US012772730B2

(12) United States Patent
Kim et al.

(10) Patent No.: US 12,772,730 B2
(45) Date of Patent: Oct. 20, 2026

(54) ORGANIC LIGHT EMITTING DEVICE

(71) Applicant: LG CHEM, LTD., Seoul (KR)

(72) Inventors: Minjun Kim, Daejeon (KR); Dong Hoon Lee, Daejeon (KR); Sang Duk Suh, Daejeon (KR); Young Seok Kim, Daejeon (KR)

(73) Assignee: LG Chem, LTD., Seoul (KR)

(*) Notice: Subject to any disclaimer, the term of this patent is extended or adjusted under 35 U.S.C. 154(b) by 571 days.

(21) Appl. No.: 18/283,763

(22) PCT Filed: Nov. 16, 2022

(86) PCT No.: PCT/KR2022/018043
§ 371 (c)(1),
(2) Date: Sep. 22, 2023

(87) PCT Pub. No.: WO2023/090836
PCT Pub. Date: May 25, 2023

(65) Prior Publication Data

US 2024/0237518 A1 Jul. 11, 2024

(30) Foreign Application Priority Data

Nov. 16, 2021 (KR) ........................ 10-2021-0157831
Nov. 15, 2022 (KR) ........................ 10-2022-0153039

(51) Int. Cl.
*H10K 85/60* (2023.01)
*H10K 50/11* (2023.01)
*H10K 101/00* (2023.01)

(52) U.S. Cl.
CPC ......... *H10K 85/654* (2023.02); *H10K 85/622* (2023.02); *H10K 85/633* (2023.02); (Continued)

(58) Field of Classification Search
CPC .. H10K 85/636; H10K 85/633; H10K 85/657; H10K 85/622
See application file for complete search history.

(56) References Cited

U.S. PATENT DOCUMENTS

2004/0251816 A1 12/2004 Leo et al.
2016/0308142 A1 10/2016 Kim et al.
(Continued)

FOREIGN PATENT DOCUMENTS

KR 10-2000-0051826 A 8/2000
KR 10-2014-0079306 A 6/2014
(Continued)

*Primary Examiner* — Mark V Prenty
(74) *Attorney, Agent, or Firm* — Bryan Cave Leighton Paisner LLP

(57) ABSTRACT

Provided is an organic light emitting device comprising: an anode; a cathode; and a light emitting layer between the anode and cathode, the light emitting layer comprising a compound of Chemical Formula 1 and a compound of Chemical Formula 2:

[Chemical Formula 1]

[Chemical Formula 2]

(Continued)

wherein any one of $Y_1$ to $Y_7$ is N and the others are CR; $Ar_1$ and $Ar_2$ are each independently a substituted or unsubstituted $C_{6-60}$ aryl or $C_{2-60}$ heteroaryl containing at least one of N, O and S; A is fused with an adjacent pentagonal ring and is a benzene ring that is unsubstituted or substituted with deuterium, or a naphthalene ring that is unsubstituted or substituted with deuterium; $Ar'_1$ to $Ar'_3$ are each independently a substituted or unsubstituted $C_{6-60}$ aryl or $C_{2-60}$ heteroaryl containing at least one of N, O and S; and the other substituents are as described in the specification.

9 Claims, 2 Drawing Sheets

(52) U.S. Cl.
CPC ......... *H10K 85/636* (2023.02); *H10K 85/657* (2023.02); *H10K 50/11* (2023.02); *H10K 85/615* (2023.02); *H10K 85/626* (2023.02); *H10K 85/6572* (2023.02); *H10K 85/6574* (2023.02); *H10K 85/6576* (2023.02); *H10K 2101/90* (2023.02)

(56) References Cited

U.S. PATENT DOCUMENTS

| | | | |
|---|---|---|---|
| 2016/0351826 A1 | 12/2016 | Kim et al. | |
| 2017/0012216 A1 | 1/2017 | Kim et al. | |
| 2019/0248804 A1 | 8/2019 | Wolleb et al. | |
| 2019/0312215 A1 | 10/2019 | Kang et al. | |
| 2020/0308201 A1 | 10/2020 | Lee et al. | |
| 2022/0069226 A1 | 3/2022 | Lee et al. | |
| 2024/0237518 A1* | 7/2024 | Kim | H10K 99/00 |

FOREIGN PATENT DOCUMENTS

| | | | |
|---|---|---|---|
| KR | 10-2018-0096458 A | 8/2018 |
| KR | 10-2019-0076375 A | 7/2019 |
| KR | 10-2019-0118392 A | 10/2019 |
| KR | 10-2020-0035769 A | 4/2020 |
| KR | 10-2020-0145198 A | 12/2020 |
| KR | 10-2021-0127634 A | 10/2021 |
| WO | 2003-012890 A2 | 2/2003 |
| WO | 2015-105313 A1 | 7/2015 |
| WO | 2015-105315 A1 | 7/2015 |
| WO | 2021-210911 A1 | 10/2021 |

* cited by examiner

【FIG. 1】
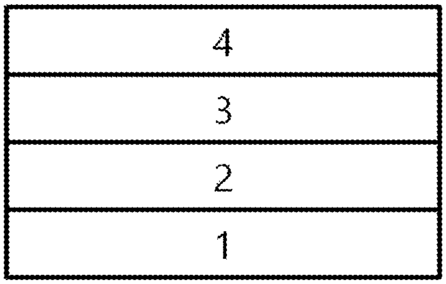
【FIG. 2】
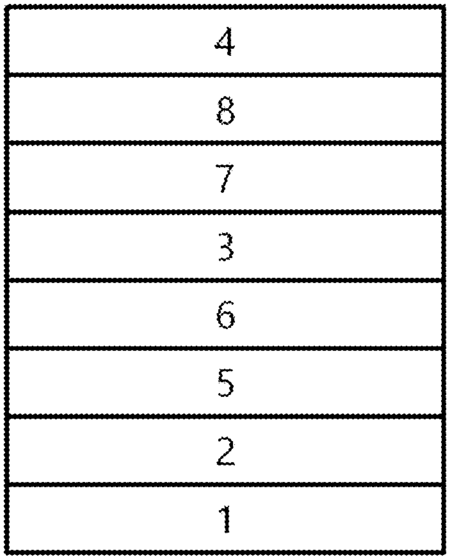

【FIG. 3】
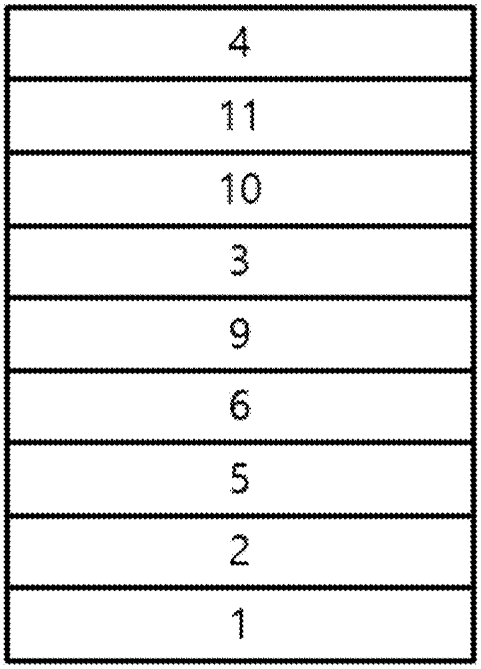

ORGANIC LIGHT EMITTING DEVICE

CROSS-REFERENCE TO RELATED APPLICATION(S)

This application is a National Stage Application of International Application No. PCT/KR2022/018043 filed on Nov. 16, 2022, which claims priority to and the benefit of Korean Patent Applications No. 10-2021-0157831 filed on Nov. 16, 2021 and No. 10-2022-0153039 filed on Nov. 15, 2022 in the Korean Intellectual Property Office, the disclosures of which are incorporated herein by reference in their entirety.

TECHNICAL FIELD

The present disclosure relates to an organic light emitting device.

BACKGROUND

In general, an organic light emitting phenomenon refers to a phenomenon where electric energy is converted into light energy by using an organic material. The organic light emitting device using the organic light emitting phenomenon has characteristics such as a wide viewing angle, an excellent contrast, a fast response time, an excellent luminance, driving voltage and response speed, and thus many studies have proceeded.

The organic light emitting device generally has a structure which comprises an anode, a cathode, and an organic material layer interposed between the anode and the cathode. The organic material layer frequently has a multilayered structure that comprises different materials in order to enhance efficiency and stability of the organic light emitting device, and for example, the organic material layer can be formed of a hole injection layer, a hole transport layer, a light emitting layer, an electron transport layer, an electron injection layer, and the like. In the structure of the organic light emitting device, if a voltage is applied between two electrodes, the holes are injected from an anode into the organic material layer and the electrons are injected from the cathode into the organic material layer, and when the injected holes and electrons meet each other, an exciton is formed, and light is emitted when the exciton falls to a ground state again.

There is a continuing need for the development of new materials for organic materials used in the organic light emitting device.

PRIOR ART LITERATURE (Patent Literature 0001) Korean Unexamined Patent Publication No. 10-2000-0051826

DETAILED DESCRIPTION OF THE INVENTION

Technical Problem

The present disclosure relates to an organic light emitting device having improved driving voltage, efficiency, and lifespan.

Technical Solution

In the present disclosure, provided is an organic light emitting device including an anode; a cathode; and a light emitting layer between the anode and the cathode, wherein the light emitting layer includes a compound of the following Chemical Formula 1 and a compound of the following Chemical Formula 2:

[Chemical Formula 1]

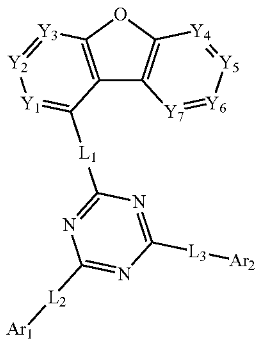

wherein in the Chemical Formula 1:

any one of $Y_1$ to $Y_7$ is N, and the others are CR;

each R is independently hydrogen, deuterium, a substituted or unsubstituted $C_{6-60}$ aryl, or a substituted or unsubstituted $C_{2-60}$ heteroaryl containing at least one heteroatom selected from the group consisting of N, O and S;

$L_1$ to $L_3$ are each independently a single bond, a substituted or unsubstituted $C_{6-60}$ arylene, or a unsubstituted $C_{2-60}$ heteroarylene containing at least one heteroatom selected from the group consisting of N, O and S; and $Ar_1$ and $Ar_2$ are each independently a substituted or unsubstituted $C_{6-60}$ aryl or a substituted or unsubstituted $C_{2-60}$ heteroaryl containing at least one heteroatom selected from the group consisting of N, O and S;

[Chemical Formula 2]

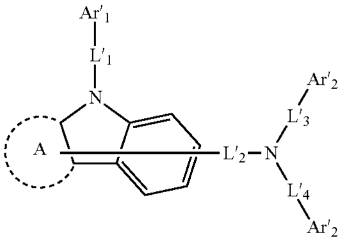

wherein in the Chemical Formula 2:

A is fused with an adjacent pentagonal ring and is a benzene ring that is unsubstituted or substituted with deuterium or a naphthalene ring that is unsubstituted or substituted with deuterium;

$L'_1$ to $L'_4$ are each independently a single bond, a substituted or unsubstituted $C_{6-60}$ arylene, or a unsubstituted $C_{2-60}$ heteroarylene containing at least one heteroatom selected from the group consisting of N, O and S; and $Ar'_1$ to $Ar'_3$ are each independently a substituted or unsubstituted $C_{6-60}$ aryl or a substituted or unsubstituted $C_{2-60}$ heteroaryl containing at least one heteroatom selected from the group consisting of N, O and S.

Advantageous Effects

The above-described organic light emitting device is excellent in driving voltage, efficiency, and lifespan.

BRIEF DESCRIPTION OF THE DRAWINGS

FIG. 1 shows an example of an organic light emitting device including a substrate 1, an anode 2, a light emitting layer 3, and a cathode 4.

FIG. 2 shows an example of an organic light emitting device including a substrate 1, an anode 2, a hole injection layer 5, a hole transport layer 6, a light emitting layer 3, an electron transport layer 7, an electron injection layer 8, and a cathode 4.

FIG. 3 shows an example of an organic light emitting device including a substrate 1, an anode 2, a hole injection layer 5, a hole transport layer 6, an electron blocking layer 9, a light emitting layer 3, a hole blocking layer 10, an electron injection and transport layer 11, and a cathode 4.

DETAILED DESCRIPTION OF THE EMBODIMENTS

Hereinafter, embodiments of the present disclosure will be described in more detail to facilitate understanding of the invention.

As used herein, the notation

, or or means a bond linked to another substituent group.

As used herein, the term "substituted or unsubstituted" means being unsubstituted or substituted with one or more substituents selected from the group consisting of deuterium, a halogen group, a nitrile group, a nitro group, a hydroxyl group, a carbonyl group, an ester group, an imide group, an amino group, a phosphine oxide group, an alkoxy group, an aryloxy group, an alkylthioxy group, an arylthioxy group, an alkylsulfoxy group, an arylsulfoxy group, a silyl group, a boron group, an alkyl group, a cycloalkyl group, an alkenyl group, an aryl group, an aralkyl group, an aralkenyl group, an alkylaryl group, an alkylamine group, an aralkylamine group, a heteroarylamine group, an arylamine group, an arylphosphine group, and a heterocyclic group containing at least one of N, O and S atoms, or being unsubstituted or substituted with a substituent in which two or more substituents of the above-exemplified substituents are connected. For example, "a substituent in which two or more substituents are connected" can be a biphenyl group. Namely, a biphenyl group can be an aryl group, or it can also be interpreted as a substituent in which two phenyl groups are connected.

In the present disclosure, the carbon number of a carbonyl group is not particularly limited, but is preferably 1 to 40. Specifically, the carbonyl group can be a compound having the following structural formulae, but is not limited thereto:

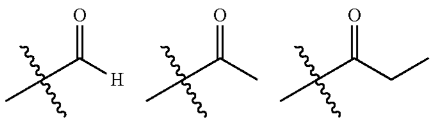

-continued

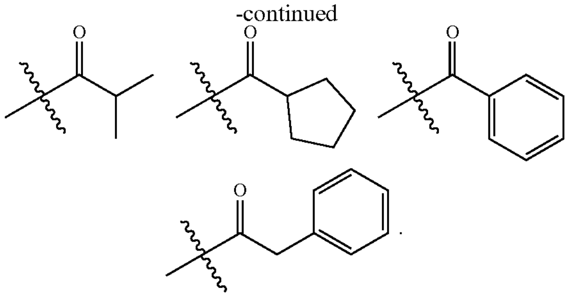

In the present disclosure, an ester group can have a structure in which oxygen of the ester group is substituted by a straight-chain, branched-chain, or cyclic alkyl group having 1 to 25 carbon atoms, or an aryl group having 6 to 25 carbon atoms. Specifically, the ester group can be a compound having the following structural formulae, but is not limited thereto:

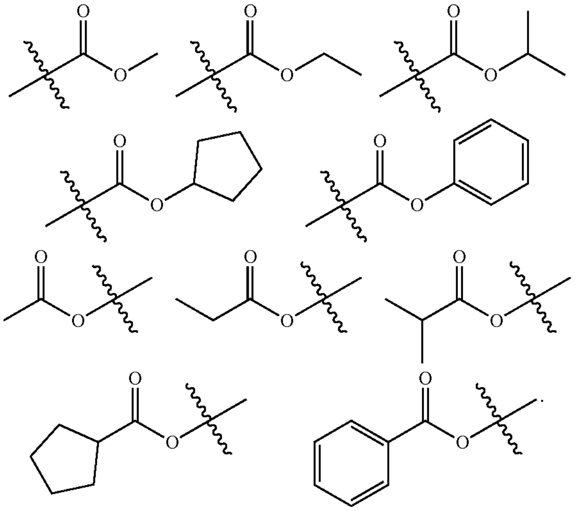

In the present disclosure, the carbon number of an imide group is not particularly limited, but is preferably 1 to 25. Specifically, the imide group can be a compound having the following structural formulae, but is not limited thereto:

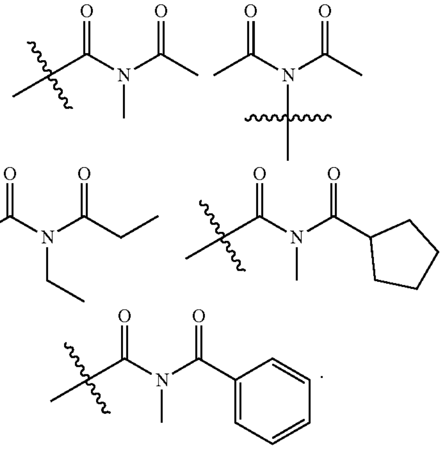

In the present disclosure, a silyl group specifically includes a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but is not limited thereto.

In the present disclosure, a boron group specifically includes a trimethylboron group, a triethylboron group, a t-butyldimethylboron group, a triphenylboron group, a phenylboron group and the like, but is not limited thereto.

In the present disclosure, examples of a halogen group include fluorine, chlorine, bromine, or iodine.

In the present disclosure, the alkyl group can be straight-chain, or branched-chain, and the carbon number thereof is not particularly limited, but is preferably 1 to 40. According to one embodiment, the carbon number of the alkyl group is 1 to 20. According to another embodiment, the carbon number of the alkyl group is 1 to 10. According to another embodiment, the carbon number of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethylpropyl, isohexyl, 2-methylpentyl, 4-methylhexyl, 5-methylhexyl, and the like, but are not limited thereto.

In the present disclosure, the alkenyl group can be straight-chain or branched-chain, and the carbon number thereof is not particularly limited, but is preferably 2 to 40. According to one embodiment, the carbon number of the alkenyl group is 2 to 20. According to another embodiment, the carbon number of the alkenyl group is 2 to 10. According to another embodiment, the carbon number of the alkenyl group is 2 to 6. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present disclosure, a cycloalkyl group is not particularly limited, but the carbon number thereof is preferably 3 to 60. According to one embodiment, the carbon number of the cycloalkyl group is 3 to 30. According to another embodiment, the carbon number of the cycloalkyl group is 3 to 20. According to another embodiment, the carbon number of the cycloalkyl group is 3 to 6. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present disclosure, an aryl group is not particularly limited, but the carbon number thereof is preferably 6 to 60, and it can be a monocyclic aryl group or a polycyclic aryl group. According to one embodiment, the carbon number of the aryl group is 6 to 30. According to one embodiment, the carbon number of the aryl group is 6 to 20. The monocyclic aryl group includes a phenyl group, a biphenyl group, a terphenyl group and the like, but is not limited thereto. The polycyclic aryl group includes a naphthyl group, an anthracenyl group, a phenanthryl group, a pyrenyl group, a perylenyl group, a chrysenyl group, a fluorenyl group or the like, but is not limited thereto.

In the present disclosure, a fluorenyl group can be substituted, and two substituents can be bonded to each other to form a spiro structure. In the case where the fluorenyl group is substituted,

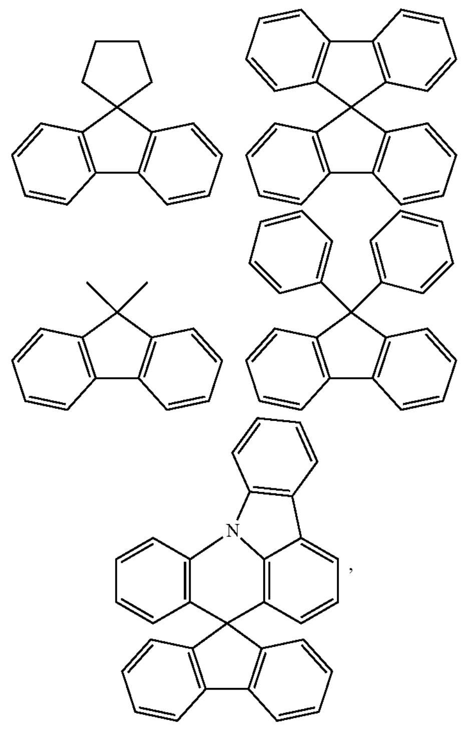
, and the like can be formed. However, the structure is not limited thereto.

In the present disclosure, a heterocyclic group is a heterocyclic group containing at least one heteroatom of O, N, Si and S as a heterogeneous element, and the carbon number thereof is not particularly limited, but is preferably 2 to 60. Examples of the heterocyclic group include a thiophene group, a furan group, a pyrrole group, an imidazole group, a thiazole group, an oxazol group, an oxadiazol group, a triazol group, a pyridyl group, a bipyridyl group, a pyrimidyl group, a triazine group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzoimidazole group, a benzothiazol group, a benzocarbazole group, a benzothiophene group, a dibenzothiophene group, a benzofuranyl group, a phenanthroline group, an isoxazolyl group, a thiadiazolyl group, a phenothiazinyl group, a dibenzofuranyl group, and the like, but are not limited thereto.

In the present disclosure, the aryl group in the aralkyl group, the aralkenyl group, the alkylaryl group, and the arylamine group is the same as the aforementioned examples of the aryl group. In the present disclosure, the alkyl group in the aralkyl group, the alkylaryl group and the alkylamine group is the same as the aforementioned examples of the alkyl group. In the present disclosure, the heteroaryl in the heteroarylamine can apply the aforementioned description of the heterocyclic group. In the present disclosure, the alkenyl group in the aralkenyl group is the same as the aforementioned examples of the alkenyl group. In the present disclosure, the aforementioned description of the aryl group can be applied except that the arylene is a divalent group. In the present disclosure, the aforementioned description of the heterocyclic group can be applied except that the heteroarylene is a divalent group. In the present disclosure, the aforementioned description of the aryl group or cycloalkyl group can be applied except that the hydrocarbon ring is not a monovalent group but formed by combining two substituent groups. In the present disclosure, the aforementioned description of the heterocyclic group can be applied, except that the heterocycle is not a monovalent group but formed by combining two substituent groups.

The present disclosure will be described in detail for each configuration.

Anode and Cathode

The anode and cathode used in the present disclosure refer to electrodes used in an organic light emitting device.

As the anode material, generally, a material having a large work function is preferably used so that holes can be smoothly injected into the organic material layer. Specific examples of the anode material include metals such as vanadium, chrome, copper, zinc, and gold, or an alloy thereof, metal oxides such as zinc oxides, indium oxides, indium tin oxides (ITO), and indium zinc oxides (IZO); a combination of metals and oxides such as ZnO:Al or $SnO_2$:Sb; conductive polymers such as poly(3-methylthiophene), poly[3,4-(ethylene-1,2-dioxy)thiophene](PEDOT), polypyrrole, and polyaniline, and the like, but are not limited thereto.

As the cathode material, generally, a material having a small work function is preferably used so that electrons can be easily injected into the organic material layer. Specific examples of the cathode material include metals such as magnesium, calcium, sodium, potassium, titanium, indium, yttrium, lithium, gadolinium, aluminum, silver, tin, and lead, or an alloy thereof; a multilayered structure material such as LiF/Al or $LiO_2$/Al, and the like, but are not limited thereto.

Light Emitting Layer

The light emitting layer used in the present disclosure refers to a layer capable of emitting light in a visible ray region by combining holes and electrons transferred from the anode and the cathode. In general, the light emitting layer includes a host material and a dopant material, and the compound of Chemical Formula 1 and the compound of Chemical Formula 2 are included as hosts in the present disclosure.

The compound of Chemical Formula 1 includes a benzofuropyridine ring and a triazine substituent bonded thereto. In Chemical Formula 1, one or more hydrogens can be substituted with deuterium.

Preferably, any one of $Y_1$ to $Y_7$ is N, and the others are CR. And, each R is independently hydrogen, deuterium, a substituted or unsubstituted $C_{6-20}$ aryl, or a substituted or unsubstituted $C_{2-20}$ heteroaryl containing at least one heteroatom selected from the group consisting of N, O and S. Preferably, each R is independently hydrogen, deuterium, phenyl, biphenylyl, naphthyl, (phenyl)naphthyl; (naphthyl)phenyl, phenanthrenyl, chrysenyl, benzophenanthrenyl, triphenylenyl, carbazolyl, fluoranthenyl, benzocarbazolyl, dibenzofuranyl, dibenzothiophenyl, benzonaphthofuranyl, or benzonaphthothiophenyl. When R is a substituent other than hydrogen or deuterium, it can be substituted with at least one deuterium.

In one embodiment, any one of $Y_1$ to $Y_7$ is N, and the others can each independently be CH or CD.

Alternatively, any one of $Y_1$ to $Y_7$ is N, and the others are CR, wherein any one of six Rs is phenyl, biphenylyl, naphthyl; (phenyl)naphthyl, (naphthyl)phenyl, phenanthrenyl, chrysenyl, benzophenanthrenyl, triphenylenyl, carbazolyl, fluoranthenyl, benzocarbazolyl, dibenzofuranyl, dibenzothiophenyl, benzonaphthofuranyl, or benzonaphthothiophenyl, and the remaining five Rs can all be hydrogen or deuterium. The R that is not hydrogen or deuterium can be substituted with at least one deuterium.

Preferably, $L_1$ to $L_3$ are each independently a single bond or a substituted or unsubstituted $C_{6-20}$ arylene.

Preferably, $L_1$ to $L_3$ are each independently a single bond; or any one selected from the group consisting of:

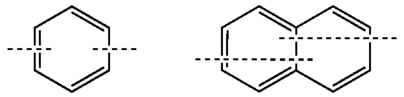

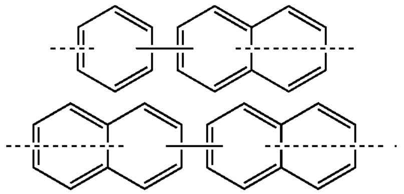

In the above, one or more hydrogens can be substituted with deuterium.

Preferably, Ar and $Ar_2$ are each independently a substituted or unsubstituted $C_{6-20}$ aryl or a substituted or unsubstituted $C_{2-20}$ heteroaryl containing at least one heteroaryl selected from the group consisting of N, O and S.

Preferably, Ar and $Ar_2$ are each independently phenyl, biphenylyl, terphenylyl, naphthyl, phenanthrenyl, fluoranthenyl, chrysenyl, benzophenanthrenyl, dibenzofuranyl, or dibenzothiophenyl. Herein, Ar and $Ar_2$ can each independently be substituted with at least one deuterium.

The compound of Chemical Formula 1 may not include deuterium or may include at least one deuterium.

For example, when the compound of Chemical Formula 1 includes deuterium, a deuterium substitution rate of the compound can be 1% to 100%.

Specifically, the deuterium substitution rate of the compound can be 5% or more, 10% or more, 20% or more, 30% or more, 40% or more, 50% or more, 60% or more, 70% or more, 75% or more, 80% or more, or 90% or more and 100% or less. The deuterium substitution rate of the compound can be determined by the number of substituted deuterium compared to the total number of hydrogens that can be present in the compound. The number of substituted deuterium can be obtained by MALDI-TOF MS (Matrix-Assisted Laser Desorption/Ionization Time-of-Flight Mass Spectrometer) analysis.

Representative examples of the compound of Chemical Formula 1 are as follows:
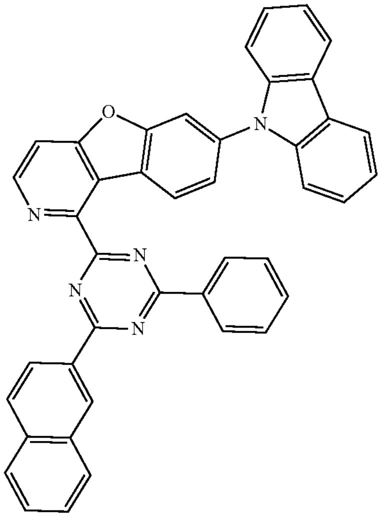
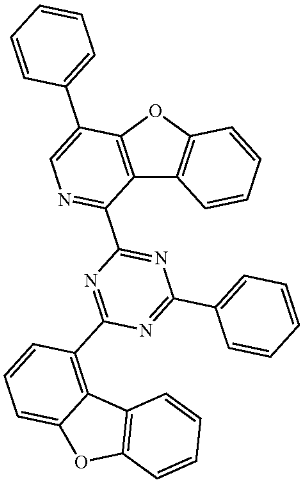
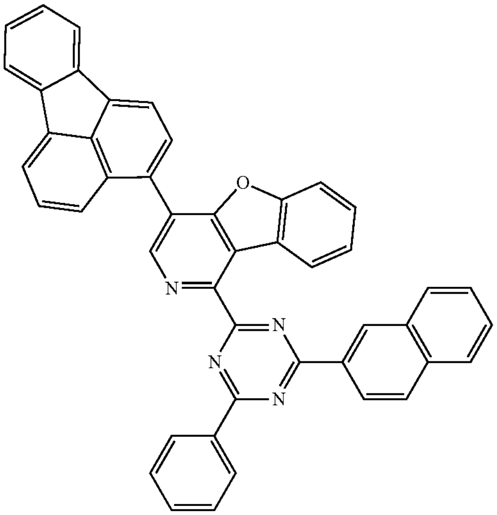
-continued
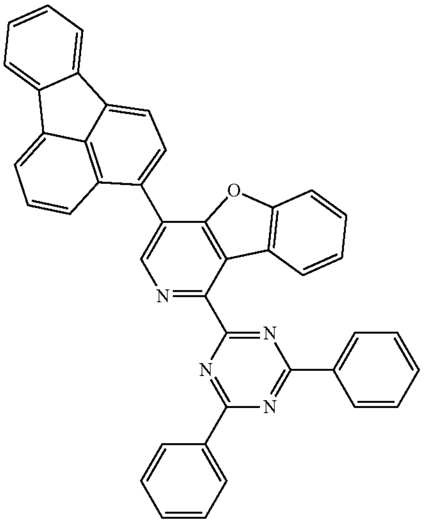
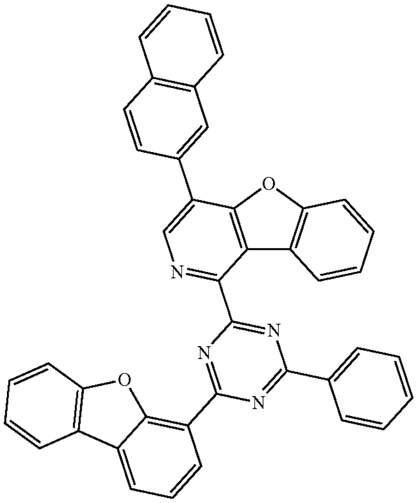
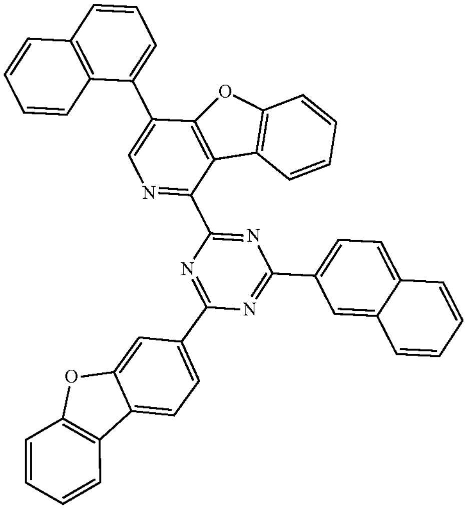

-continued
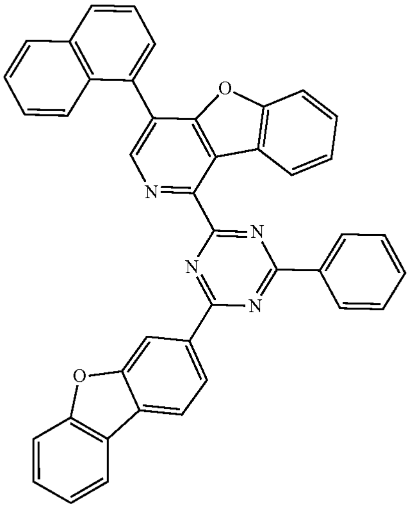
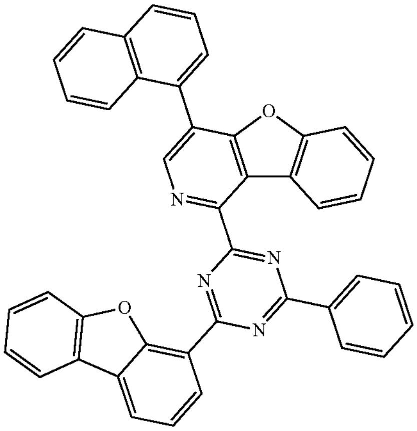
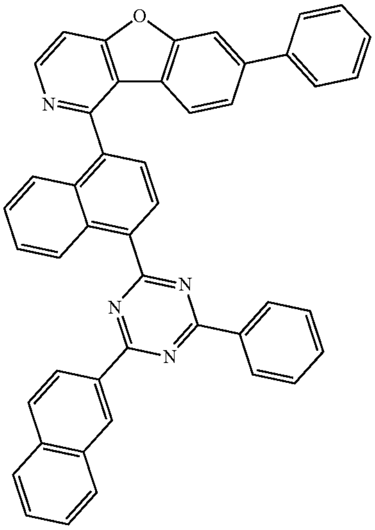
-continued
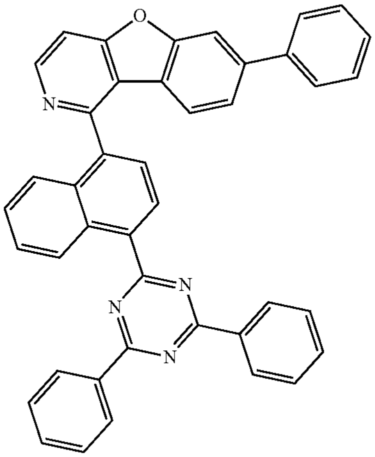
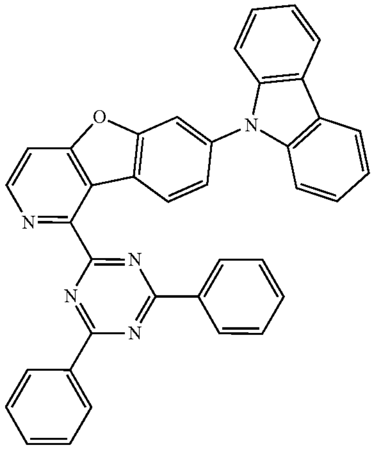
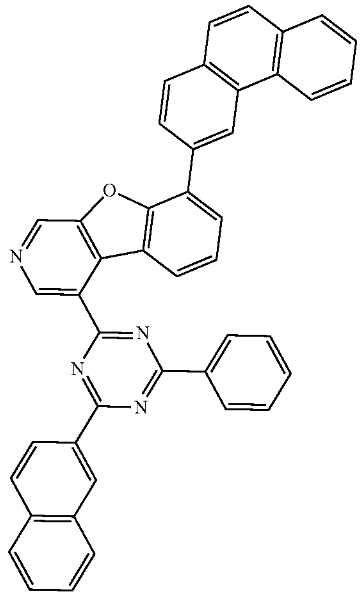

-continued
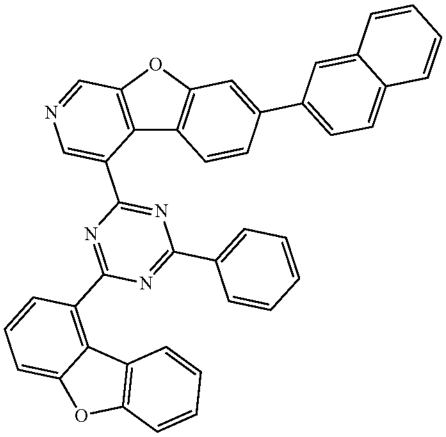
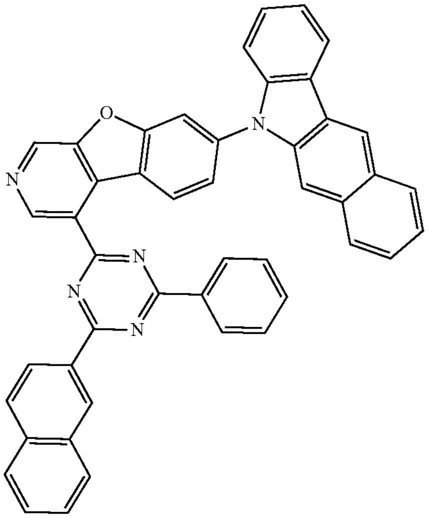
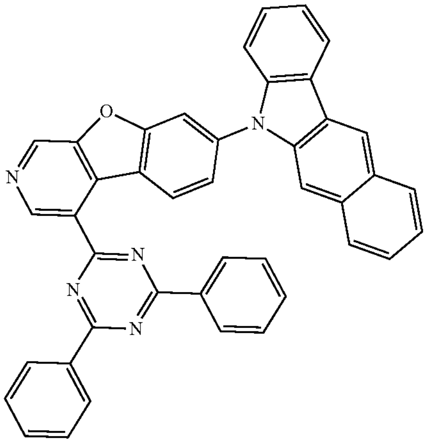
-continued
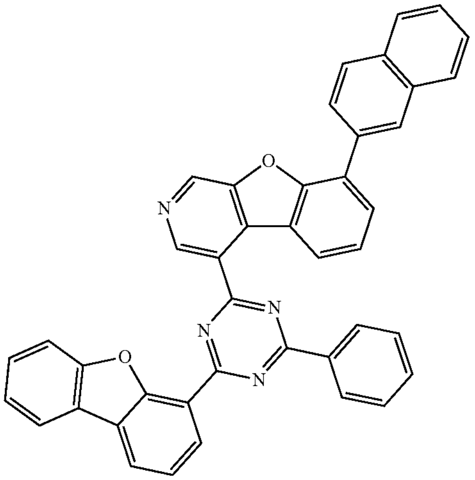
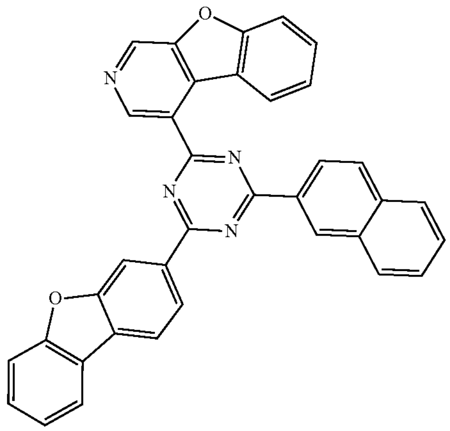
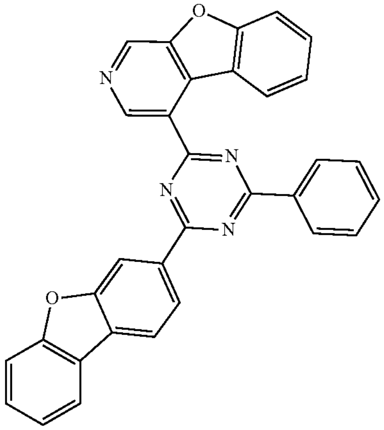
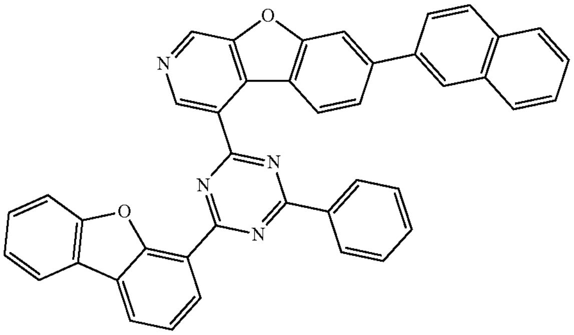

-continued
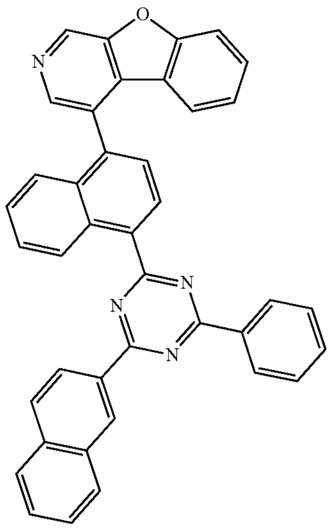
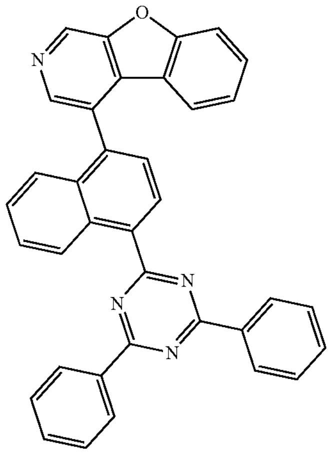
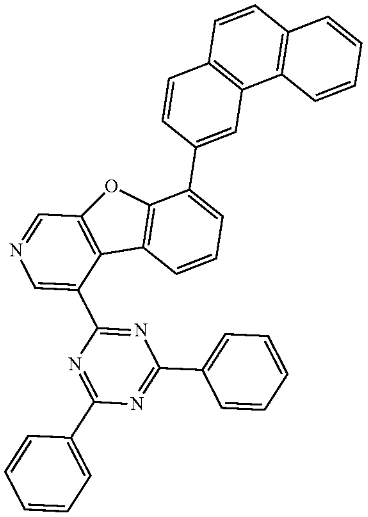
-continued
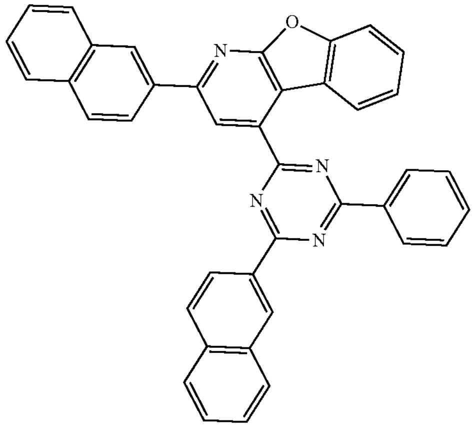
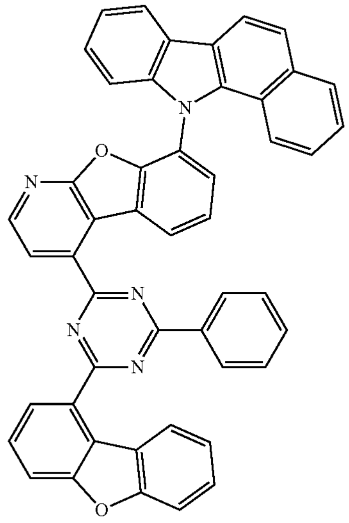
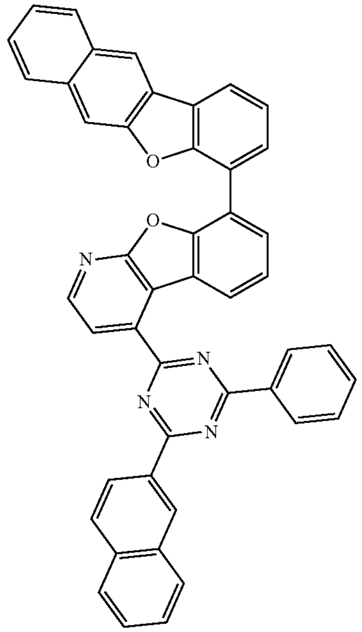

-continued
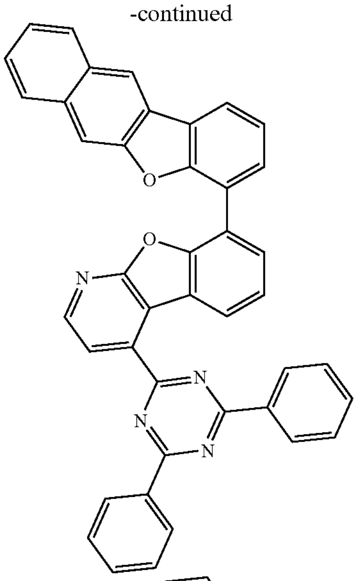
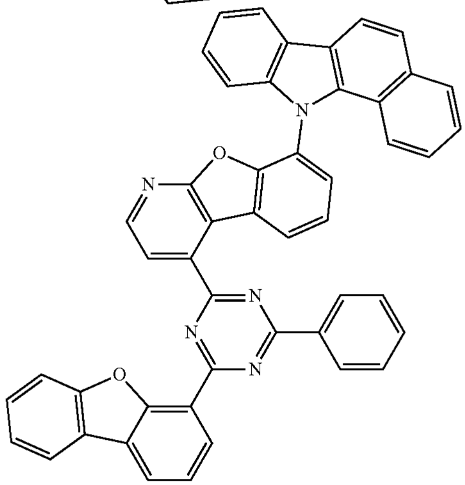
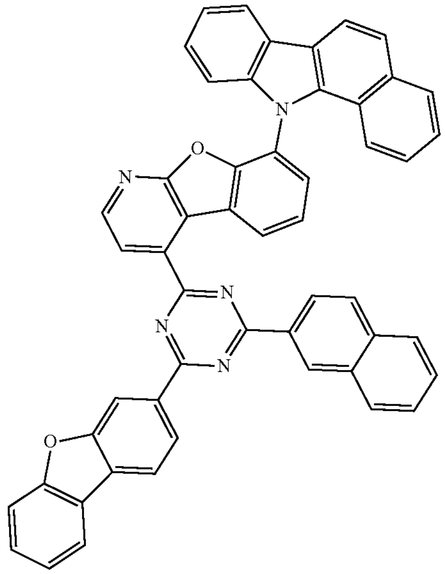
-continued
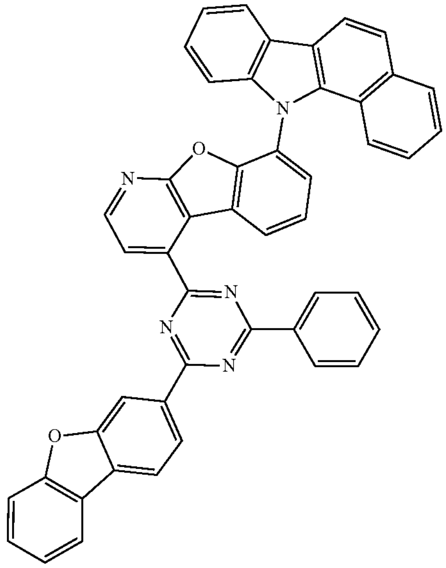
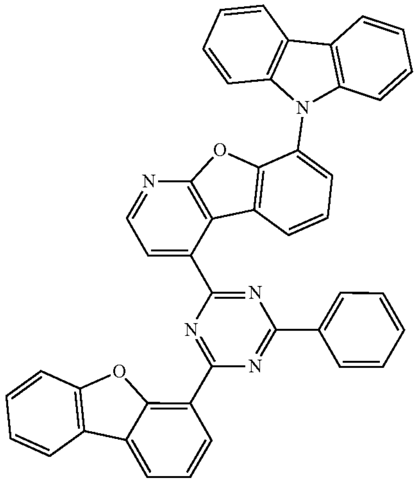
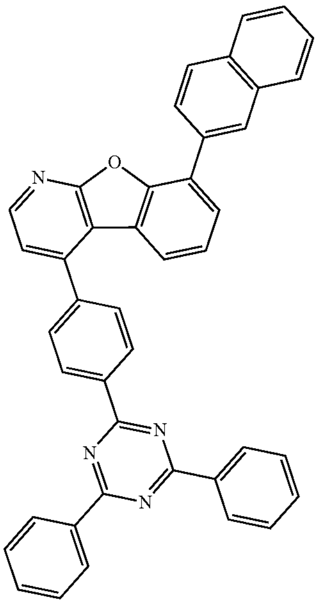

-continued
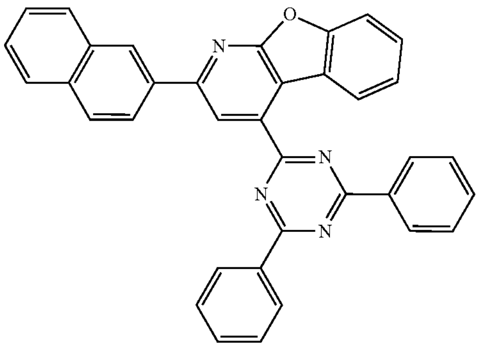
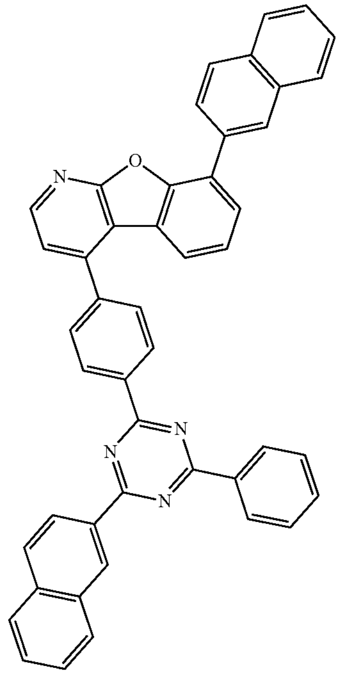
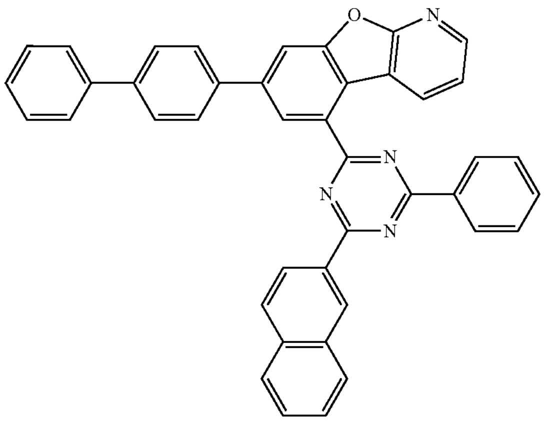
-continued
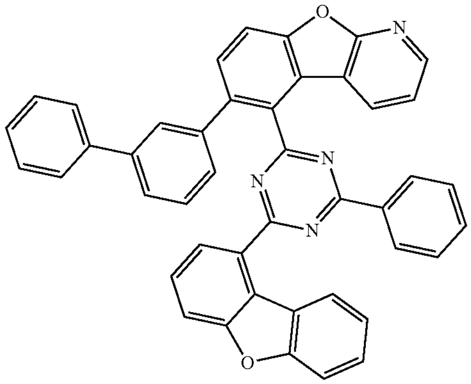
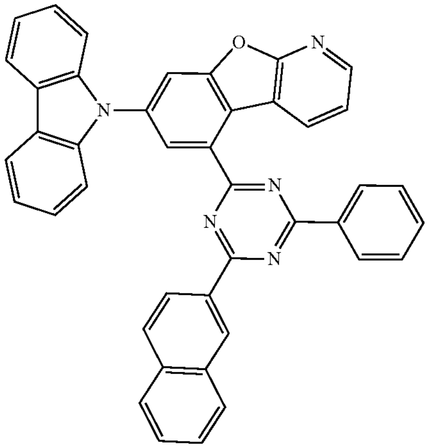
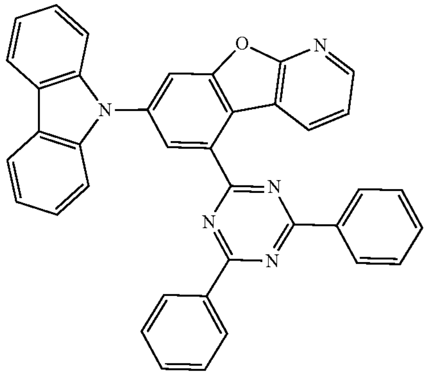
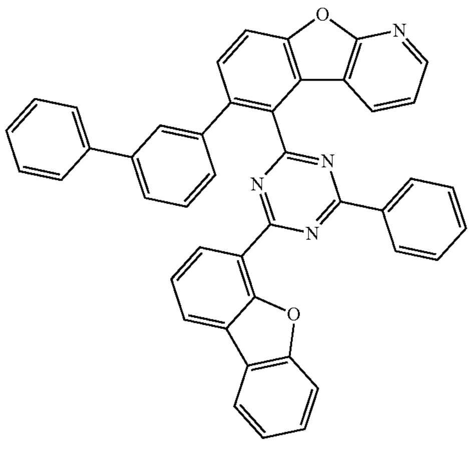

-continued
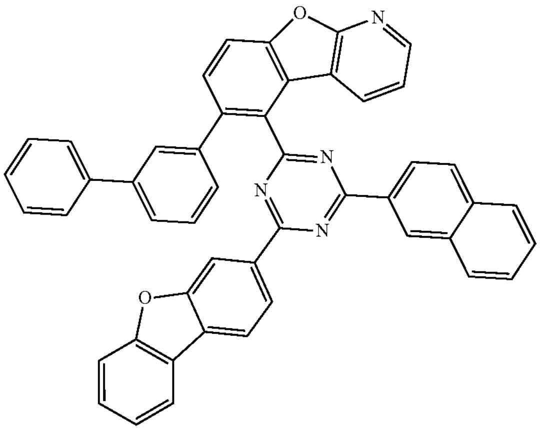
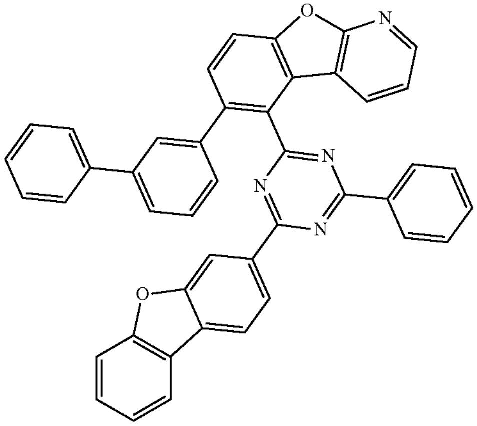
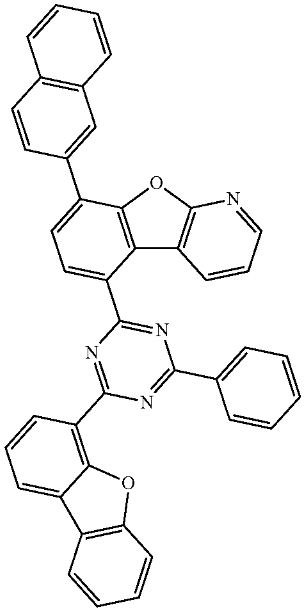
-continued
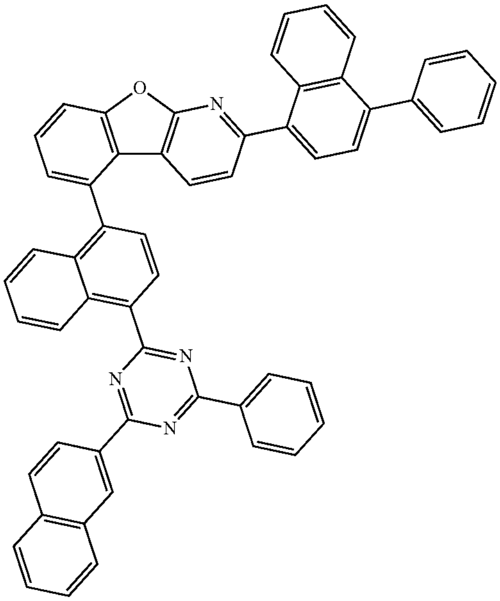
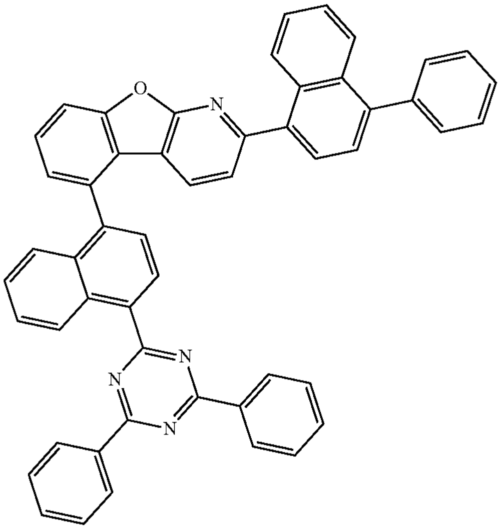
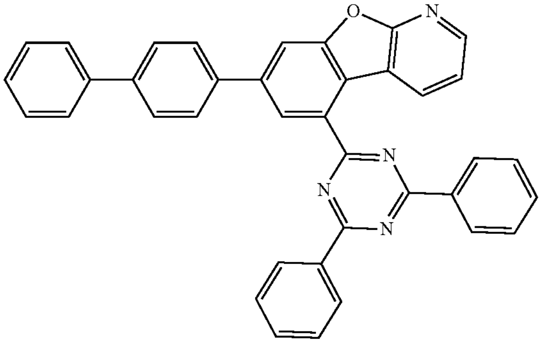

-continued
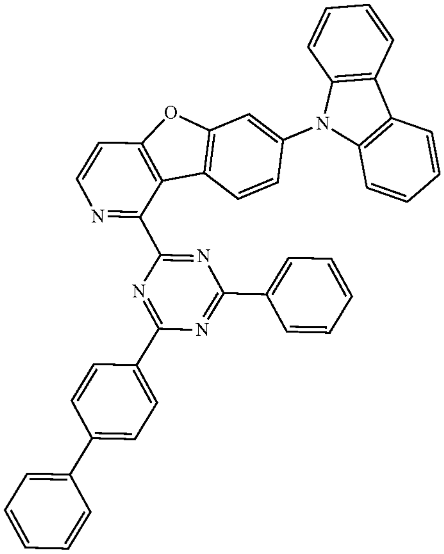
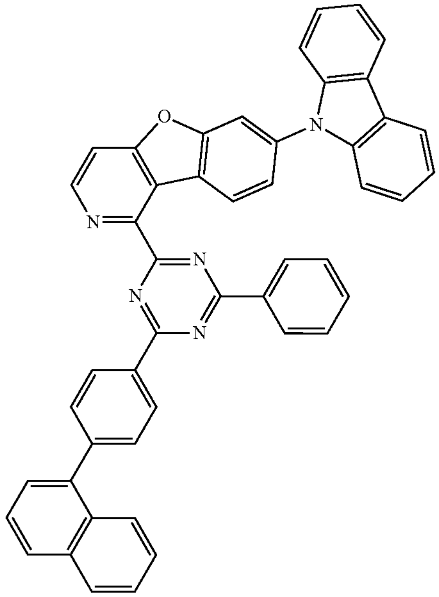
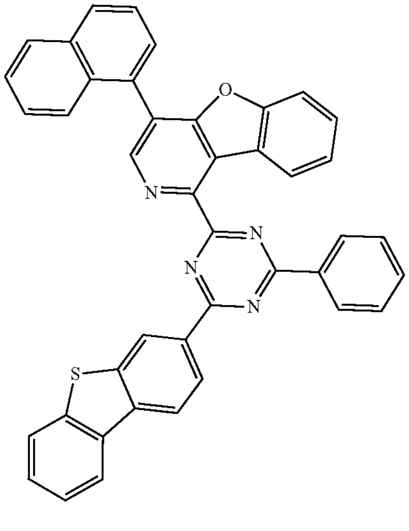
-continued
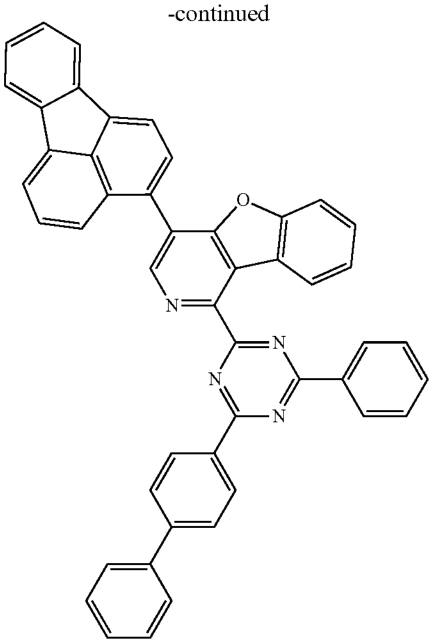
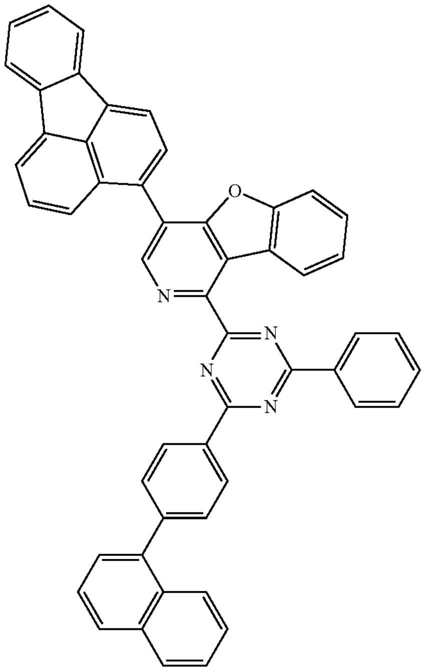

-continued
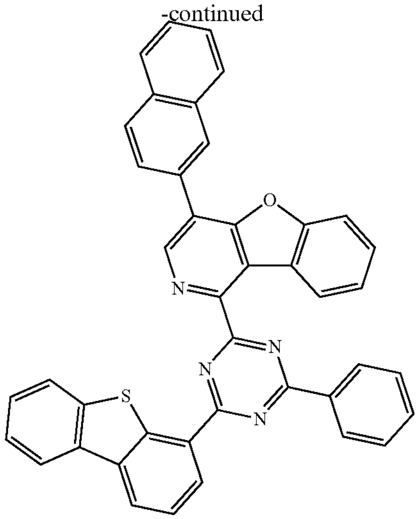
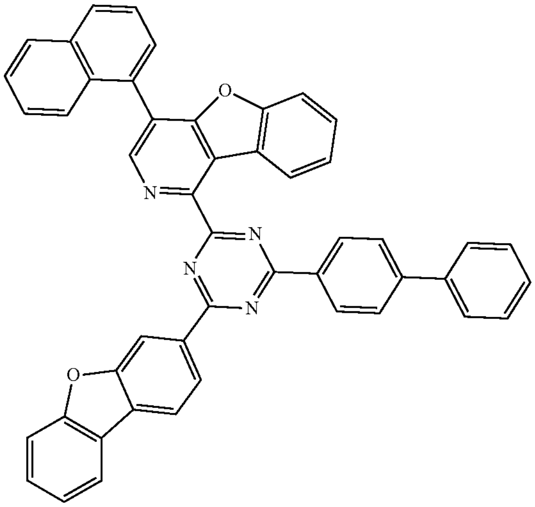
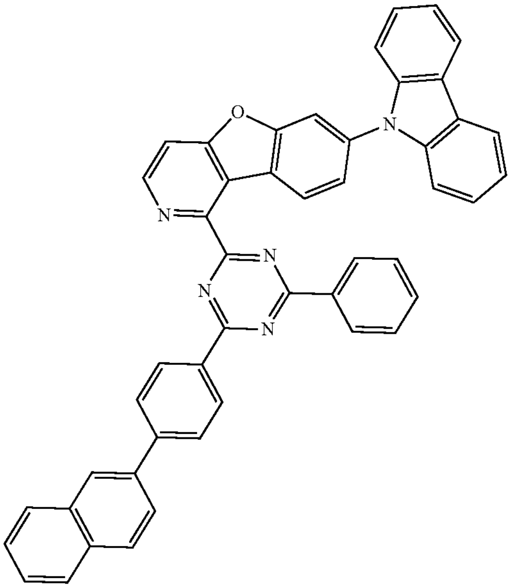
-continued
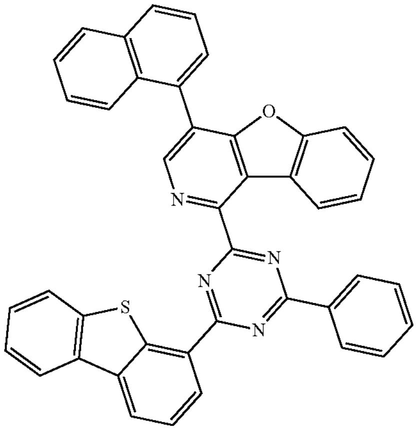
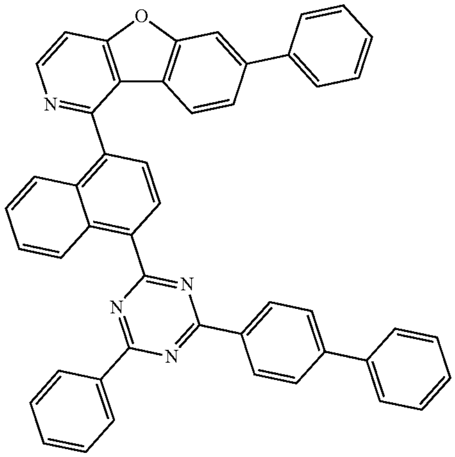
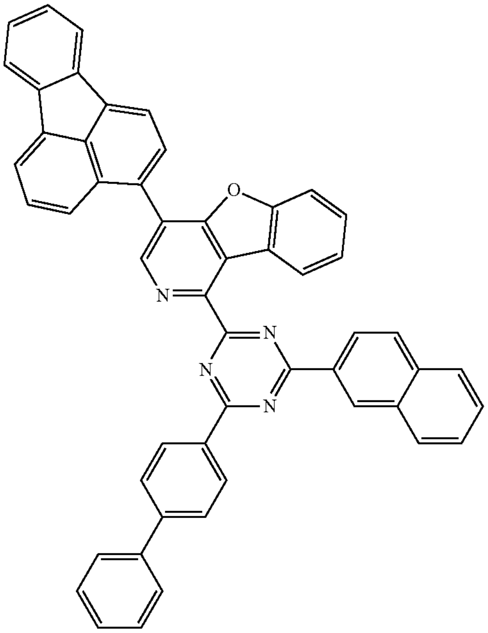

-continued
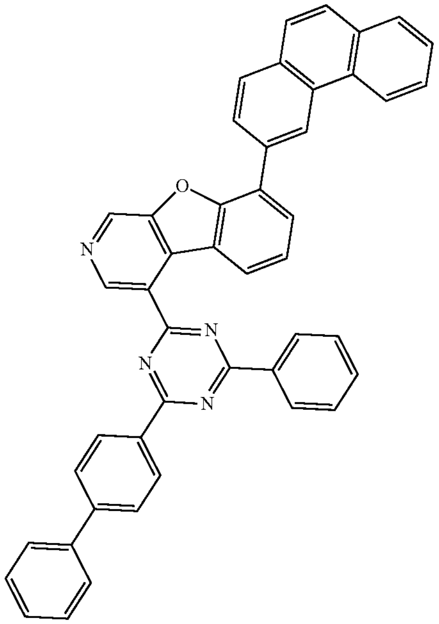
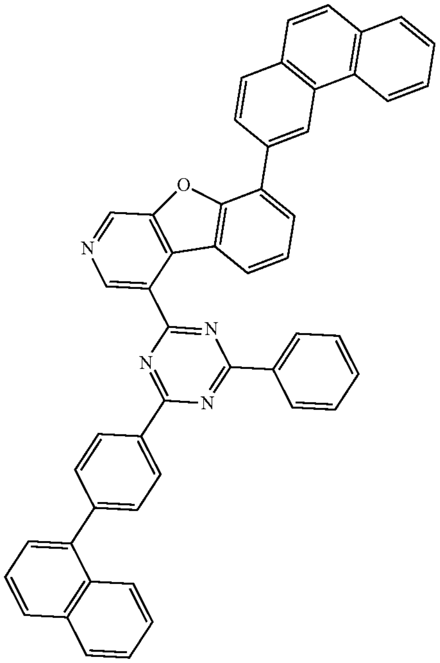
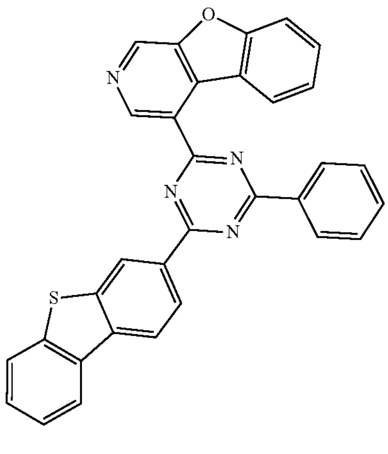
-continued
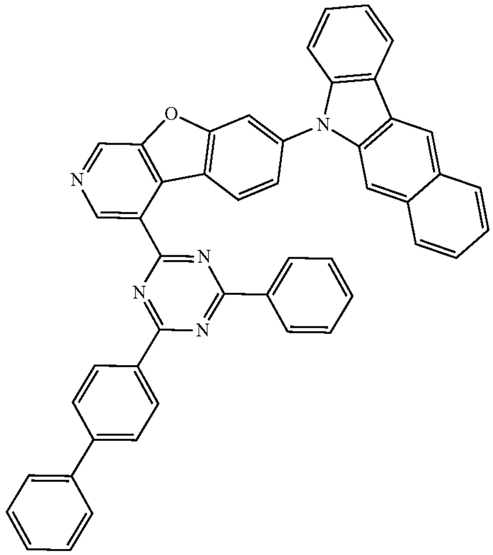
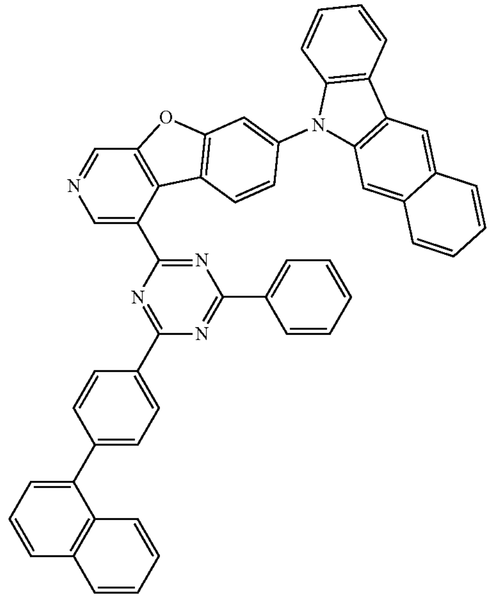
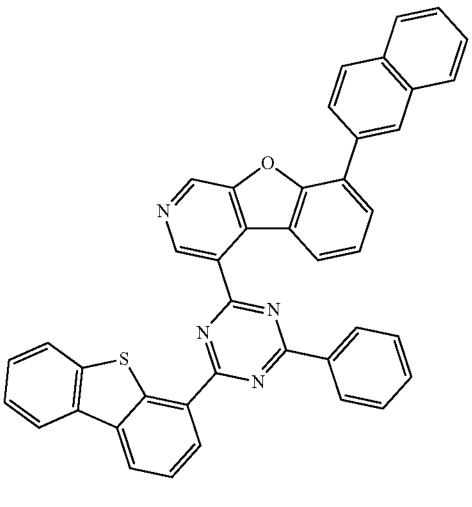

-continued
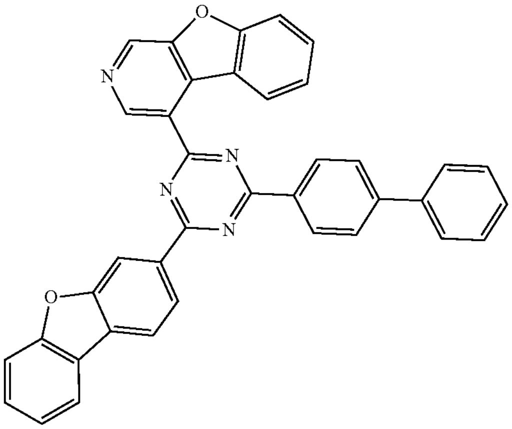
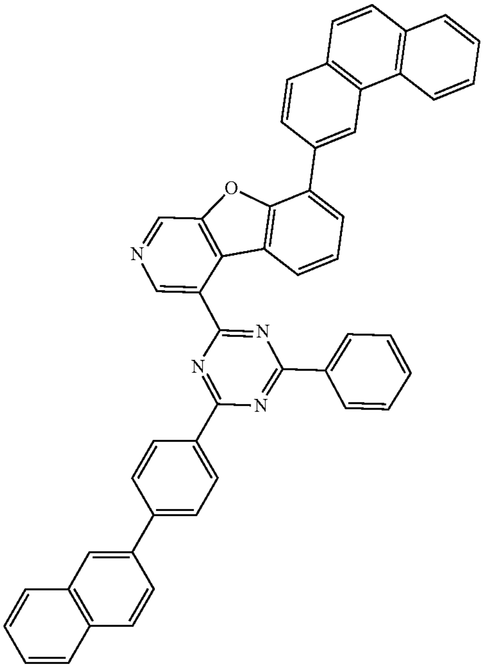
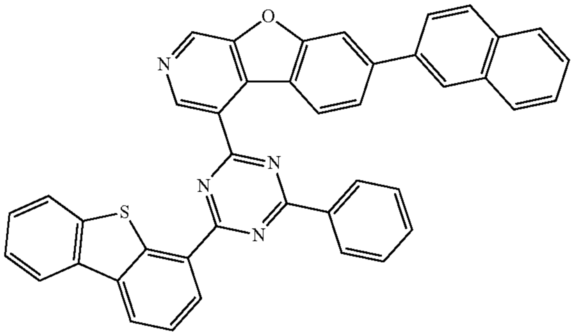
-continued
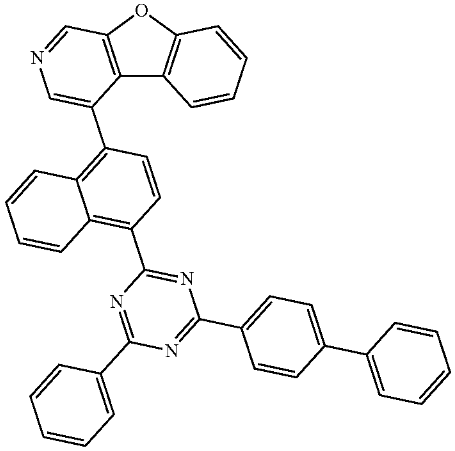
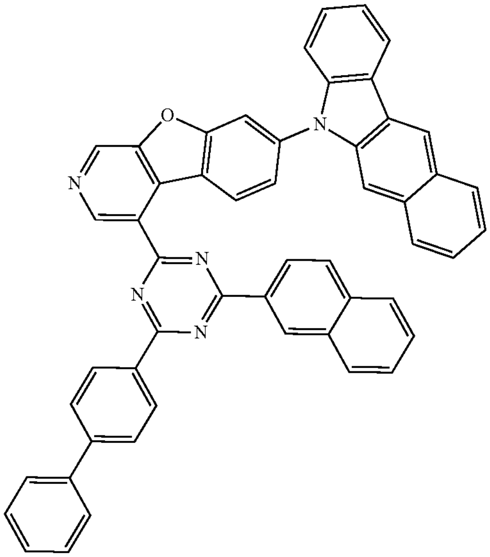
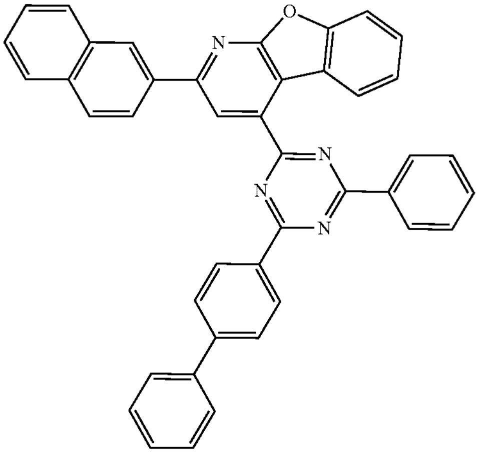

-continued
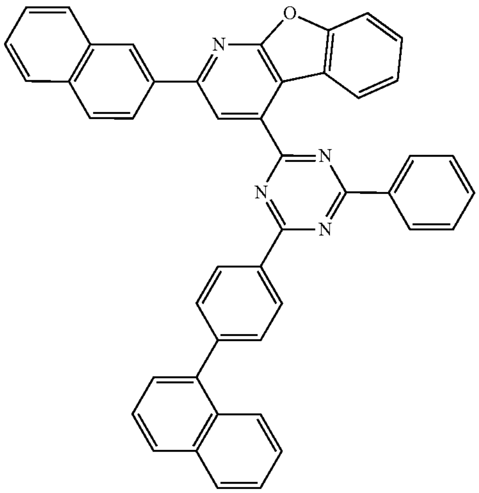
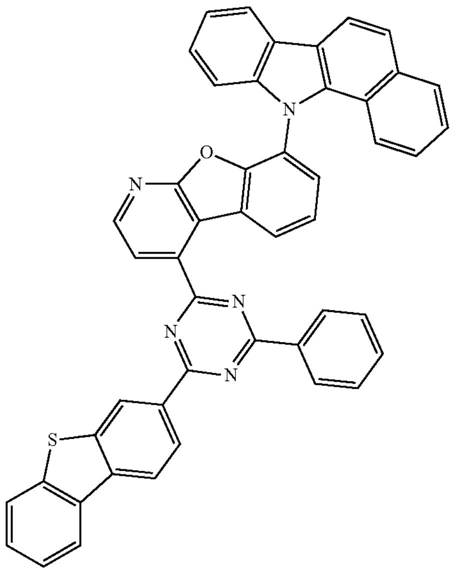
-continued
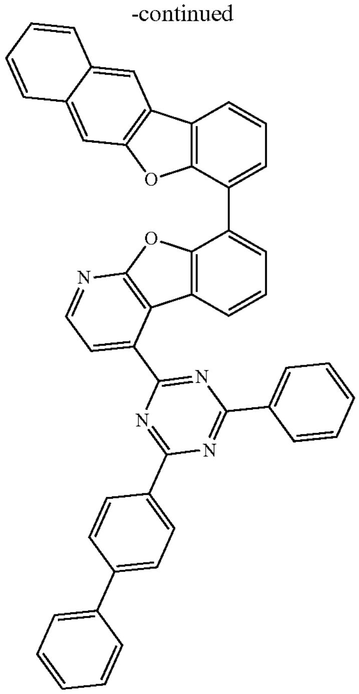
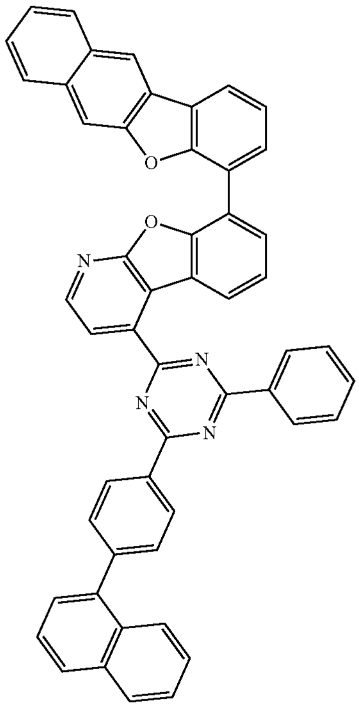

-continued
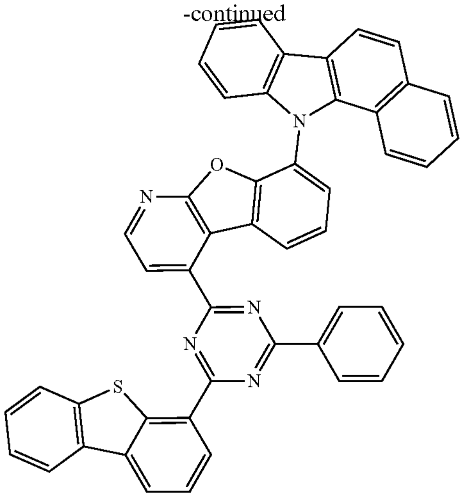
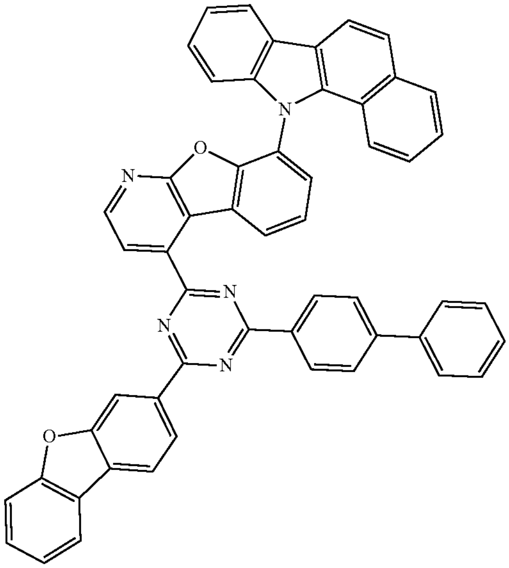
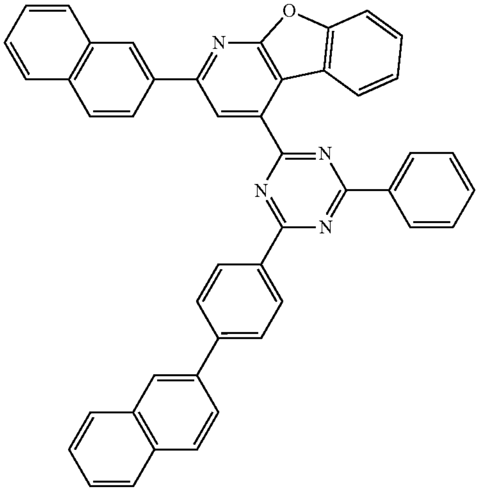
-continued
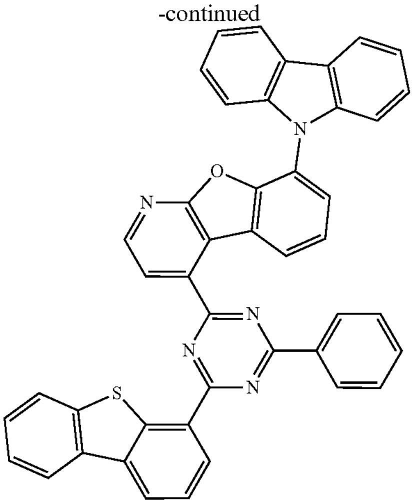
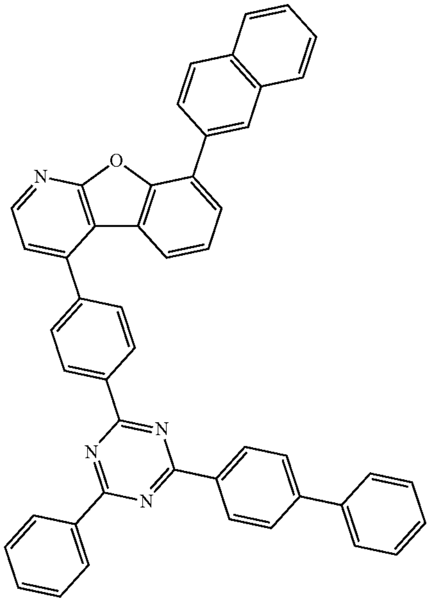
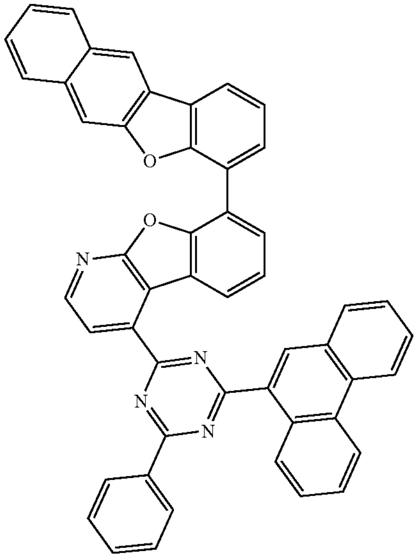

-continued
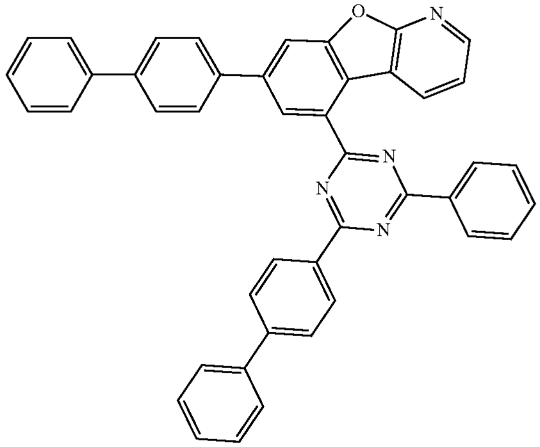
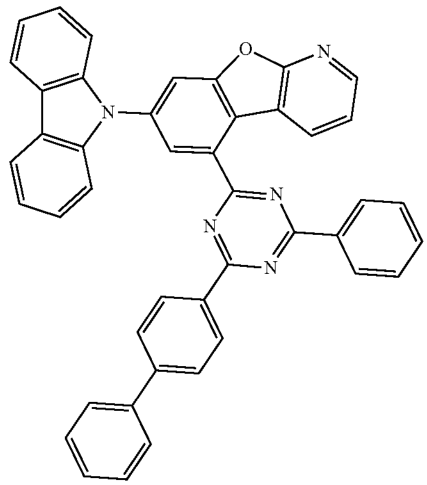
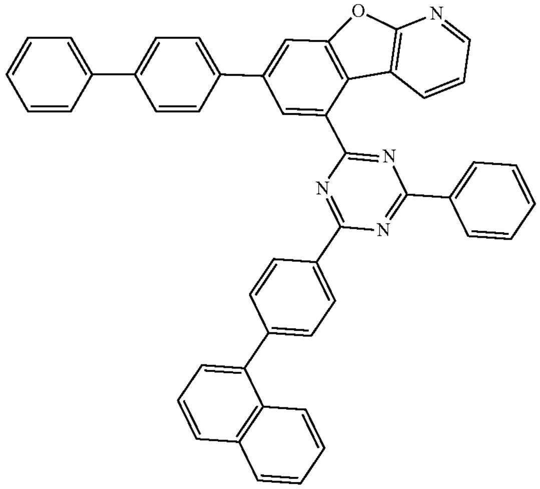
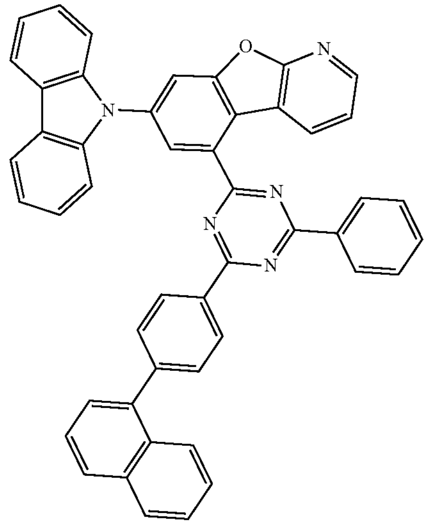
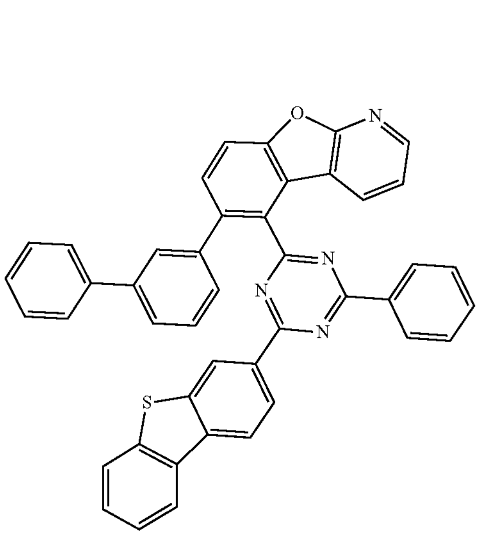
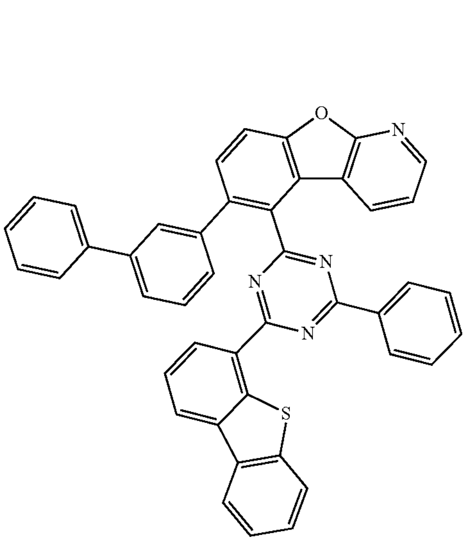

-continued
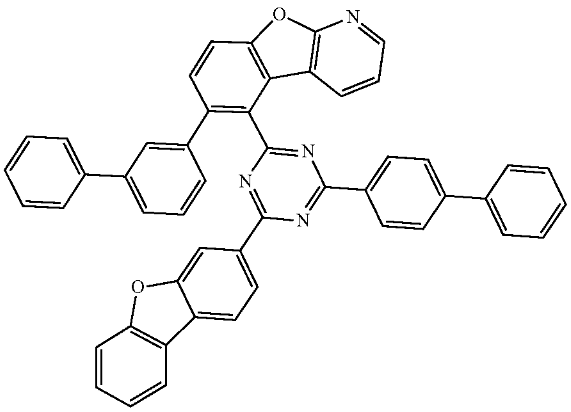
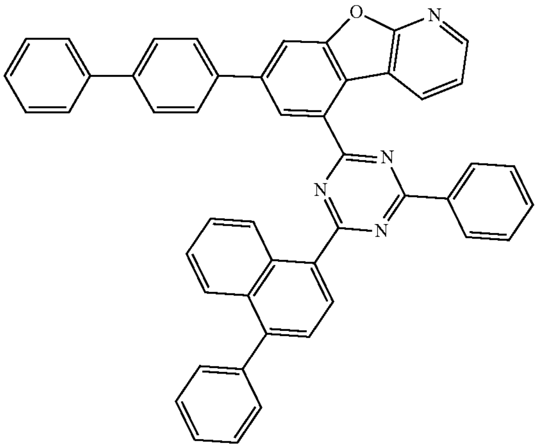
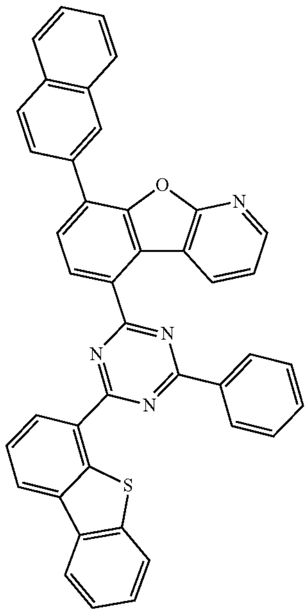
-continued
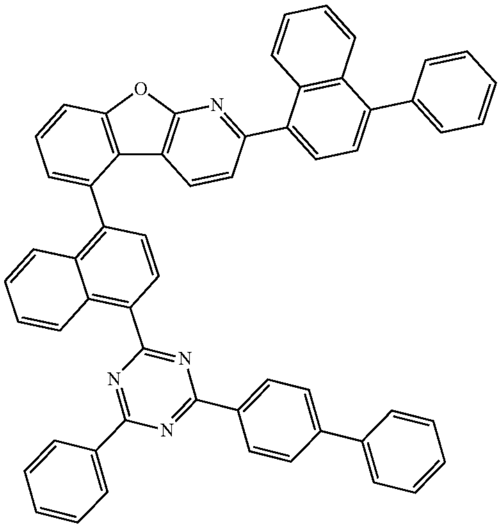
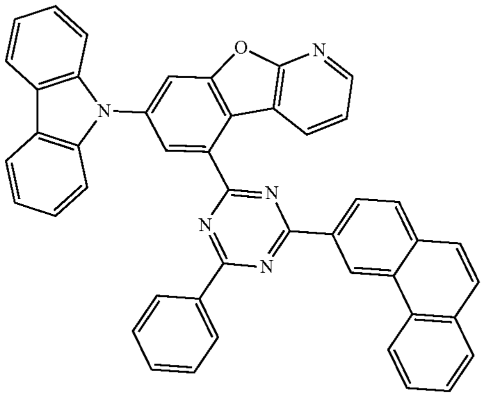
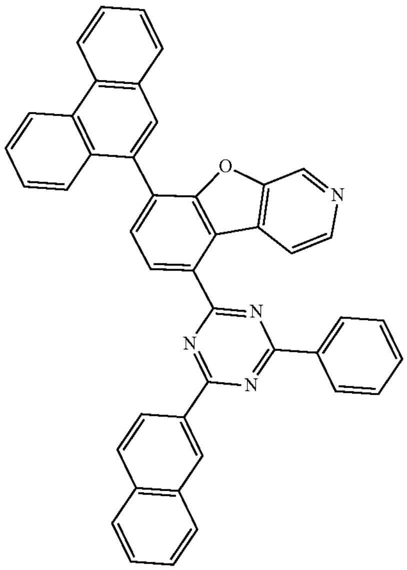

-continued
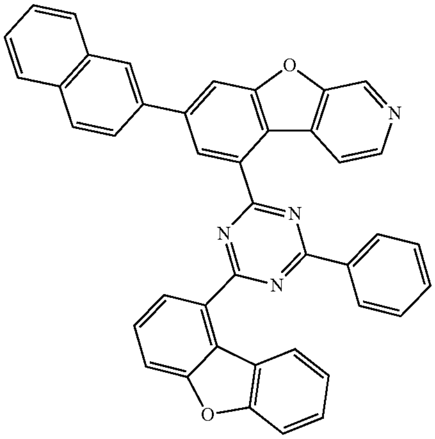
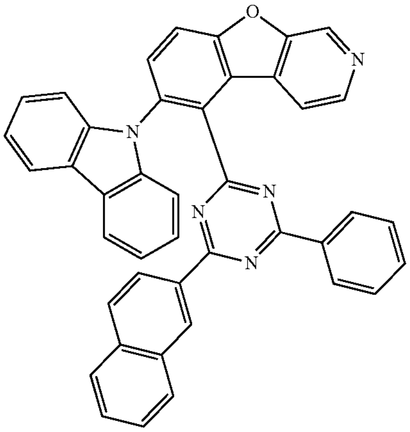
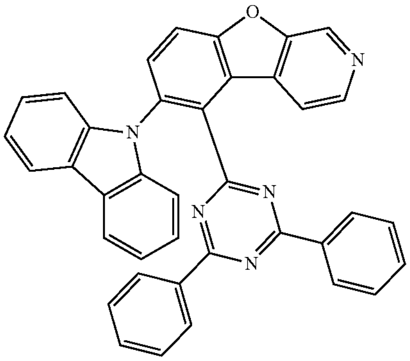
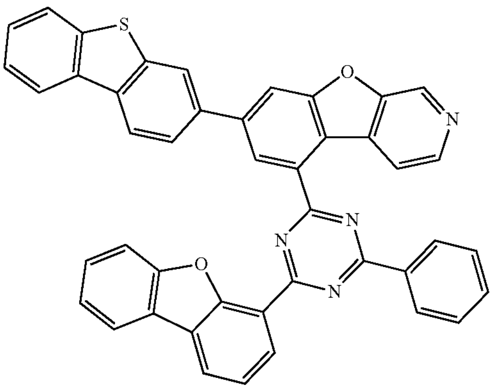
-continued
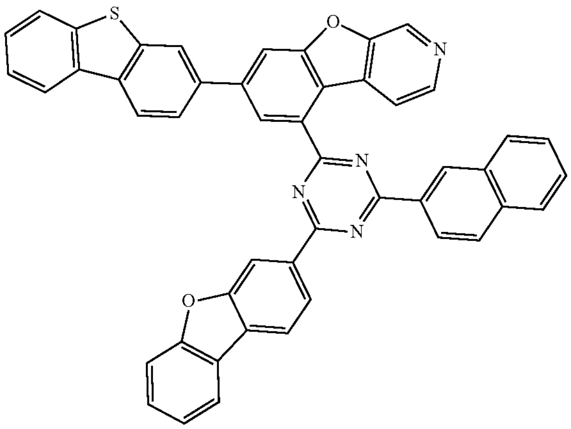
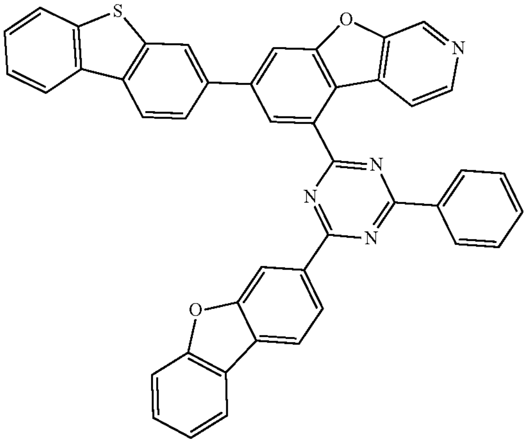
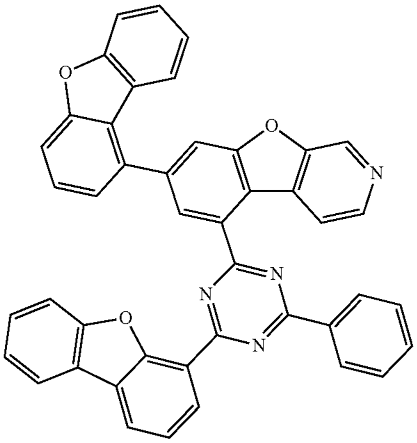

-continued
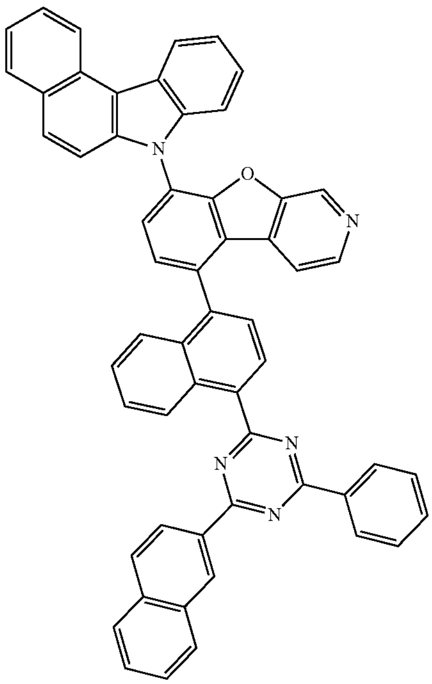
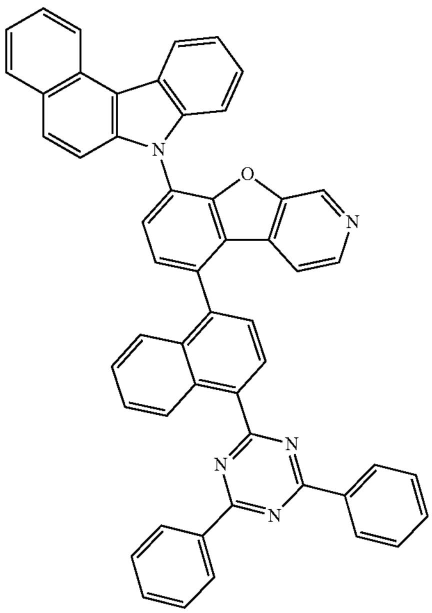
-continued
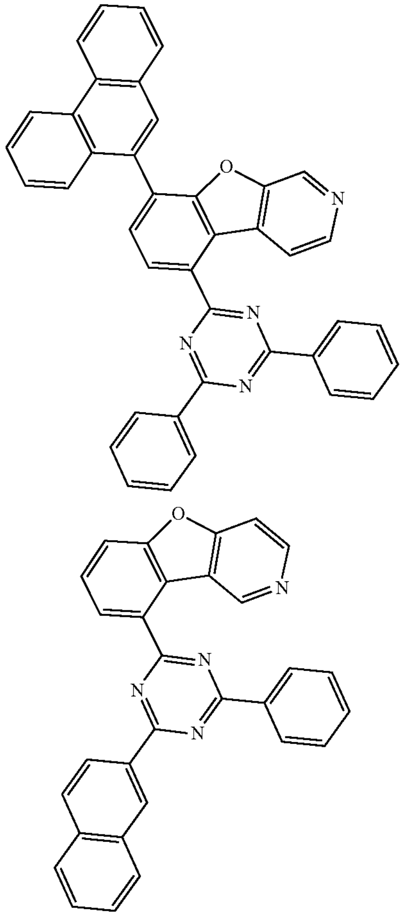
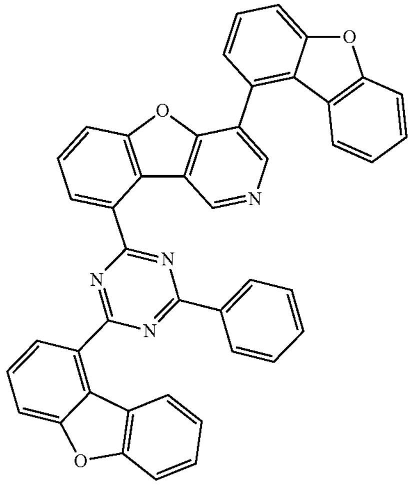

-continued
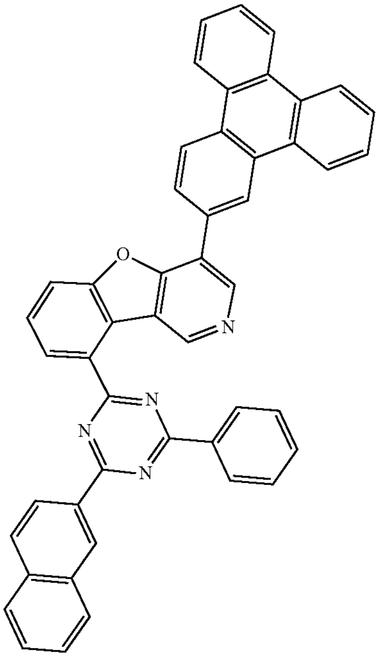
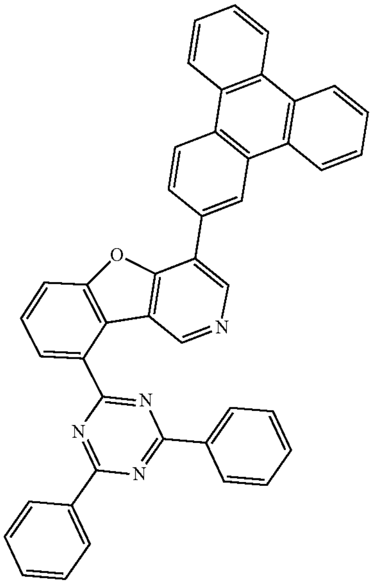
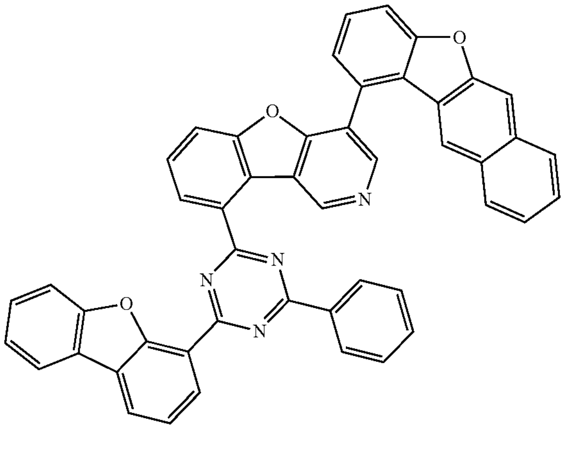
-continued
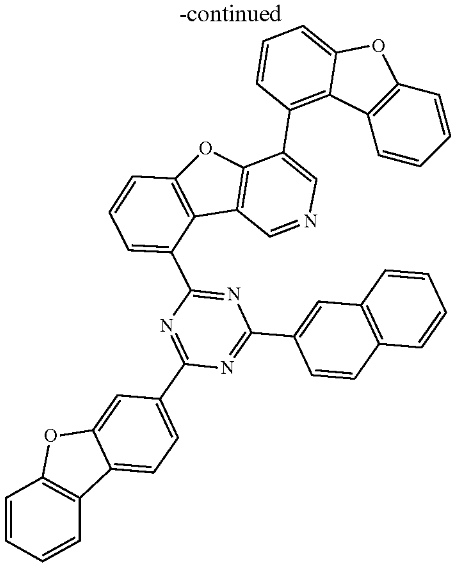
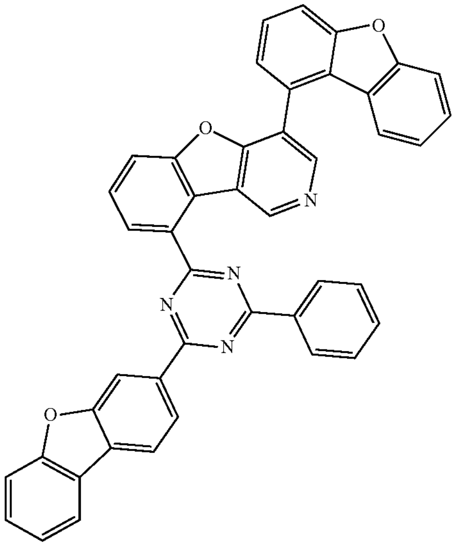
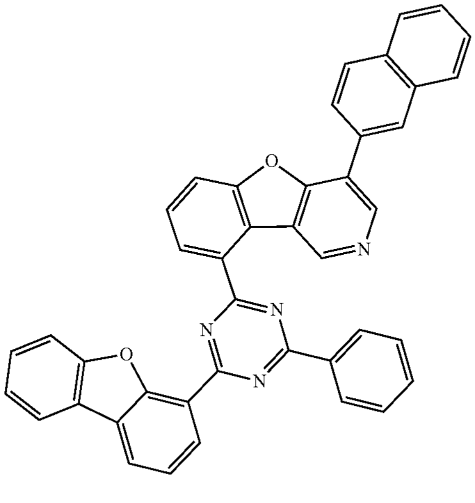

-continued
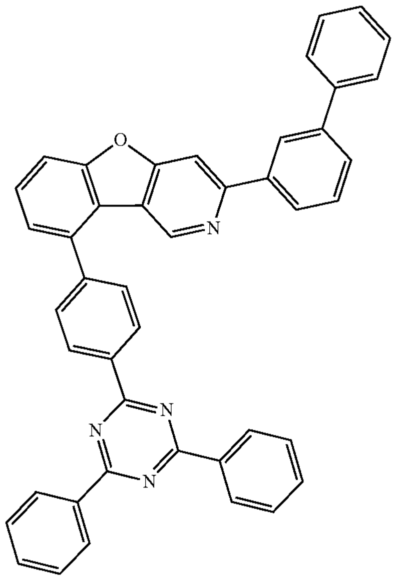
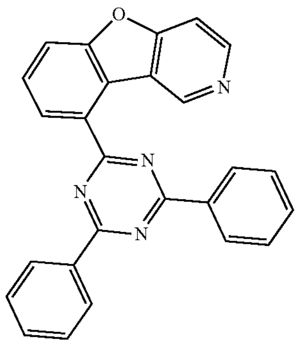 [SMILES: c1ccc(-c2nc(-c3ccccc3)nc(-c3cccc4oc5ccncc5c34)n2)cc1]
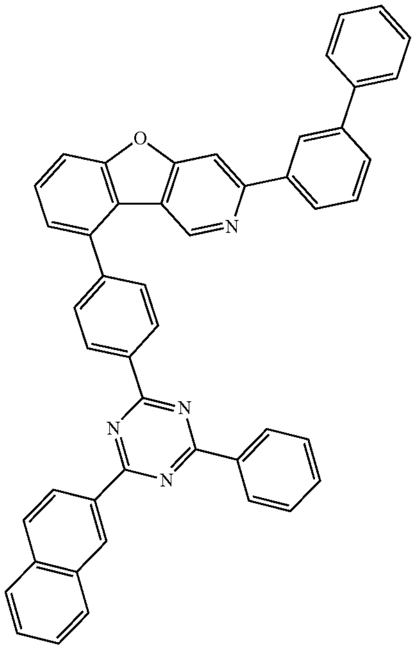
-continued
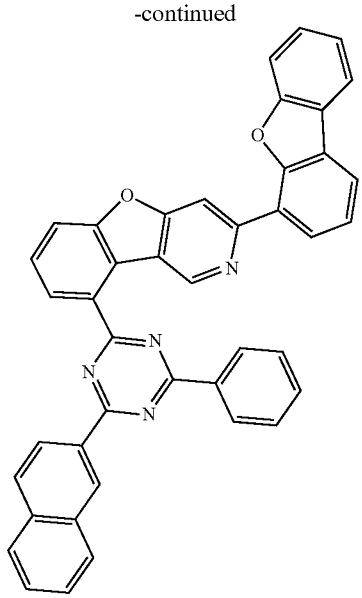
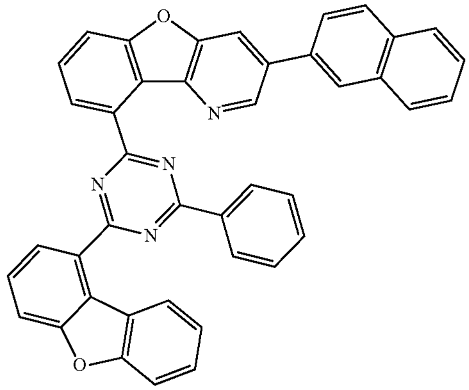
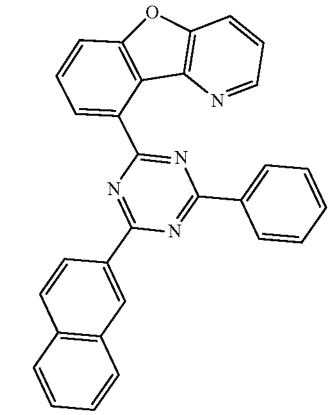
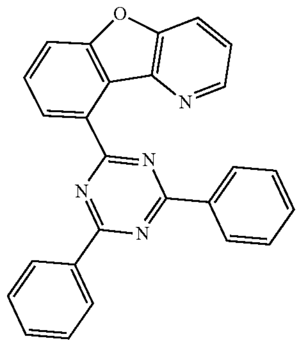

-continued
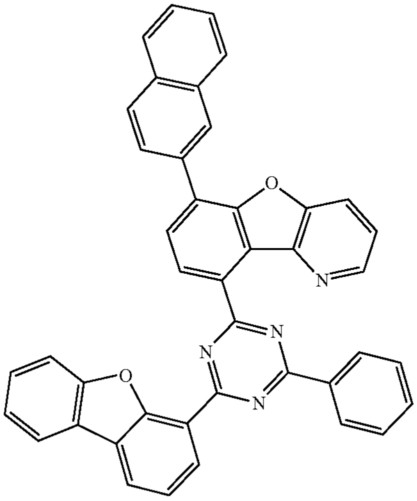
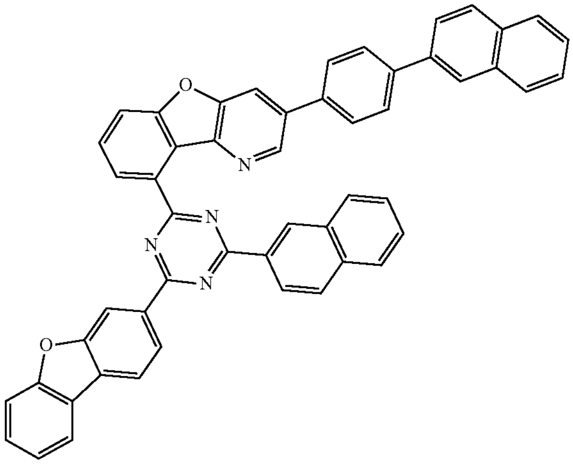
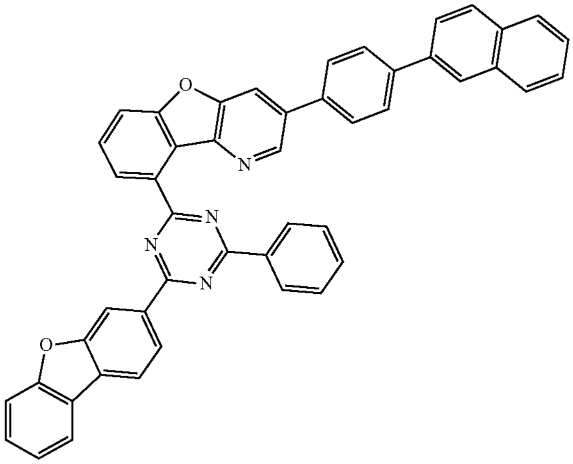
-continued
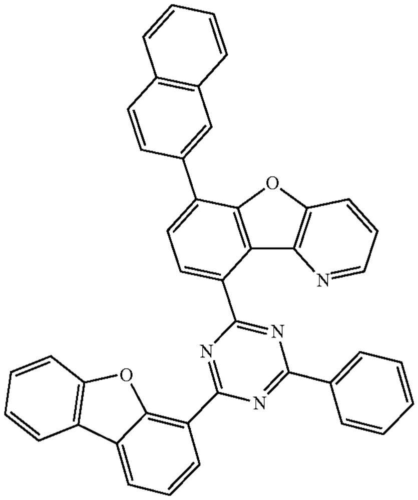
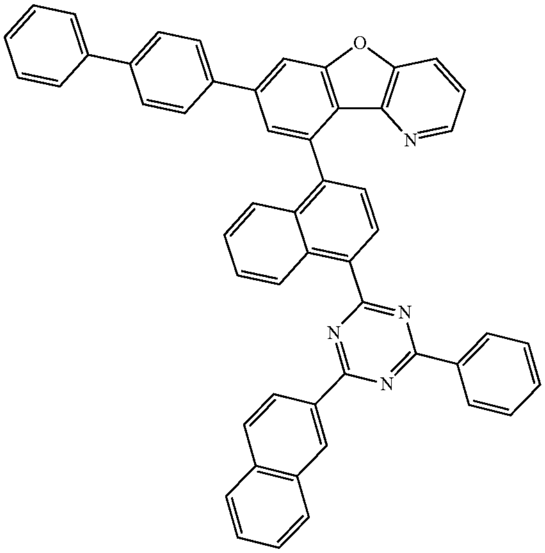
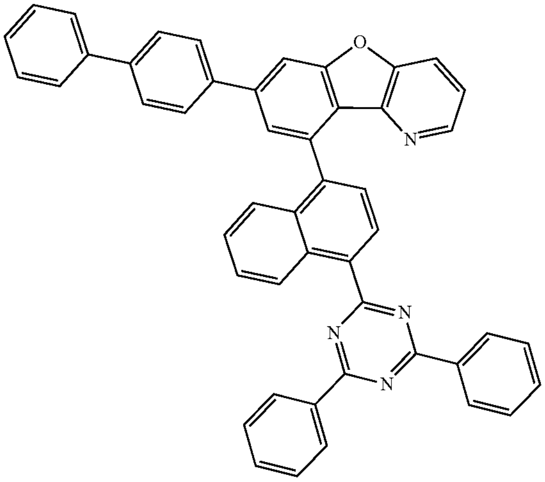

-continued
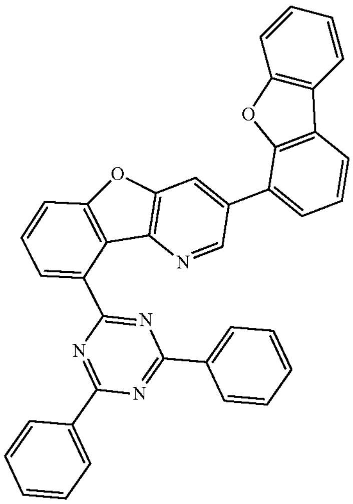
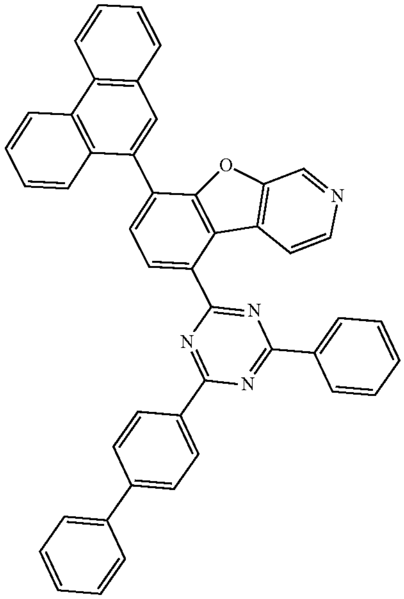
-continued
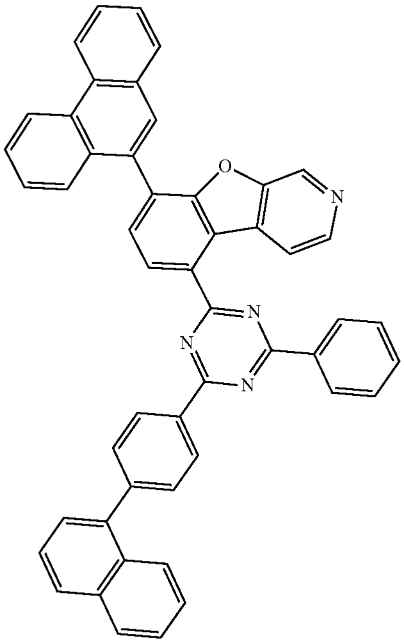
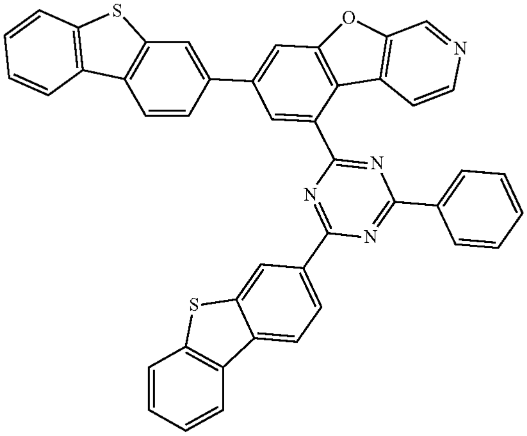
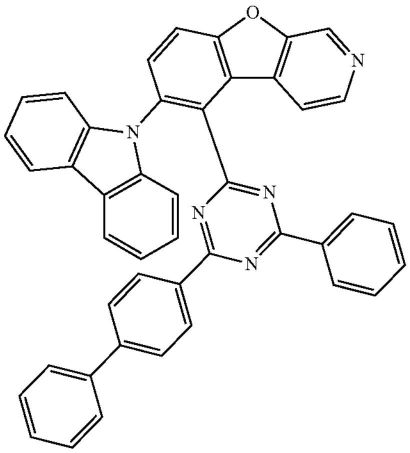

-continued
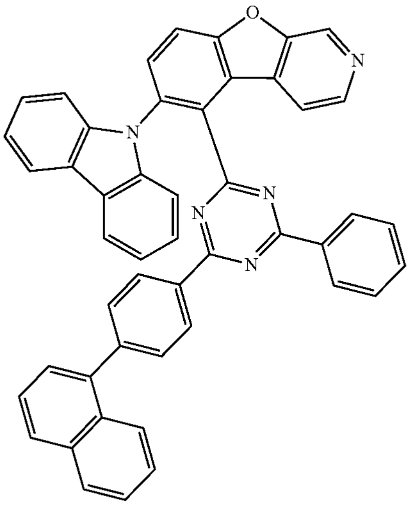
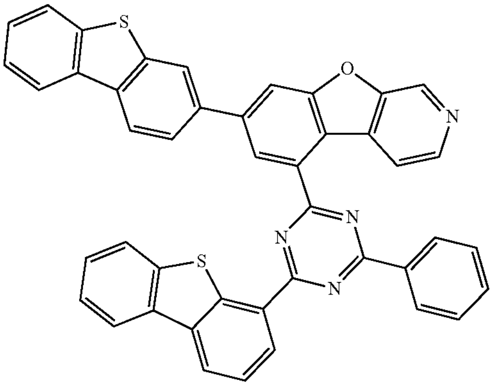
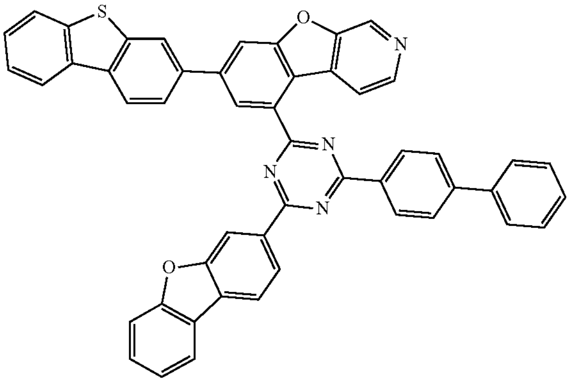
-continued
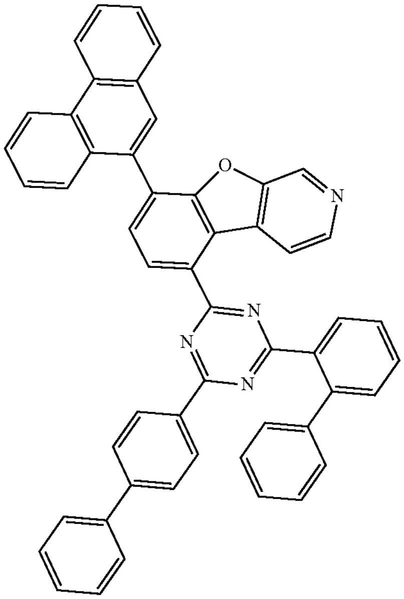
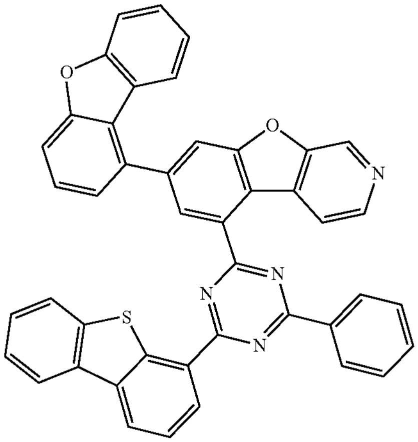

-continued
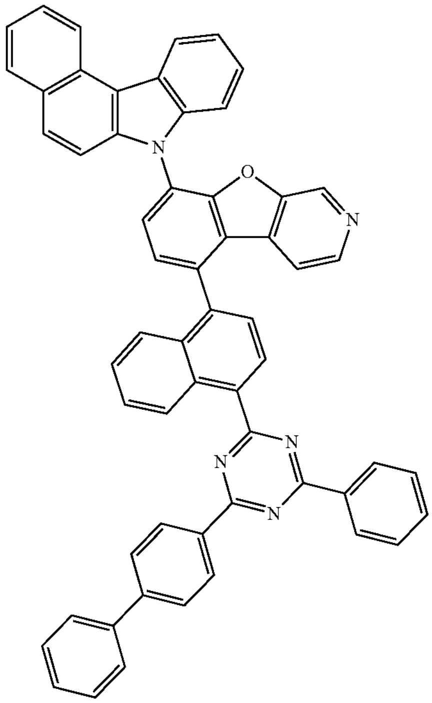
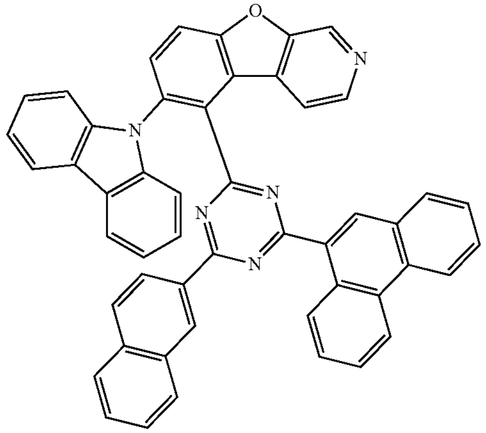
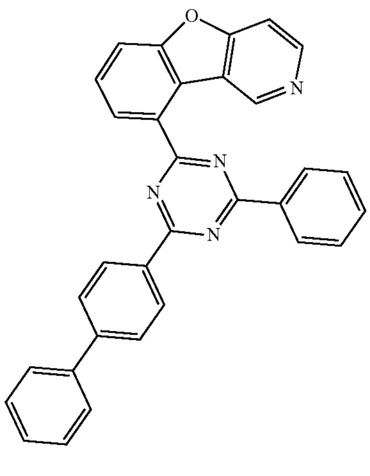
-continued
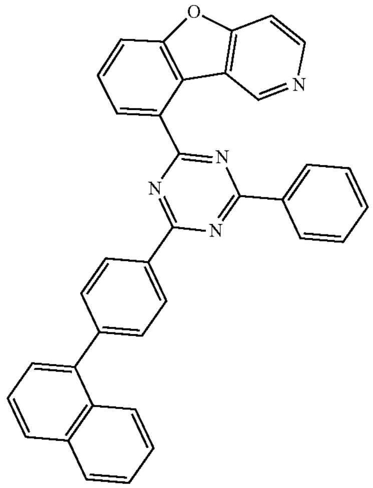
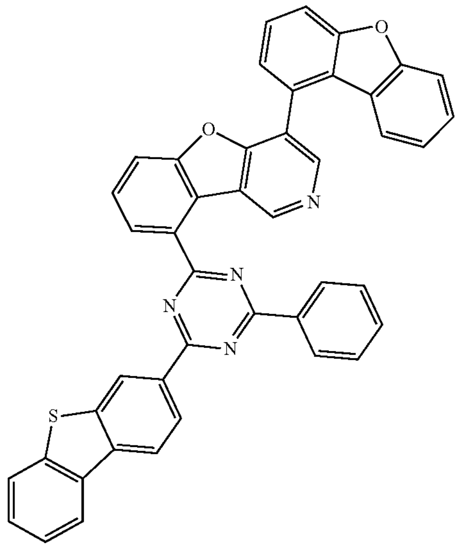
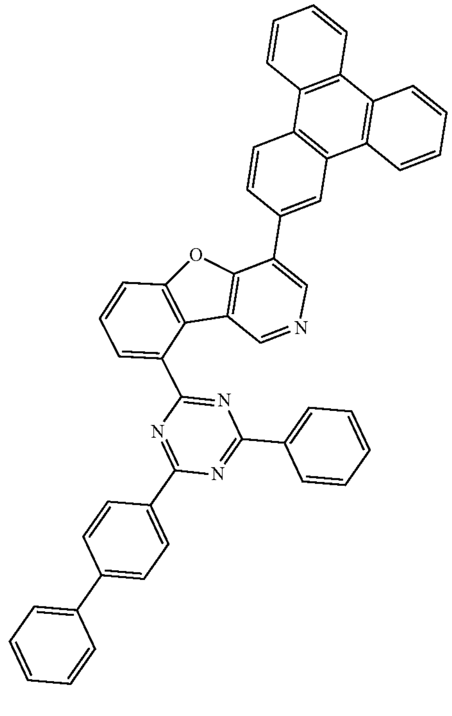

-continued
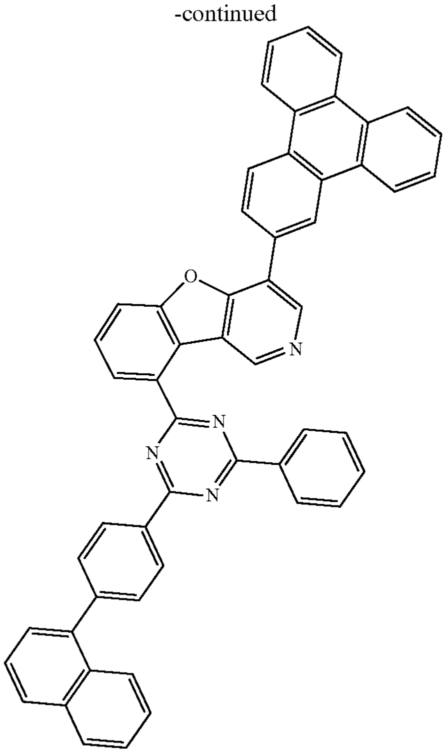
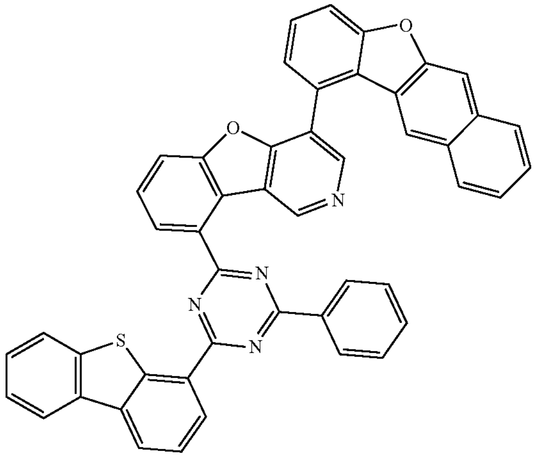
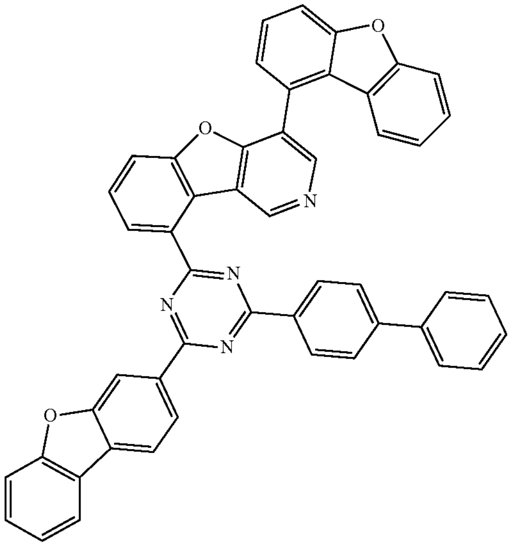
-continued
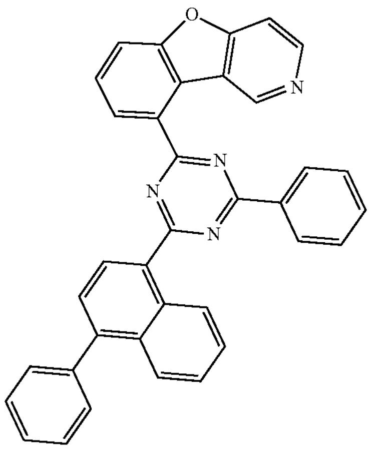
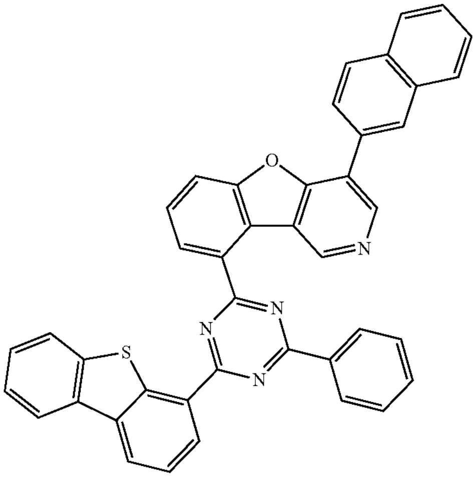
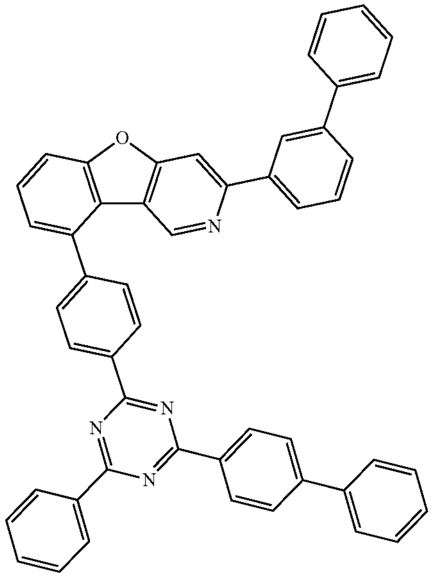

-continued
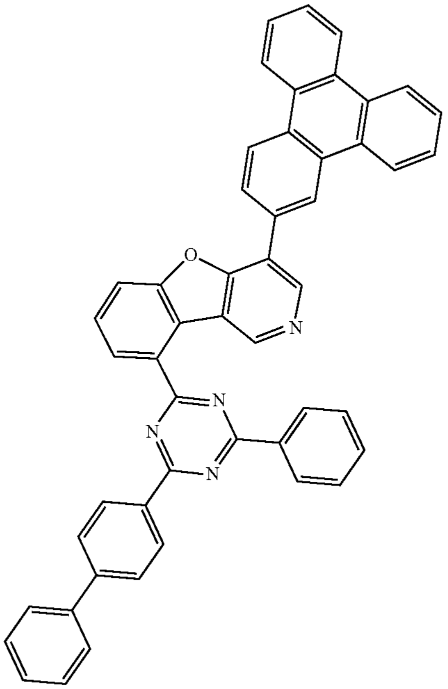
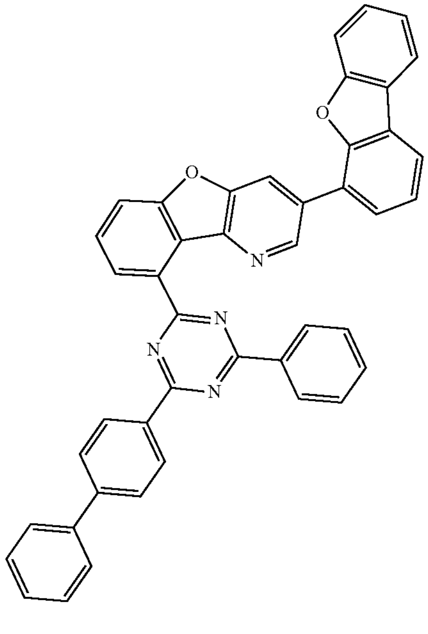
-continued
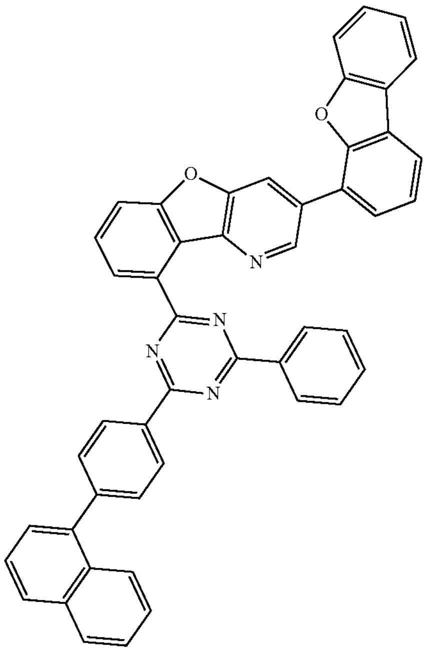
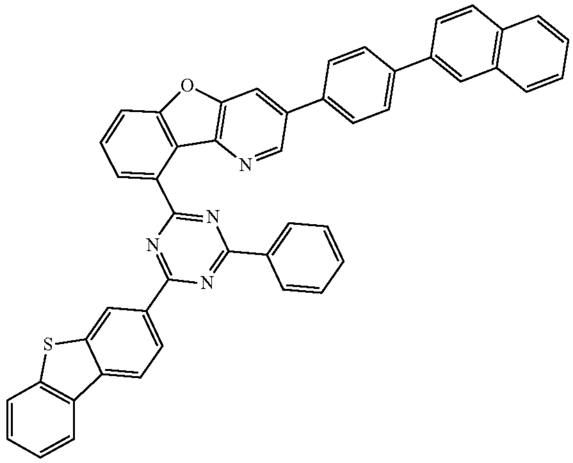
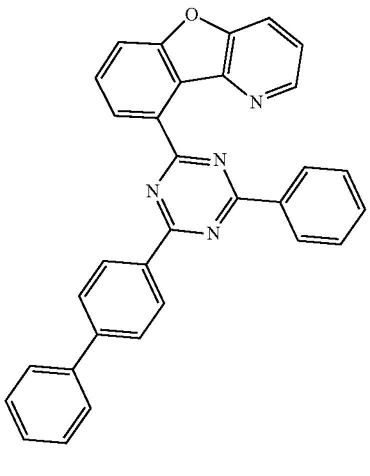

-continued
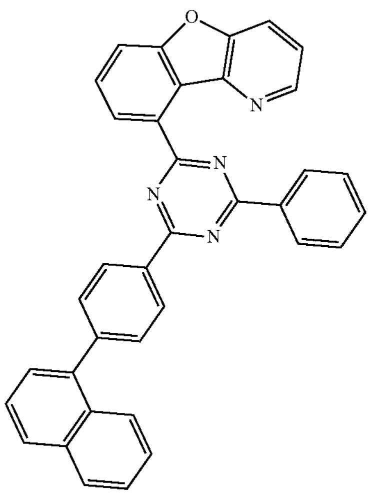
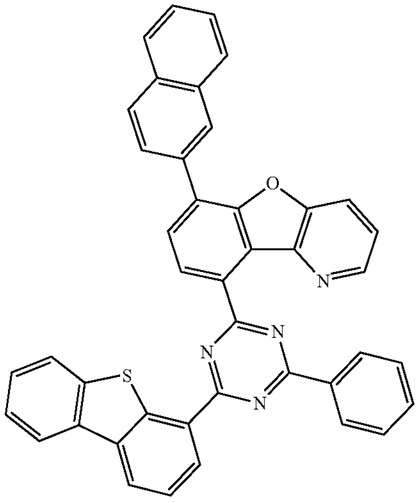
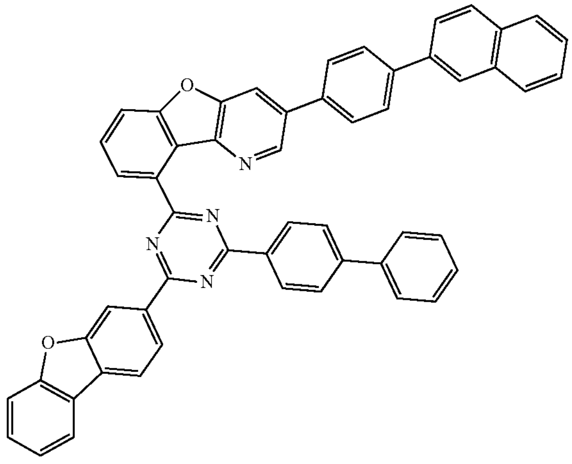
-continued
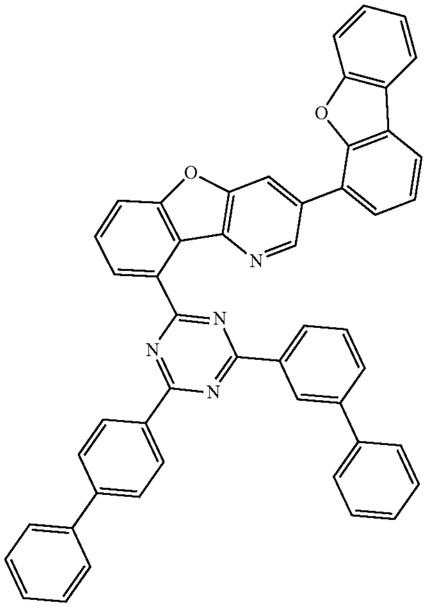
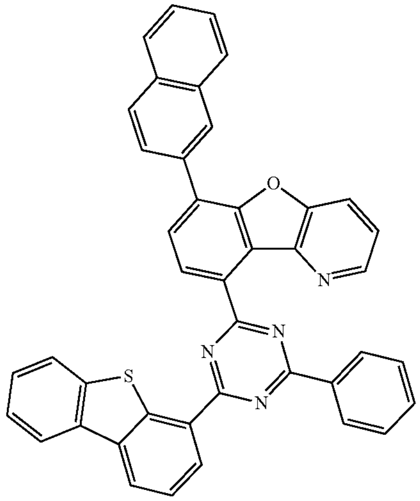
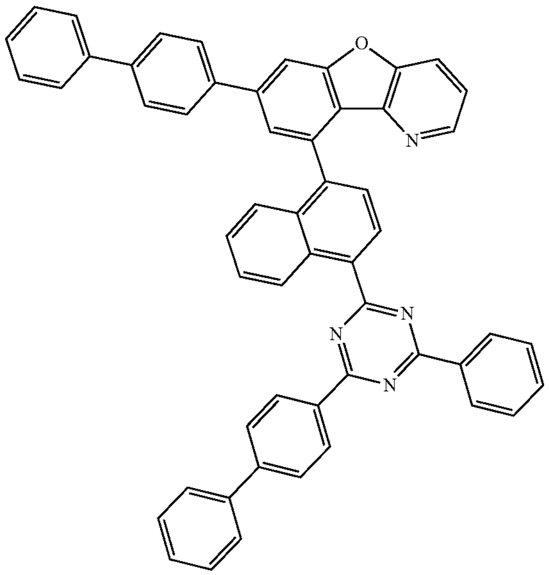

-continued
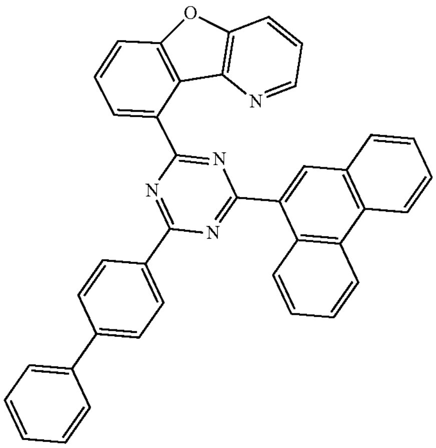 [SMILES: c1ccc(-c2ccc(-c3nc(-c4cc5ccccc5c5ccccc45)nc(-c4cccc5oc6cccnc6c45)n3)cc2)cc1]
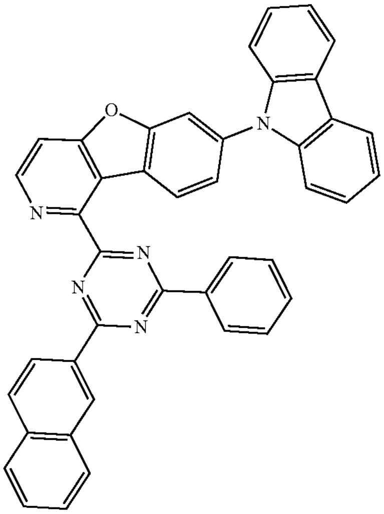
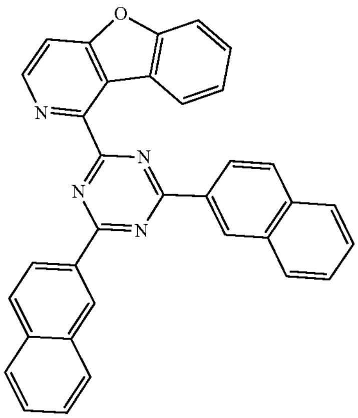
-continued
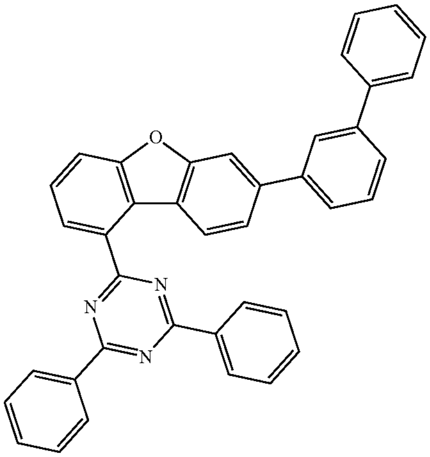
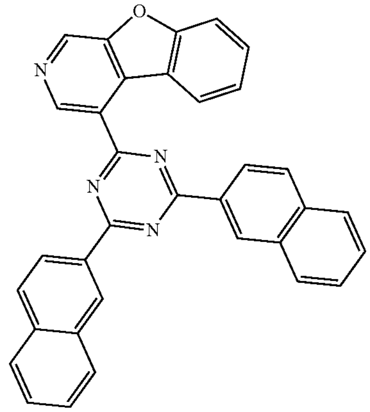
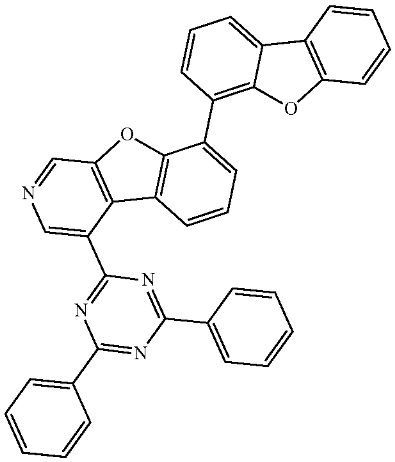

-continued
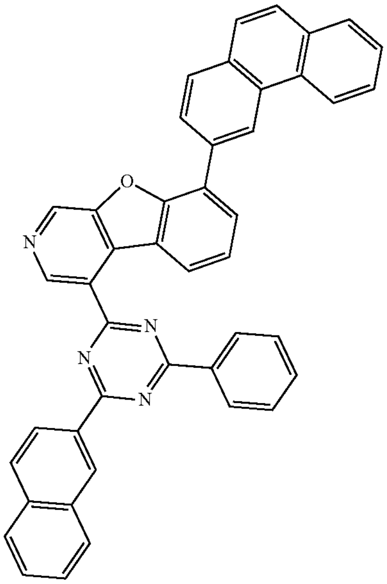
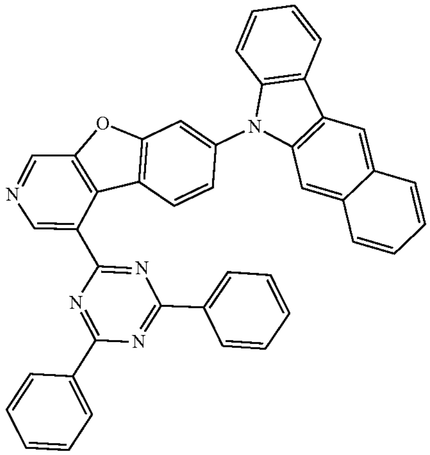
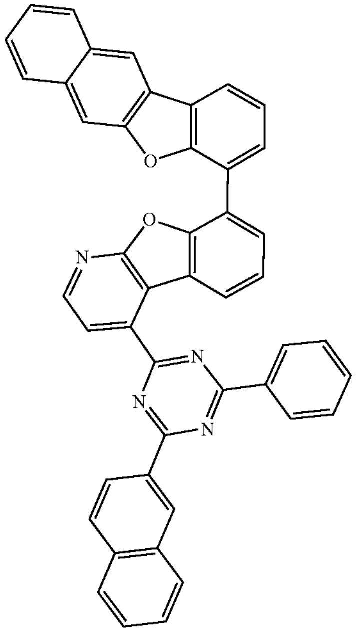
-continued
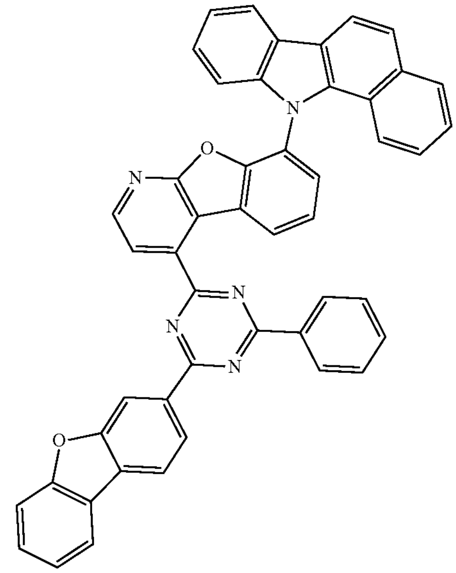
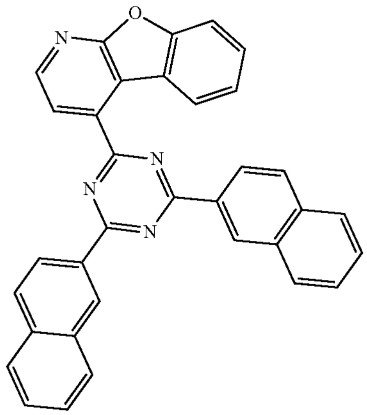
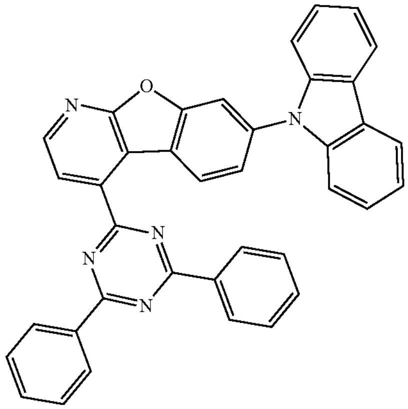

-continued
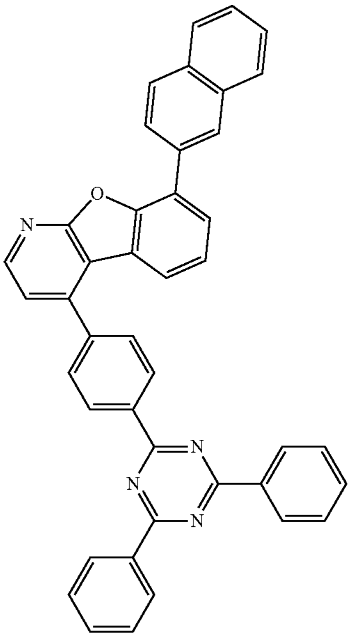
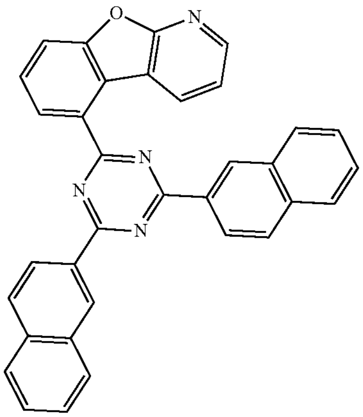
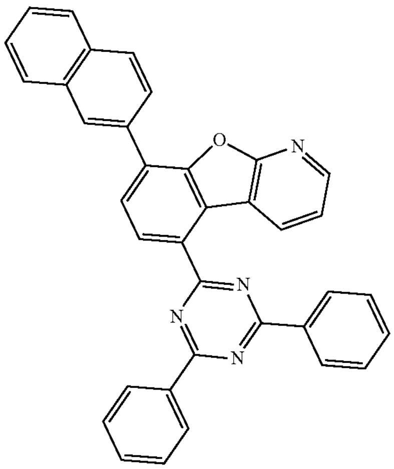
-continued
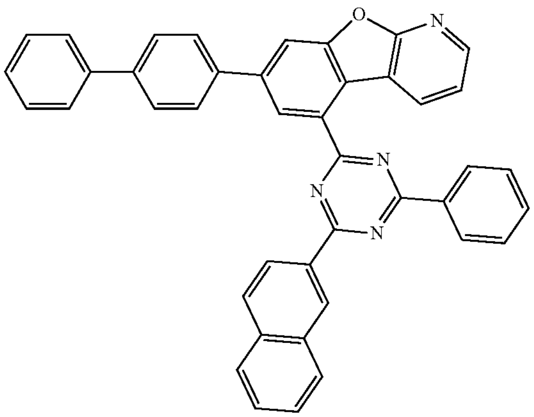
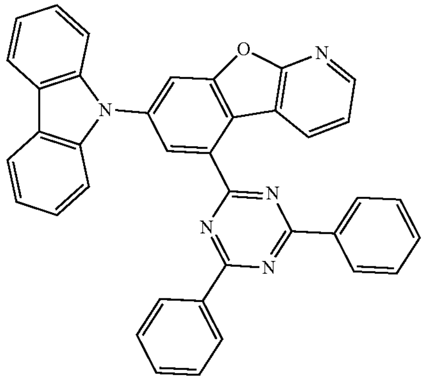
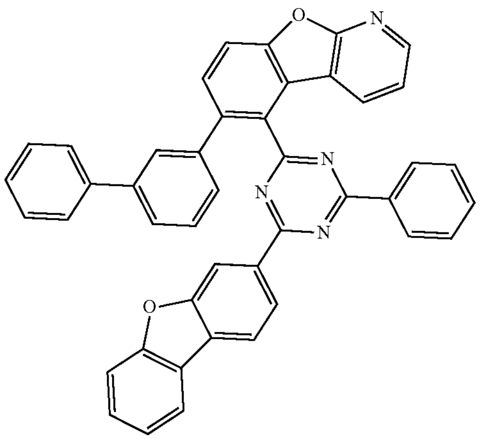

-continued
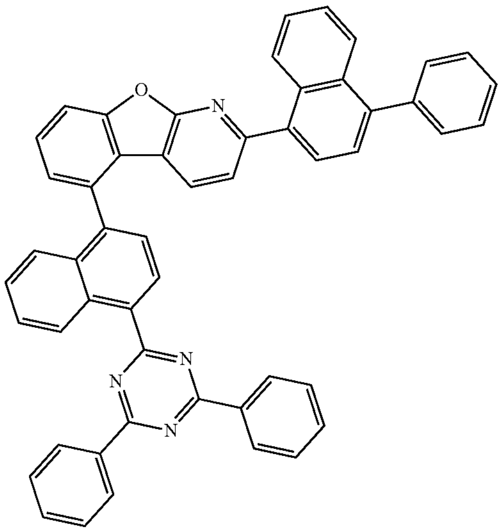
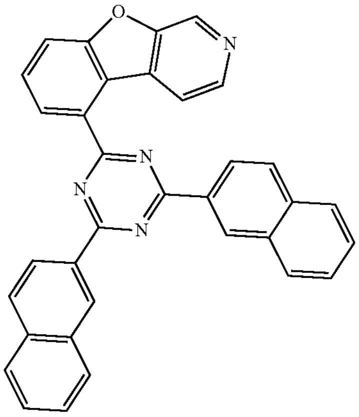
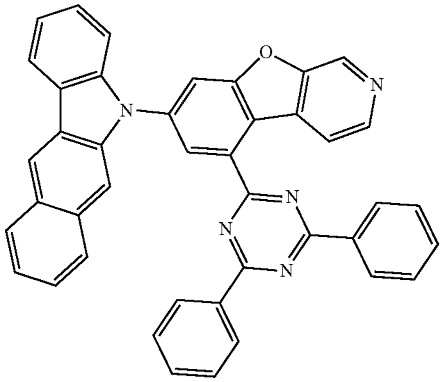
-continued
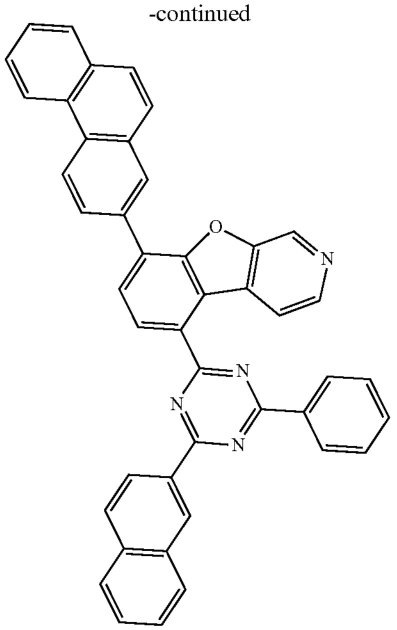
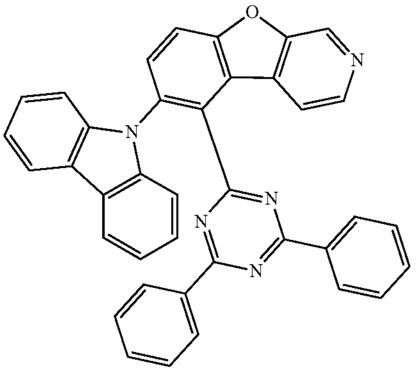
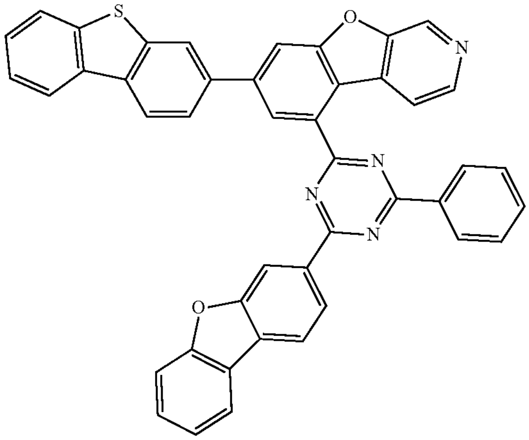

-continued
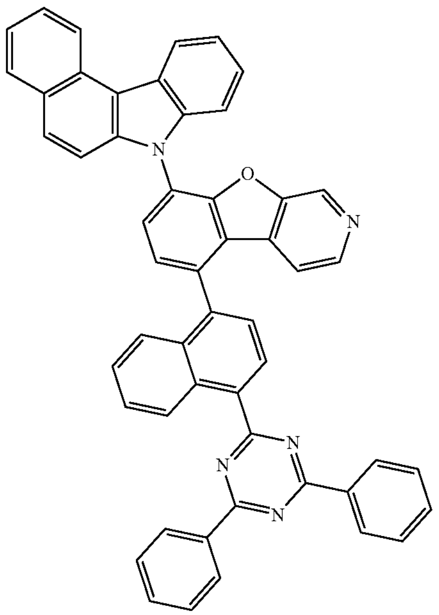
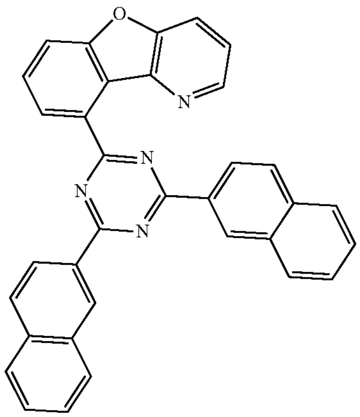
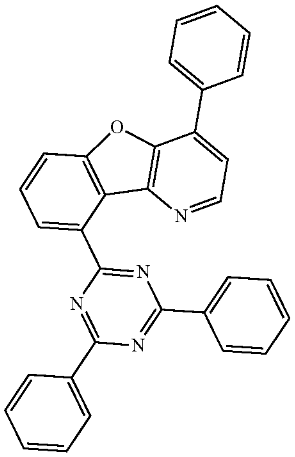
-continued
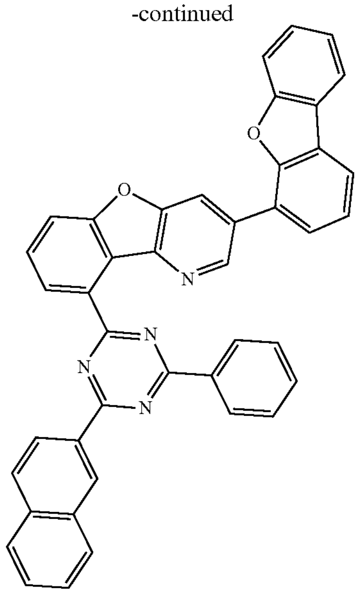
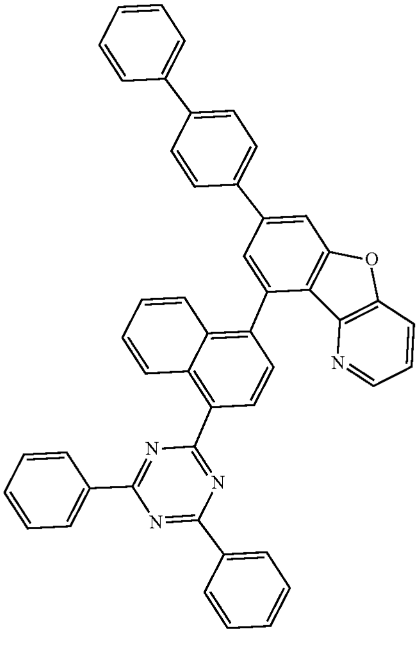
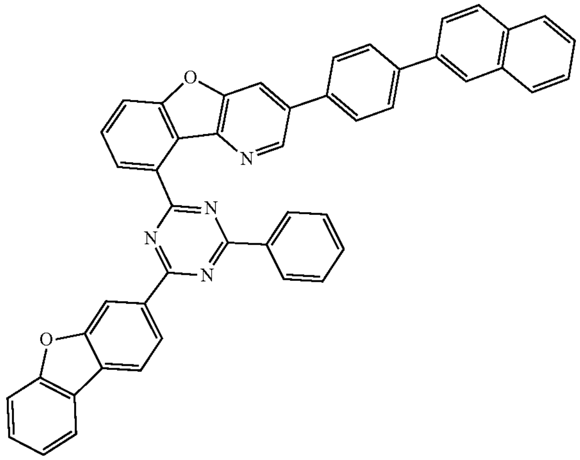

-continued
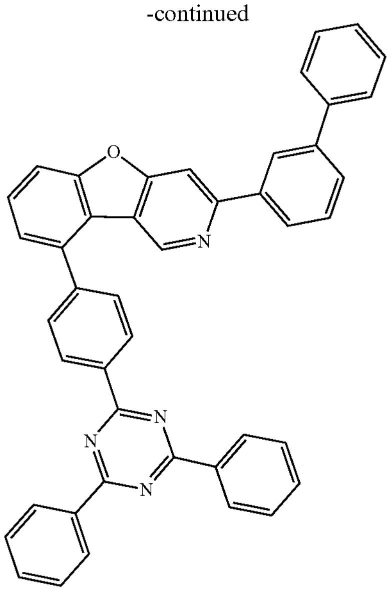
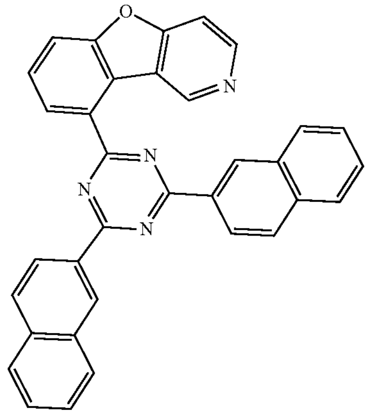
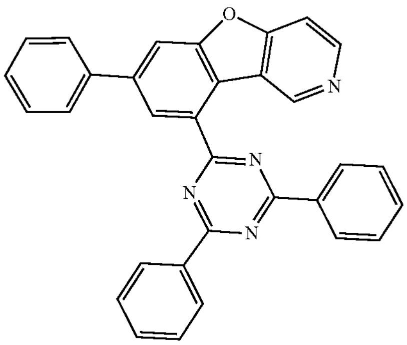
-continued
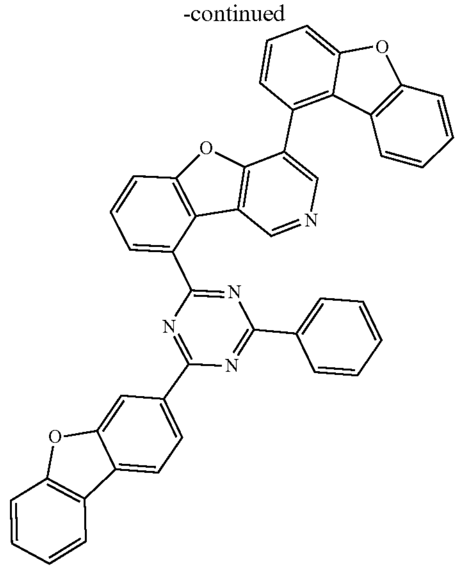
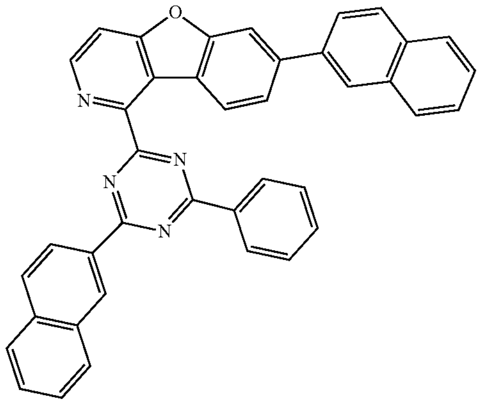
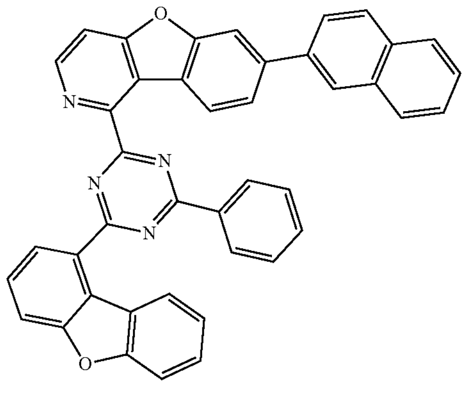

-continued
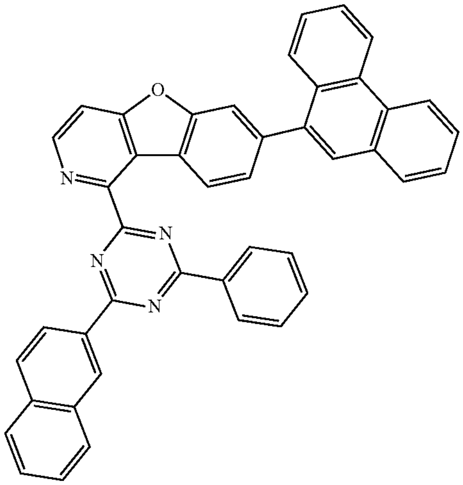
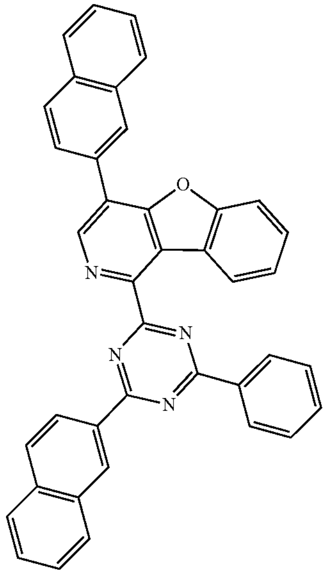
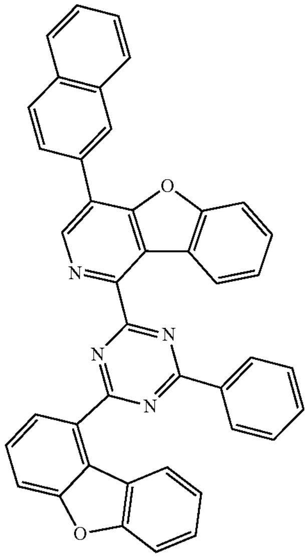
-continued
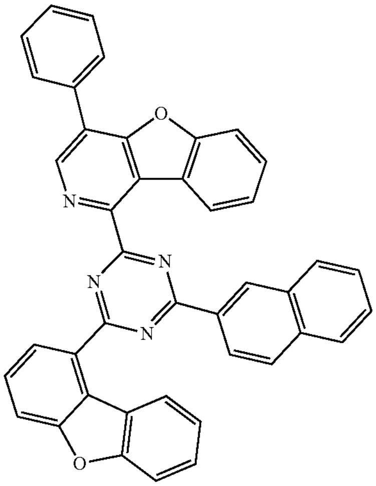
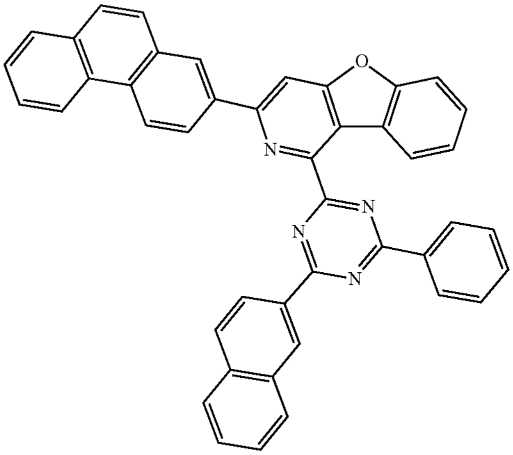
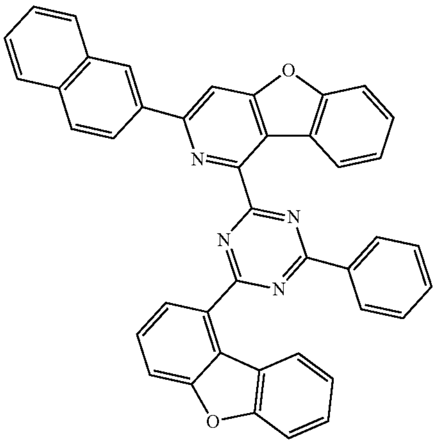

-continued
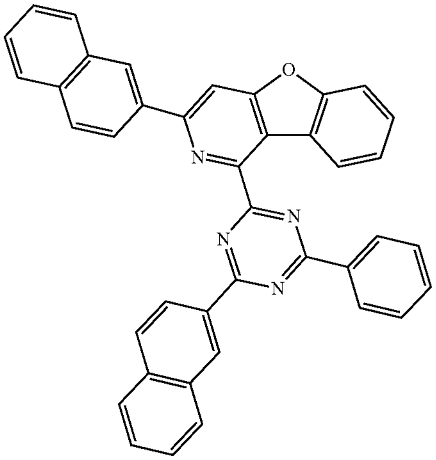
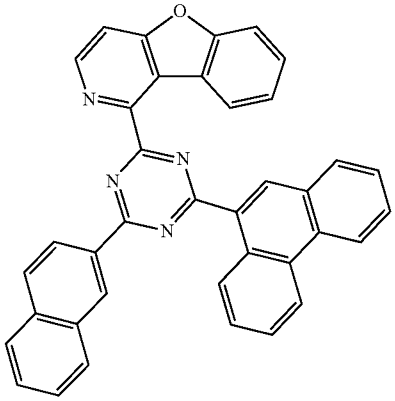
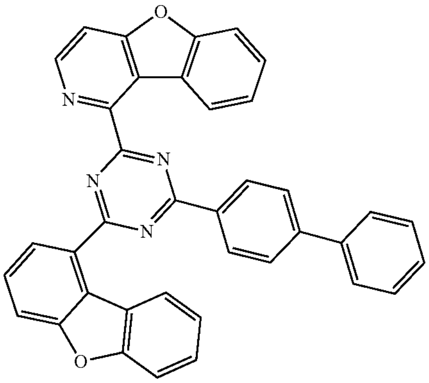
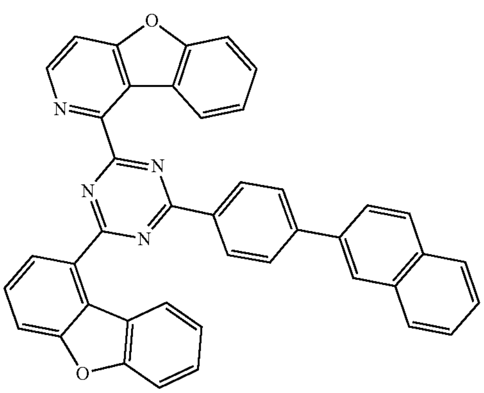
-continued
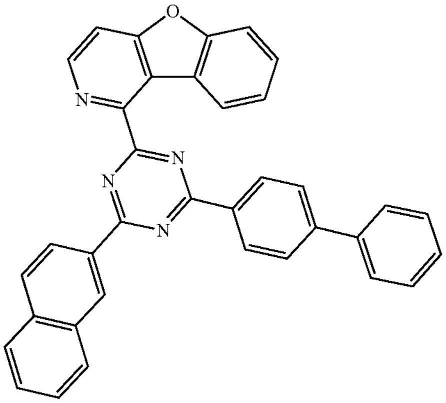
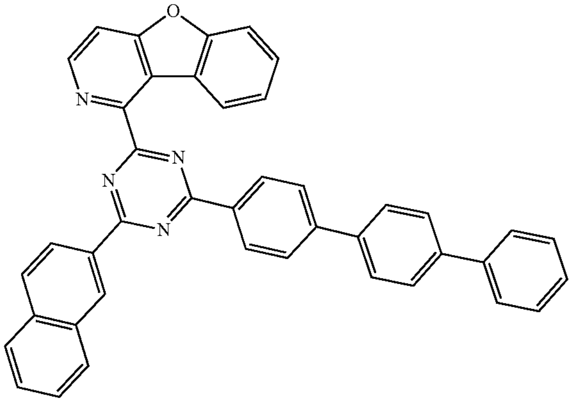
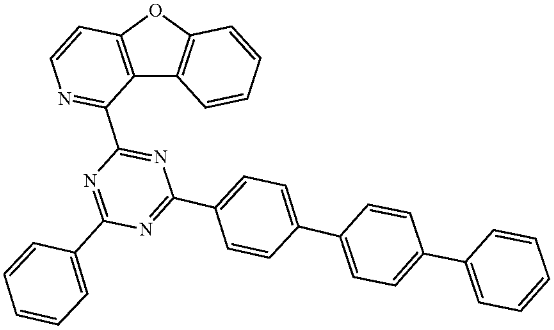
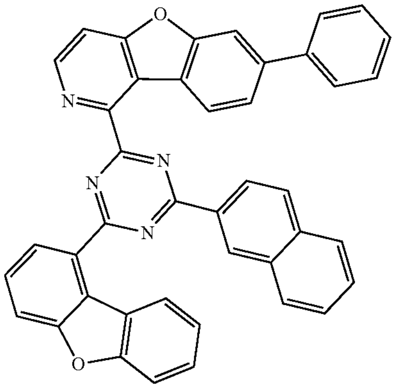

-continued
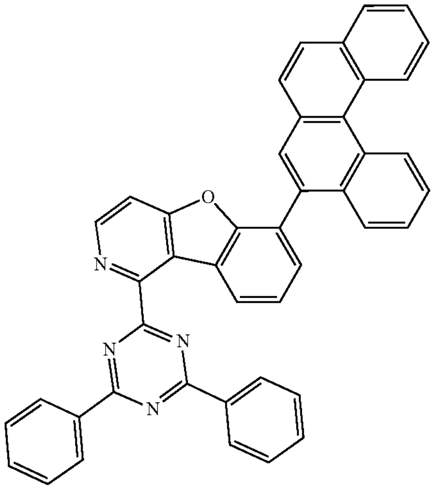
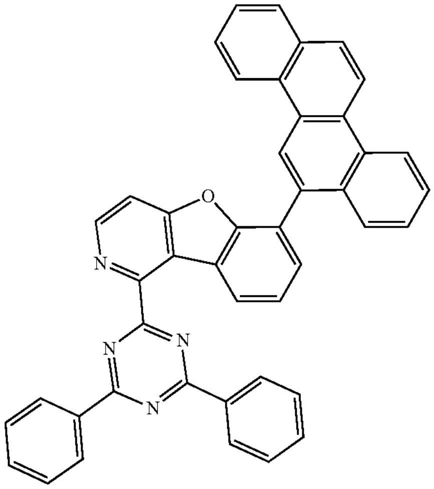
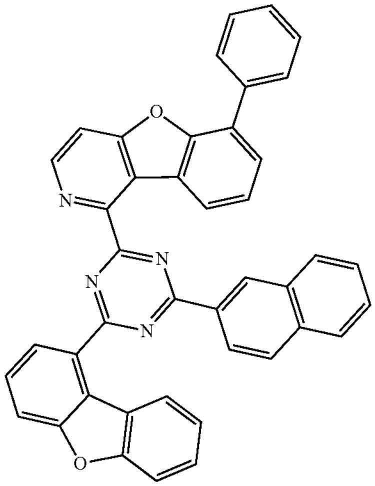
-continued
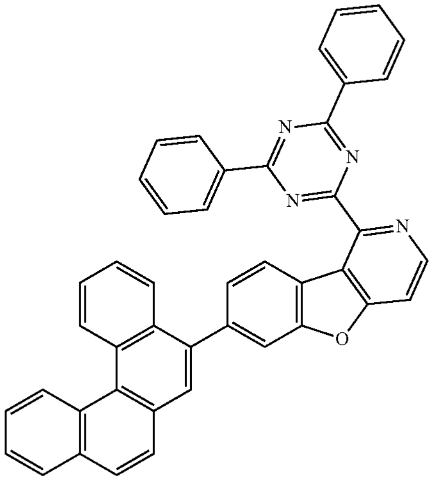
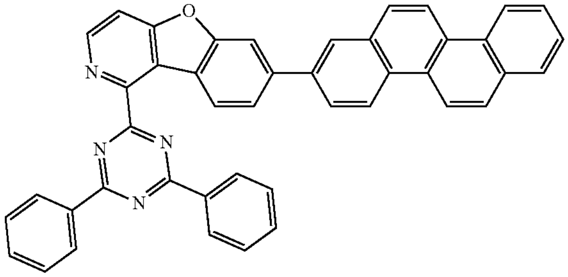
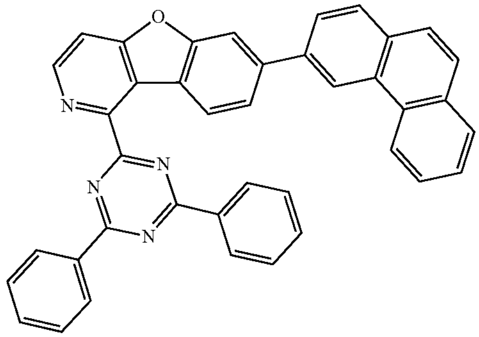
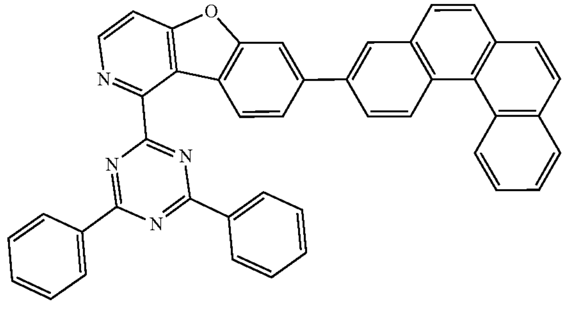
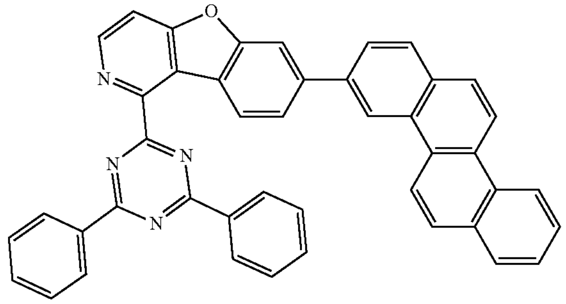

-continued
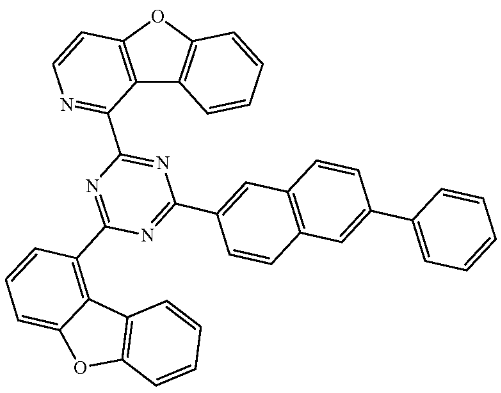
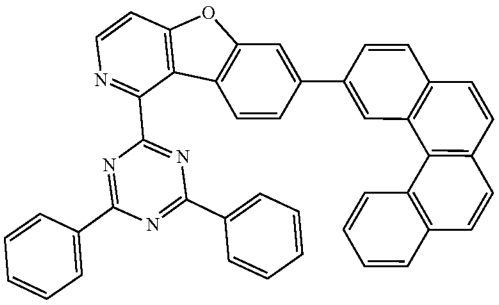
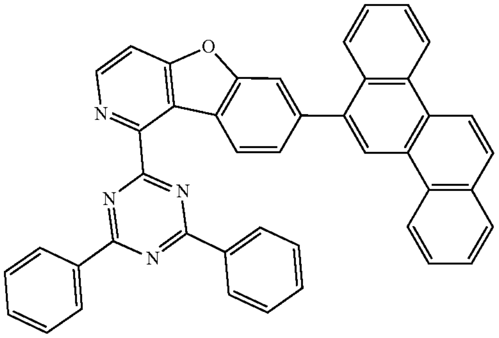
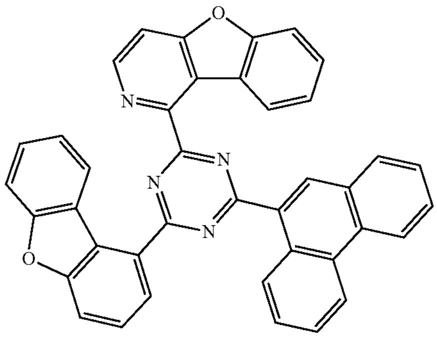
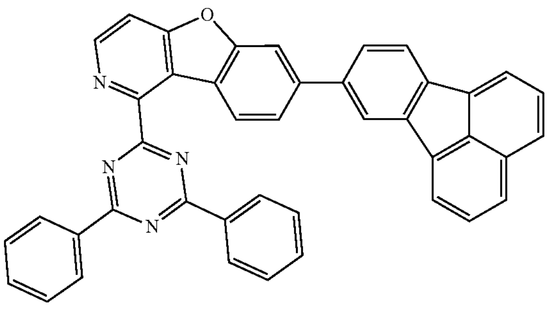
-continued
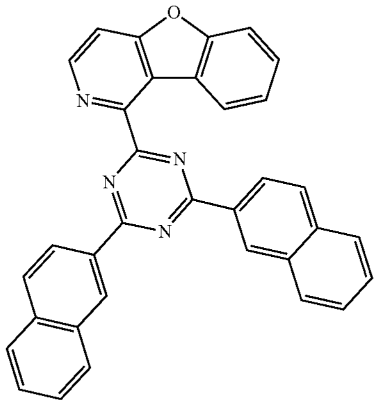
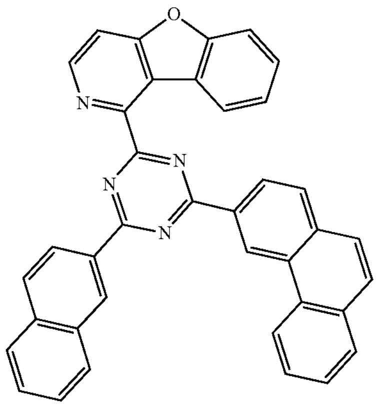
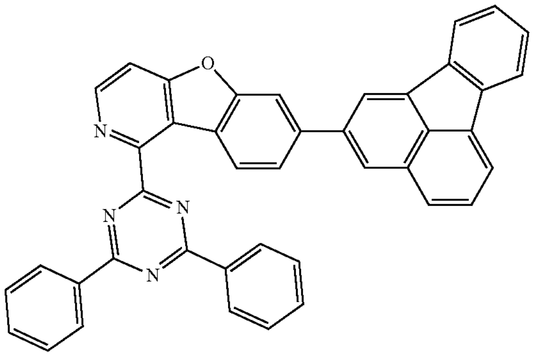
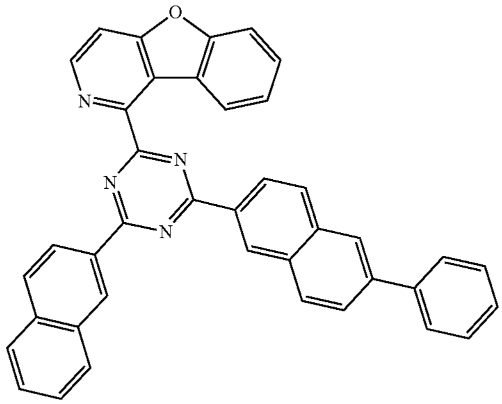

-continued
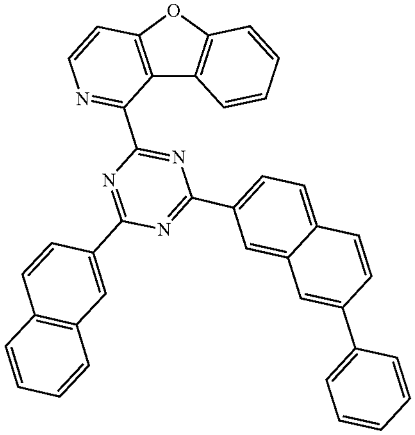
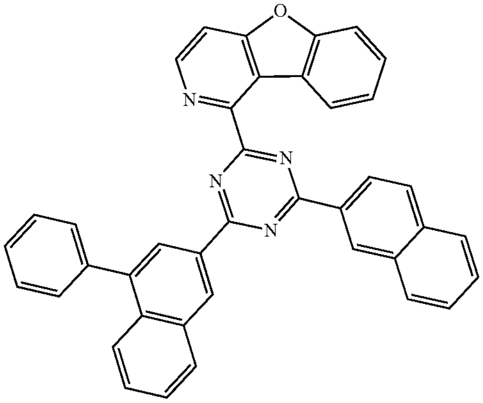
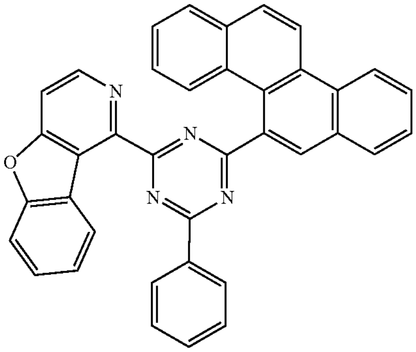
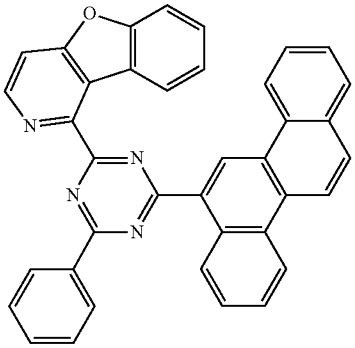
-continued
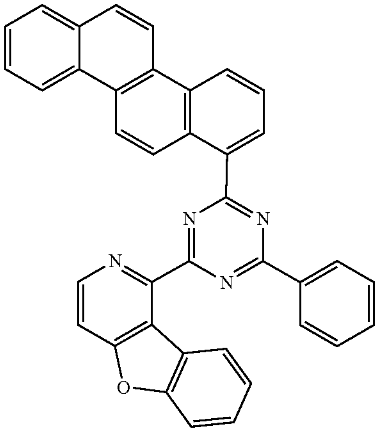
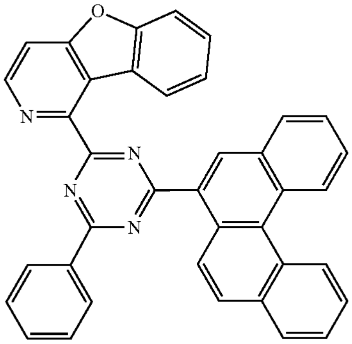
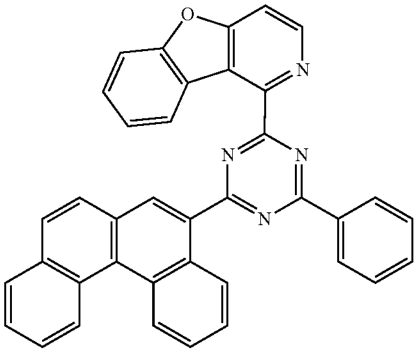
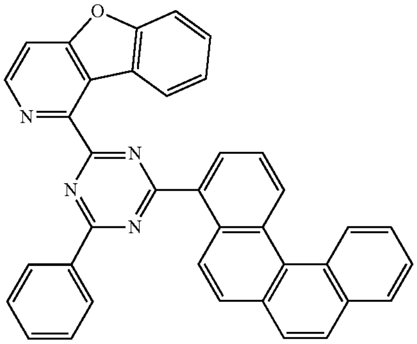

-continued
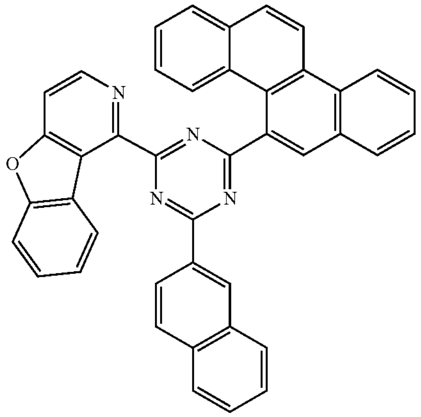
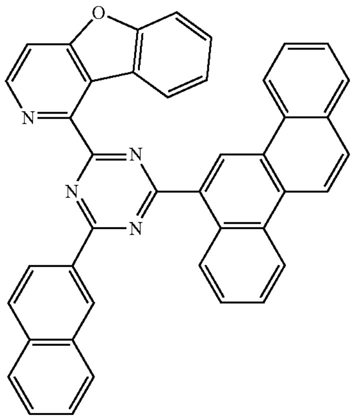
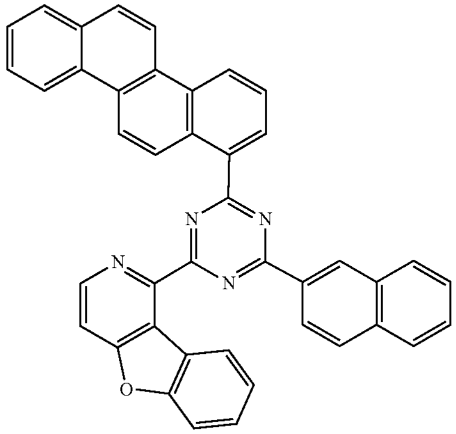
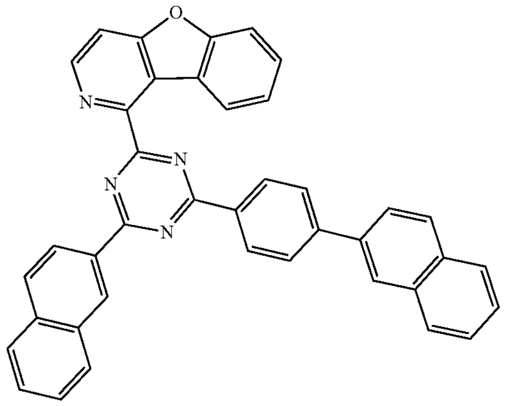
-continued
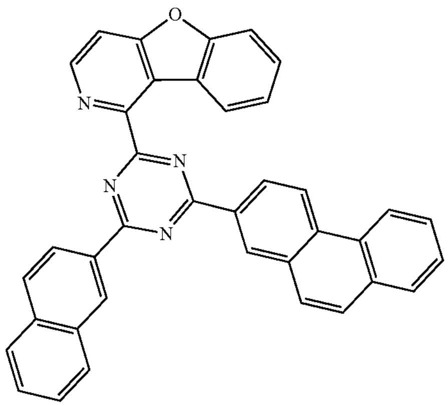
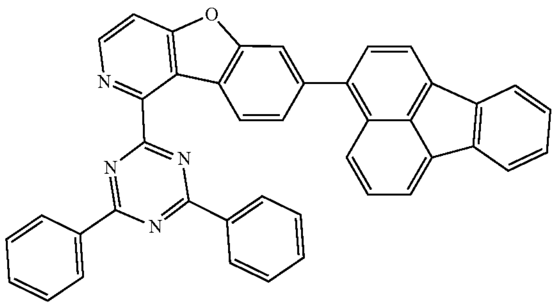
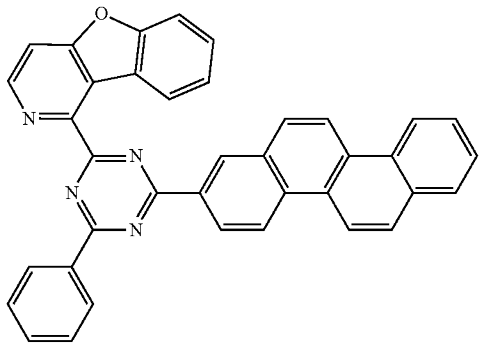
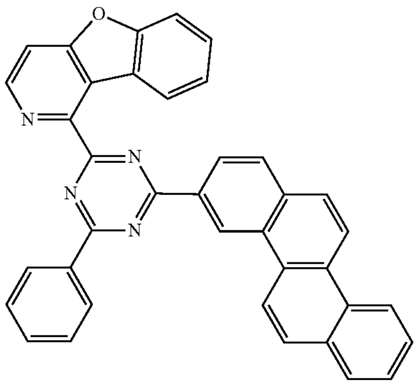

-continued
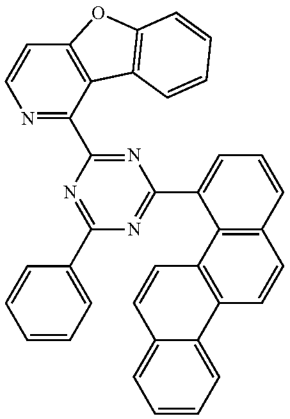
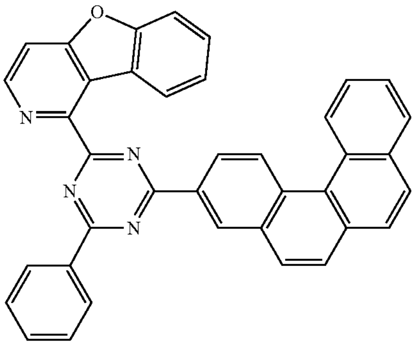
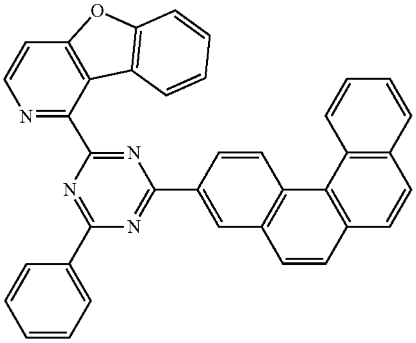
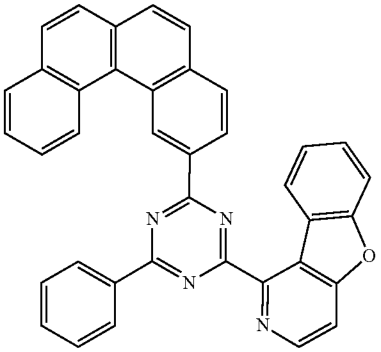
-continued
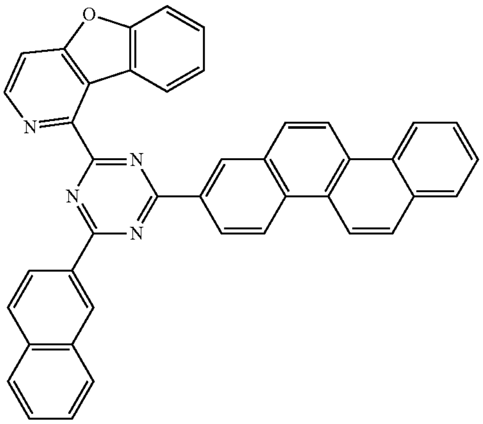
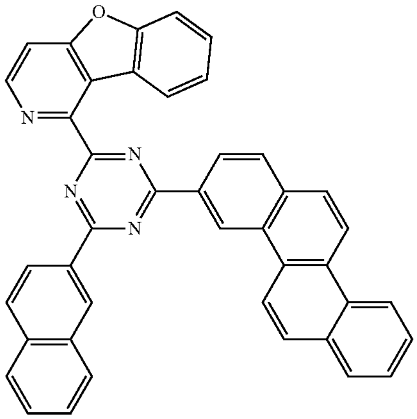
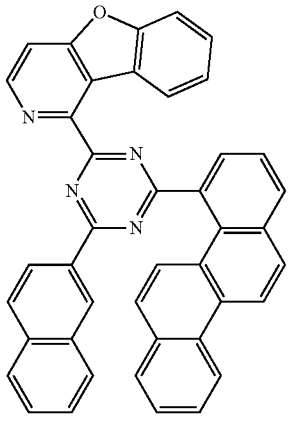

-continued
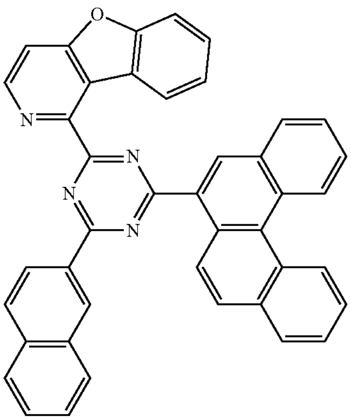
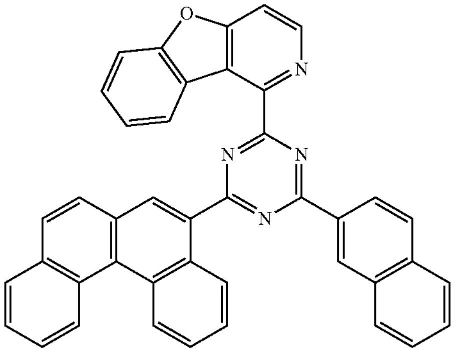
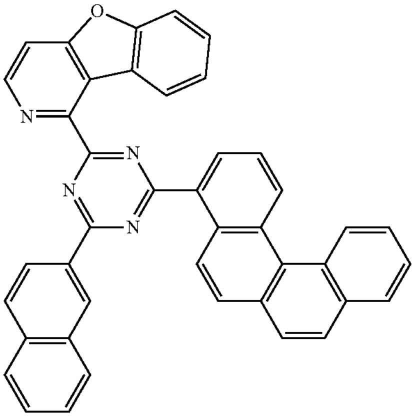
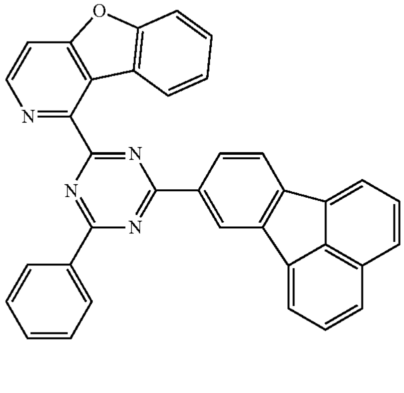
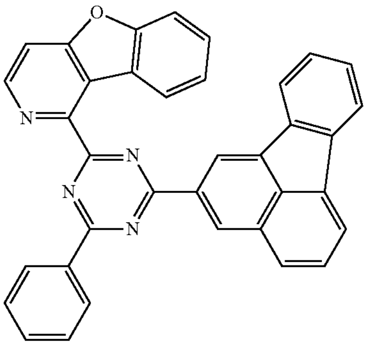
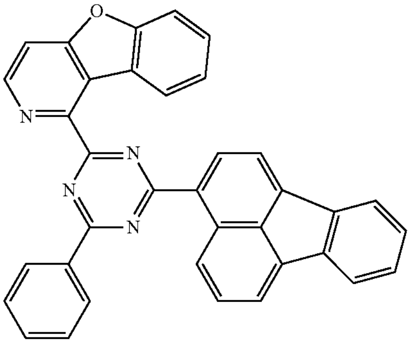
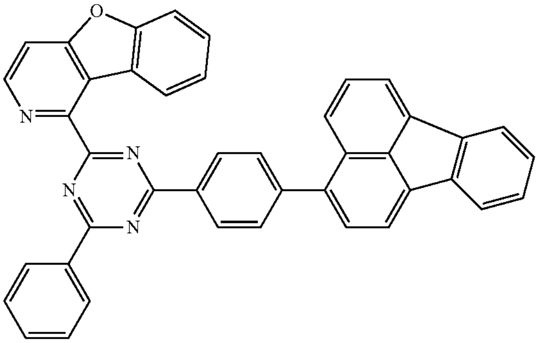
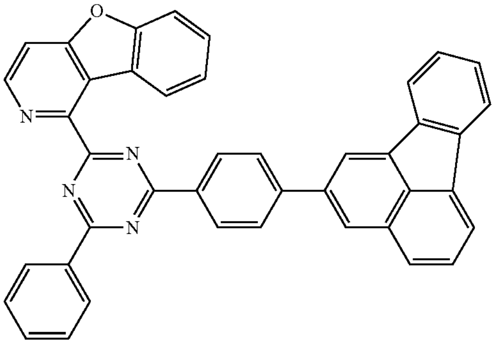
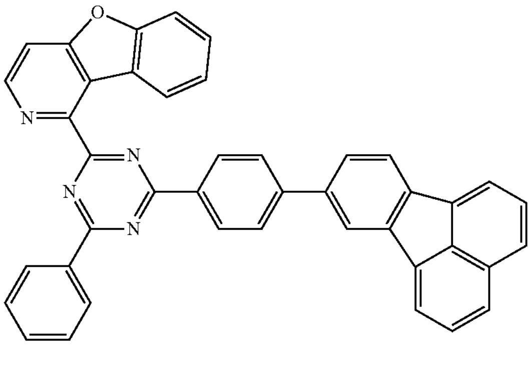

-continued
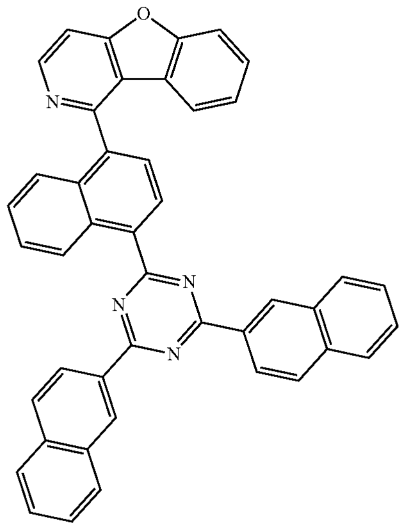
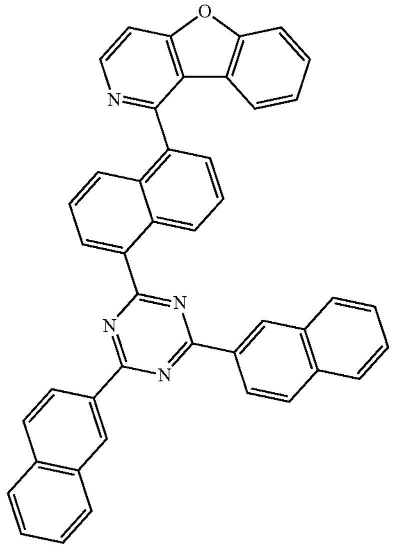
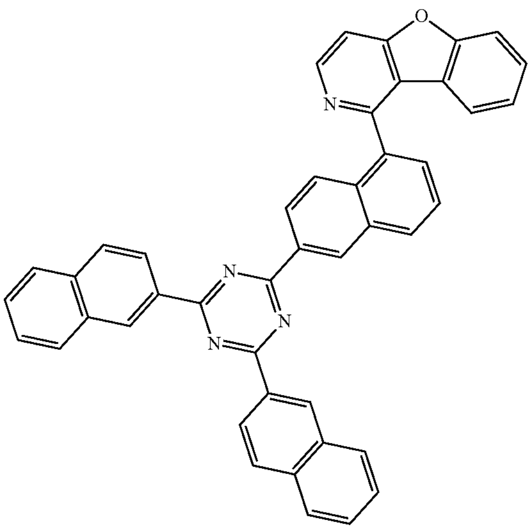
-continued
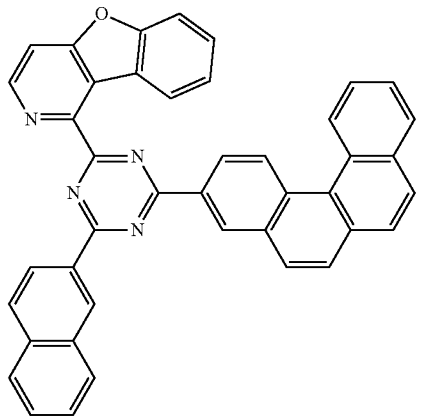
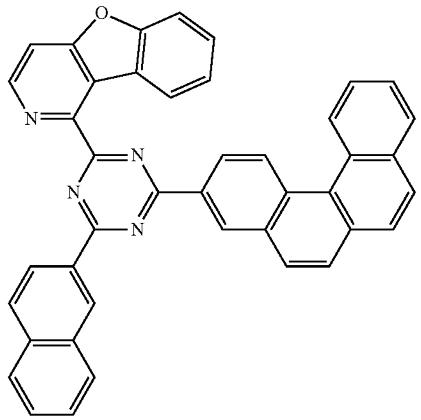
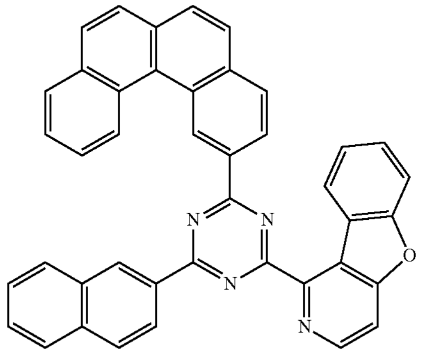
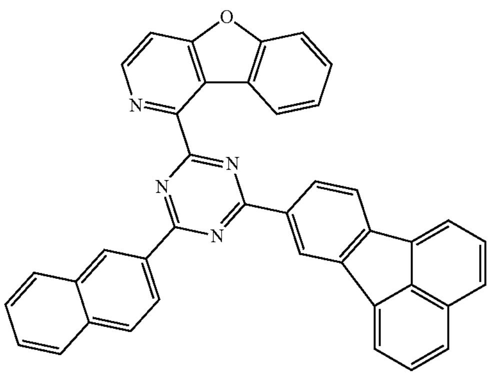

-continued
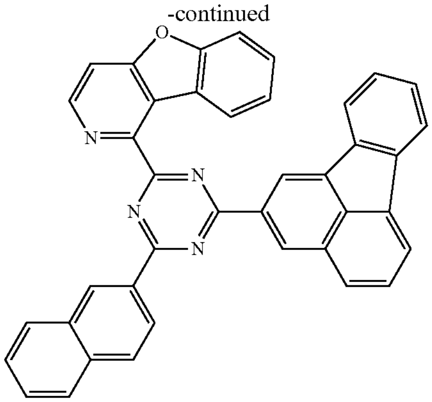
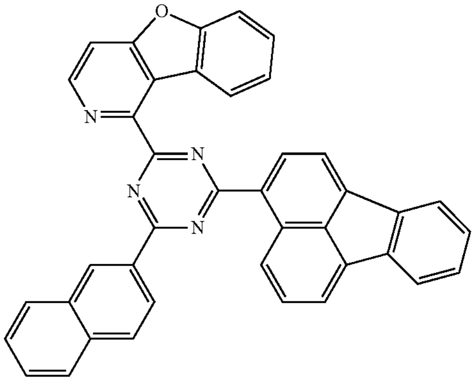
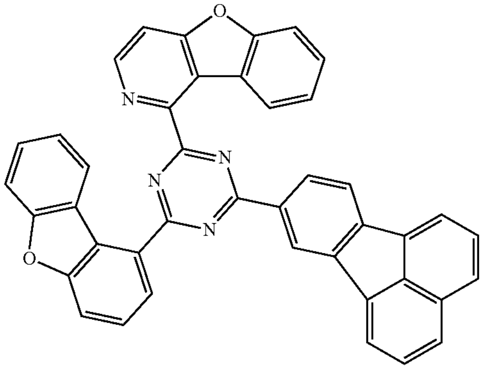
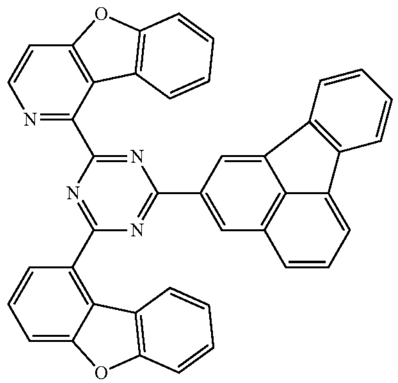
-continued
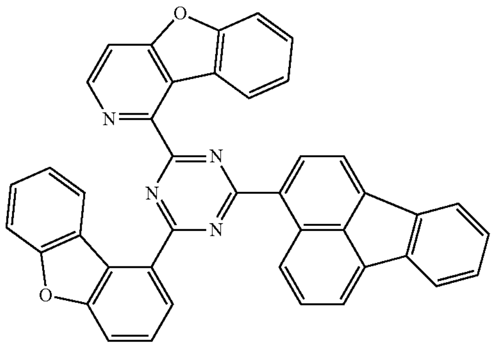
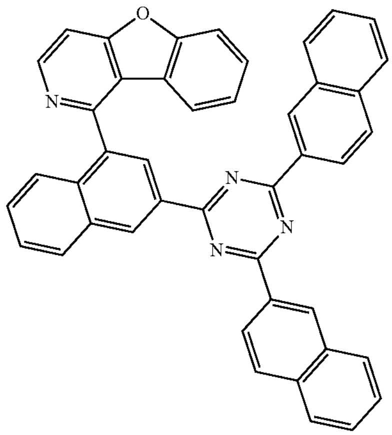
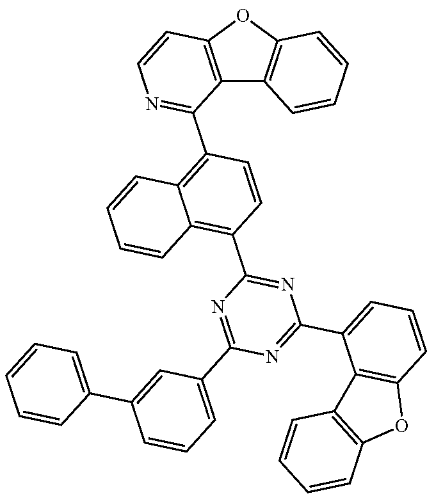

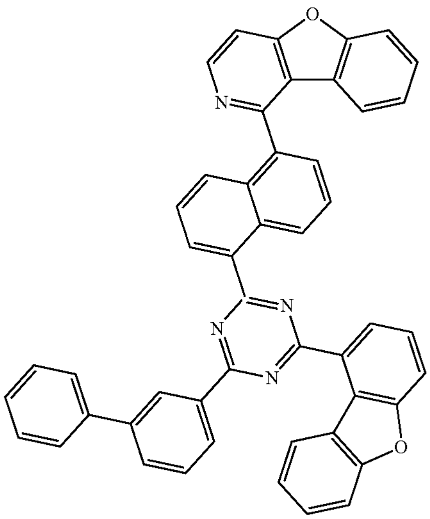
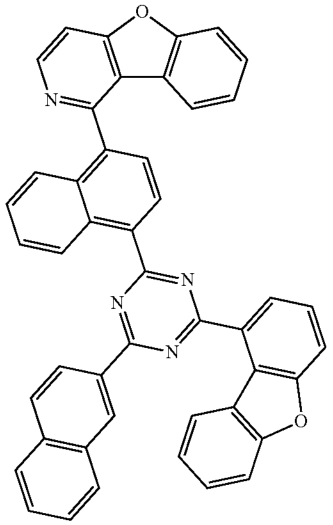
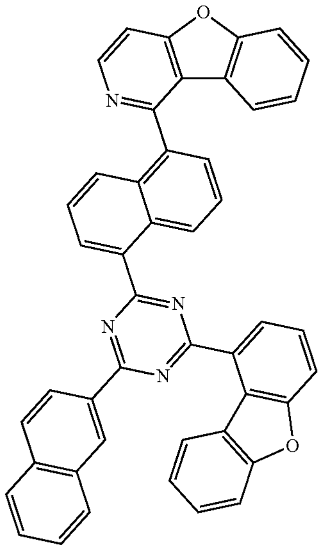
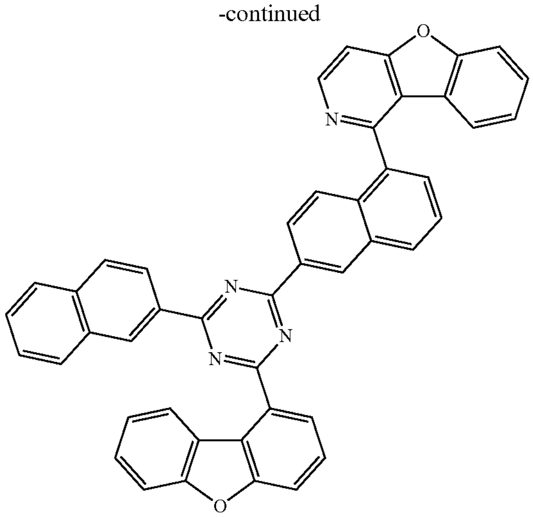
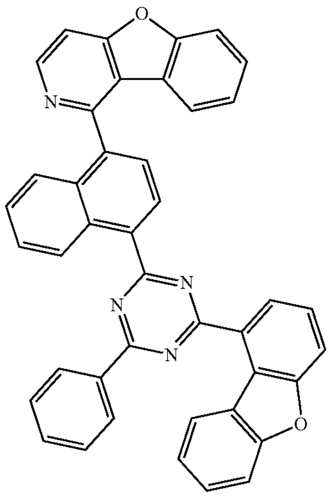
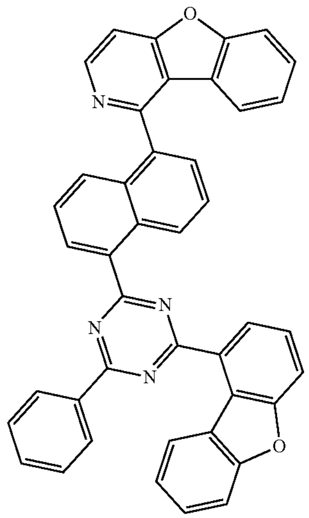

-continued
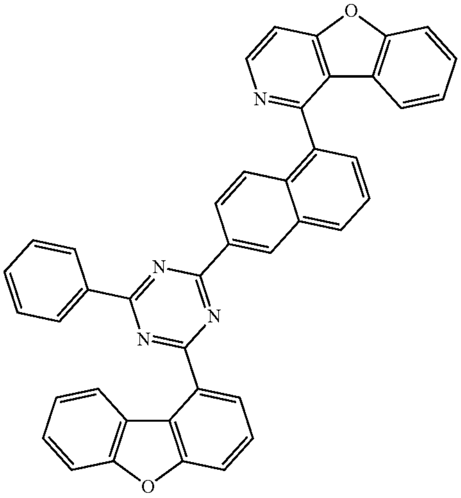
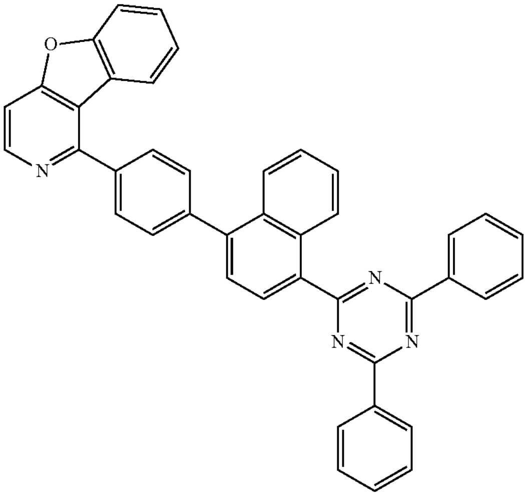
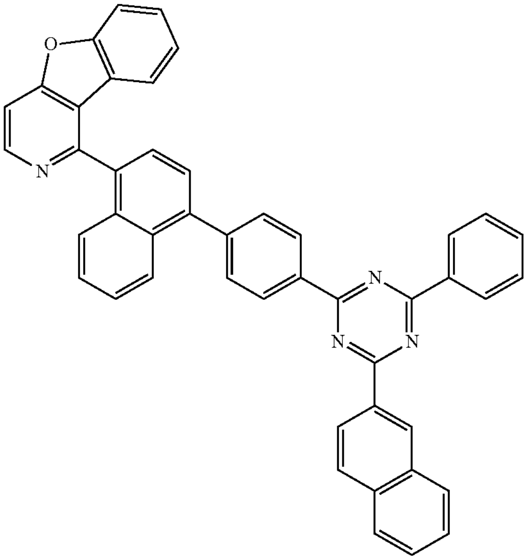
-continued
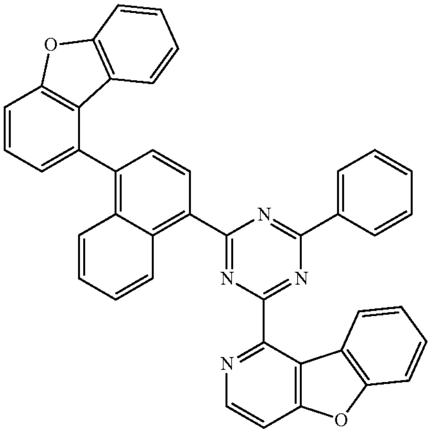
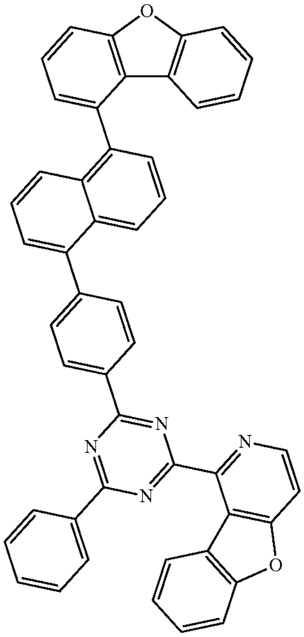
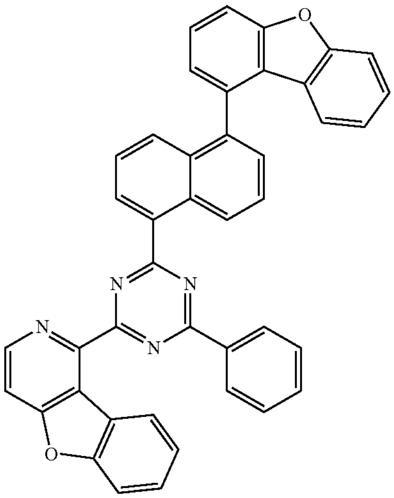

-continued
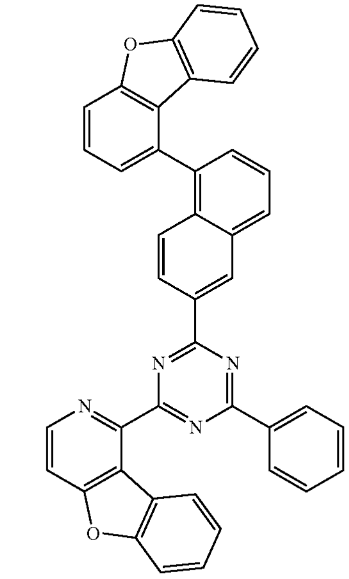
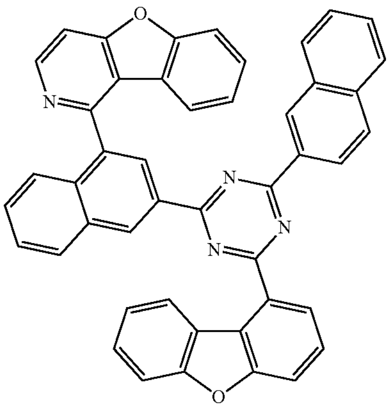
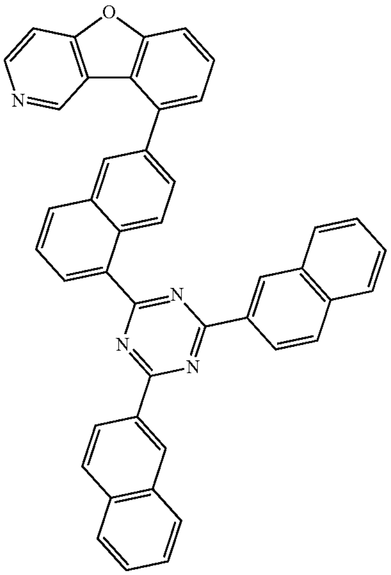
-continued
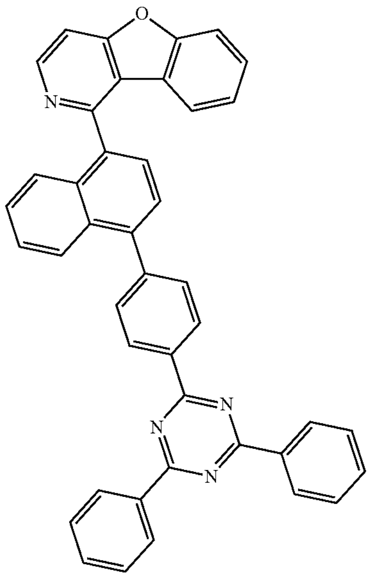
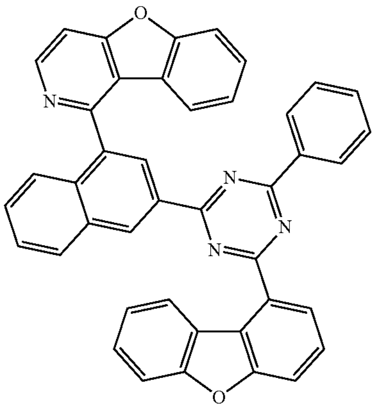
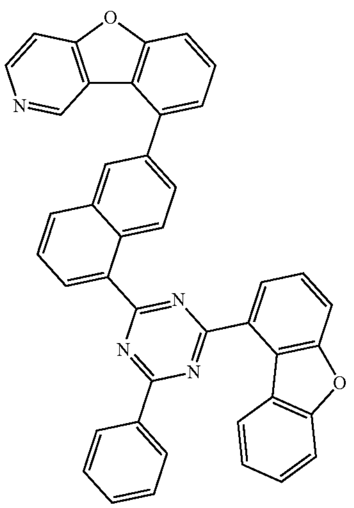

-continued
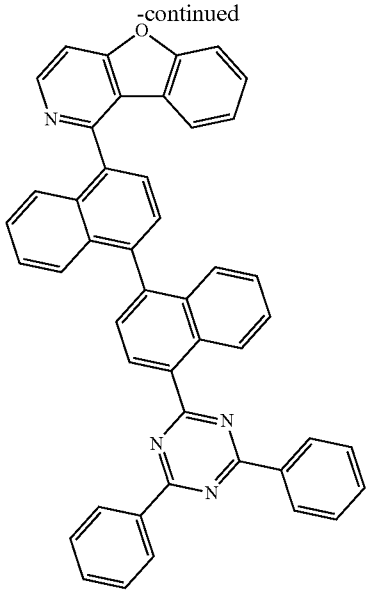
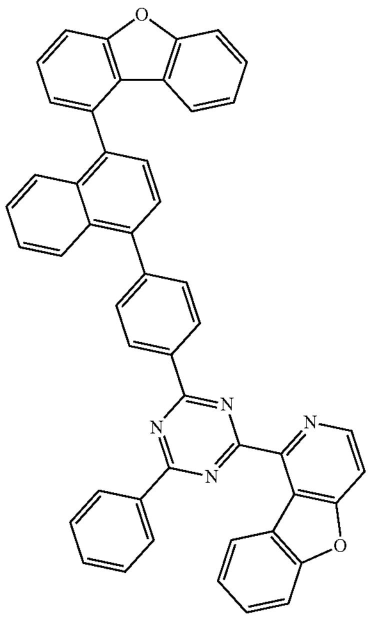
-continued
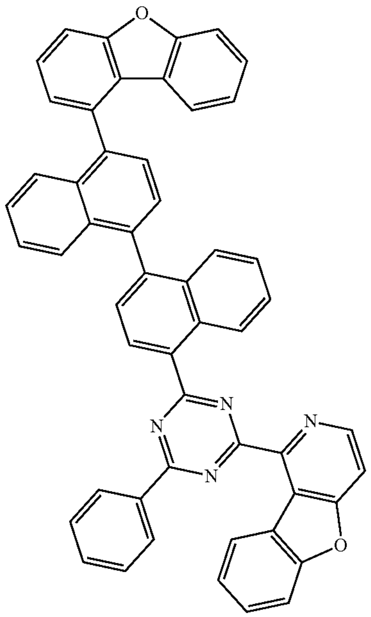
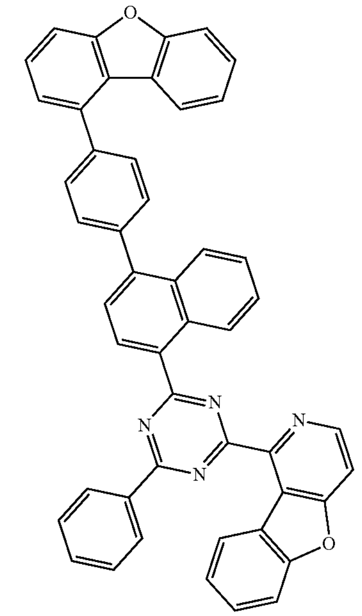
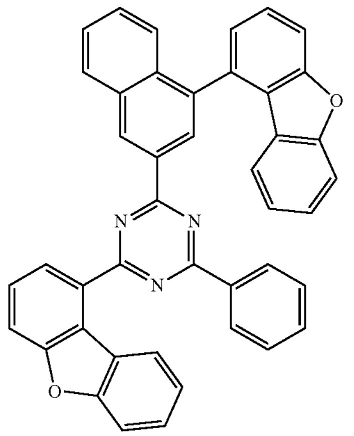

-continued
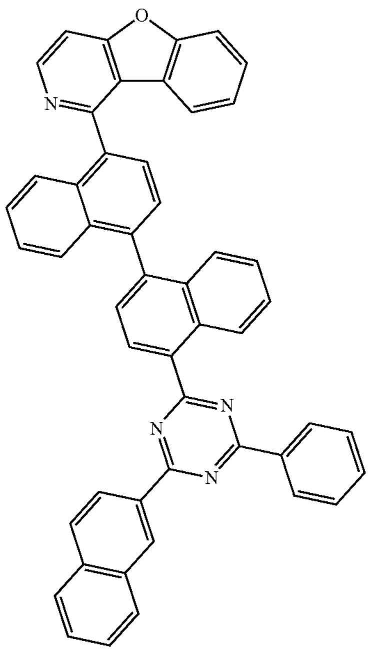
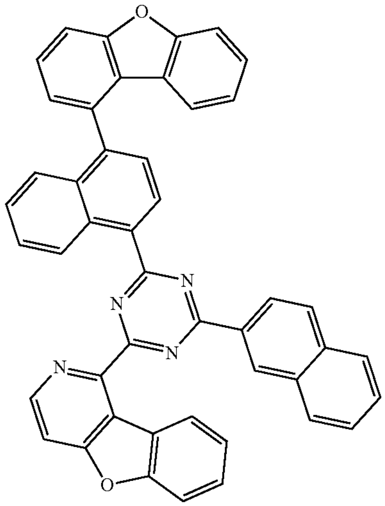
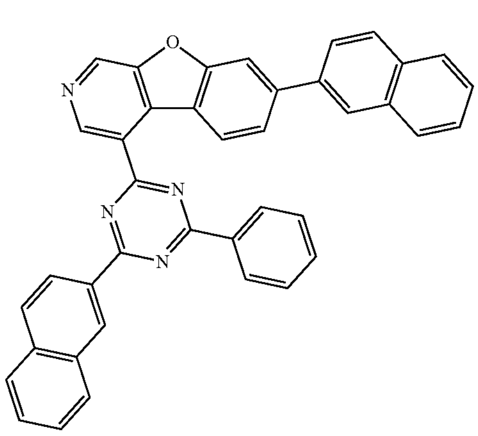
-continued
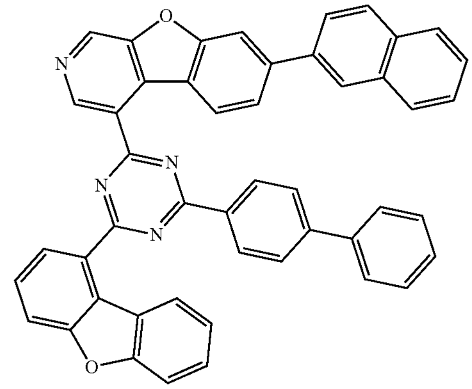
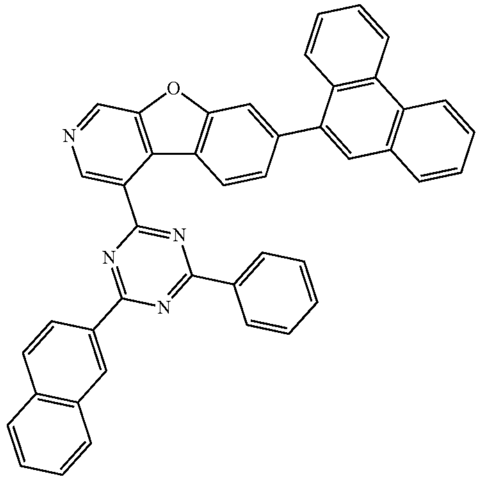
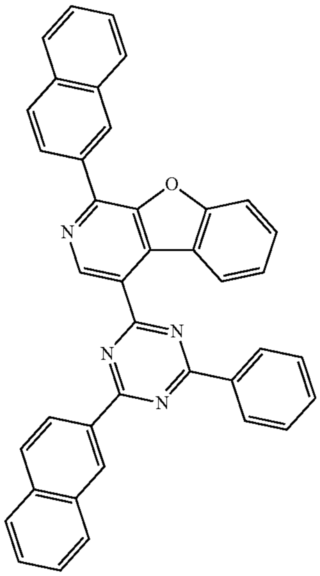

-continued
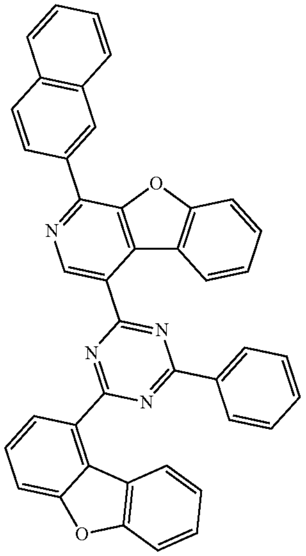
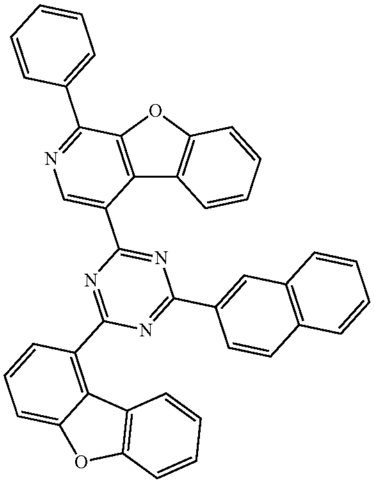
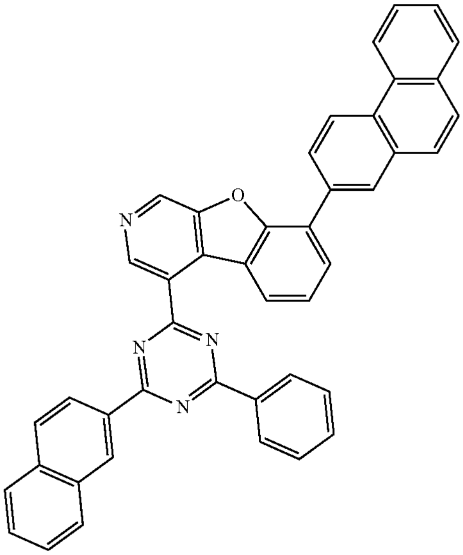
-continued
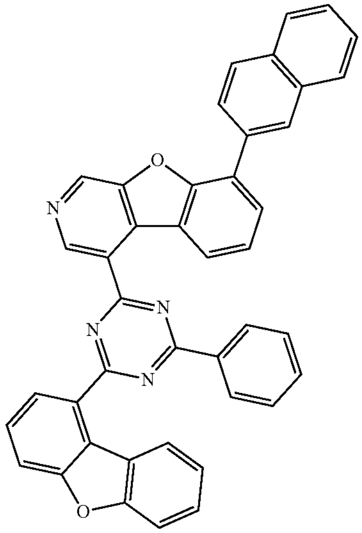
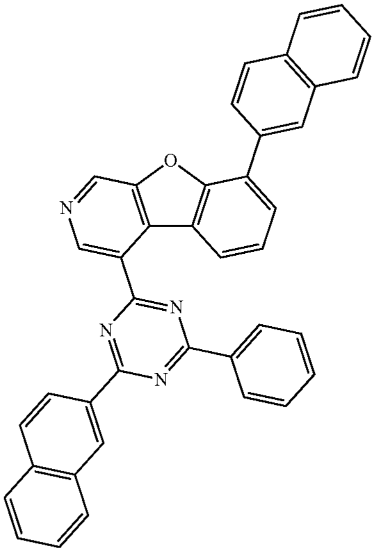
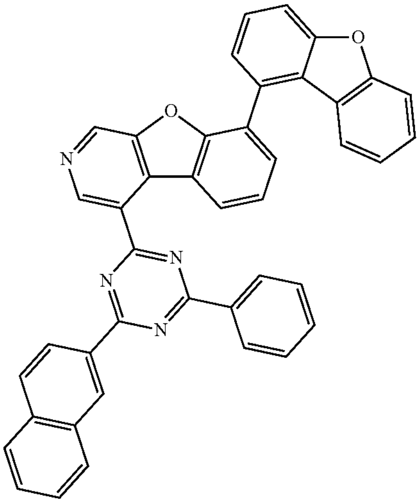

-continued
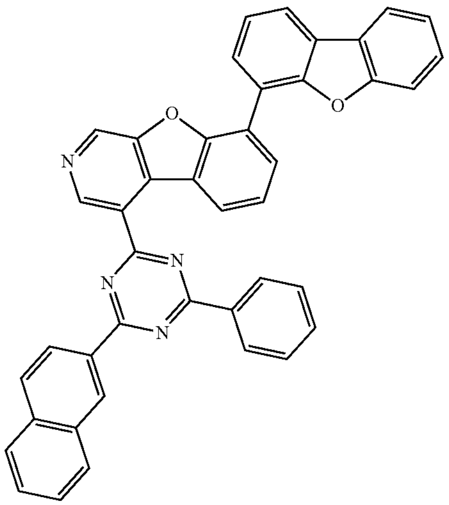
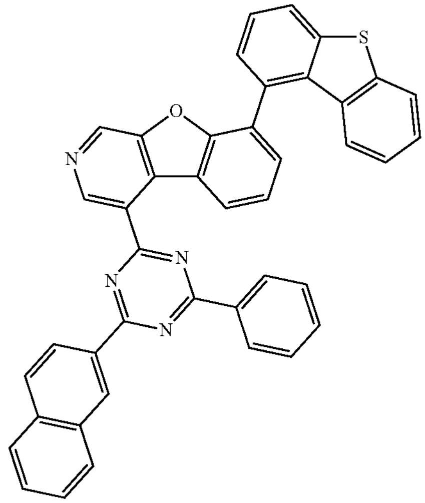
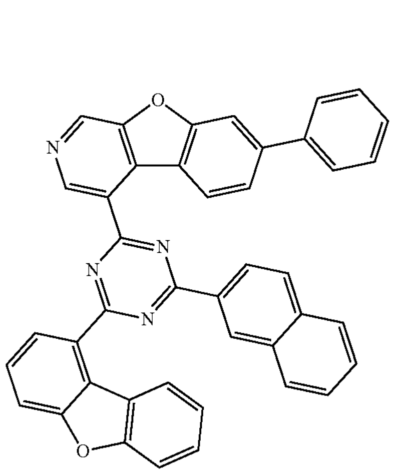
-continued
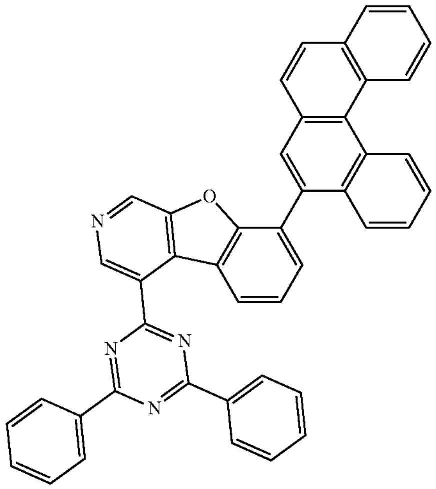
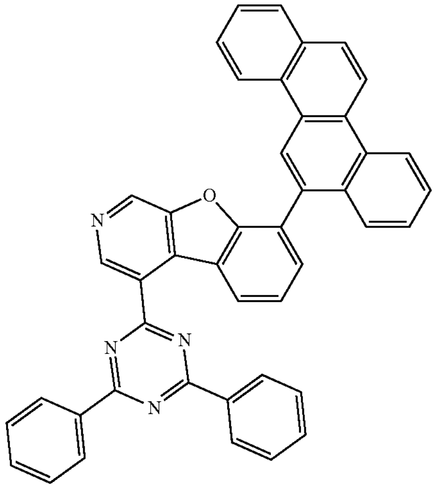
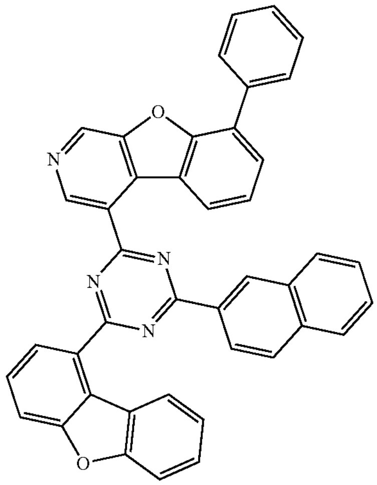

-continued
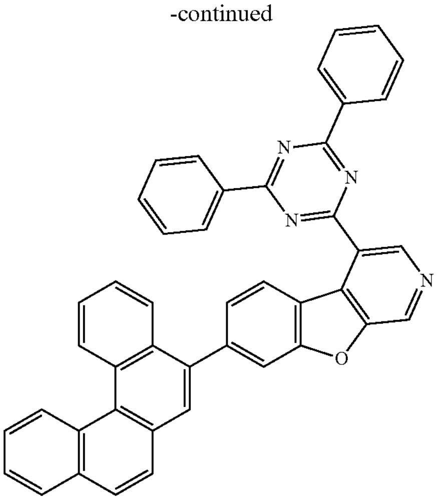
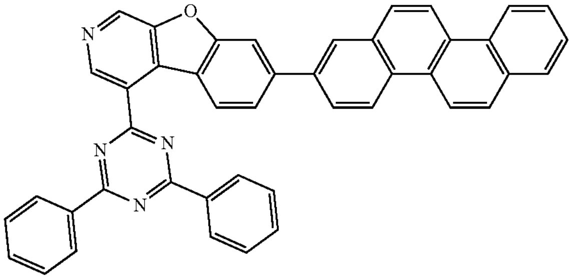
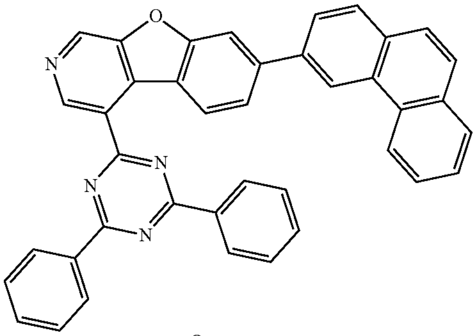
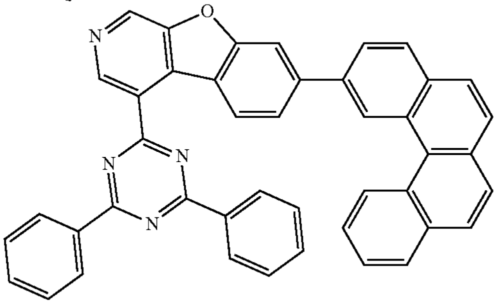
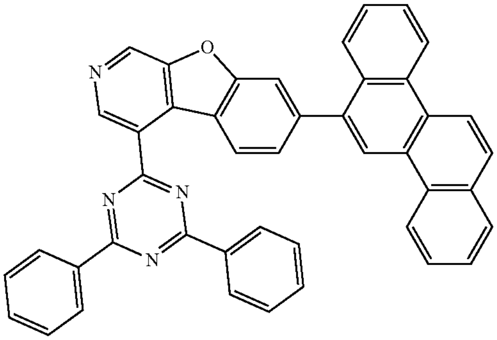
-continued
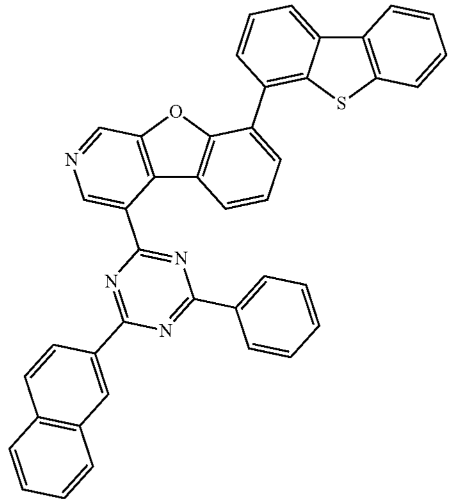
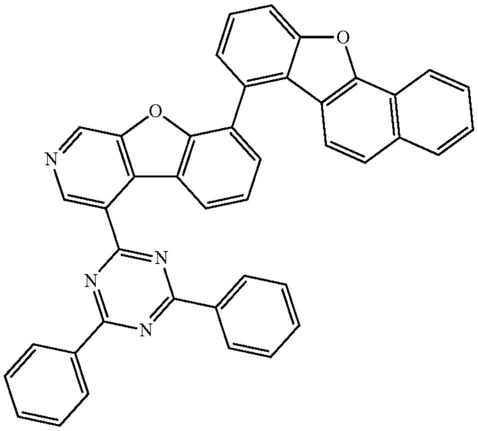
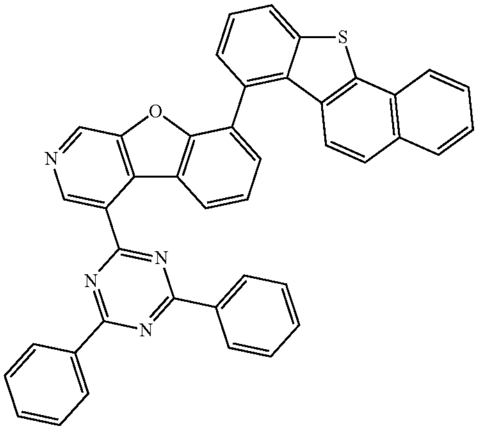

-continued
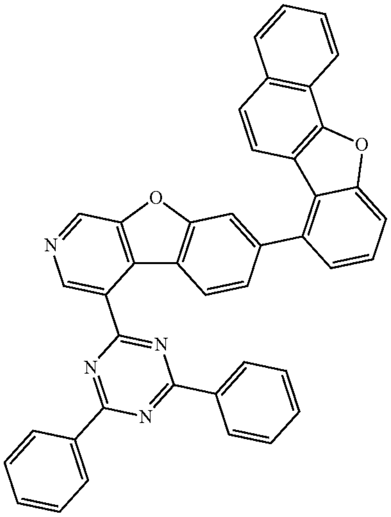
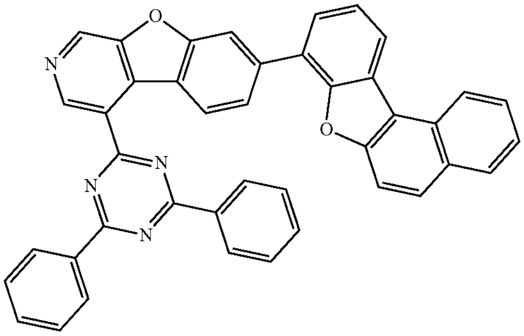
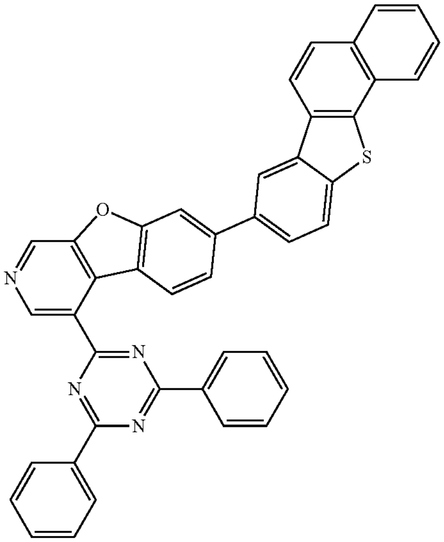
-continued
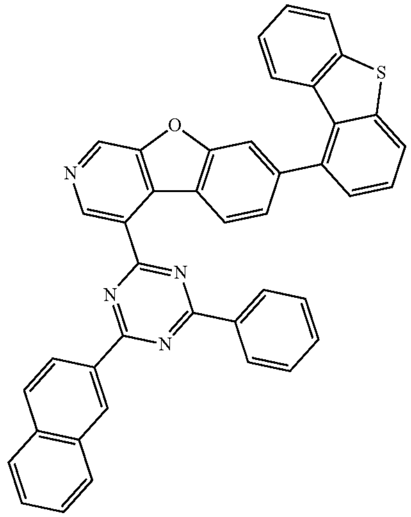
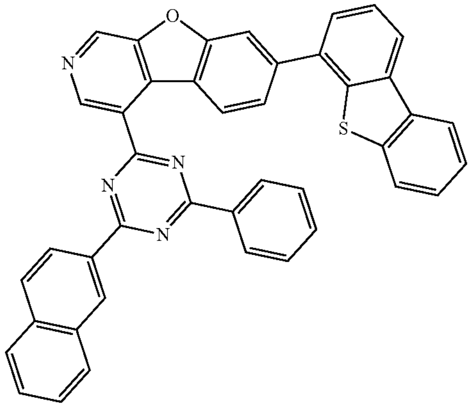
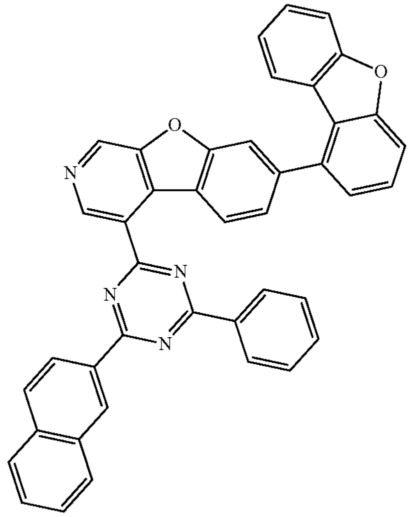

-continued
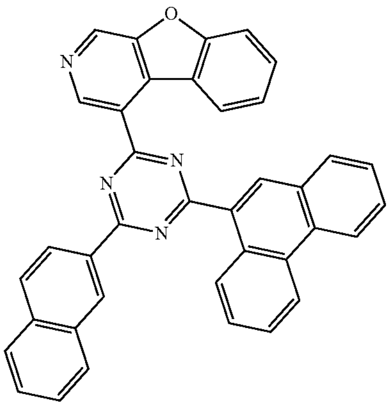
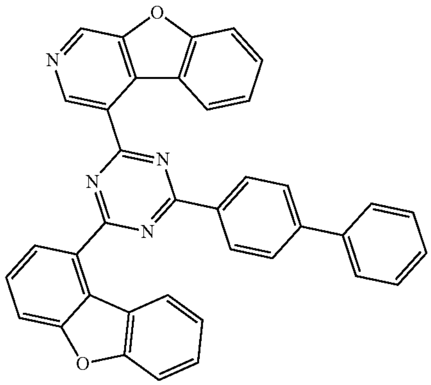
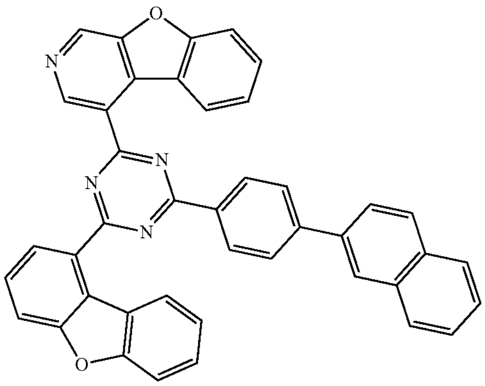
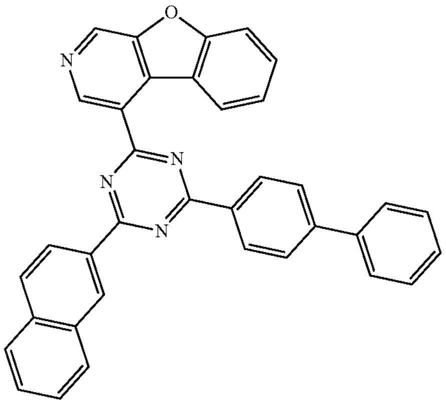
-continued
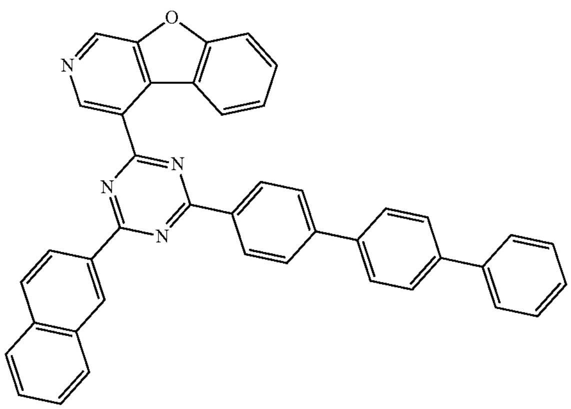
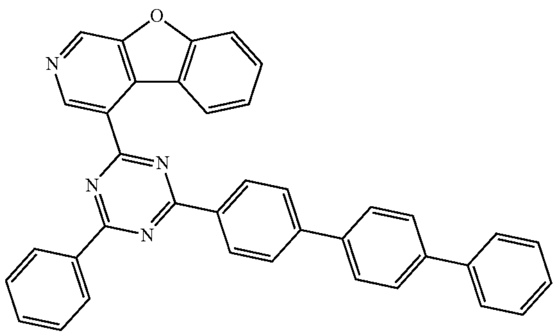
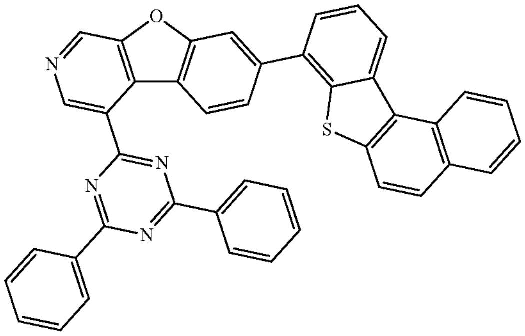
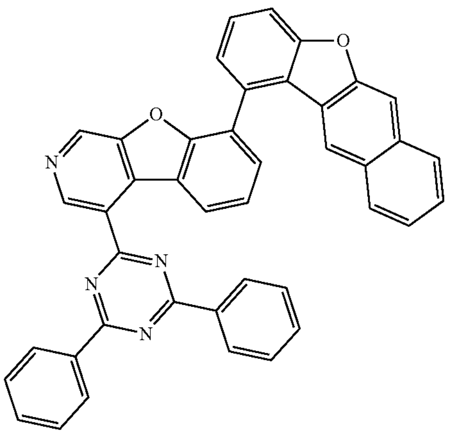

-continued
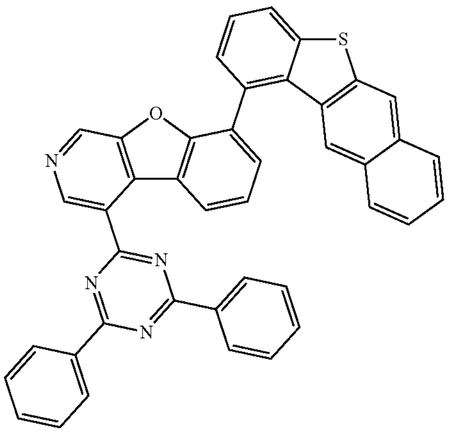
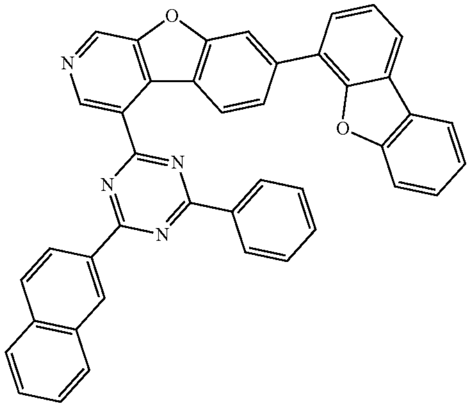
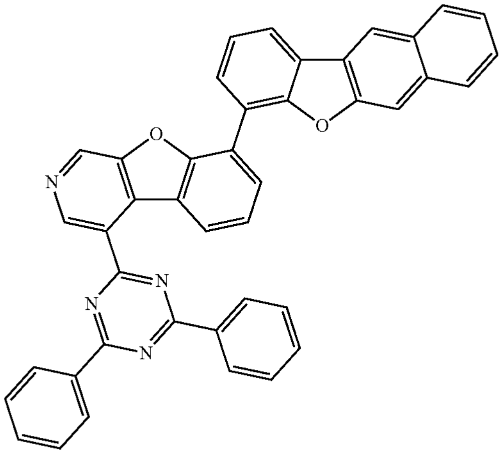
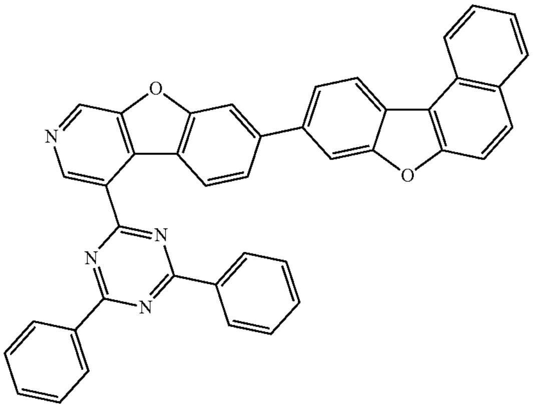
-continued
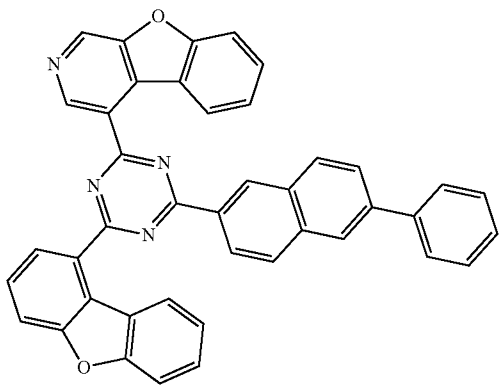
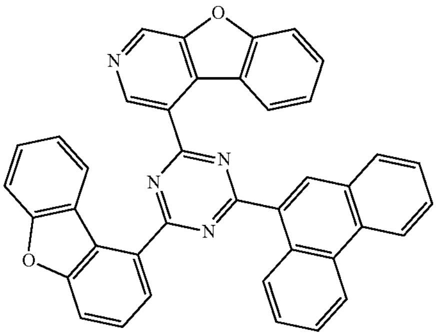
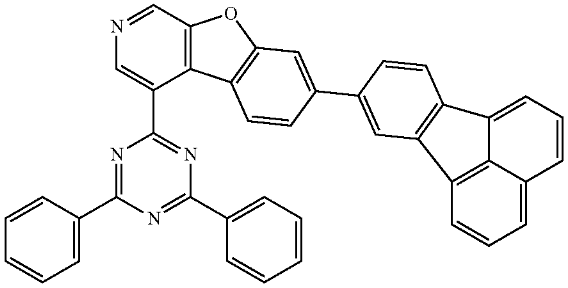
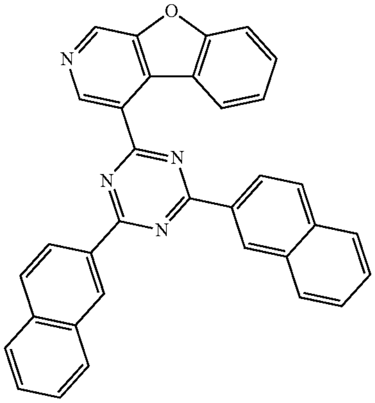

-continued
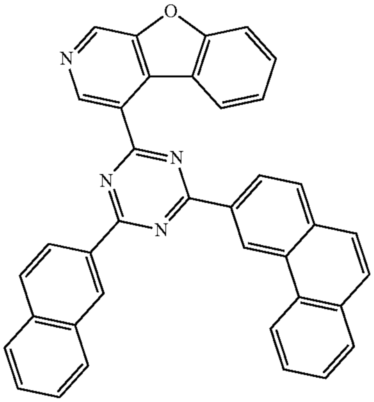
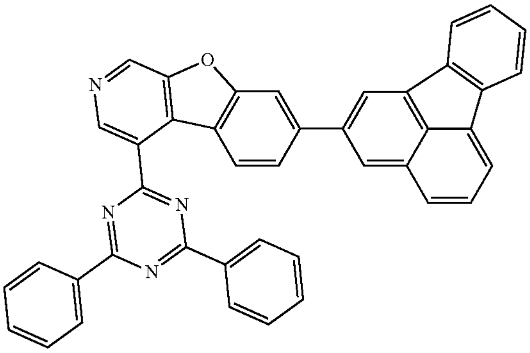
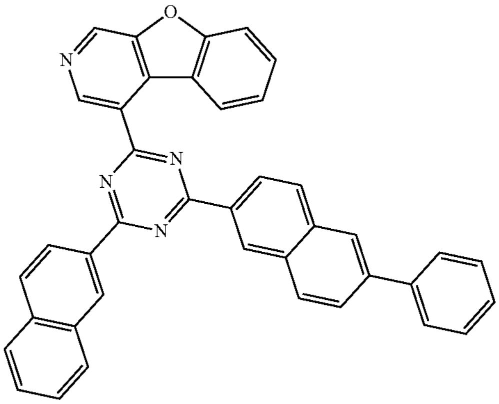
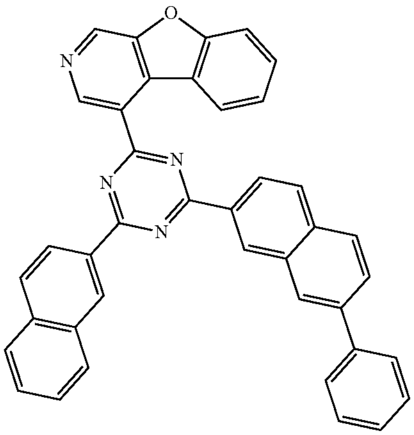
-continued
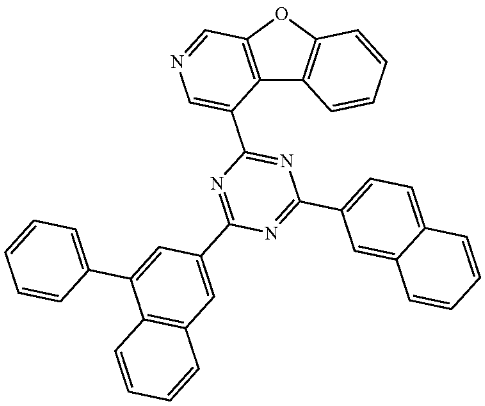
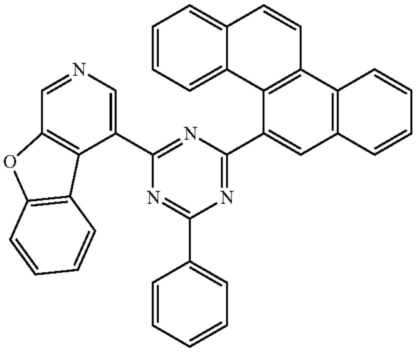
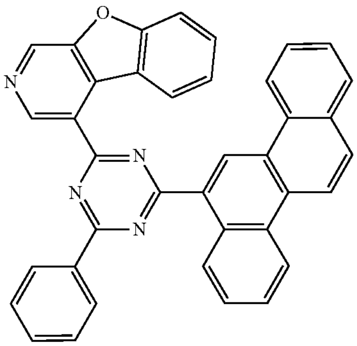
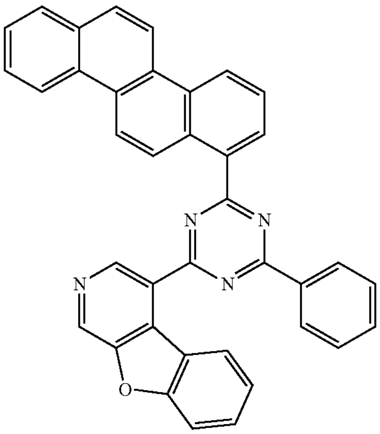

-continued
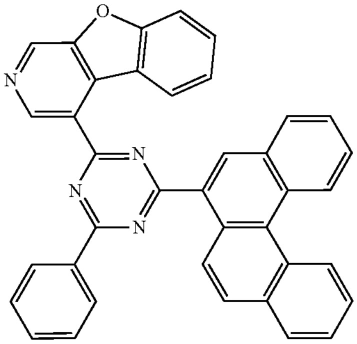
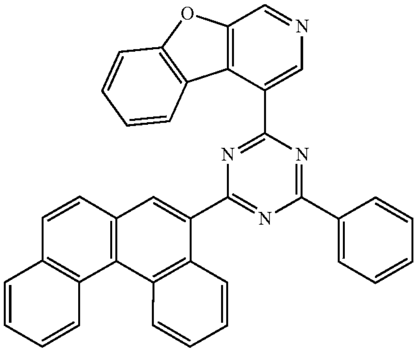
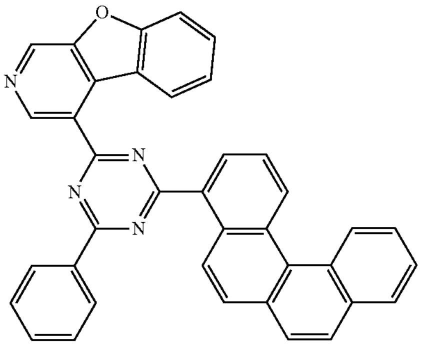
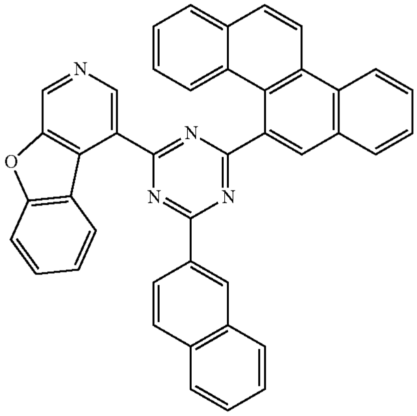
-continued
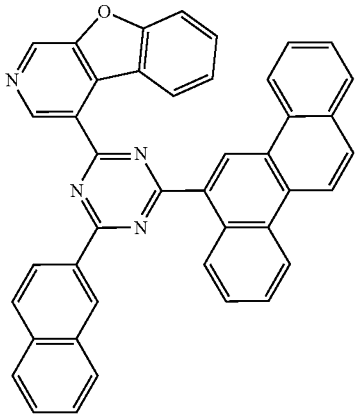
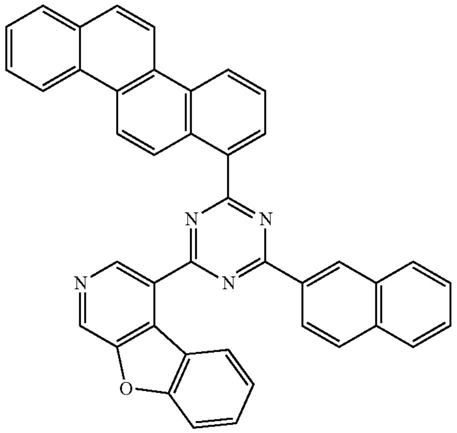
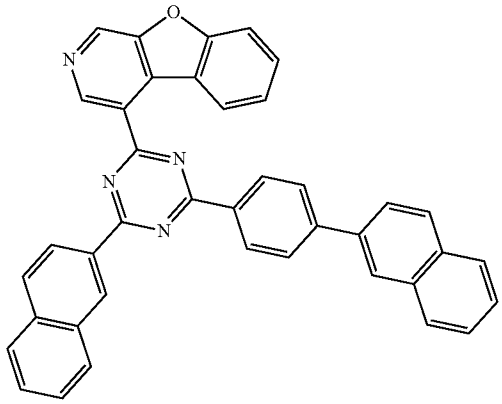
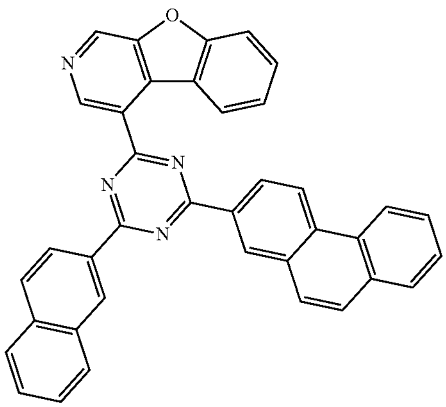

-continued
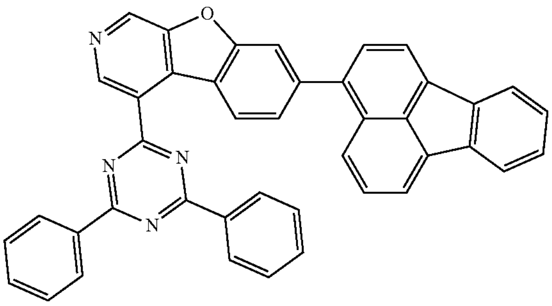
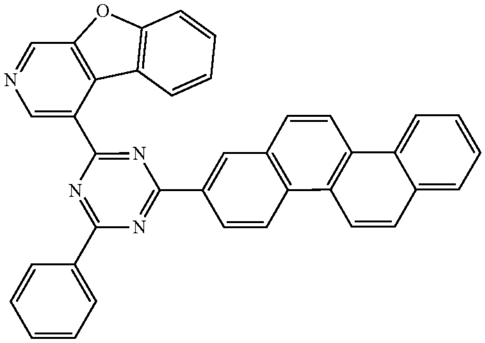
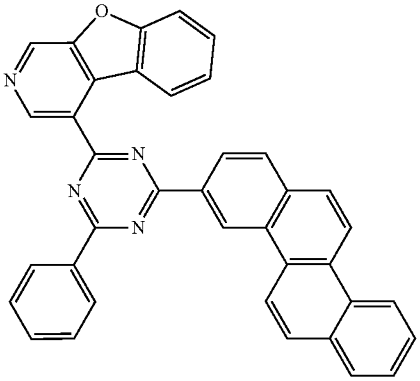
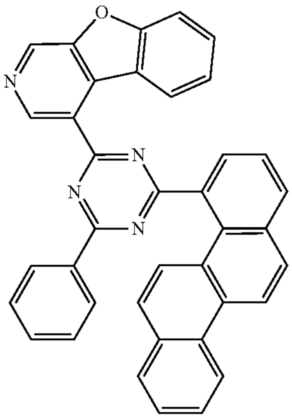
-continued
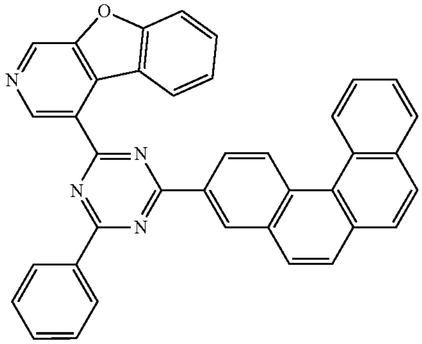
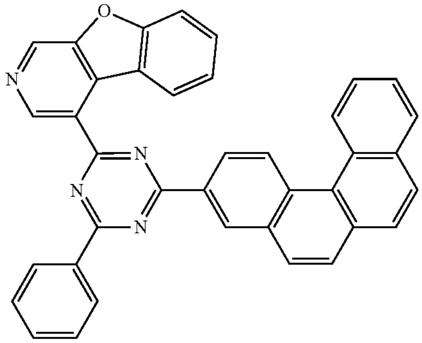
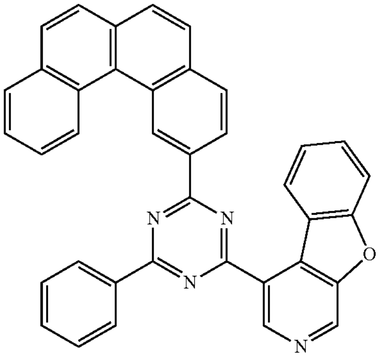
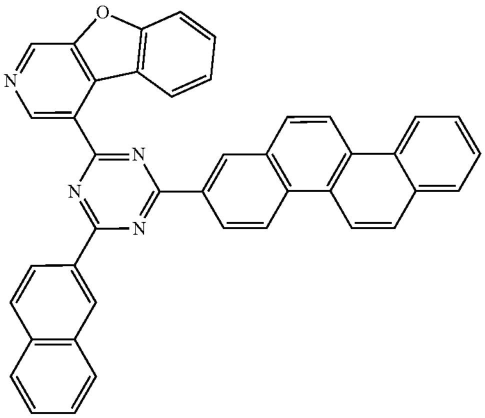

-continued
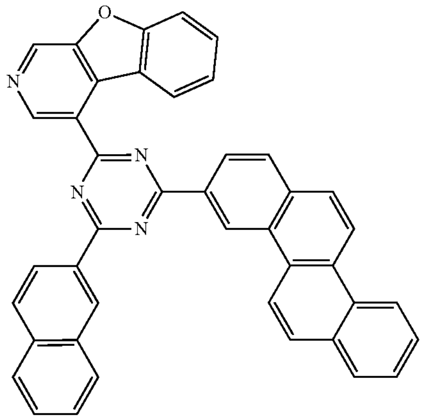
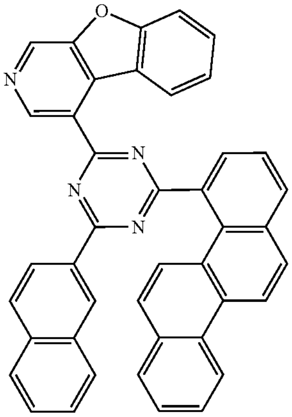
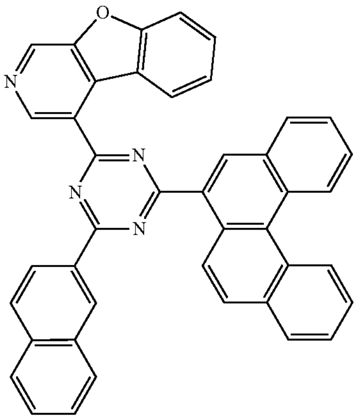
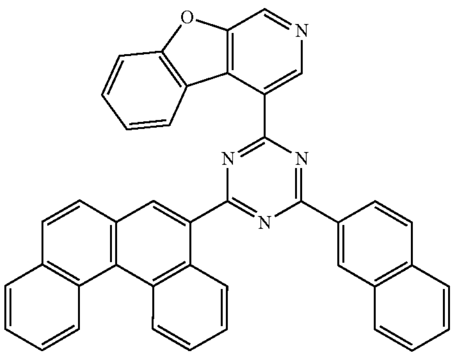
-continued
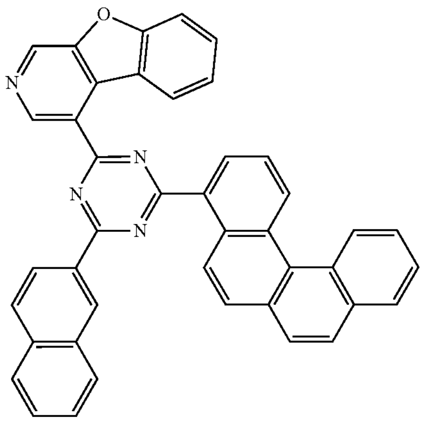
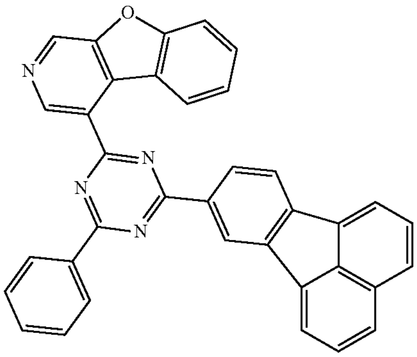
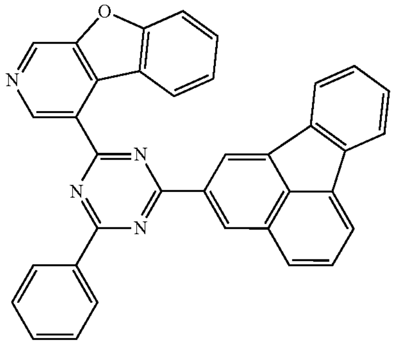
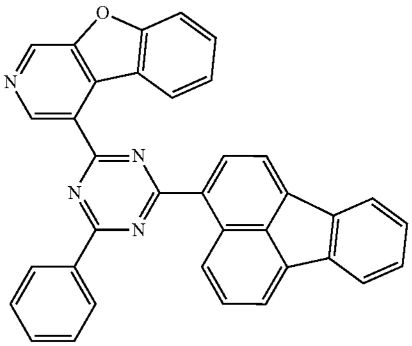

-continued
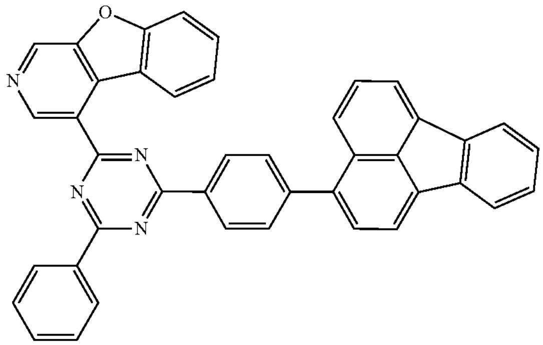
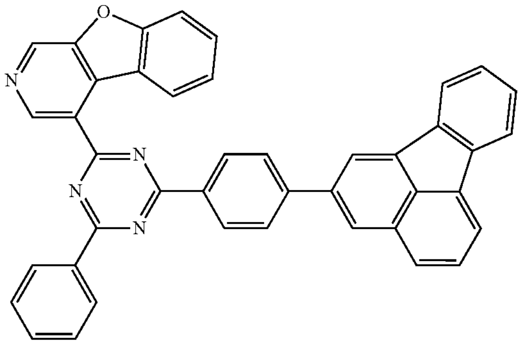
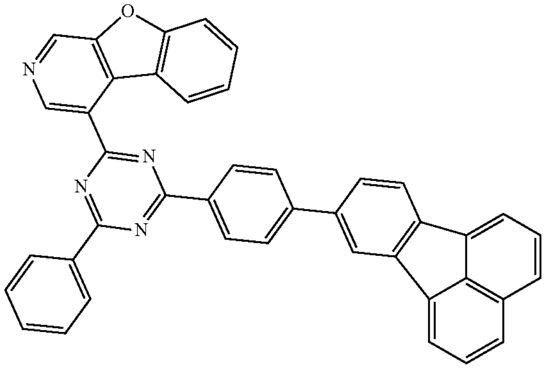
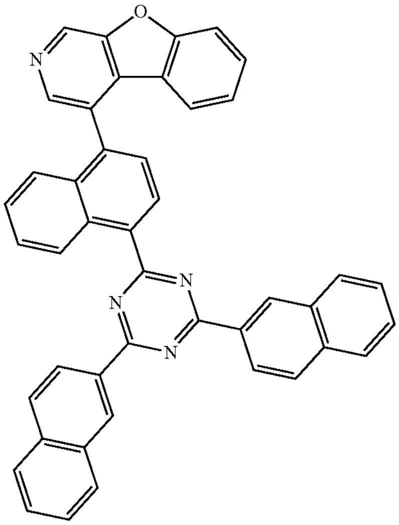
-continued
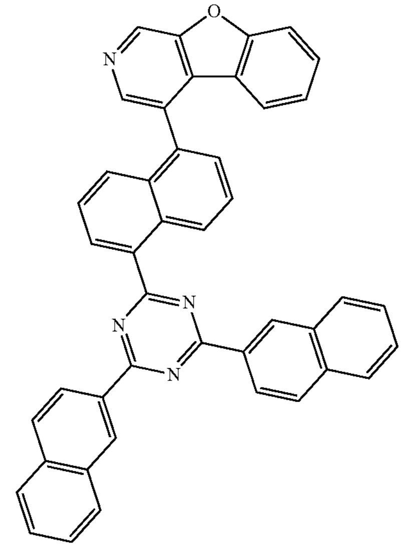
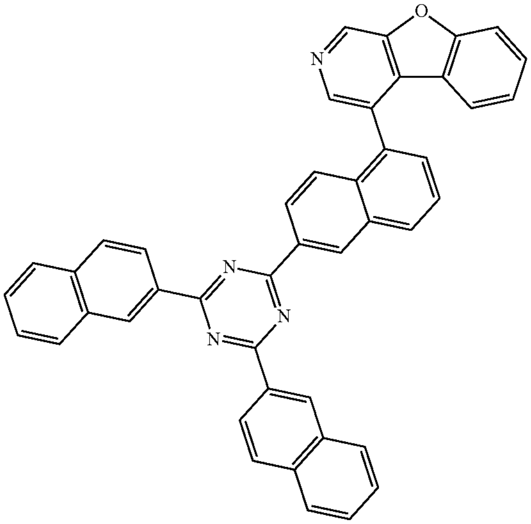
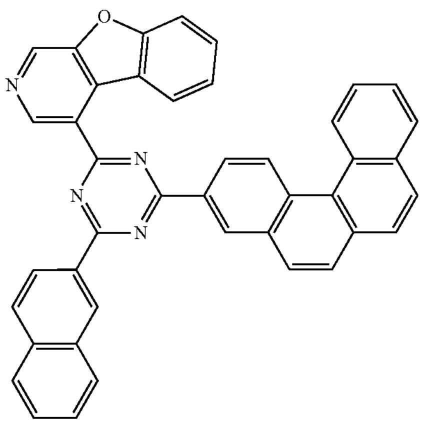

-continued
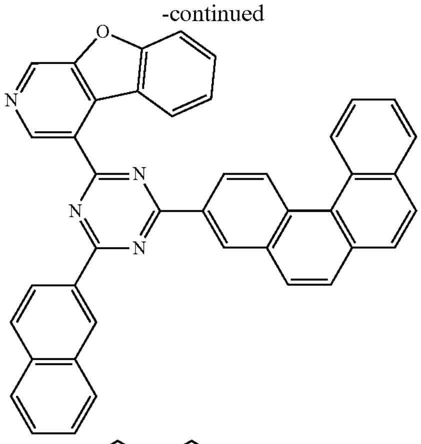
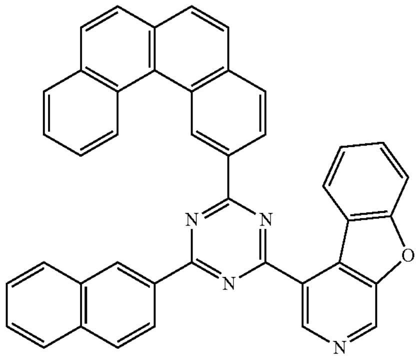
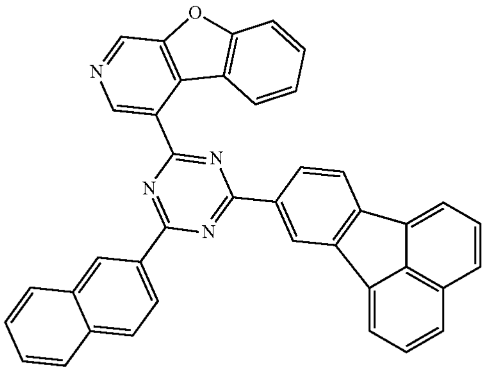
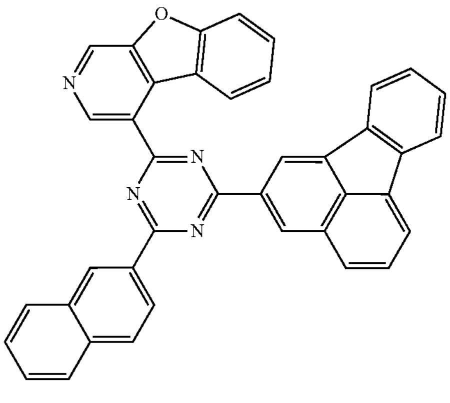
-continued
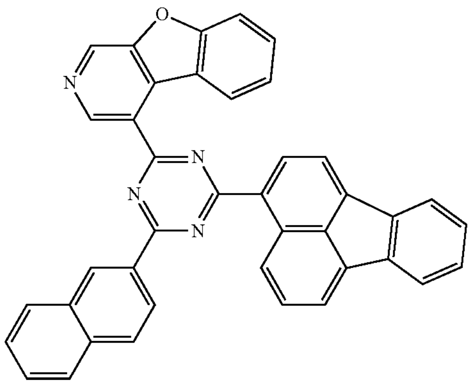
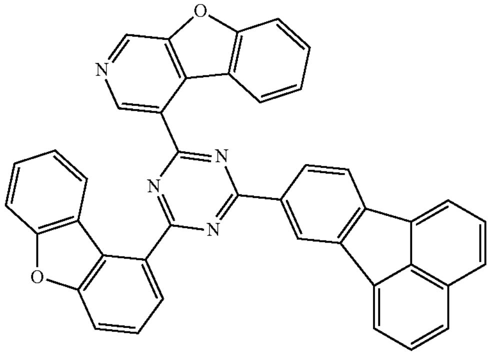
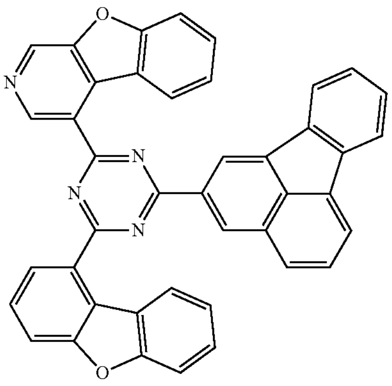
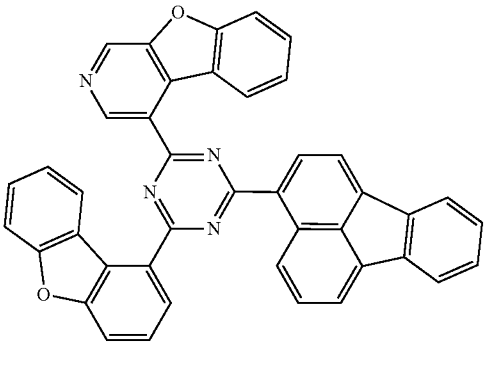

-continued
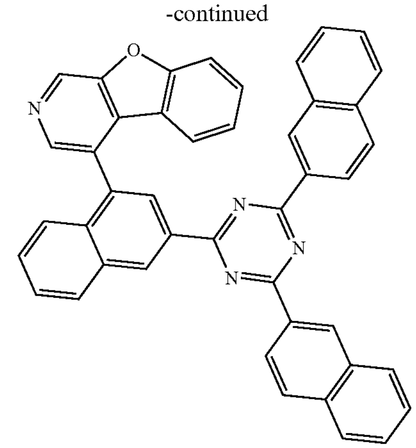
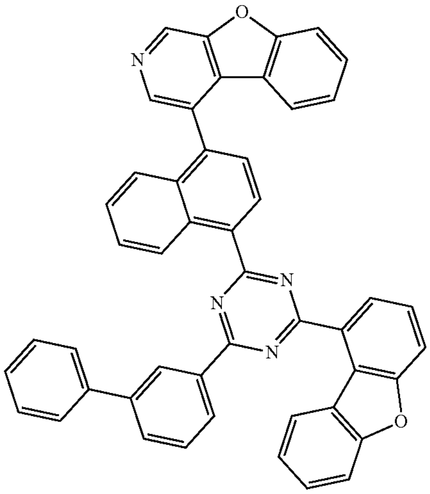
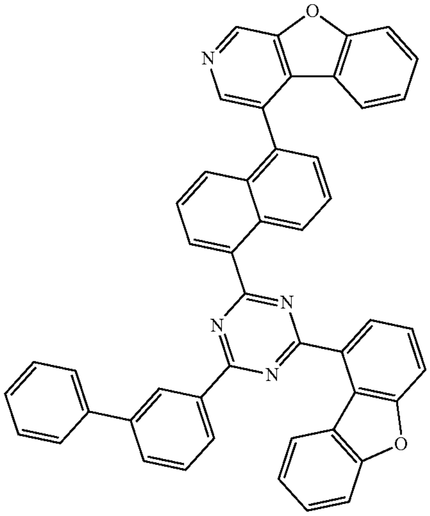
-continued
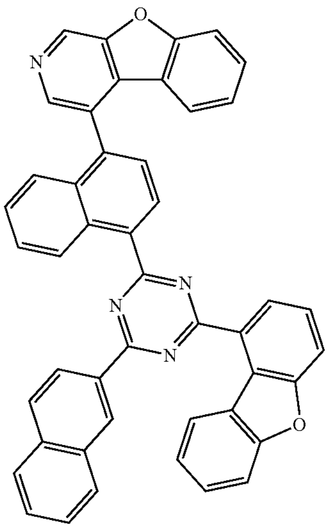
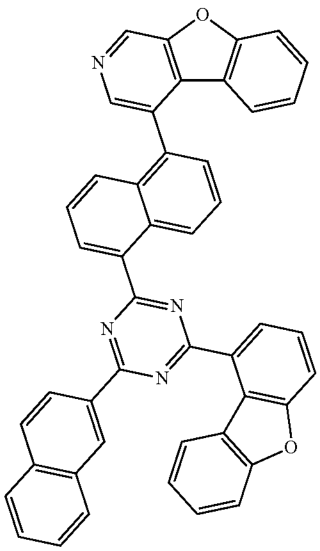
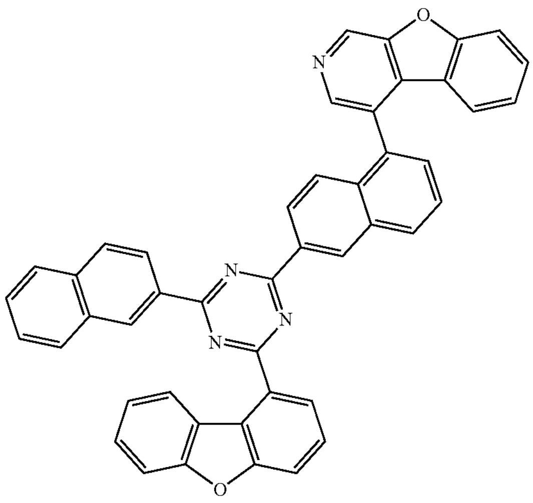

-continued
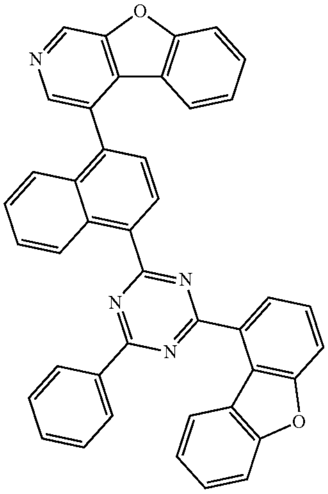
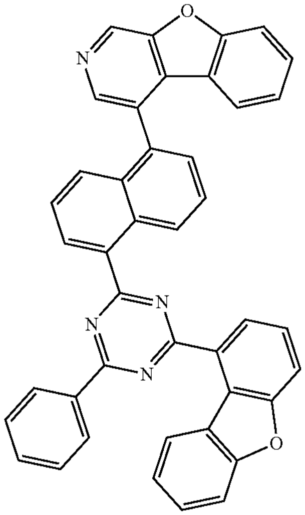
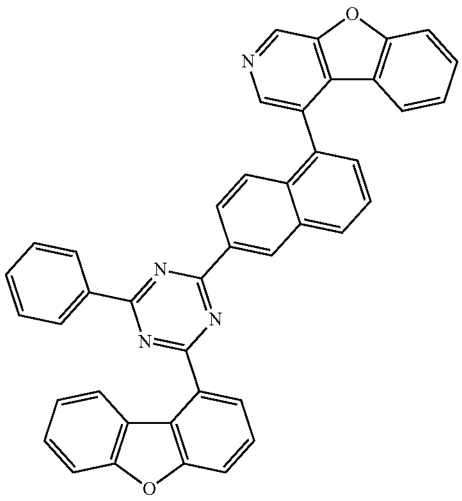
-continued
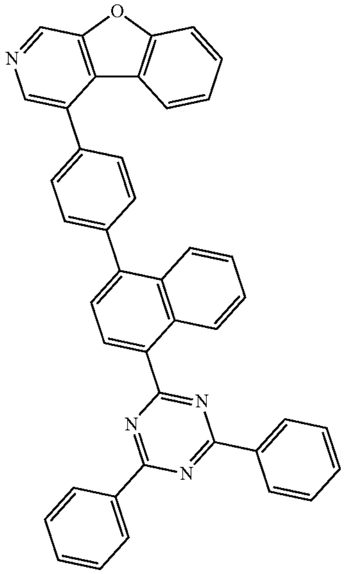
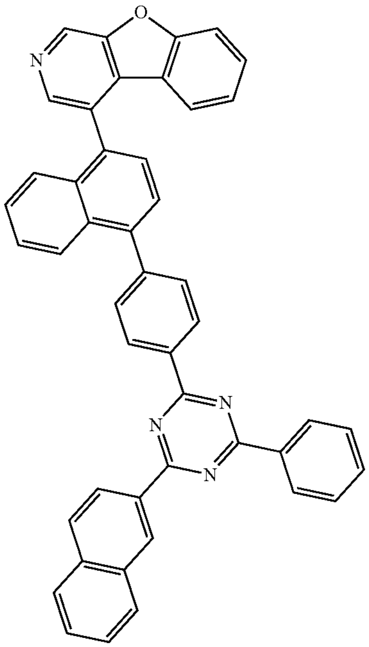
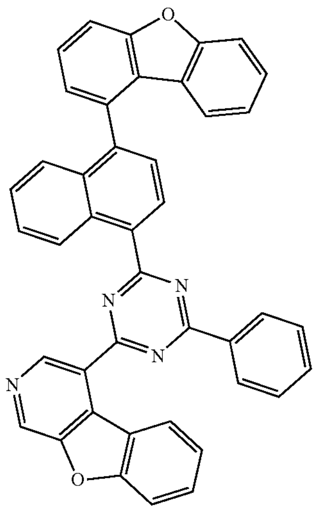

-continued
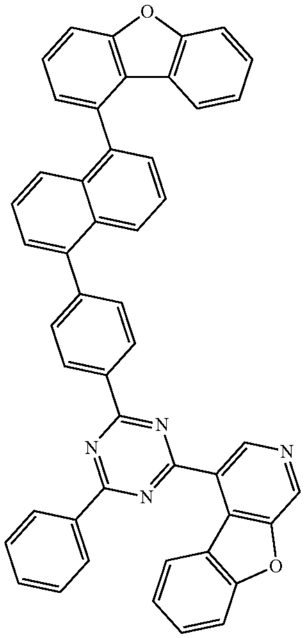
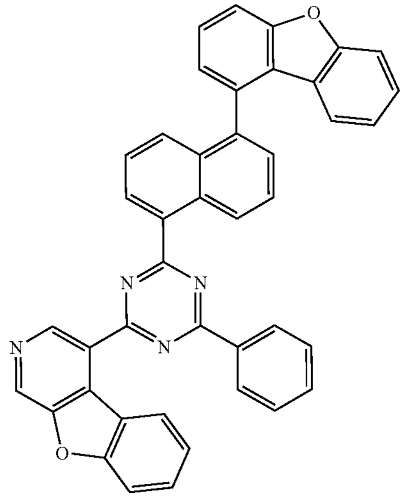
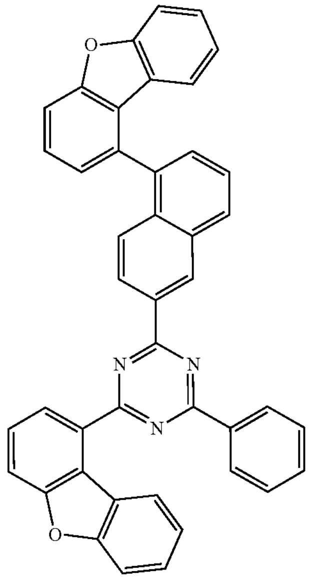
-continued
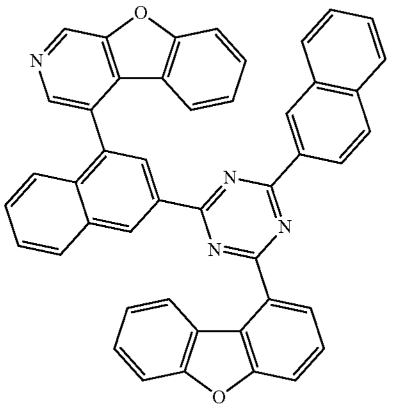
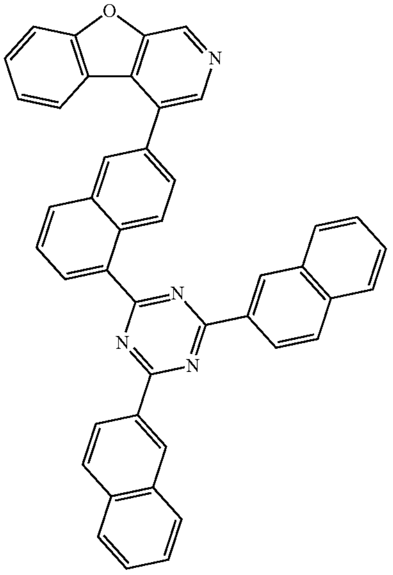
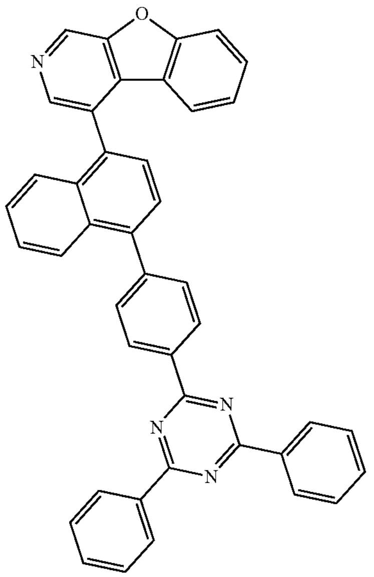

-continued
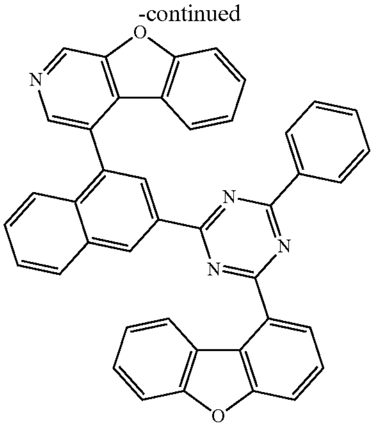
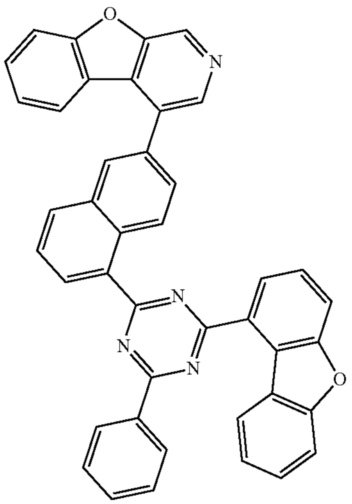
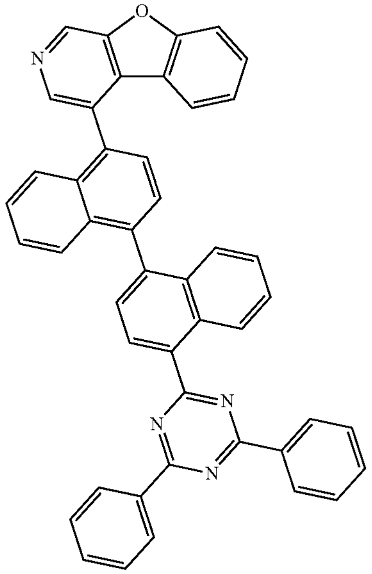
-continued
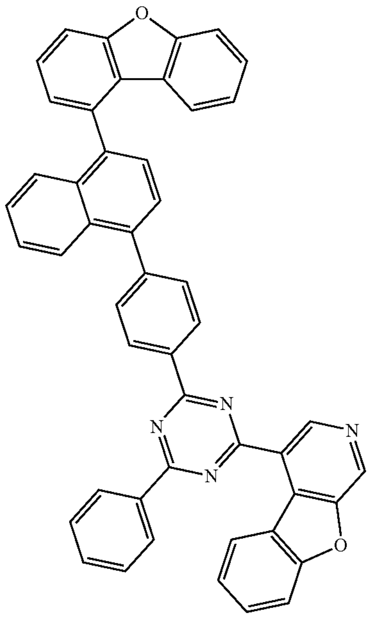
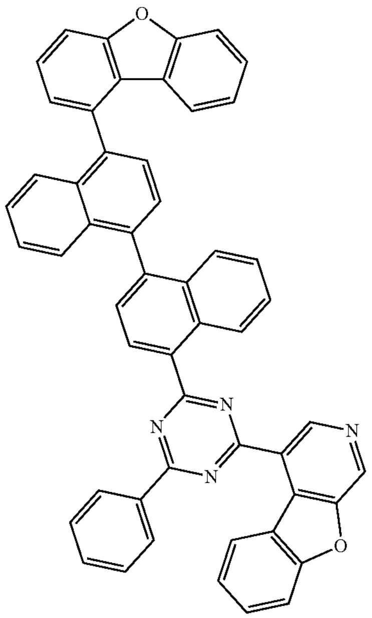

-continued
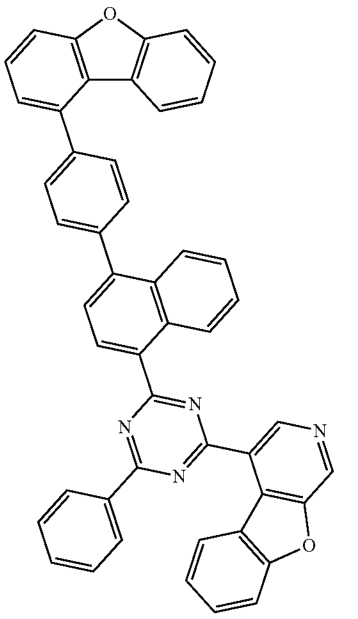
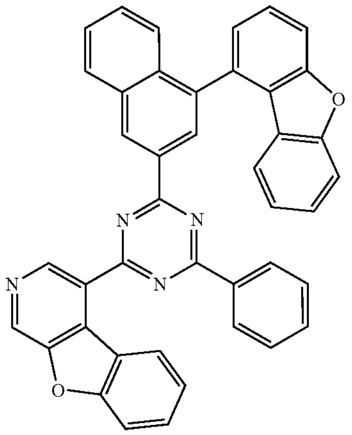
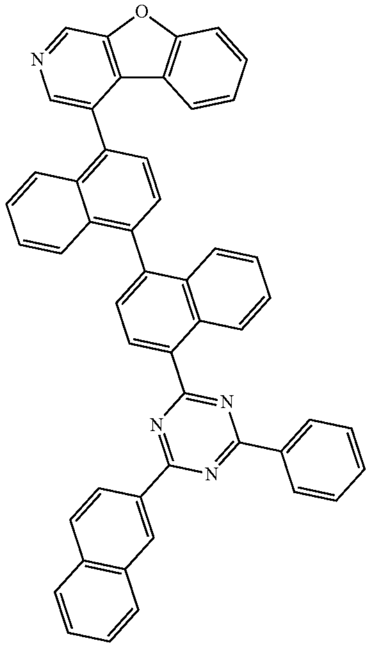
-continued
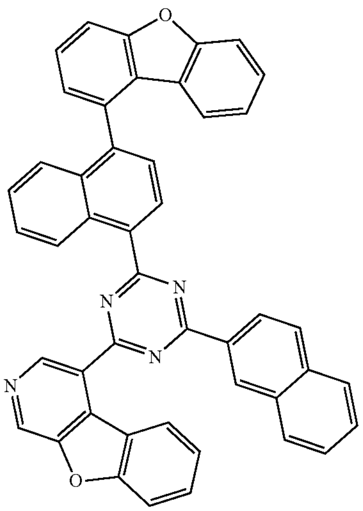 [SMILES: c1ccc2cc(-c3nc(-c4ccc(-c5cccc6oc7ccccc7c56)c5ccccc45)nc(-c4cncc5oc6ccccc6c45)n3)ccc2c1]
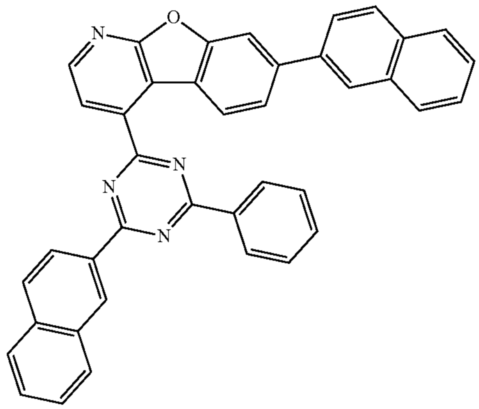
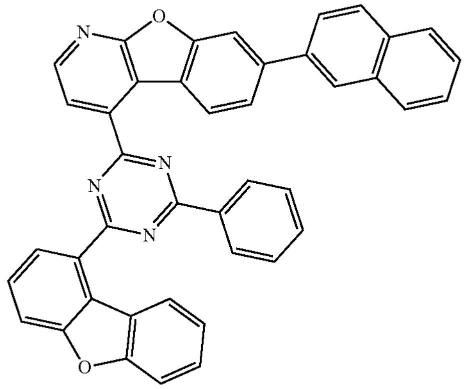

-continued
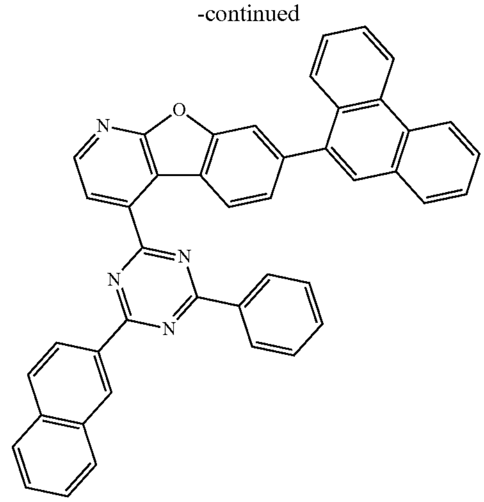
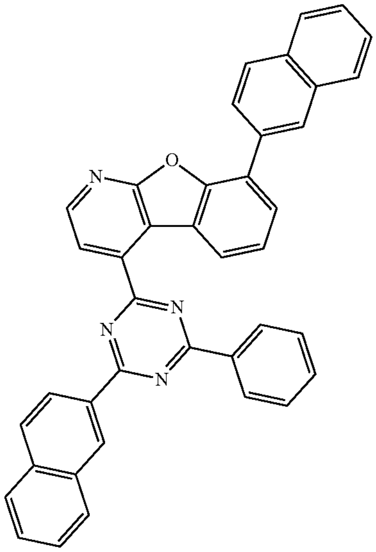
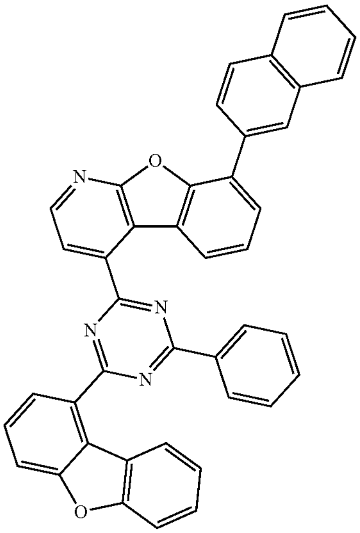
-continued
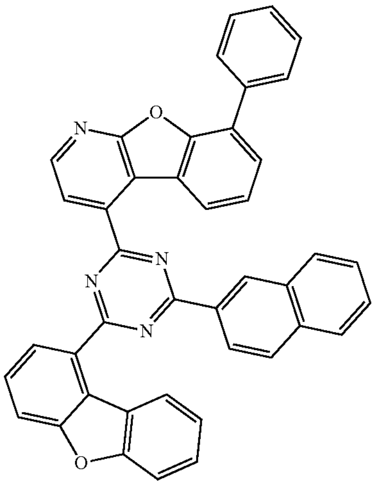
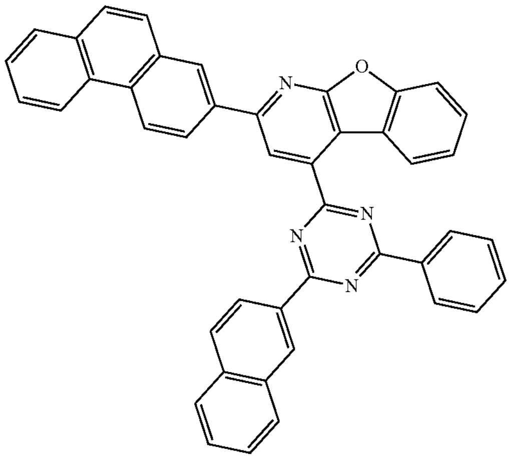
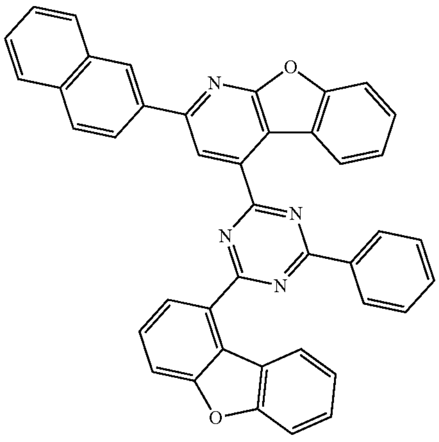

-continued
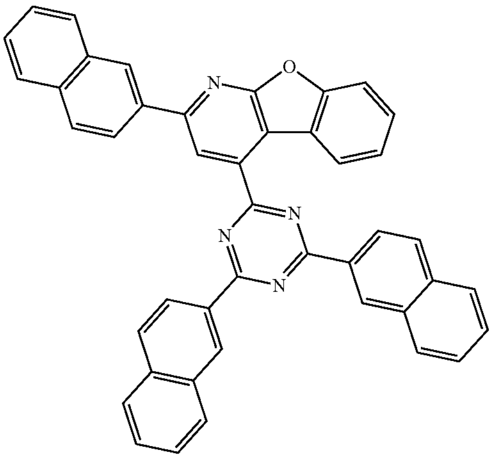
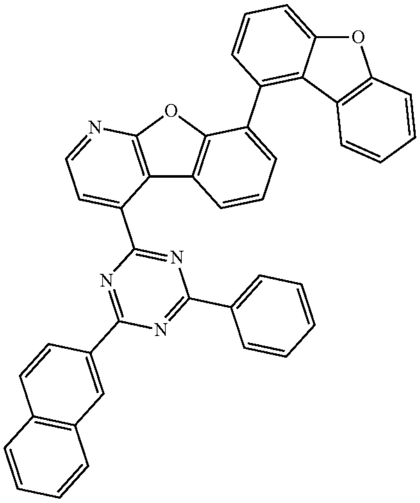
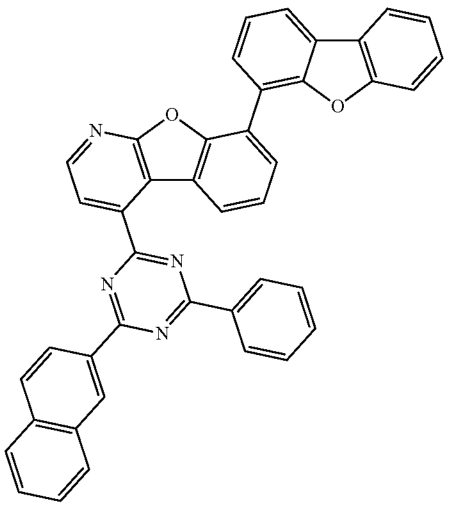
-continued
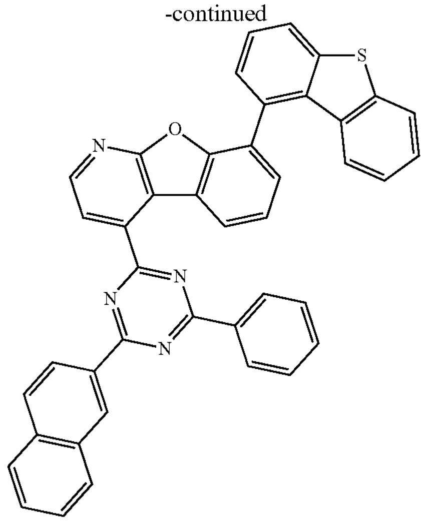
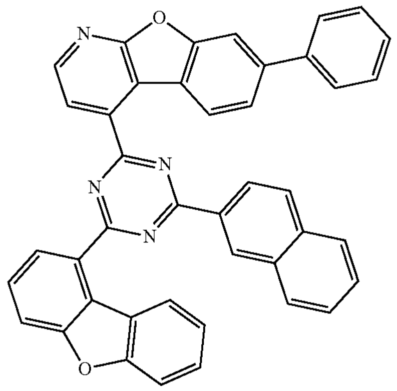
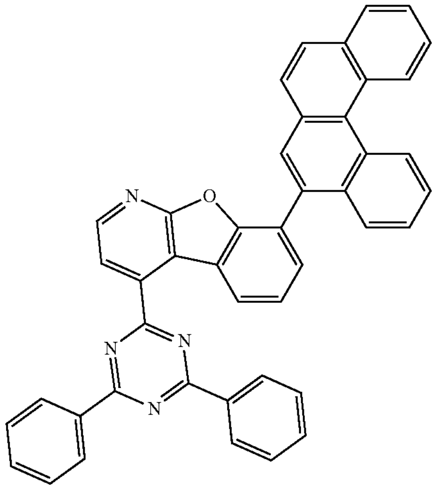

-continued
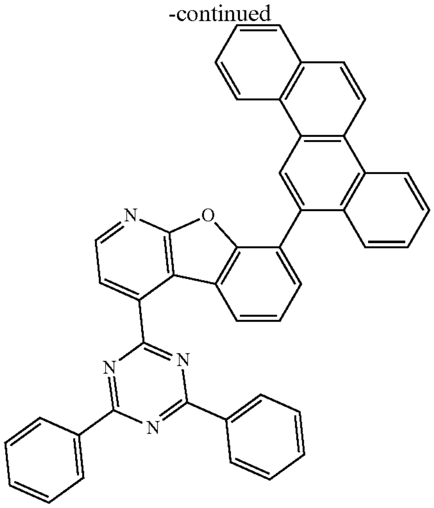
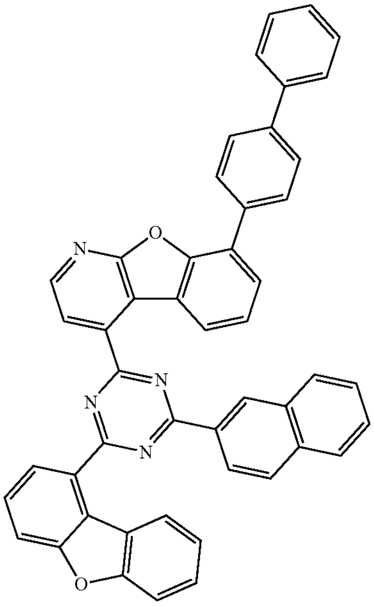
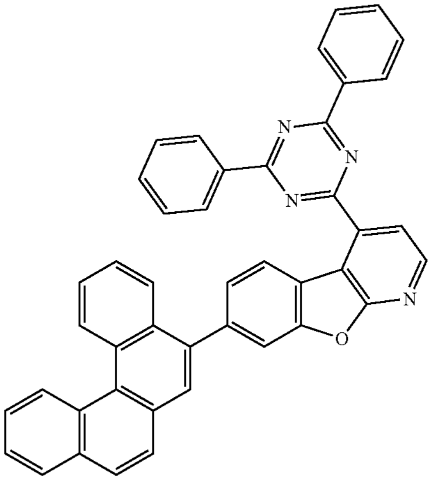
-continued
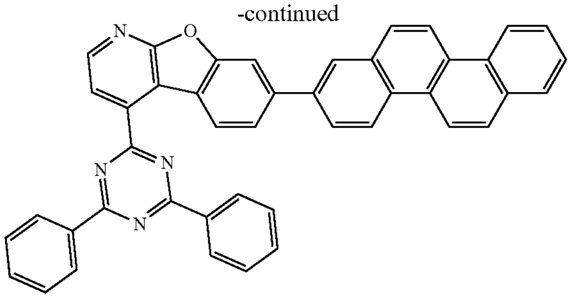
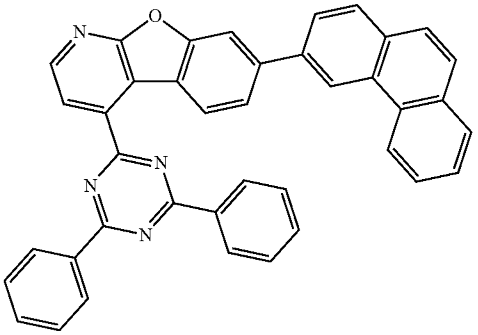
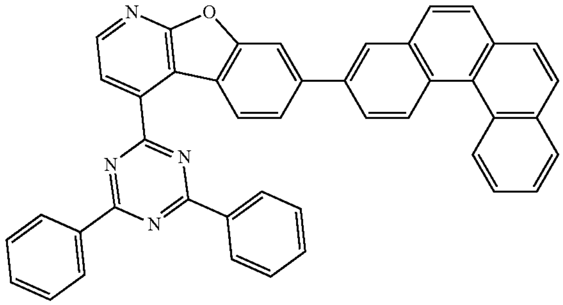
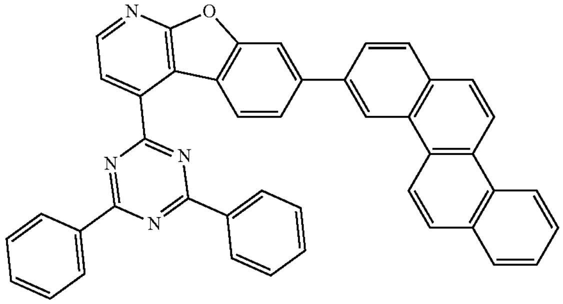
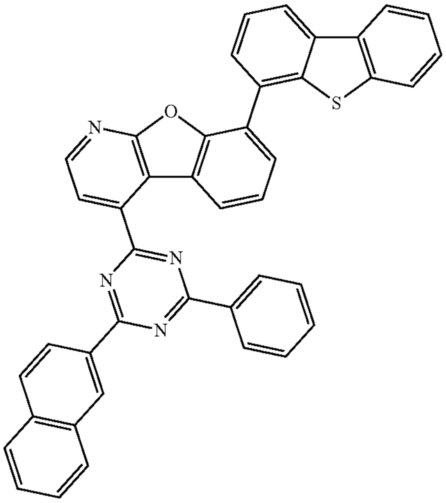

-continued
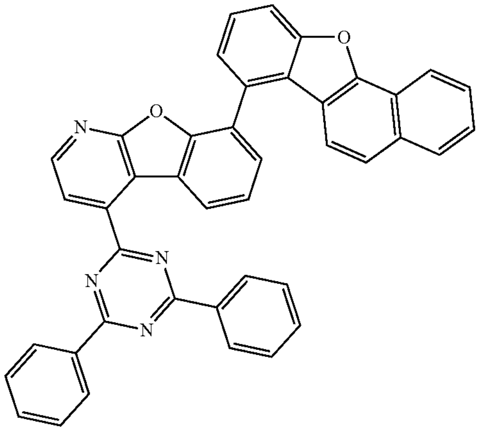
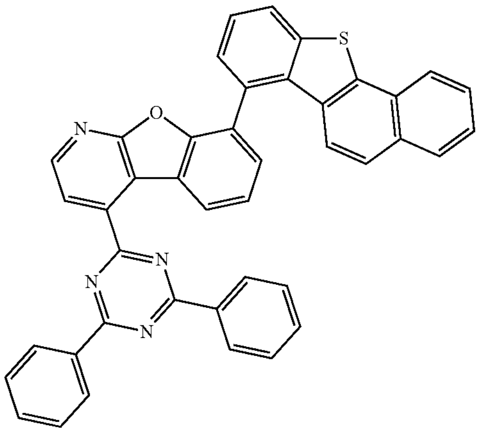
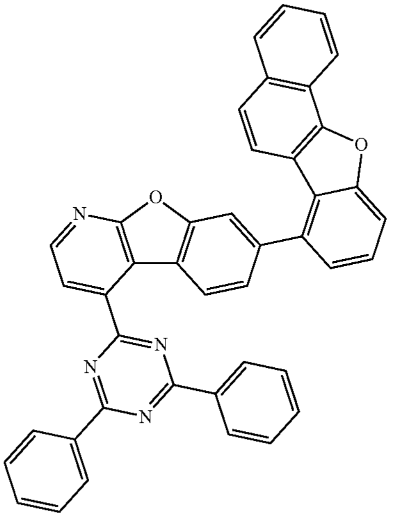
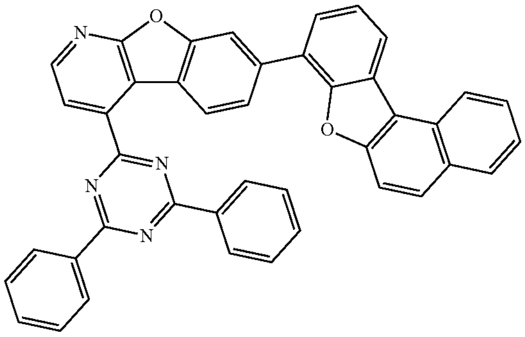
-continued
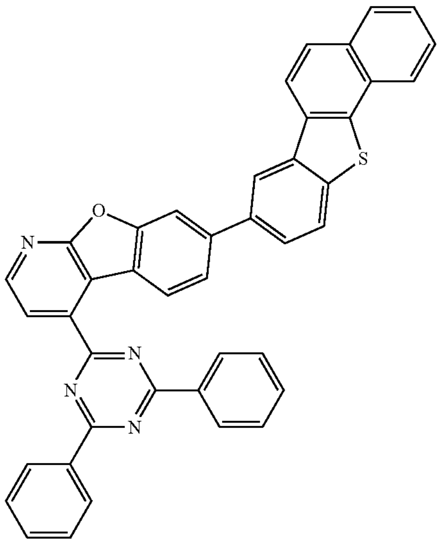
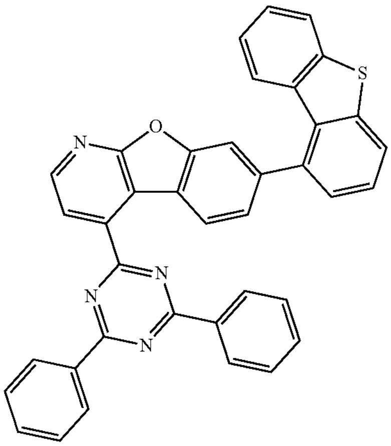
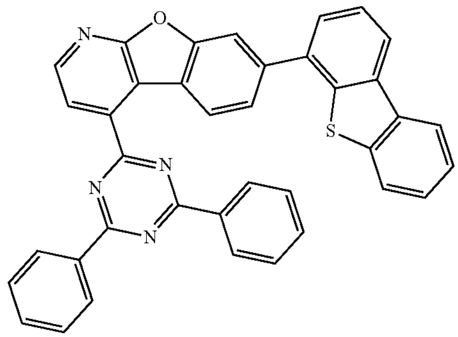

-continued
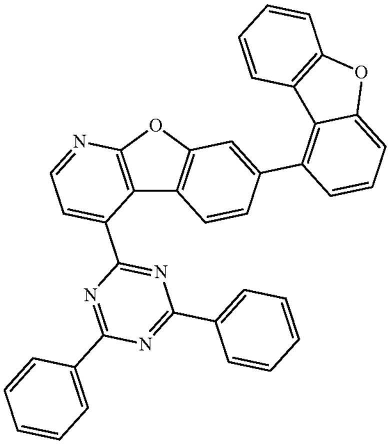
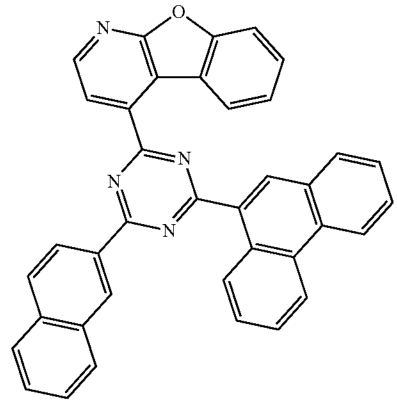
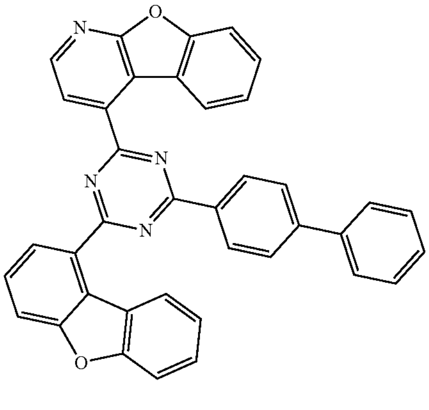
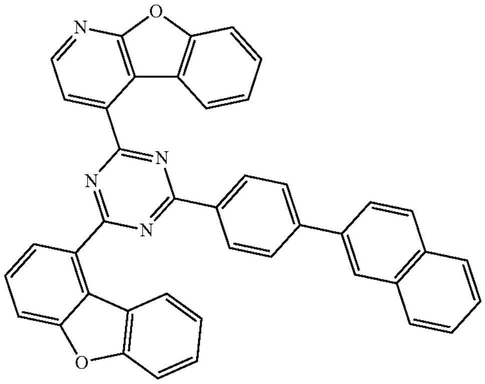
-continued
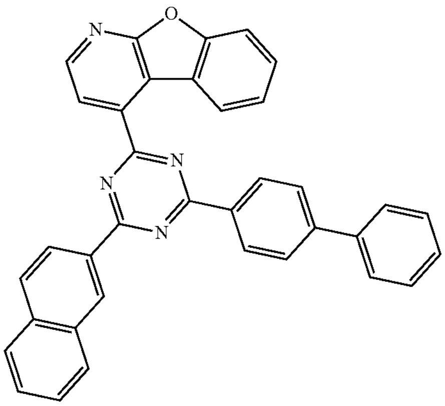
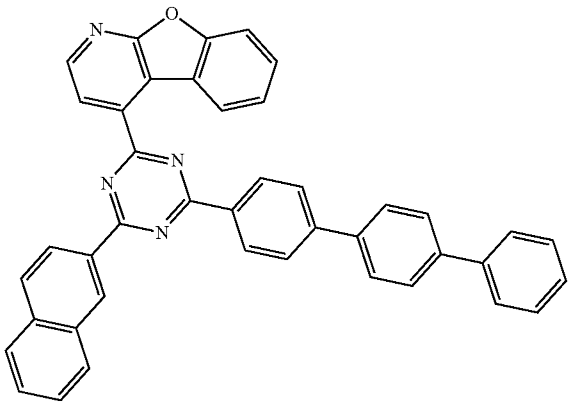
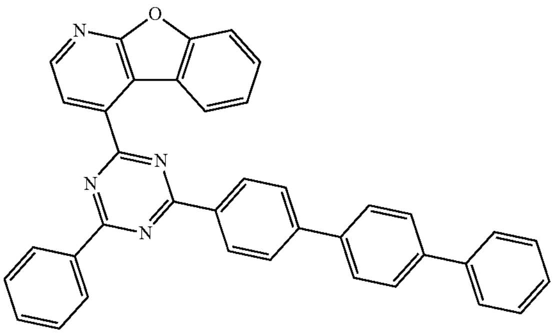
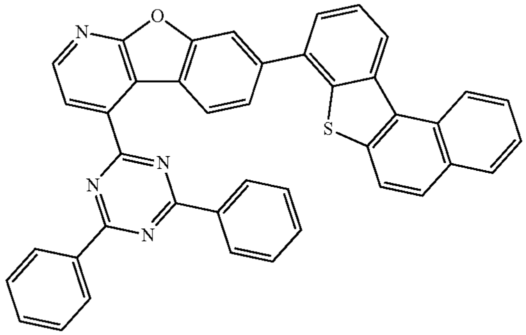

-continued
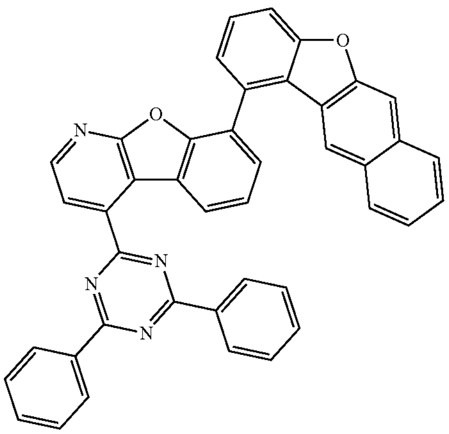
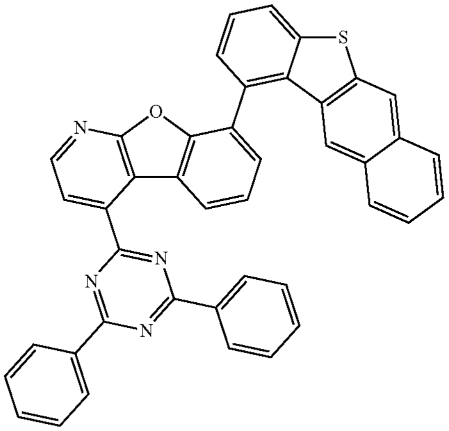
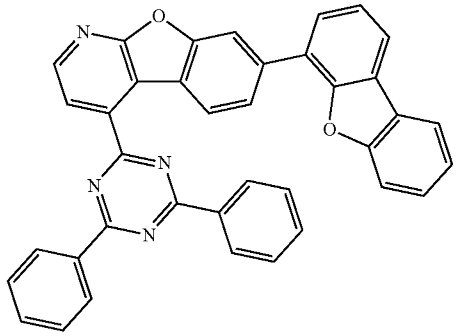
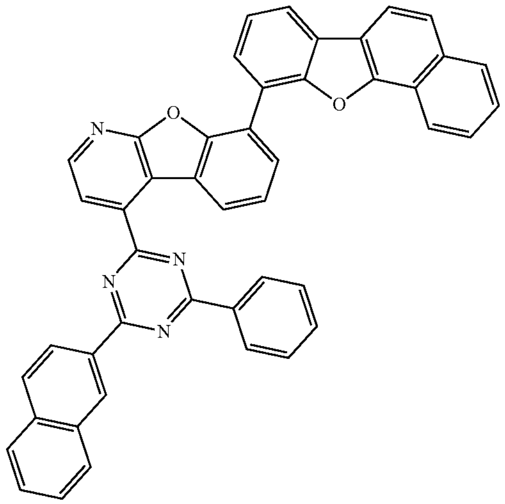
-continued
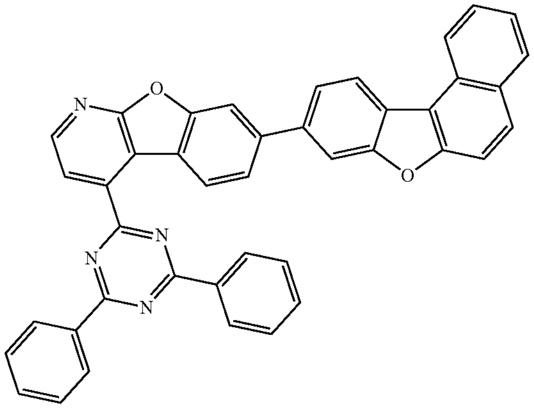
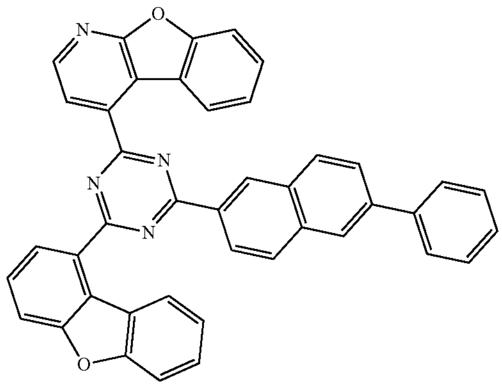
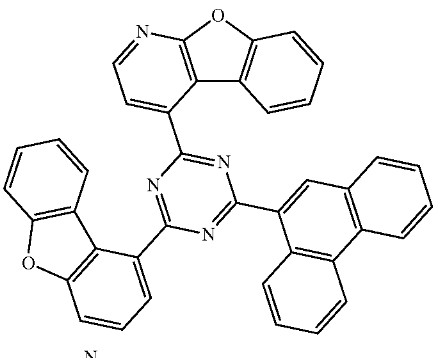
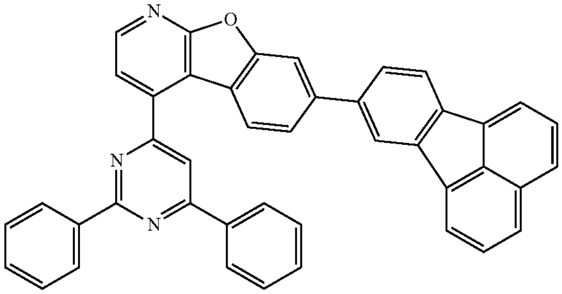

-continued
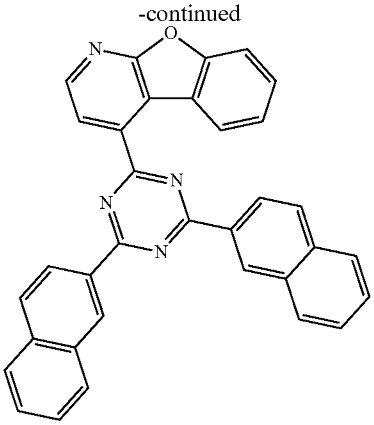
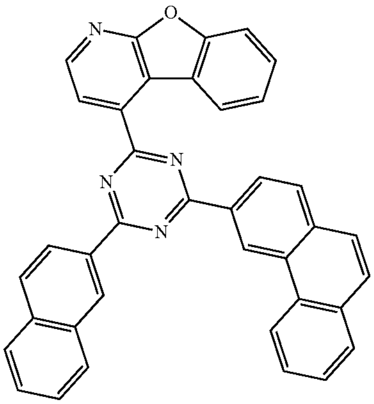
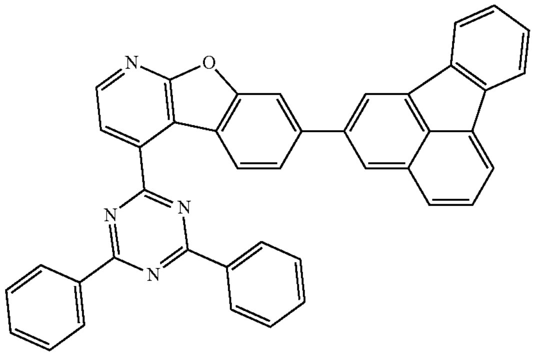
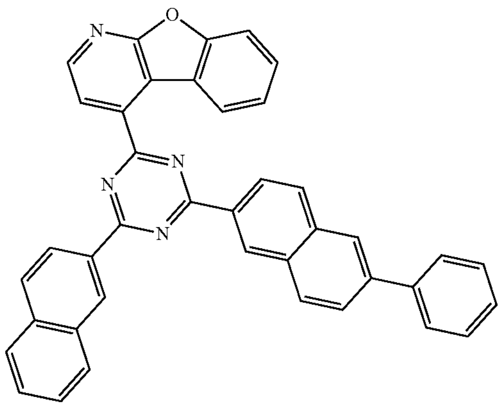
-continued
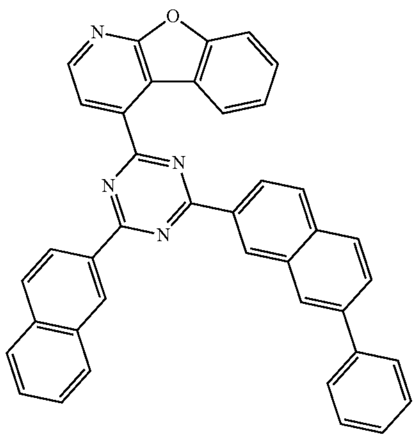
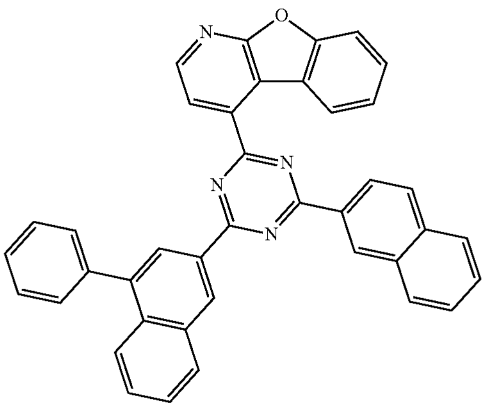
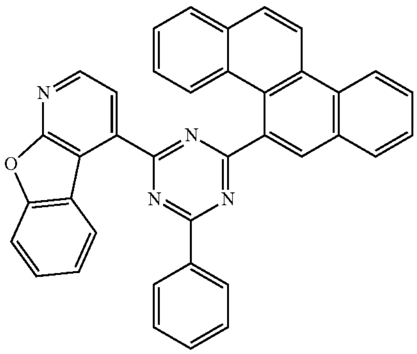
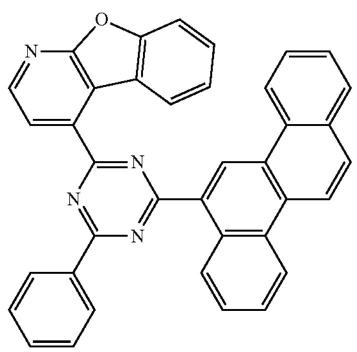

-continued
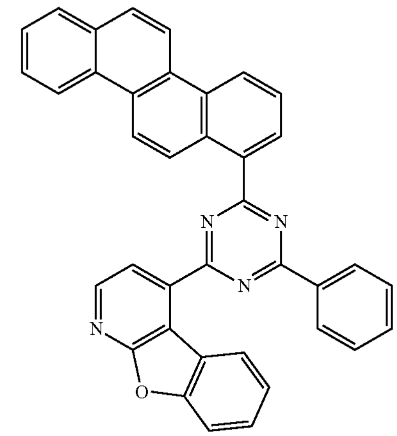
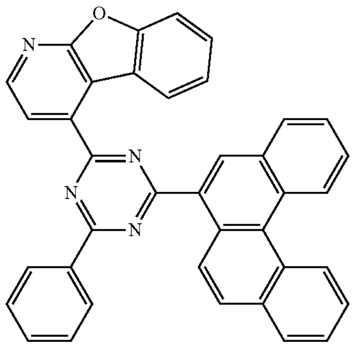
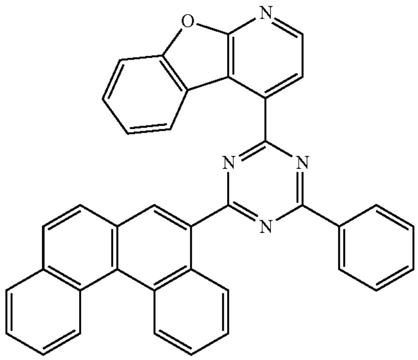
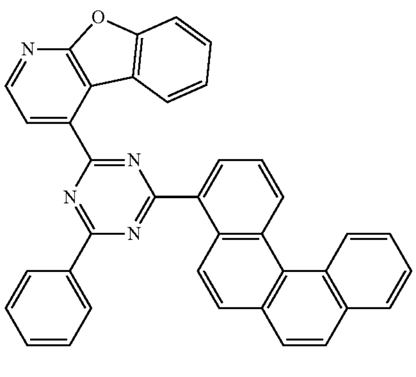
-continued
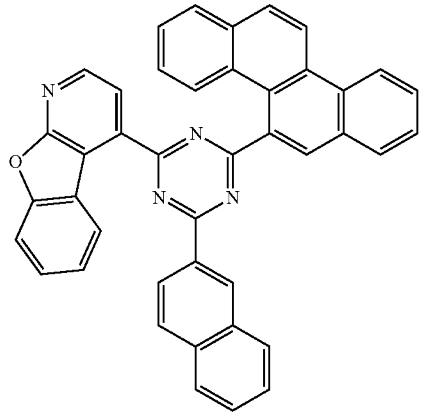
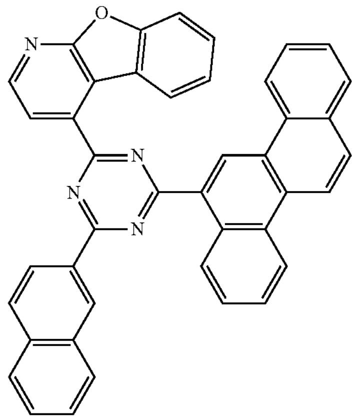
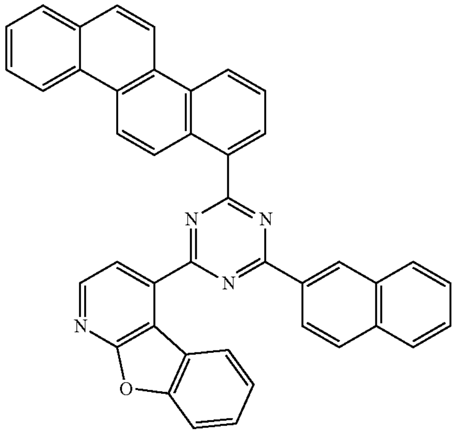
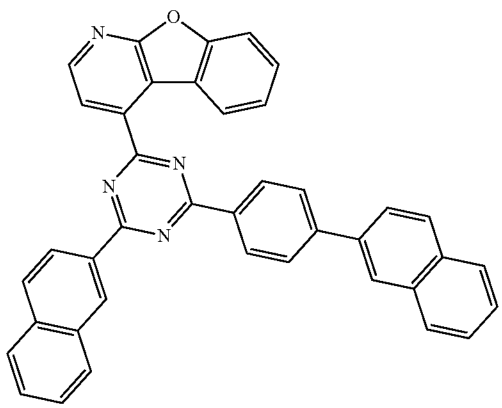

-continued
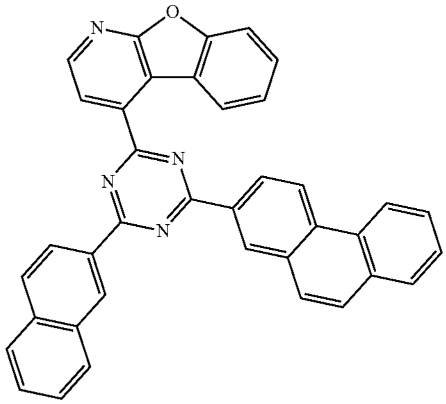
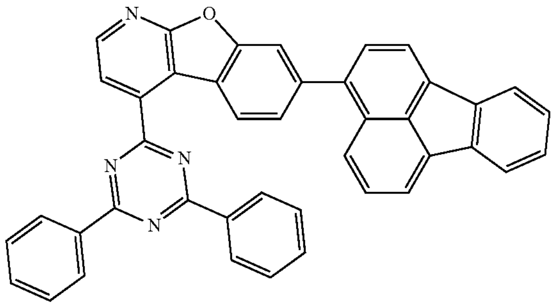
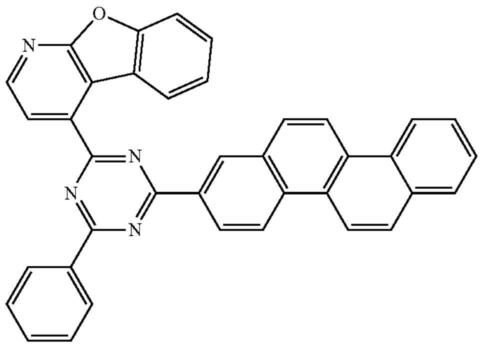
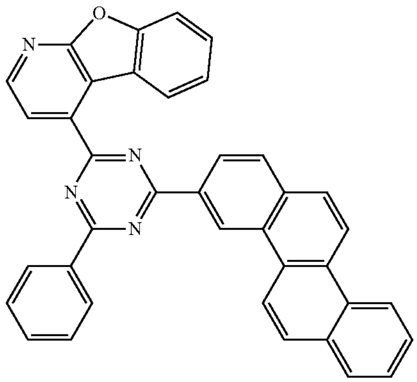
-continued
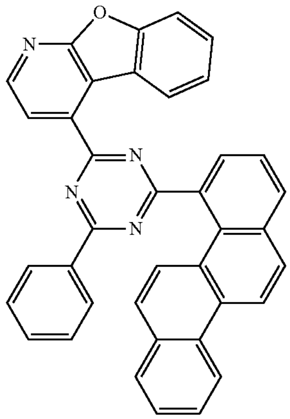
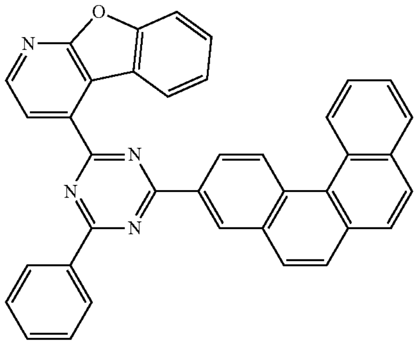
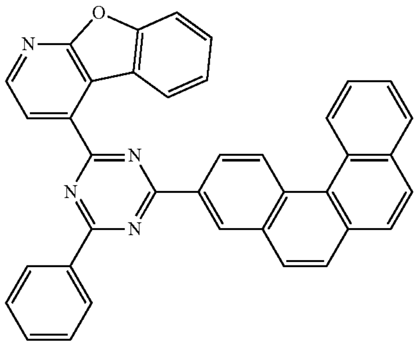
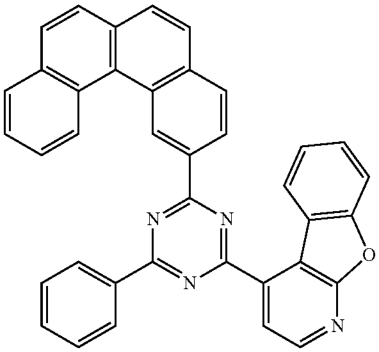

-continued
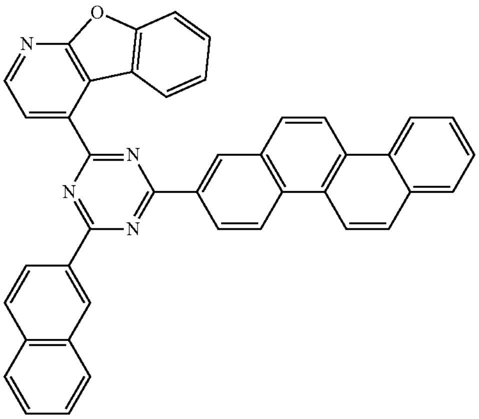
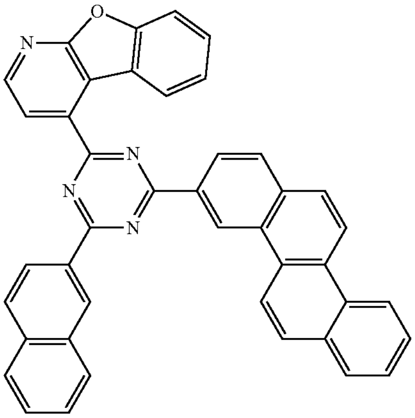
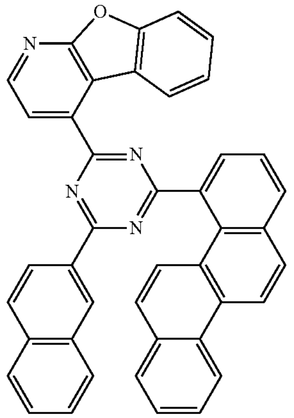
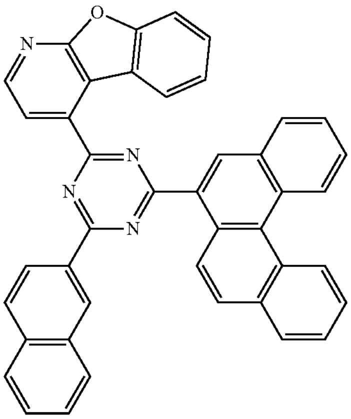
-continued
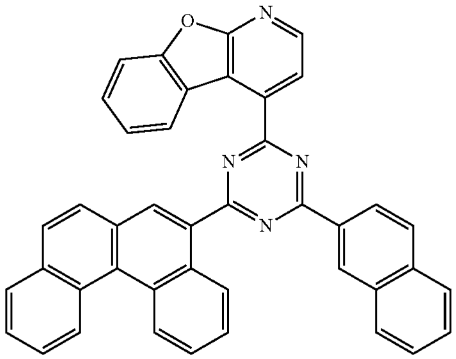
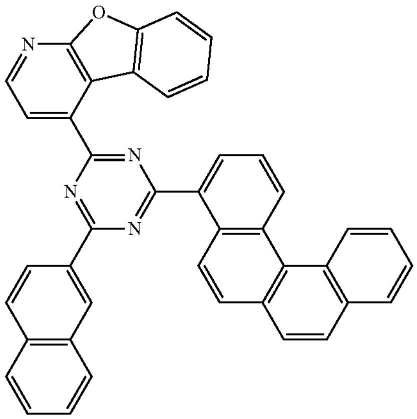
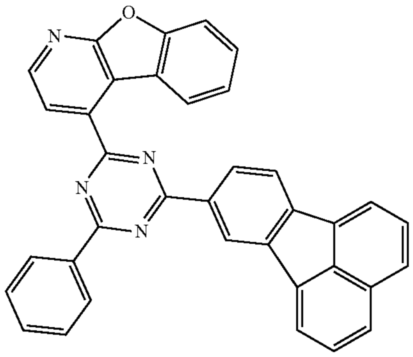
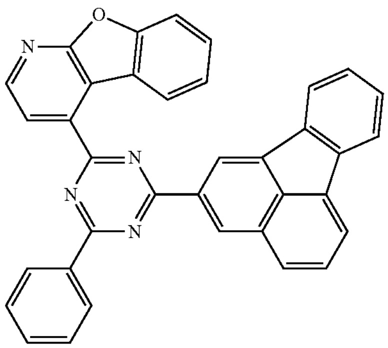

-continued
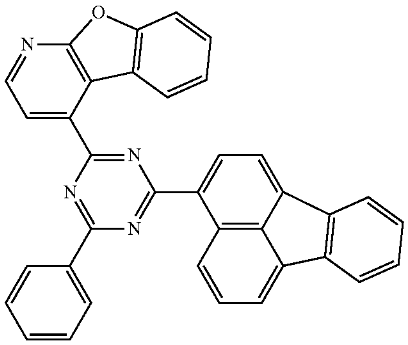
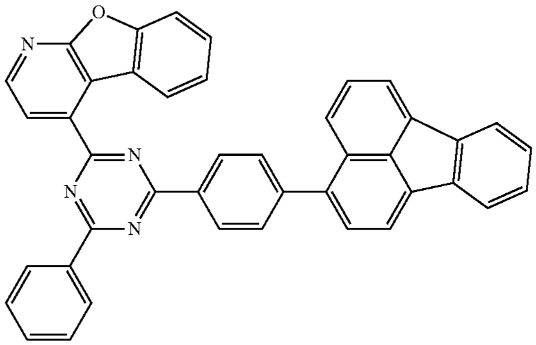
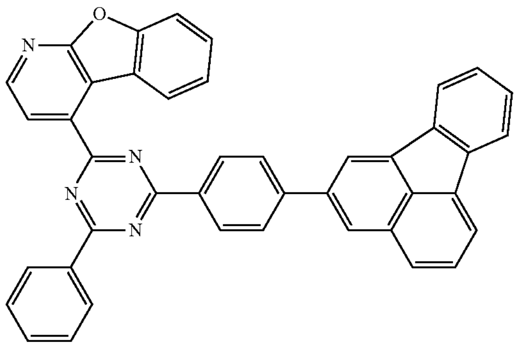
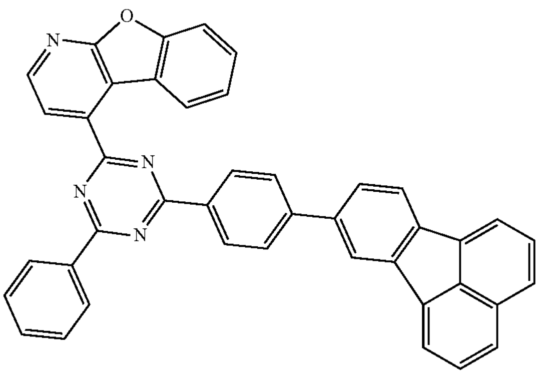
-continued
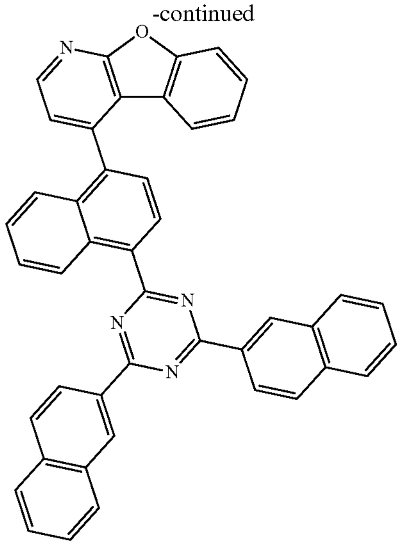
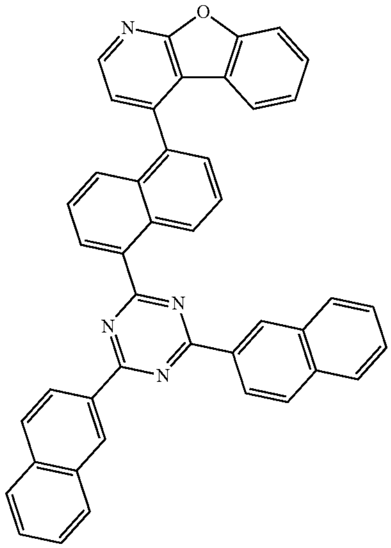
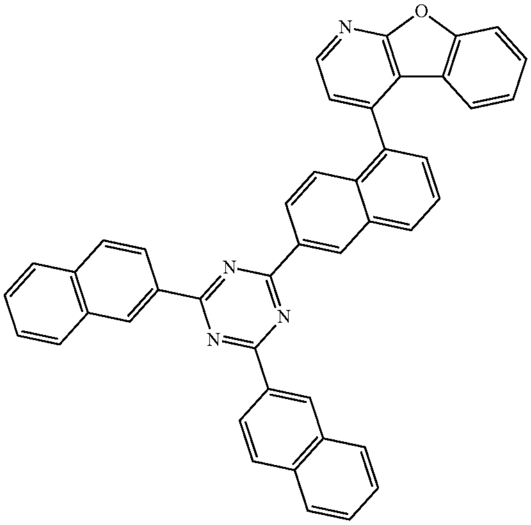

-continued
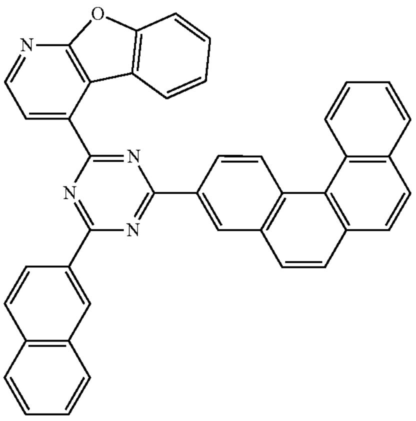
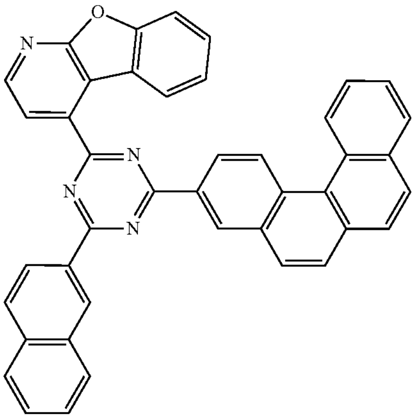
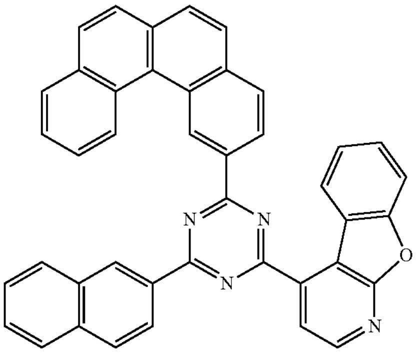
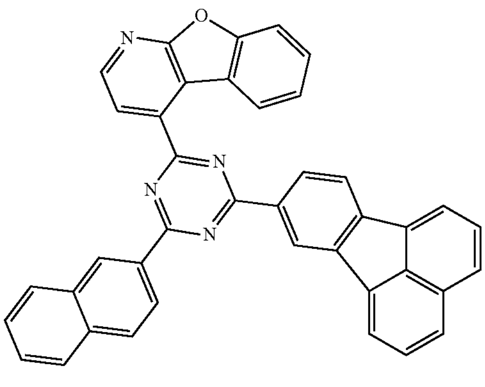
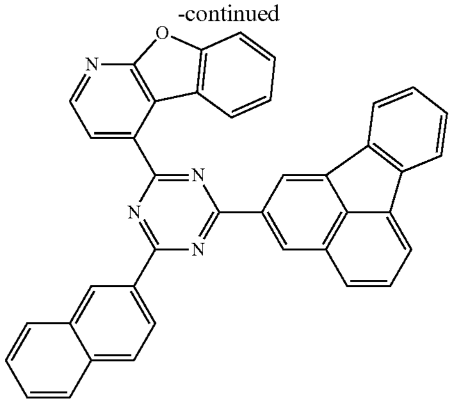
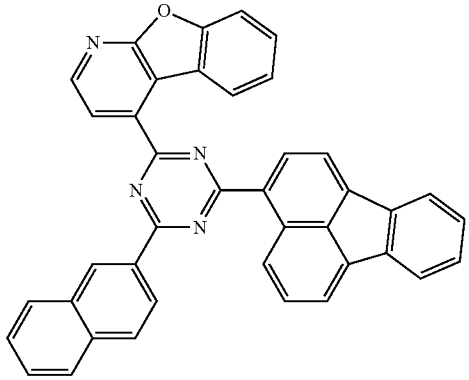
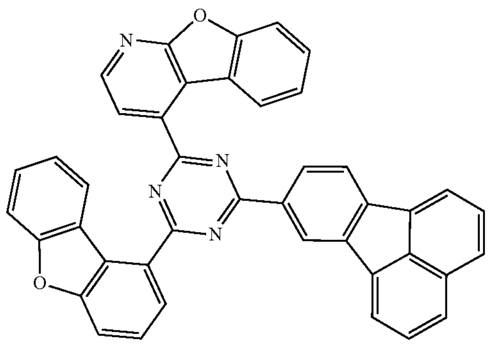
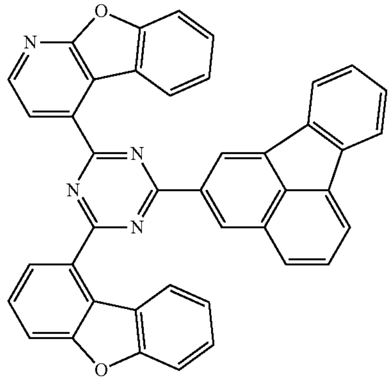

-continued
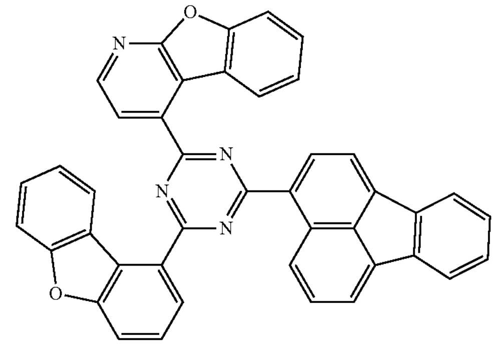
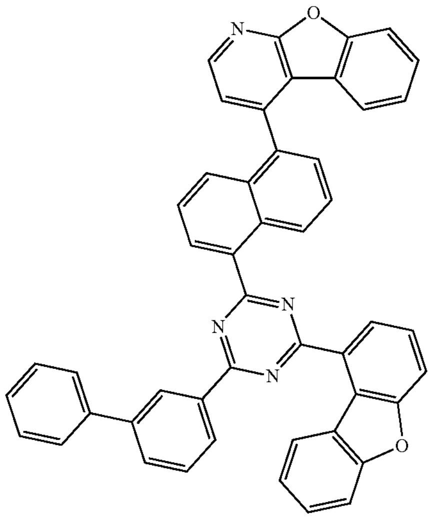
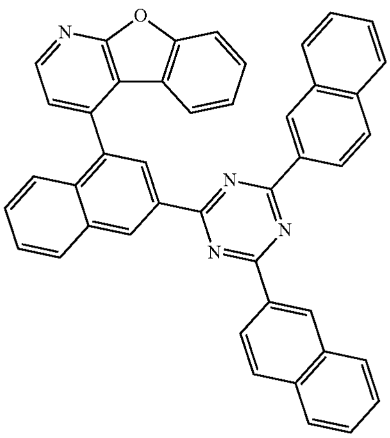
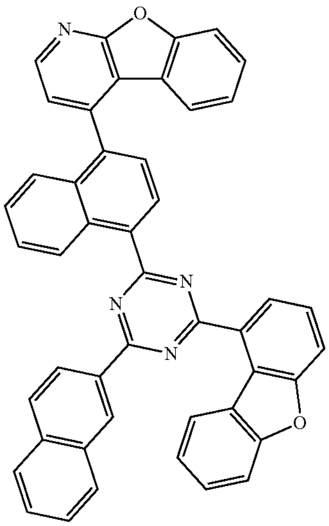
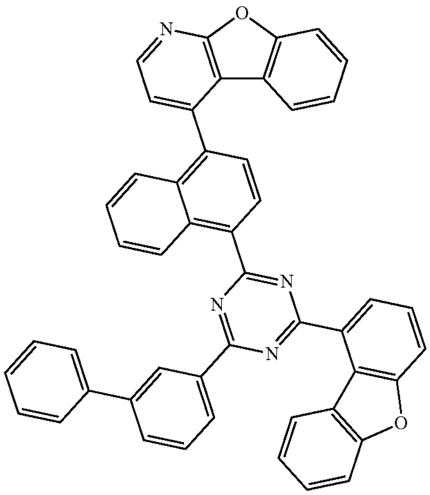
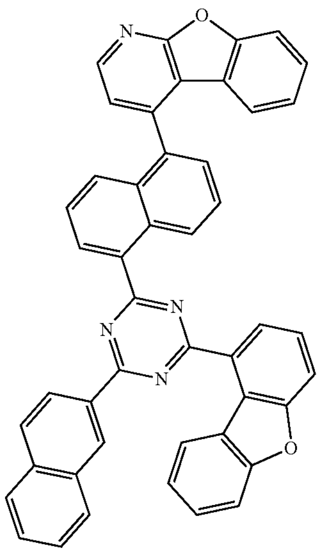
-continued -continued
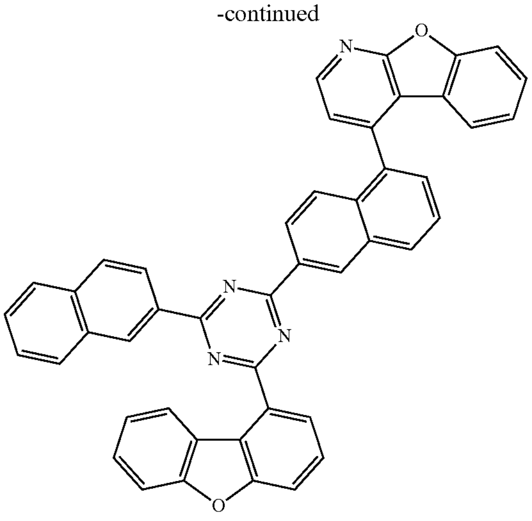
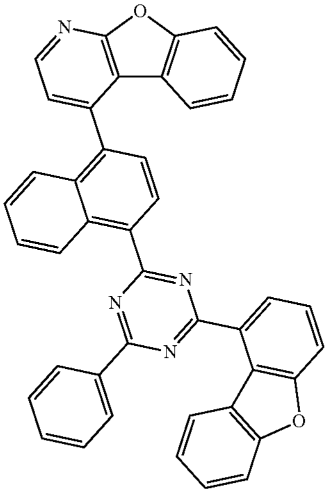
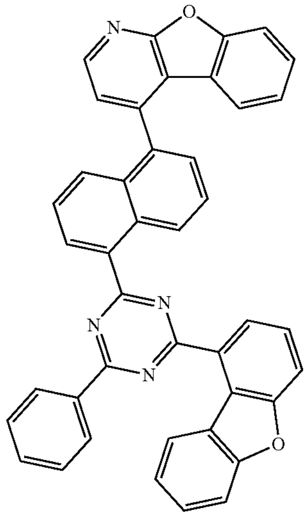
-continued
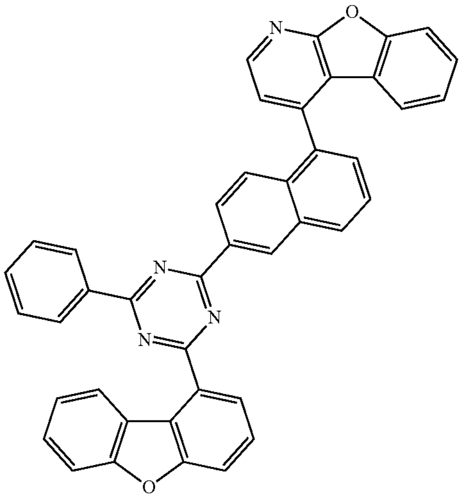
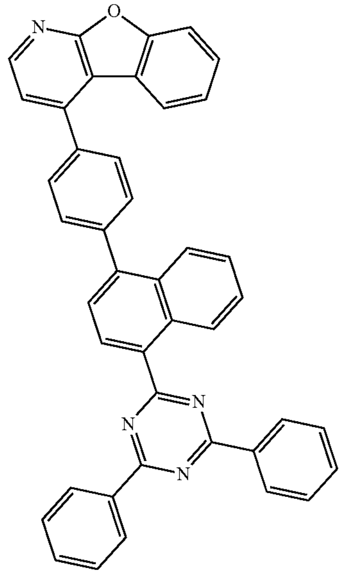
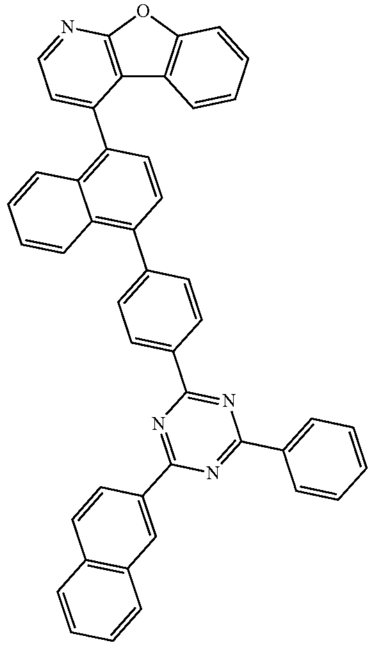

-continued
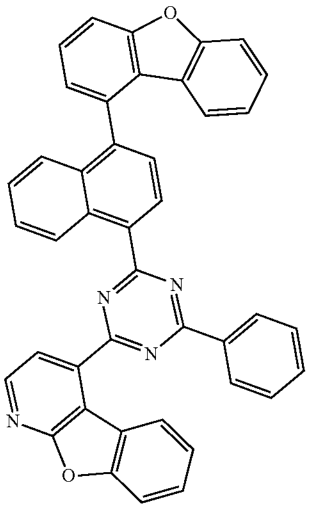
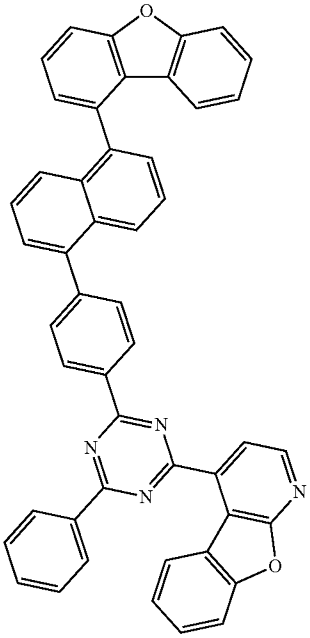
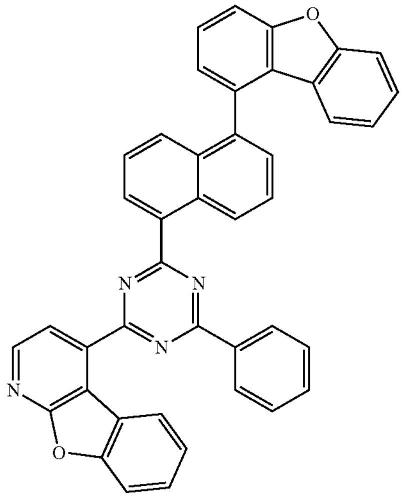
-continued
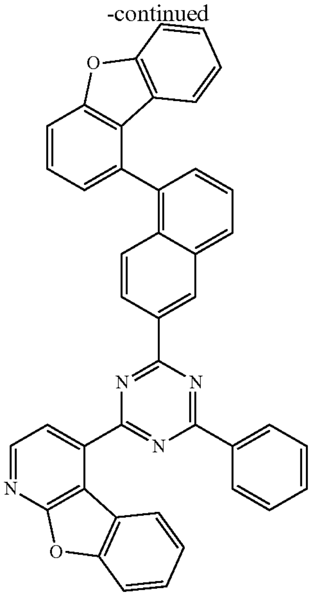
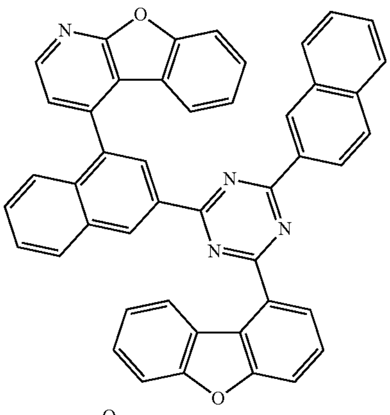
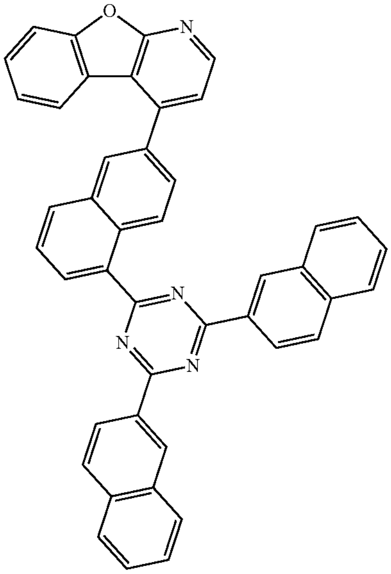

-continued
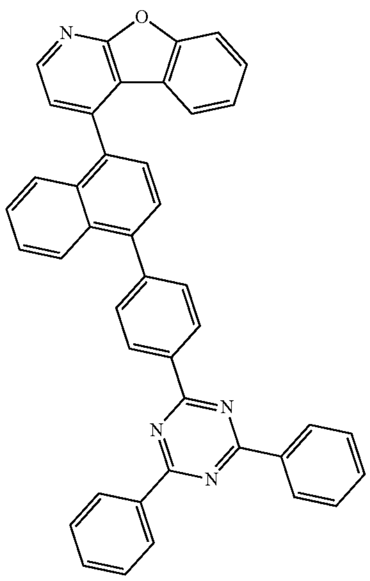
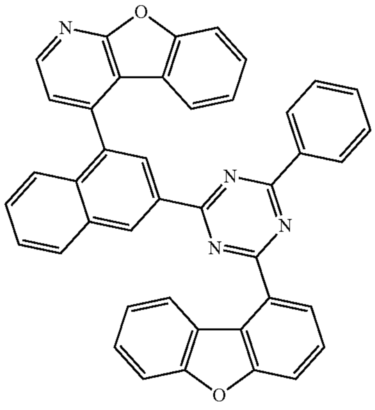
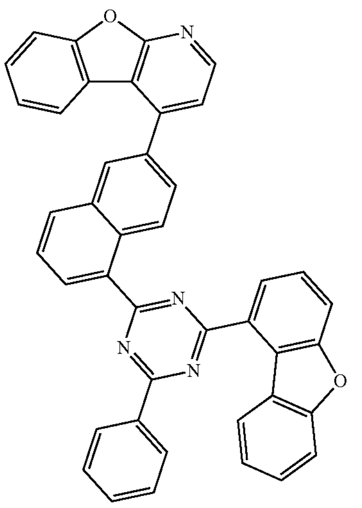
-continued
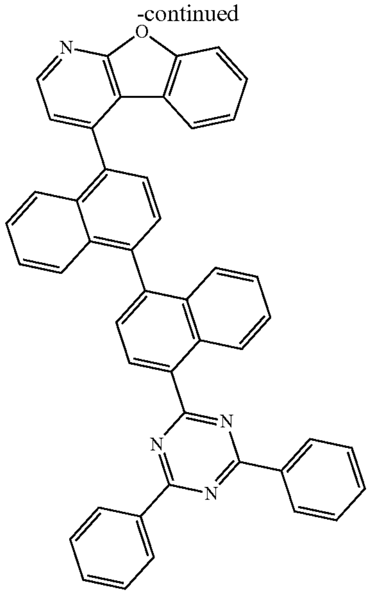
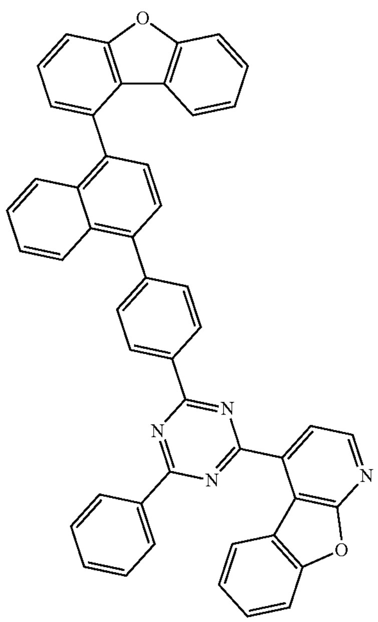

-continued
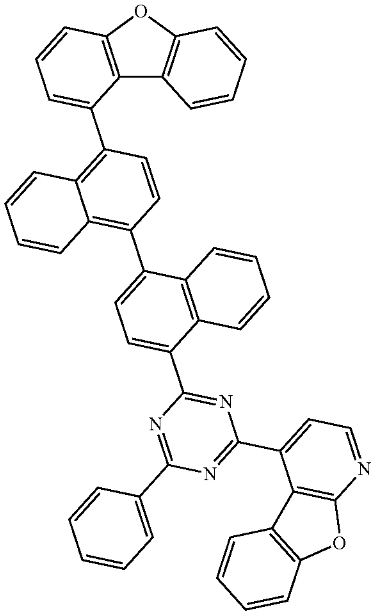
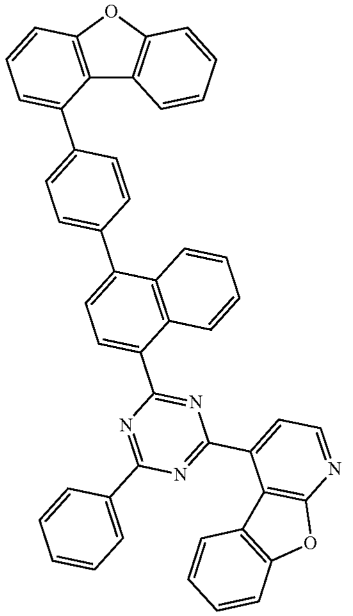
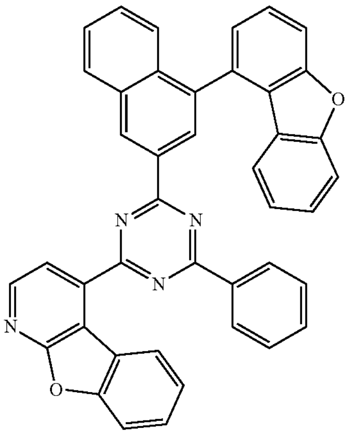
-continued
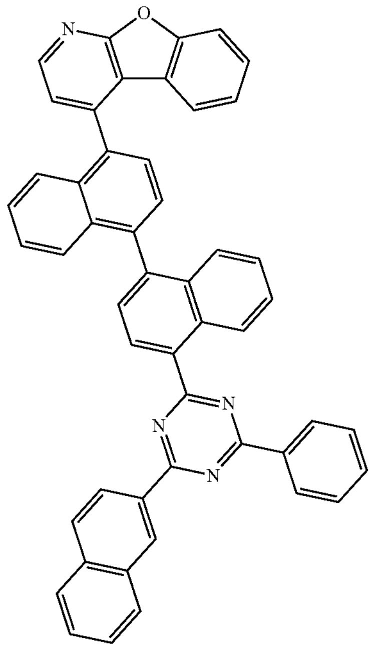
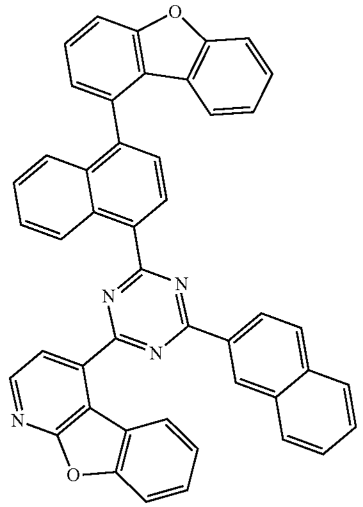
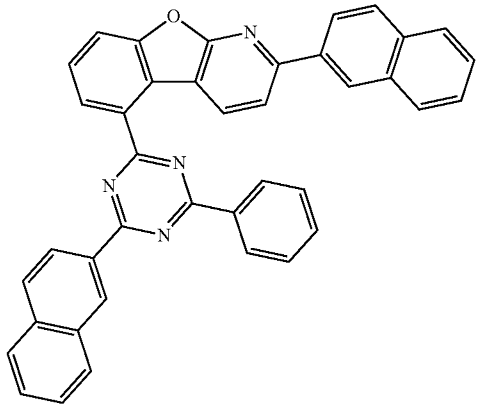

-continued
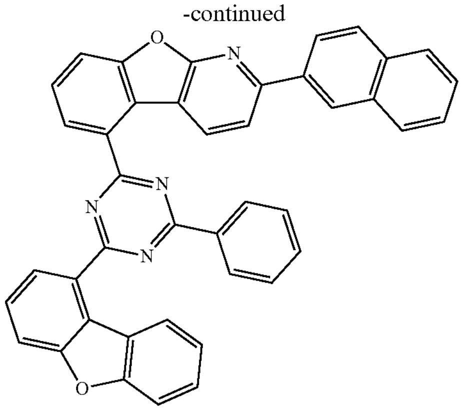
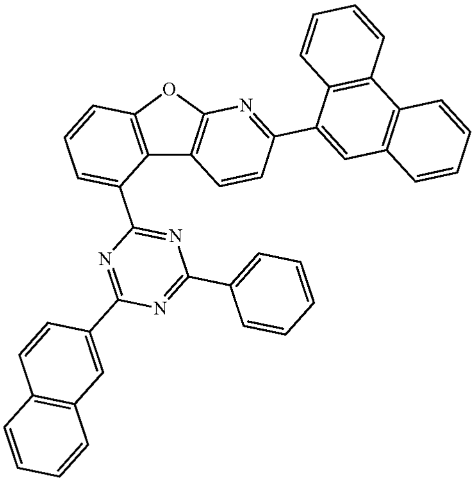
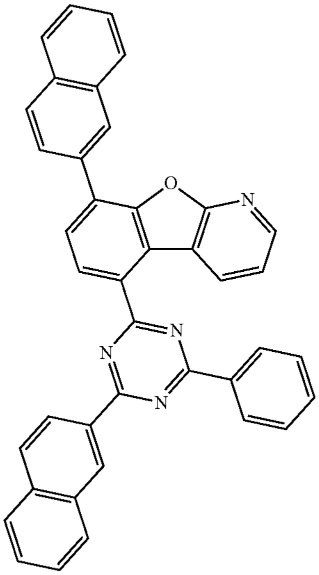
-continued
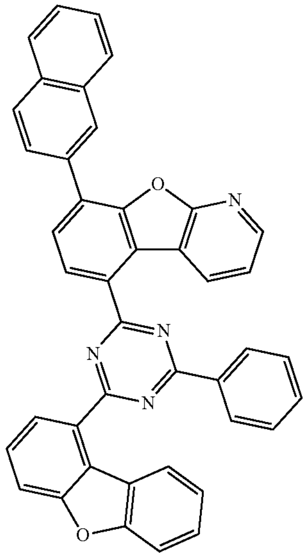
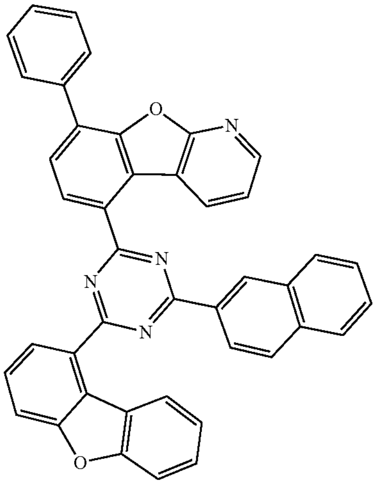
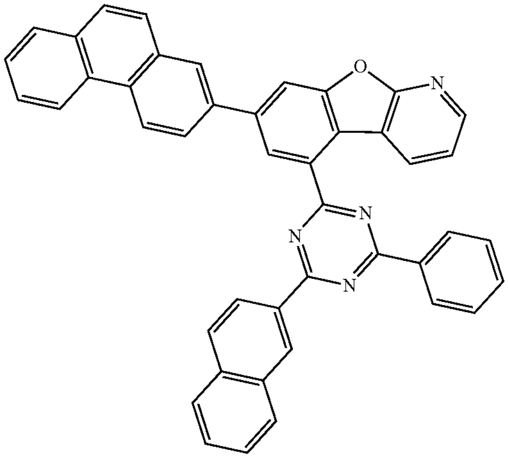

-continued
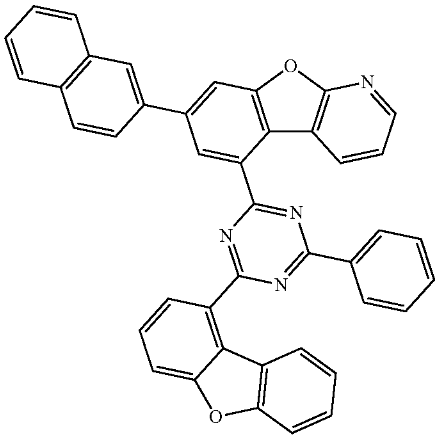
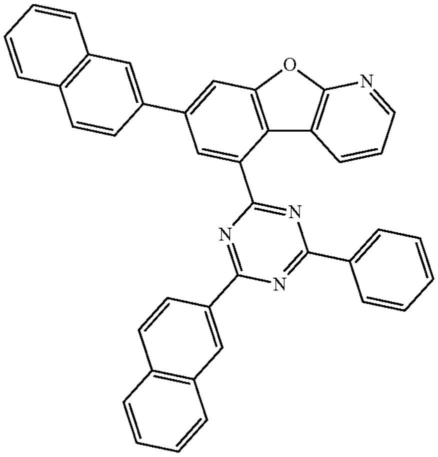
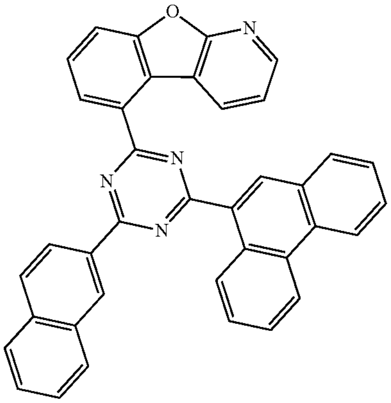
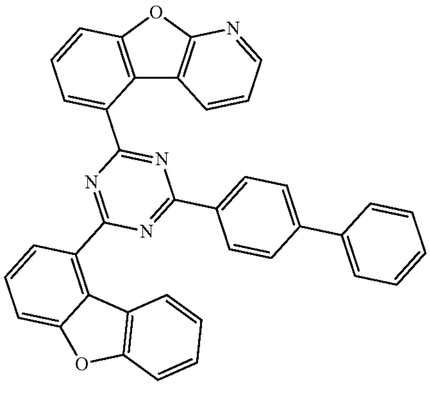
-continued
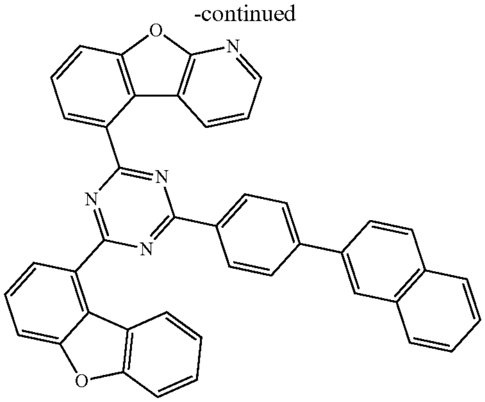
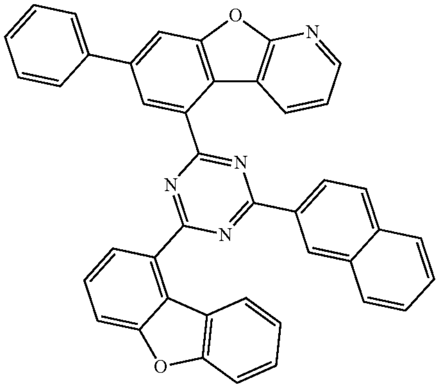
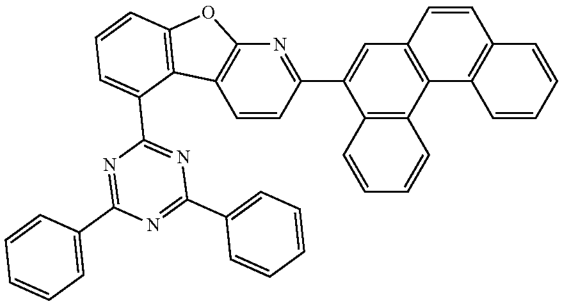
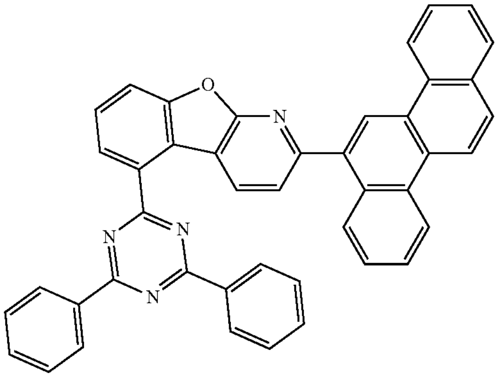

-continued
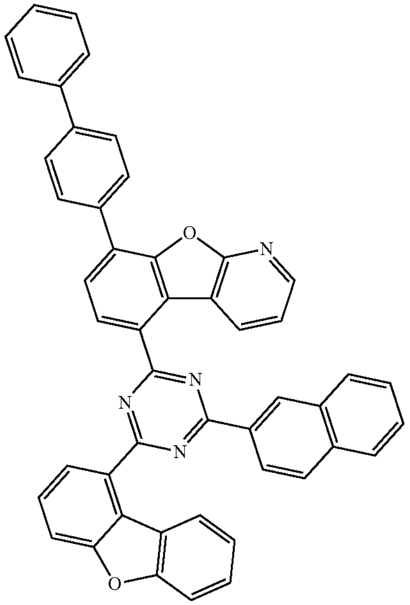
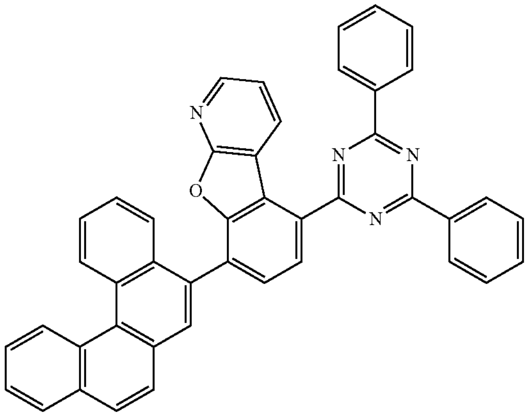
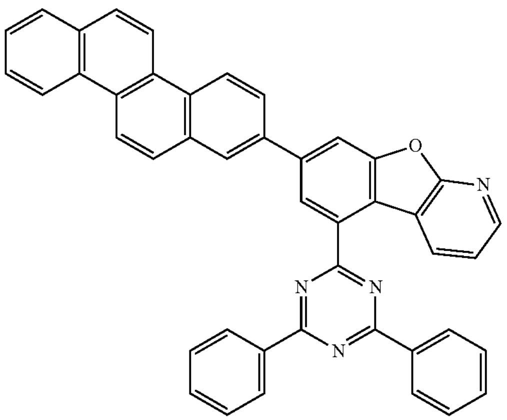
-continued
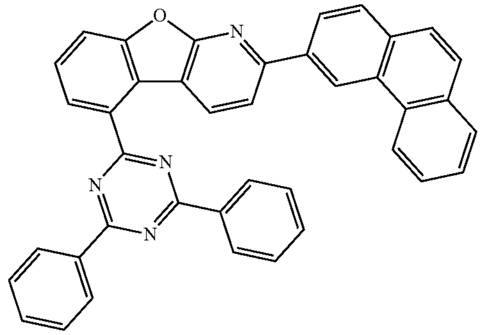
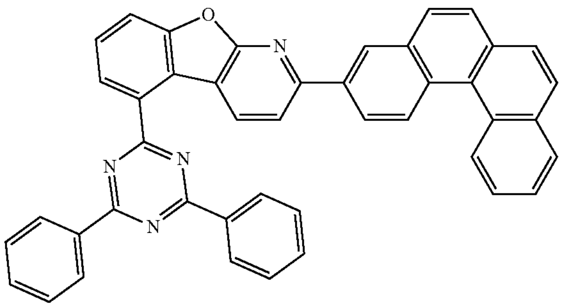
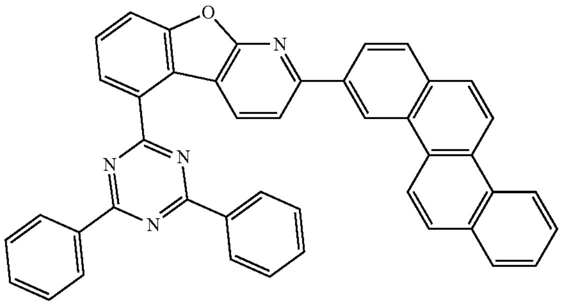
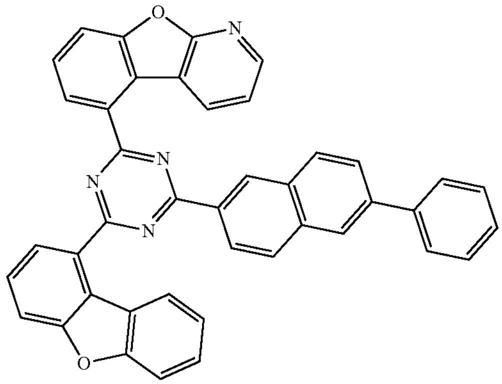
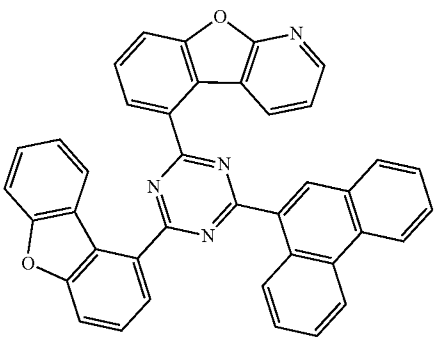

-continued
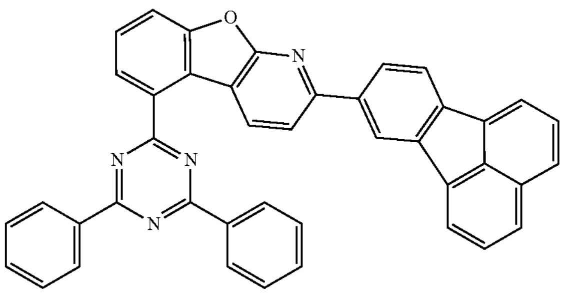
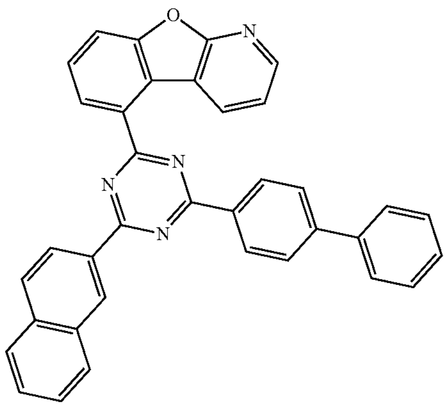
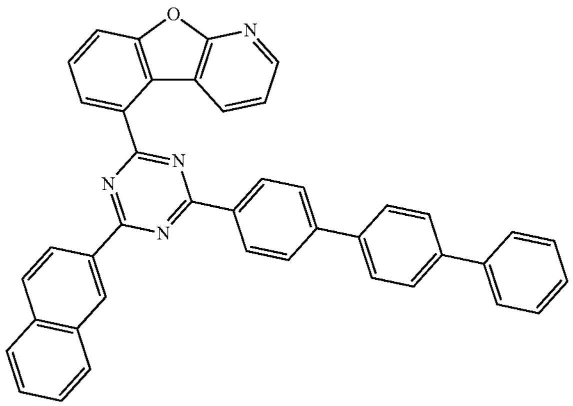
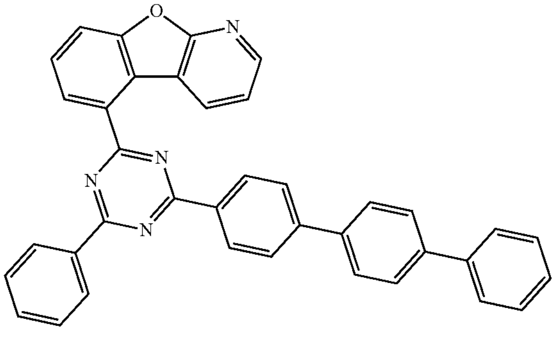
-continued
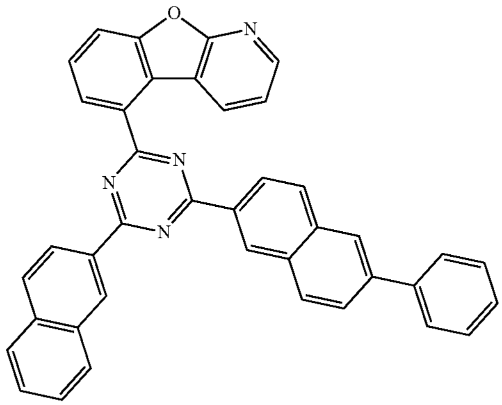
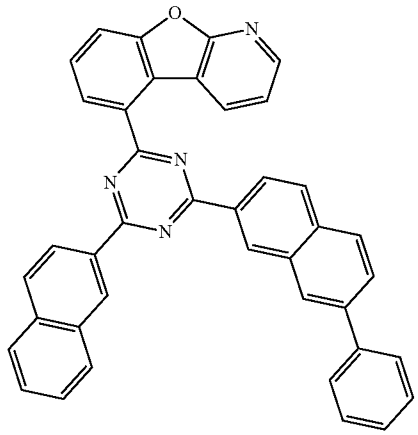
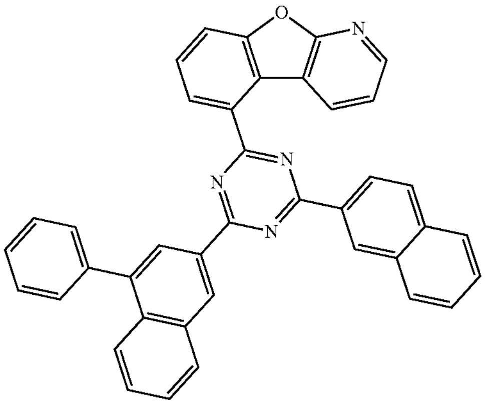
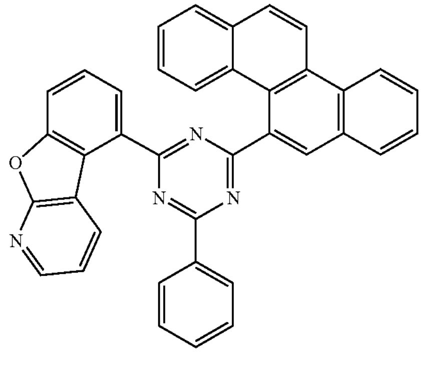

-continued
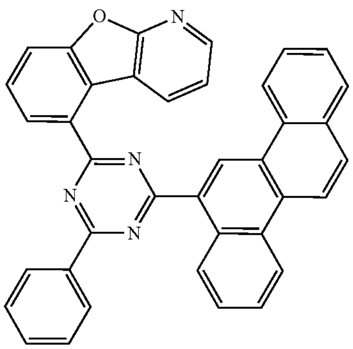
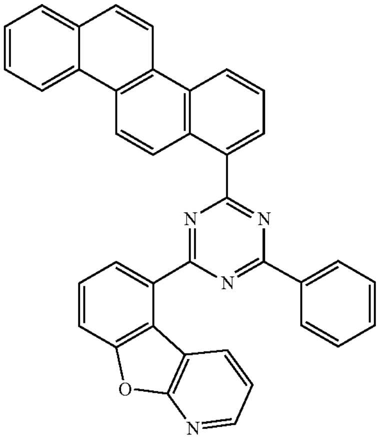
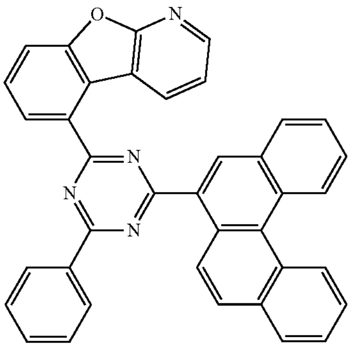
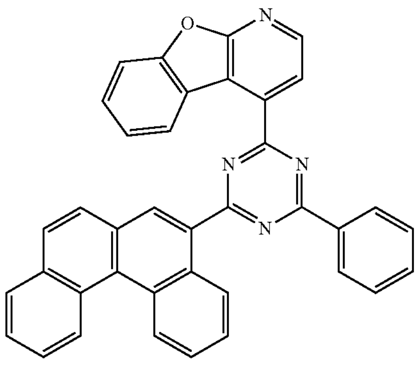
-continued
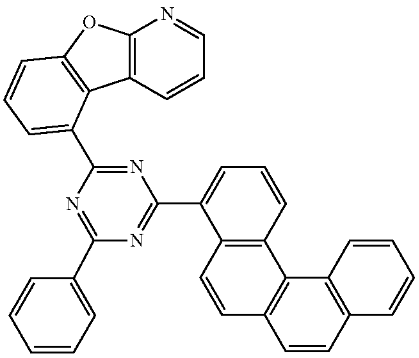
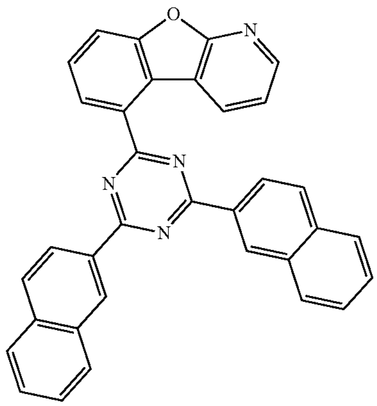
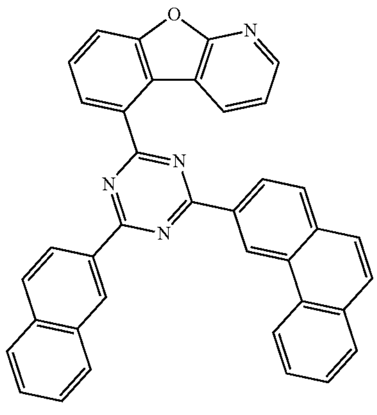
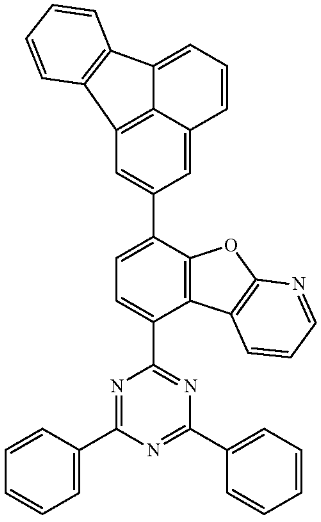

-continued
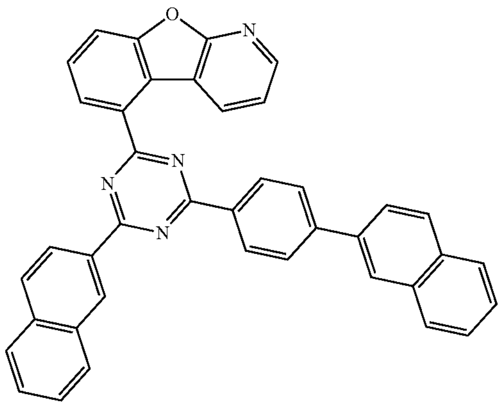
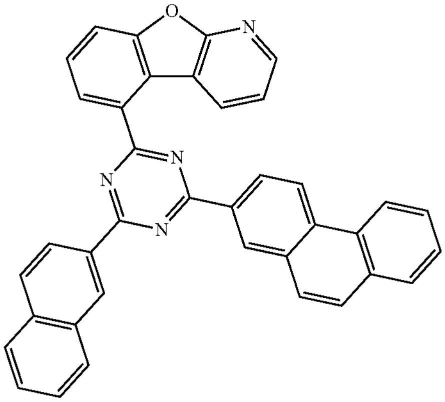
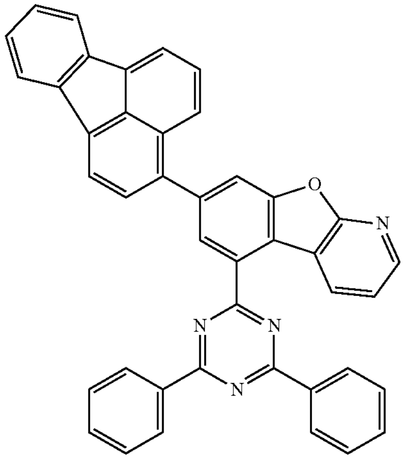
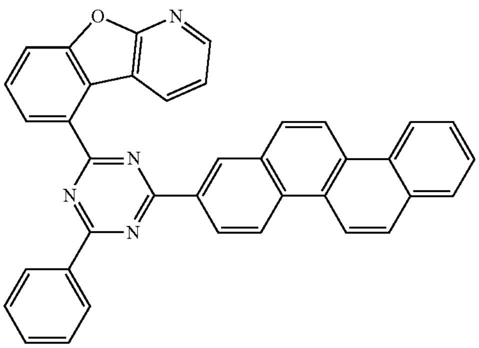
-continued
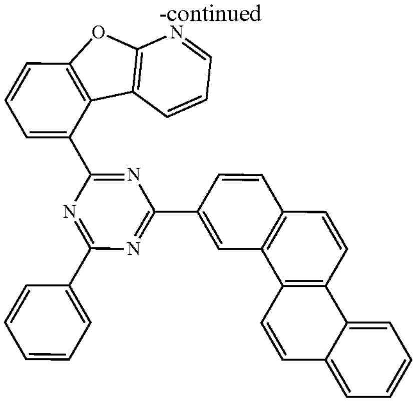
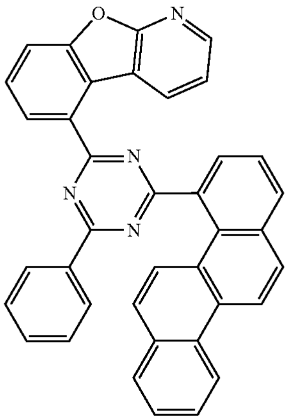
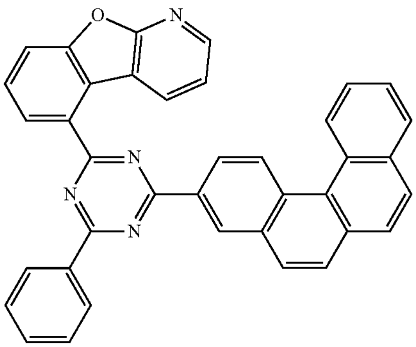
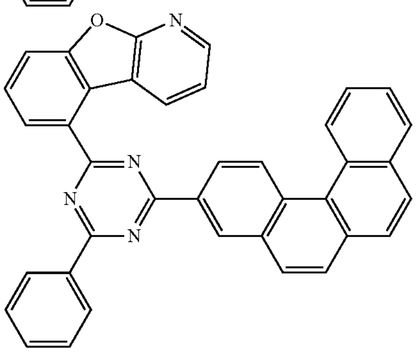

-continued
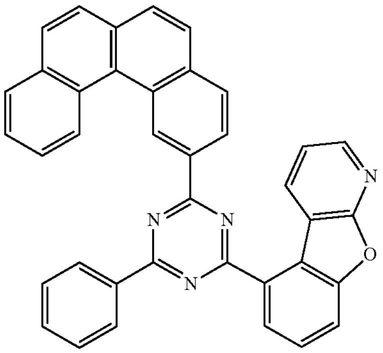
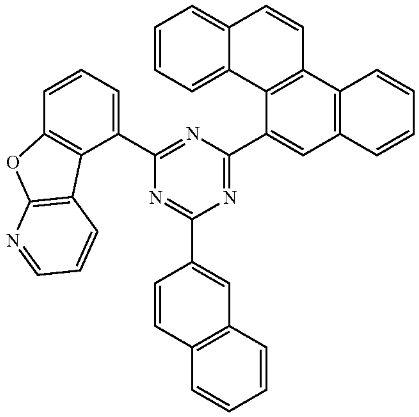
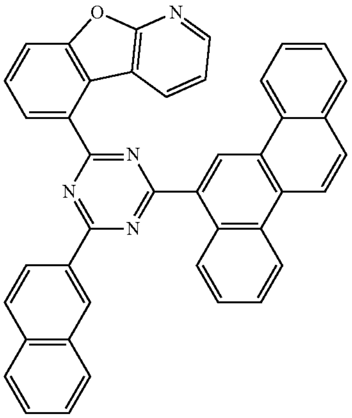
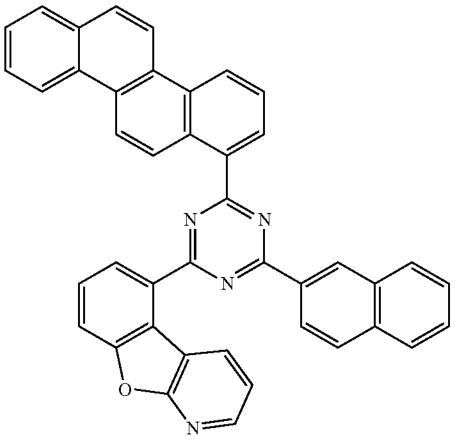
-continued
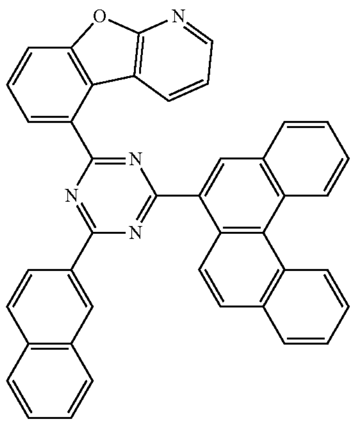
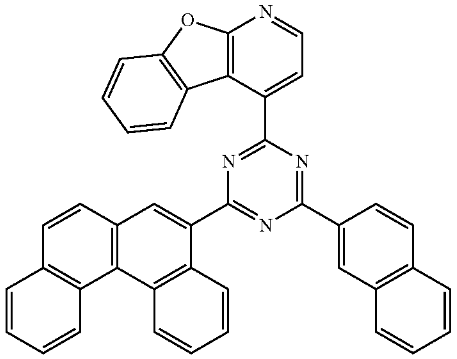
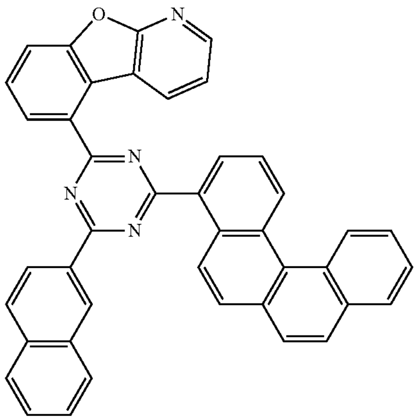
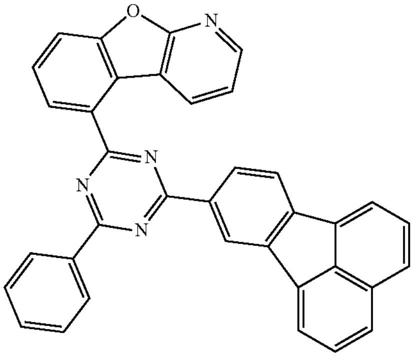

-continued
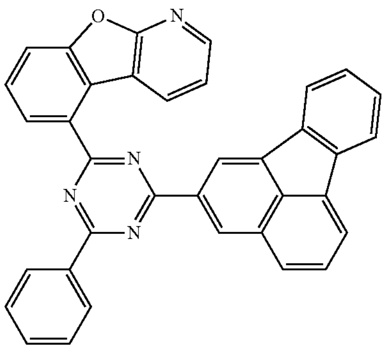
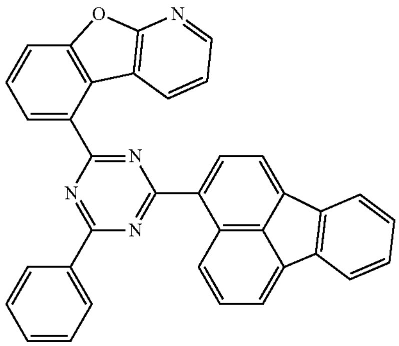
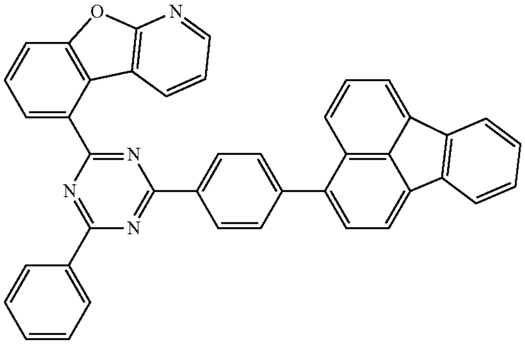
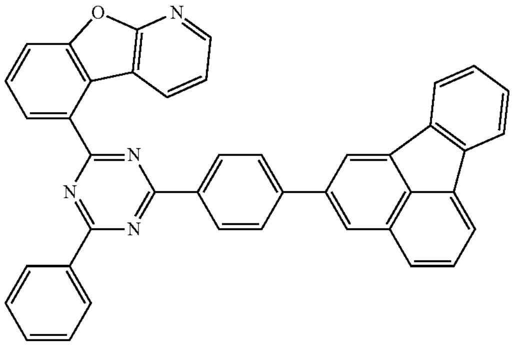
-continued
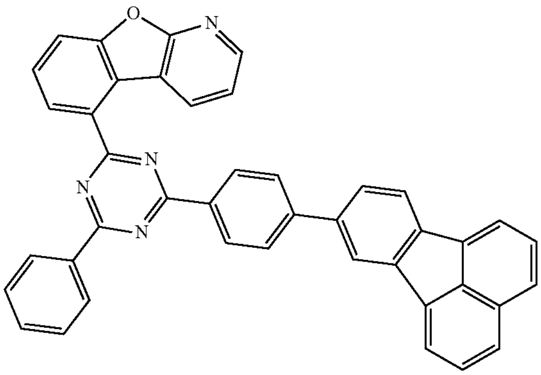
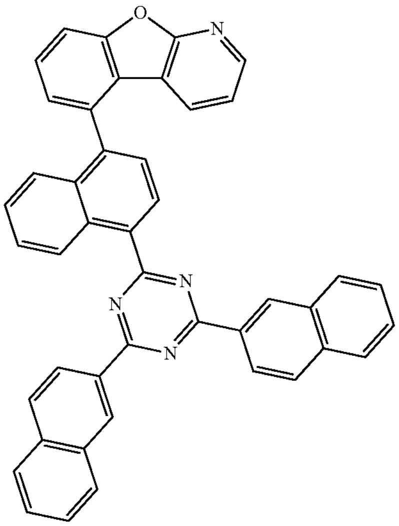
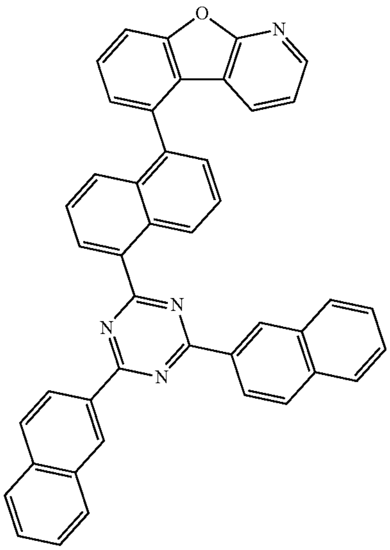

-continued
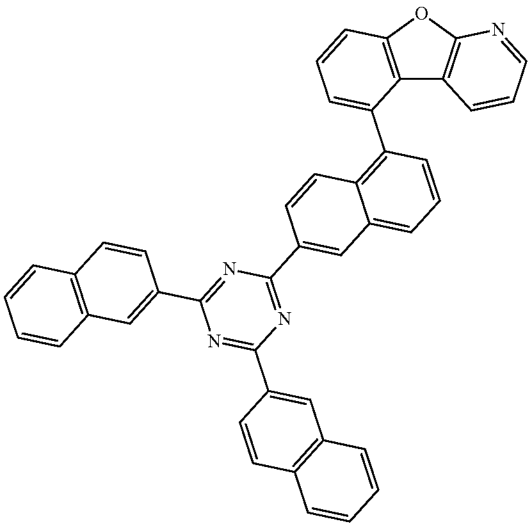
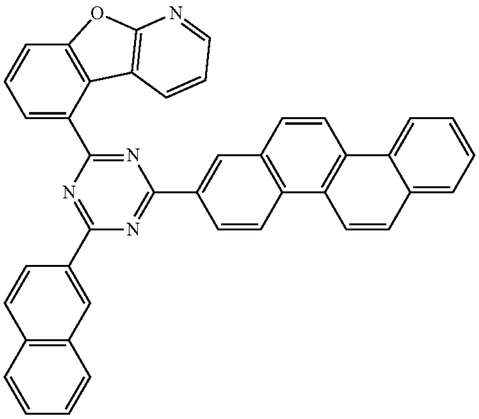
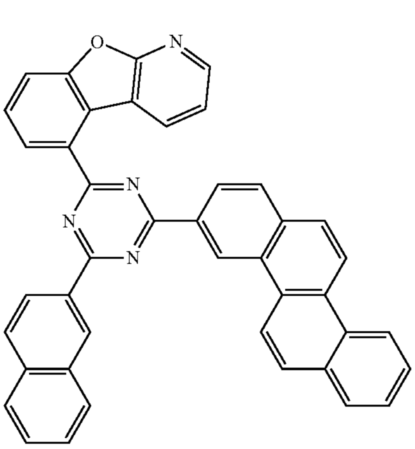
-continued
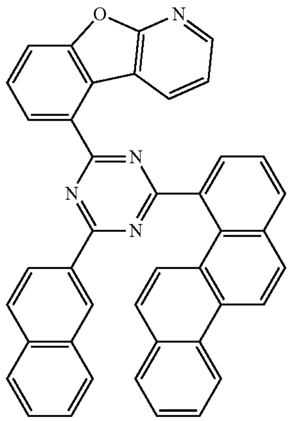
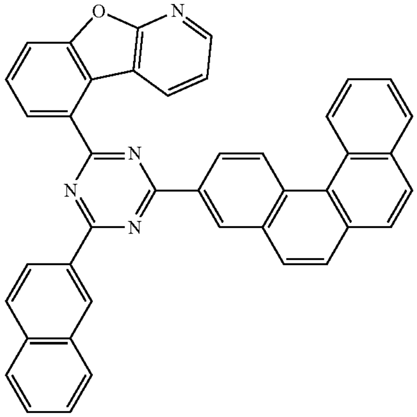
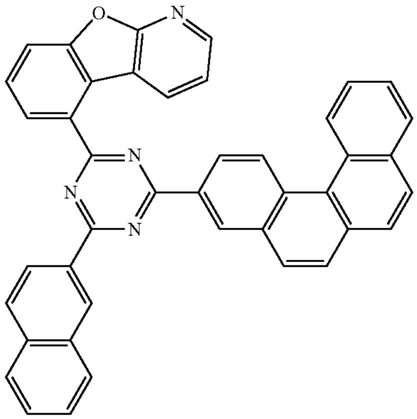
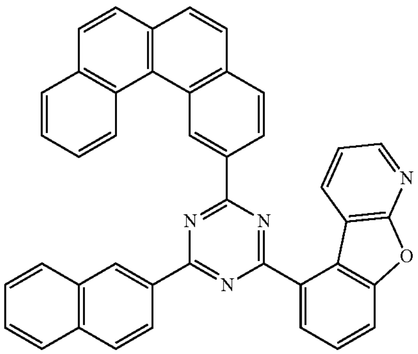

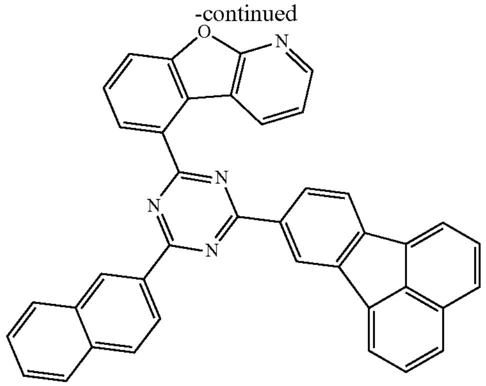
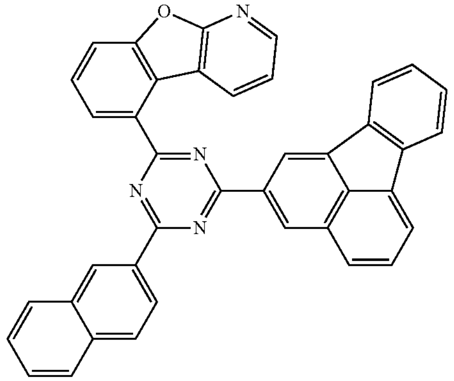
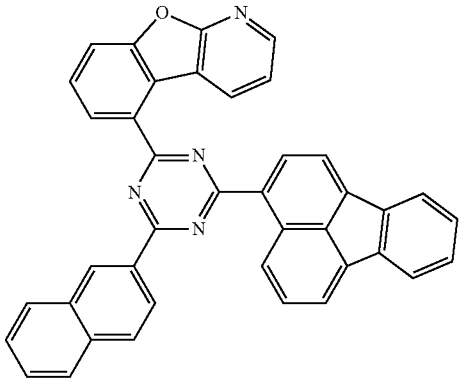
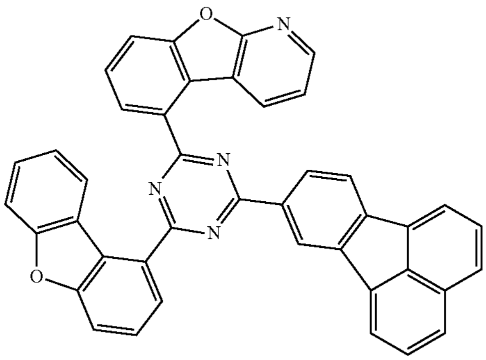
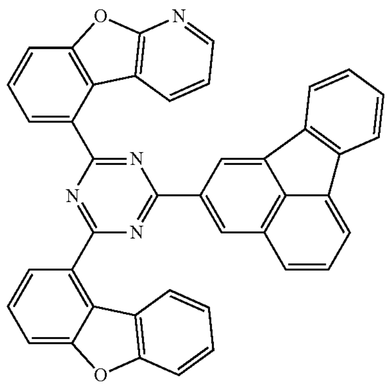
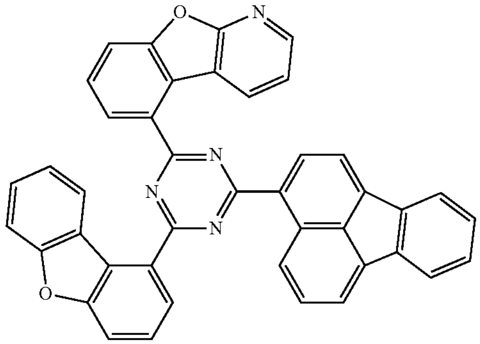
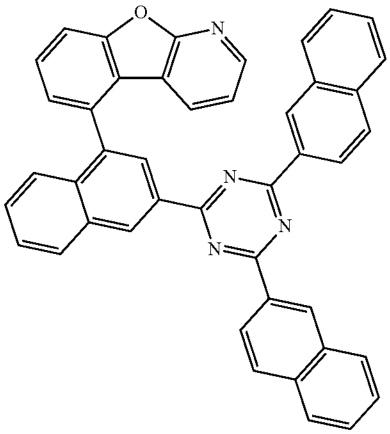
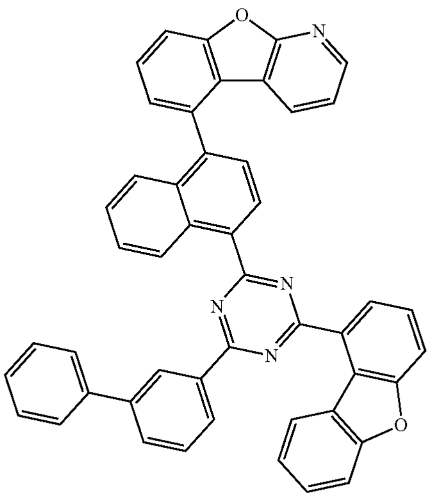

-continued
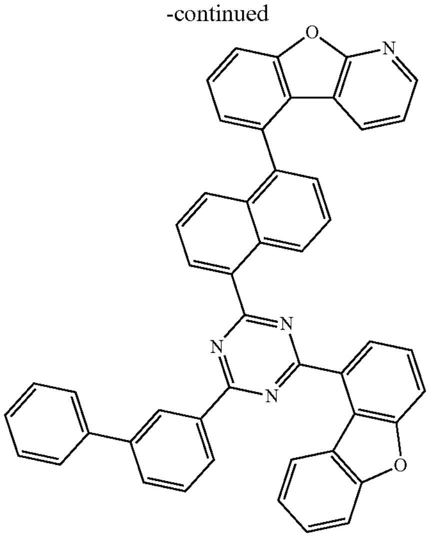
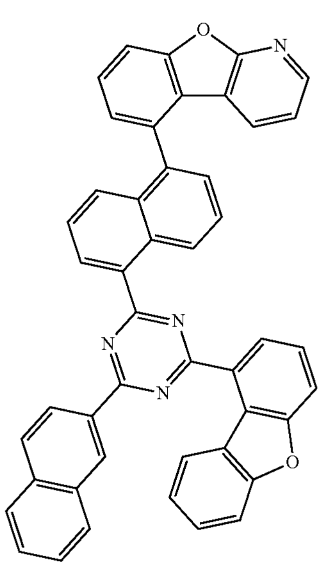
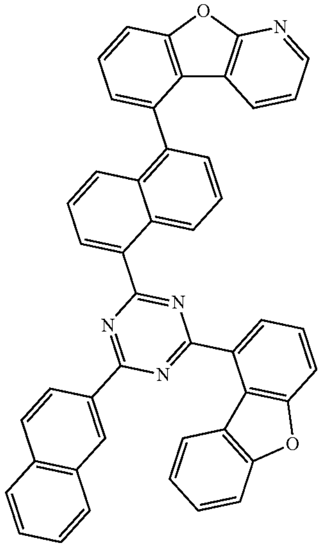
-continued
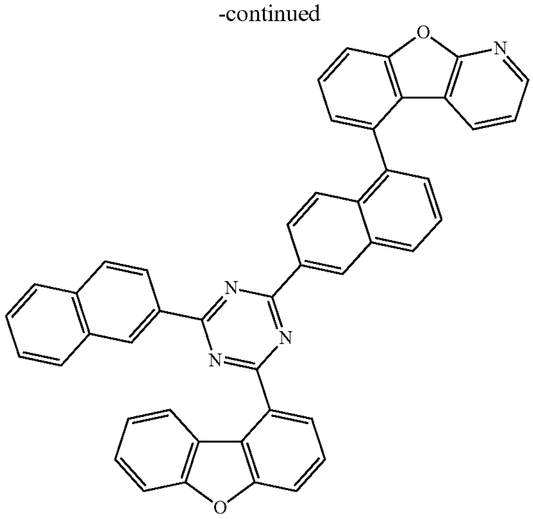
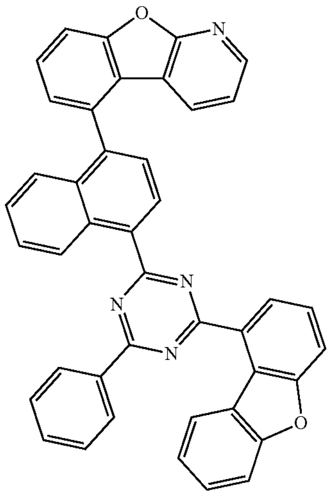
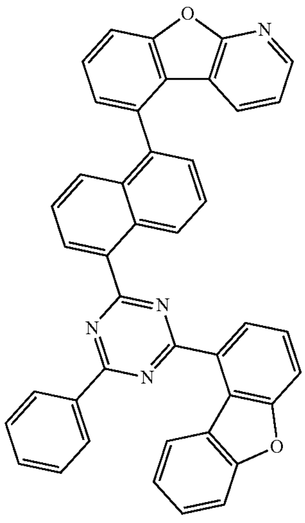

-continued
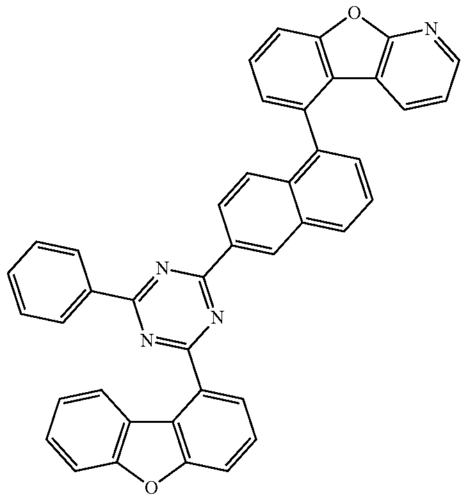
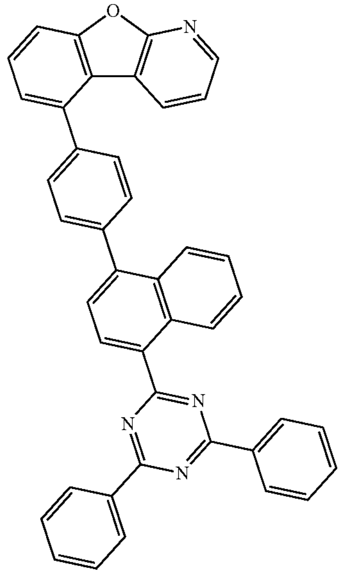
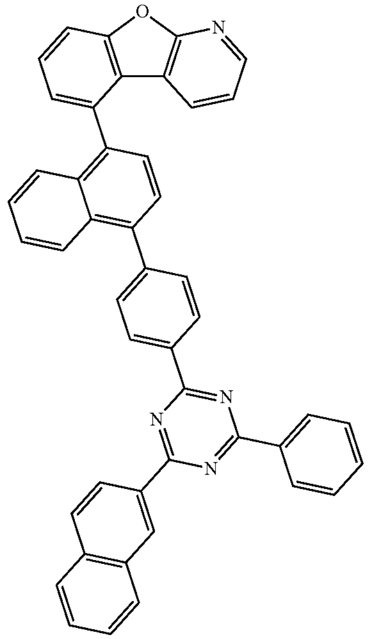
-continued
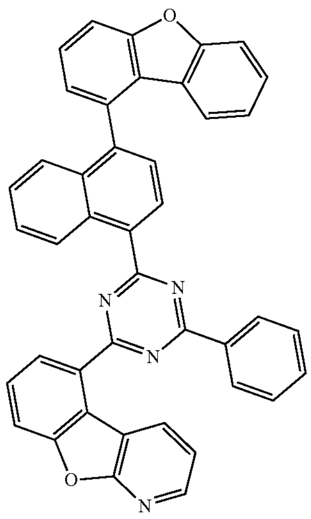
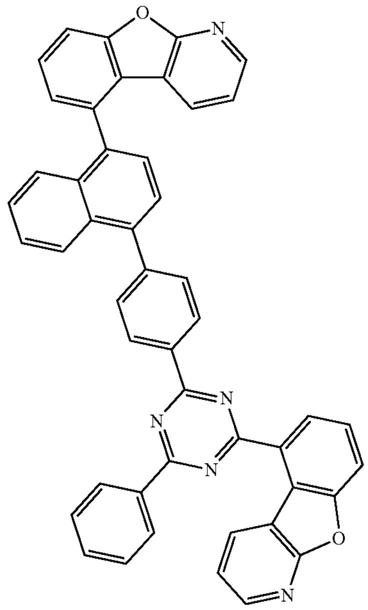
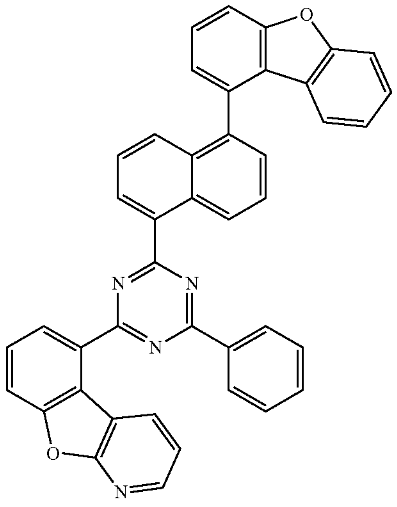

-continued
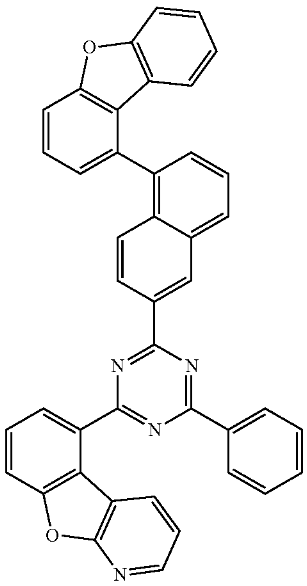
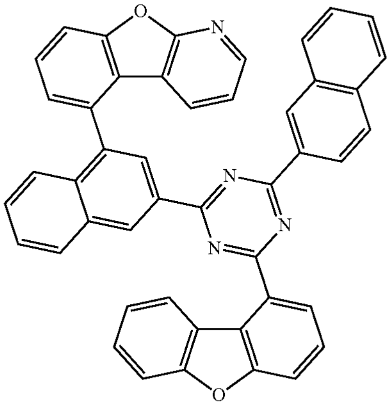
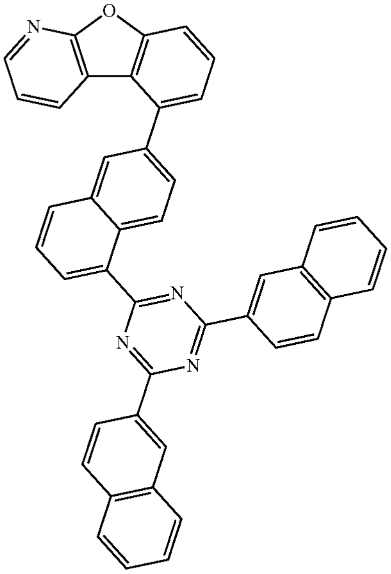
-continued
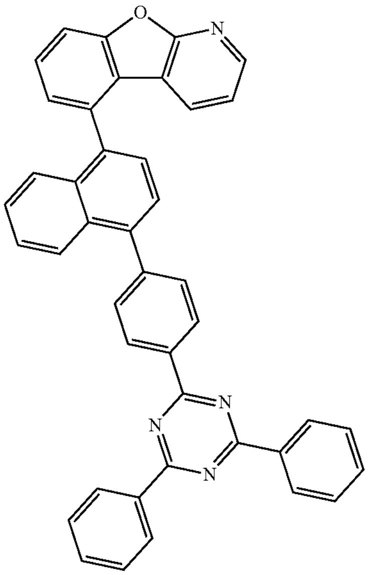
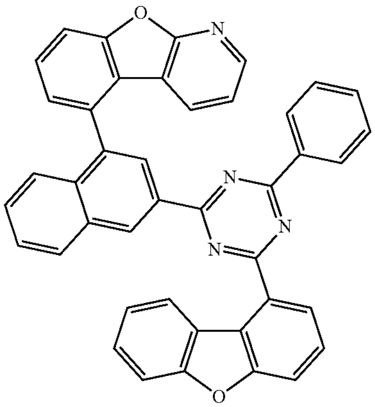
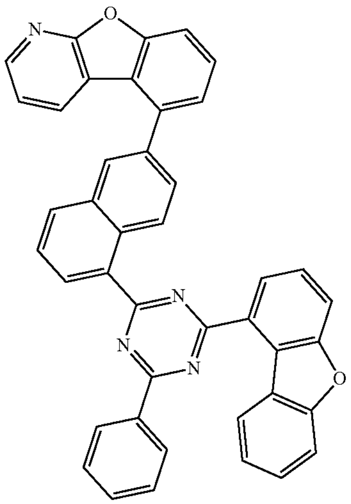

-continued
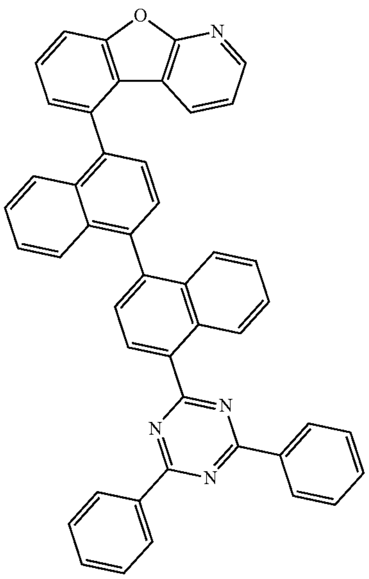
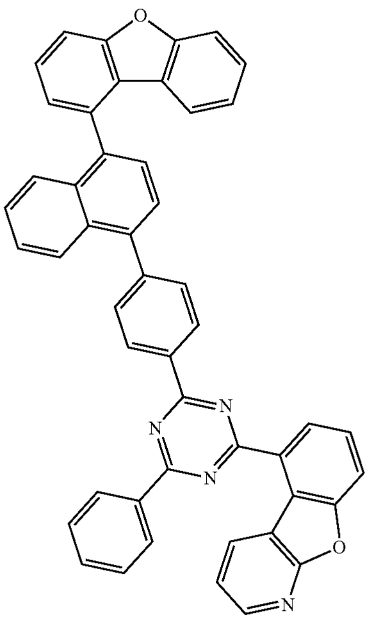
-continued
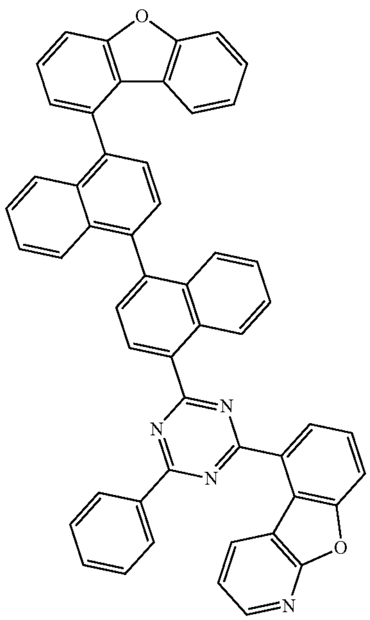
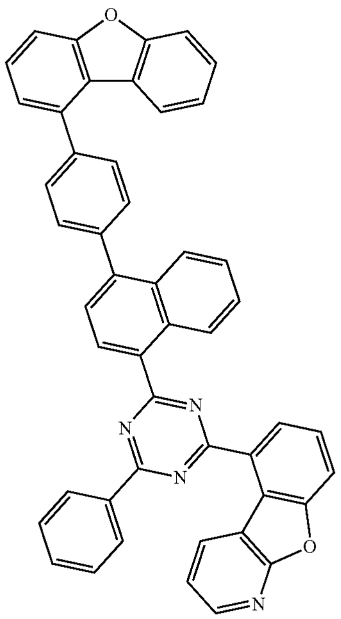
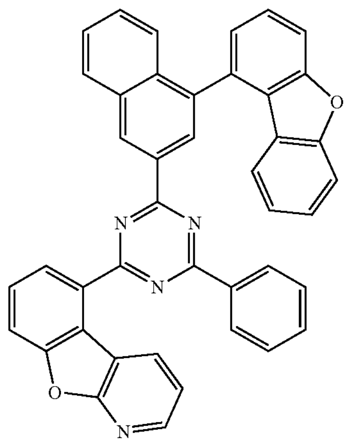

-continued
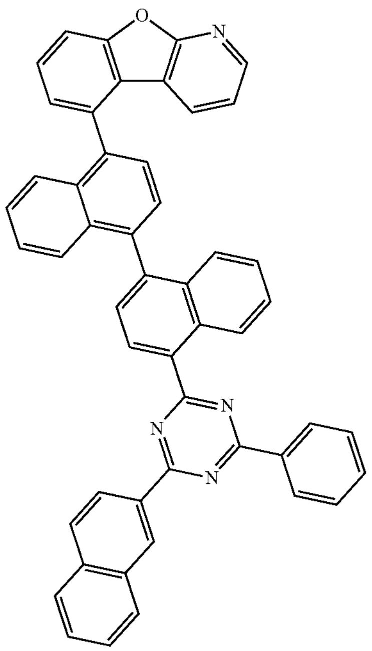
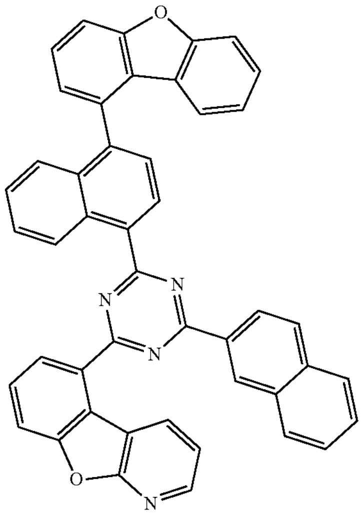
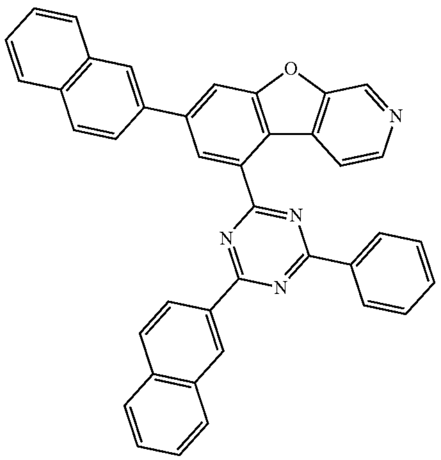
-continued
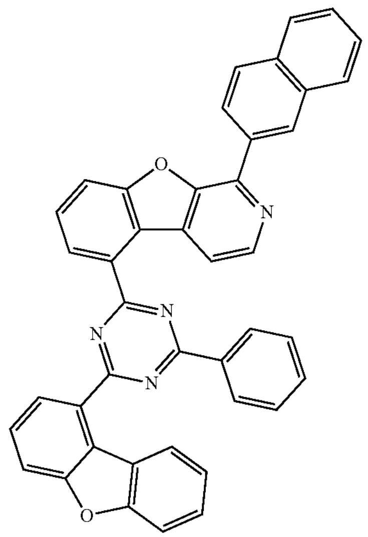
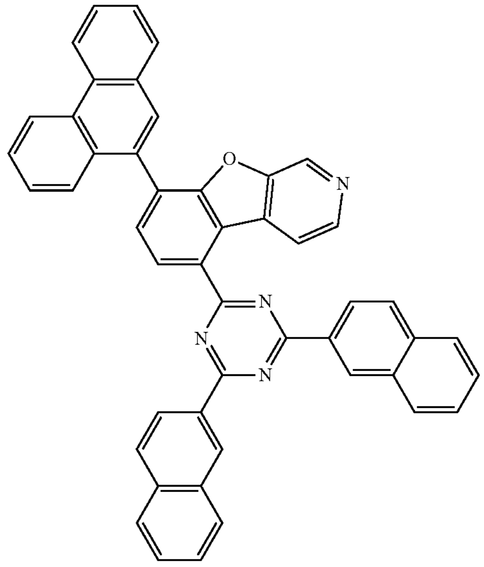
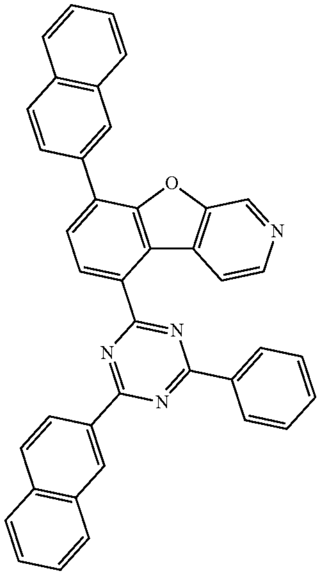

-continued
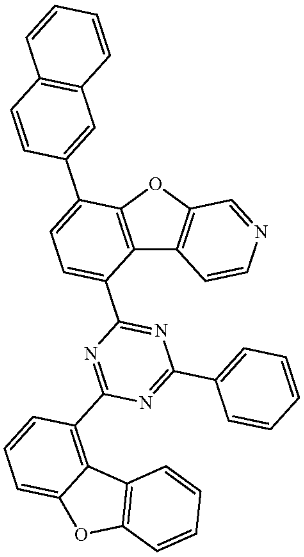
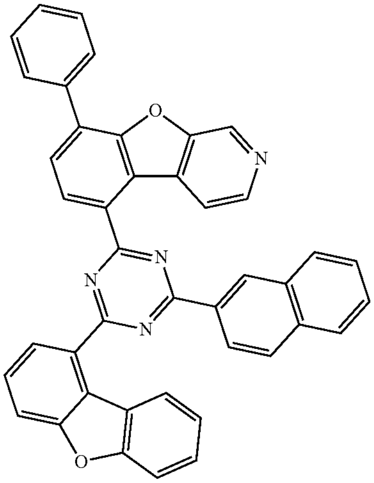
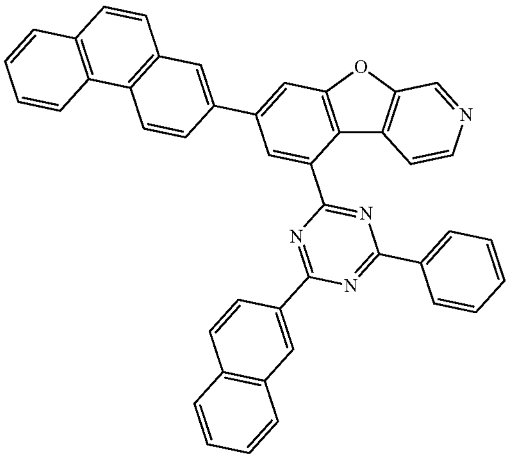
-continued
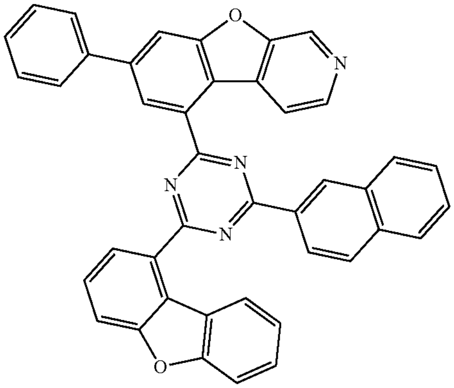
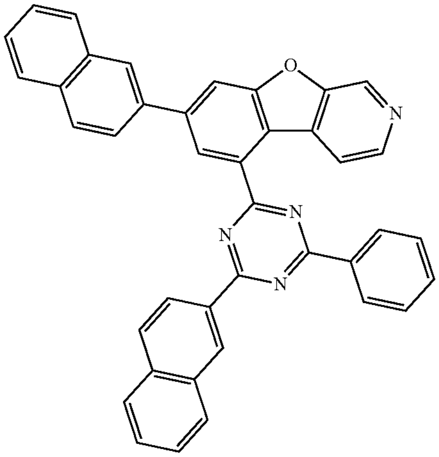
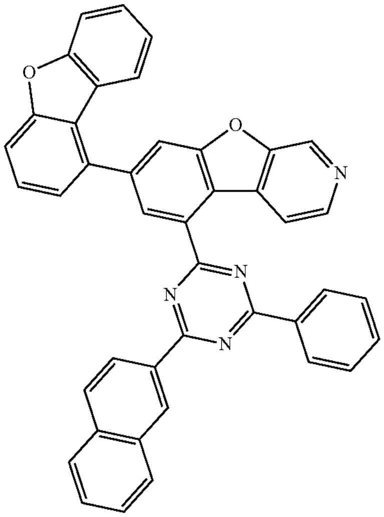

-continued
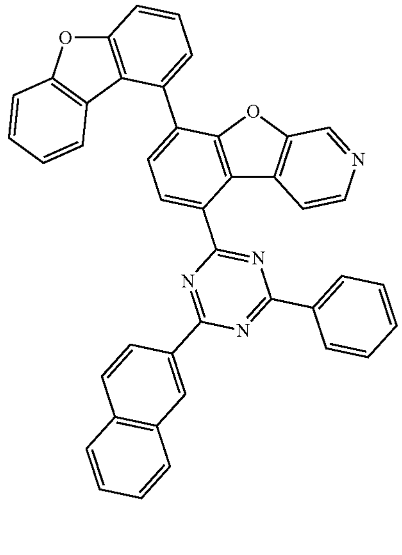
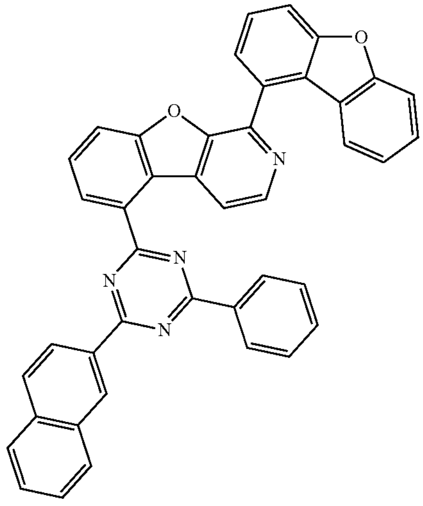
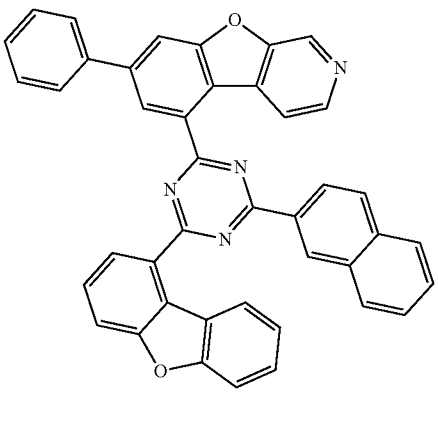
-continued
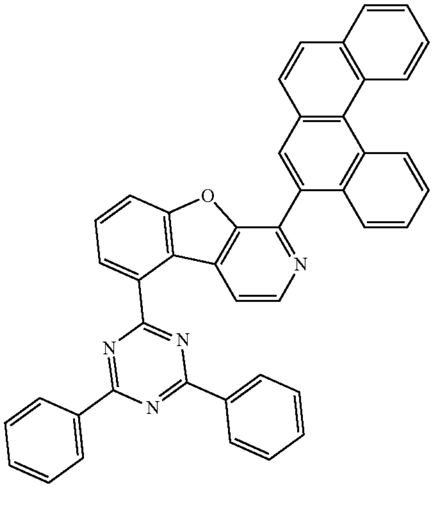
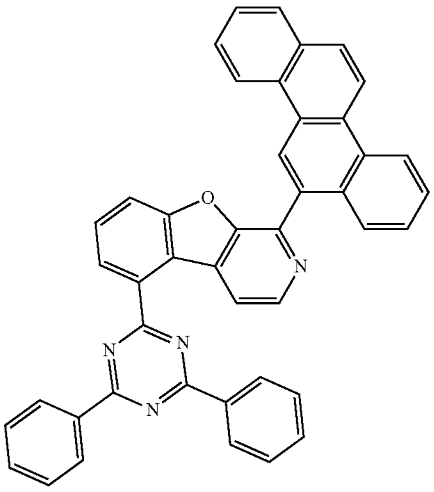
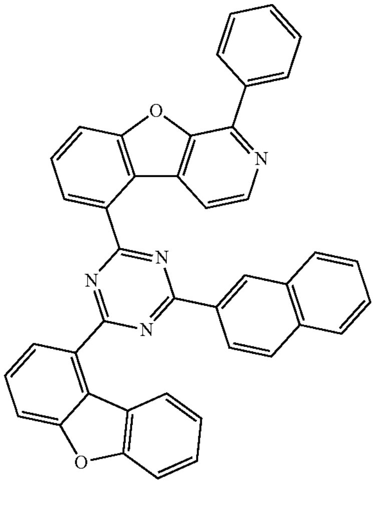

-continued
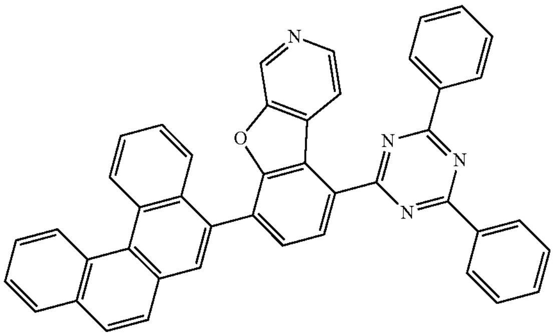
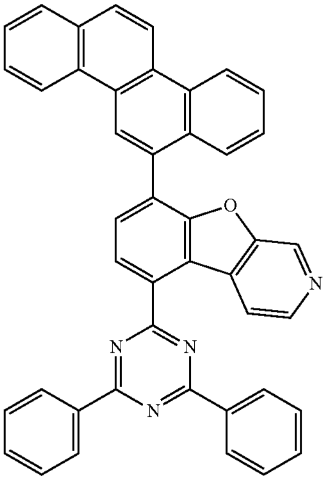
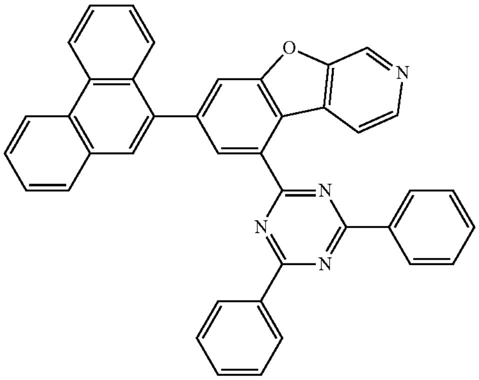
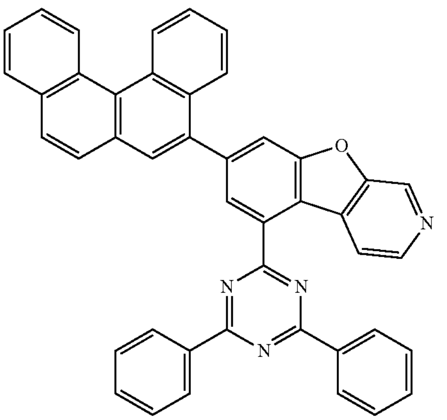
-continued
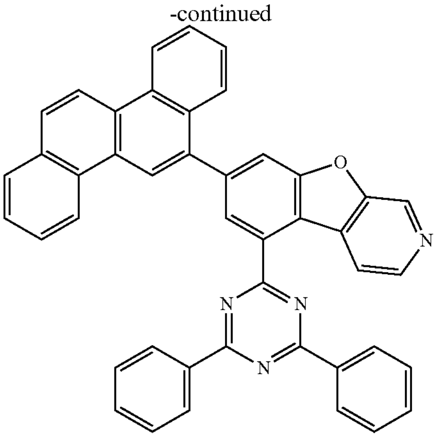
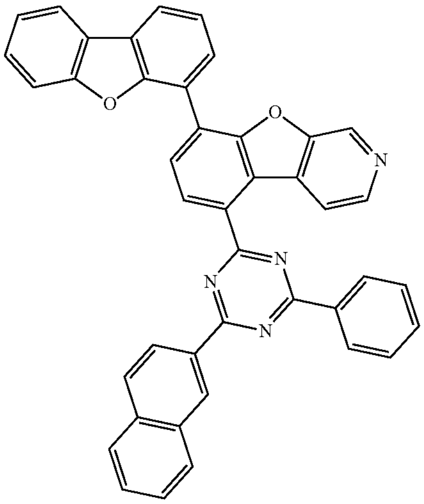
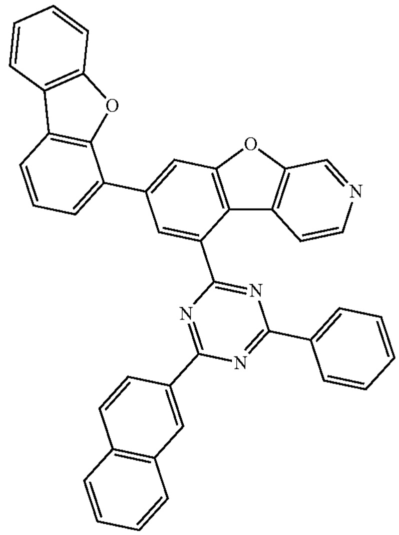

-continued
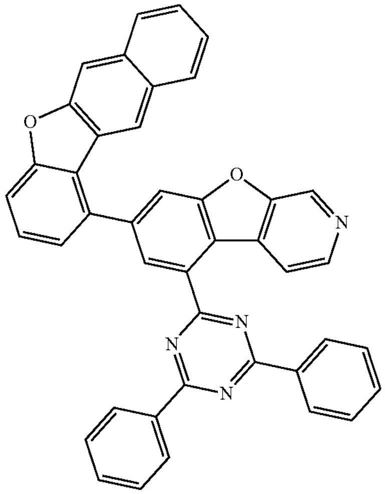
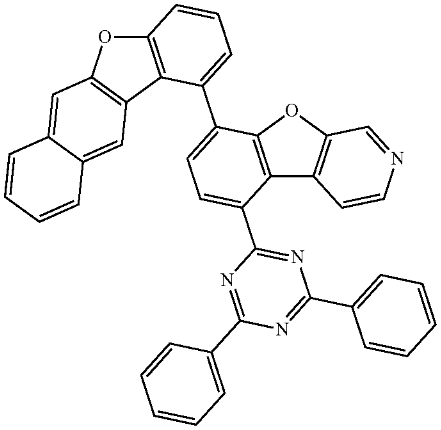
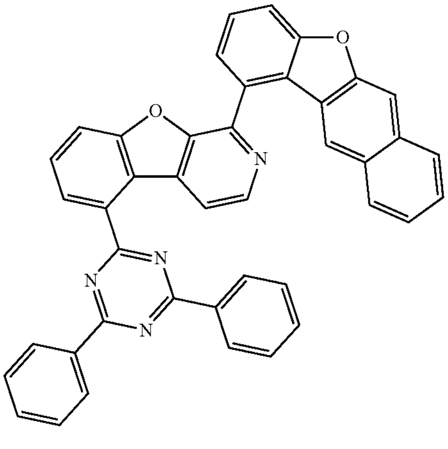
-continued
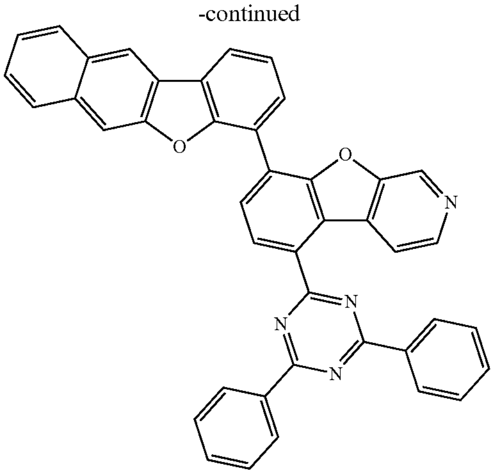
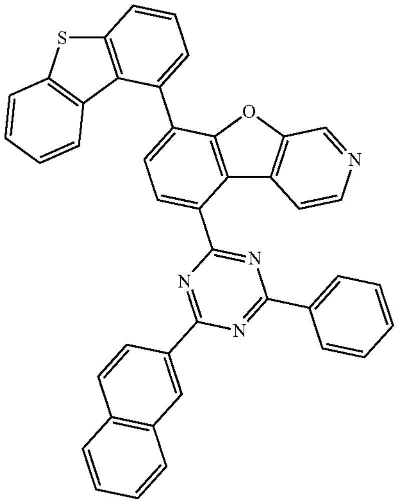
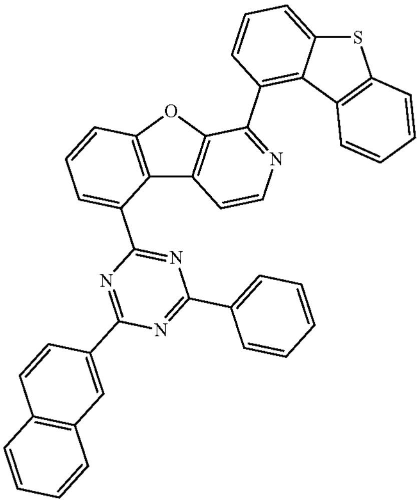

-continued
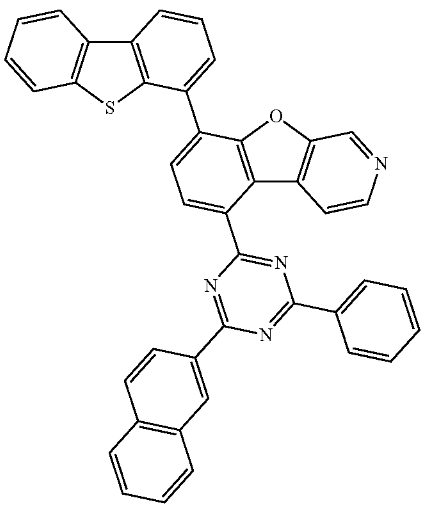
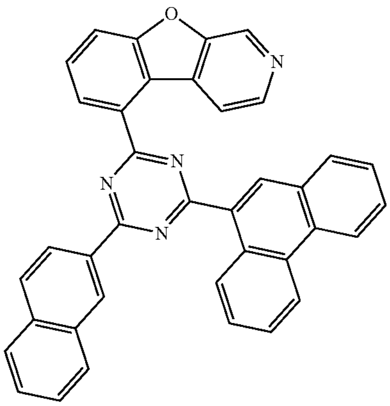
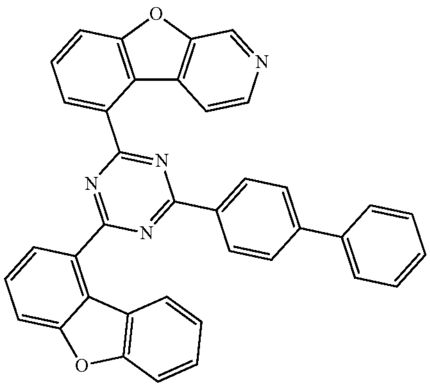
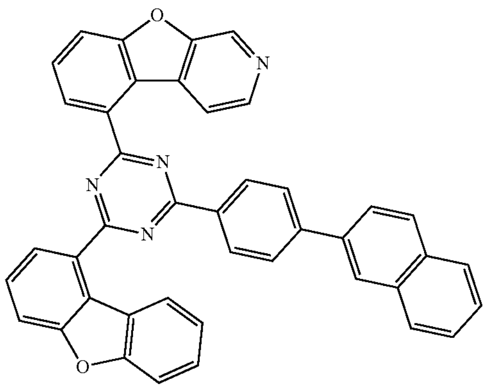
-continued
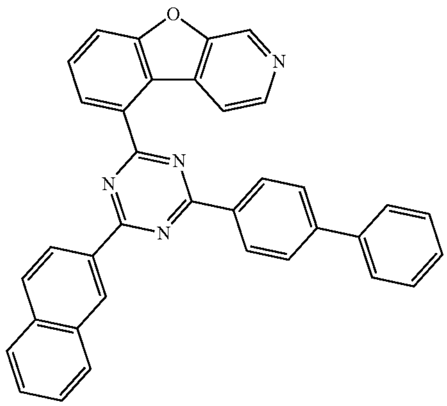
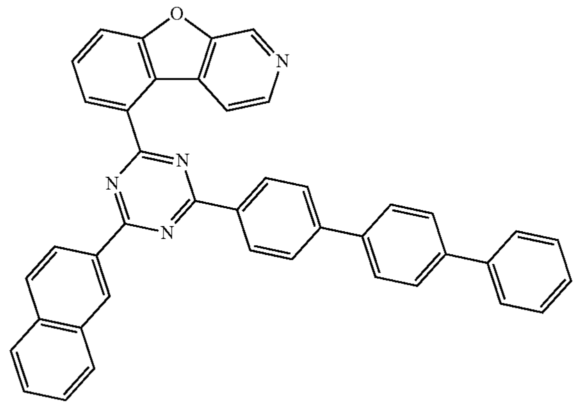
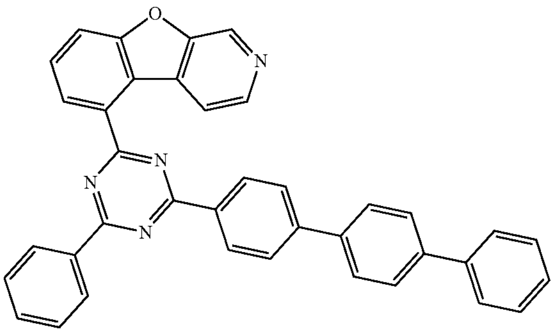 [SMILES: c1ccc(-c2ccc(-c3ccc(-c4nc(-c5ccccc5)nc(-c5cccc6oc7cnccc7c56)n4)cc3)cc2)cc1]

-continued
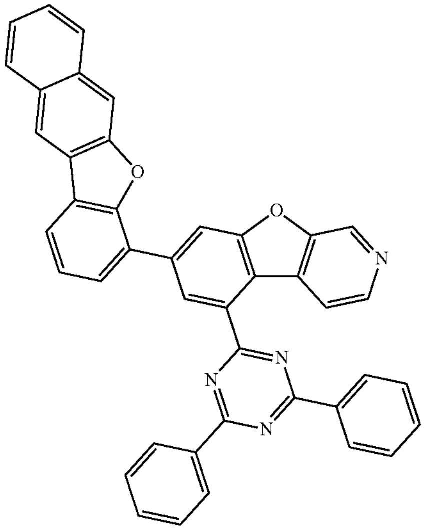
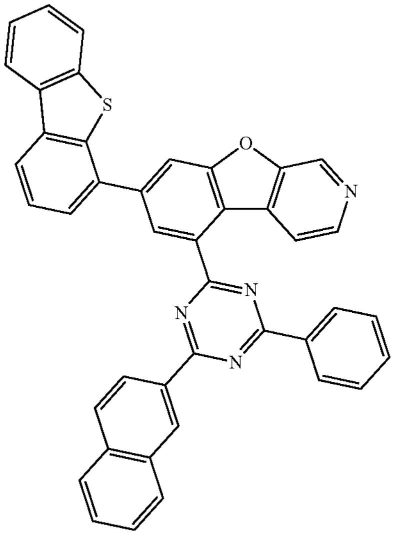
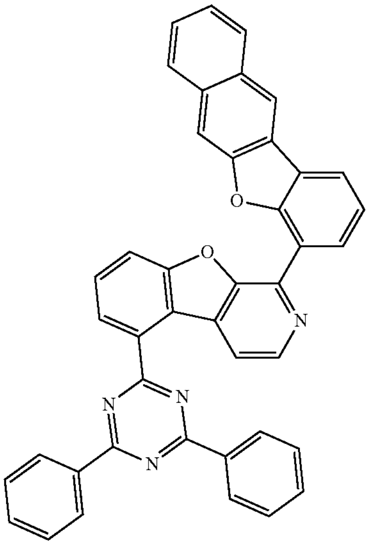
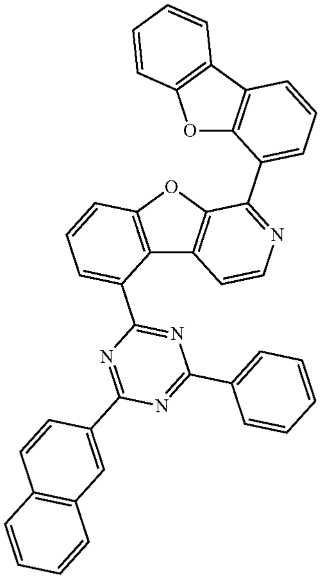
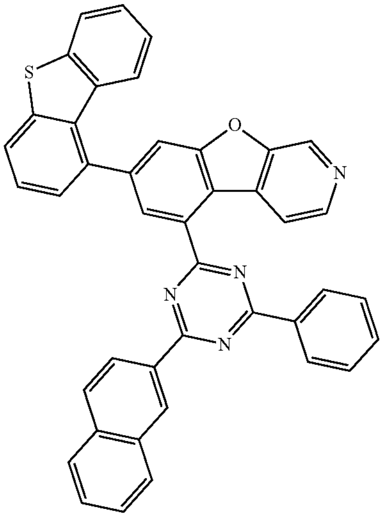
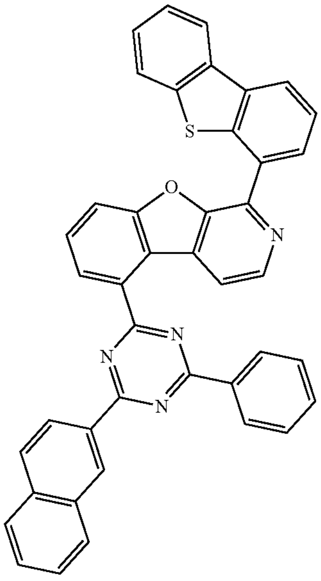

-continued
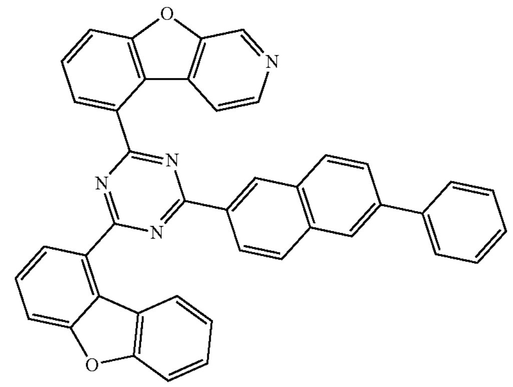
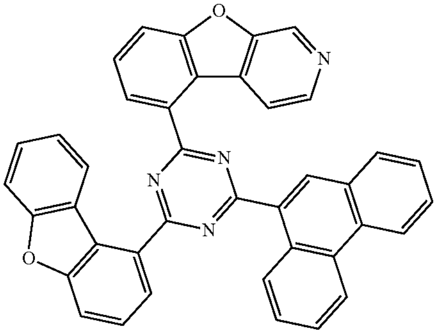
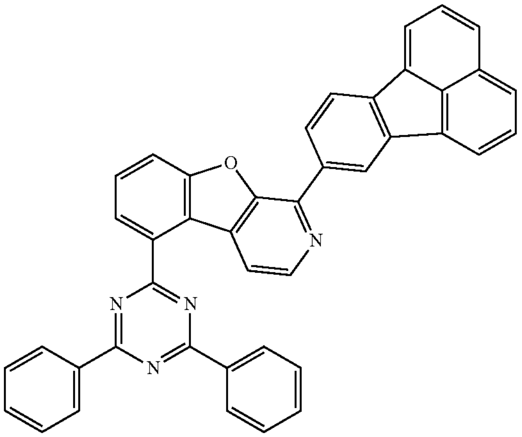
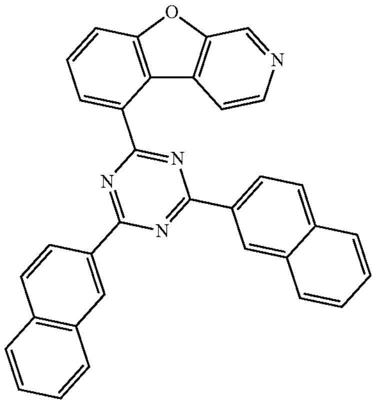
-continued
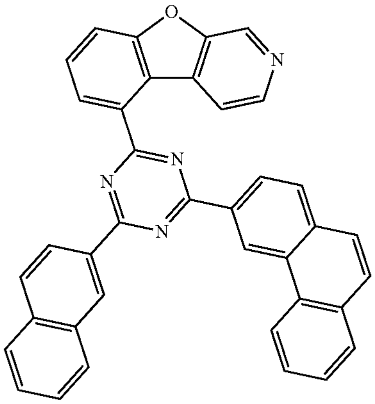
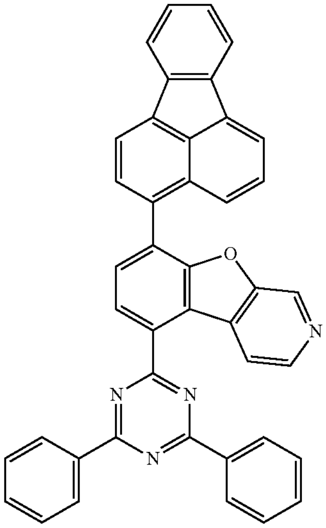
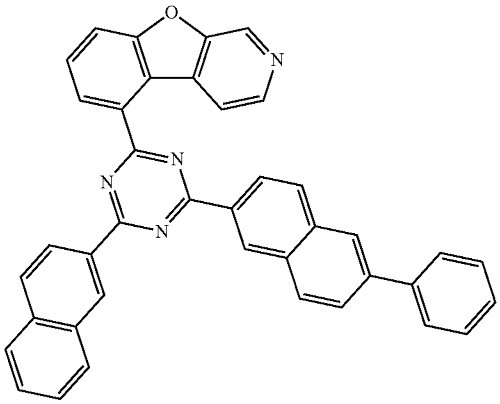

-continued
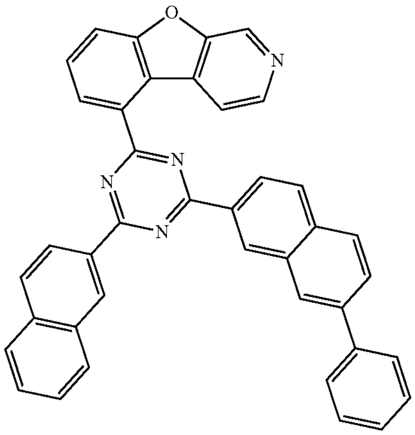
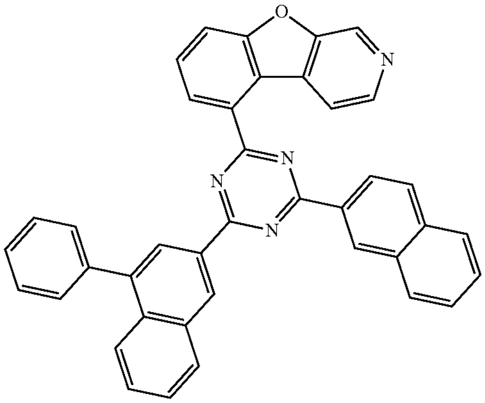
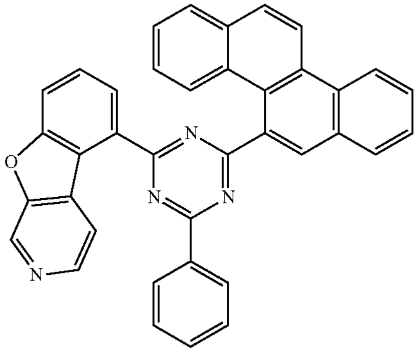
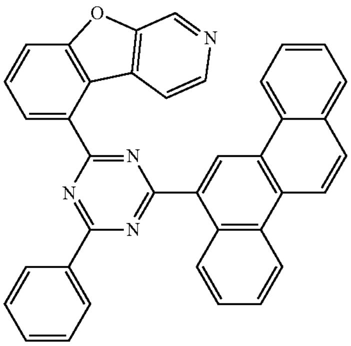
-continued
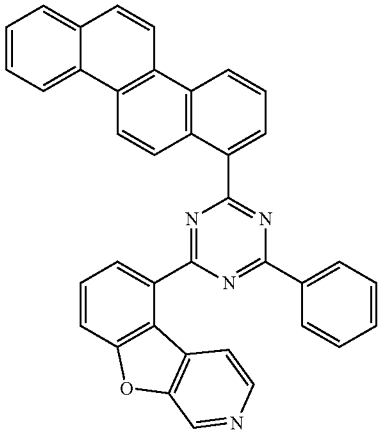
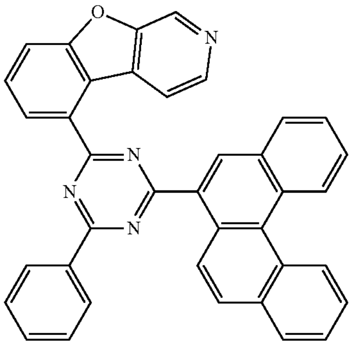
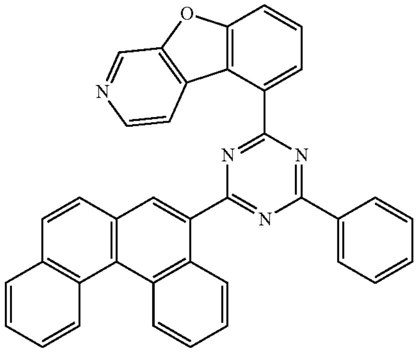
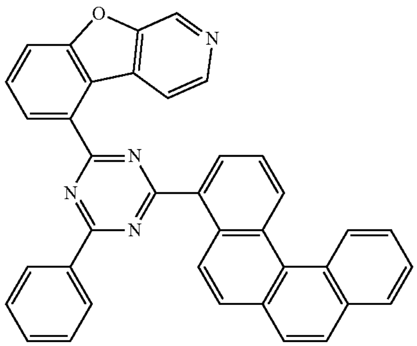

-continued
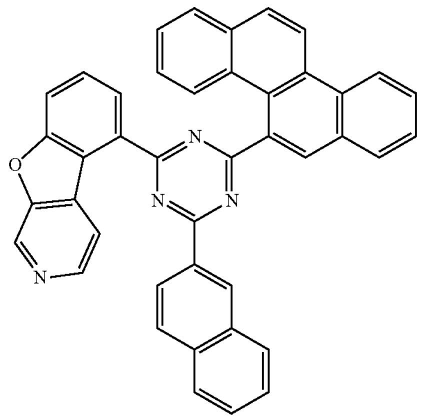
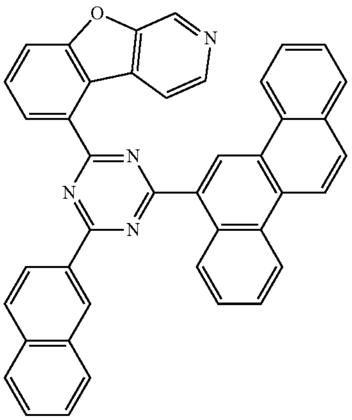
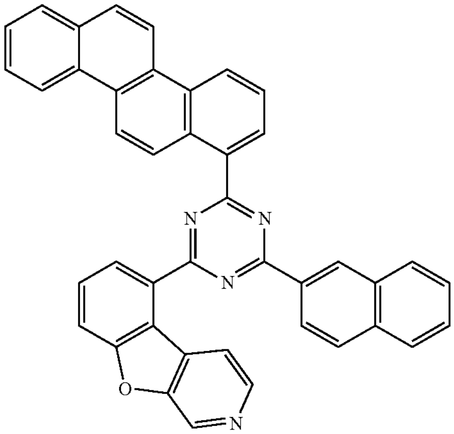
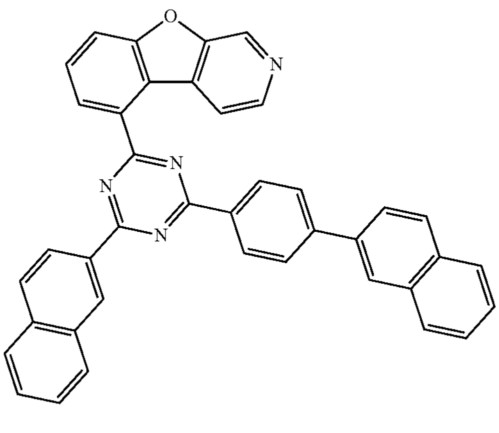
-continued
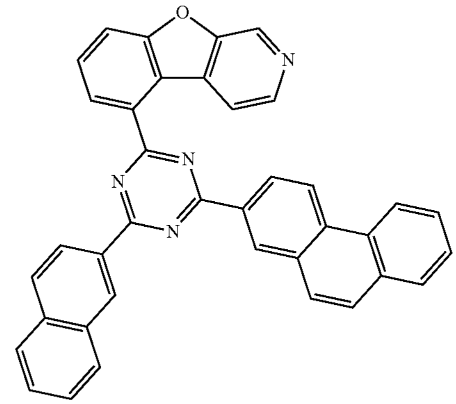
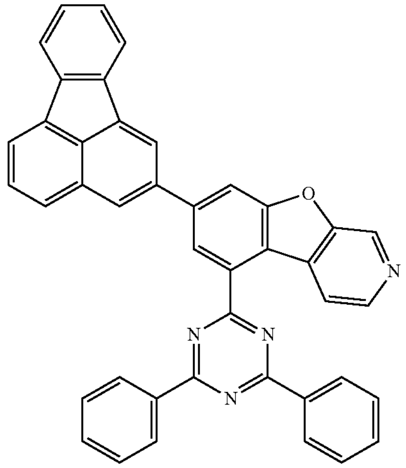
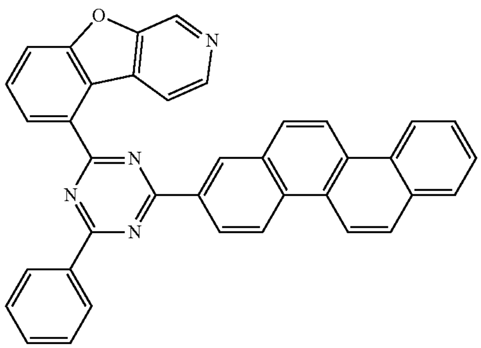
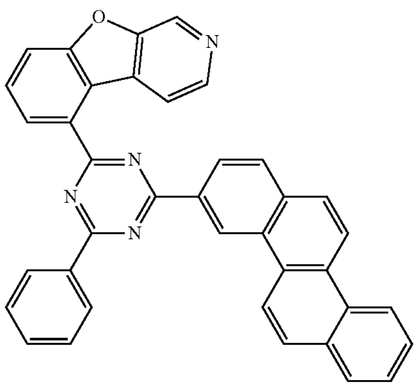

-continued
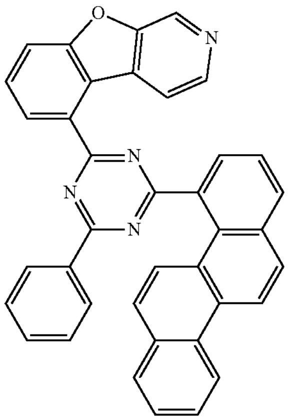
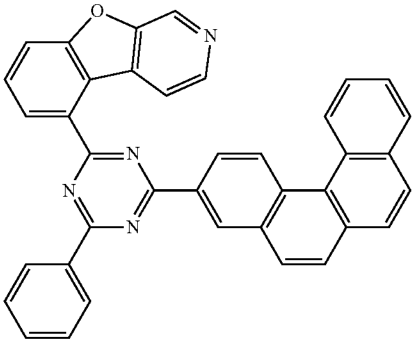
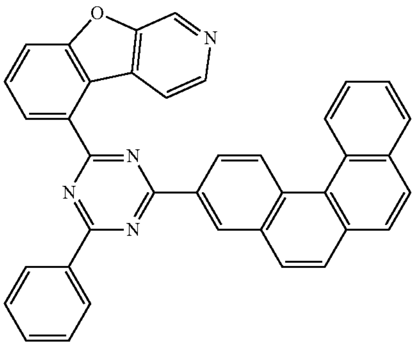
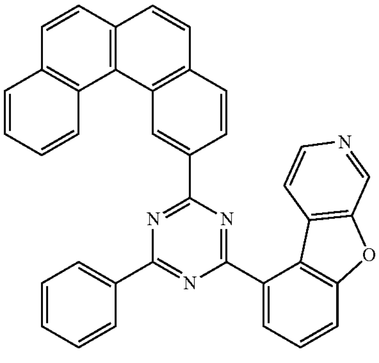
-continued
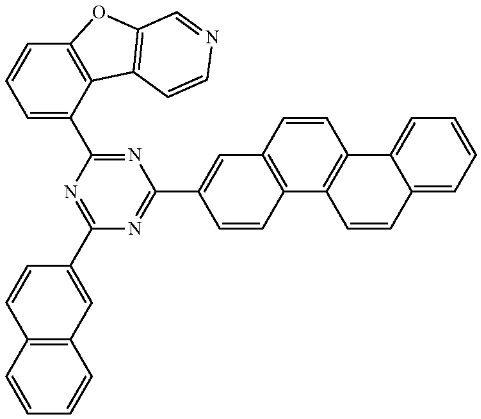
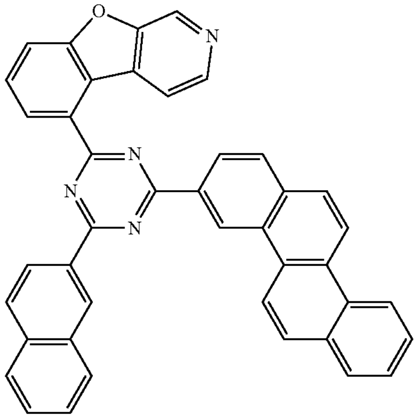
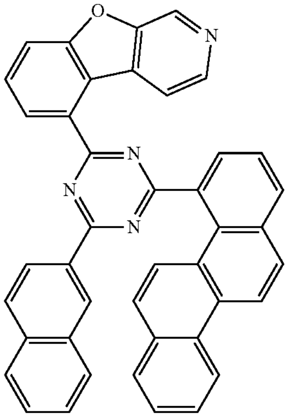
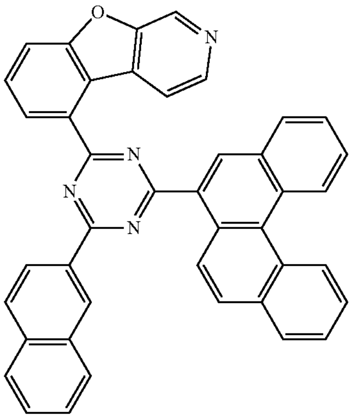

-continued
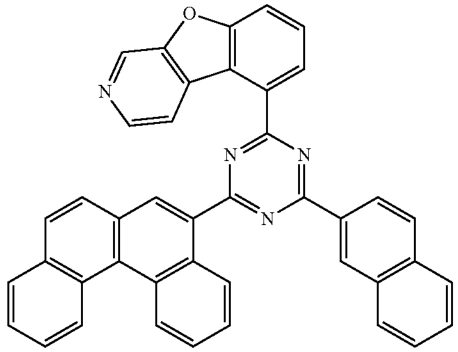
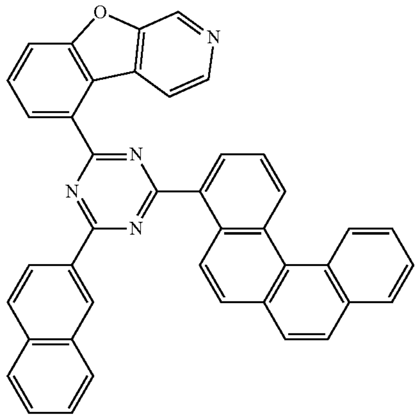
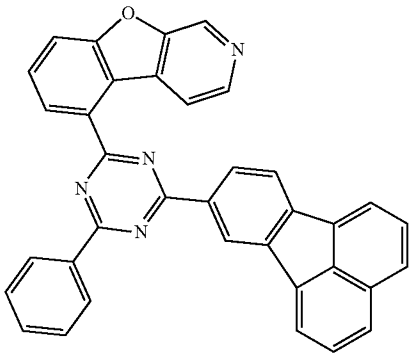
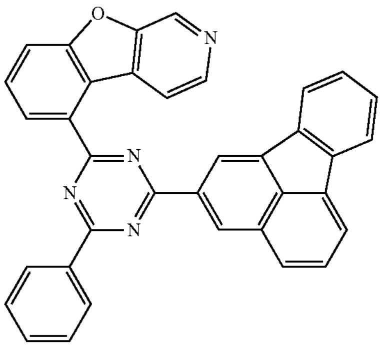
-continued
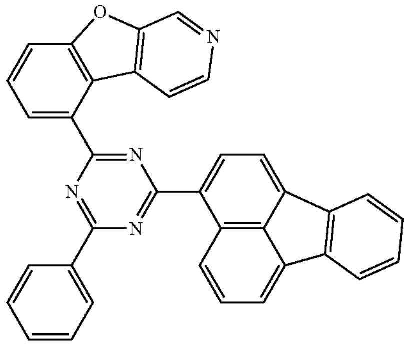
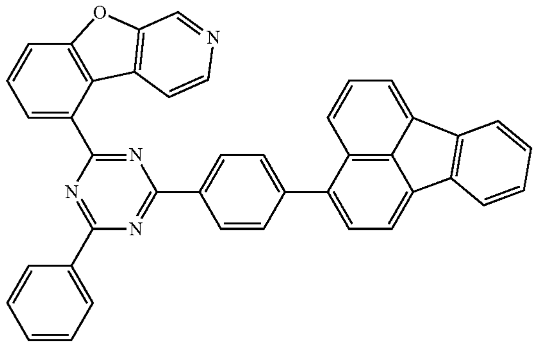
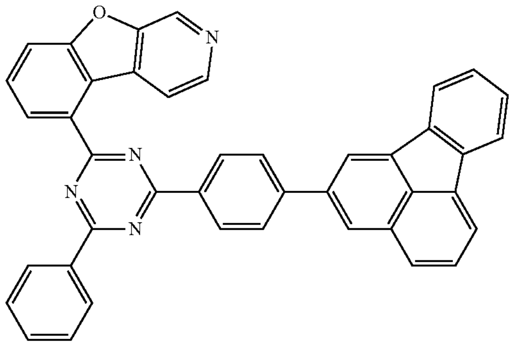
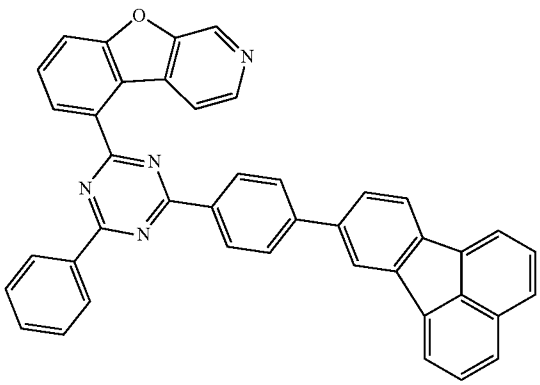

-continued
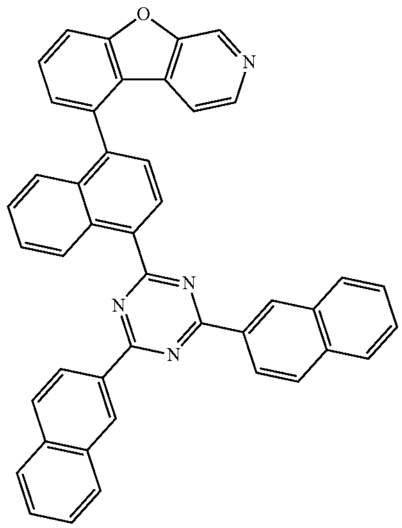
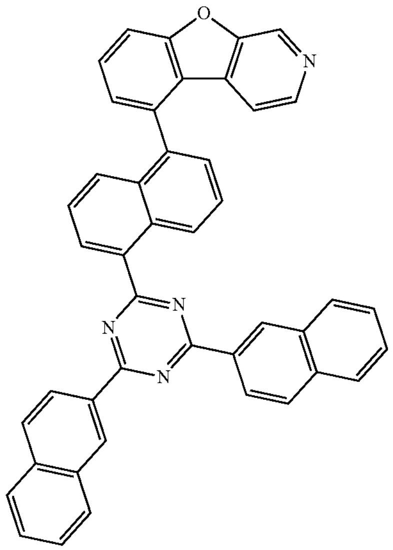
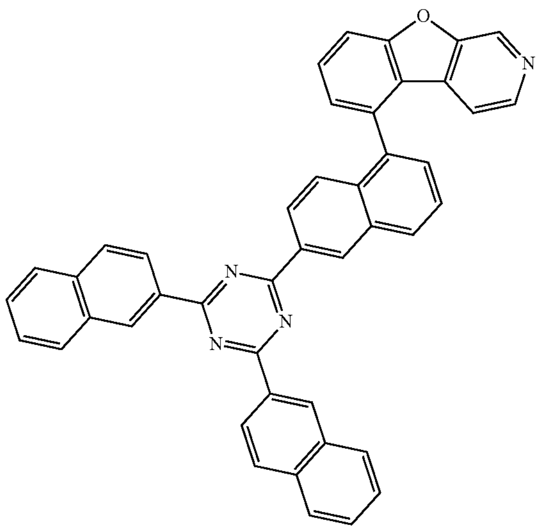
-continued
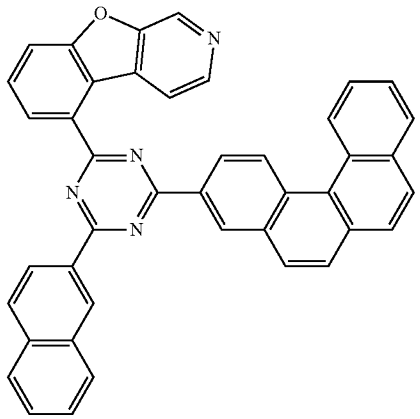
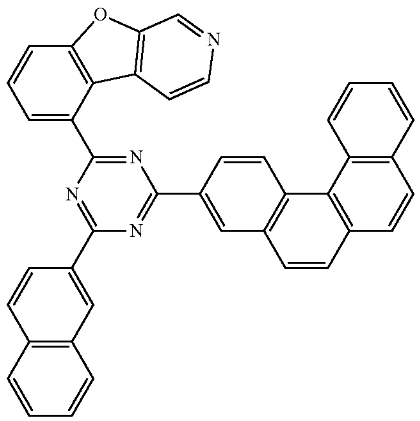
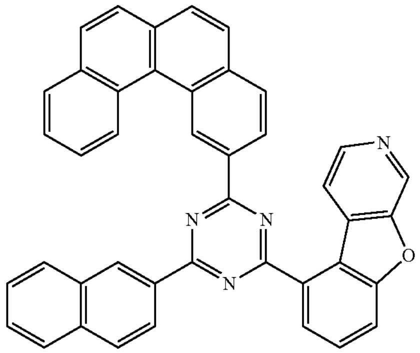
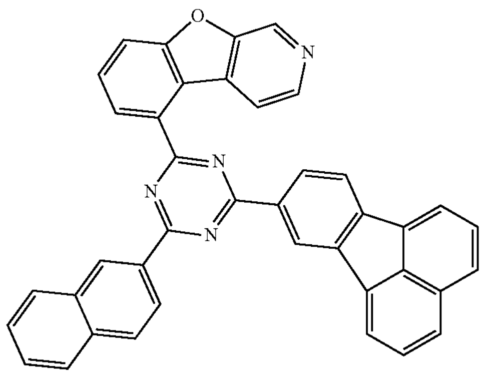

-continued
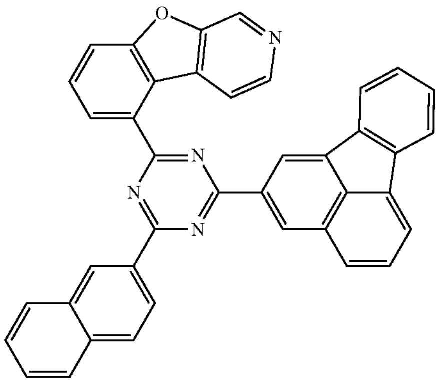
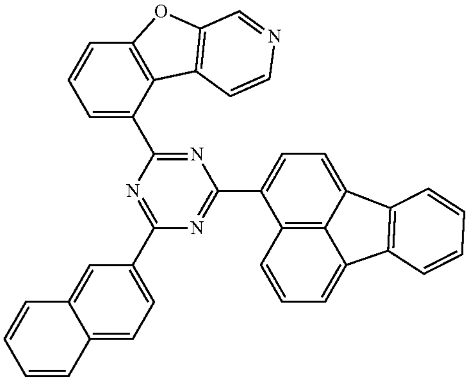
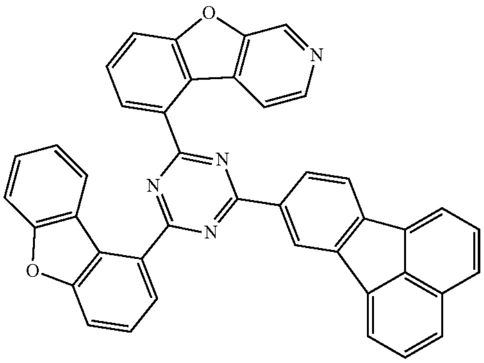
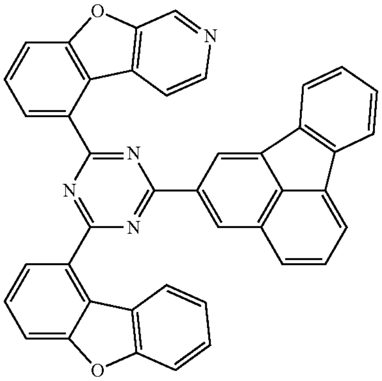
-continued
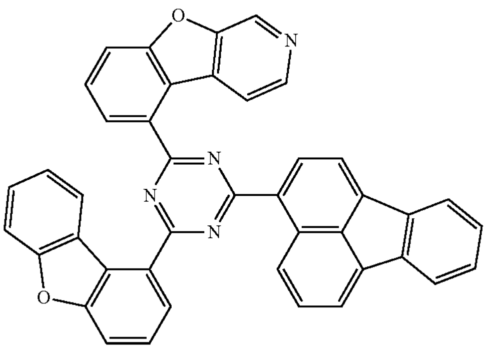
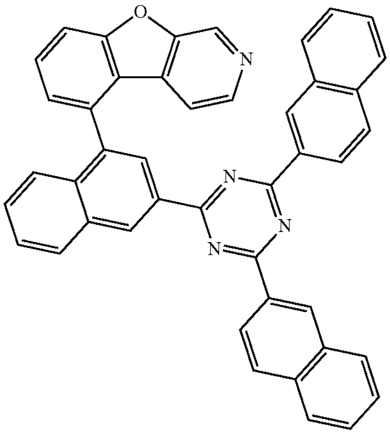
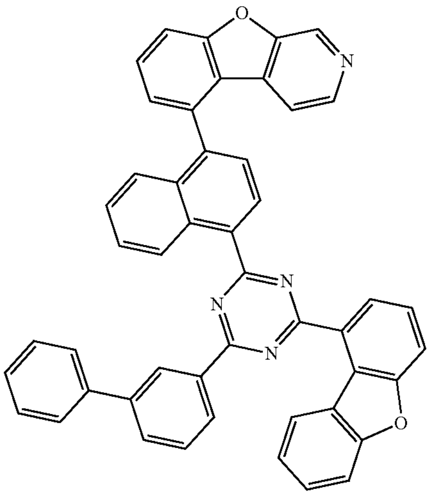

-continued
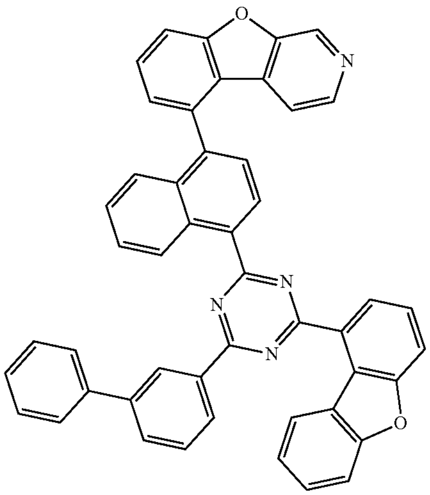
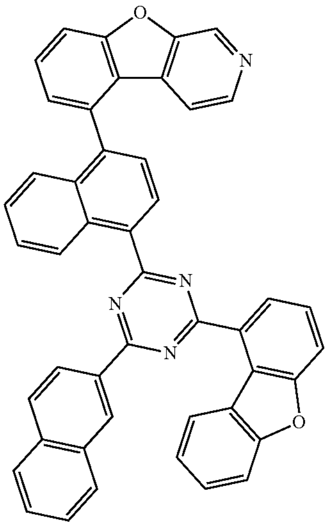
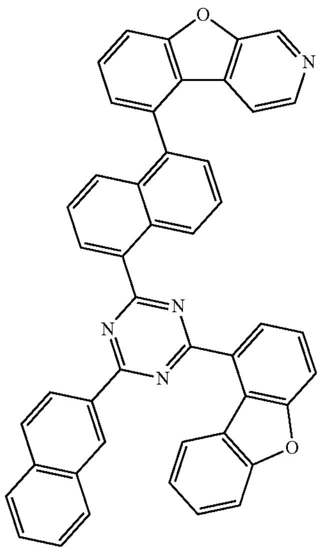
-continued
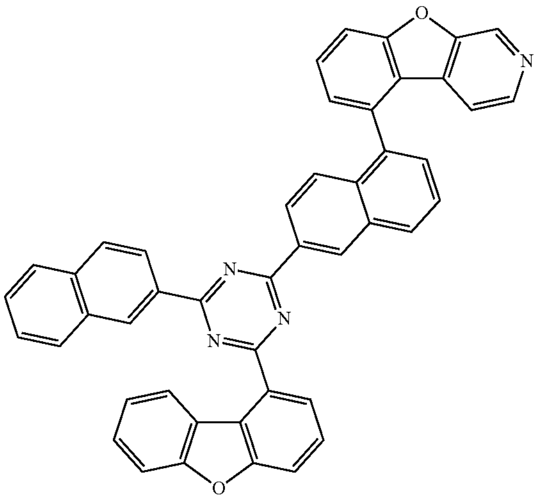
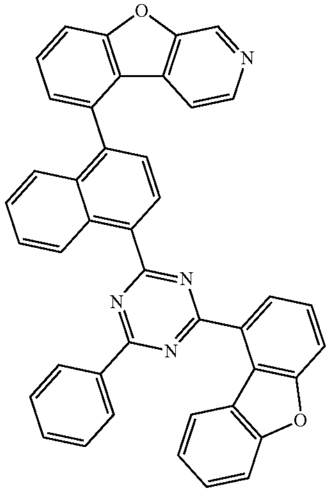
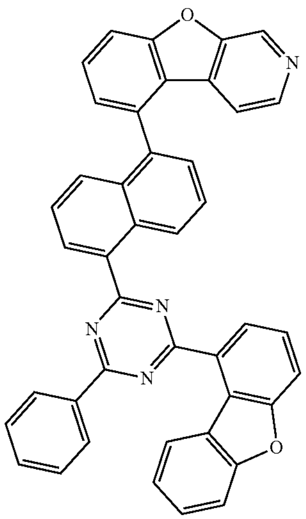

-continued
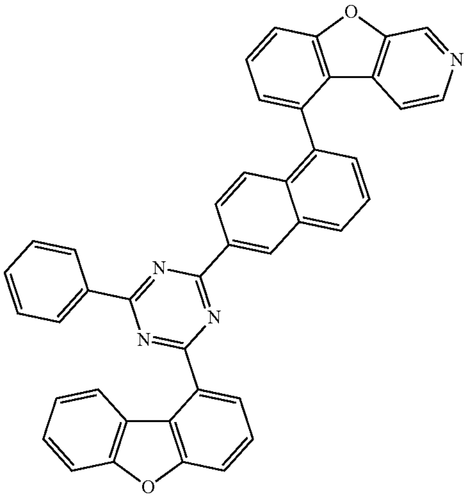
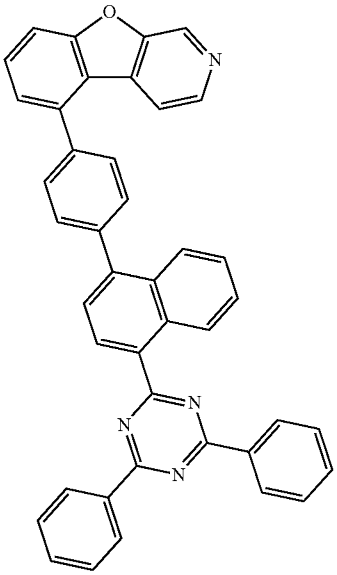
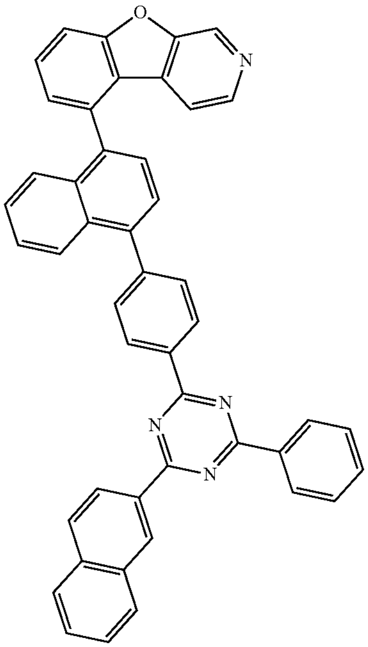
-continued
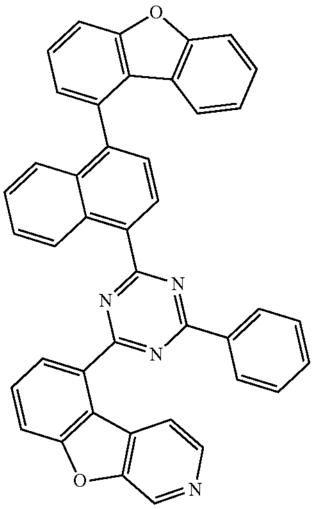
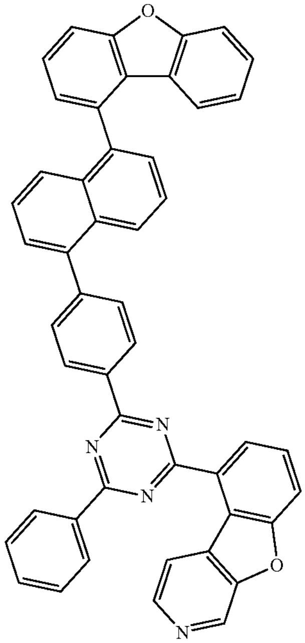
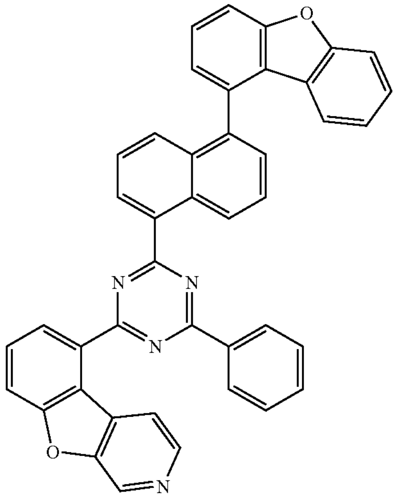

-continued
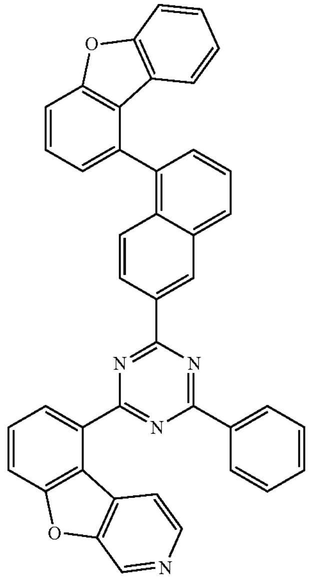
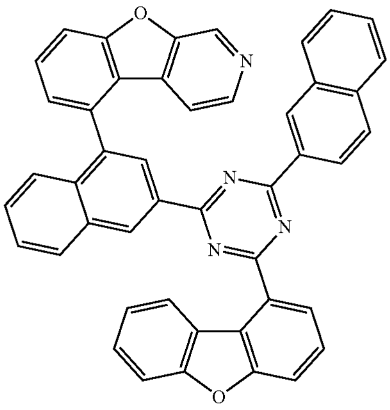
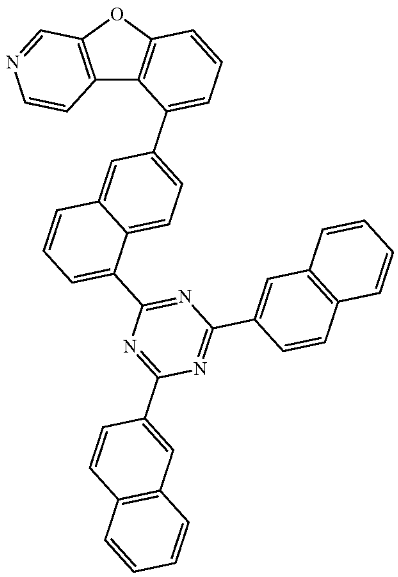
-continued
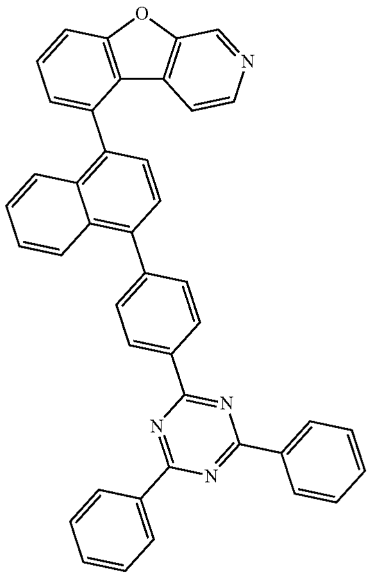
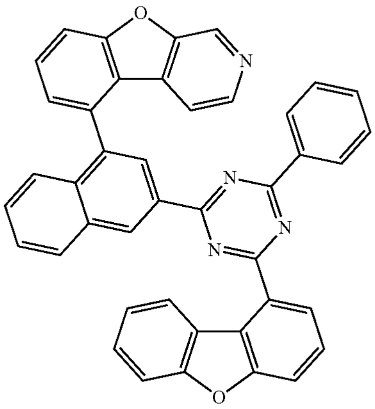
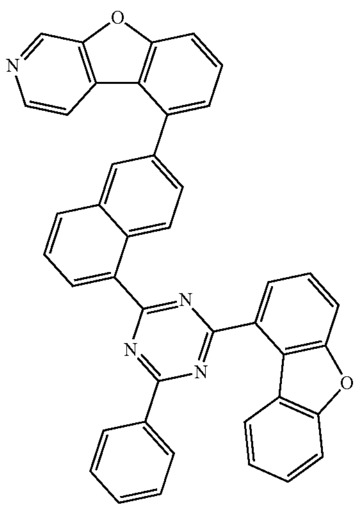

-continued
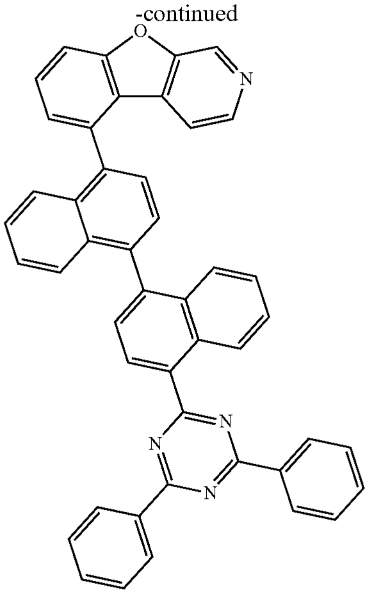
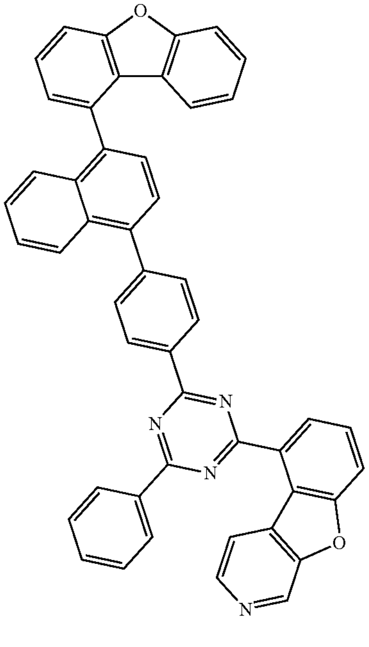
-continued
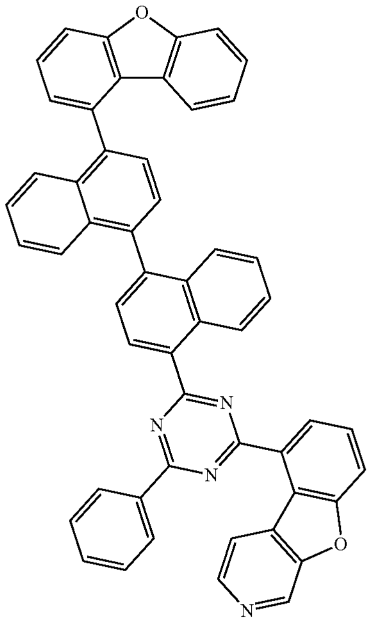
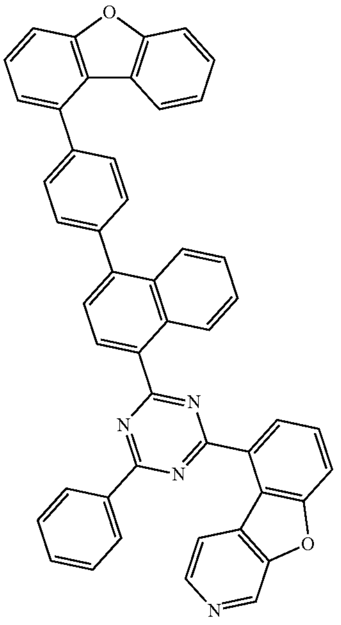
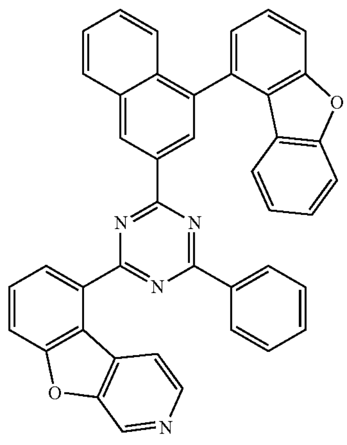

-continued
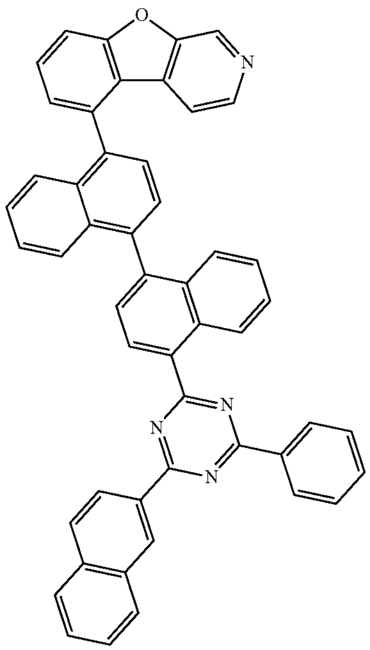
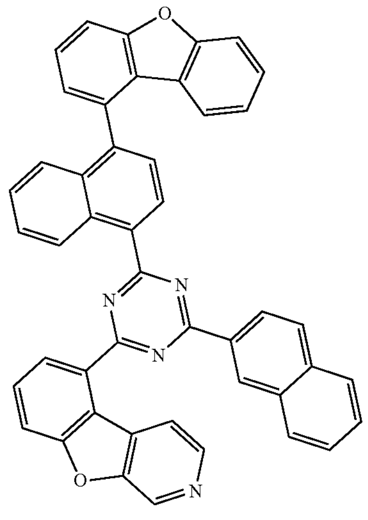
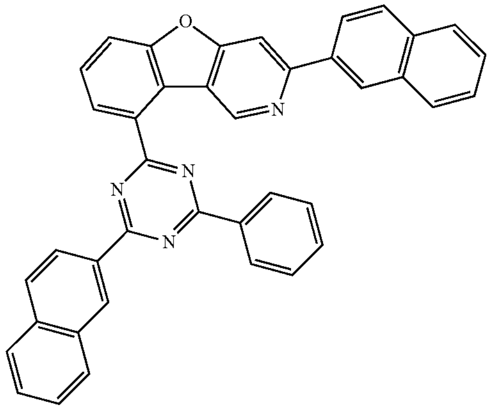
-continued
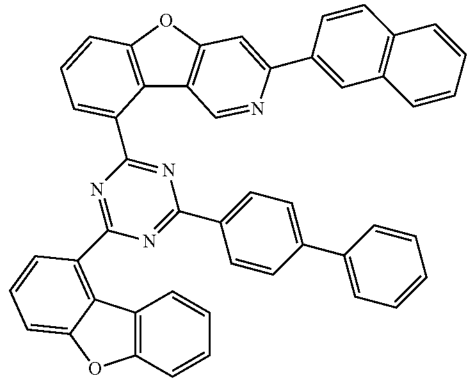
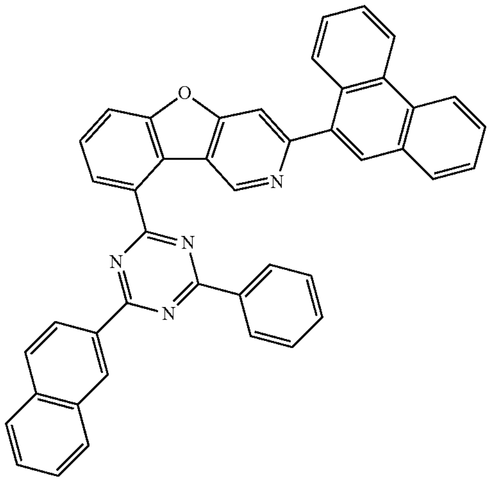
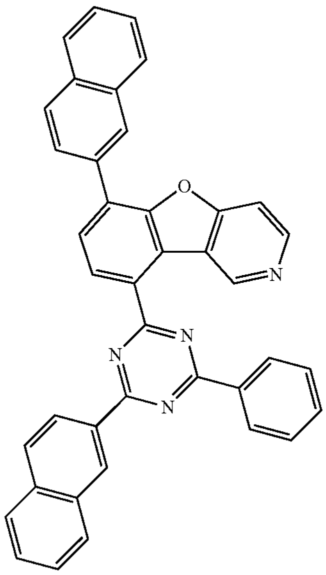

-continued
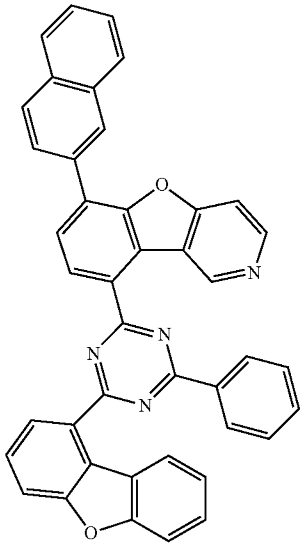
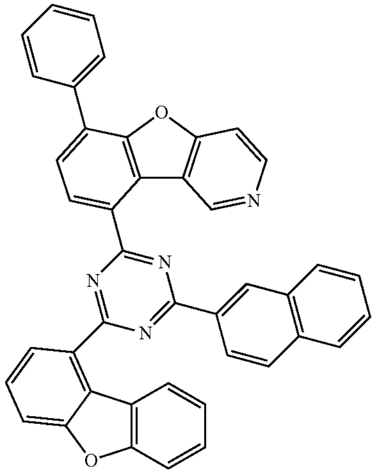
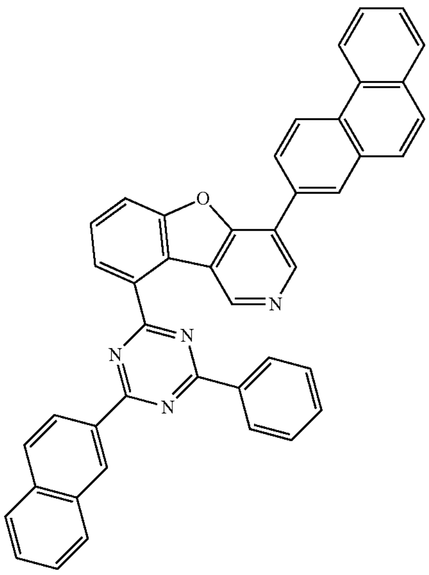
-continued
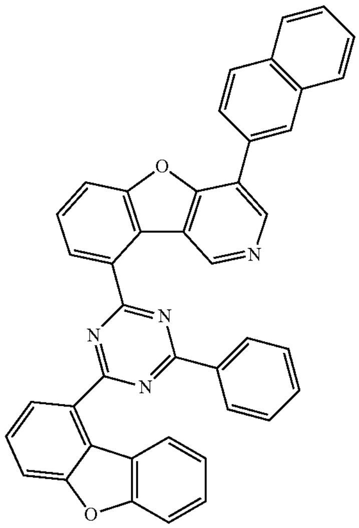
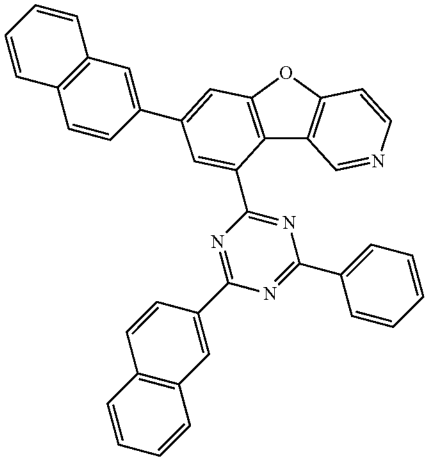
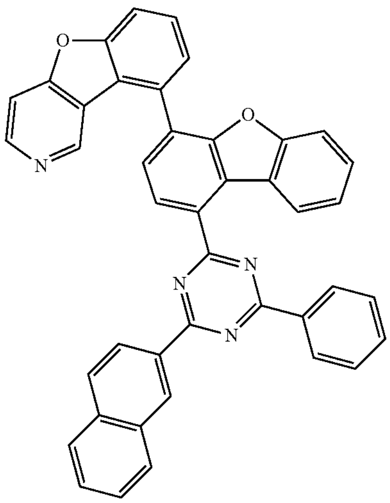

-continued
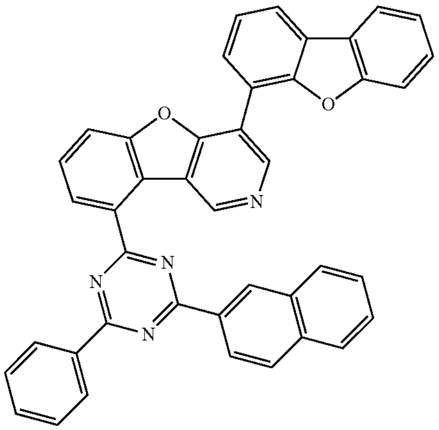
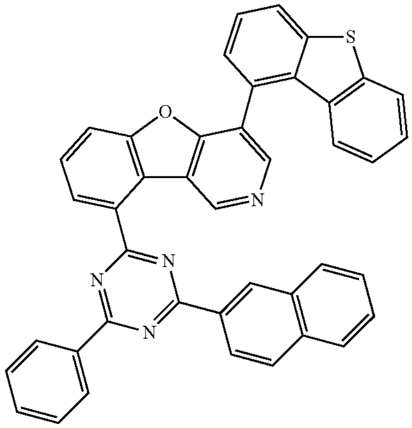
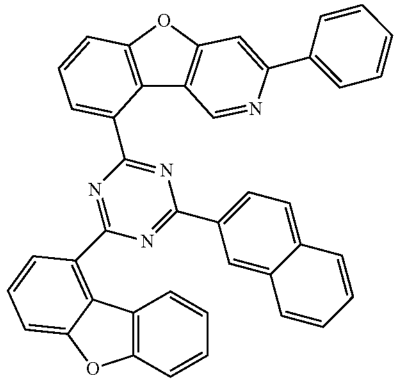
-continued
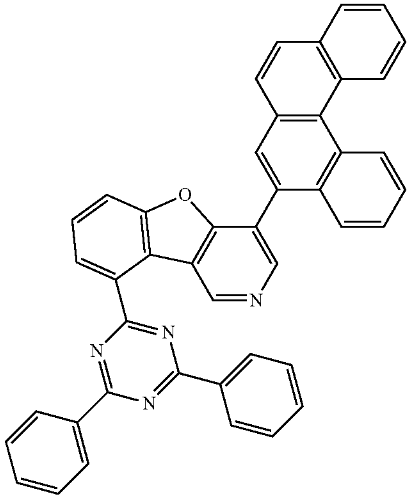
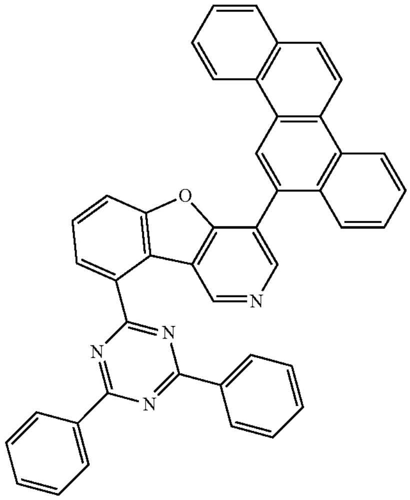
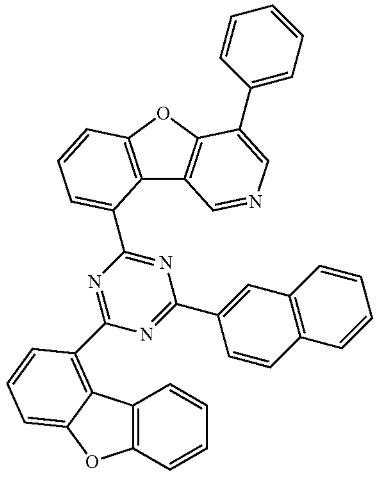

-continued
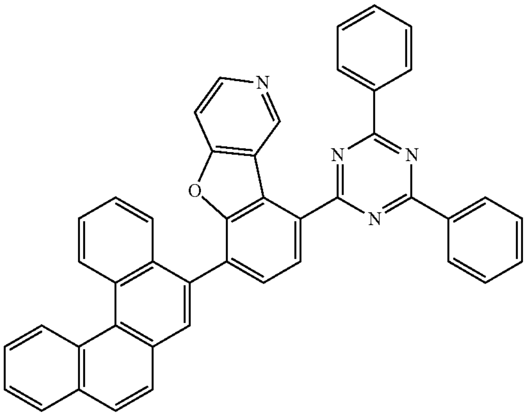
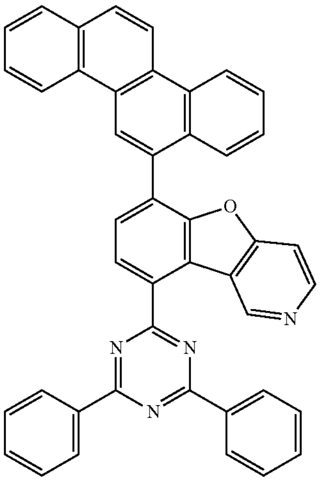
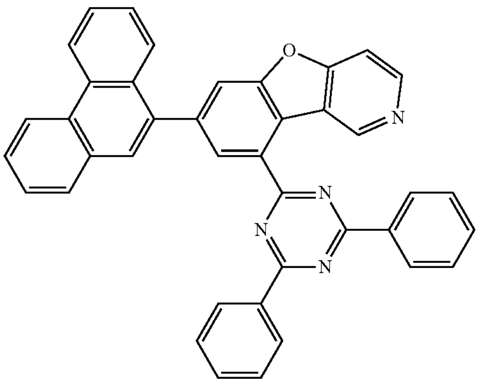
-continued
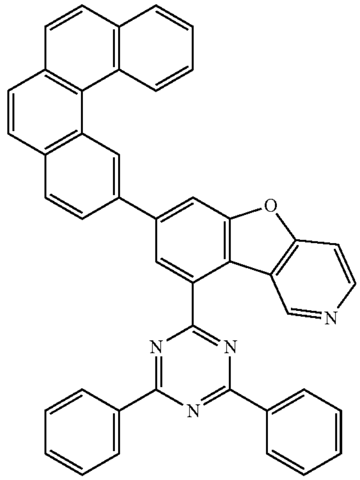
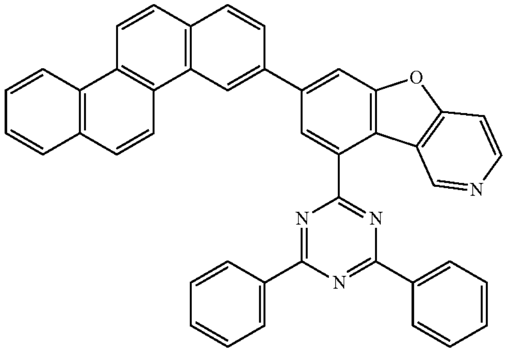
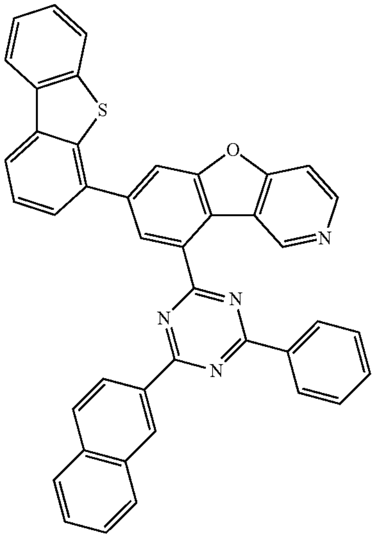

-continued
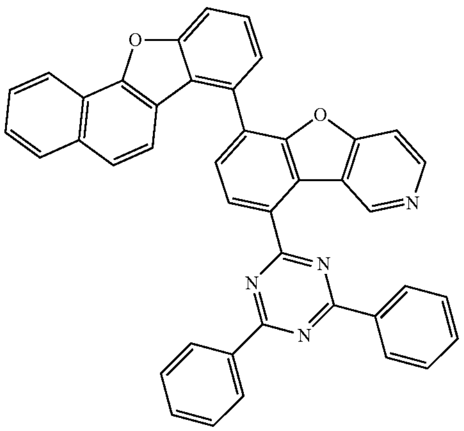
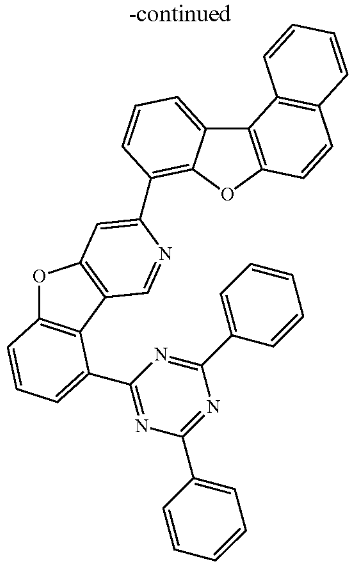
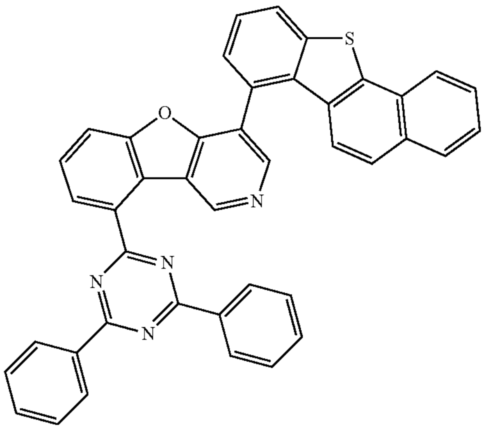
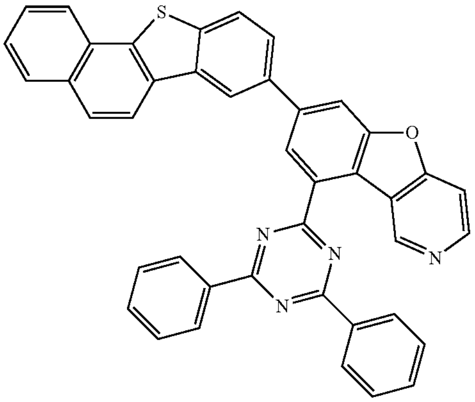
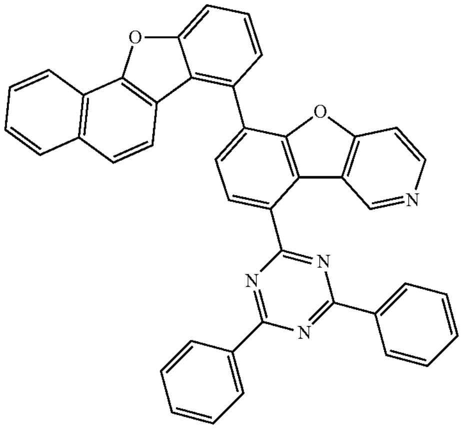
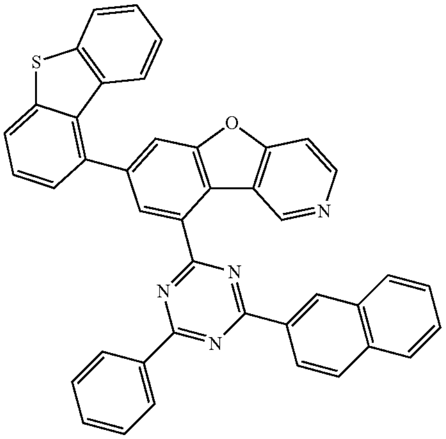
-continued -continued
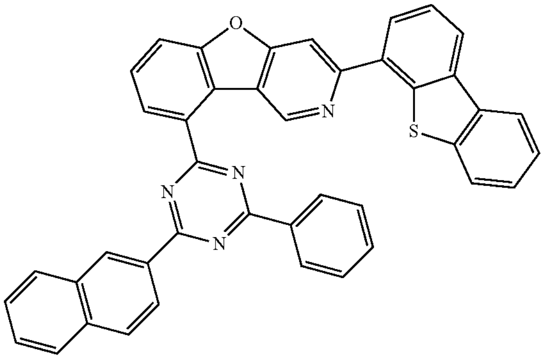
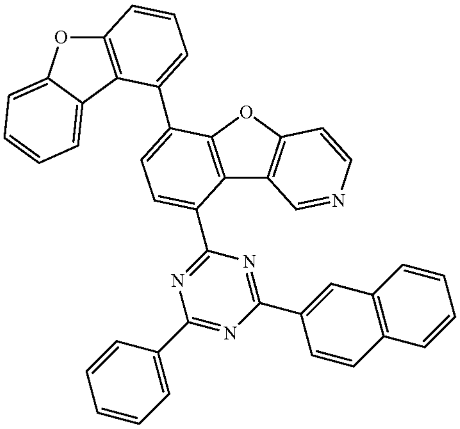
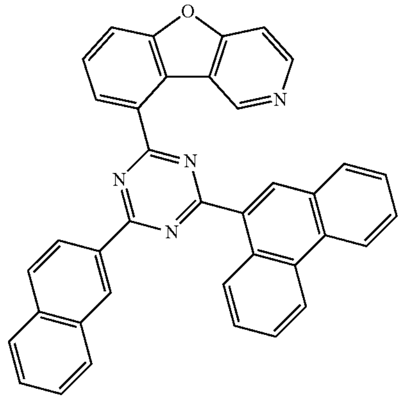
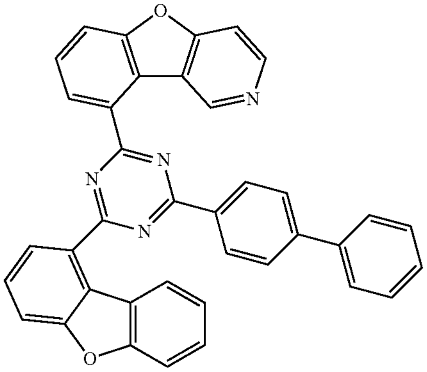
-continued
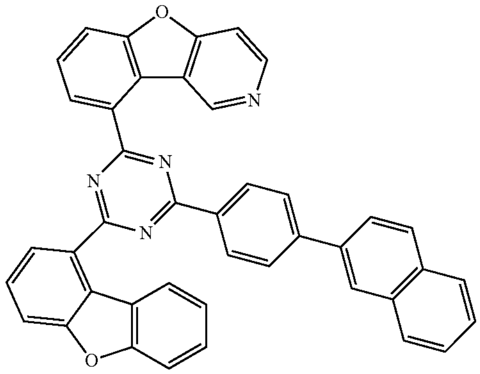
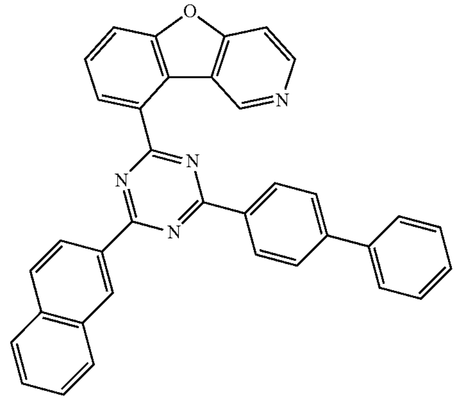
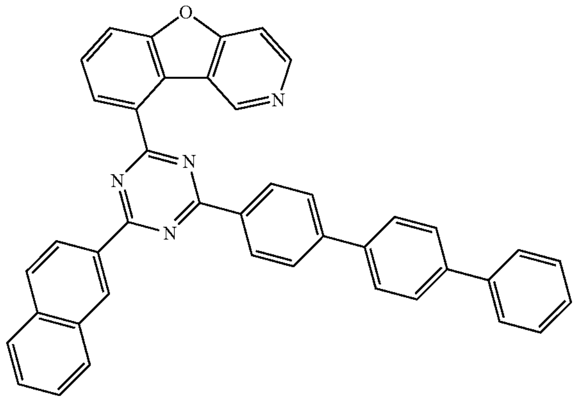
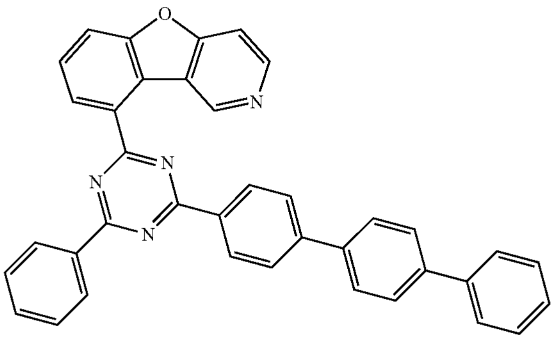

-continued
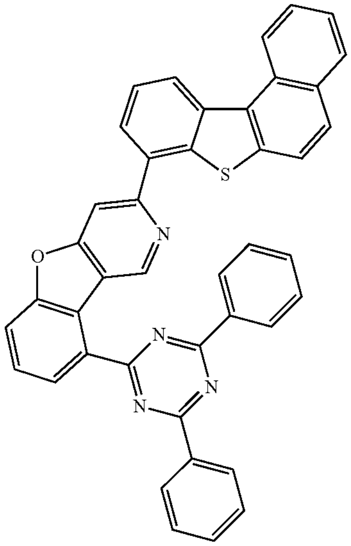
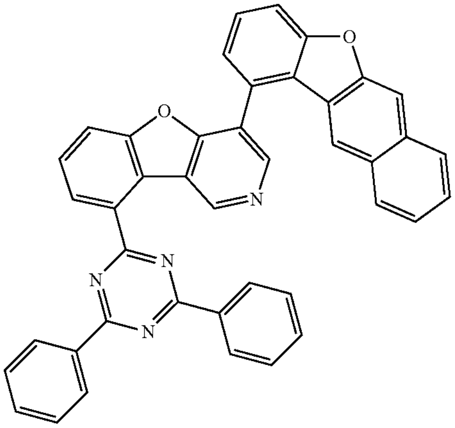
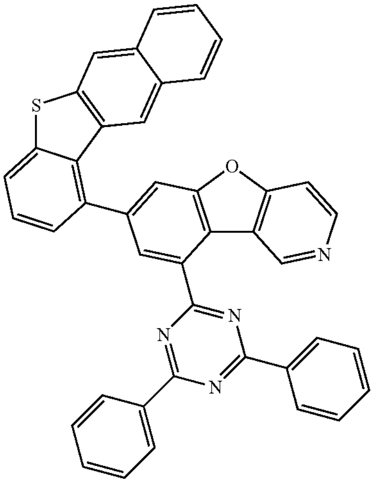
-continued
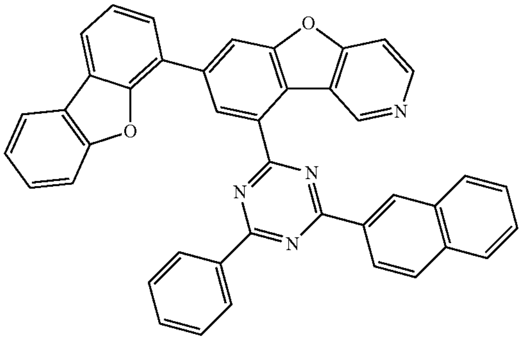
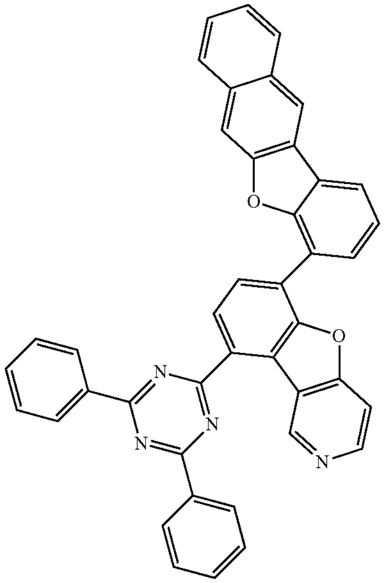
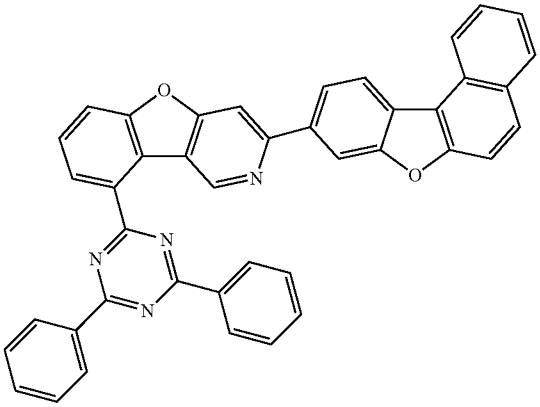
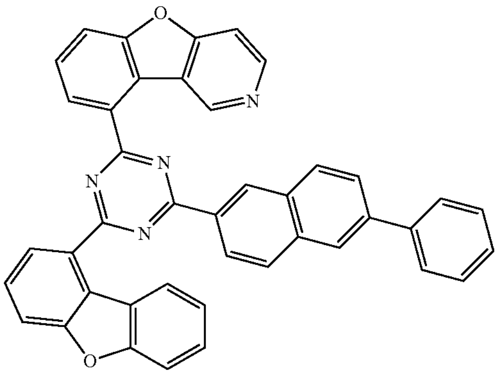

-continued
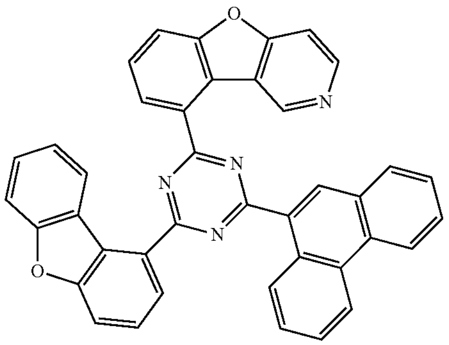
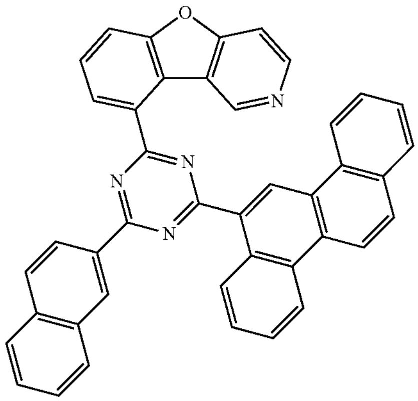
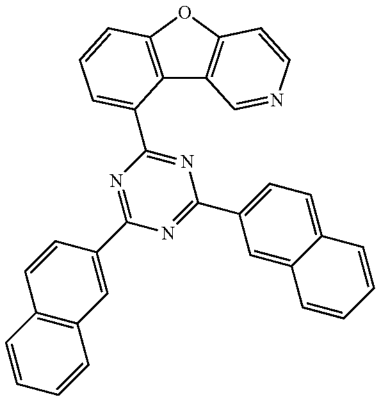
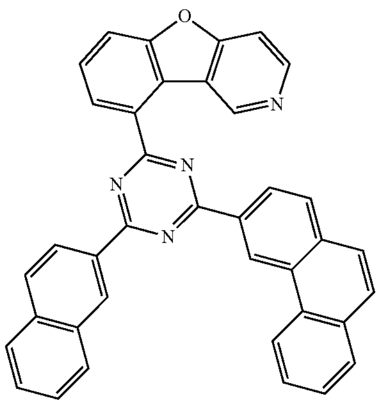
-continued
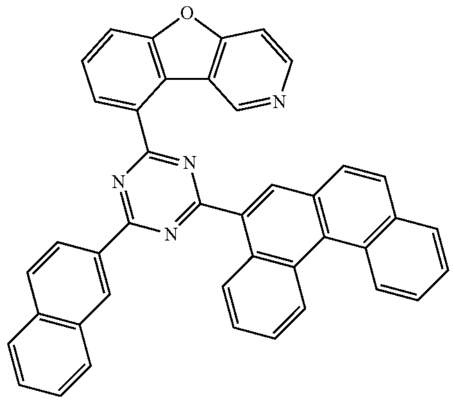
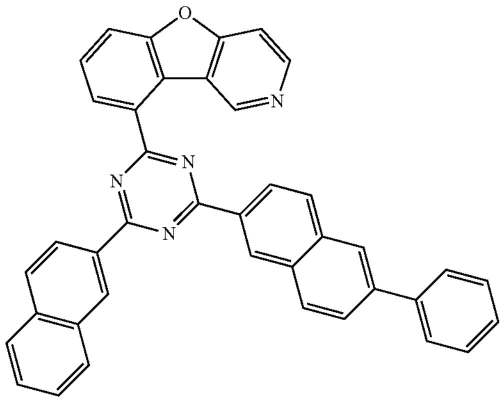
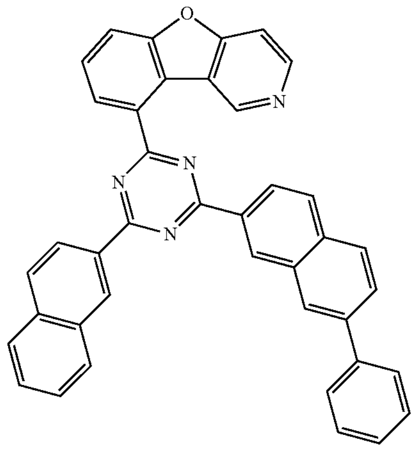
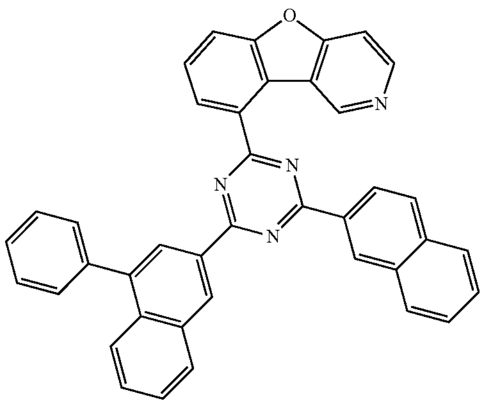

-continued
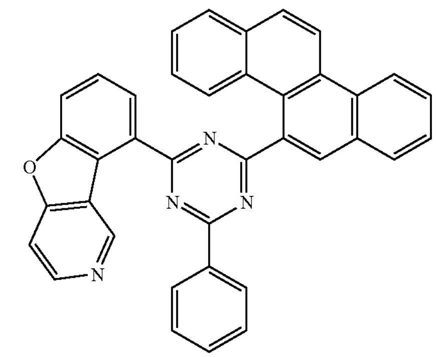
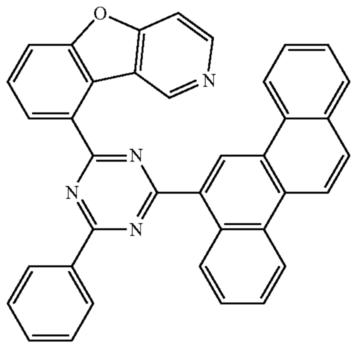
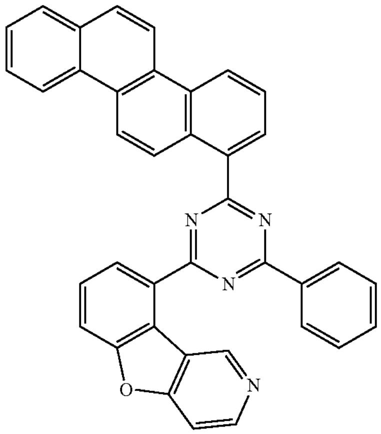
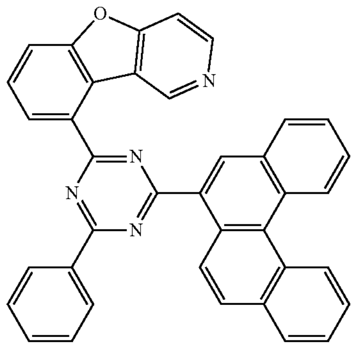
-continued
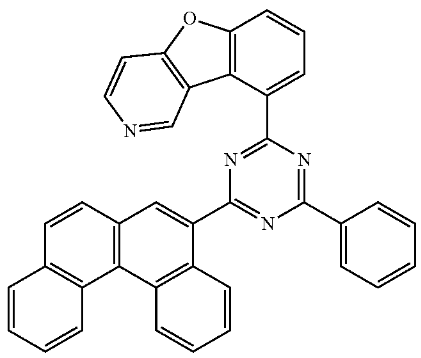
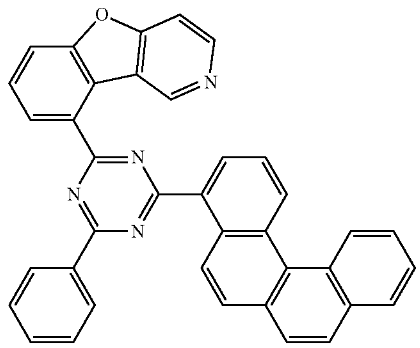
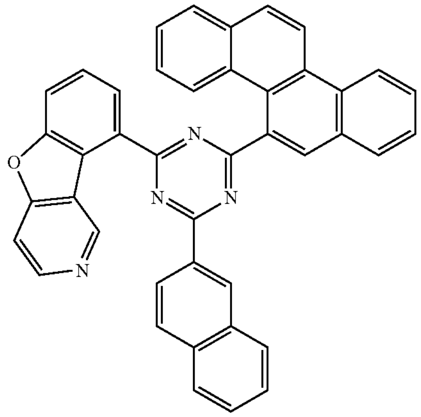
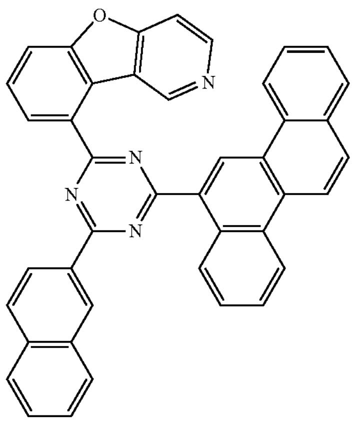

-continued
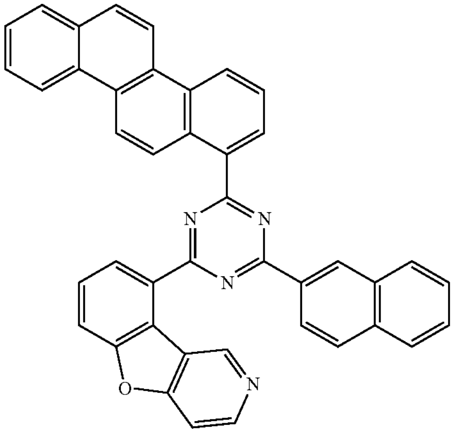
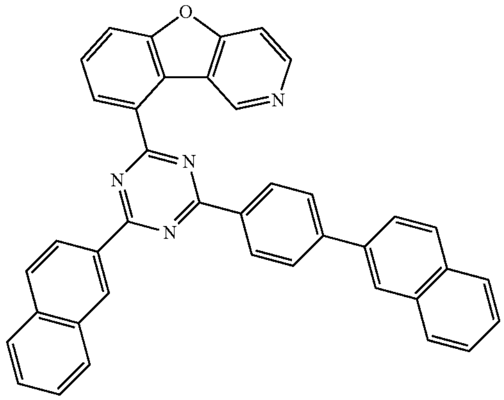
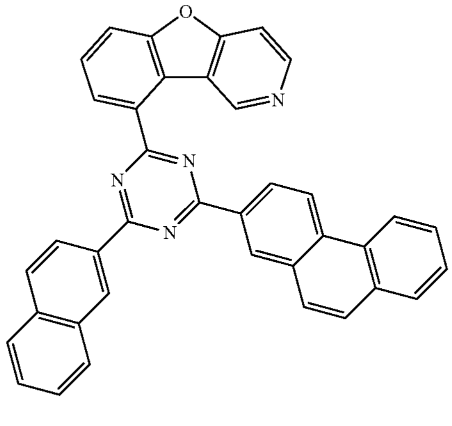
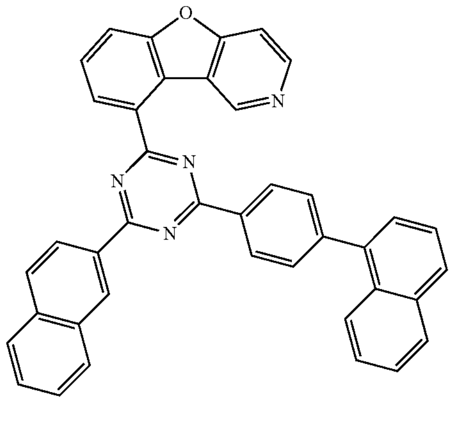
-continued
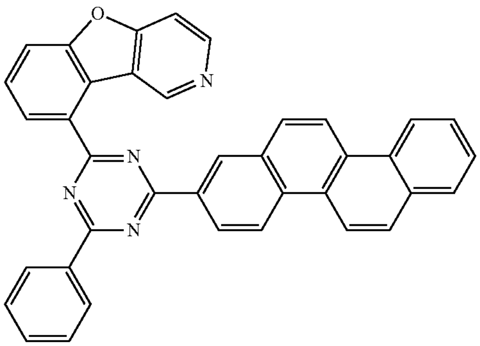
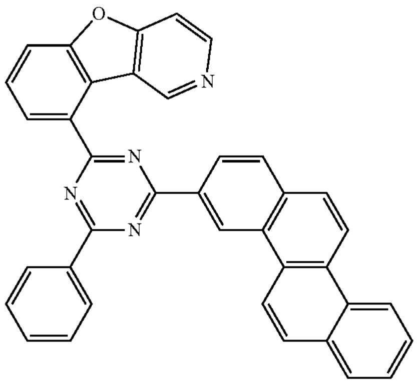
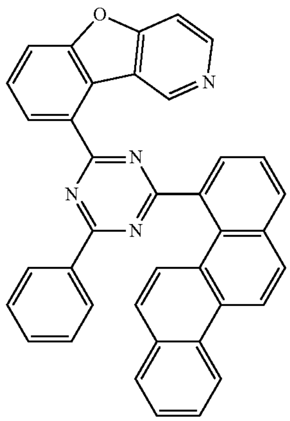
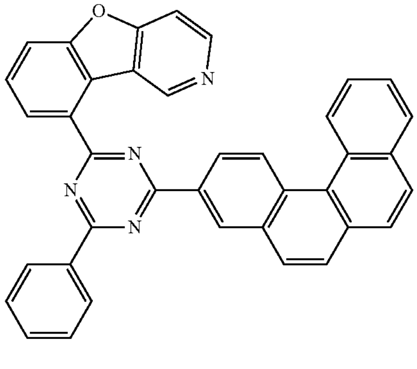

-continued
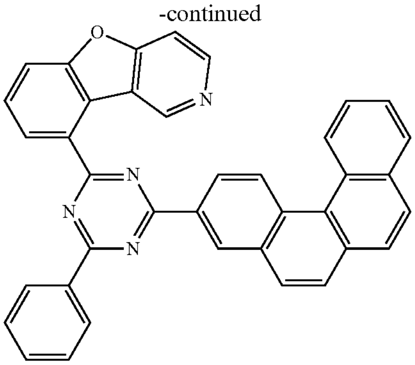
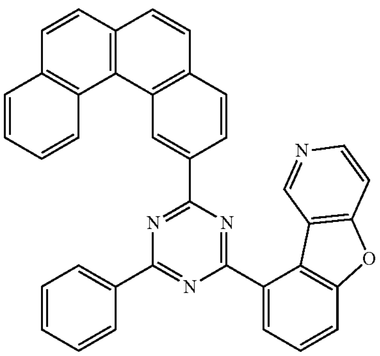
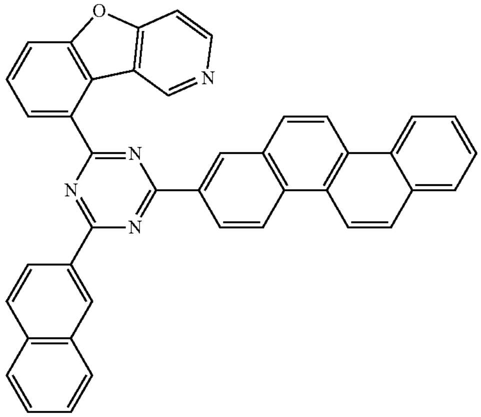
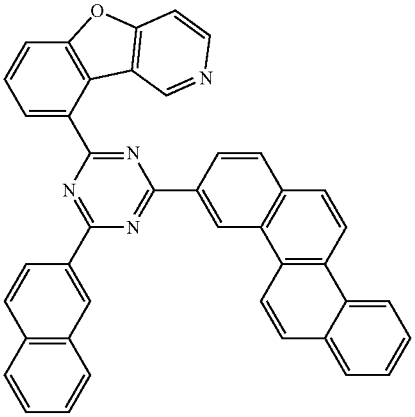
-continued
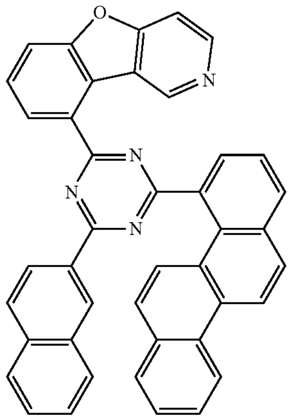
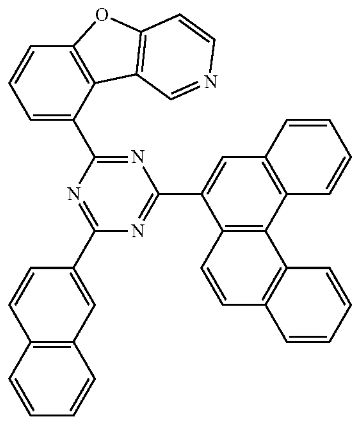
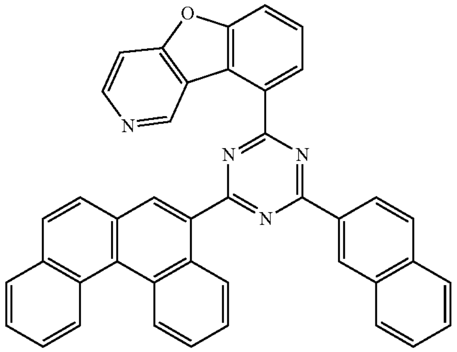
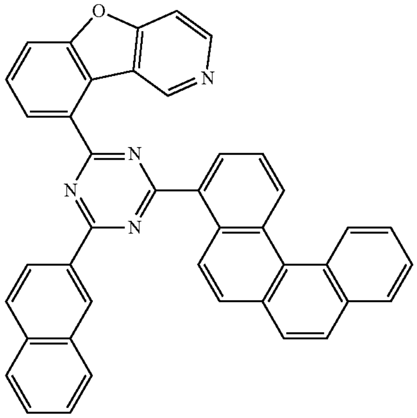

-continued
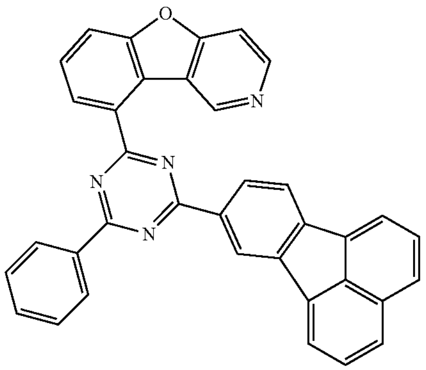
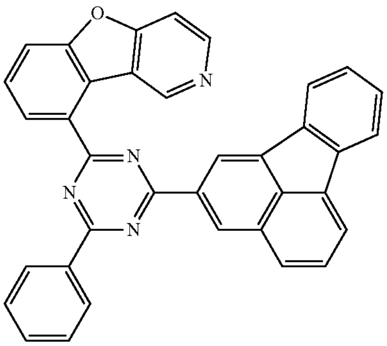
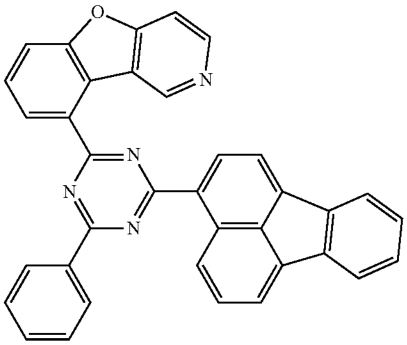
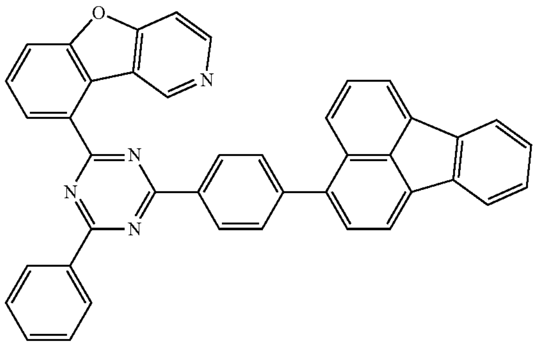
-continued
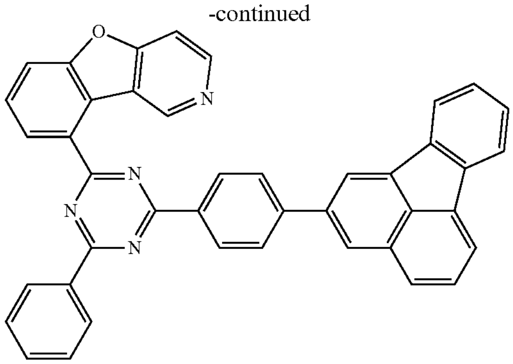
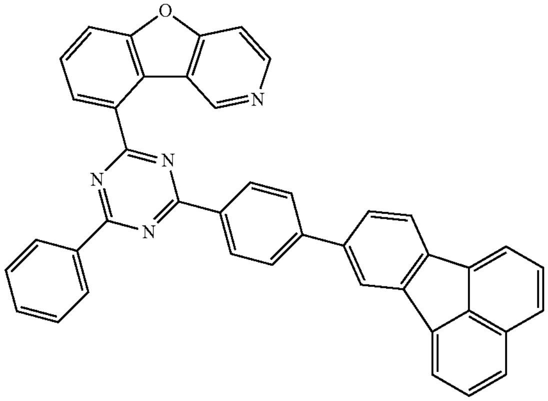
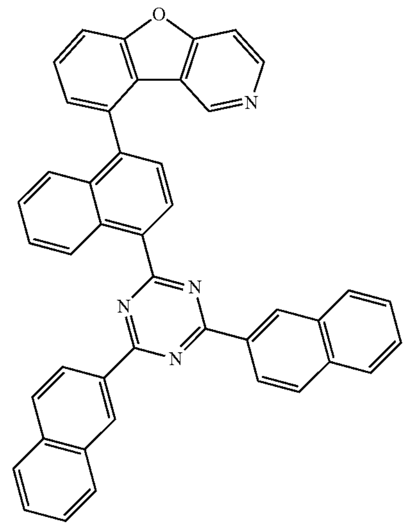

-continued
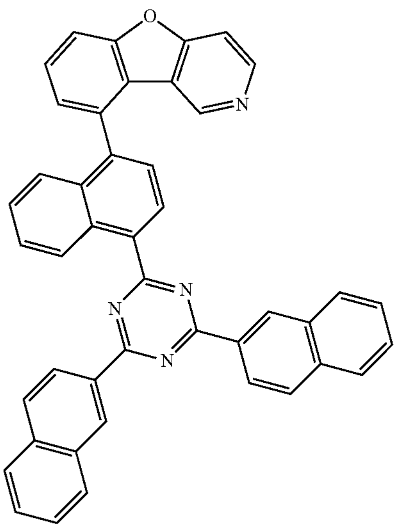
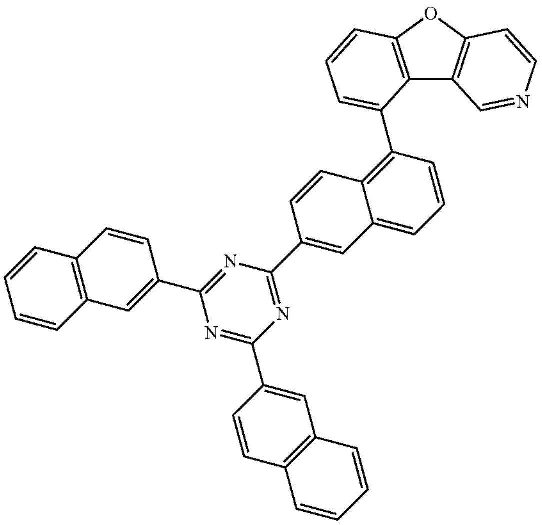
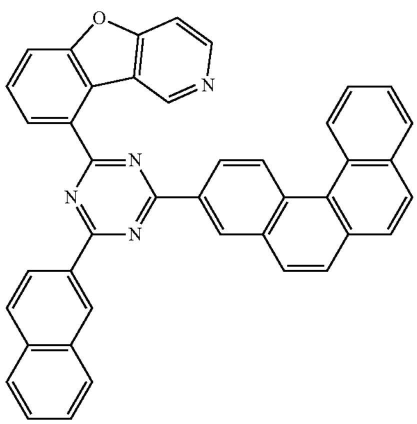
-continued
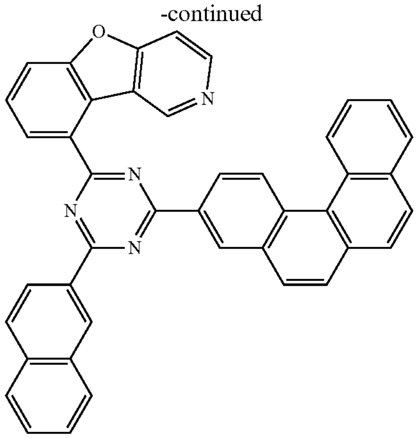
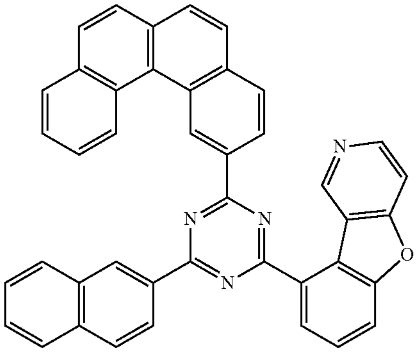
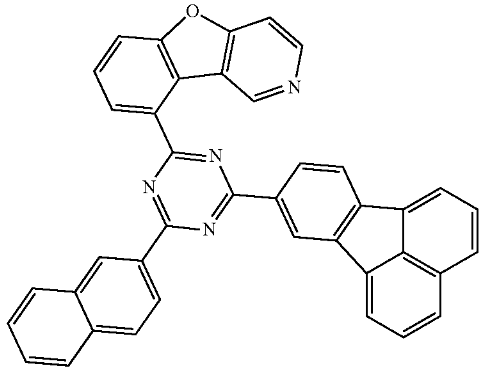
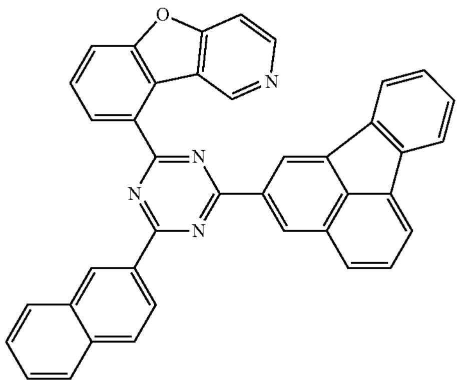

-continued
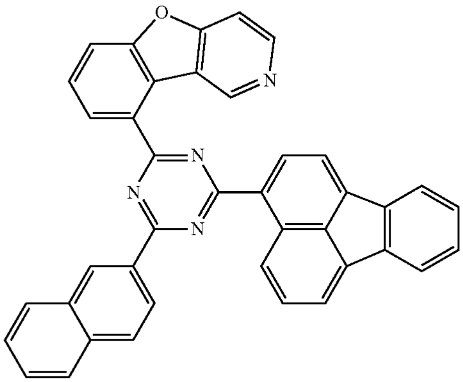
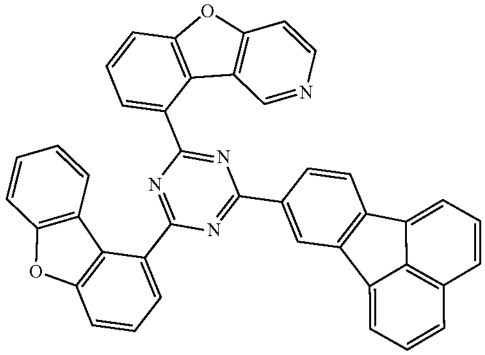
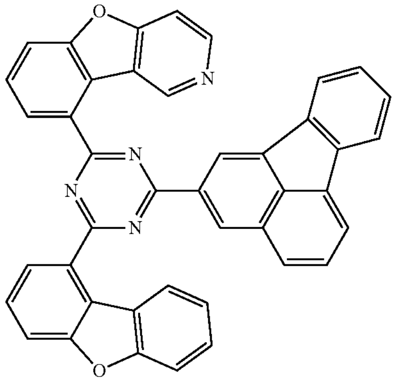
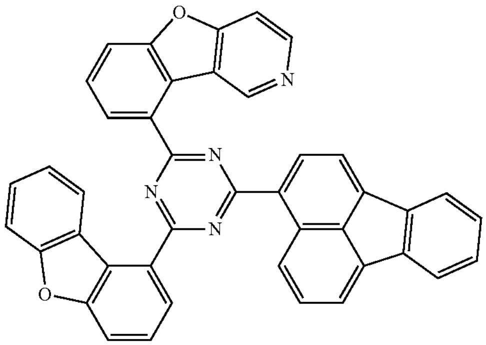
-continued
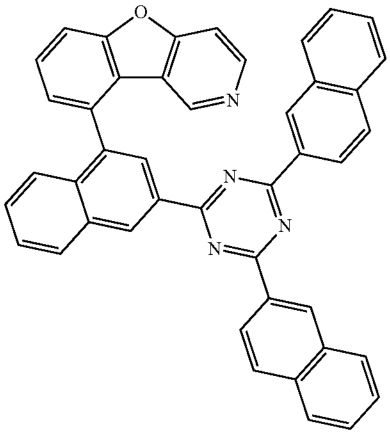
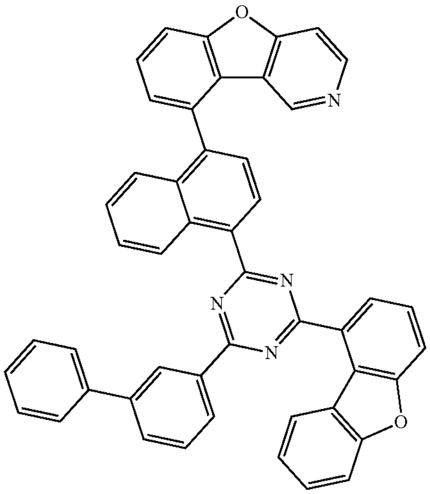
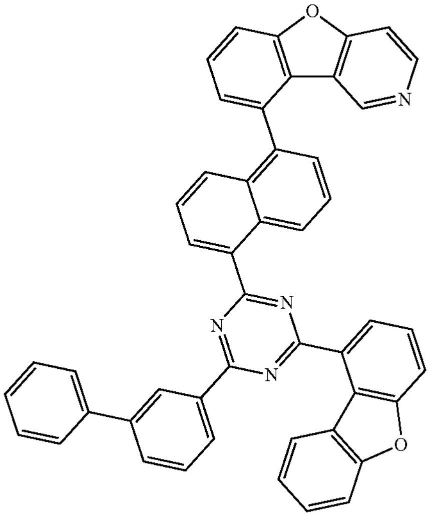

-continued
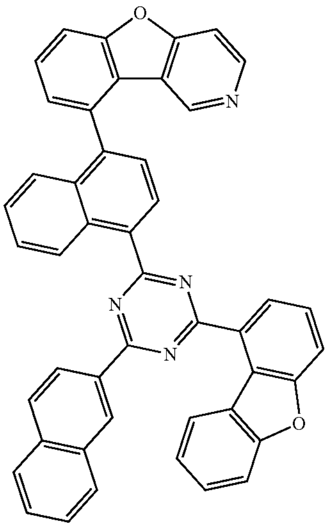
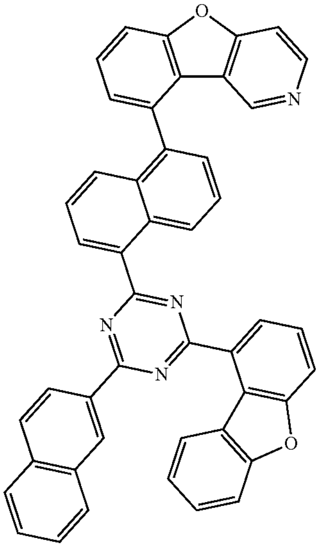
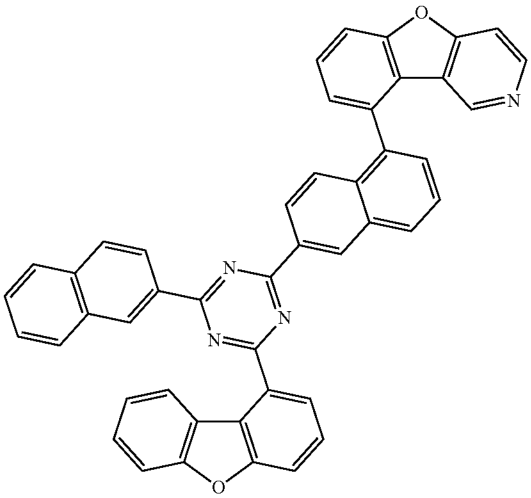
-continued
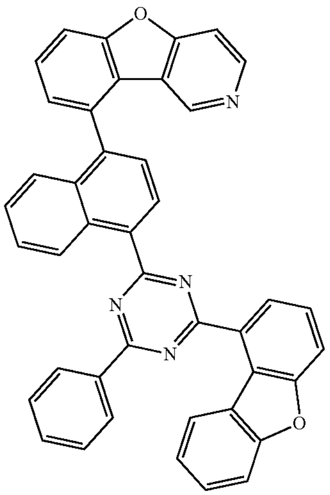
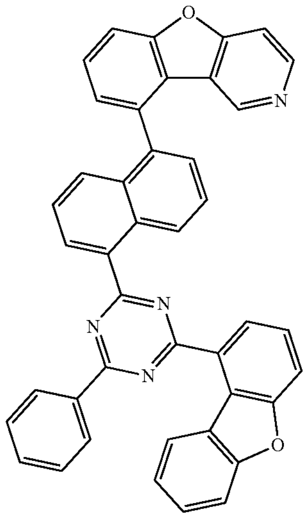
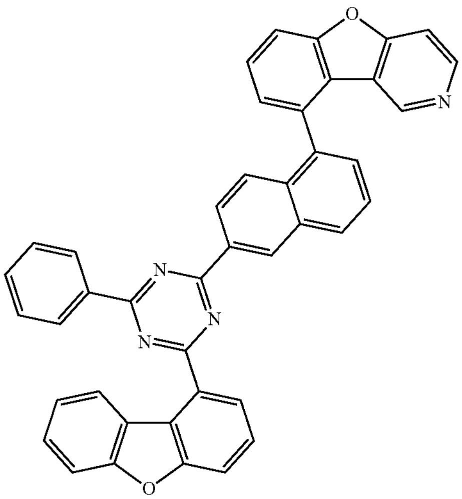

-continued
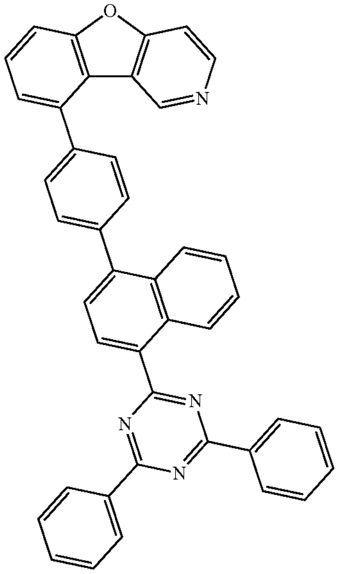
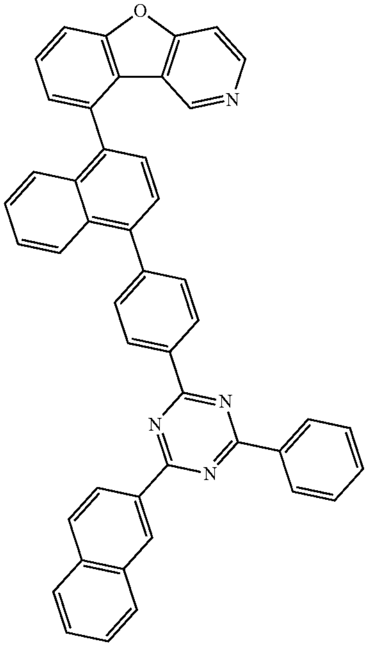
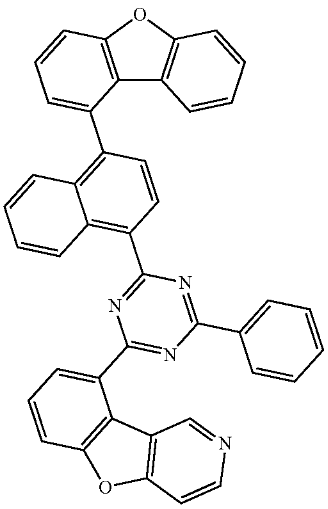
-continued
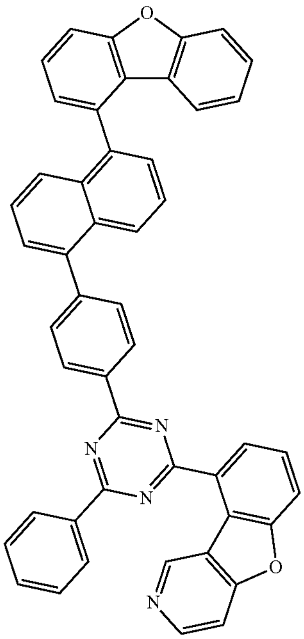
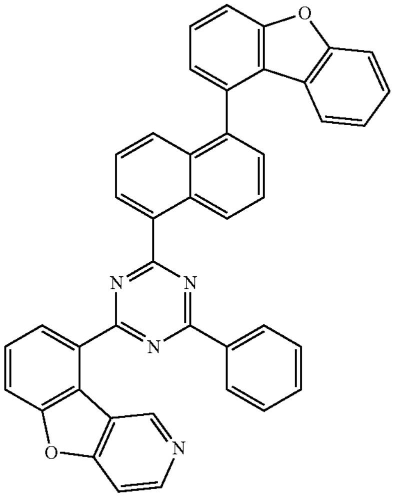
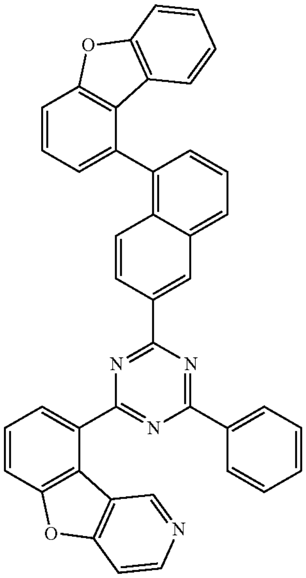

-continued
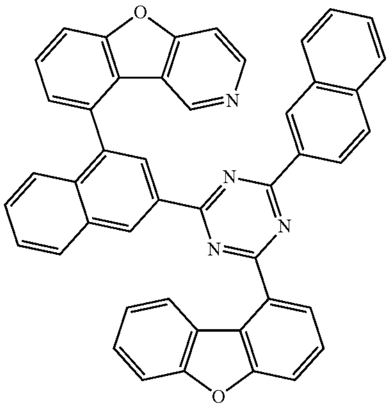
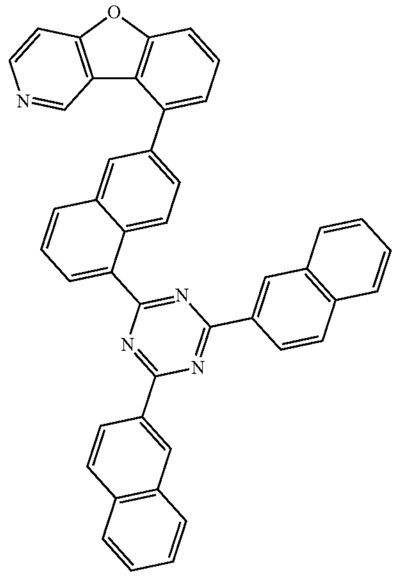
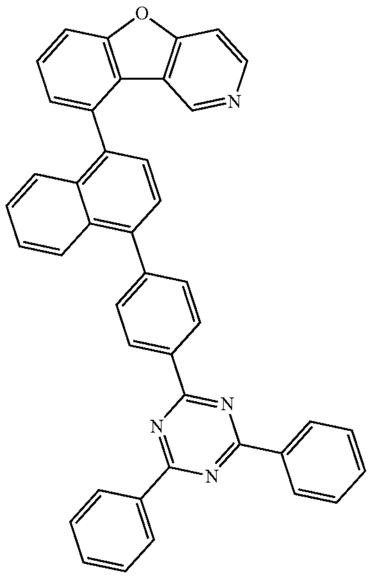
-continued
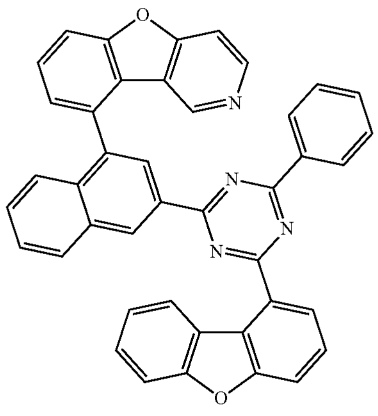
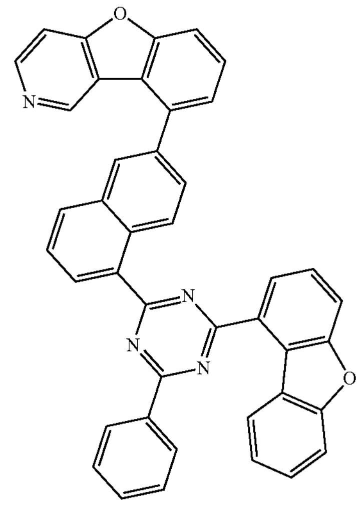
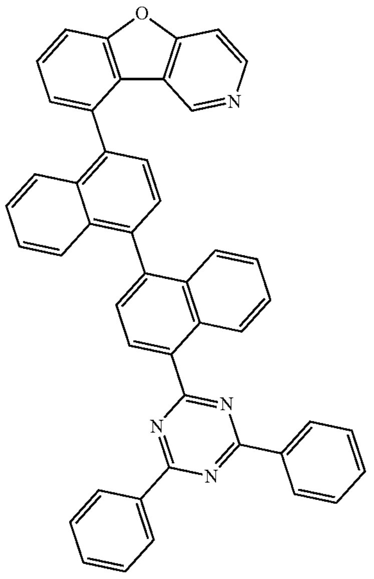

-continued
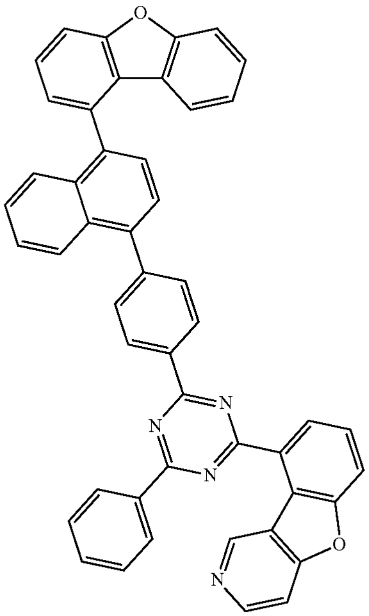
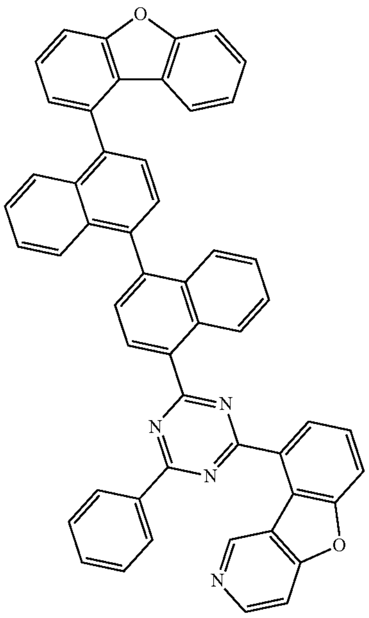
-continued
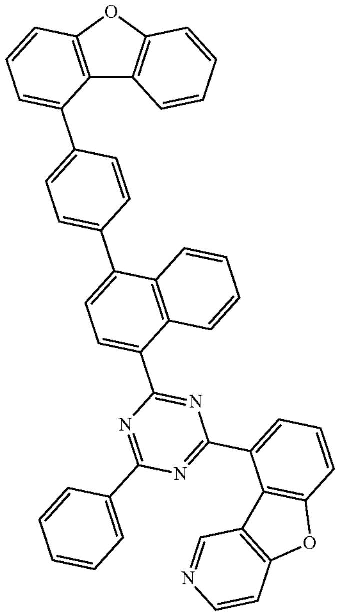
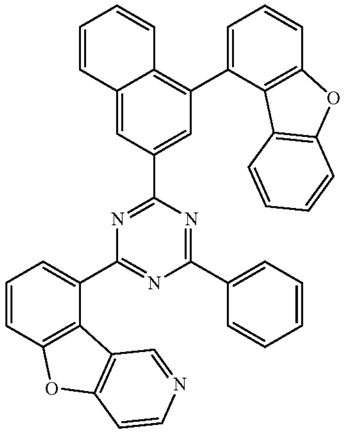
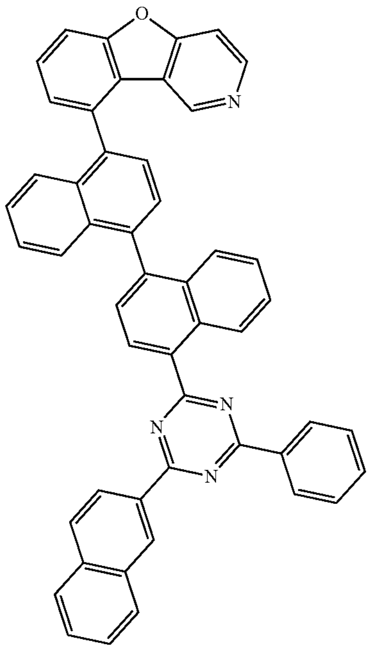

-continued
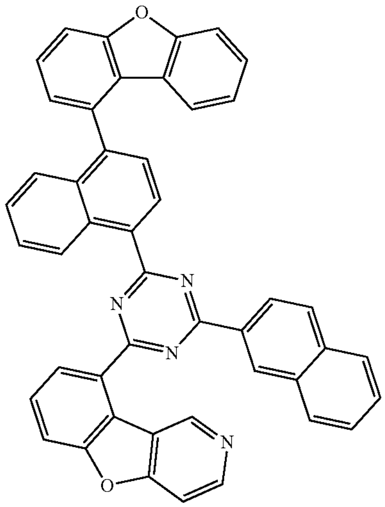
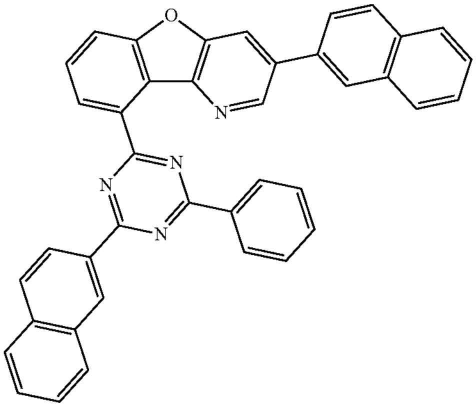
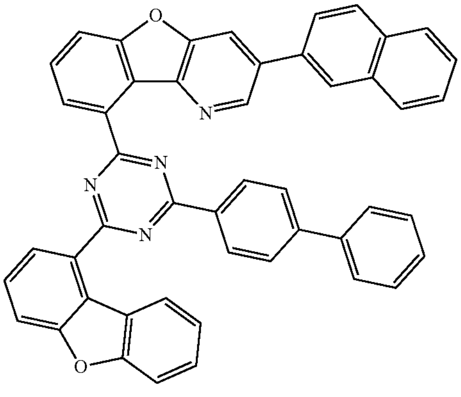
-continued
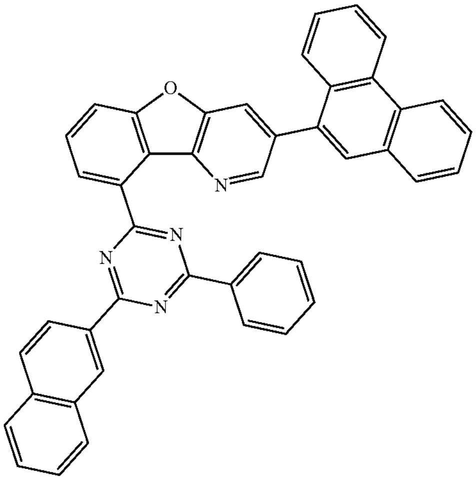
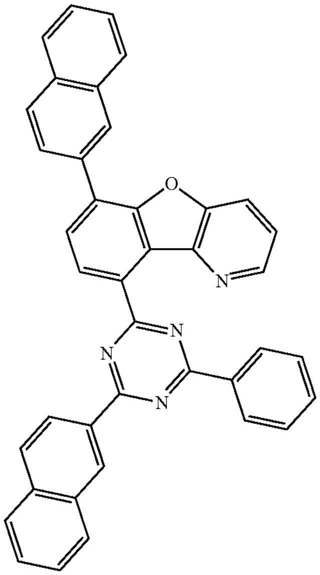
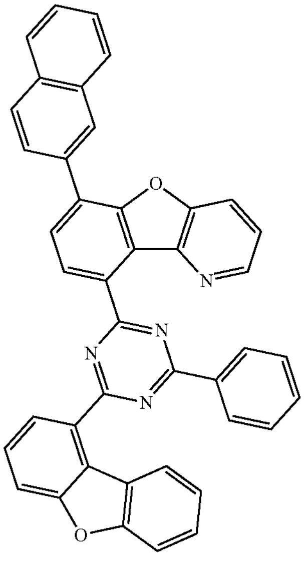

-continued
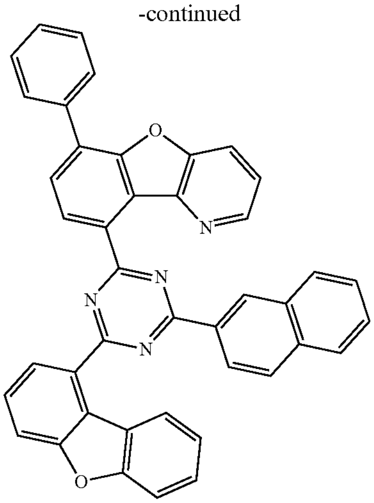
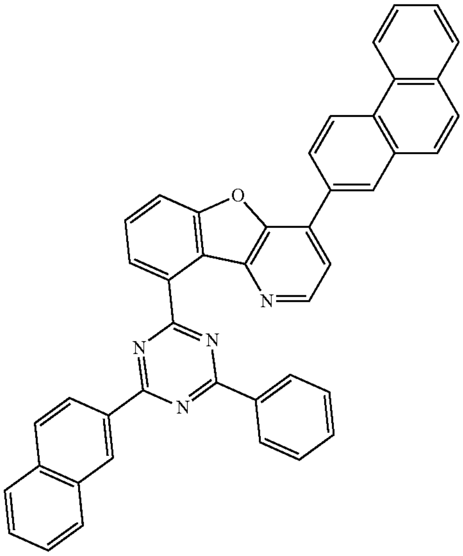
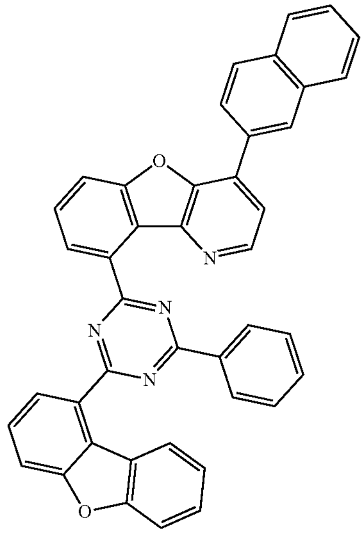
-continued
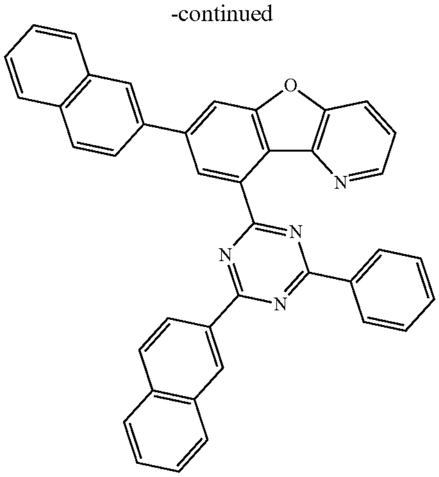
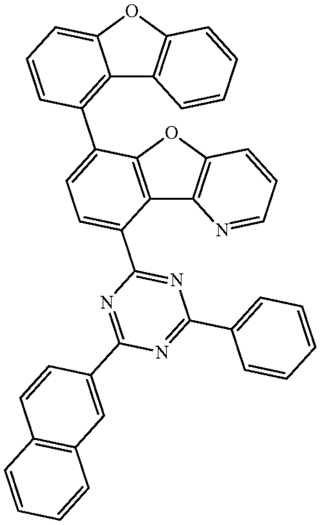
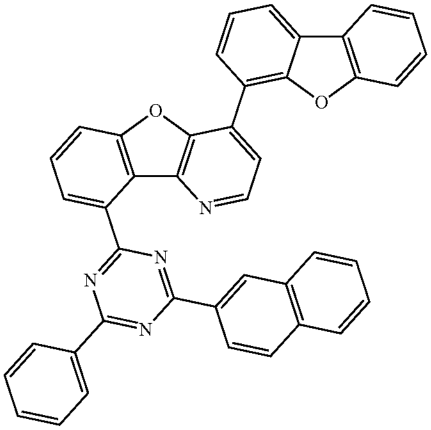

-continued
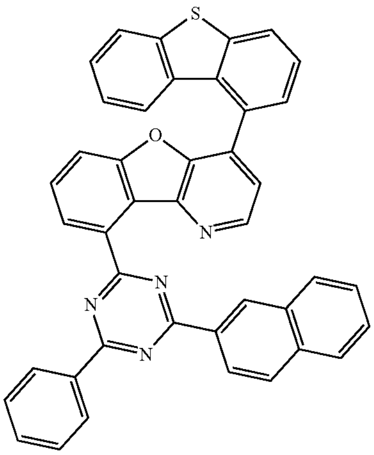
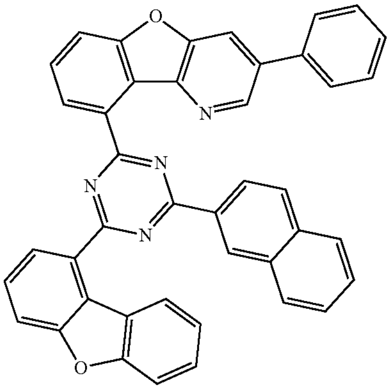
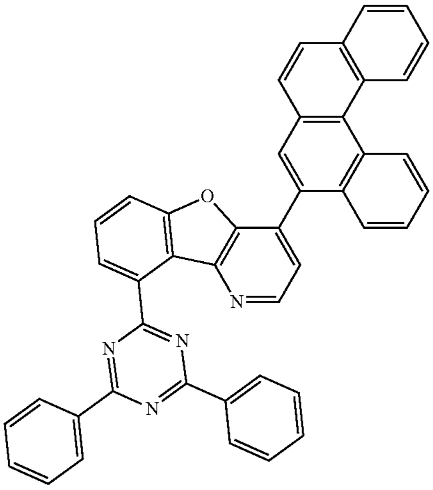
-continued
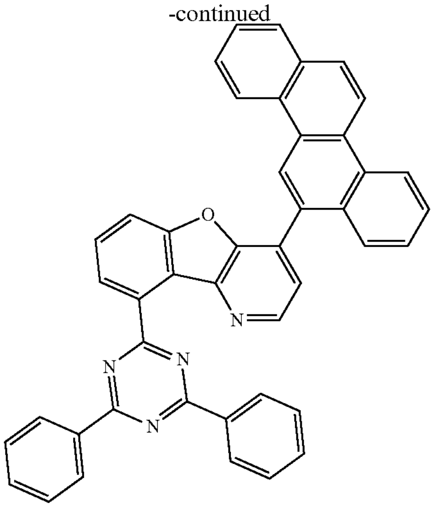
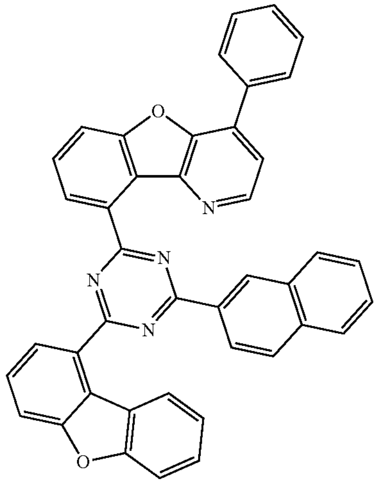
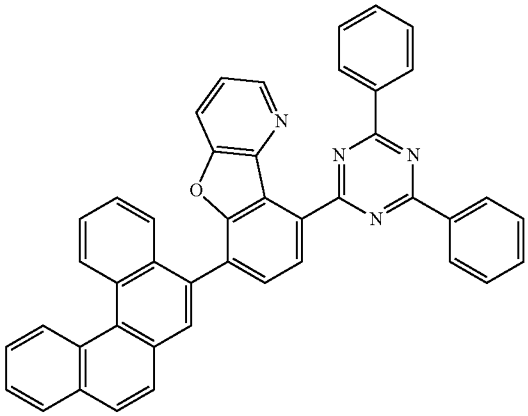

-continued
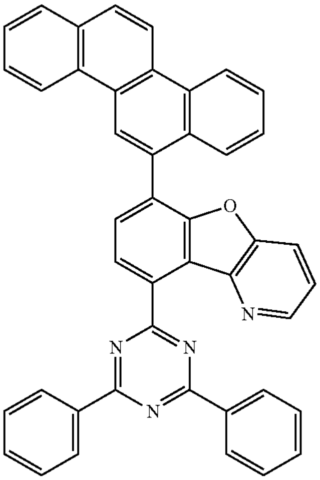
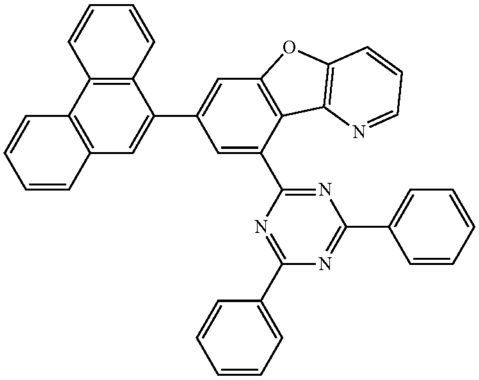
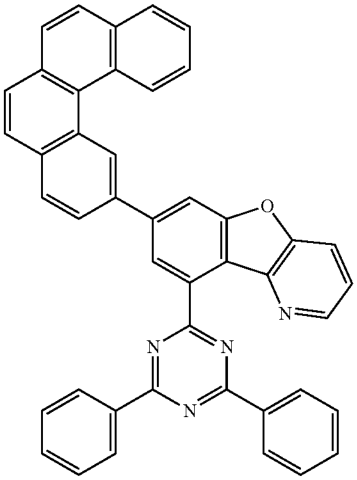
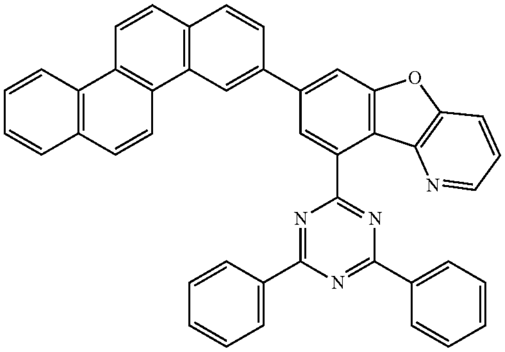
-continued
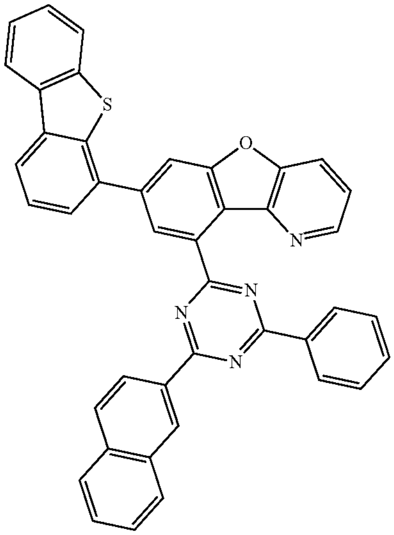
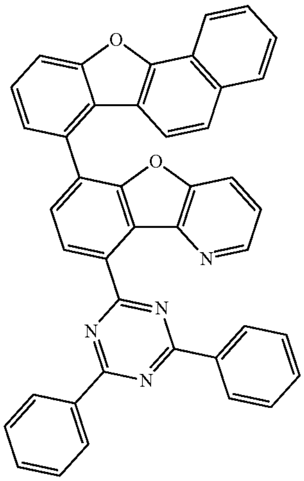
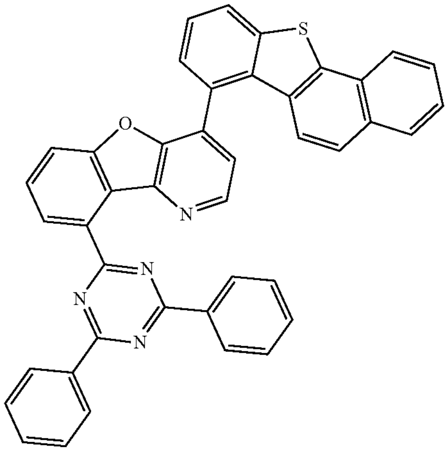

-continued
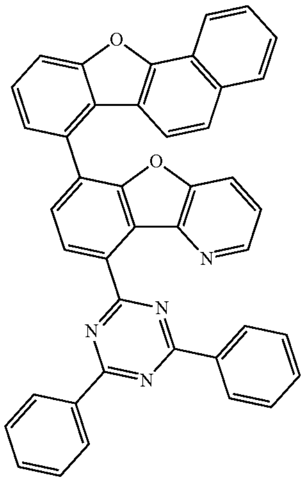
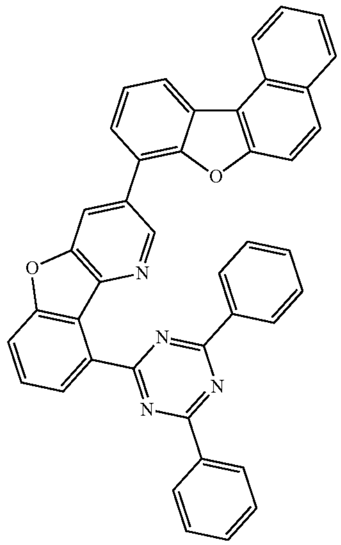
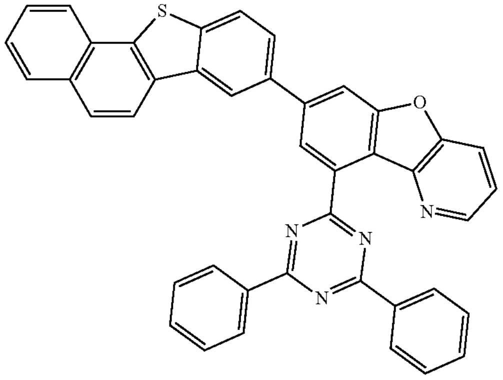
-continued
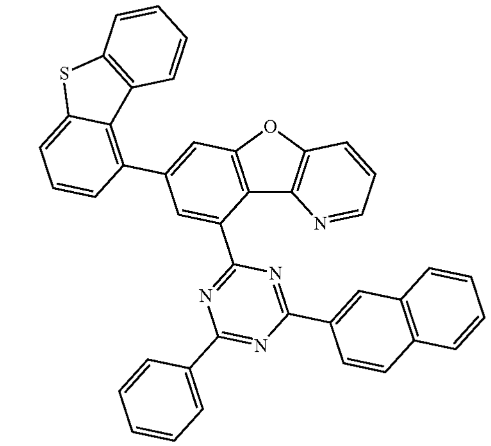
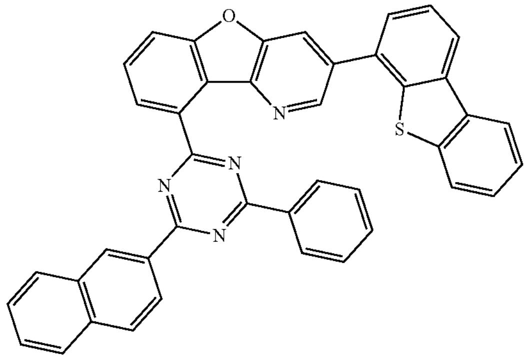
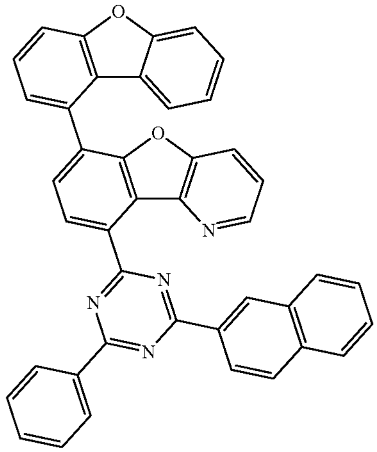
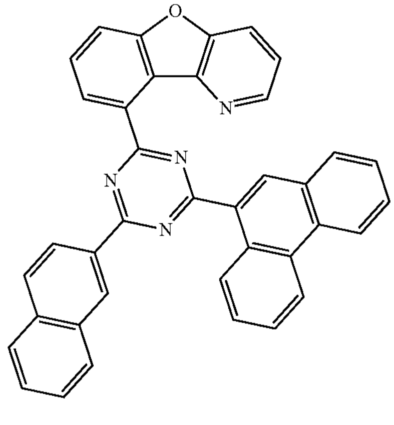

-continued
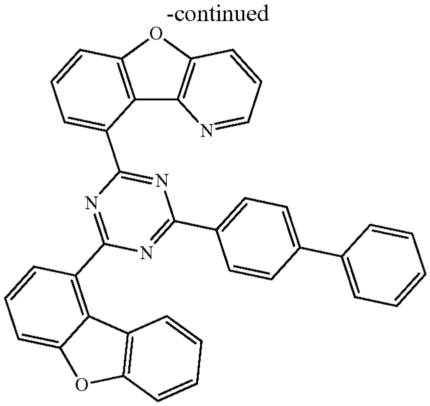
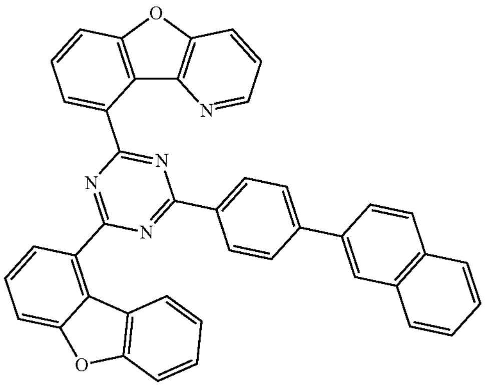
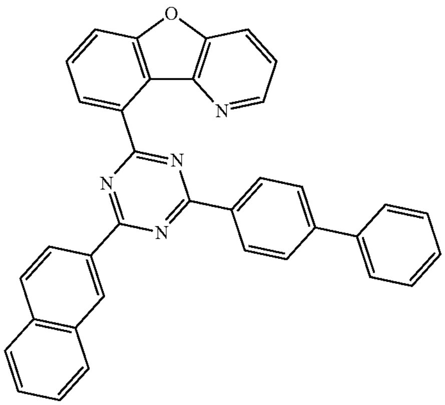
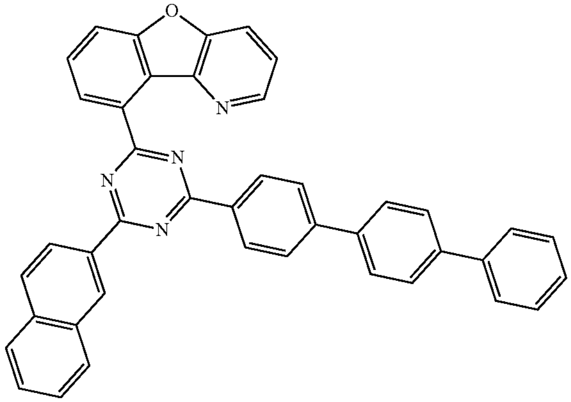
-continued
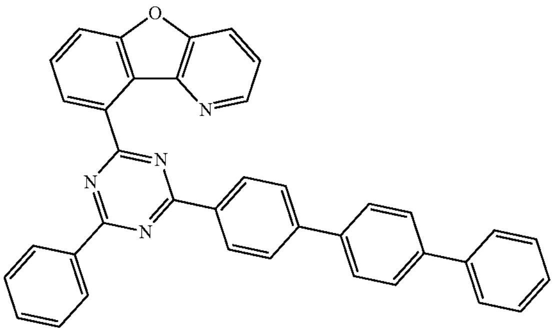
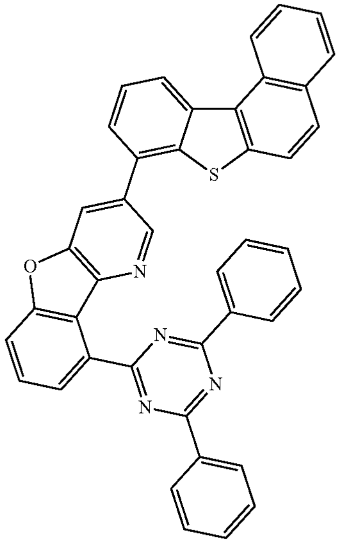
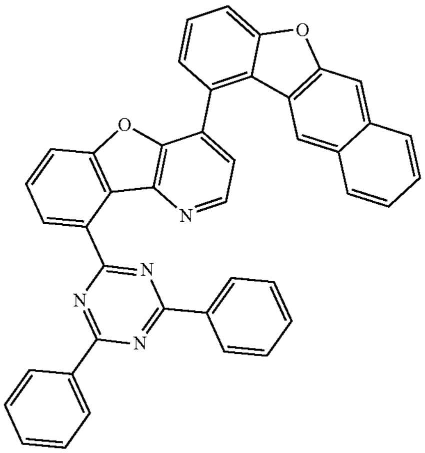

-continued
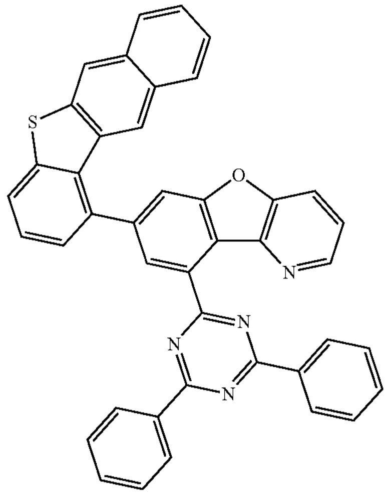
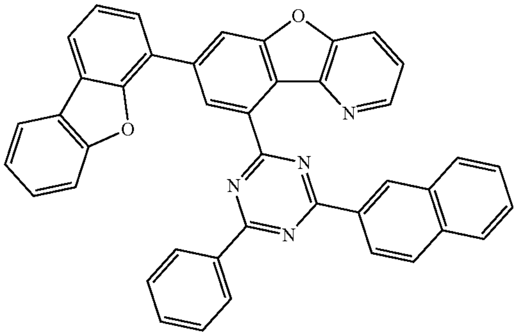
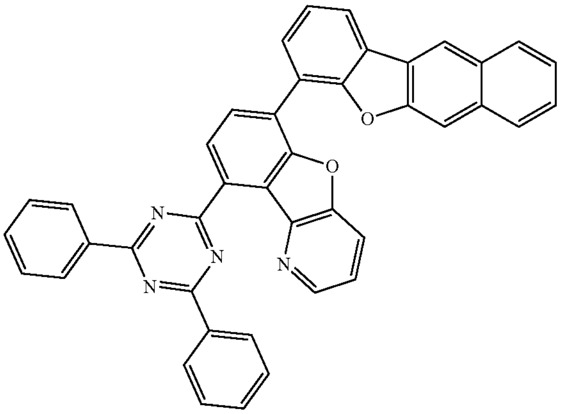
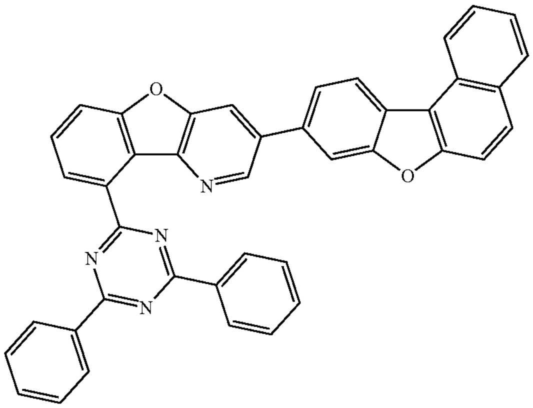
-continued
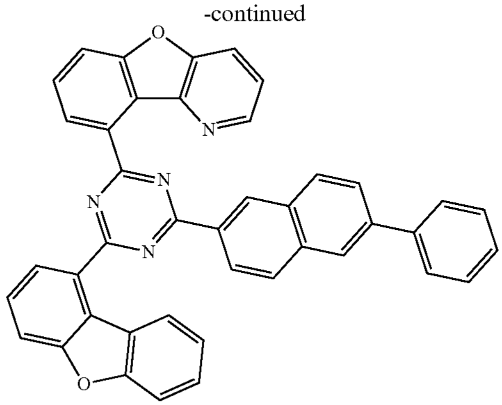
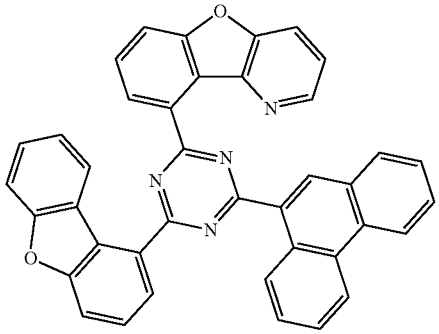
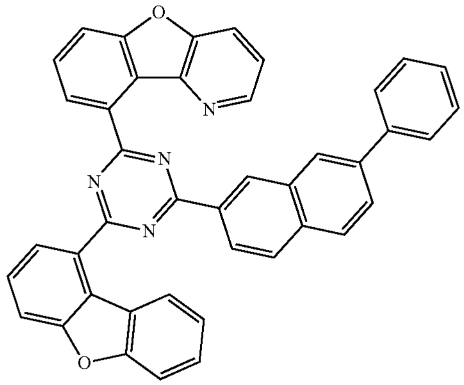
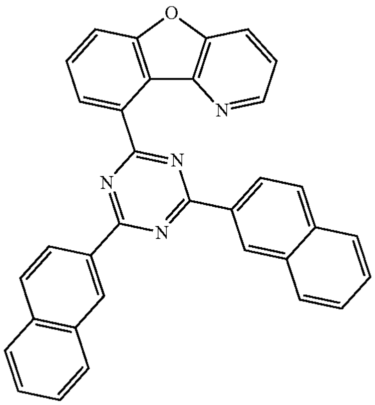

-continued
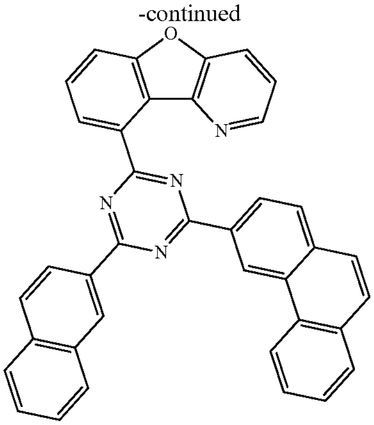
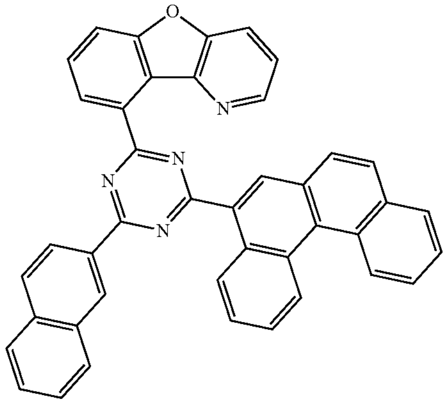
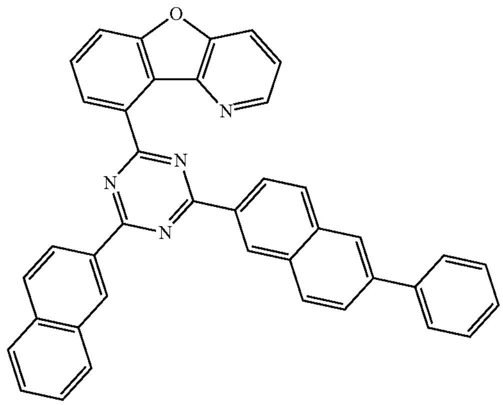
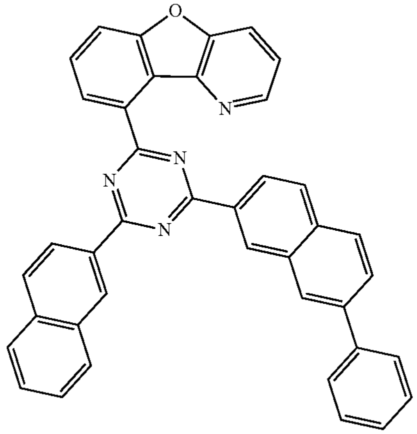
-continued
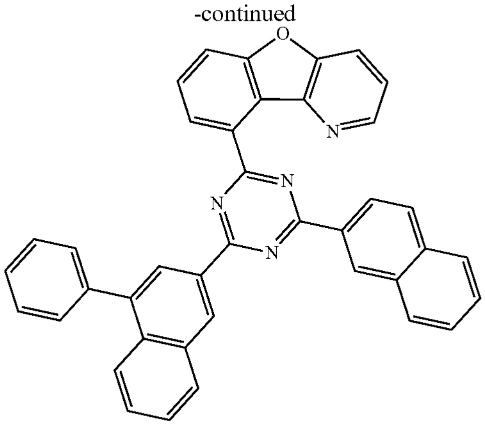
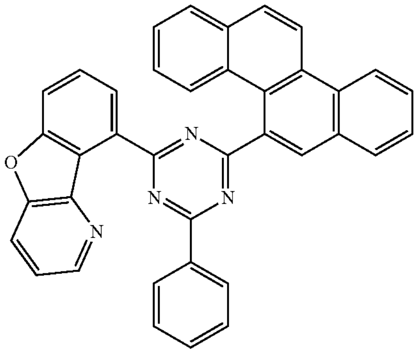
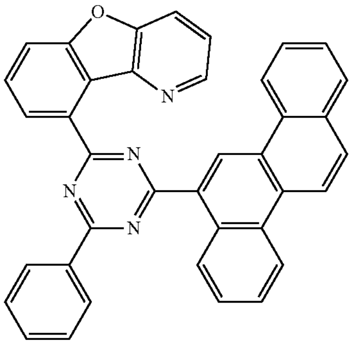
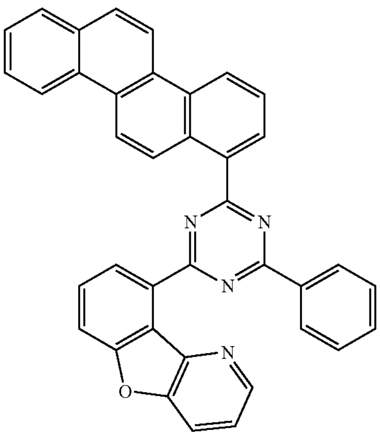

-continued
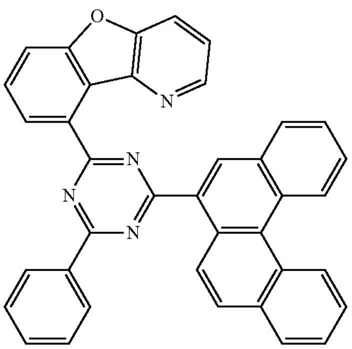
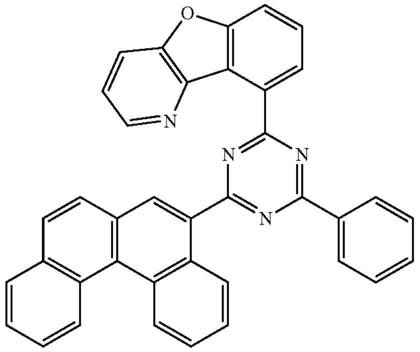
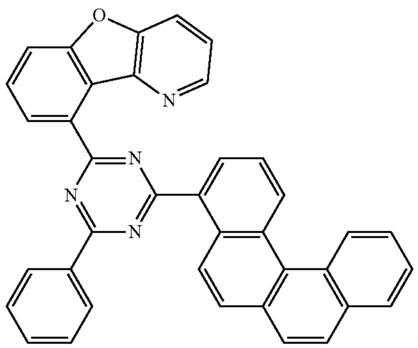
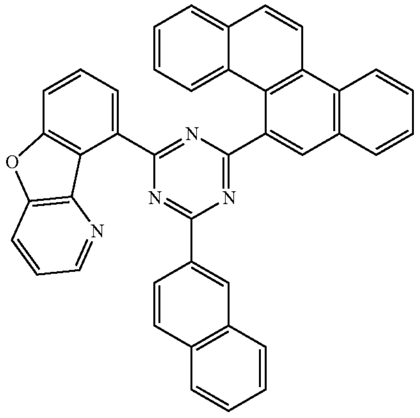
-continued
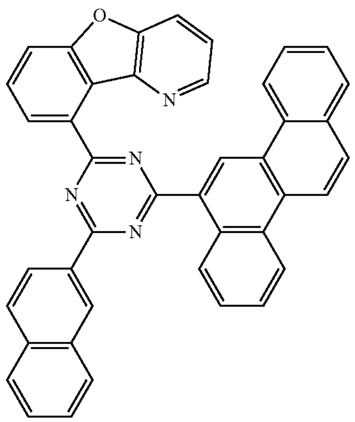
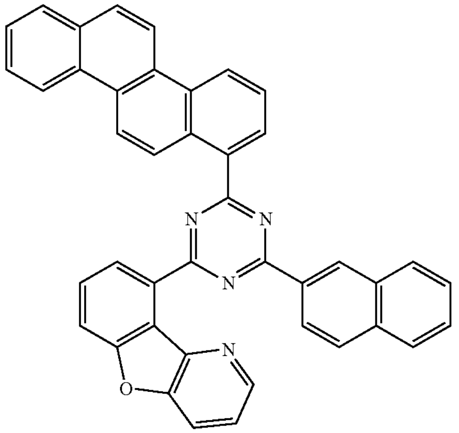
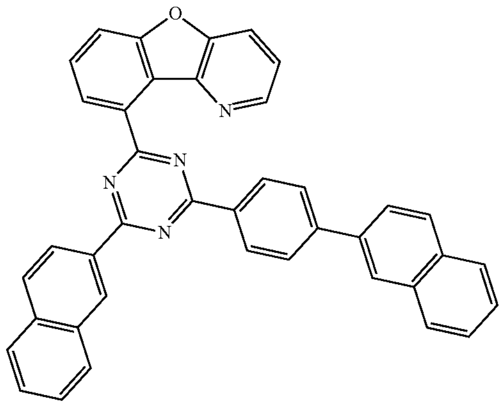
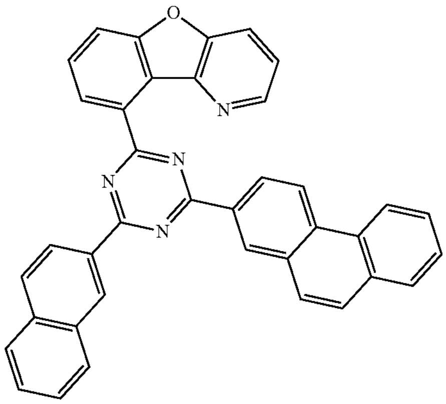

-continued
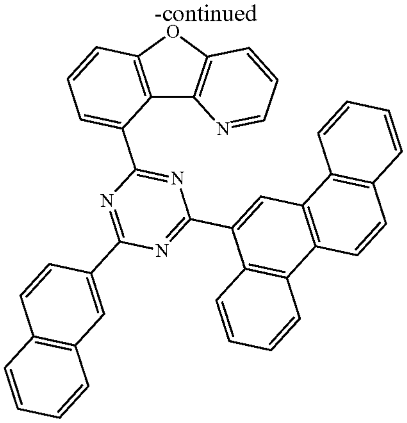
-continued
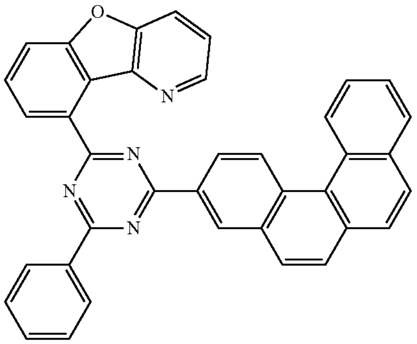
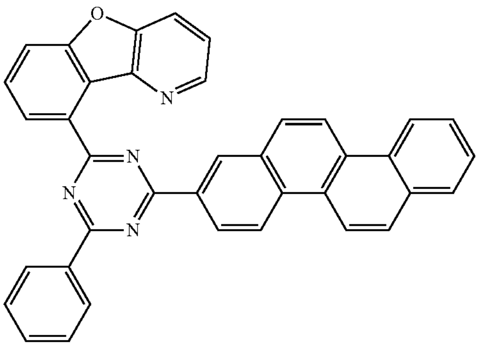
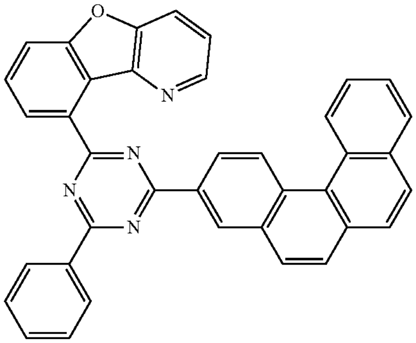
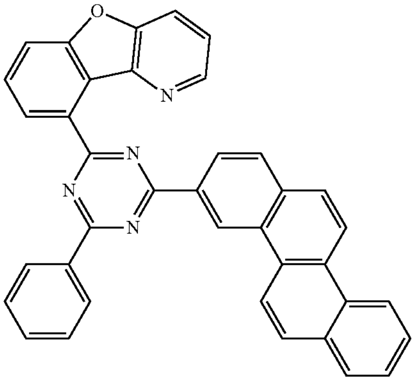
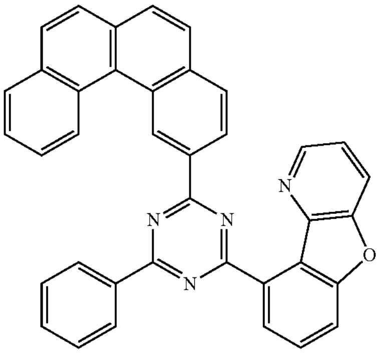
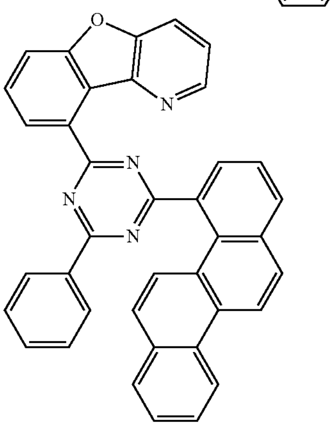
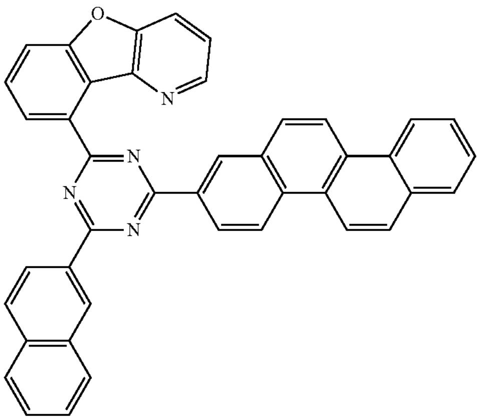

-continued
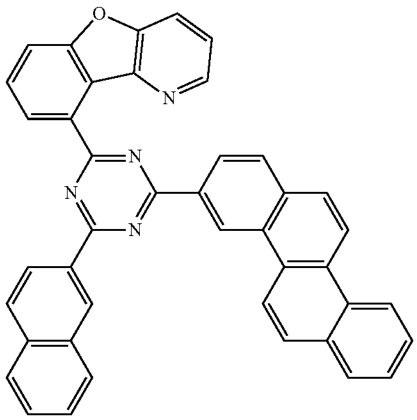
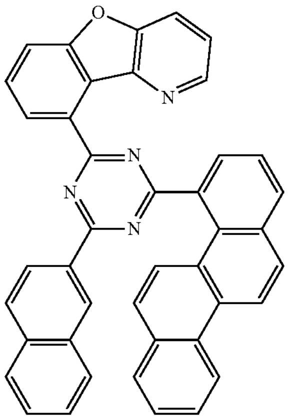
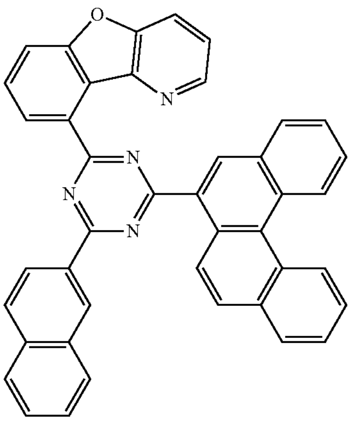
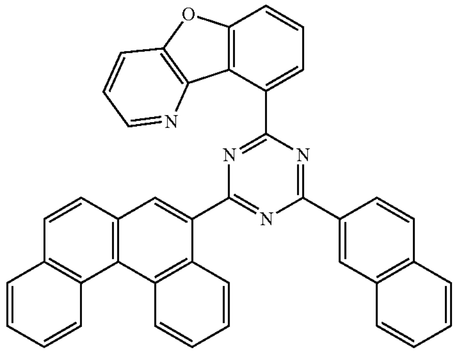
-continued
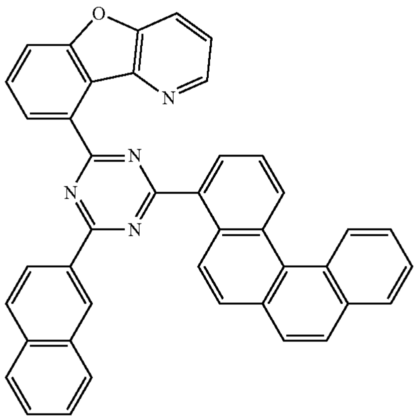
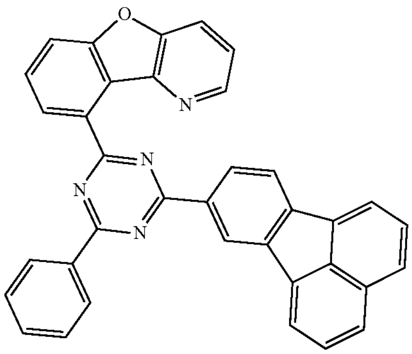
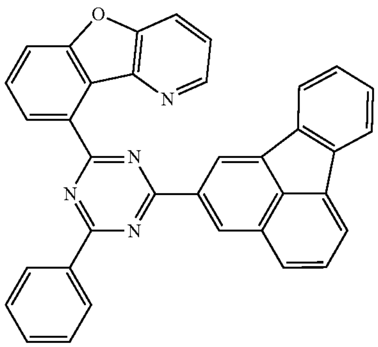
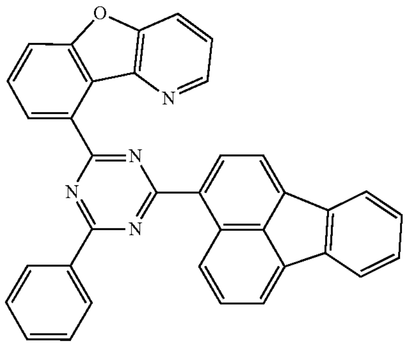

-continued
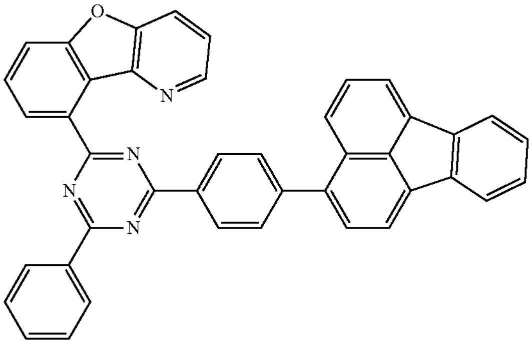
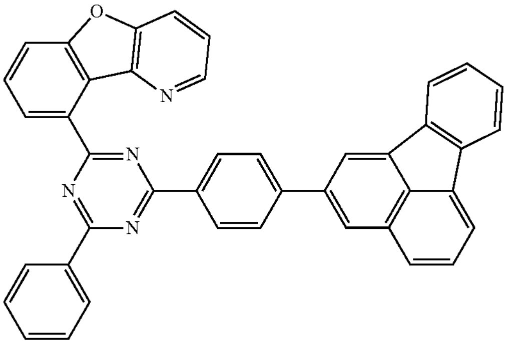
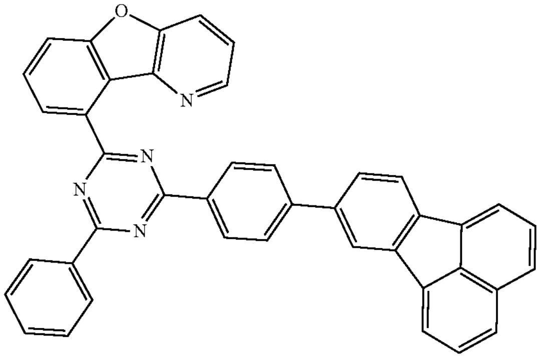
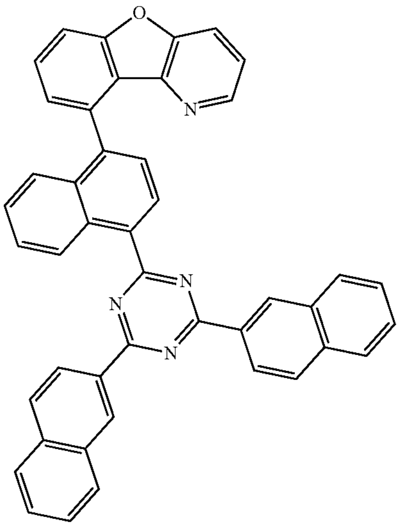
-continued
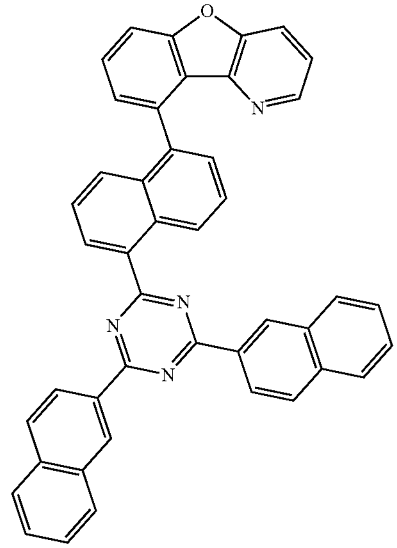
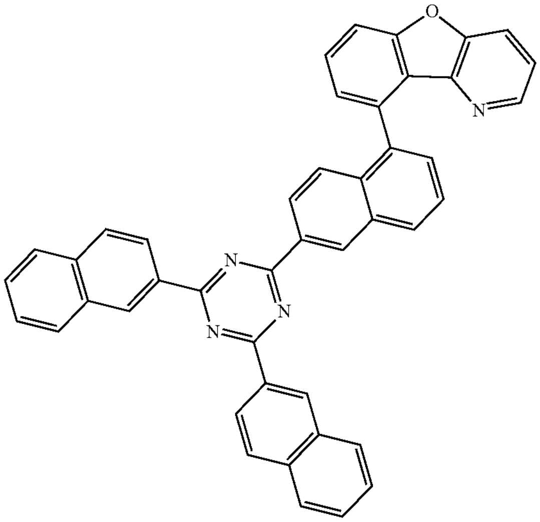
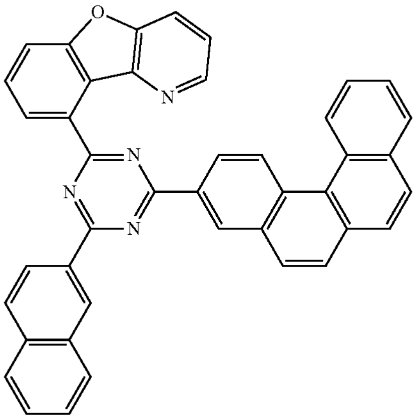

-continued
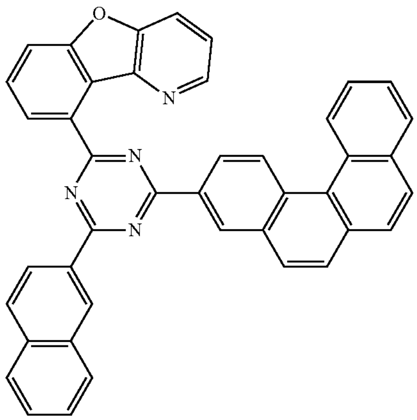
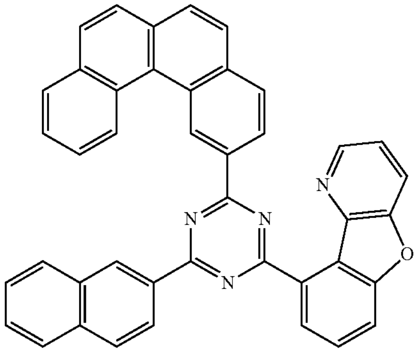
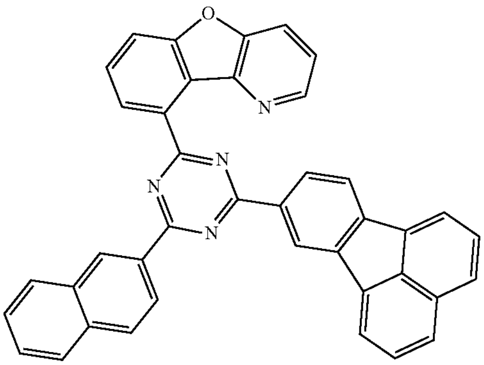
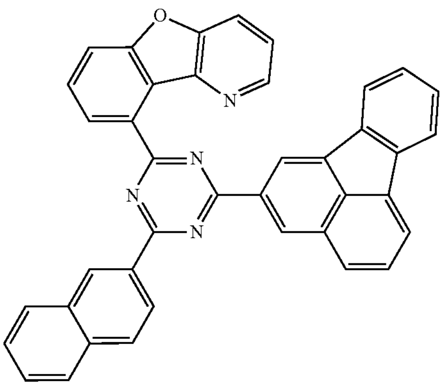
-continued
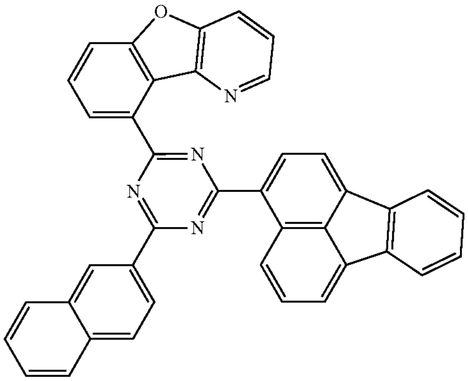
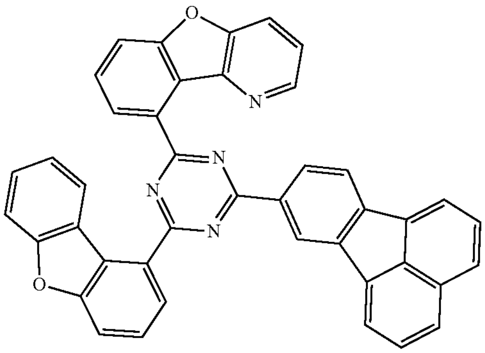
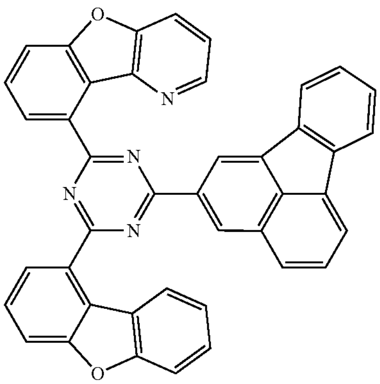
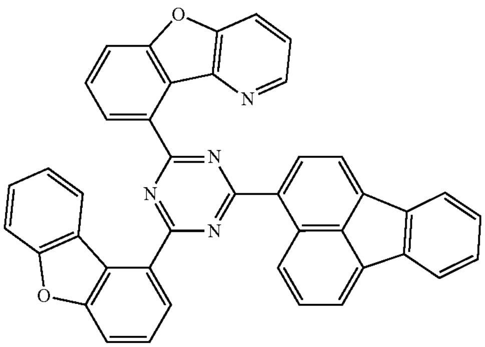

-continued
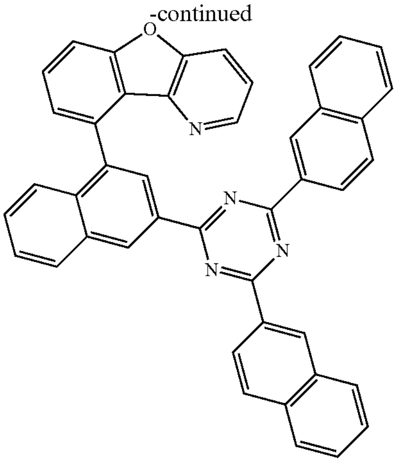
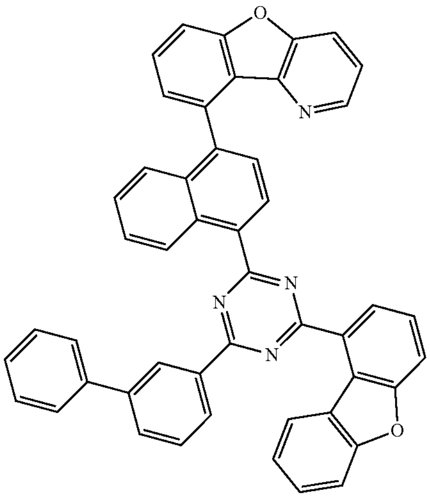
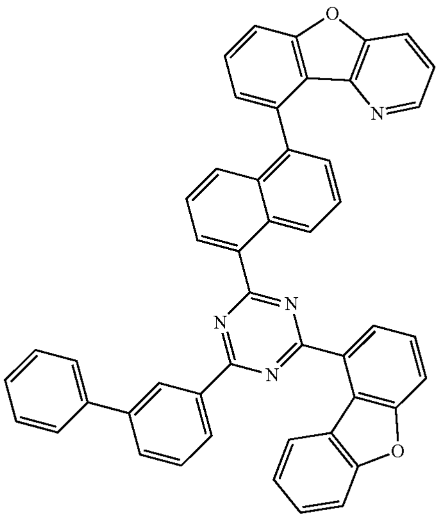
-continued
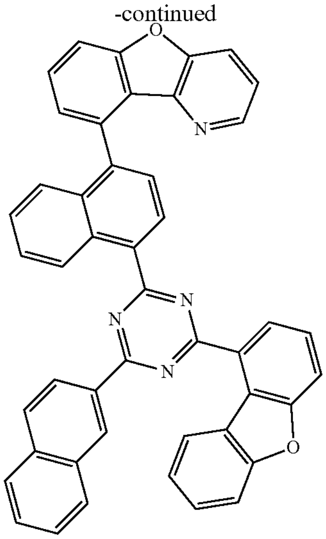
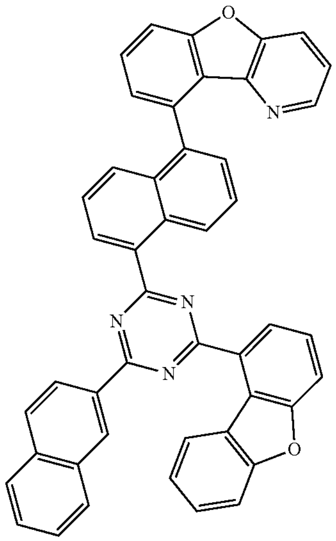
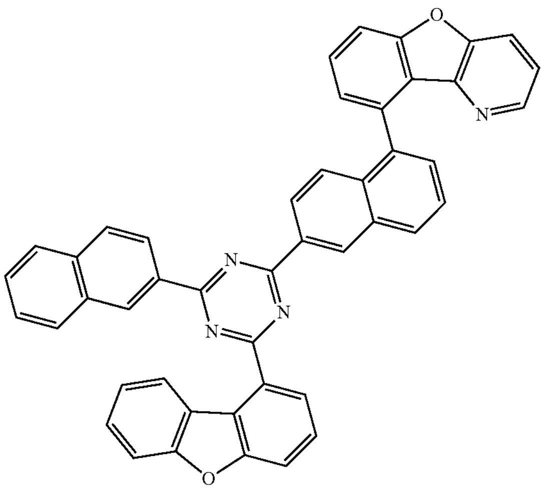

-continued
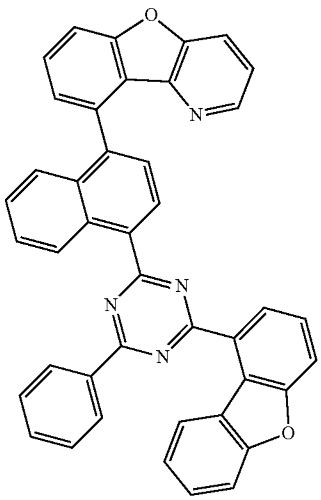
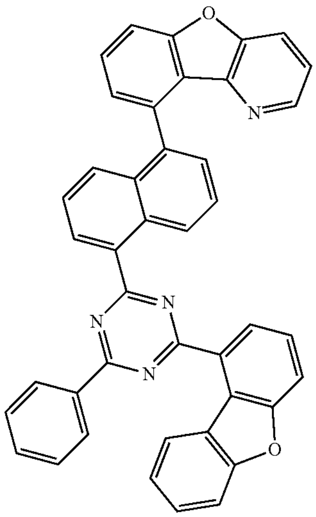
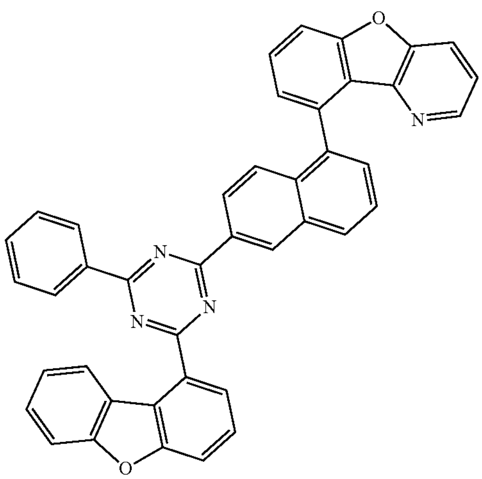
-continued
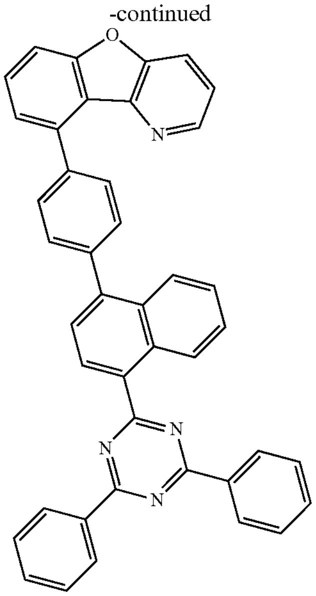
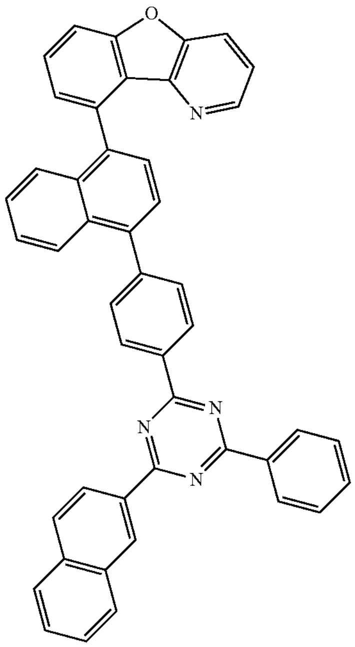
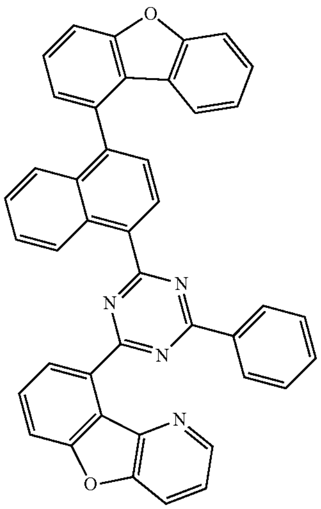

-continued
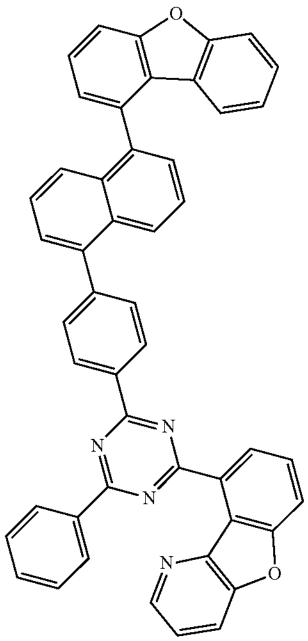
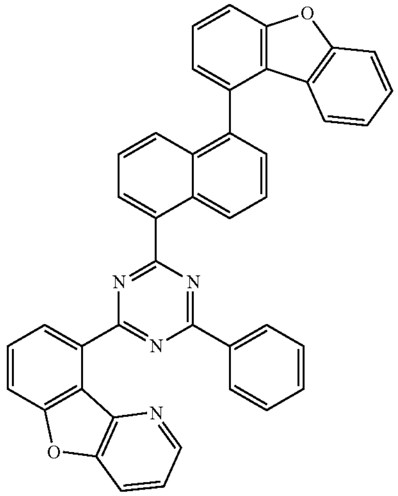
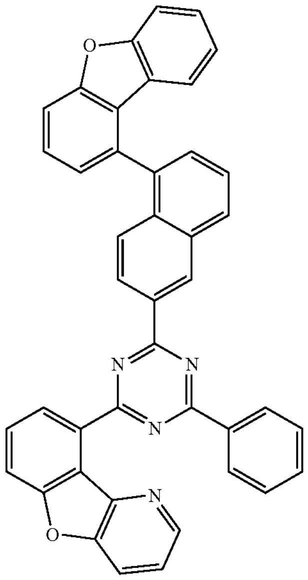
-continued
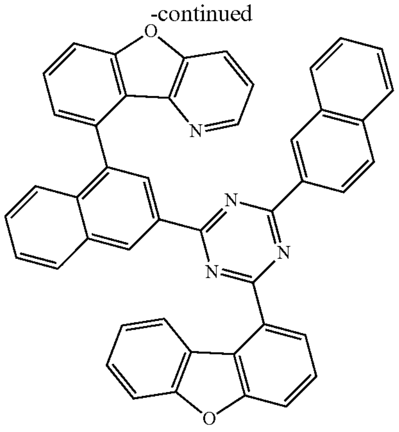
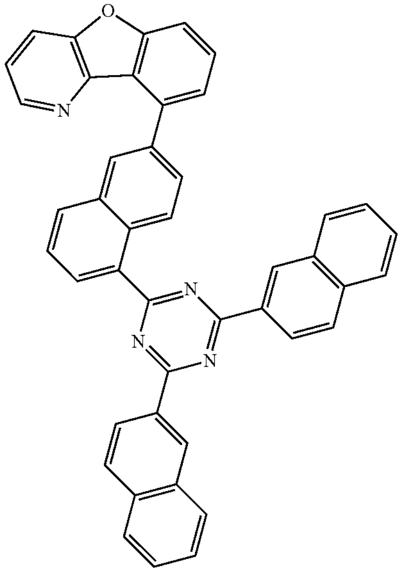
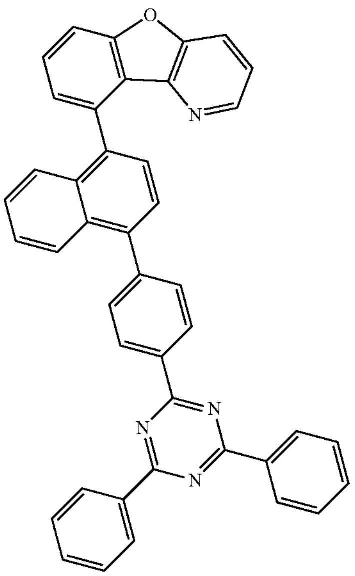

-continued
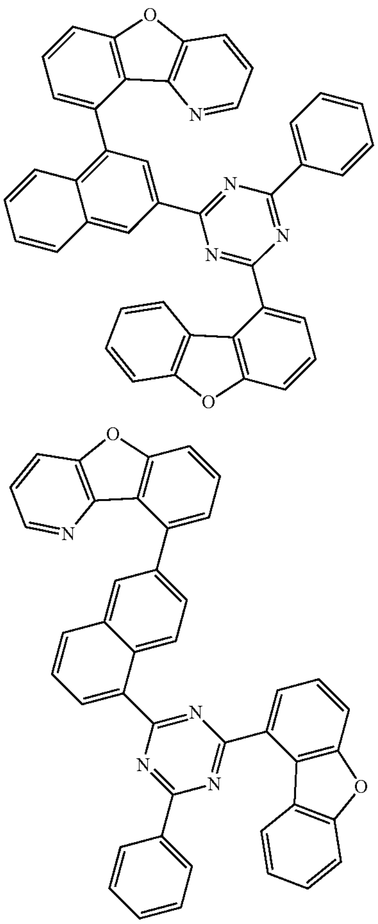
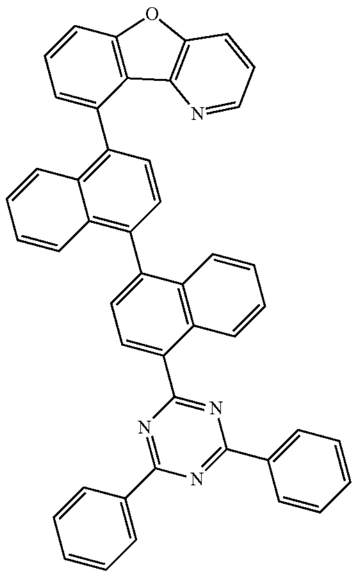
-continued
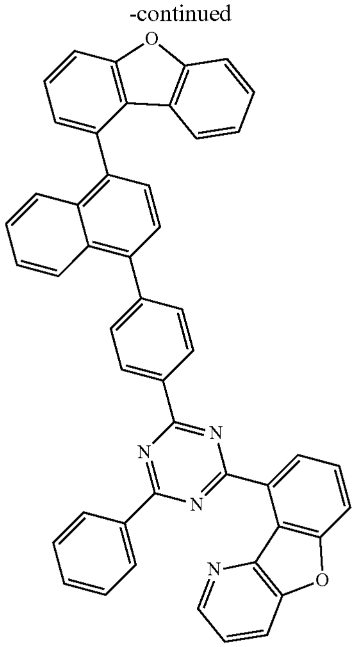
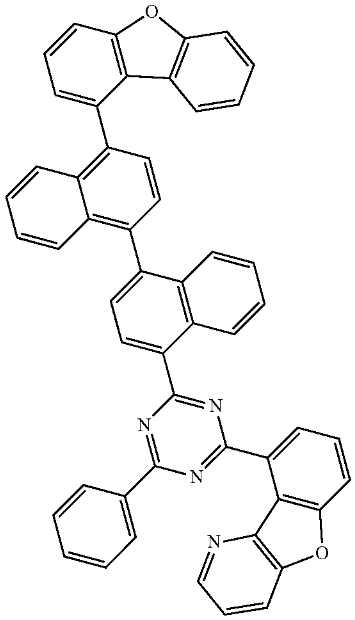

-continued

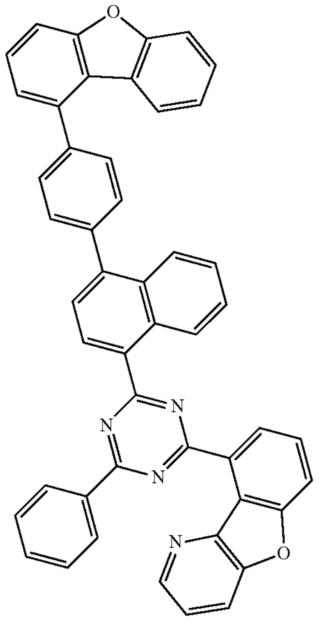

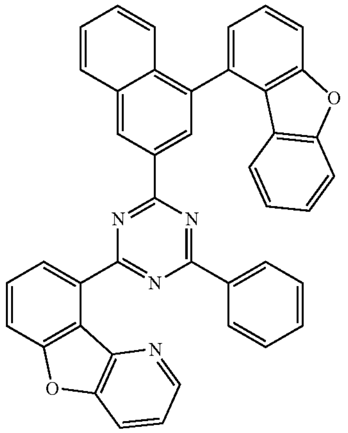

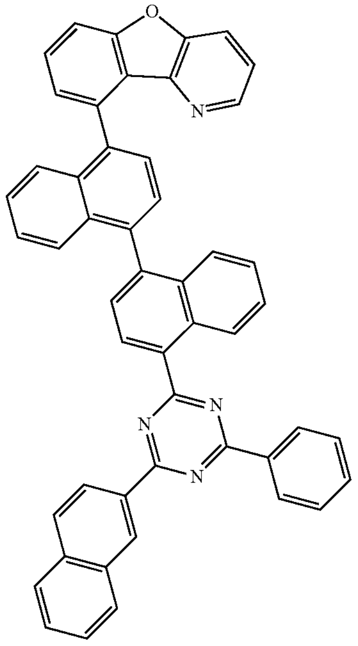

-continued

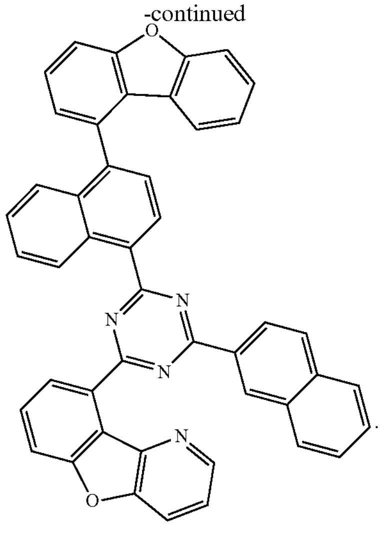

In addition, provided is a preparation method for preparing the compound of Chemical Formula 1.

For example, the compound of Chemical Formula 1 can be prepared by a preparation method as in Reaction Scheme 1 below.

[Rreaction Scheme 1]

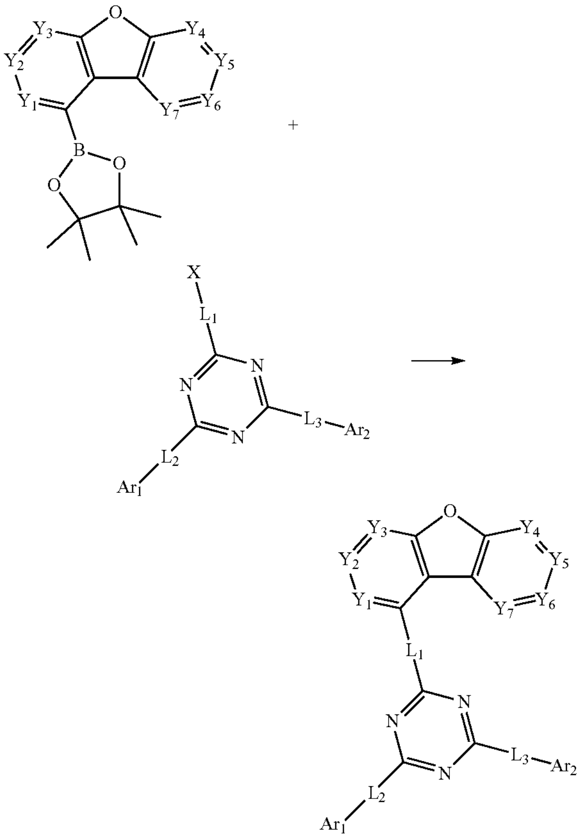

In the above, definitions of other substituents except for X are the same as defined in Chemical Formula 1, and X is halogen, preferably chloro or bromo.

The Reaction Scheme 1 is a Suzuki coupling reaction, and preferably performed in the presence of a palladium catalyst and a base. In addition, the reactive group for the Suzuki coupling reaction can be appropriately changed as known in the art.

The preparation method of the compound of Chemical Formula 1 can be more specifically described in Synthesis Examples described below.

The compound of Chemical Formula 2 includes a carbazole or benzocarbazole core, and an aryl amine substituent bonded thereto. In Chemical Formula 2, one or more hydrogens can be replaced with deuterium.

Preferably, $L'_1$ to $L'_4$ are each independently a single bond or a substituted or unsubstituted $C_{6-20}$ arylene.

Preferably, $L'_1$ to $L'_4$ are each independently a single bond, phenylene, or naphthylene. $L'_1$ to $L'_4$ can each independently be unsubstituted or substituted with at least one deuterium.

Preferably, $Ar'_1$ to $Ar'_3$ are each independently a substituted or unsubstituted $C_{6-20}$ aryl or a substituted or unsubstituted $C_{2-20}$ heteroaryl containing at least one heteroatom selected from the group consisting of N, O and S.

Preferably, $Ar'_1$ to $Ar'_3$ are each independently phenyl, biphenylyl, terphenylyl, naphthyl, dibenzofuranyl, dibenzothiophenyl, or 9,9-dimethylfluorenyl.

$Ar'_1$ to $Ar'_3$ can each independently be unsubstituted or substituted with at least one deuterium.

Preferably, $L'_1$ is a single bond or phenylene; and $Ar'_1$ is phenyl, biphenylyl, terphenylyl, or naphthyl. $L'_1$ and $Ar'_1$ can each independently be unsubstituted or substituted with at least one deuterium.

Preferably, $L'_2$ to $L'_4$ are each independently a single bond, phenylene, or naphthylene; and $Ar'_2$ and $Ar'_3$ are each independently phenyl, biphenylyl, terphenylyl, naphthyl, dibenzofuranyl, dibenzothiophenyl, or 9,9-dimethylfluorenyl. $L'_2$ to $L'_4$ and $Ar'_2$ and $Ar'_3$ can each independently be unsubstituted or substituted with at least one deuterium.

Preferably, $L'_2$ is a single bond or phenylene; $L'_3$ and $L'_4$ are each independently a single bond, phenylene, or naphthylene; and $Ar'_2$ and Ar’s are each independently phenyl; biphenylyl; terphenylyl; naphthyl; dibenzofuranyl; dibenzothiophenyl; or 9,9-dimethylfluorenyl. $L'_2$ to $L'_4$ and $Ar'_2$ and $Ar'_3$ can each independently be unsubstituted or substituted with at least one deuterium.

The compound of Chemical Formula 2 may not include deuterium or may include at least one deuterium.

For example, when the compound of Chemical Formula 2 includes deuterium, a deuterium substitution rate of the compound can be 1% to 100%. Specifically, the deuterium substitution rate of the compound can be 5% or more, 10% or more, 20% or more, 30% or more, 40% or more, 50% or more, 60% or more, 70% or more, 75% or more, 80% or more, or 90% or more and 100% or less.

Representative examples of the compound of Chemical Formula 2 are as follows:

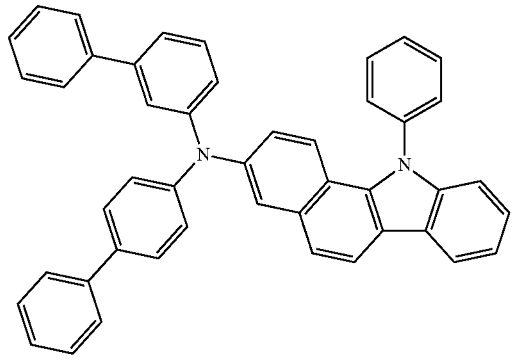

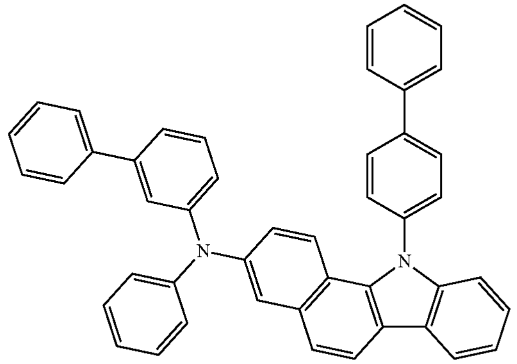

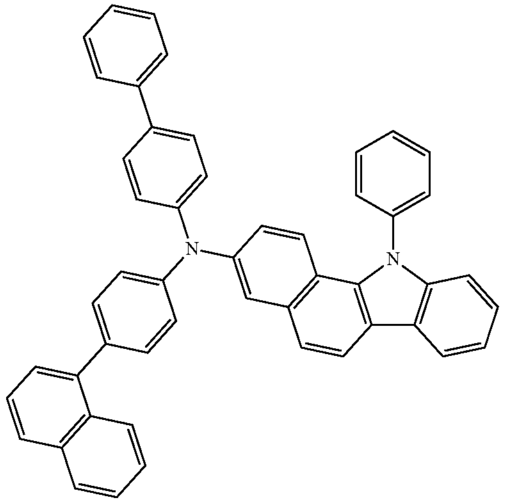

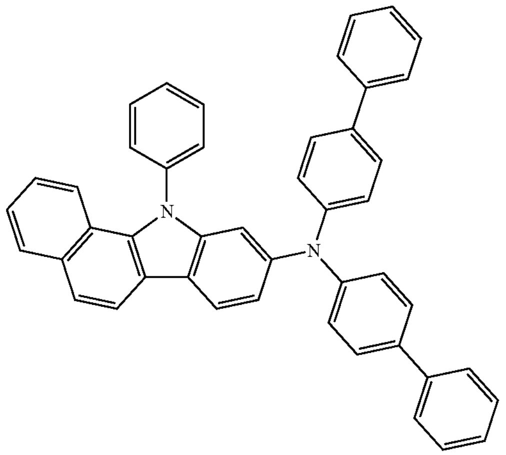

-continued
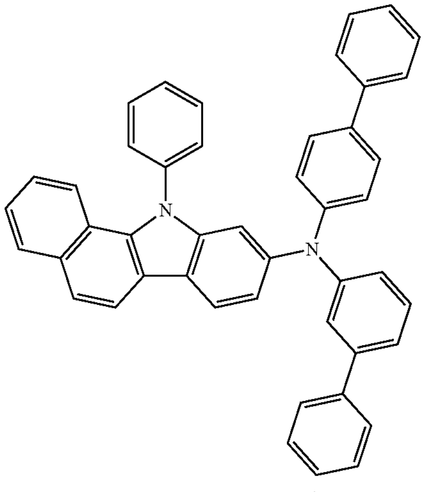
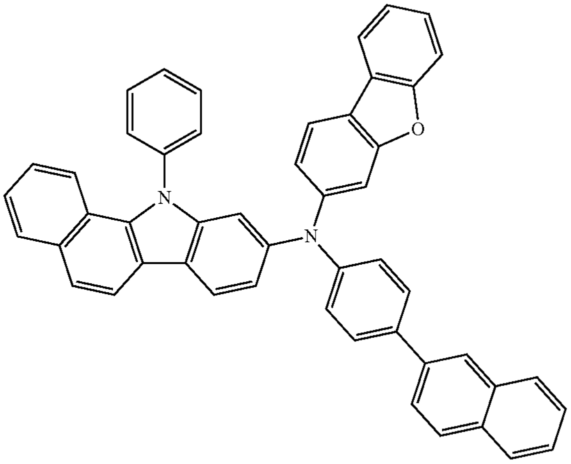
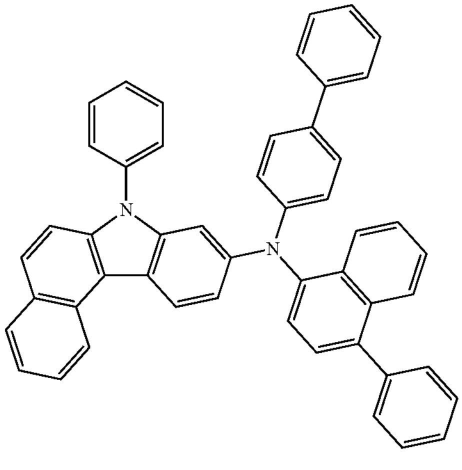
-continued
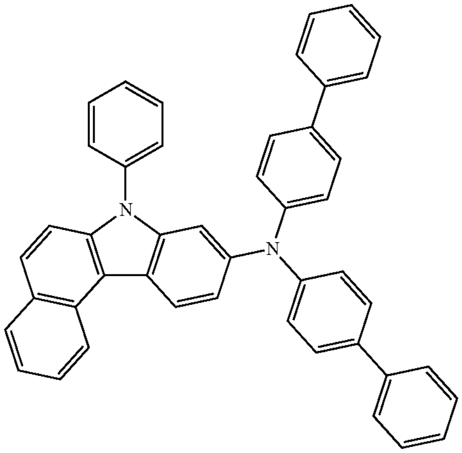
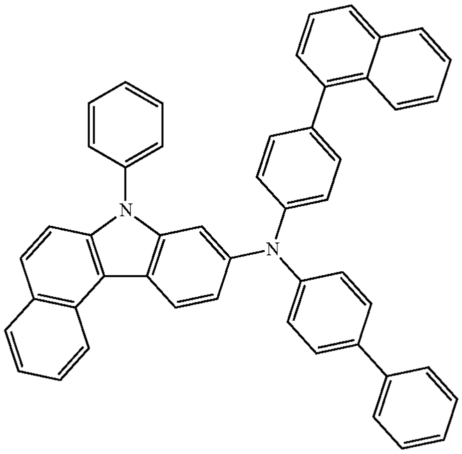
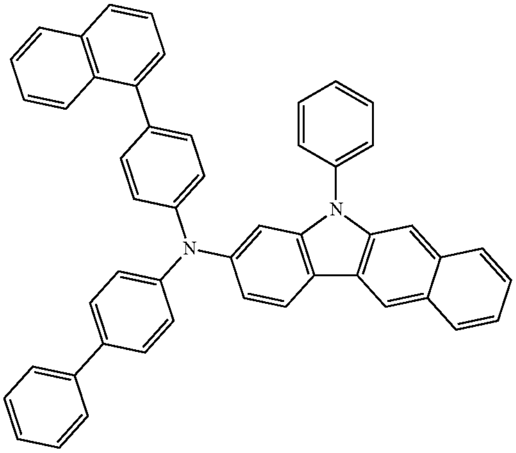

-continued
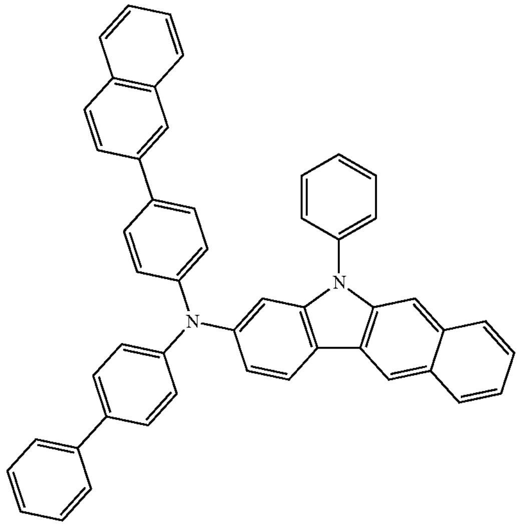
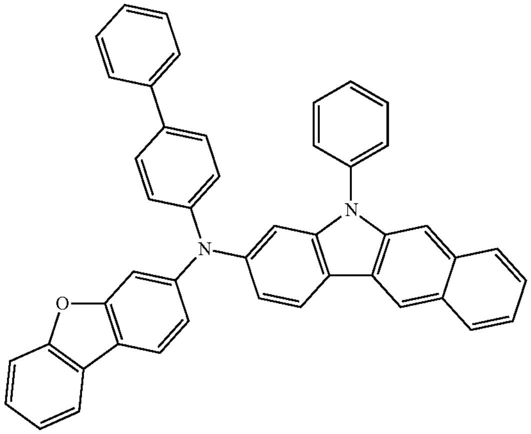
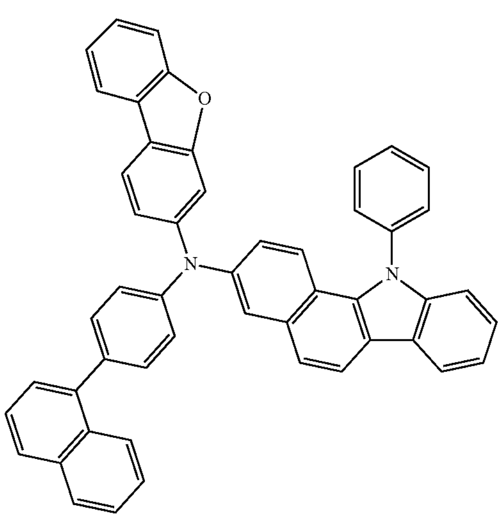
-continued
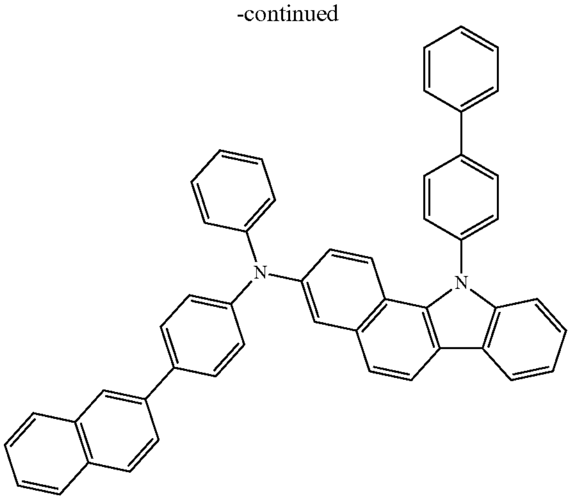
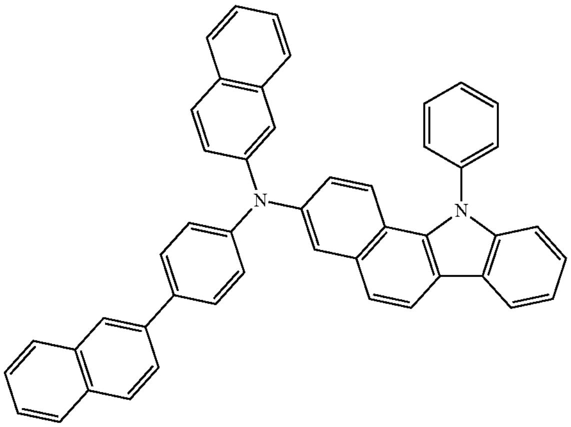
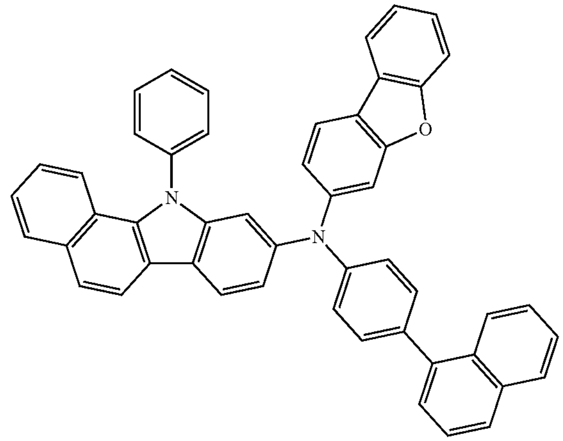

-continued
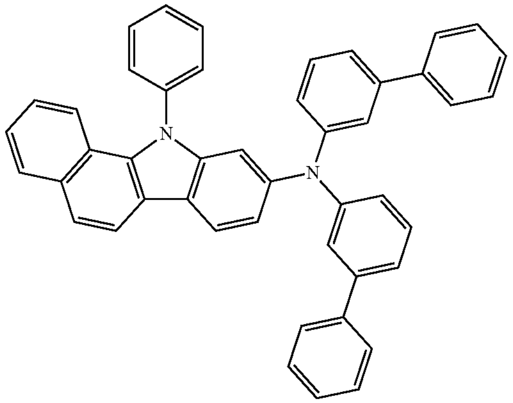
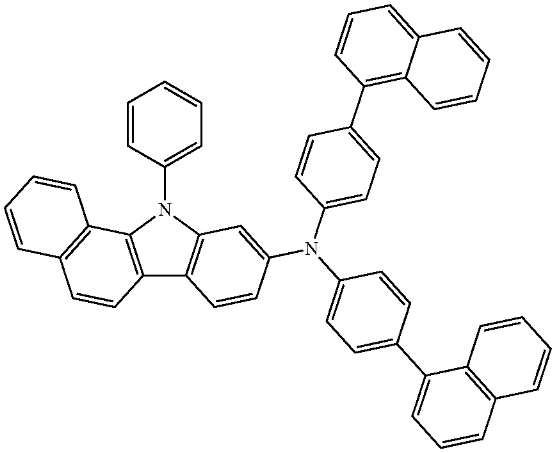
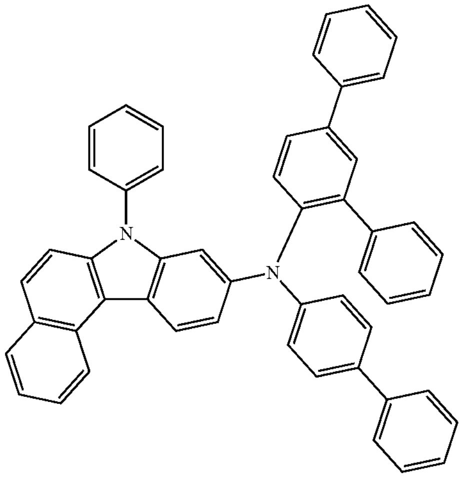
-continued
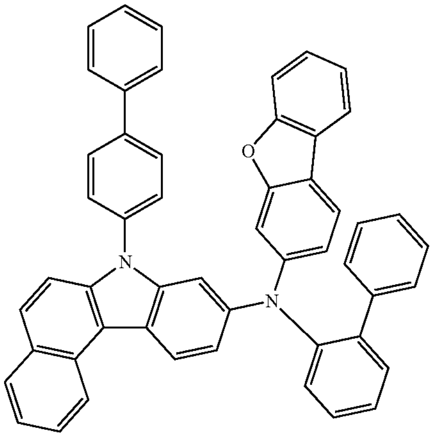
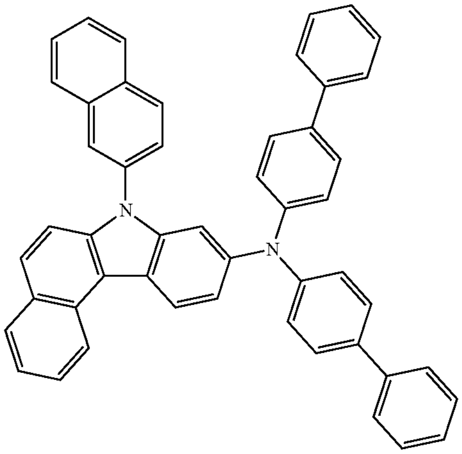
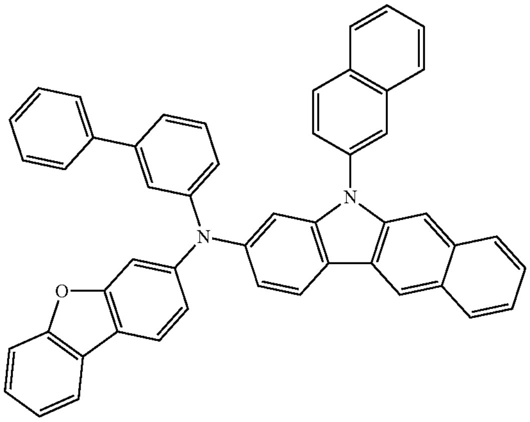
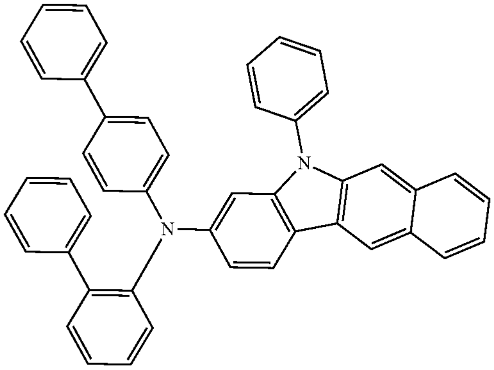

-continued
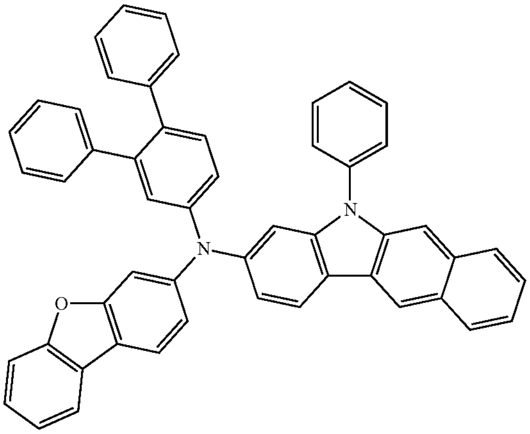
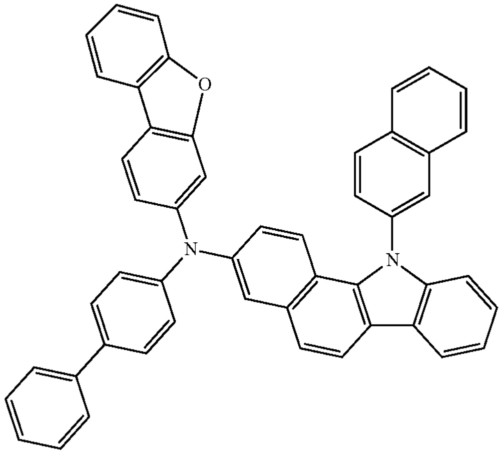
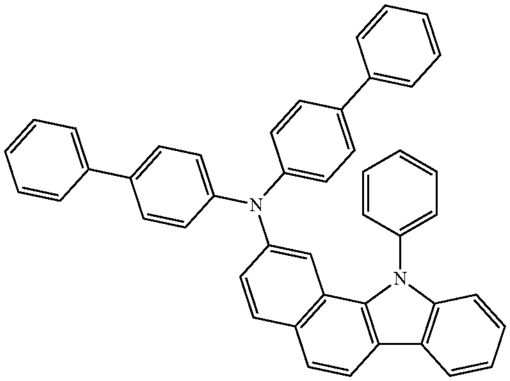
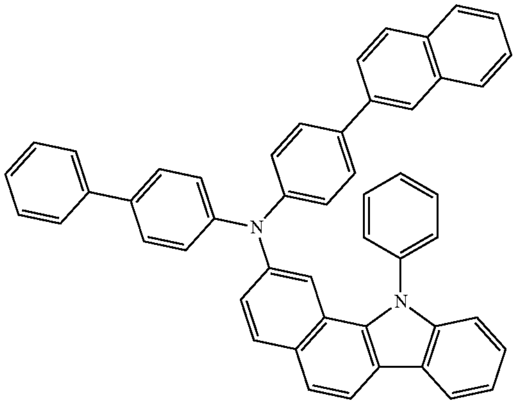
-continued
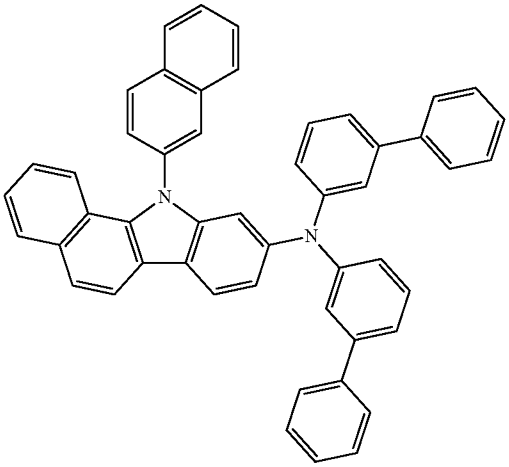
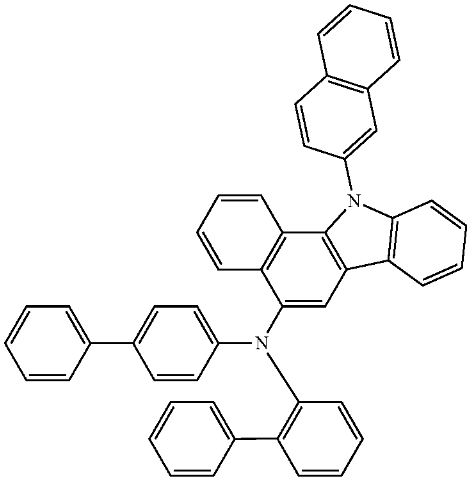
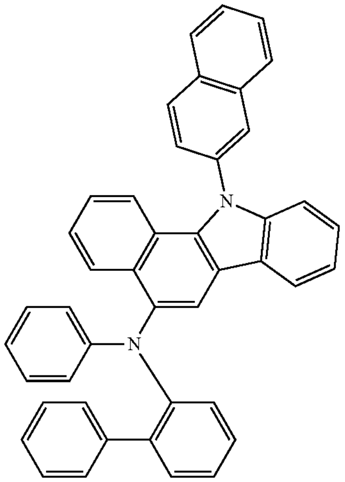

-continued
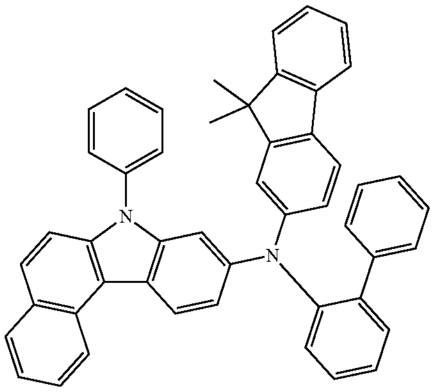
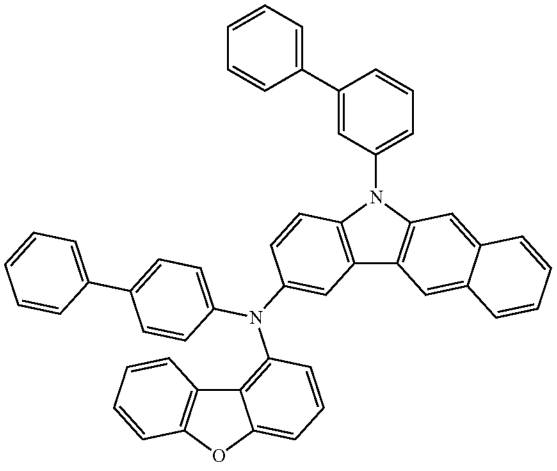
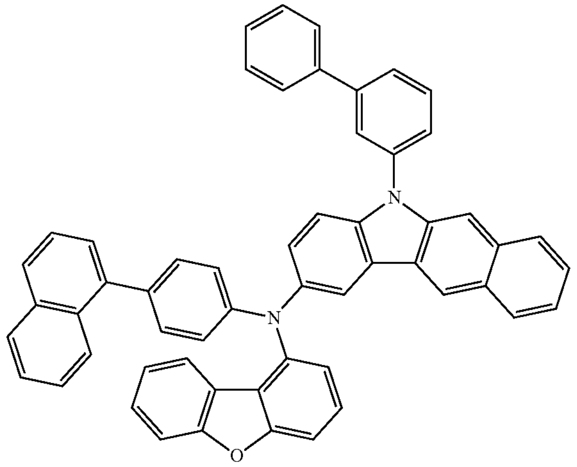
-continued
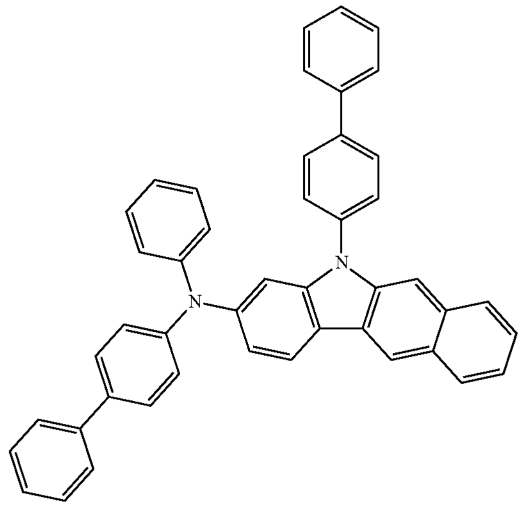
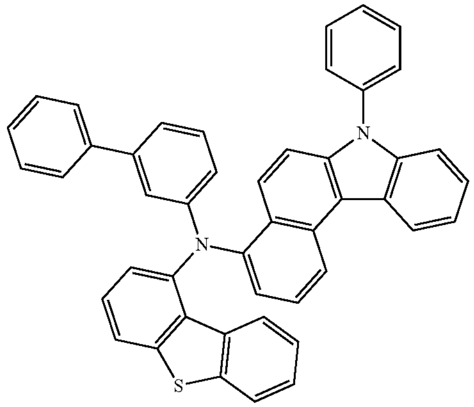
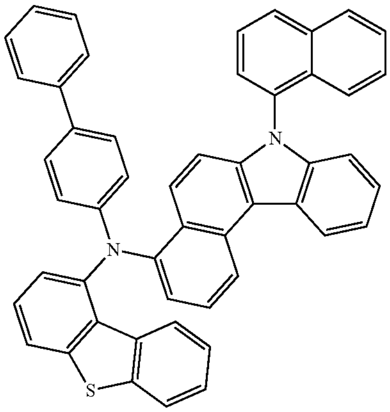
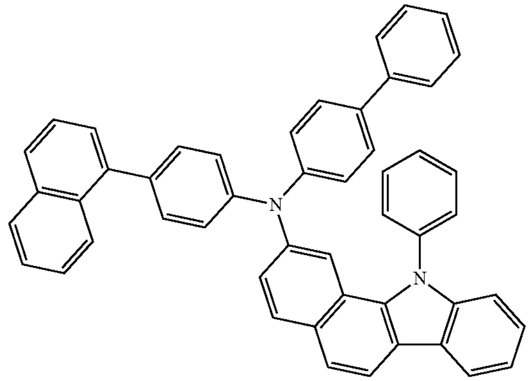

-continued
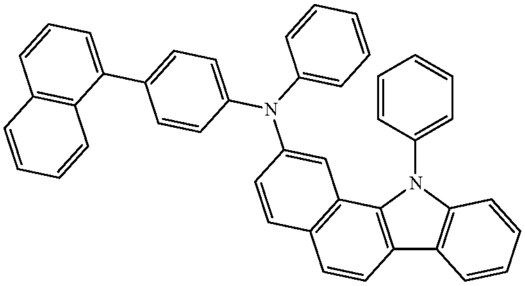
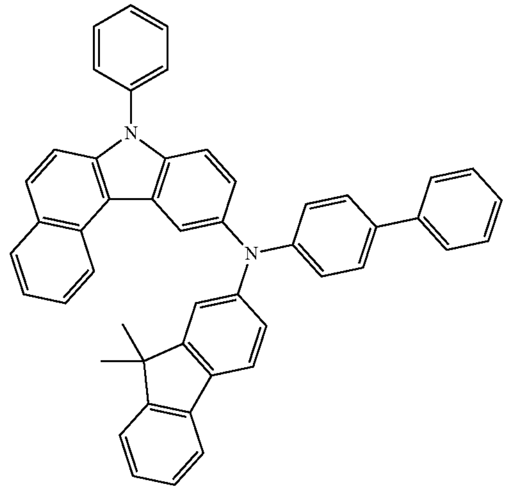
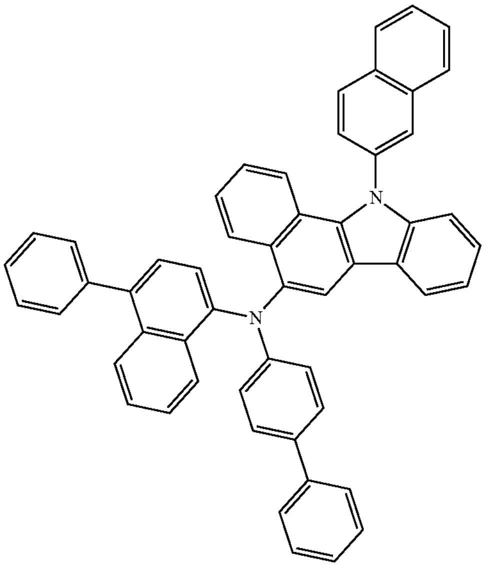
-continued
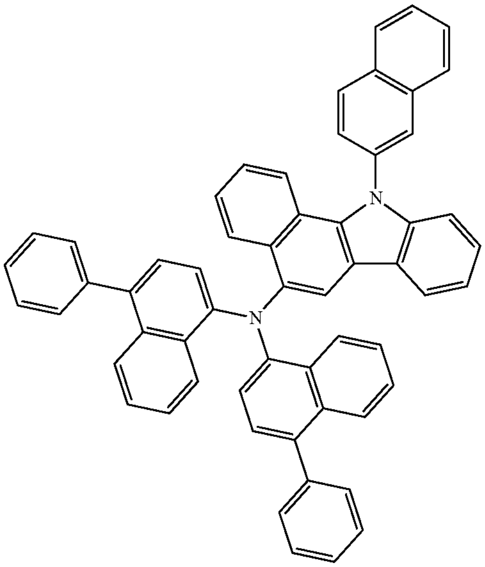
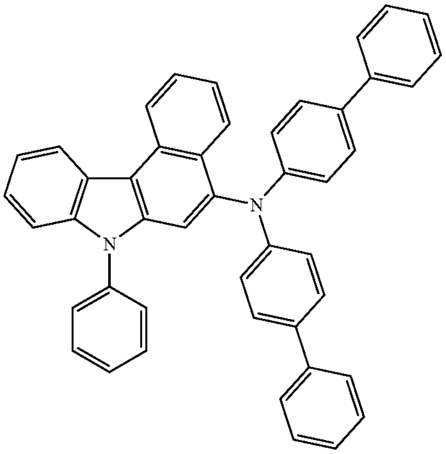
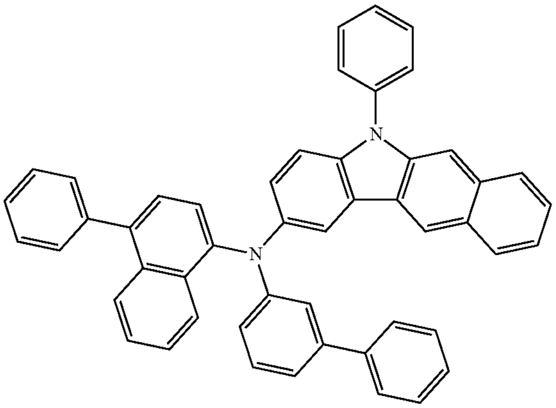

-continued
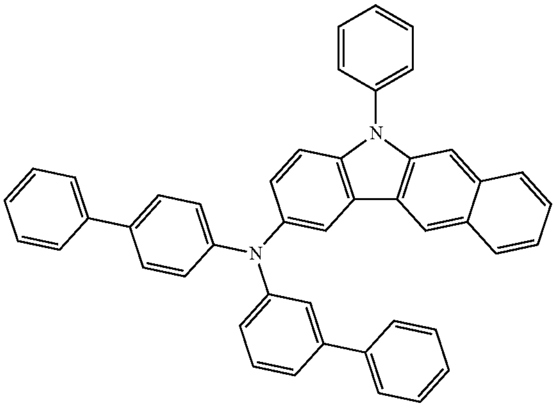
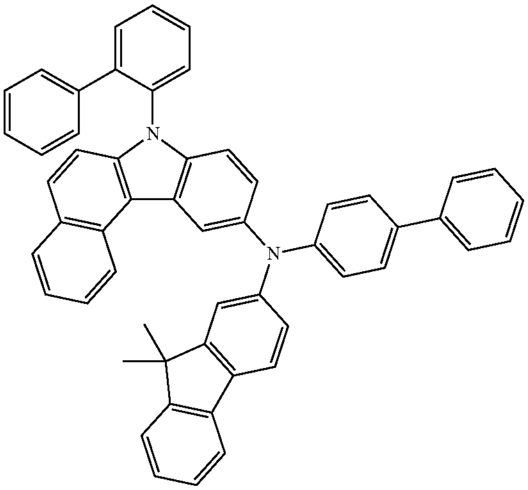
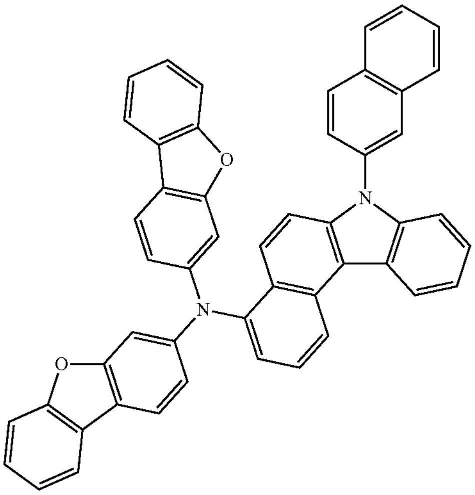
-continued
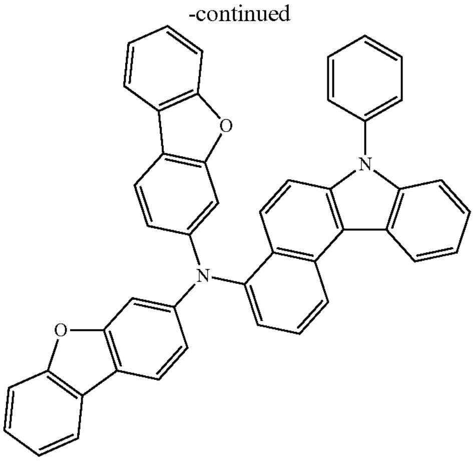
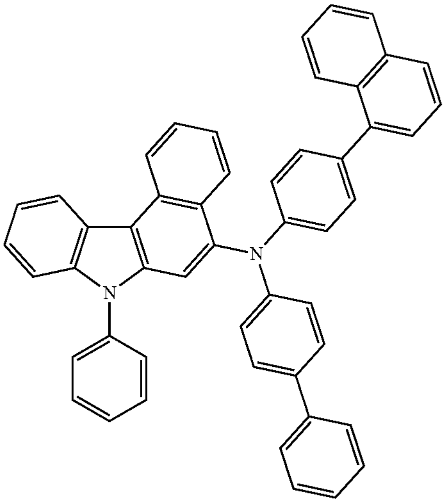
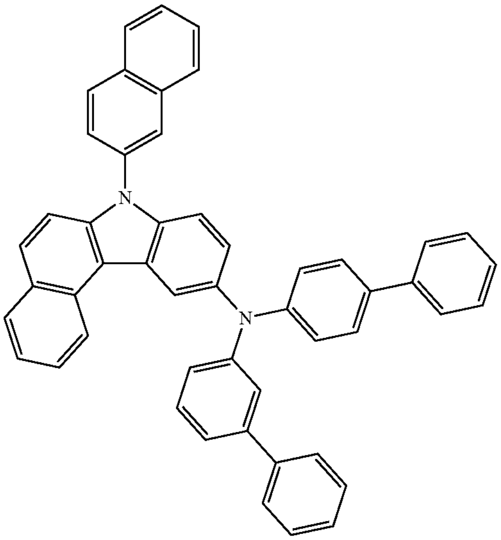

-continued
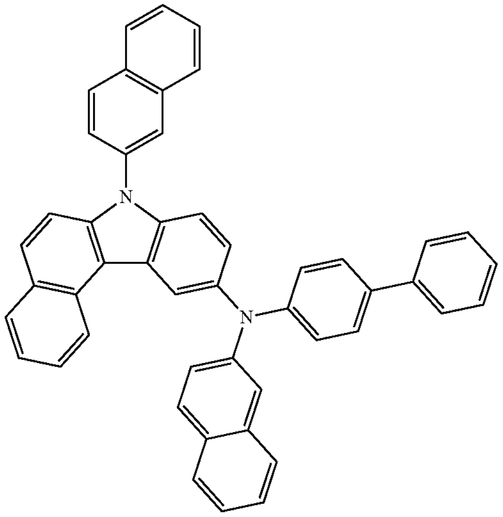
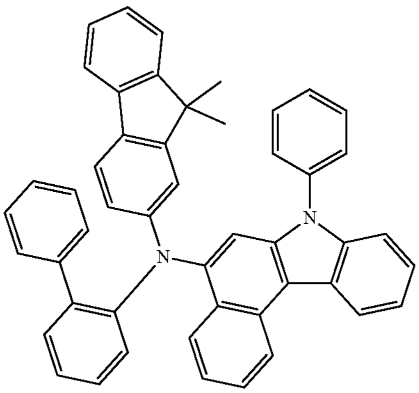
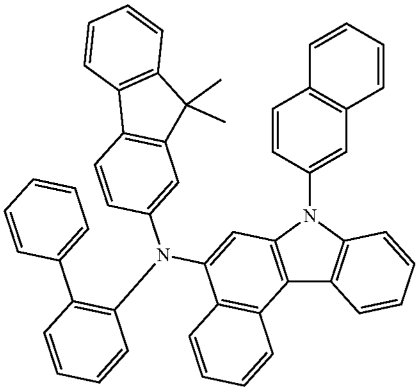
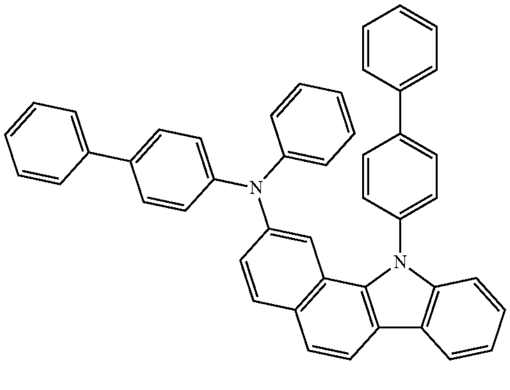
-continued
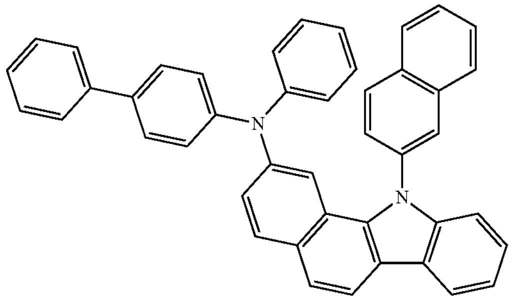
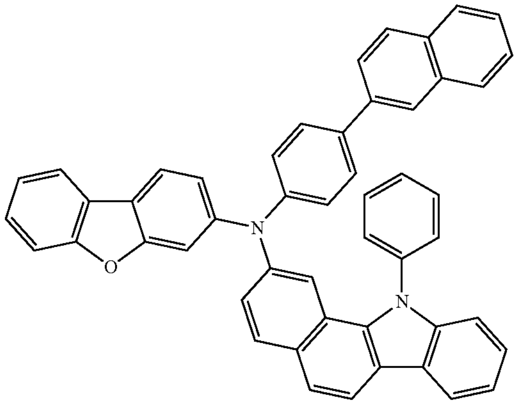
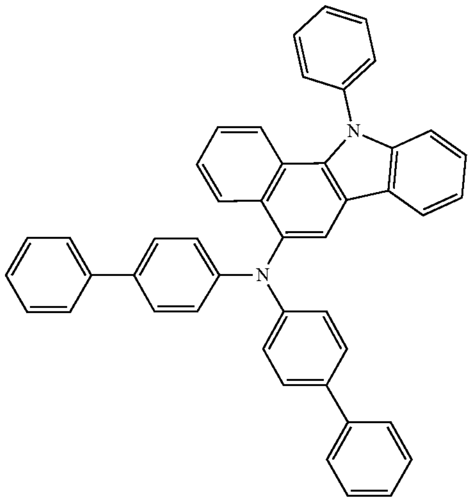
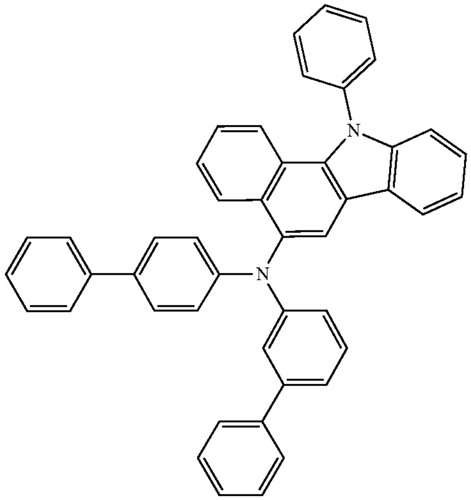

-continued
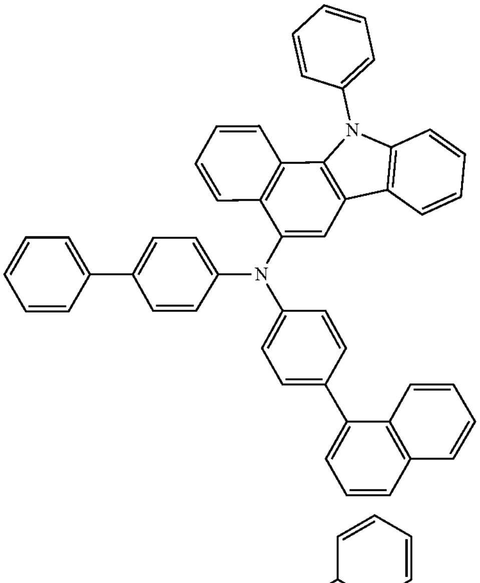
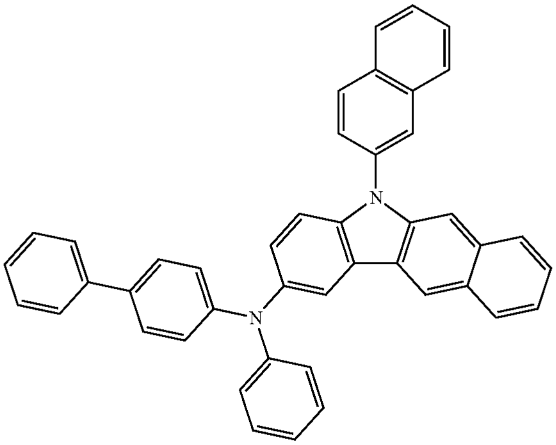
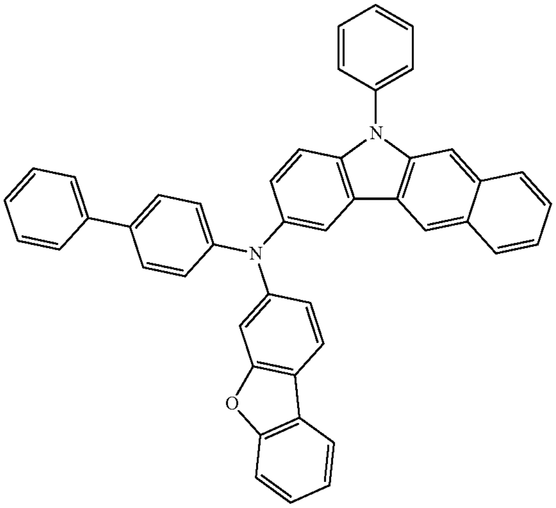
-continued
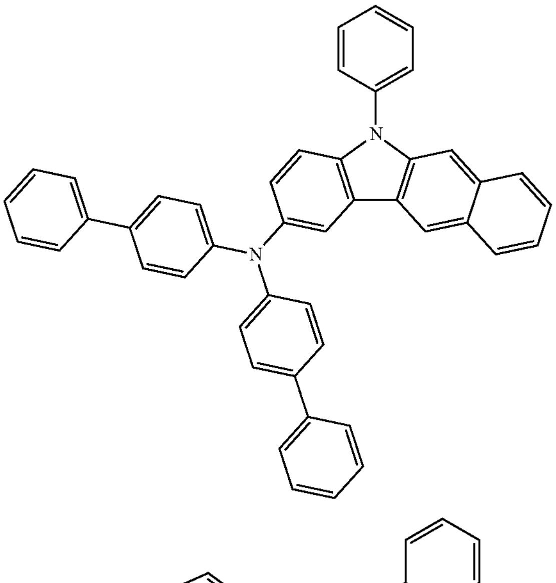
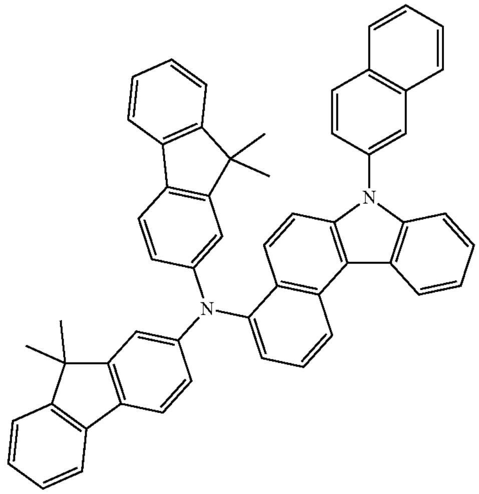
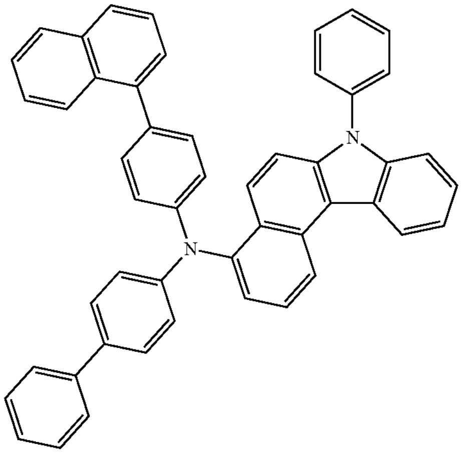

-continued
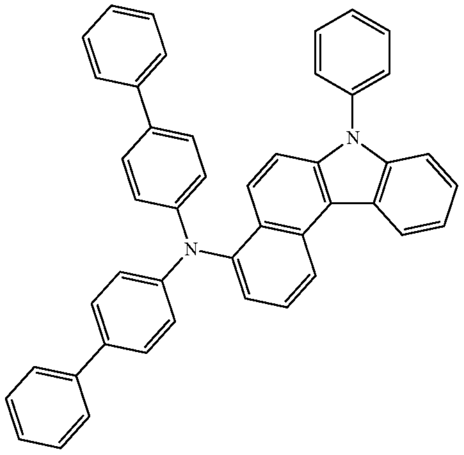
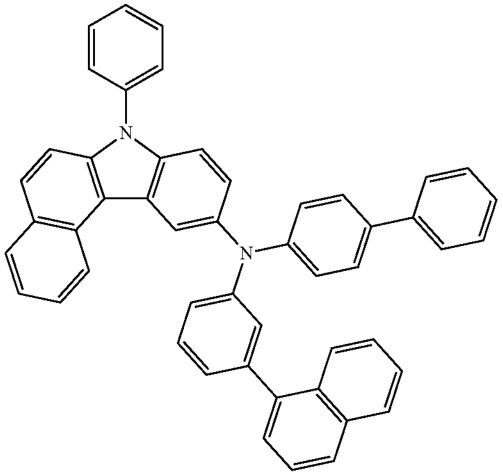
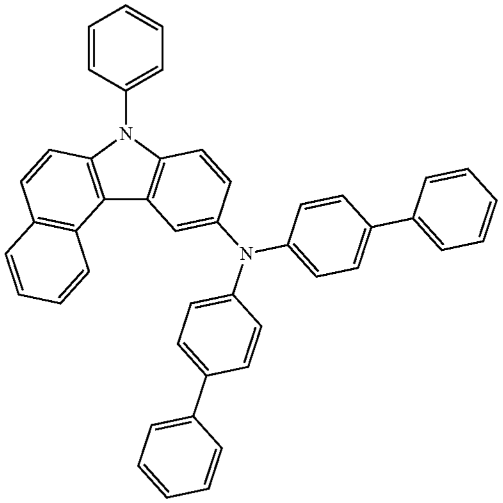
-continued
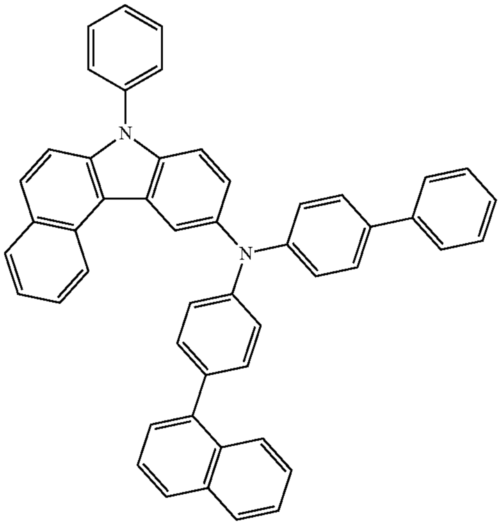
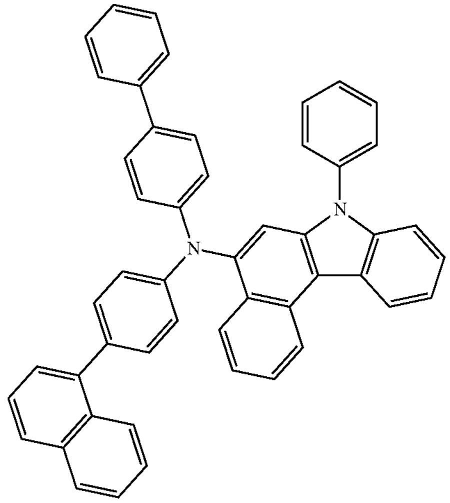
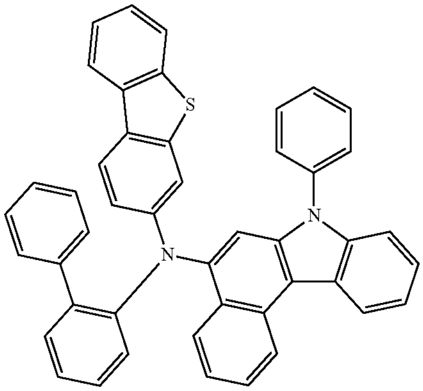

-continued
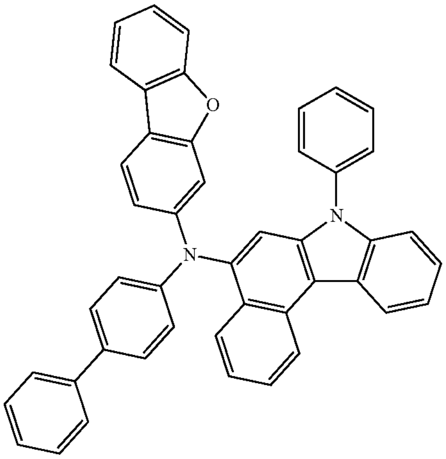
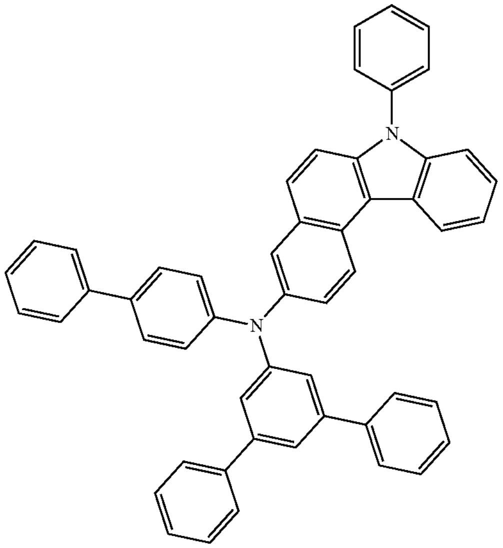
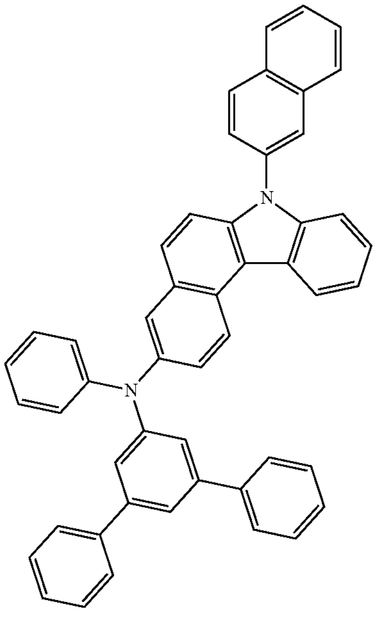
-continued
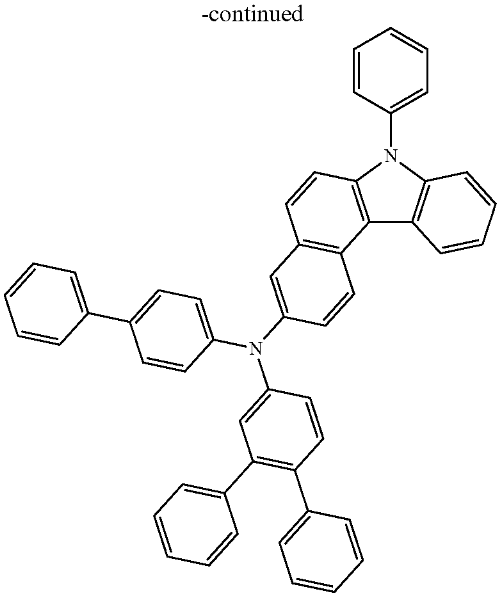
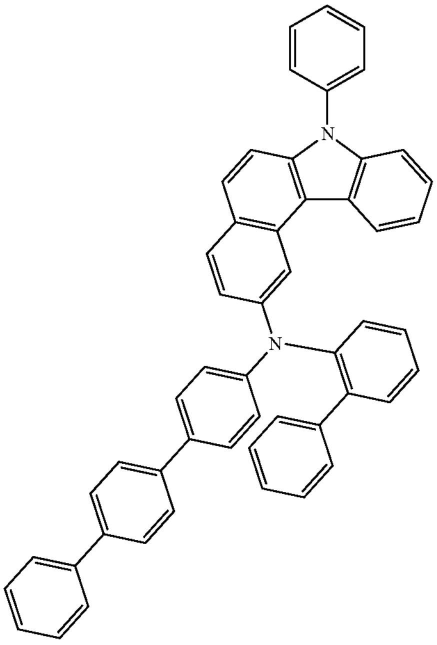

-continued
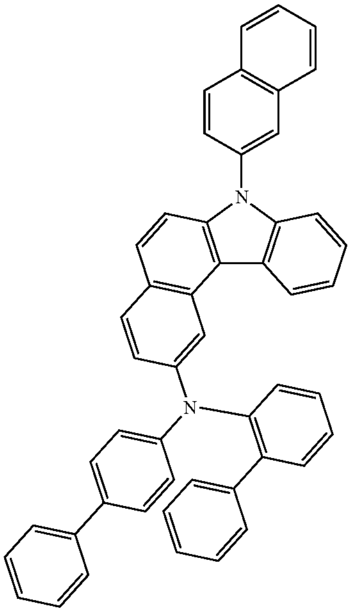
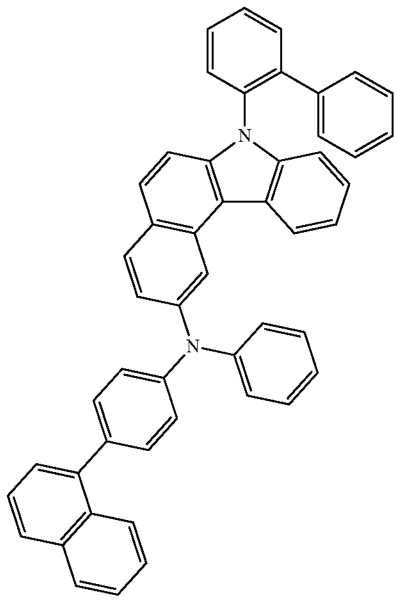
-continued
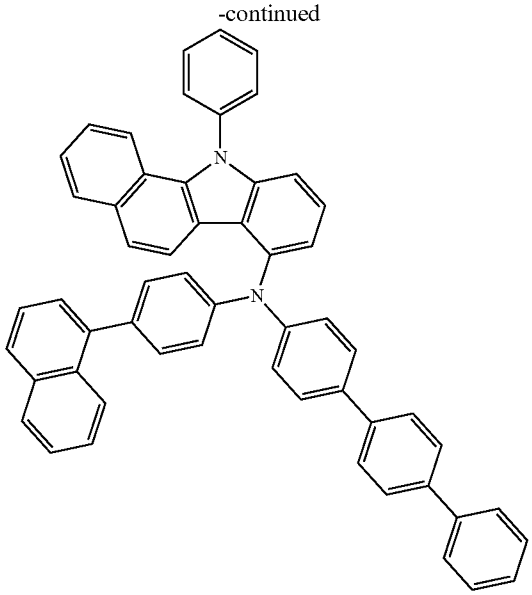
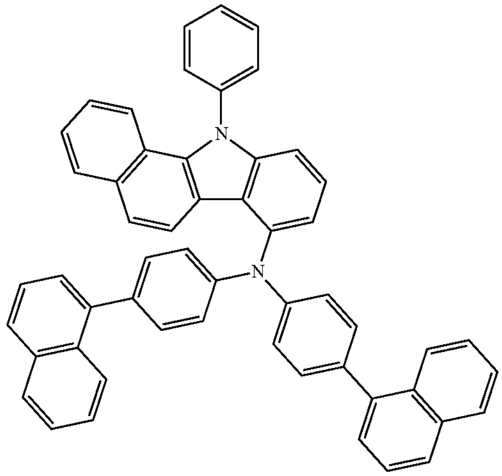
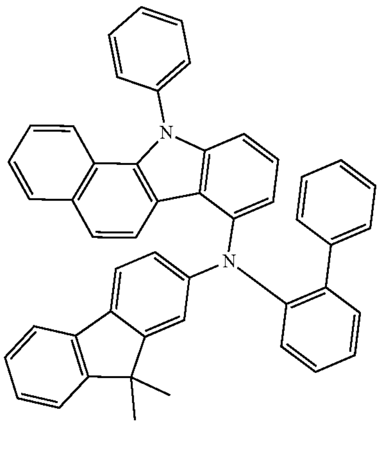

-continued
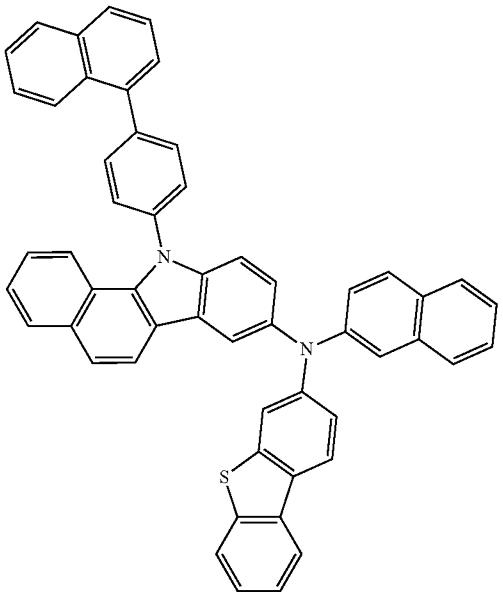
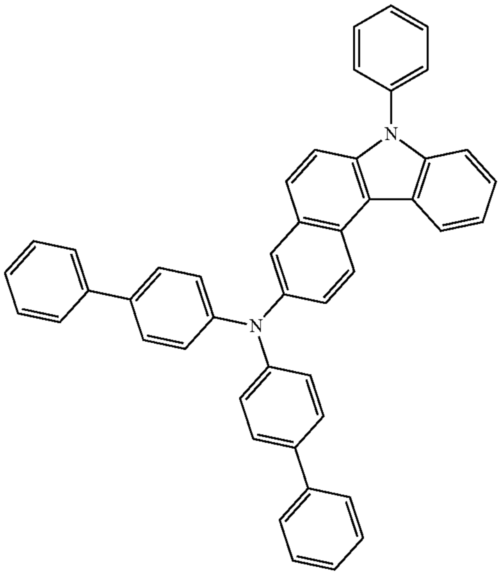
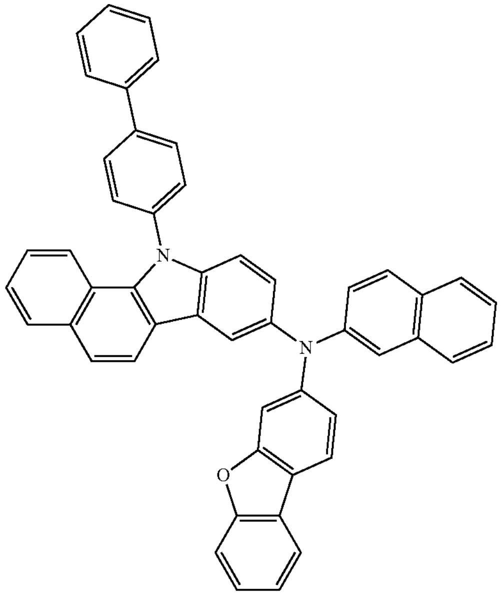
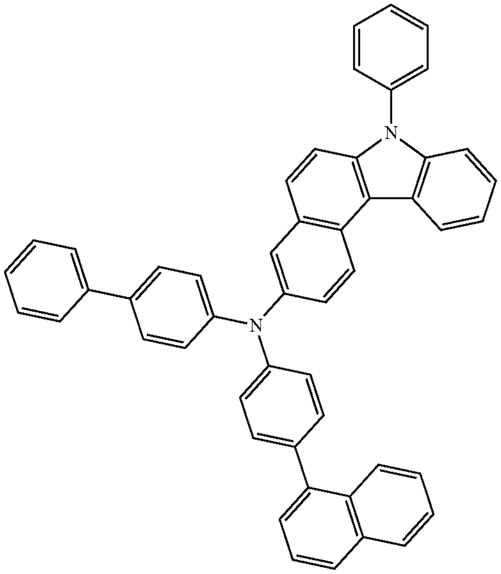
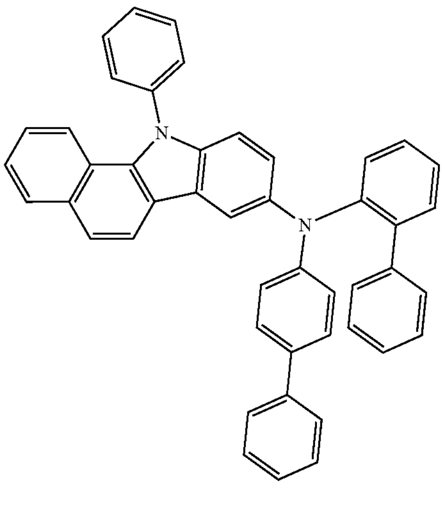
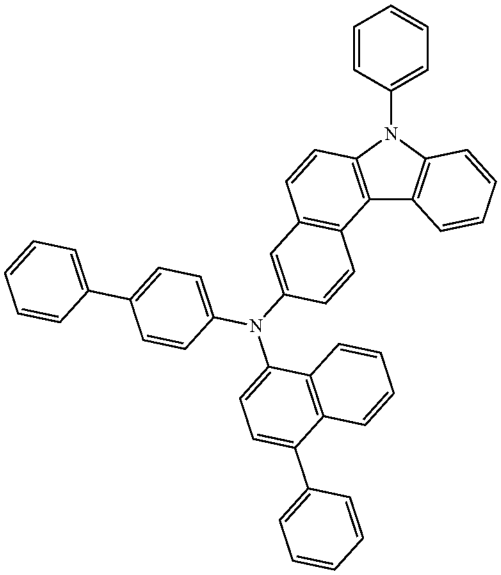

-continued
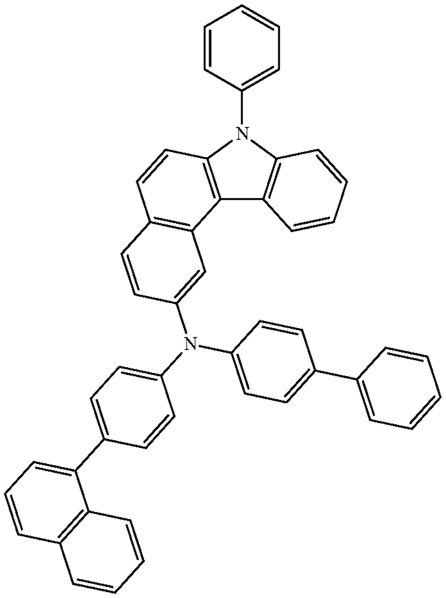
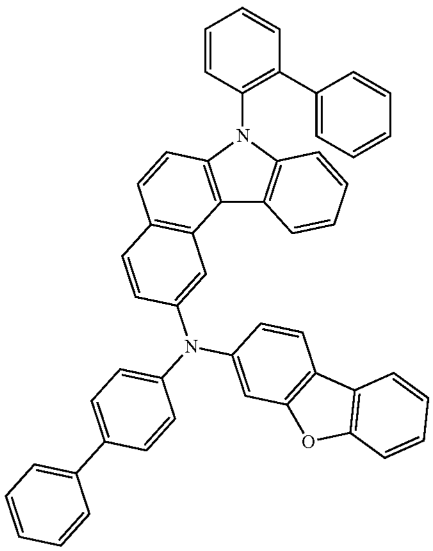
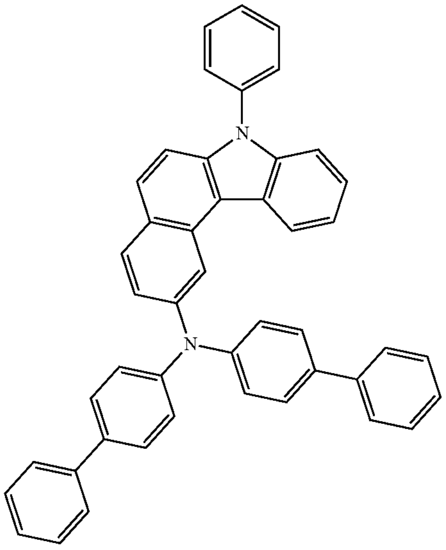
-continued
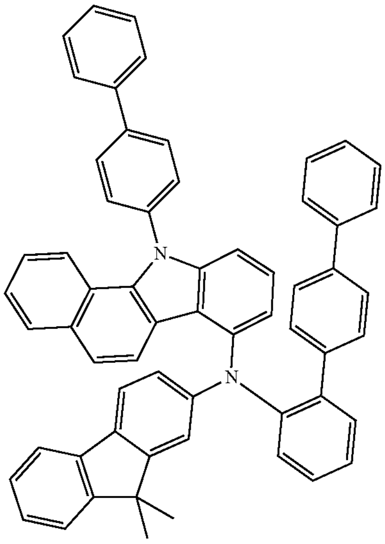
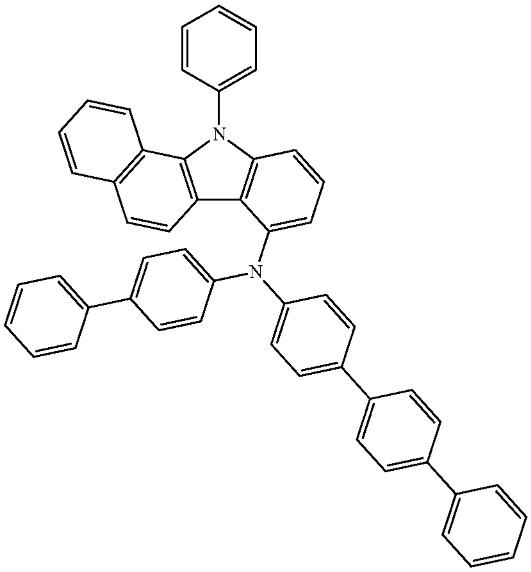
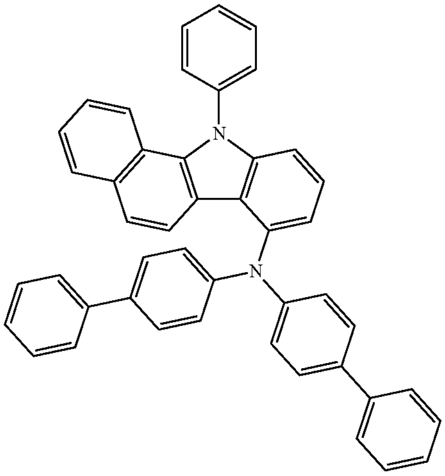

-continued
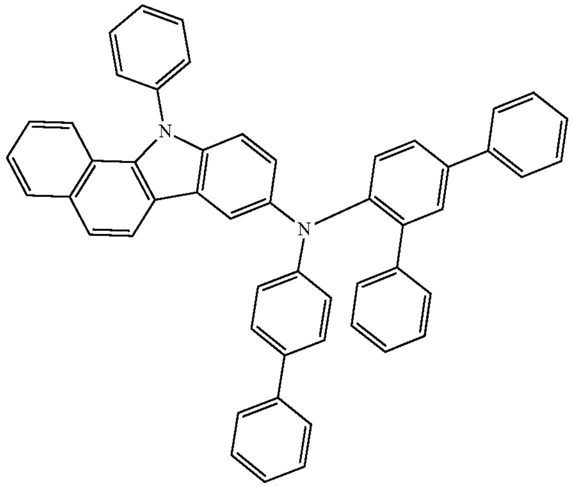
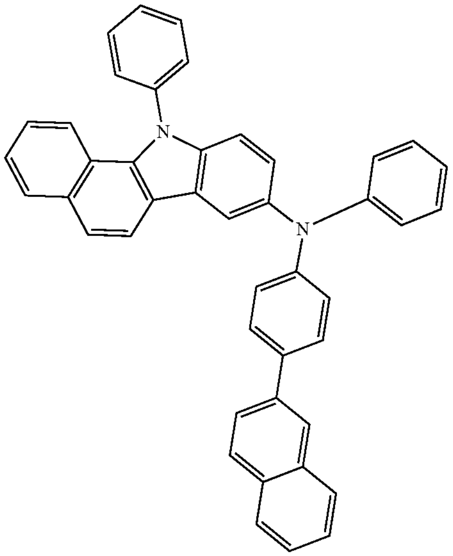
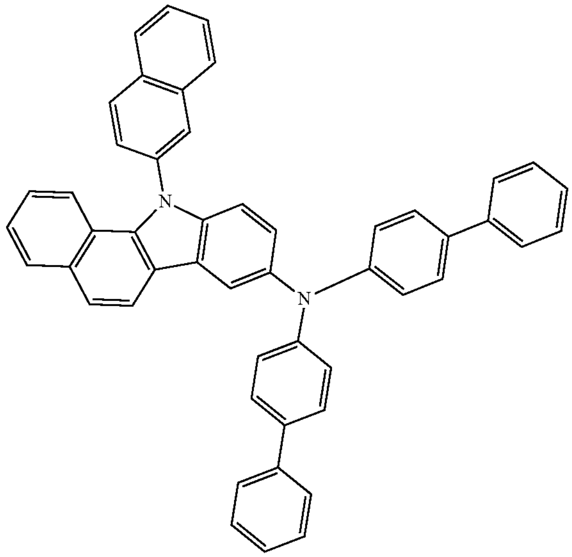
-continued
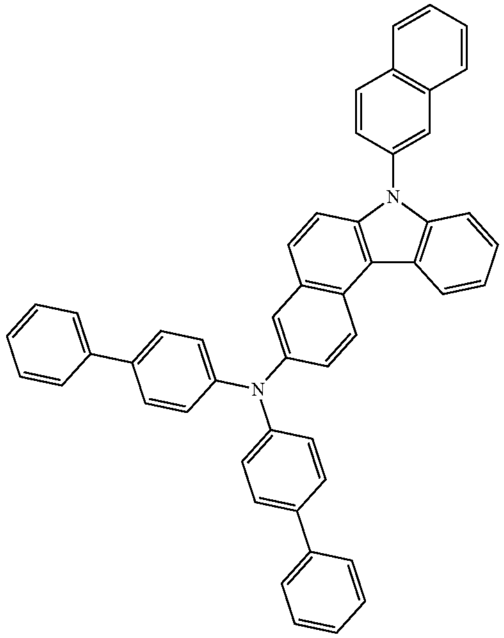
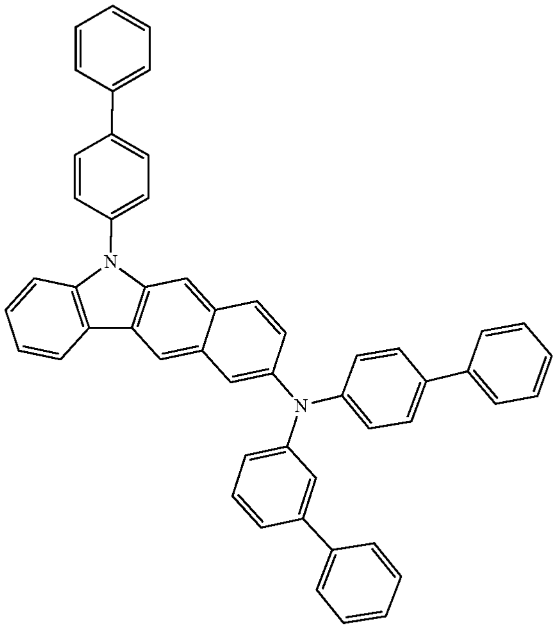

-continued
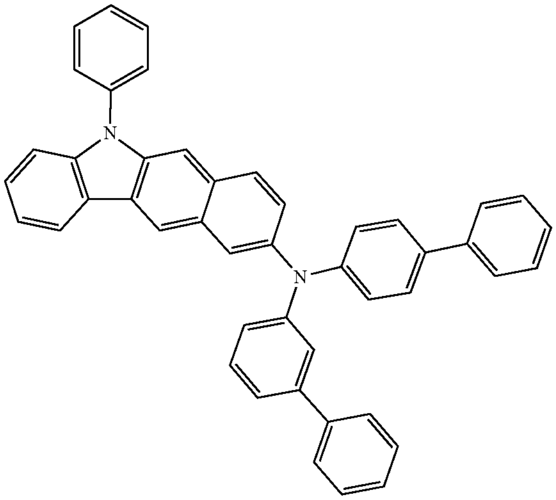
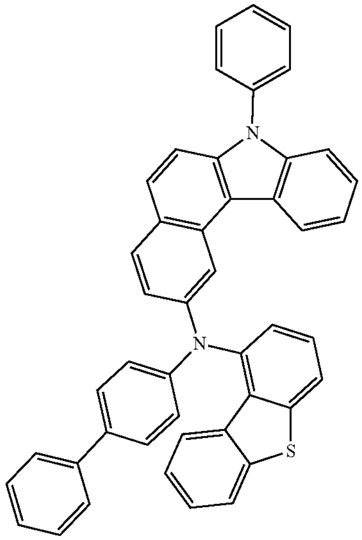
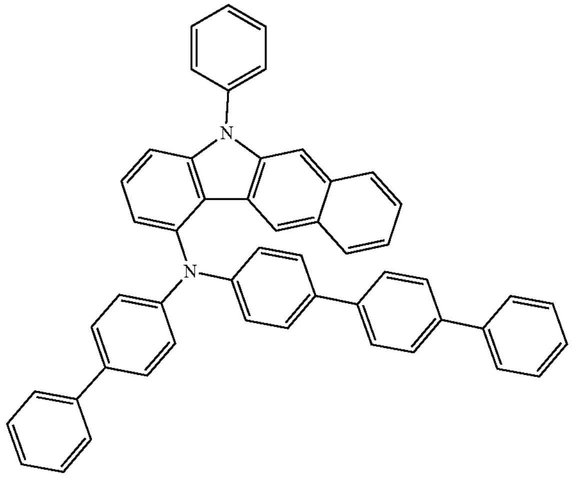
-continued
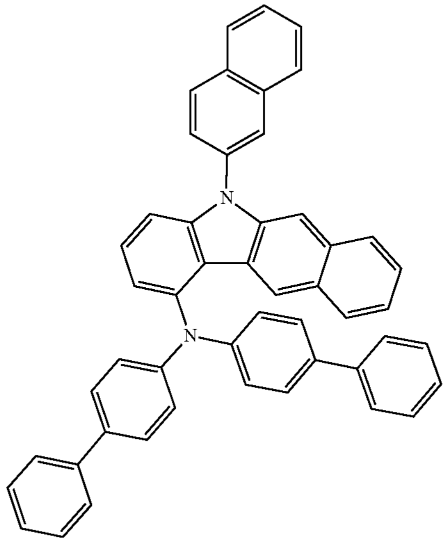
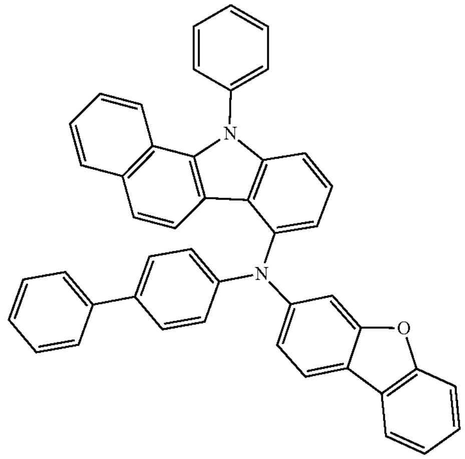
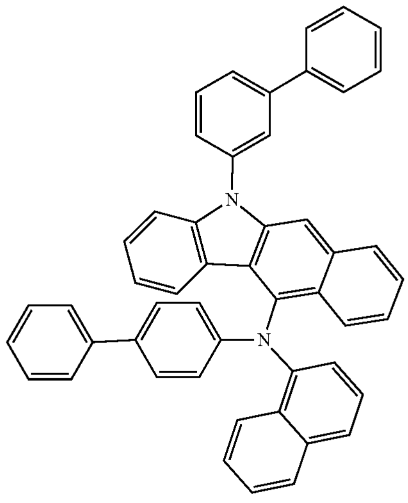

-continued
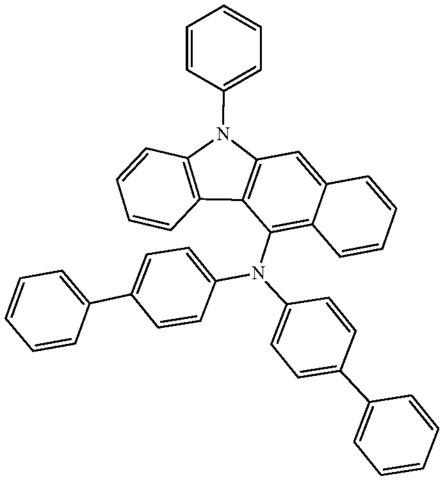
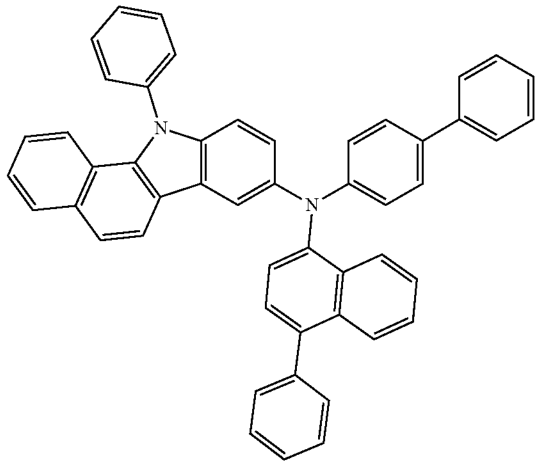
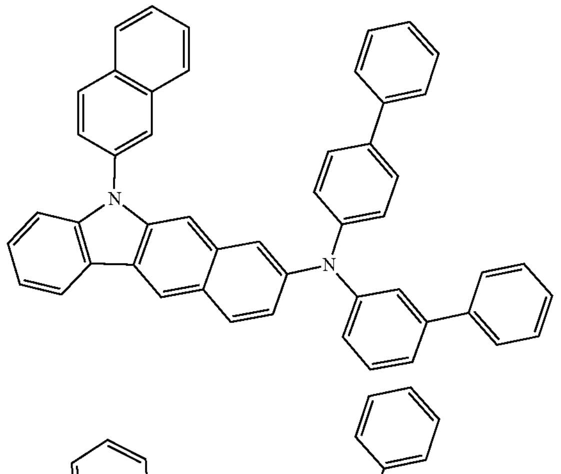
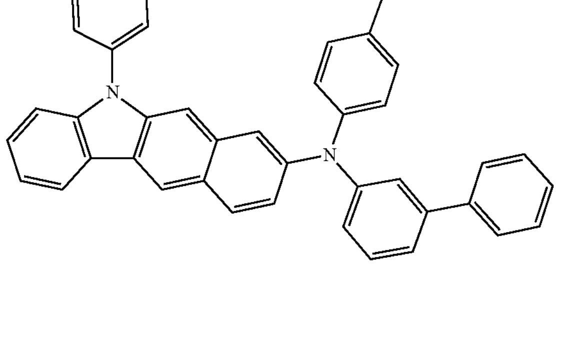
-continued
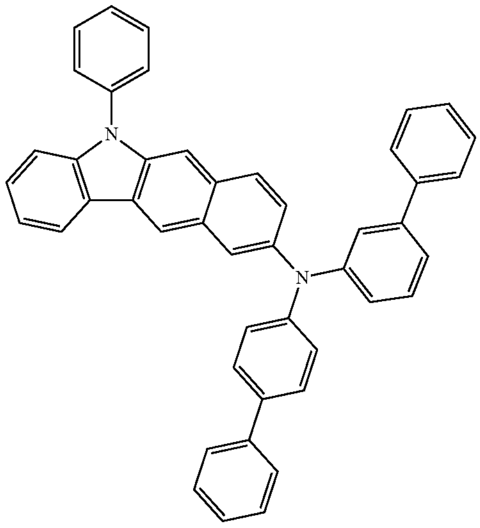
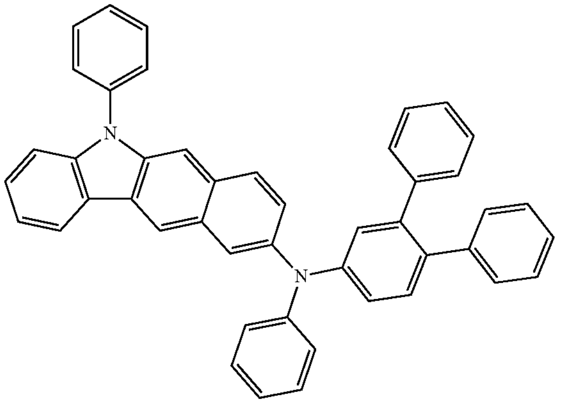
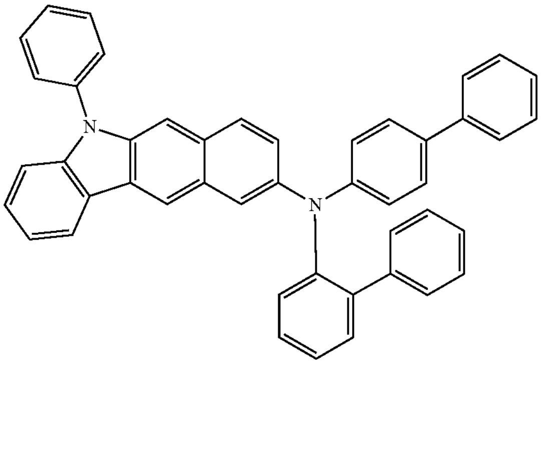

-continued
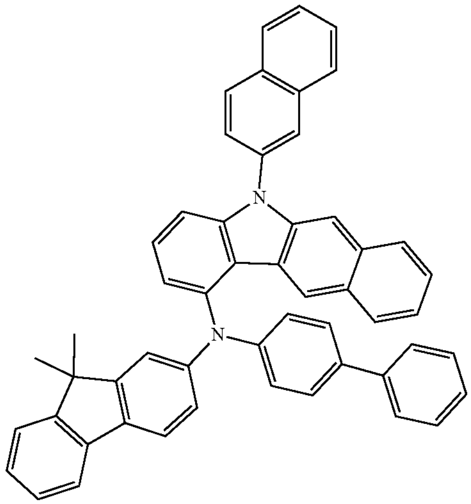
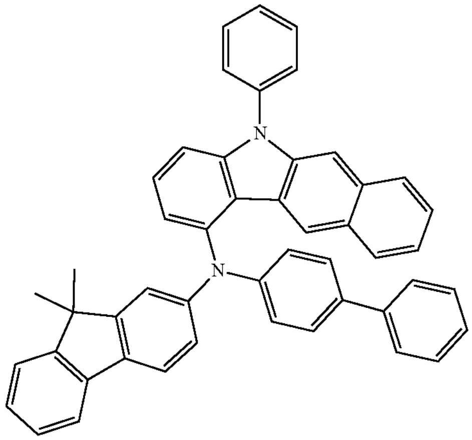
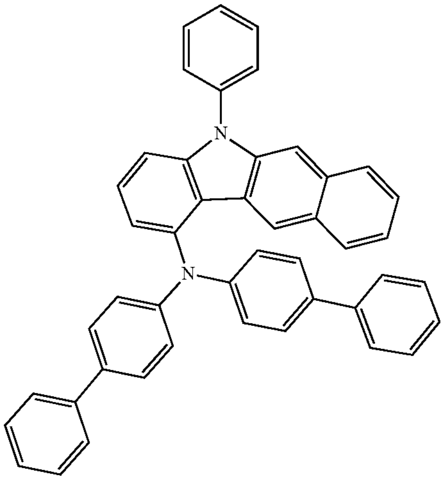
-continued
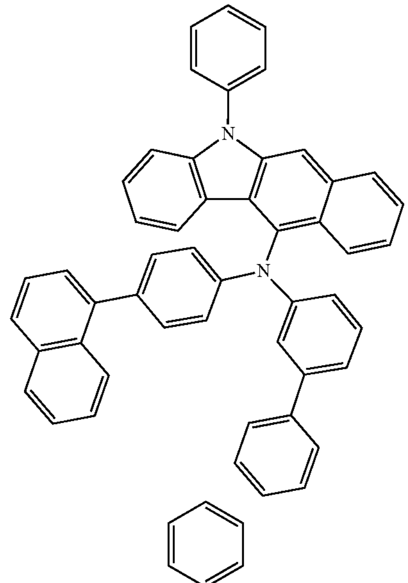
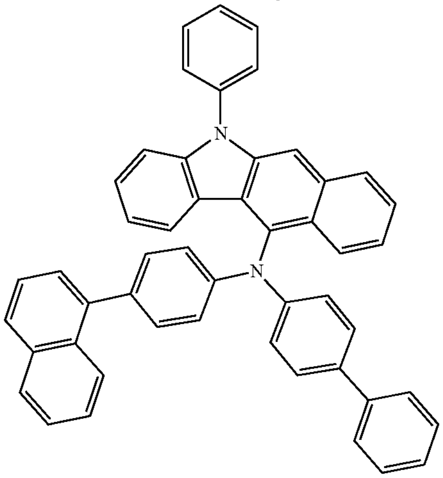
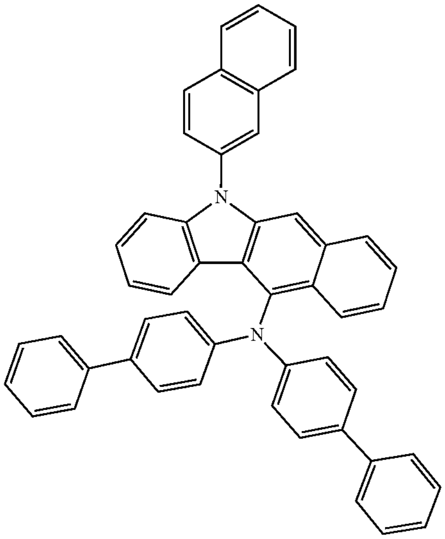

-continued
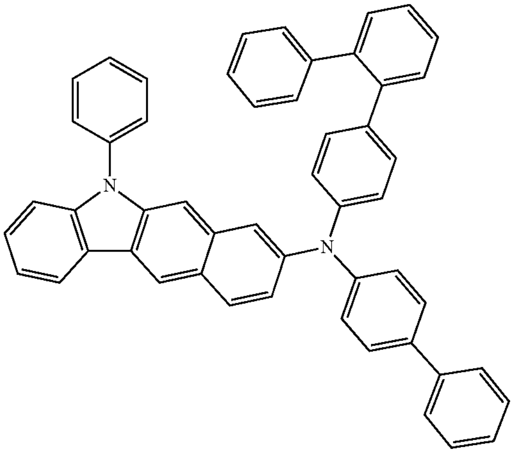
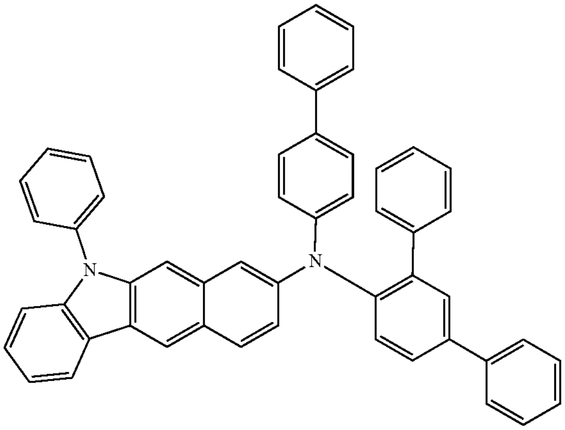
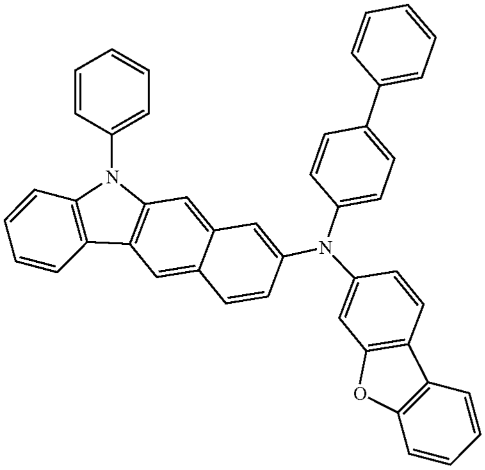
-continued
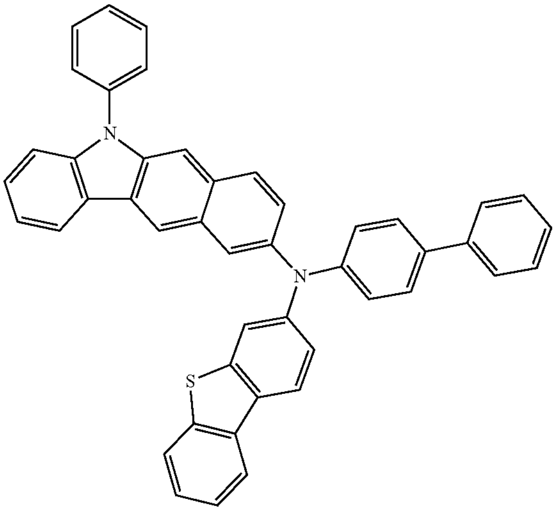
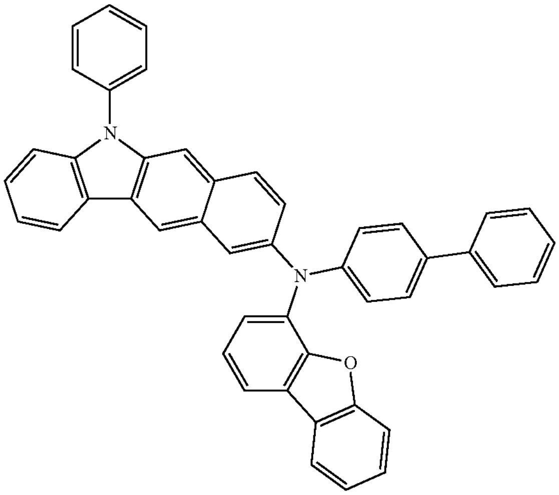
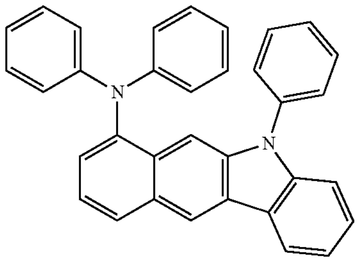

-continued
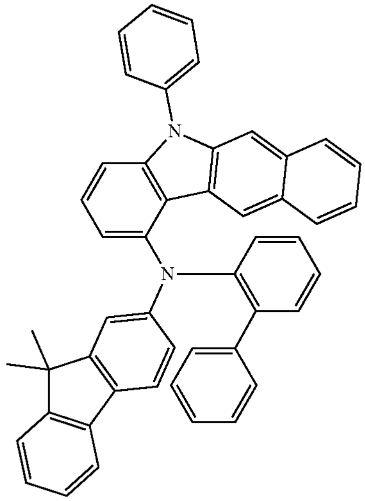
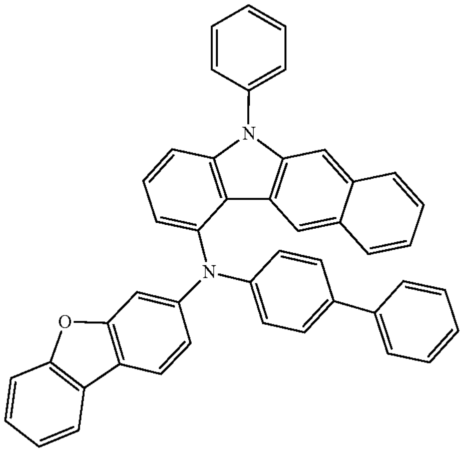
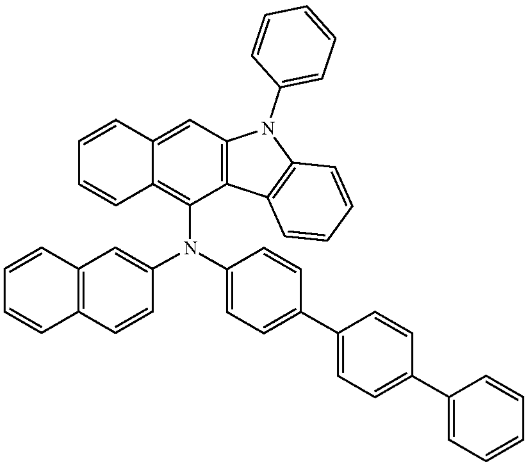
-continued
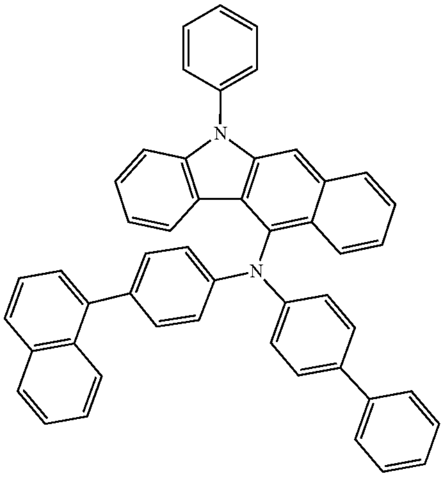
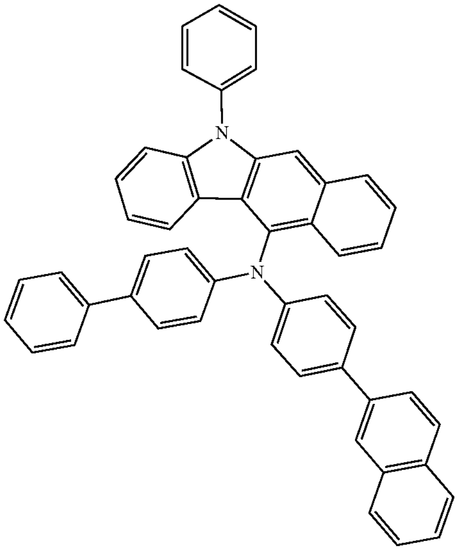
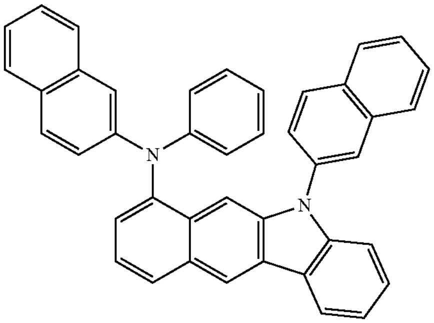

-continued
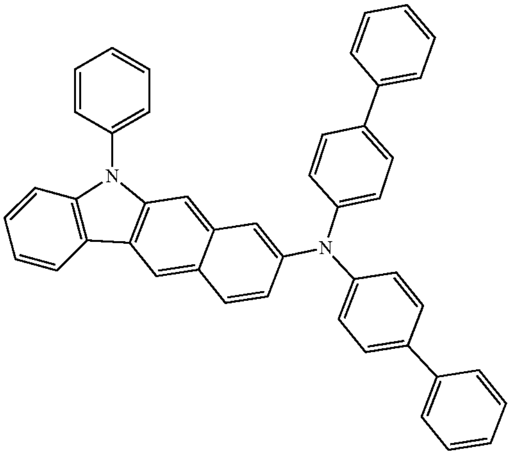
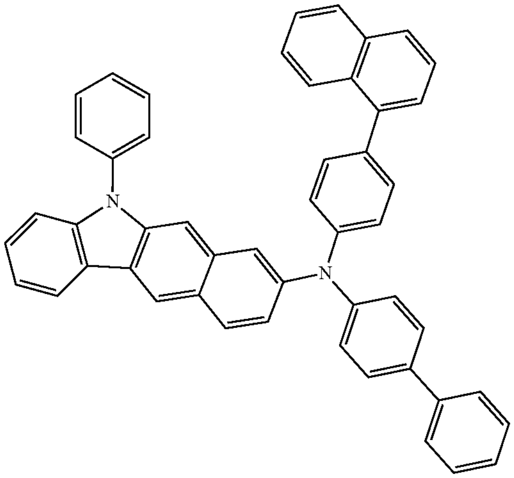
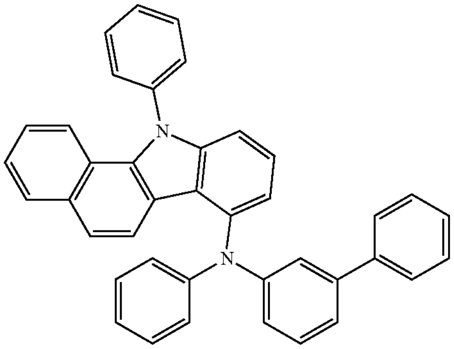
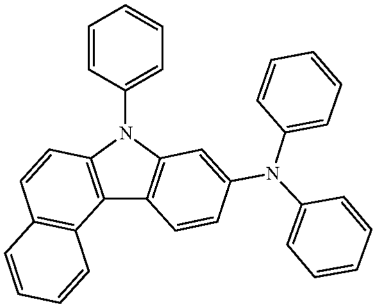
-continued
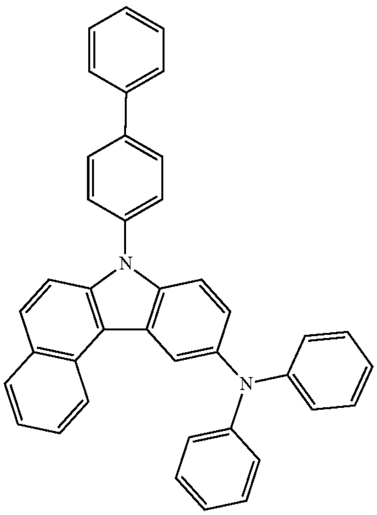
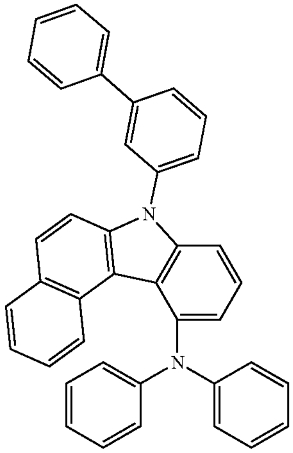
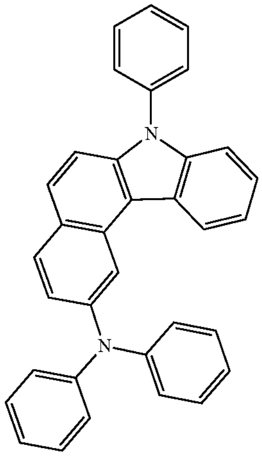

-continued
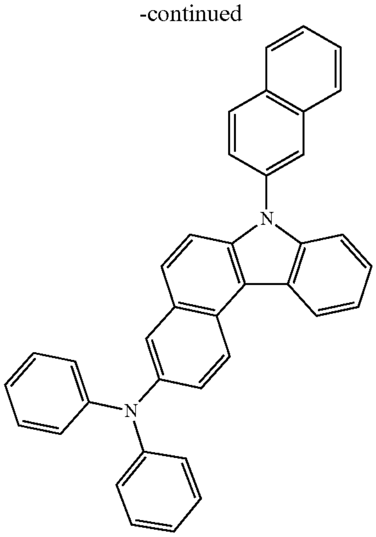
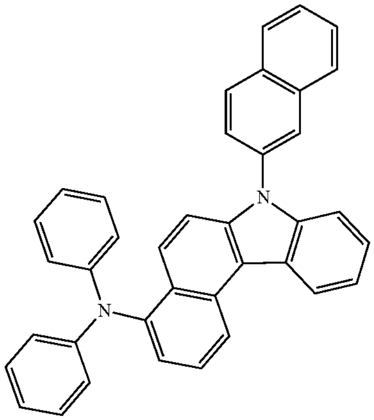
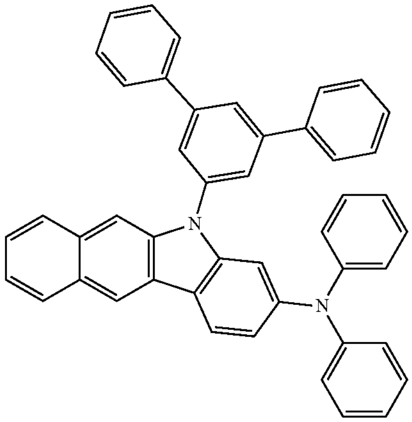
-continued
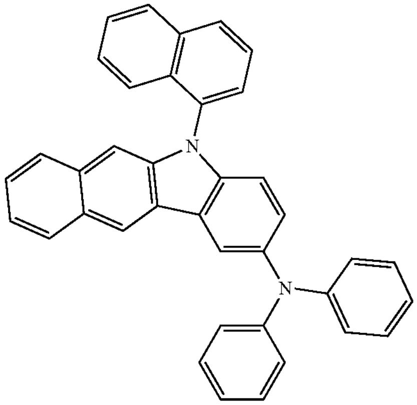
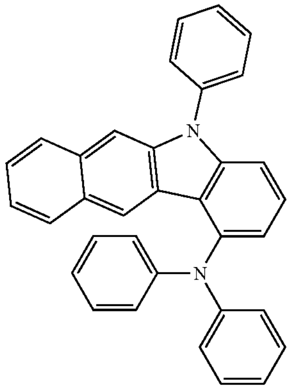
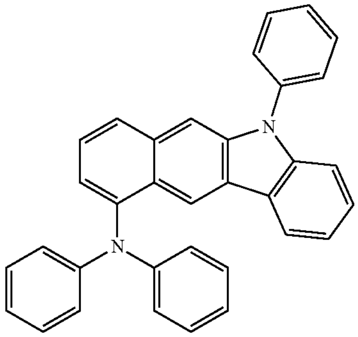
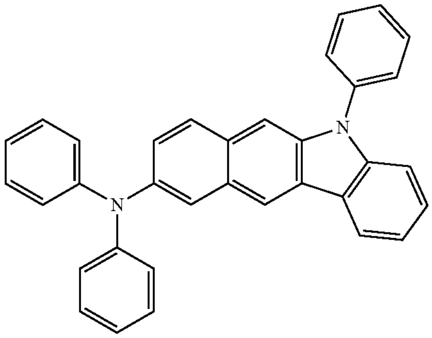
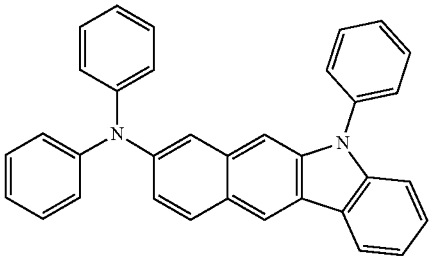

-continued
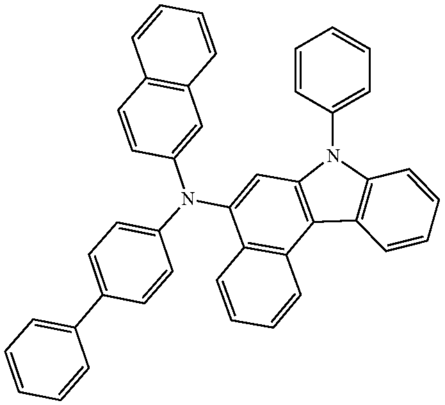
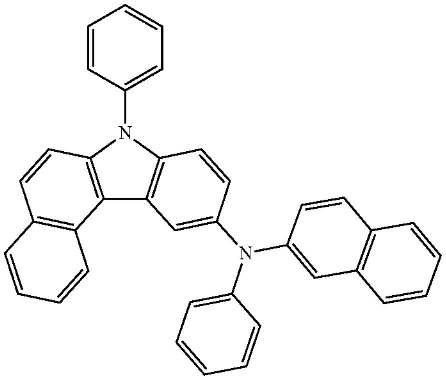
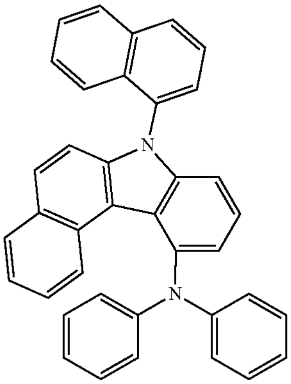
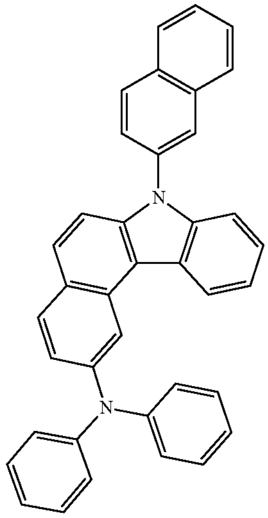
-continued
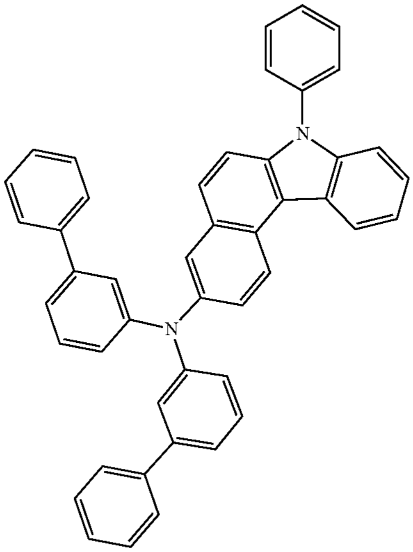
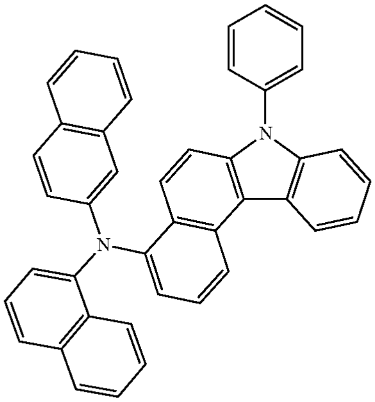
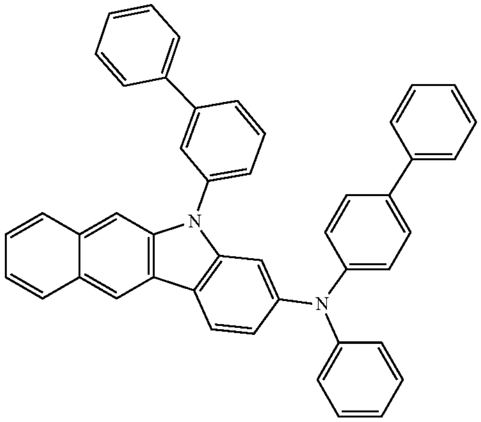

-continued
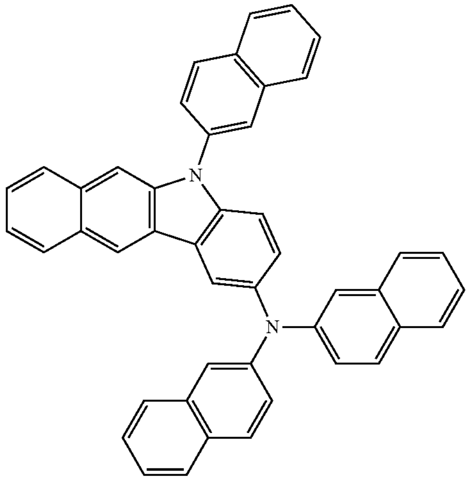
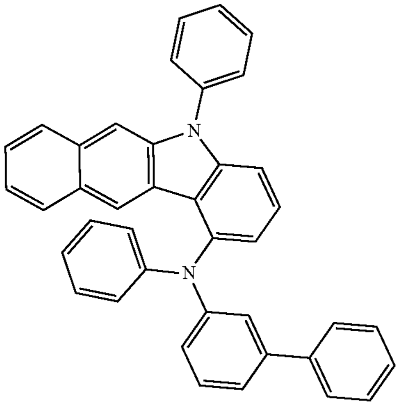
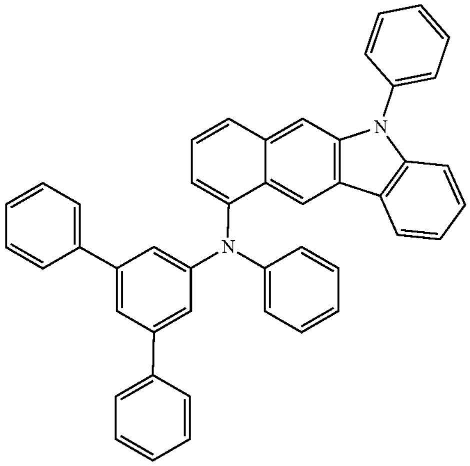
-continued
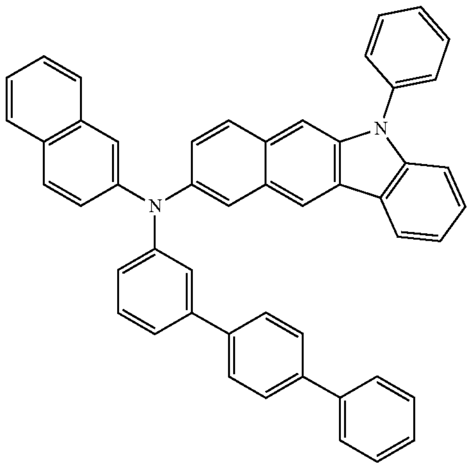
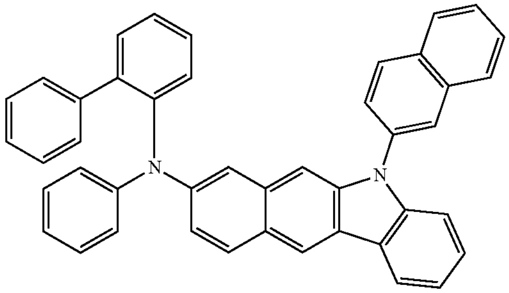
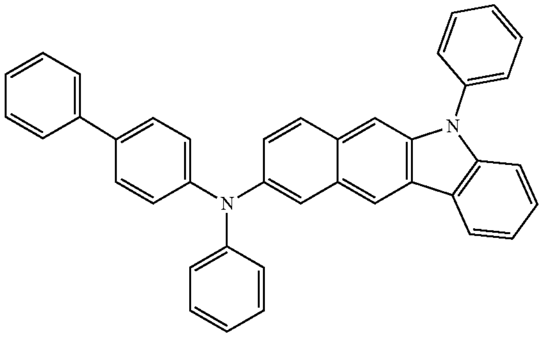
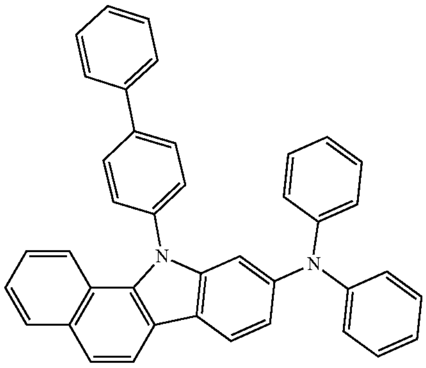

-continued
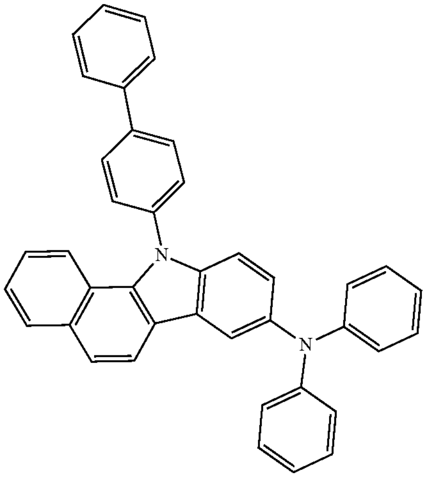
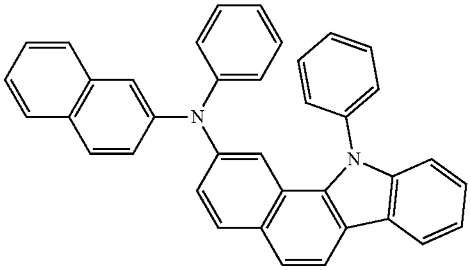
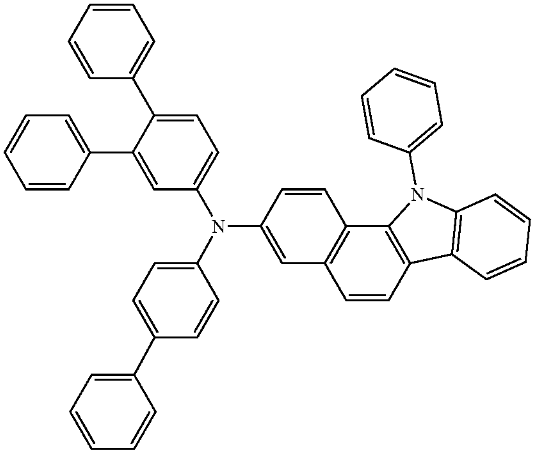
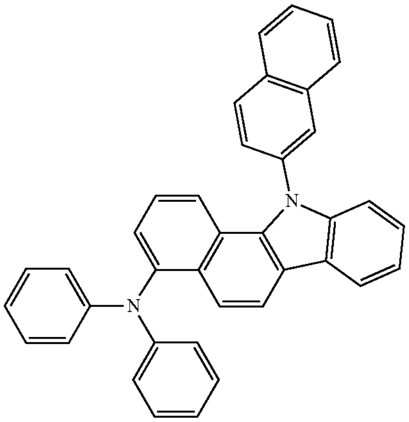
-continued
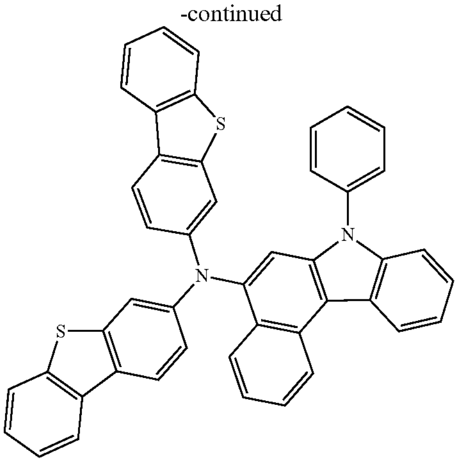
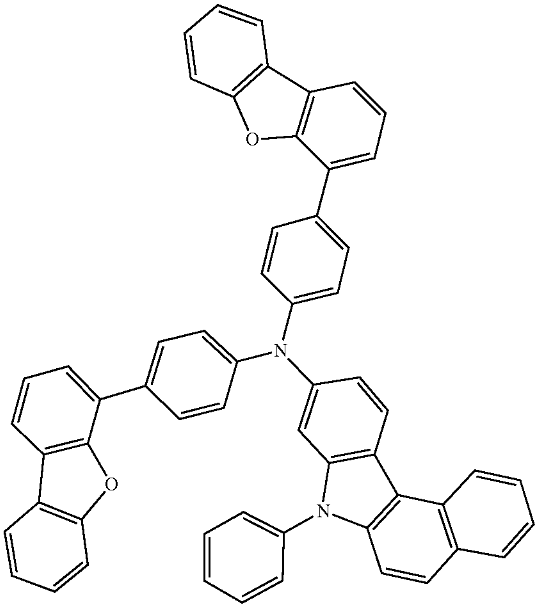
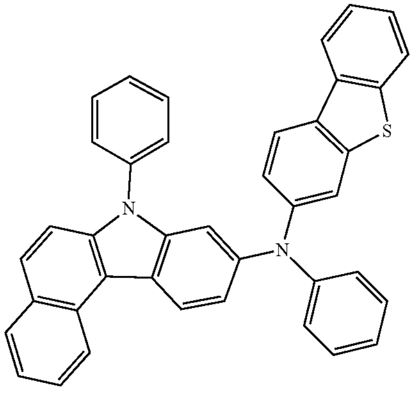

-continued
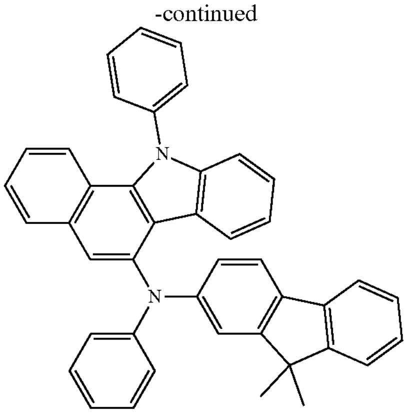
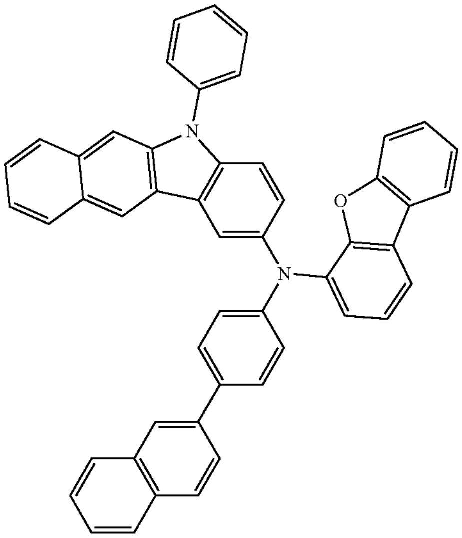
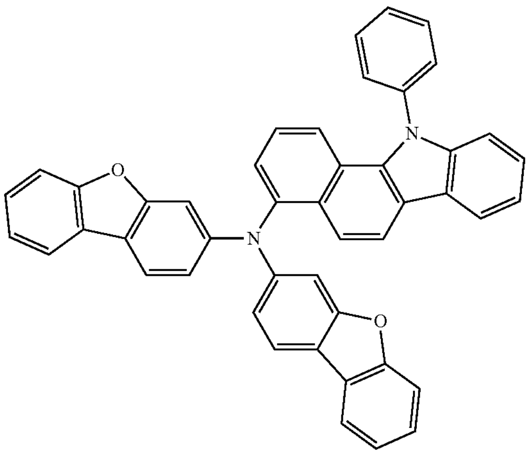
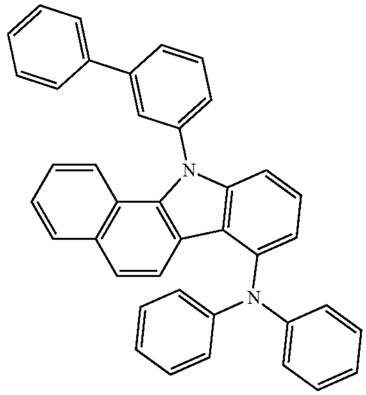
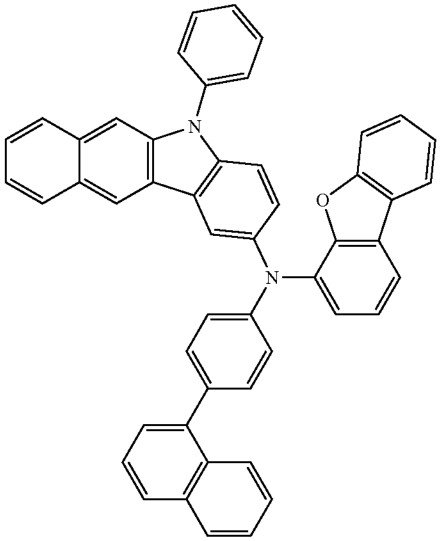
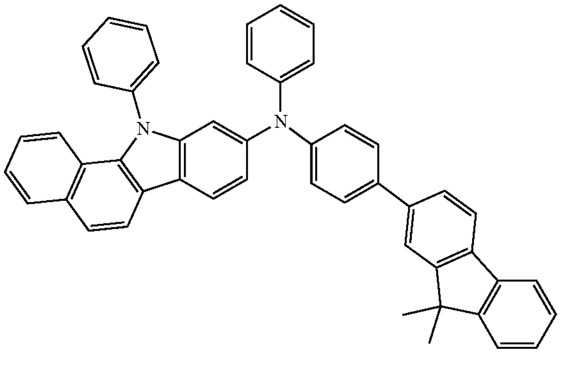
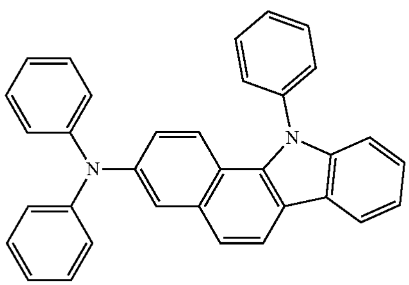

-continued
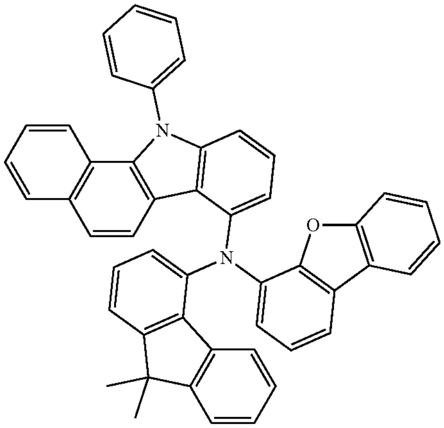
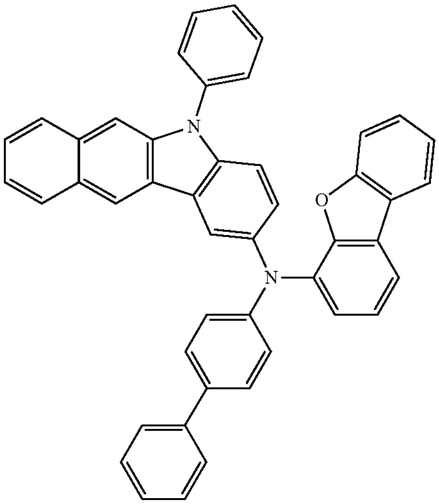
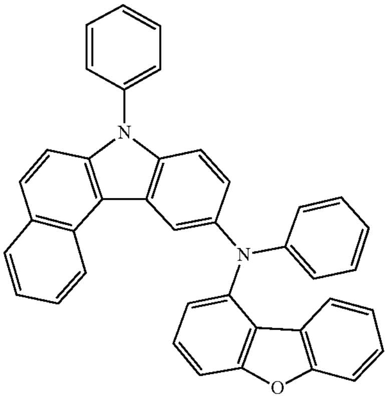
-continued
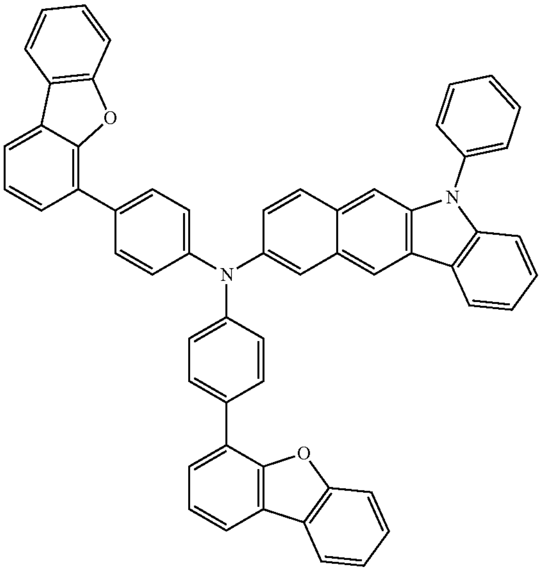
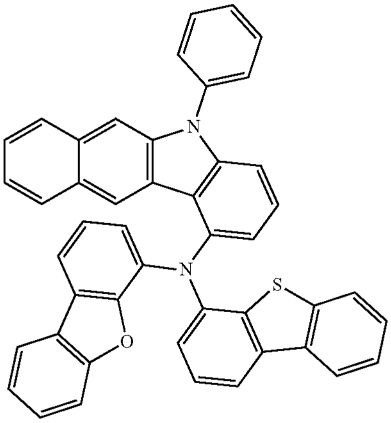
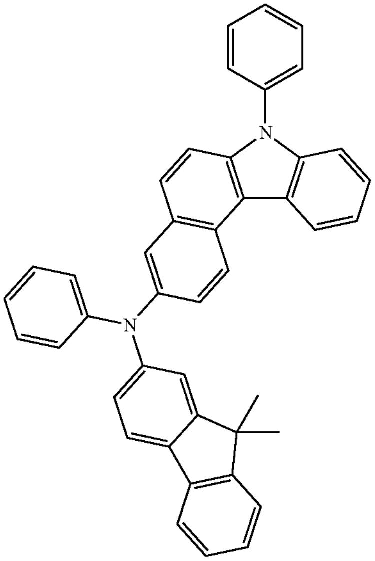

-continued
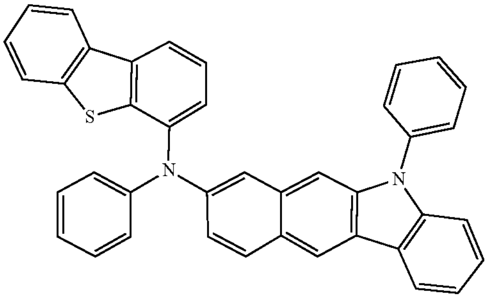
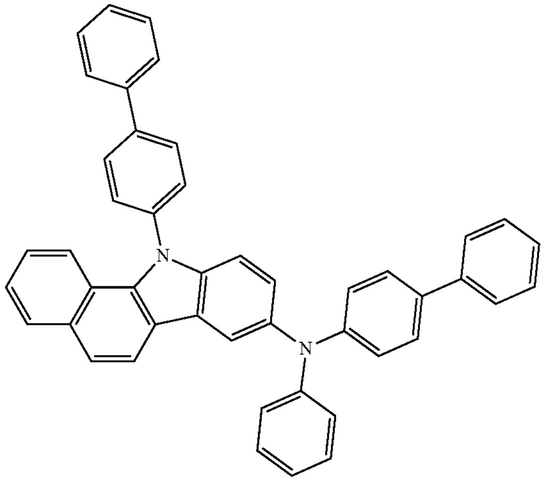
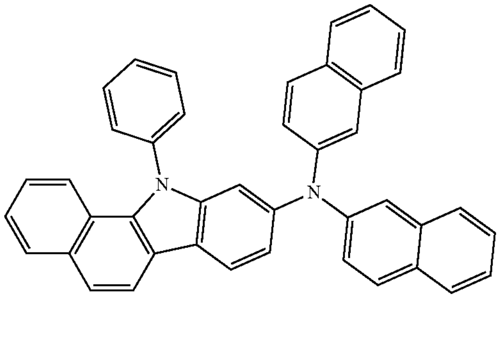
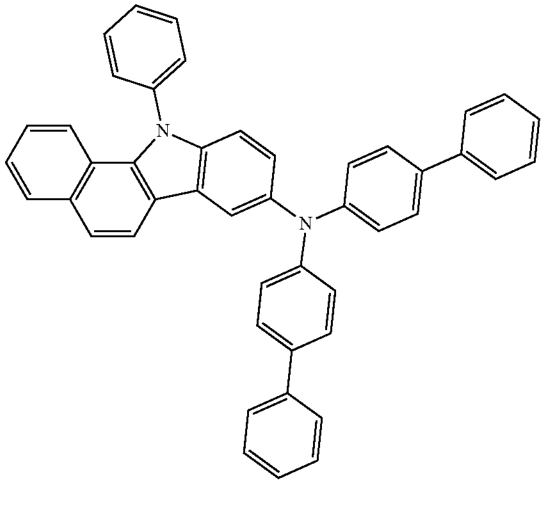
-continued
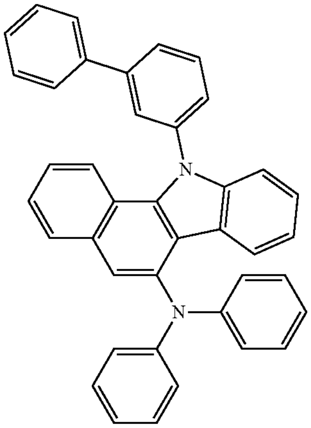
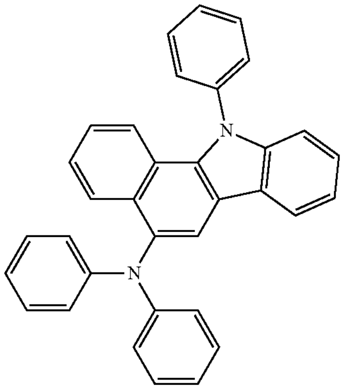
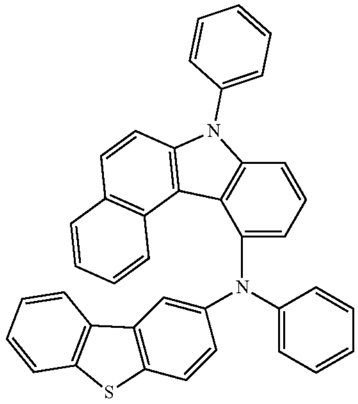
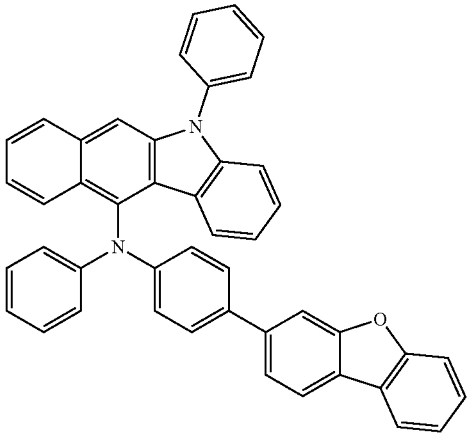

-continued
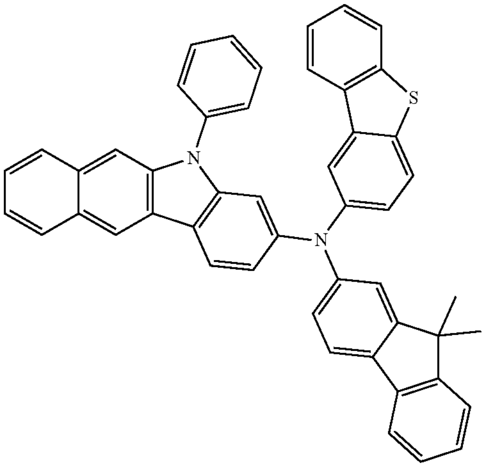
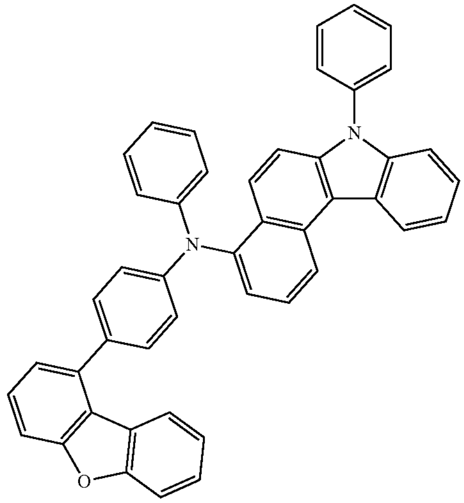
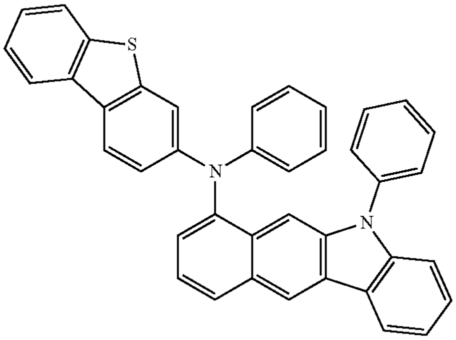
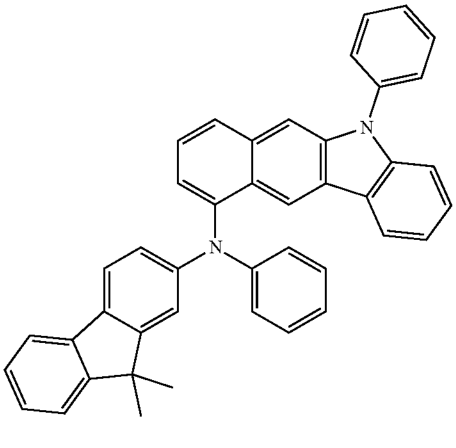
-continued
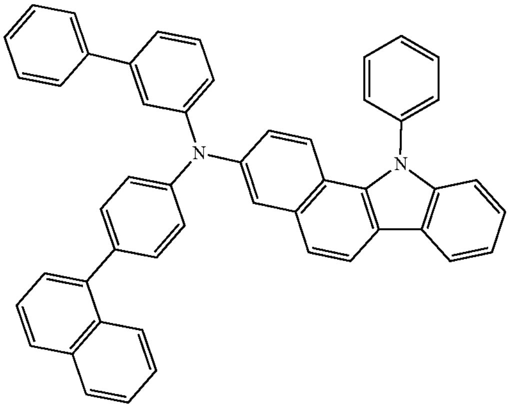
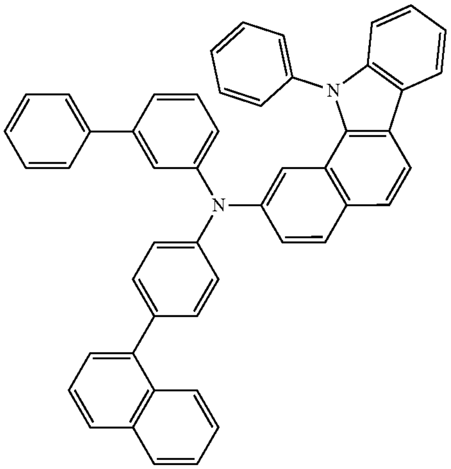
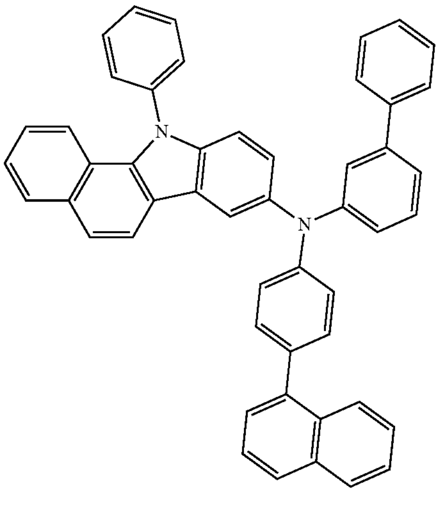

-continued
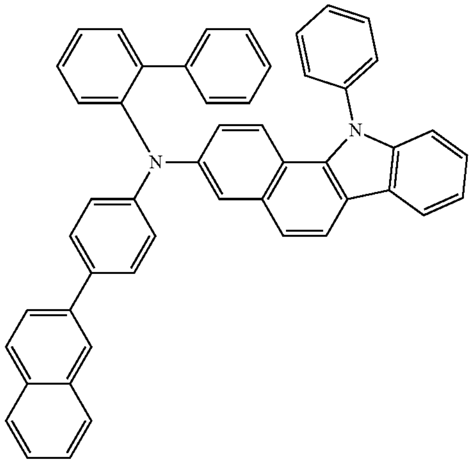
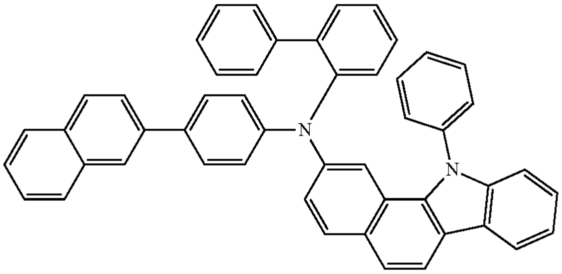
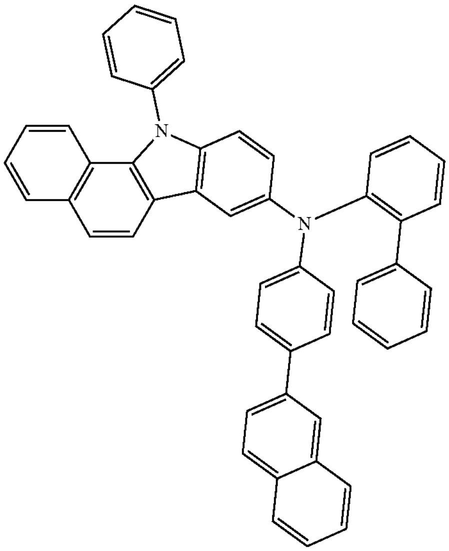
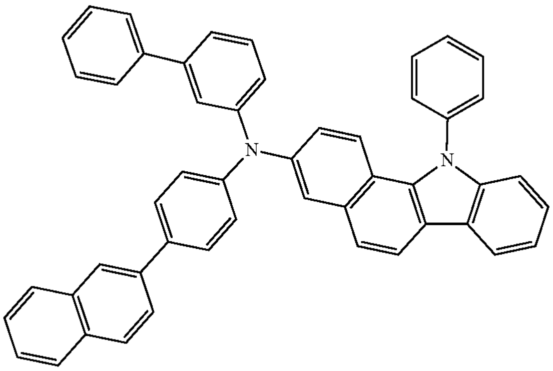
-continued
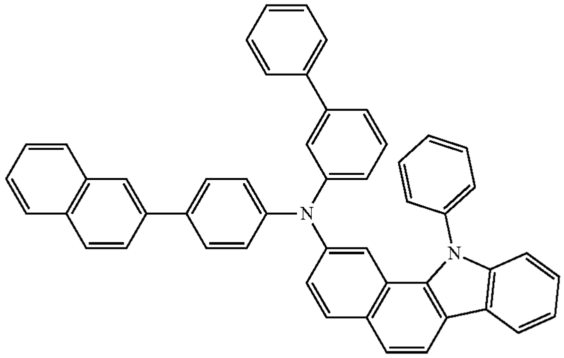
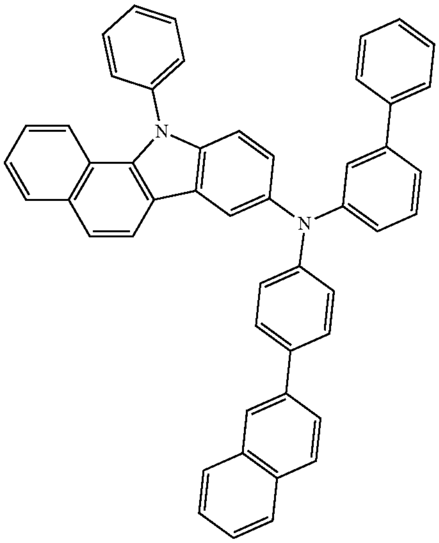
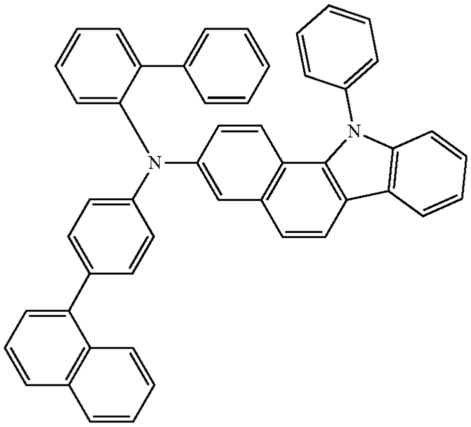
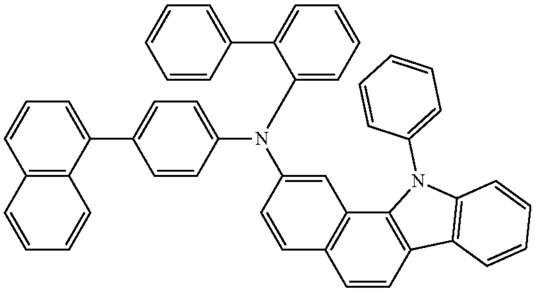

-continued
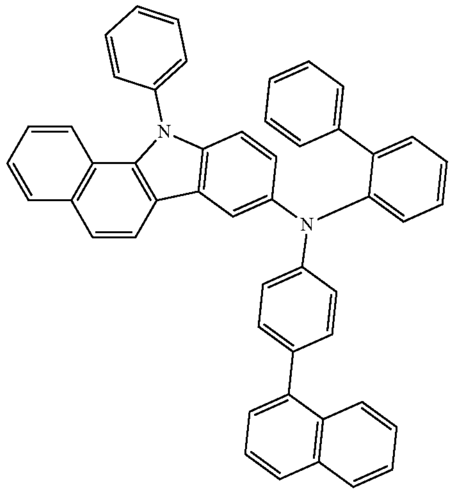
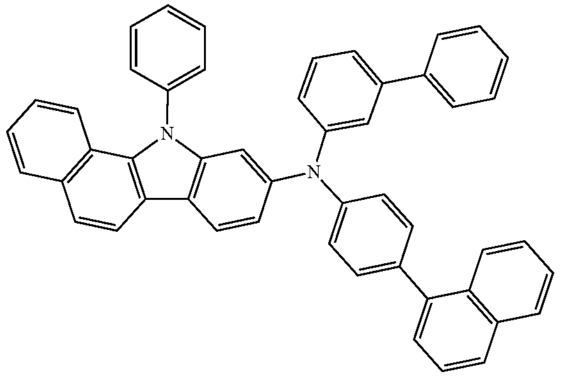
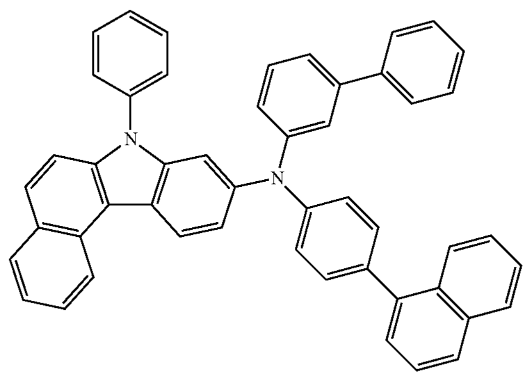
-continued
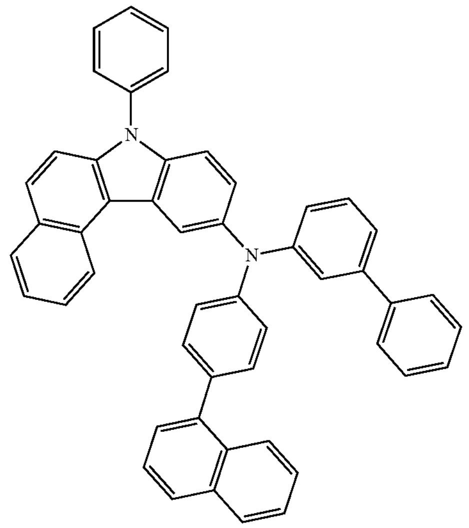
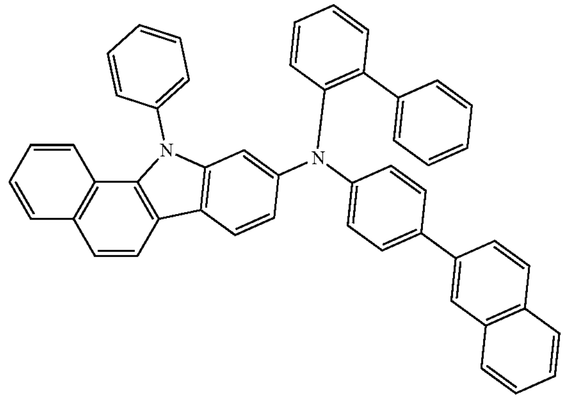
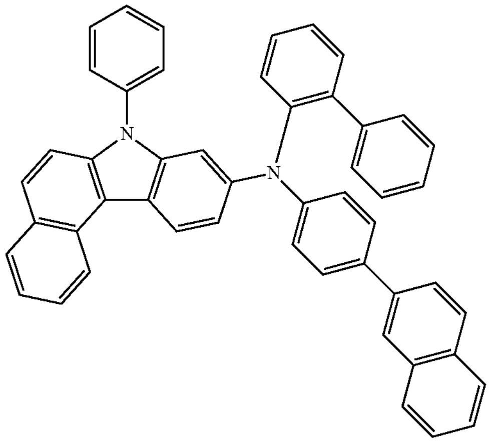

-continued
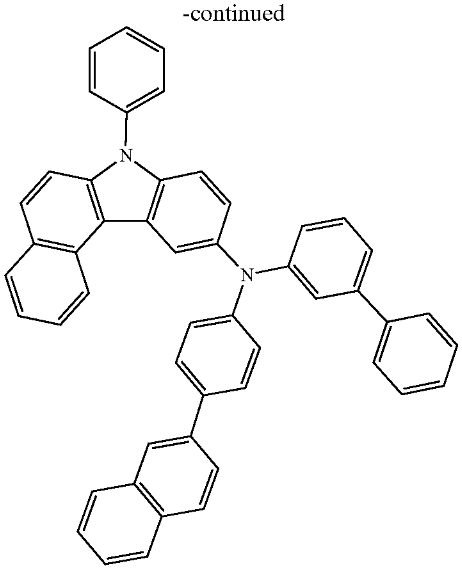
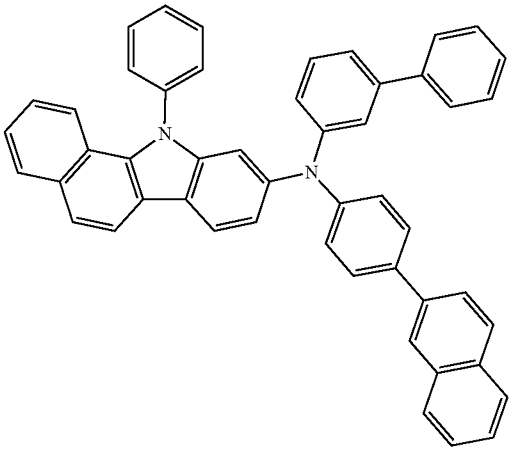
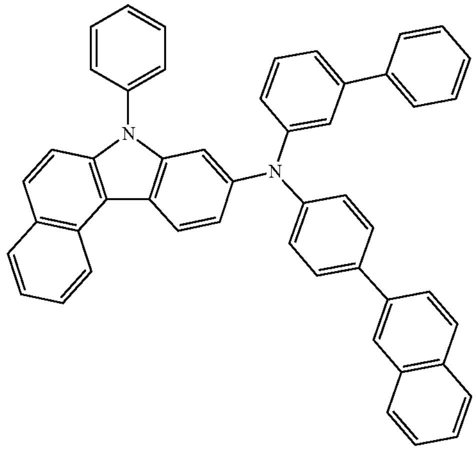
-continued
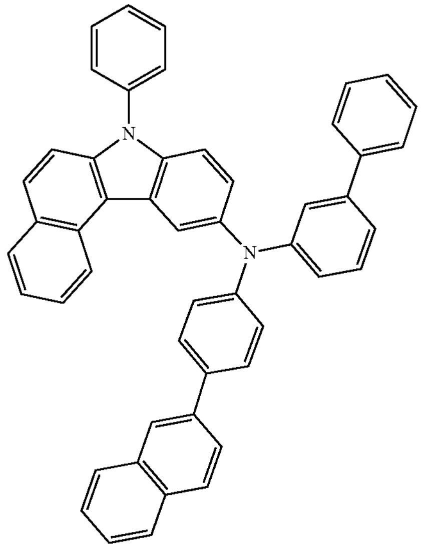
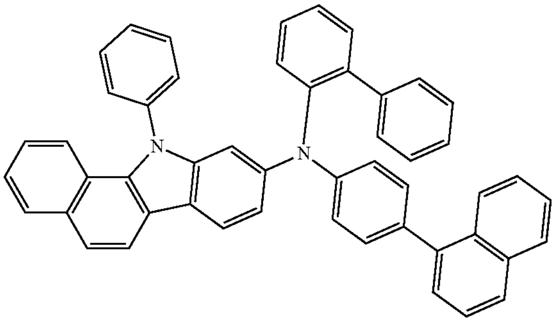
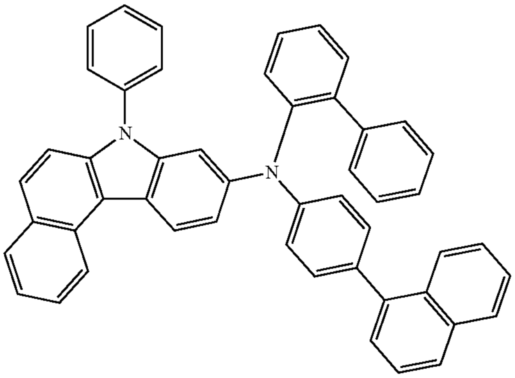

-continued
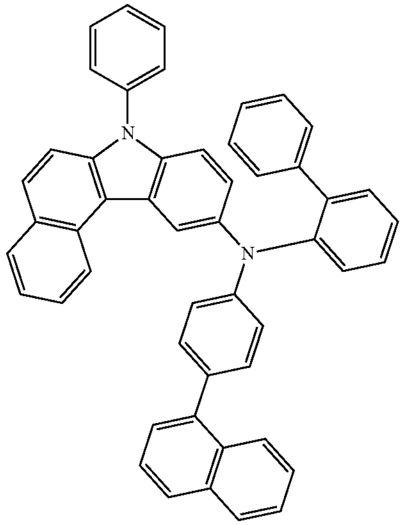
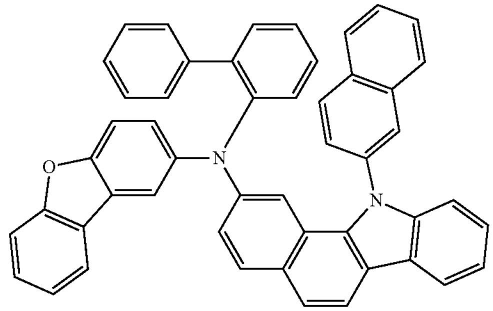
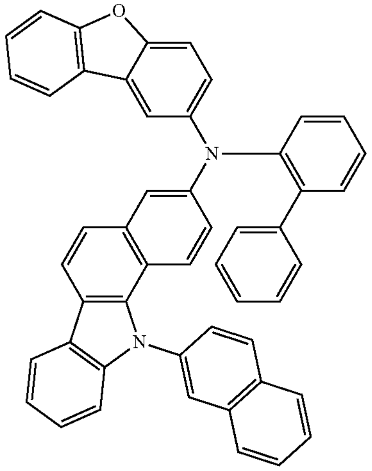
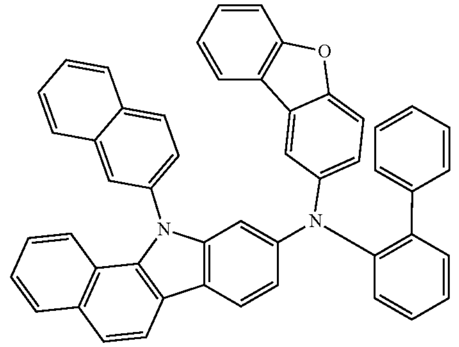
-continued
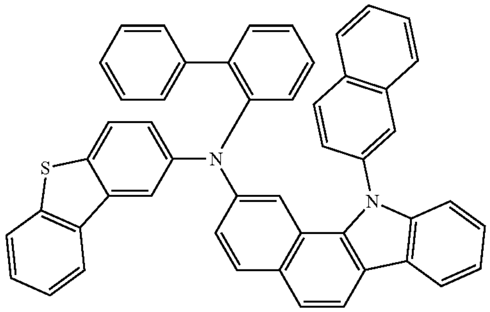
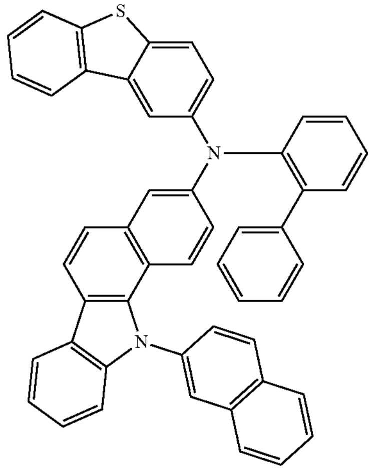
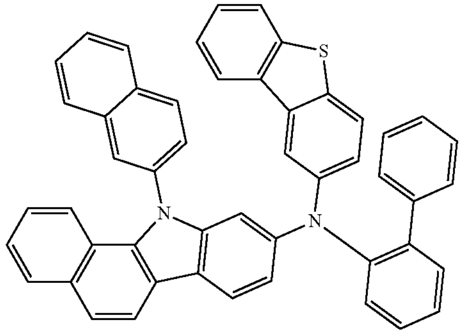
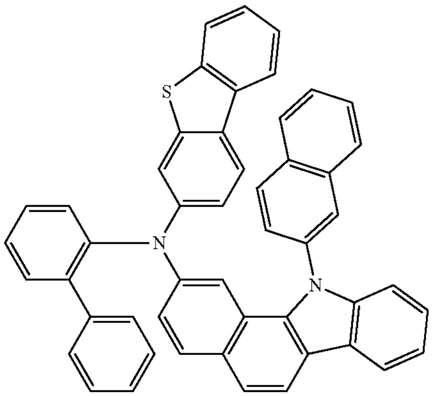

-continued
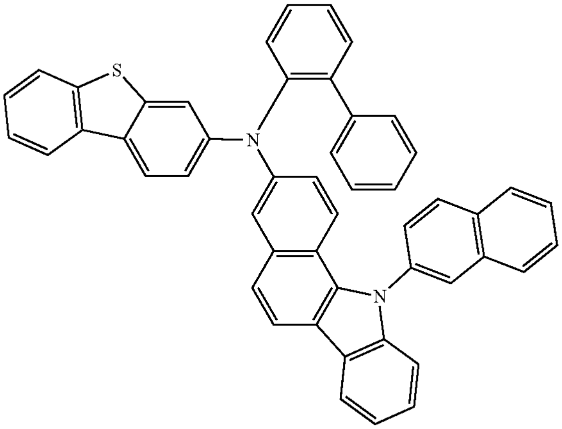
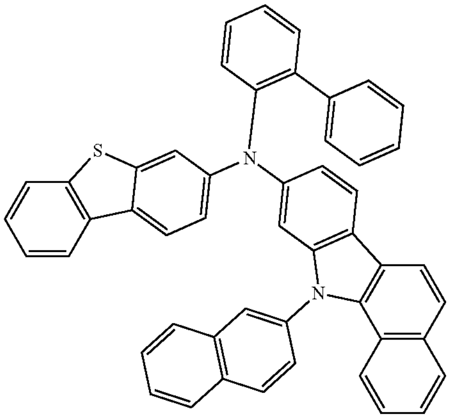
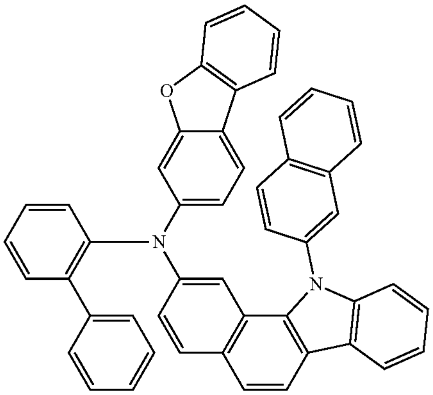
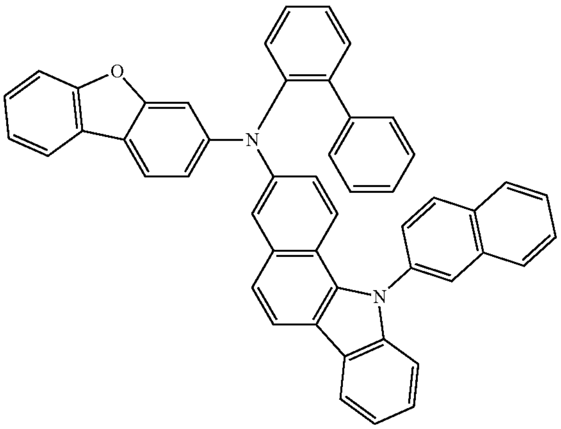
-continued
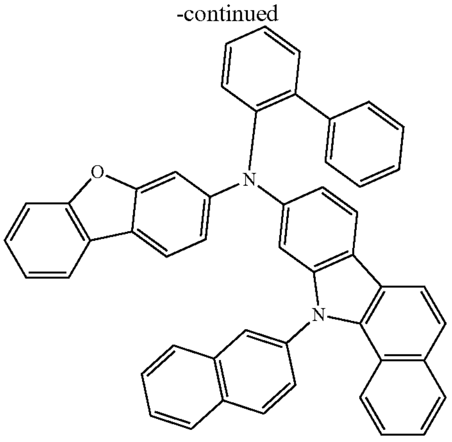
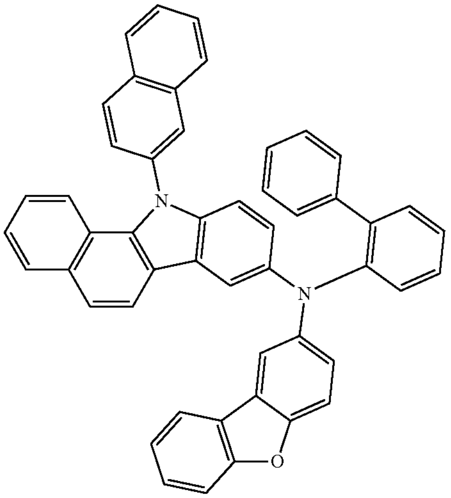
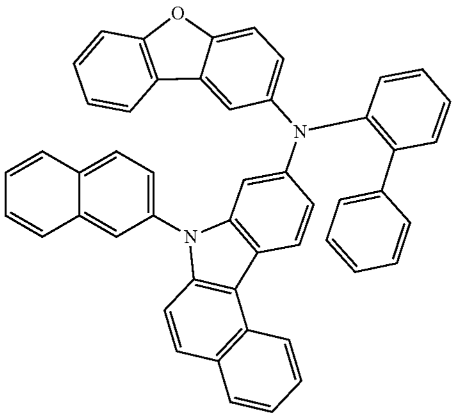

-continued
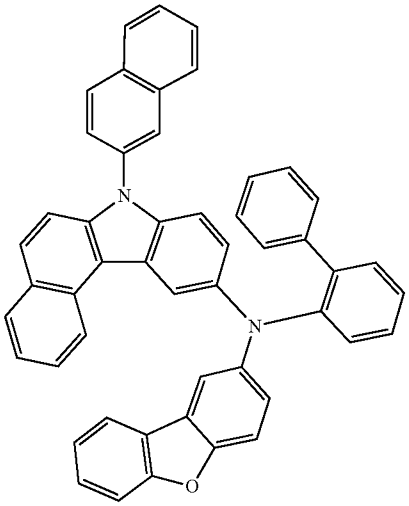
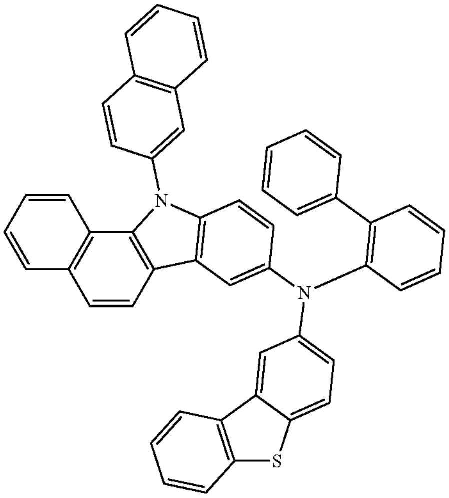
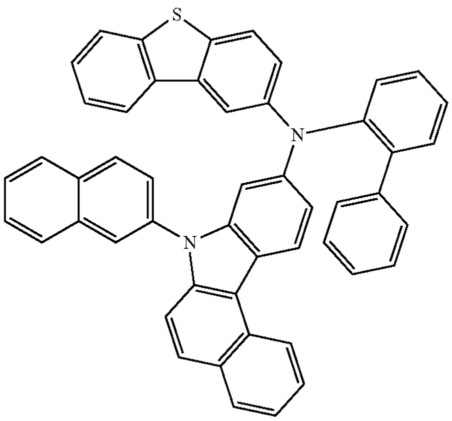
-continued
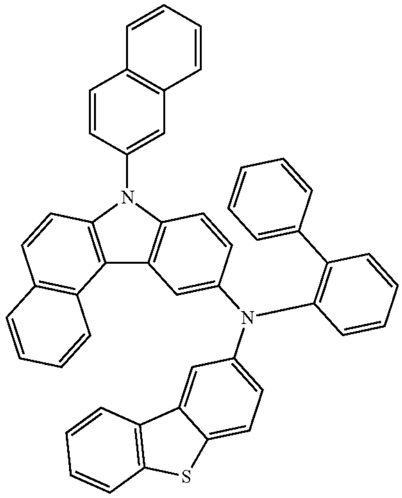
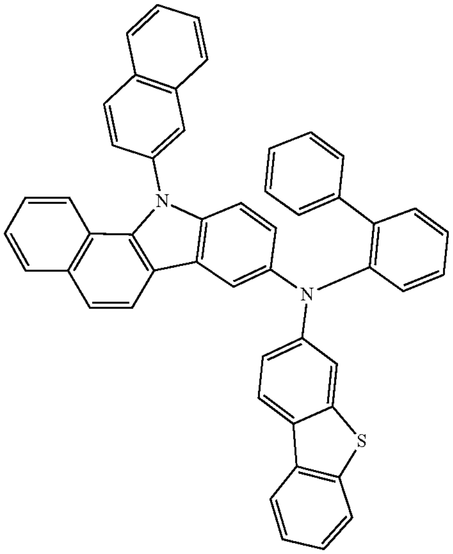
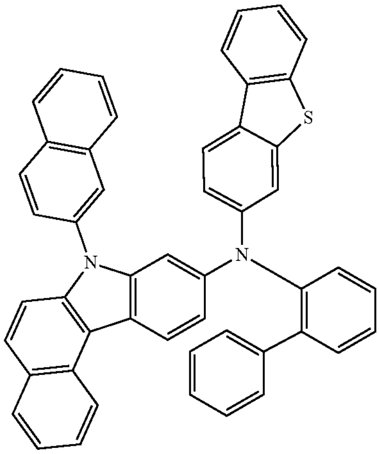

-continued
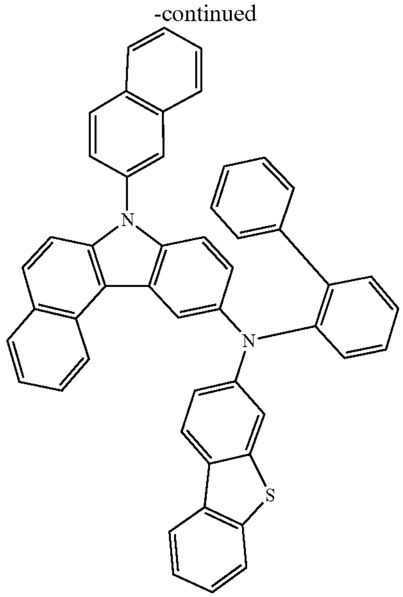
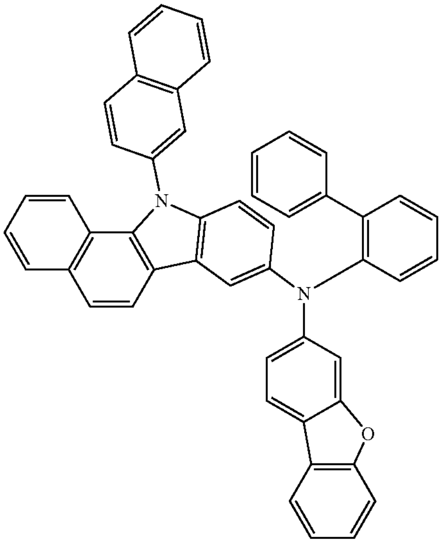
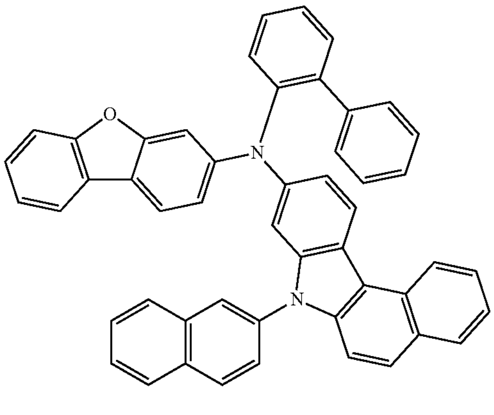
-continued
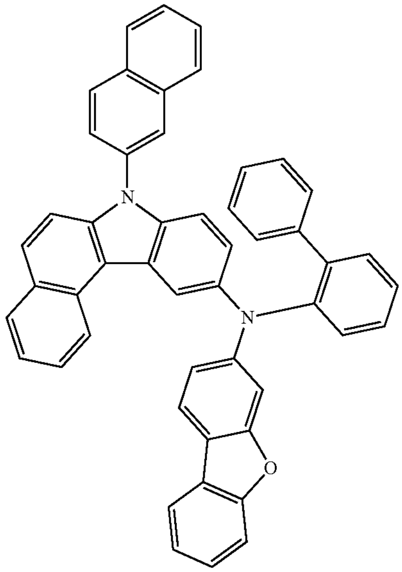
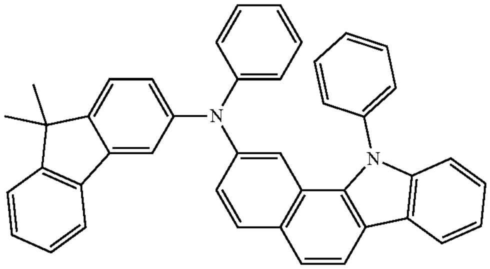
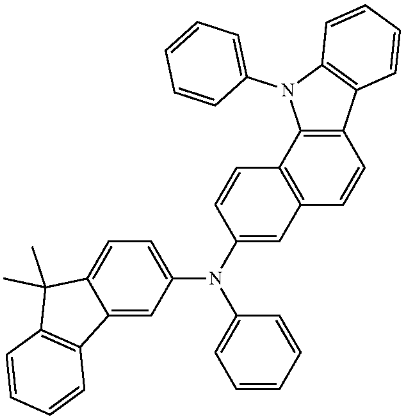
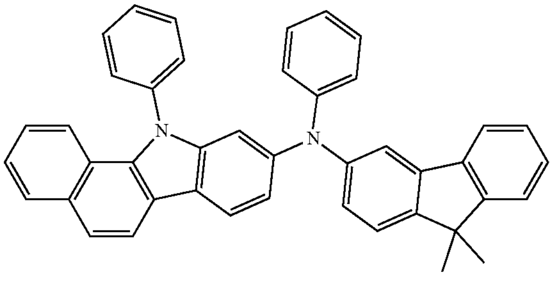

-continued
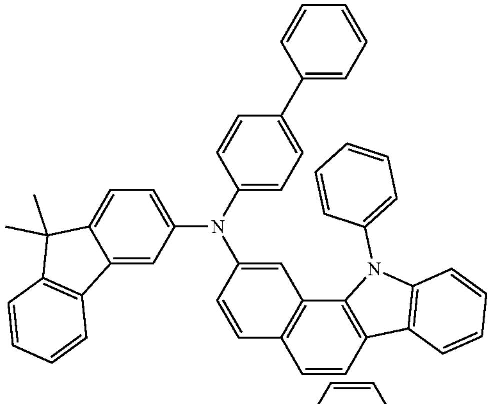
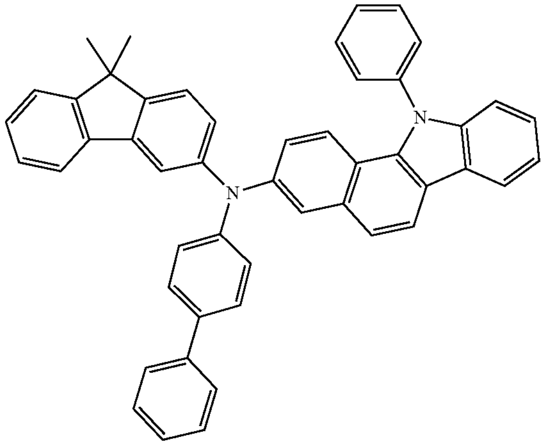
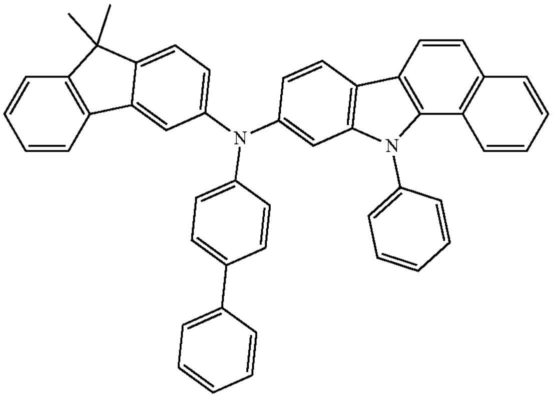
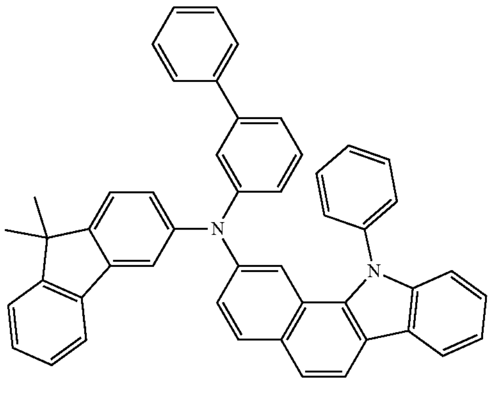
-continued
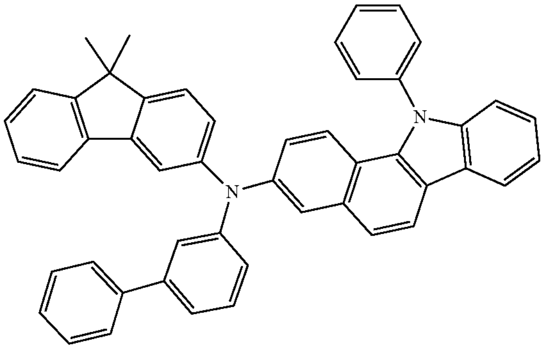
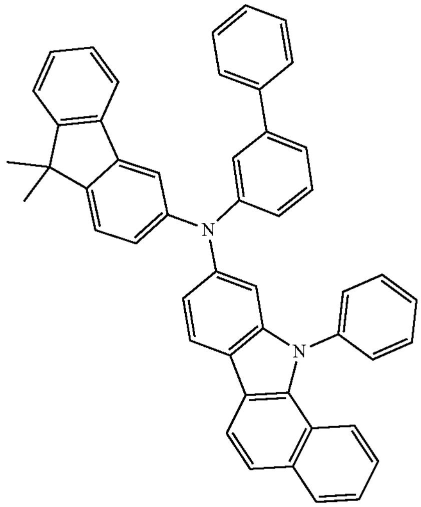
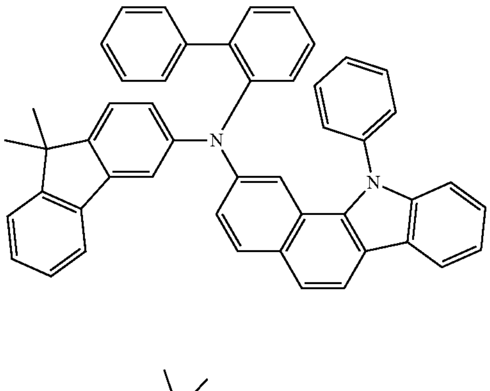
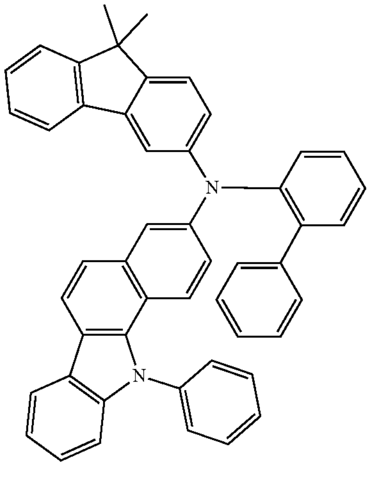

-continued
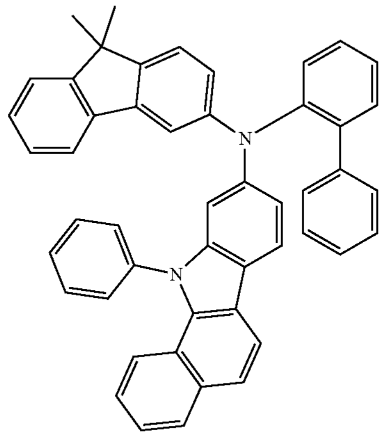
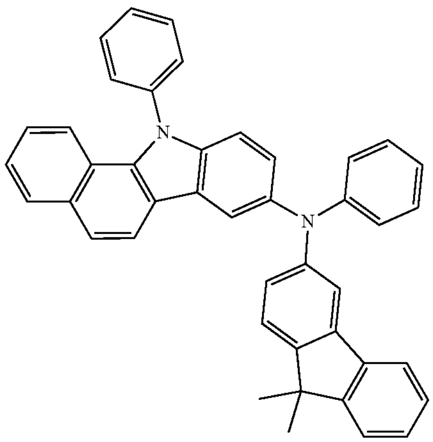
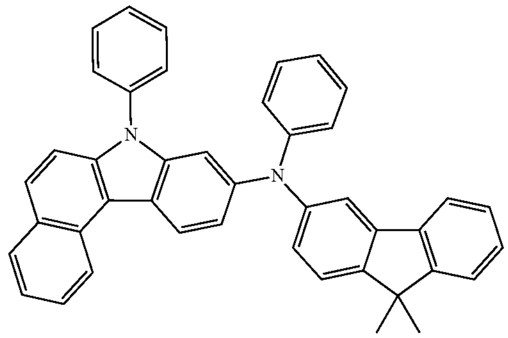
-continued
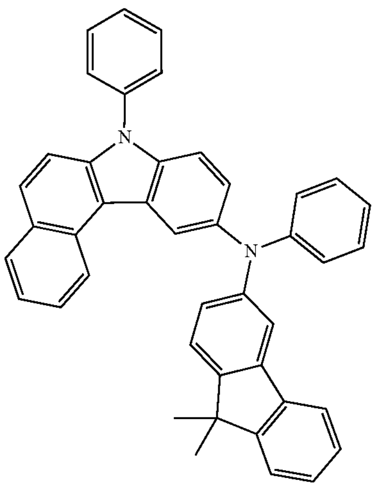
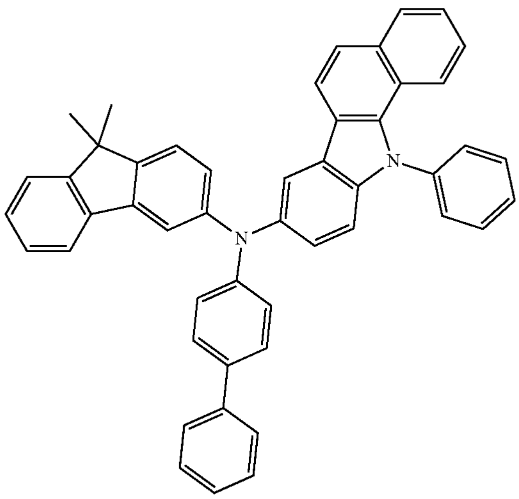
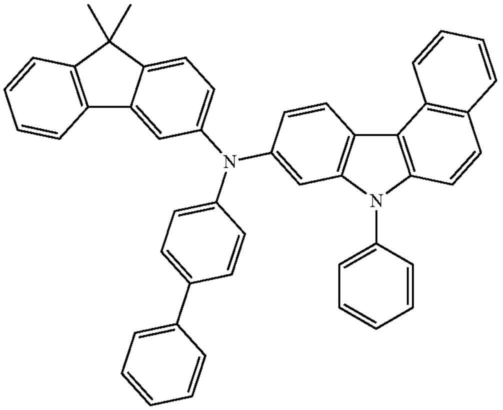

-continued
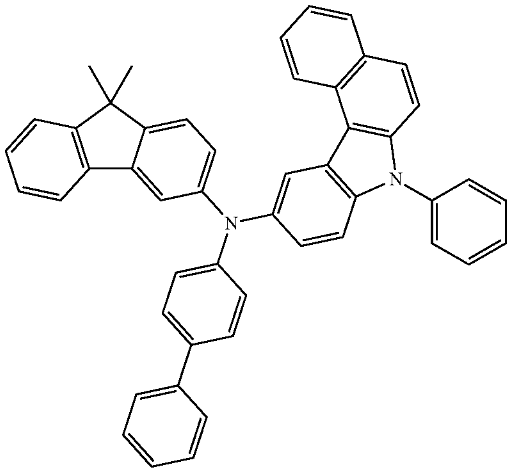
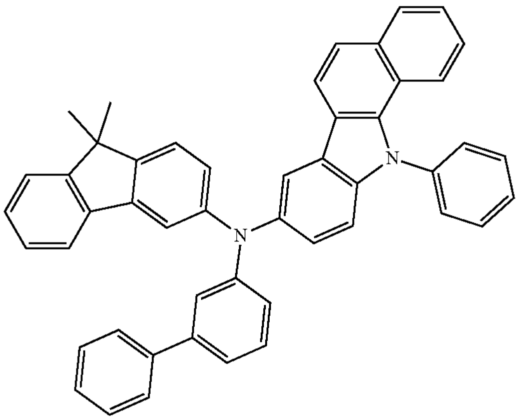
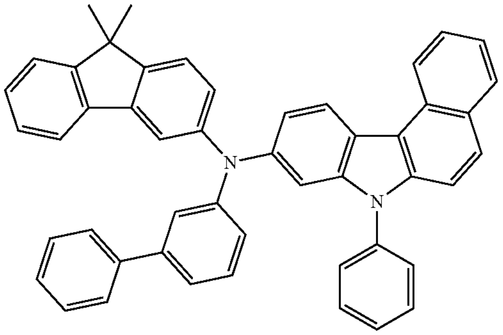
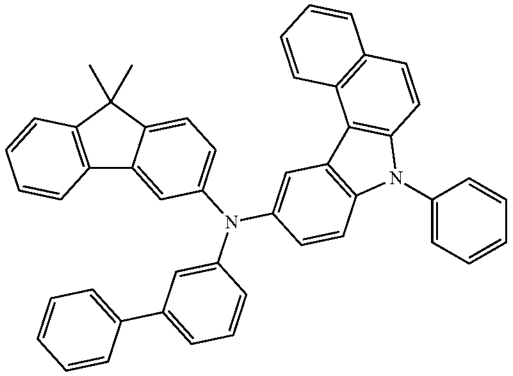
-continued
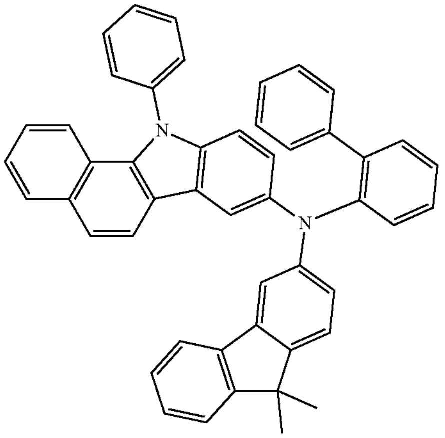
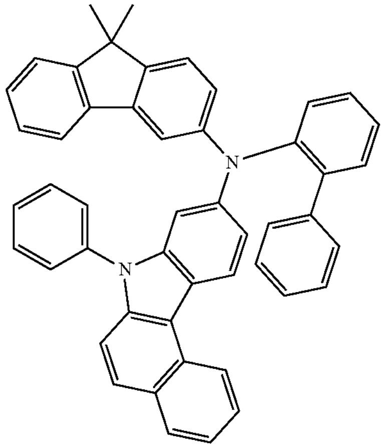
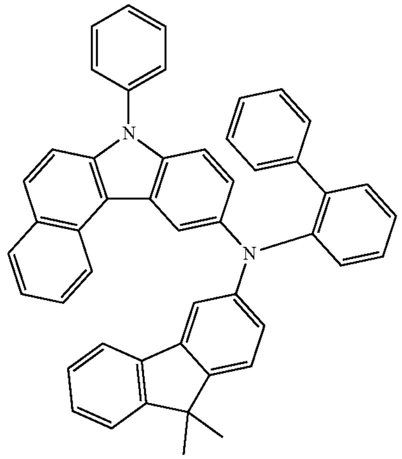
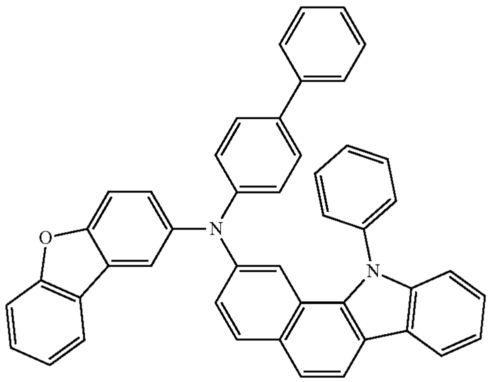

-continued
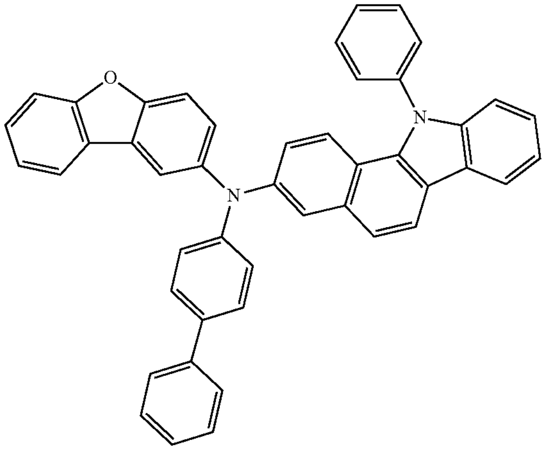
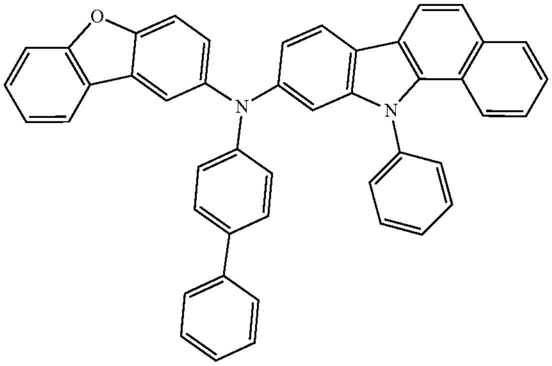
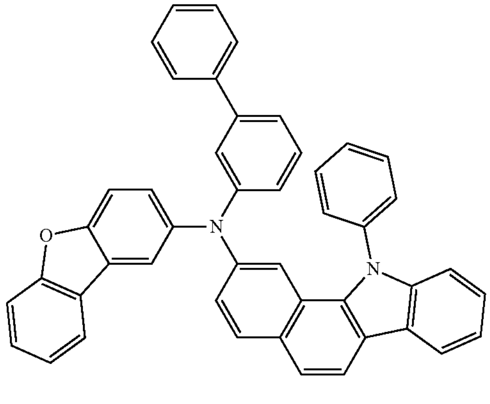
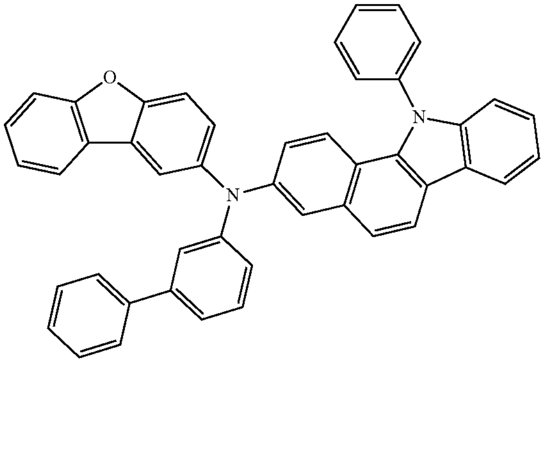
-continued
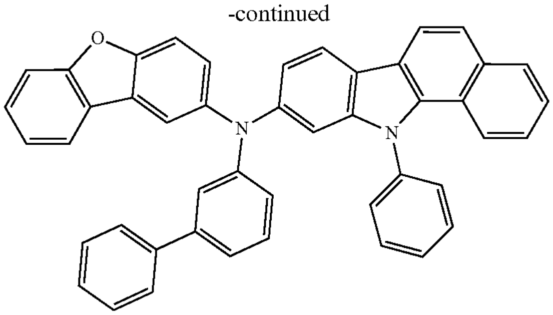
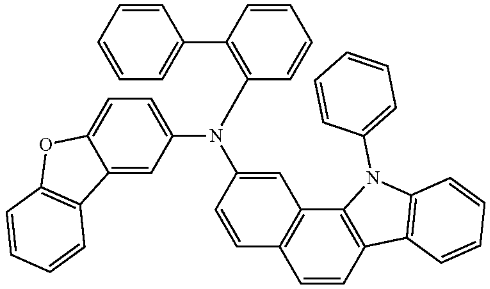
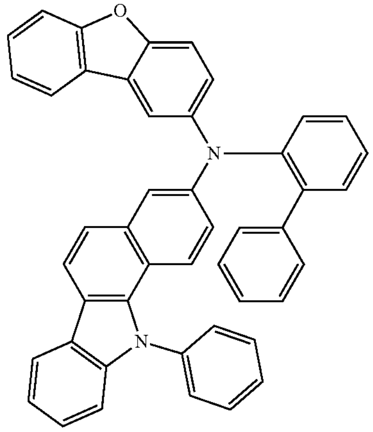
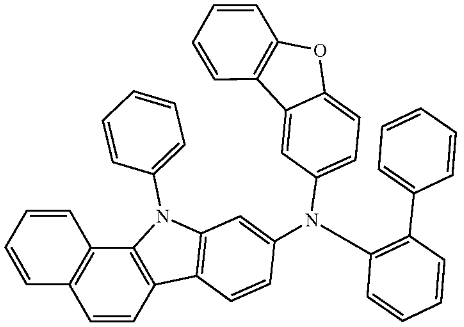
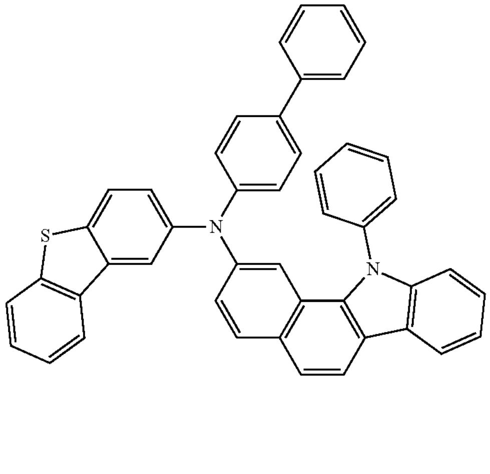

-continued
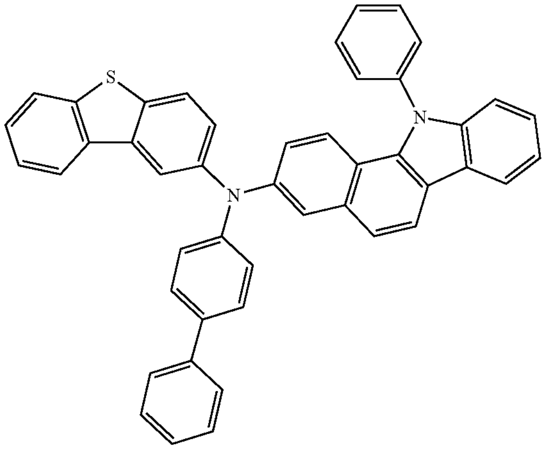
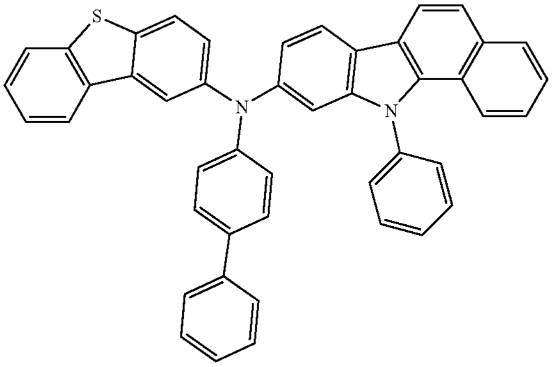
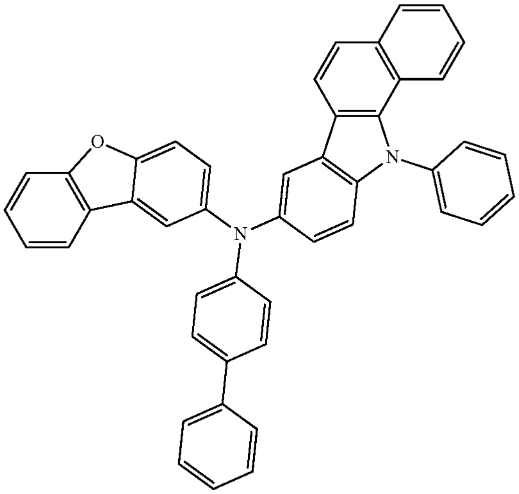
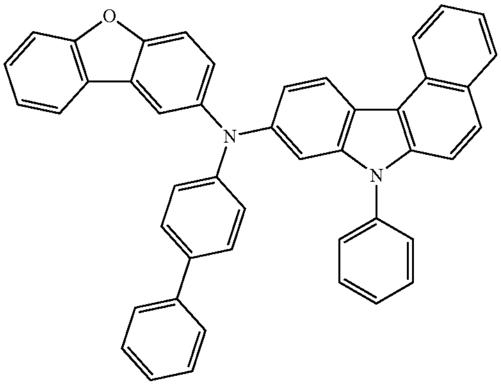
-continued
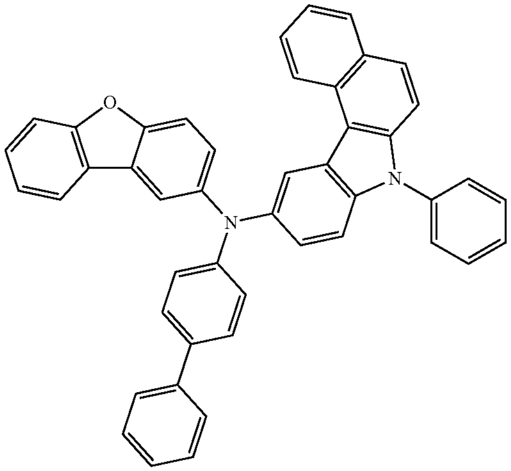
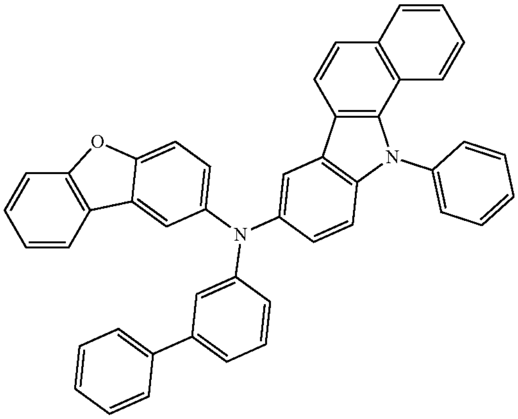
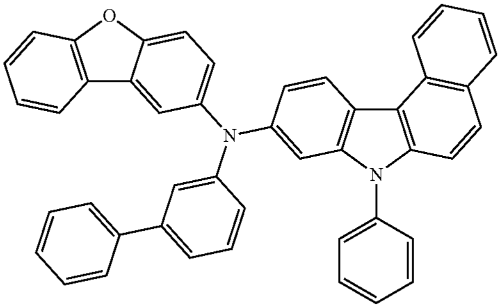
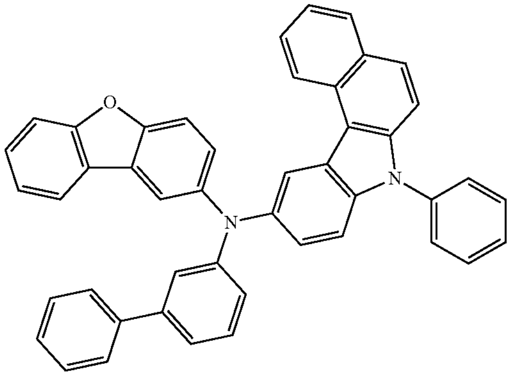

-continued
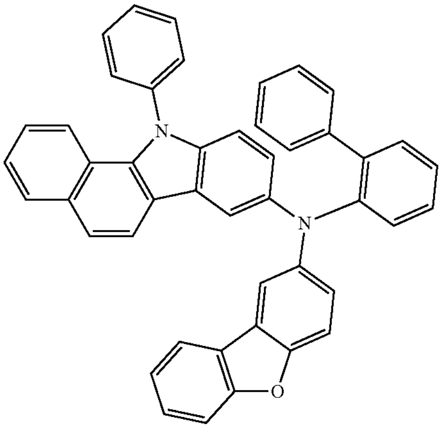
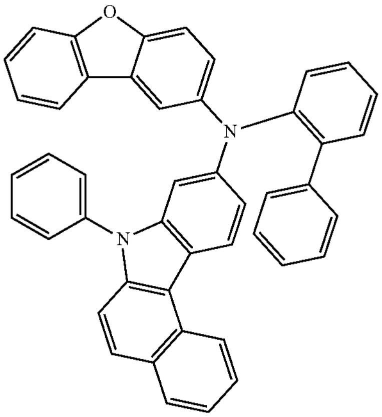
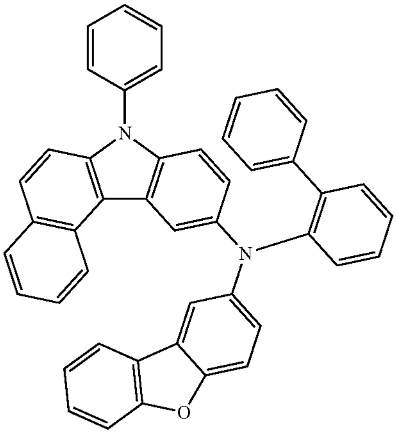
-continued
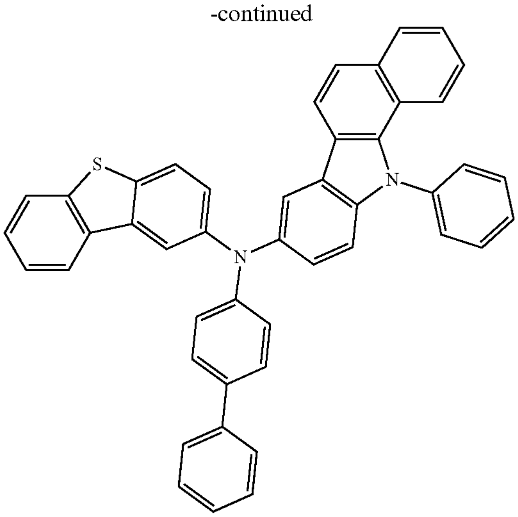
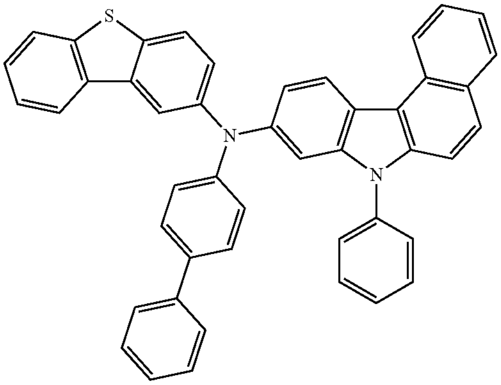
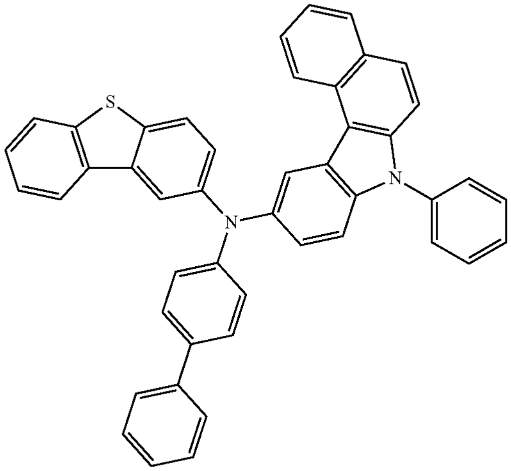
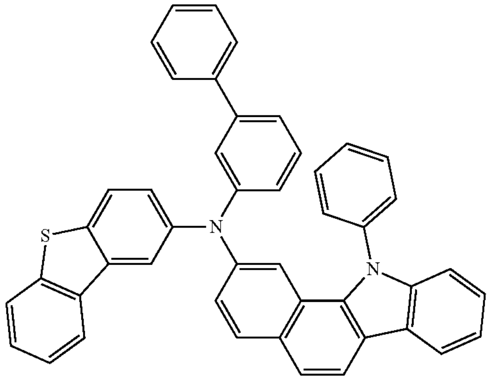

-continued
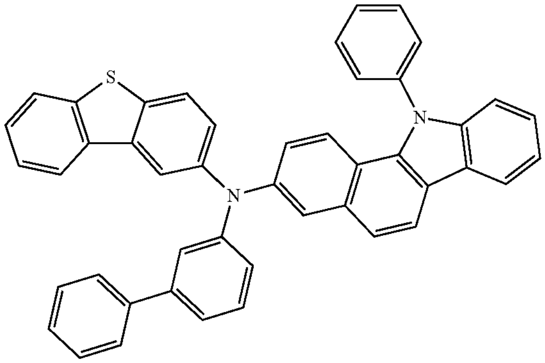
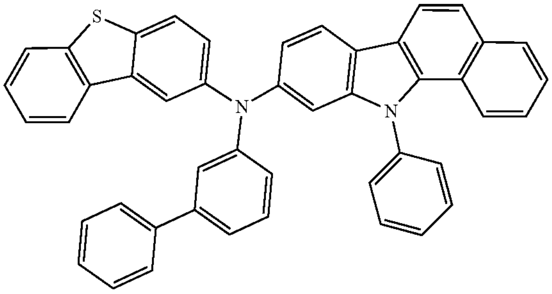
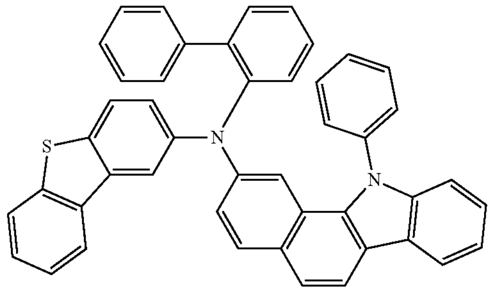
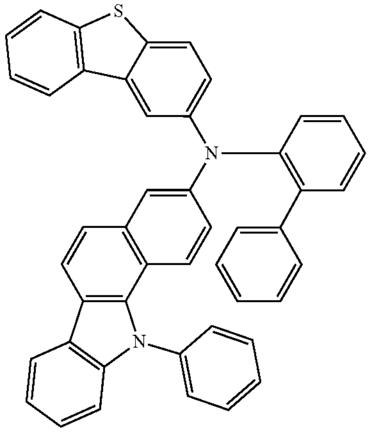
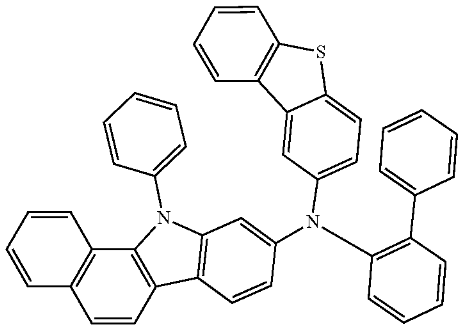
-continued
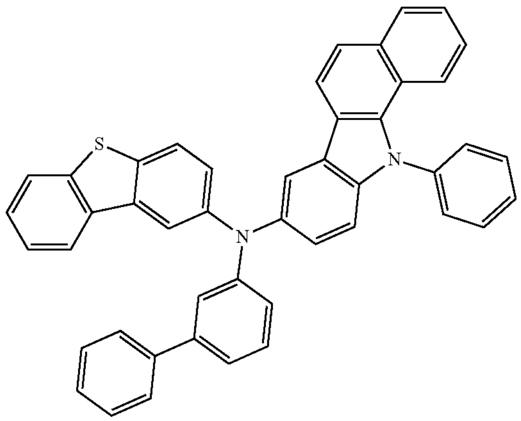
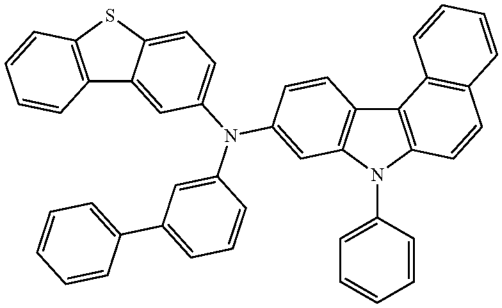
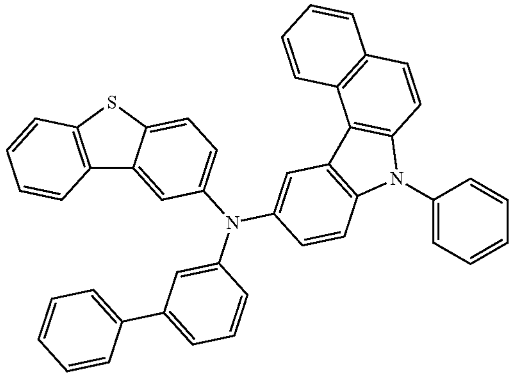
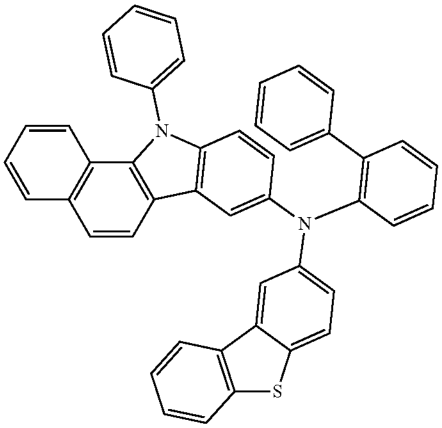

-continued
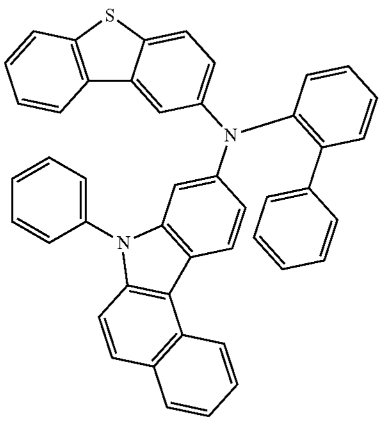
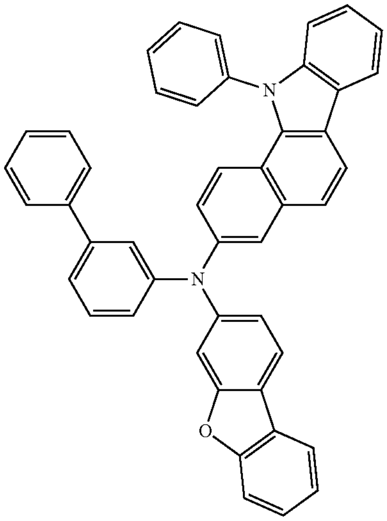
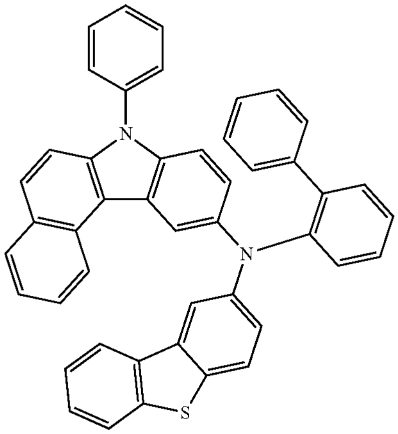
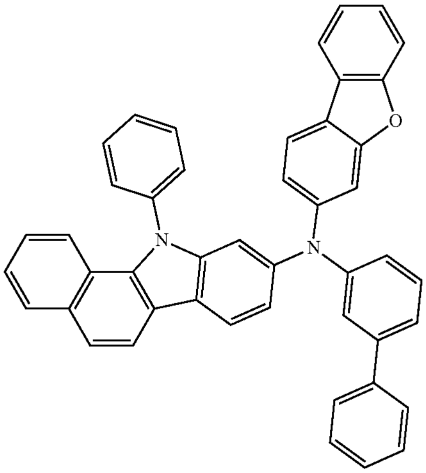
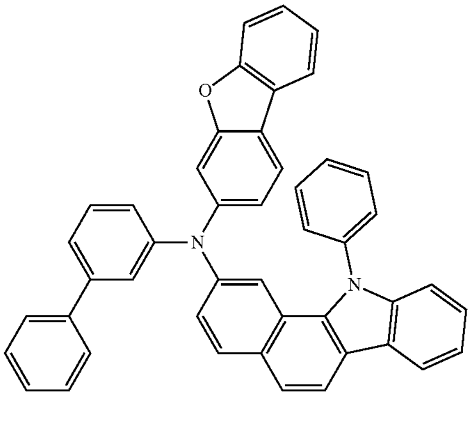
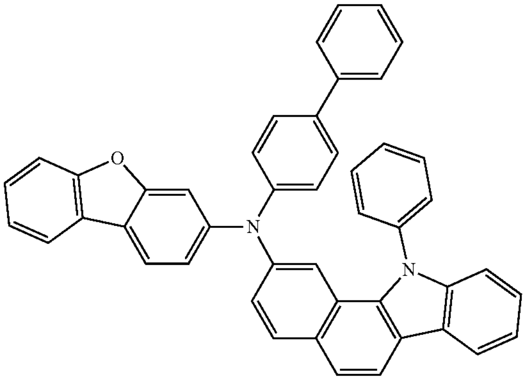
-continued -continued
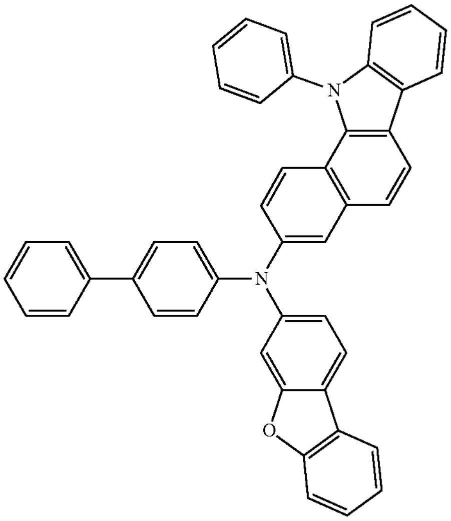
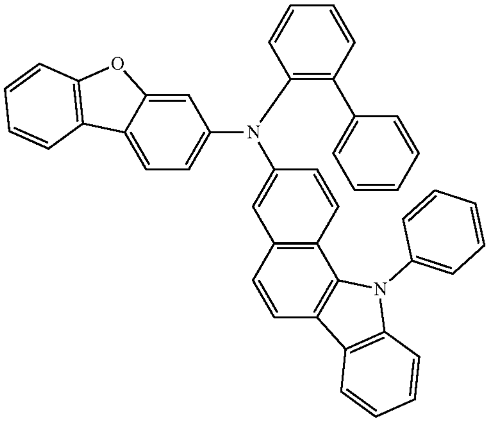
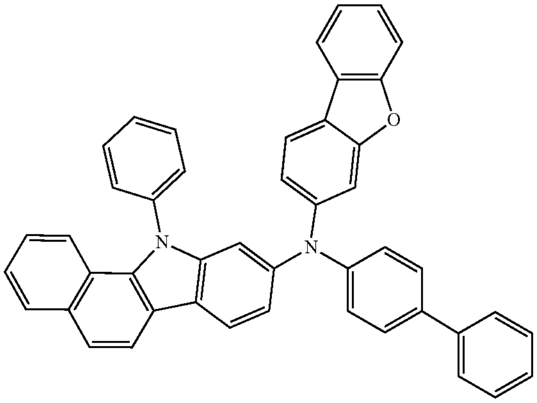
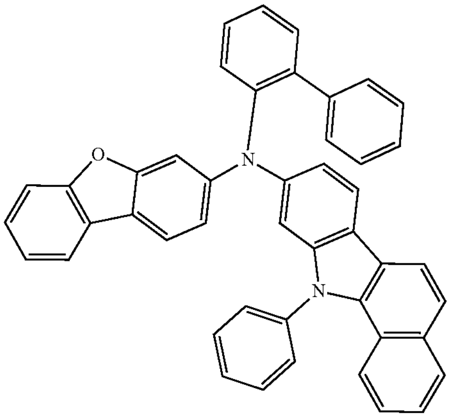
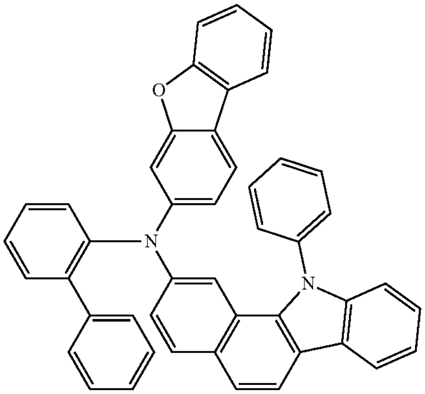
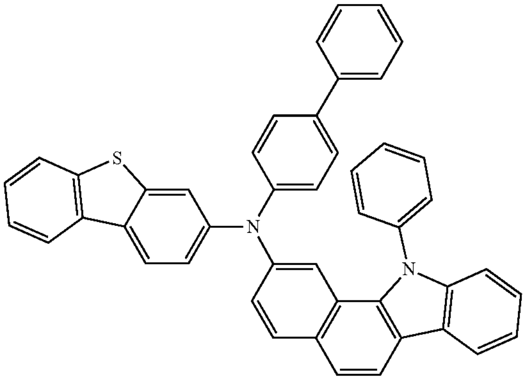
-continued -continued
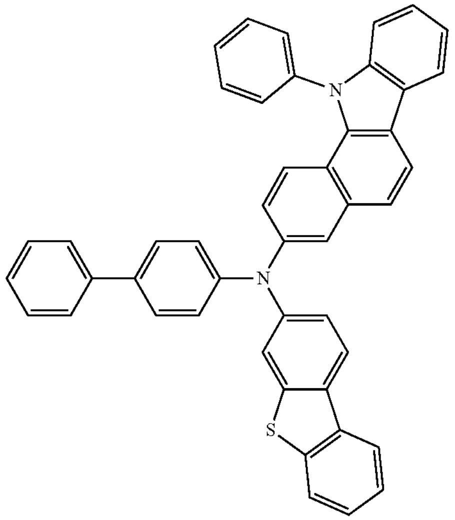
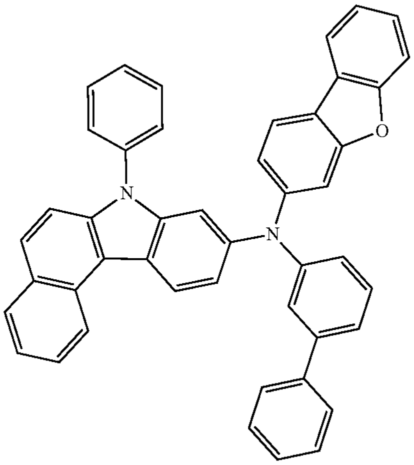
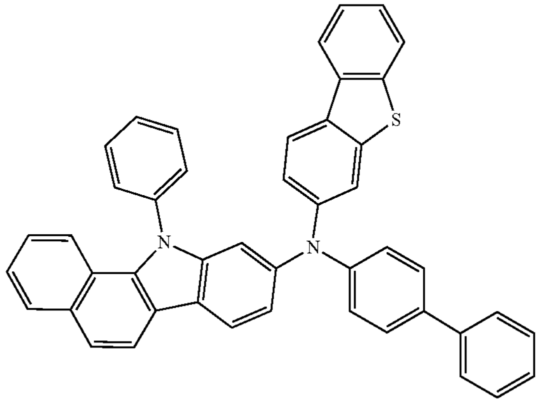
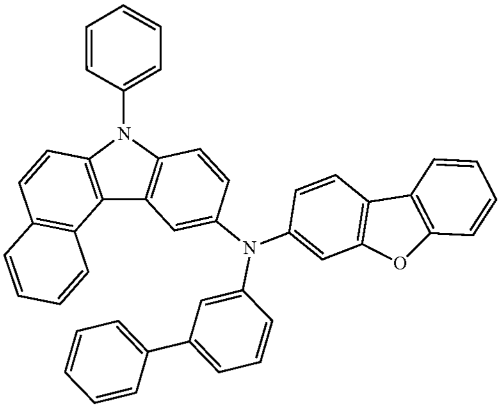
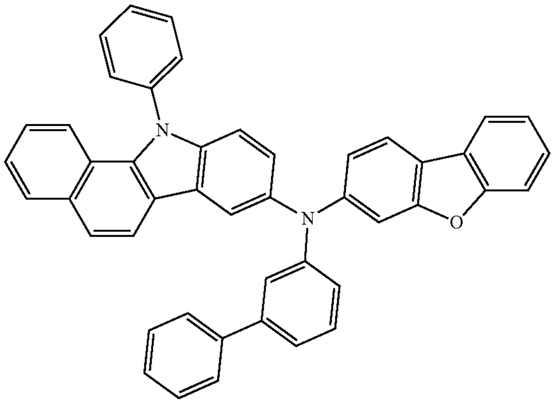
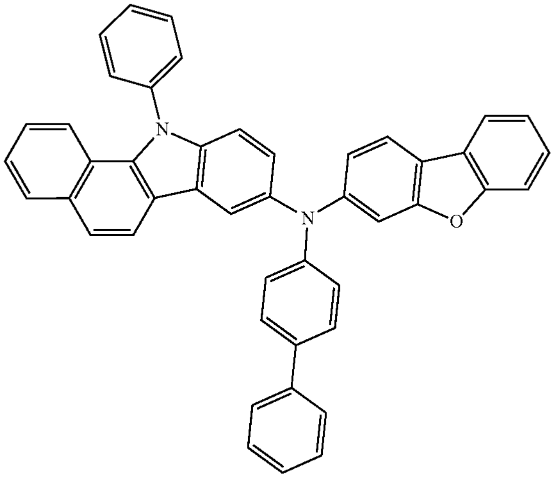
-continued -continued
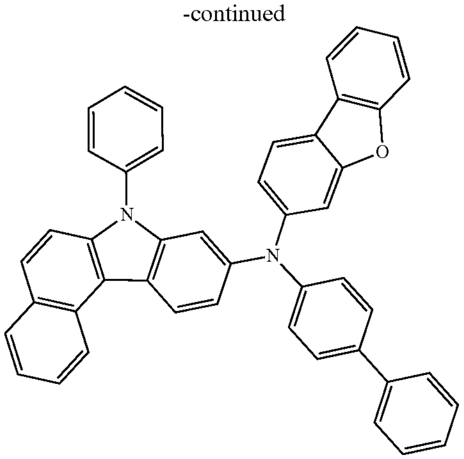
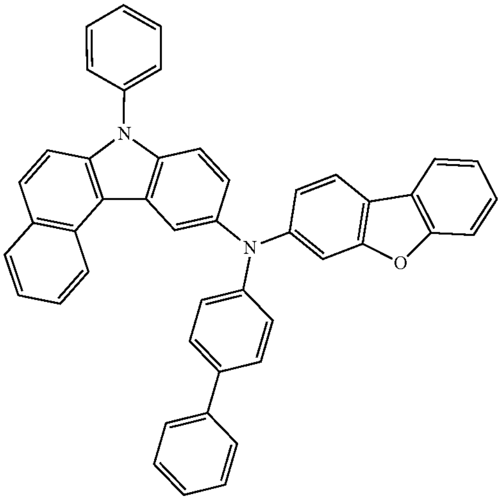
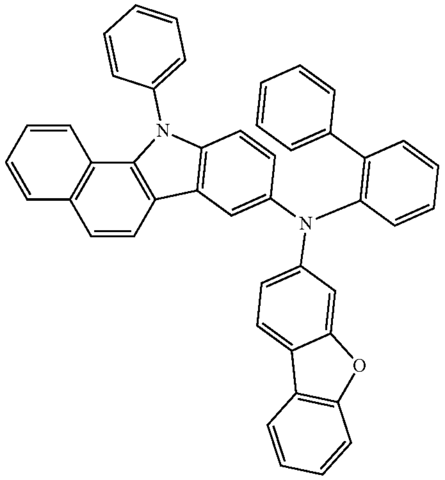
-continued
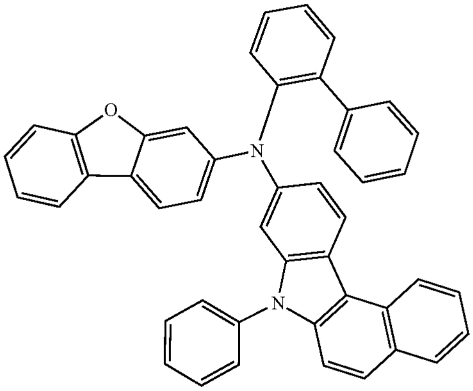
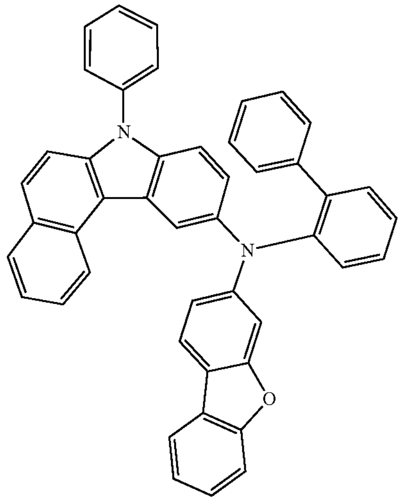
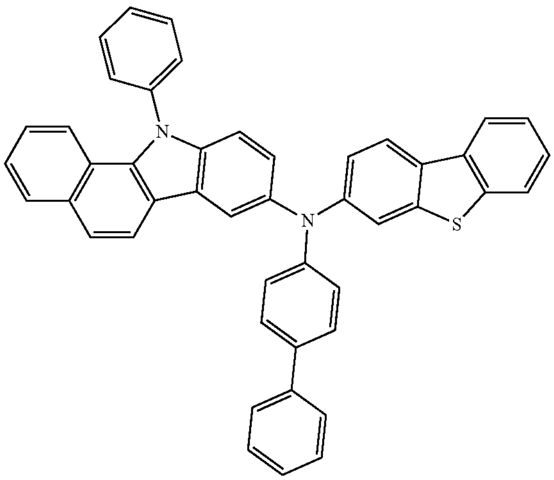

-continued
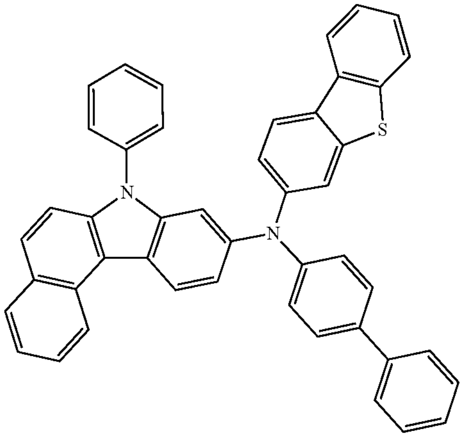
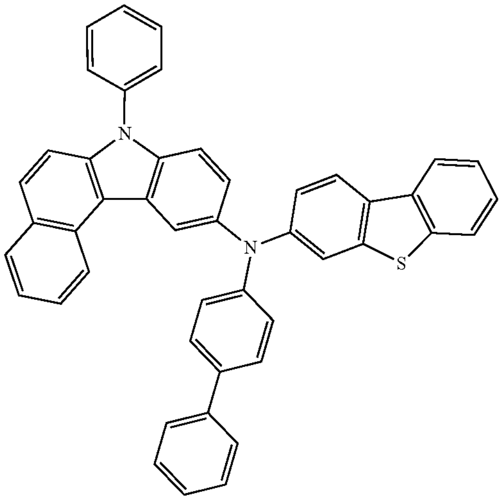
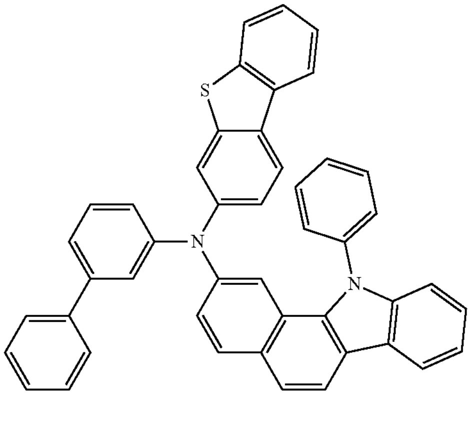
-continued
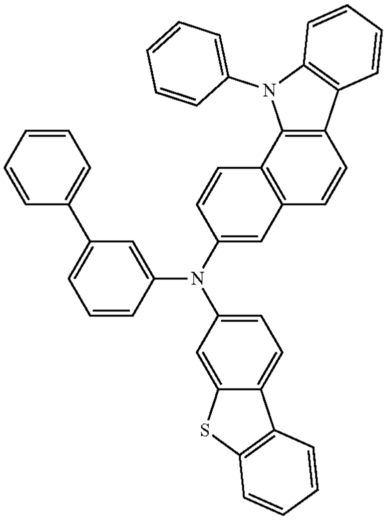
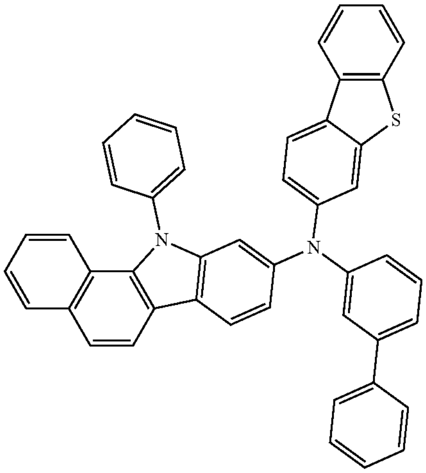
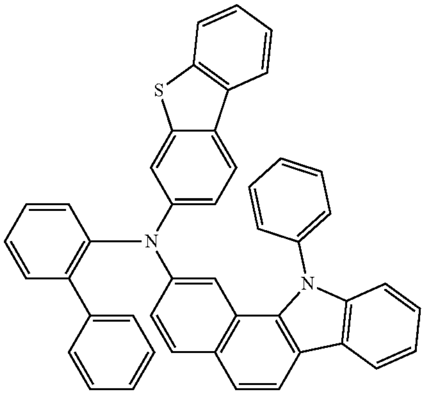

-continued
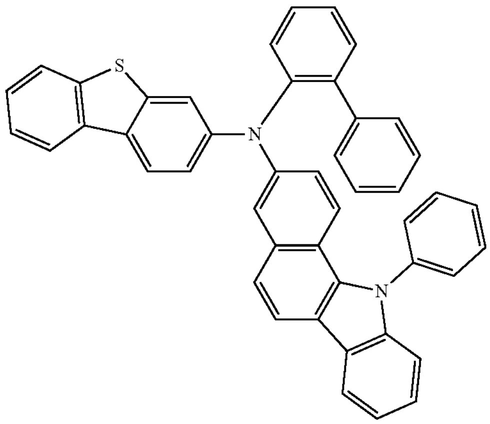
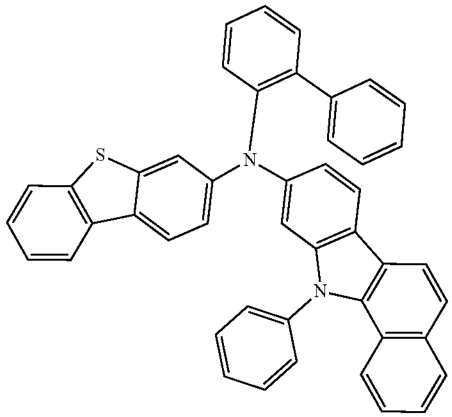
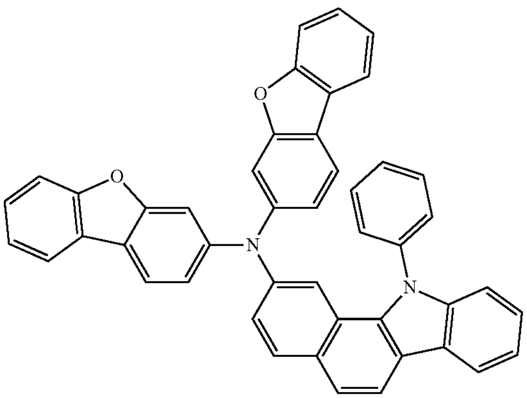
-continued
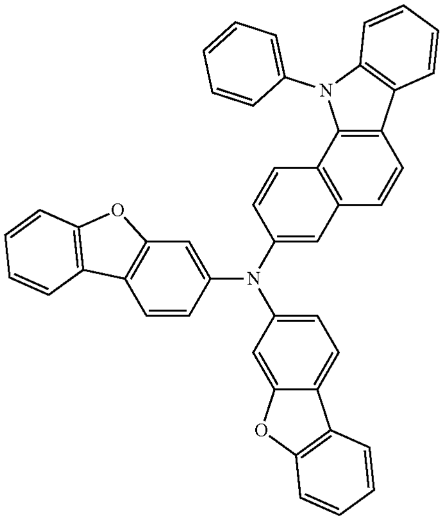
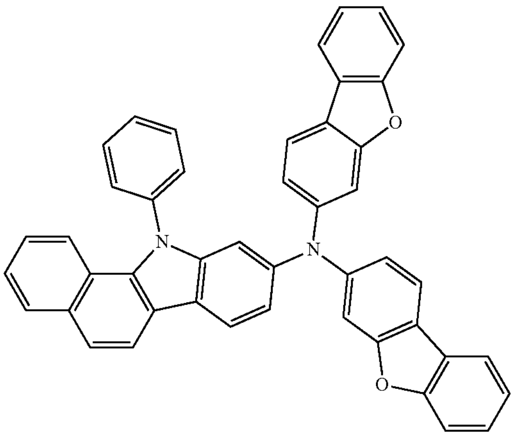
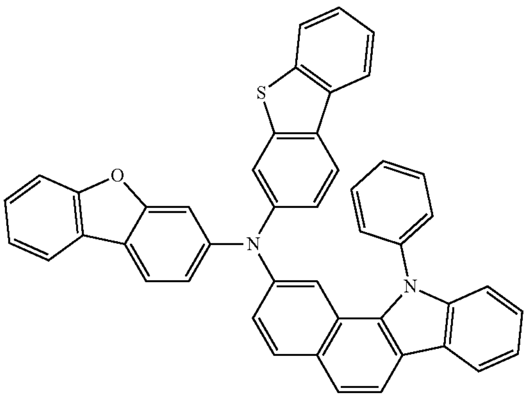

-continued
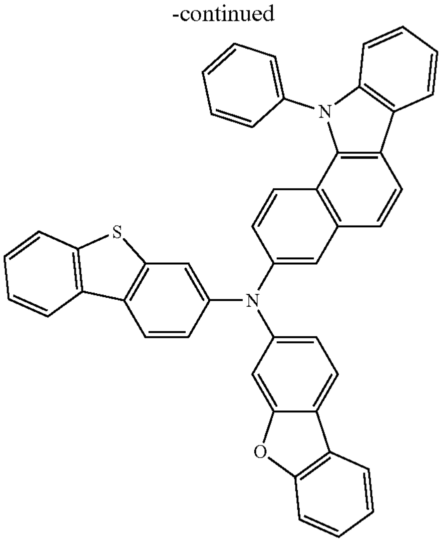
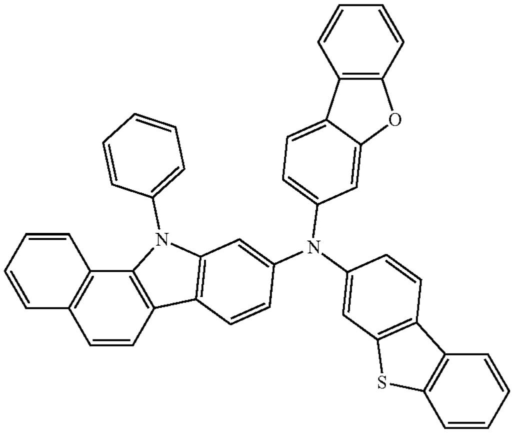
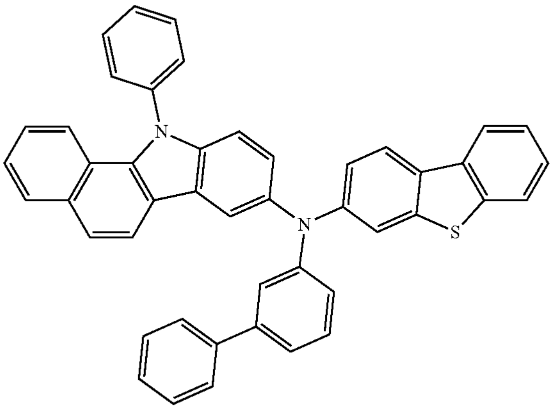
-continued
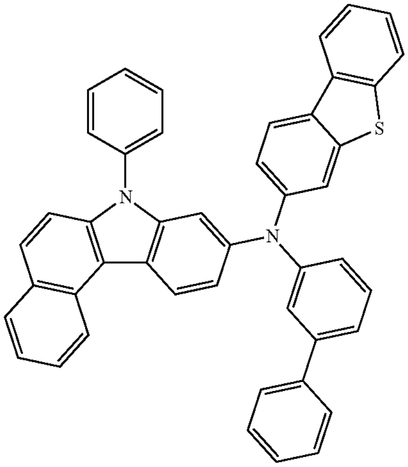
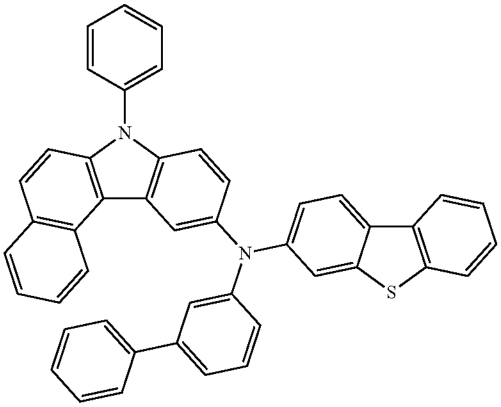
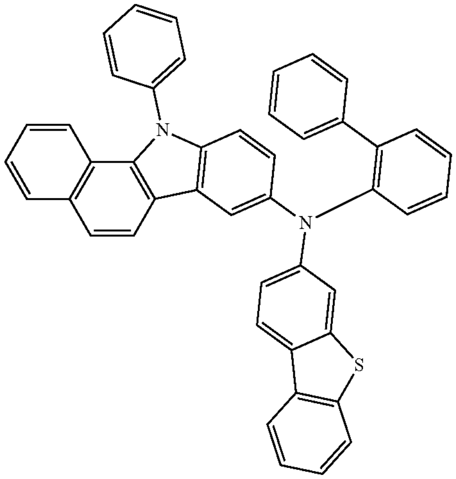

-continued
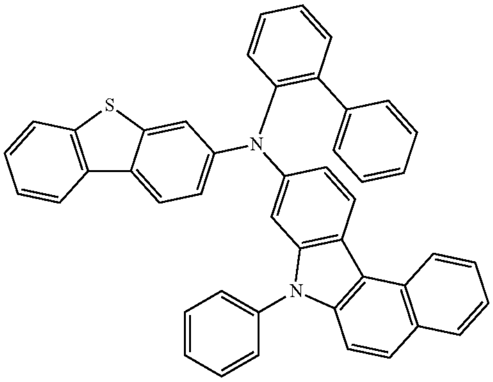
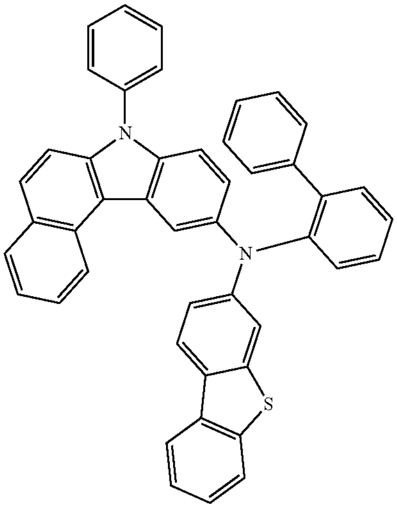
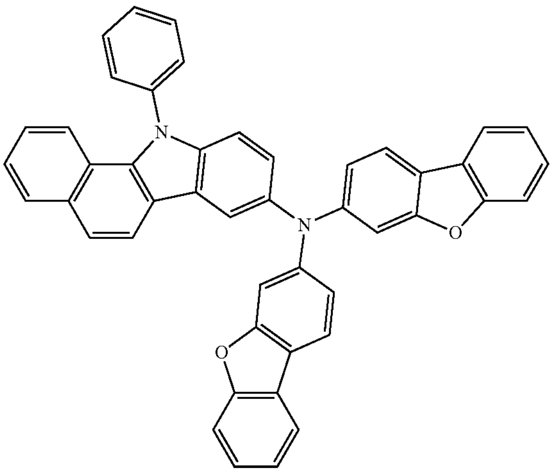
-continued
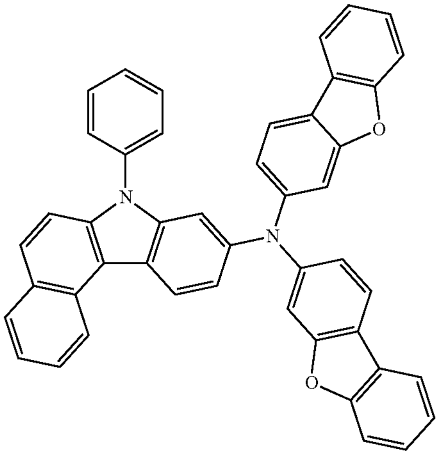
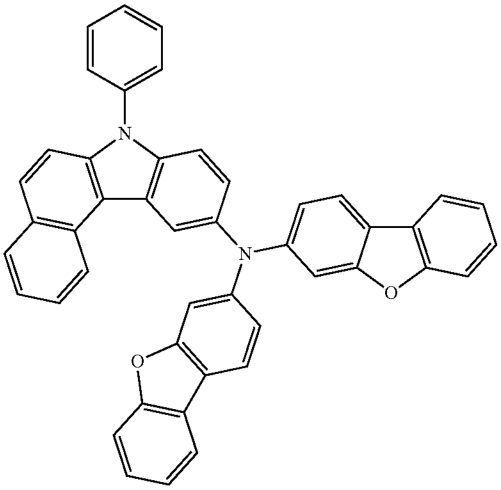
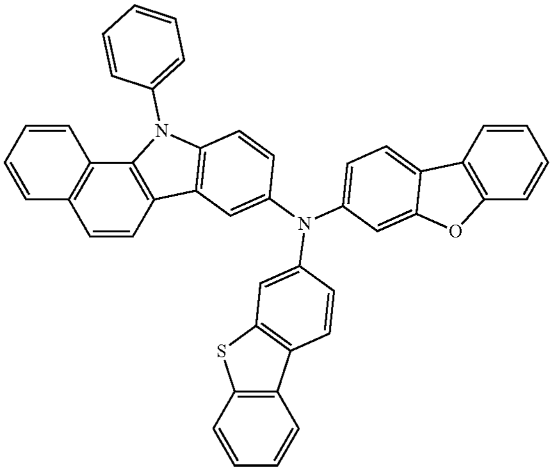

-continued
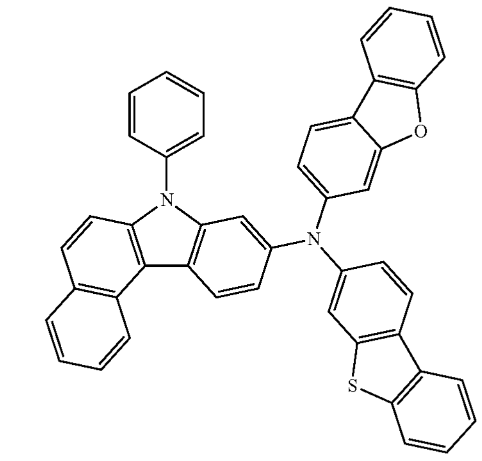
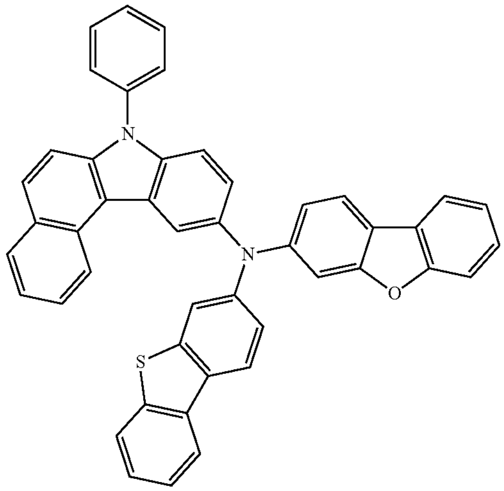
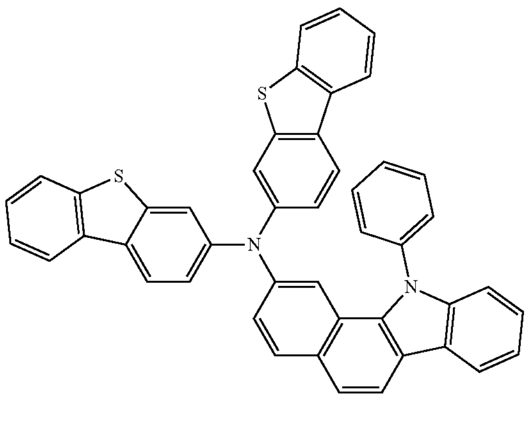
-continued
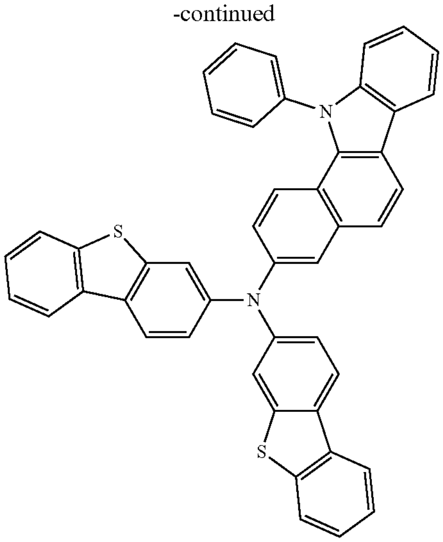
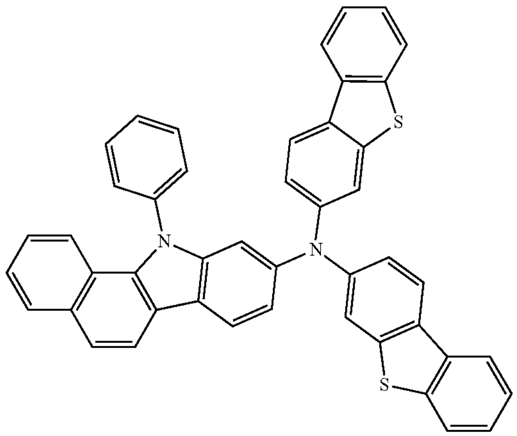
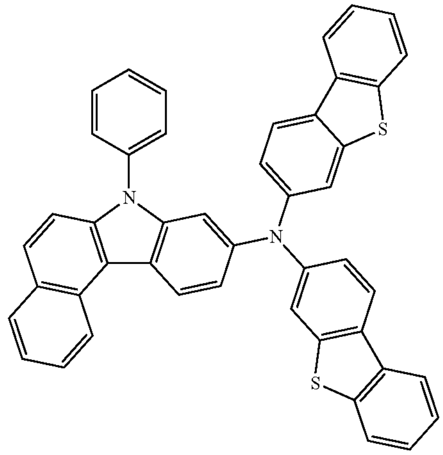

-continued
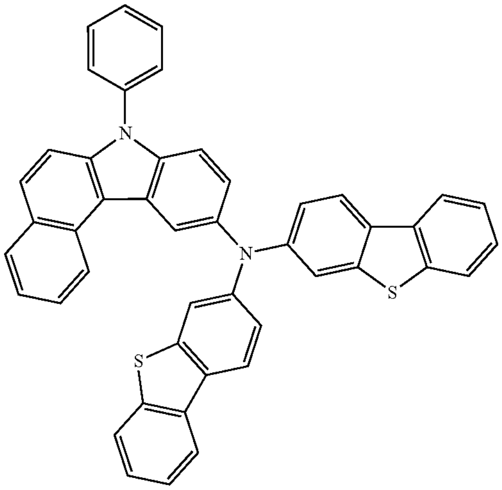
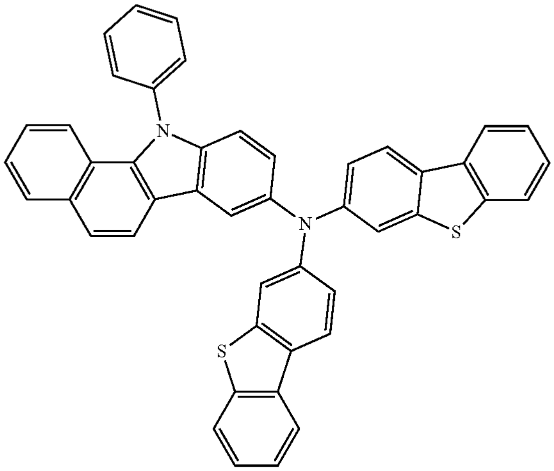
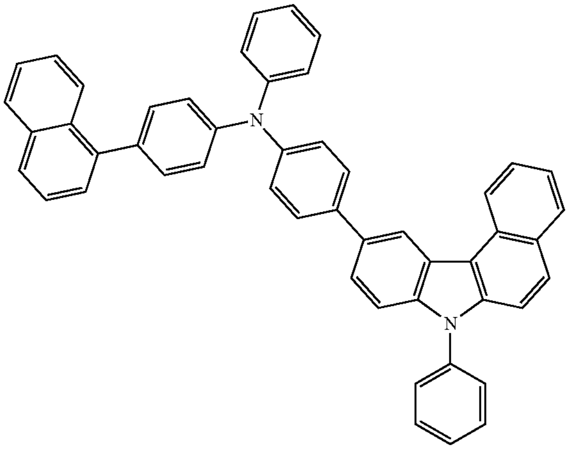
-continued
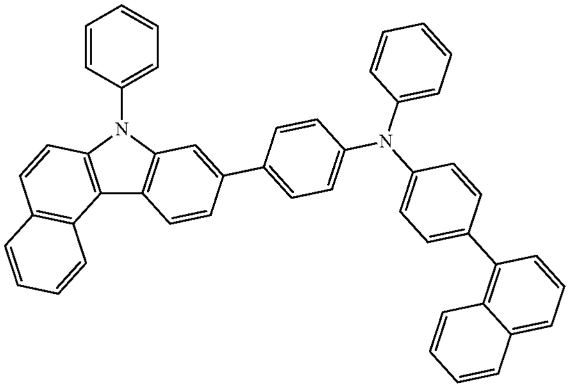
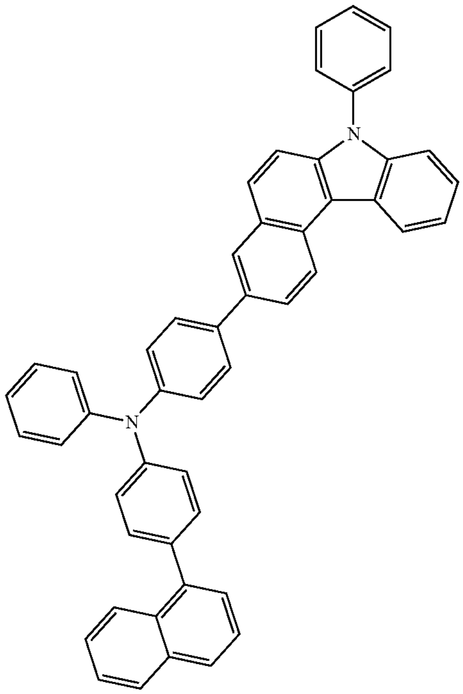
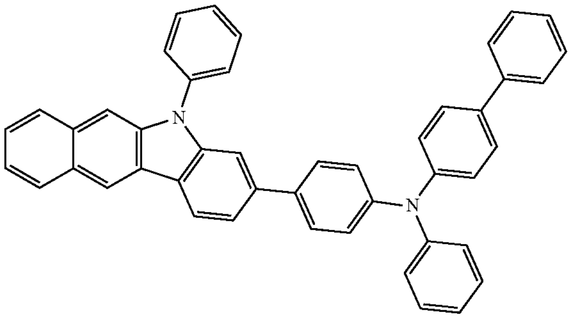

-continued
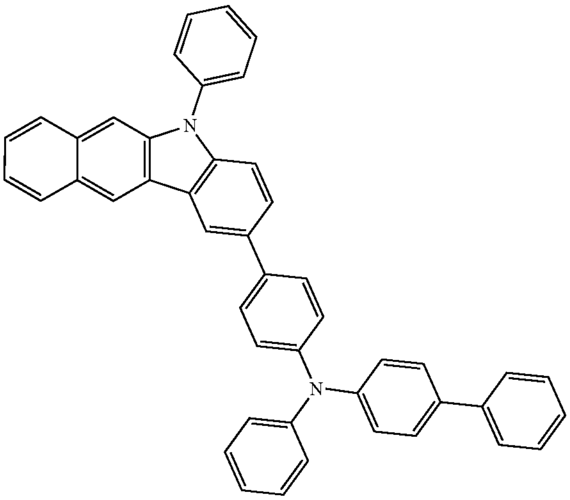
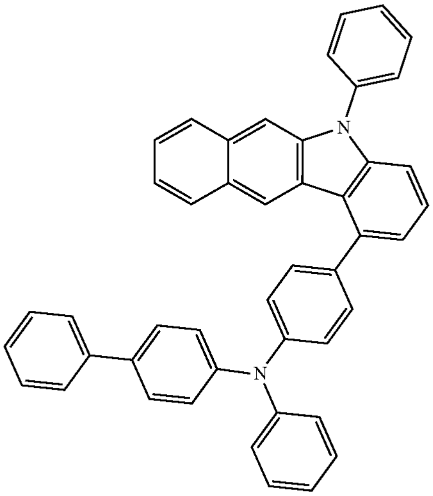
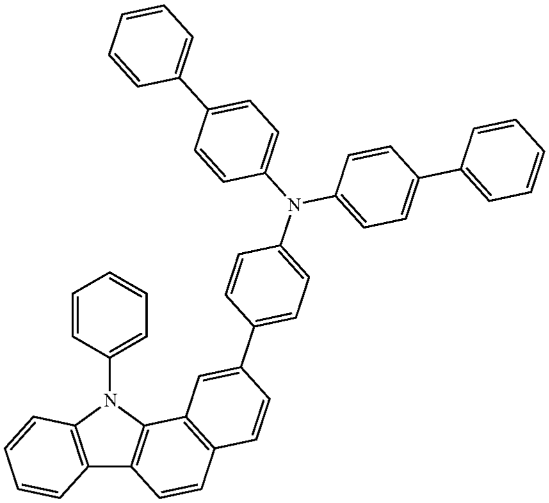
-continued
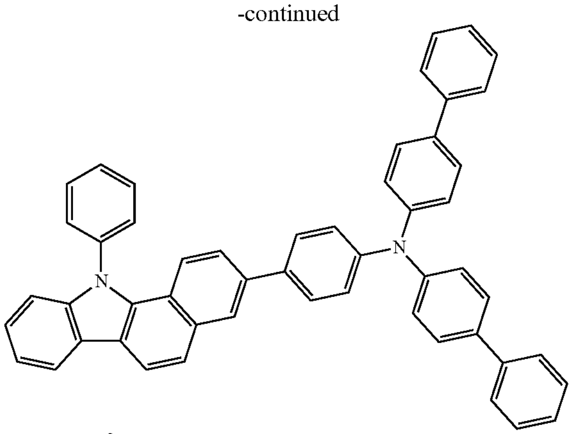
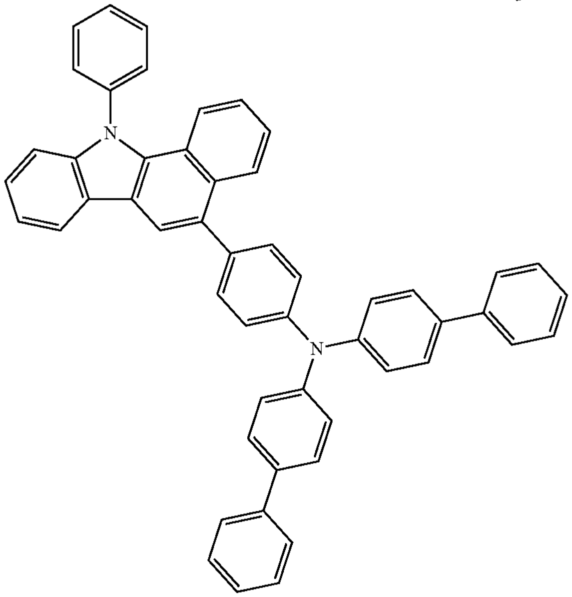
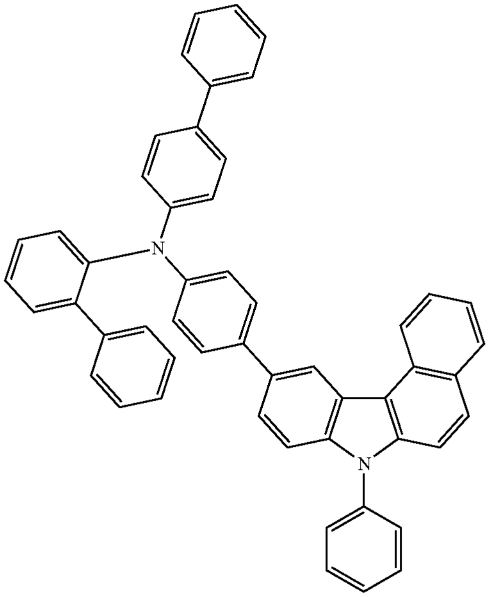

-continued
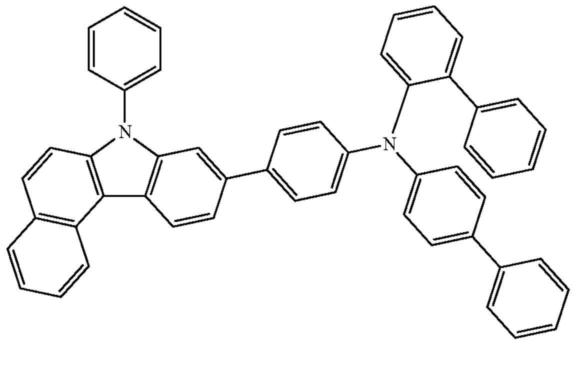
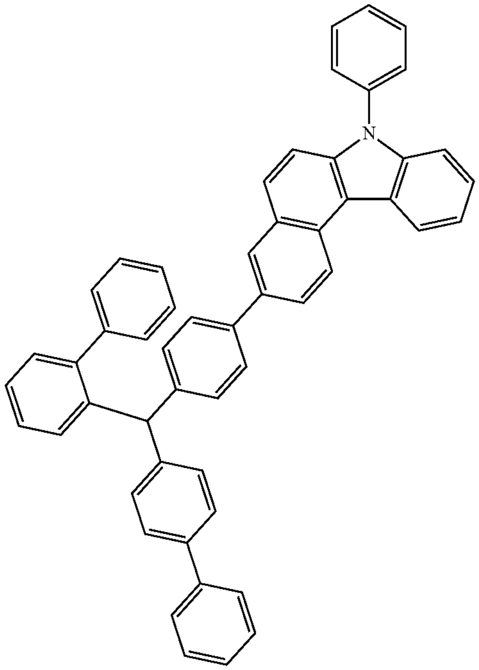
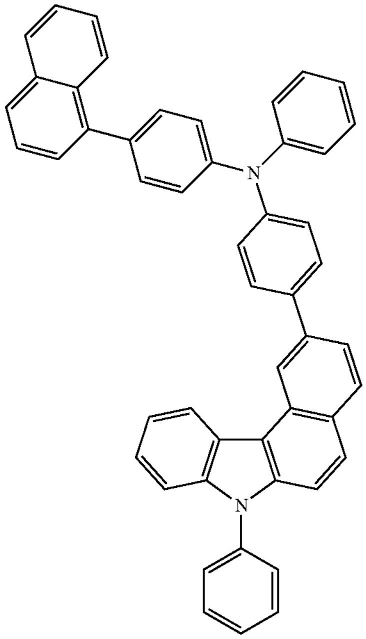
-continued
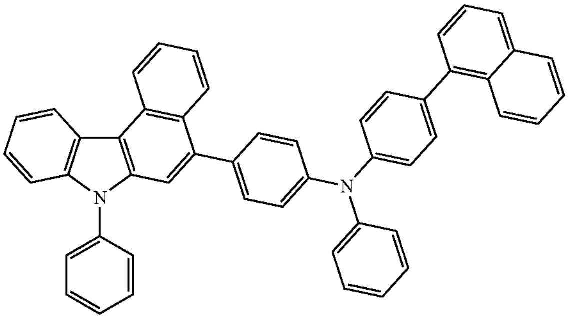
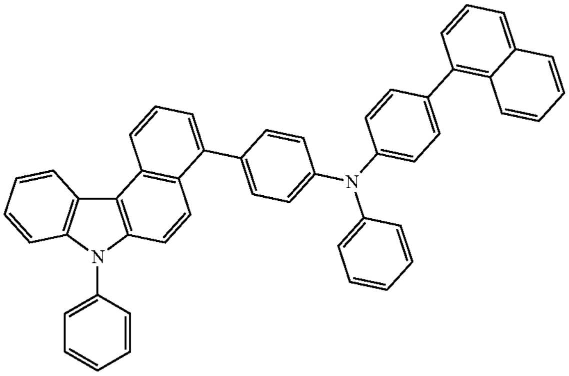
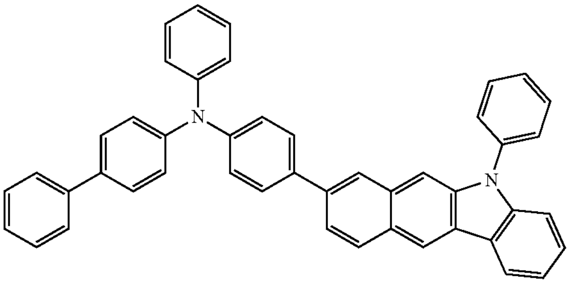
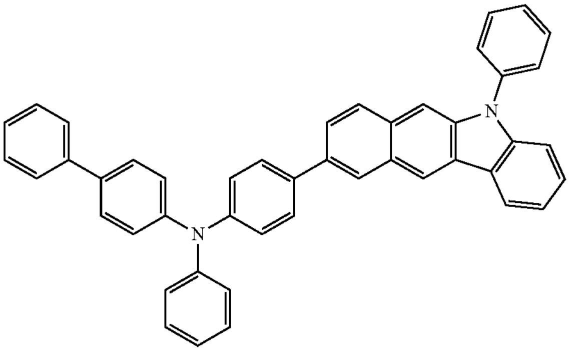

-continued
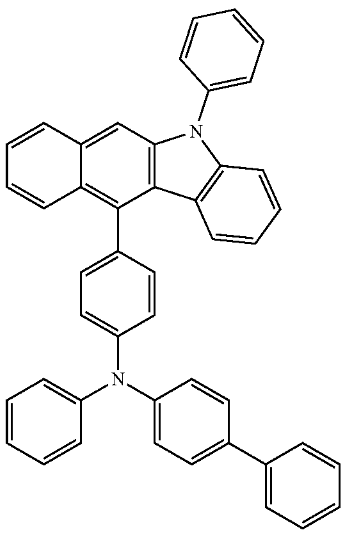
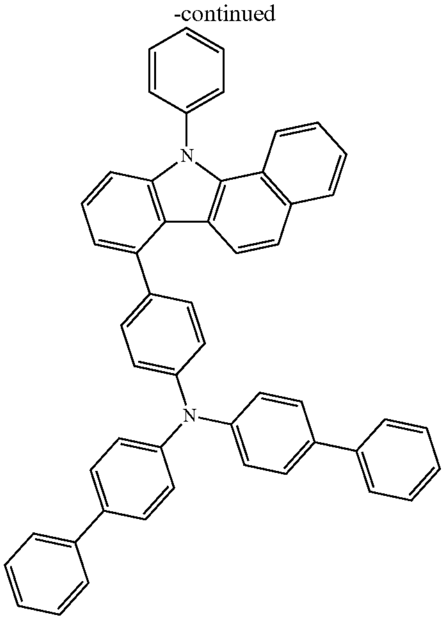
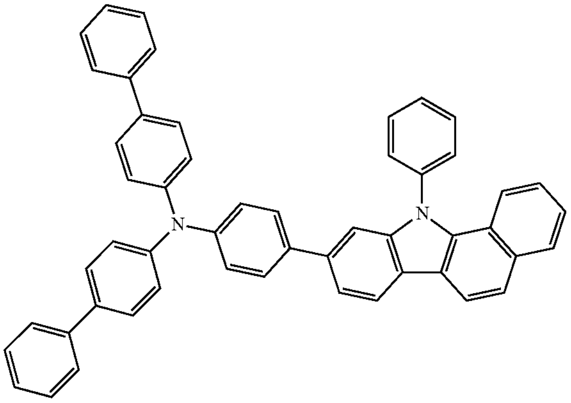
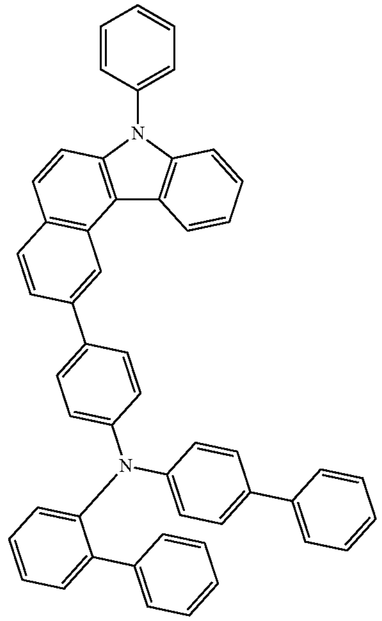
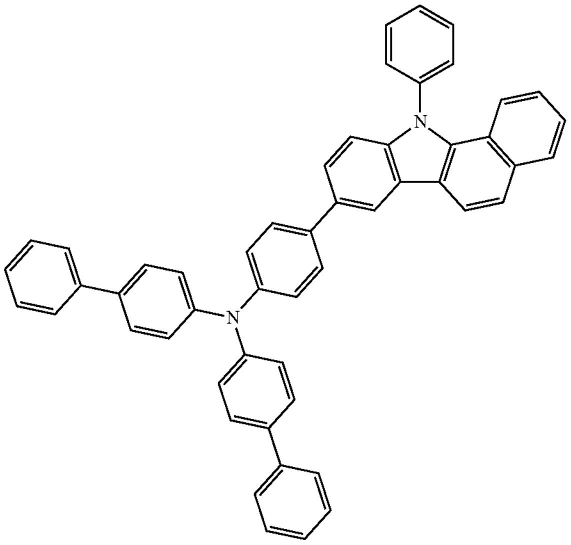
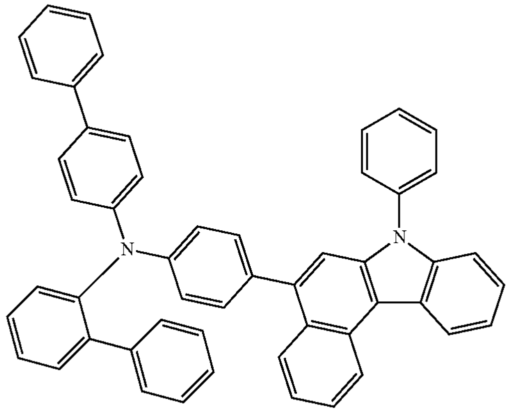

-continued
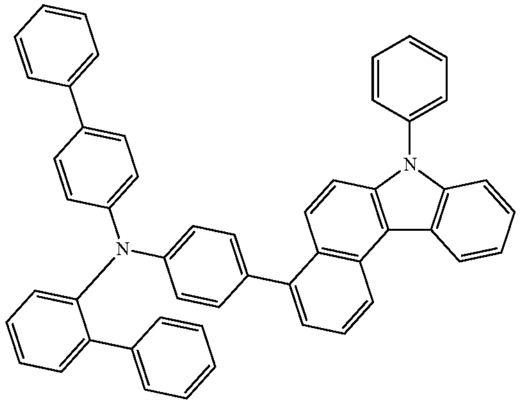
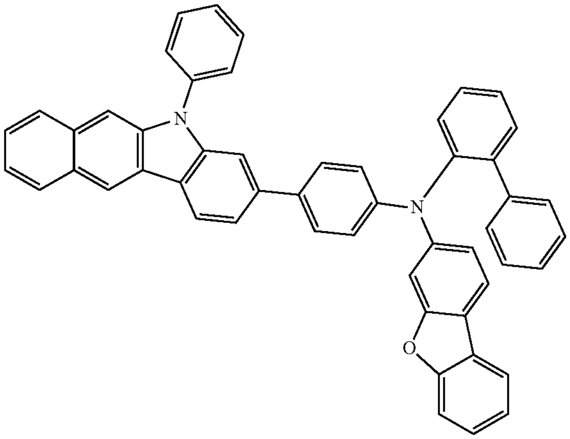
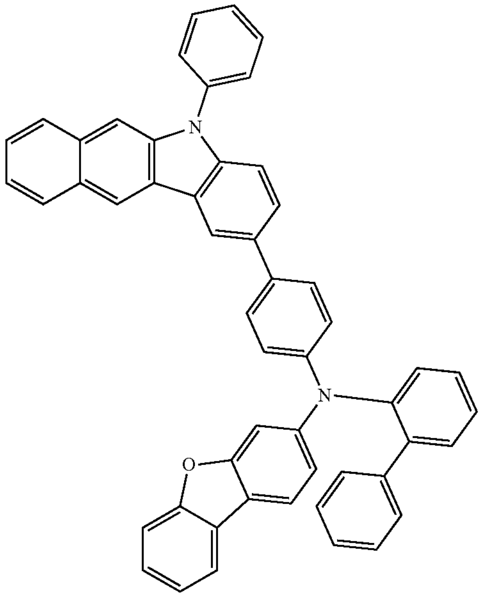
-continued
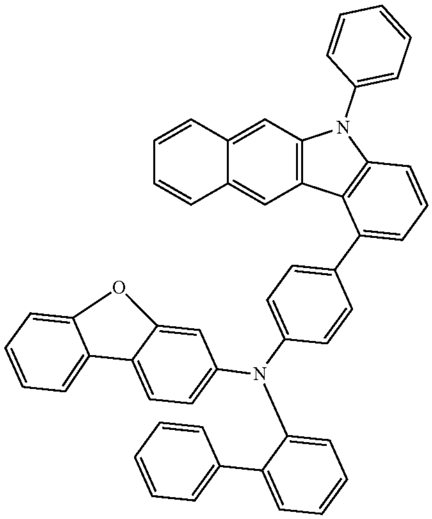
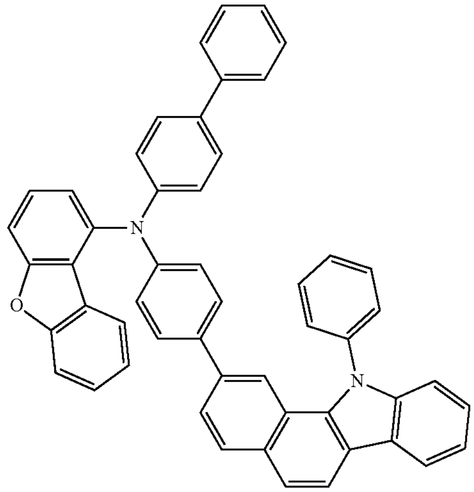
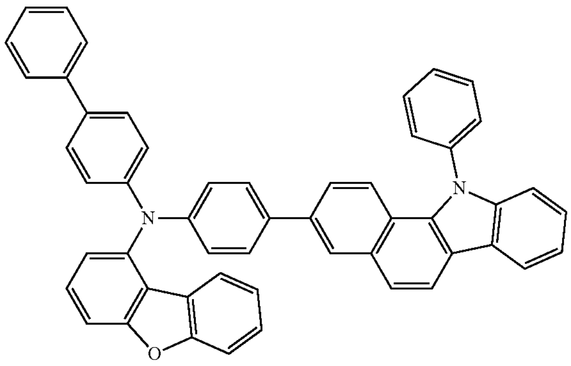

-continued
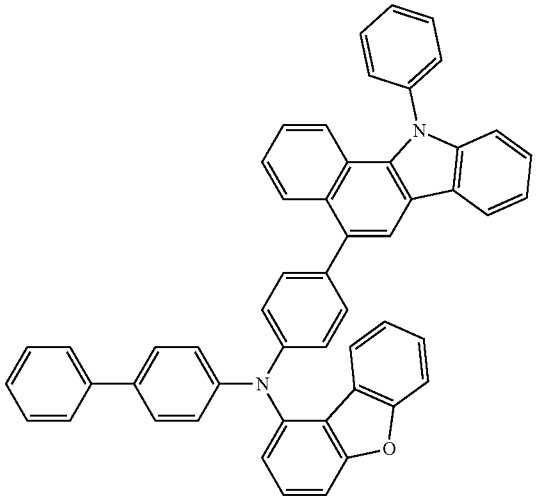
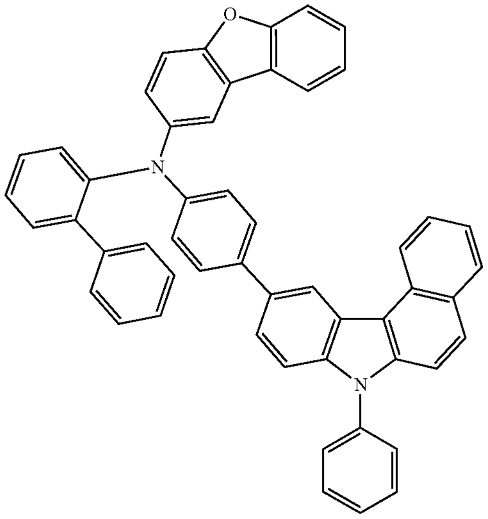
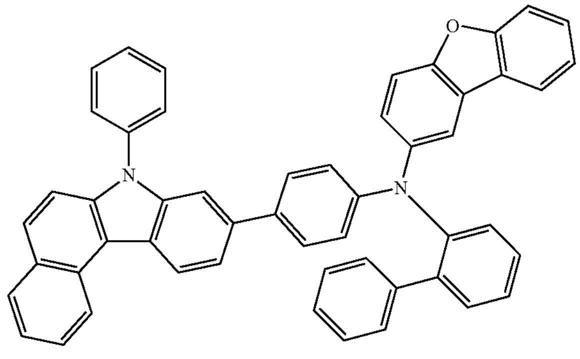
-continued
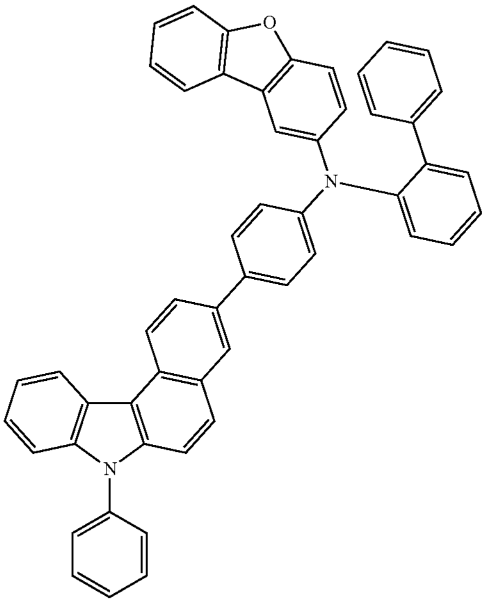
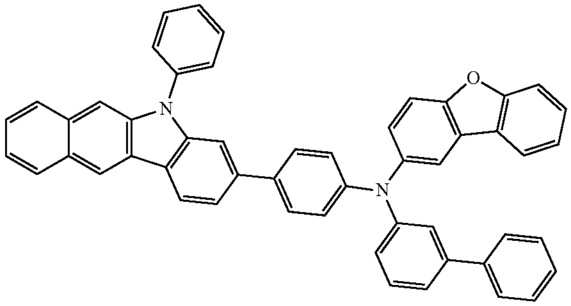
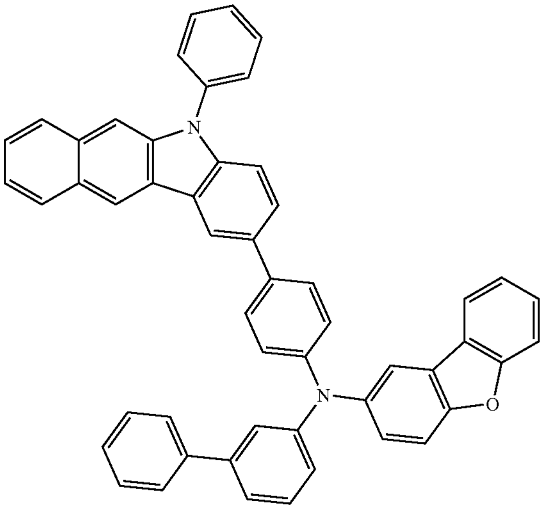

-continued
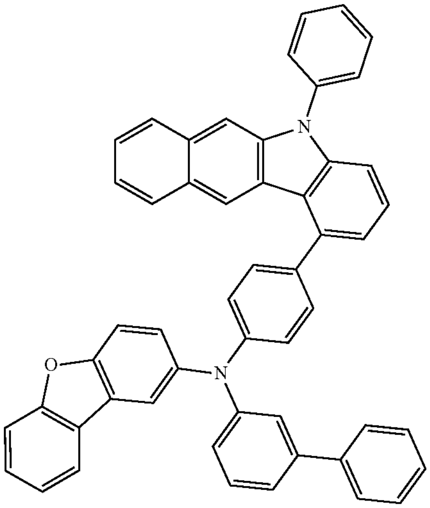
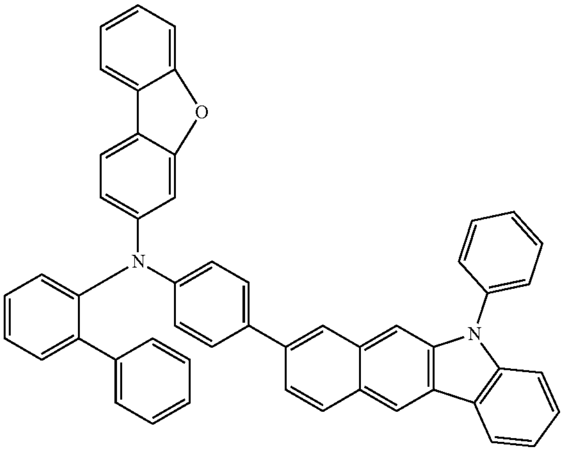
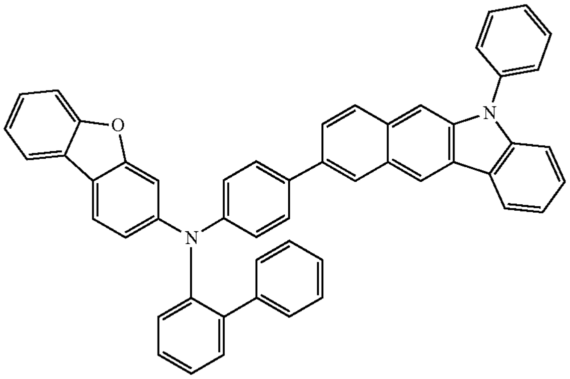
-continued
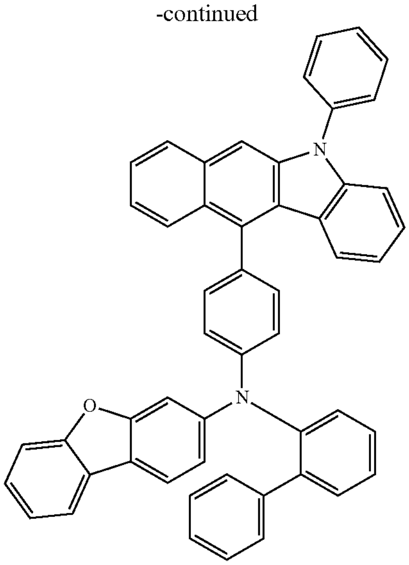
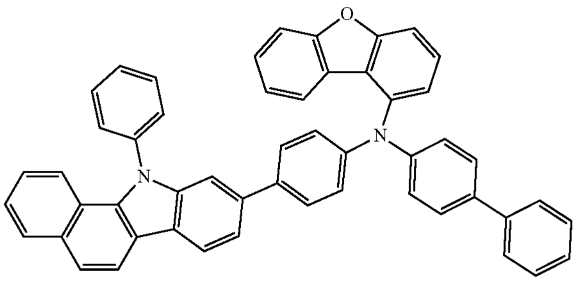
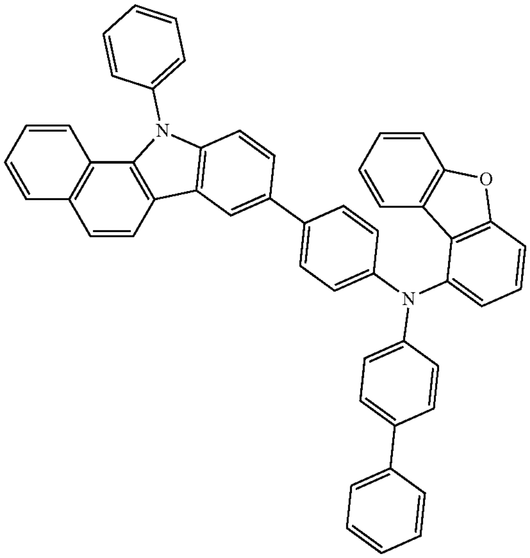

-continued
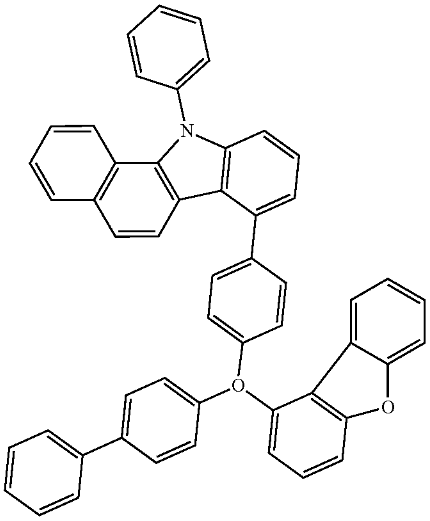
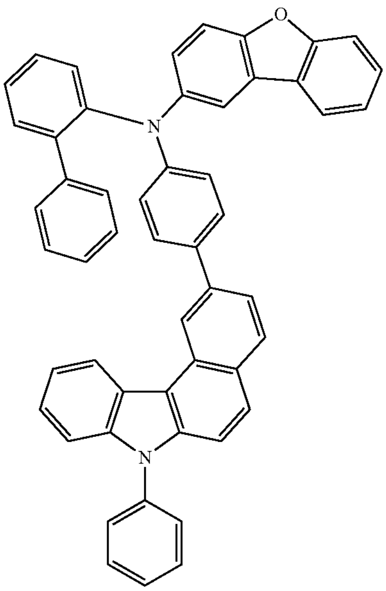
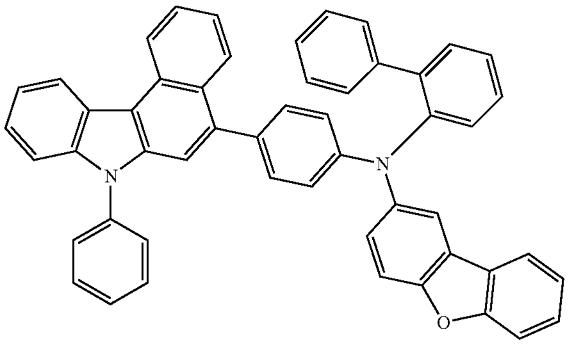
-continued
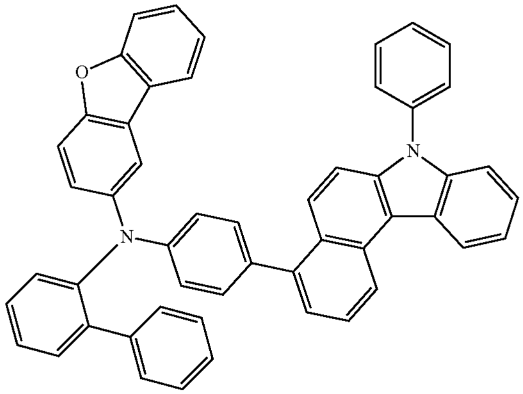
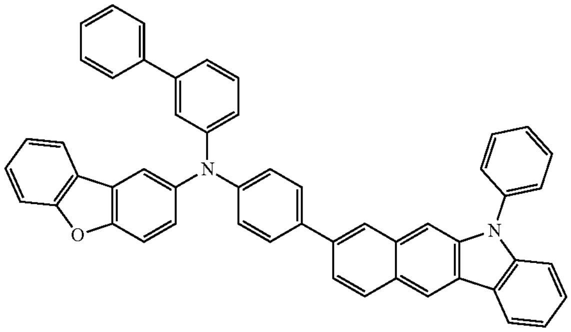
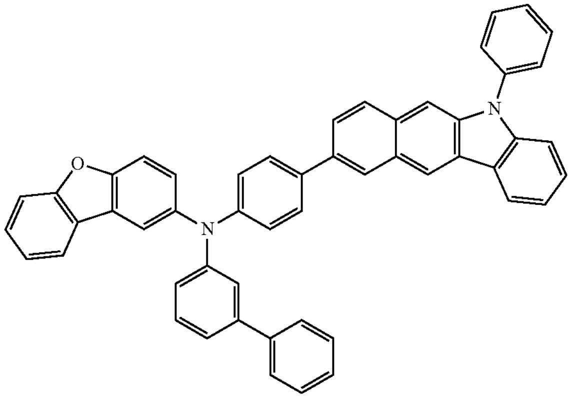
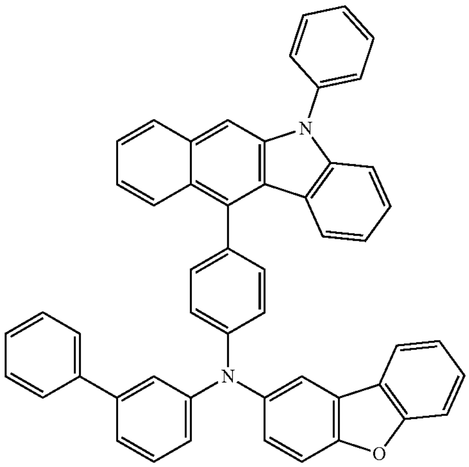

-continued
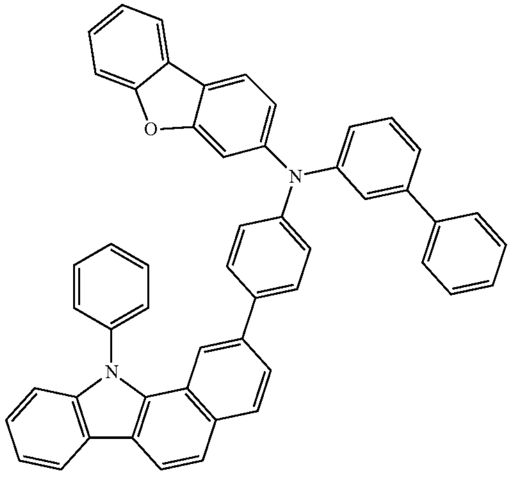
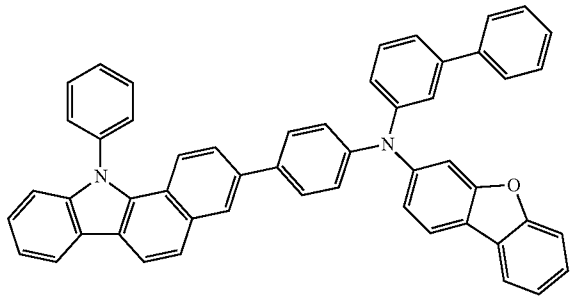
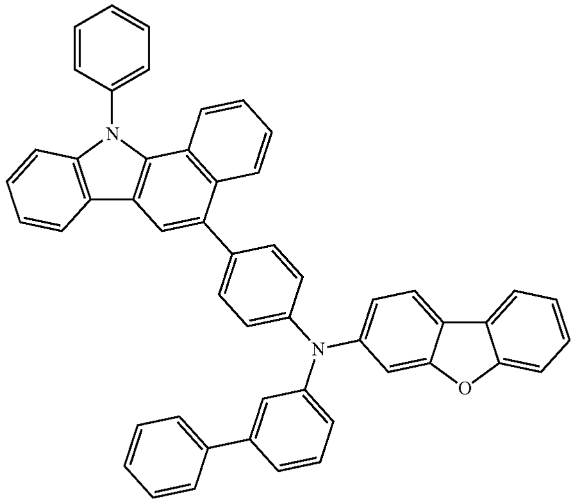
-continued
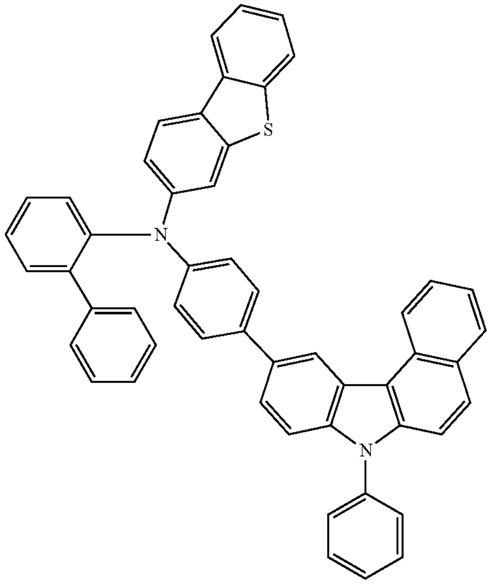
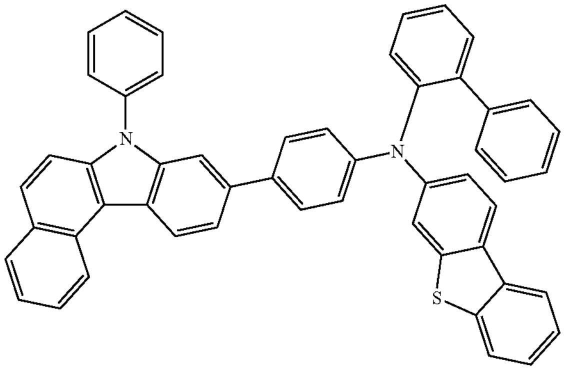
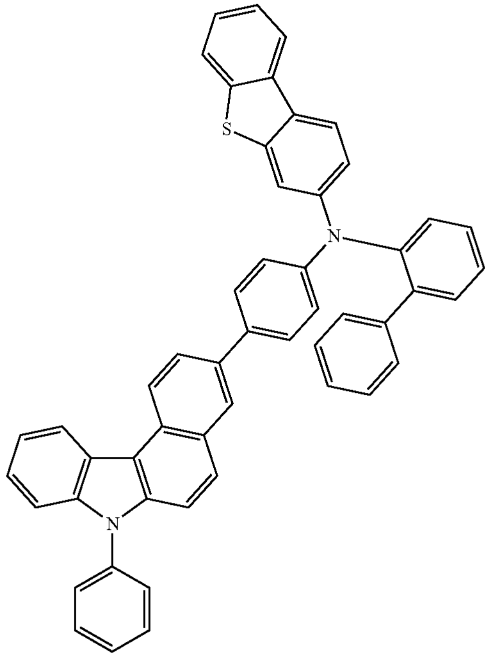

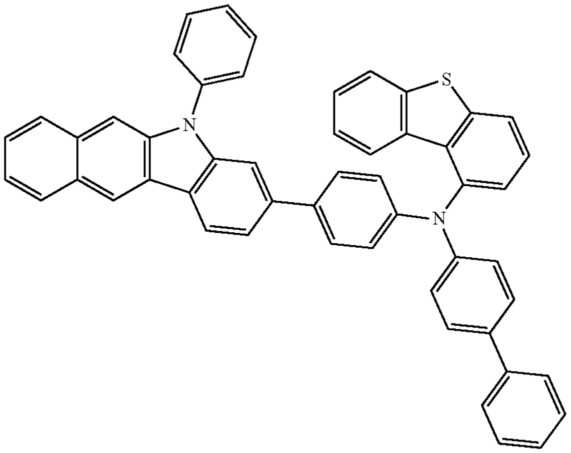
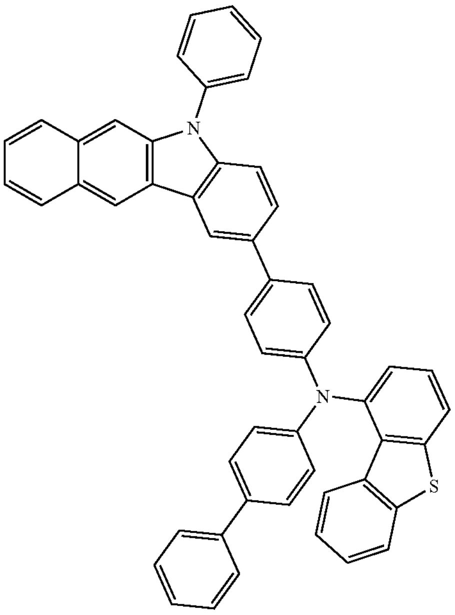
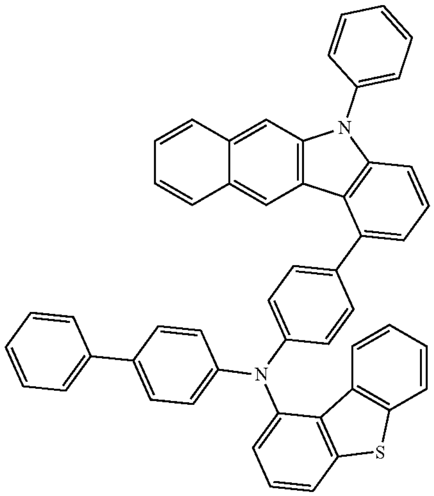
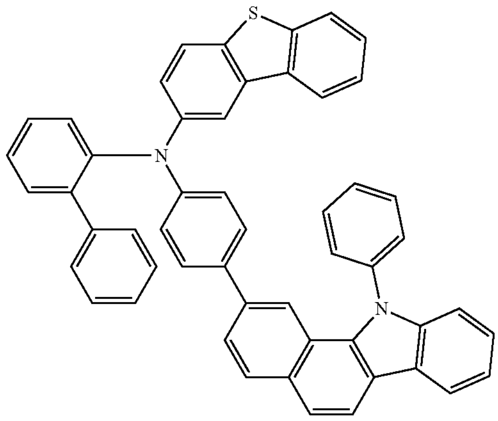
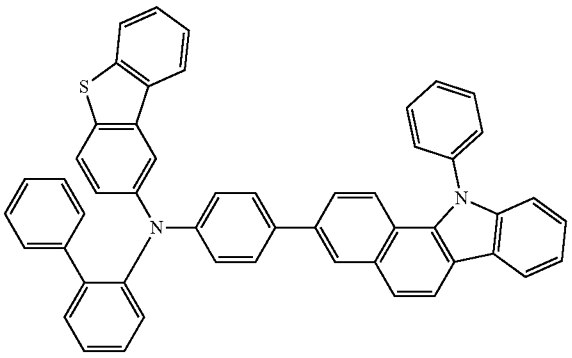
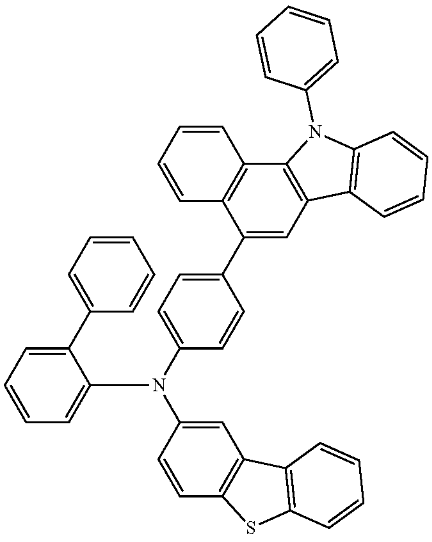
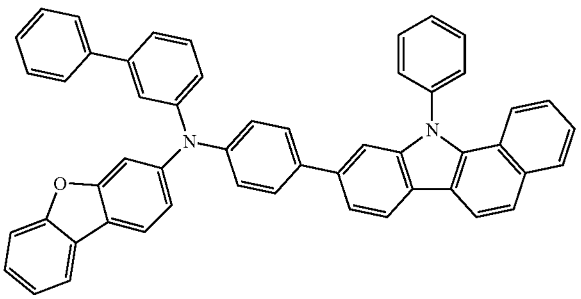

-continued
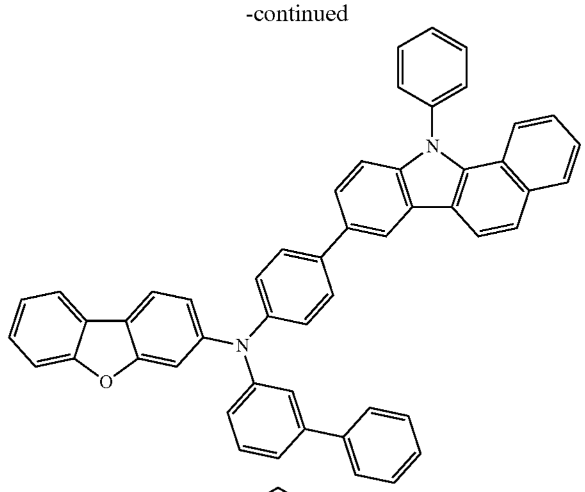
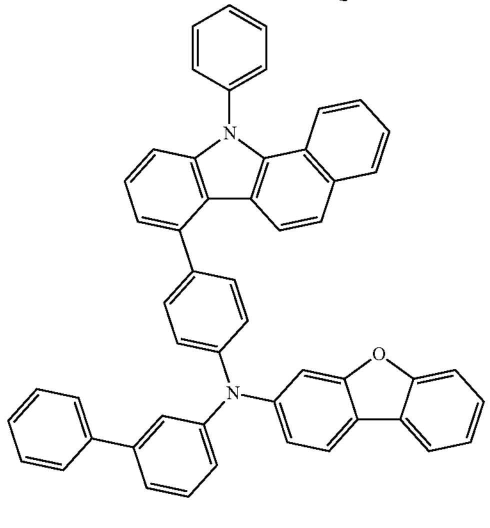
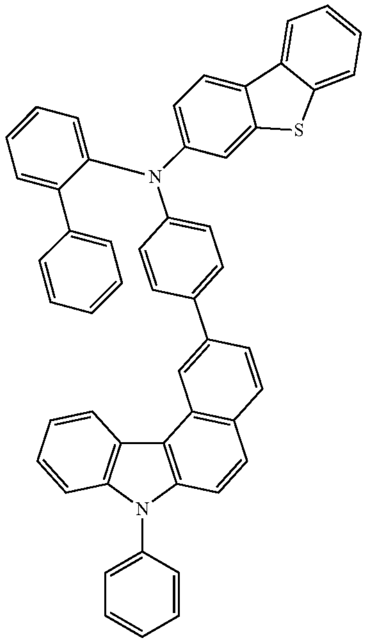
-continued
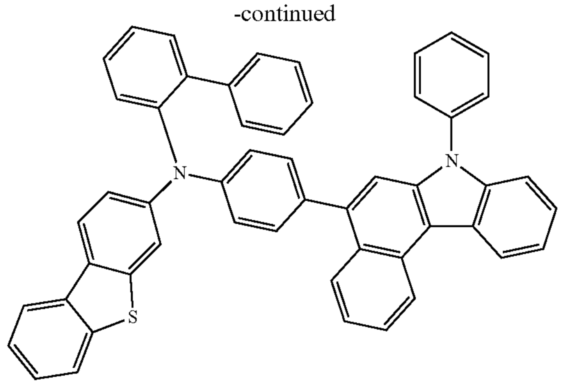
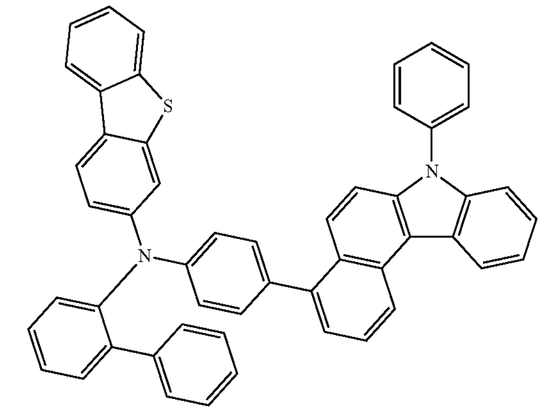
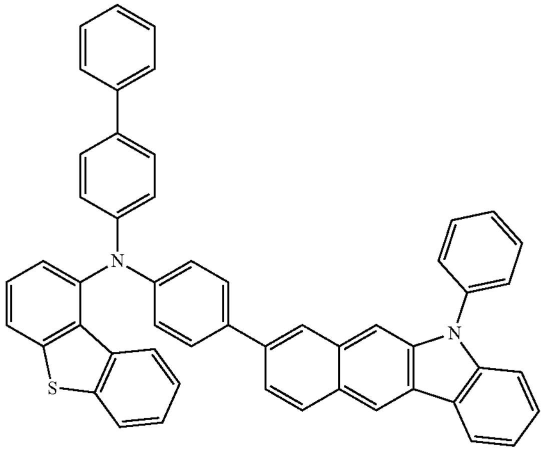

-continued
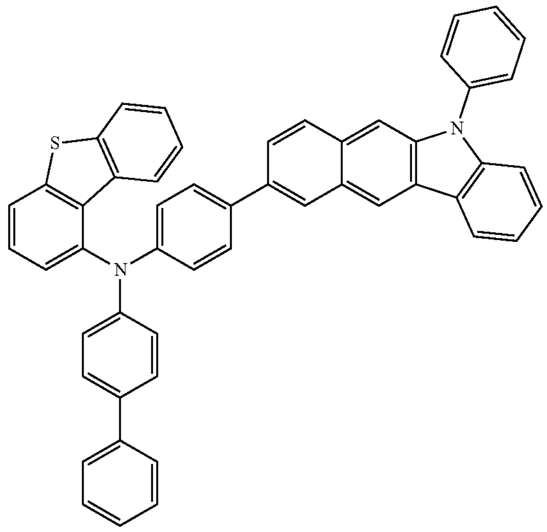
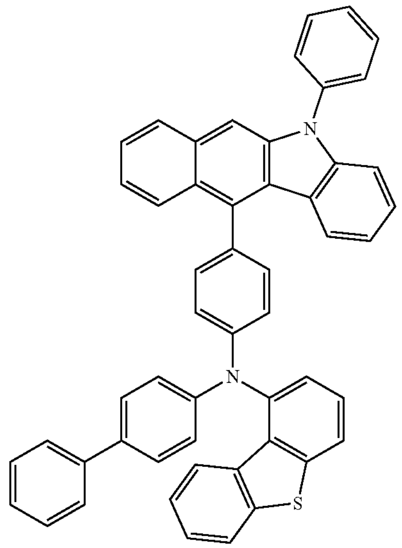
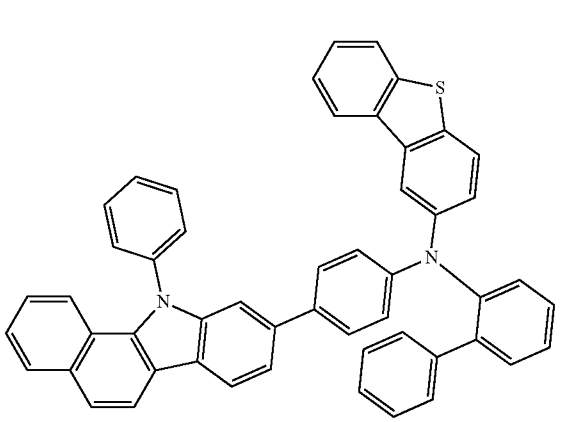
-continued
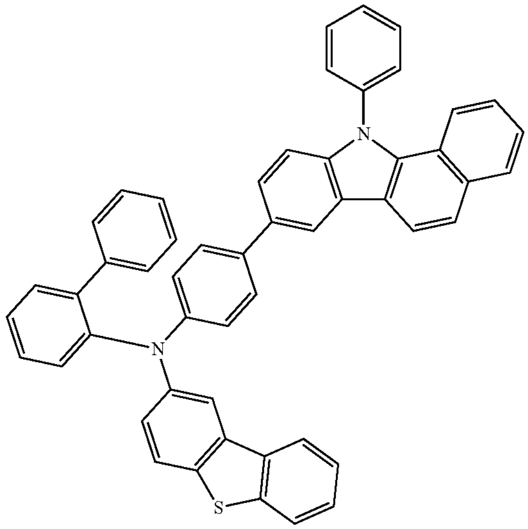
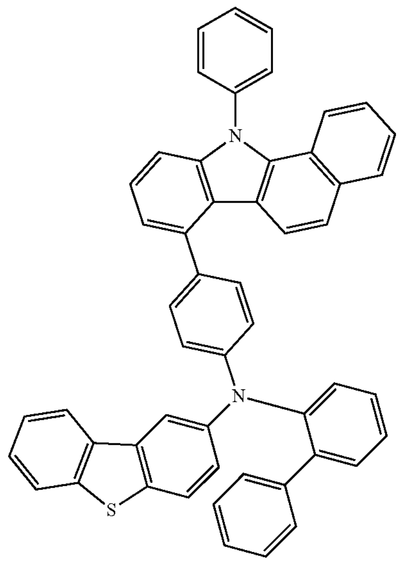
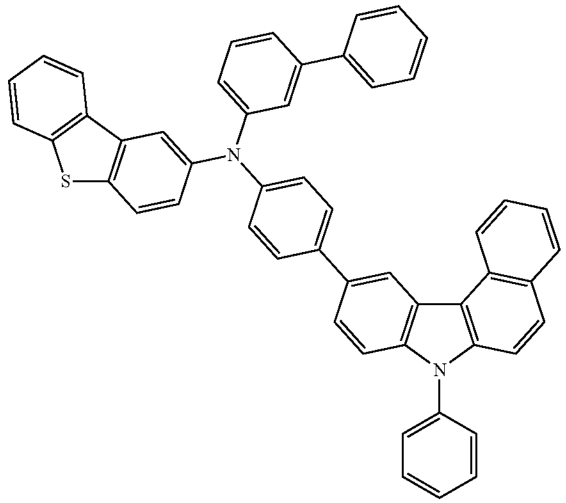

-continued
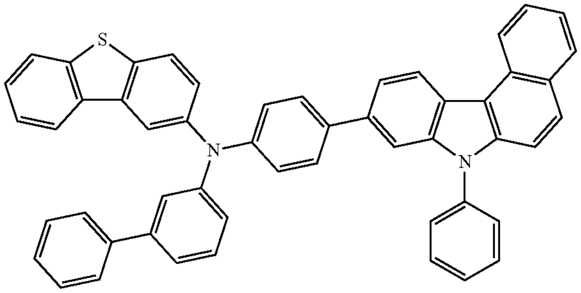
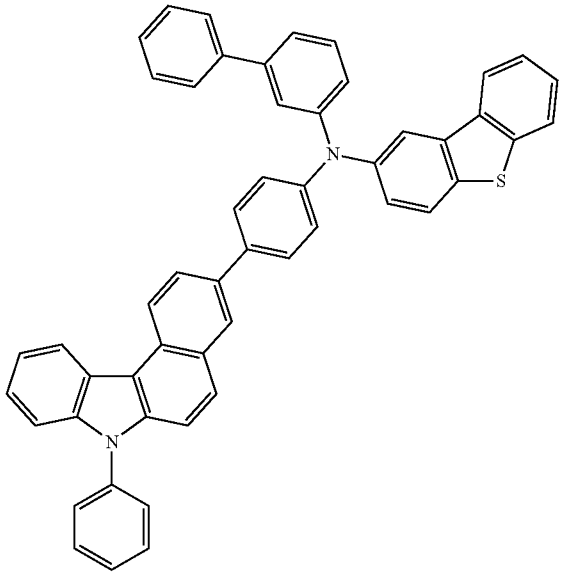
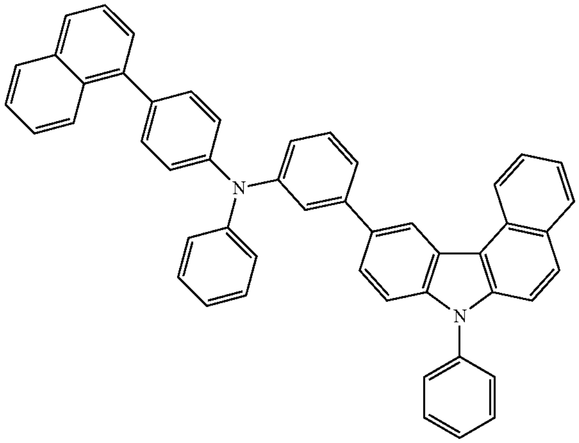
-continued
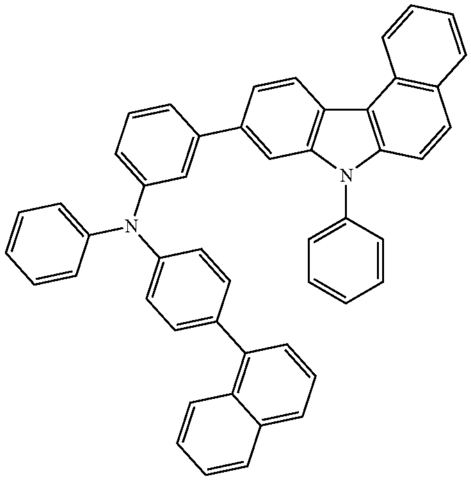
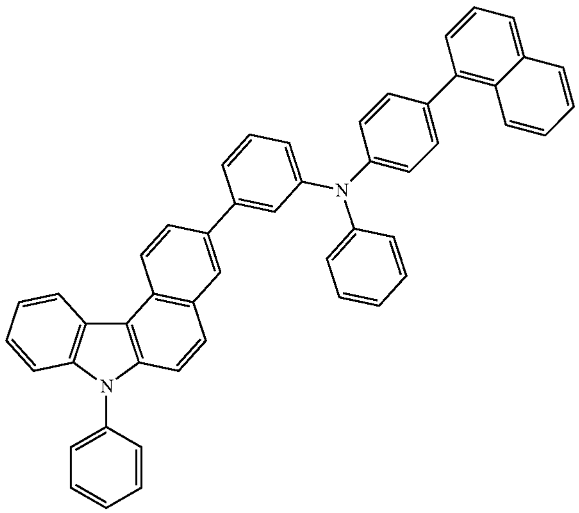
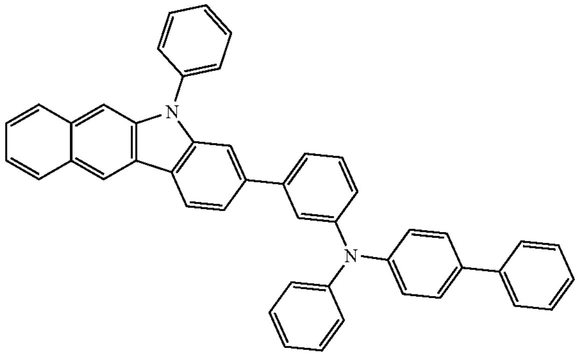

-continued
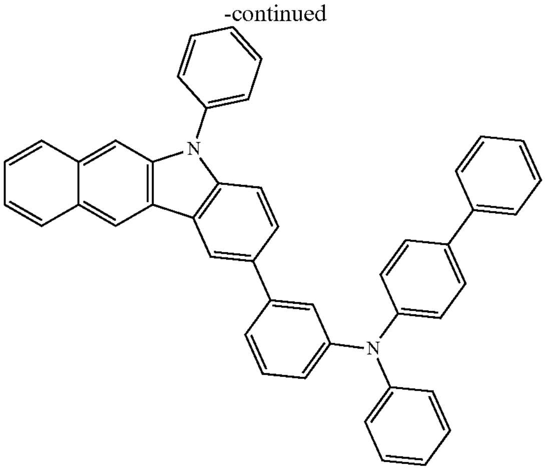
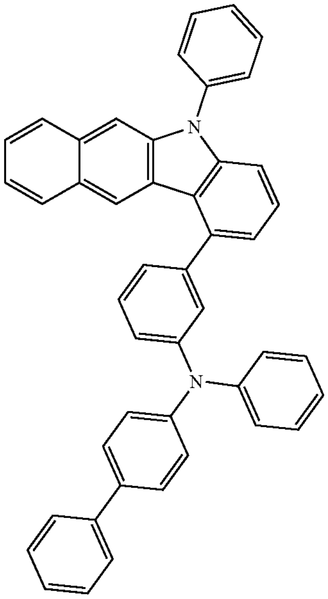
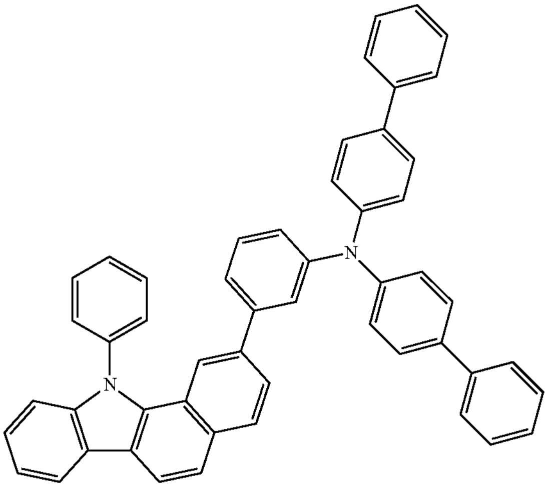
-continued
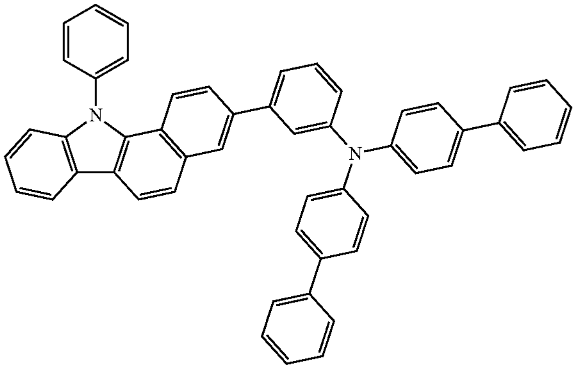
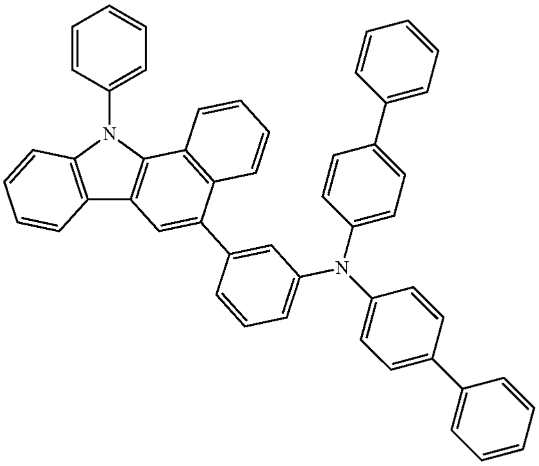
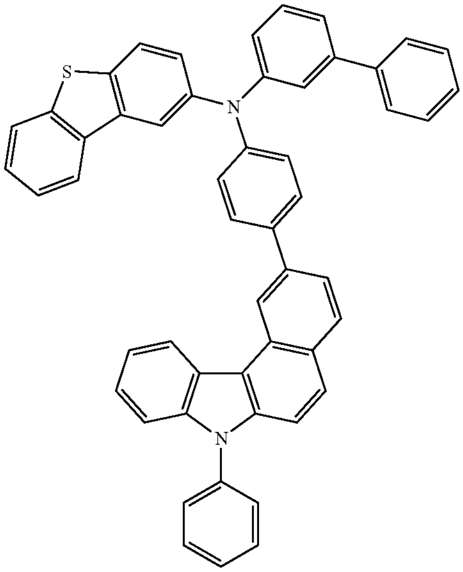
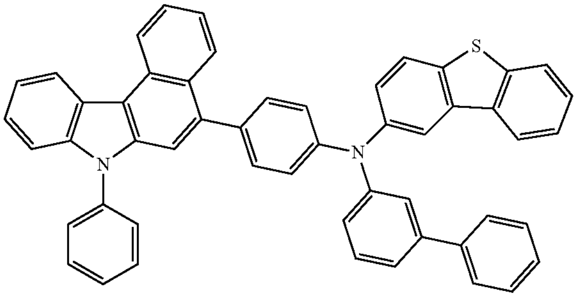

-continued
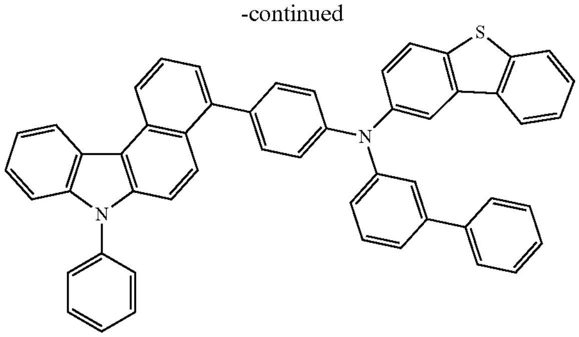
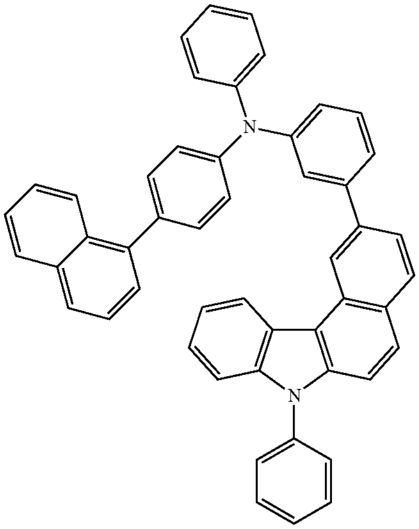
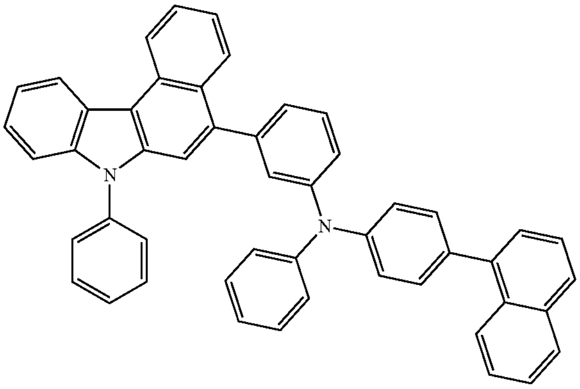
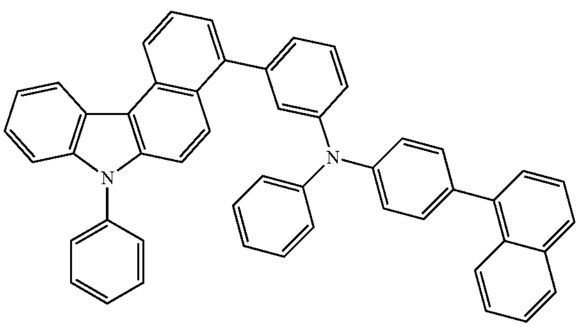
-continued
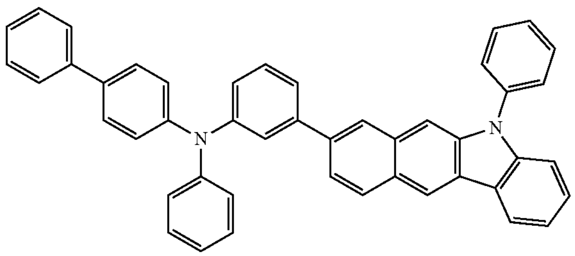
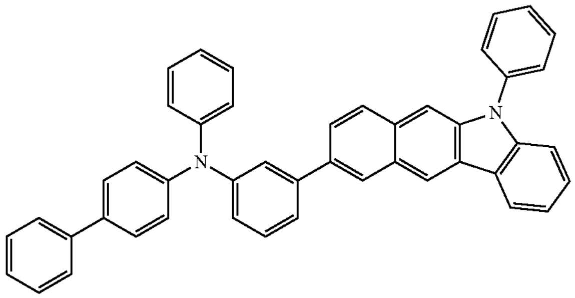
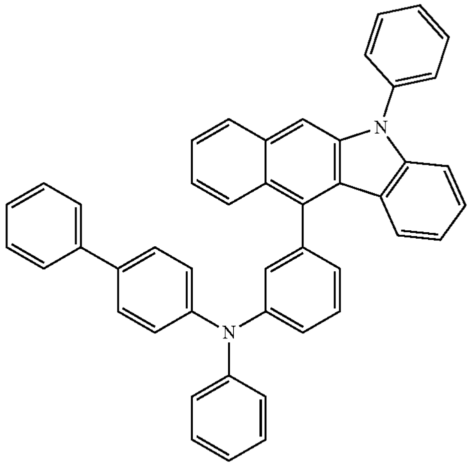
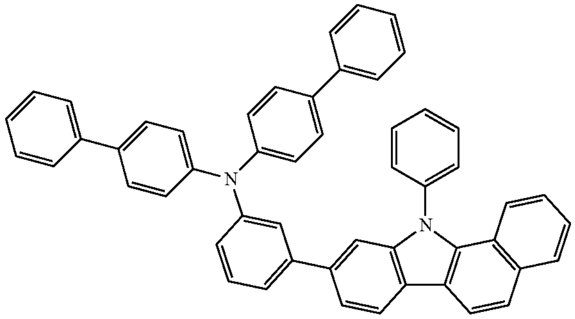

-continued
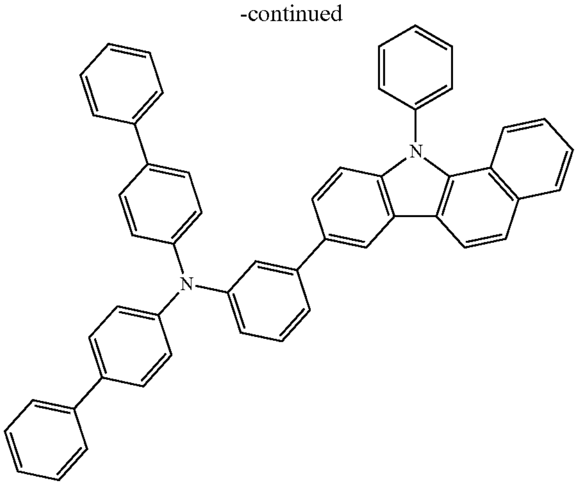
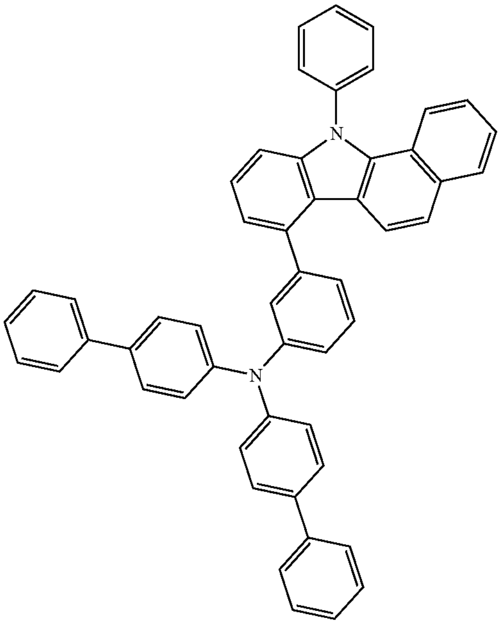
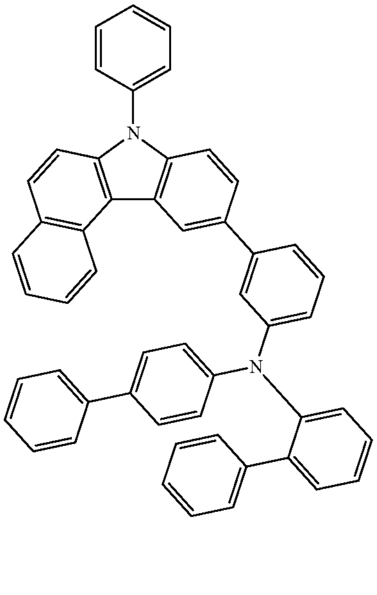
-continued
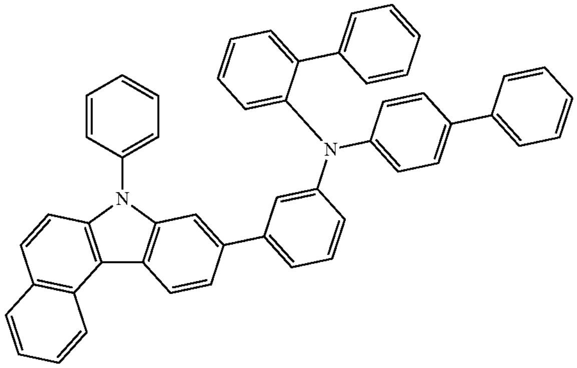
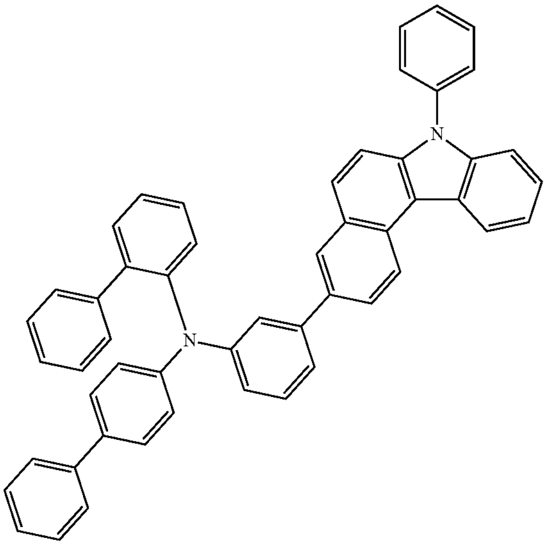
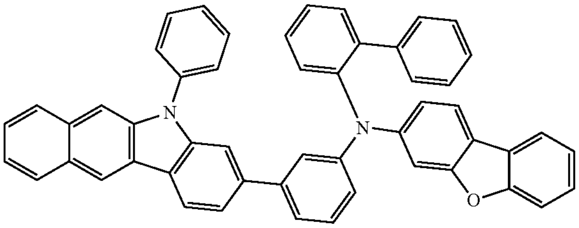
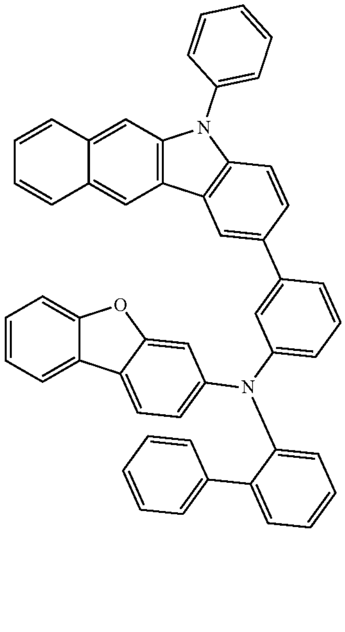

-continued
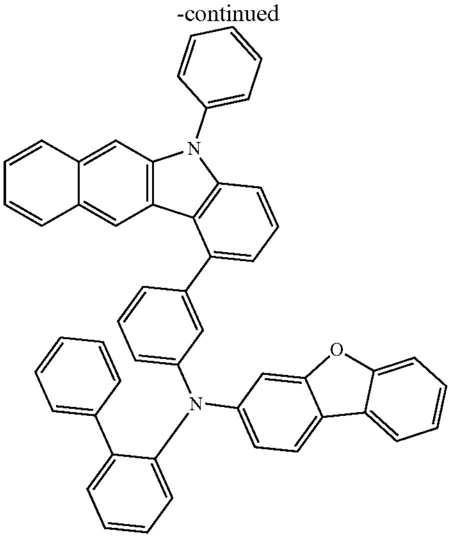
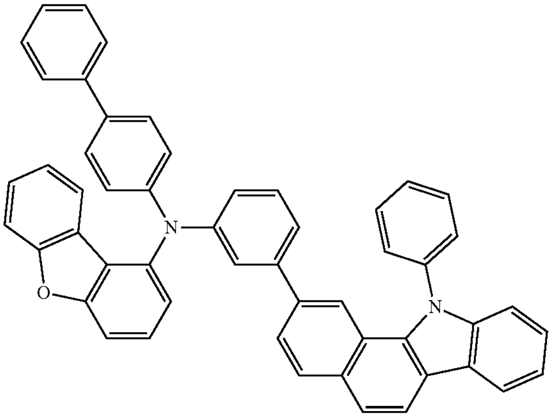
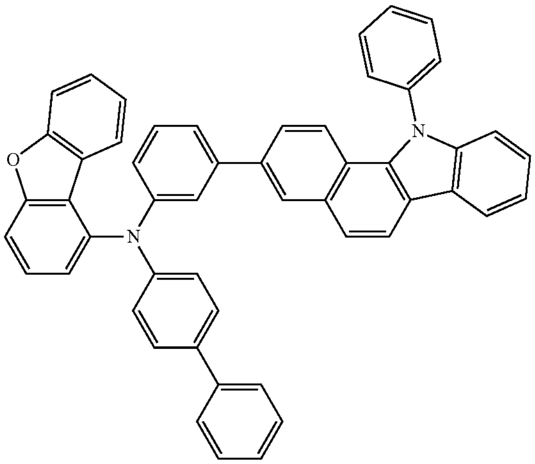
-continued
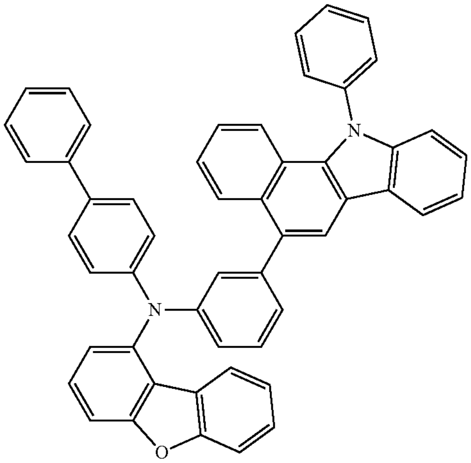
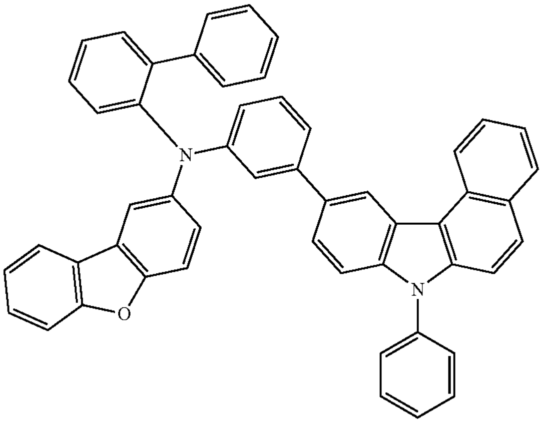
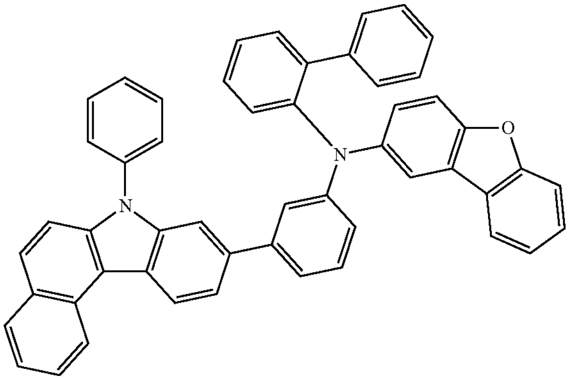

-continued
-continued
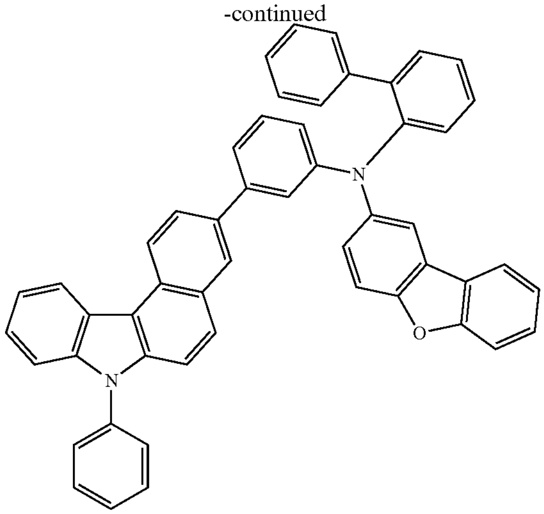
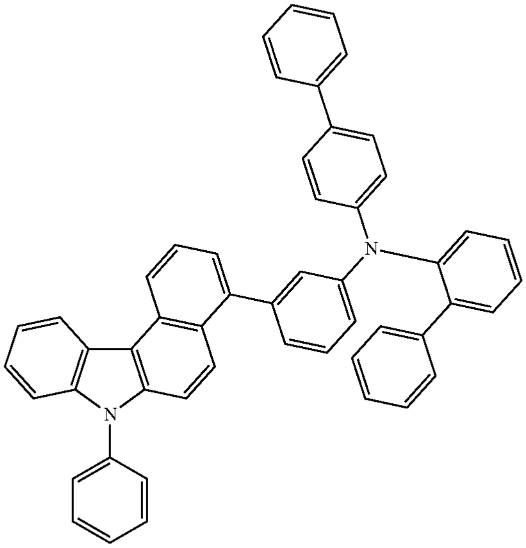
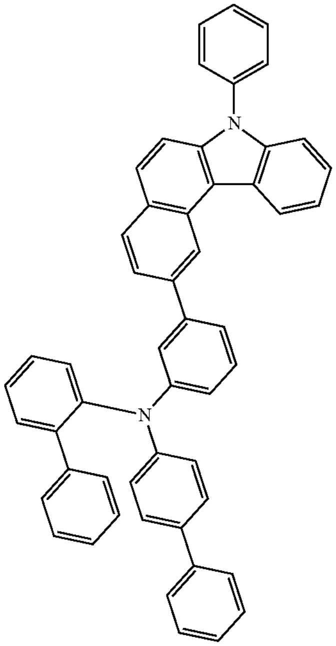
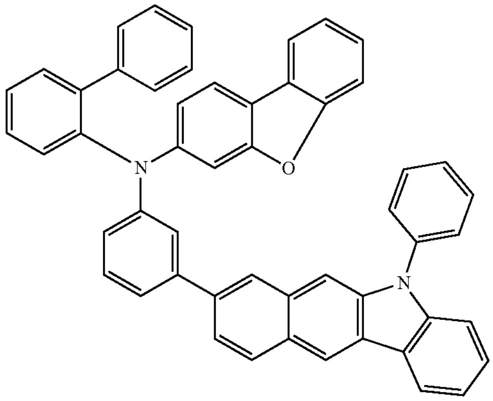
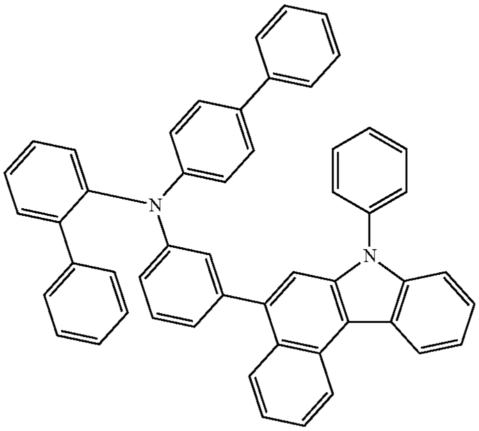
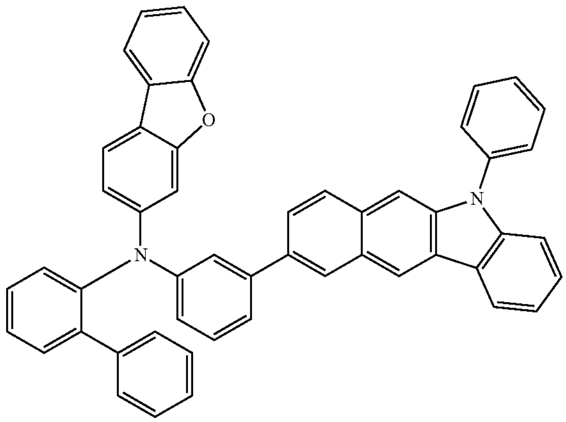

-continued
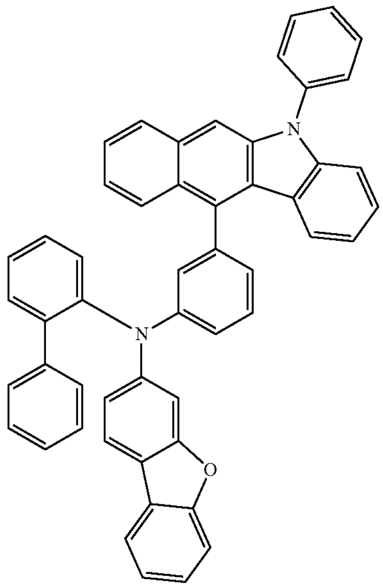
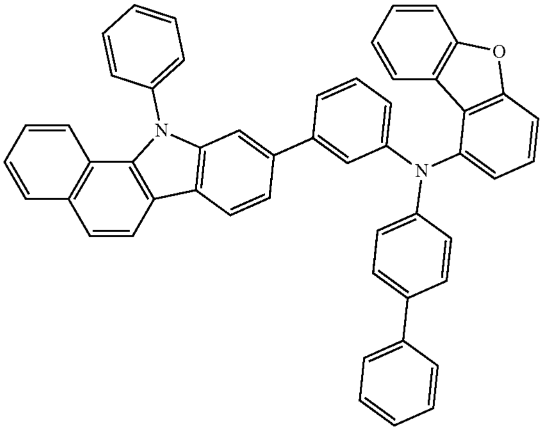
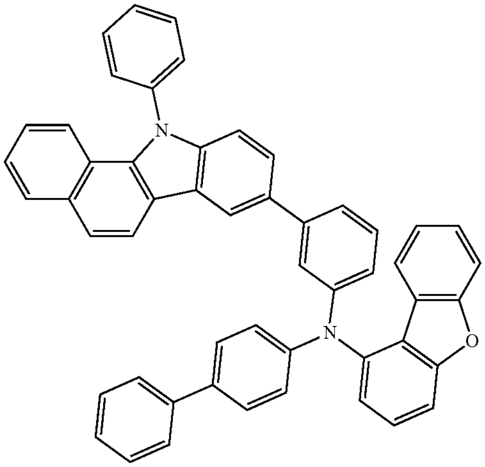
-continued
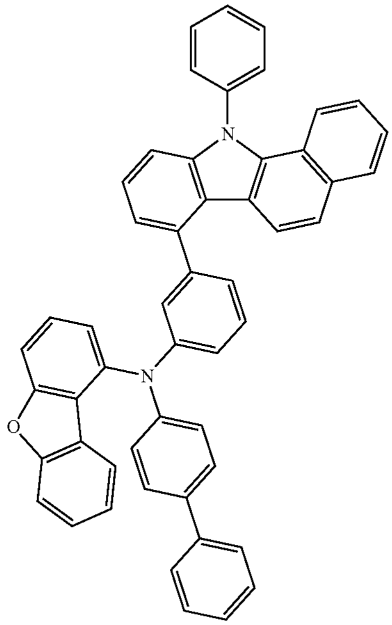
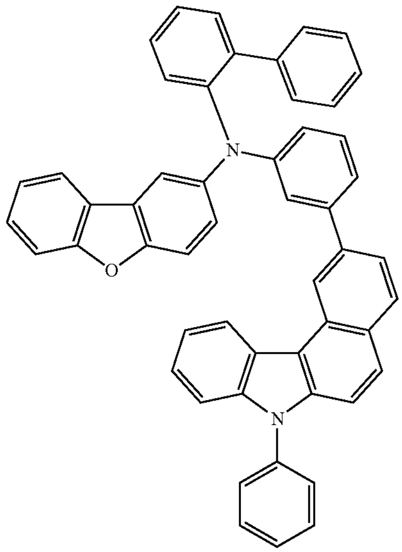
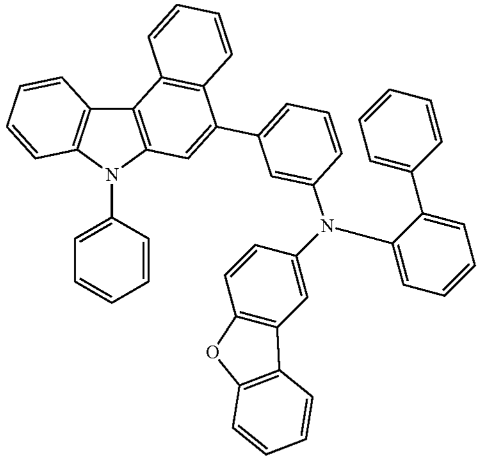

-continued
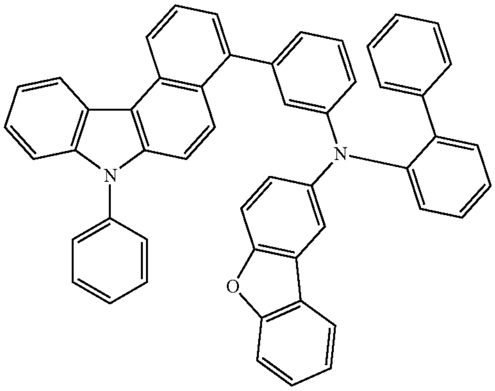
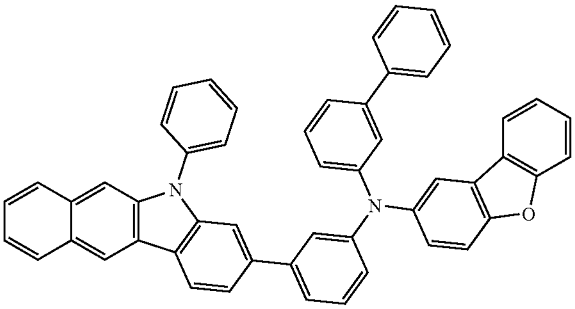
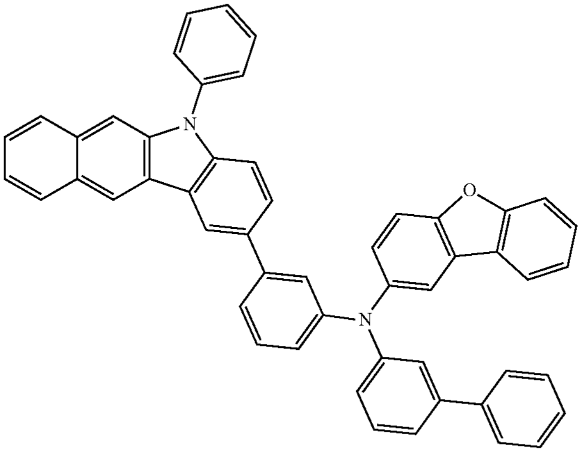
-continued
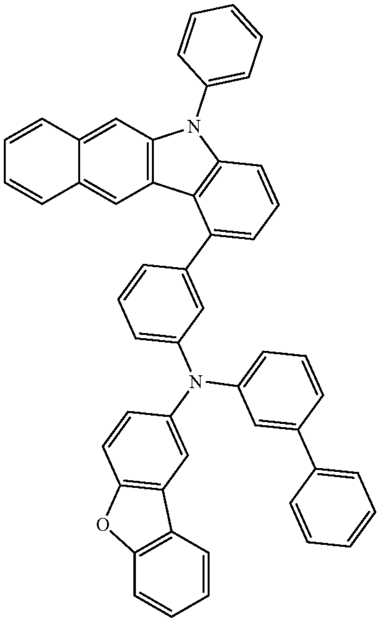
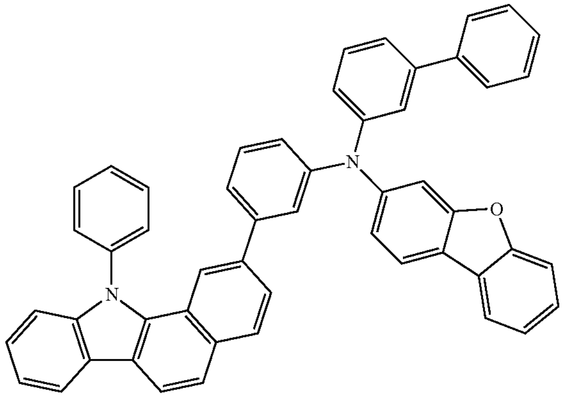
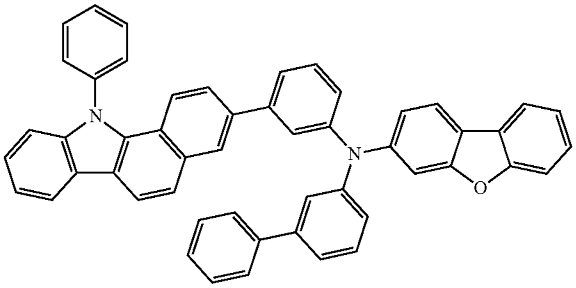

-continued
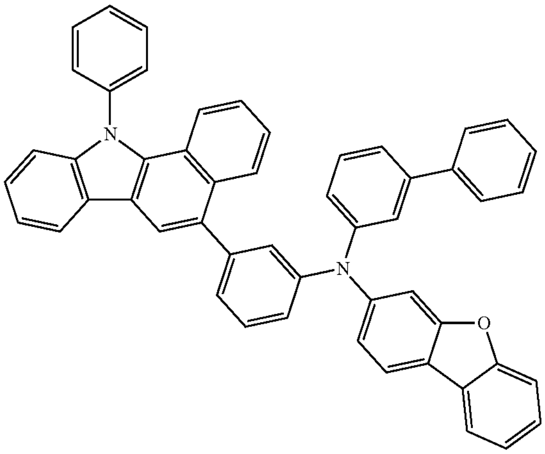
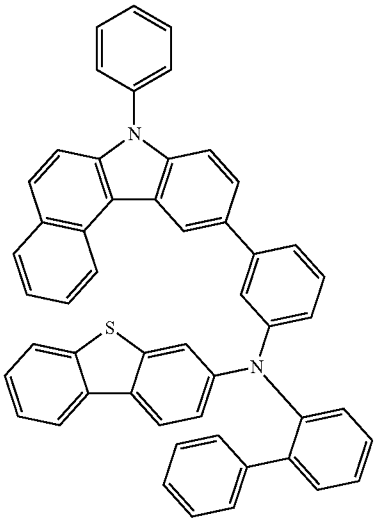
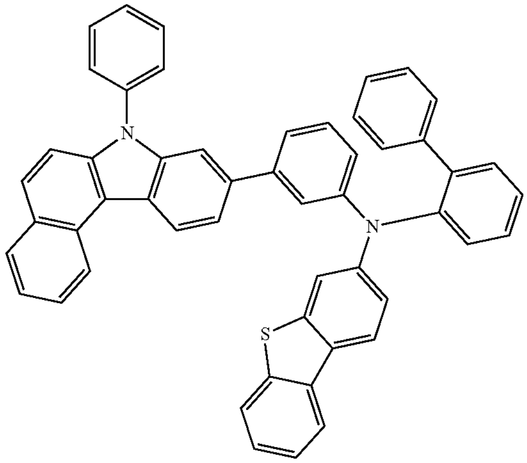
-continued
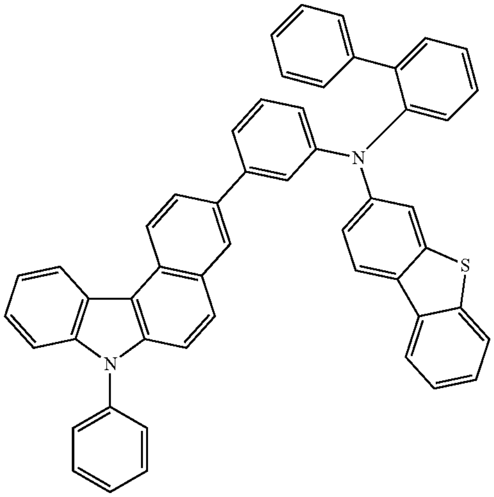
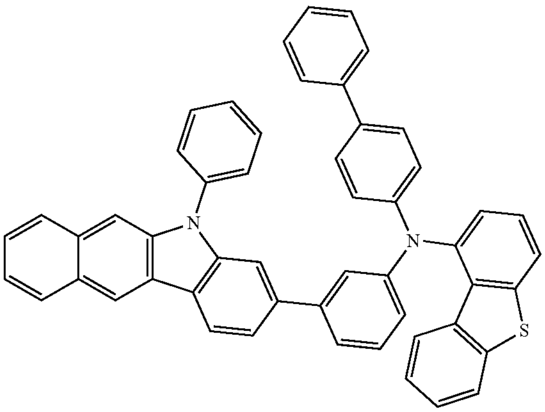
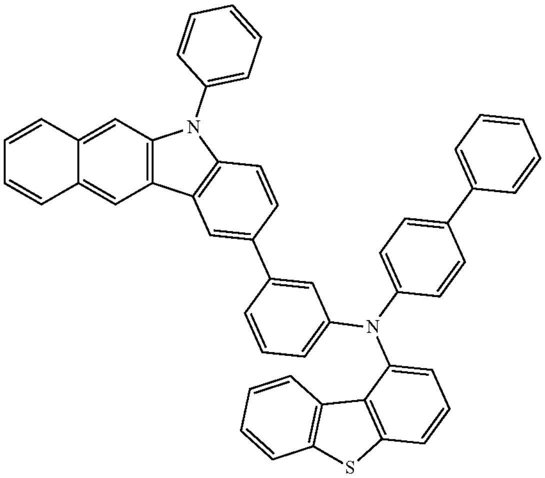

-continued
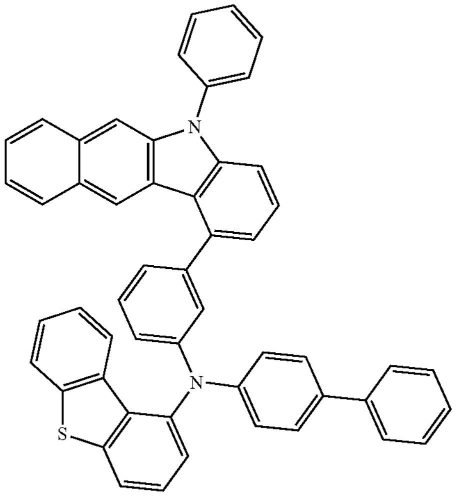
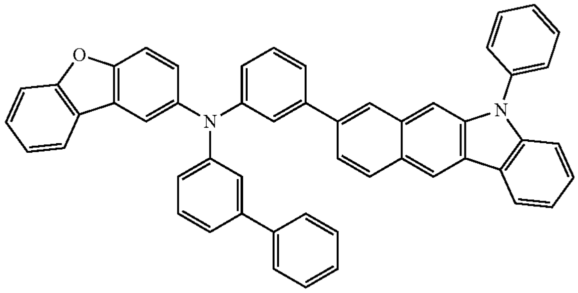
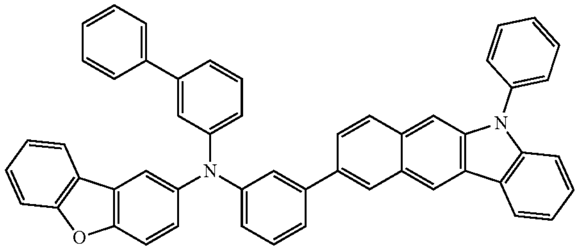
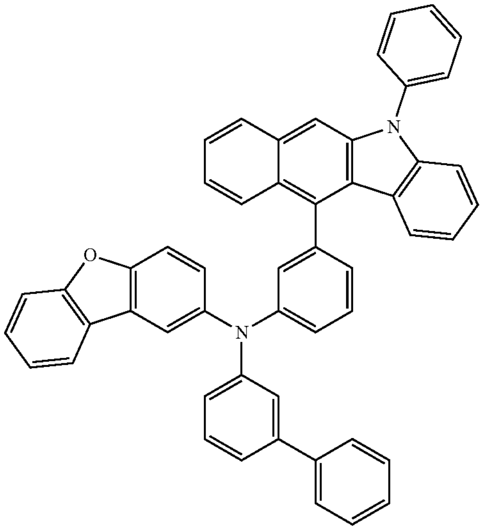
-continued
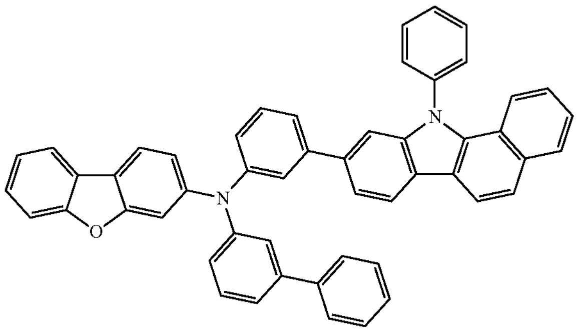
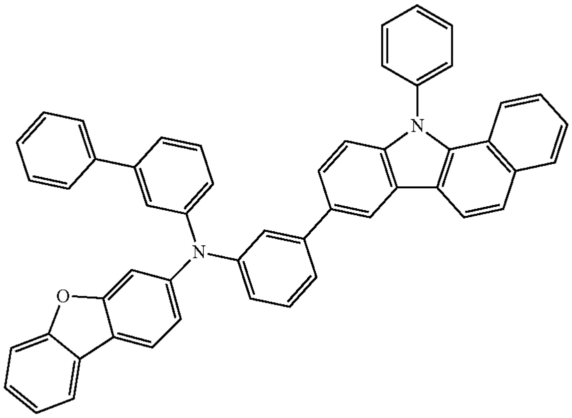
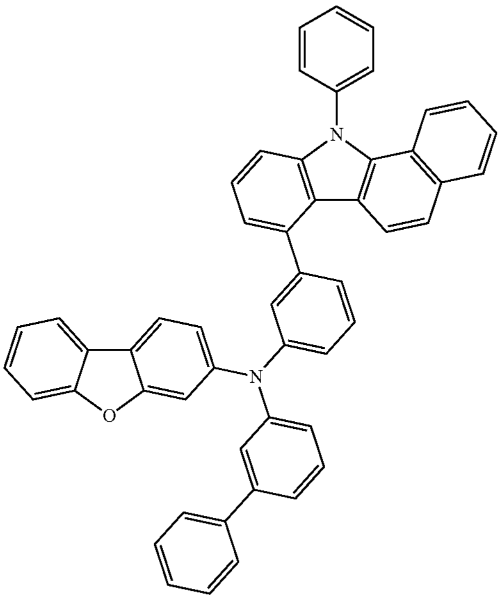

-continued
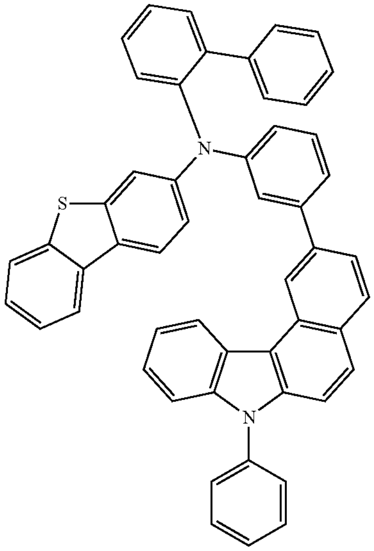
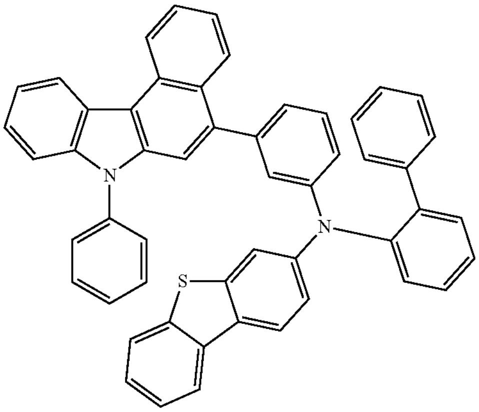
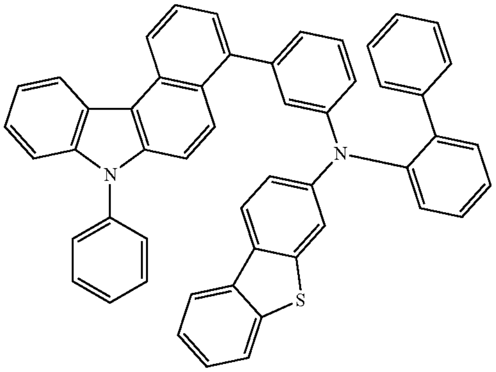
-continued
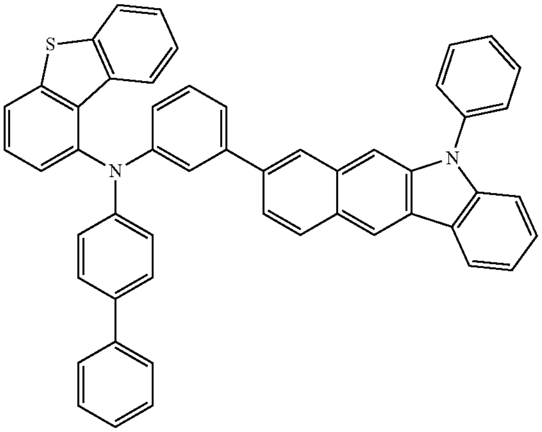
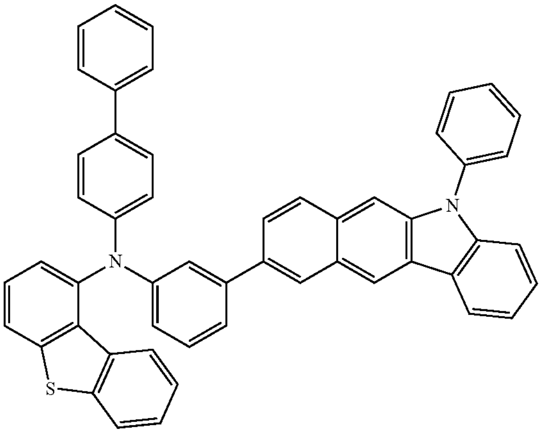
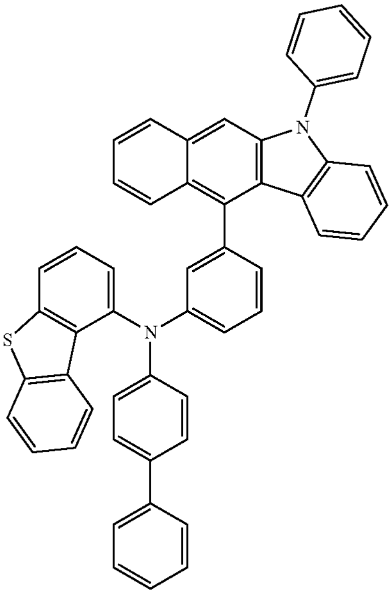

-continued
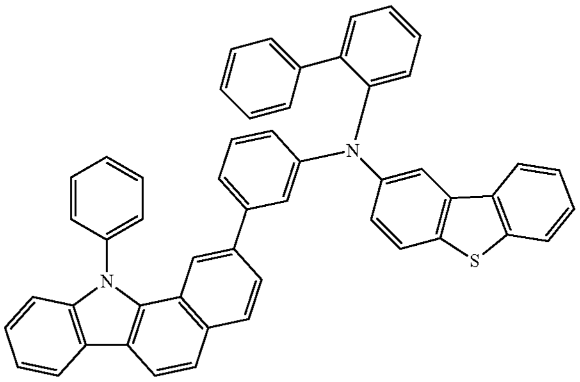
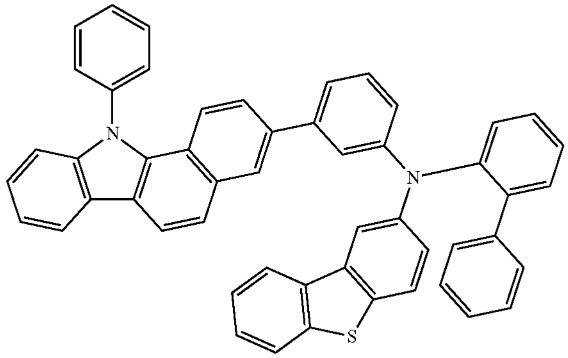
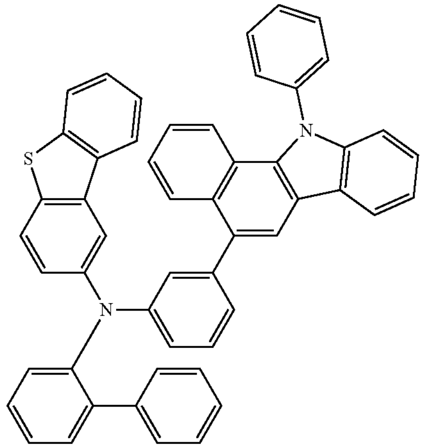
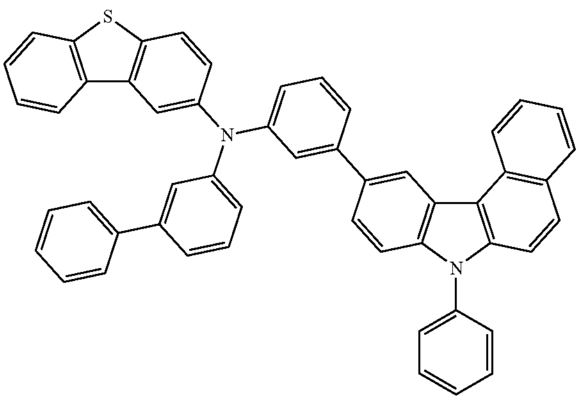
-continued
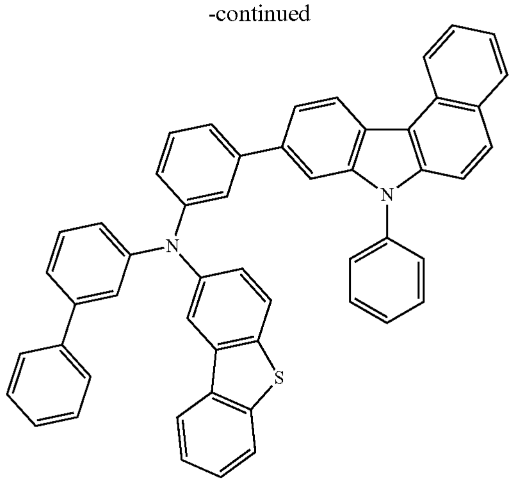
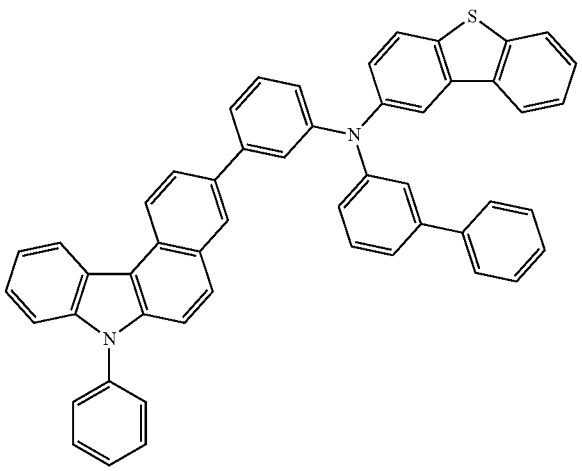
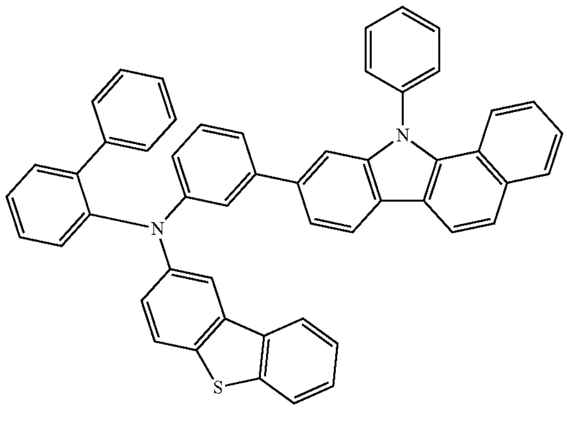

-continued
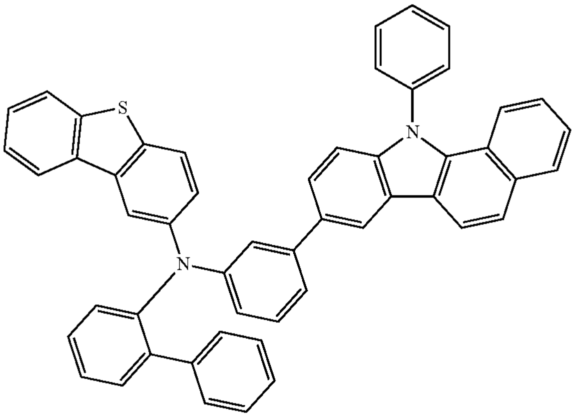
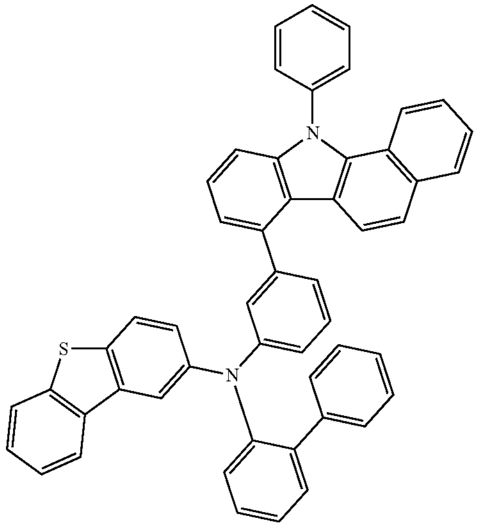
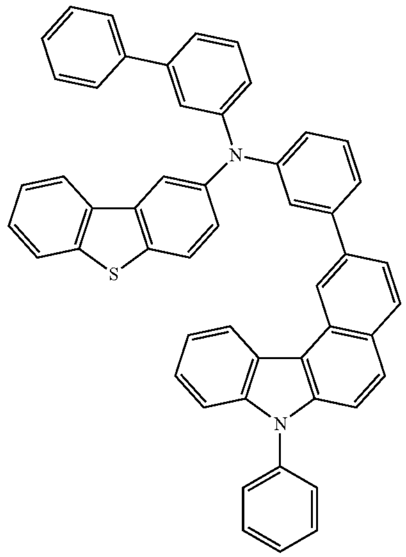
-continued
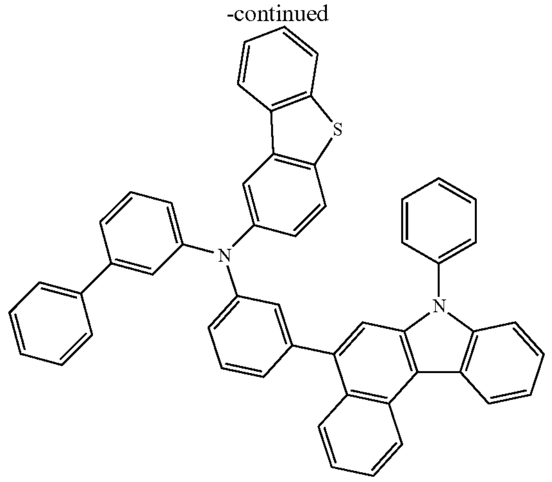
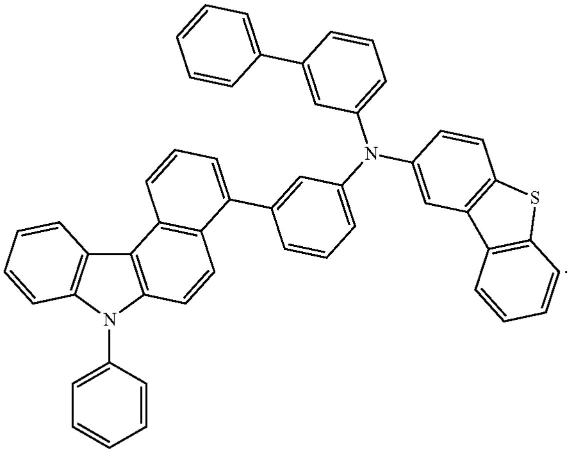 [SMILES: c1ccc(-c2cccc(N(c3cccc(-c4cccc5c4ccc4c5c5ccccc5n4-c4ccccc4)c3)c3ccc4sc5ccccc5c4c3)c2)cc1]
In addition, provided is a preparation method for preparing the compound of Chemical Formula 2.
Specifically, the compound of Chemical Formula 2 can be prepared by a preparation method as in Reaction Scheme 2-1 below.
[Reaction Scheme 2-1]
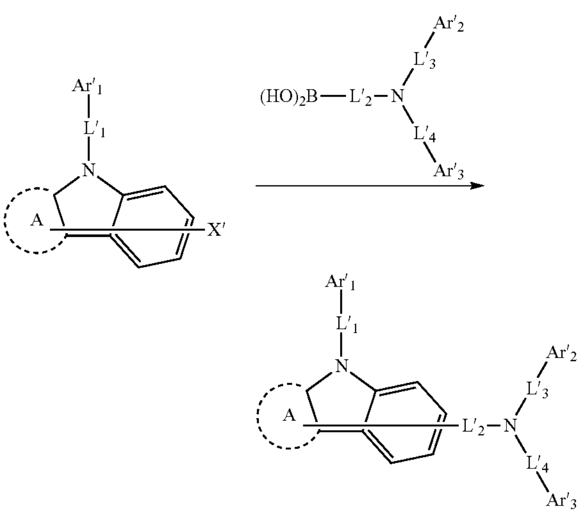

In the above, definitions of other substituents except for X' are the same as defined in Chemical Formula 2, and X' is halogen, preferably chloro or bromo.

The Reaction Scheme 2-1 is a Suzuki coupling reaction, and preferably performed in the presence of a palladium catalyst and a base. In addition, the reactive group for the Suzuki coupling reaction can be appropriately changed as known in the art.

Alternatively, when $L'_2$ is a single bond, the compound of Chemical Formula 2 can be prepared by a preparation method shown in Reaction Scheme 2-2 below.

[Reaction Scheme 2-2]

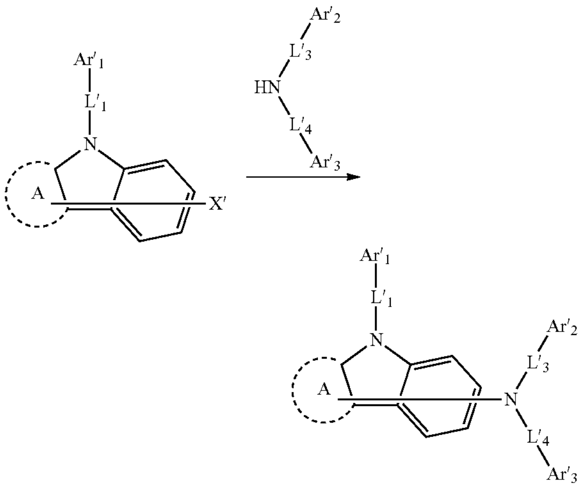

In the above, definitions of other substituents except for X' are the same as defined in Chemical Formula 2, and X' is halogen, preferably chloro or bromo.

The Reaction Scheme 2-2 is an amine substitution reaction, and preferably performed in the presence of a palladium catalyst and a base. In addition, the reactive group for the amine substitution reaction can be appropriately changed as known in the art.

The preparation method of the compound of Chemical Formula 2 can be more specifically described in Synthesis Examples described below.

In the light emitting layer, the compound of Chemical Formula 1 and the compound of Chemical Formula 2 can be included at a weight ratio of 1:99 to 99:1, 5:95 to 95:5, or 10:90 to 90:10.

The dopant material is not particularly limited as long as it is a material used in an organic light emitting device. For example, the dopant material includes an aromatic amine derivative, a styrylamine compound, a boron complex, a fluoranthene compound, a metal complex, and the like. Specifically, the aromatic amine derivative is a substituted or unsubstituted fused aromatic ring derivative having an arylamino group, and examples thereof include pyrene, anthracene, chrysene, periflanthene and the like, which have an arylamino group. The styrylamine compound is a compound where at least one arylvinyl group is substituted with a substituted or unsubstituted arylamine, in which one or two or more substituent groups selected from the group consisting of an aryl group, a silyl group, an alkyl group, a cycloalkyl group, and an arylamino group are substituted or unsubstituted. Specific examples thereof include styrylamine, styryldiamine, styryltriamine, styryltetramine, and the like, but are not limited thereto. Further, the metal complex includes an iridium complex, a platinum complex, and the like, but is not limited thereto.

In one embodiment, one or more of the following compounds can be used as the dopant material, but the present disclosure is not limited thereto:

Dp-1

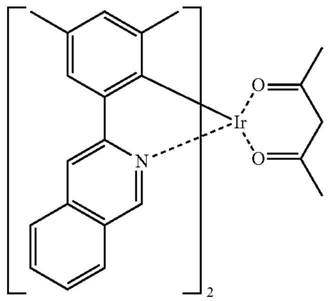

Dp-2

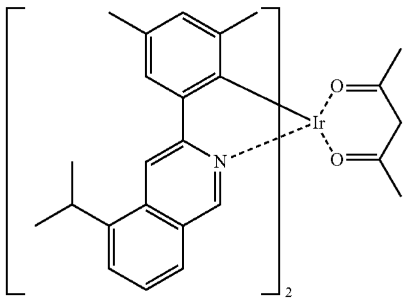

Dp-3

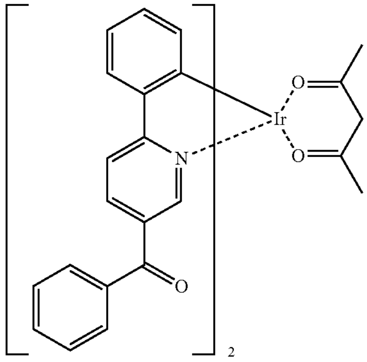

Dp-4

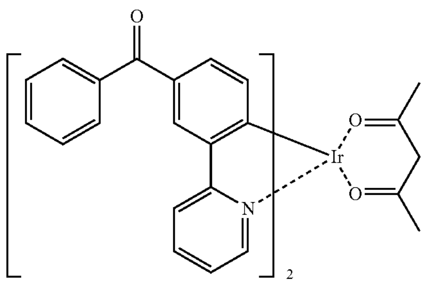

-continued
Dp-5
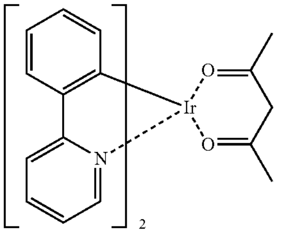
Dp-6
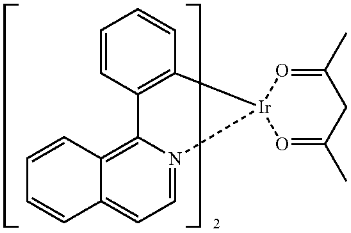
Dp-7
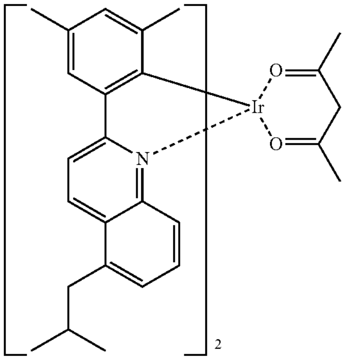
Dp-8
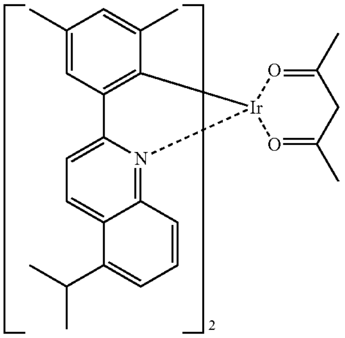
Dp-9
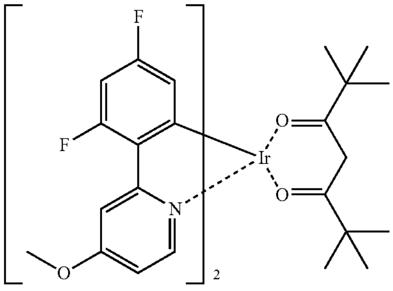
-continued
Dp-10
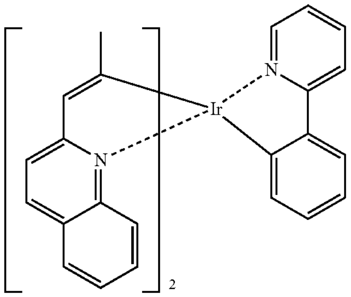
Dp-11
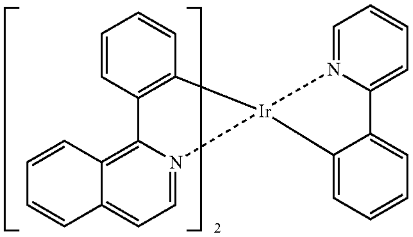
Dp-12
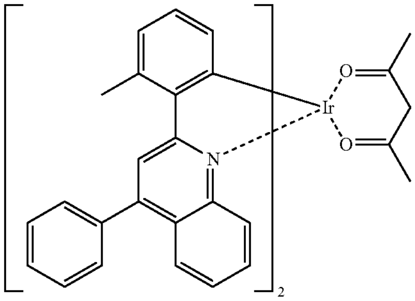
Dp-13
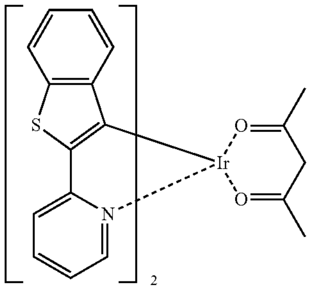
Dp-14
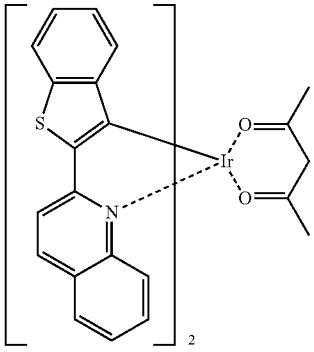

-continued
Dp-15
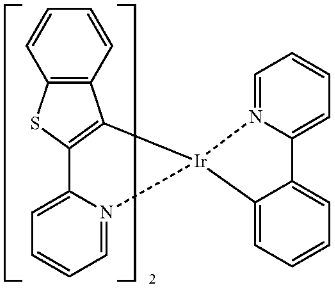
Dp-16
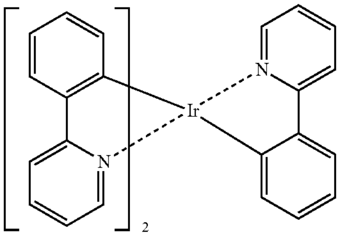
Dp-17
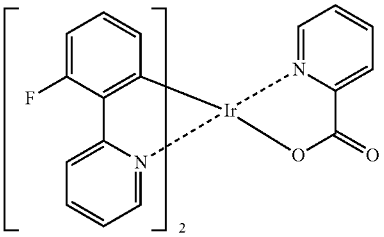
Dp-18
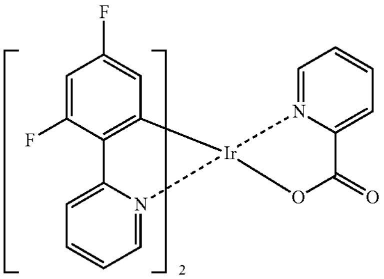
Dp-19
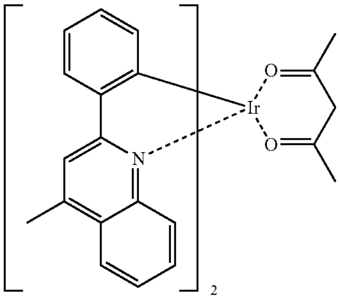
Dp-20
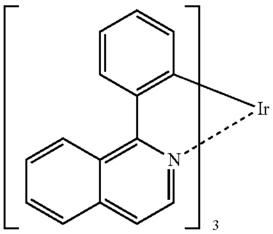
-continued
Dp-21
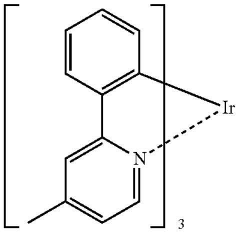
Dp-22
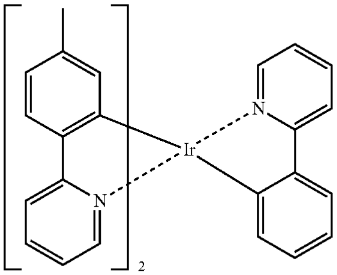
Dp-23
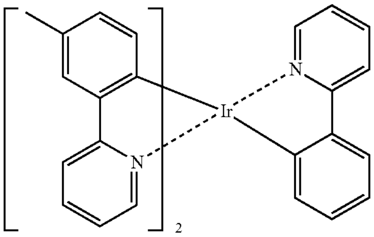
Dp-24
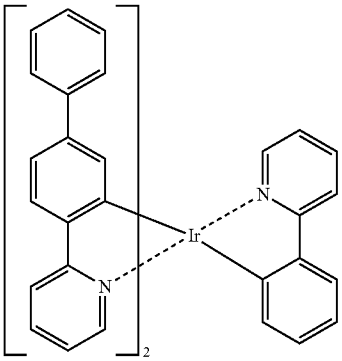
Dp-25
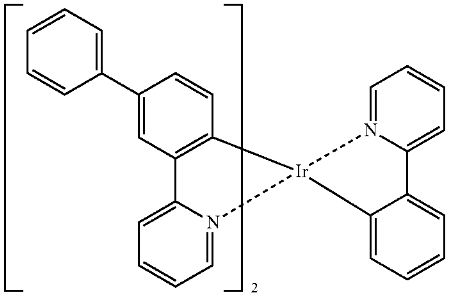

-continued
Dp-26
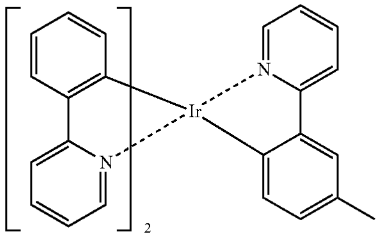
Dp-27
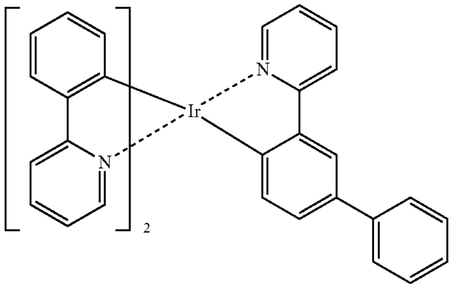
Dp-28
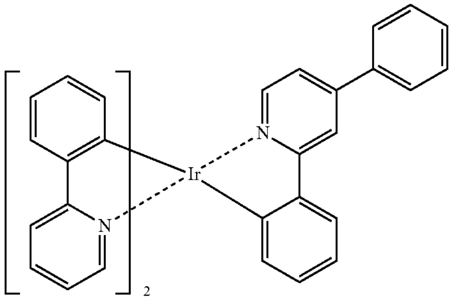
Dp-29
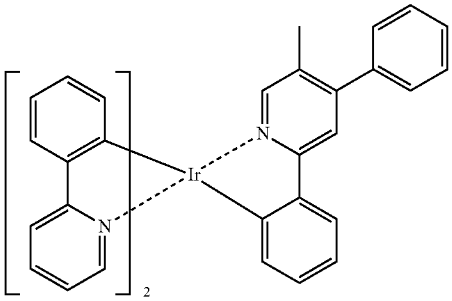
Dp-30
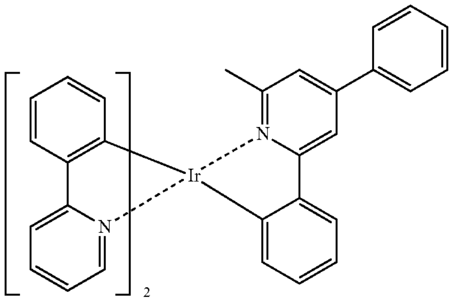
-continued
Dp-31
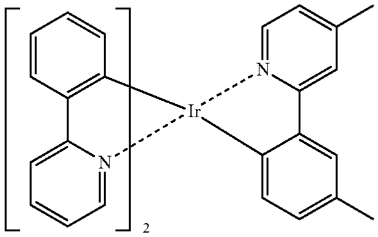
Dp-32
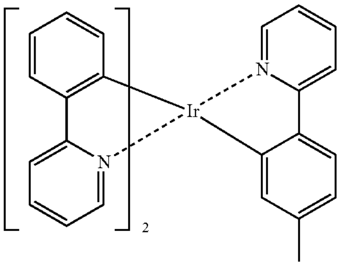
Dp-33
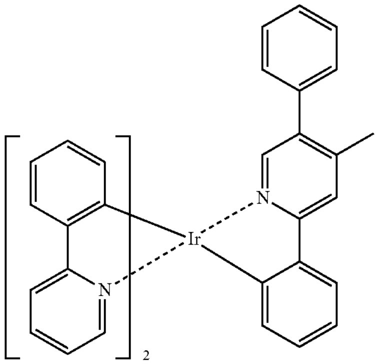
Dp-34
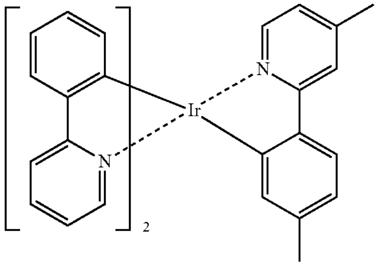
Dp-35
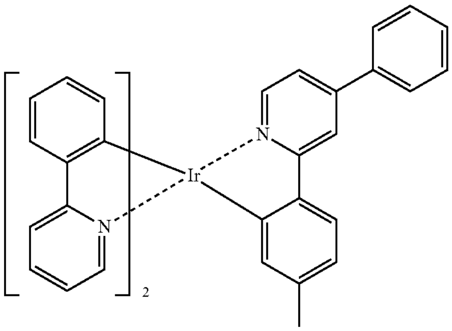

-continued

Dp-36

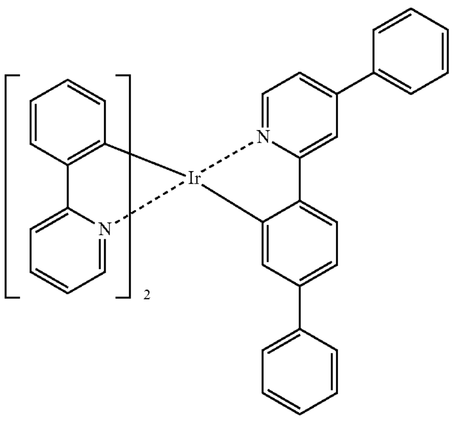

Dp-37

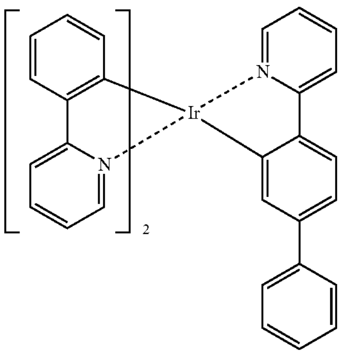

Dp-38

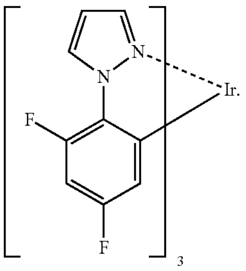

Hole Transport Layer

The organic light emitting device according to the present disclosure can include a hole transport layer between the light emitting layer and the anode.

The hole transport layer is a layer that receives holes from an anode or a hole injection layer and transports the holes to the light emitting layer. The hole transport material is suitably a material having large mobility to the holes, which can receive holes from the anode or the hole injection layer and transfer the holes to the light emitting layer.

Specific examples of the hole transport material include an arylamine-based organic material, a conductive polymer, a block copolymer in which a conjugate portion and a non-conjugate portion are present together, and the like, but are not limited thereto.

Hole Injection Layer

The organic light emitting device according to the present disclosure can further include a hole injection layer between the anode and the hole transport layer, if necessary.

The hole injection layer is a layer for injecting holes from the electrode, and the hole injection material is preferably a compound which can transport the holes, thus has a hole-injecting effect in the anode and an excellent hole-injecting effect to the light emitting layer or the light emitting material, prevents excitons produced in the light emitting layer from moving to an electron injection layer or the electron injection material, and is excellent in the ability to form a thin film. It is preferable that a HOMO (highest occupied molecular orbital) of the hole injection material is between the work function of the anode material and a HOMO of a peripheral organic material layer.

Specific examples of the hole injection material include metal porphyrin, oligothiophene, an arylamine-based organic material, a hexanitrilehexaazatriphenylene-based organic material, a quinacridone-based organic material, a perylene-based organic material, anthraquinone, polyaniline and polythiophene-based conductive polymer, and the like, but are not limited thereto.

Electron Blocking Layer

The organic light emitting device according to the present disclosure can include an electron blocking layer between a hole transport layer and a light emitting layer, if necessary.

The electron blocking layer prevents electrons injected from the cathode from being transferred to the hole transport layer without recombination in the light emitting layer, and is also called an electron suppressing layer. A material having the electron affinity lower than that of the electron transport layer is preferable for the electron blocking layer.

Electron Transport Layer

The organic light emitting device according to the present disclosure can include an electron transport layer between the light emitting layer and the cathode.

The electron transport layer receives electrons from a cathode or an electron injection layer formed on the cathode and transports the electrons to a light emitting layer, and also inhibits the transport of holes in the light emitting layer. The electron transport material is suitably a material which can receive electrons well from a cathode and transfer the electrons to a light emitting layer and has large mobility for electrons.

Specifically, examples thereof can include an Al complex of 8-hydroxyquinoline; a complex including $Alq_3$; an organic radical compound; a hydroxyflavone-metal complex, and the like, but are not limited thereto. The electron transport layer can be used with any desired cathode material, as used according to the related art. In particular, appropriate examples of the cathode material are a typical material which has a low work function, followed by an aluminum layer or a silver layer. Specific examples thereof include cesium, barium, calcium, ytterbium, and samarium, in each case followed by an aluminum layer or a silver layer.

Electron Injection Layer

The organic light emitting device according to the present disclosure can further include an electron injection layer between the electron transport layer and the cathode, if necessary.

The electron injection layer is a layer which injects electrons from an electrode, and is preferably a compound which has a capability of transporting electrons, has an effect of injecting electrons from a cathode and an excellent effect of injecting electrons into a light emitting layer or a light emitting material, prevents excitons produced from the light emitting layer from moving to a hole injection layer, and is also excellent in the ability to form a thin film.

Specific examples of the material that can be used for the electron injection layer include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, a metal complex compound, a nitrogen-containing 5-membered ring derivative, and the like, but are not limited thereto.

Examples of the metal complex compound include 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato)(1-naphtholato)aluminum, bis(2-methyl-8-quinolinato)(2-naphtholato)gallium, and the like, but are not limited thereto.

Hole Blocking Layer

The organic light emitting device according to the present disclosure can include a hole blocking layer between the electron transport layer and the light emitting layer, if necessary.

The hole blocking layer prevents holes injected from the anode from being transferred to the electron transport layer without recombination in the light emitting layer, and a material having high ionization energy is preferable for the hole blocking layer.

Organic Light Emitting Device

A structure of the organic light emitting device according to the present disclosure is illustrated in FIG. 1. FIG. 1 shows an example of an organic light emitting device including a substrate 1, an anode 2, a light emitting layer 3, and a cathode 4. FIG. 2 shows an example of an organic light emitting device including a substrate 1, an anode 2, a hole injection layer 5, a hole transport layer 6, a light emitting layer 3, an electron transport layer 7, an electron injection layer 8, and a cathode 4. FIG. 3 shows an example of an organic light emitting device including a substrate 1, an anode 2, a hole injection layer 5, a hole transport layer 6, an electron blocking layer 9, a light emitting layer 3, a hole blocking layer 10, an electron injection and transport layer 11, and a cathode 4.

The organic light emitting device according to the present disclosure can be manufactured by sequentially laminating the above-described components. In this case, the organic light emitting device can be manufactured by depositing a metal, metal oxides having conductivity, or an alloy thereof on the substrate using a PVD (physical vapor deposition) method such as a sputtering method or an e-beam evaporation method to form an anode, forming the above-mentioned respective layers thereon, and then depositing a material that can be used as the cathode thereon.

In addition to such a method, the organic light emitting device can be manufactured by sequentially depositing the above-described components from a cathode material to an anode material in the reverse order on a substrate (WO 2003/012890). Further, the light emitting layer can be formed using the host and the dopant by a solution coating method as well as a vacuum deposition method. Herein, the solution coating method means a spin coating, a dip coating, a doctor blading, an inkjet printing, a screen printing, a spray method, a roll coating, or the like, but is not limited thereto.

Meanwhile, the organic light emitting device according to the present disclosure can be a top emission device, a bottom emission device, or a double-sided emission device depending on the material used.

The preparation of the organic light emitting device according to the present disclosure will be described in detail in the following examples. However, these examples are presented for illustrative purposes only, and are not intended to limit the scope of the present disclosure.

Synthesis Example 1: Preparation of Compound Represented by Chemical Formula 1

Synthesis Example 1-1

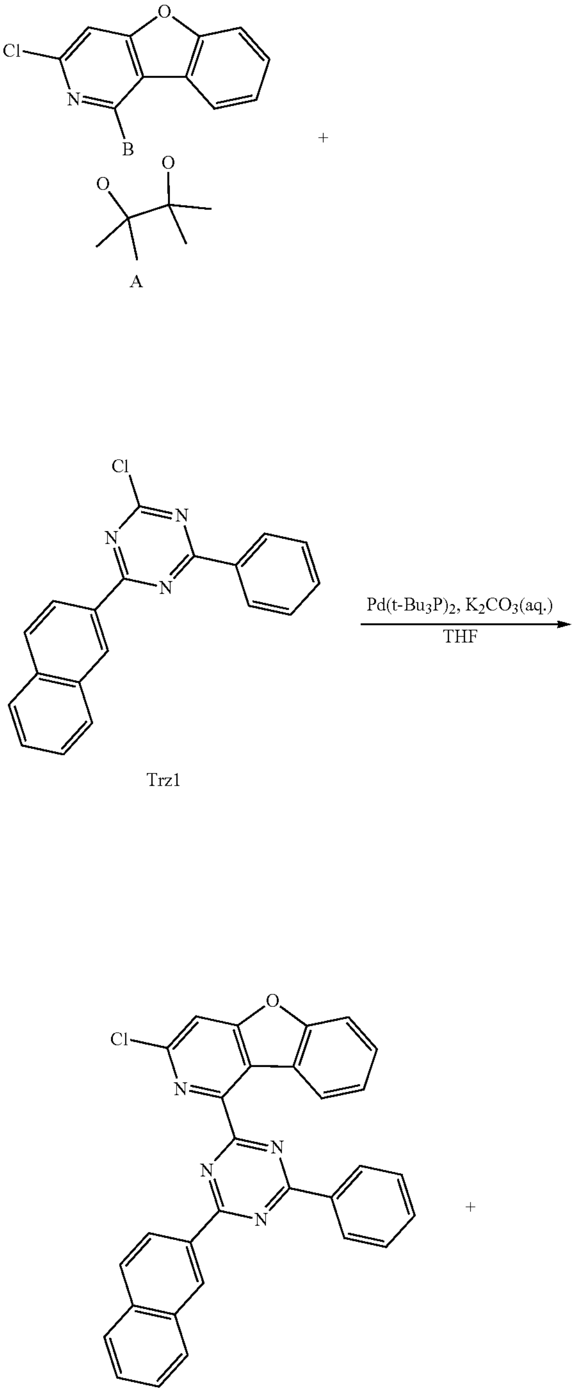

A

Trz1 subA-1

-continued

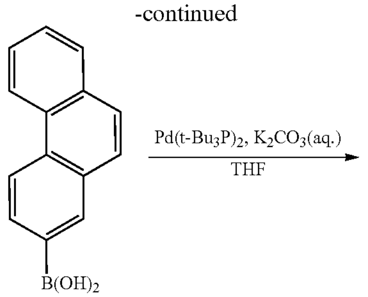

sub1

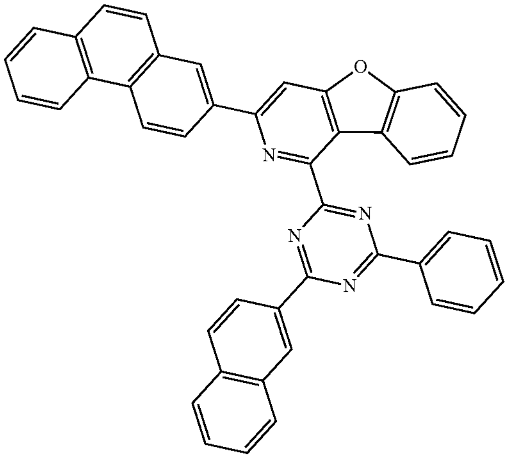

1-1

Compound A (15 g, 45.5 mmol) and Trz1 (15.2 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 13.9 g of subA-1 (yield 63%, MS: [M+H]+=485).

Compound subA-1 (15 g, 30.9 mmol) and sub1 (7.2 g, 32.5 mmol) were added to 300 ml of THE under a nitrogen atmosphere, and the mixture was stirred and refluxed. Then, potassium carbonate (12.8 g, 92.8 mmol) was dissolved in 100 ml of water, and then added thereto. Thereafter, it was stirred sufficiently, followed by adding bis(tri-tert-butylphosphine)palladium(0) (0.2 g, 0.3 mmol). After 4 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 11.6 g of Compound 1-1 (yield 60%, MS: [M+H]+=627).

Synthesis Example 1-2

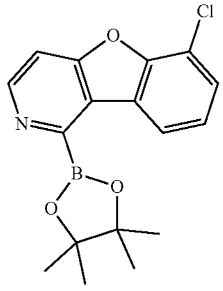

B

+

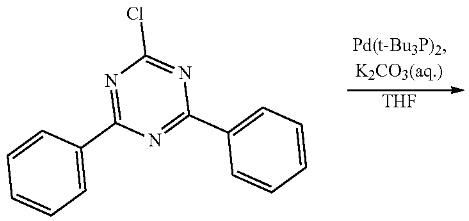

Trz2

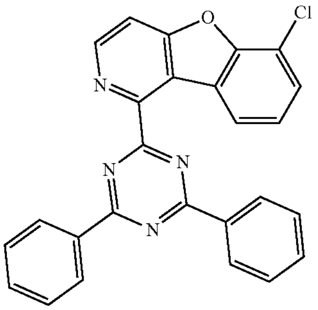

subB-1

+

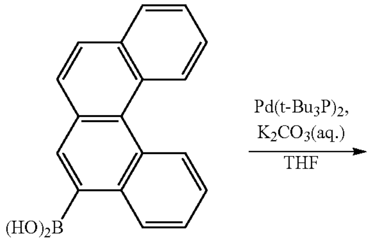

sub2

-continued

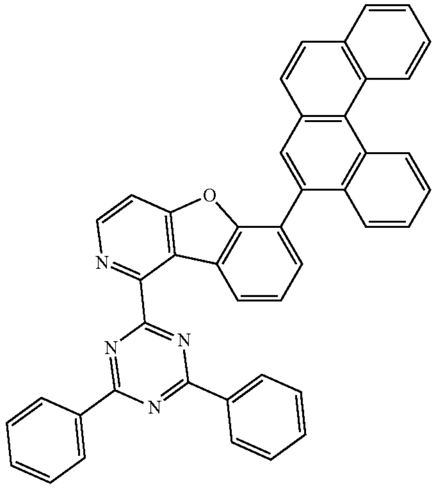

1-2

Compound B (15 g, 45.5 mmol) and Trz2 (12.8 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 13.6 g of subB-1 (yield 69%, MS: [M+H]+=435).

Compound subB-1 (15 g, 34.5 mmol) and sub2 (9.9 g, 36.2 mmol) were added to 300 ml of THE under a nitrogen atmosphere, and the mixture was stirred and refluxed. Then, potassium carbonate (14.3 g, 103.5 mmol) was dissolved in 100 ml of water, and then added thereto. Thereafter, it was stirred sufficiently, followed by adding bis(tri-tert-butylphosphine)palladium(0) (0.2 g, 0.3 mmol). After 4 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 14.5 g of Compound 1-2 (yield 67%, MS: [M+H]+=627).

Synthesis Example 1-3

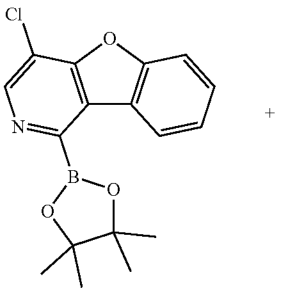

C

+

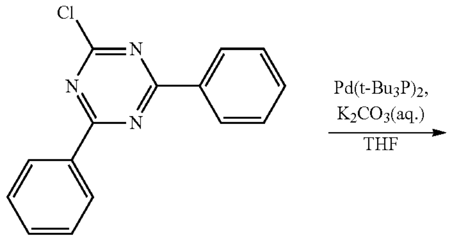

Trz2

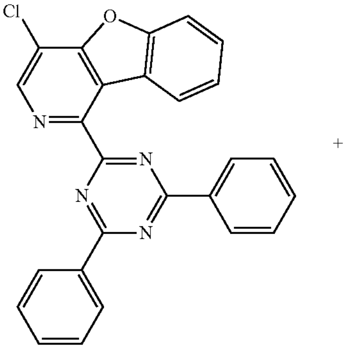

subC-1

+

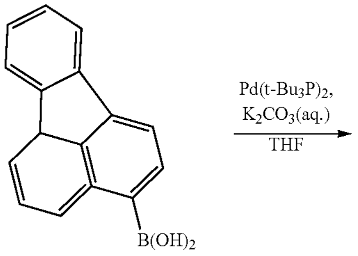

sub3

-continued

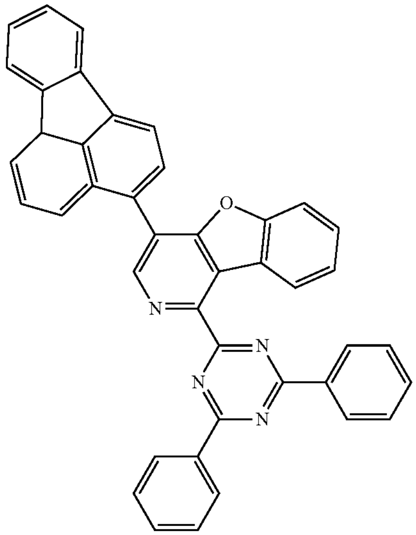

1-3

Compound C (15 g, 45.5 mmol) and Trz2 (12.8 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 12.6 g of subC-1 (yield 64%, MS: [M+H]+=435).

Compound subC-1 (15 g, 34.5 mmol) and sub3 (8.9 g, 36.2 mmol) were added to 300 ml of THE under a nitrogen atmosphere, and the mixture was stirred and refluxed. Then, potassium carbonate (14.3 g, 103.5 mmol) was dissolved in 100 ml of water, and then added thereto. Thereafter, it was stirred sufficiently, followed by adding bis(tri-tert-butylphosphine)palladium(0) (0.2 g, 0.3 mmol). After 5 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 14.1 g of Compound 1-3 (yield 68%, MS: [M+H]+=601).

Synthesis Example 1-4

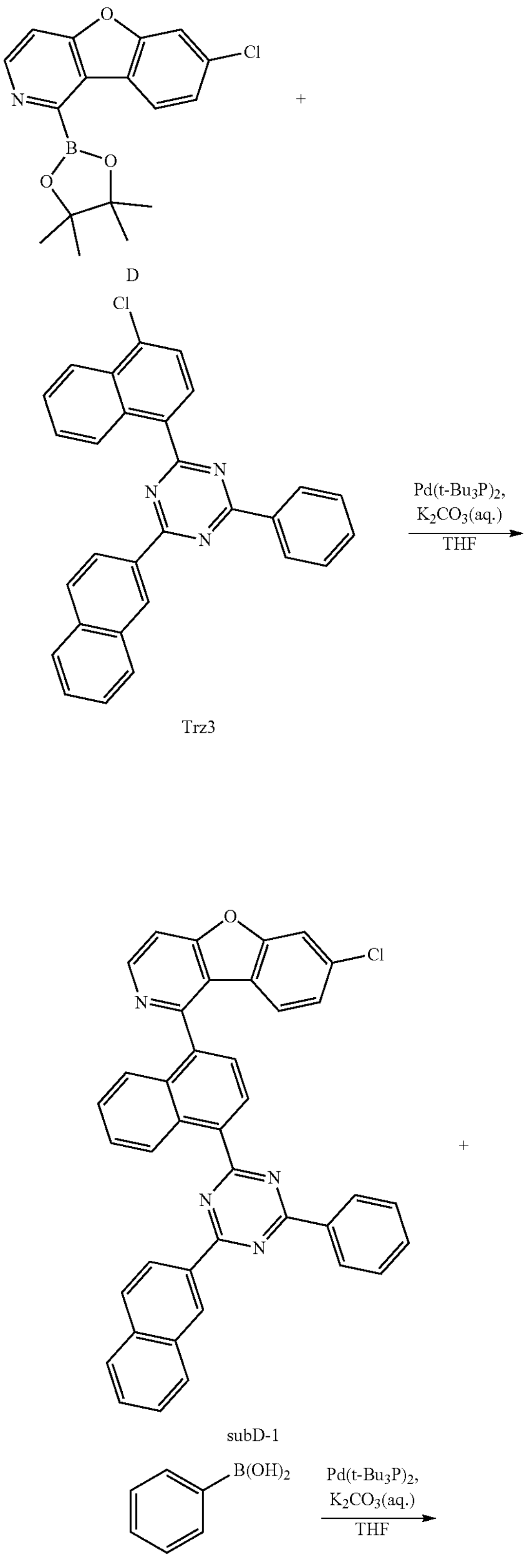

D

Trz3 subD-1 sub4

-continued

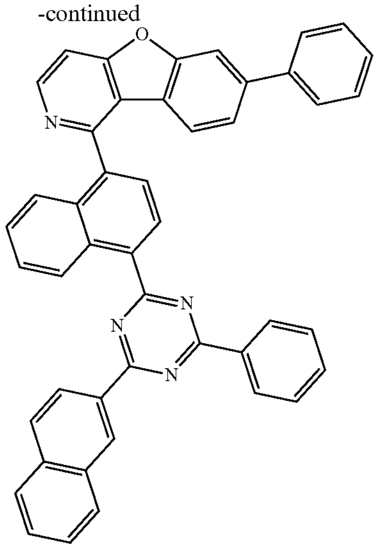

1-4

Compound D (15 g, 45.5 mmol) and Trz3 (21.2 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 21.1 g of subD-1 (yield 76%, MS: [M+H]+=611).

Compound subD-1 (15 g, 24.5 mmol) and sub4 (3.1 g, 25.8 mmol) were added to 300 ml of THE under a nitrogen atmosphere, and the mixture was stirred and refluxed. Then, potassium carbonate (10.2 g, 73.6 mmol) was dissolved in 100 ml of water, and then added thereto. Thereafter, it was stirred sufficiently, followed by adding bis(tri-tert-butylphosphine)palladium(0) (0.1 g, 0.2 mmol). After 4 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 12.8 g of Compound 1-4 (yield 80%, MS: [M+H]+=653).

Synthesis Example 1-5

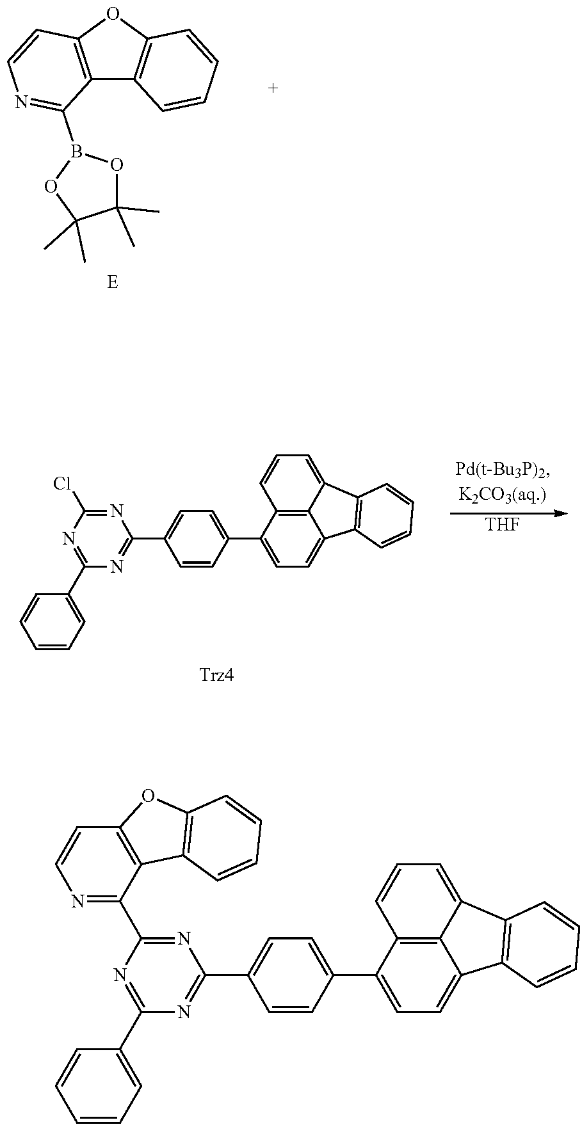

E

Trz4

1-5

Compound E (15 g, 50.8 mmol) and Trz4 (25 g, 53.4 mmol) were added to 300 ml of THE under a nitrogen atmosphere, and the mixture was stirred and refluxed. Then, potassium carbonate (21.1 g, 152.5 mmol) was dissolved in 100 ml of water, and then added thereto. Thereafter, it was stirred sufficiently, followed by adding bis(tri-tert-butylphosphine)palladium(0) (0.3 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 20.4 g of Compound 1-5 (yield 67%, MS: [M+H]+=601).

Synthesis Example 1-6

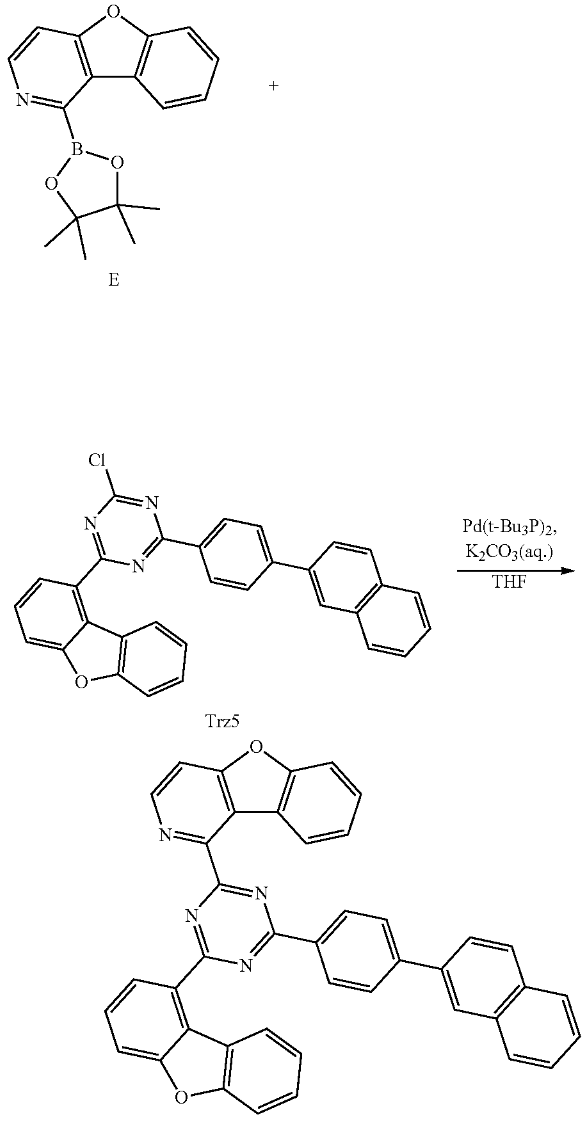

E

Trz5

1-6

Compound E (15 g, 50.8 mmol) and Trz5 (25.8 g, 53.4 mmol) were added to 300 ml of THE under a nitrogen atmosphere, and the mixture was stirred and refluxed. Then, potassium carbonate (21.1 g, 152.5 mmol) was dissolved in 100 ml of water, and then added thereto. Thereafter, it was stirred sufficiently, followed by adding bis(tri-tert-butylphosphine)palladium(0) (0.3 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 20.4 g of Compound 1-6 (yield 65%, MS: [M+H]+=617).

Synthesis Example 1-7

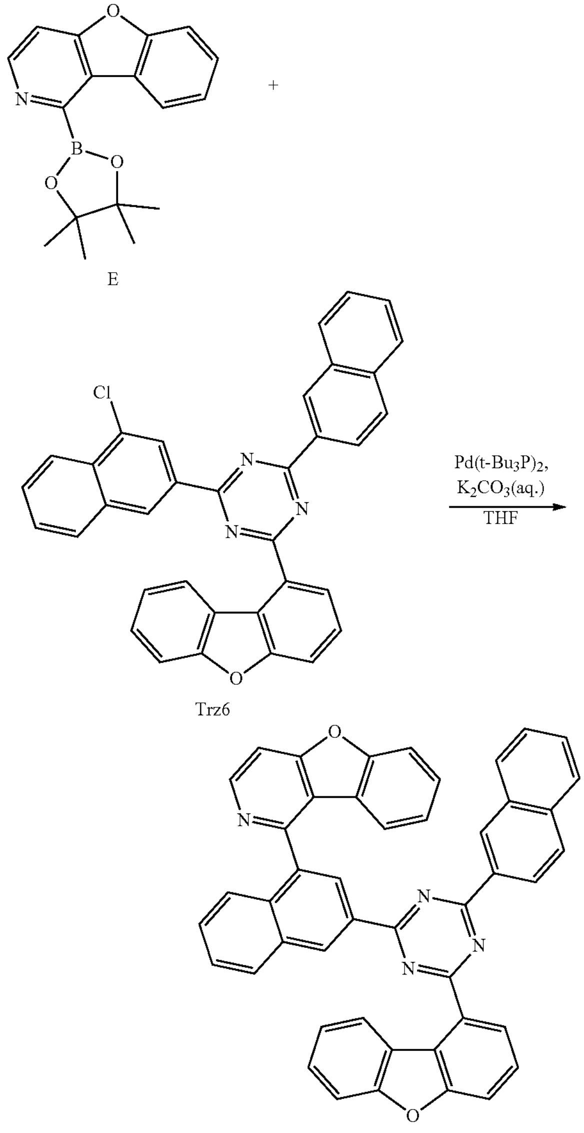

E

Trz6

1-7

Compound E (15 g, 50.8 mmol) and Trz6 (28.5 g, 53.4 mmol) were added to 300 ml of THE under a nitrogen atmosphere, and the mixture was stirred and refluxed. Then, potassium carbonate (21.1 g, 152.5 mmol) was dissolved in 100 ml of water, and then added thereto. Thereafter, it was stirred sufficiently, followed by adding bis(tri-tert-butylphosphine)palladium(O) (0.3 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 20.7 g of Compound 1-7 (yield 61%, MS: [M+H]+=667).

Synthesis Example 1-8

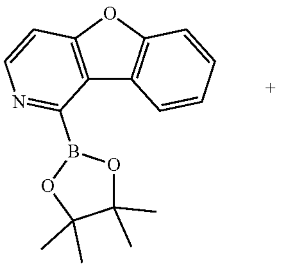

E

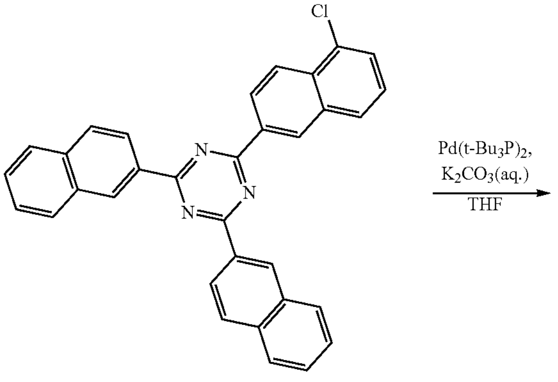

Trz7

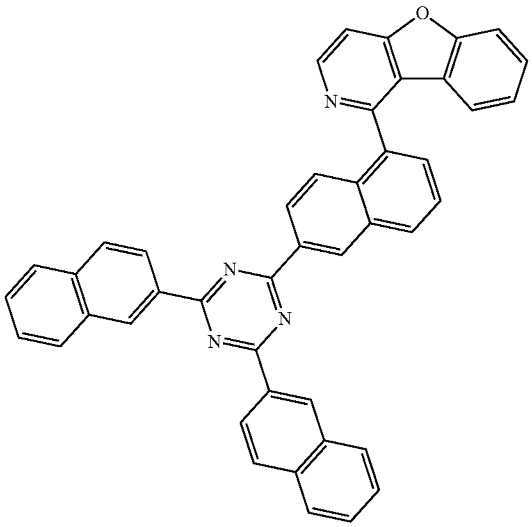

1-8

Compound E (15 g, 50.8 mmol) and Trz7 (26.4 g, 53.4 mmol) were added to 300 ml of THE under a nitrogen atmosphere, and the mixture was stirred and refluxed. Then, potassium carbonate (21.1 g, 152.5 mmol) was dissolved in 100 ml of water, and then added thereto. Thereafter, it was stirred sufficiently, followed by adding bis(tri-tert-butylphosphine)palladium(0) (0.3 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 24.2 g of Compound 1-8 (yield 76%, MS: [M+H]+=627).

Synthesis Example 1-9

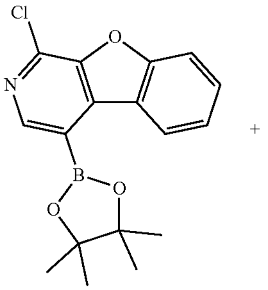

F

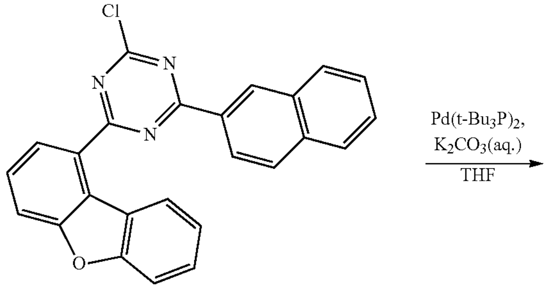

Trz8

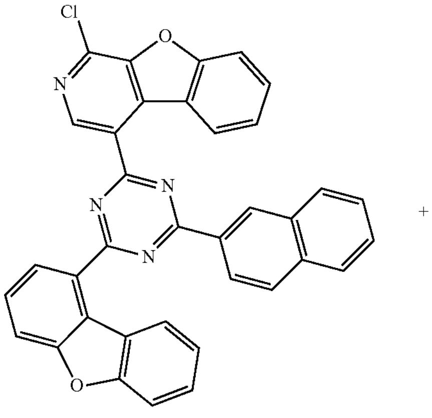

subF-1

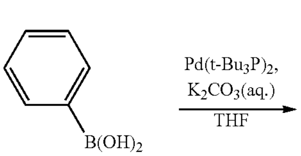

sub4

-continued

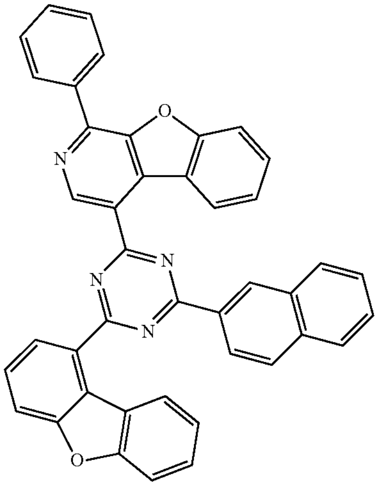

1-9

Compound F (15 g, 45.5 mmol) and Trz8 (19.5 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 17 g of subF-1 (yield 65%, MS: [M+H]+= 575).

Compound subF-1 (15 g, 26.1 mmol) and sub4 (3.3 g, 27.4 mmol) were added to 300 ml of THE under a nitrogen atmosphere, and the mixture was stirred and refluxed. Then, potassium carbonate (10.8 g, 78.3 mmol) was dissolved in 100 ml of water, and then added thereto. Thereafter, it was stirred sufficiently, followed by adding bis(tri-tert-butylphosphine)palladium(0) (0.1 g, 0.3 mmol). After 4 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 12.9 g of Compound 1-9 (yield 80%, MS: [M+H]+=617).

Synthesis Example 1-10

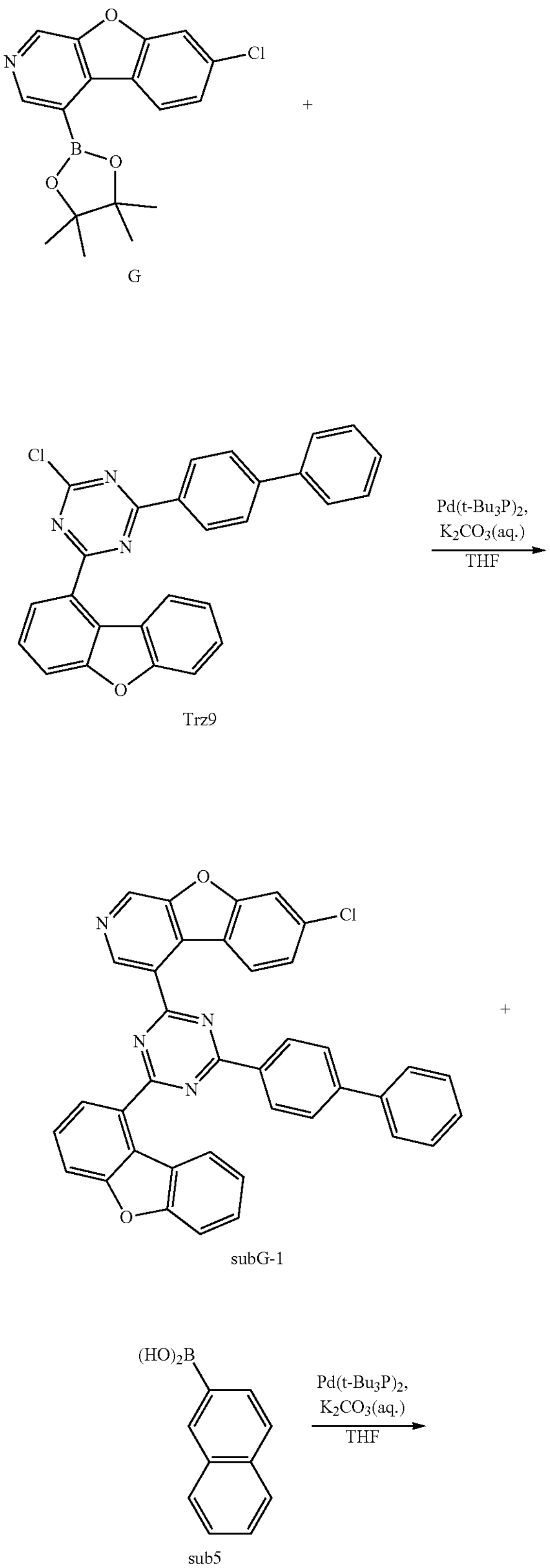

-continued

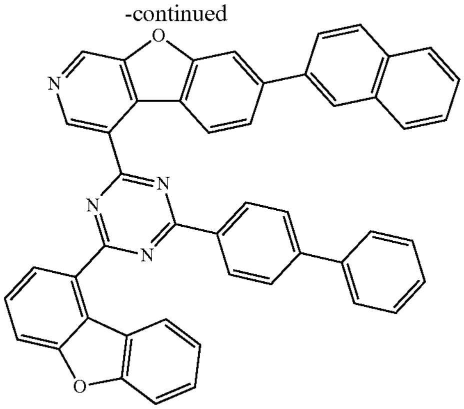

1-10

Compound G (15 g, 45.5 mmol) and Trz9 (20.7 g, 47.8 mmol) were added to 300 ml of THF under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 21.9 g of subG-1 (yield 80%, MS: [M+H]+=601).

Compound subG-1 (15 g, 25 mmol) and sub5 (4.5 g, 26.2 mmol) were added to 300 ml of THF under a nitrogen atmosphere, and the mixture was stirred and refluxed. Then, potassium carbonate (10.3 g, 74.9 mmol) was dissolved in 100 ml of water, and then added thereto. Thereafter, it was stirred sufficiently, followed by adding bis(tri-tert-butylphosphine)palladium(0) (0.1 g, 0.2 mmol). After 4 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 13 g of Compound 1-10 (yield 75%, MS: [M+H]+=693).

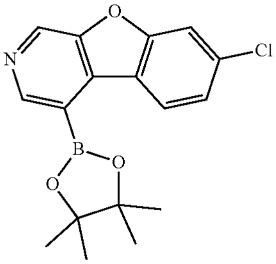

+

G

-continued

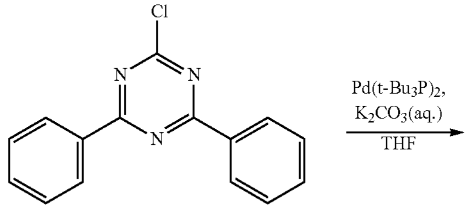

Trz2

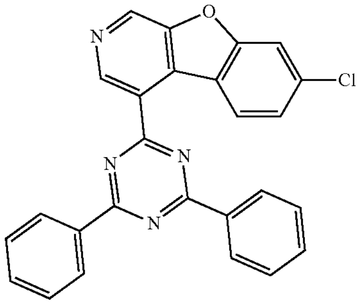

+ subG-2

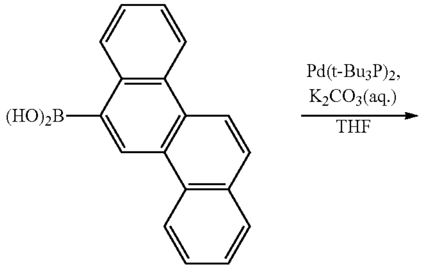

sub6

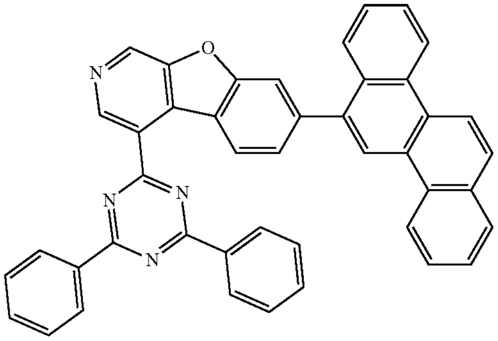

1-11

Compound G (15 g, 45.5 mmol) and Trz2 (12.8 g, 47.8 mmol) were added to 300 ml of THF under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 13.8 g of subG-2 (yield 70%, MS: [M+H]+=435).

Compound subG-2 (15 g, 34.5 mmol) and sub6 (17.5 g, 36.2 mmol) were added to 300 ml of THE under a nitrogen atmosphere, and the mixture was stirred and refluxed. Then, potassium carbonate (14.3 g, 103.5 mmol) was dissolved in 100 ml of water, and then added thereto. Thereafter, it was stirred sufficiently, followed by adding bis(tri-tert-butylphosphine)palladium(0) (0.2 g, 0.3 mmol). After 5 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 14 g of Compound 1-11 (yield 65%, MS: [M+H]+=627).

Synthesis Example 1-12

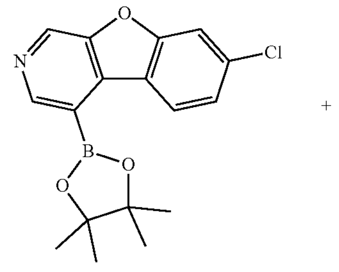

G

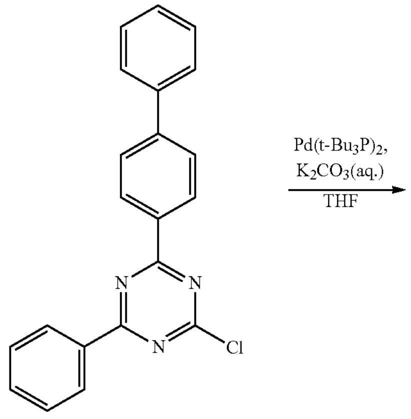

Trz10

-continued

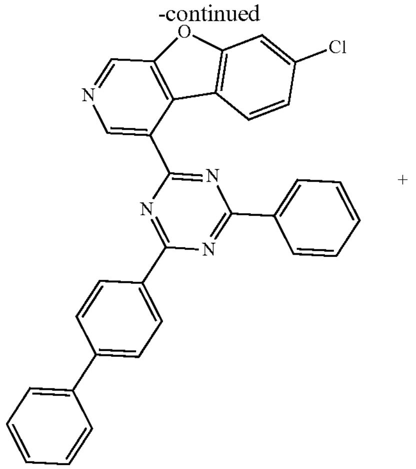

subG-3

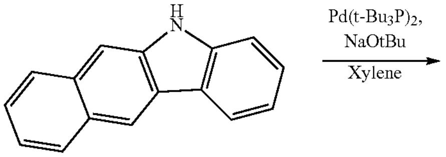

sub7

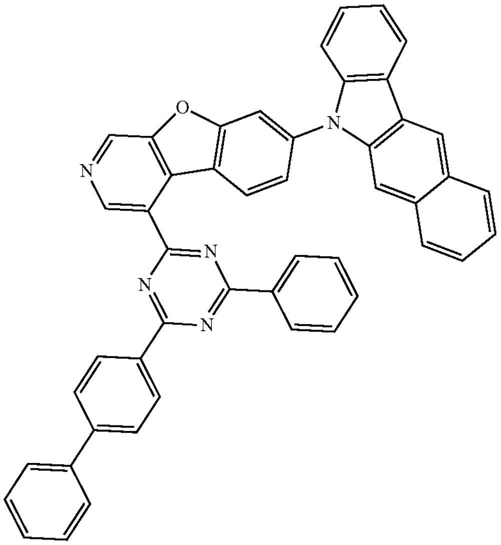

1-12

Compound G (15 g, 45.5 mmol) and Trz10 (16.4 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 14.2 g of subG-3 (yield 61%, MS: [M+H]+=511).

Compound subG-3 (10 g, 19.6 mmol), sub7 (4.3 g, 20 mmol), and sodium tert-butoxide (2.4 g, 25.4 mmol) were added to 200 ml of Xylene under a nitrogen atmosphere, and the mixture was stirred and refluxed. Then, bis(tri-tert-butylphosphine)palladium(0) (0.1 g, 0.2 mmol) was added thereto. After 5 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 9.5 g of Compound 1-12 (yield 70%, MS: [M+H]+=692).

Synthesis Example 1-13

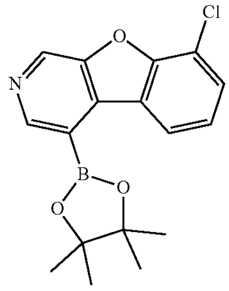

+

H

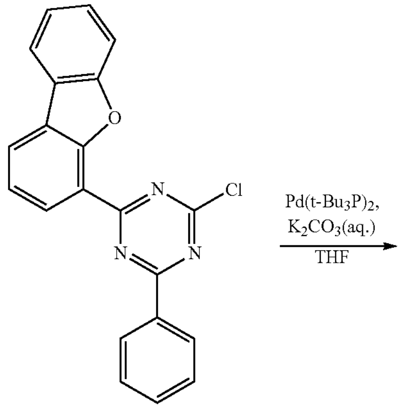

Trz11

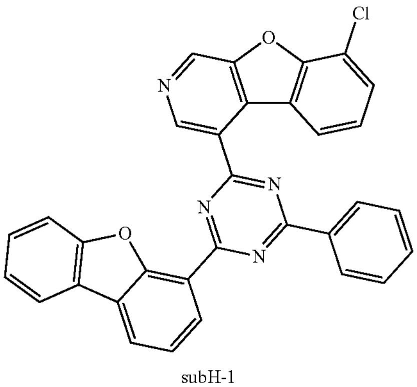

+ subH-1

-continued

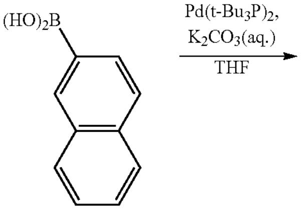

sub5

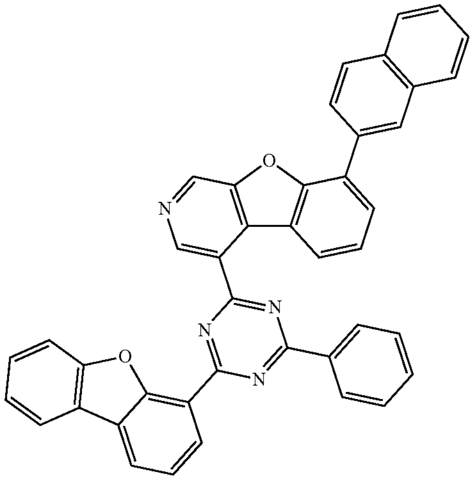

1-13

Compound H (15 g, 45.5 mmol) and Trz11 (17.1 g, 47.8 mmol) were added to 300 ml of THF under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 16.2 g of subH-1 (yield 68%, MS: [M+H]+=525).

Compound subH-1 (15 g, 28.6 mmol) and sub5 (5.2 g, 30 mmol) were added to 300 ml of THF under a nitrogen atmosphere, and the mixture was stirred and refluxed. Then, potassium carbonate (11.8 g, 85.7 mmol) was dissolved in 100 ml of water, and then added thereto. Thereafter, it was stirred sufficiently, followed by adding bis(tri-tert-butylphosphine)palladium(0) (0.1 g, 0.3 mmol). After 4 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 10.9 g of Compound 1-13 (yield 62%, MS: [M+H]+=617).

Synthesis Example 1-14

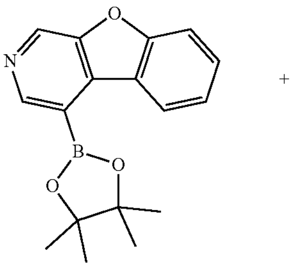

I

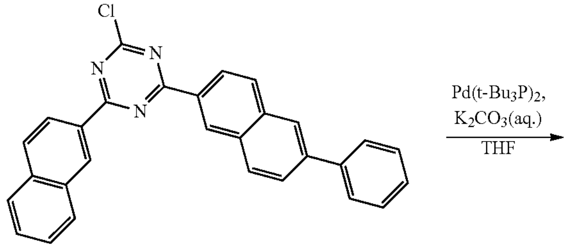

Trz12

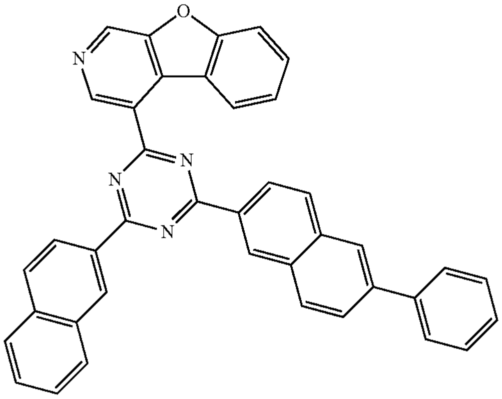

1-14

Compound I (15 g, 50.8 mmol) and Trz12 (23.7 g, 53.4 mmol) were added to 300 ml of THE under a nitrogen atmosphere, and the mixture was stirred and refluxed. Then, potassium carbonate (21.1 g, 152.5 mmol) was dissolved in 100 ml of water, and then added thereto. Thereafter, it was stirred sufficiently, followed by adding bis(tri-tert-butylphosphine)palladium(0) (0.3 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 17.6 g of Compound 1-14 (yield 60%, MS: [M+H]+=577).

Synthesis Example 1-15

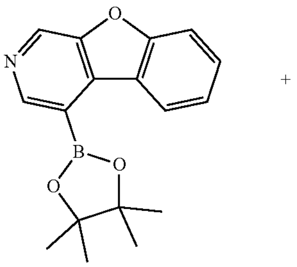

I

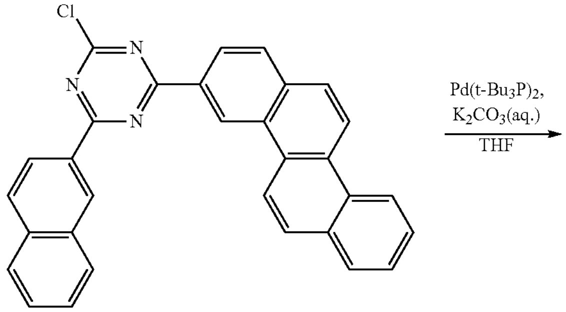

Trz13

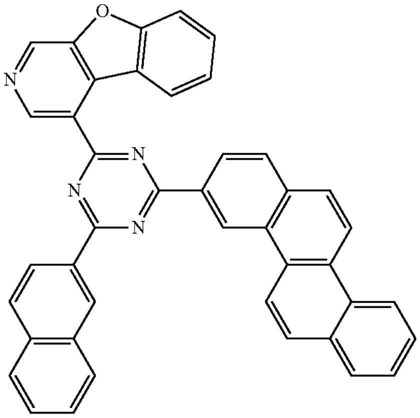

1-15

Compound I (15 g, 50.8 mmol) and Trz13 (25 g, 53.4 mmol) were added to 300 ml of THE under a nitrogen atmosphere, and the mixture was stirred and refluxed. Then, potassium carbonate (21.1 g, 152.5 mmol) was dissolved in 100 ml of water, and then added thereto. Thereafter, it was stirred sufficiently, followed by adding bis(tri-tert-butylphosphine)palladium(0) (0.3 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 21.7 g of Compound 1-15 (yield 71%, MS: [M+H]+=601).

Synthesis Example 1-16

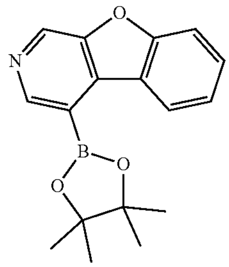

+

I

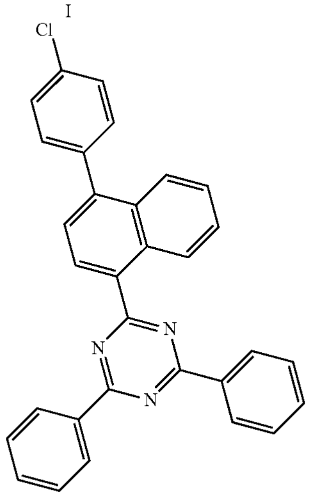

Trz14

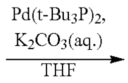

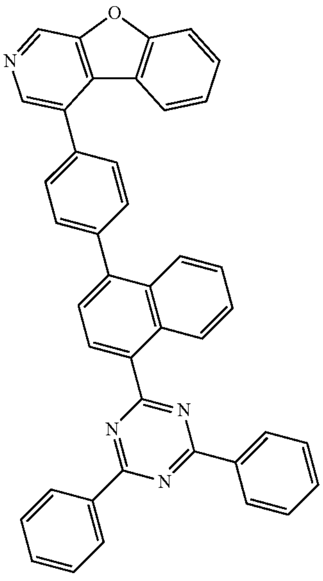

1-16

Compound I (15 g, 50.8 mmol) and Trz14 (25.1 g, 53.4 mmol) were added to 300 ml of THE under a nitrogen atmosphere, and the mixture was stirred and refluxed. Then, potassium carbonate (21.1 g, 152.5 mmol) was dissolved in 100 ml of water, and then added thereto. Thereafter, it was stirred sufficiently, followed by adding bis(tri-tert-butylphosphine)palladium(0) (0.3 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 21.4 g of Compound 1-16 (yield 70%, MS: [M+H]+=603).

Synthesis Example 1-17

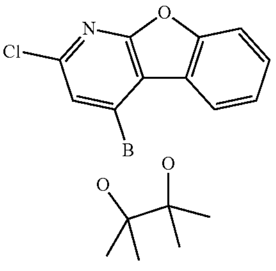

J

+

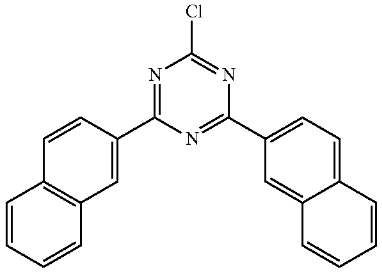

Trz15

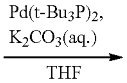

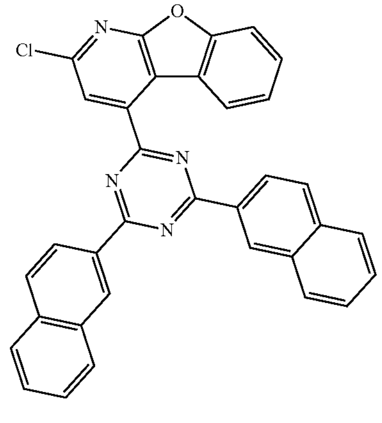

subJ-1

+

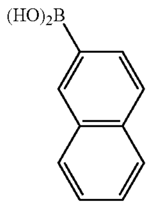

sub5

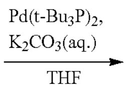

-continued

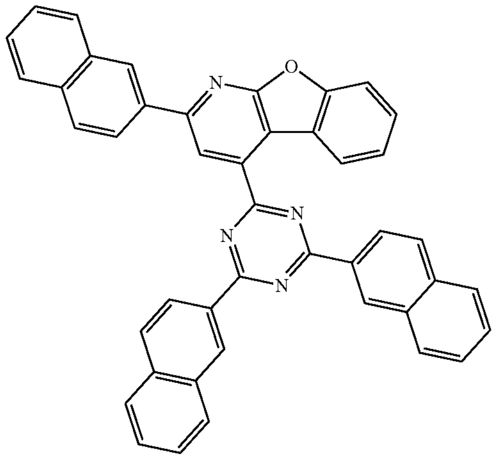

1-17

Compound J (15 g, 45.5 mmol) and Trz15 (17.6 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 15.6 g of subJ-1 (yield 64%, MS: [M+H]+=535).

Compound subJ-1 (15 g, 28 mmol) and sub5 (5.1 g, 29.4 mmol) were added to 300 ml of THE under a nitrogen atmosphere, and the mixture was stirred and refluxed. Then, potassium carbonate (11.6 g, 84.1 mmol) was dissolved in 100 ml of water, and then added thereto. Thereafter, it was stirred sufficiently, followed by adding bis(tri-tert-butylphosphine)palladium(0) (0.1 g, 0.3 mmol). After 4 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 13.7 g of Compound 1-17 (yield 78%, MS: [M+H]+=627).

Synthesis Example 1-18

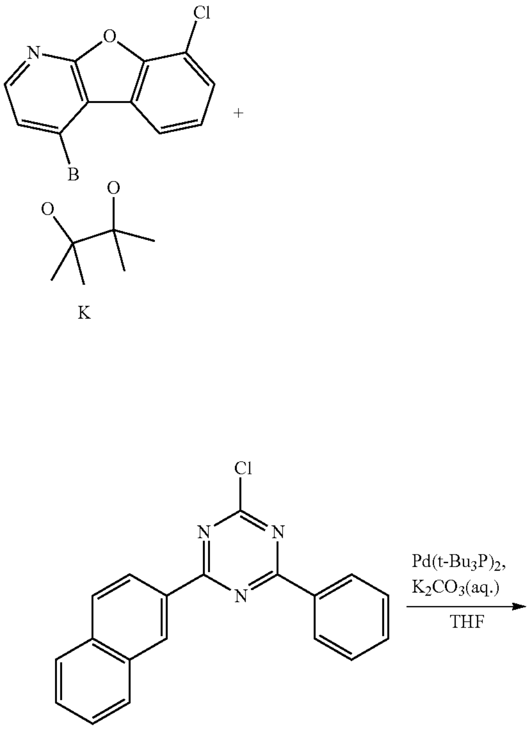

K

Trz1

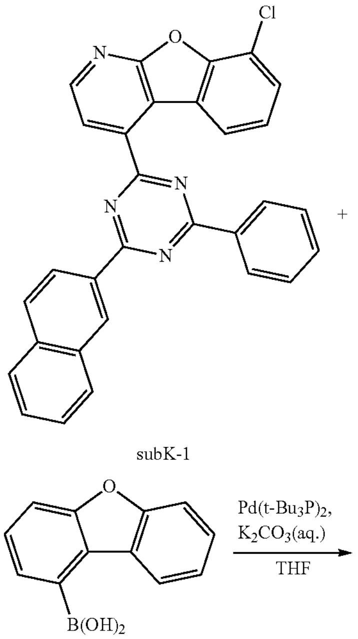

subK-1 sub8

-continued

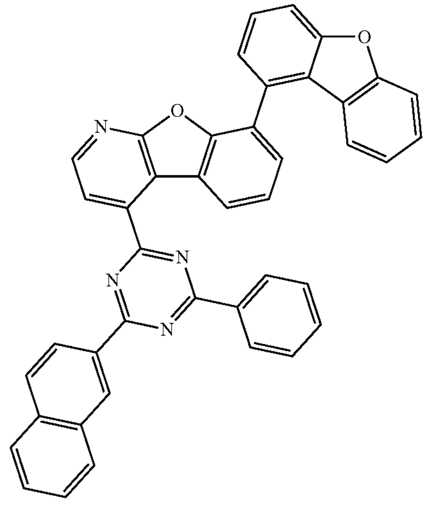

1-18

Compound K (15 g, 45.5 mmol) and Trz1 (15.2 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 13.9 g of subK-1 (yield 63%, MS: [M+H]+=485).

Compound subK-1 (15 g, 30.9 mmol) and sub8 (6.9 g, 32.5 mmol) were added to 300 ml of THE under a nitrogen atmosphere, and the mixture was stirred and refluxed. Then, potassium carbonate (12.8 g, 92.8 mmol) was dissolved in 100 ml of water, and then added thereto. Thereafter, it was stirred sufficiently, followed by adding bis(tri-tert-butylphosphine)palladium(0) (0.2 g, 0.3 mmol). After 4 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 12.4 g of Compound 1-18 (yield 65%, MS: [M+H]+=617).

Synthesis Example 1-19

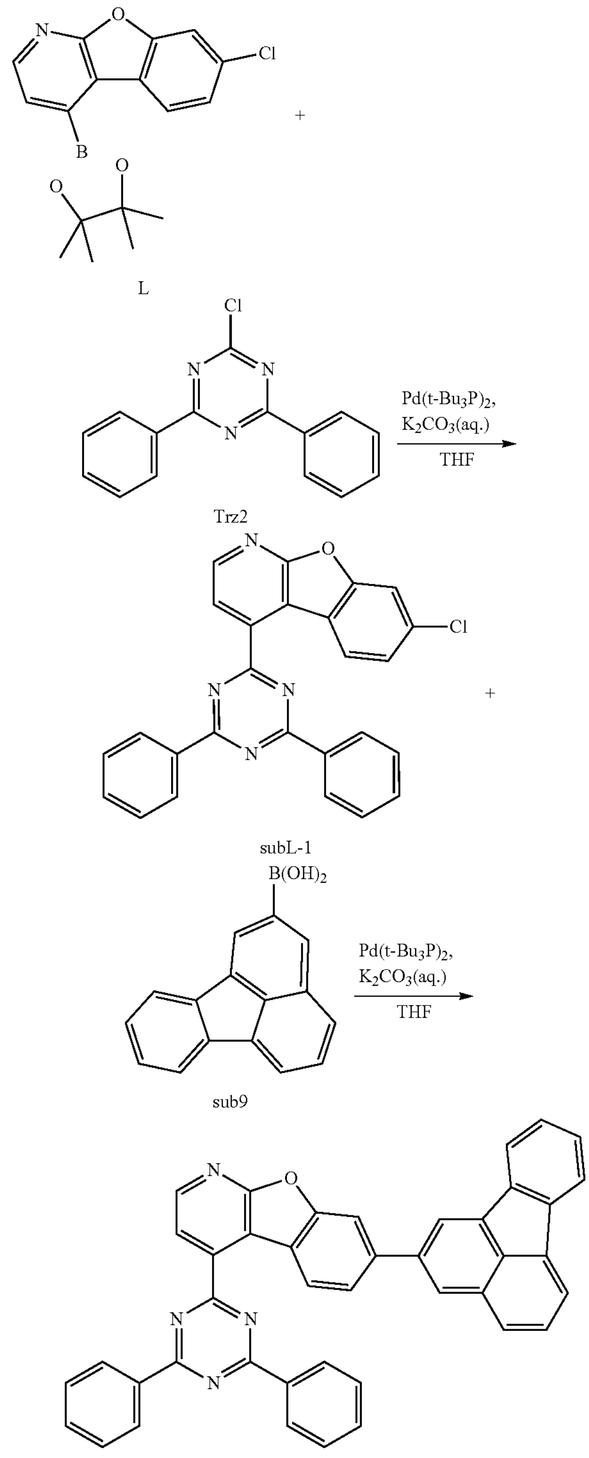

L

Trz2 subL-1 sub9

1-19

Compound L (15 g, 45.5 mmol) and Trz2 (12.8 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 13.6 g of subL-1 (yield 69%, MS: [M+H]+=435).

Compound subL-1 (15 g, 34.5 mmol) and sub9 (8.9 g, 36.2 mmol) were added to 300 ml of THE under a nitrogen atmosphere, and the mixture was stirred and refluxed. Then, potassium carbonate (14.3 g, 103.5 mmol) was dissolved in 100 ml of water, and then added thereto. Thereafter, it was stirred sufficiently, followed by adding bis(tri-tert-butylphosphine)palladium(0) (0.2 g, 0.3 mmol). After 5 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 13.2 g of Compound 1-19 (yield 64%, MS: [M+H]+=601).

Synthesis Example 1-20

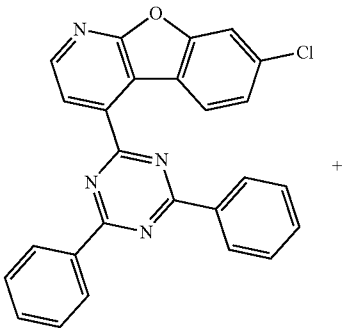

subL-1

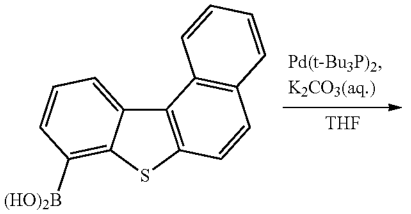

sub10

-continued

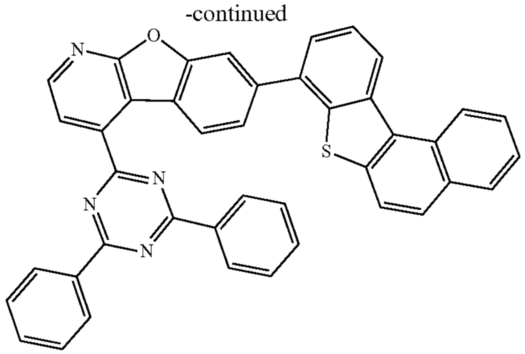

1-20

Compound subL-1 (15 g, 34.5 mmol) and sub10 (10.1 g, 36.2 mmol) were added to 300 ml of THE under a nitrogen atmosphere, and the mixture was stirred and refluxed. Then, potassium carbonate (14.3 g, 103.5 mmol) was dissolved in 100 ml of water, and then added thereto. Thereafter, it was stirred sufficiently, followed by adding bis(tri-tert-butylphosphine)palladium(0) (0.2 g, 0.3 mmol). After 4 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 14.4 g of Compound 1-20 (yield 66%, MS: [M+H]+=633).

Synthesis Example 1-21

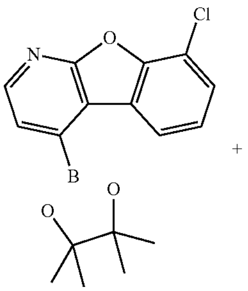

K

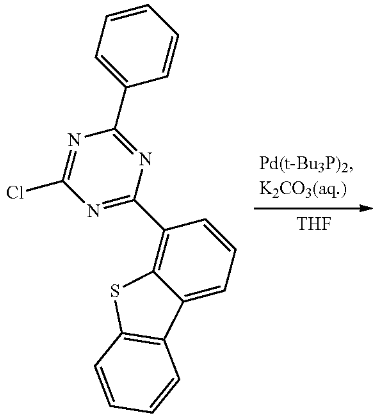

Trz16

-continued

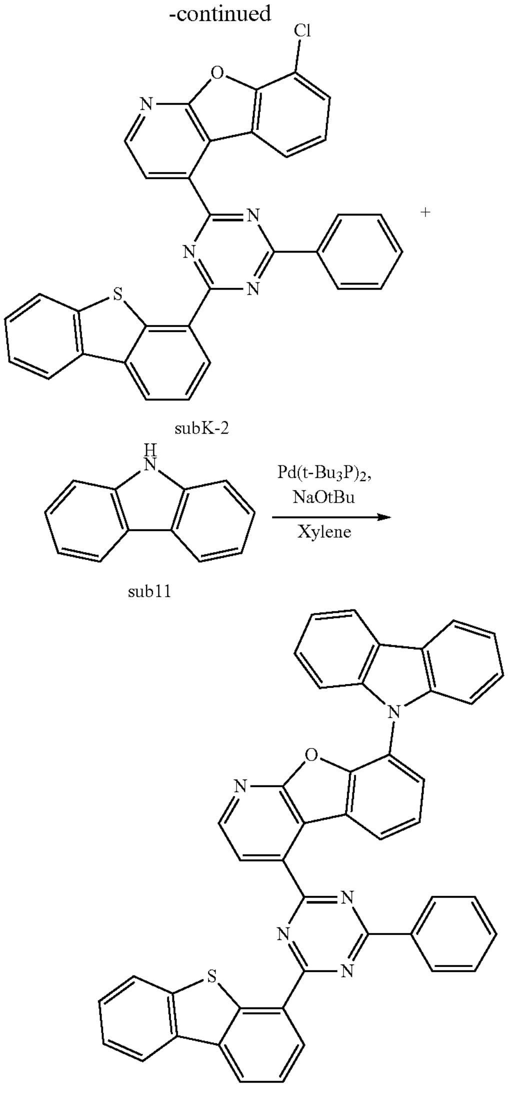

subK-2 sub11

1-21

Compound K (15 g, 45.5 mmol) and Trz16 (17.9 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 16.7 g of subK-2 (yield 68%, MS: [M+H]+=541).

Compound subK-2 (10 g, 18.5 mmol), sub11 (3.2 g, 18.9 mmol), and sodium tert-butoxide (2.3 g, 24 mmol) were added to 200 ml of Xylene under a nitrogen atmosphere, and the mixture was stirred and refluxed. Then, bis(tri-tert-butylphosphine)palladium(0) (0.1 g, 0.2 mmol) was added thereto. After 5 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 7.8 g of Compound 1-21 (yield 63%, MS: [M+H]+=672).

Synthesis Example 1-22

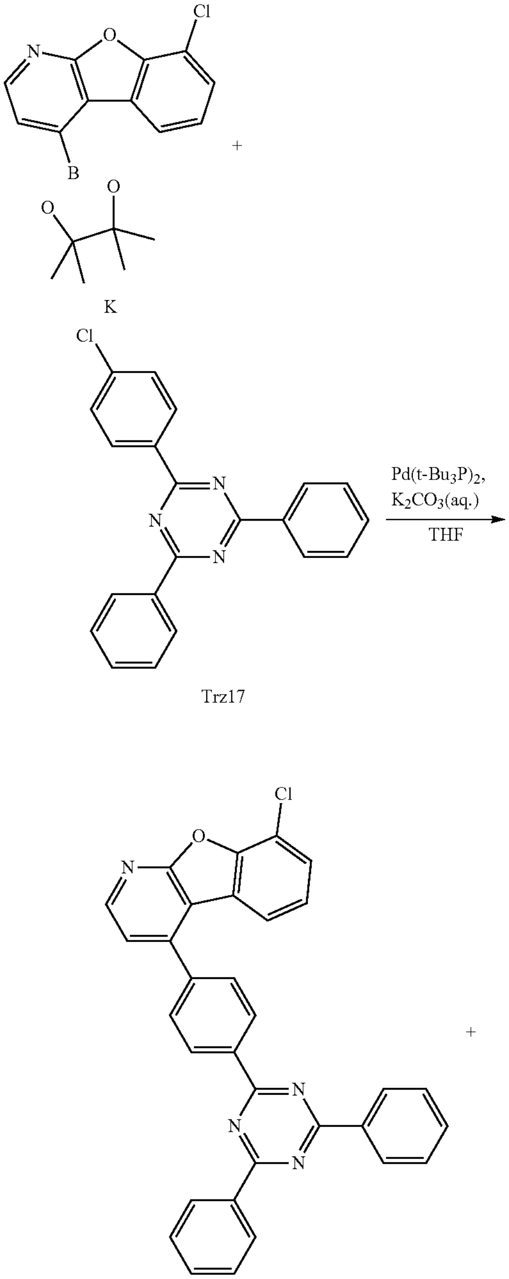

K

Trz17 subK-3

-continued

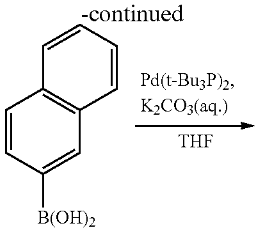

sub5

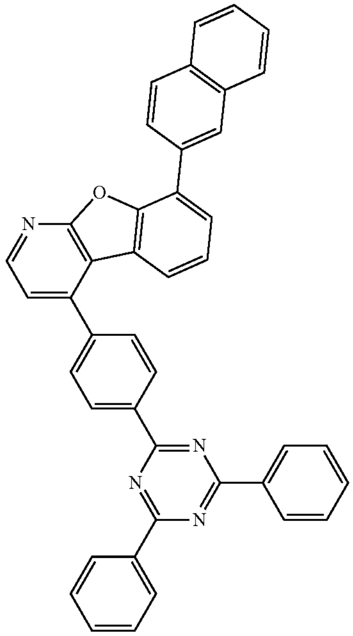

1-22

Compound K (15 g, 45.5 mmol) and Trz17 (16.4 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 15.3 g of subK-3 (yield 66%, MS: [M+H]+=511).

Compound subK-3 (15 g, 29.4 mmol) and sub5 (5.3 g, 30.8 mmol) were added to 300 ml of THE under a nitrogen atmosphere, and the mixture was stirred and refluxed. Then, potassium carbonate (12.2 g, 88.1 mmol) was dissolved in 100 ml of water, and then added thereto. Thereafter, it was stirred sufficiently, followed by adding bis(tri-tert-butylphosphine)palladium(0) (0.2 g, 0.3 mmol). After 4 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 13.8 g of Compound 1-22 (yield 78%, MS: [M+H]+=603).

Synthesis Example 1-23

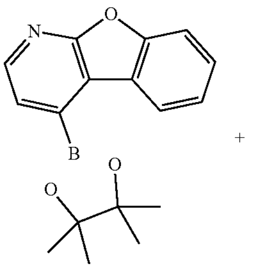

M

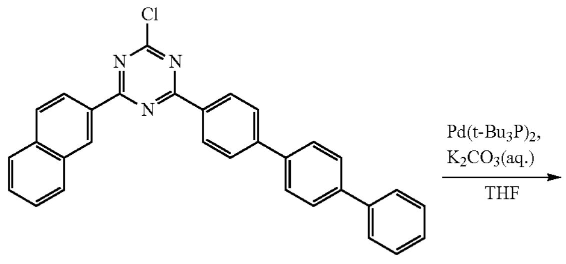

Trz18

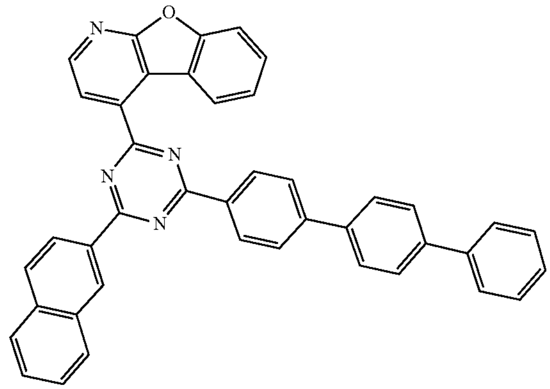

1-23

Compound M (15 g, 50.8 mmol) and Trz18 (25.1 g, 53.4 mmol) were added to 300 ml of THE under a nitrogen atmosphere, and the mixture was stirred and refluxed. Then, potassium carbonate (21.1 g, 152.5 mmol) was dissolved in 100 ml of water, and then added thereto. Thereafter, it was stirred sufficiently, followed by adding bis(tri-tert-butylphosphine)palladium(0) (0.3 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 19.9 g of Compound 1-23 (yield 65%, MS: [M+H]+=603).

Synthesis Example 1-24

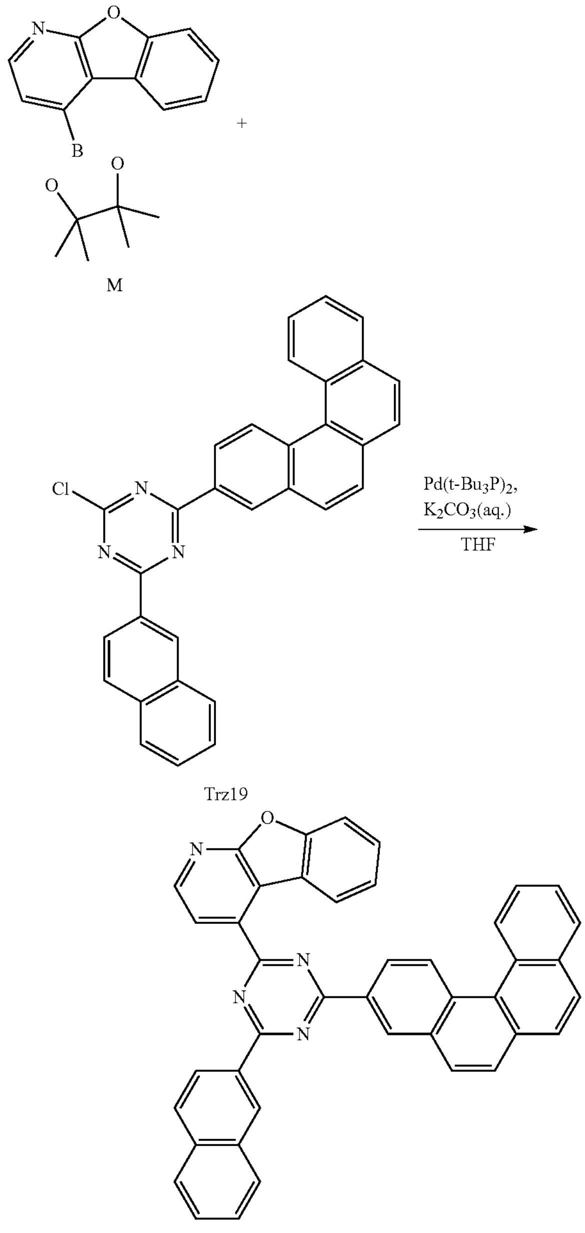

M

Trz19

1-24

Compound M (15 g, 50.8 mmol) and Trz19 (25 g, 53.4 mmol) were added to 300 ml of THE under a nitrogen atmosphere, and the mixture was stirred and refluxed. Then, potassium carbonate (21.1 g, 152.5 mmol) was dissolved in 100 ml of water, and then added thereto. Thereafter, it was stirred sufficiently, followed by adding bis(tri-tert-butylphosphine)palladium(0) (0.3 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 20.4 g of Compound 1-24 (yield 67%, MS: [M+H]+=601).

Synthesis Example 1-25

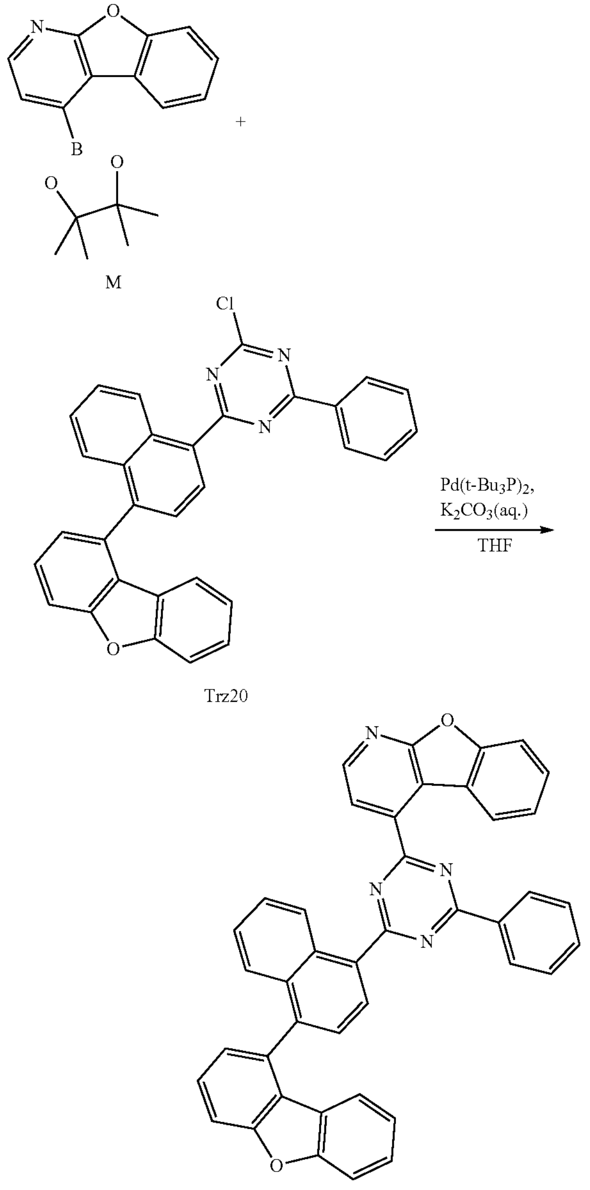

M

Trz20

1-25

Compound M (15 g, 50.8 mmol) and Trz20 (25.8 g, 53.4 mmol) were added to 300 ml of THE under a nitrogen atmosphere, and the mixture was stirred and refluxed. Then, potassium carbonate (21.1 g, 152.5 mmol) was dissolved in 100 ml of water, and then added thereto. Thereafter, it was stirred sufficiently, followed by adding bis(tri-tert-butylphosphine)palladium(0) (0.3 g, 0.5 mmol). After 3 hours of reaction, cooling was performed to room temperature. Then, the organic layer was separated from the water layer, and then the organic layer was distilled. Then, this was dissolved again in chloroform, and washed twice with water.

Thereafter, the organic layer was separated, treated with anhydrous magnesium sulfate, stirred, then filtered, and the filtrate was distilled under reduced pressure. The concentrated compound was purified by silica gel column chromatography to prepare 19.7 g of Compound 1-25 (yield 63%, MS: [M+H]+=617).

Synthesis Example 1-26

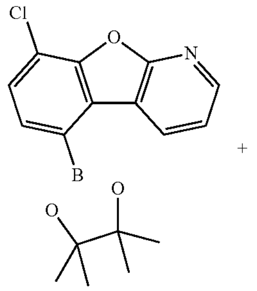

N

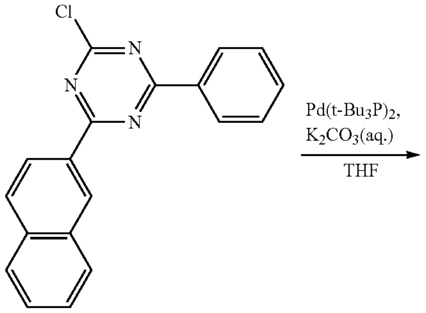

Trz1

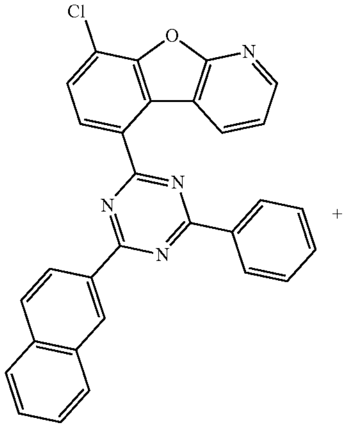

subN-1

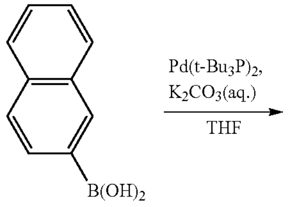

sub5

-continued

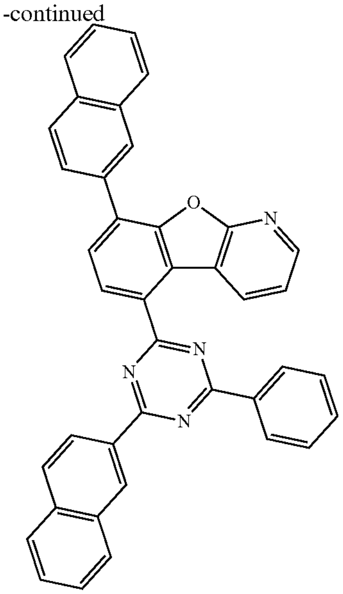

1-26

Compound N (15 g, 45.5 mmol) and Trz1 (15.2 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 15.9 g of subN-1 (yield 72%, MS: [M+H]+=485).

Compound subN-1 (15 g, 30.9 mmol) and sub5 (5.6 g, 32.5 mmol) were added to 300 ml of THE under a nitrogen atmosphere, and the mixture was stirred and refluxed. Then, potassium carbonate (12.8 g, 92.8 mmol) was dissolved in 100 ml of water, and then added thereto. Thereafter, it was stirred sufficiently, followed by adding bis(tri-tert-butylphosphine)palladium(0) (0.2 g, 0.3 mmol). After 4 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 12.7 g of Compound 1-26 (yield 71%, MS: [M+H]+=577).

Synthesis Example 1-27

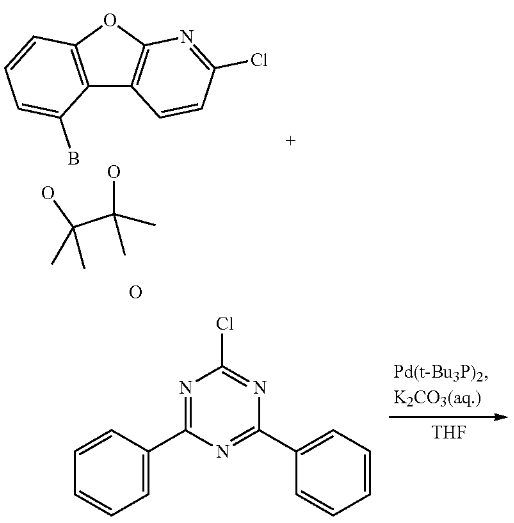

Trz2

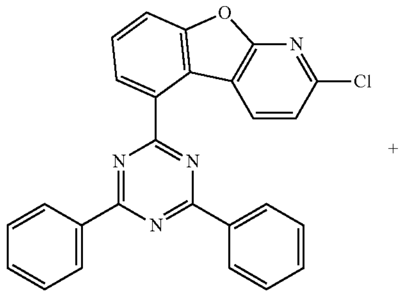

subO-1

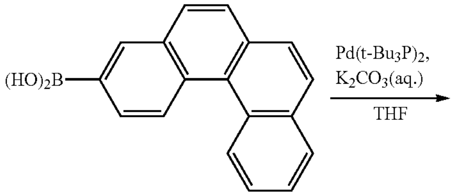

sub12

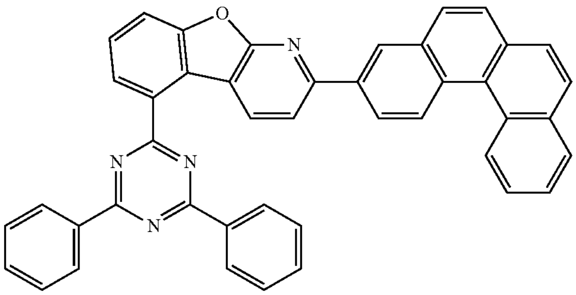

1-27

Compound O (15 g, 45.5 mmol) and Trz2 (12.8 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 15 g of subO-1 (yield 76%, MS: [M+H]+=435).

Compound subO-1 (15 g, 34.5 mmol) and sub12 (9.9 g, 36.2 mmol) were added to 300 ml of THE under a nitrogen atmosphere, and the mixture was stirred and refluxed. Then, potassium carbonate (14.3 g, 103.5 mmol) was dissolved in 100 ml of water, and then added thereto. Thereafter, it was stirred sufficiently, followed by adding bis(tri-tert-butylphosphine)palladium(0) (0.2 g, 0.3 mmol). After 4 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 15.8 g of Compound 1-27 (yield 73%, MS: [M+H]+=627).

Synthesis Example 1-28

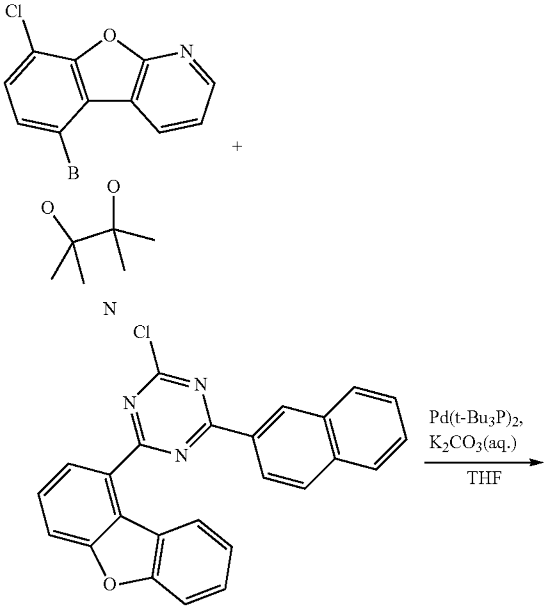

Trz8

-continued

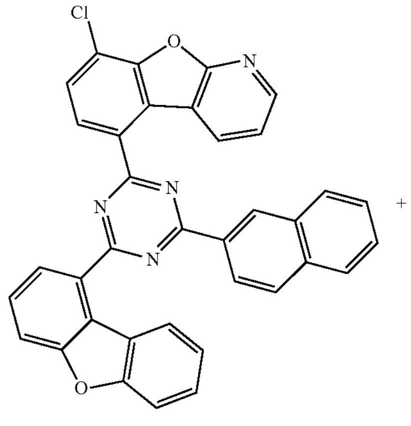

subN-2

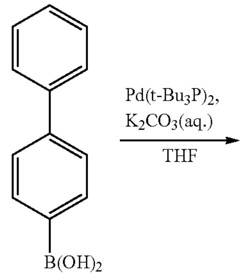

sub13

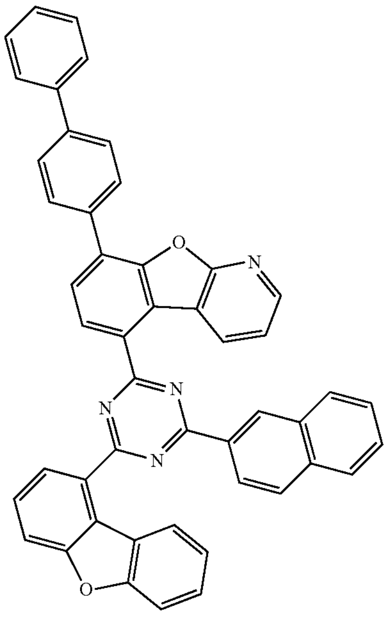

1-28

Compound N (15 g, 45.5 mmol) and Trz8 (12.8 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 20.4 g of subN-2 (yield 78%, MS: [M+H]+=575).

Compound subN-2 (15 g, 26.1 mmol) and sub13 (5.4 g, 27.4 mmol) were added to 300 ml of THE under a nitrogen atmosphere, and the mixture was stirred and refluxed. Then, potassium carbonate (10.8 g, 78.3 mmol) was dissolved in 100 ml of water, and then added thereto. Thereafter, it was stirred sufficiently, followed by adding bis(tri-tert-butylphosphine)palladium(0) (0.1 g, 0.3 mmol). After 4 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 10.8 g of Compound 1-28 (yield 60%, MS: [M+H]+=693).

Synthesis Example 1-29

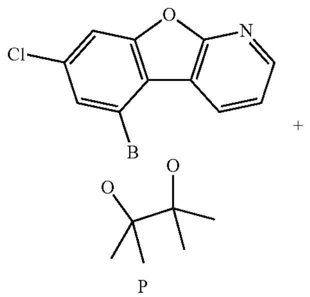

P

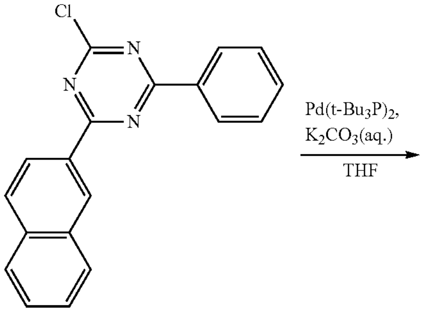

Trz1

-continued

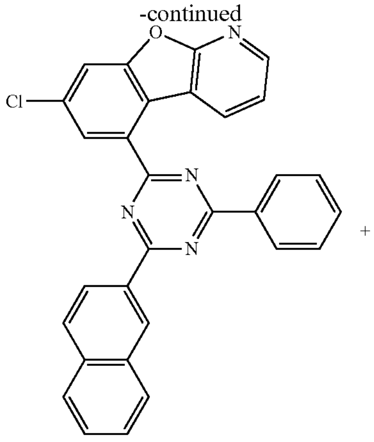

subP-1

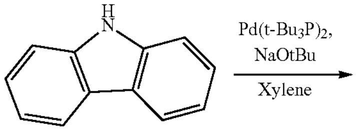

sub11

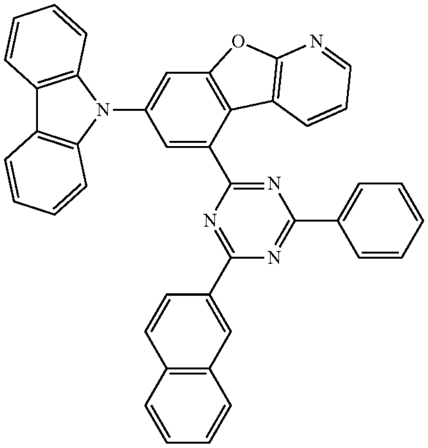

1-29

Compound P (15 g, 45.5 mmol) and Trz1 (15.2 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 13.7 g of subP-1 (yield 62%, MS: [M+H]+=485).

Compound subP-1 (10 g, 20.6 mmol), sub11 (3.5 g, 21 mmol), and sodium tert-butoxide (2.6 g, 26.8 mmol) were added to 200 ml of Xylene under a nitrogen atmosphere, and the mixture was stirred and refluxed. Then, bis(tri-tert-butylphosphine)palladium(0) (0.1 g, 0.2 mmol) was added thereto. After 4 hours, the reaction was completed, cooling was performed to room temperature, and the solvent was removed under reduced pressure. Then, the compound was completely dissolved again in chloroform, and washed twice with water.

Thereafter, the organic layer was separated, treated with anhydrous magnesium sulfate, then filtered, and the filtrate was distilled under reduced pressure. The concentrated compound was purified by silica gel column chromatography to prepare 6.5 g of Compound 1-29 (yield 51%, MS: [M+H]+=616).

Synthesis Example 1-30

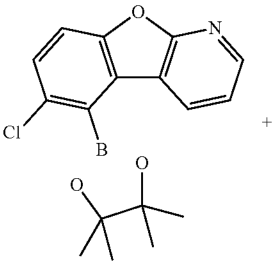

Q

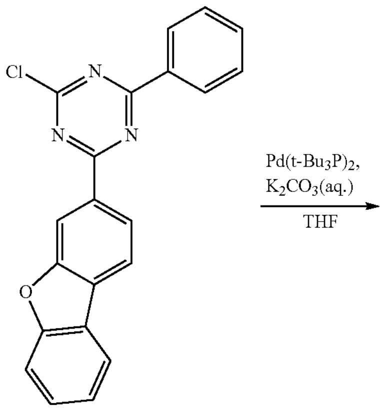

Trz21

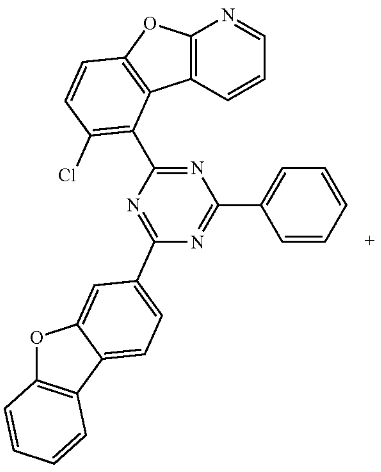

subQ-1

-continued

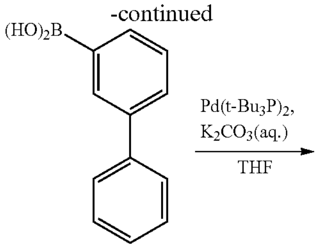

sub14

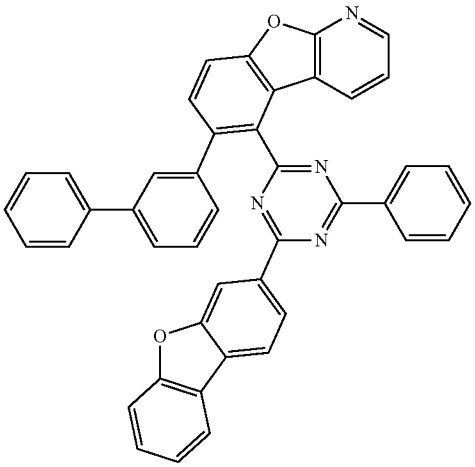

1-30

Compound Q (15 g, 45.5 mmol) and Trz21 (17.1 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 16.5 g of subQ-1 (yield 69%, MS: [M+H]+=525).

Compound subQ-1 (15 g, 28.6 mmol) and sub14 (5.9 g, 30 mmol) were added to 300 ml of THE under a nitrogen atmosphere, and the mixture was stirred and refluxed. Then, potassium carbonate (11.8 g, 85.7 mmol) was dissolved in 100 ml of water, and then added thereto. Thereafter, it was stirred sufficiently, followed by adding bis(tri-tert-butylphosphine)palladium(0) (0.1 g, 0.3 mmol). After 5 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 14.7 g of Compound 1-30 (yield 80%, MS: [M+H]+=643).

Synthesis Example 1-31

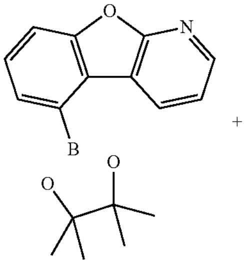

+

R

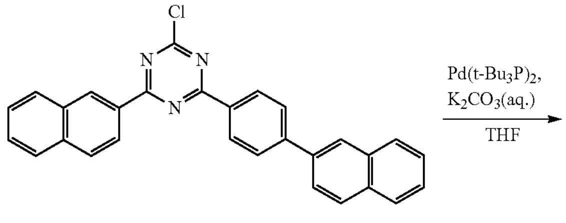

Trz22

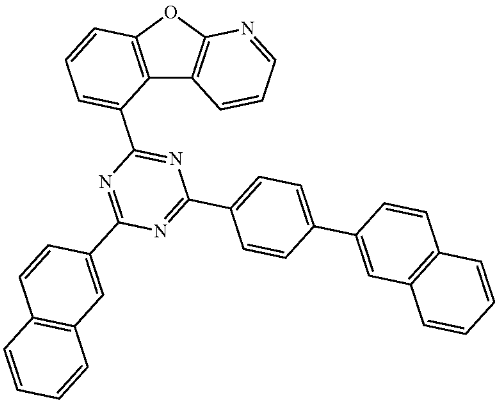

1-31

Compound R (15 g, 50.8 mmol) and Trz22 (23.7 g, 53.4 mmol) were added to 300 ml of THE under a nitrogen atmosphere, and the mixture was stirred and refluxed. Then, potassium carbonate (21.1 g, 152.5 mmol) was dissolved in 100 ml of water, and then added thereto. Thereafter, it was stirred sufficiently, followed by adding bis(tri-tert-butylphosphine)palladium(0) (0.3 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 18.7 g of Compound 1-31 (yield 64%, MS: [M+H]+=577).

Synthesis Example 1-32

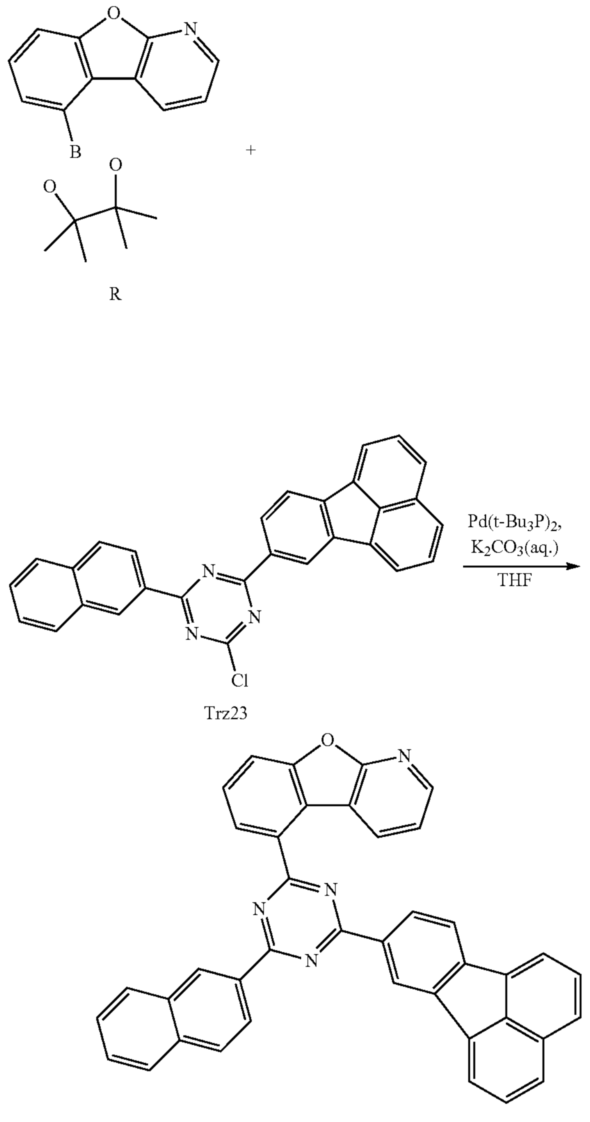

R

Trz23

1-32

Compound R (15 g, 50.8 mmol) and Trz23 (23.6 g, 53.4 mmol) were added to 300 ml of THF under a nitrogen atmosphere, and the mixture was stirred and refluxed. Then, potassium carbonate (21.1 g, 152.5 mmol) was dissolved in 100 ml of water, and then added thereto. Thereafter, it was stirred sufficiently, followed by adding bis(tri-tert-butylphosphine)palladium(0) (0.3 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 23.1 g of Compound 1-32 (yield 79%, MS: [M+H]+=575).

Synthesis Example 1-33

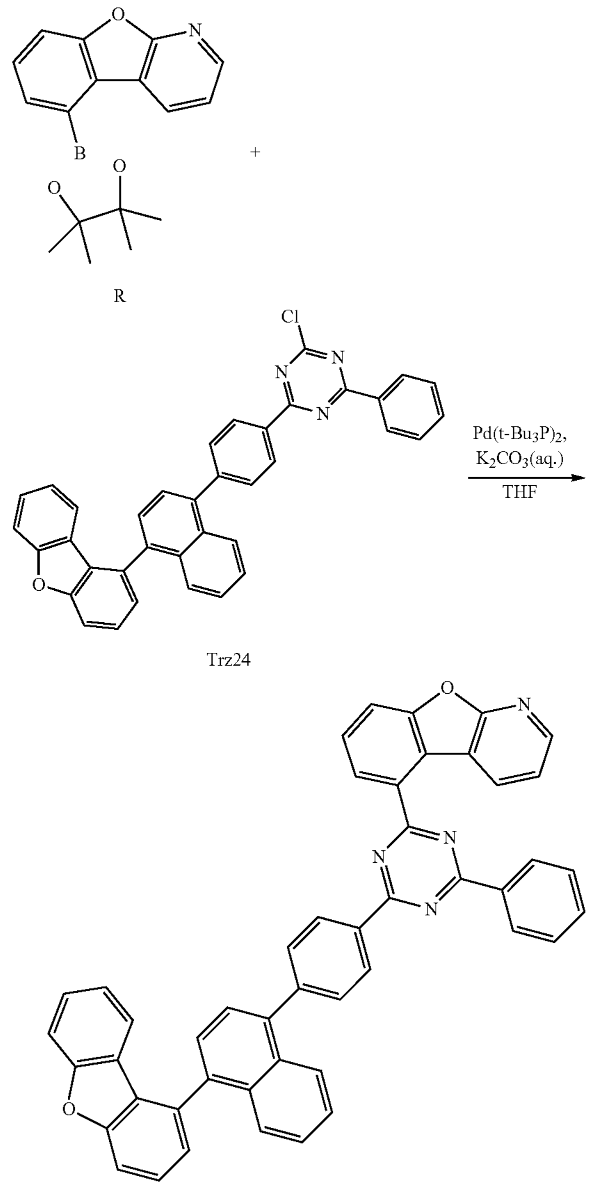

R

Trz24

1-33

Compound R (15 g, 50.8 mmol) and Trz24 (29.9 g, 53.4 mmol) were added to 300 ml of THF under a nitrogen atmosphere, and the mixture was stirred and refluxed. Then, potassium carbonate (21.1 g, 152.5 mmol) was dissolved in 100 ml of water, and then added thereto. Thereafter, it was stirred sufficiently, followed by adding bis(tri-tert-butylphosphine)palladium(0) (0.3 g, 0.5 mmol). After 4 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 26 g of Compound 1-33 (yield 74%, MS: [M+H]+=693).

Synthesis Example 1-34

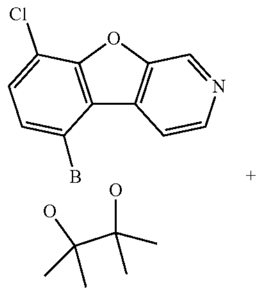

S

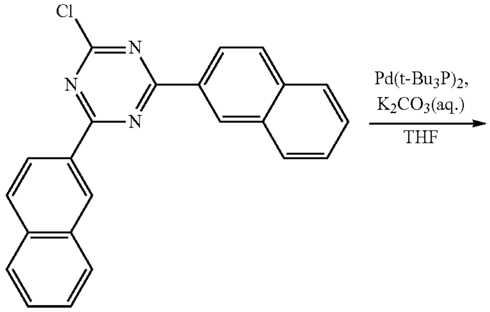

Trz15

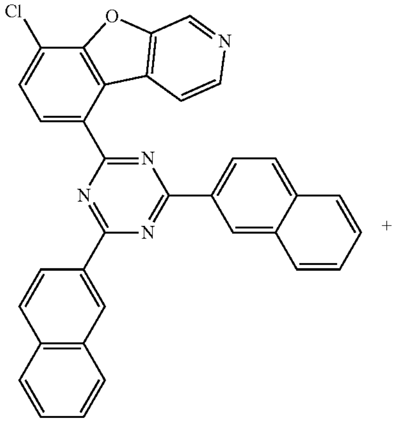

subS-1

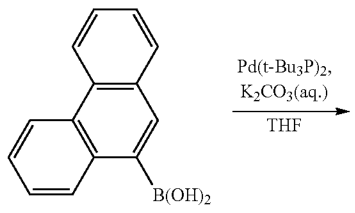

sub15

-continued

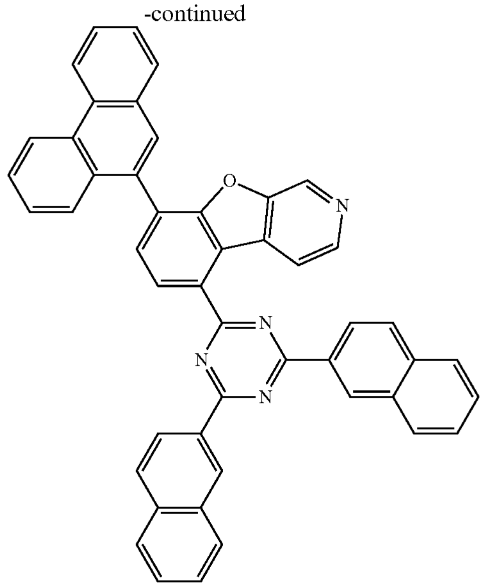

1-34

Compound S (15 g, 45.5 mmol) and Trz15 (17.6 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 19 g of subS-1 (yield 78%, MS: [M+H]+= 535).

Compound subS-1 (15 g, 28 mmol) and sub15 (6.5 g, 29.4 mmol) were added to 300 ml of THE under a nitrogen atmosphere, and the mixture was stirred and refluxed. Then, potassium carbonate (11.6 g, 84.1 mmol) was dissolved in 100 ml of water, and then added thereto. Thereafter, it was stirred sufficiently, followed by adding bis(tri-tert-butylphosphine)palladium(0) (0.1 g, 0.3 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 13.3 g of Compound 1-34 (yield 70%, MS: [M+H]+=677).

Synthesis Example 1-35

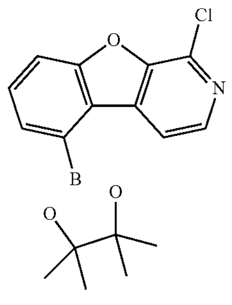

T

+

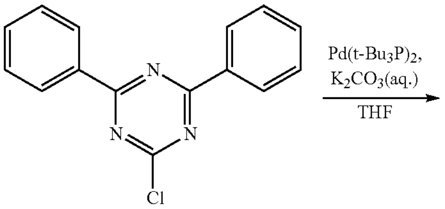

Trz2

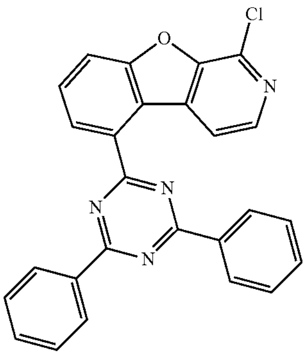

subT-1

+

-continued

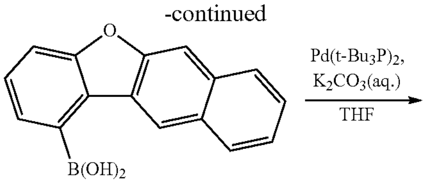

sub16

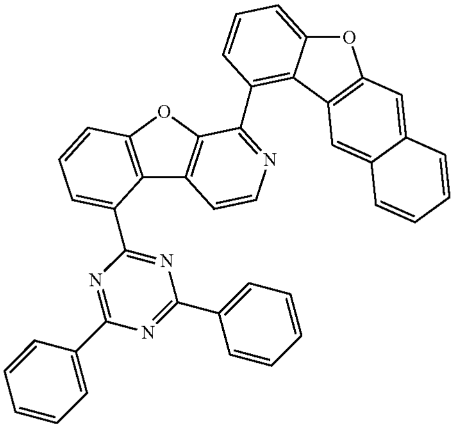

1-35

Compound T (15 g, 45.5 mmol) and Trz2 (12.8 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 14.4 g of subT-1 (yield 73%, MS: [M+H]+=435).

Compound subT-1 (15 g, 34.5 mmol) and sub16 (9.5 g, 36.2 mmol) were added to 300 ml of THE under a nitrogen atmosphere, and the mixture was stirred and refluxed. Then, potassium carbonate (14.3 g, 103.5 mmol) was dissolved in 100 ml of water, and then added thereto. Thereafter, it was stirred sufficiently, followed by adding bis(tri-tert-butylphosphine)palladium(0) (0.2 g, 0.3 mmol). After 5 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 17 g of Compound 1-35 (yield 80%, MS: [M+H]+=617).

Synthesis Example 1-36

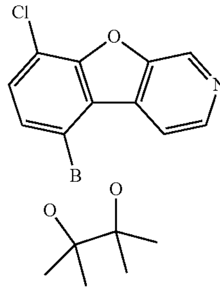

S

+

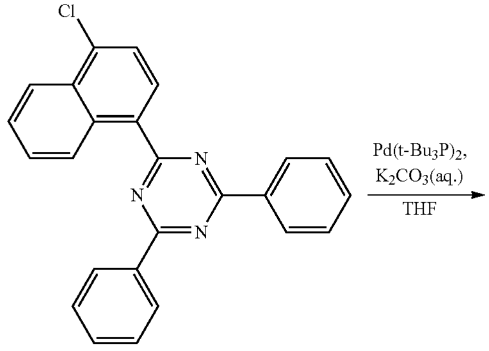

Trz25

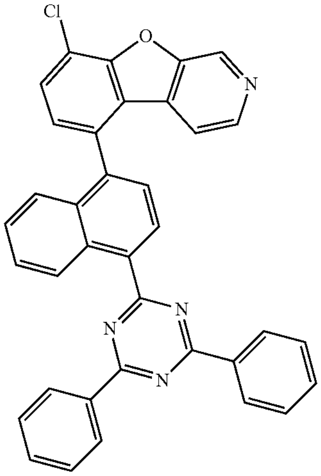

+ subS-2

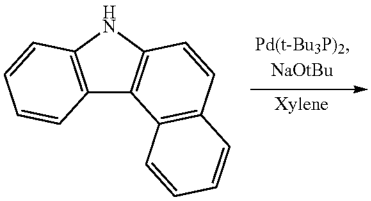

sub17

-continued

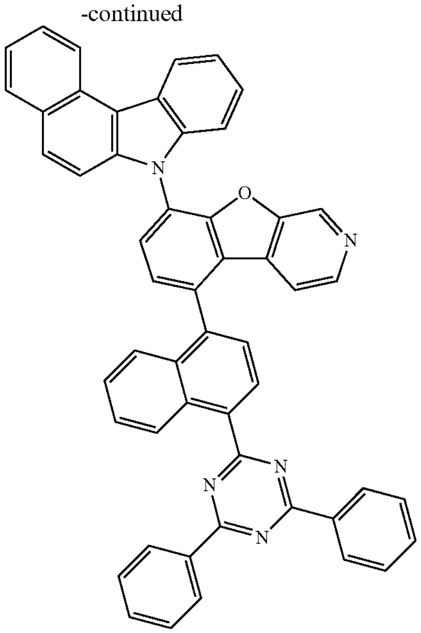

1-36

Compound S (15 g, 45.5 mmol) and Trz25 (18.8 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 19.6 g of subS-2 (yield 77%, MS: [M+H]+=561).

Compound subS-2 (10 g, 17.8 mmol), sub17 (4 g, 18.2 mmol), and sodium tert-butoxide (2.2 g, 23.2 mmol) were added to 200 ml of Xylene under a nitrogen atmosphere, and the mixture was stirred and refluxed. Then, bis(tri-tert-butylphosphine)palladium(0) (0.1 g, 0.2 mmol) was added thereto. After 5 hours, the reaction was completed, cooling was performed to room temperature, and the solvent was removed under reduced pressure. Then, the compound was completely dissolved again in chloroform, and washed twice with water.

Thereafter, the organic layer was separated, treated with anhydrous magnesium sulfate, then filtered, and the filtrate was distilled under reduced pressure. The concentrated compound was purified by silica gel column chromatography to prepare 7.3 g of Compound 1-36 (yield 55%, MS: [M+H]+=742).

Synthesis Example 1-37

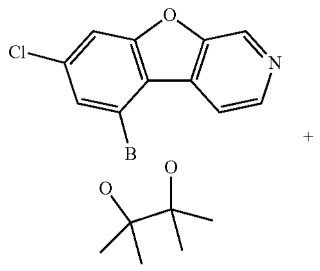

U

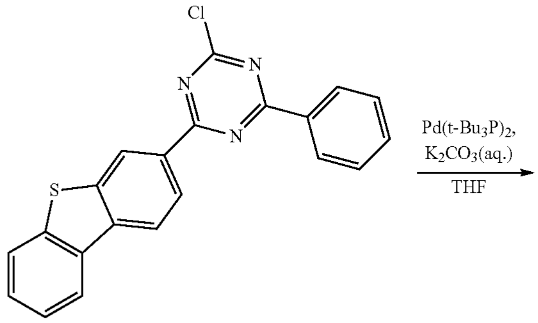

Trz26

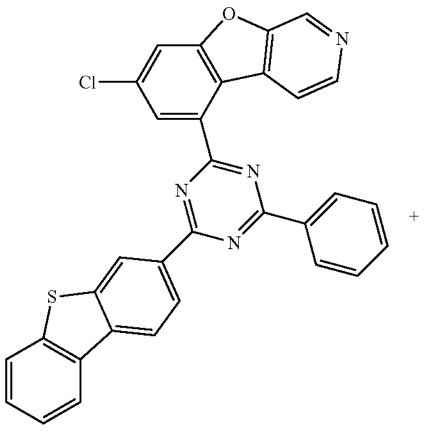

subU-1

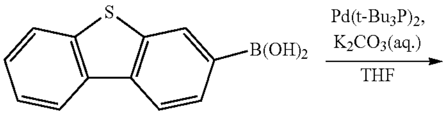

sub18

-continued

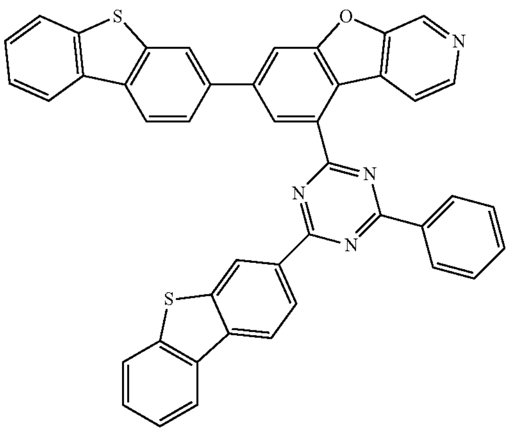

1-37

Compound U (15 g, 45.5 mmol) and Trz26 (17.9 g, 47.8 mmol) were added to 300 ml of THF under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 18.7 g of subU-1 (yield 76%, MS: [M+H]+=541).

Compound subU-1 (15 g, 27.7 mmol) and sub18 (6.6 g, 29.1 mmol) were added to 300 ml of THF under a nitrogen atmosphere, and the mixture was stirred and refluxed. Then, potassium carbonate (11.5 g, 83.2 mmol) was dissolved in 100 ml of water, and then added thereto. Thereafter, it was stirred sufficiently, followed by adding bis(tri-tert-butylphosphine)palladium(0) (0.1 g, 0.3 mmol). After 4 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 13.5 g of Compound 1-37 (yield 71%, MS: [M+H]+=689).

Synthesis Example 1-38

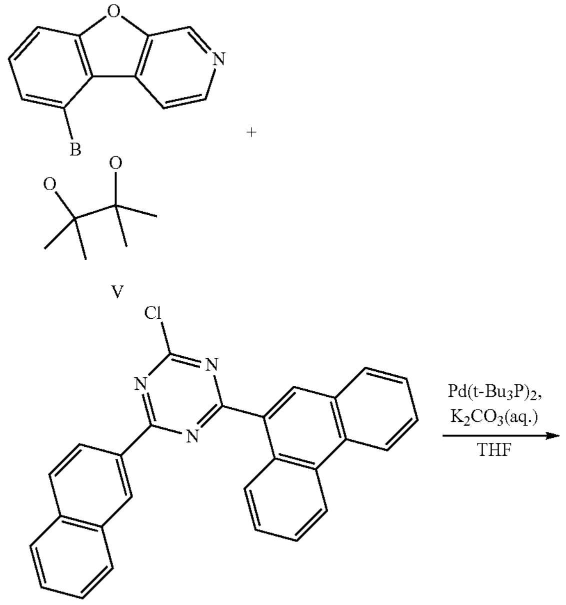

V

Trz27

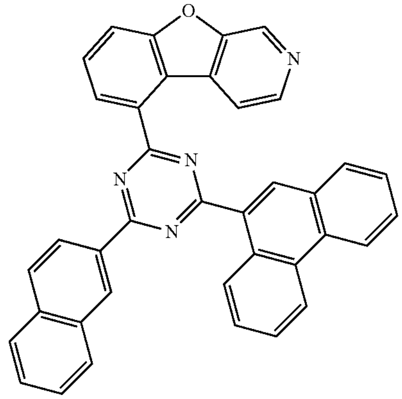

1-38

Compound V (15 g, 50.8 mmol) and Trz27 (22.3 g, 53.4 mmol) were added to 300 ml of THE under a nitrogen atmosphere, and the mixture was stirred and refluxed. Then, potassium carbonate (21.1 g, 152.5 mmol) was dissolved in 100 ml of water, and then added thereto. Thereafter, it was stirred sufficiently, followed by adding bis(tri-tert-butylphosphine)palladium(0) (0.3 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 16.8 g of Compound 1-38 (yield 60%, MS: [M+H]+=551).

Synthesis Example 1-39

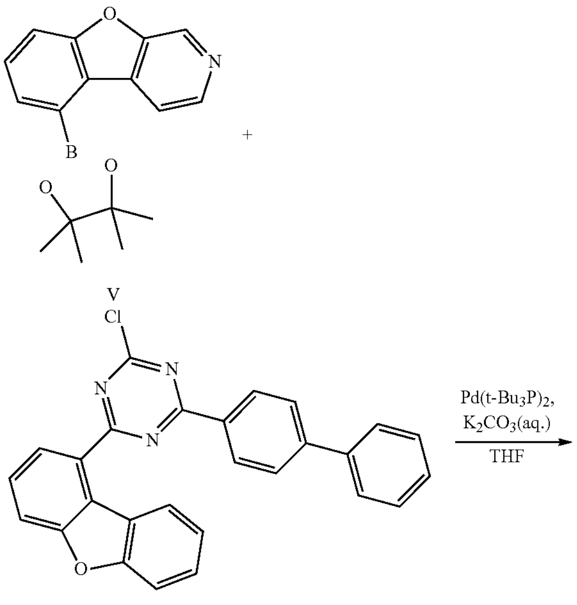

V

Trz28

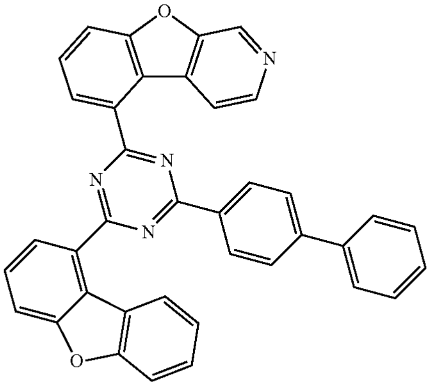

1-39

Compound V (15 g, 50.8 mmol) and Trz28 (23.2 g, 53.4 mmol) were added to 300 ml of THE under a nitrogen atmosphere, and the mixture was stirred and refluxed. Then, potassium carbonate (21.1 g, 152.5 mmol) was dissolved in 100 ml of water, and then added thereto. Thereafter, it was stirred sufficiently, followed by adding bis(tri-tert-butylphosphine)palladium(0) (0.3 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 20.1 g of Compound 1-39 (yield 70%, MS: [M+H]+=567).

Synthesis Example 1-40

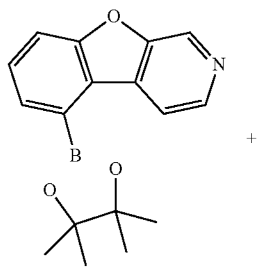

V

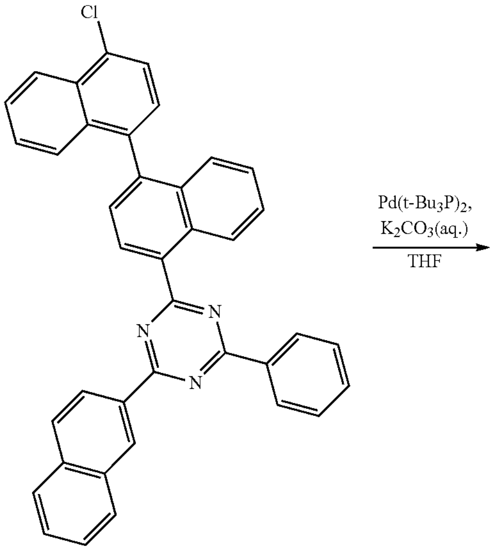

Trz29

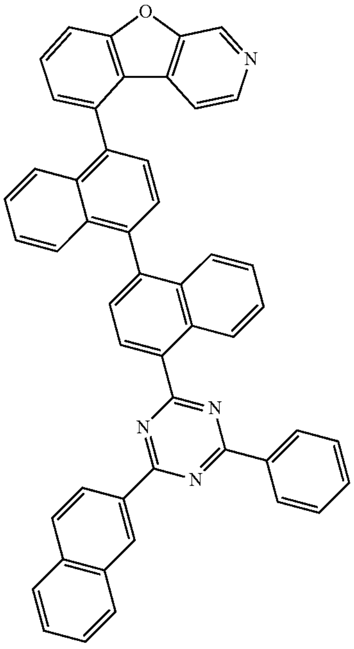

1-40

Compound V (15 g, 50.8 mmol) and Trz29 (30.4 g, 53.4 mmol) were added to 300 ml of THE under a nitrogen atmosphere, and the mixture was stirred and refluxed. Then, potassium carbonate (21.1 g, 152.5 mmol) was dissolved in 100 ml of water, and then added thereto. Thereafter, it was stirred sufficiently, followed by adding bis(tri-tert-butylphosphine)palladium(0) (0.3 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 24.6 g of Compound 1-40 (yield 69%, MS: [M+H]+=703).

Synthesis Example 1-41

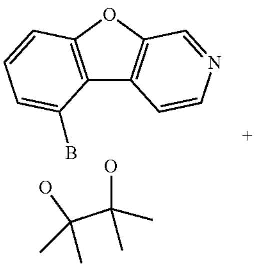

V

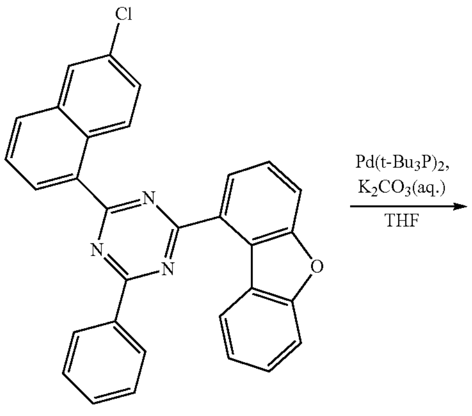

Trz30

-continued

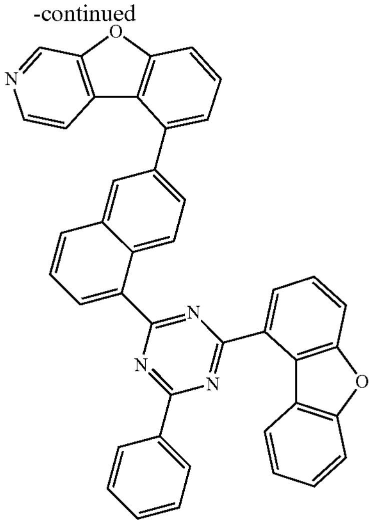

1-41

Compound V (15 g, 50.8 mmol) and Trz30 (25.8 g, 53.4 mmol) were added to 300 ml of THE under a nitrogen atmosphere, and the mixture was stirred and refluxed. Then, potassium carbonate (21.1 g, 152.5 mmol) was dissolved in 100 ml of water, and then added thereto. Thereafter, it was stirred sufficiently, followed by adding bis(tri-tert-butylphosphine)palladium(0) (0.3 g, 0.5 mmol). After 4 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 23.8 g of Compound 1-41 (yield 76%, MS: [M+H]+=617).

Synthesis Example 1-42

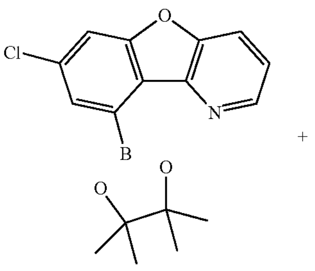

W

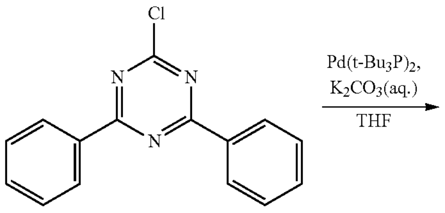

Trz2

-continued

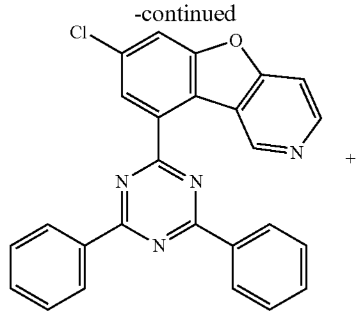

subW-1

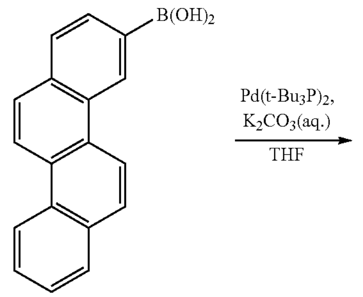

sub19

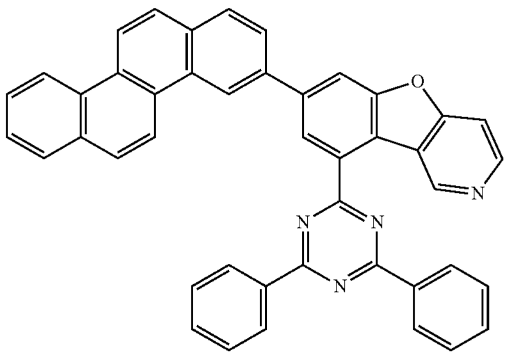

1-42

Compound W (15 g, 45.5 mmol) and Trz2 (12.8 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 13 g of subW-1 (yield 66%, MS: [M+H]+=435).

Compound subW-1 (15 g, 34.5 mmol) and sub19 (9.9 g, 36.2 mmol) were added to 300 ml of THE under a nitrogen atmosphere, and the mixture was stirred and refluxed. Then, potassium carbonate (14.3 g, 103.5 mmol) was dissolved in 100 ml of water, and then added thereto. Thereafter, it was stirred sufficiently, followed by adding bis(tri-tert-butylphosphine)palladium(0) (0.2 g, 0.3 mmol). After 4 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 16.4 g of Compound 1-42 (yield 76%, MS: [M+H]+=627).

Synthesis Example 1-43

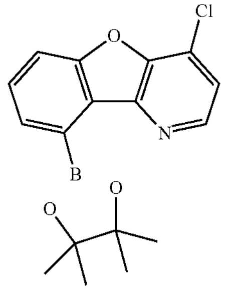

X

+

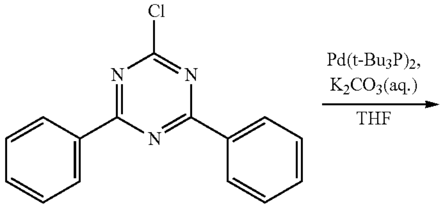

Trz2

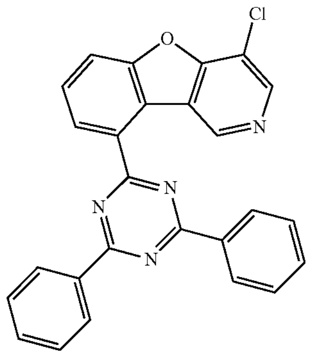

subX-1

+

-continued

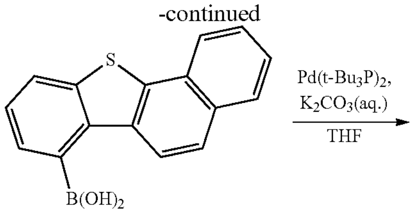

sub20

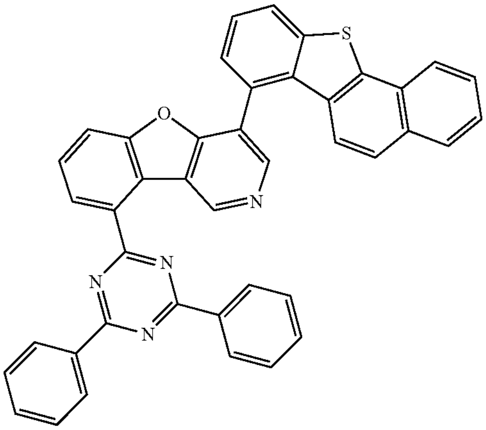

1-43

Compound X (15 g, 45.5 mmol) and Trz2 (12.8 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 14 g of subX-1 (yield 71%, MS: [M+H]+=435).

Compound subX-1 (15 g, 34.5 mmol) and sub20 (10.1 g, 36.2 mmol) were added to 300 ml of THE under a nitrogen atmosphere, and the mixture was stirred and refluxed. Then, potassium carbonate (14.3 g, 103.5 mmol) was dissolved in 100 ml of water, and then added thereto. Thereafter, it was stirred sufficiently, followed by adding bis(tri-tert-butylphosphine)palladium(0) (0.2 g, 0.3 mmol). After 4 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 14 g of Compound 1-43 (yield 64%, MS: [M+H]+=633).

Synthesis Example 1-44

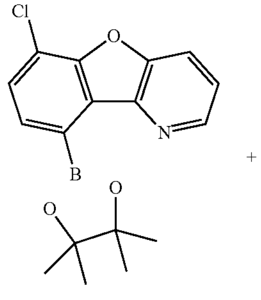

Y

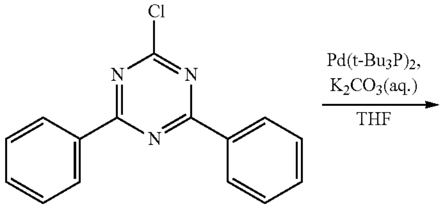

Trz2

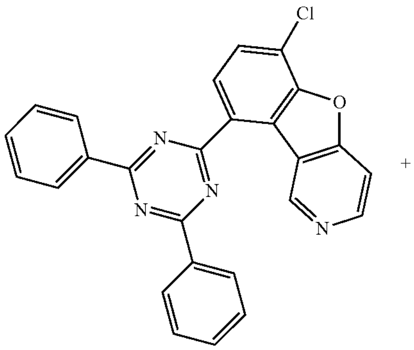

subY-1

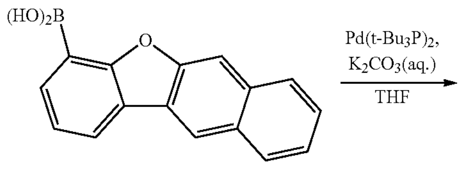

sub21

-continued

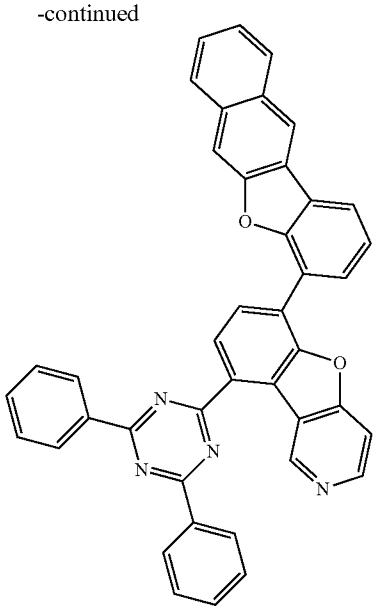

1-44

Compound Y (15 g, 45.5 mmol) and Trz2 (12.6 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 15.8 g of subY-1 (yield 80%, MS: [M+H]+=435).

Compound subY-1 (15 g, 34.5 mmol) and sub21 (9.5 g, 36.2 mmol) were added to 300 ml of THE under a nitrogen atmosphere, and the mixture was stirred and refluxed. Then, potassium carbonate (14.3 g, 103.5 mmol) was dissolved in 100 ml of water, and then added thereto. Thereafter, it was stirred sufficiently, followed by adding bis(tri-tert-butylphosphine)palladium(0) (0.2 g, 0.3 mmol). After 5 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 14.9 g of Compound 1-44 (yield 70%, MS: [M+H]+=617).

Synthesis Example 1-45

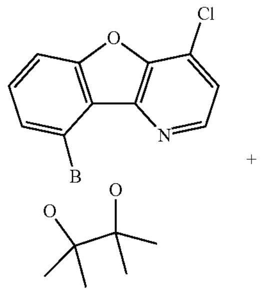

X

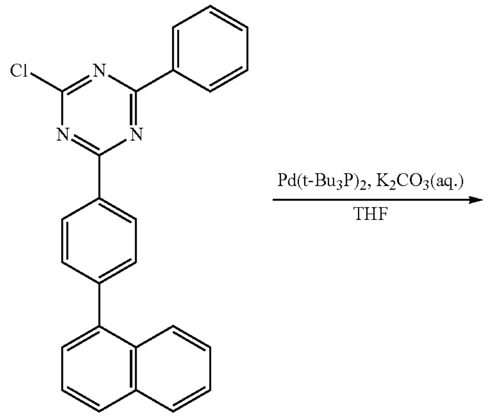

Trz31

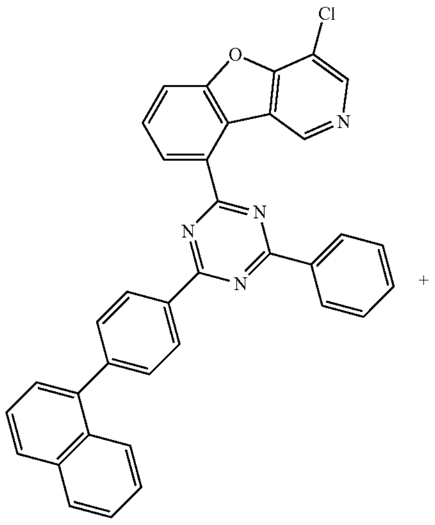

subX-2

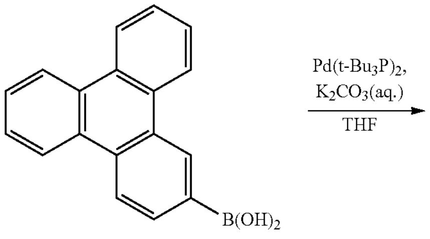

sub22

-continued

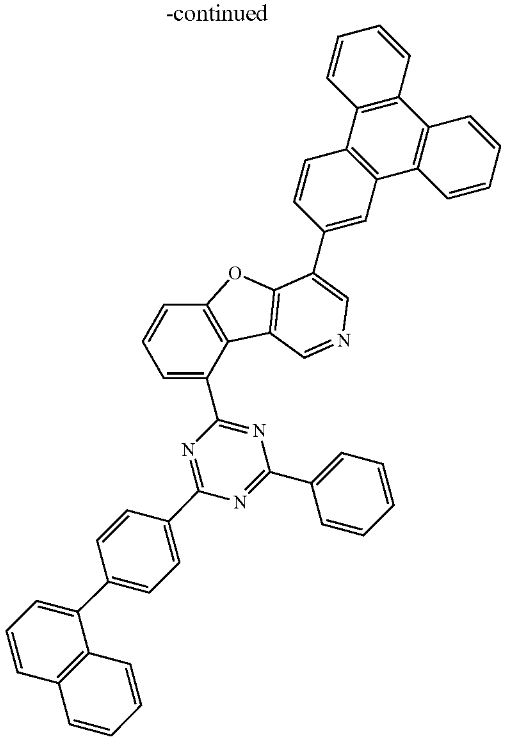

1-45

Compound X (15 g, 45.5 mmol) and Trz31 (18.8 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 18.1 g of subX-2 (yield 71%, MS: [M+H]+=561).

Compound subX-2 (15 g, 26.7 mmol) and sub22 (7.6 g, 28.1 mmol) were added to 300 ml of THE under a nitrogen atmosphere, and the mixture was stirred and refluxed. Then, potassium carbonate (11.1 g, 80.2 mmol) was dissolved in 100 ml of water, and then added thereto. Thereafter, it was stirred sufficiently, followed by adding bis(tri-tert-butylphosphine)palladium(0) (0.1 g, 0.3 mmol). After 4 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 15.7 g of Compound 1-45 (yield 78%, MS: [M+H]+=753).

Synthesis Example 1-46

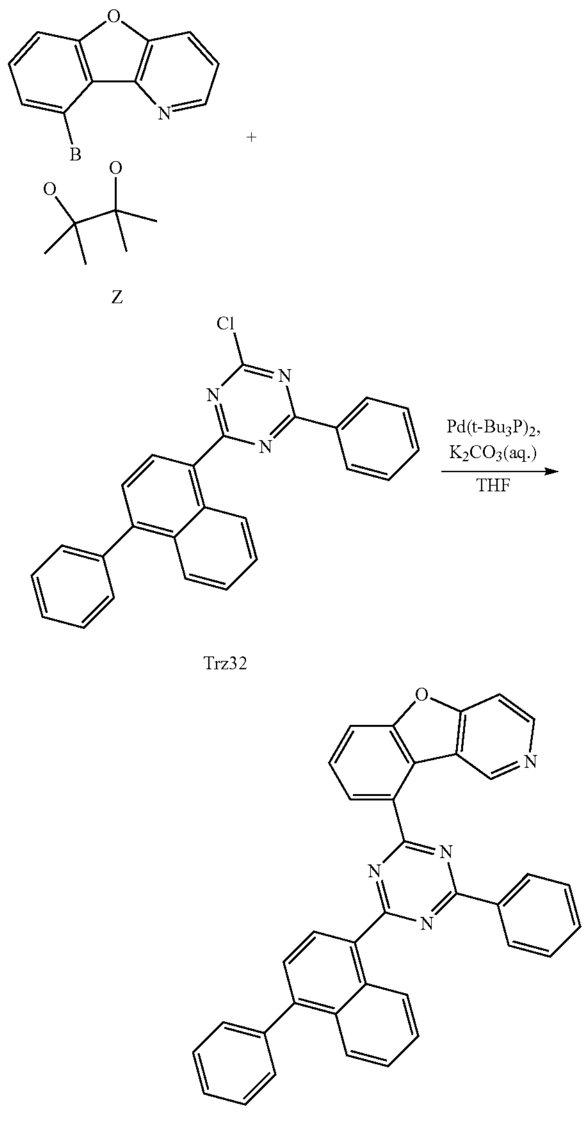

Z

Trz32

1-46

Compound Z (15 g, 50.8 mmol) and Trz32 (21 g, 53.4 mmol) were added to 300 ml of THE under a nitrogen atmosphere, and the mixture was stirred and refluxed. Then, potassium carbonate (21.1 g, 152.5 mmol) was dissolved in 100 ml of water, and then added thereto. Thereafter, it was stirred sufficiently, followed by adding bis(tri-tert-butylphosphine)palladium(0) (0.3 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 16.6 g of Compound 1-46 (yield 62%, MS: [M+H]+=527).

Synthesis Example 1-47

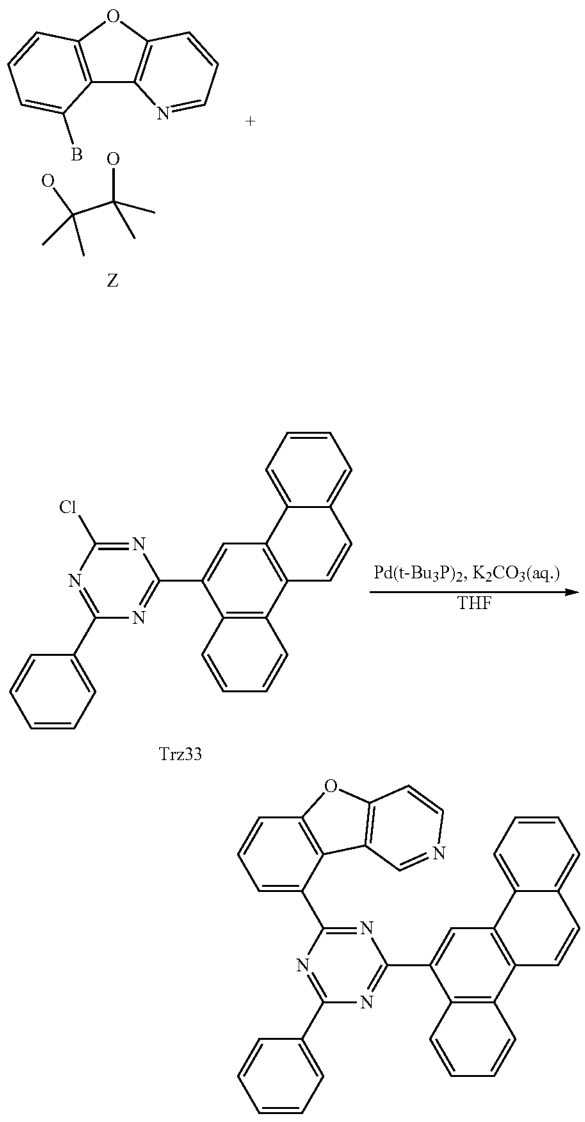

Z

Trz33

1-47

Compound Z (15 g, 50.8 mmol) and Trz33 (22.3 g, 53.4 mmol) were added to 300 ml of THE under a nitrogen atmosphere, and the mixture was stirred and refluxed. Then, potassium carbonate (21.1 g, 152.5 mmol) was dissolved in 100 ml of water, and then added thereto. Thereafter, it was stirred sufficiently, followed by adding bis(tri-tert-butylphosphine)palladium(0) (0.3 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 19.3 g of Compound 1-47 (yield 69%, MS: [M+H]+=551).

Synthesis Example 1-48

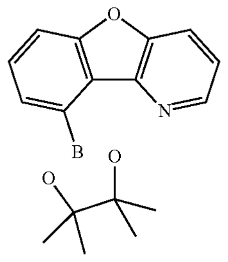

+

Z

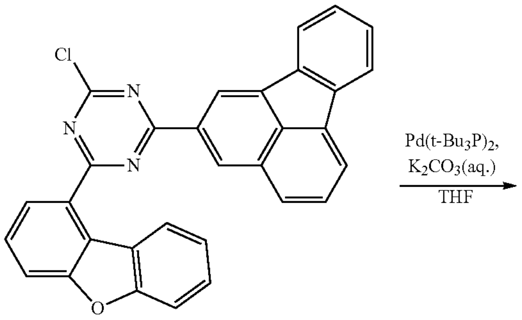

Trz34

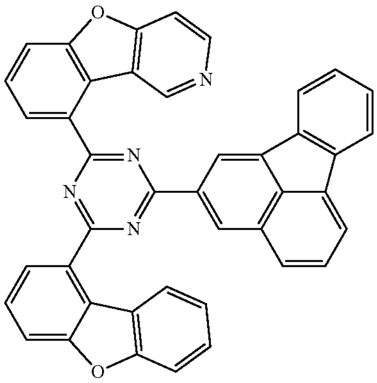

1-48

Compound Z (15 g, 50.8 mmol) and Trz34 (25.7 g, 53.4 mmol) were added to 300 ml of THE under a nitrogen atmosphere, and the mixture was stirred and refluxed. Then, potassium carbonate (21.1 g, 152.5 mmol) was dissolved in 100 ml of water, and then added thereto. Thereafter, it was stirred sufficiently, followed by adding bis(tri-tert-butylphosphine)palladium(0) (0.3 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 23.1 g of Compound 1-48 (yield 74%, MS: [M+H]+=615).

Synthesis Example 1-49

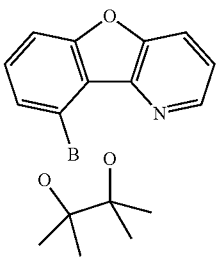

+

Z

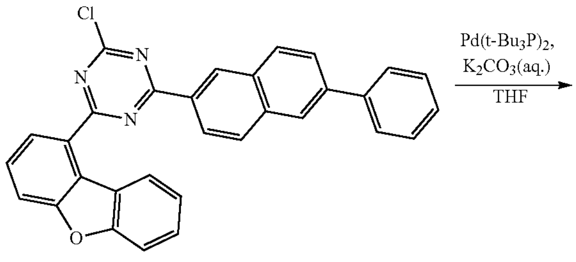

Trz35

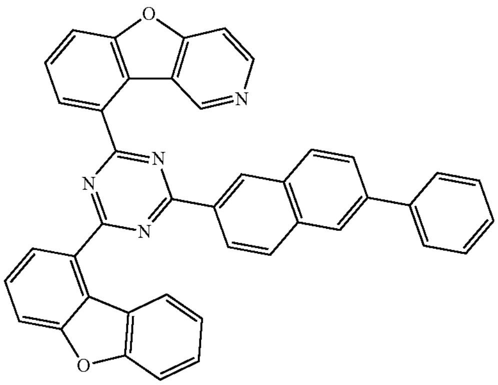

1-49

Compound Z (15 g, 50.8 mmol) and Trz35 (25.8 g, 53.4 mmol) were added to 300 ml of THE under a nitrogen atmosphere, and the mixture was stirred and refluxed. Then, potassium carbonate (21.1 g, 152.5 mmol) was dissolved in 100 ml of water, and then added thereto. Thereafter, it was stirred sufficiently, followed by adding bis(tri-tert-butylphosphine)palladium(0) (0.3 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 22.9 g of Compound 1-49 (yield 73%, MS: [M+H]+=617).

Synthesis Example 1-50

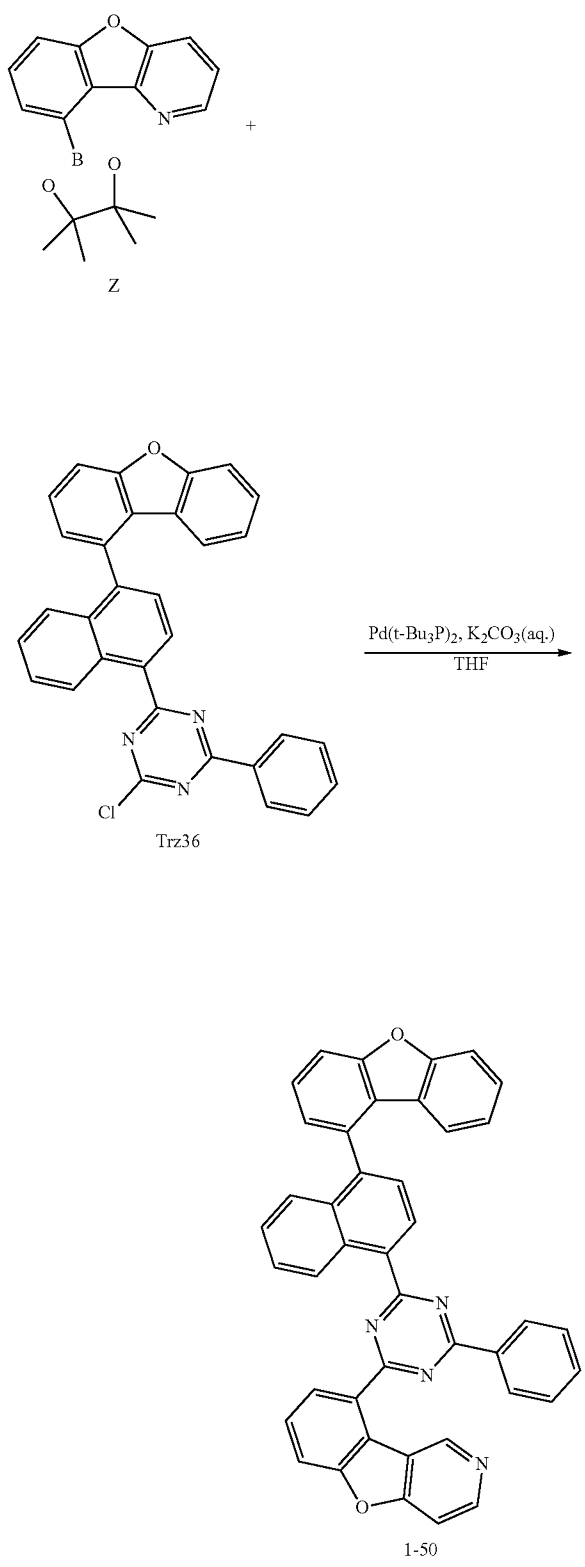

Z

Trz36

1-50

Compound Z (15 g, 50.8 mmol) and Trz36 (25.8 g, 53.4 mmol) were added to 300 ml of THE under a nitrogen atmosphere, and the mixture was stirred and refluxed. Then, potassium carbonate (21.1 g, 152.5 mmol) was dissolved in 100 ml of water, and then added thereto. Thereafter, it was stirred sufficiently, followed by adding bis(tri-tert-butylphosphine)palladium(0) (0.3 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 19.4 g of Compound 1-50 (yield 62%, MS: [M+H]+=617).

Synthesis Example 1-51

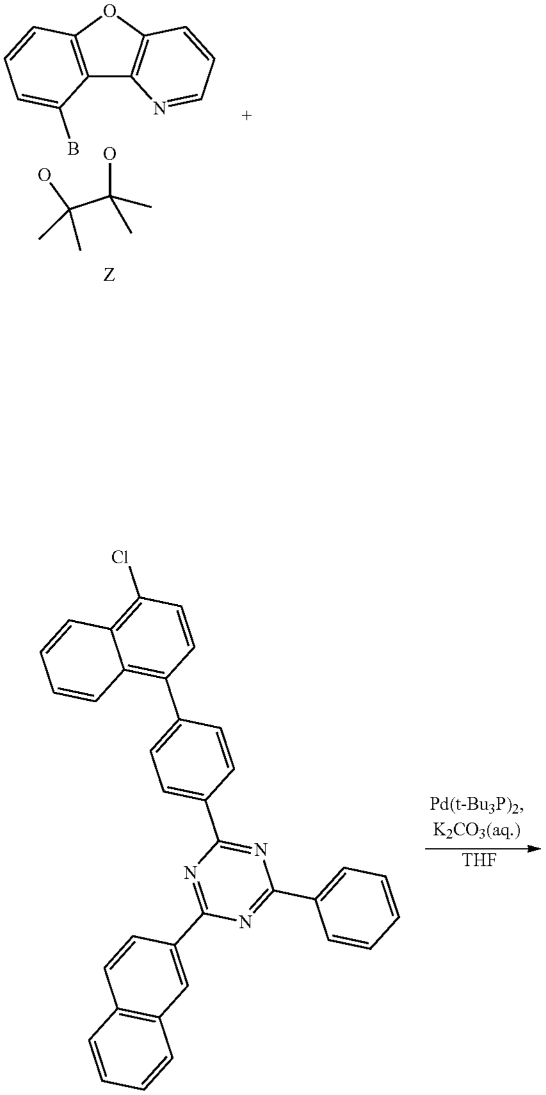

Z

Trz37

-continued

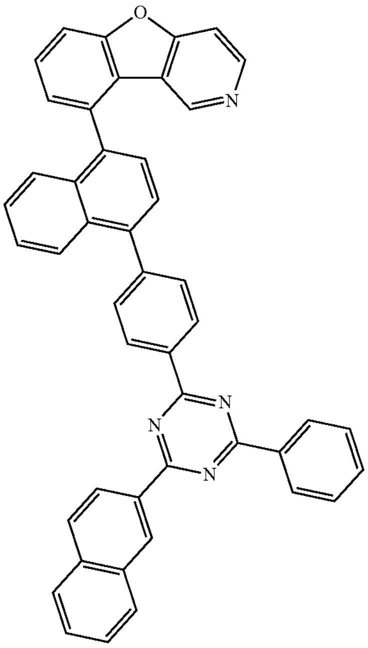

1-51

Compound Z (15 g, 50.8 mmol) and Trz37 (27.8 g, 53.4 mmol) were added to 300 ml of THE under a nitrogen atmosphere, and the mixture was stirred and refluxed. Then, potassium carbonate (21.1 g, 152.5 mmol) was dissolved in 100 ml of water, and then added thereto. Thereafter, it was stirred sufficiently, followed by adding bis(tri-tert-butylphosphine)palladium(0) (0.3 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 19.9 g of Compound 1-51 (yield 60%, MS: [M+H]+=653).

Synthesis Example 1-52

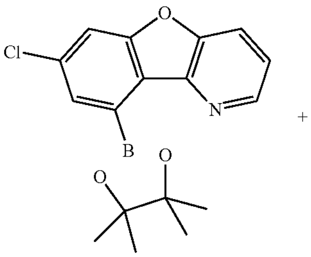

AA

-continued

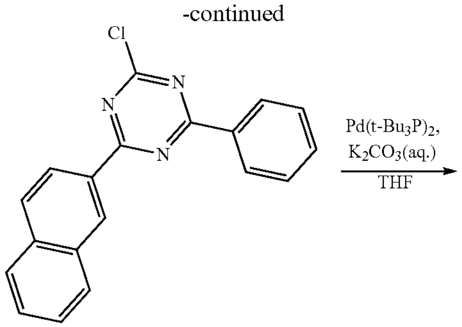

Trz1

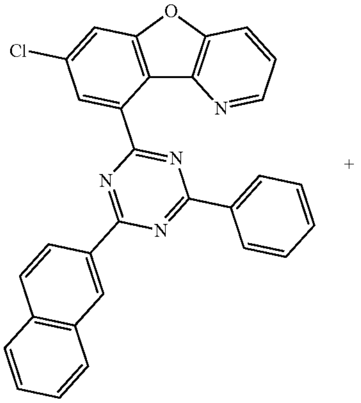

subAA-1

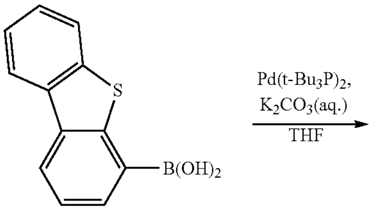

sub23

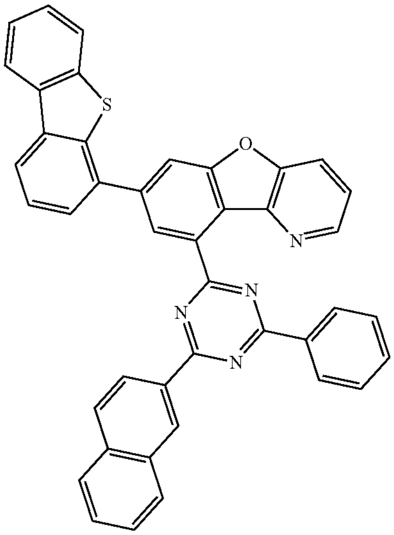

1-52

Compound AA (15 g, 45.5 mmol) and Trz1 (15.2 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 17.2 g of subAA-1 (yield 78%, MS: [M+H]+=485).

Compound subAA-1 (15 g, 30.9 mmol) and sub23 (7.4 g, 32.5 mmol) were added to 300 ml of THE under a nitrogen atmosphere, and the mixture was stirred and refluxed. Then, potassium carbonate (12.8 g, 92.8 mmol) was dissolved in 100 ml of water, and then added thereto. Thereafter, it was stirred sufficiently, followed by adding bis(tri-tert-butylphosphine)palladium(0) (0.2 g, 0.3 mmol). After 4 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 13.9 g of Compound 1-52 (yield 71%, MS: [M+H]+=633).

Synthesis Example 1-53

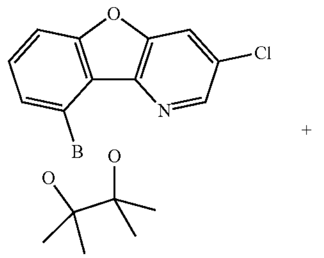

AB

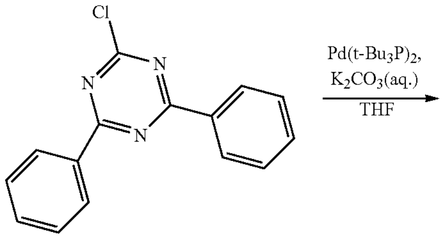

Trz2

-continued

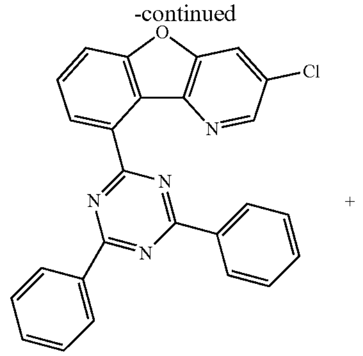

subAB-1

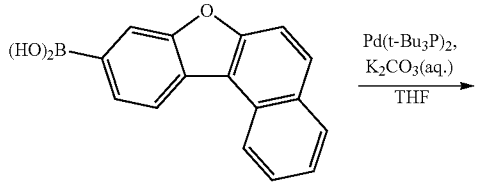

sub24

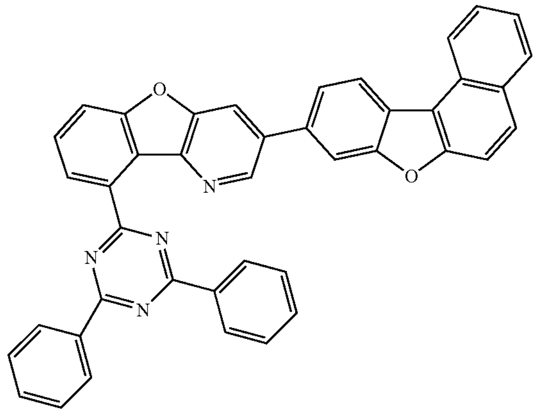

1-53

Compound AB (15 g, 45.5 mmol) and Trz2 (12.8 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 14 g of subAB-1 (yield 71%, MS: [M+H]+=435).

Compound subAB-1 (14 g, 32 mmol), and sub24 (8.9 g, 33.8 mmol) were added to 300 ml of THE under a nitrogen atmosphere, and the mixture was stirred and refluxed. Then, potassium carbonate (13.3 g, 96.6 mmol) was dissolved in 100 ml of water, and then added thereto. Thereafter, it was stirred sufficiently, followed by adding bis(tri-tert-butylphosphine)palladium(0) (0.2 g, 0.3 mmol). After 5 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 12.5 g of Compound 1-53 (yield 62%, MS: [M+H]+=617)

Synthesis Example 1-54

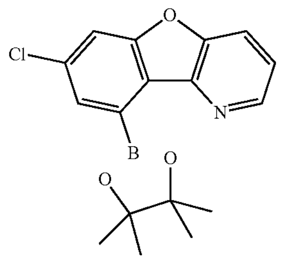

AA

+

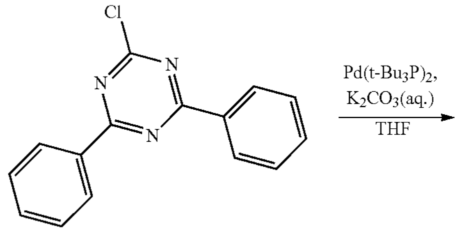

Trz2

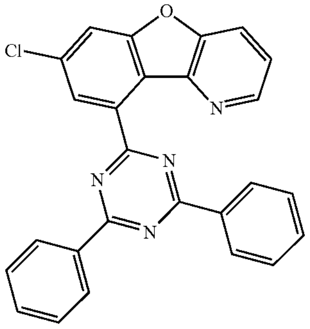

subAA-2

+

-continued

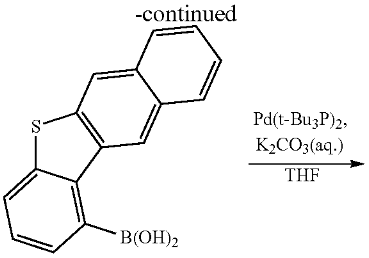

sub25

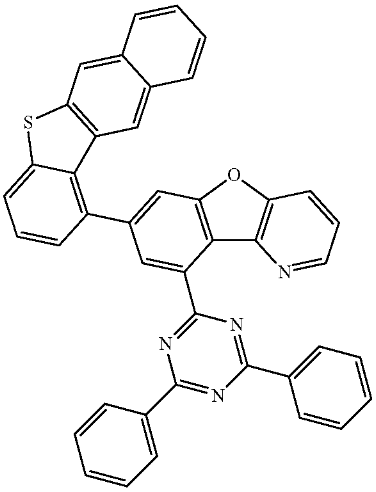

1-54

Compound AA (15 g, 45.5 mmol) and Trz2 (12.8 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 12.6 g of subAA-2 (yield 64%, MS: [M+H]+=435).

Compound subAA-2 (15 g, 34.5 mmol) and sub25 (10.1 g, 36.2 mmol) were added to 300 ml of THE under a nitrogen atmosphere, and the mixture was stirred and refluxed. Then, potassium carbonate (14.3 g, 103.5 mmol) was dissolved in 100 ml of water, and then added thereto. Thereafter, it was stirred sufficiently, followed by adding bis(tri-tert-butylphosphine)palladium(0) (0.2 g, 0.3 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 13.3 g of Compound 1-54 (yield 61%, MS: [M+H]+=633).

Synthesis Example 1-55

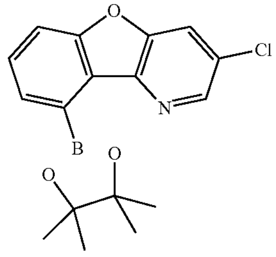

+

AB

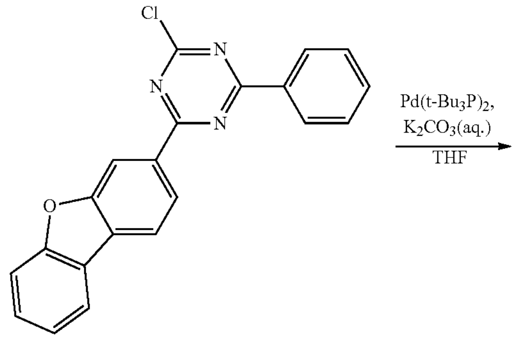

Trz21

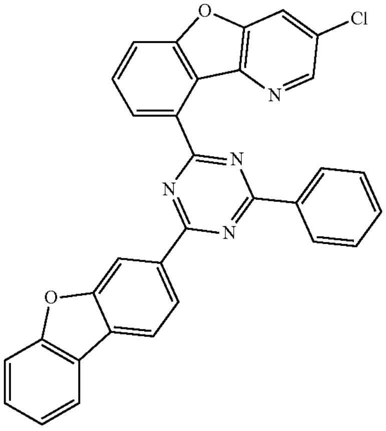

+ subAB-2

-continued

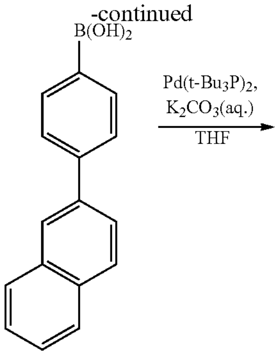

sub26

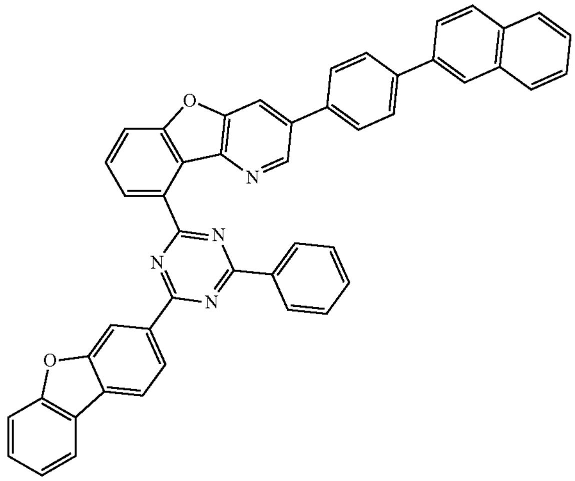

1-55

Compound AB (15 g, 45.5 mmol) and Trz21 (17.1 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 15.5 g of subAB-2 (yield 65%, MS: [M+H]+=525).

Compound subAB-2 (15 g, 28.6 mmol) and sub26 (7.4 g, 30 mmol) were added to 300 ml of THE under a nitrogen atmosphere, and the mixture was stirred and refluxed. Then, potassium carbonate (11.8 g, 85.7 mmol) was dissolved in 100 ml of water, and then added thereto. Thereafter, it was stirred sufficiently, followed by adding bis(tri-tert-butylphosphine)palladium(0) (0.1 g, 0.3 mmol). After 4 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 12.5 g of Compound 1-55 (yield 63%, MS: [M+H]+=693).

Synthesis Example 1-56

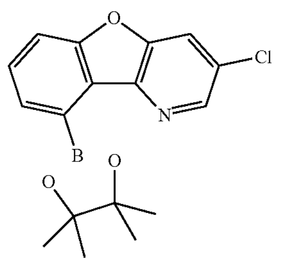

AB

+

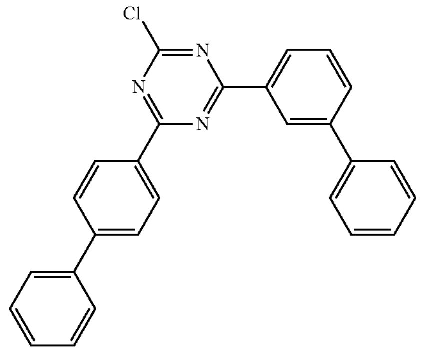

Trz38

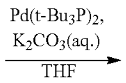

-continued

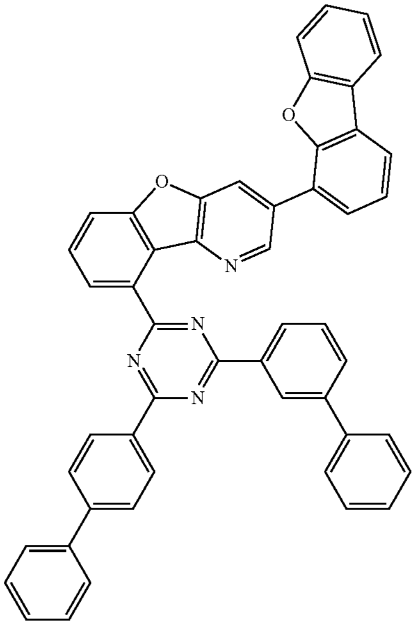

1-56

Compound AB (15 g, 45.5 mmol) and Trz38 (20.1 g, 47.8 mmol) were added to 300 ml of THE under a nitrogen atmosphere, and the mixture was stirred and refluxed. Then, potassium carbonate (18.9 g, 136.5 mmol) was dissolved in 100 ml of water, and then added thereto. Thereafter, it was stirred sufficiently, followed by adding bis(tri-tert-butylphosphine)palladium(0) (0.2 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 18.4 g of subAB-3 (yield 69%, MS: [M+H]+=587).

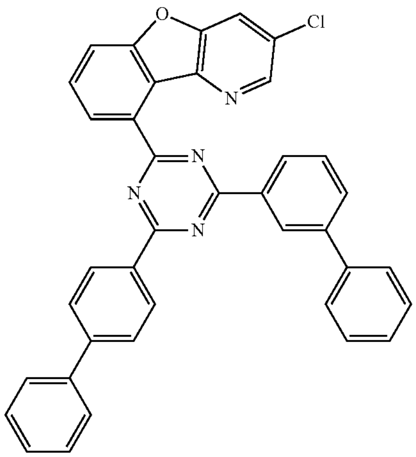

subAB-3

+

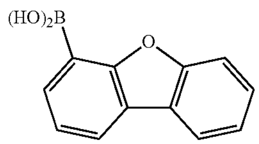

sub27

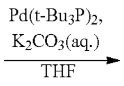

Compound subAB-3 (15 g, 25.6 mmol) and sub27 (5.7 g, 26.8 mmol) were added to 300 ml of THE under a nitrogen atmosphere, and the mixture was stirred and refluxed. Then, potassium carbonate (10.6 g, 76.7 mmol) was dissolved in 100 ml of water, and then added thereto. Thereafter, it was stirred sufficiently, followed by adding bis(tri-tert-butylphosphine)palladium(0) (0.1 g, 0.3 mmol). After 4 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 13.4 g of Compound 1-56 (yield 73%, MS: [M+H]+=719).

Synthesis Example 1-57

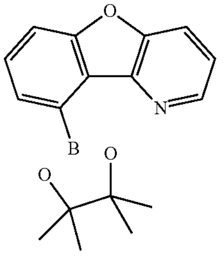

+

AC

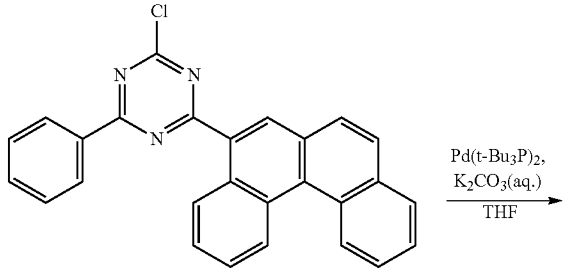

Trz39

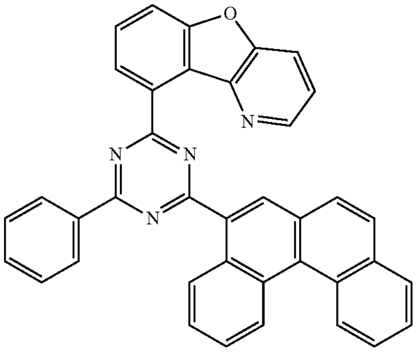

1-57

Compound AC (15 g, 50.8 mmol) and Trz39 (22.3 g, 53.4 mmol) were added to 300 ml of THE under a nitrogen atmosphere, and the mixture was stirred and refluxed. Then, potassium carbonate (21.1 g, 152.5 mmol) was dissolved in 100 ml of water, and then added thereto. Thereafter, it was stirred sufficiently, followed by adding bis(tri-tert-butylphosphine)palladium(0) (0.3 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 22.1 g of Compound 1-57 (yield 79%, MS: [M+H]+=551).

Synthesis Example 1-58

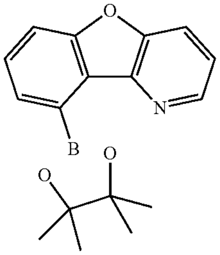

+

AC

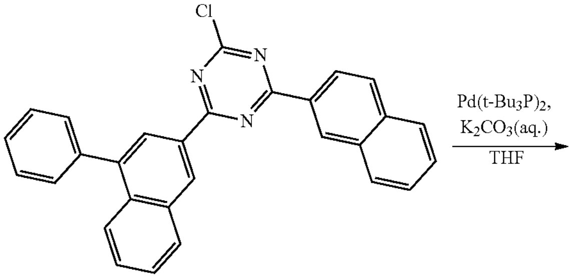

Trz40

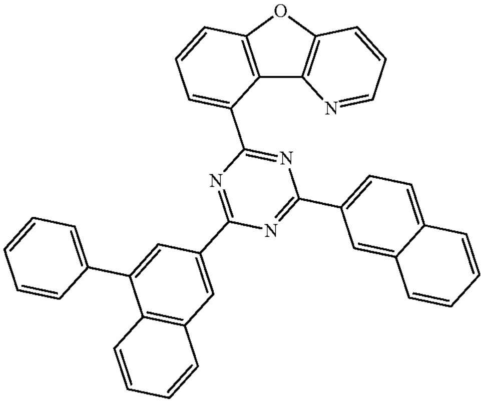

1-58

Compound AC (15 g, 50.8 mmol) and Trz40 (23.7 g, 53.4 mmol) were added to 300 ml of THE under a nitrogen atmosphere, and the mixture was stirred and refluxed. Then, potassium carbonate (21.1 g, 152.5 mmol) was dissolved in 100 ml of water, and then added thereto. Thereafter, it was stirred sufficiently, followed by adding bis(tri-tert-butylphosphine)palladium(0) (0.3 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 19.3 g of Compound 1-58 (yield 66%, MS: [M+H]+=577).

Synthesis Example 1-59

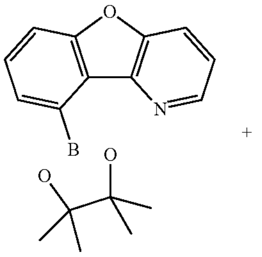

AC

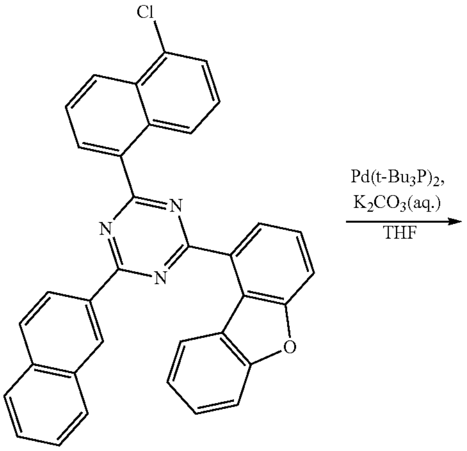

Trz41

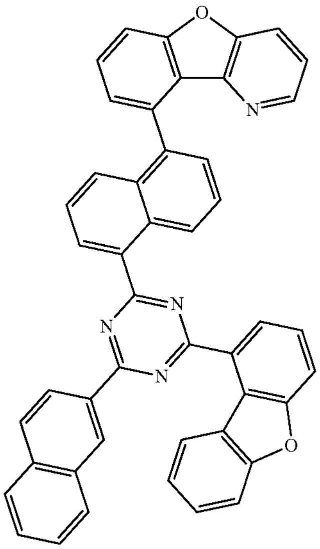

1-59

Compound AC (15 g, 50.8 mmol) and Trz41 (28.5 g, 53.4 mmol) were added to 300 ml of THE under a nitrogen atmosphere, and the mixture was stirred and refluxed. Then, potassium carbonate (21.1 g, 152.5 mmol) was dissolved in 100 ml of water, and then added thereto. Thereafter, it was stirred sufficiently, followed by adding bis(tri-tert-butylphosphine)palladium(0) (0.3 g, 0.5 mmol). After 3 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 24.7 g of Compound 1-59 (yield 73%, MS: [M+H]+=667).

Synthesis Example 2: Preparation of Compound Represented by Chemical Formula 2

Synthesis Example 2-1

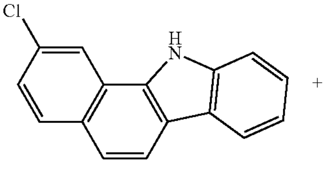

E

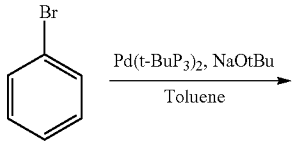

sub33

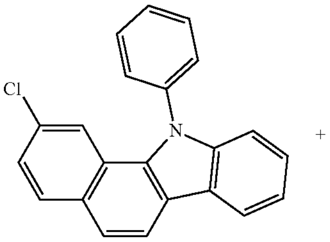

subE-1

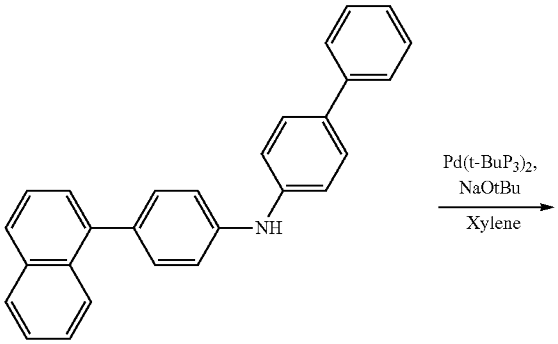

amine1

-continued

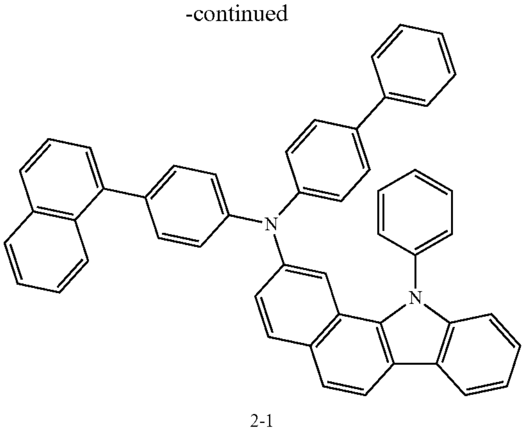

2-1

Compound E (10 g, 39.7 mmol), sub33 (6.2 g, 39.7 mmol), and sodium tert-butoxide (7.6 g, 79.5 mmol) were added to 200 ml of toluene under a nitrogen atmosphere, and the mixture was stirred and refluxed. Then, bis(tri-tert-butylphosphine)palladium(0) (0.2 g, 0.4 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 8.6 g of subE-1 (yield 66%, MS: [M+H]+=328).

Compound subE-1 (10 g, 30.5 mmol), amine1 (11.9 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 12.7 g of Compound 2-1 (yield 63%, MS: [M+H]+=664).

Synthesis Example 2-2

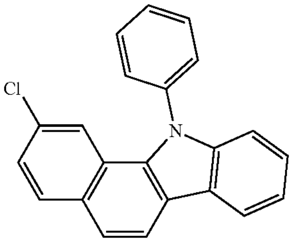

subE-1

+

-continued

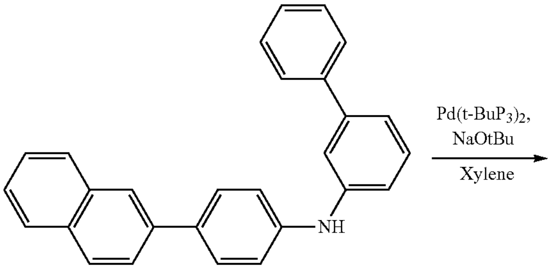

amine2

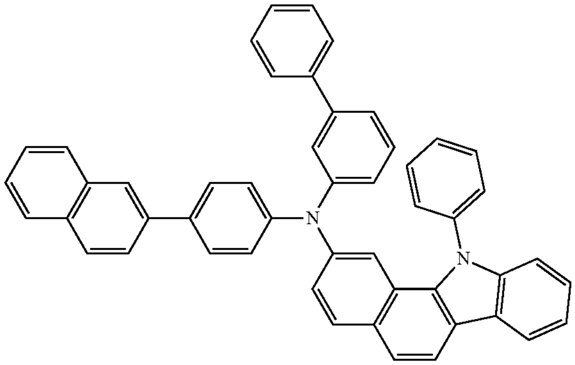

2-2

Compound subE-1 (10 g, 30.5 mmol), amine2 (11.9 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 10.9 g of Compound 2-2 (yield 54%, MS: [M+H]+=664).

Synthesis Example 2-3

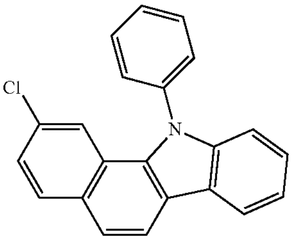

subE-1

+

-continued

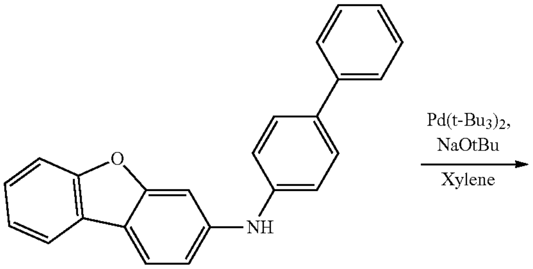

amine3

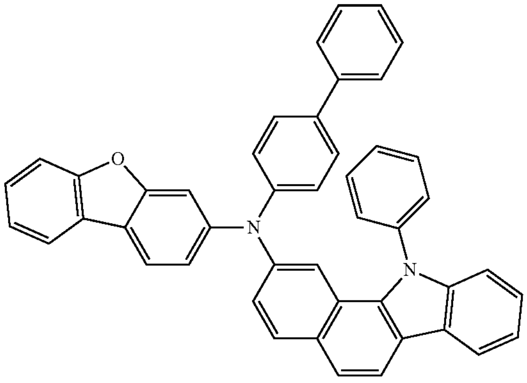

2-3

Compound subE-1 (10 g, 30.5 mmol), amine3 (10.7 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 12.4 g of Compound 2-3 (yield 65%, MS: [M+H]+=628).

Synthesis Example 2-4

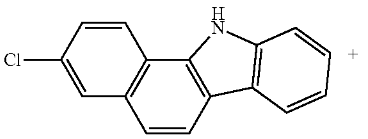

F

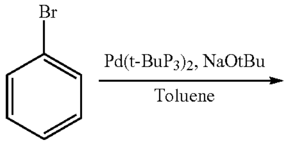

sub33

-continued

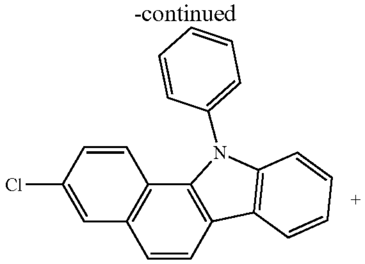

subF-1

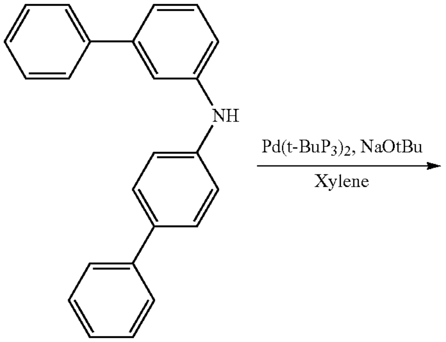

amine4

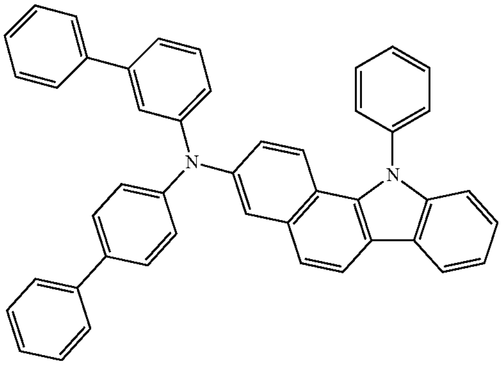

2-4

Compound F (10 g, 39.7 mmol), sub33 (6.2 g, 39.7 mmol), and sodium tert-butoxide (7.6 g, 79.5 mmol) were added to 200 ml of toluene under a nitrogen atmosphere, and the mixture was stirred and refluxed. Then, bis(tri-tert-butylphosphine)palladium(0) (0.2 g, 0.4 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 9 g of subF-1 (yield 69%, MS: [M+H]+=328).

Compound subF-1 (10 g, 30.5 mmol), amine4 (10.3 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 11.4 g of Compound 2-4 (yield 61%, MS: [M+H]+=614).

Synthesis Example 2-5

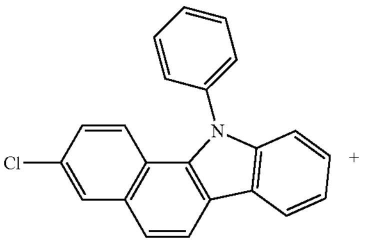

subF-1

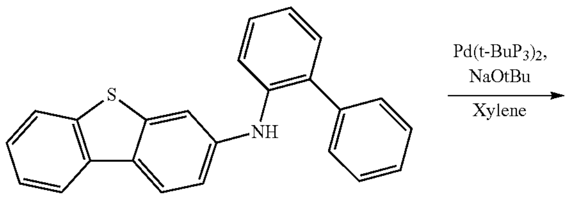

amine5

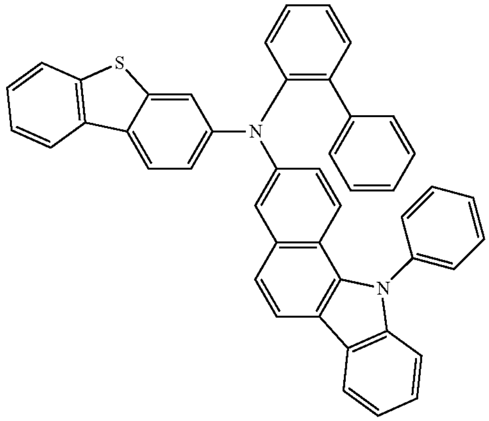

2-5

Compound subF-1 (10 g, 30.5 mmol), amine5 (11.3 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 12.2 g of Compound 2-5 (yield 62%, MS: [M+H]+=644).

Synthesis Example 2-6

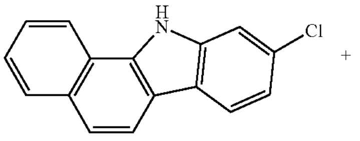

G

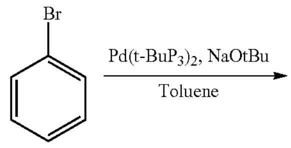

sub33

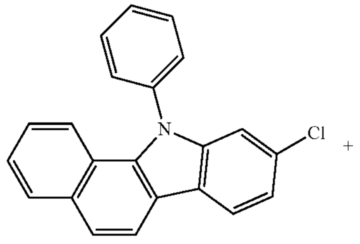

subG-1

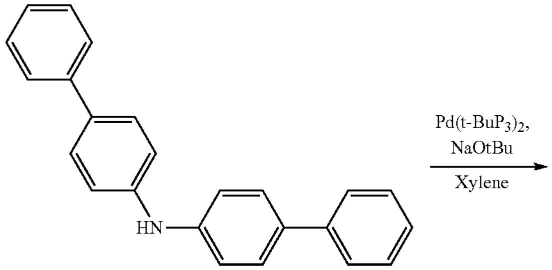

amine6

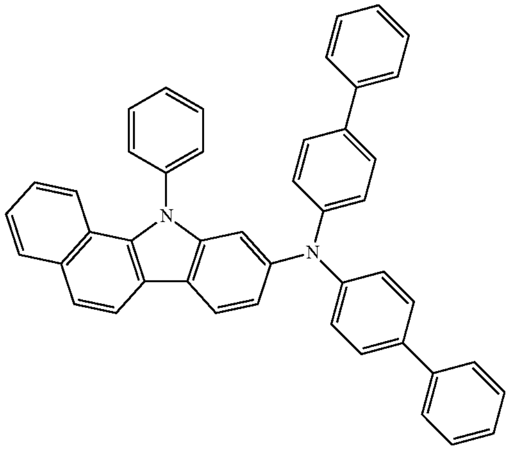

2-6

Compound G (10 g, 39.7 mmol), sub33 (6.2 g, 39.7 mmol), and sodium tert-butoxide (7.6 g, 79.5 mmol) were added to 200 ml of toluene under a nitrogen atmosphere, and the mixture was stirred and refluxed. Then, bis(tri-tert-butylphosphine)palladium(0) (0.2 g, 0.4 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 7.8 g of subG-1 (yield 60%, MS: [M+H]+=328).

Compound subG-1 (10 g, 30.5 mmol), amine6 (10.3 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 11.4 g of Compound 2-6 (yield 61%, MS: [M+H]+=614).

Synthesis Example 2-7

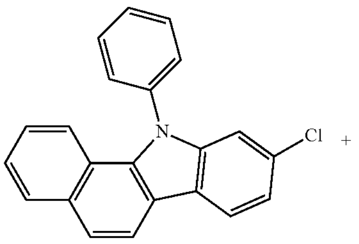

subG-1

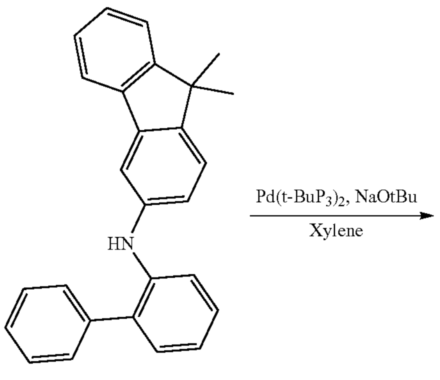

amine7

-continued

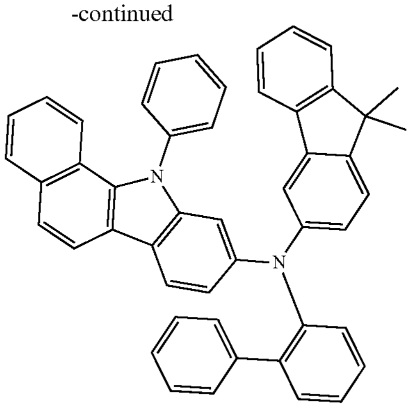

2-7

Compound subG-1 (10 g, 30.5 mmol), amine7 (11.6 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 13.1 g of Compound 2-7 (yield 66%, MS: [M+H]+=654).

Synthesis Example 2-8

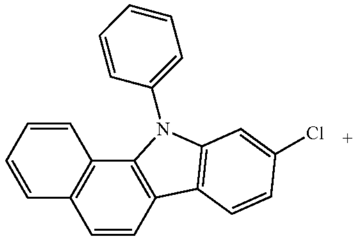

subG-1

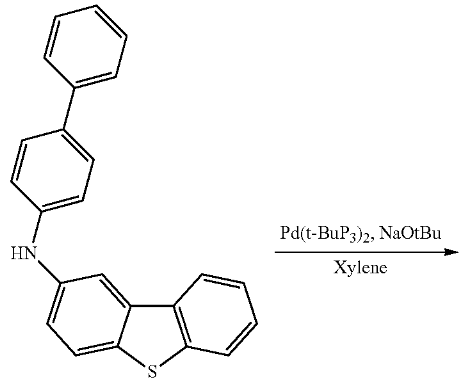

amine8

-continued

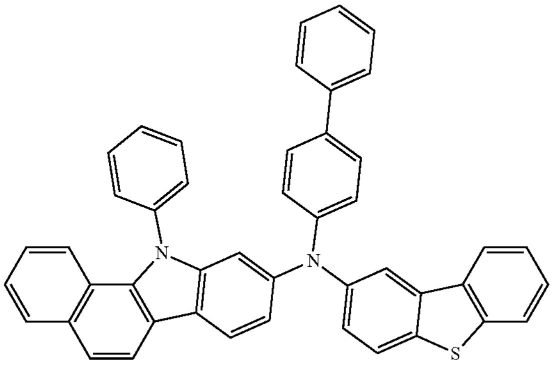

2-8

Compound subG-1 (10 g, 30.5 mmol), amine8 (11.3 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 11.6 g of Compound 2-8 (yield 59%, MS: [M+H]+=644). Synthesis Example 2-9

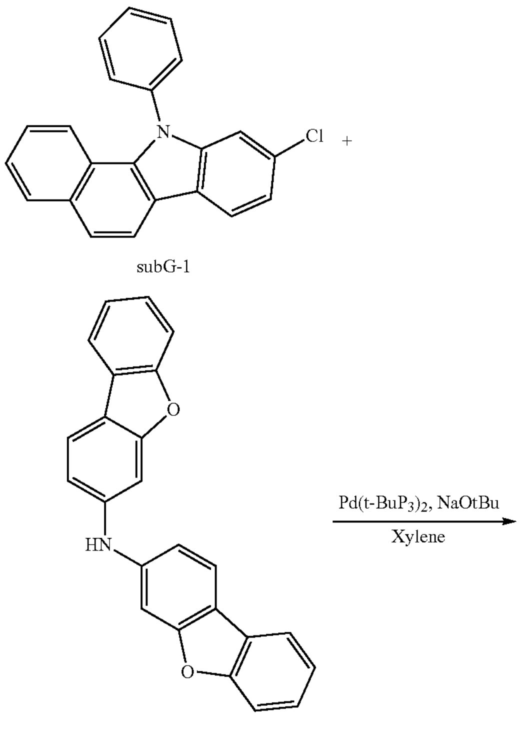

subG-1 amine9

-continued

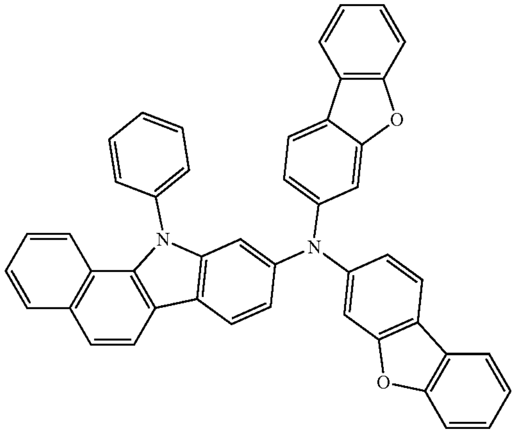

2-9

Compound subG-1 (10 g, 30.5 mmol), amine9 (11.2 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 13.5 g of Compound 2-9 (yield 69%, MS: [M+H]+=642).

Synthesis Example 2-10

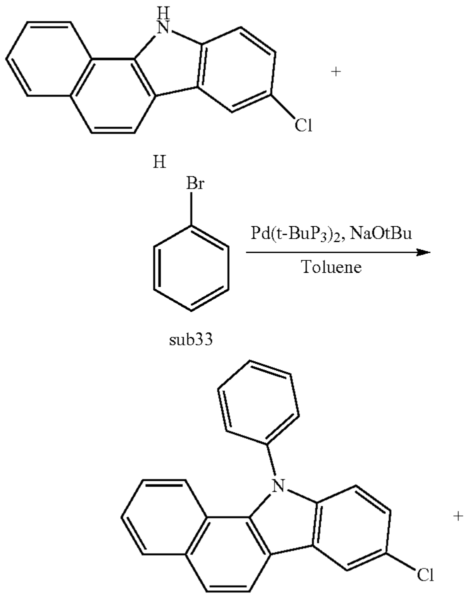

sub33 subH-1

-continued

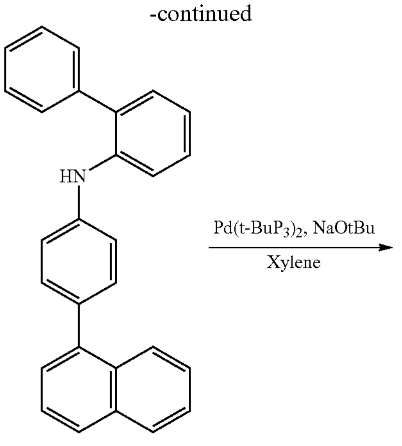

amine10

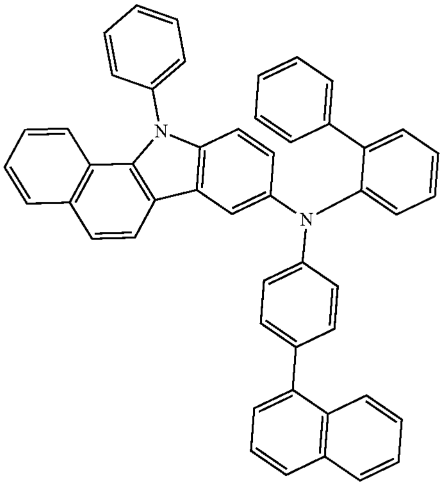

2-10

Compound H (10 g, 39.7 mmol), sub33 (6.2 g, 39.7 mmol), and sodium tert-butoxide (7.6 g, 79.5 mmol) were added to 200 ml of toluene under a nitrogen atmosphere, and the mixture was stirred and refluxed. Then, bis(tri-tert-butylphosphine)palladium(0) (0.2 g, 0.4 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 8.3 g of subH-1 (yield 64%, MS: [M+H]+=328).

Compound subh-1 (10 g, 30.5 mmol), amine10 (11.9 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 10.9 g of Compound 2-10 (yield 54%, MS: [M+H]+=664).

Synthesis Example 2-11

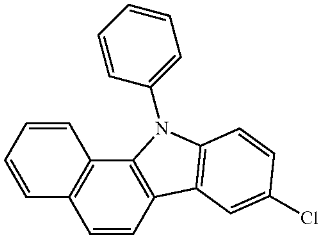

+ subH-1

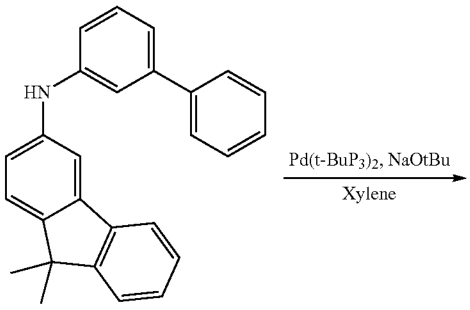

amine11

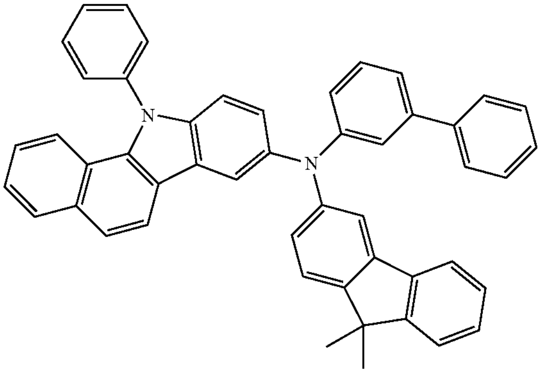

2-11

Compound subH-1 (10 g, 30.5 mmol), amine11 (11.6 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 10.6 g of Compound 2-11 (yield 53%, MS: [M+H]+=654).

Synthesis Example 2-12

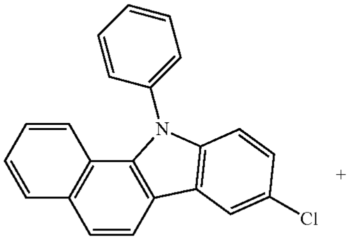

subH-1

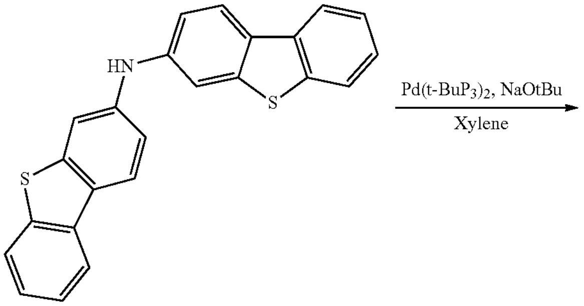

amine12

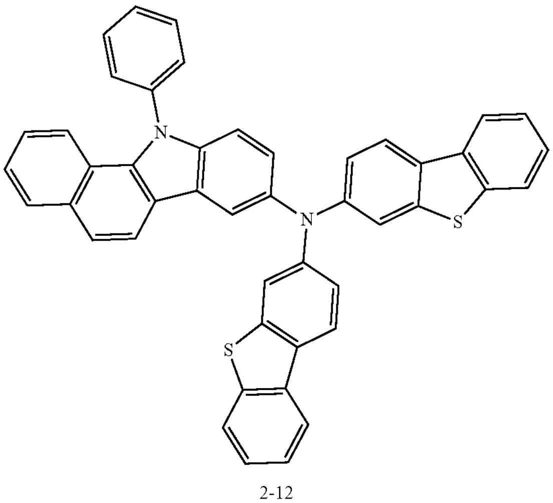

2-12

Compound subH-1 (10 g, 30.5 mmol), amine12 (12.2 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 12.5 g of Compound 2-12 (yield 61%, MS: [M+H]+=674).

Synthesis Example 2-13

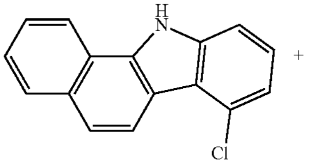

I

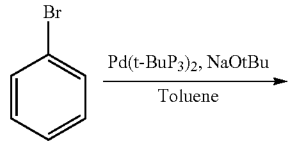

sub33

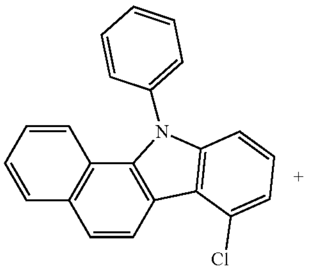

subI-1

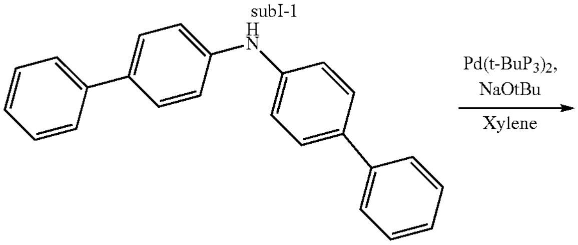

amine6

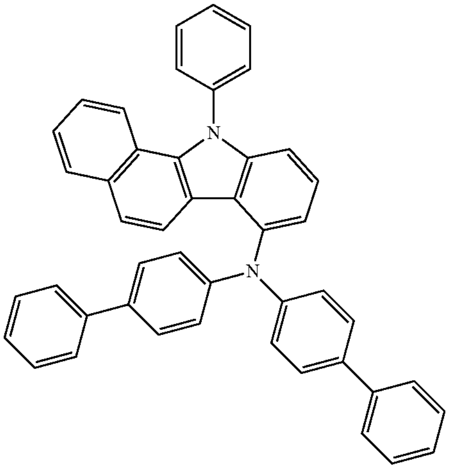

2-13

Compound 1 (10 g, 39.7 mmol), sub33 (6.2 g, 39.7 mmol), and sodium tert-butoxide (7.6 g, 79.5 mmol) were added to 200 ml of toluene under a nitrogen atmosphere, and the mixture was stirred and refluxed. Then, bis(tri-tert-butylphosphine)palladium(0) (0.2 g, 0.4 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 7.8 g of subI-1 (yield 60%, MS: [M+H]+=328).

Compound subI-1 (10 g, 30.5 mmol), amine6 (10.3 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 9.5 g of Compound 2-13 (yield 51%, MS: [M+H]+=614).

Synthesis Example 2-14

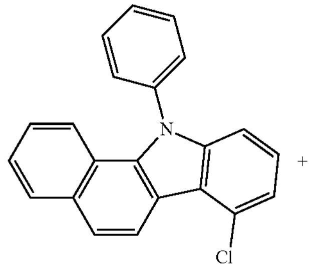

subI-1

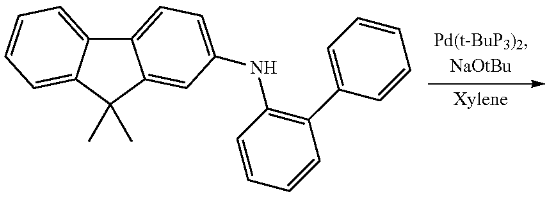

amine13

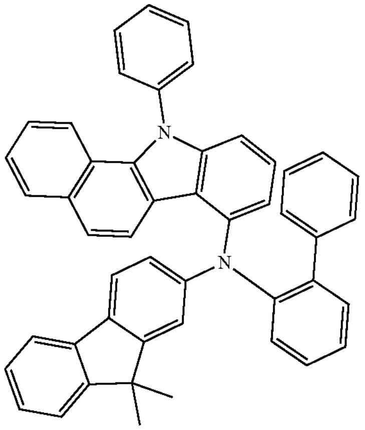

2-14

Compound subI-1 (10 g, 30.5 mmol), amine13 (11.6 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 13.5 g of Compound 2-14 (yield 68%, MS: [M+H]+=654).

Synthesis Example 2-15

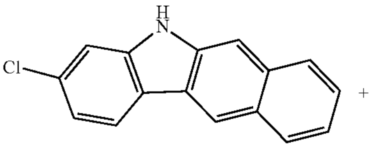

J

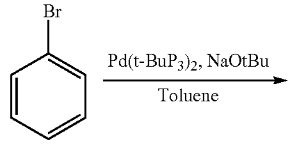

sub33

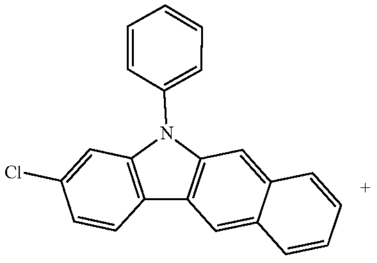

subJ-1

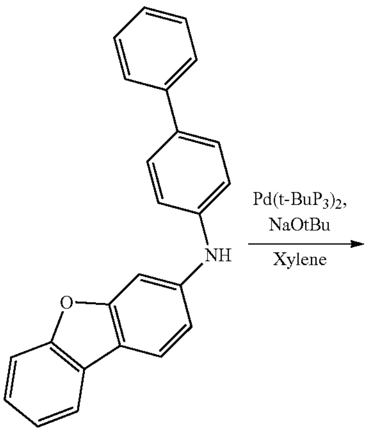

amine3

-continued

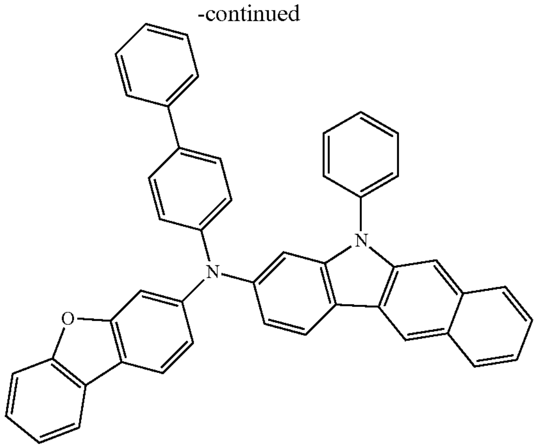

2-15

Compound J (10 g, 39.7 mmol), sub33 (6.2 g, 39.7 mmol), and sodium tert-butoxide (7.6 g, 79.5 mmol) were added to 200 ml of toluene under a nitrogen atmosphere, and the mixture was stirred and refluxed. Then, bis(tri-tert-butylphosphine)palladium(0) (0.2 g, 0.4 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 6.6 g of subJ-1 (yield 51%, MS: [M+H]+=328).

Compound subJ-1 (10 g, 30.5 mmol), amine3 (10.7 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 9.8 g of Compound 2-15 (yield 51%, MS: [M+H]+=628).

Synthesis Example 2-16

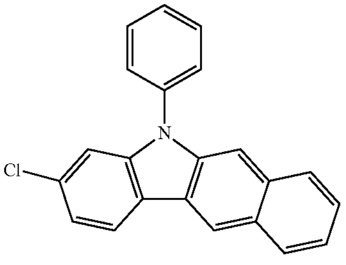

+ subJ-1

-continued

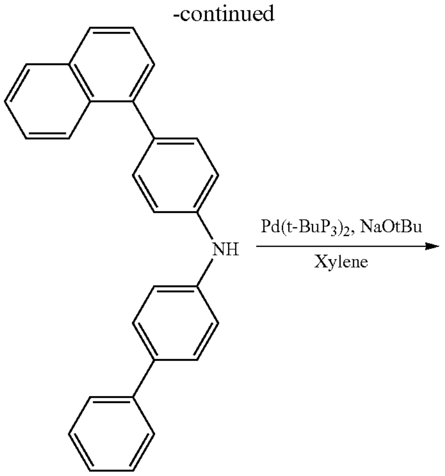

amine1

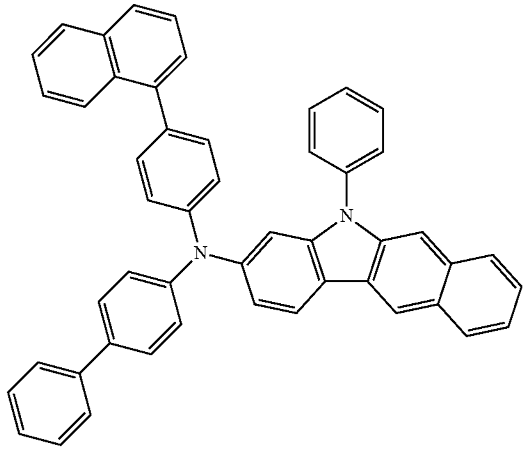

2-16

Compound subJ-1 (10 g, 30.5 mmol), amine1 (11.9 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 13.3 g of Compound 2-16 (yield 66%, MS: [M+H]+=664).

Synthesis Example 2-17

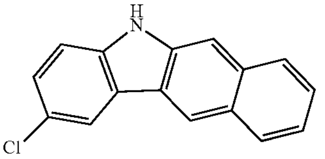

+

K

-continued

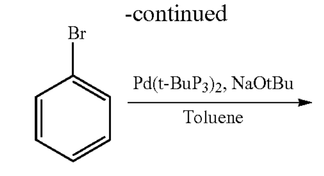

sub33

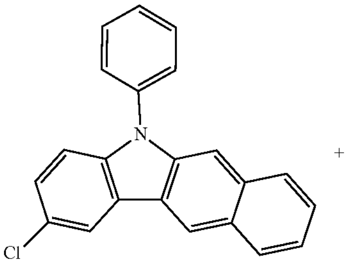

subK-1

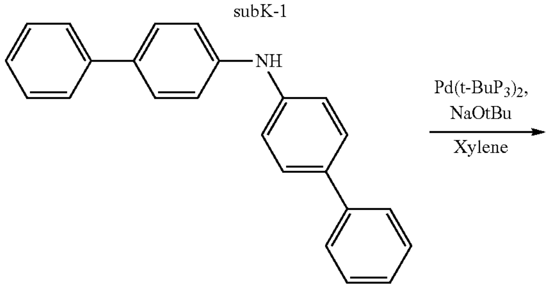

amine6

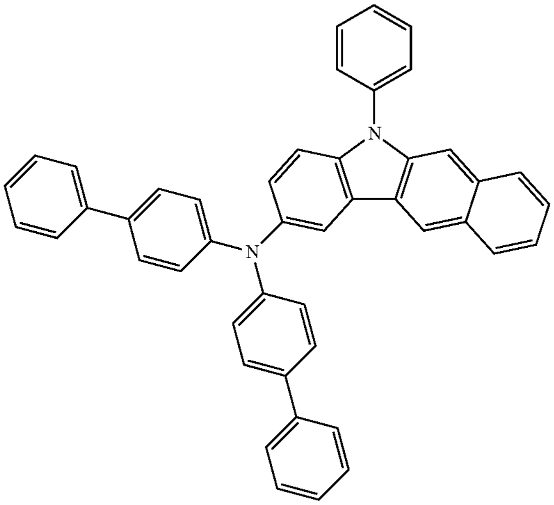

2-17

Compound K (10 g, 39.7 mmol), sub33 (6.2 g, 39.7 mmol), and sodium tert-butoxide (7.6 g, 79.5 mmol) were added to 200 ml of toluene under a nitrogen atmosphere, and the mixture was stirred and refluxed. Then, bis(tri-tert-butylphosphine)palladium(0) (0.2 g, 0.4 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 8.4 g of subK-1 (yield 65%, MS: [M+H]+=328).

Compound subK-1 (10 g, 30.5 mmol), amine6 (10.3 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 12.5 g of Compound 2-17 (yield 67%, MS: [M+H]+=614).

Synthesis Example 2-18

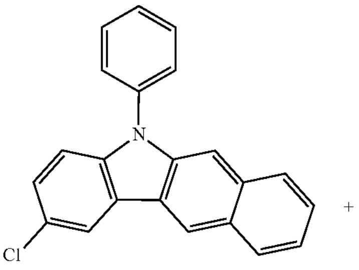

subK-1

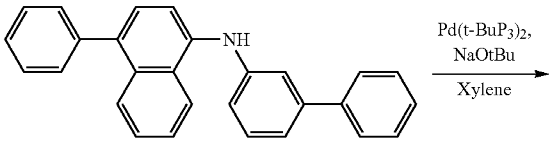

amine14

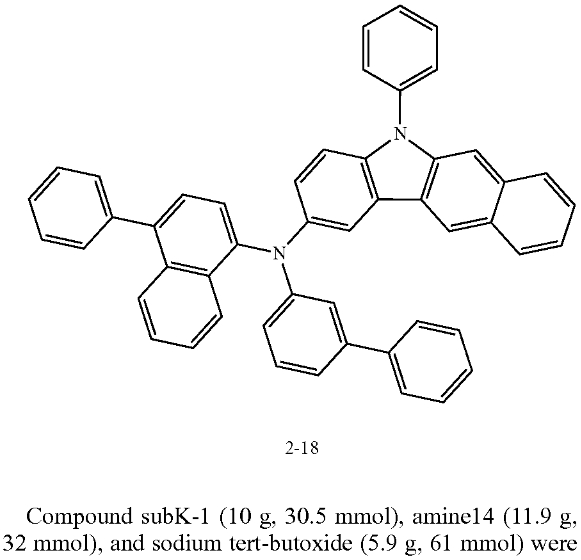

2-18

Compound subK-1 (10 g, 30.5 mmol), amine14 (11.9 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 14.2 g of Compound 2-18 (yield 70%, MS: [M+H]+=664).

Synthesis Example 2-19

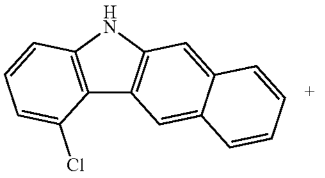

L

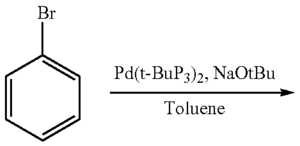

sub33

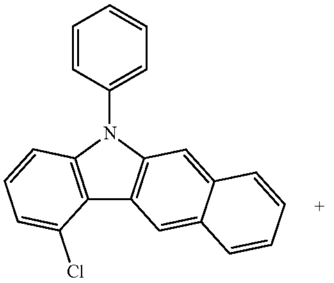

subL-1

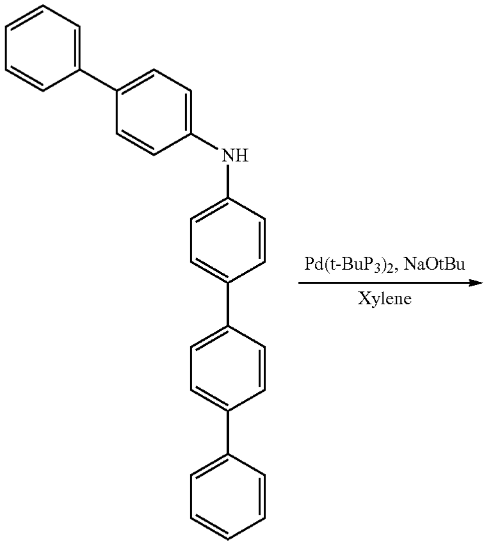

amine15

-continued

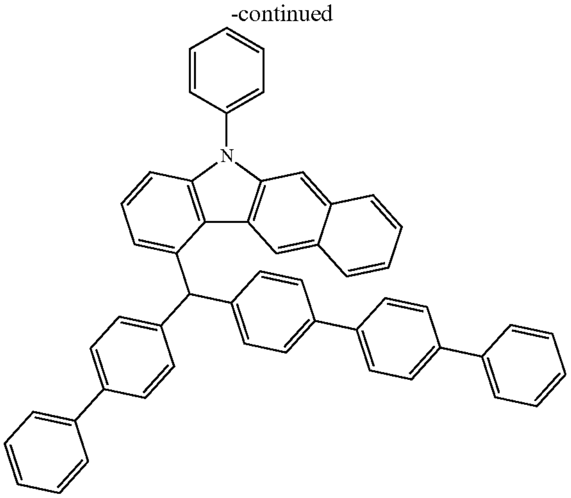

2-19

Compound L (10 g, 39.7 mmol), sub33 (6.2 g, 39.7 mmol), and sodium tert-butoxide (7.6 g, 79.5 mmol) were added to 200 ml of toluene under a nitrogen atmosphere, and the mixture was stirred and refluxed. Then, bis(tri-tert-butylphosphine)palladium(0) (0.2 g, 0.4 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 6.5 g of subL-1 (yield 50%, MS: [M+H]+=328).

Compound subL-1 (10 g, 30.5 mmol), amine15 (12.7 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 13.9 g of Compound 2-19 (yield 66%, MS: [M+H]+=690).

Synthesis Example 2-20

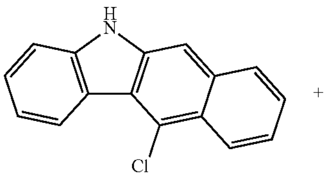

M

-continued

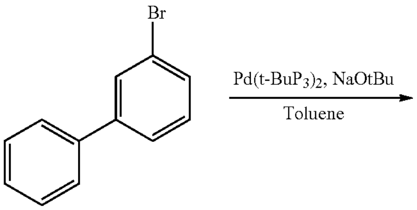

sub34

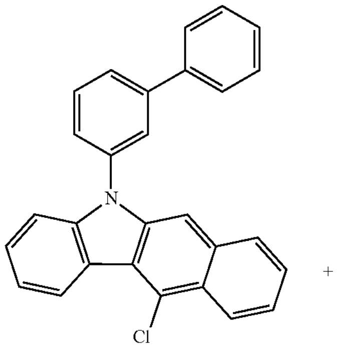

subM-1

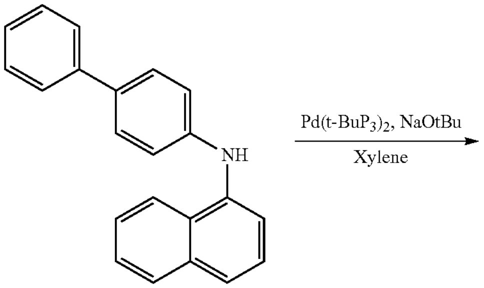

amine16

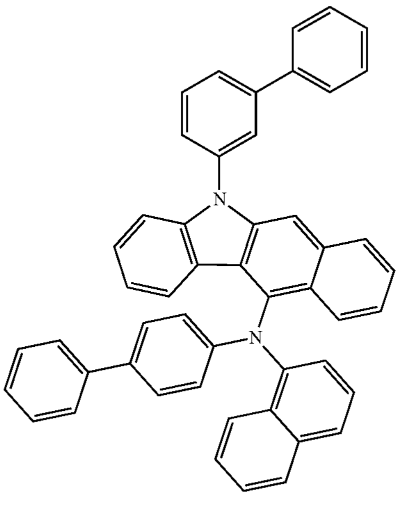

2-20

Compound M (10 g, 39.7 mmol), sub34 (9.3 g, 39.7 mmol), and sodium tert-butoxide (7.6 g, 79.5 mmol) were added to 200 ml of toluene under a nitrogen atmosphere, and the mixture was stirred and refluxed. Then, bis(tri-tert-butylphosphine)palladium(0) (0.2 g, 0.4 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 11.1 g of subM-1 (yield 69%, MS: [M+H]+=404).

Compound subM-1 (10 g, 24.8 mmol), amine16 (7.7 g, 26 mmol), and sodium tert-butoxide (4.8 g, 49.5 mmol) were added to 200 ml of Xylene under a nitrogen atmosphere, and the mixture was stirred and refluxed. Then, bis(tri-tert-butylphosphine)palladium(0) (0.1 g, 0.2 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 8.5 g of Compound 2-20 (yield 52%, MS: [M+H]+=664).

Synthesis Example 2-21

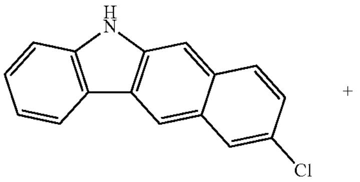

N

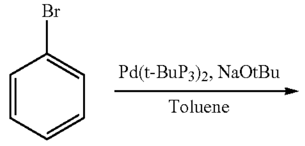

sub33

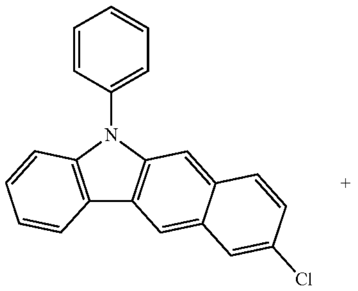

subN-1

-continued

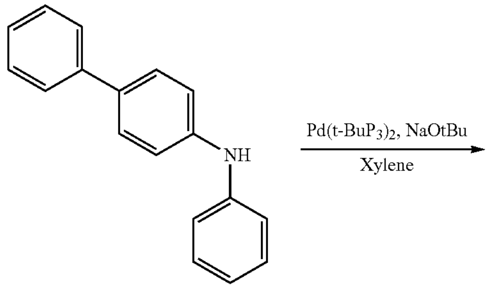

amine17

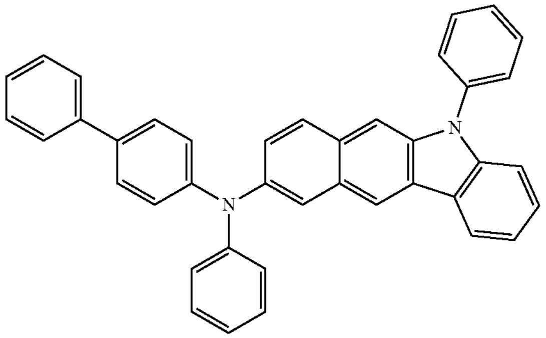

2-21

Compound N (10 g, 39.7 mmol), sub33 (6.2 g, 39.7 mmol), and sodium tert-butoxide (7.6 g, 79.5 mmol) were added to 200 ml of toluene under a nitrogen atmosphere, and the mixture was stirred and refluxed. Then, bis(tri-tert-butylphosphine)palladium(0) (0.2 g, 0.4 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 8.8 g of subN-1 (yield 68%, MS: [M+H]+=328).

Compound subN-1 (10 g, 30.5 mmol), amine17 (7.9 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 8.2 g of Compound 2-21 (yield 50%, MS: [M+H]+=538).

Synthesis Example 2-22

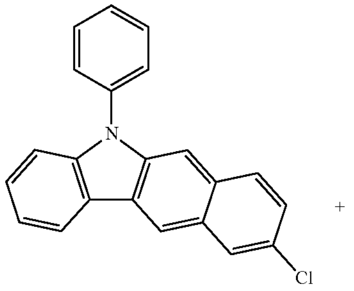

subN-1

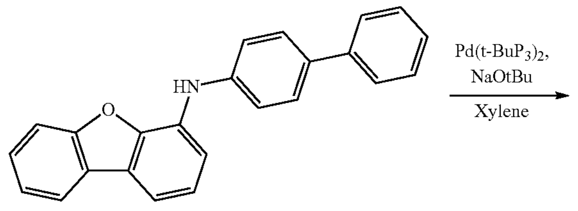

amine18

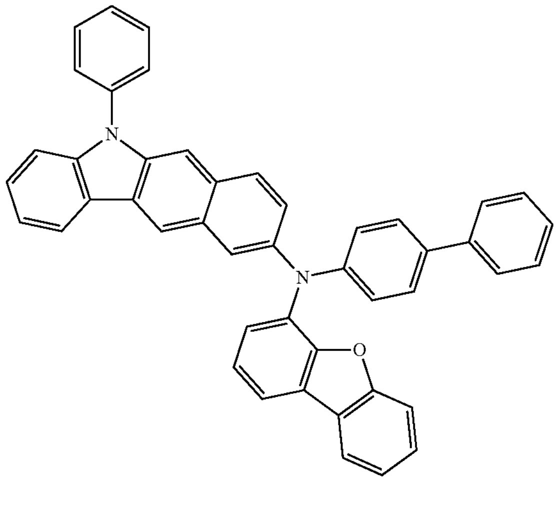

2-22

Compound subN-1 (10 g, 30.5 mmol), amine18 (10.7 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 13 g of Compound 2-22 (yield 68%, MS: [M+H]+=628).

Synthesis Example 2-23

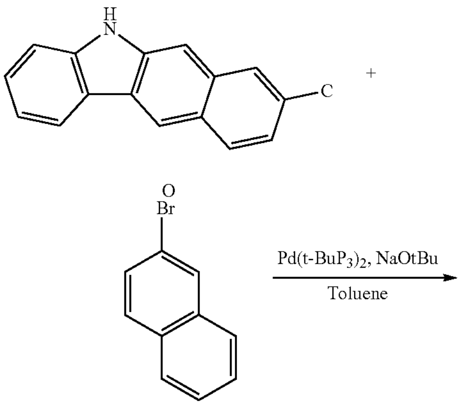

sub35

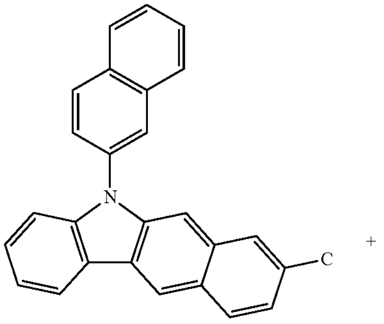

SubO-1

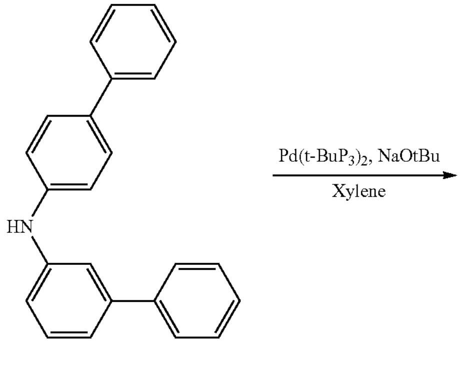

amine4

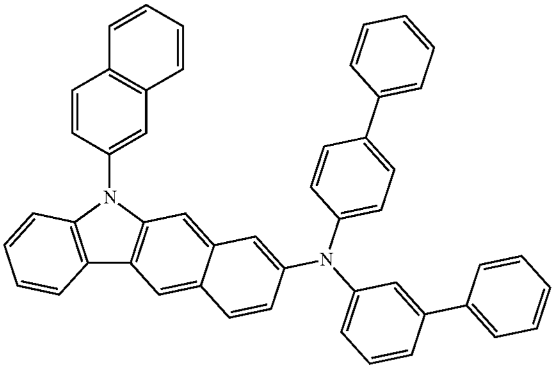

2-23

Compound O (10 g, 39.7 mmol), sub35 (8.2 g, 39.7 mmol), and sodium tert-butoxide (7.6 g, 79.5 mmol) were added to 200 ml of toluene under a nitrogen atmosphere, and the mixture was stirred and refluxed. Then, bis(tri-tert-butylphosphine)palladium(0) (0.2 g, 0.4 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 9.6 g of subO-1 (yield 64%, MS: [M+H]+=378).

Compound subO-1 (10 g, 26.5 mmol), amine4 (8.9 g, 27.8 mmol), and sodium tert-butoxide (5.1 g, 52.9 mmol) were added to 200 ml of Xylene under a nitrogen atmosphere, and the mixture was stirred and refluxed. Then, bis(tri-tert-butylphosphine)palladium(0) (0.1 g, 0.3 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 10.5 g of Compound 2-23 (yield 60%, MS: [M+H]+=664).

Synthesis Example 2-24

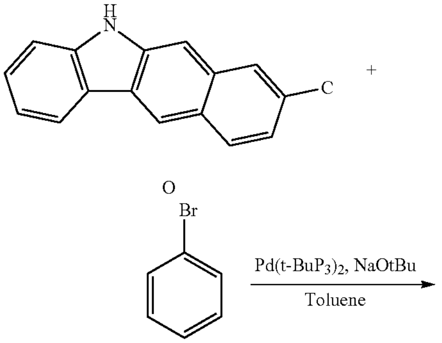

sub33

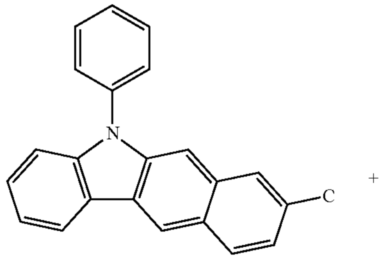

SubO-2

-continued

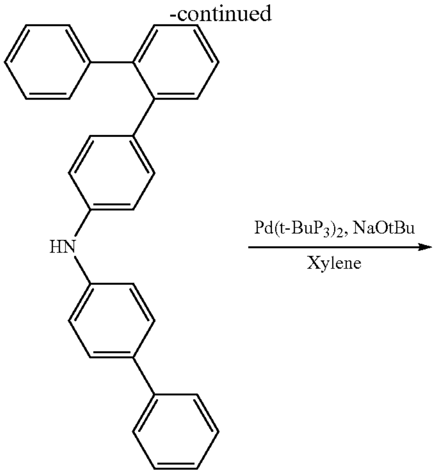

amine19

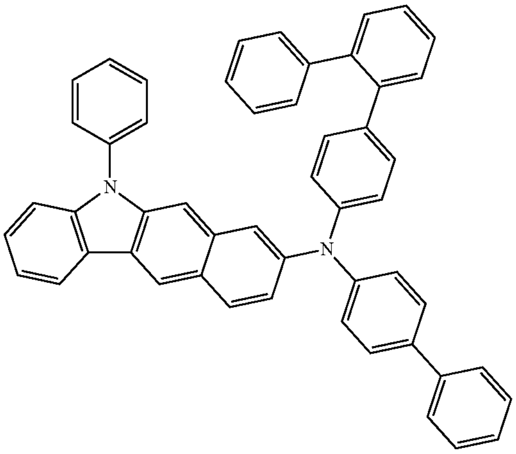

2-24

Compound O (10 g, 39.7 mmol), sub33 (6.2 g, 39.7 mmol), and sodium tert-butoxide (7.6 g, 79.5 mmol) were added to 200 ml of toluene under a nitrogen atmosphere, and the mixture was stirred and refluxed. Then, bis(tri-tert-butylphosphine)palladium(0) (0.2 g, 0.4 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 9 g of subO-2 (yield 69%, MS: [M+H]+=328).

Compound subO-2 (10 g, 30.5 mmol), amine19 (12.7 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 12.6 g of Compound 2-24 (yield 60%, MS: [M+H]+=690).

Synthesis Example 2-25

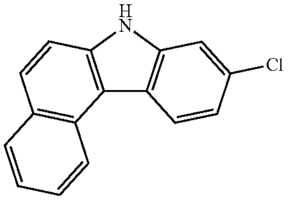

+

P

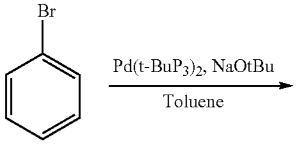

sub33

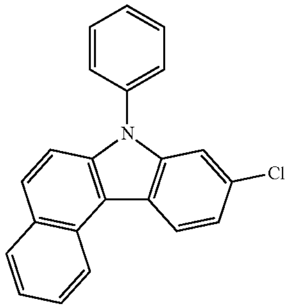

+

SubP-1

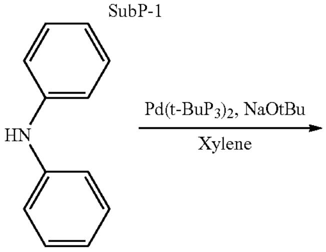

amine20

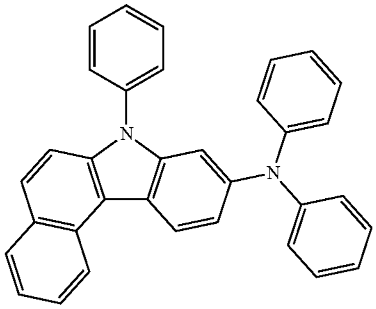

2-25

Compound P (10 g, 39.7 mmol), sub33 (6.2 g, 39.7 mmol), and sodium tert-butoxide (7.6 g, 79.5 mmol) were added to 200 ml of toluene under a nitrogen atmosphere, and the mixture was stirred and refluxed. Then, bis(tri-tert-butylphosphine)palladium(0) (0.2 g, 0.4 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 9.1 g of subP-1 (yield 70%, MS: [M+H]+=328).

Compound subP-1 (10 g, 30.5 mmol), amine20 (5.4 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 9.6 g of Compound 2-25 (yield 68%, MS: [M+H]+=462).

Synthesis Example 2-26

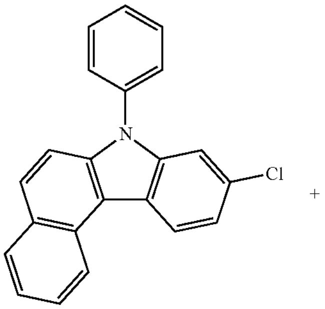

SubP-1

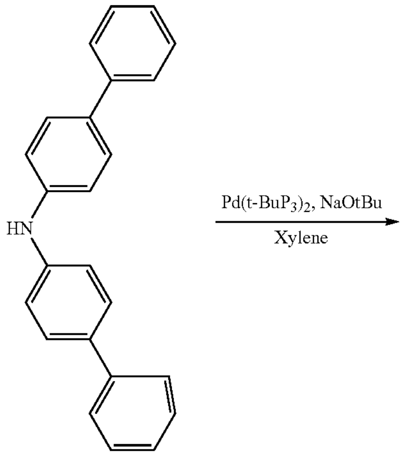

amine6

-continued

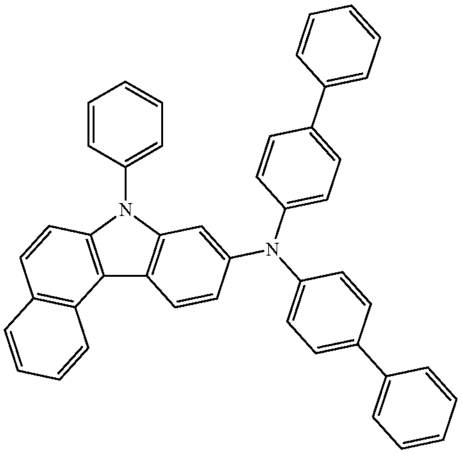

2-26

Compound subP-1 (10 g, 30.5 mmol), amine6 (10.3 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 12.9 g of Compound 2-26 (yield 69%, MS: [M+H]+=614).

Synthesis Example 2-27

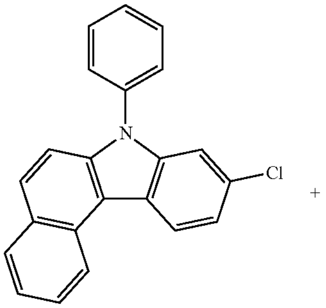

SubP-1

-continued

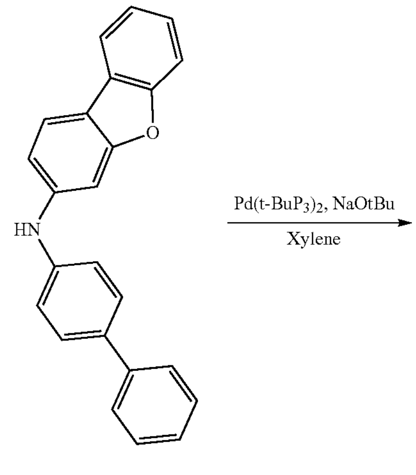

amine3

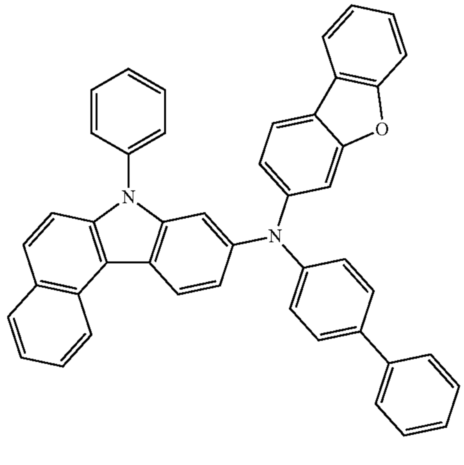

2-27

Compound subP-1 (10 g, 30.5 mmol), amine3 (10.7 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 12.8 g of Compound 2-27 (yield 67%, MS: [M+H]+=628).

Synthesis Example 2-28

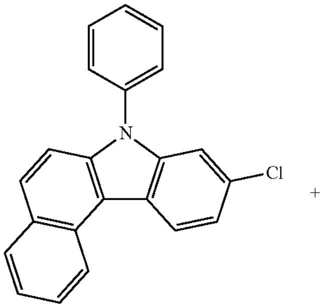

SubP-1

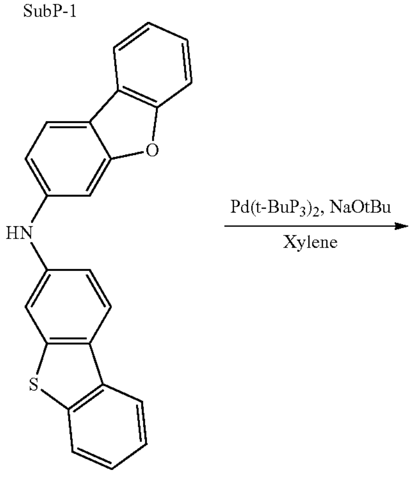

amine21

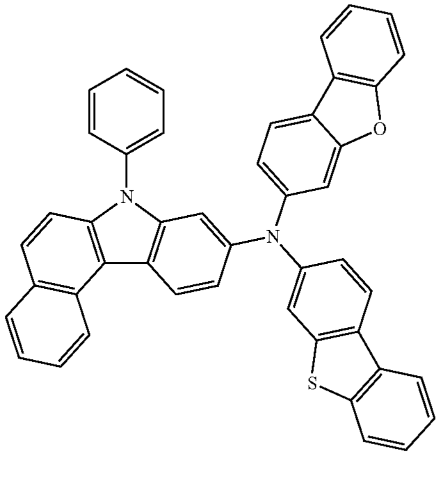

2-28

Compound subP-1 (10 g, 30.5 mmol), amine21 (11.7 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 13.4 g of Compound 2-28 (yield 67%, MS: [M+H]+=658).

Synthesis Example 2-29

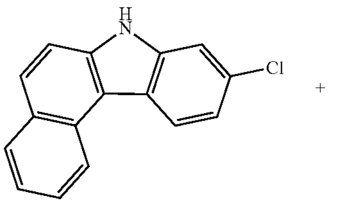

P

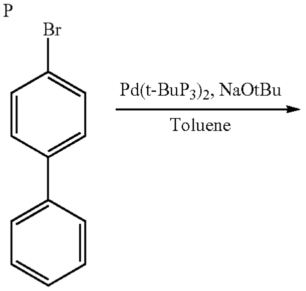

sub36

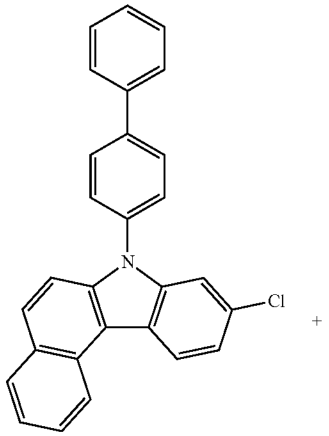

SubP-2

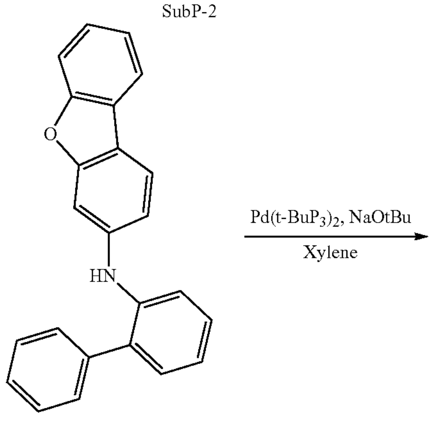

amine22

-continued

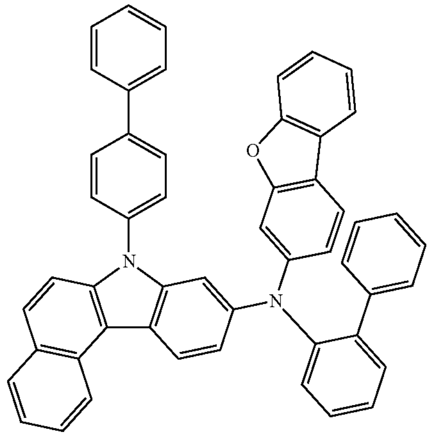

2-29

Compound P (10 g, 39.7 mmol), sub36 (9.3 g, 39.7 mmol), and sodium tert-butoxide (7.6 g, 79.5 mmol) were added to 200 ml of toluene under a nitrogen atmosphere, and the mixture was stirred and refluxed. Then, bis(tri-tert-butylphosphine)palladium(0) (0.2 g, 0.4 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 9.1 g of subP-2 (yield 57%, MS: [M+H]+=404).

Compound subP-2 (10 g, 24.8 mmol), amine22 (8.7 g, 26 mmol), and sodium tert-butoxide (4.8 g, 49.5 mmol) were added to 200 ml of Xylene under a nitrogen atmosphere, and the mixture was stirred and refluxed. Then, bis(tri-tert-butylphosphine)palladium(0) (0.1 g, 0.2 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 11.1 g of Compound 2-29 (yield 64%, MS: [M+H]+=704).

Synthesis Example 2-30

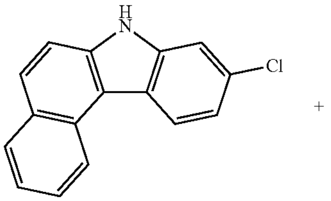

P

-continued

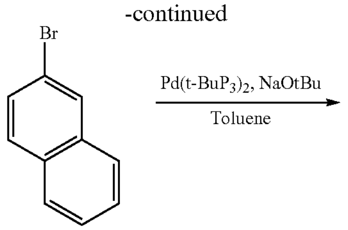

sub35

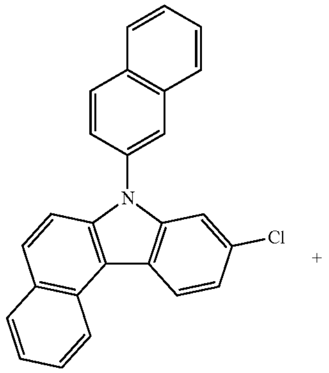

SubP-3

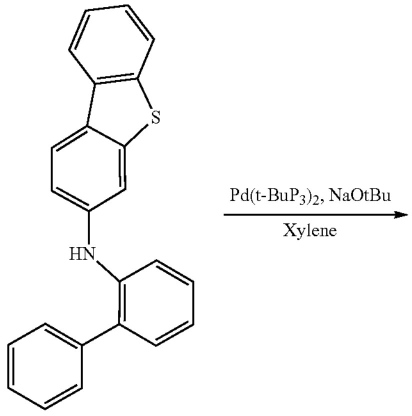

amine5

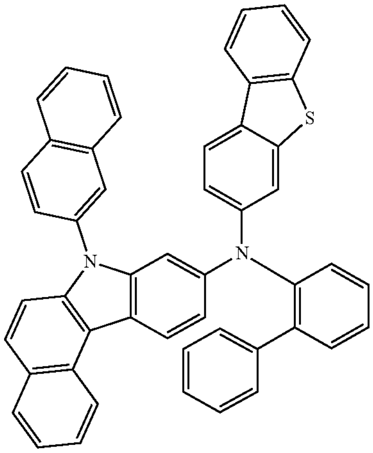

2-30

Compound P (10 g, 39.7 mmol), sub35 (8.2 g, 39.7 mmol), and sodium tert-butoxide (7.6 g, 79.5 mmol) were added to 200 ml of toluene under a nitrogen atmosphere, and the mixture was stirred and refluxed. Then, bis(tri-tert-butylphosphine)palladium(0) (0.2 g, 0.4 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 10 g of subP-3 (yield 67%, MS: [M+H]+=378).

Compound subP-3 (10 g, 26.5 mmol), amine5 (9.8 g, 27.8 mmol), and sodium tert-butoxide (5.1 g, 52.9 mmol) were added to 200 ml of Xylene under a nitrogen atmosphere, and the mixture was stirred and refluxed. Then, bis(tri-tert-butylphosphine)palladium(0) (0.1 g, 0.3 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 10.5 g of Compound 2-30 (yield 57%, MS: [M+H]+=694).

Synthesis Example 2-31

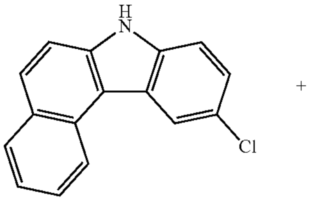

Q

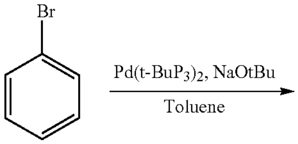

sub33

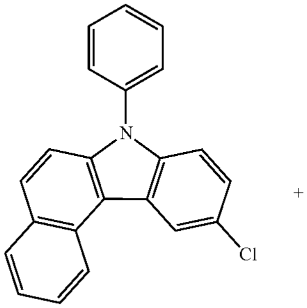

subQ-1

-continued

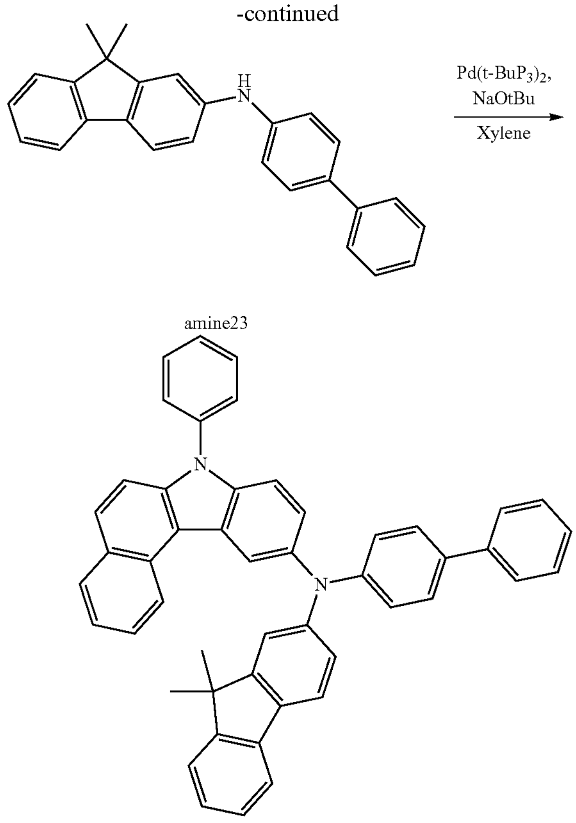

amine23

2-31

Compound Q (10 g, 39.7 mmol), sub33 (6.2 g, 39.7 mmol), and sodium tert-butoxide (7.6 g, 79.5 mmol) were added to 200 ml of toluene under a nitrogen atmosphere, and the mixture was stirred and refluxed. Then, bis(tri-tert-butylphosphine)palladium(0) (0.2 g, 0.4 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 9.1 g of subQ-1 (yield 70%, MS: [M+H]+=328).

Compound subQ-1 (10 g, 30.5 mmol), amine23 (11.6 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 12.7 g of Compound 2-31 (yield 64%, MS: [M+H]+=654).

Synthesis Example 2-32

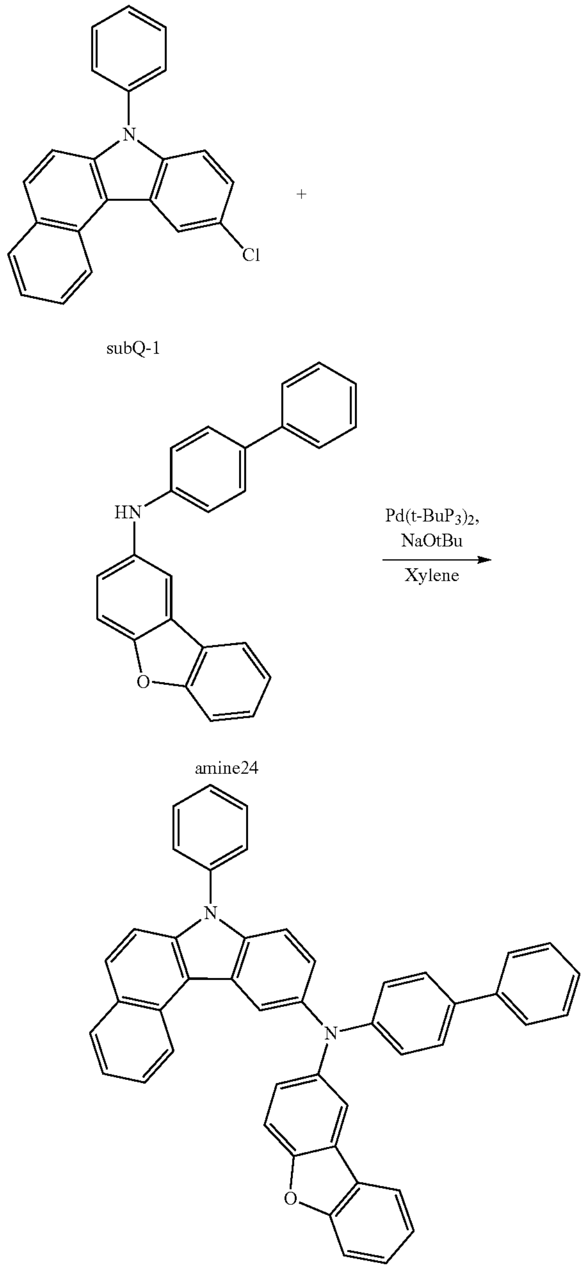

subQ-1 amine24

2-32

Compound subQ-1 (10 g, 30.5 mmol), amine24 (10.7 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 11.3 g of Compound 2-32 (yield 59%, MS: [M+H]+=628).

Synthesis Example 2-33

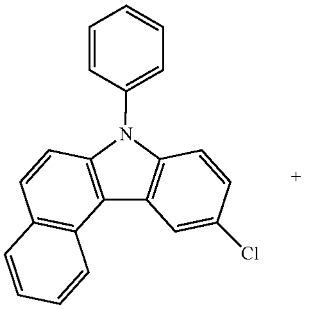

subQ-1

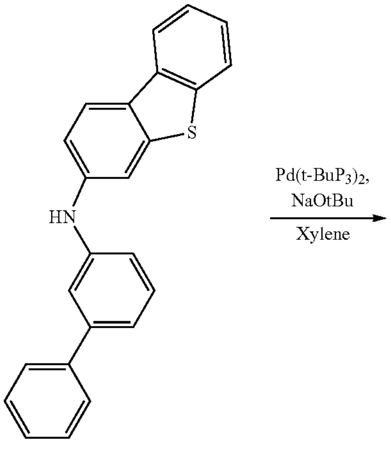

amine 25

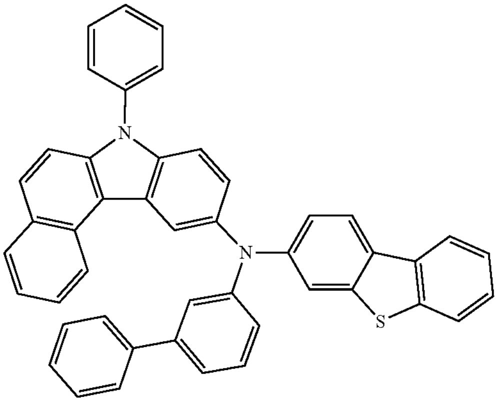

2-33

Compound subQ-1 (10 g, 30.5 mmol), amine25 (11.3 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 9.8 g of Compound 2-33 (yield 50%, MS: [M+H]+=644).

Synthesis Example 2-34

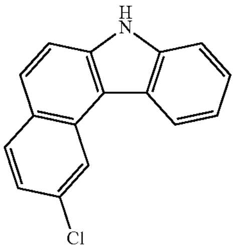

R

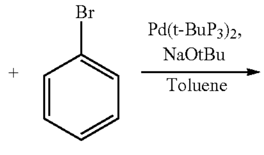

sub33

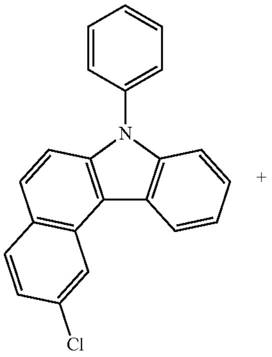

subR-1

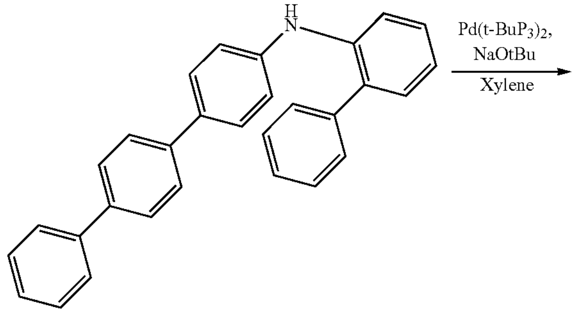

amine26

-continued

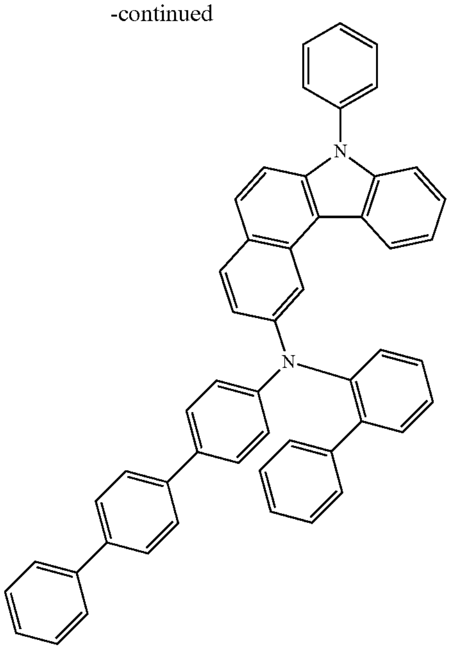

2-34

Compound R (10 g, 39.7 mmol), sub33 (6.2 g, 39.7 mmol), and sodium tert-butoxide (7.6 g, 79.5 mmol) were added to 200 ml of toluene under a nitrogen atmosphere, and the mixture was stirred and refluxed. Then, bis(tri-tert-butylphosphine)palladium(0) (0.2 g, 0.4 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 6.8 g of subR-1 (yield 52%, MS: [M+H]+=328).

Compound subR-1 (10 g, 30.5 mmol), amine26 (12.7 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 14.3 g of Compound 2-34 (yield 68%, MS: [M+H]+=690).

Synthesis Example 2-35

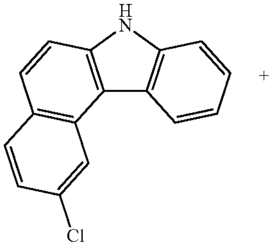

R

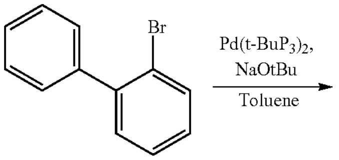

sub37

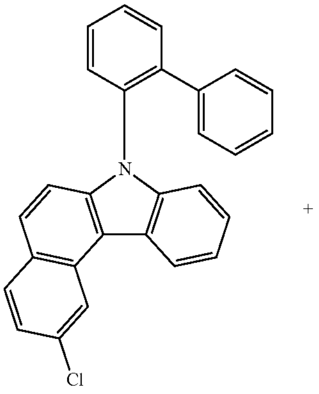

subR-2

-continued

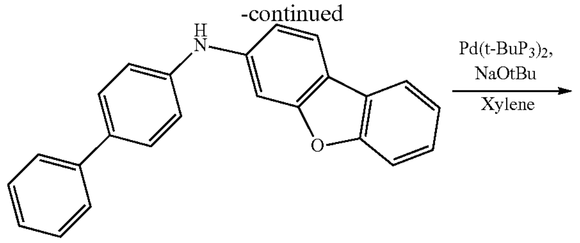

amine3

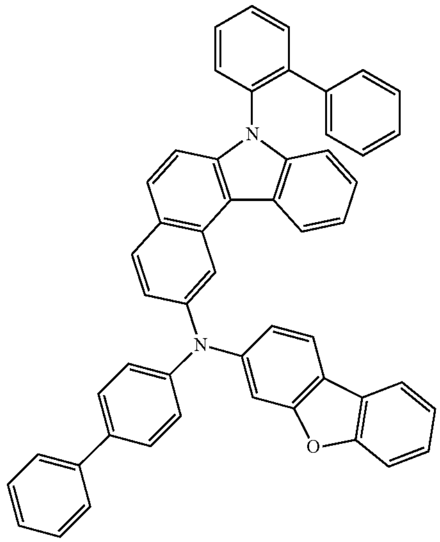

2-35

Compound R (10 g, 39.7 mmol), sub37 (9.3 g, 39.7 mmol), and sodium tert-butoxide (7.6 g, 79.5 mmol) were added to 200 ml of toluene under a nitrogen atmosphere, and the mixture was stirred and refluxed. Then, bis(tri-tert-butylphosphine)palladium(0) (0.2 g, 0.4 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 8.5 g of subR-2 (yield 53%, MS: [M+H]+=404).

Compound subR-2 (10 g, 24.8 mmol), amine3 (8.7 g, 26 mmol), and sodium tert-butoxide (4.8 g, 49.5 mmol) were added to 200 ml of Xylene under a nitrogen atmosphere, and the mixture was stirred and refluxed. Then, bis(tri-tert-butylphosphine)palladium(0) (0.1 g, 0.2 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 10.6 g of Compound 2-35 (yield 61%, MS: [M+H]+=704).

Synthesis Example 2-36

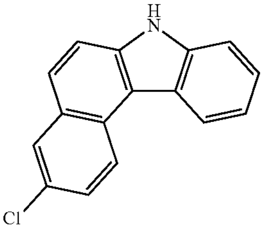

S

+

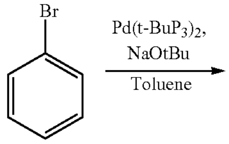

sub33

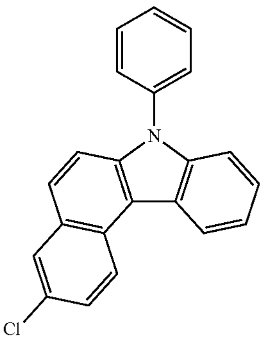

+ subS-1

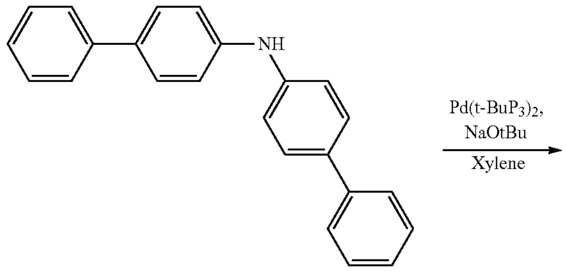

amine6

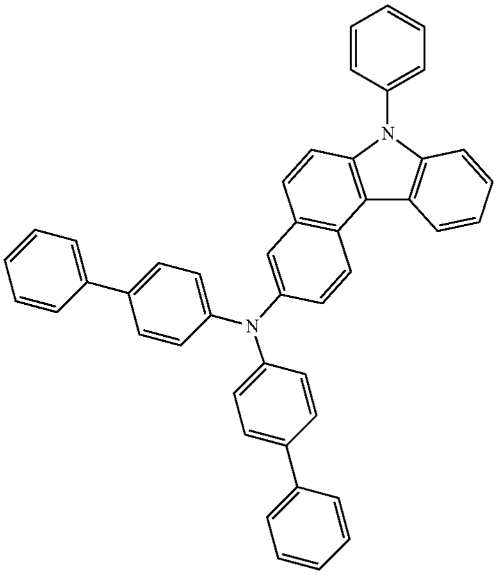

2-36

Compound S (10 g, 39.7 mmol), sub33 (6.2 g, 39.7 mmol), and sodium tert-butoxide (7.6 g, 79.5 mmol) were added to 200 ml of toluene under a nitrogen atmosphere, and the mixture was stirred and refluxed. Then, bis(tri-tert-butylphosphine)palladium(0) (0.2 g, 0.4 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 8.6 g of subS-1 (yield 66%, MS: [M+H]+=328).

Compound subS-1 (10 g, 30.5 mmol), amine6 (10.3 g, 32 mmol), and sodium tert-butoxide (5.9 g, 61 mmol) were added to 200 ml of Xylene under a nitrogen atmosphere, and the mixture was stirred and refluxed. Then, bis(tri-tert-butylphosphine)palladium(0) (0.2 g, 0.3 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 10.5 g of Compound 2-36 (yield 56%, MS: [M+H]+=614).

Synthesis Example 2-37

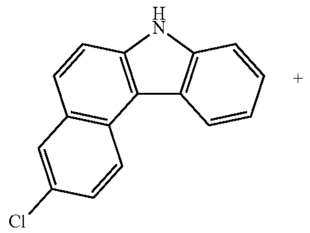

S

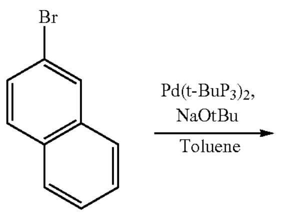

sub35

-continued

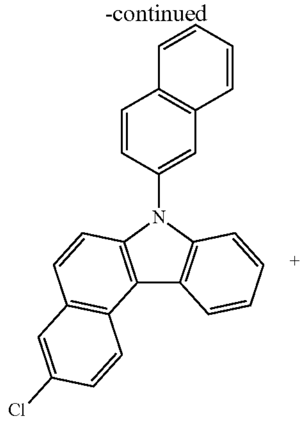

subS-2

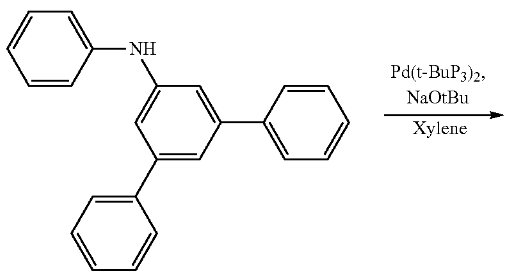

amine27

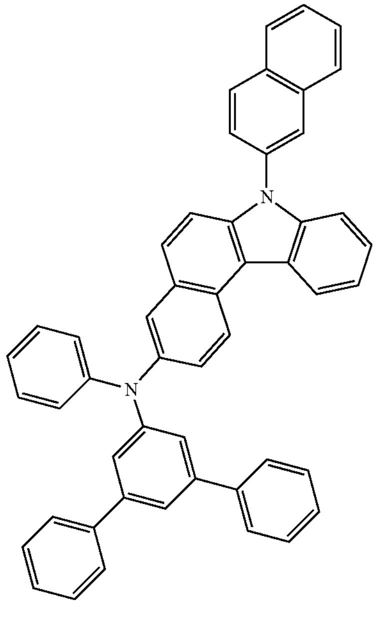

2-37

Compound S (10 g, 39.7 mmol), sub35 (8.2 g, 39.7 mmol), and sodium tert-butoxide (7.6 g, 79.5 mmol) were added to 200 ml of toluene under a nitrogen atmosphere, and the mixture was stirred and refluxed. Then, bis(tri-tert-butylphosphine)palladium(0) (0.2 g, 0.4 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 7.5 g of subS-2 (yield 50%, MS: [M+H]+=378).

Compound subS-2 (10 g, 26.5 mmol), amine27 (8.9 g, 27.8 mmol), and sodium tert-butoxide (5.1 g, 52.9 mmol) were added to 200 ml of Xylene under a nitrogen atmosphere, and the mixture was stirred and refluxed. Then, bis(tri-tert-butylphosphine)palladium(0) (0.1 g, 0.3 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 10.7 g of Compound 2-37 (yield 61%, MS: [M+H]+=664).

Synthesis Example 2-38

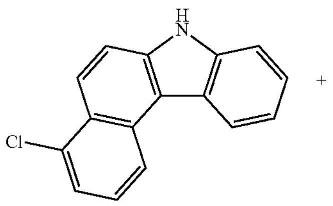

T

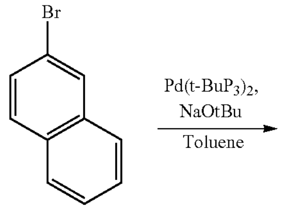

sub35

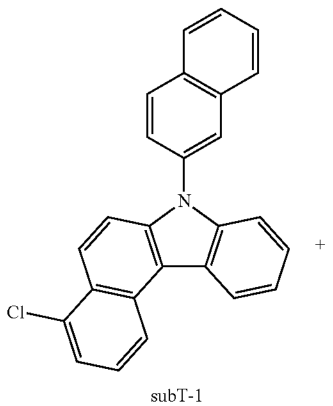

subT-1

-continued

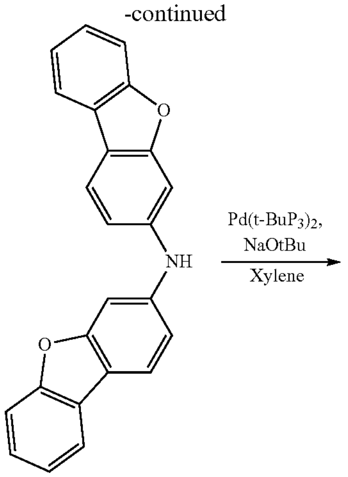

amine9

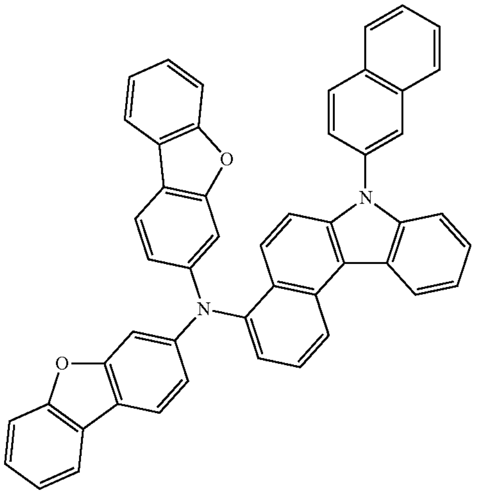

2-38

Compound T (10 g, 39.7 mmol), sub35 (8.2 g, 39.7 mmol), and sodium tert-butoxide (7.6 g, 79.5 mmol) were added to 200 ml of toluene under a nitrogen atmosphere, and the mixture was stirred and refluxed. Then, bis(tri-tert-butylphosphine)palladium(0) (0.2 g, 0.4 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 8.4 g of subT-1 (yield 56%, MS: [M+H]+=378).

Compound subT-1 (10 g, 26.5 mmol), amine9 (9.7 g, 27.8 mmol), and sodium tert-butoxide (5.1 g, 52.9 mmol) were added to 200 ml of Xylene under a nitrogen atmosphere, and the mixture was stirred and refluxed. Then, bis(tri-tert-butylphosphine)palladium(0) (0.1 g, 0.3 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 12.6 g of Compound 2-38 (yield 69%, MS: [M+H]+=692).

Synthesis Example 2-39

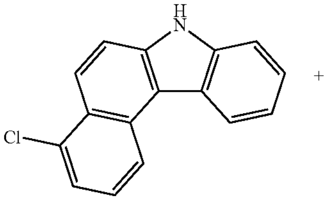

U

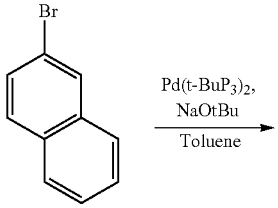

sub35

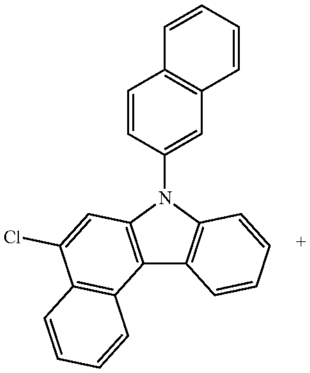

subU-1

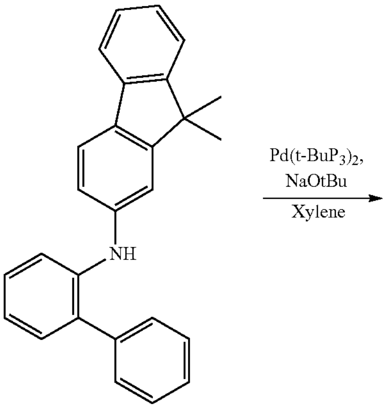

amine13

-continued

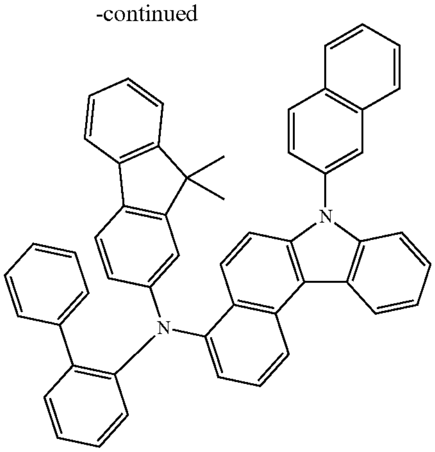

2-39

Compound U (10 g, 39.7 mmol), sub35 (8.2 g, 39.7 mmol), and sodium tert-butoxide (7.6 g, 79.5 mmol) were added to 200 ml of toluene under a nitrogen atmosphere, and the mixture was stirred and refluxed. Then, bis(tri-tert-butylphosphine)palladium(0) (0.2 g, 0.4 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 7.6 g of subU-1 (yield 51%, MS: [M+H]+=378).

Compound subU-1 (10 g, 26.5 mmol), amine13 (10 g, 27.8 mmol), and sodium tert-butoxide (5.1 g, 52.9 mmol) were added to 200 ml of Xylene under a nitrogen atmosphere, and the mixture was stirred and refluxed. Then, bis(tri-tert-butylphosphine)palladium(0) (0.1 g, 0.3 mmol) was added thereto. After 2 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 11.2 g of Compound 2-39 (yield 60%, MS: [M+H]+=704).

Synthesis Example 2-40

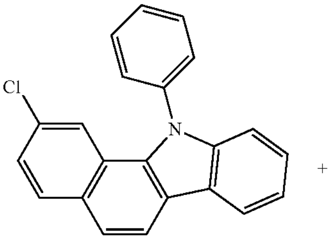

subE-1

-continued

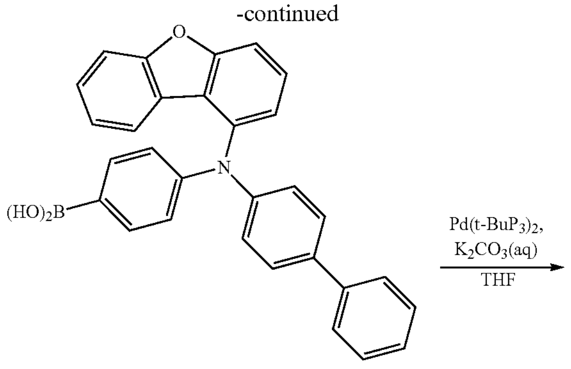

amine 28

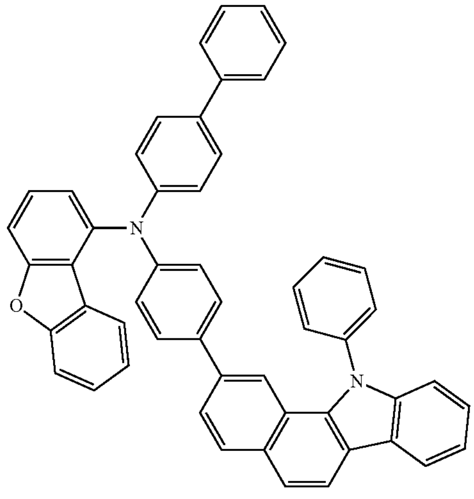

2-40

Compound subE-1 (15 g, 45.8 mmol) and amine28 (21.9 g, 48 mmol) were added to 300 ml of THE under a nitrogen atmosphere, and the mixture was stirred and refluxed. Then, potassium carbonate (19 g, 137.3 mmol) was dissolved in 57 ml of water, and then added thereto. Thereafter, it was stirred sufficiently, followed by adding bis(tri-tert-butylphosphine) palladium(0) (0.2 g, 0.5 mmol). After 10 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 20.9 g of Compound 2-40 (yield 65%, MS: [M+H]+=703).

Synthesis Example 2-41

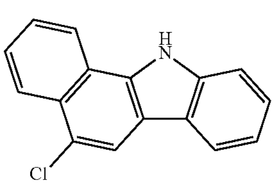

+

V

-continued

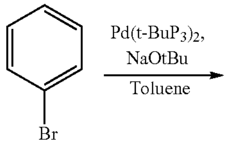

sub33

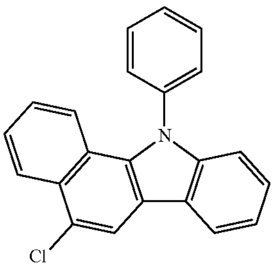

+ subV-1

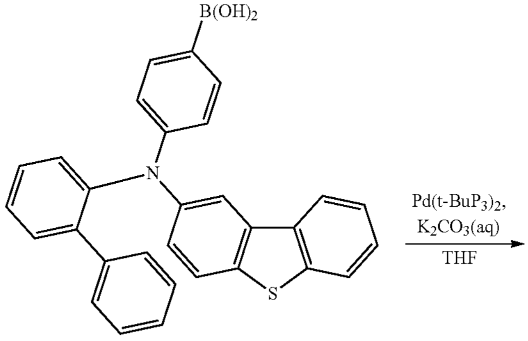

amine29

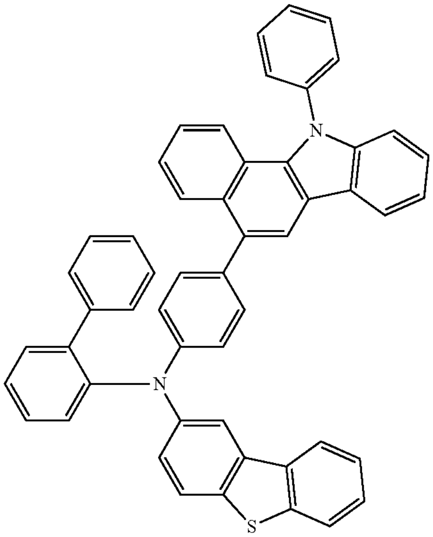

2-41

Compound V (10 g, 39.7 mmol), sub33 (6.9 g, 43.7 mmol), and sodium tert-butoxide (11.5 g, 119.2 mmol) were added to 200 ml of toluene under a nitrogen atmosphere, and the mixture was stirred and refluxed. Then, bis(tri-tert-butylphosphine)palladium(0) (0.4 g, 0.8 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 6.5 g of subV-1 (yield 50%, MS: [M+H]+=328).

Compound subV-1 (15 g, 45.8 mmol) and amine29 (22.6 g, 48 mmol) were added to 300 ml of THE under a nitrogen atmosphere, and the mixture was stirred and refluxed. Then, potassium carbonate (19 g, 137.3 mmol) was dissolved in 57 ml of water, and then added thereto. Thereafter, it was stirred sufficiently, followed by adding bis(tri-tert-butylphosphine) palladium(0) (0.2 g, 0.5 mmol). After 9 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 23 g of Compound 2-41 (yield 70%, MS: [M+H]+=719).

Synthesis Example 2-42

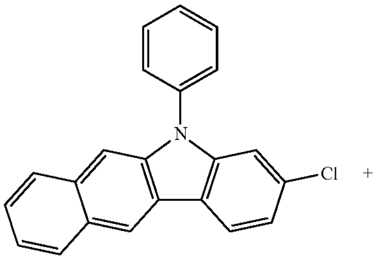

subJ-1

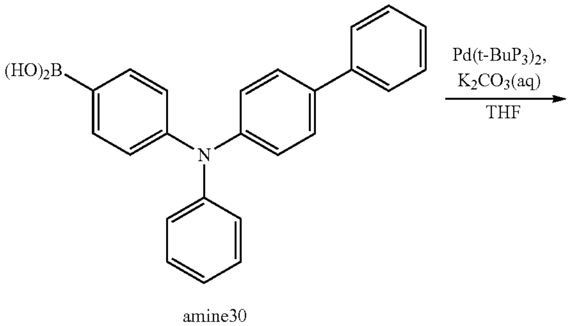

amine30

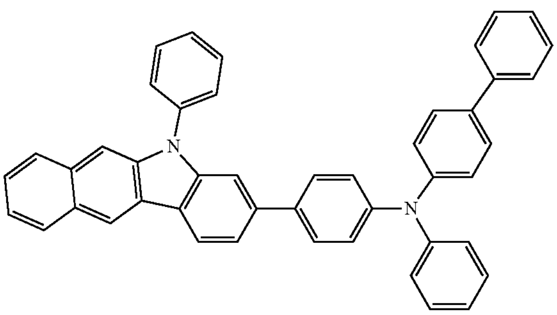

2-42

Compound subJ-1 (15 g, 45.8 mmol) and amine30 (17.5 g, 48 mmol) were added to 300 ml of THE under a nitrogen atmosphere, and the mixture was stirred and refluxed. Then, potassium carbonate (19 g, 137.3 mmol) was dissolved in 57 ml of water, and then added thereto. Thereafter, it was stirred sufficiently, followed by adding bis(tri-tert-butylphosphine) palladium(0) (0.2 g, 0.5 mmol). After 11 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 19.6 g of Compound 2-42 (yield 70%, MS: [M+H]+=613).

Synthesis Example 2-43

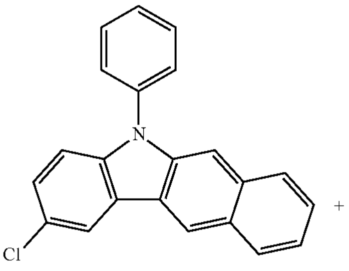

subK-1

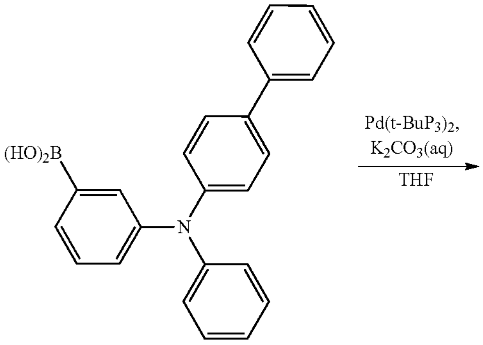

amine31

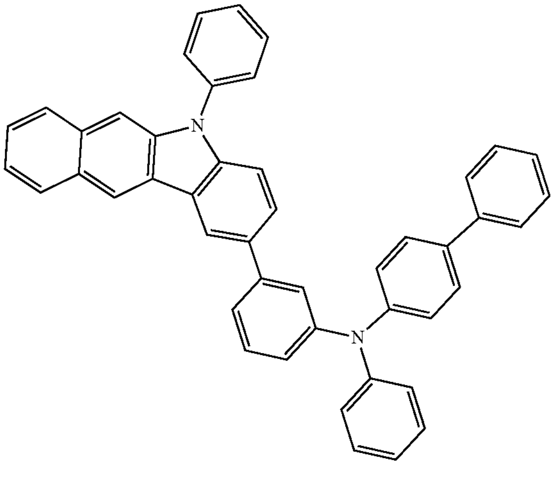

2-43

Compound subK-1 (15 g, 45.8 mmol) and amine31 (17.5 g, 48 mmol) were added to 300 ml of THE under a nitrogen atmosphere, and the mixture was stirred and refluxed. Then, potassium carbonate (19 g, 137.3 mmol) was dissolved in 57 ml of water, and then added thereto. Thereafter, it was stirred sufficiently, followed by adding bis(tri-tert-butylphosphine) palladium(0) (0.2 g, 0.5 mmol). After 12 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 19.6 g of Compound 2-43 (yield 70%, MS: [M+H]+=613).

Synthesis Example 2-44

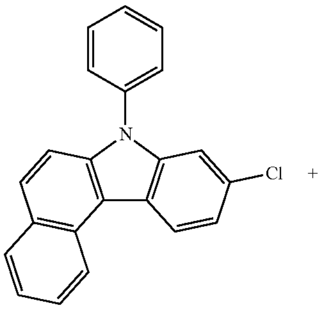

subP-1

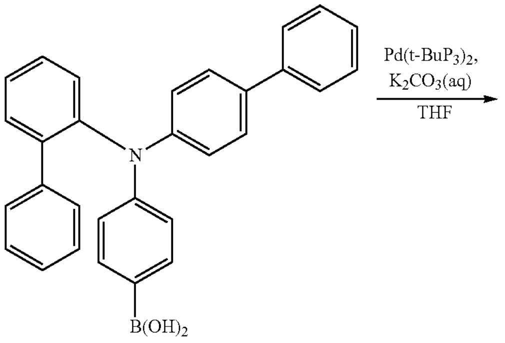

amine32

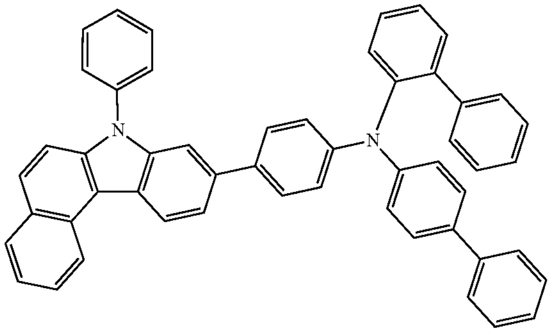

2-44

Compound subP-1 (15 g, 45.8 mmol) and amine32 (21.2 g, 48 mmol) were added to 300 ml of THE under a nitrogen atmosphere, and the mixture was stirred and refluxed. Then, potassium carbonate (19 g, 137.3 mmol) was dissolved in 57 ml of water, and then added thereto. Thereafter, it was stirred sufficiently, followed by adding bis(tri-tert-butylphosphine) palladium(0) (0.2 g, 0.5 mmol). After 10 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 19.5 g of Compound 2-44 (yield 62%, MS: [M+H]+=689).

Synthesis Example 2-45

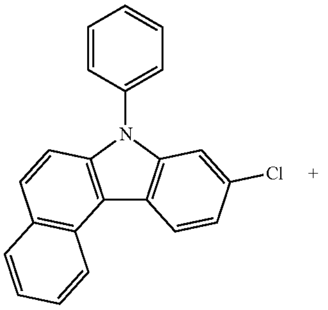

subP-1

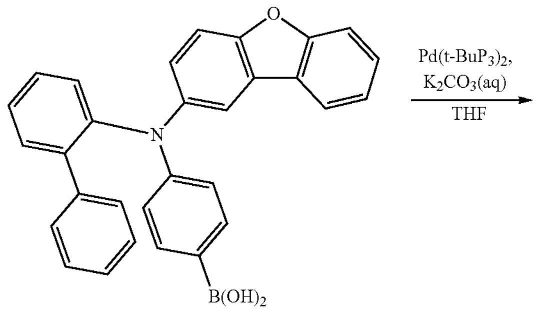

amine33

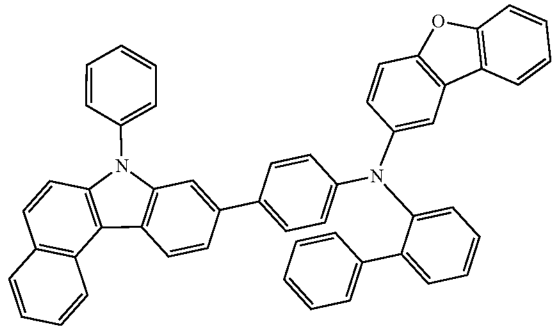

2-45

Compound subP-1 (15 g, 45.8 mmol) and amine33 (21.9 g, 48 mmol) were added to 300 ml of THE under a nitrogen atmosphere, and the mixture was stirred and refluxed. Then, potassium carbonate (19 g, 137.3 mmol) was dissolved in 57 ml of water, and then added thereto. Thereafter, it was stirred sufficiently, followed by adding bis(tri-tert-butylphosphine)

palladium(0) (0.2 g, 0.5 mmol). After 9 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 23.5 g of Compound 2-45 (yield 73%, MS: [M+H]+=703).

Synthesis Example 2-46

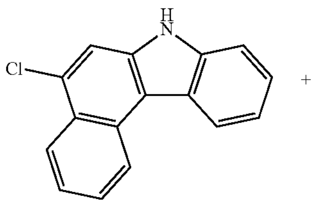

U

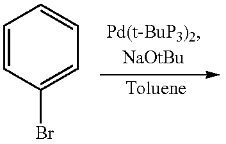

sub33

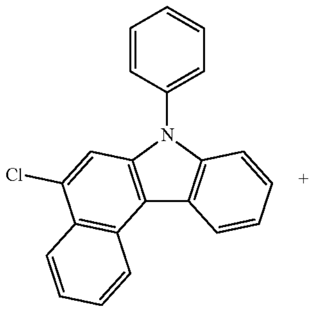

subU-2

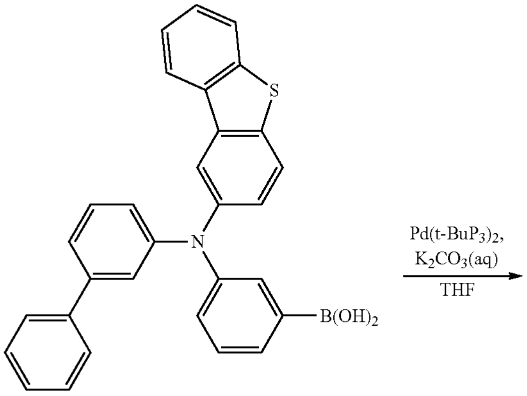

amine34

-continued

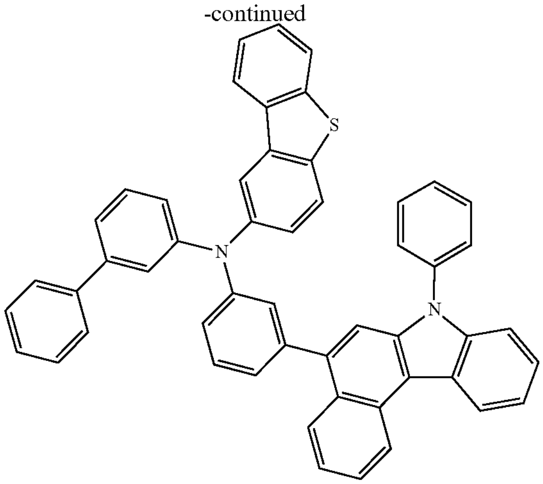

2-46

Compound U (10 g, 39.7 mmol), sub33 (6.9 g, 43.7 mmol), and sodium tert-butoxide (11.5 g, 119.2 mmol) were added to 200 ml of toluene under a nitrogen atmosphere, and the mixture was stirred and refluxed. Then, bis(tri-tert-butylphosphine)palladium(0) (0.4 g, 0.8 mmol) was added thereto. After 3 hours, the reaction was completed, cooling was performed to room temperature, and the solvent was removed under reduced pressure. Then, the compound was completely dissolved again in chloroform, and washed twice with water. Thereafter, the organic layer was separated, treated with anhydrous magnesium sulfate, then filtered, and the filtrate was distilled under reduced pressure. The concentrated compound was purified by silica gel column chromatography to prepare 8.1 g of subU-2 (yield 62%, MS: [M+H]+=328).

Compound subU-2 (15 g, 45.8 mmol) and amine34 (22.6 g, 48 mmol) were added to 300 ml of THE under a nitrogen atmosphere, and the mixture was stirred and refluxed. Then, potassium carbonate (19 g, 137.3 mmol) was dissolved in 57 ml of water, and then added thereto. Thereafter, it was stirred sufficiently, followed by adding bis(tri-tert-butylphosphine) palladium(0) (0.2 g, 0.5 mmol). After 8 hours of reaction, cooling was performed to room temperature. Then, the organic layer was separated from the water layer, and then the organic layer was distilled. Then, this was dissolved again in chloroform, and washed twice with water. Thereafter, the organic layer was separated, treated with anhydrous magnesium sulfate, stirred, then filtered, and the filtrate was distilled under reduced pressure. The concentrated compound was purified by silica gel column chromatography to prepare 21 g of Compound 2-46 (yield 64%, MS: [M+H]+=719).

EXAMPLES AND COMPARATIVE EXAMPLES

Example 1

A glass substrate on which ITO (indium tin oxide) was coated as a thin film to a thickness of 1,000 Å was put into distilled water in which a detergent was dissolved, and ultrasonically cleaned. At this time, a product manufactured by Fischer Co. was used as the detergent, and distilled water filtered twice using a filter manufactured by Millipore Co. was used as the distilled water. After the ITO was cleaned for 30 minutes, ultrasonic cleaning was repeated twice using distilled water for 10 minutes. After the cleaning with distilled water was completed, the substrate was ultrasonically cleaned with solvents of isopropyl alcohol, acetone, and methanol, dried, and then transferred to a plasma cleaner. The substrate was cleaned for 5 minutes using oxygen plasma and then transferred to a vacuum depositor.

On the prepared ITO transparent electrode, the following Compound HI-1 was formed to a thickness of 1150 Å while the following Compound A-1 was p-doped at a concentration of 1.5% to form a hole injection layer. On the hole injection layer, the following Compound HT-1 was vacuum-deposited to form a hole transport layer having a thickness of 800 Å. Then, on the hole transport layer, the following Compound EB-1 was vacuum-deposited to form an electron blocking layer having a thickness of 150 Å. Then, on the EB-1 deposited layer, the following Compound 1-1, Compound 2-1 and Compound Dp-7 were vacuum-deposited as hosts at a weight ratio of 49:49:2 to form a red light emitting layer having a thickness of 400 Å. On the light emitting layer, the following Compound HB-1 was vacuum-deposited to form a hole blocking layer having a thickness of 30 Å. On the hole blocking layer, the following Compound ET-1 and the following Compound LiQ were vacuum-deposited at a weight ratio of 2:1 to form an electron injection and transport layer having a thickness of 300 Å. On the electron injection and transport layer, lithium fluoride (LiF) and aluminum were sequentially deposited to a thickness of 12 Å and 1000 Å, respectively, to form a cathode.

HI-1

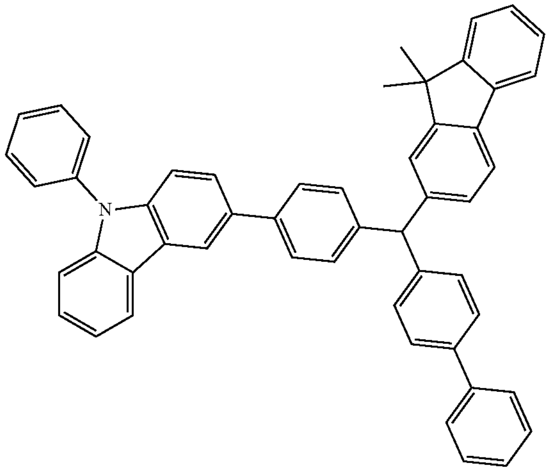

A-1

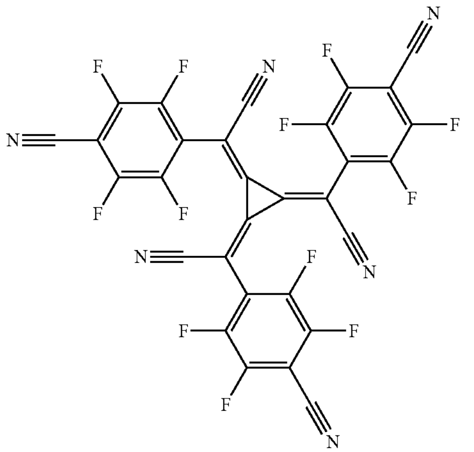

-continued

HT-1

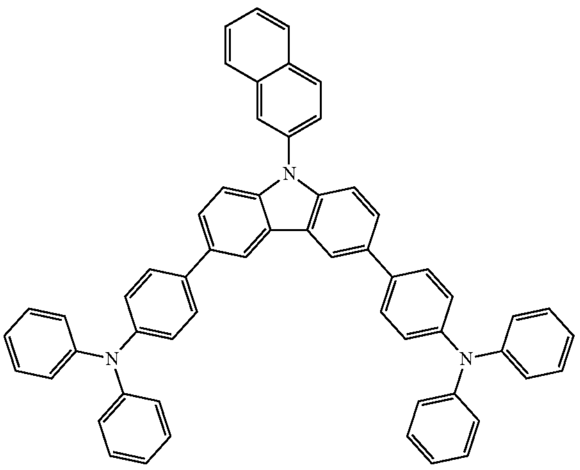

EB-1

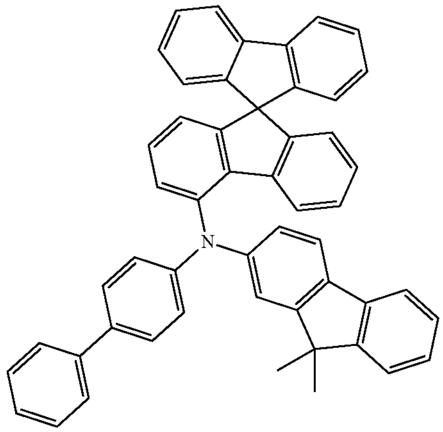

Dp-7

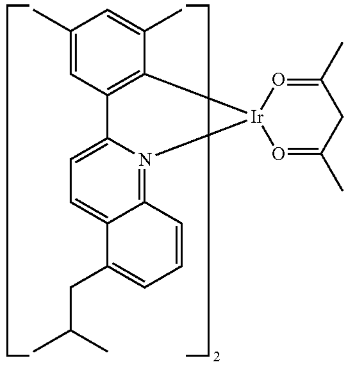

-continued

HHB-1

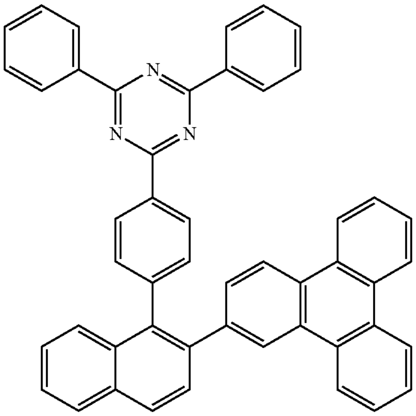

ET-1

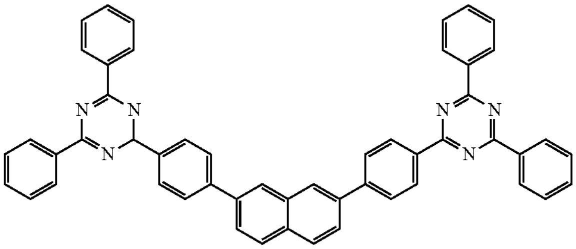

LiQ

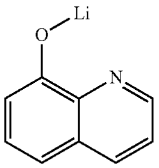

In the above process, the deposition rate of the organic material was maintained at 0.4 to 0.7 Å/sec, the deposition rate of lithium fluoride of the cathode was maintained at 0.3 Å/sec, and the deposition rate of aluminum was maintained at 2 Å/sec. In addition, the degree of vacuum during the deposition was maintained at $2\times10^{-7}$ to $5\times10^{-6}$ torr, thereby manufacturing an organic light emitting device.

Examples 2 to 220

An organic light emitting device was manufactured in the same manner as in Example 1, except that the first host and the second host listed in Table 1 were used by co-deposition at a weight ratio of 1:1.

Comparative Examples 1 to 60

An organic light emitting device was manufactured in the same manner as in Example 1, except that the first host and the second host listed in Table 2 were used by co-deposition at a weight ratio of 1:1.

B-1

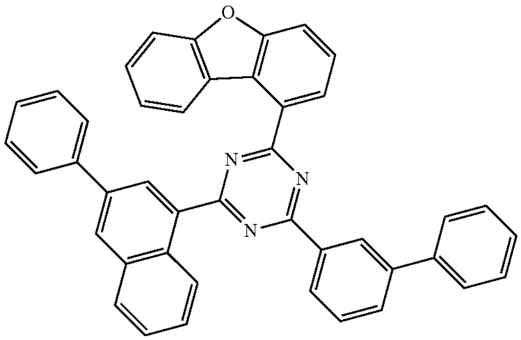

B-2

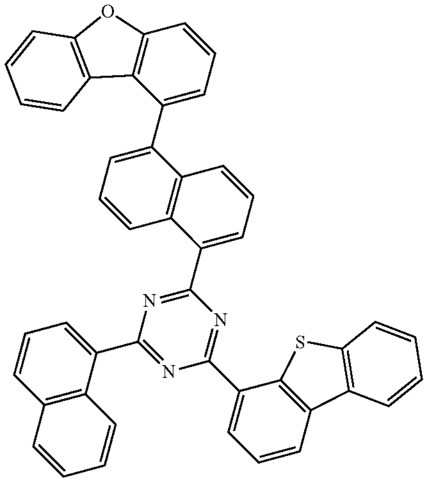

B-3

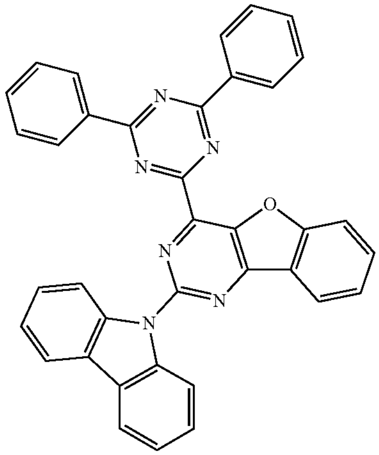

-continued
B-4
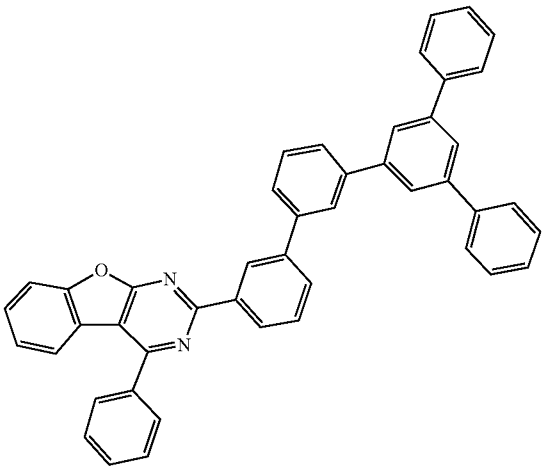
B-5
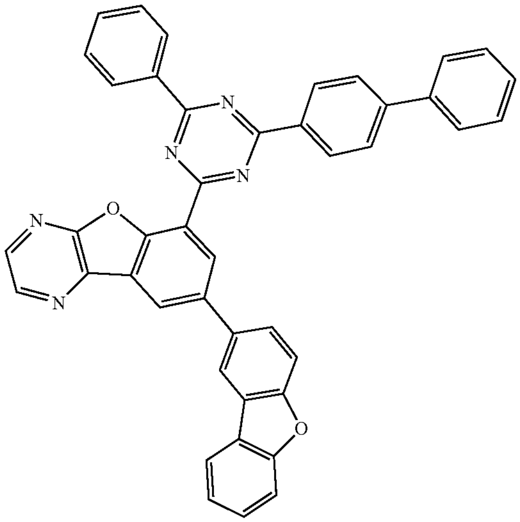
B-6
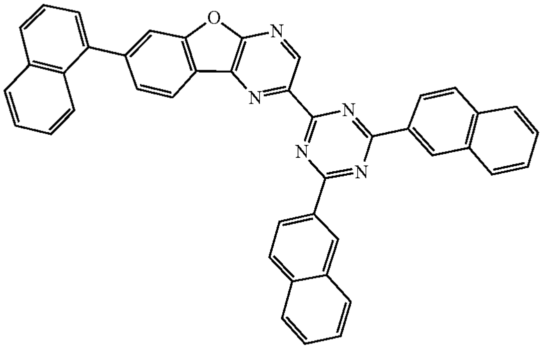
-continued
B-7
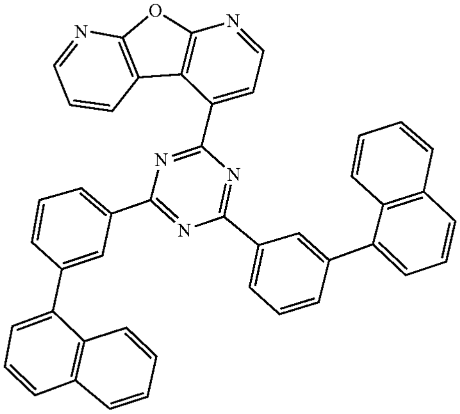
B-8
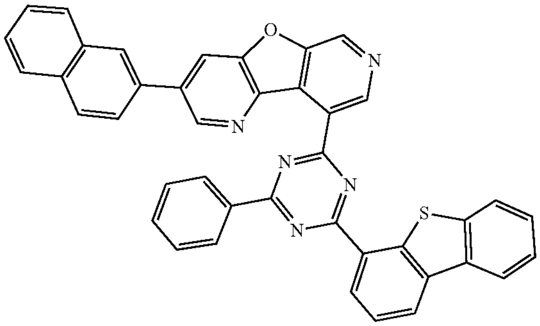
B-9
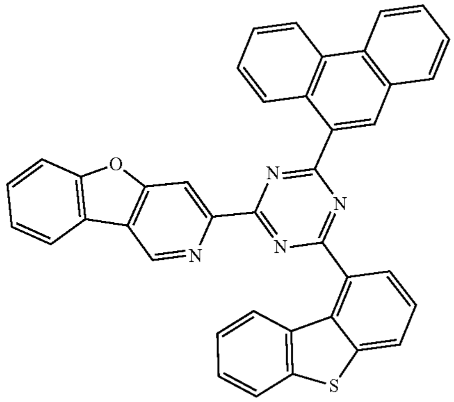
B-10
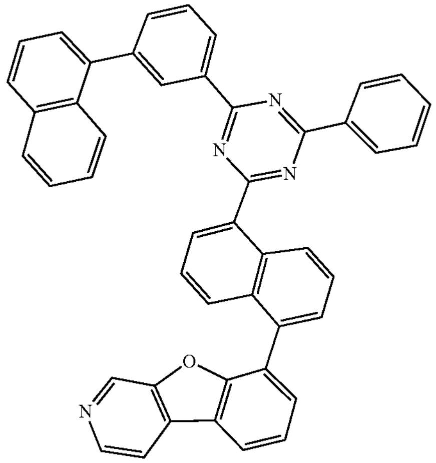

-continued

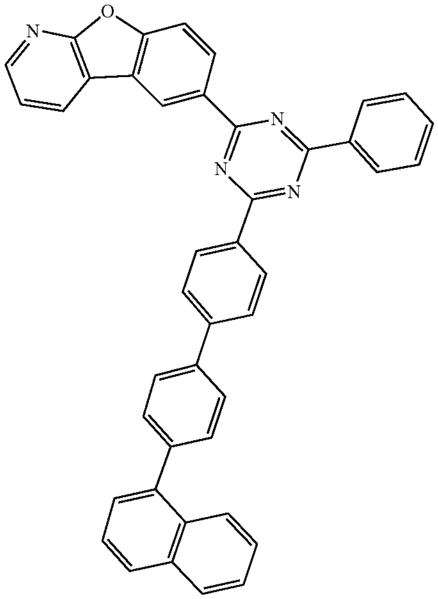

B-11

-continued

B-12

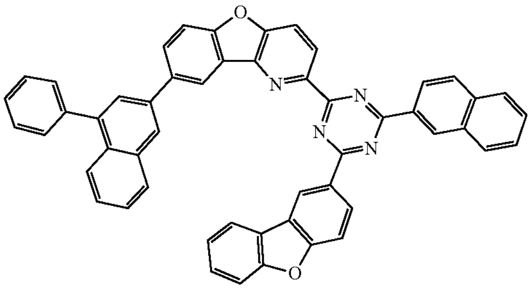

Experimental Examples

For the organic light emitting devices prepared in Examples 1 to 220 and Comparative Examples 1 to 60, the voltage, and efficiency were measured by applying a current (15 mA/cm$^2$), and the results are shown in Tables 1 and 2 below. The lifespan T95 means the time taken until the initial luminance (6,000 nit) decreases to 95%.

TABLE 1

| Category | First host | Second host | Driving voltage (V) | Efficiency (cd/A) | Lifespan T95 (hr) | Emission color |
|---|---|---|---|---|---|---|
| Example 1 | Compound 1-1 | Compound 2-1 | 3.67 | 22.14 | 234 | Red |
| Example 2 | | Compound 2-6 | 3.58 | 21.83 | 237 | Red |
| Example 3 | | Compound 2-11 | 3.62 | 21.86 | 221 | Red |
| Example 4 | | Compound 2-23 | 3.59 | 22.22 | 244 | Red |
| Example 5 | | Compound 2-34 | 3.66 | 22.22 | 244 | Red |
| Example 6 | Compound 1-2 | Compound 2-2 | 3.58 | 21.93 | 225 | Red |
| Example 7 | | Compound 2-14 | 3.65 | 21.59 | 246 | Red |
| Example 8 | | Compound 2-28 | 3.64 | 21.38 | 238 | Red |
| Example 9 | | Compound 2-37 | 3.62 | 22.15 | 243 | Red |
| Example 10 | | Compound 2-44 | 3.64 | 21.21 | 235 | Red |
| Example 11 | Compound 1-4 | Compound 2-3 | 3.61 | 23.30 | 224 | Red |
| Example 12 | | Compound 2-16 | 3.63 | 22.39 | 245 | Red |
| Example 13 | | Compound 2-29 | 3.64 | 23.20 | 232 | Red |
| Example 14 | | Compound 2-33 | 3.59 | 22.55 | 238 | Red |
| Example 15 | | Compound 2-41 | 3.60 | 22.70 | 241 | Red |
| Example 16 | Compound 1-5 | Compound 2-5 | 3.59 | 22.27 | 225 | Red |
| Example 17 | | Compound 2-18 | 3.62 | 23.03 | 238 | Red |
| Example 18 | | Compound 2-26 | 3.64 | 23.10 | 223 | Red |
| Example 19 | | Compound 2-36 | 3.59 | 22.73 | 227 | Red |
| Example 20 | | Compound 2-42 | 3.58 | 23.29 | 226 | Red |
| Example 21 | Compound 1-6 | Compound 2-4 | 3.66 | 22.28 | 233 | Red |

TABLE 1-continued

| Category | First host | Second host | Driving voltage (V) | Efficiency (cd/A) | Lifespan T95 (hr) | Emission color |
|---|---|---|---|---|---|---|
| Example 22 | | Compound 2-13 | 3.64 | 21.67 | 223 | Red |
| Example 23 | | Compound 2-20 | 3.61 | 22.00 | 227 | Red |
| Example 24 | | Compound 2-25 | 3.64 | 21.41 | 236 | Red |
| Example 25 | | Compound 2-43 | 3.65 | 21.33 | 236 | Red |
| Example 26 | Compound 1-7 | Compound 2-7 | 3.62 | 22.03 | 235 | Red |
| Example 27 | | Compound 2-19 | 3.59 | 21.78 | 238 | Red |
| Example 28 | | Compound 2-32 | 3.59 | 21.34 | 223 | Red |
| Example 29 | | Compound 2-40 | 3.62 | 21.80 | 228 | Red |
| Example 30 | | Compound 2-45 | 3.62 | 21.95 | 243 | Red |
| Example 31 | Compound 1-9 | Compound 2-8 | 3.53 | 22.72 | 255 | Red |
| Example 32 | | Compound 2-17 | 3.47 | 23.32 | 260 | Red |
| Example 33 | | Compound 2-22 | 3.54 | 23.12 | 266 | Red |
| Example 34 | | Compound 2-35 | 3.56 | 23.23 | 263 | Red |
| Example 35 | | Compound 2-46 | 3.54 | 23.16 | 255 | Red |
| Example 36 | Compound 1-11 | Compound 2-9 | 3.50 | 22.39 | 275 | Red |
| Example 37 | | Compound 2-15 | 3.54 | 22.71 | 258 | Red |
| Example 38 | | Compound 2-24 | 3.51 | 22.71 | 273 | Red |
| Example 39 | | Compound 2-31 | 3.54 | 23.28 | 257 | Red |
| Example 40 | | Compound 2-38 | 3.53 | 22.64 | 273 | Red |
| Example 41 | Compound 1-12 | Compound 2-2 | 3.62 | 22.99 | 223 | Red |
| Example 42 | | Compound 2-10 | 3.65 | 23.23 | 242 | Red |
| Example 43 | | Compound 2-21 | 3.64 | 22.43 | 224 | Red |
| Example 44 | | Compound 2-30 | 3.64 | 23.39 | 230 | Red |
| Example 45 | | Compound 2-43 | 3.59 | 23.39 | 222 | Red |
| Example 46 | Compound 1-14 | Compound 2-3 | 3.66 | 23.26 | 24 | Red |
| Example 47 | | Compound 2-12 | 3.60 | 22.16 | 235 | Red |
| Example 48 | | Compound 2-27 | 3.63 | 23.07 | 240 | Red |
| Example 49 | | Compound 2-39 | 3.66 | 22.19 | 237 | Red |
| Example 50 | | Compound 2-46 | 3.60 | 22.36 | 223 | Red |
| Example 51 | Compound 1-15 | Compound 2-1 | 3.67 | 21.43 | 194 | Red |
| Example 52 | | Compound 2-6 | 3.71 | 21.36 | 194 | Red |
| Example 53 | | Compound 2-11 | 3.72 | 21.44 | 211 | Red |
| Example 54 | | Compound 2-23 | 3.73 | 22.30 | 194 | Red |
| Example 55 | | Compound 2-34 | 3.69 | 21.81 | 211 | Red |
| Example 56 | Compound 1-17 | Compound 2-2 | 3.67 | 21.60 | 225 | Red |
| Example 57 | | Compound 2-14 | 3.59 | 21.62 | 227 | Red |
| Example 58 | | Compound 2-28 | 3.65 | 22.27 | 229 | Red |
| Example 59 | | Compound 2-37 | 3.58 | 21.22 | 229 | Red |

TABLE 1-continued

| Category | First host | Second host | Driving voltage (V) | Efficiency (cd/A) | Lifespan T95 (hr) | Emission color |
|---|---|---|---|---|---|---|
| Example 60 | | Compound 2-44 | 3.60 | 21.74 | 232 | Red |
| Example 61 | Compound 1-18 | Compound 2-3 | 3.65 | 22.29 | 228 | Red |
| Example 62 | | Compound 2-16 | 3.59 | 22.18 | 225 | Red |
| Example 63 | | Compound 2-29 | 3.60 | 22.14 | 224 | Red |
| Example 64 | | Compound 2-33 | 3.58 | 21.52 | 231 | Red |
| Example 65 | | Compound 2-41 | 3.63 | 21.88 | 224 | Red |
| Example 66 | Compound 1-19 | Compound 2-5 | 3.67 | 23.38 | 226 | Red |
| Example 67 | | Compound 2-18 | 3.63 | 23.01 | 236 | Red |
| Example 68 | | Compound 2-26 | 3.67 | 22.59 | 226 | Red |
| Example 69 | | Compound 2-36 | 3.65 | 22.92 | 23 | Red |
| Example 70 | | Compound 2-42 | 3.64 | 22.32 | 227 | Red |
| Example 71 | Compound 1-23 | Compound 2-4 | 3.61 | 22.20 | 234 | Red |
| Example 72 | | Compound 2-13 | 3.67 | 22.68 | 246 | Red |
| Example 73 | | Compound 2-20 | 3.65 | 23.28 | 241 | Red |
| Example 74 | | Compound 2-25 | 3.63 | 22.27 | 244 | Red |
| Example 75 | | Compound 2-43 | 3.60 | 22.45 | 232 | Red |
| Example 76 | Compound 1-24 | Compound 2-7 | 3.53 | 22.59 | 263 | Red |
| Example 77 | | Compound 2-19 | 3.55 | 22.37 | 256 | Red |
| Example 78 | | Compound 2-32 | 3.54 | 23.23 | 262 | Red |
| Example 79 | | Compound 2-40 | 3.61 | 23.28 | 273 | Red |
| Example 80 | | Compound 2-45 | 3.51 | 22.83 | 264 | Red |
| Example 81 | Compound 1-25 | Compound 2-8 | 3.52 | 22.58 | 253 | Red |
| Example 82 | | Compound 2-17 | 3.54 | 22.68 | 254 | Red |
| Example 83 | | Compound 2-22 | 3.54 | 22.34 | 268 | Red |
| Example 84 | | Compound 2-35 | 3.61 | 23.25 | 265 | Red |
| Example 85 | | Compound 2-46 | 3.61 | 23.24 | 258 | Red |
| Example 86 | Compound 1-26 | Compound 2-9 | 3.60 | 21.52 | 223 | Red |
| Example 87 | | Compound 2-15 | 3.60 | 21.60 | 223 | Red |
| Example 88 | | Compound 2-24 | 3.59 | 21.29 | 209 | Red |
| Example 89 | | Compound 2-31 | 3.61 | 21.39 | 224 | Red |
| Example 90 | | Compound 2-38 | 3.59 | 20.87 | 234 | Red |
| Example 91 | Compound 1-27 | Compound 2-2 | 3.67 | 22.74 | 254 | Red |
| Example 92 | | Compound 2-10 | 3.58 | 23.28 | 247 | Red |
| Example 93 | | Compound 2-21 | 3.62 | 22.46 | 242 | Red |
| Example 94 | | Compound 2-30 | 3.58 | 23.28 | 254 | Red |
| Example 95 | | Compound 2-43 | 3.61 | 23.15 | 246 | Red |
| Example 96 | Compound 1-29 | Compound 2-3 | 3.60 | 23.02 | 221 | Red |
| Example 97 | | Compound 2-12 | 3.60 | 23.38 | 244 | Red |

TABLE 1-continued

| Category | First host | Second host | Driving voltage (V) | Efficiency (cd/A) | Lifespan T95 (hr) | Emission color |
|---|---|---|---|---|---|---|
| Example 98 | | Compound 2-27 | 3.59 | 23.26 | 227 | Red |
| Example 99 | | Compound 2-39 | 3.61 | 22.16 | 223 | Red |
| Example 100 | | Compound 2-46 | 3.59 | 22.27 | 235 | Red |
| Example 101 | Compound 1-31 | Compound 2-1 | 3.67 | 23.33 | 236 | Red |
| Example 102 | | Compound 2-6 | 3.58 | 22.97 | 246 | Red |
| Example 103 | | Compound 2-11 | 3.62 | 22.51 | 224 | Red |
| Example 104 | | Compound 2-23 | 3.58 | 22.20 | 233 | Red |
| Example 105 | | Compound 2-34 | 3.61 | 22.72 | 246 | Red |
| Example 106 | Compound 1-32 | Compound 2-2 | 3.62 | 21.34 | 224 | Red |
| Example 107 | | Compound 2-14 | 3.64 | 21.21 | 221 | Red |
| Example 108 | | Compound 2-28 | 3.65 | 21.21 | 230 | Red |
| Example 109 | | Compound 2-37 | 3.60 | 21.20 | 243 | Red |
| Example 110 | | Compound 2-44 | 3.58 | 21.62 | 232 | Red |
| Example 111 | Compound 1-33 | Compound 2-3 | 3.66 | 21.75 | 235 | Red |
| Example 112 | | Compound 2-16 | 3.58 | 22.01 | 226 | Red |
| Example 113 | | Compound 2-29 | 3.61 | 21.54 | 246 | Red |
| Example 114 | | Compound 2-33 | 3.60 | 21.60 | 241 | Red |
| Example 115 | | Compound 2-41 | 3.64 | 21.89 | 237 | Red |
| Example 116 | Compound 1-34 | Compound 2-5 | 3.54 | 22.57 | 267 | Red |
| Example 117 | | Compound 2-18 | 3.55 | 22.89 | 259 | Red |
| Example 118 | | Compound 2-26 | 3.54 | 22.92 | 268 | Red |
| Example 119 | | Compound 2-36 | 3.61 | 23.15 | 270 | Red |
| Example 120 | | Compound 2-42 | 3.53 | 23.30 | 264 | Red |
| Example 121 | Compound 1-35 | Compound 2-4 | 3.54 | 23.12 | 262 | Red |
| Example 122 | | Compound 2-13 | 3.51 | 22.78 | 276 | Red |
| Example 123 | | Compound 2-20 | 3.47 | 22.94 | 268 | Red |
| Example 124 | | Compound 2-25 | 3.52 | 22.66 | 260 | Red |
| Example 125 | | Compound 2-43 | 3.60 | 23.19 | 263 | Red |
| Example 126 | Compound 1-36 | Compound 2-7 | 3.60 | 23.35 | 235 | Red |
| Example 127 | | Compound 2-19 | 3.62 | 22.28 | 221 | Red |
| Example 128 | | Compound 2-32 | 3.60 | 22.74 | 225 | Red |
| Example 129 | | Compound 2-40 | 3.59 | 22.90 | 237 | Red |
| Example 130 | | Compound 2-45 | 3.62 | 23.07 | 240 | Red |
| Example 131 | Compound 1-38 | Compound 2-8 | 3.66 | 22.45 | 238 | Red |
| Example 132 | | Compound 2-17 | 3.62 | 23.22 | 244 | Red |
| Example 133 | | Compound 2-22 | 3.61 | 23.11 | 226 | Red |
| Example 134 | | Compound 2-35 | 3.67 | 22.15 | 226 | Red |
| Example 135 | | Compound 2-46 | 3.60 | 22.56 | 229 | Red |

TABLE 1-continued

| Category | First host | Second host | Driving voltage (V) | Efficiency (cd/A) | Lifespan T95 (hr) | Emission color |
|---|---|---|---|---|---|---|
| Example 136 | Compound 1-39 | Compound 2-9 | 3.53 | 23.35 | 257 | Red |
| Example 137 | | Compound 2-15 | 3.57 | 23.34 | 276 | Red |
| Example 138 | | Compound 2-24 | 3.59 | 22.18 | 263 | Red |
| Example 139 | | Compound 2-31 | 3.54 | 22.58 | 269 | Red |
| Example 140 | | Compound 2-38 | 3.61 | 22.52 | 256 | Red |
| Example 141 | Compound 1-40 | Compound 2-2 | 3.50 | 23.27 | 275 | Red |
| Example 142 | | Compound 2-10 | 3.51 | 22.70 | 272 | Red |
| Example 143 | | Compound 2-21 | 3.59 | 22.26 | 272 | Red |
| Example 144 | | Compound 2-30 | 3.47 | 22.46 | 255 | Red |
| Example 145 | | Compound 2-43 | 3.53 | 22.51 | 276 | Red |
| Example 146 | Compound 1-42 | Compound 2-3 | 3.32 | 23.31 | 277 | Red |
| Example 147 | | Compound 2-12 | 3.39 | 23.38 | 292 | Red |
| Example 148 | | Compound 2-27 | 3.48 | 23.79 | 274 | Red |
| Example 149 | | Compound 2-39 | 3.35 | 23.53 | 299 | Red |
| Example 150 | | Compound 2-46 | 3.42 | 24.06 | 284 | Red |
| Example 151 | Compound 1-43 | Compound 2-1 | 3.39 | 23.32 | 282 | Red |
| Example 152 | | Compound 2-6 | 3.49 | 23.63 | 304 | Red |
| Example 153 | | Compound 2-11 | 3.41 | 24.26 | 295 | Red |
| Example 154 | | Compound 2-23 | 3.35 | 24.37 | 279 | Red |
| Example 155 | | Compound 2-34 | 3.40 | 24.53 | 287 | Red |
| Example 156 | Compound 1-44 | Compound 2-2 | 3.54 | 22.79 | 270 | Red |
| Example 157 | | Compound 2-14 | 3.53 | 23.32 | 276 | Red |
| Example 158 | | Compound 2-28 | 3.55 | 22.79 | 264 | Red |
| Example 159 | | Compound 2-37 | 3.51 | 22.38 | 260 | Red |
| Example 160 | | Compound 2-44 | 3.50 | 23.24 | 256 | Red |
| Example 161 | Compound 1-47 | Compound 2-3 | 3.59 | 23.17 | 257 | Red |
| Example 162 | | Compound 2-16 | 3.48 | 22.50 | 262 | Red |
| Example 163 | | Compound 2-29 | 3.55 | 22.70 | 265 | Red |
| Example 164 | | Compound 2-33 | 3.49 | 22.25 | 268 | Red |
| Example 165 | | Compound 2-41 | 3.53 | 23.13 | 269 | Rec |
| Example 166 | Compound 1-48 | Compound 2-5 | 3.36 | 23.64 | 306 | Red |
| Example 167 | | Compound 2-18 | 3.48 | 24.60 | 292 | Red |
| Example 168 | | Compound 2-26 | 3.49 | 23.94 | 303 | Red |
| Example 169 | | Compound 2-36 | 3.47 | 23.26 | 300 | Red |
| Example 170 | | Compound 2-42 | 3.35 | 24.41 | 280 | Red |
| Example 171 | Compound 1-49 | Compound 2-4 | 3.34 | 23.95 | 295 | Red |
| Example 172 | | Compound 2-13 | 3.39 | 23.69 | 30 | Red |
| Example 173 | | Compound 2-20 | 3.35 | 23.63 | 305 | Red |

TABLE 1-continued

| Category | First host | Second host | Driving voltage (V) | Efficiency (cd/A) | Lifespan T95 (hr) | Emission color |
|---|---|---|---|---|---|---|
| Example 174 | | Compound 2-25 | 3.46 | 23.66 | 305 | Red |
| Example 175 | | Compound 2-43 | 3.44 | 23.74 | 275 | Red |
| Example 176 | Compound 1-50 | Compound 2-7 | 3.47 | 22.83 | 270 | Red |
| Example 177 | | Compound 2-19 | 3.52 | 22.23 | 259 | Red |
| Example 178 | | Compound 2-32 | 3.48 | 23.10 | 267 | Red |
| Example 179 | | Compound 2-40 | 3.49 | 22.67 | 266 | Red |
| Example 180 | | Compound 2-45 | 3.58 | 22.16 | 265 | Red |
| Example 181 | Compound 1-51 | Compound 2-8 | 3.54 | 22.53 | 269 | Red |
| Example 182 | | Compound 2-17 | 3.59 | 22.12 | 261 | Red |
| Example 183 | | Compound 2-22 | 3.60 | 22.18 | 268 | Red |
| Example 184 | | Compound 2-35 | 3.51 | 22.42 | 254 | Red |
| Example 185 | | Compound 2-46 | 3.48 | 22.38 | 257 | Red |
| Example 186 | Compound 1-52 | Compound 2-9 | 3.58 | 22.19 | 225 | Red |
| Example 187 | | Compound 2-15 | 3.58 | 23.15 | 233 | Red |
| Example 188 | | Compound 2-24 | 3.67 | 22.38 | 240 | Red |
| Example 189 | | Compound 2-31 | 3.61 | 22.44 | 233 | Red |
| Example 190 | | Compound 2-38 | 3.66 | 22.27 | 223 | Red |
| Example 191 | Compound 1-54 | Compound 2-2 | 3.62 | 22.63 | 225 | Red |
| Example 192 | | Compound 2-10 | 3.60 | 22.97 | 227 | Red |
| Example 193 | | Compound 2-21 | 3.58 | 22.71 | 232 | Red |
| Example 194 | | Compound 2-30 | 3.60 | 22.20 | 231 | Red |
| Example 195 | | Compound 2-43 | 3.61 | 22.33 | 244 | Red |
| Example 196 | Compound 1-55 | Compound 2-3 | 3.73 | 21.49 | 196 | Red |
| Example 197 | | Compound 2-12 | 3.65 | 22.26 | 202 | Red |
| Example 198 | | Compound 2-27 | 3.66 | 22.11 | 205 | Red |
| Example 199 | | Compound 2-39 | 3.68 | 21.76 | 216 | Red |
| Example 200 | | Compound 2-46 | 3.68 | 21.99 | 198 | Red |
| Example 201 | Compound 1-54 | Compound 2-1 | 3.70 | 21.77 | 205 | Red |
| Example 202 | | Compound 2-6 | 3.72 | 21.59 | 193 | Red |
| Example 203 | | Compound 2-11 | 3.73 | 22.10 | 204 | Red |
| Example 204 | | Compound 2-23 | 3.73 | 21.29 | 201 | Red |
| Example 205 | | Compound 2-34 | 3.68 | 21.71 | 201 | Red |
| Example 206 | Compound 1-56 | Compound 2-2 | 3.67 | 21.55 | 230 | Red |
| Example 207 | | Compound 2-14 | 3.63 | 21.31 | 245 | Red |
| Example 208 | | Compound 2-28 | 3.66 | 22.24 | 230 | Red |
| Example 209 | | Compound 2-37 | 3.67 | 21.42 | 221 | Red |
| Example 210 | | Compound 2-44 | 3.59 | 21.25 | 245 | Red |
| Example 211 | Compound 1-57 | Compound 2-3 | 3.59 | 21.22 | 241 | Red |

TABLE 1-continued

| Category | First host | Second host | Driving voltage (V) | Efficiency (cd/A) | Lifespan T95 (hr) | Emission color |
|---|---|---|---|---|---|---|
| Example 212 | | Compound 2-16 | 3.64 | 21.27 | 237 | Red |
| Example 213 | | Compound 2-29 | 3.67 | 22.27 | 226 | Red |
| Example 214 | | Compound 2-33 | 3.60 | 22.00 | 226 | Red |
| Example 215 | | Compound 2-41 | 3.62 | 21.57 | 231 | Red |
| Example 216 | Compound 1-59 | Compound 2-5 | 3.66 | 21.20 | 203 | Red |
| Example 217 | | Compound 2-18 | 3.67 | 21.29 | 193 | Red |
| Example 218 | | Compound 2-26 | 3.69 | 21.54 | 213 | Red |
| Example 219 | | Compound 2-36 | 3.65 | 22.04 | 201 | Red |
| Example 220 | | Compound 2-42 | 3.72 | 21.69 | 211 | Red |

TABLE 2

| Category | First host | Second host | Driving voltage (V) | Efficiency (cd/A) | Lifespan T95 (hr) | Emission color |
|---|---|---|---|---|---|---|
| Comparative Example 1 | Compound B-1 | Compound 2-1 | 3.88 | 18.69 | 167 | Red |
| Comparative Example 2 | | Compound 2-6 | 3.86 | 19.14 | 165 | Red |
| Comparative Example 3 | | Compound 2-11 | 3.89 | 18.81 | 156 | Red |
| Comparative Example 4 | | Compound 2-23 | 3.89 | 18.86 | 156 | Red |
| Comparative Example 5 | | Compound 2-34 | 3.84 | 19.13 | 161 | Red |
| Comparative Example 6 | Compound B-2 | Compound 2-2 | 3.83 | 17.18 | 162 | Red |
| Comparative Example 7 | | Compound 2-14 | 3.87 | 17.48 | 157 | Red |
| Comparative Example 8 | | Compound 2-28 | 3.91 | 17.84 | 154 | Red |
| Comparative Example 9 | | Compound 2-37 | 3.86 | 17.69 | 155 | Red |
| Comparative Example 10 | | Compound 2-44 | 3.84 | 17.47 | 160 | Red |
| Comparative Example 11 | Compound B-3 | Compound 2-3 | 3.87 | 18.93 | 168 | Red |
| Comparative Example 12 | | Compound 2-16 | 3.90 | 18.99 | 152 | Red |
| Comparative Example 13 | | Compound 2-29 | 3.84 | 18.66 | 159 | Red |
| Comparative Example 14 | | Compound 2-33 | 3.86 | 18.65 | 154 | Red |
| Comparative Example 15 | | Compound 2-41 | 3.83 | 19.17 | 153 | Red |
| Comparative Example 16 | Compound B-4 | Compound 2-5 | 3.92 | 17.10 | 141 | Red |
| Comparative Example 17 | | Compound 2-18 | 3.87 | 17.29 | 122 | Red |
| Comparative Example 18 | | Compound 2-26 | 3.92 | 18.10 | 107 | Red |
| Comparative Example 19 | | Compound 2-36 | 3.87 | 17.96 | 156 | Red |
| Comparative Example 20 | | Compound 2-42 | 3.90 | 17.17 | 116 | Red |
| Comparative Example 21 | Compound B-5 | Compound 2-9 | 3.98 | 17.98 | 110 | Red |
| Comparative Example 22 | | Compound 2-13 | 3.90 | 17.48 | 124 | Red |
| Comparative Example 23 | | Compound 2-20 | 3.81 | 18.05 | 129 | Red |
| Comparative Example 24 | | Compound 2-25 | 3.86 | 17.68 | 137 | Red |

TABLE 2-continued

| Category | First host | Second host | Driving voltage (V) | Efficiency (cd/A) | Lifespan T95 (hr) | Emission color |
|---|---|---|---|---|---|---|
| Comparative Example 25 | | Compound 2-43 | 3.81 | 17.93 | 153 | Red |
| Comparative Example 26 | Compound B-6 | Compound 2-7 | 4.18 | 16.59 | 91 | Red |
| Comparative Example 27 | | Compound 2-19 | 4.14 | 16.55 | 81 | Red |
| Comparative Example 28 | | Compound 2-32 | 4.14 | 15.70 | 86 | Red |
| Comparative Example 29 | | Compound 2-40 | 4.23 | 15.64 | 82 | Red |
| Comparative Example 30 | | Compound 2-45 | 4.23 | 16.42 | 87 | Red |
| Comparative Example 31 | Compound B-7 | Compound 2-8 | 3.92 | 18.04 | 149 | Red |
| Comparative Example 32 | | Compound 2-17 | 3.85 | 17.23 | 153 | Red |
| Comparative Example 33 | | Compound 2-22 | 3.88 | 17.59 | 154 | Red |
| Comparative Example 34 | | Compound 2-35 | 3.82 | 17.88 | 144 | Red |
| Comparative Example 35 | | Compound 2-46 | 3.82 | 17.67 | 109 | Red |
| Comparative Example 36 | Compound B-8 | Compound 2-9 | 4.12 | 15.88 | 123 | Red |
| Comparative Example 37 | | Compound 2-15 | 4.02 | 16.10 | 113 | Red |
| Comparative Example 38 | | Compound 2-24 | 4.01 | 16.26 | 108 | Red |
| Comparative Example 39 | | Compound 2-31 | 4.02 | 16.35 | 110 | Red |
| Comparative Example 40 | | Compound 2-38 | 4.06 | 15.32 | 119 | Red |
| Comparative Example 41 | Compound B-9 | Compound 2-2 | 4.02 | 16.78 | 149 | Red |
| Comparative Example 42 | | Compound 2-10 | 4.08 | 16.48 | 162 | Red |
| Comparative Example 43 | | Compound 2-21 | 4.09 | 16.95 | 153 | Red |
| Comparative Example 44 | | Compound 2-30 | 4.04 | 16.93 | 166 | Red |
| Comparative Example 45 | | Compound 2-43 | 4.07 | 16.70 | 167 | Red |
| Comparative Example 46 | Compound B-10 | Compound 2-3 | 4.14 | 15.15 | 86 | Red |
| Comparative Example 47 | | Compound 2-12 | 4.16 | 15.61 | 76 | Red |
| Comparative Example 48 | | Compound 2-27 | 4.21 | 15.16 | 76 | Red |
| Comparative Example 49 | | Compound 2-39 | 4.14 | 15.21 | 76 | Red |
| Comparative Example 50 | | Compound 2-46 | 4.18 | 16.40 | 85 | Red |
| Comparative Example 51 | Compound B-11 | Compound 2-1 | 3.95 | 17.62 | 160 | Red |
| Comparative Example 52 | | Compound 2-6 | 3.90 | 17.82 | 107 | Red |
| Comparative Example 53 | | Compound 2-11 | 3.91 | 17.54 | 124 | Red |
| Comparative Example 54 | | Compound 2-23 | 3.82 | 17.54 | 135 | Red |
| Comparative Example 55 | | Compound 2-34 | 3.92 | 17.52 | 148 | Red |
| Comparative Example 56 | Compound B-12 | Compound 2-2 | 4.16 | 16.00 | 86 | Red |
| Comparative Example 57 | | Compound 2-14 | 4.18 | 15.98 | 88 | Red |
| Comparative Example 58 | | Compound 2-28 | 4.13 | 15.74 | 74 | Red |
| Comparative Example 59 | | Compound 2-37 | 4.13 | 16.20 | 80 | Red |
| Comparative Example 60 | | Compound 2-44 | 4.18 | 16.52 | 85 | Red |

Referring to Tables 1 and 2, it can be confirmed in Examples 1 to 220 using the compound of Chemical Formula 1 and the compound of Chemical Formula 2 as co-hosts that the driving voltage is low and the efficiency and lifespan are improved compared to Comparative Examples 1 to 60. From this, it can be confirmed that the combination of the compound of Chemical Formula 1 and the compound of Chemical Formula 2 is effective in transferring energy to the dopant in the light emitting layer.

| [DESCRIPTION OF SYMBOLS] | |
|---|---|
| 1: Substrate | 2: Anode |
| 3: Light emitting layer | 4: Cathode |
| 5: Hole injection layer | 6: Hole transport layer |
| 7: Electron transport layer | 8: Electron injection layer |
| 9: Electron blocking layer | 10: Hole blocking layer |
| 11: Electron injection and transport layer | |

The invention claimed is:

1. An organic light emitting device comprising:

an anode;

a cathode; and a light emitting layer between the anode and the cathode, wherein the light emitting layer comprises a compound of the following Chemical Formula 1 and a compound of the following Chemical Formula 2:

[Chemical Formula 1]

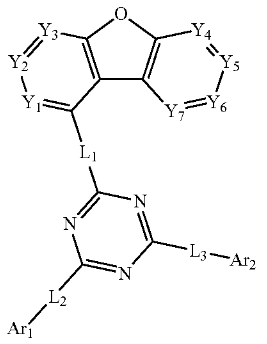

wherein in Chemical Formula 1:

any one of $Y_1$ to $Y_7$ is N, and the others are CR;

each R is independently hydrogen, deuterium, a substituted or unsubstituted $C_{6-60}$ aryl, or a substituted or unsubstituted $C_{2-60}$ heteroaryl containing at least one heteroatom selected from the group consisting of N, O and S;

$L_1$ to $L_3$ are each independently a single bond, a substituted or unsubstituted $C_{6-60}$ arylene, or an unsubstituted $C_{2-60}$ heteroarylene containing at least one heteroatom selected from the group consisting of N, O and S; and $Ar_1$ and $Ar_2$ are each independently a substituted or unsubstituted $C_{6-60}$ aryl or a substituted or unsubstituted $C_{2-60}$ heteroaryl containing at least one heteroatom selected from the group consisting of N, O and S;

[Chemical Formula 2]

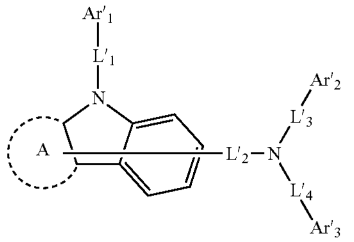

wherein in Chemical Formula 2:

A is fused with an adjacent pentagonal ring and is a benzene ring that is unsubstituted or substituted with deuterium, or a naphthalene ring that is unsubstituted or substituted with deuterium;

$L'_1$ to $L'_4$ are each independently a single bond, a substituted or unsubstituted $C_{6-60}$ arylene, or an unsubstituted $C_{2-60}$ heteroarylene containing at least one heteroatom selected from the group consisting of N, O and S; and $Ar'_1$ to $Ar'_3$ are each independently a substituted or unsubstituted $C_{6-60}$ aryl or a substituted or unsubstituted $C_{2-60}$ heteroaryl containing at least one heteroatom selected from the group consisting of N, O and S.

2. The organic light emitting device of claim 1, wherein each R is independently hydrogen, deuterium, phenyl, biphenylyl, naphthyl, (phenyl)naphthyl, (naphthyl)phenyl, phenanthrenyl, chrysenyl, benzophenanthrenyl, triphenylenyl, carbazoyl, fluoranthenyl, benzocarbazolyl, dibenzofuranyl, dibenzothiophenyl, benzonaphthofuranyl, or benzonaphthothiophenyl; and R, which is not hydrogen or deuterium, is unsubstituted or substituted with at least one deuterium.

3. The organic light emitting device of claim 1, wherein $L_1$ to $L_3$ are each independently a single bond or any one selected from the group consisting of:

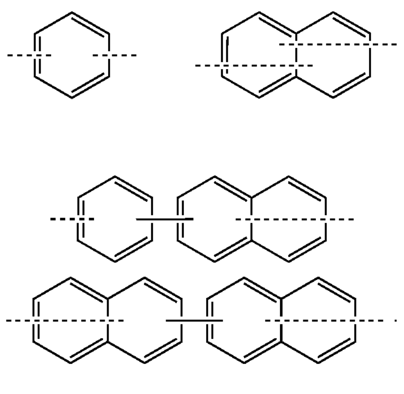

4. The organic light emitting device of claim 1, wherein $Ar_1$ and $Ar_2$ are each independently phenyl, biphenylyl, terphenylyl, naphthyl, phenanthrenyl, fluoranthenyl, chrysenyl, benzophenanthrenyl, dibenzofuranyl, or dibenzothiophenyl; and $Ar_1$ and $Ar_2$ are each independently unsubstituted or substituted with at least one deuterium.

5. The organic light emitting device of claim 1, wherein the compound of Chemical Formula 1 is any one compound selected from the group consisting of:
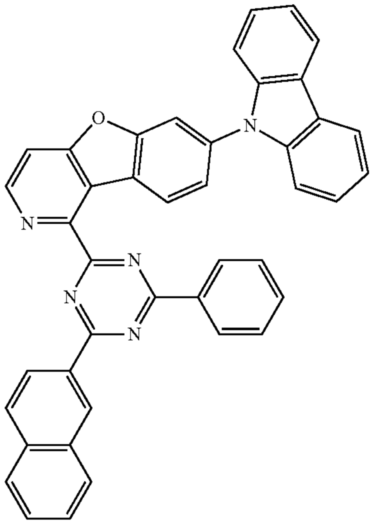
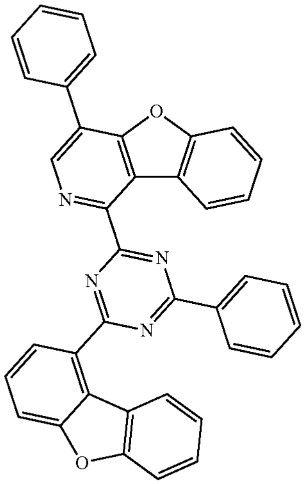
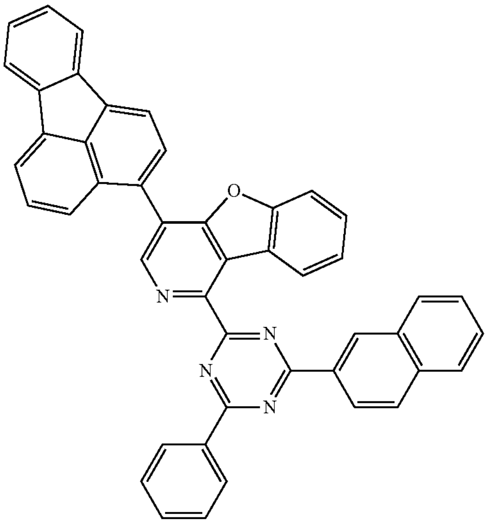
-continued
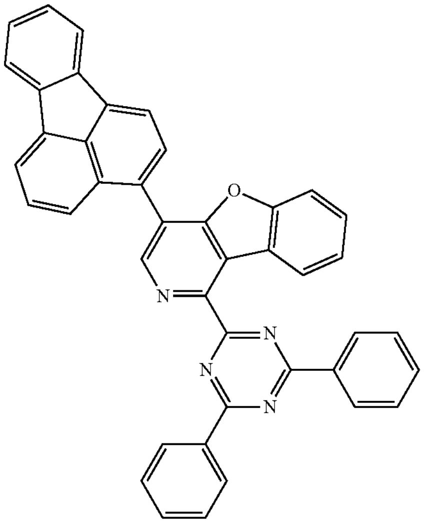
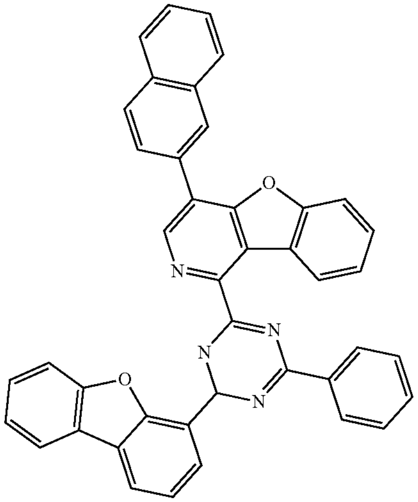
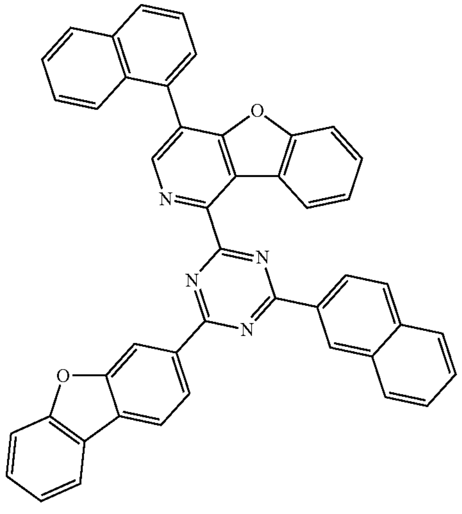

-continued
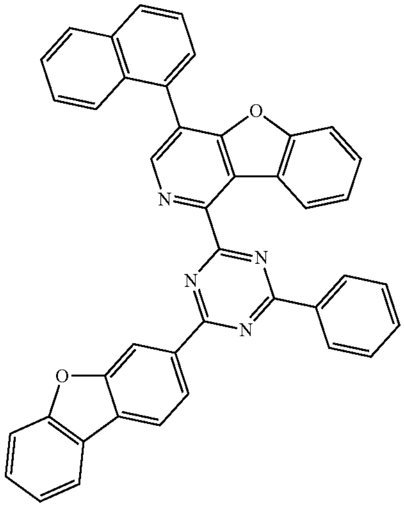
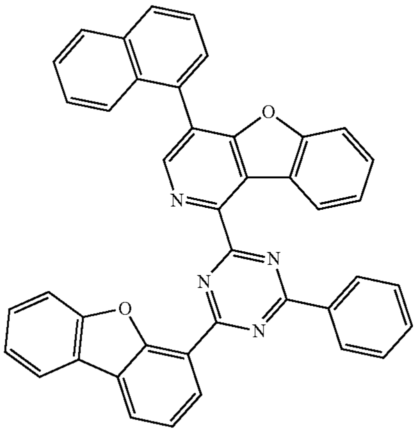
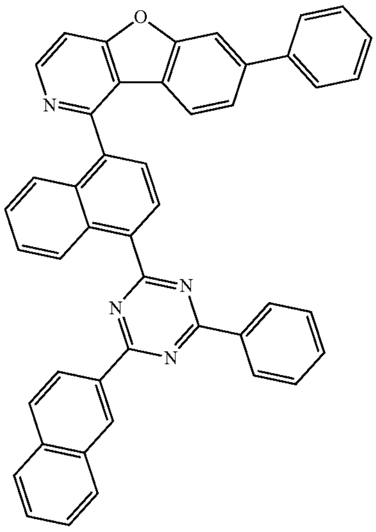
-continued
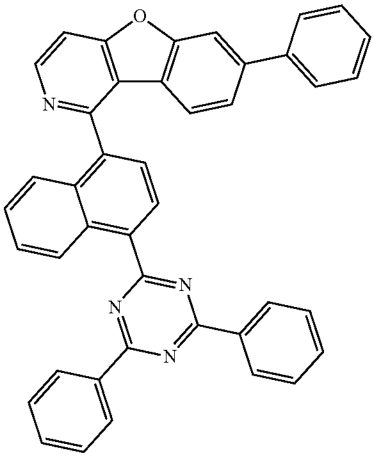
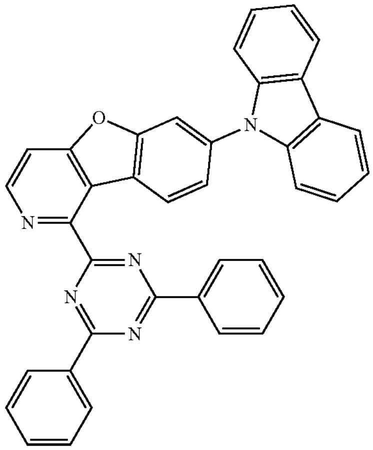
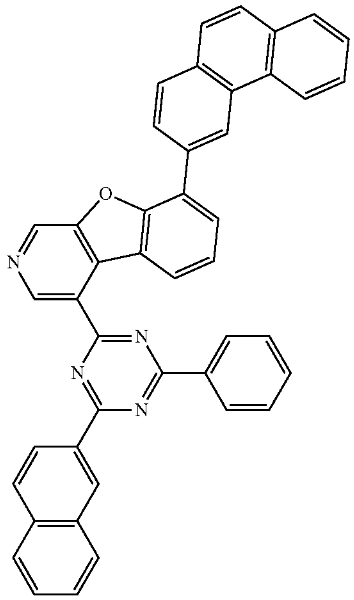

-continued
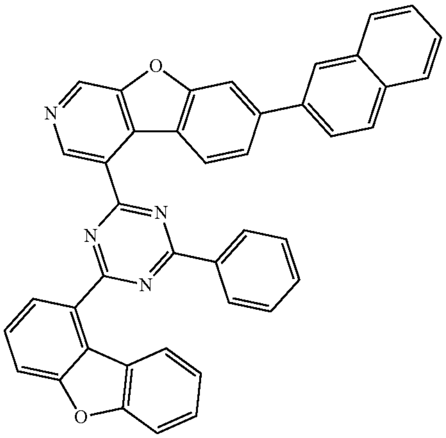
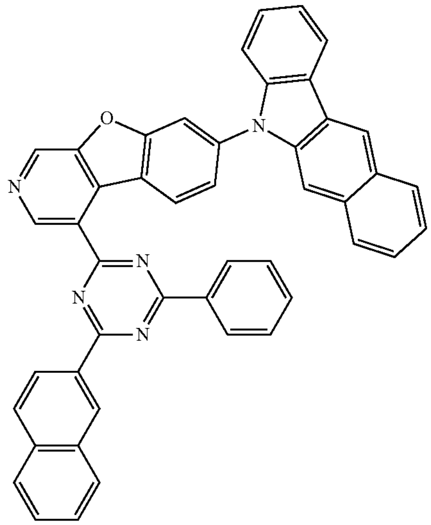
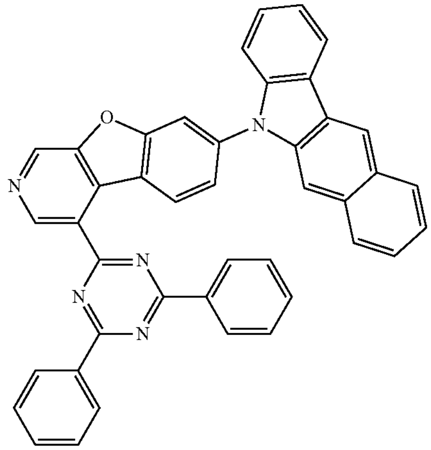
-continued
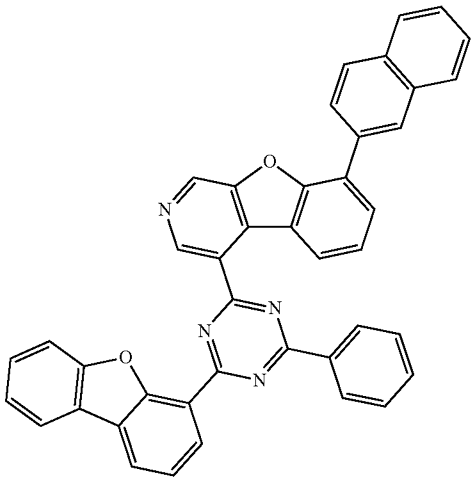
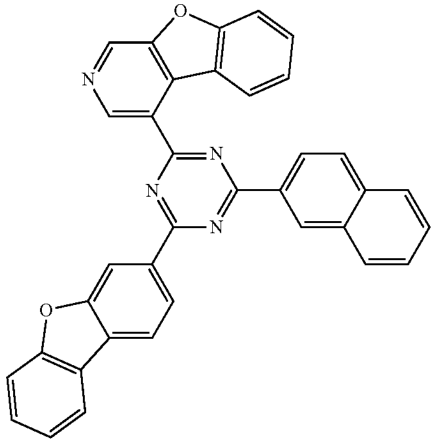
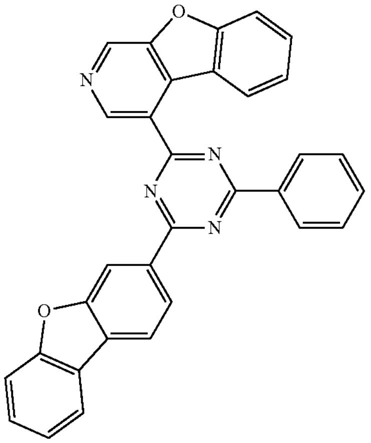
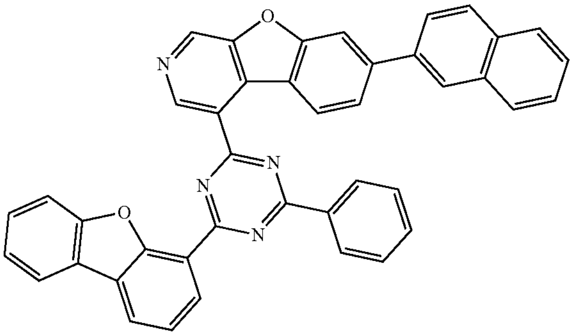

-continued
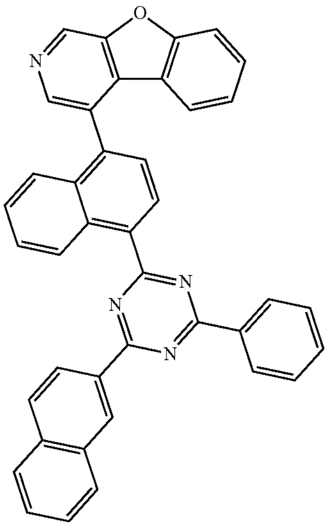
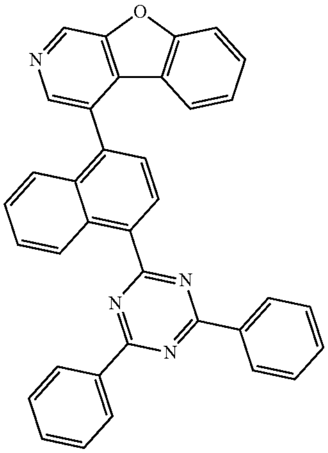
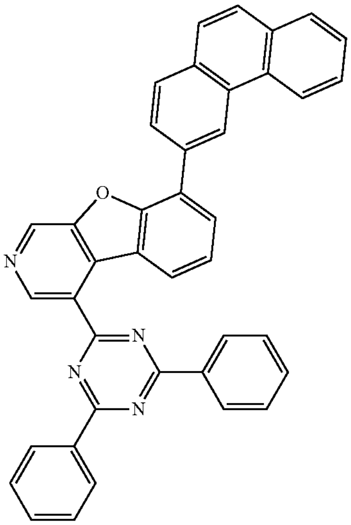
-continued
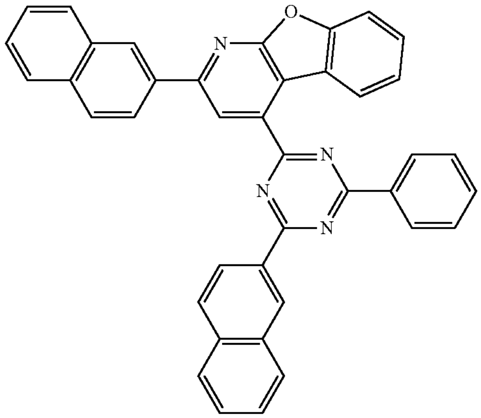
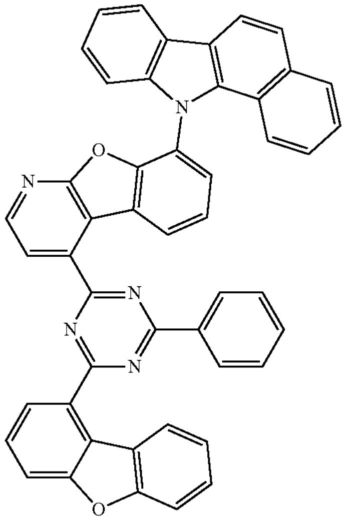
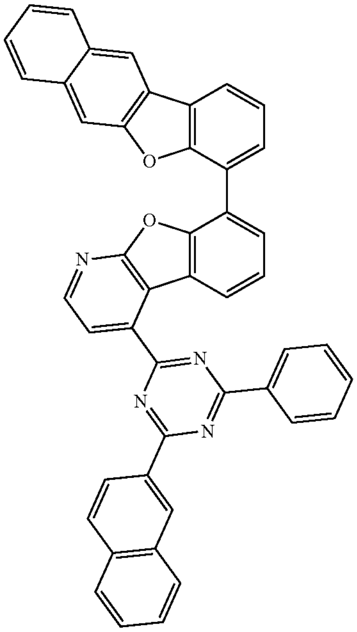

-continued
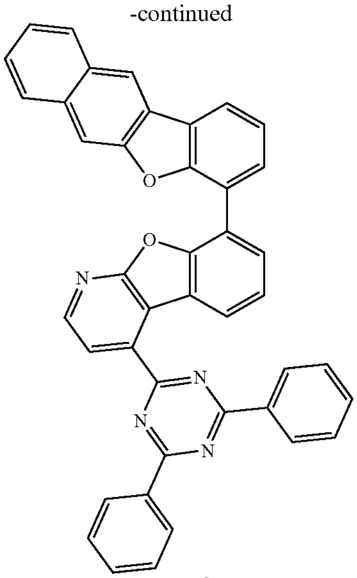
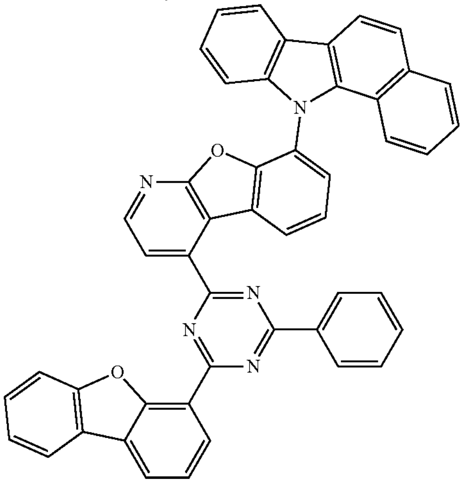
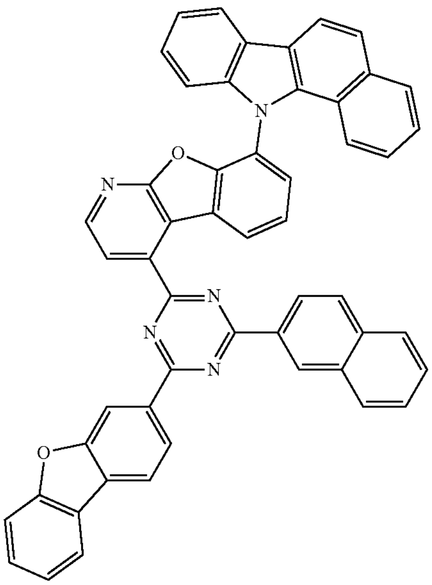
-continued
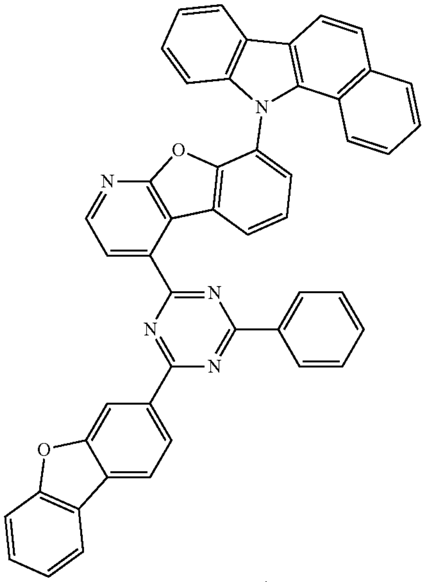
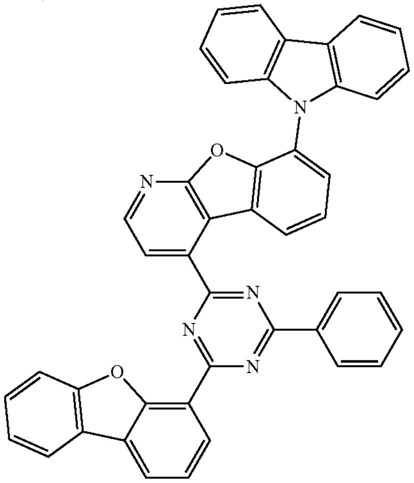
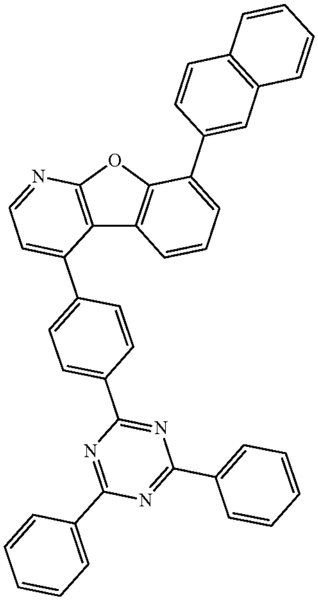

-continued
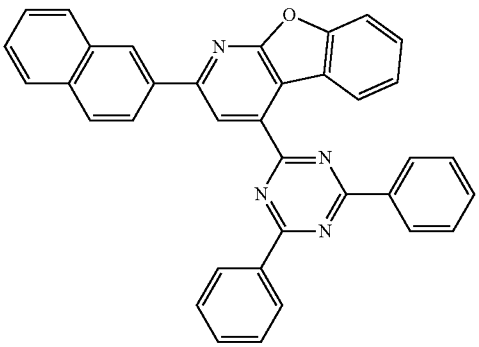
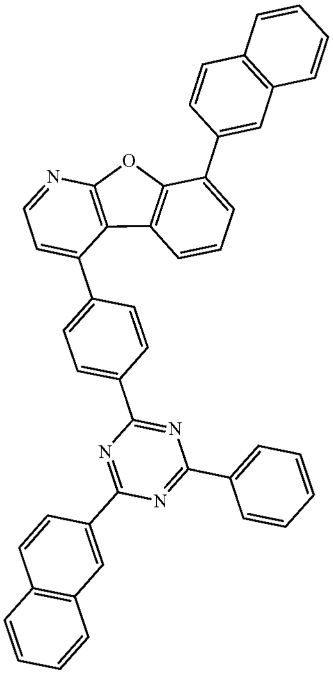
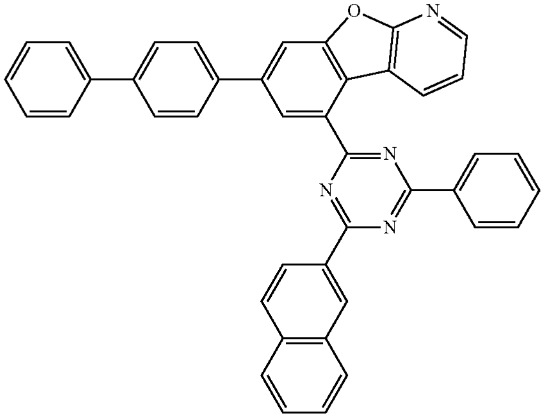
-continued
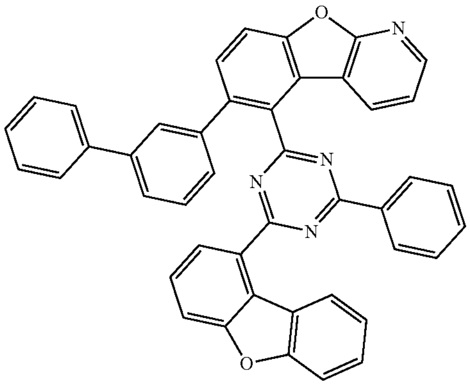
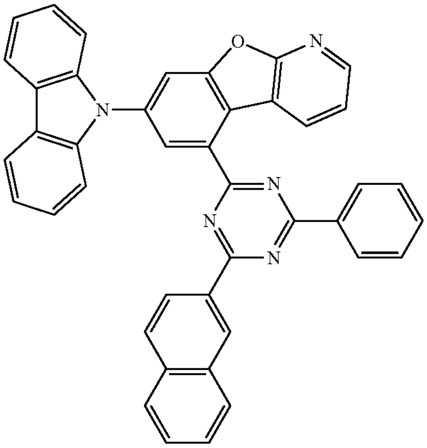
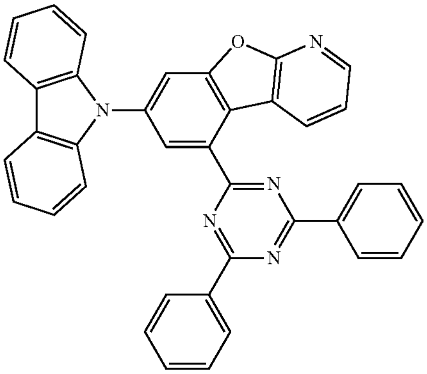
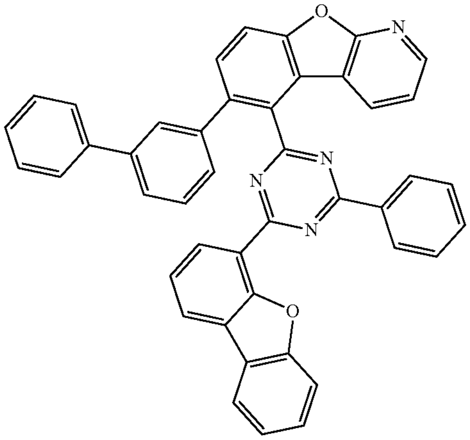

-continued
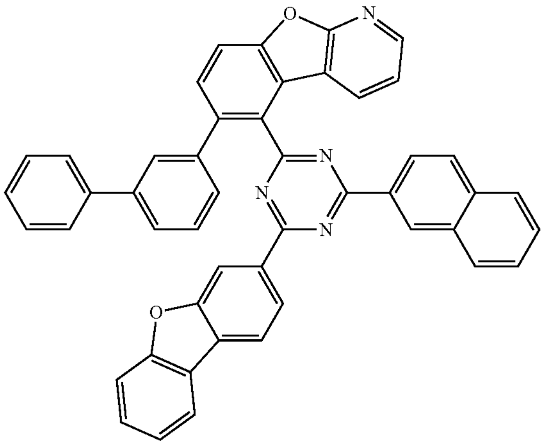
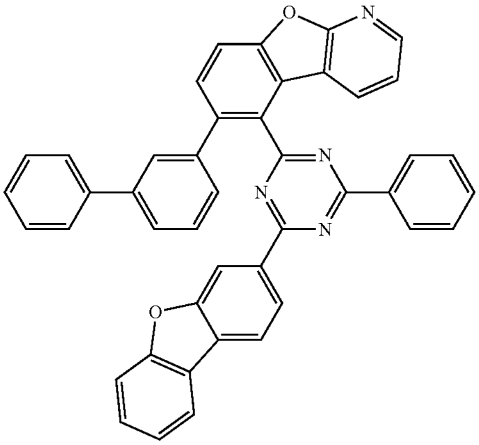
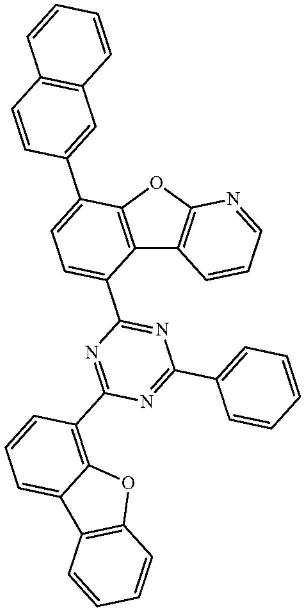
-continued
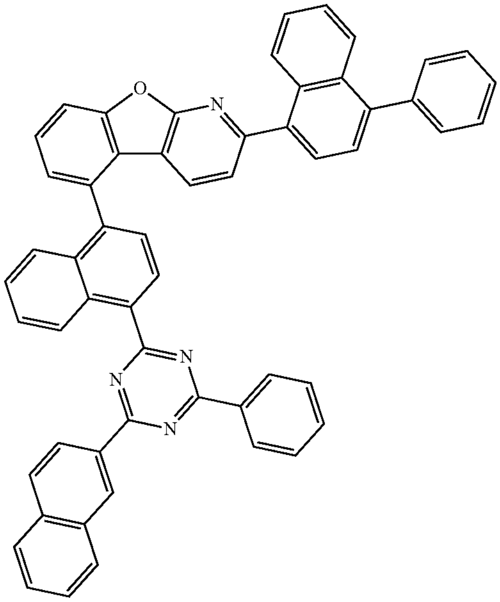
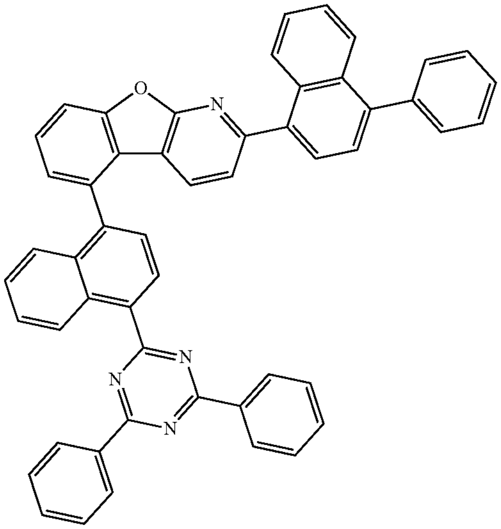
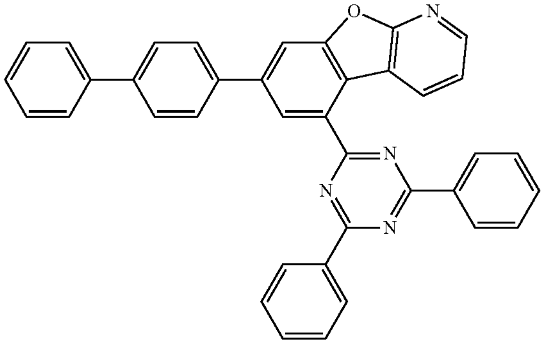

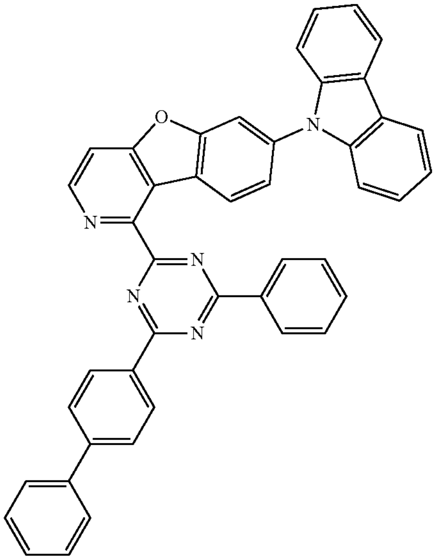
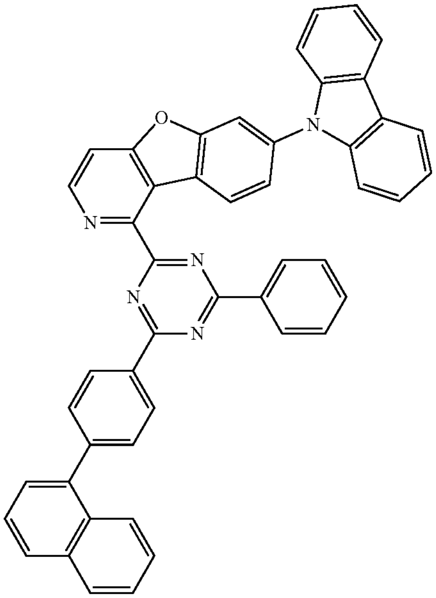
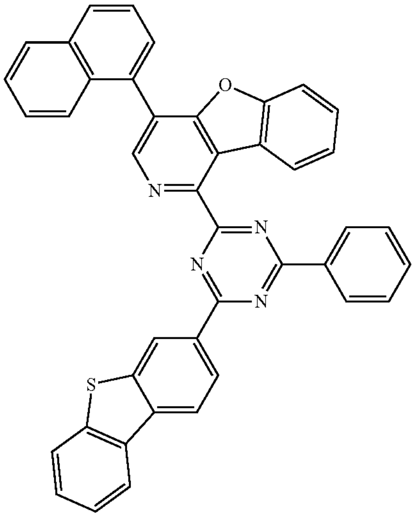
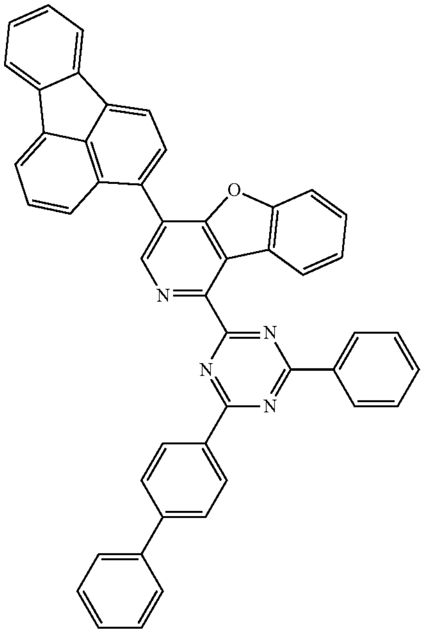
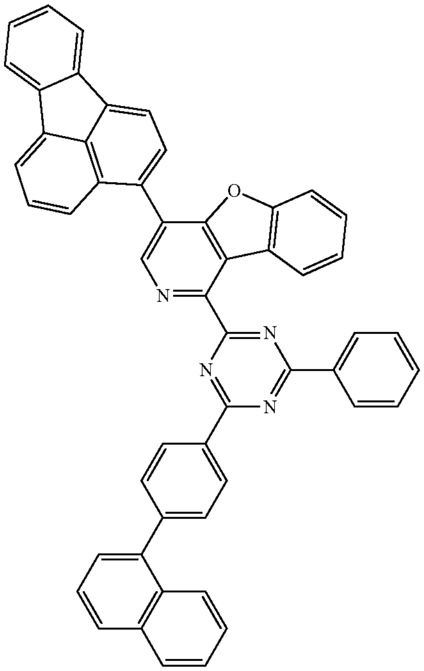

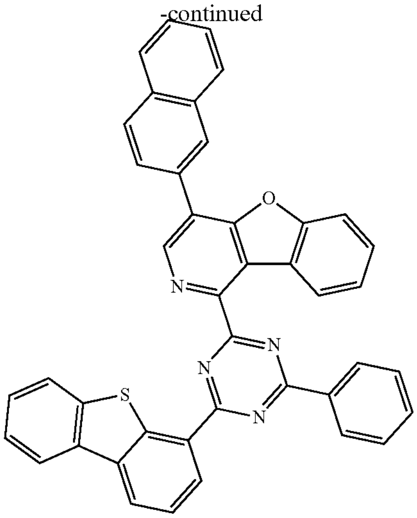
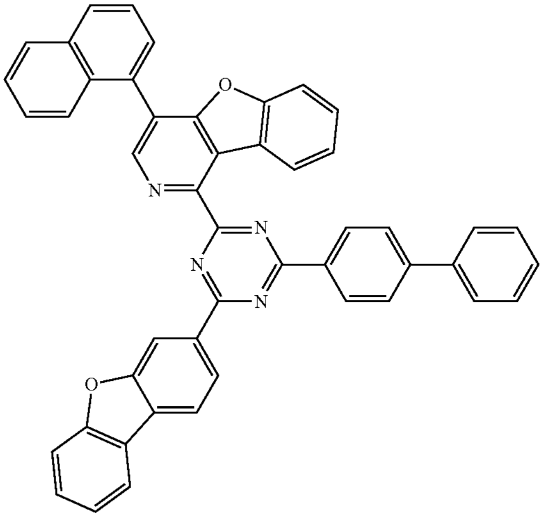
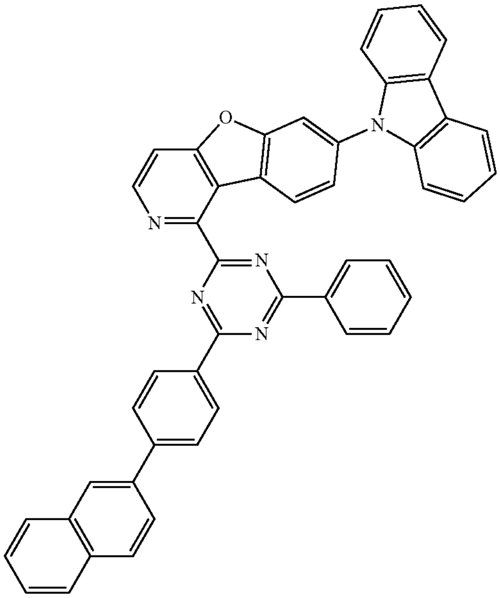
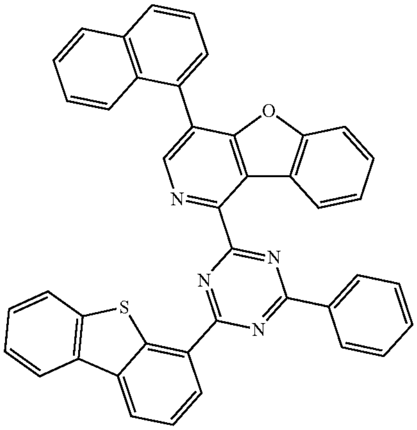
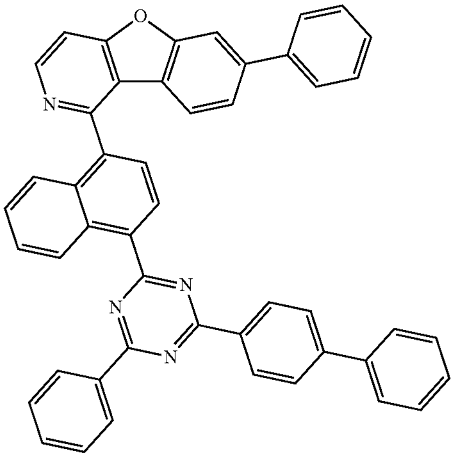
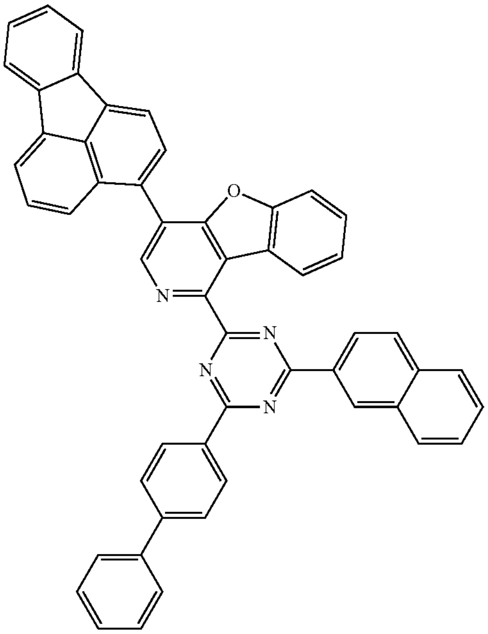

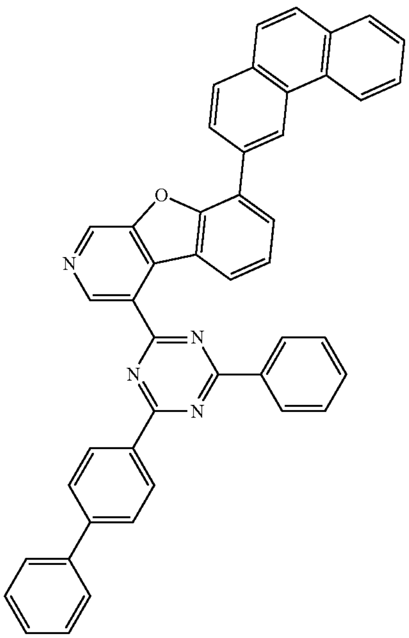
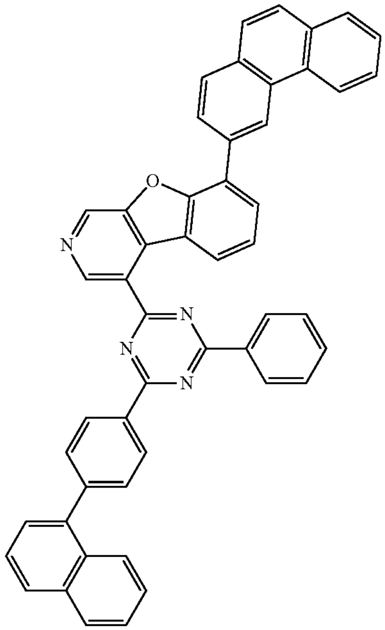
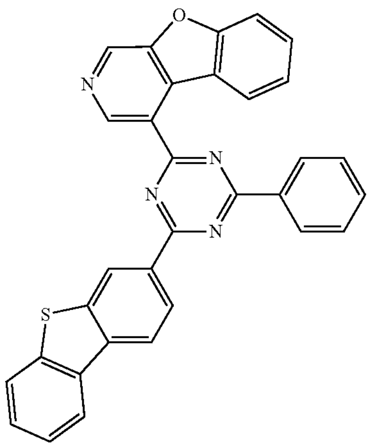
-continued
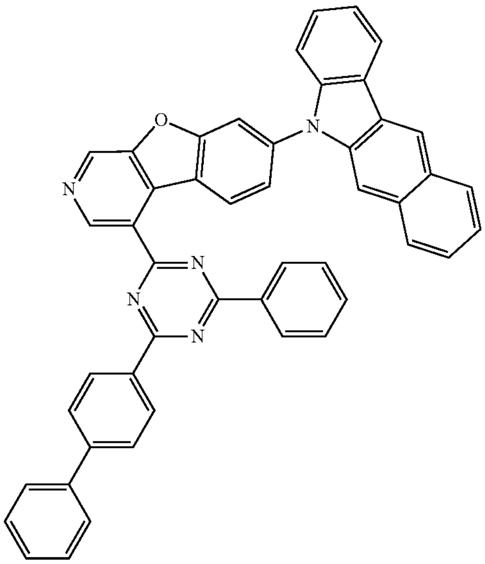
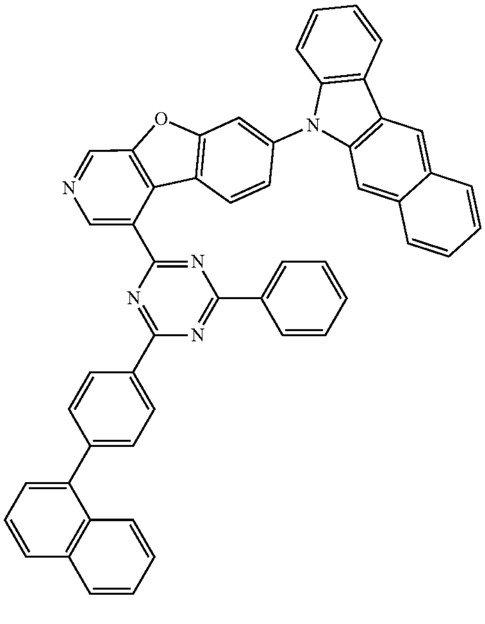
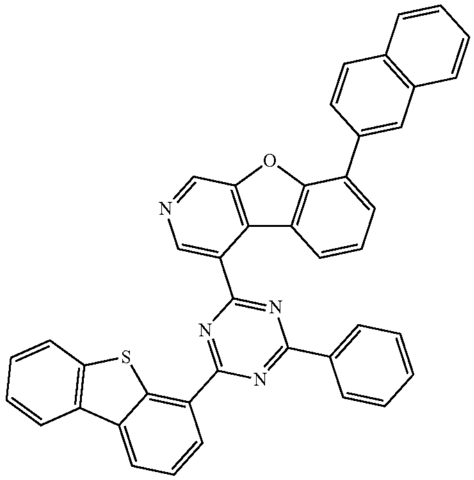

-continued
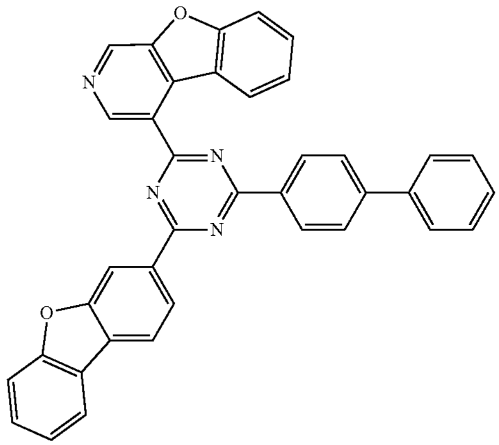
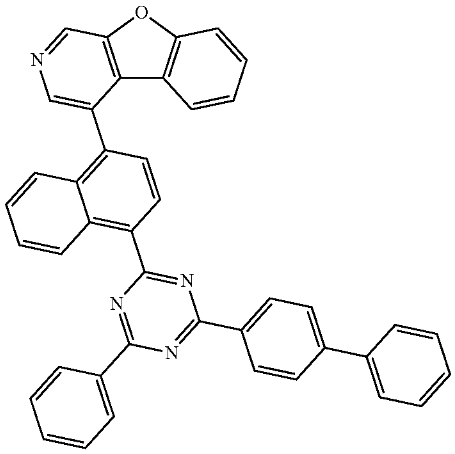
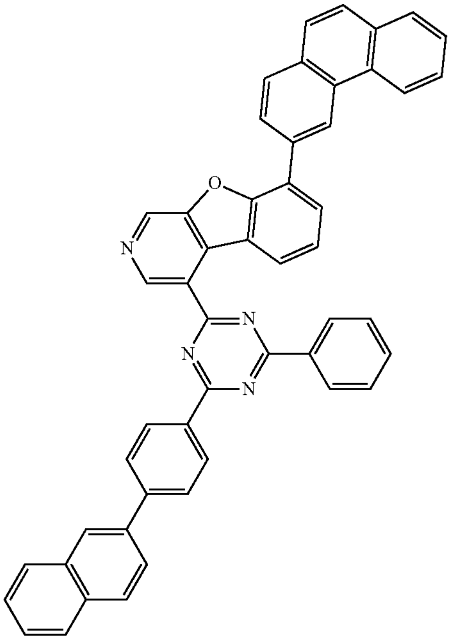
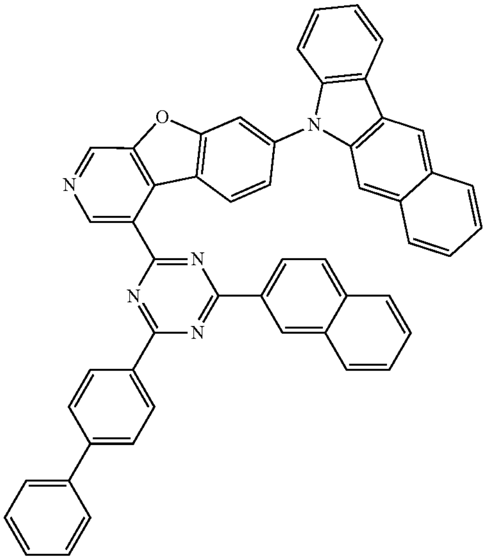
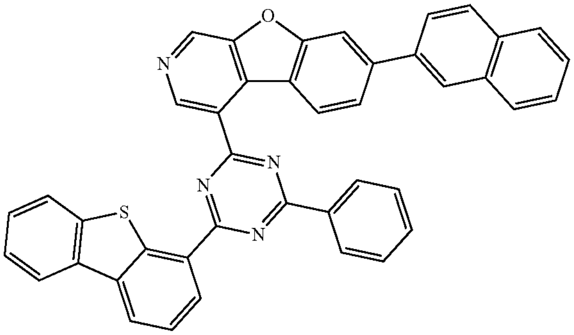
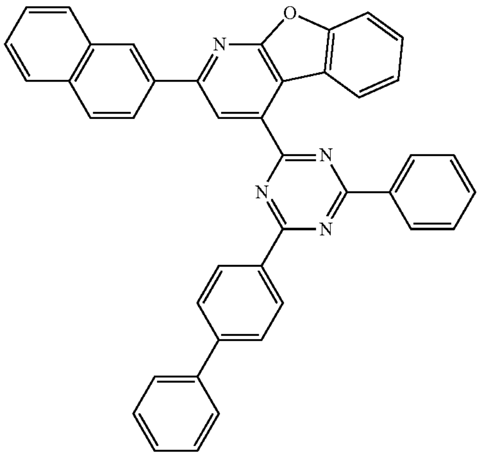
-continued -continued
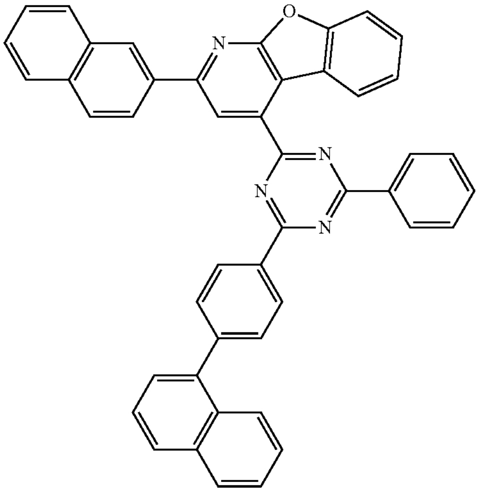
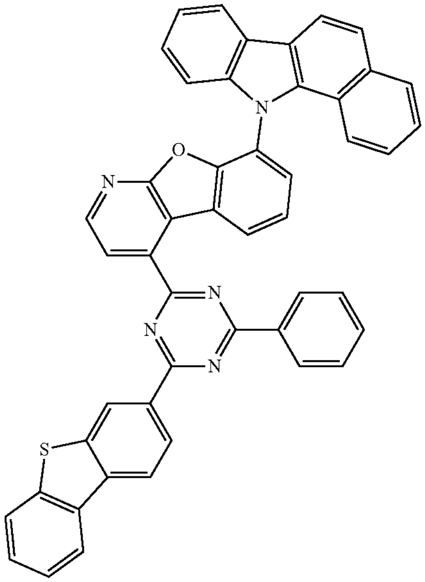
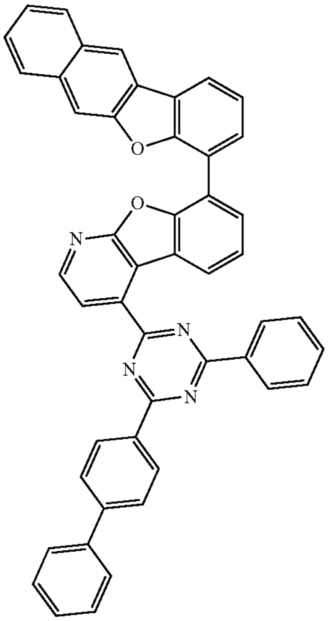
-continued
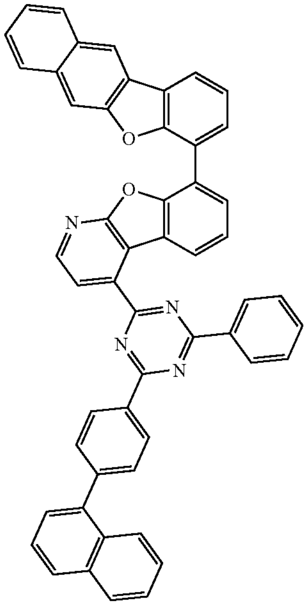
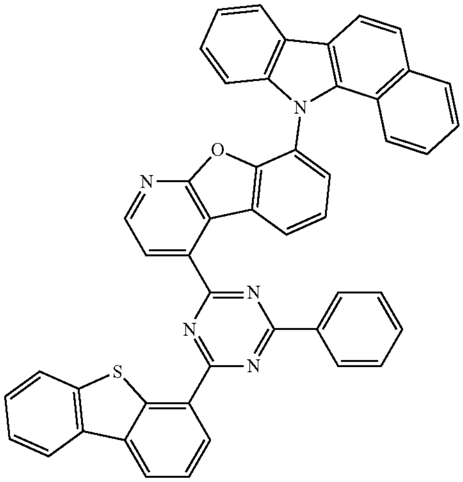
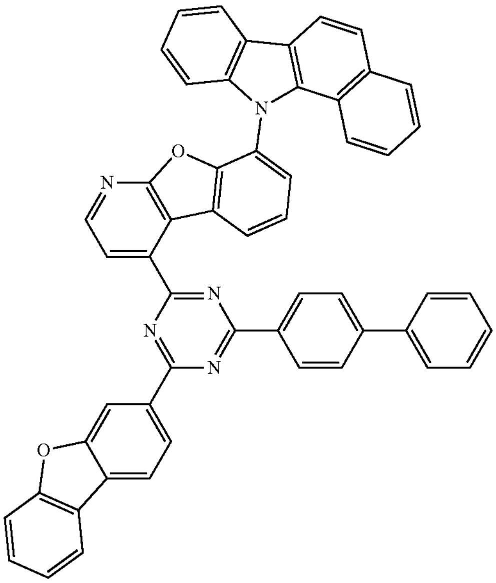

-continued
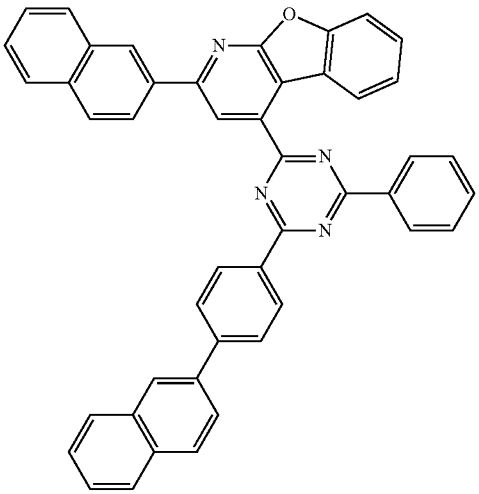
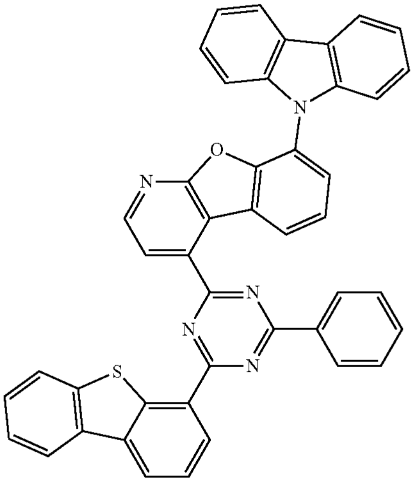
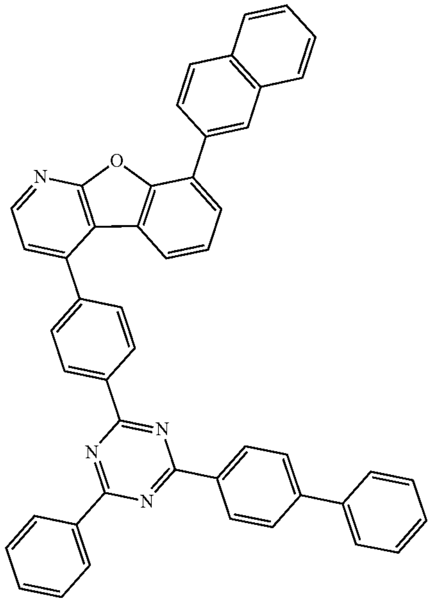
-continued
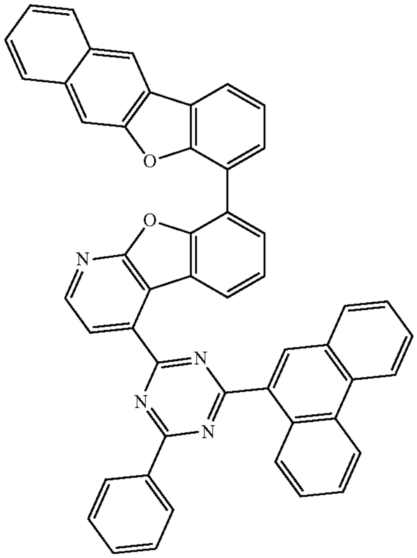
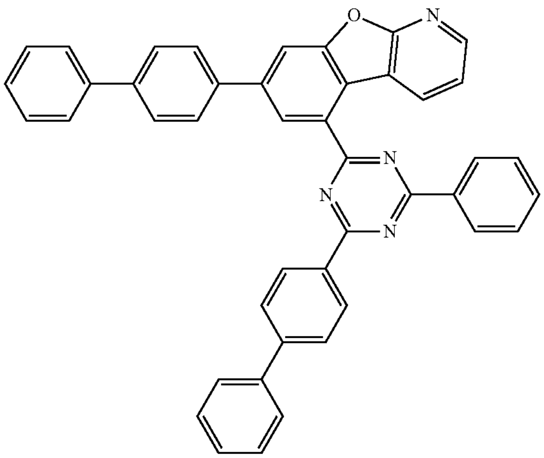
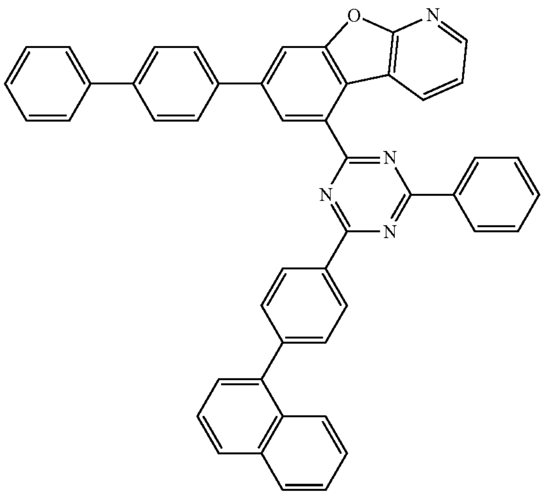

-continued
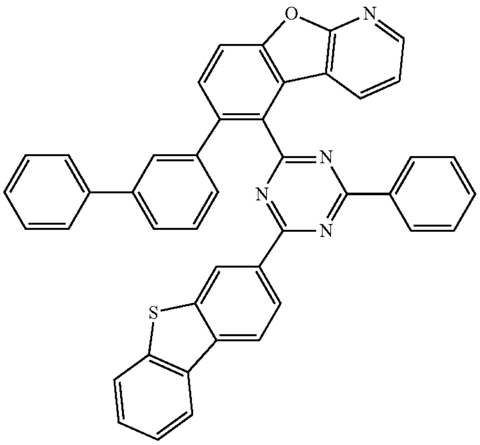
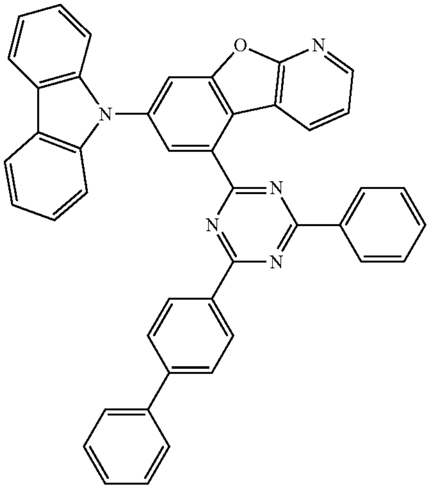
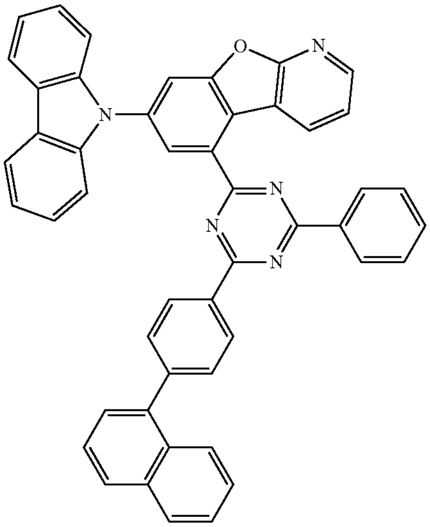
-continued
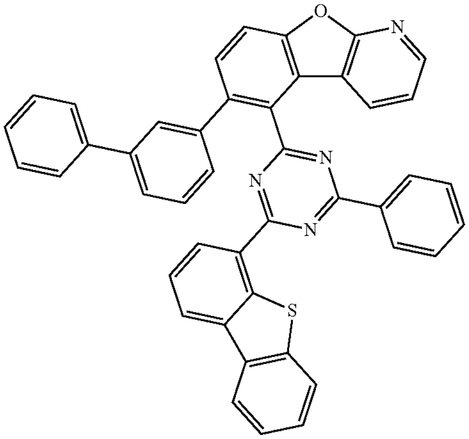
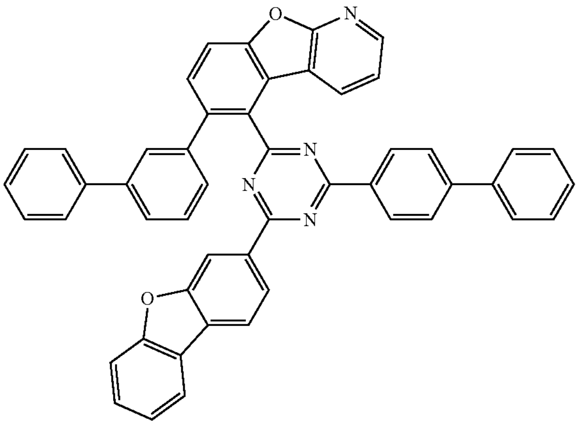
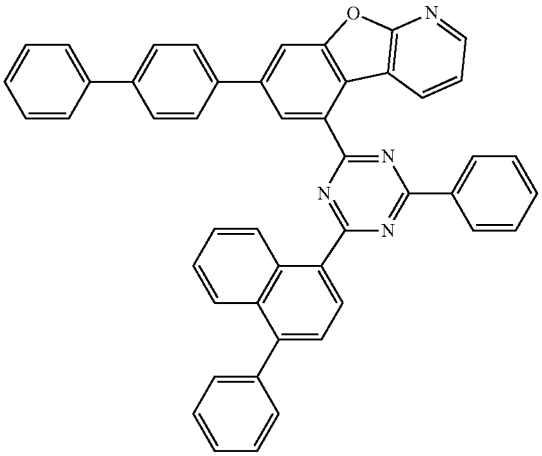

-continued
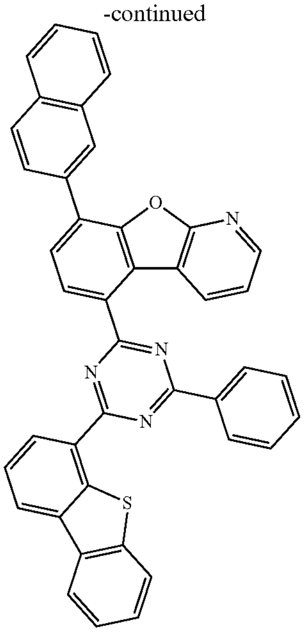
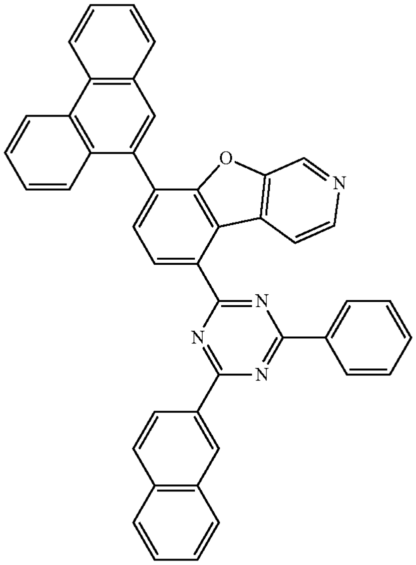
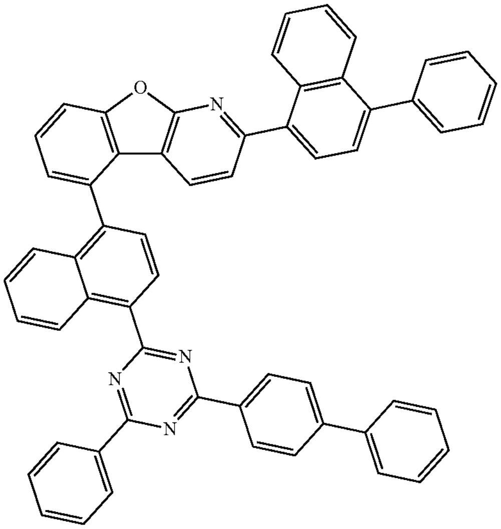
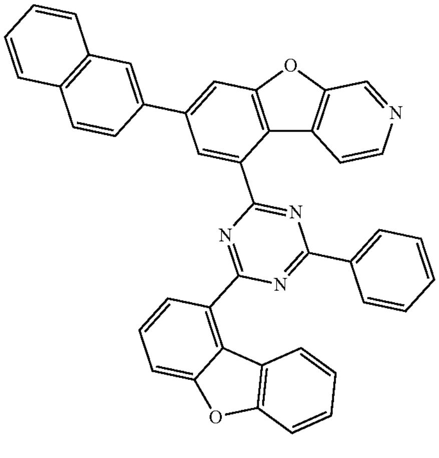
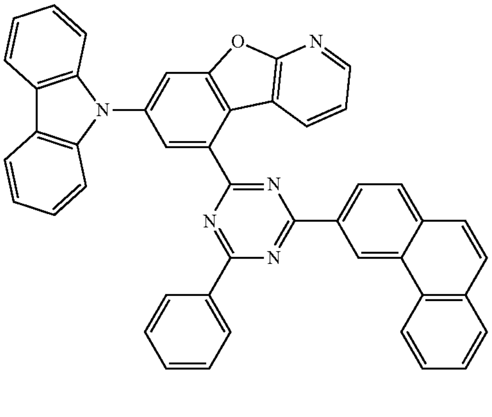
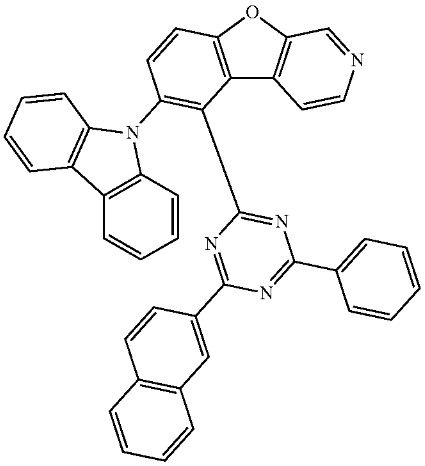

-continued
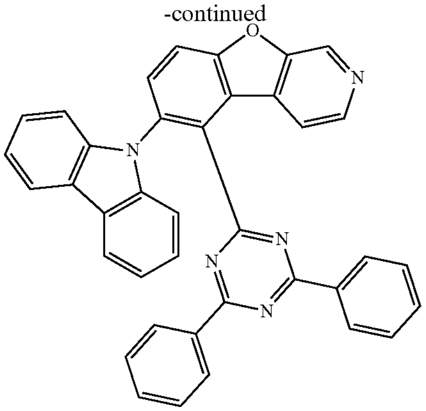
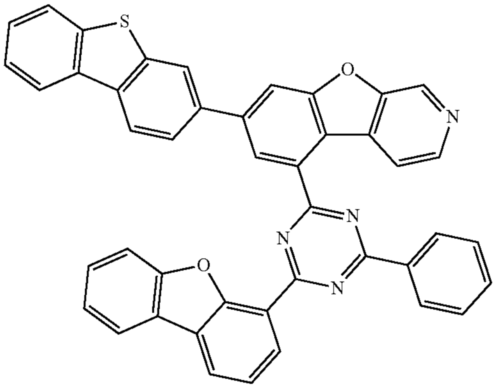
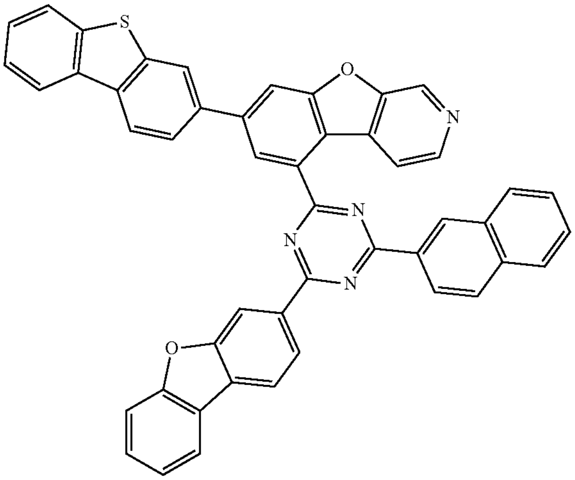
-continued
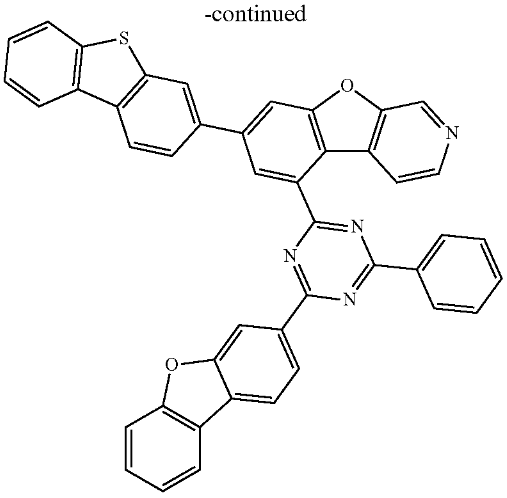
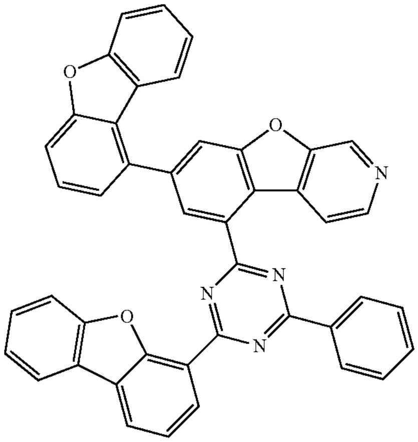
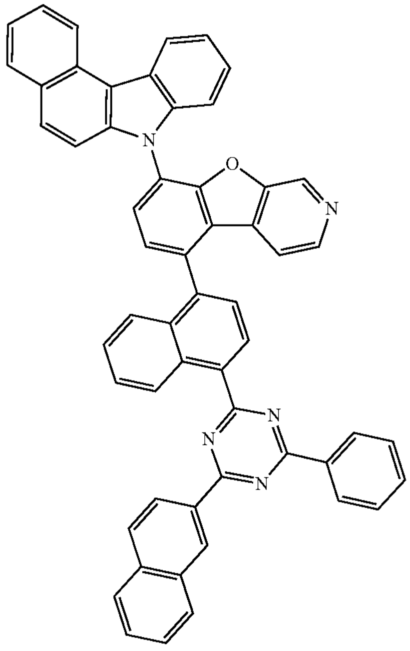

-continued
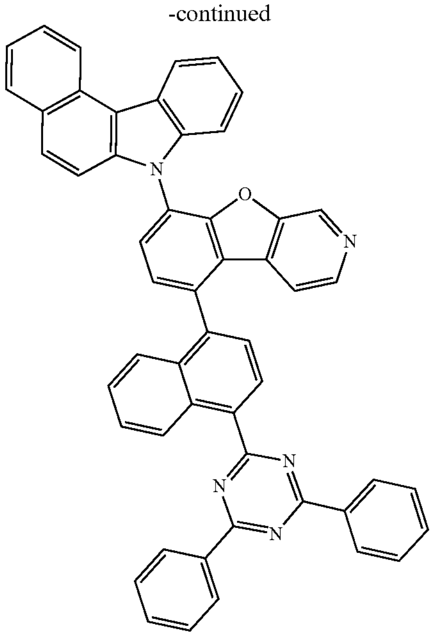
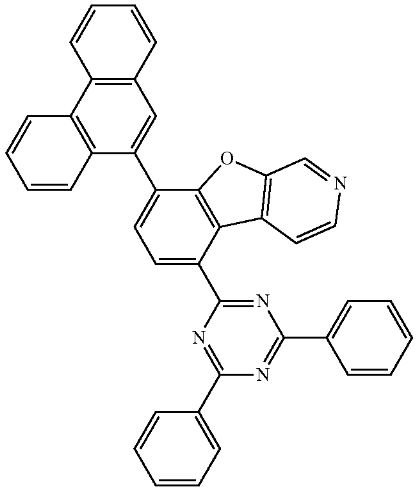
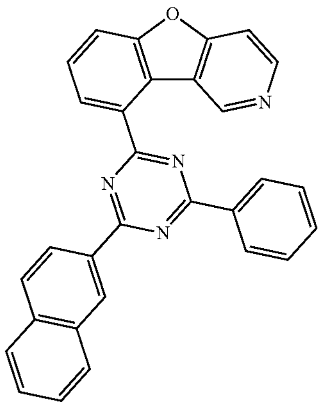
-continued
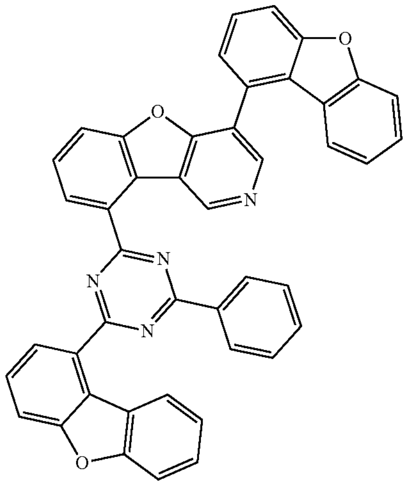
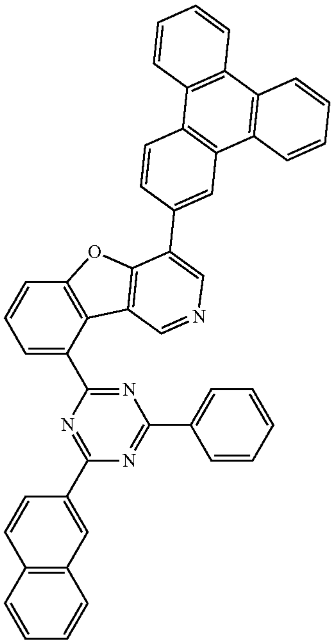
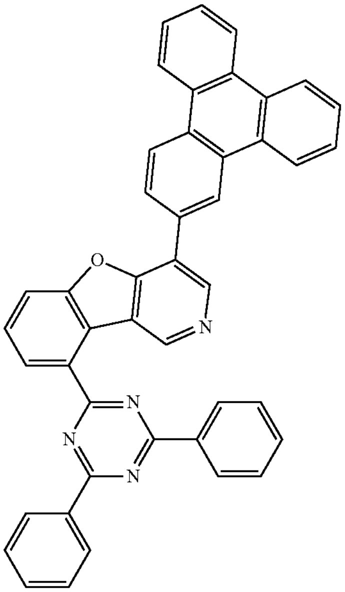

-continued
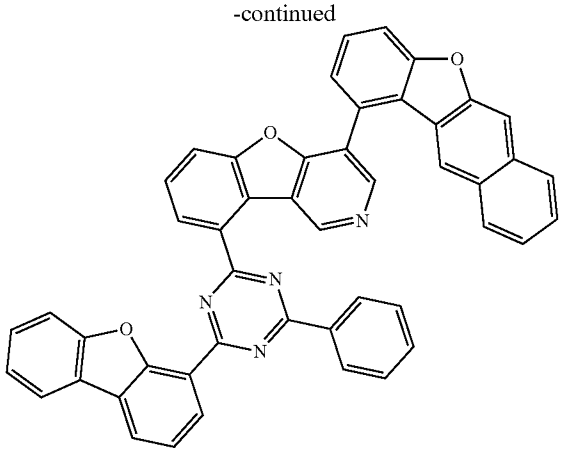
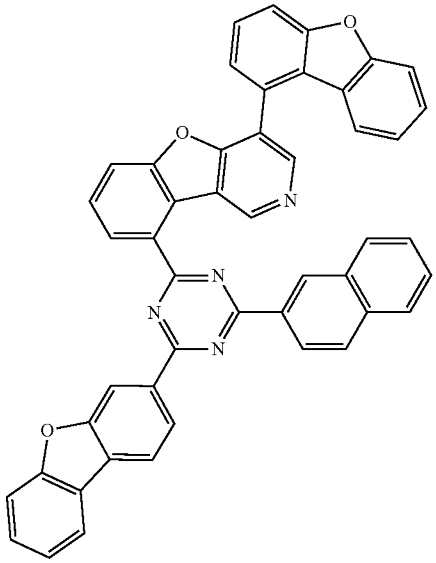
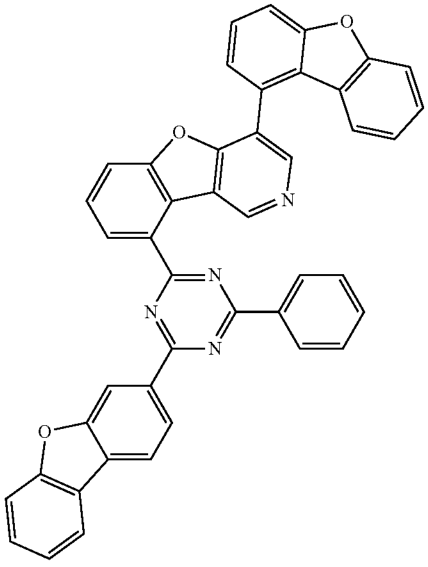
-continued
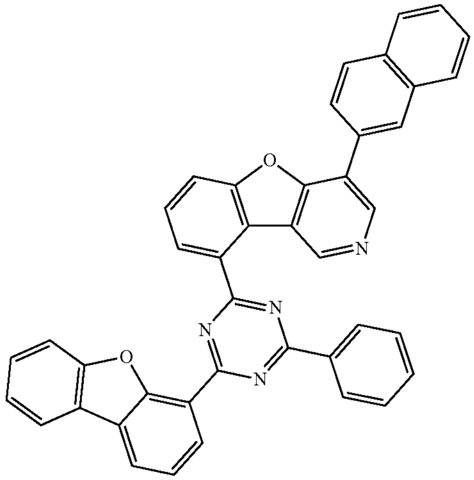
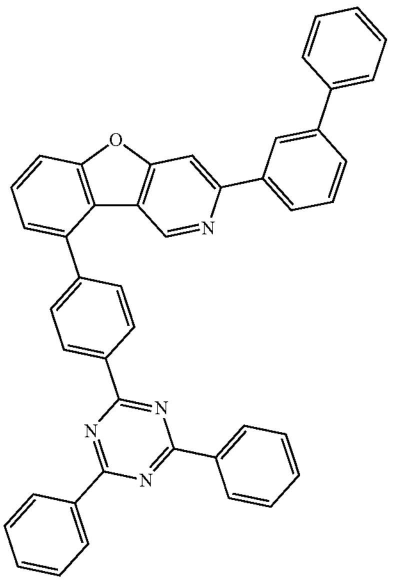
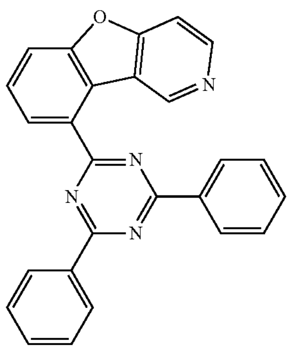

-continued
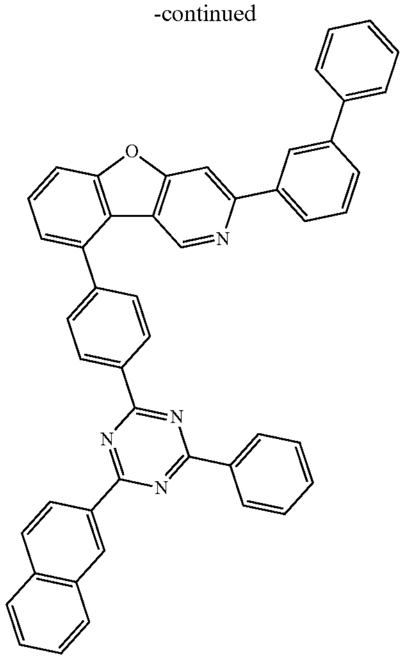
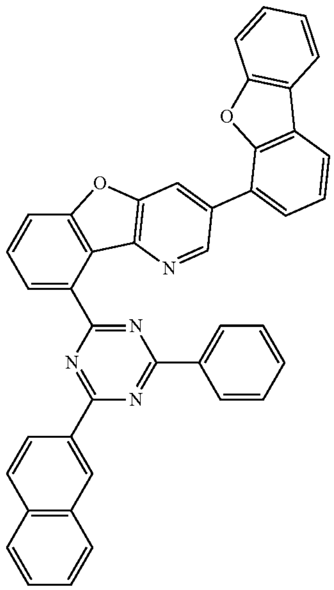
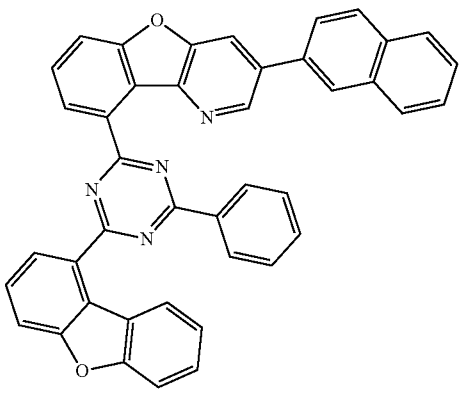
-continued
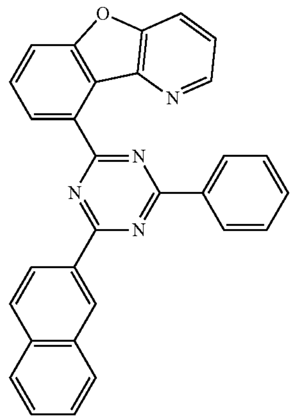
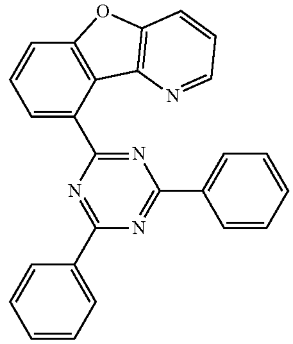
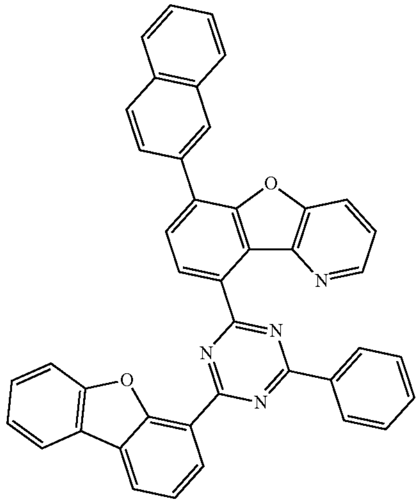
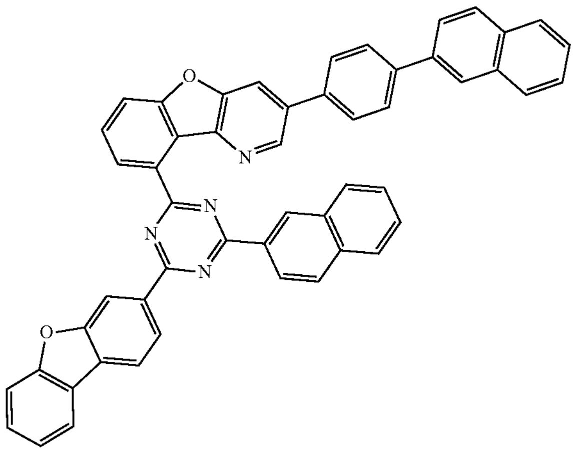

-continued
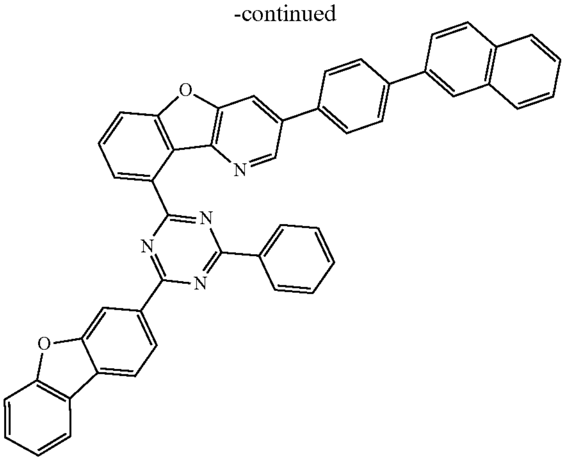
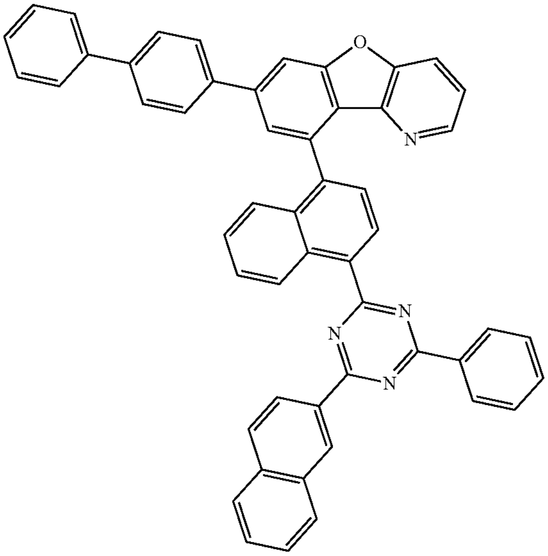
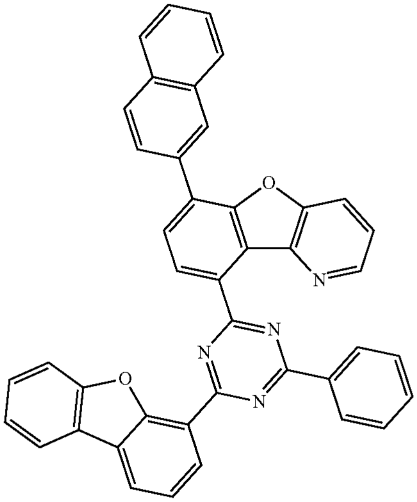
-continued
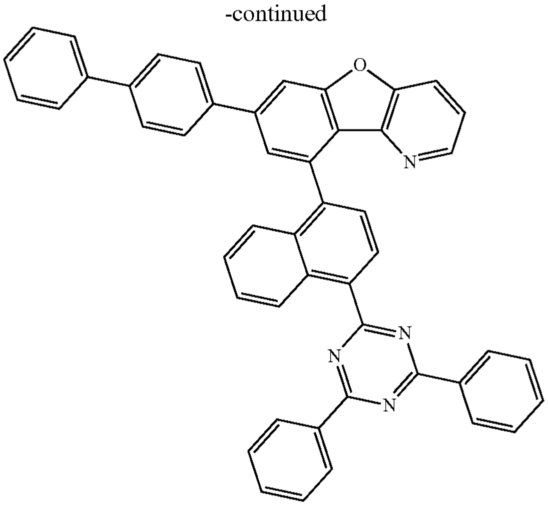
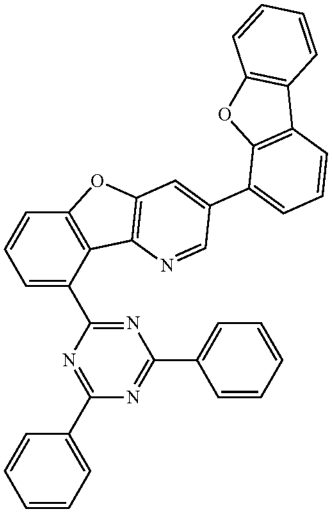
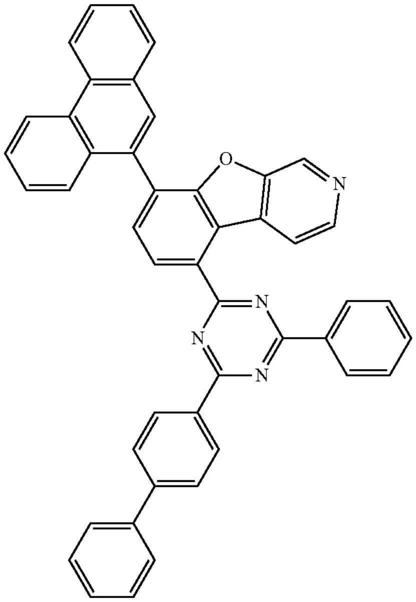

-continued
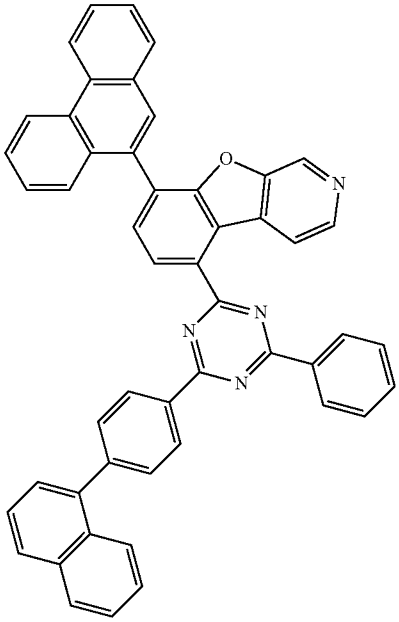
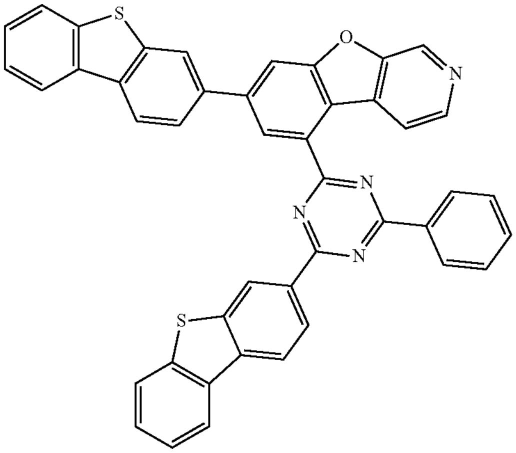
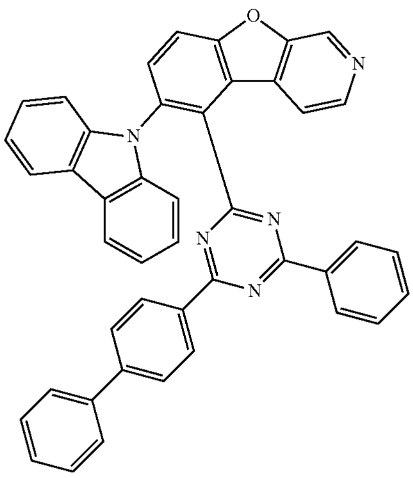
-continued
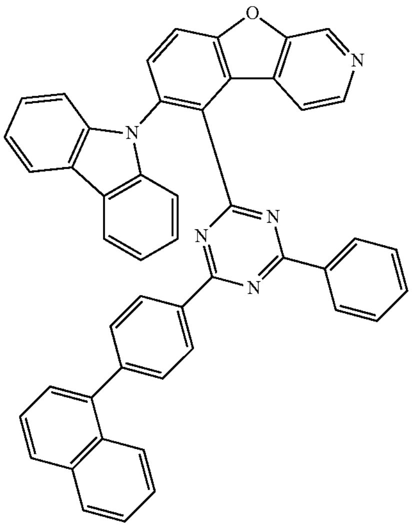
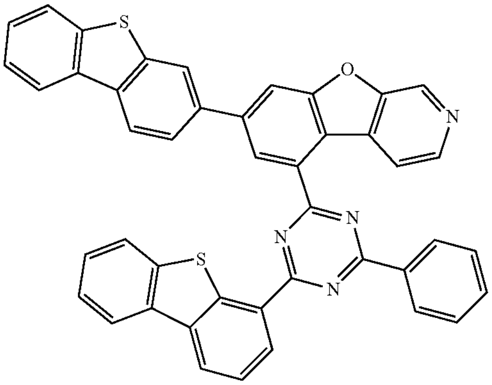
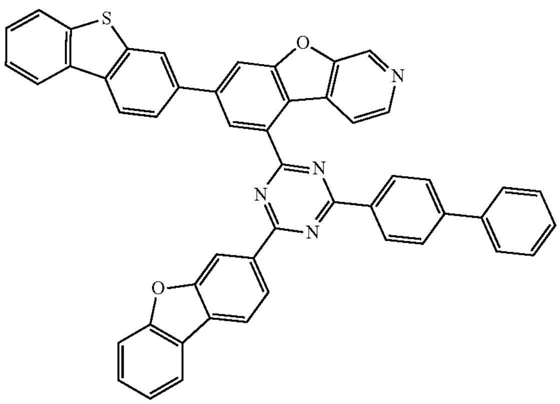

-continued
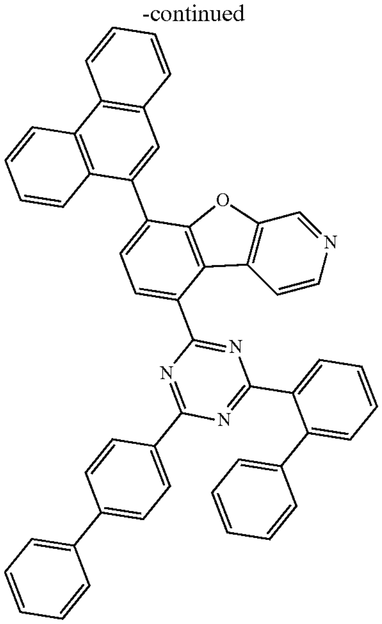
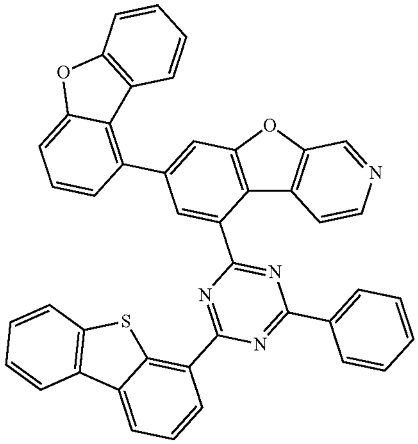
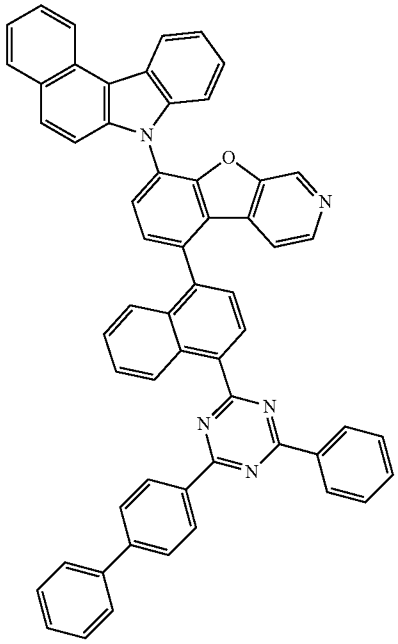
-continued
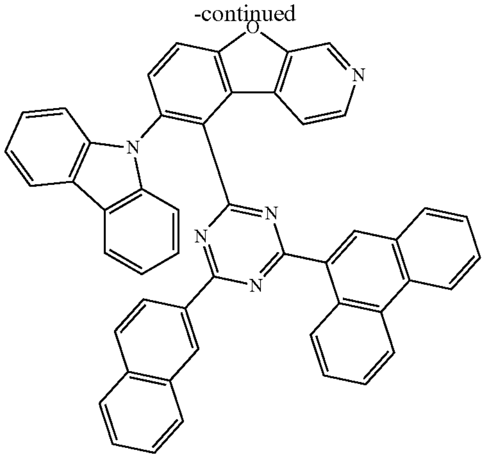
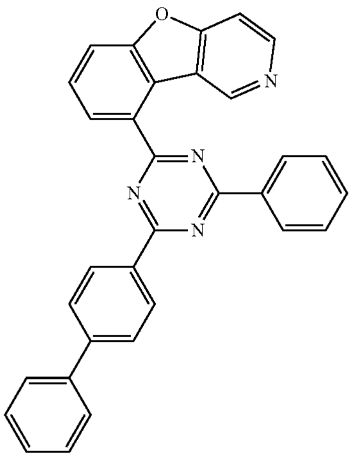
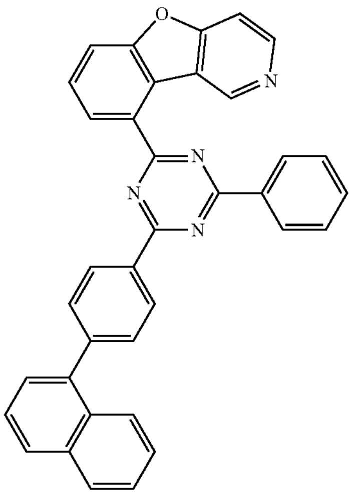

-continued
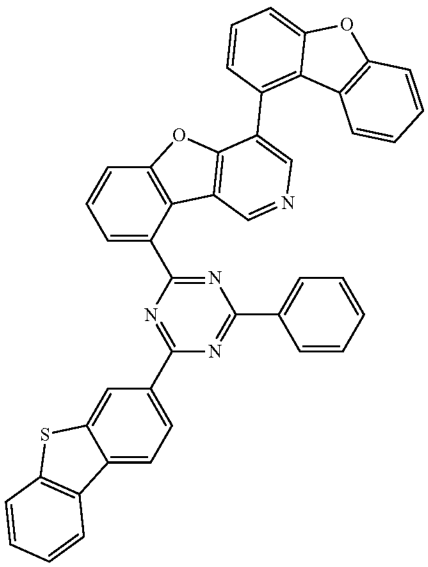
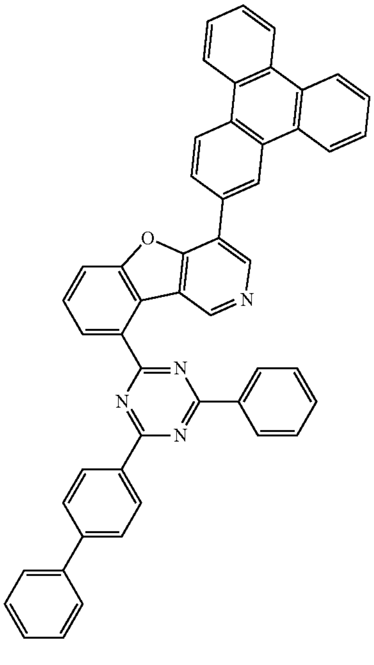
-continued
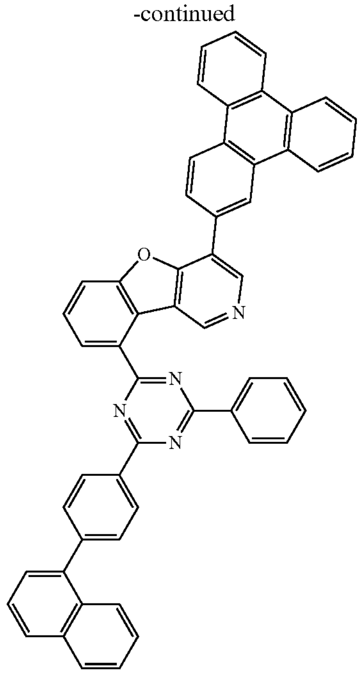
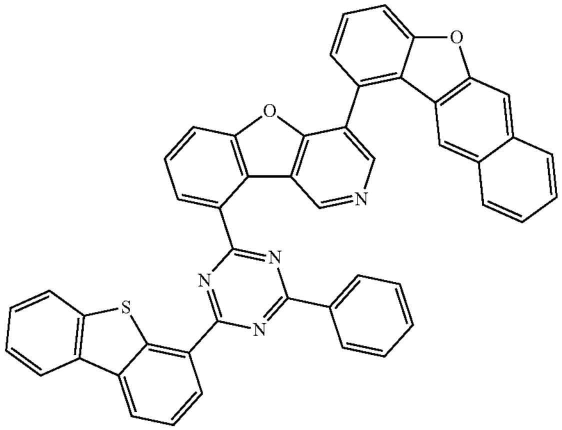
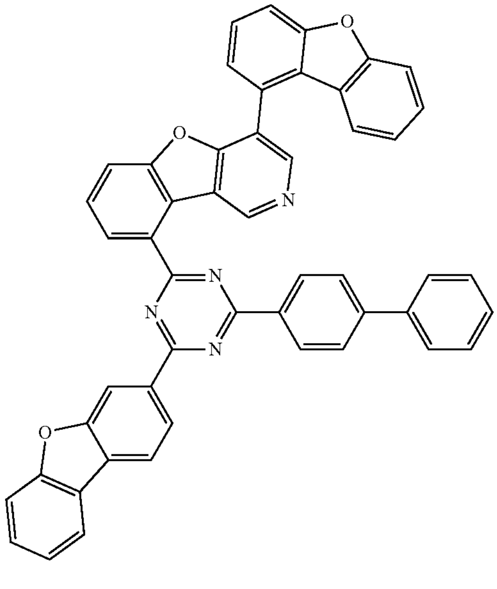

-continued
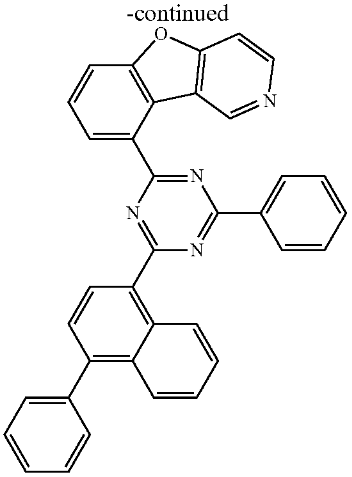
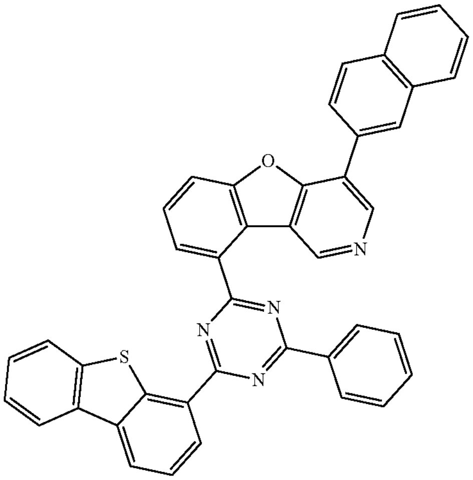
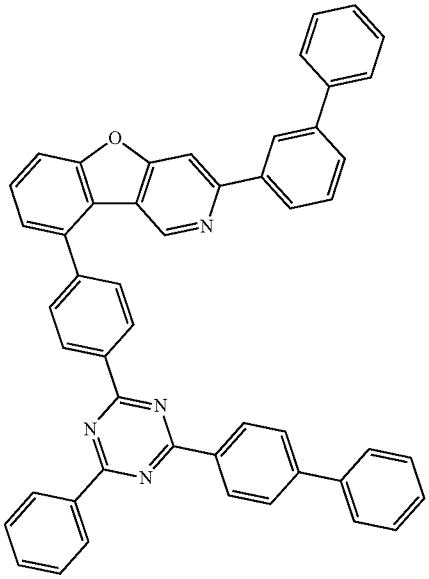
-continued
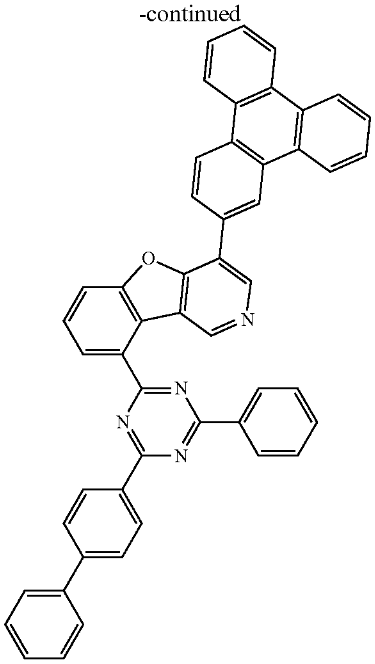
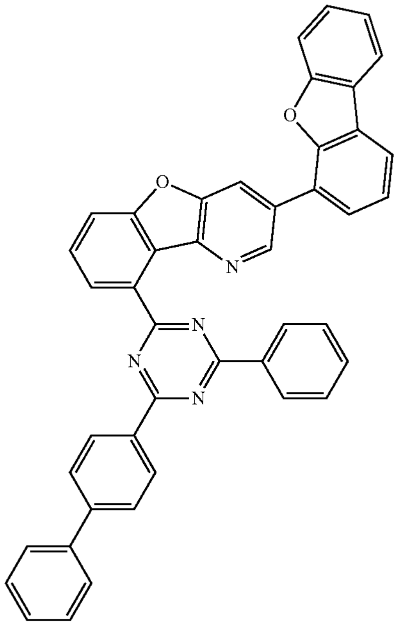

-continued
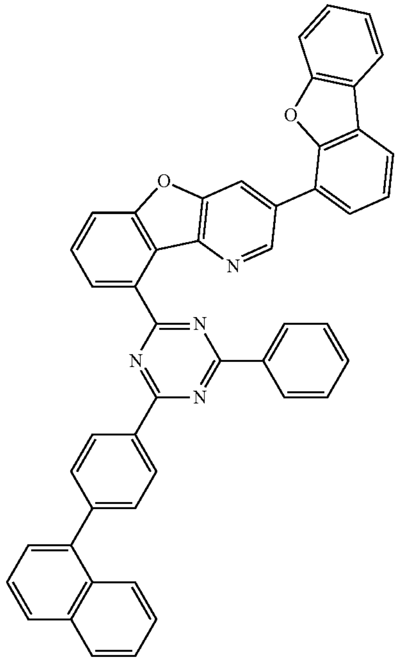
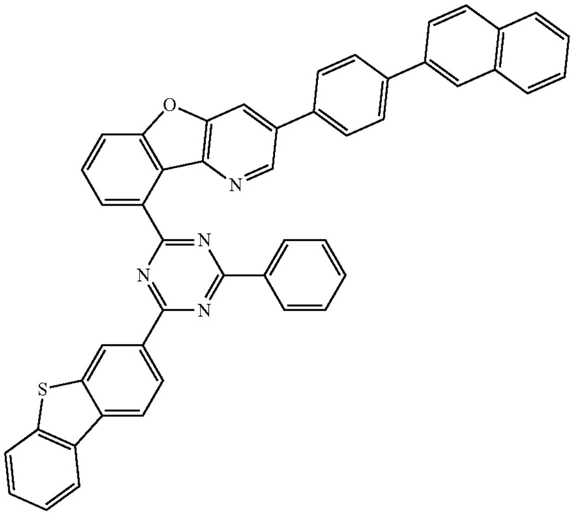
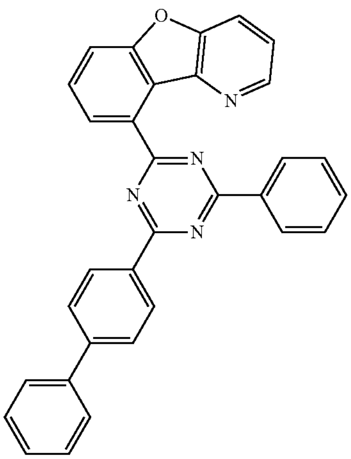
-continued
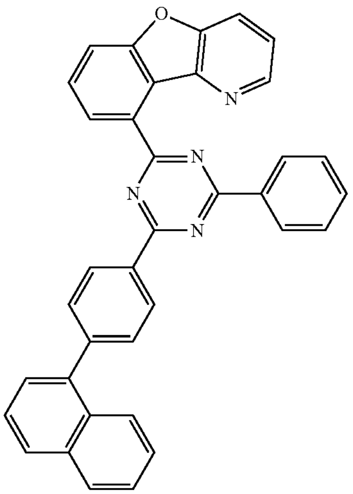
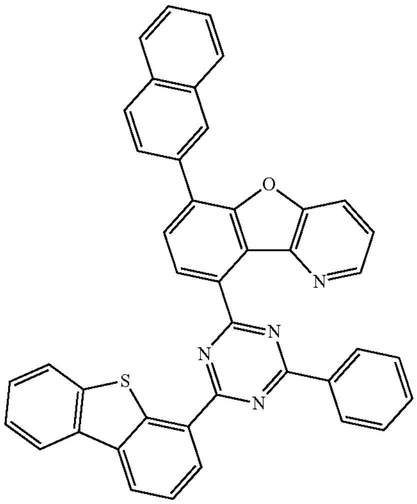
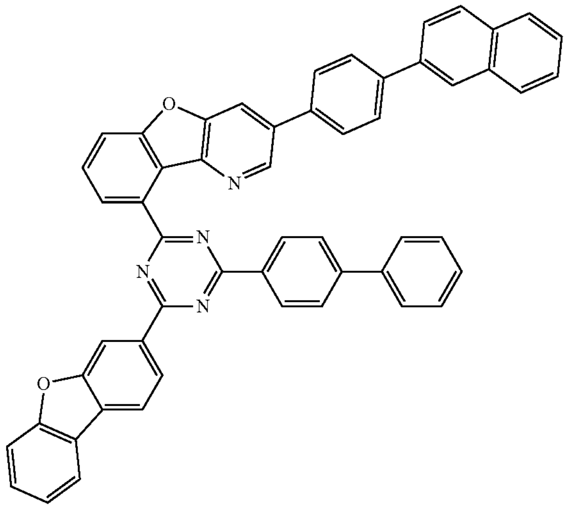

-continued
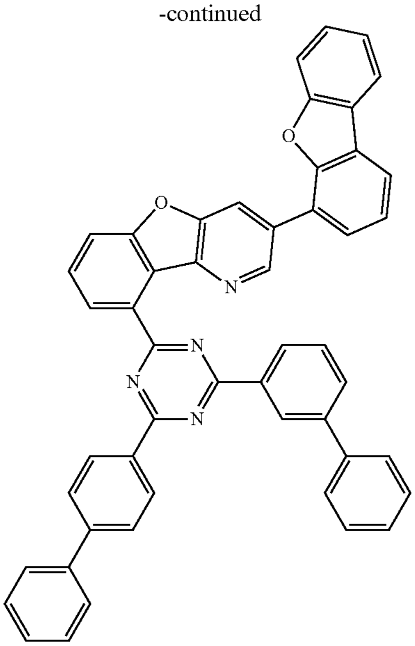
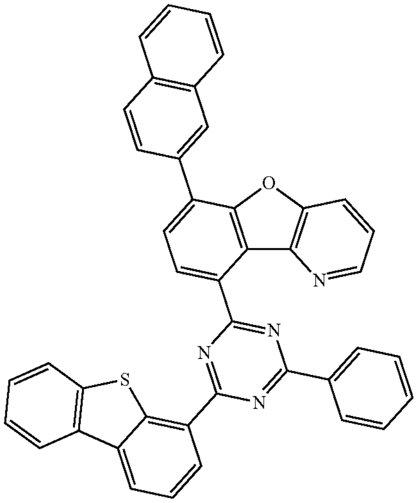
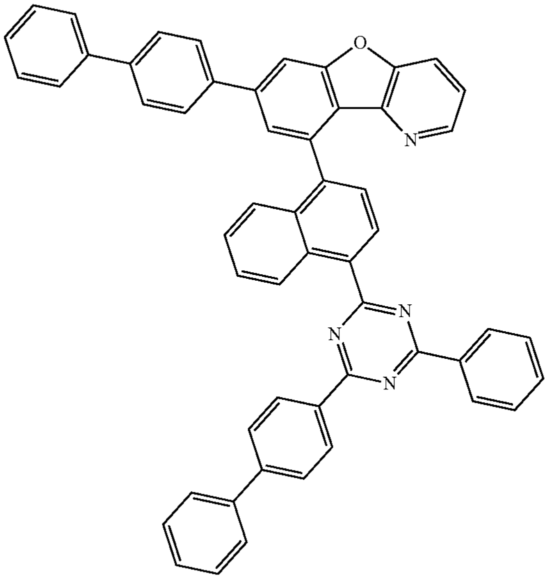
-continued
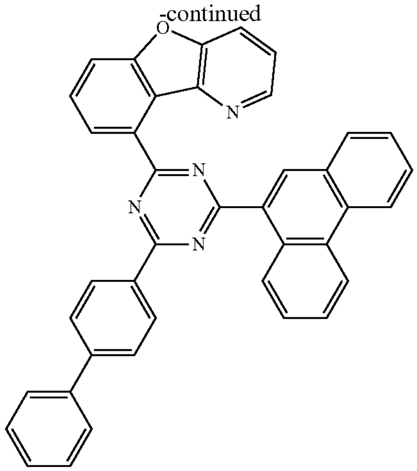
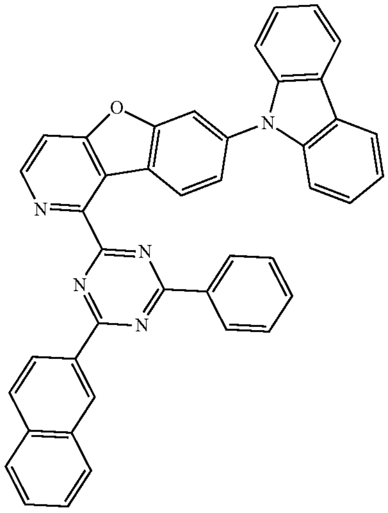
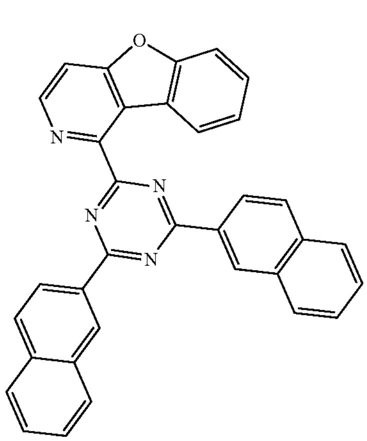

-continued
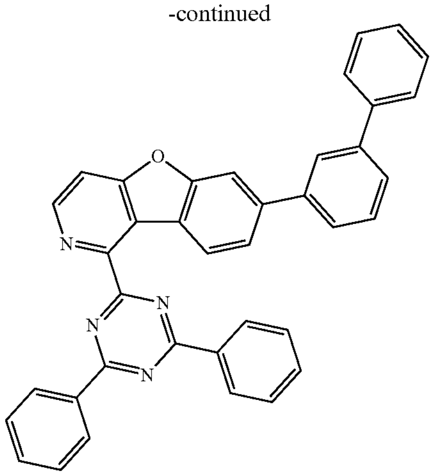
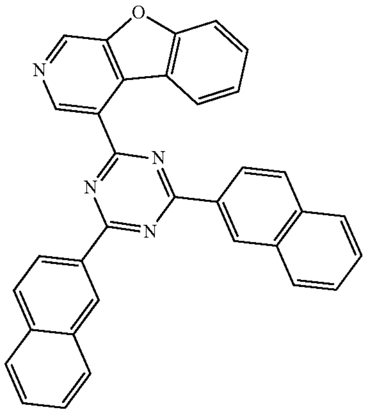
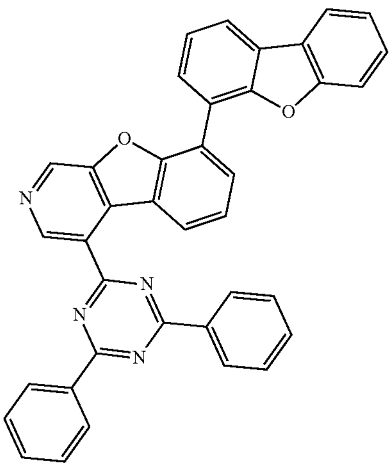
-continued
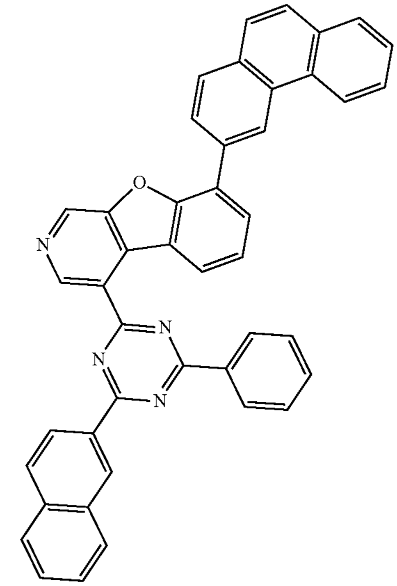
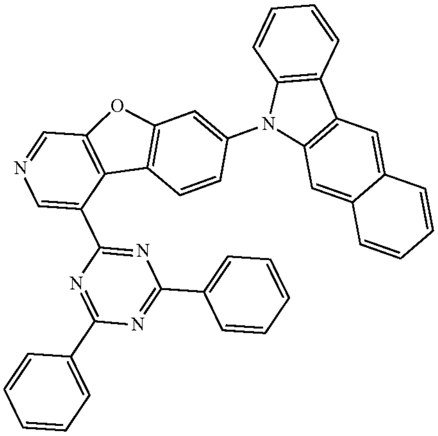
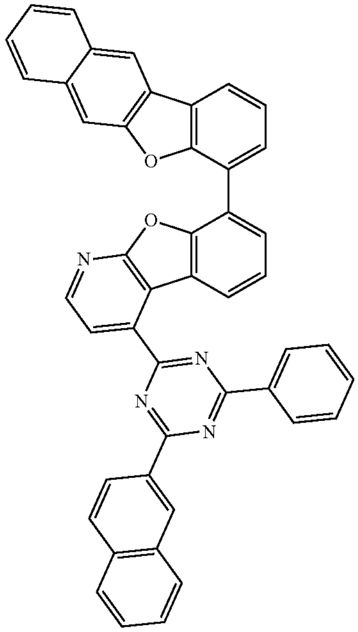

-continued
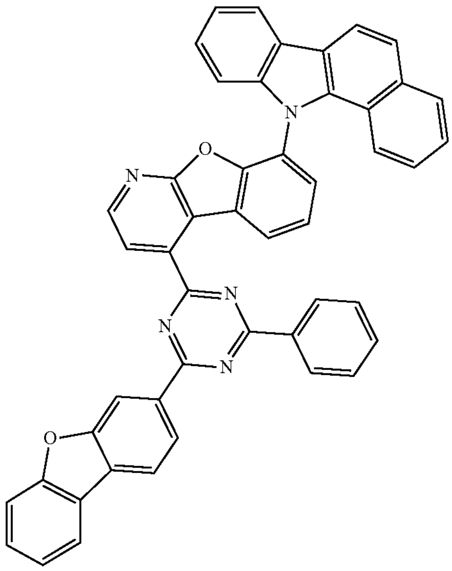
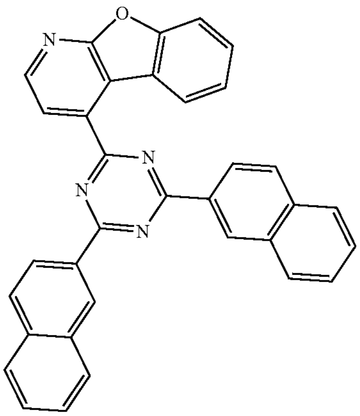
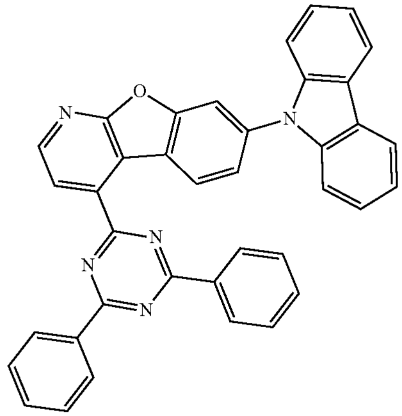
-continued
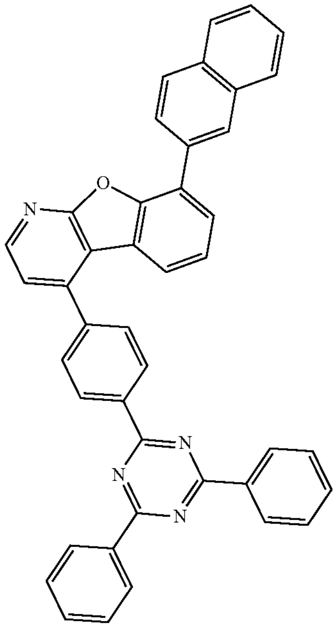
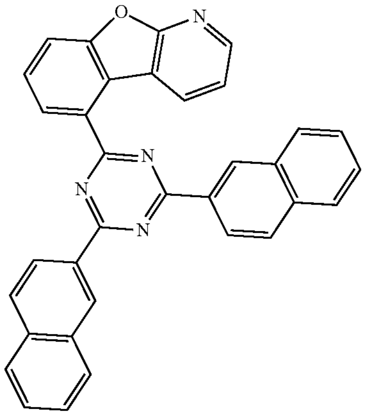
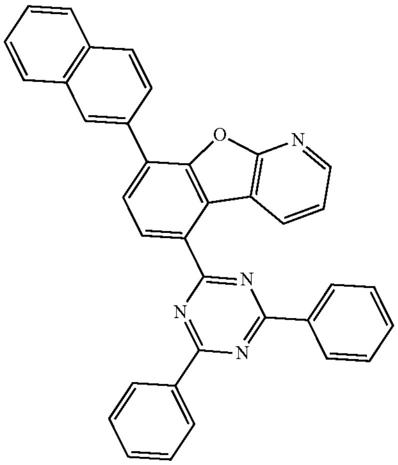

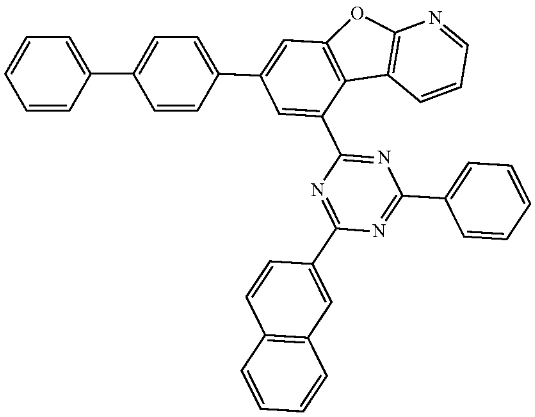
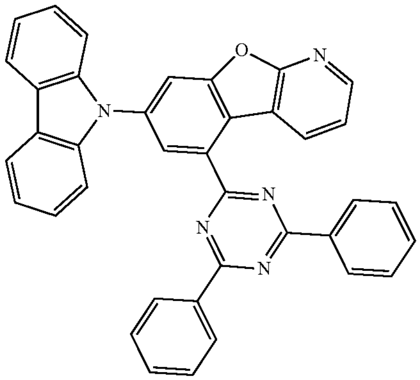
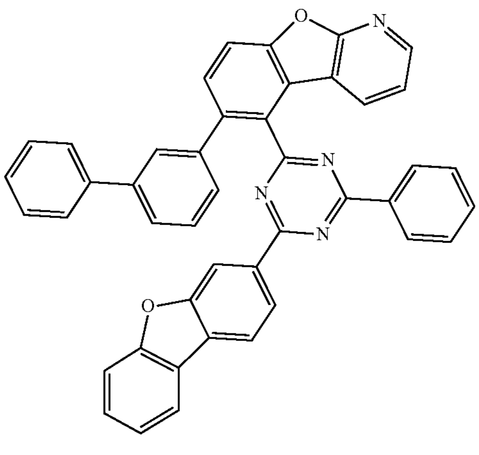
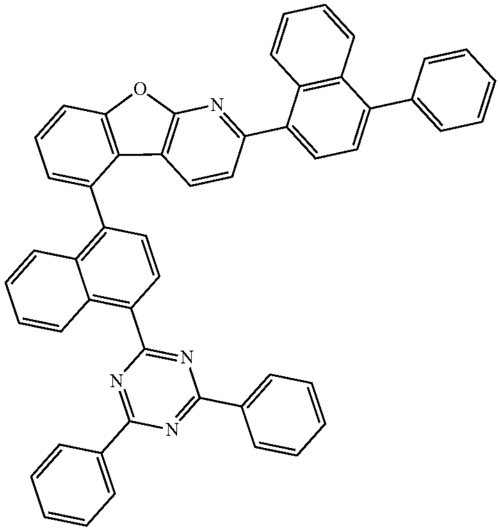
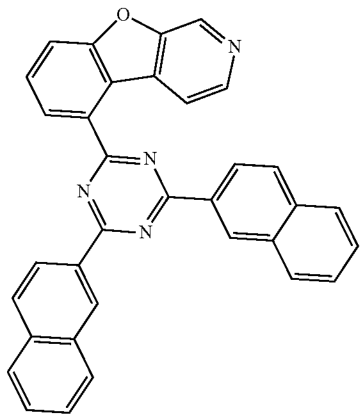
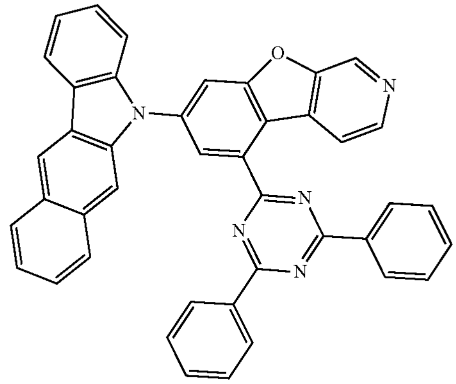

-continued
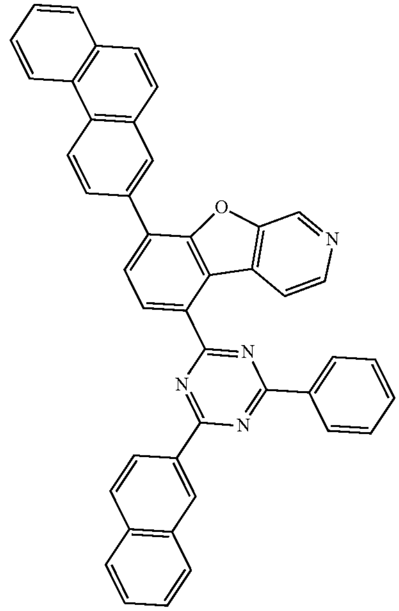
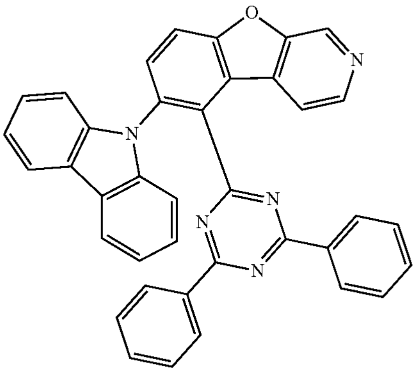
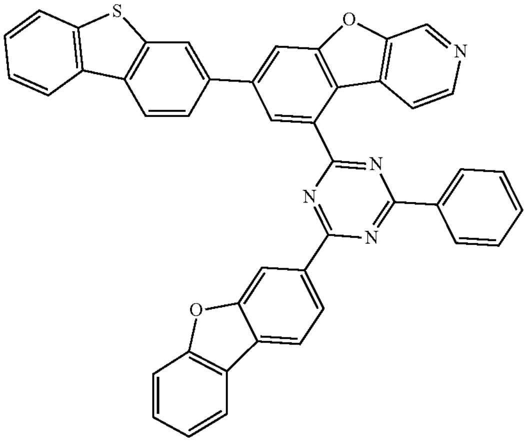
-continued
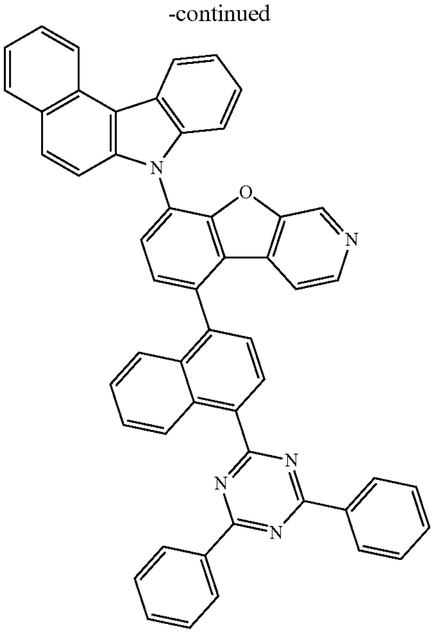
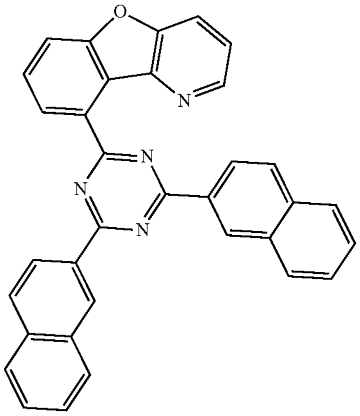
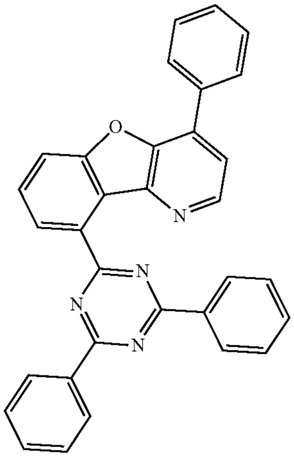

-continued
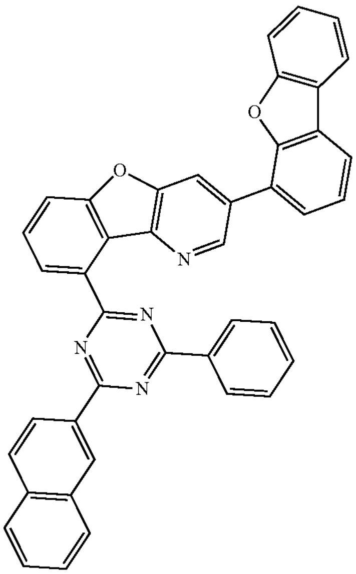
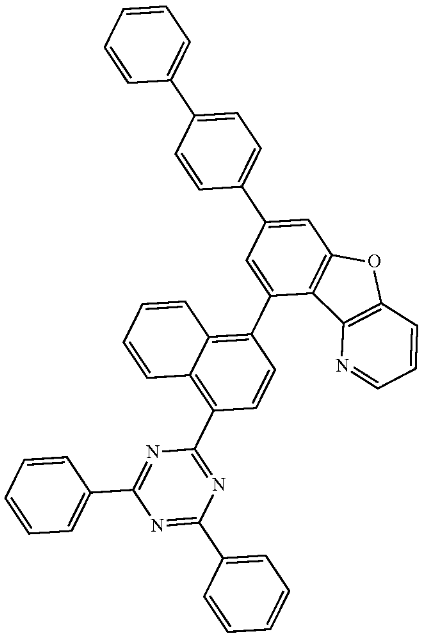
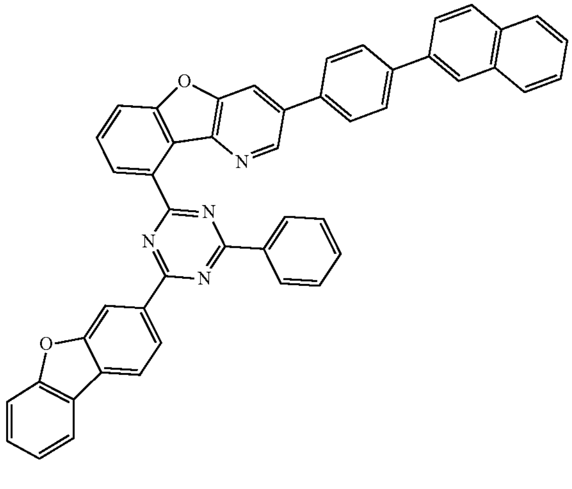
-continued
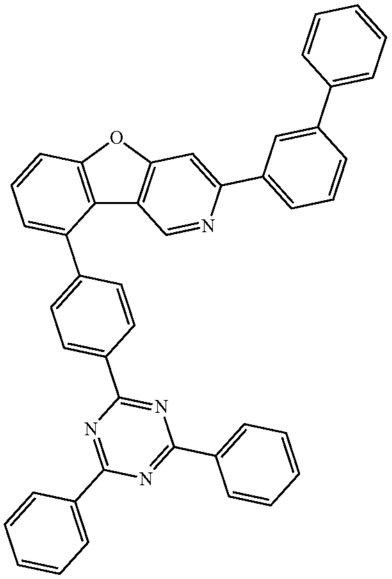
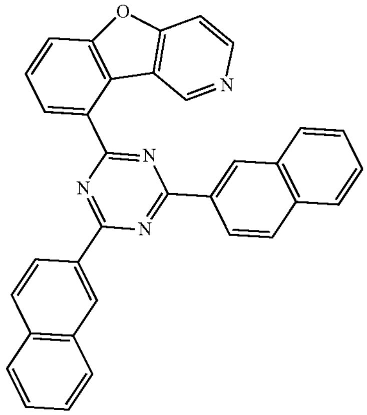
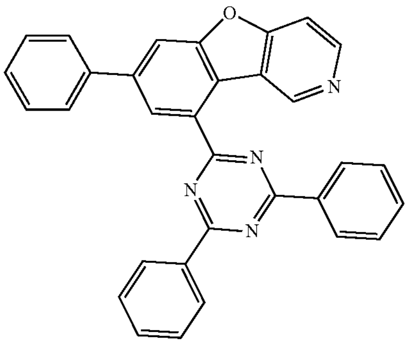

-continued
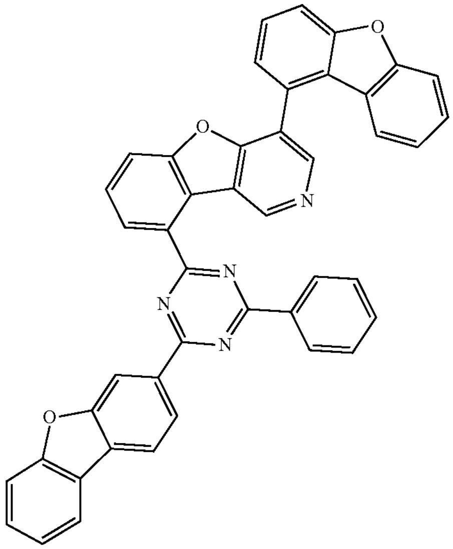
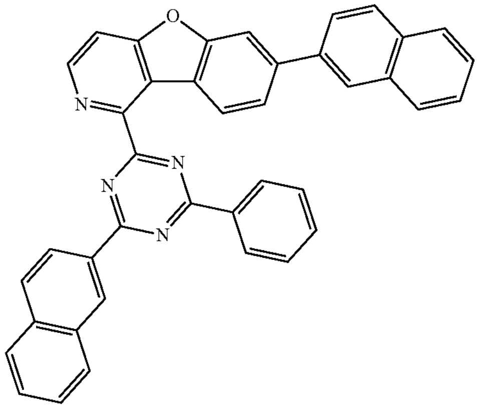
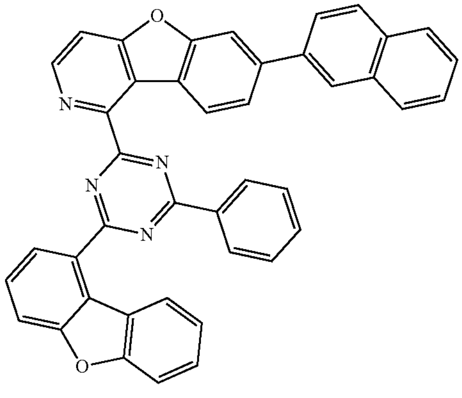
-continued
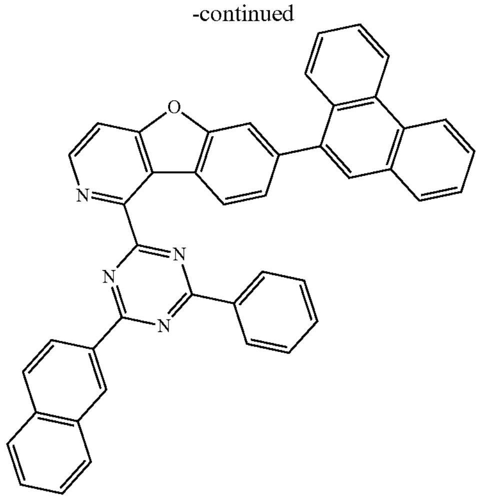
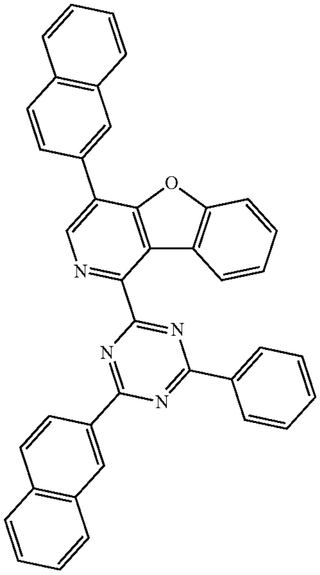
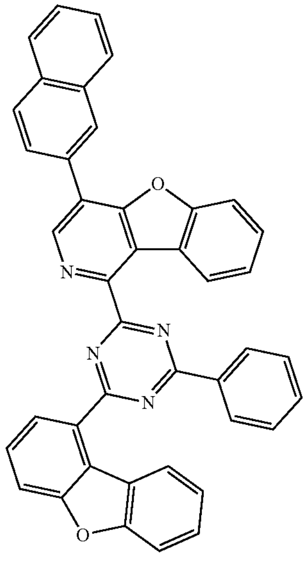

-continued
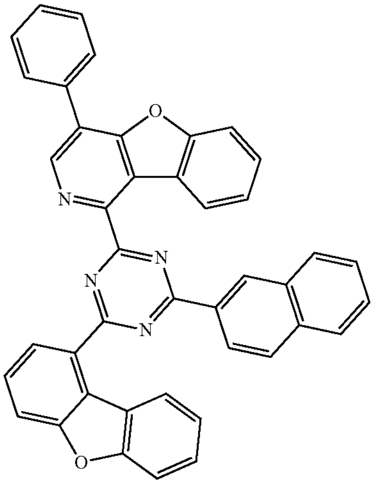
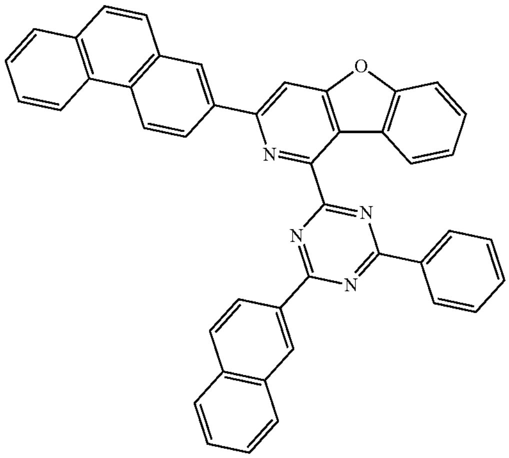
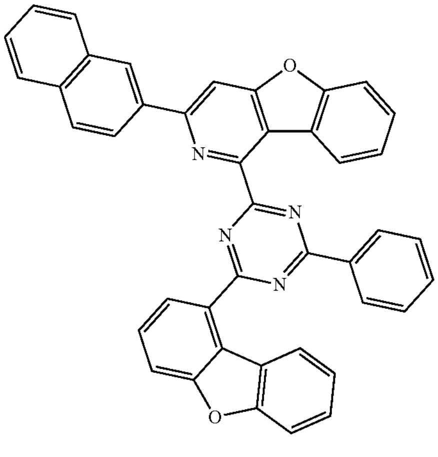
-continued
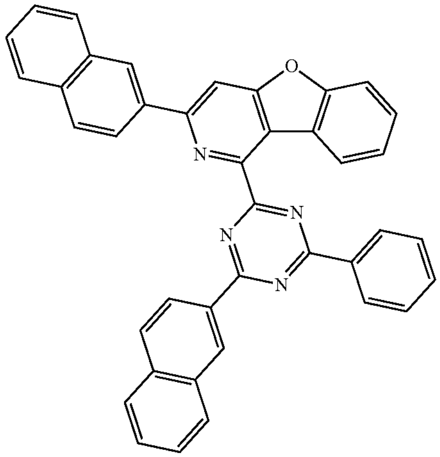
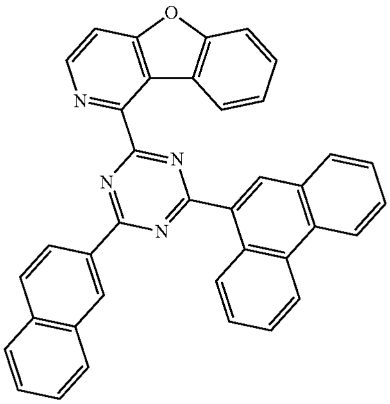
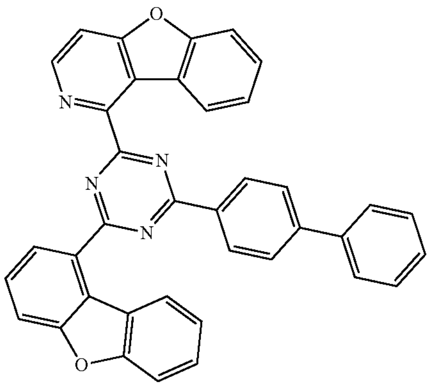
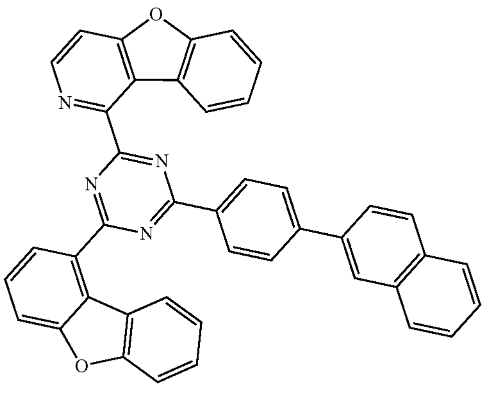

-continued
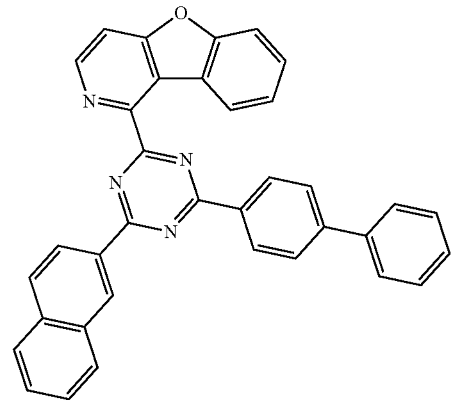
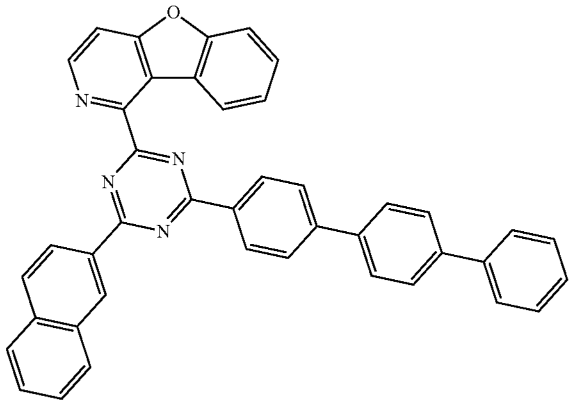
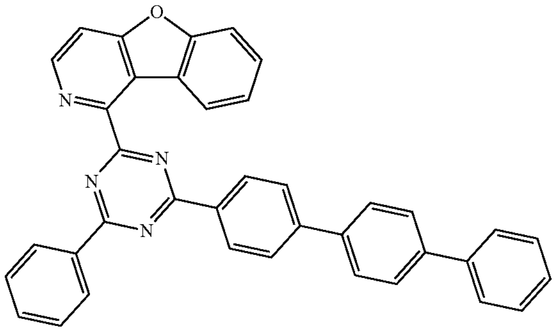
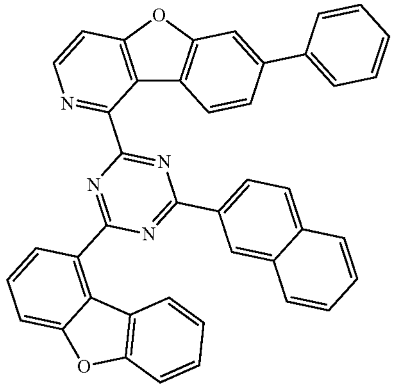
-continued
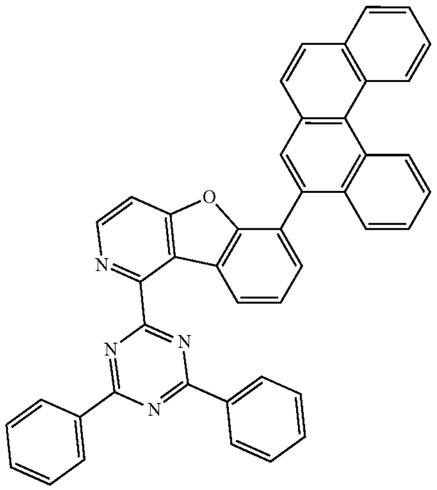
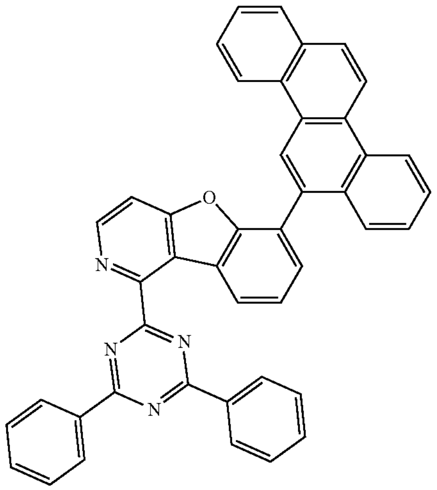
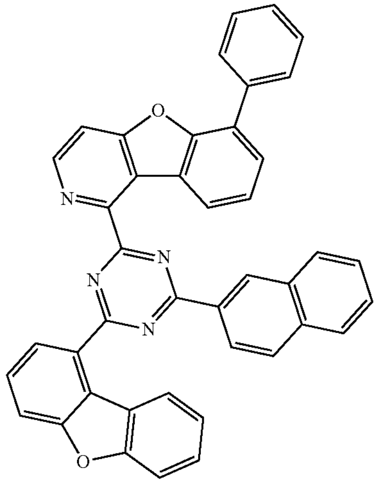

-continued
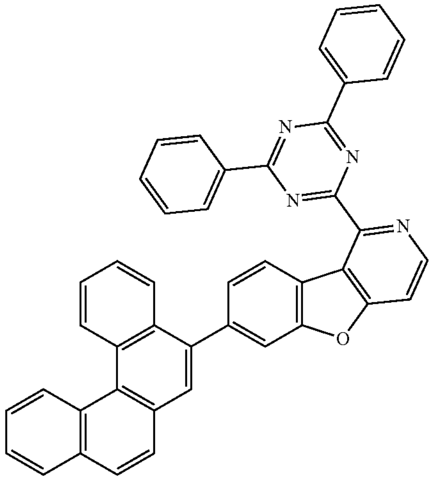
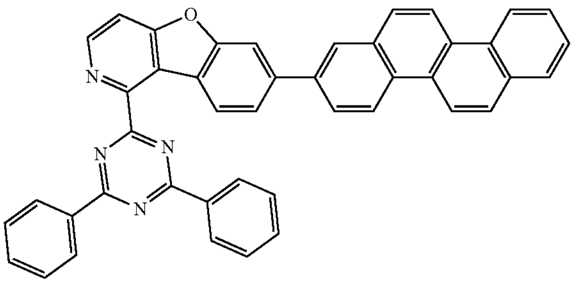
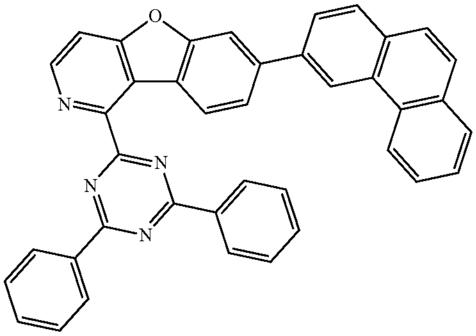
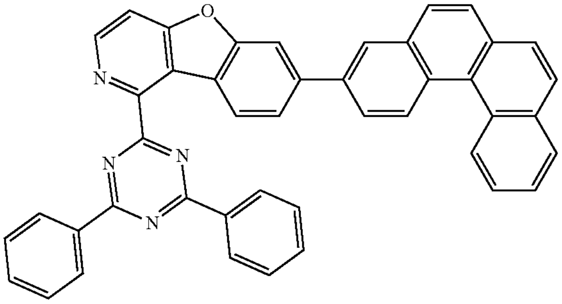
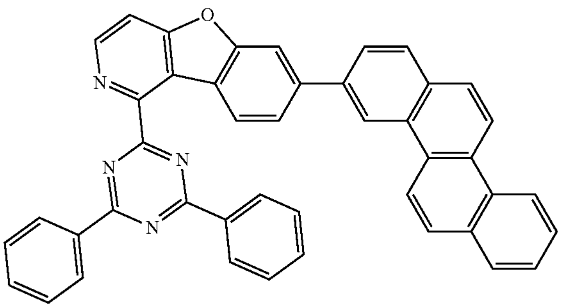
-continued
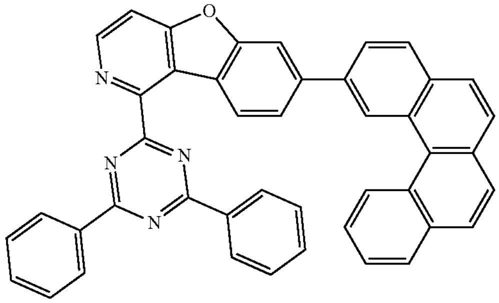
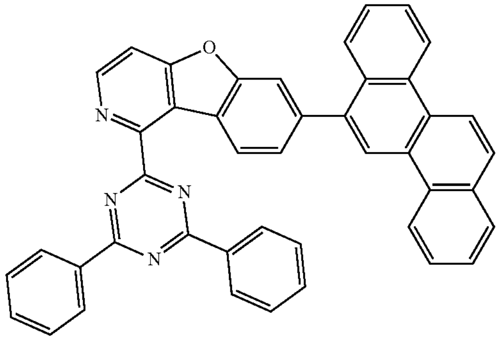
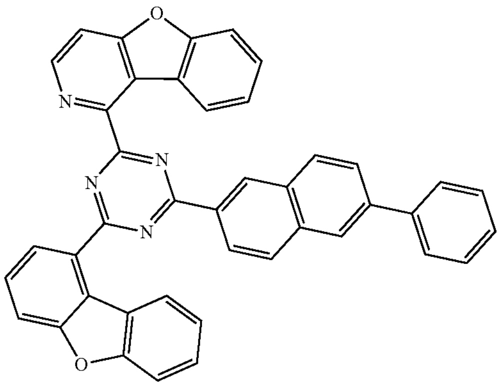
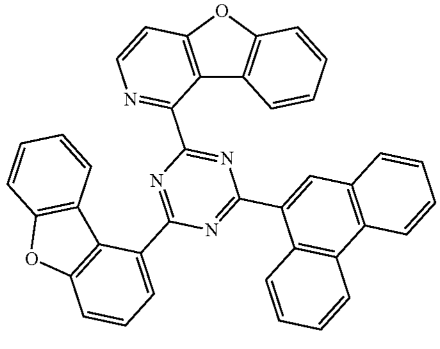
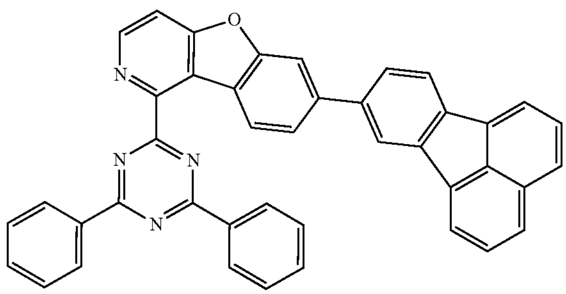

-continued
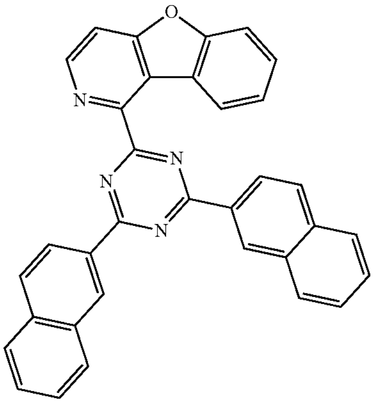
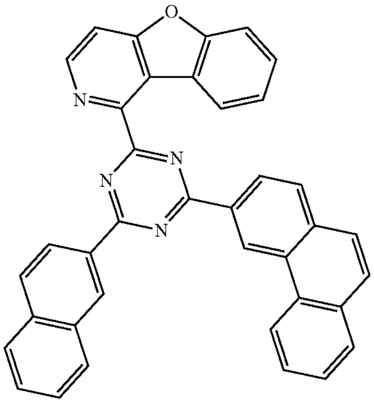
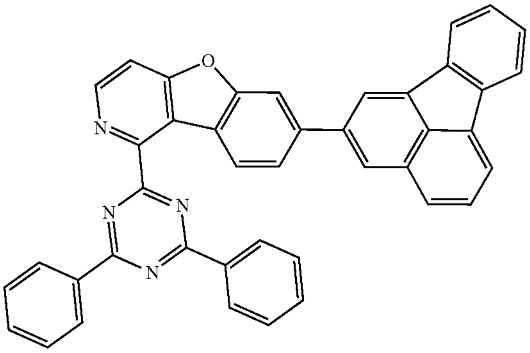
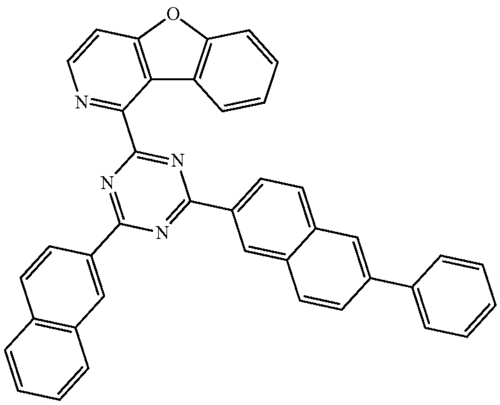
-continued
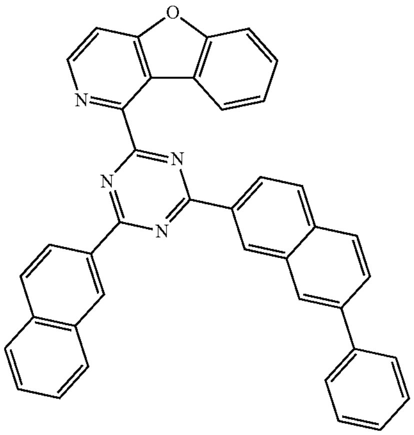
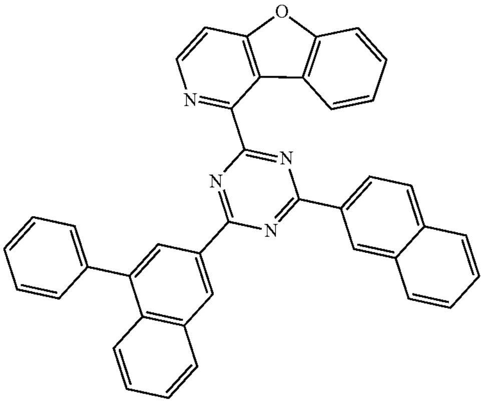
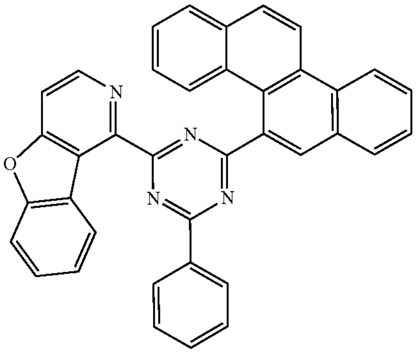
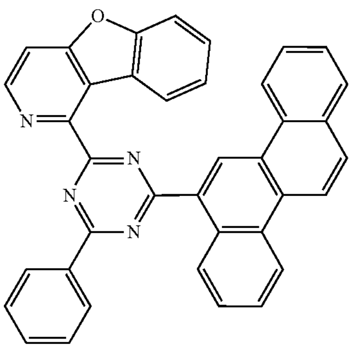

-continued
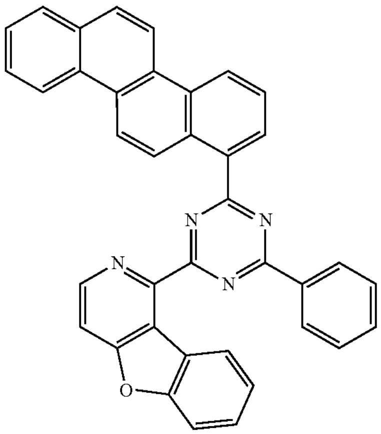
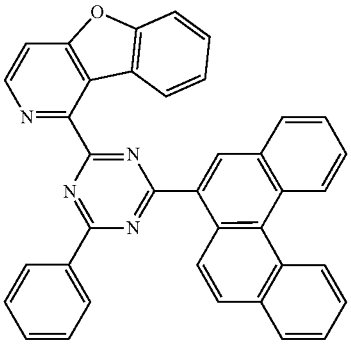
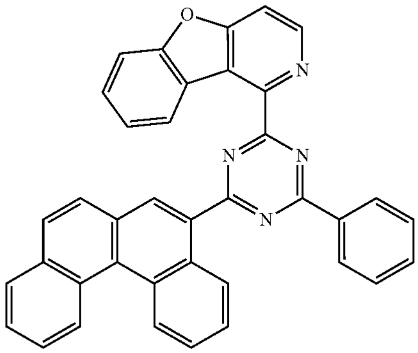
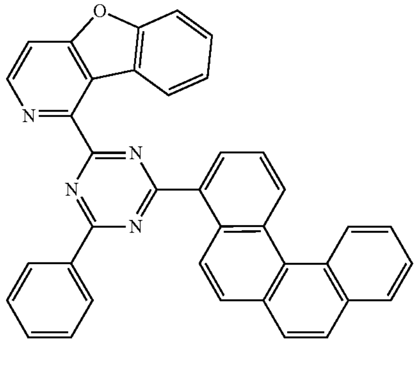
-continued
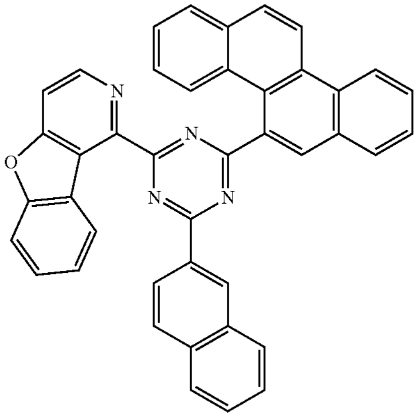
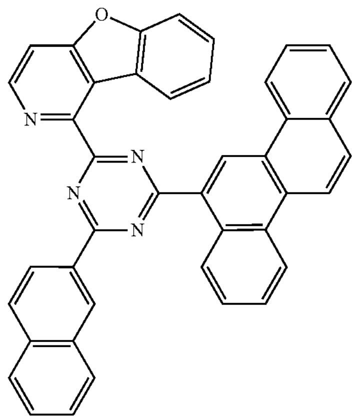
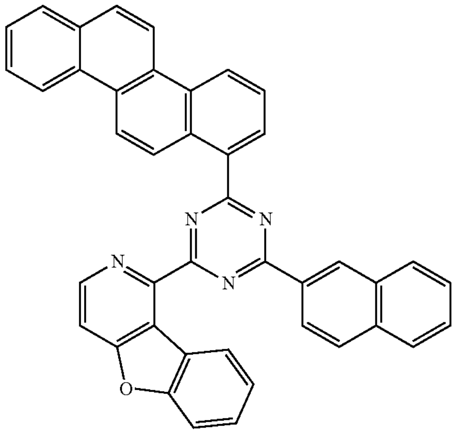
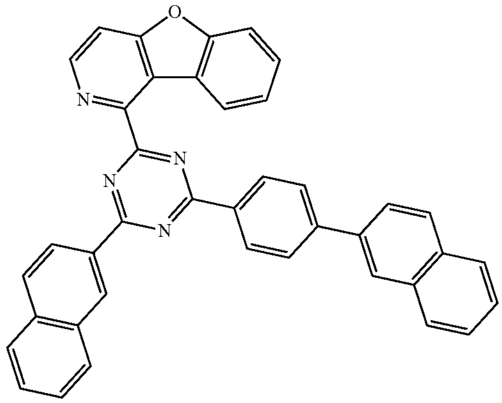

-continued
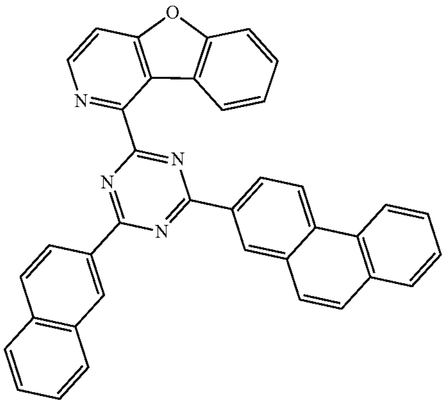
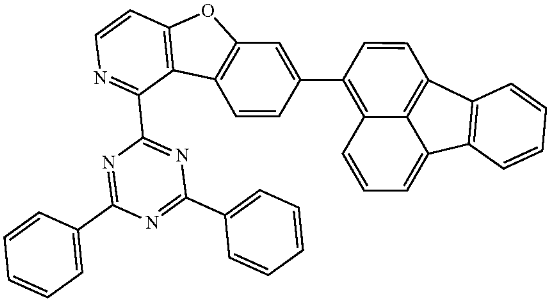
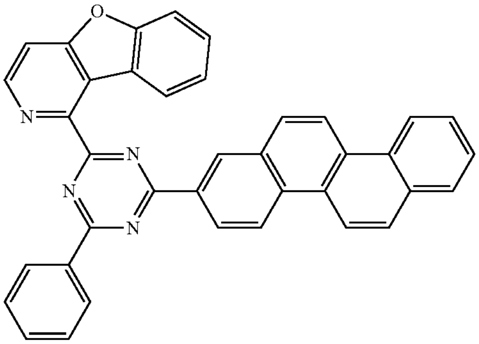
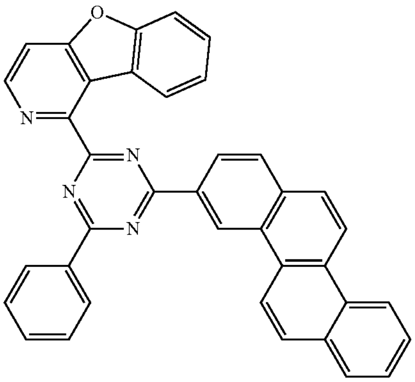
-continued
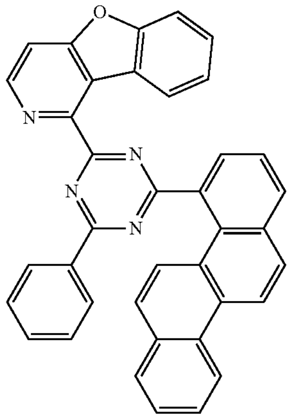
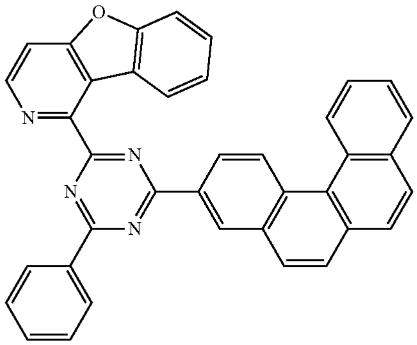
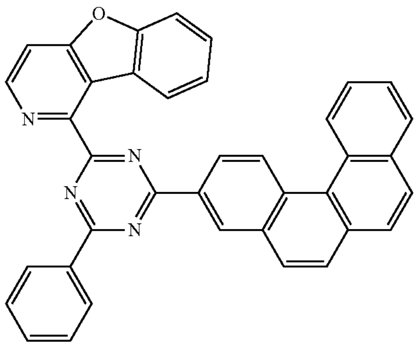
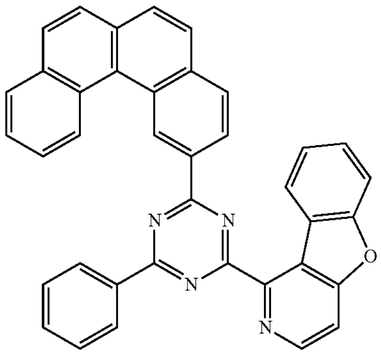

-continued
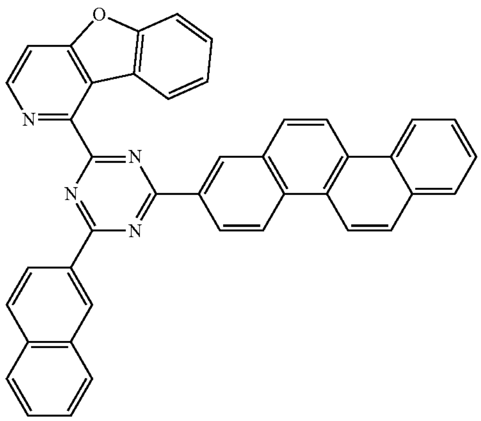
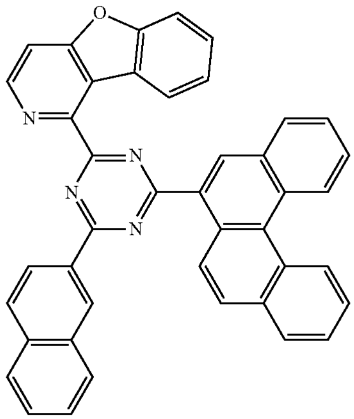
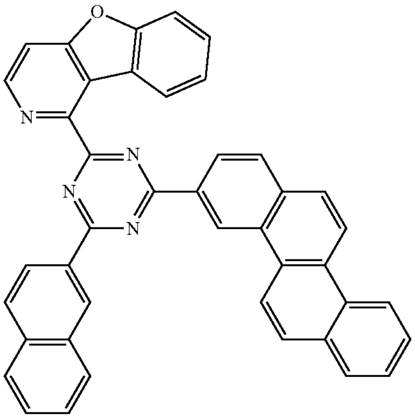
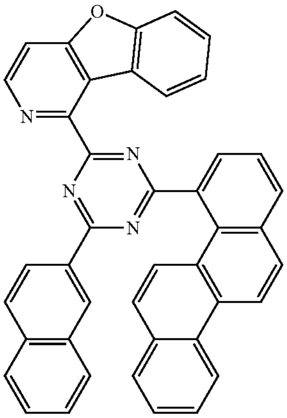 [SMILES: c1ccc2cc(-c3nc(-c4cccc5ccc6c7ccccc7ccc6c45)nc(-c4nccc5oc6ccccc6c45)n3)ccc2c1]
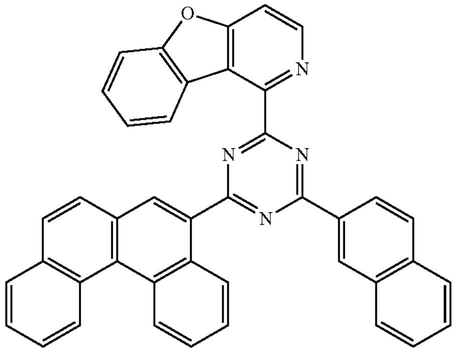
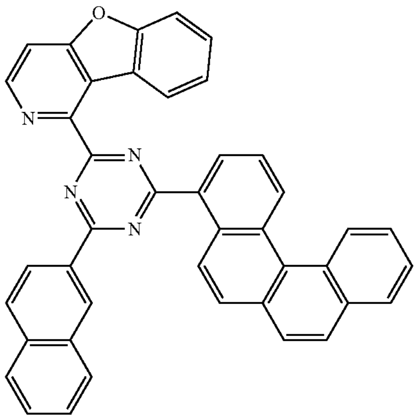
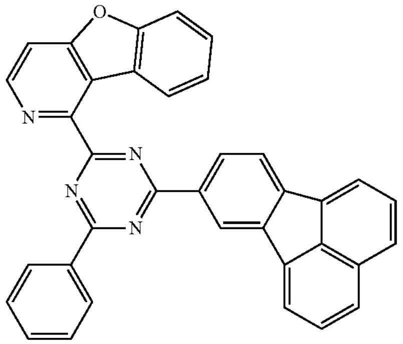

-continued
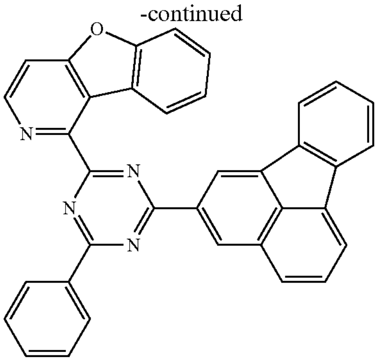
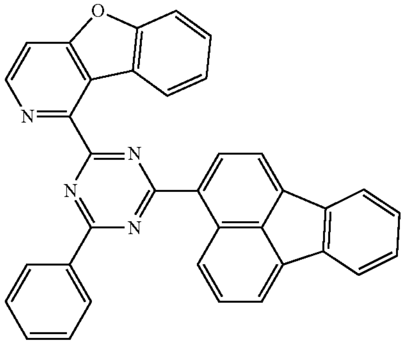
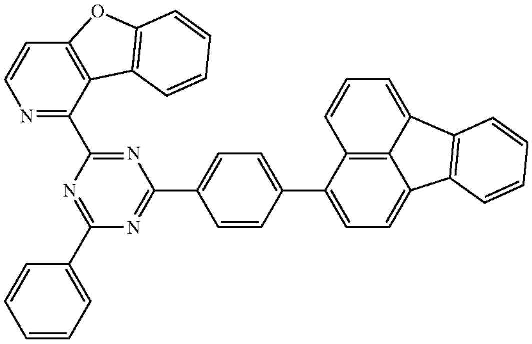
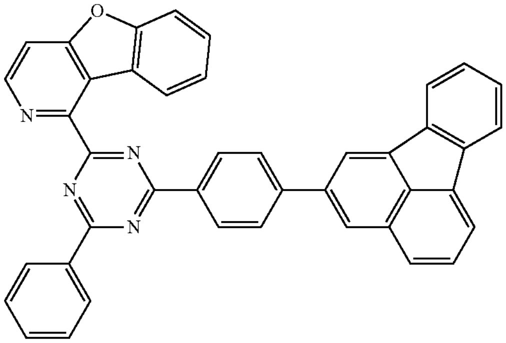
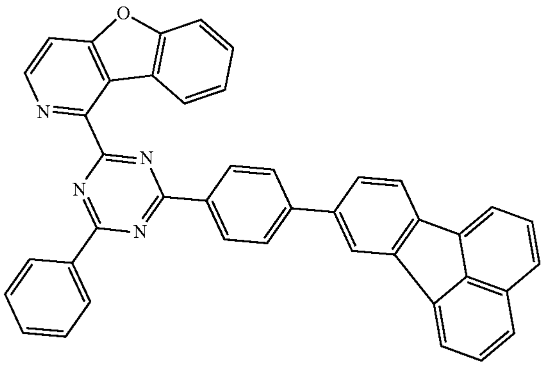
-continued
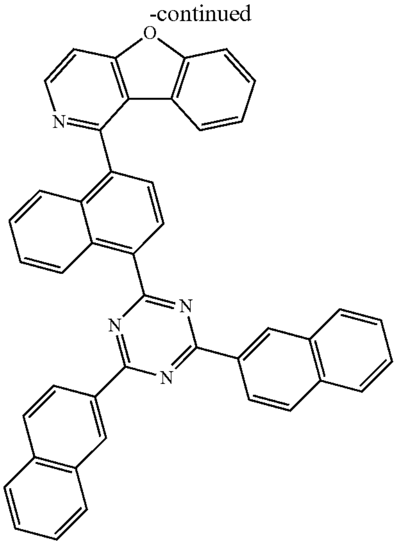
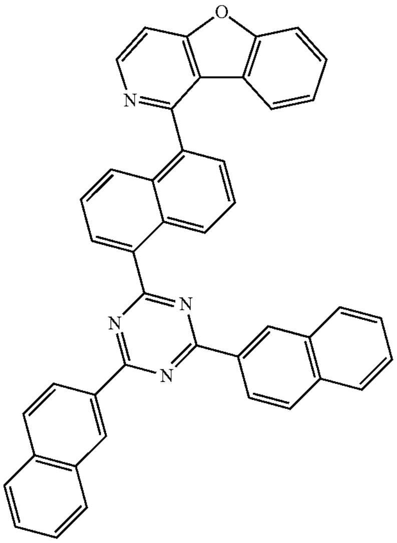
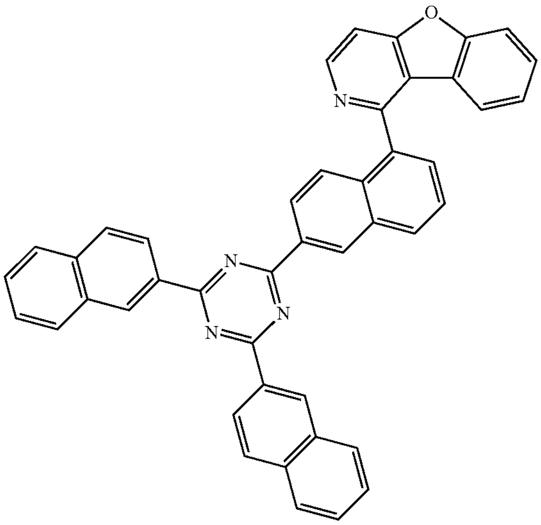

-continued
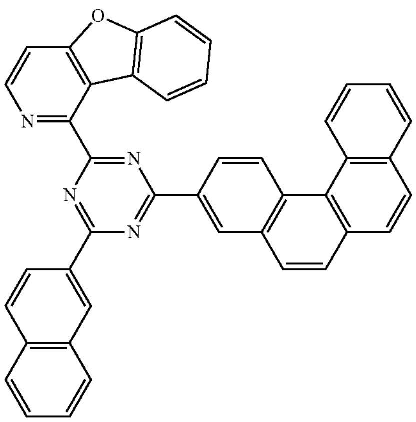
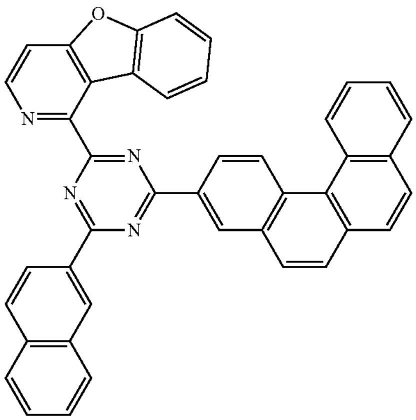
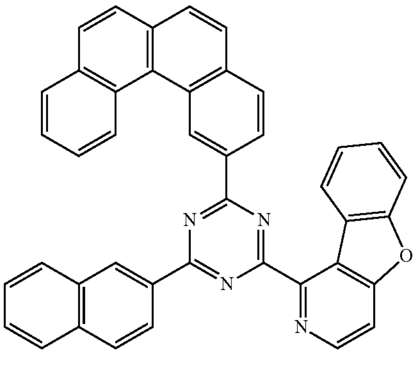
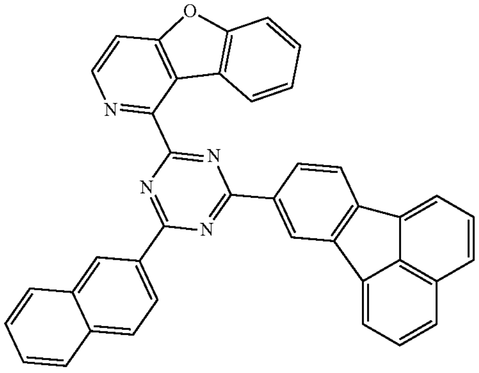
-continued
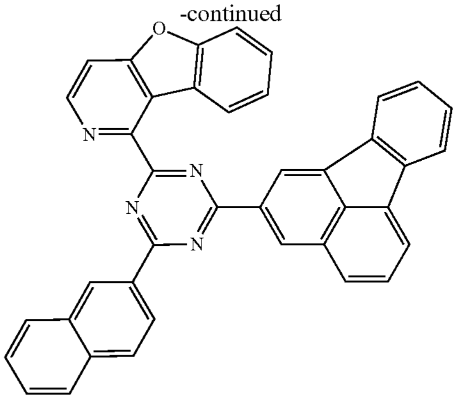
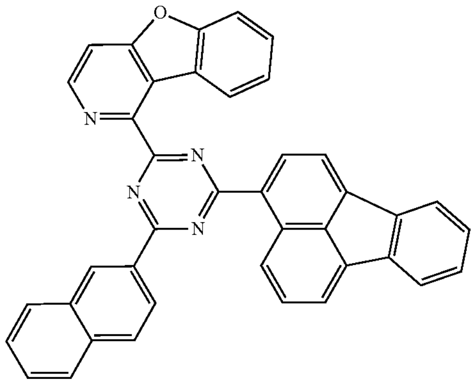 [SMILES: c1ccc2c(c1)-c1cccc3c(-c4nc(-c5ccc6ccccc6c5)nc(-c5nccc6oc7ccccc7c56)n4)ccc-2c13]
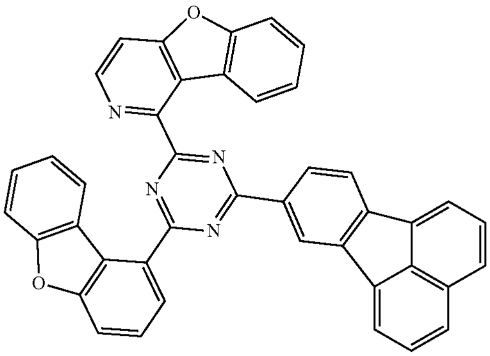
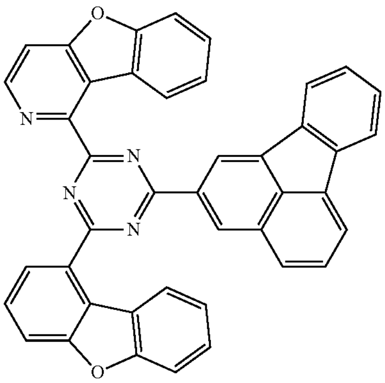

-continued
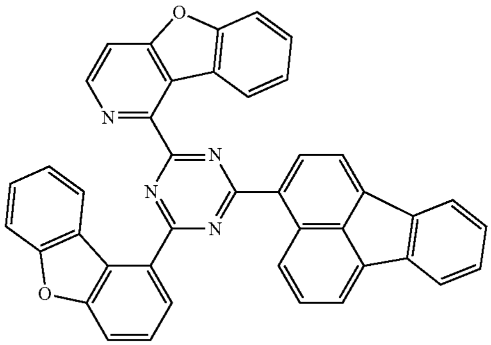
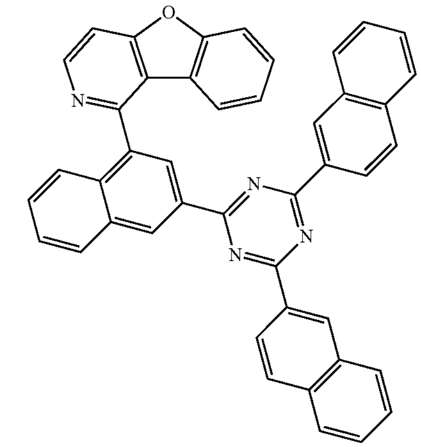
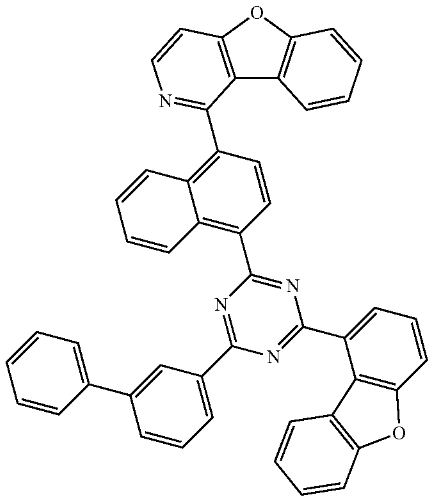
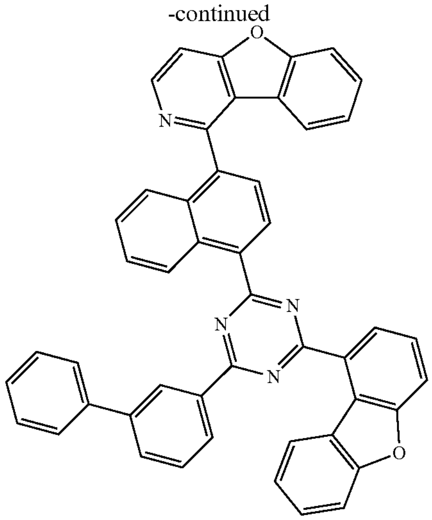
-continued
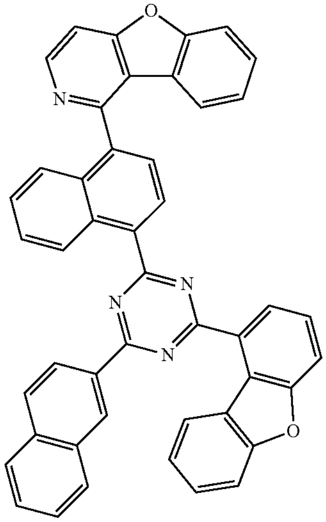
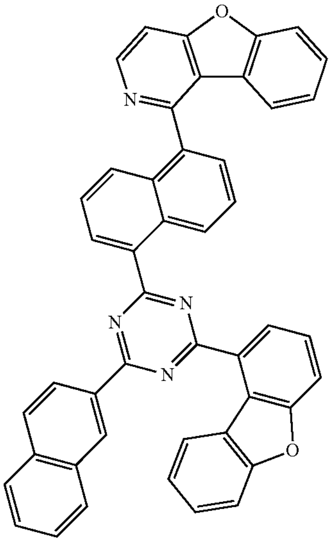

-continued
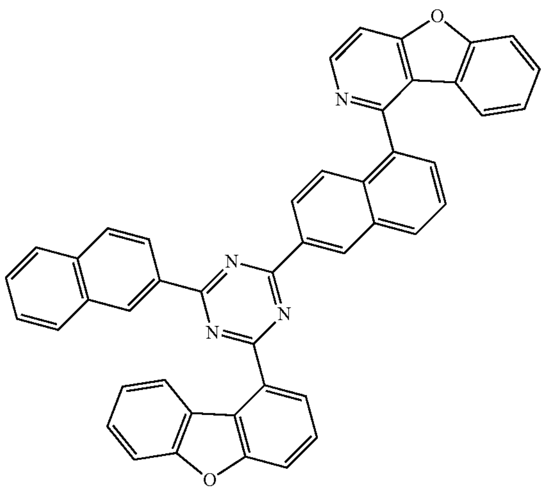
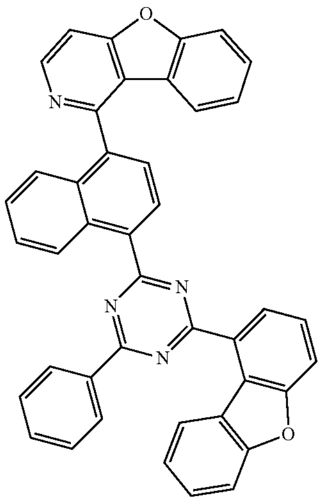
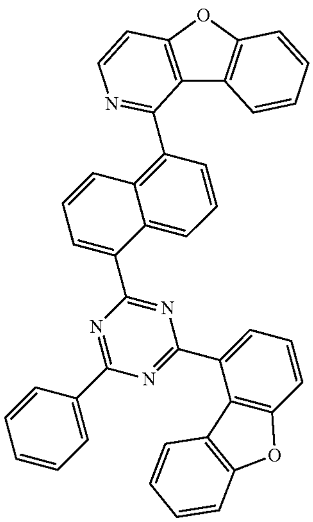
-continued
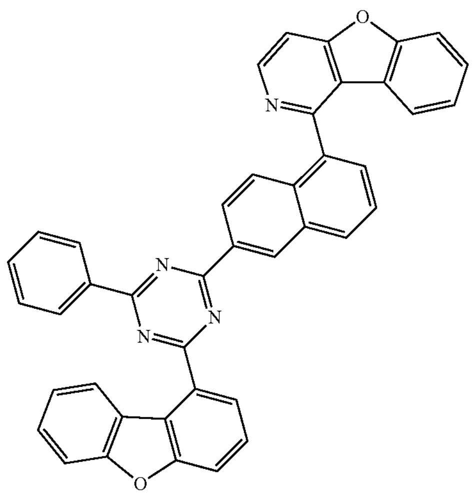
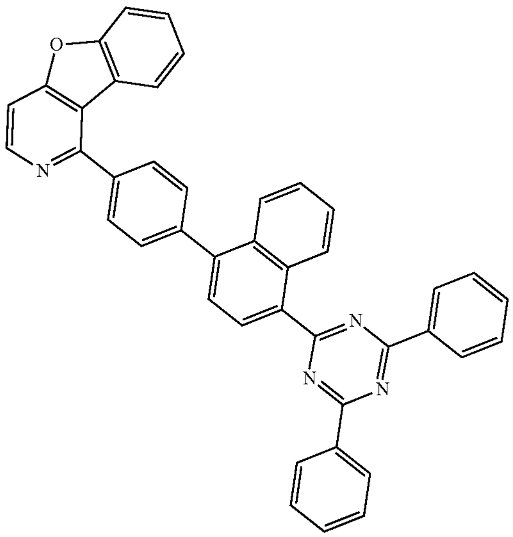
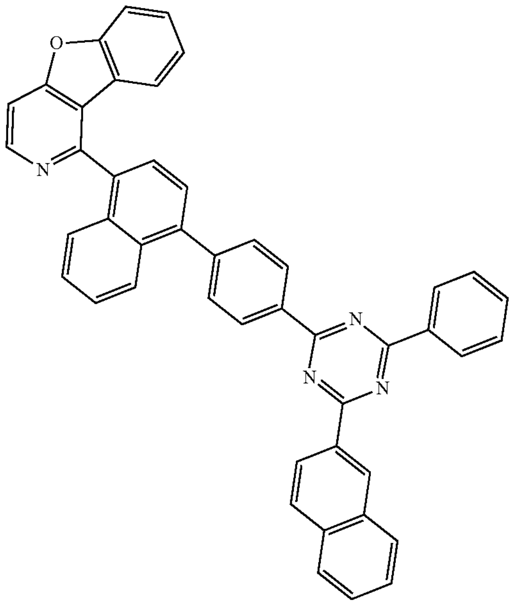

-continued
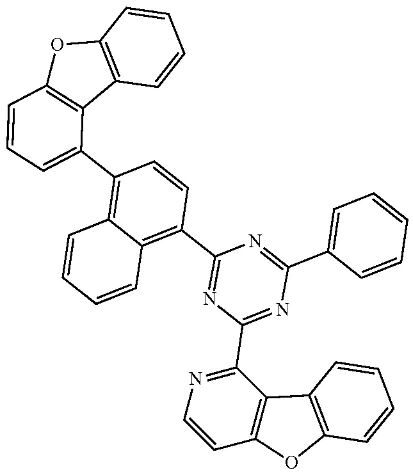
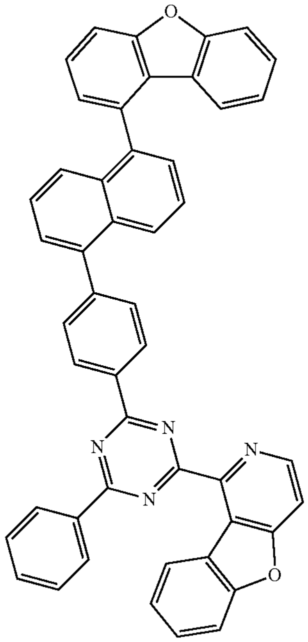
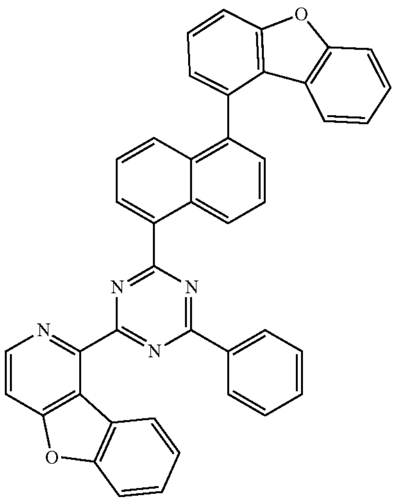
-continued
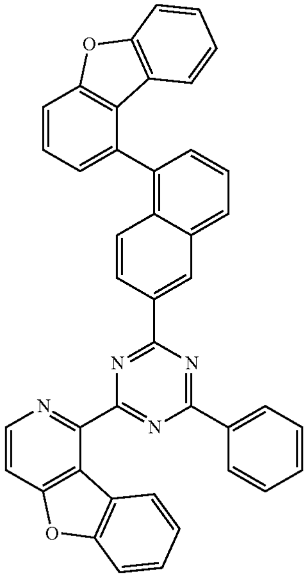
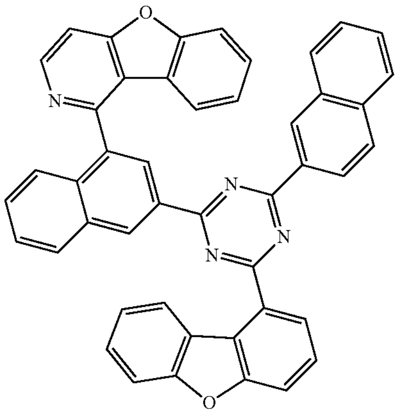
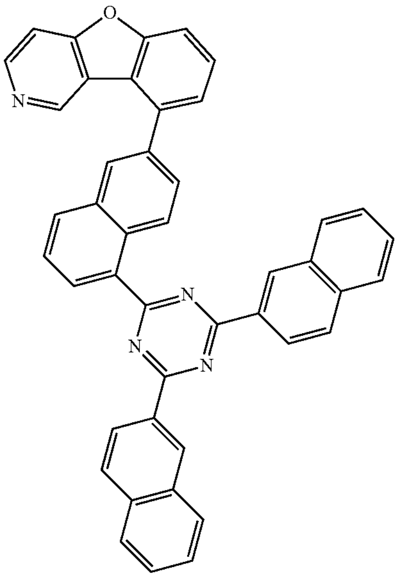

-continued
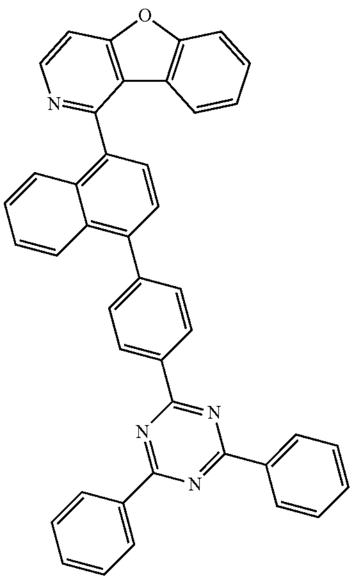
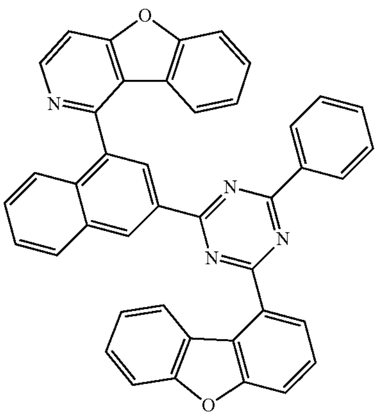
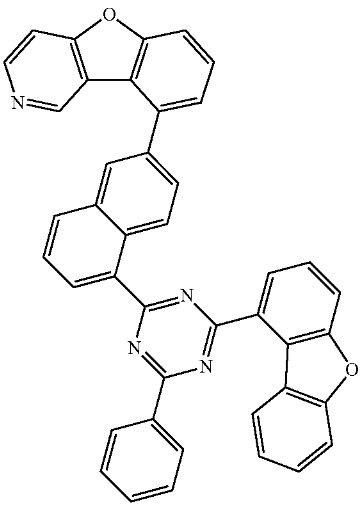
-continued
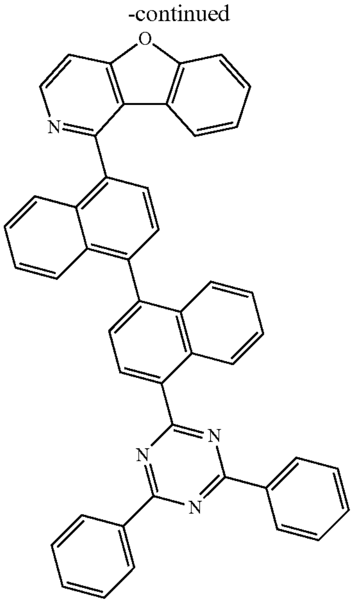
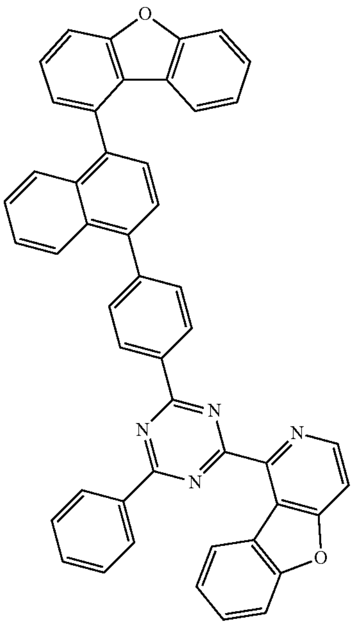

-continued
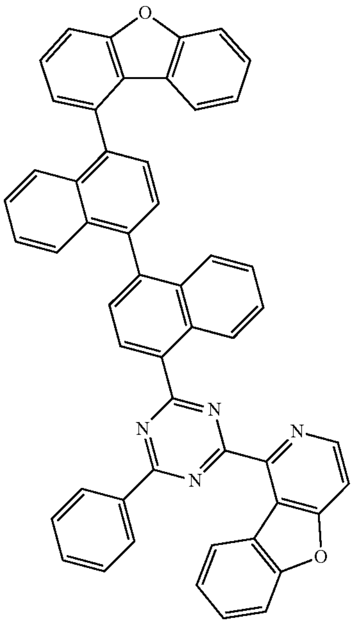
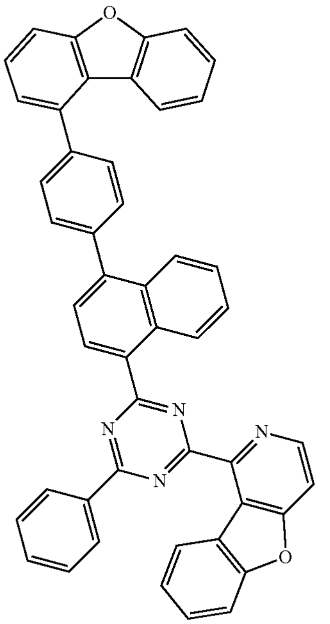
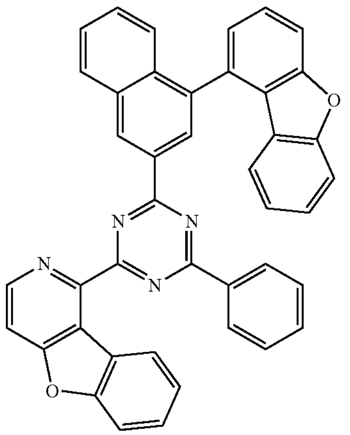
-continued
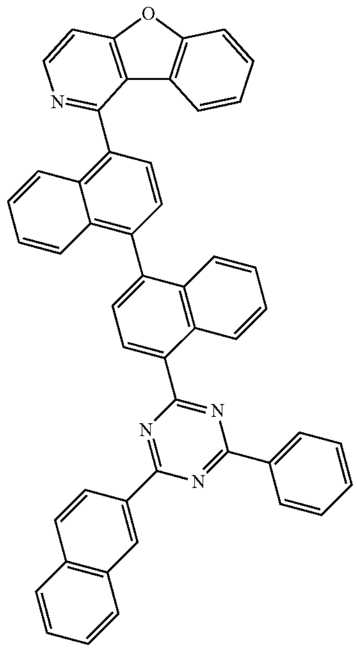
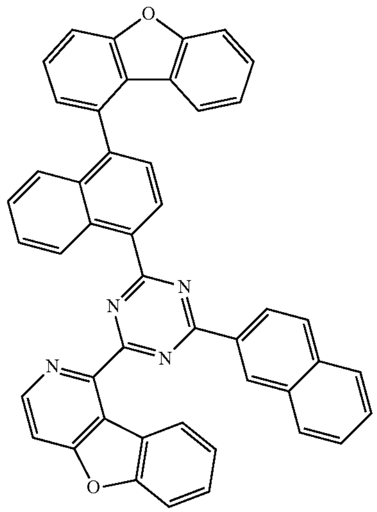
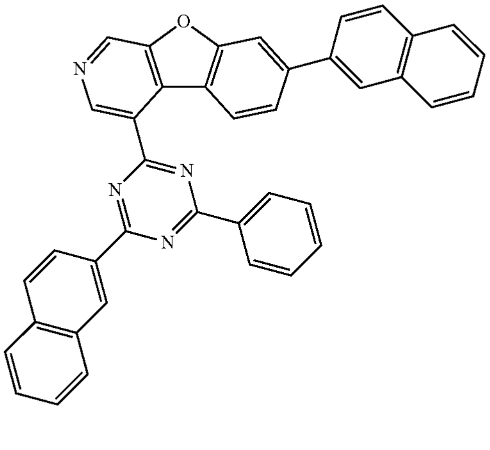

-continued
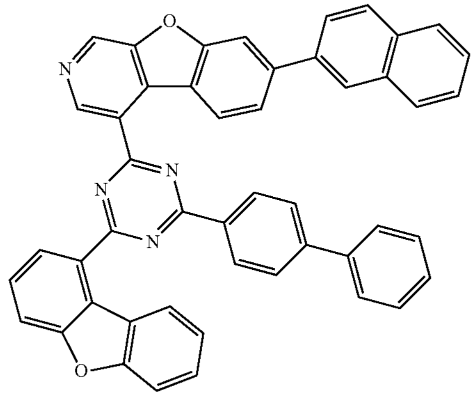
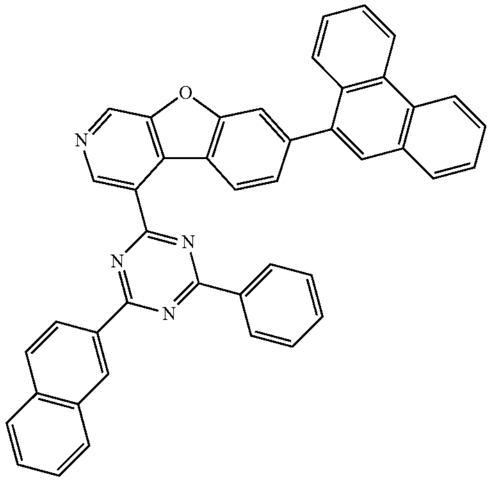
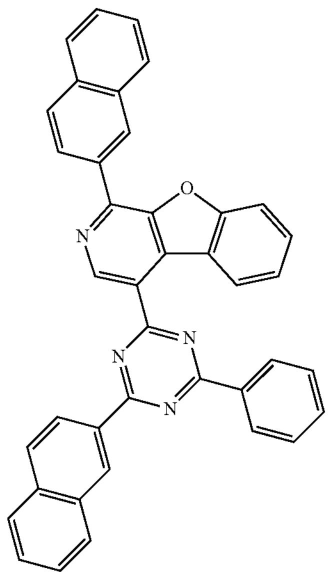
-continued
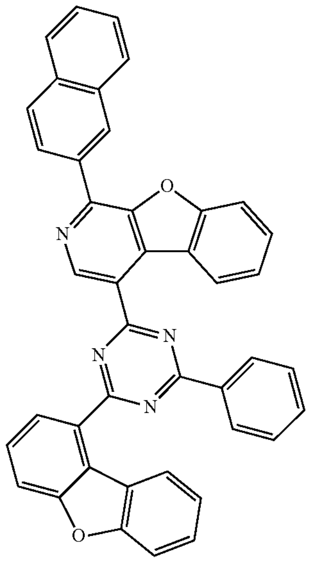
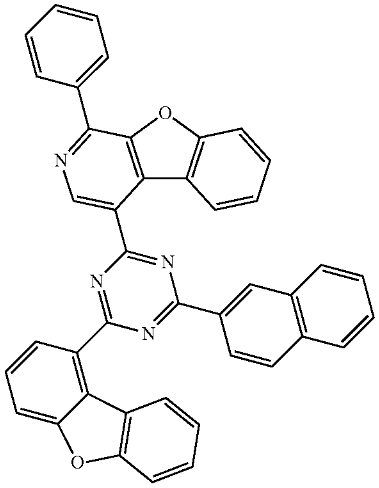
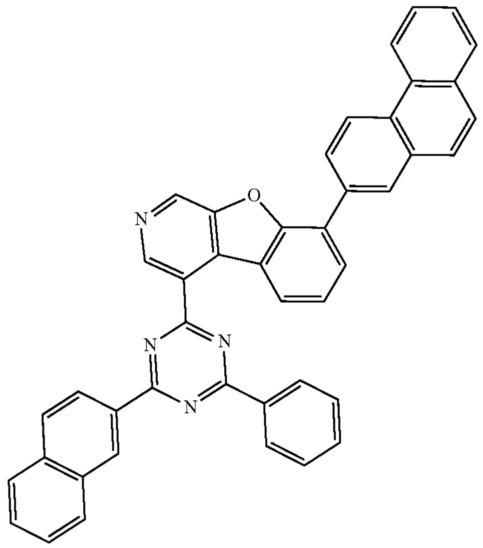

-continued
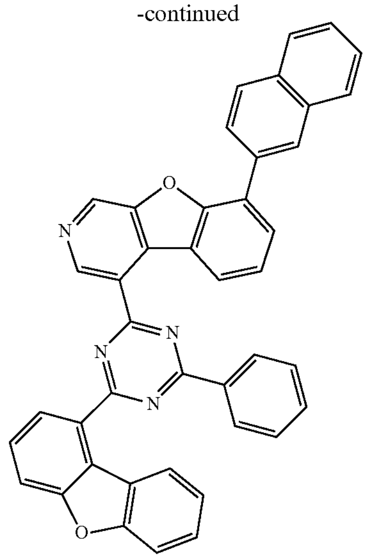
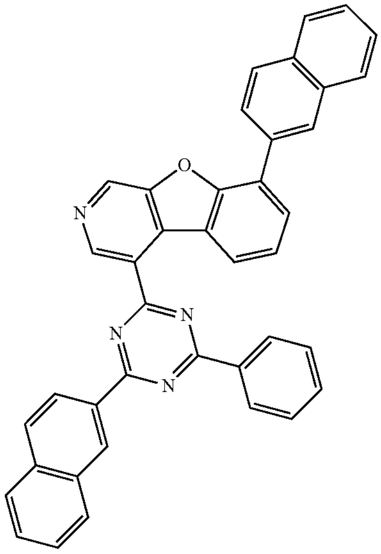
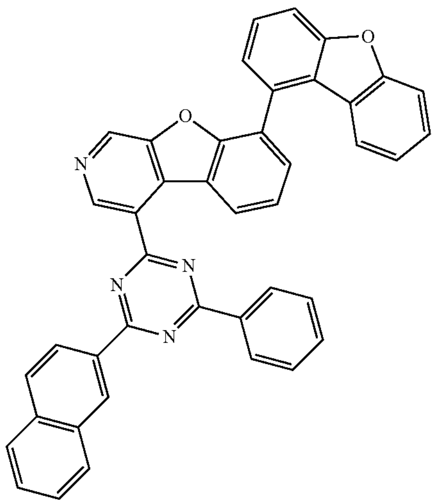
-continued
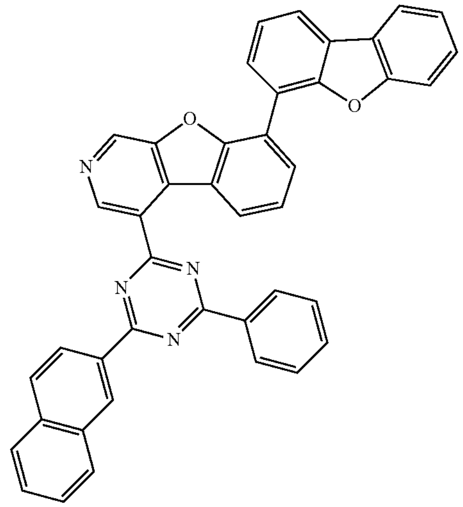
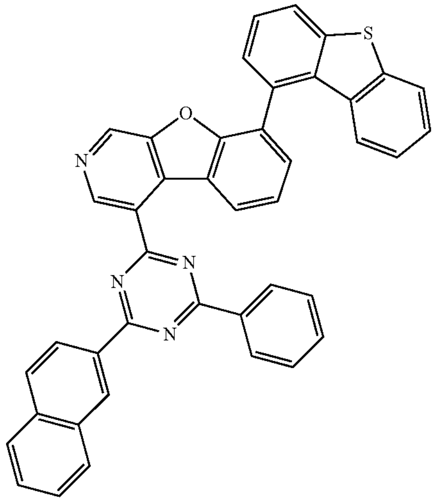
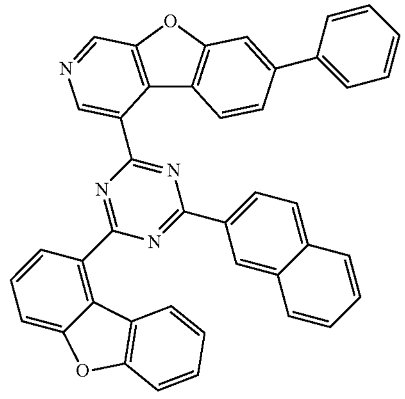

-continued
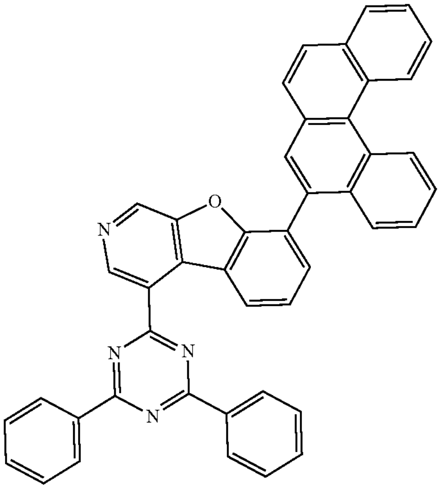
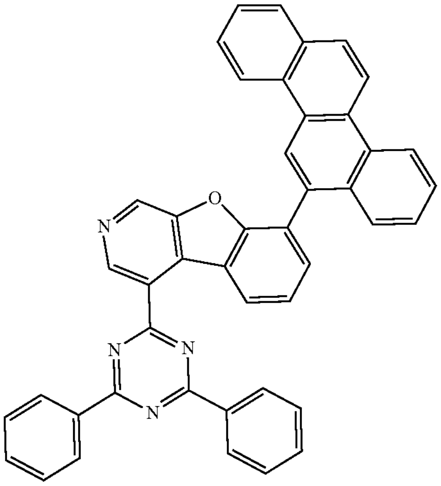
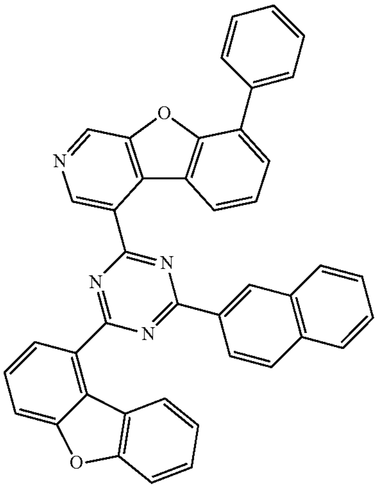
-continued
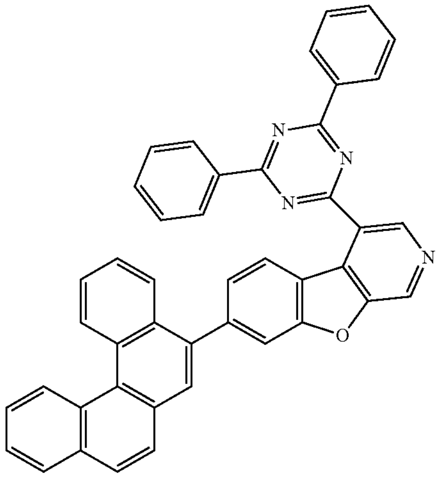
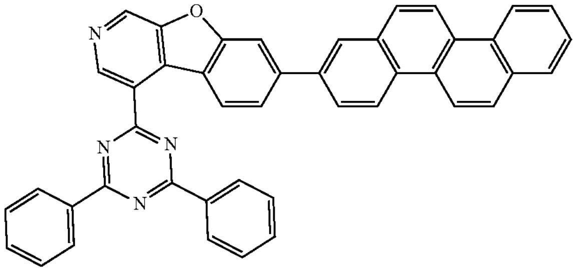
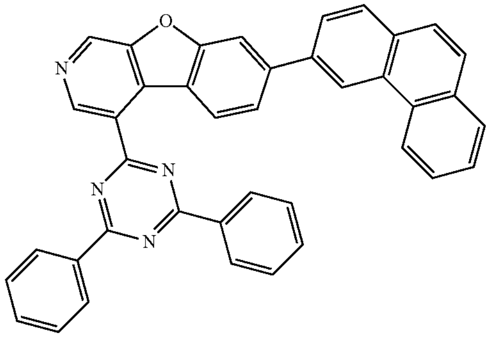
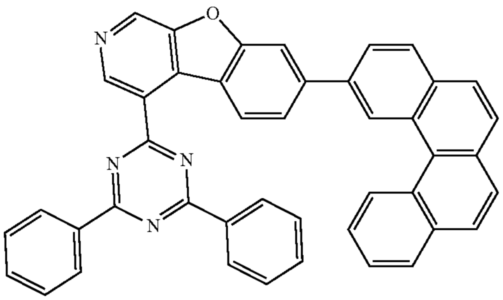
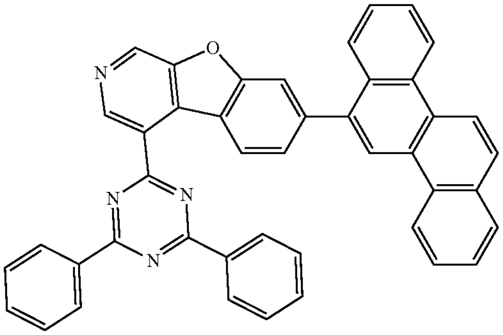

-continued
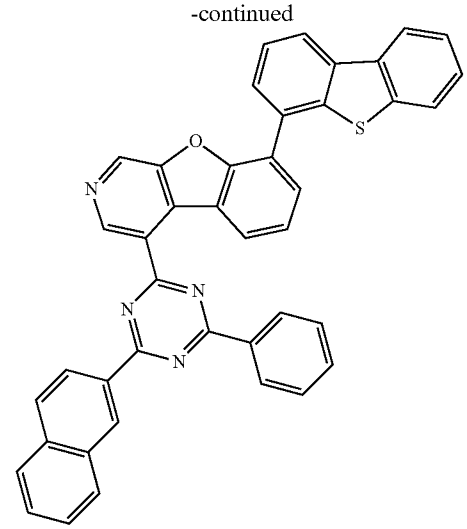
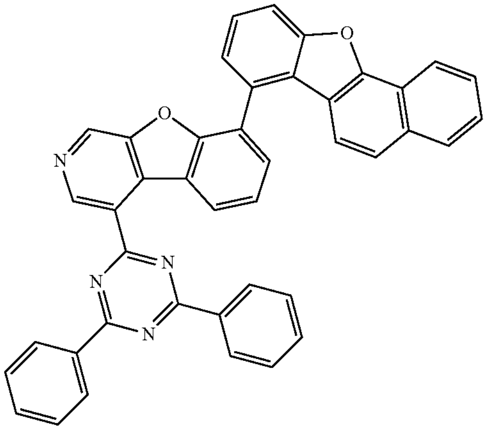
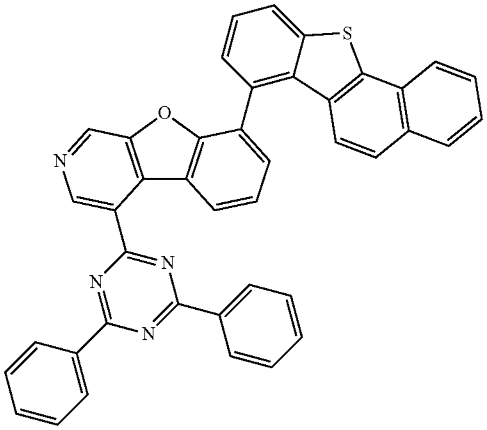
-continued
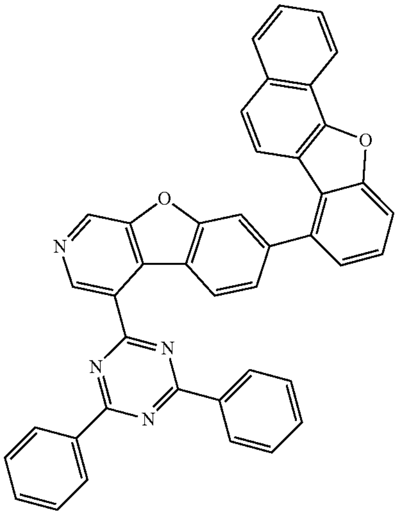
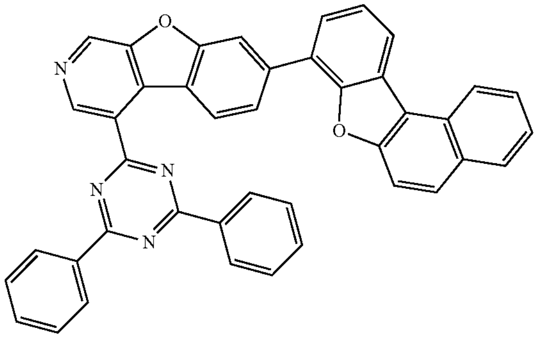
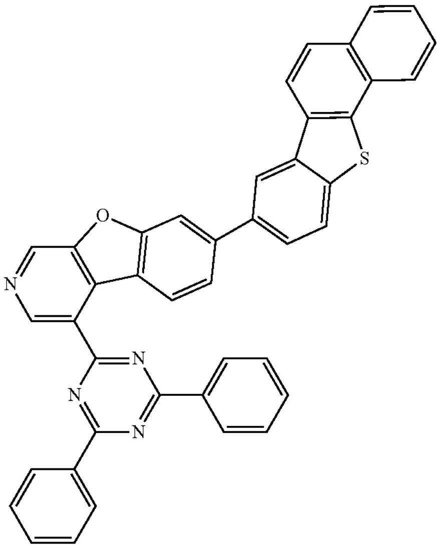

-continued
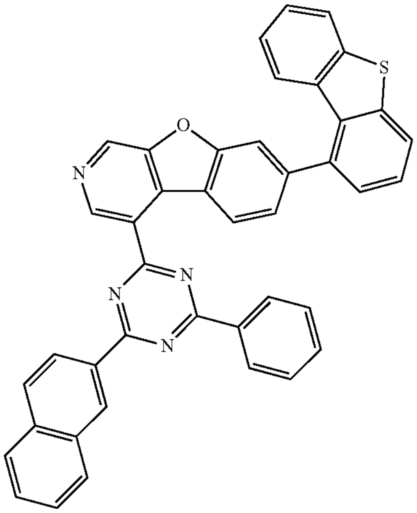
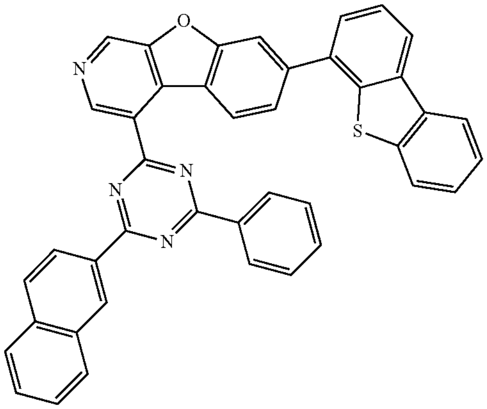
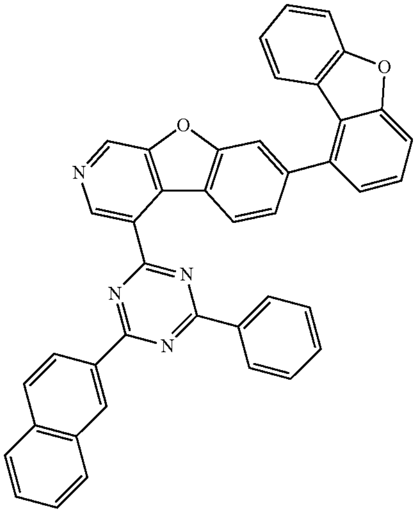
-continued
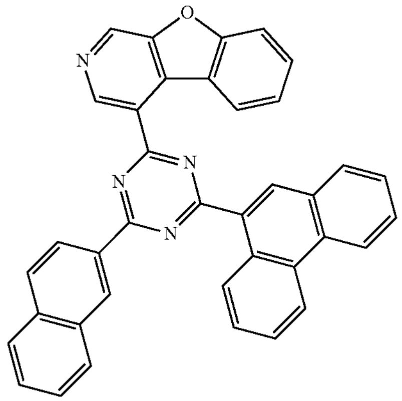
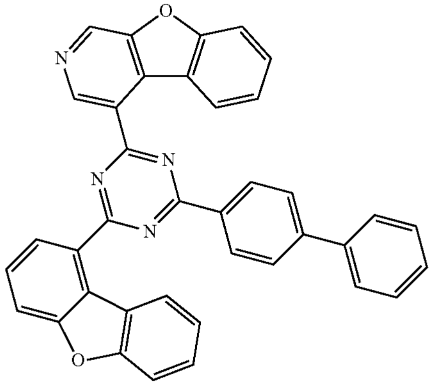
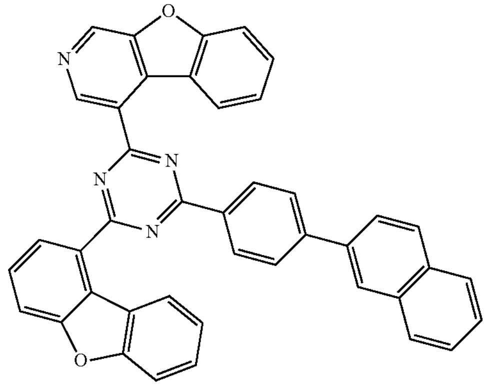
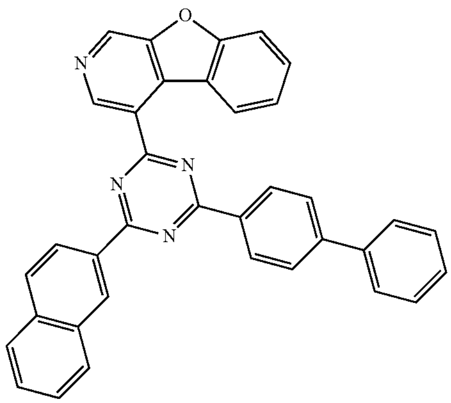

-continued
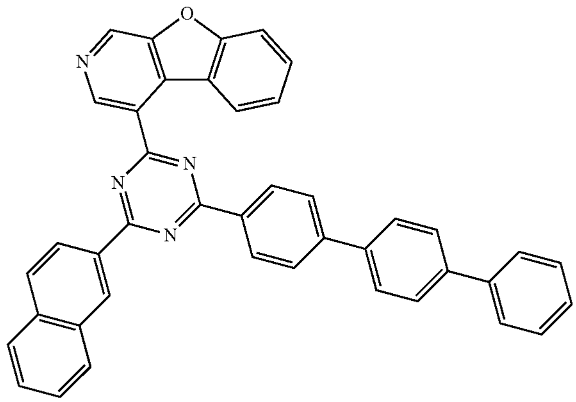
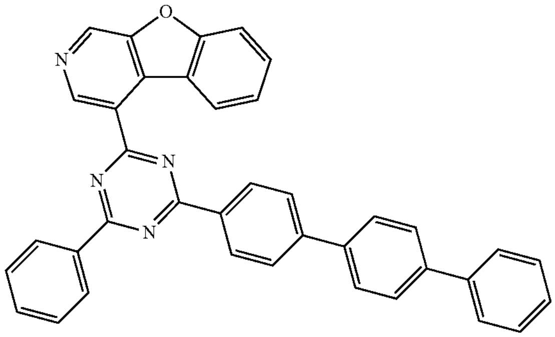
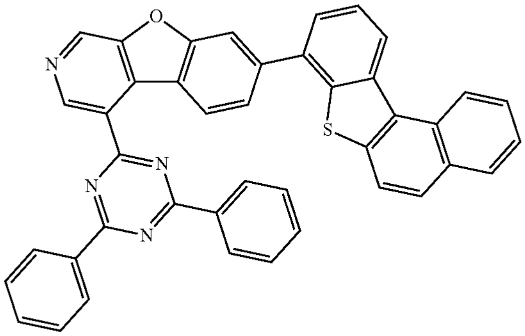
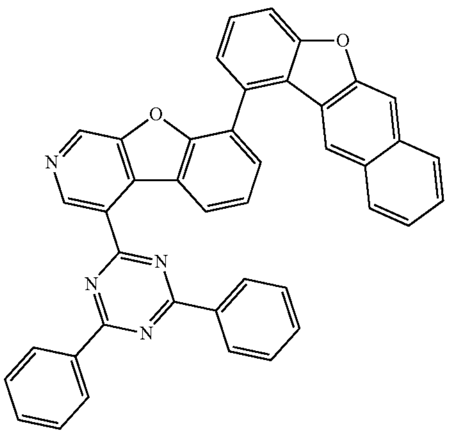
-continued
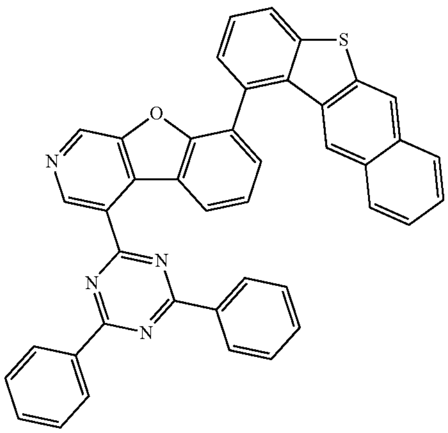
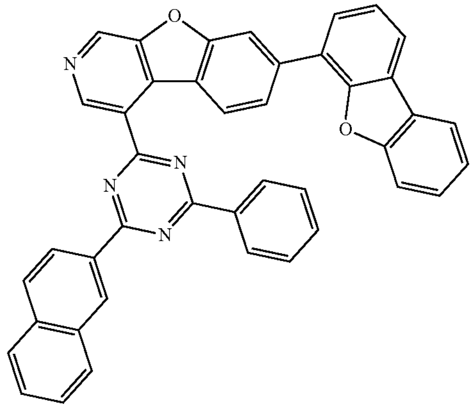
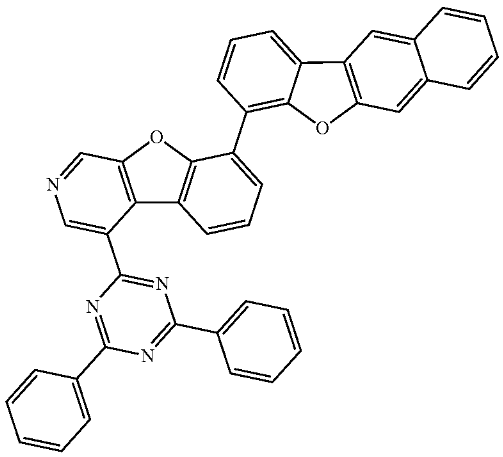
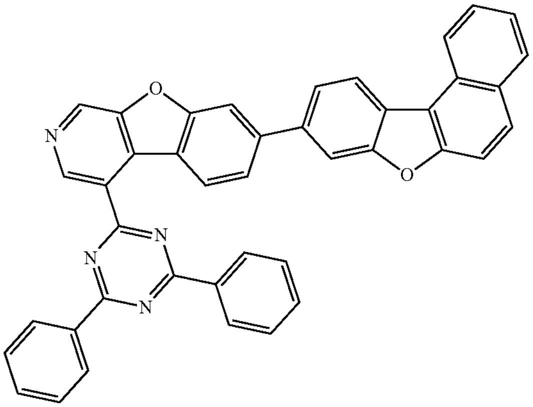

-continued
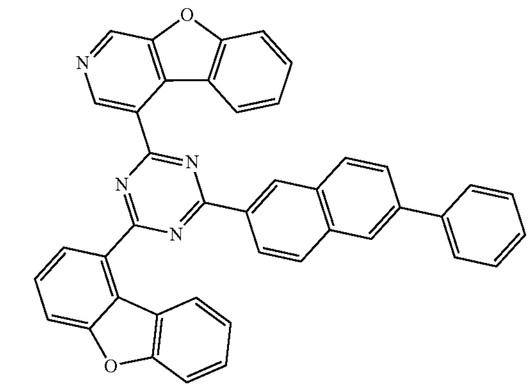
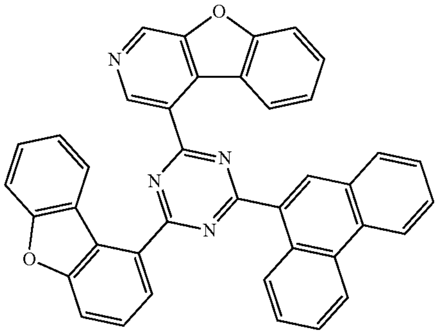
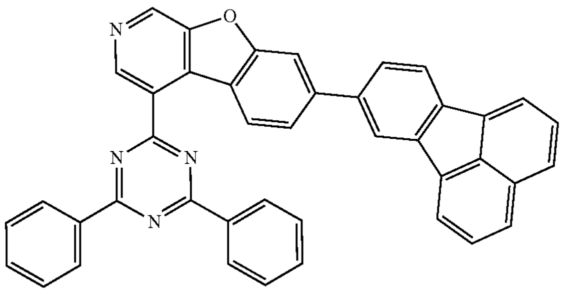
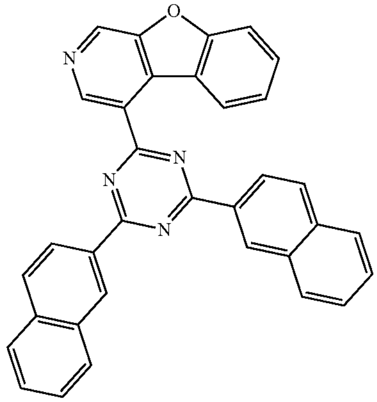
-continued
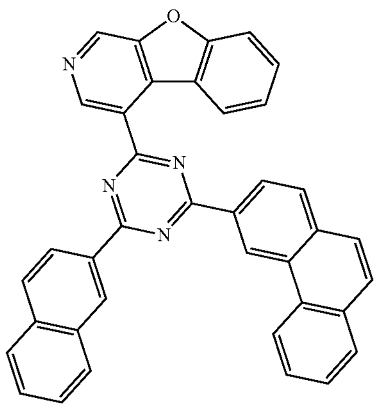
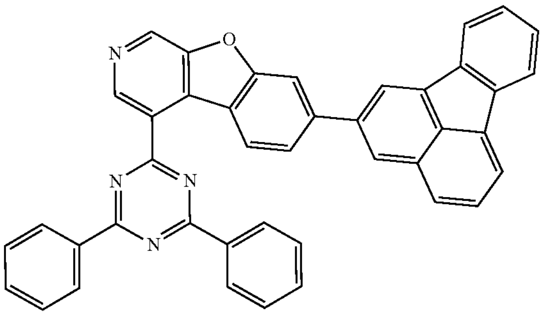
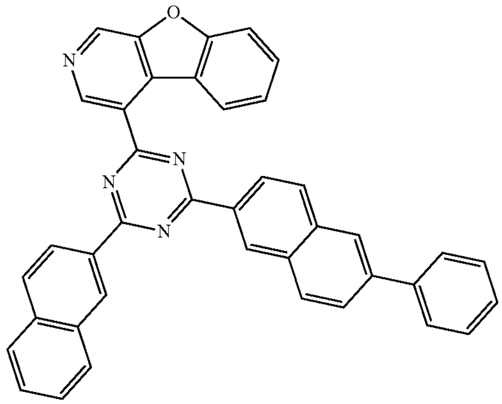
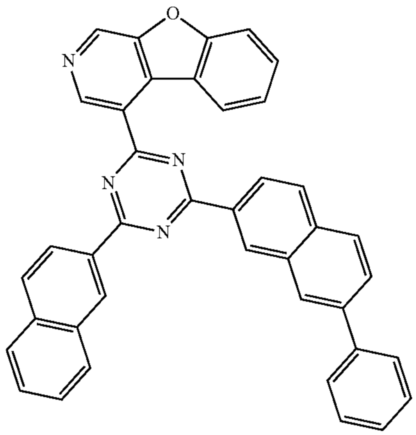

-continued
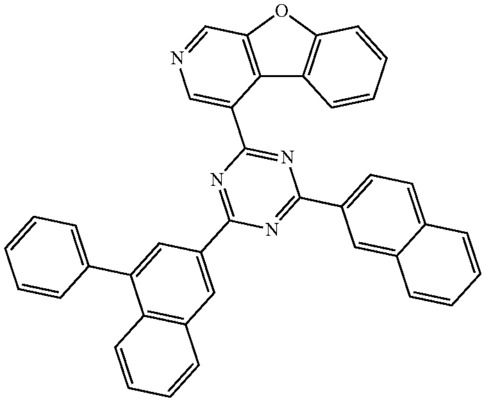
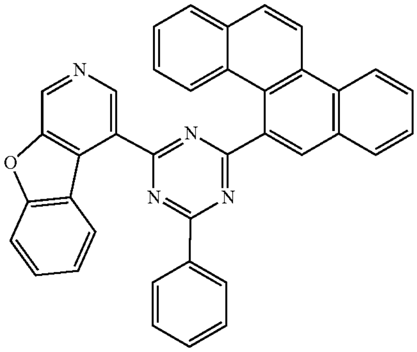
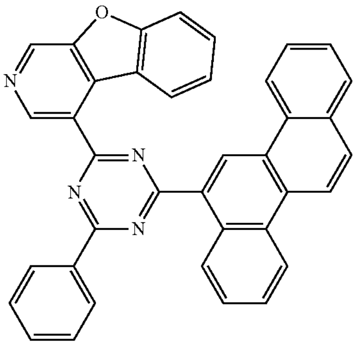
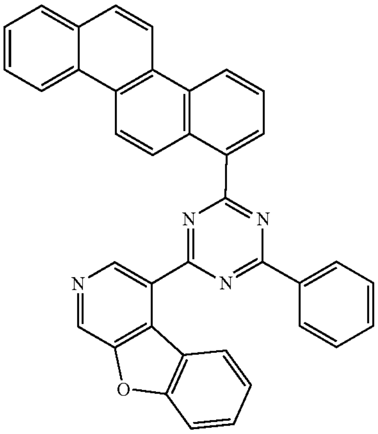
-continued
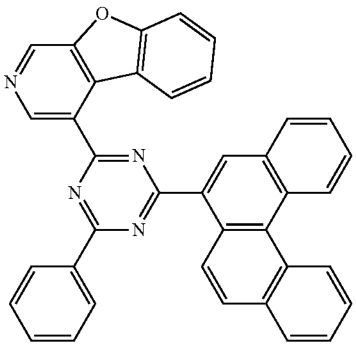
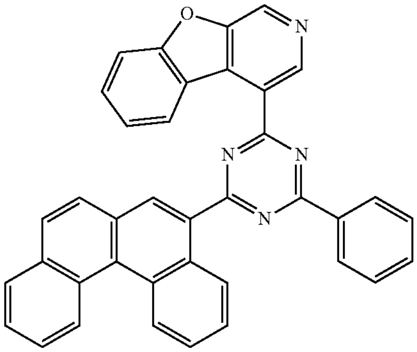
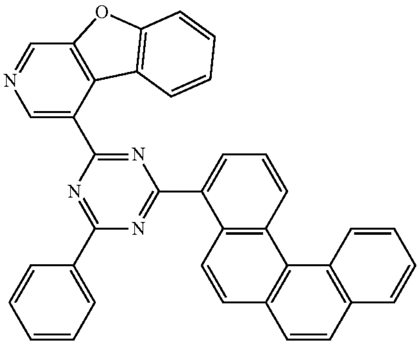
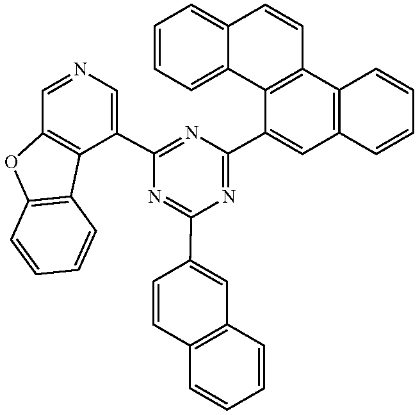

-continued
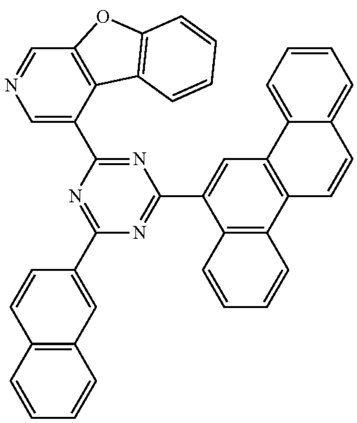
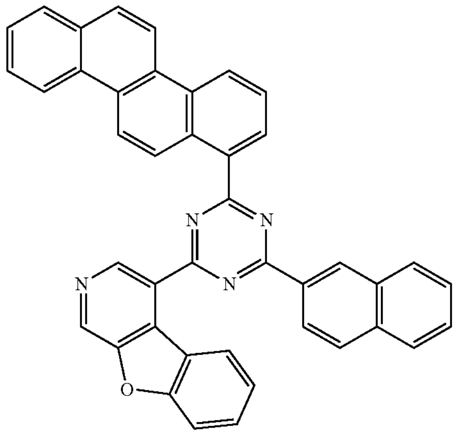
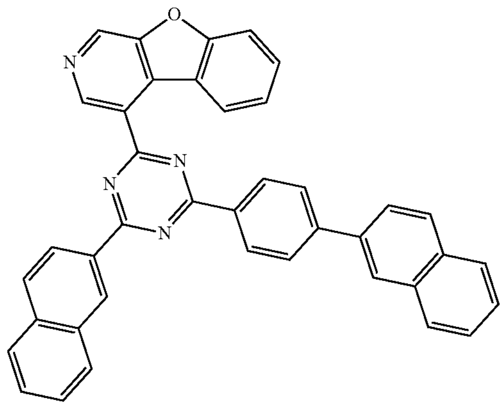
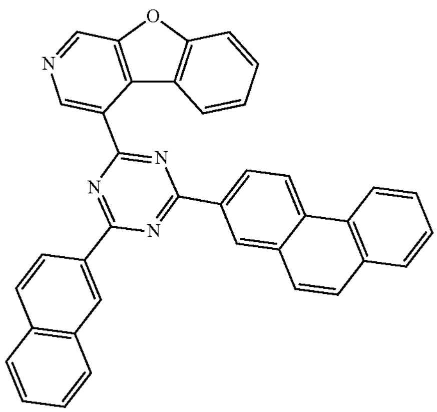
-continued
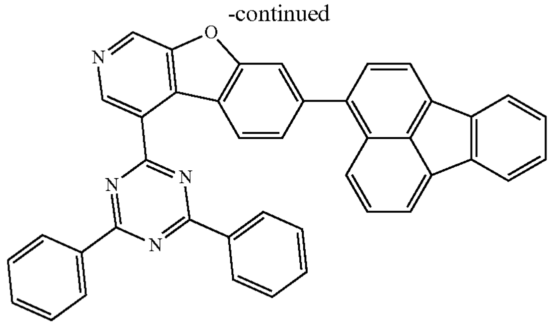
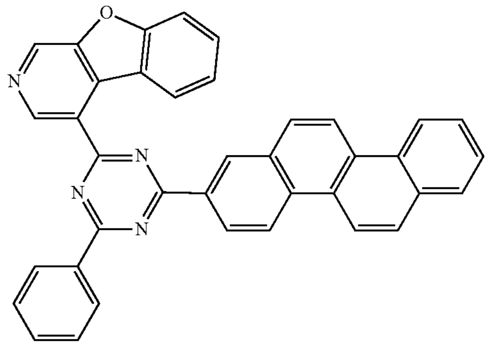
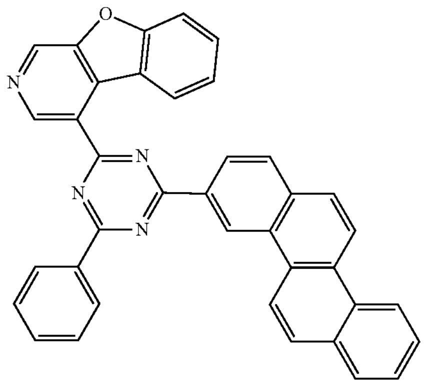
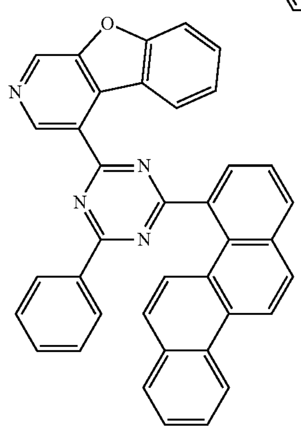

-continued
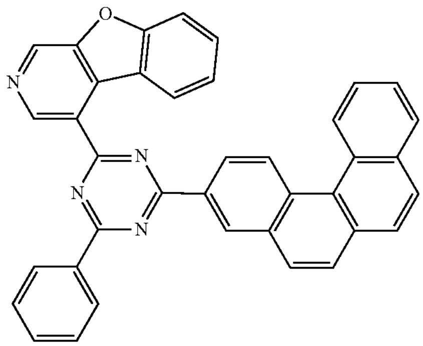
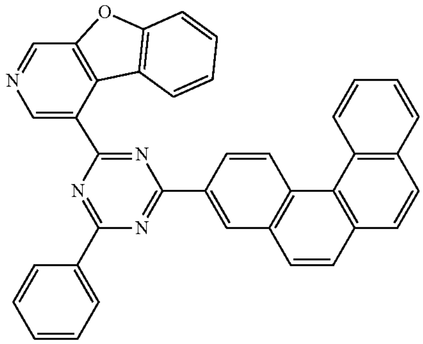
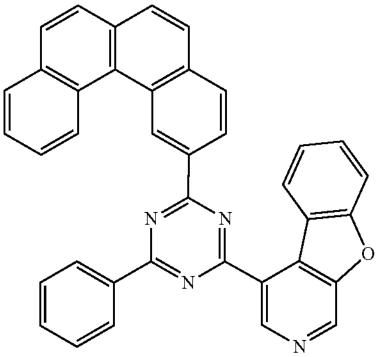
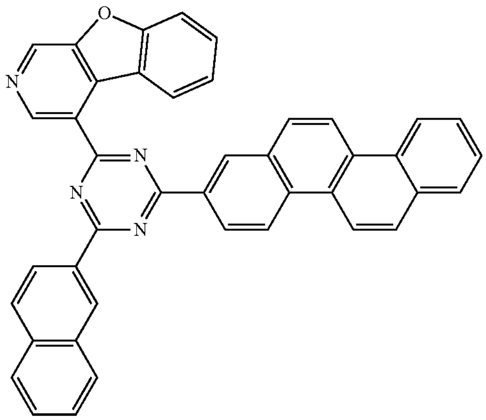
-continued
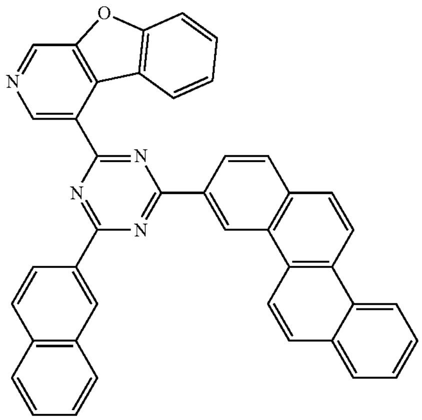
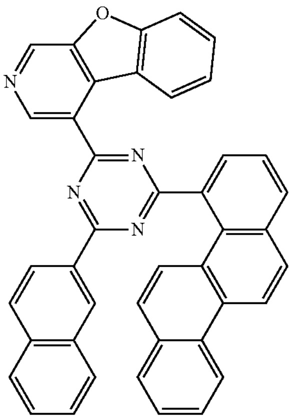
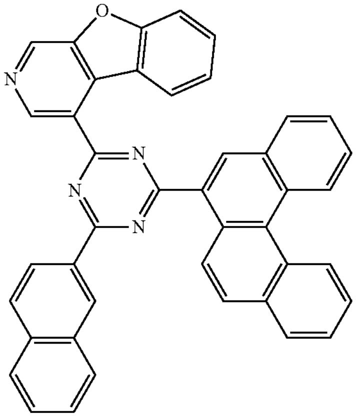
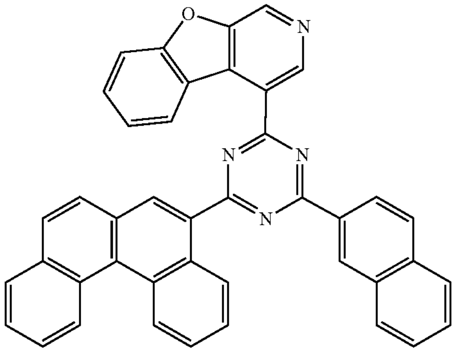

-continued
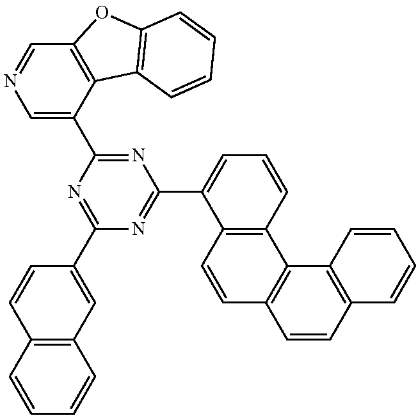
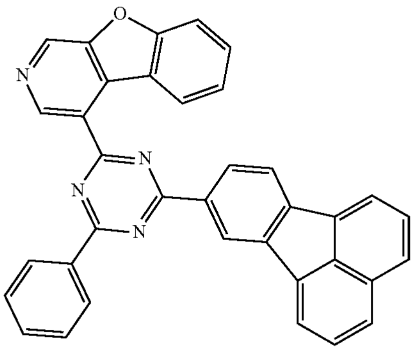
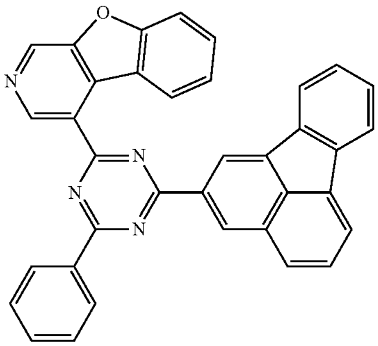
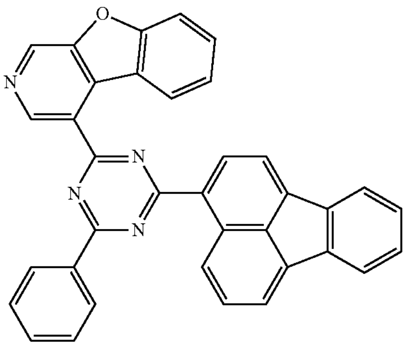
-continued
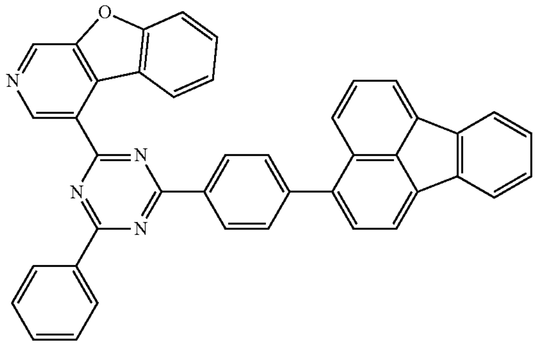
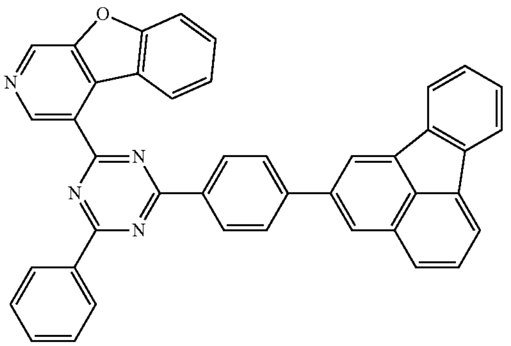
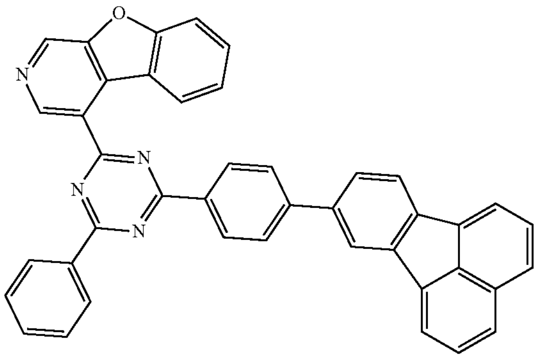
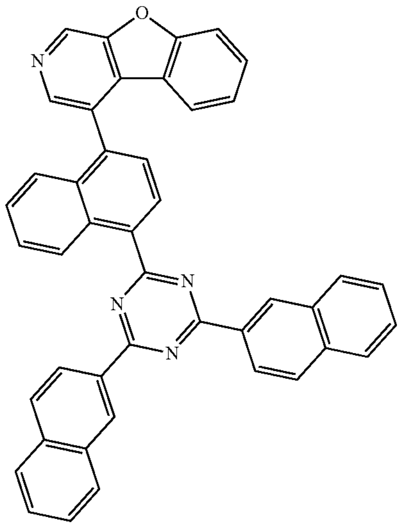

-continued
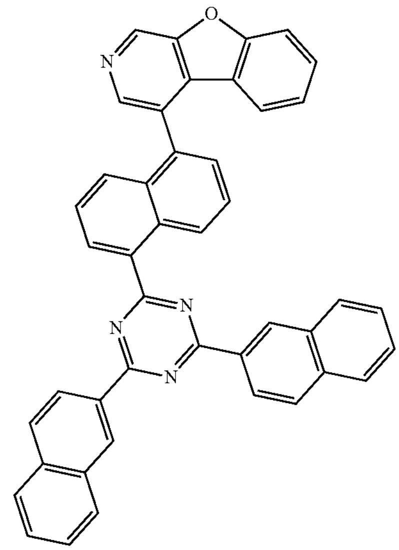
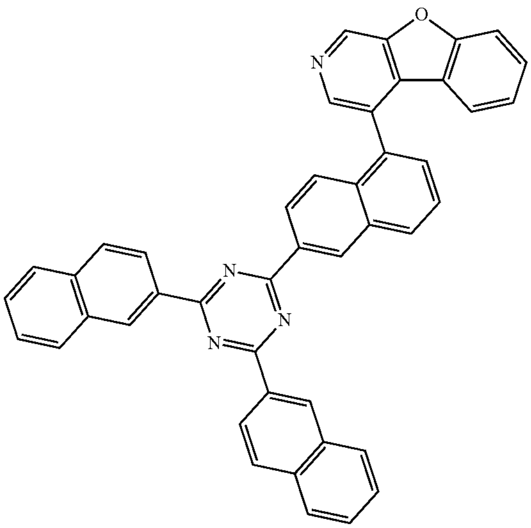
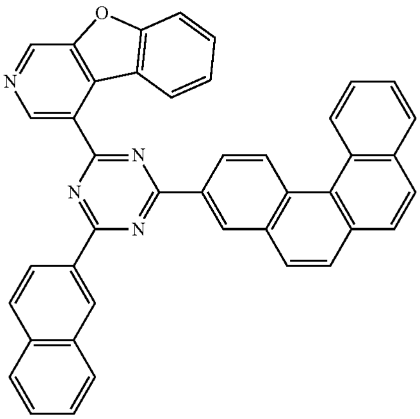
-continued
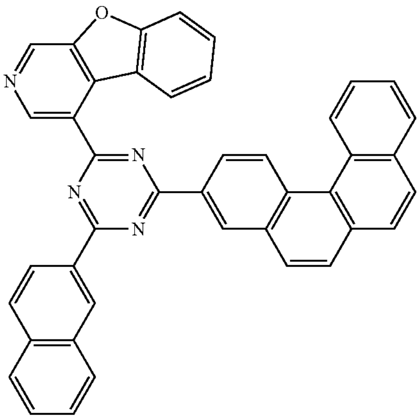
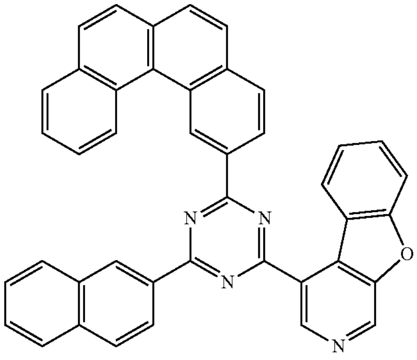
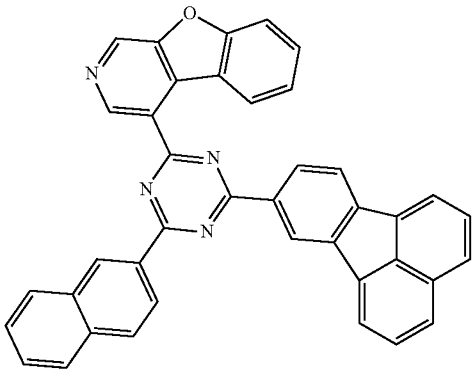
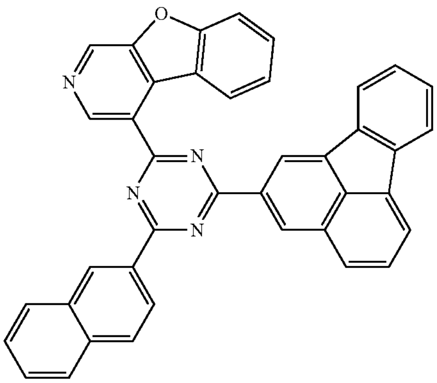

-continued
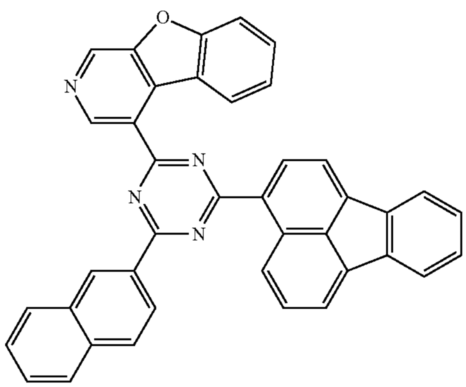
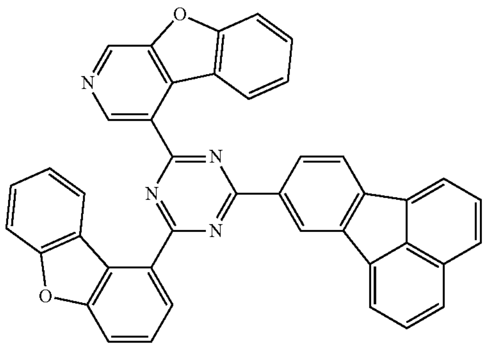
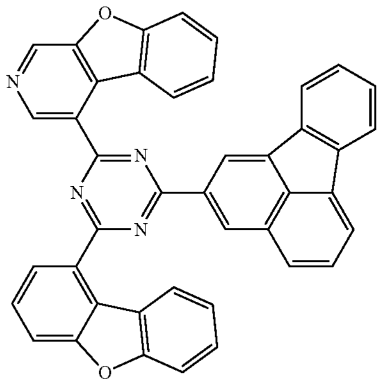
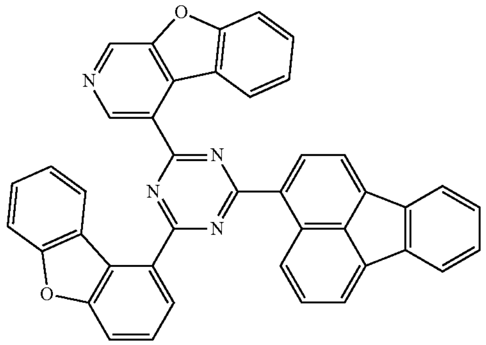
-continued
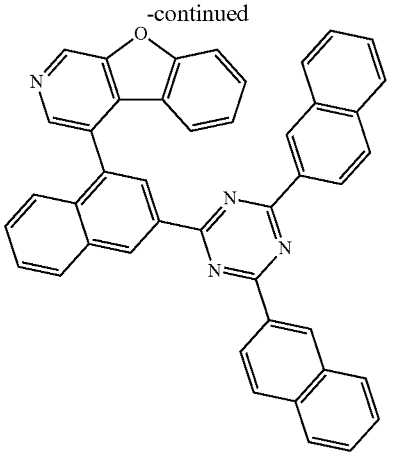
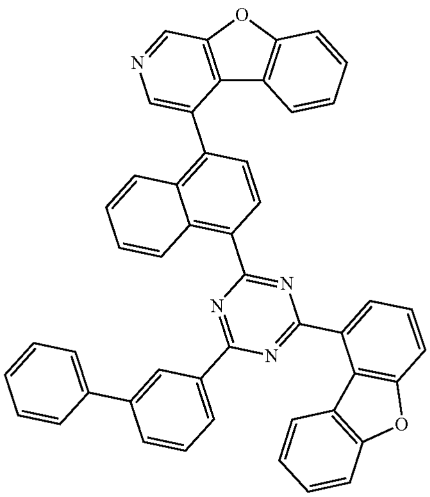
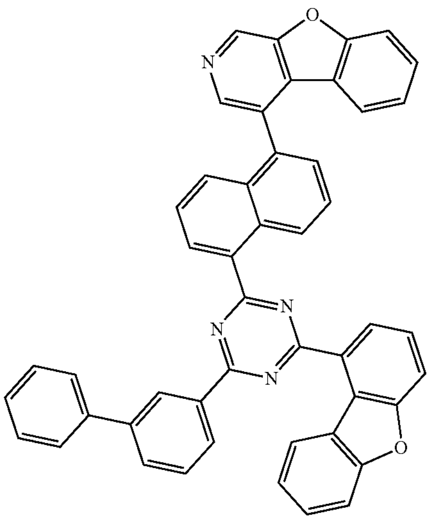

-continued
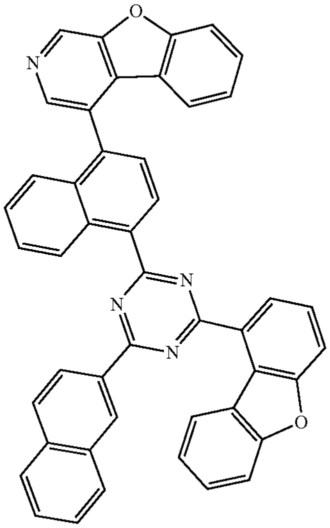
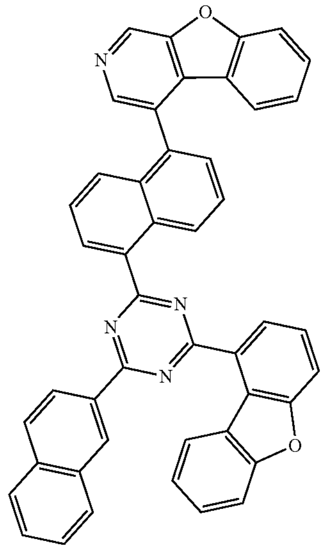
-continued
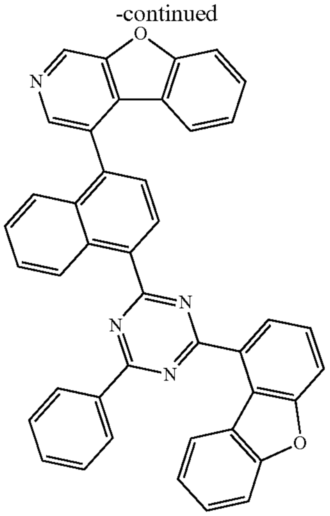
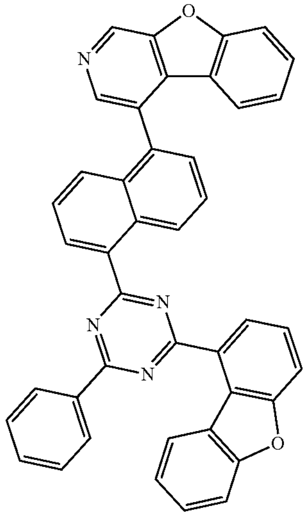
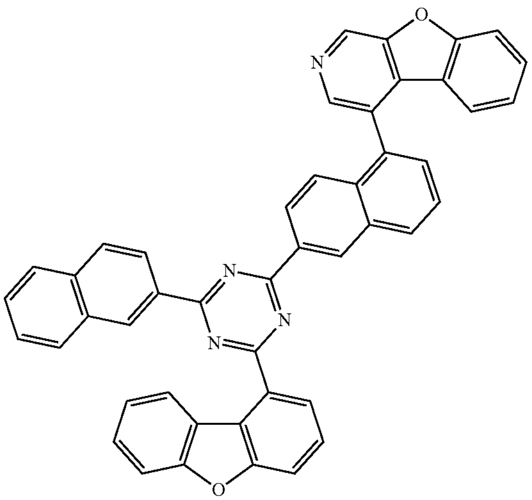
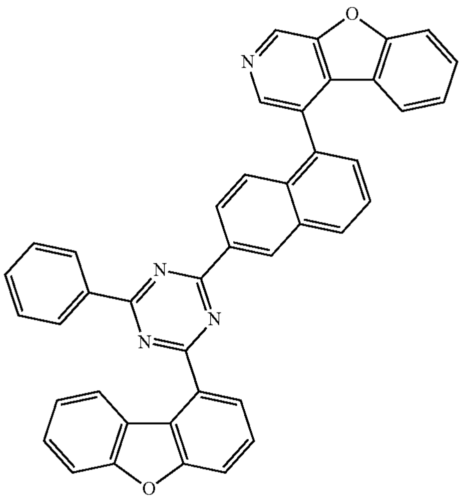

-continued
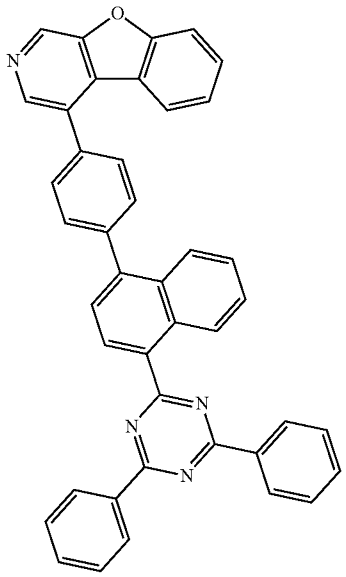
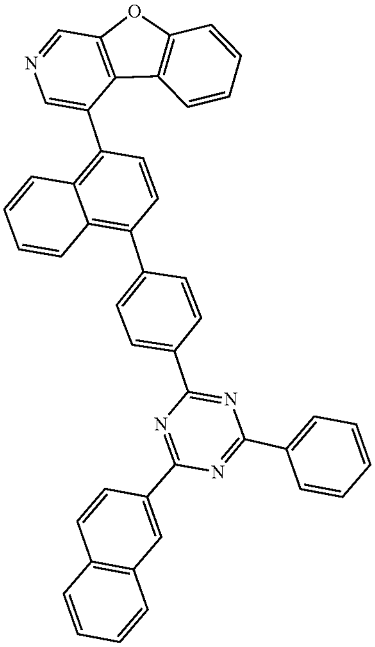
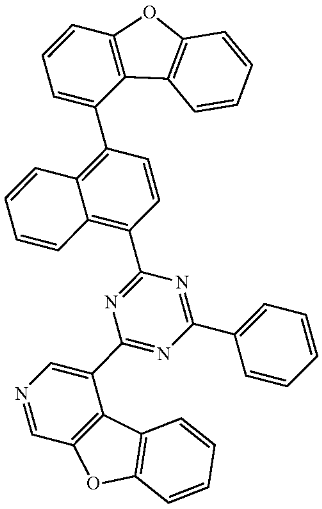
-continued
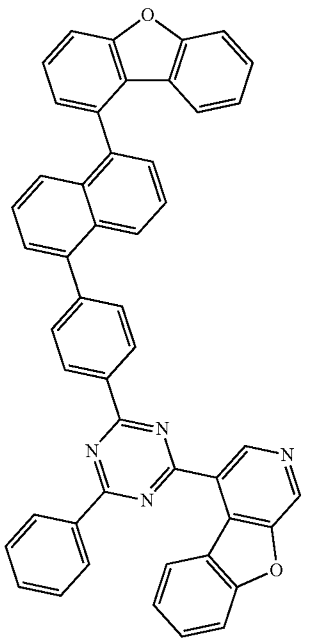
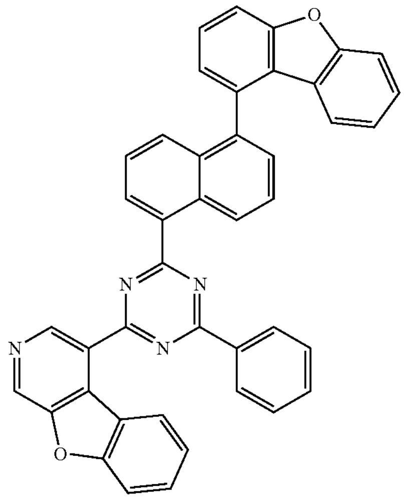
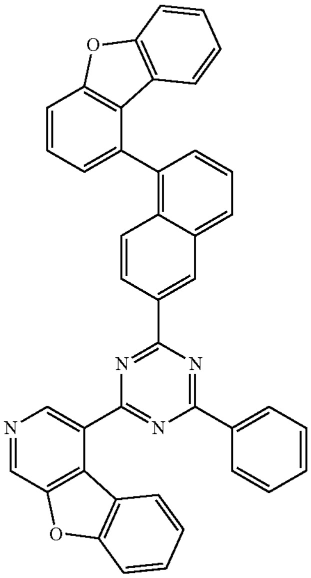

-continued
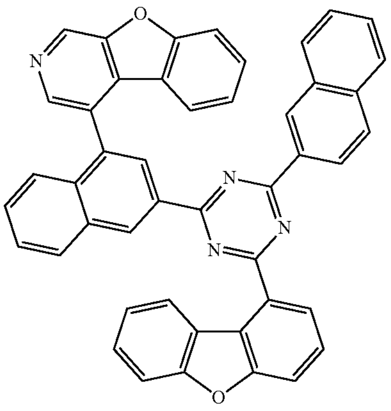
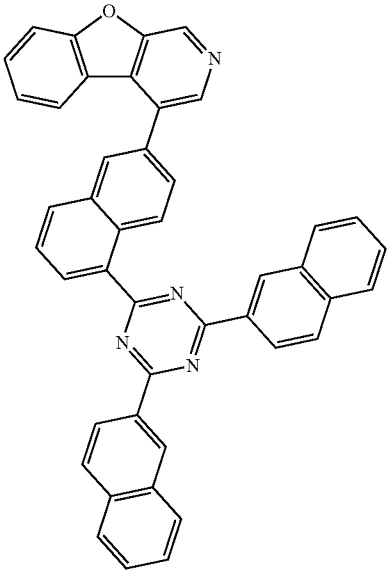
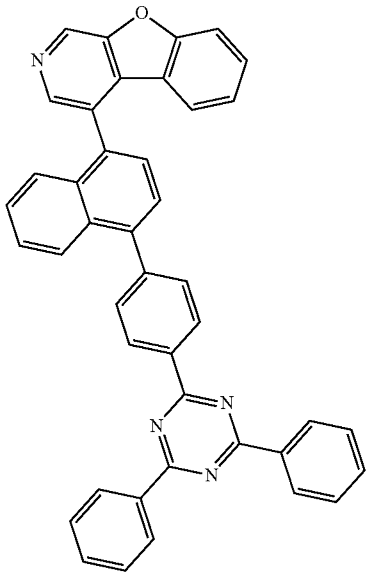
-continued
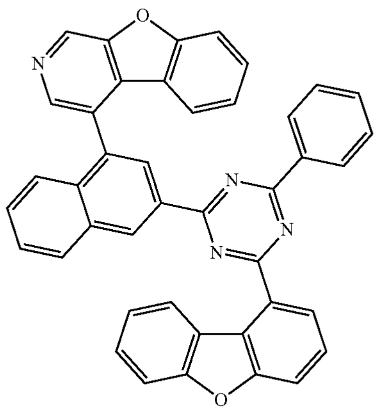
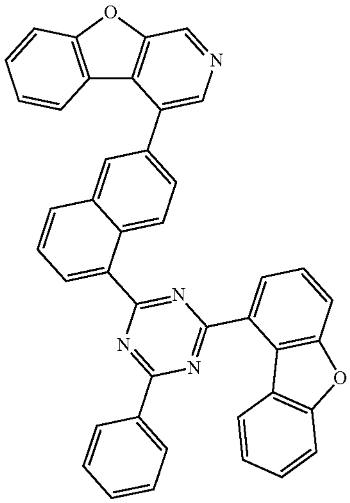
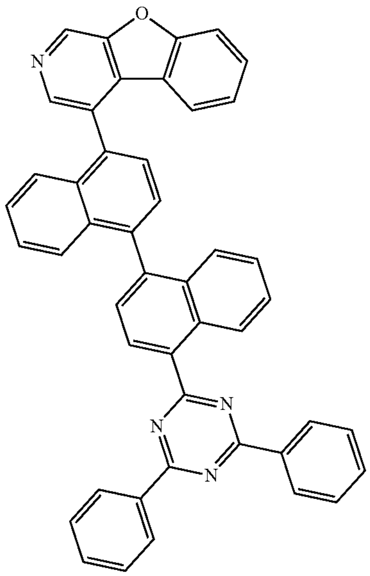

-continued
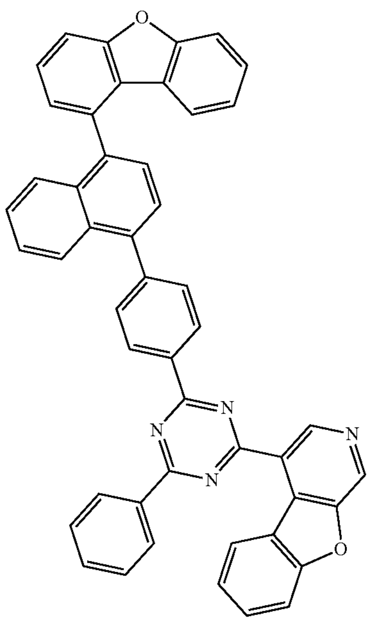
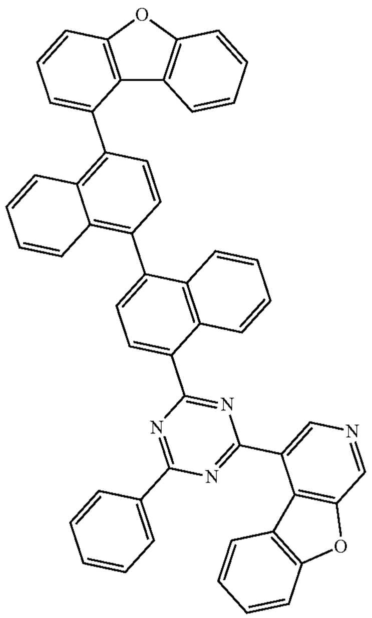
-continued
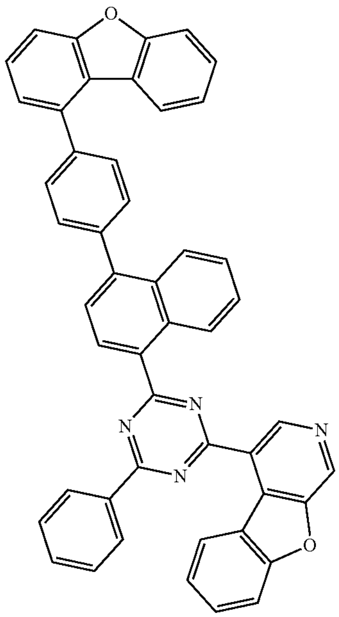
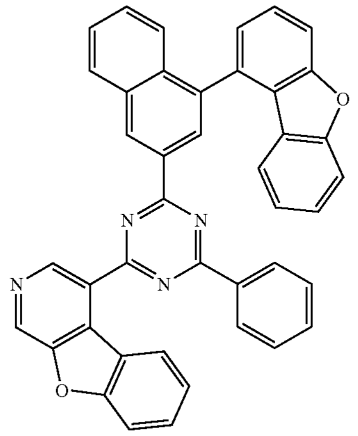
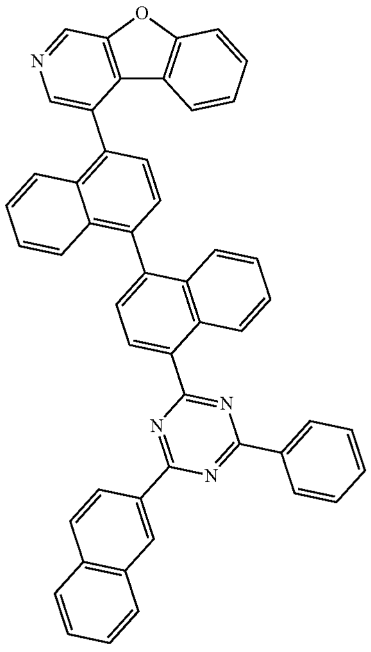

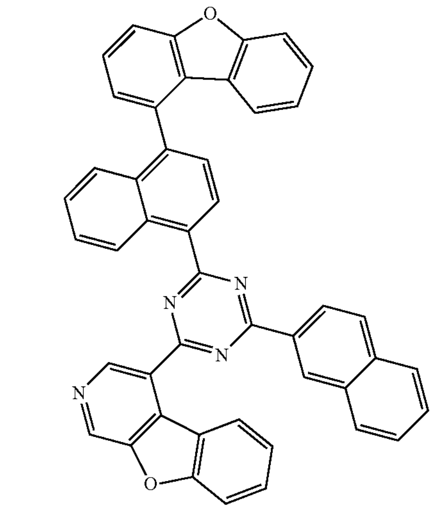
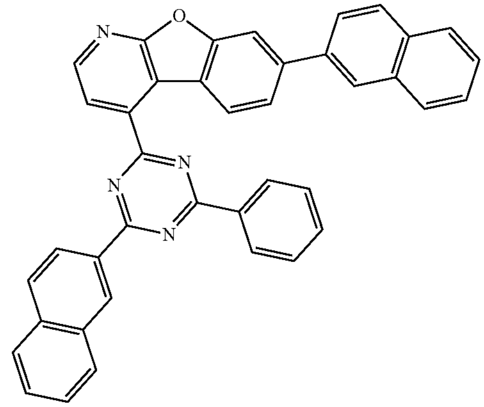
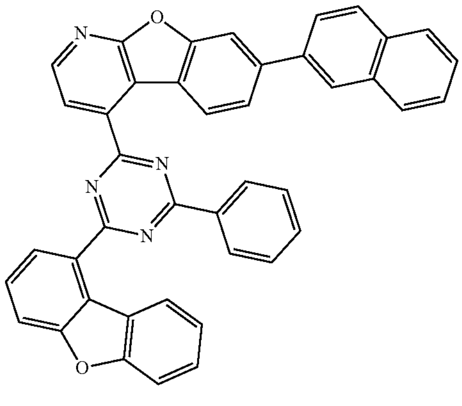
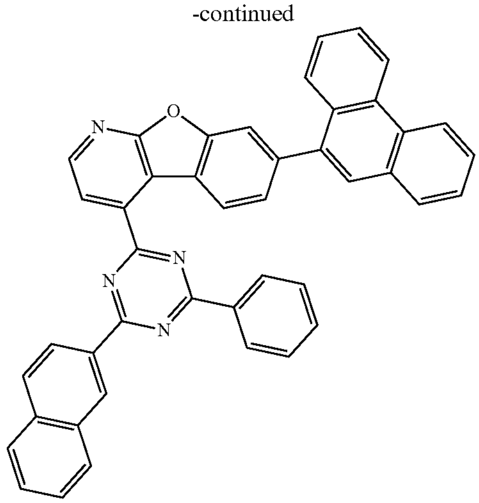
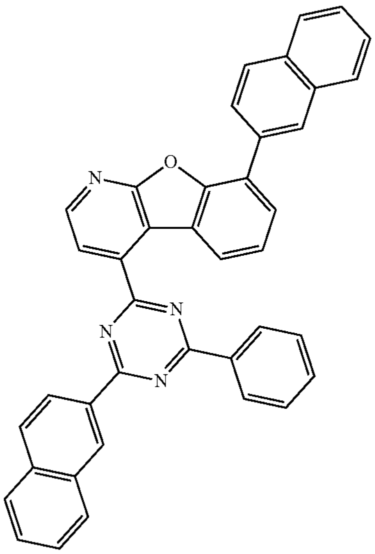
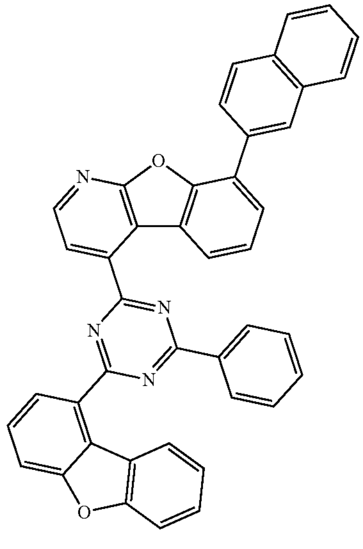

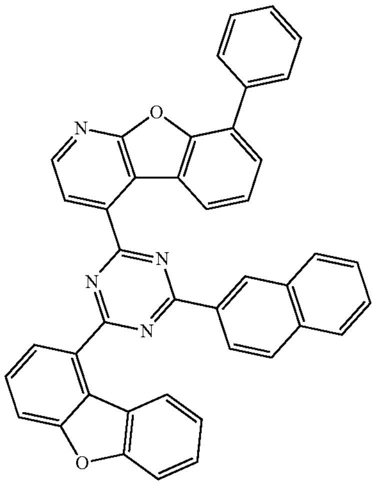
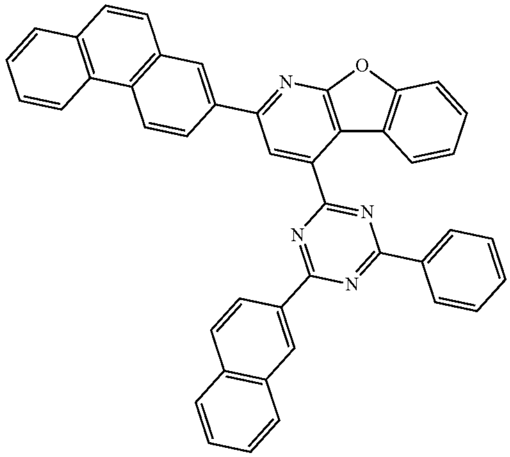
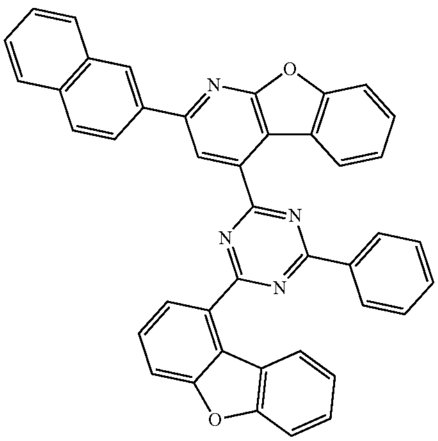
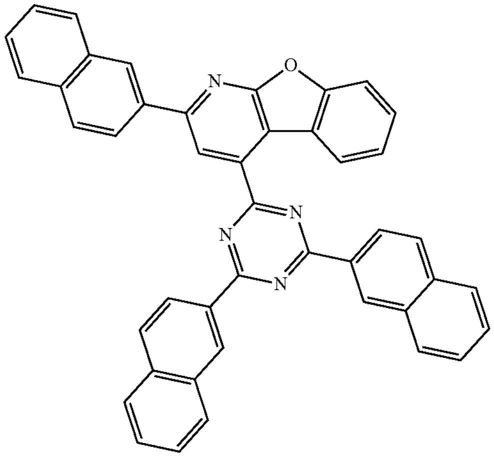
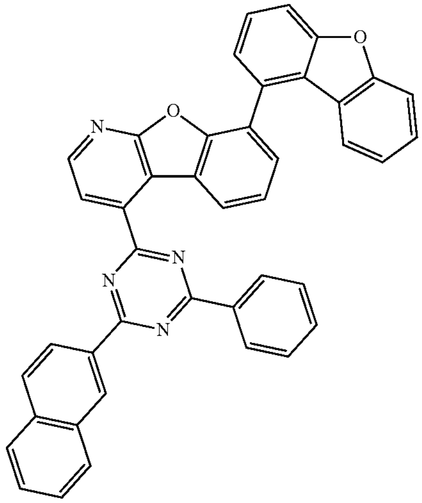
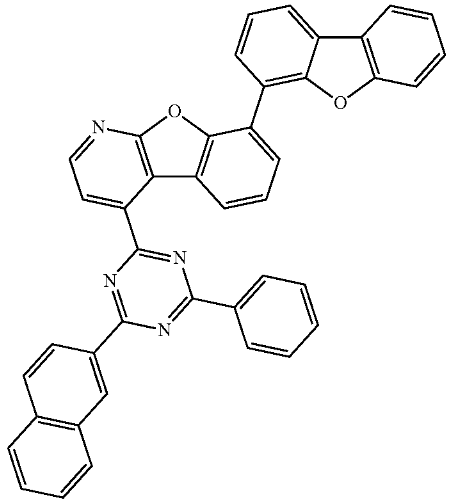

-continued
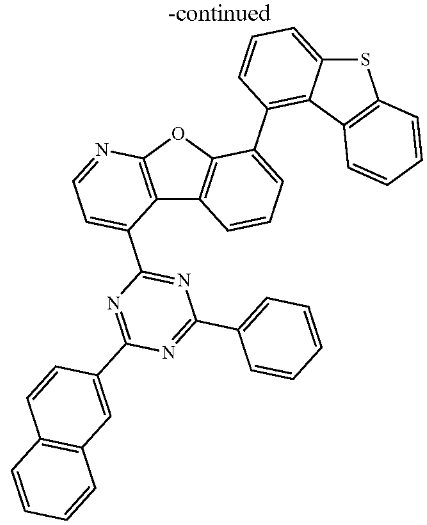
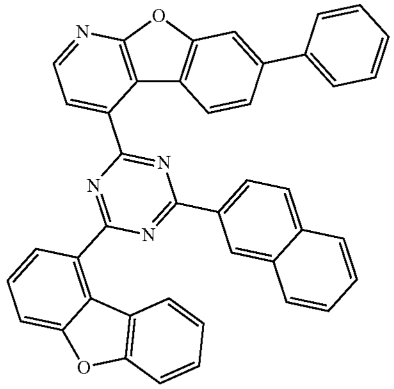
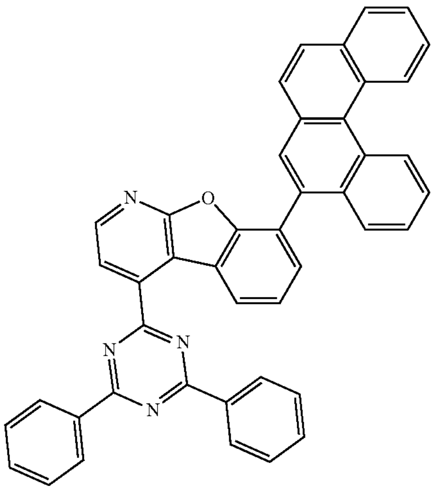
-continued
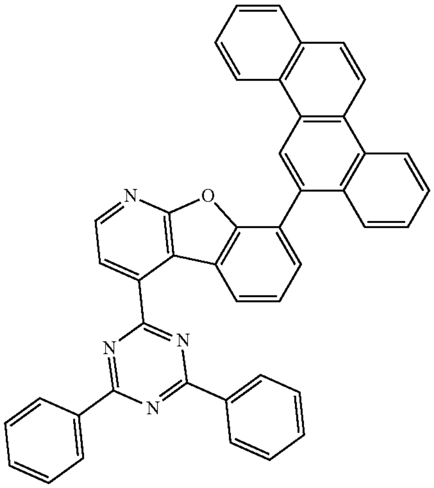
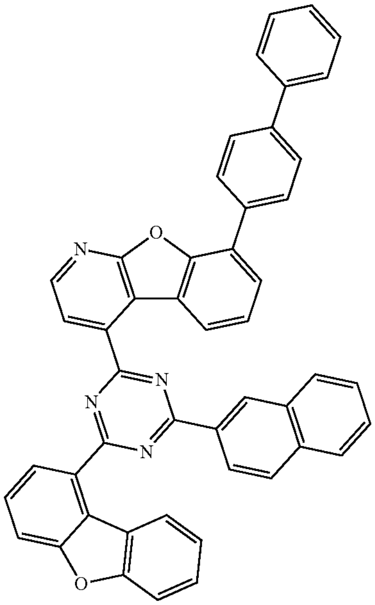
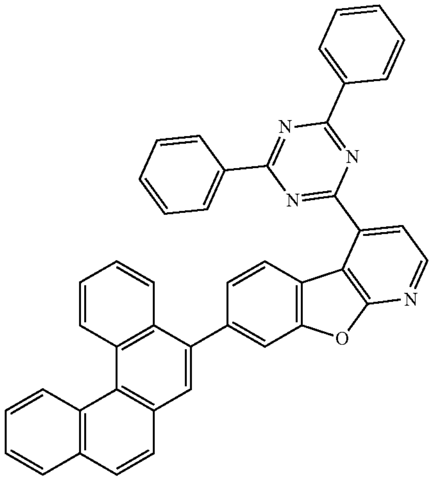

-continued
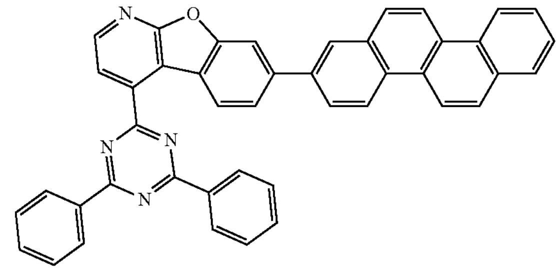
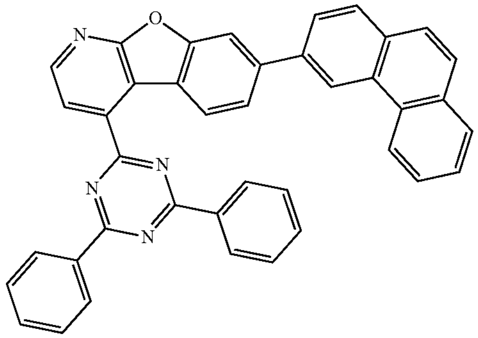
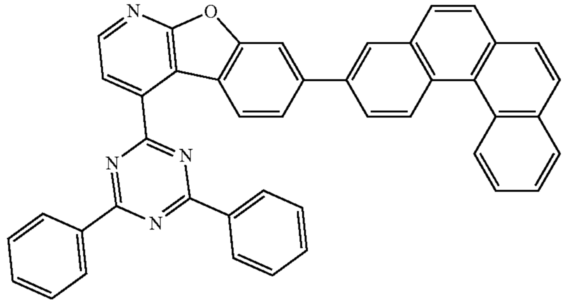
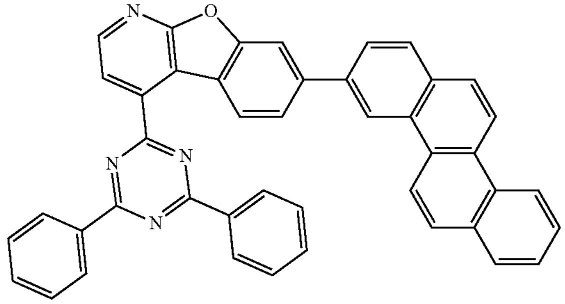
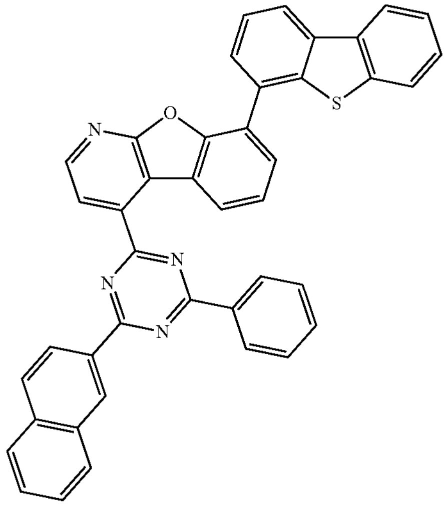
-continued
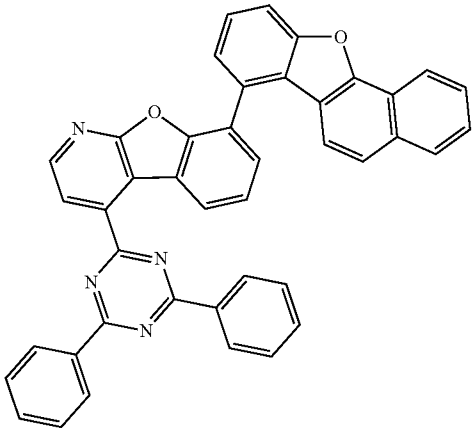
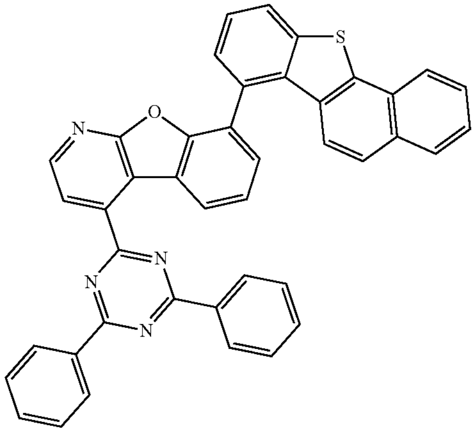
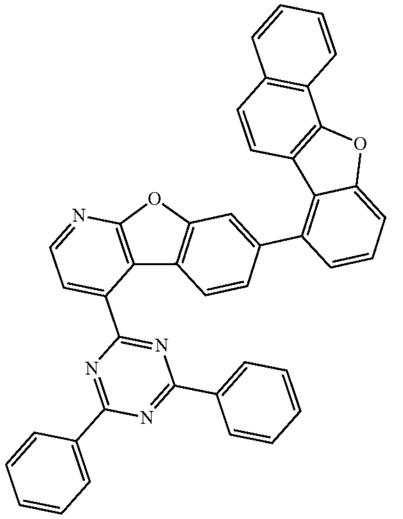
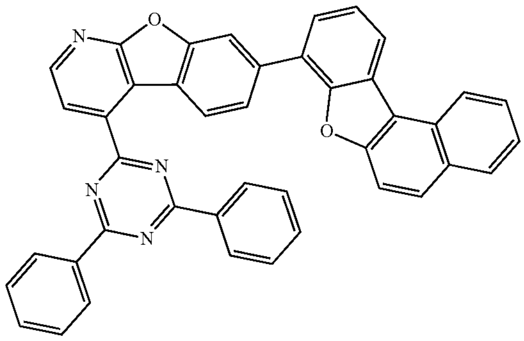

-continued
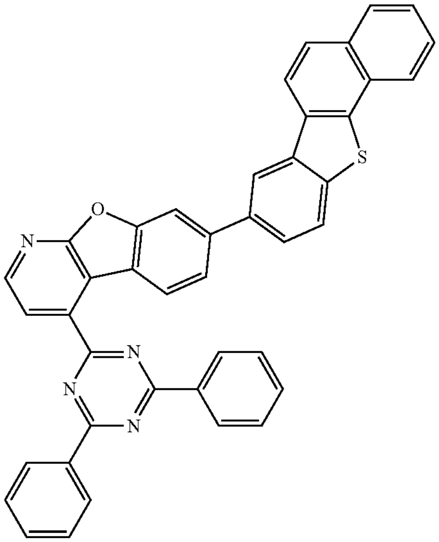
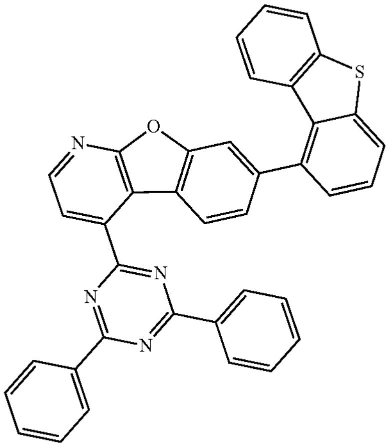
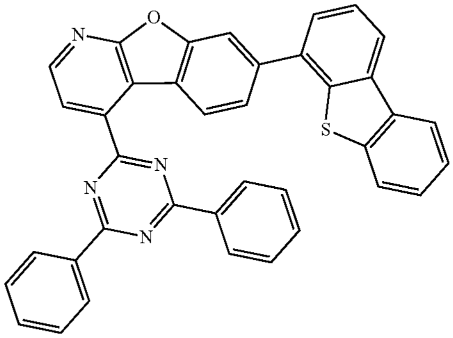
-continued
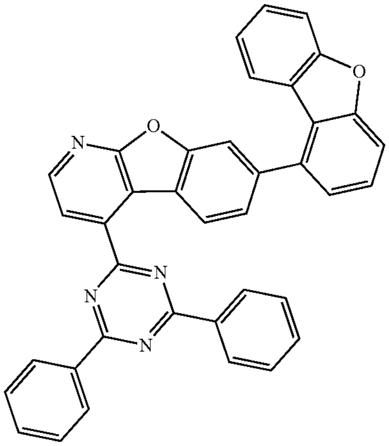
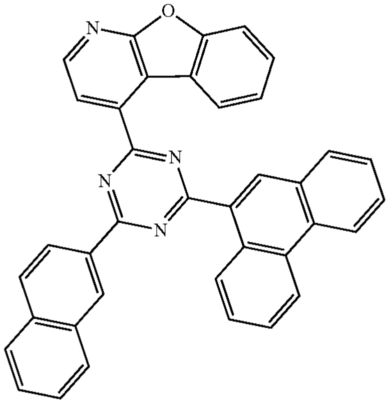
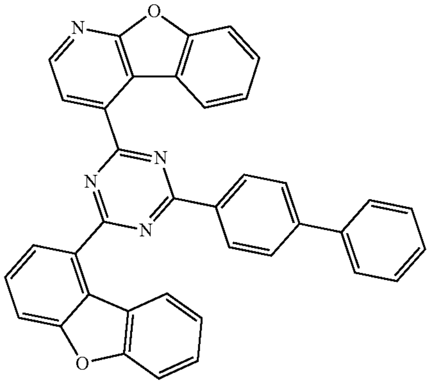
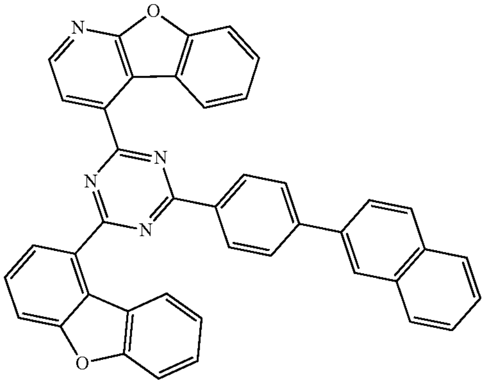

-continued
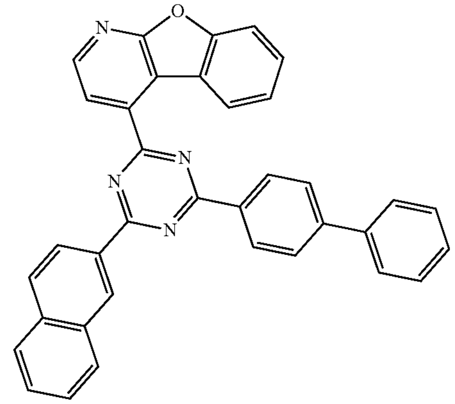
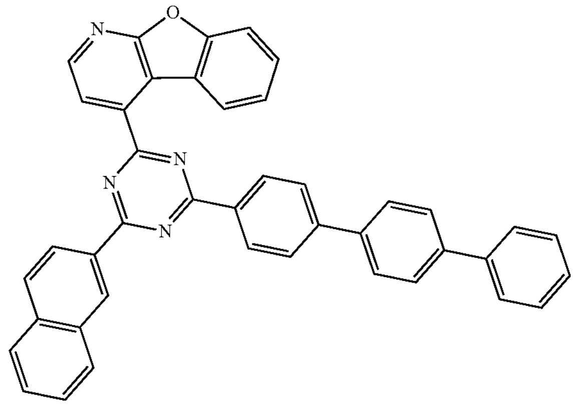
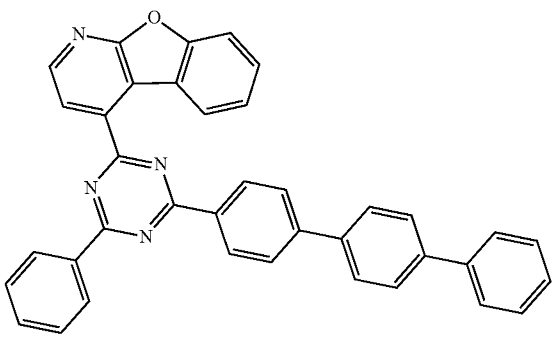
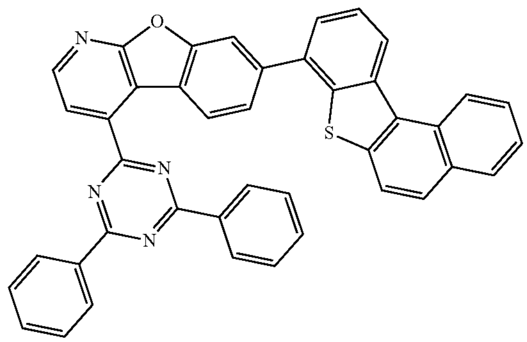
-continued
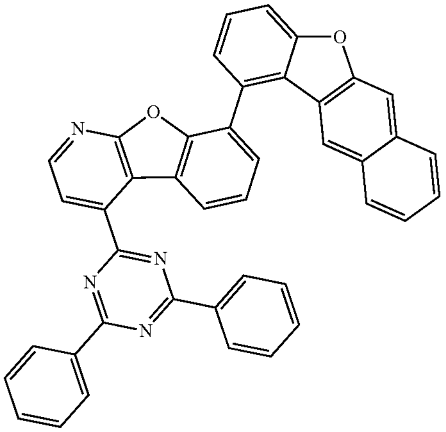
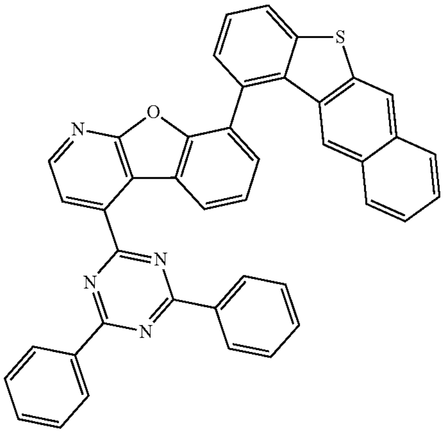
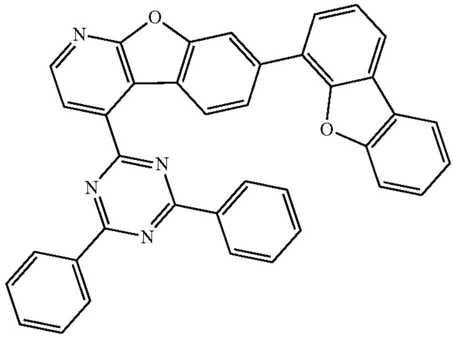
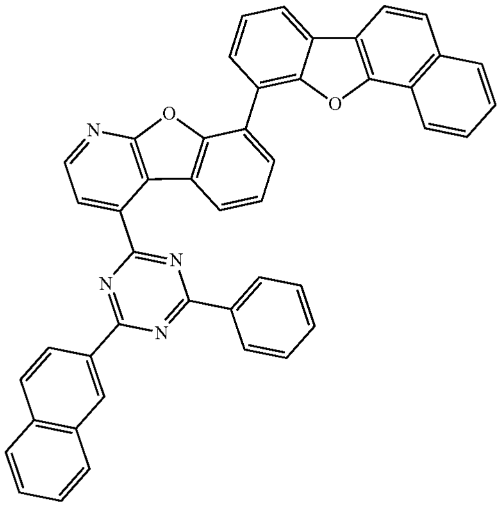

-continued
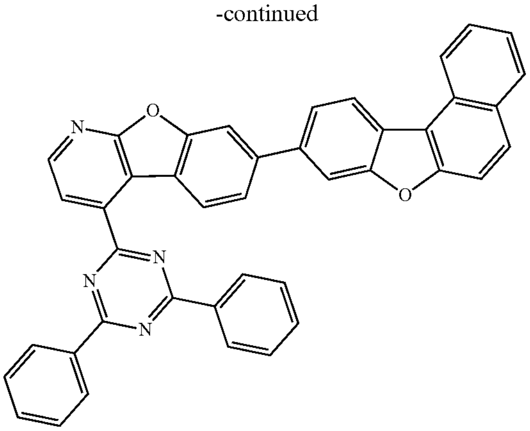
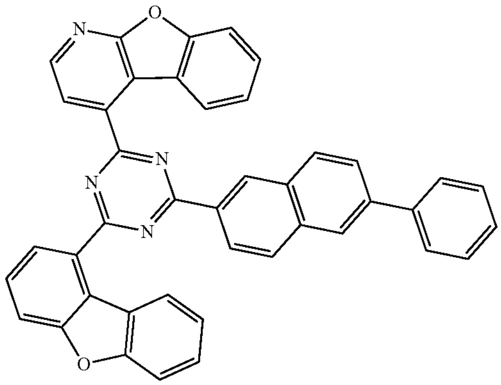
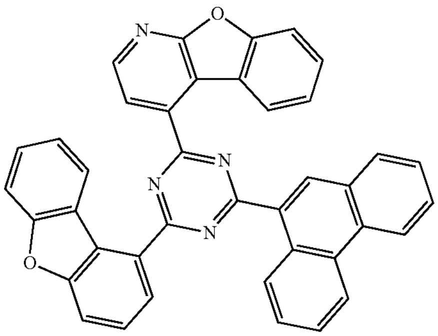
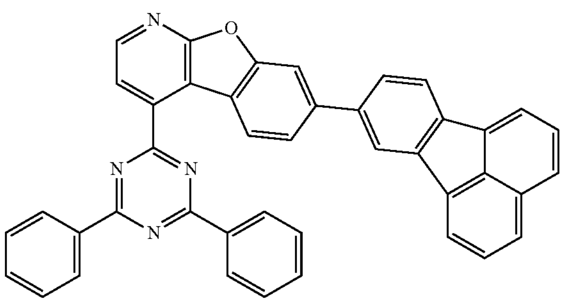
-continued
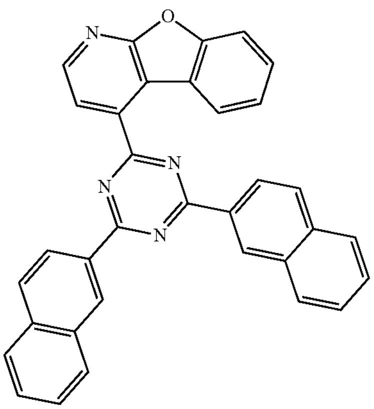
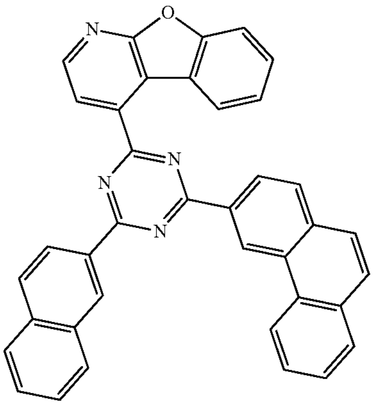
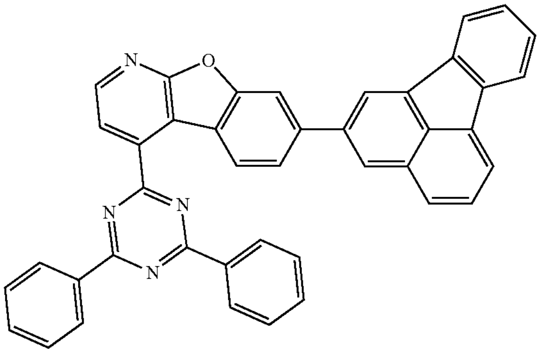
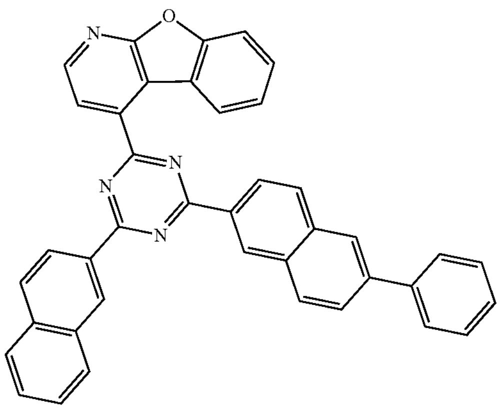

-continued
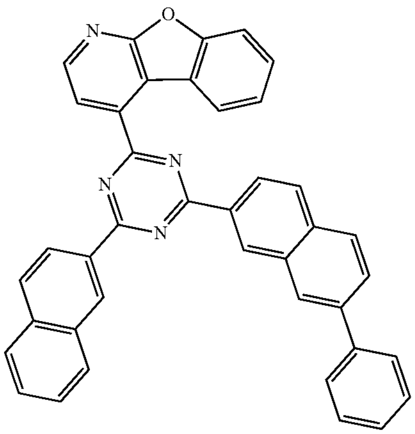
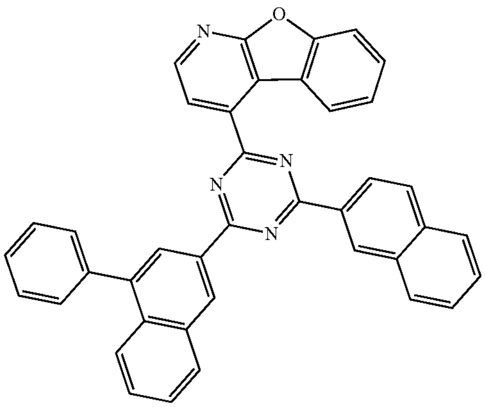
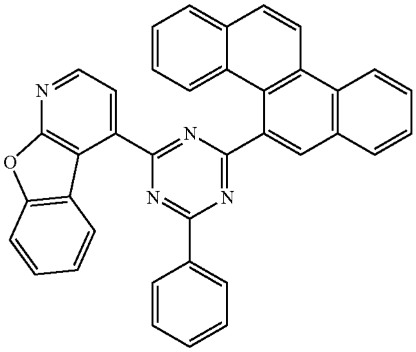
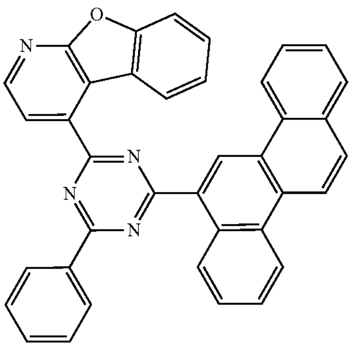
-continued
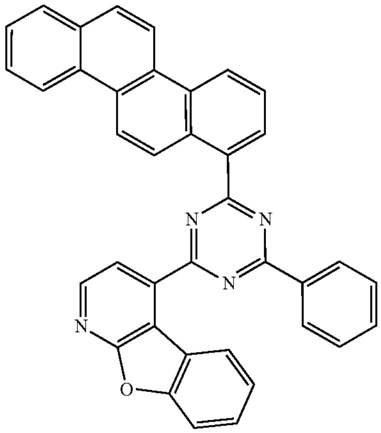
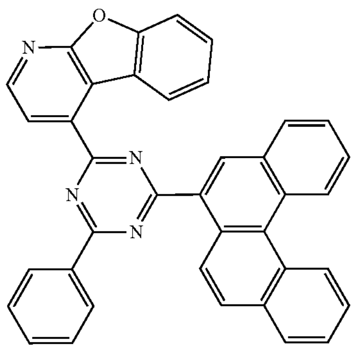
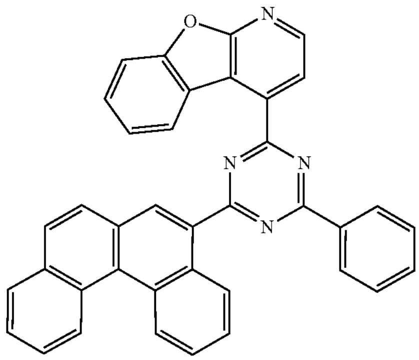
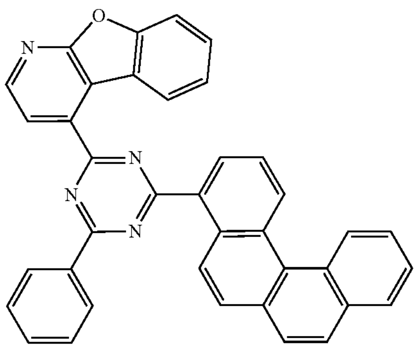

-continued
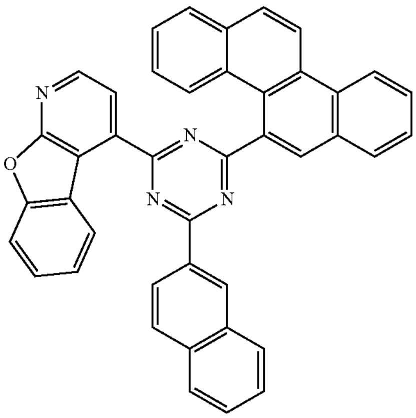
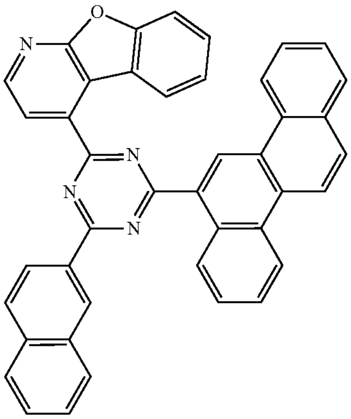
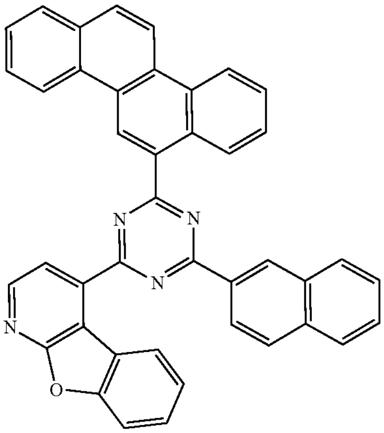
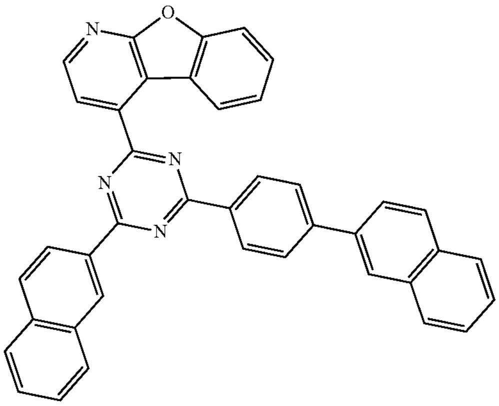
-continued
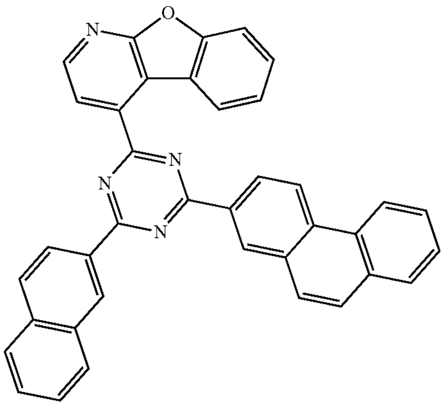
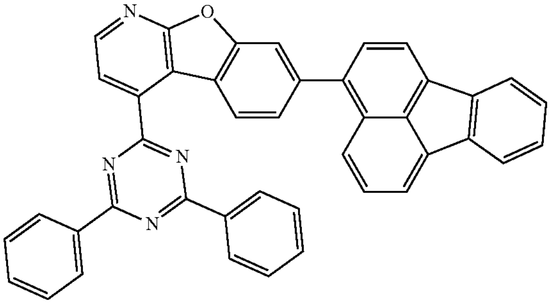
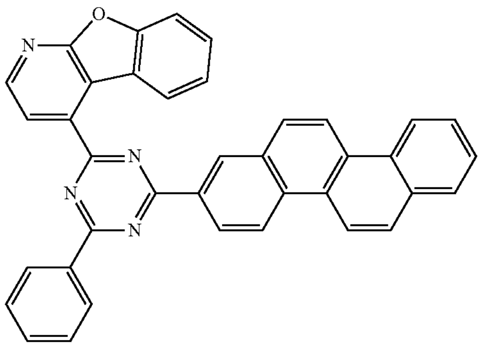
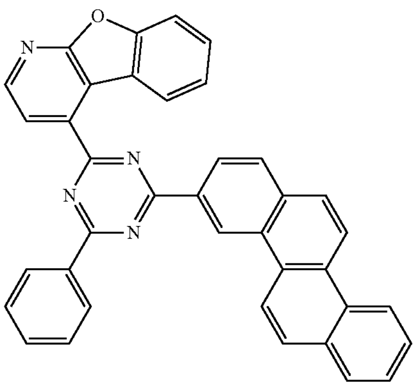

-continued
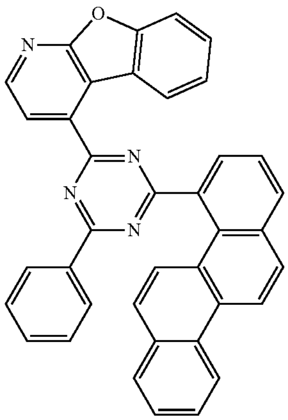
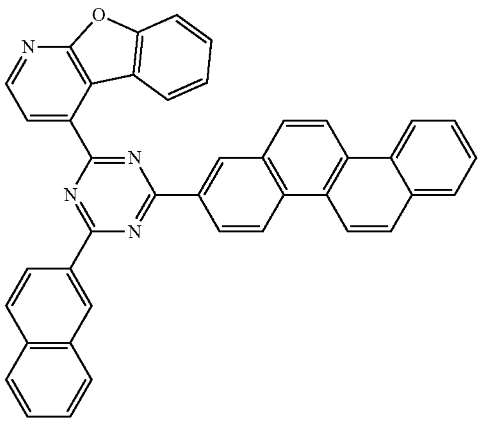
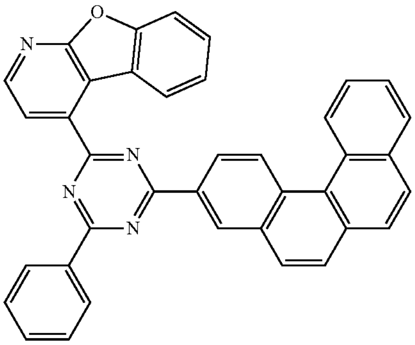
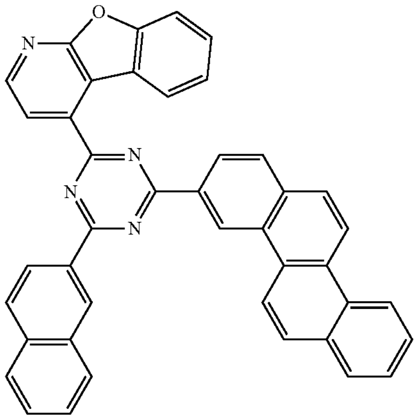
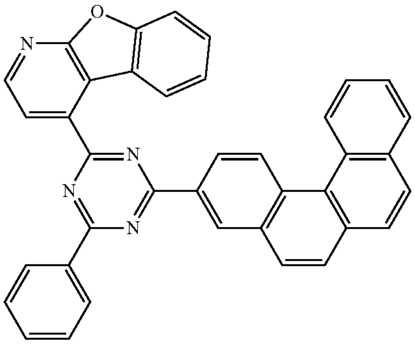
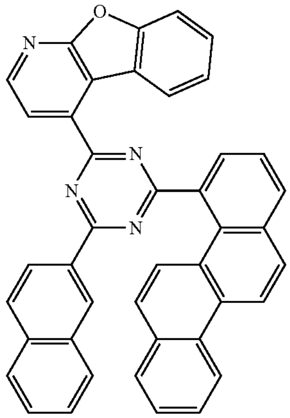
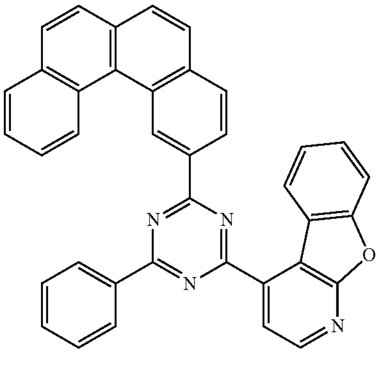
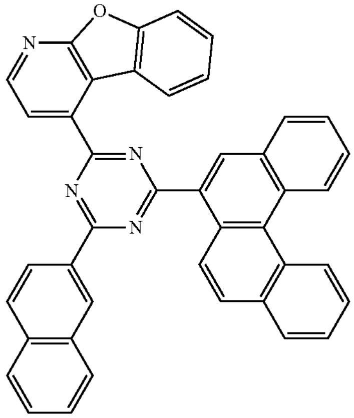

-continued
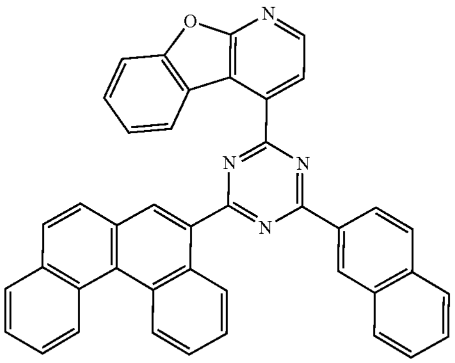
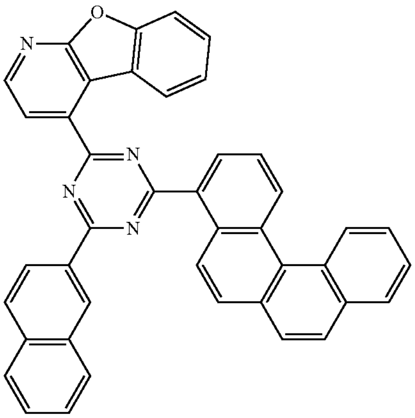
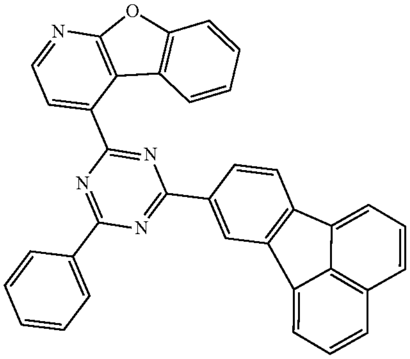
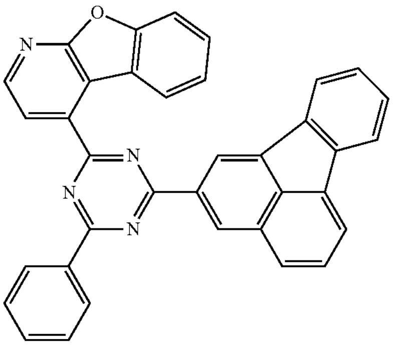
-continued
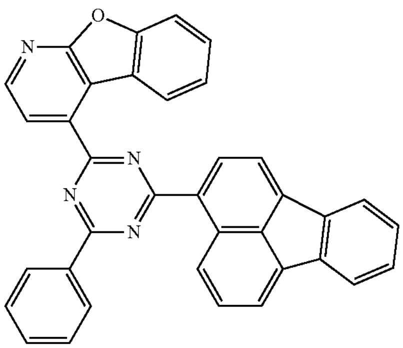
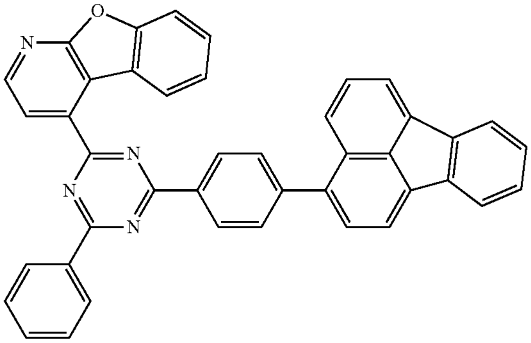
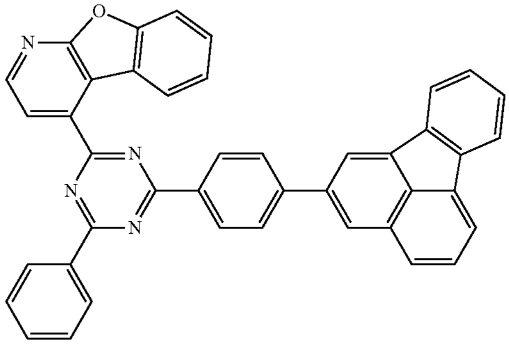
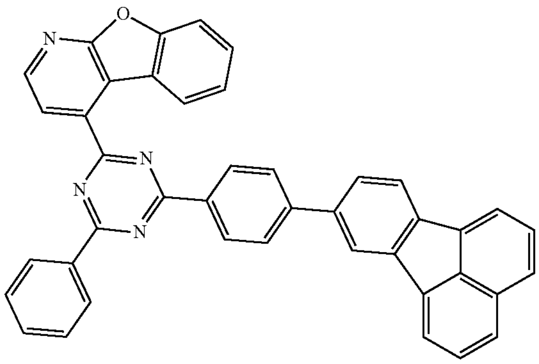

-continued
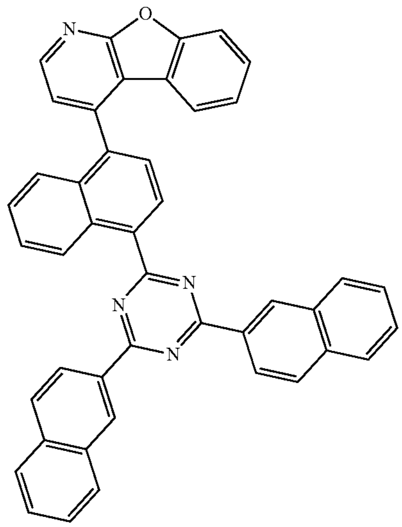
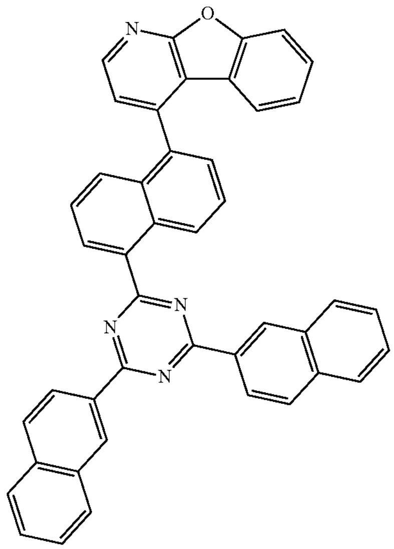
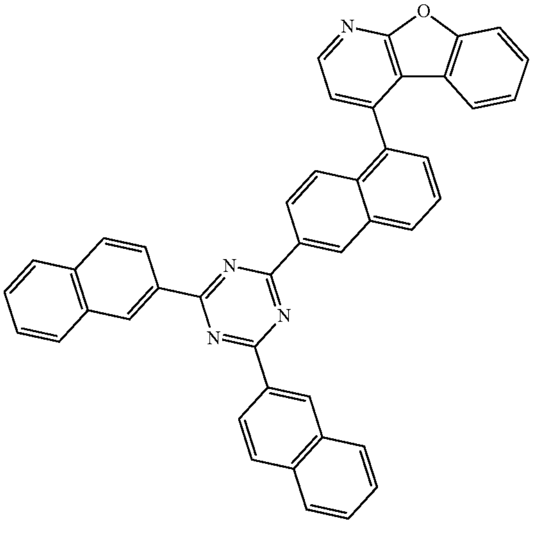 [SMILES: c1ccc2cc(-c3nc(-c4ccc5ccccc5c4)nc(-c4ccc5c(-c6ccnc7oc8ccccc8c67)cccc5c4)n3)ccc2c1]
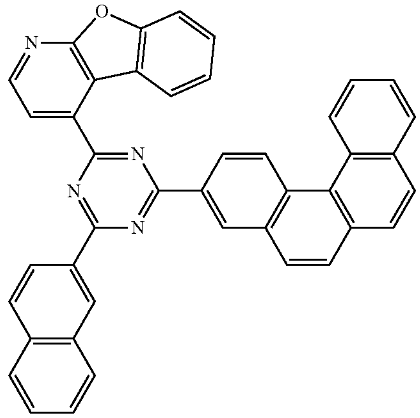
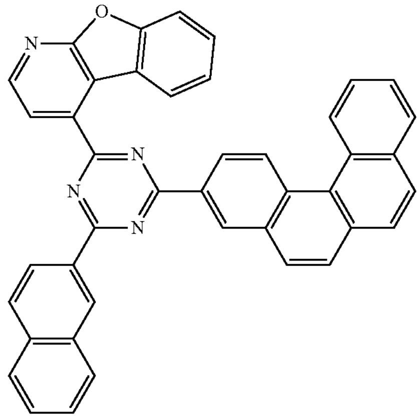
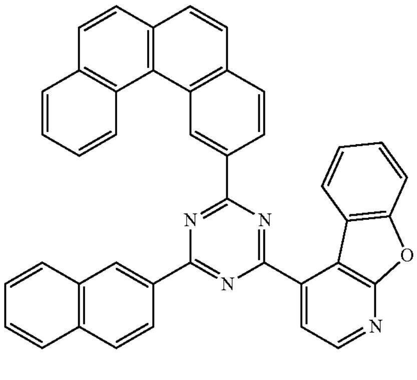
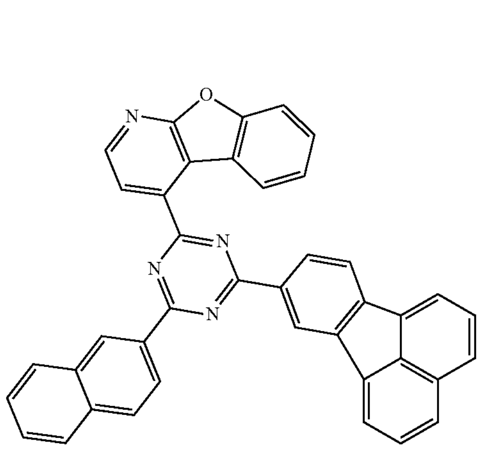

-continued
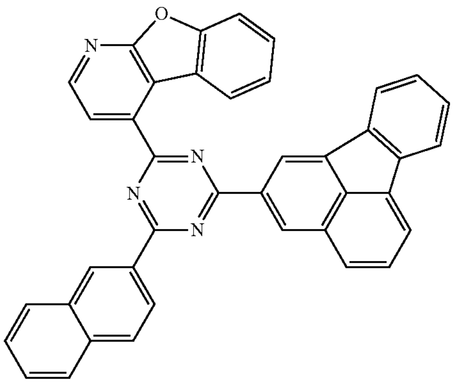
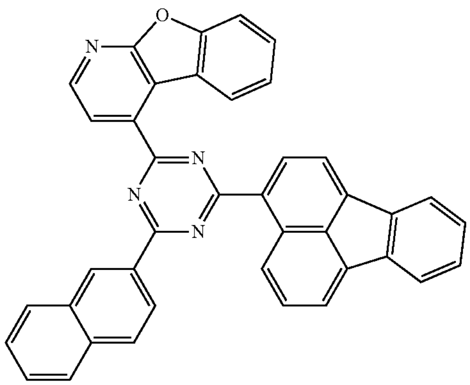
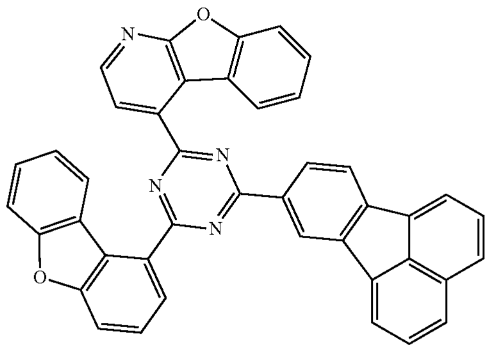
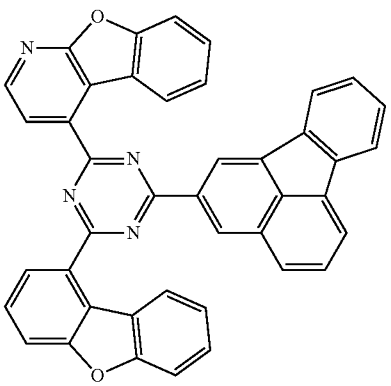
-continued
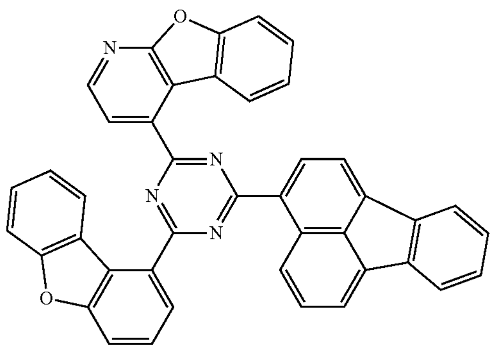
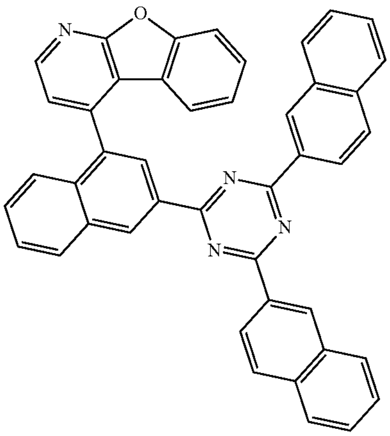
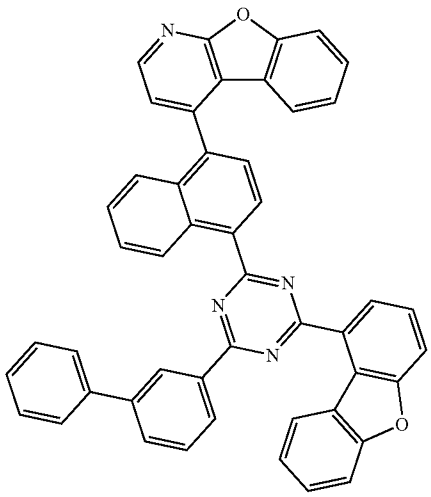

-continued
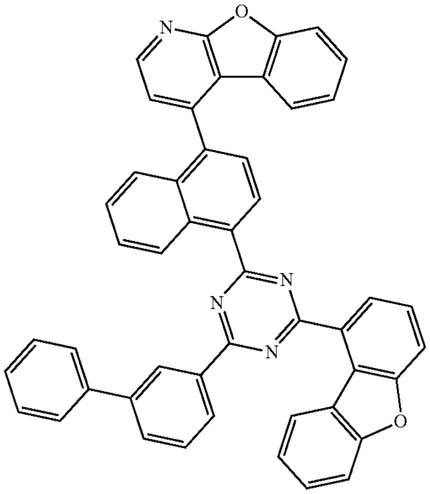
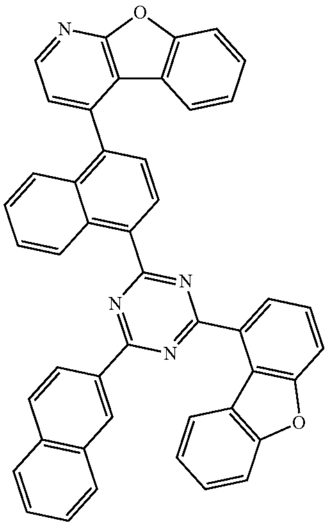
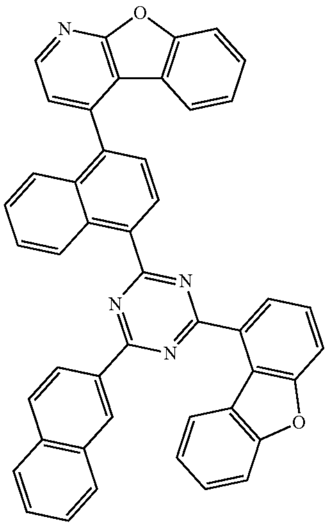
-continued
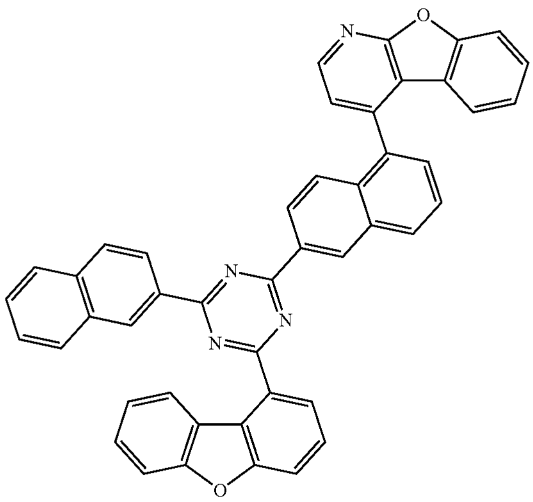
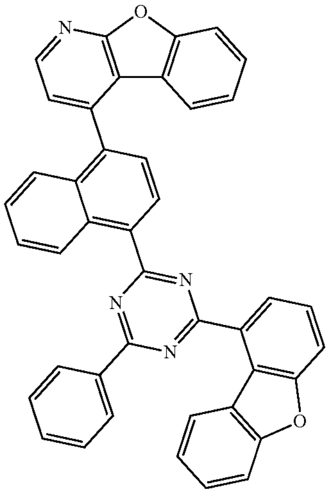
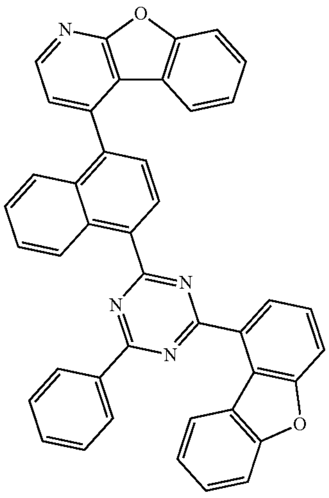

-continued
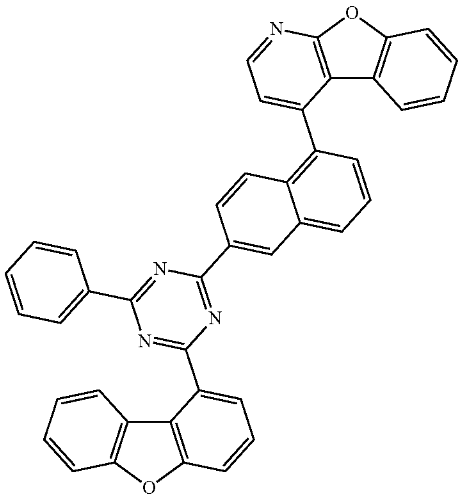
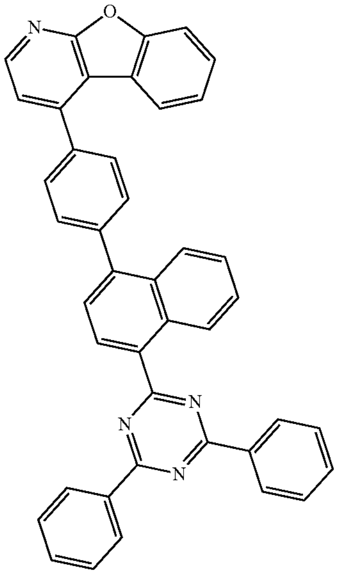
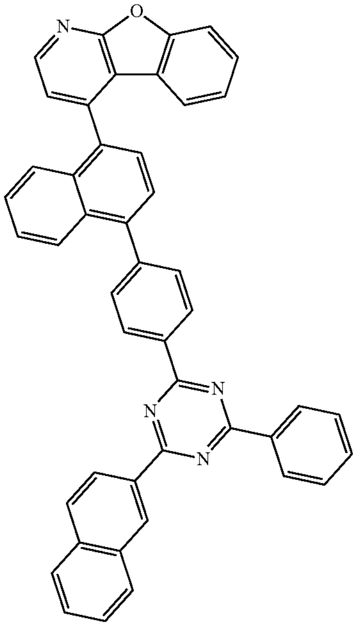
-continued
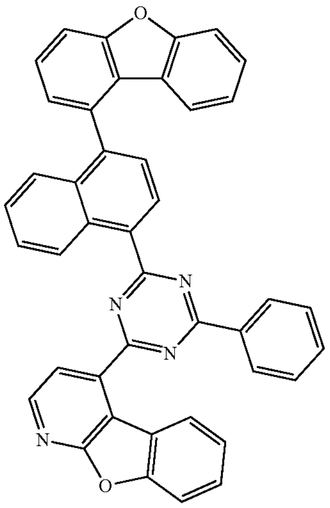
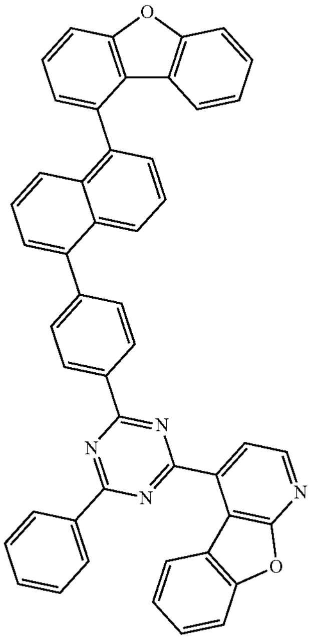
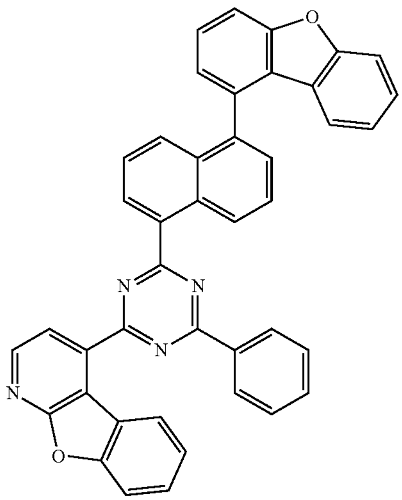

-continued
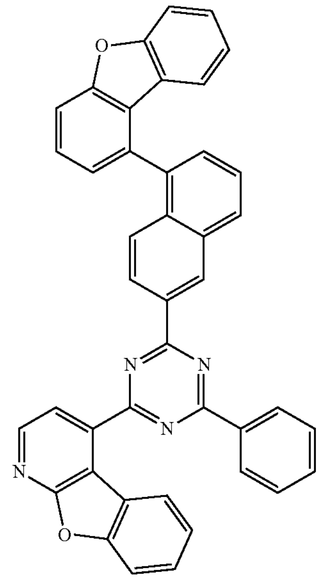
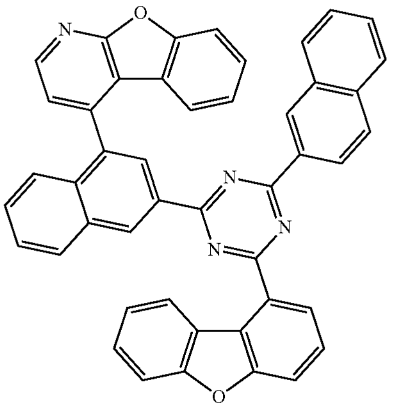
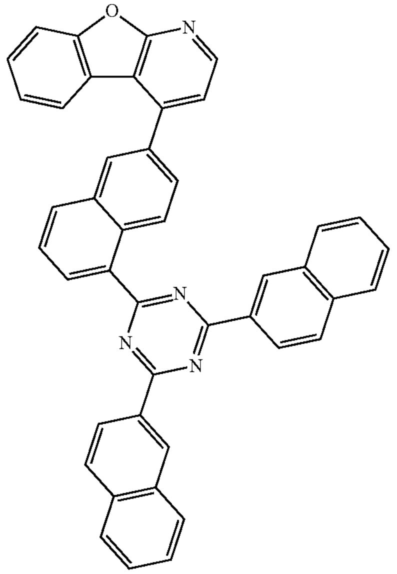
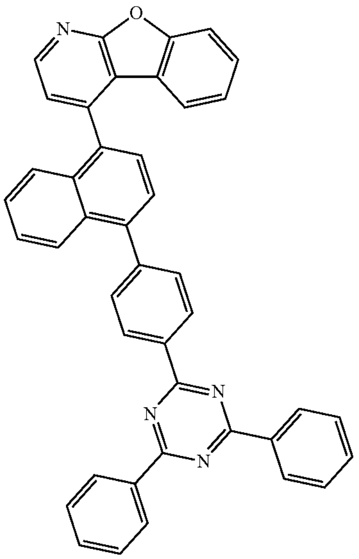
-continued
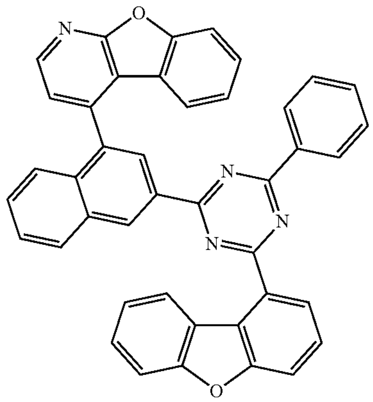
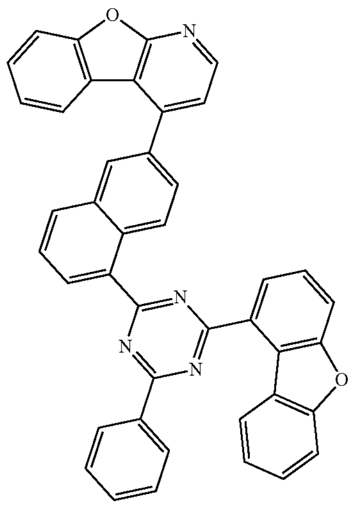

-continued
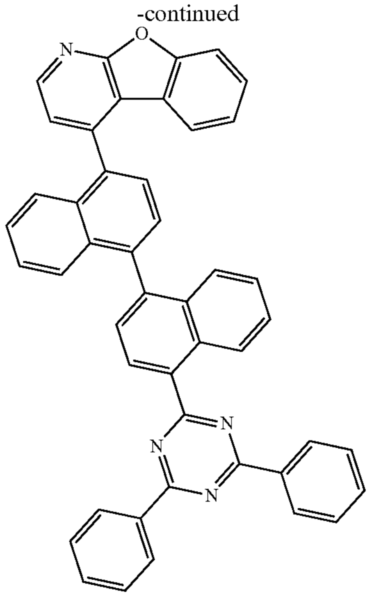
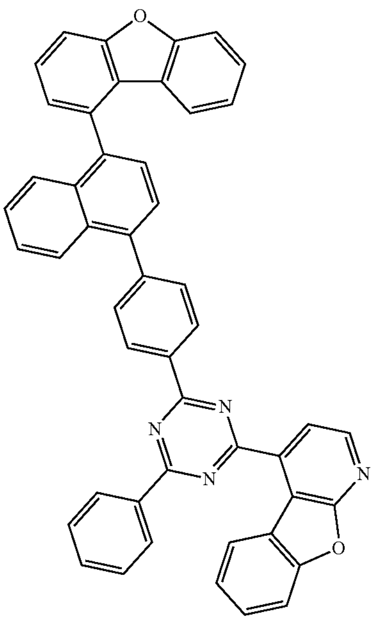
-continued
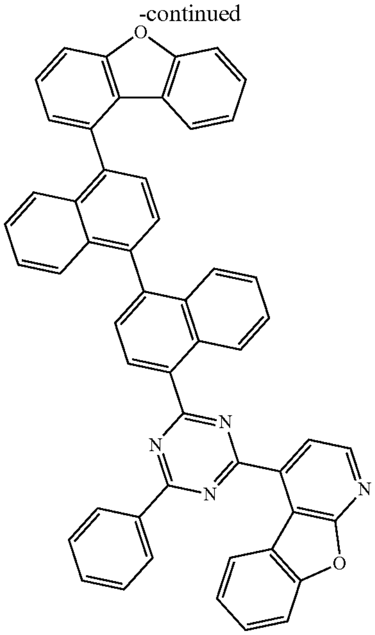
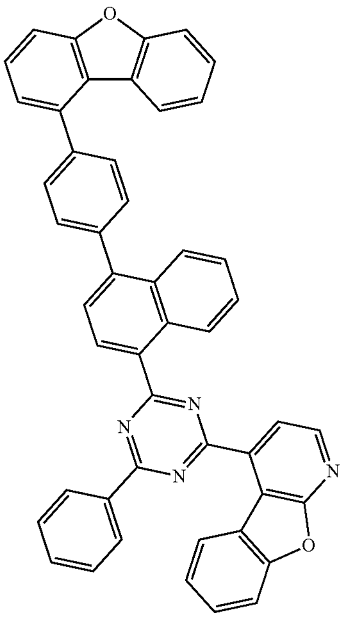
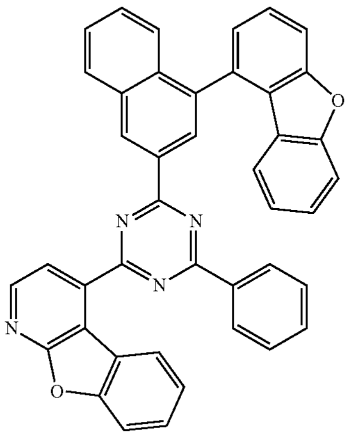

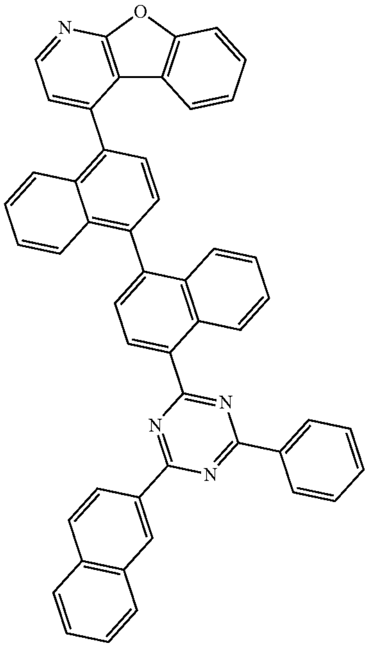
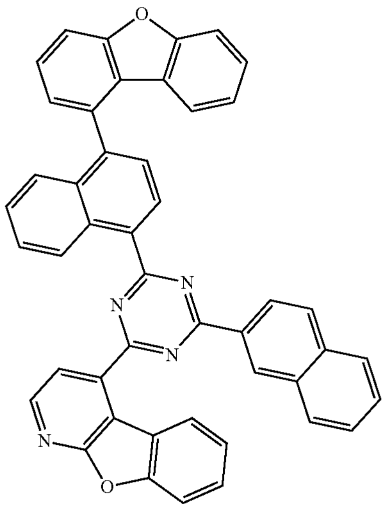
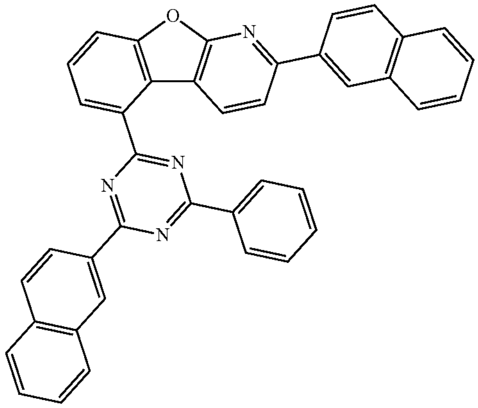
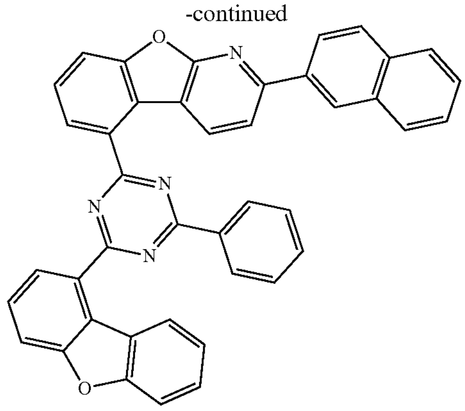
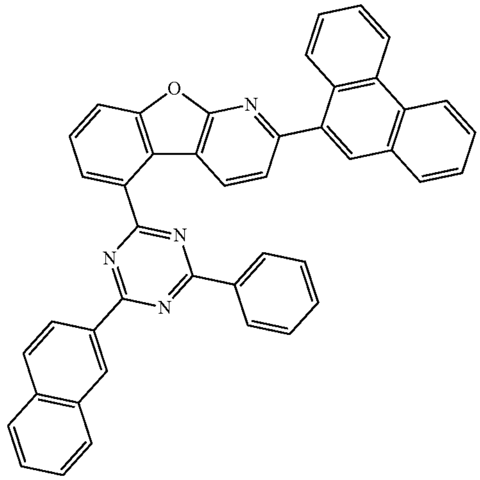
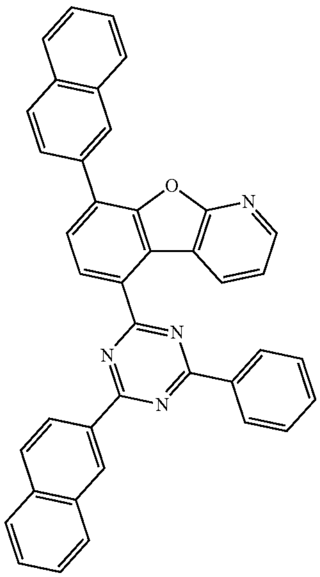

-continued
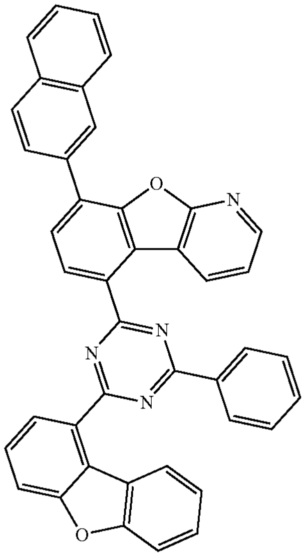
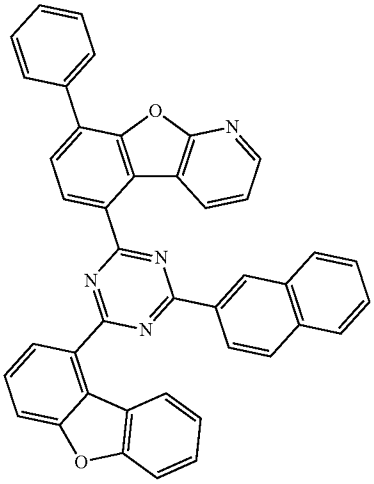
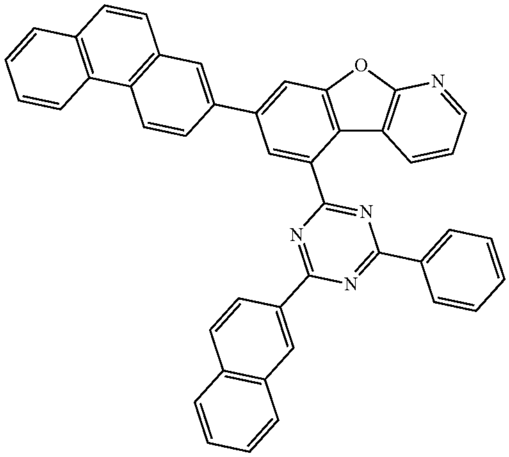
-continued
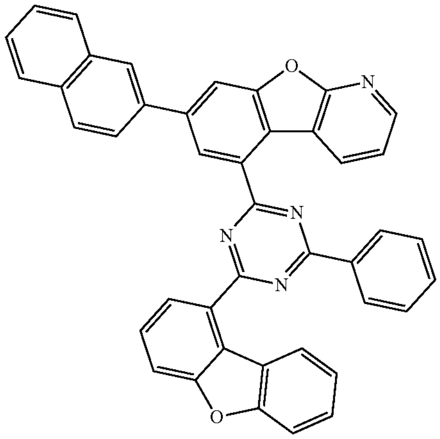
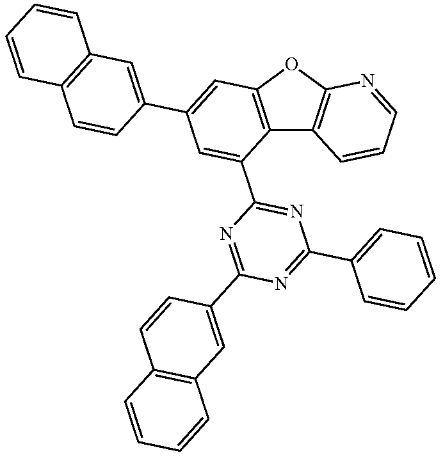
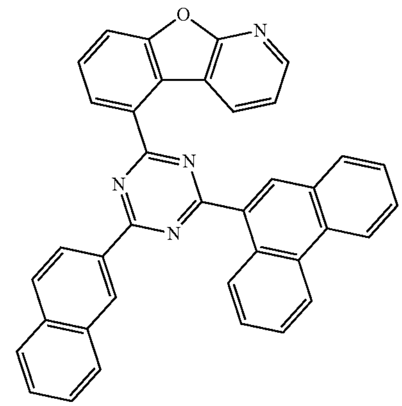
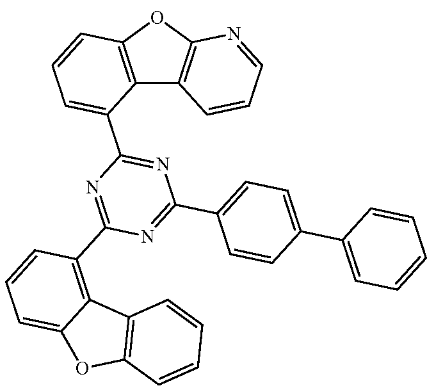

-continued
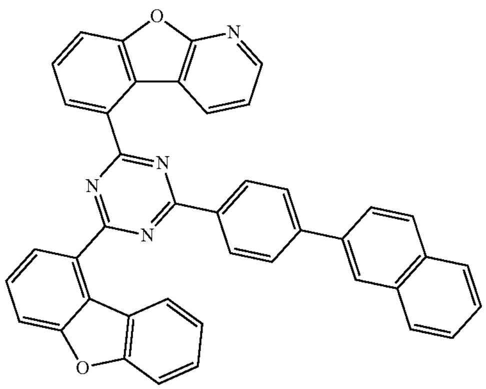
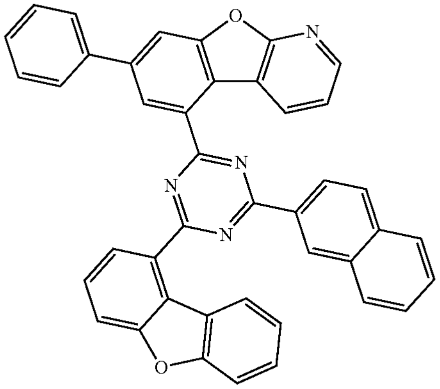
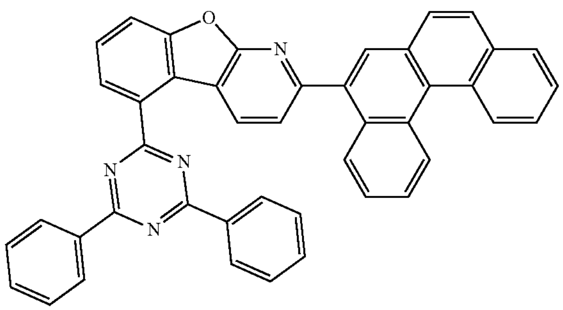
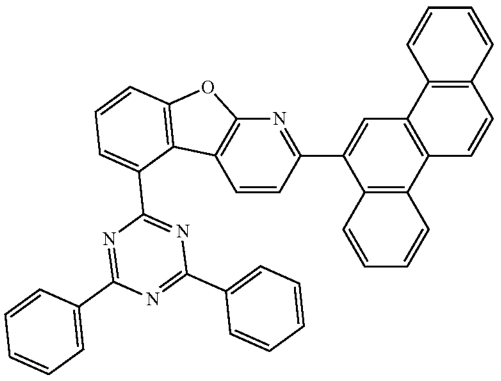
-continued
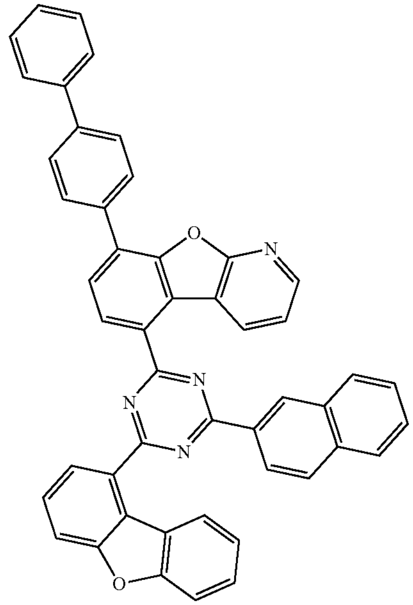
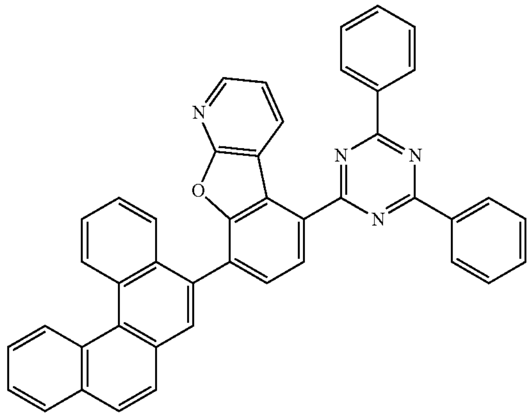
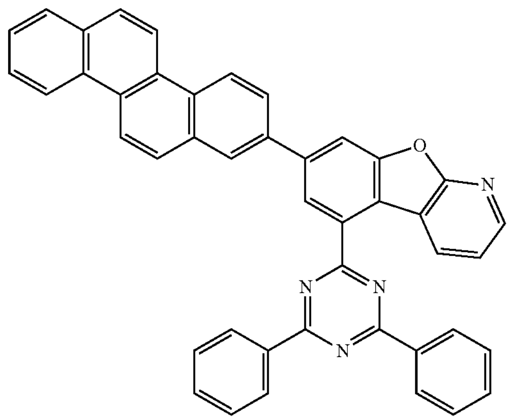

-continued
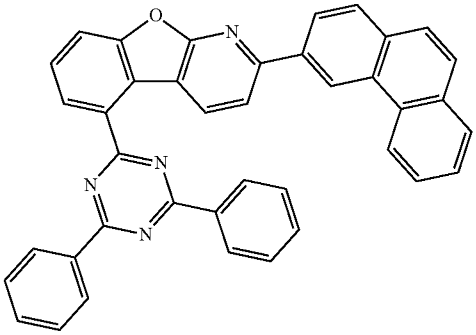
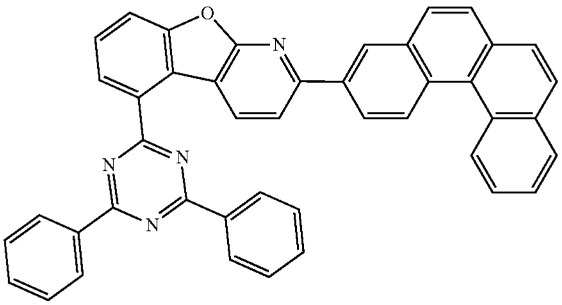
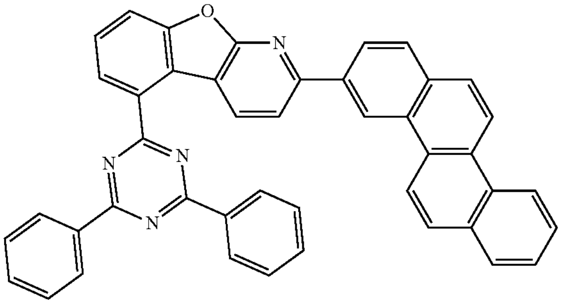
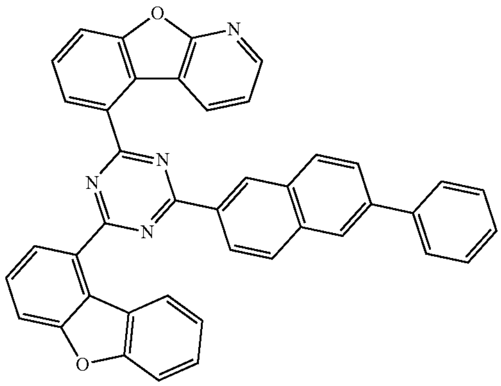
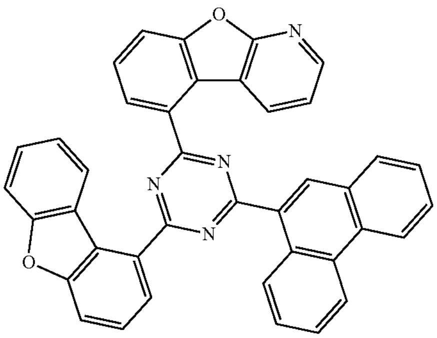
-continued
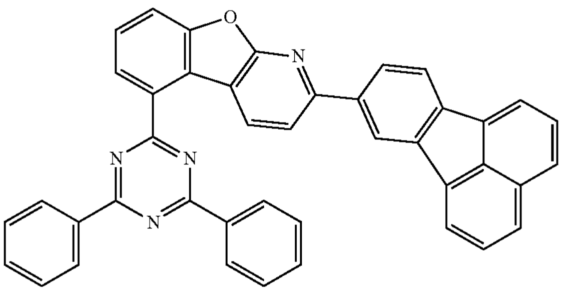
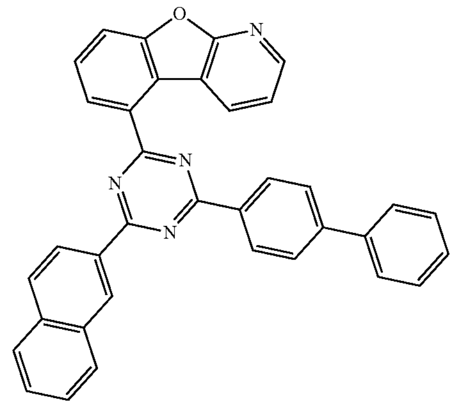
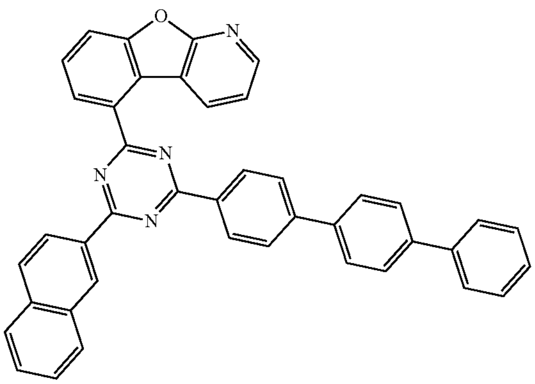
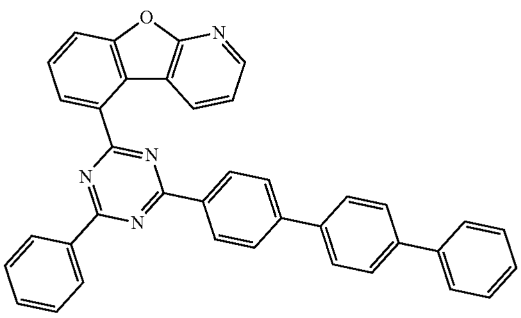

-continued
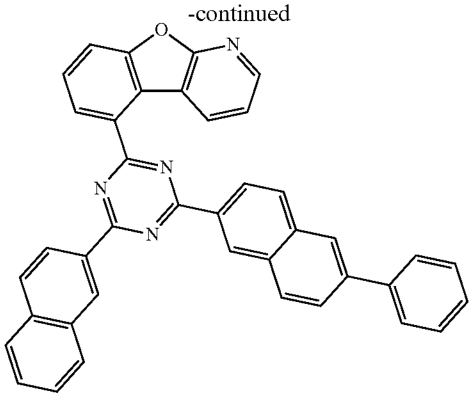
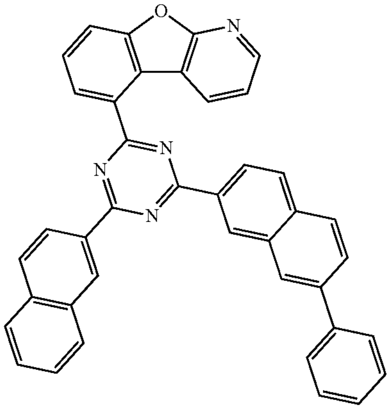
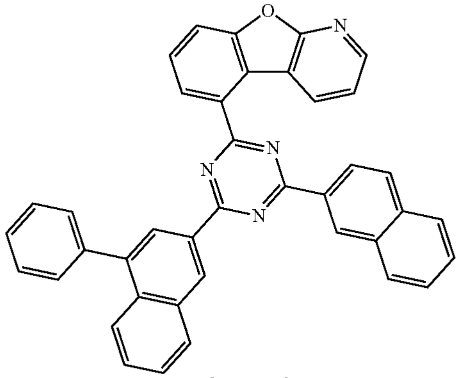
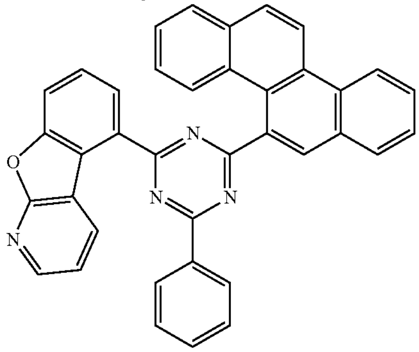
-continued
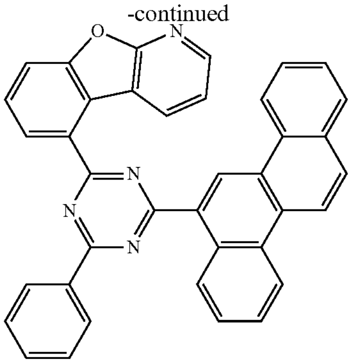
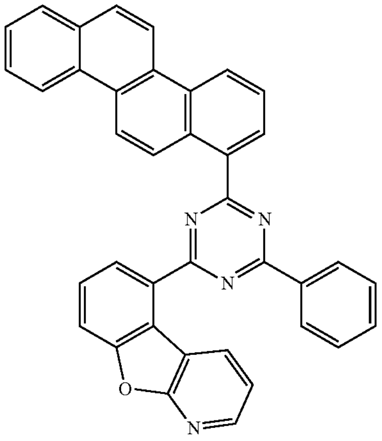
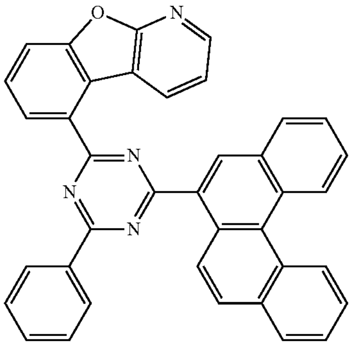
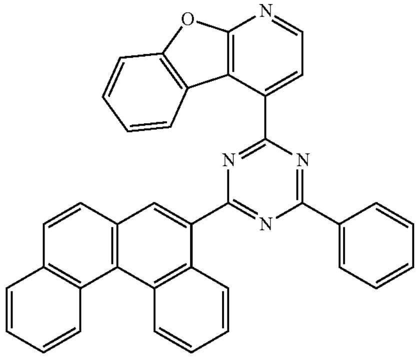

-continued
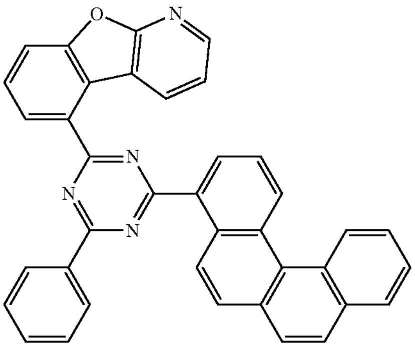
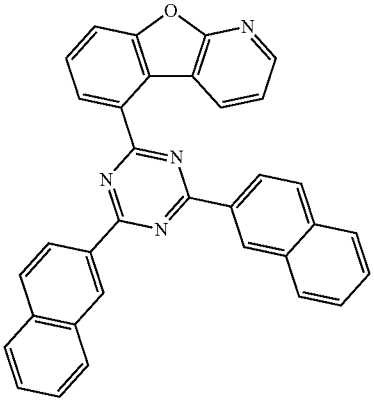
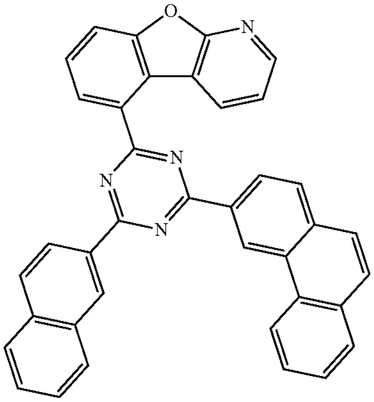
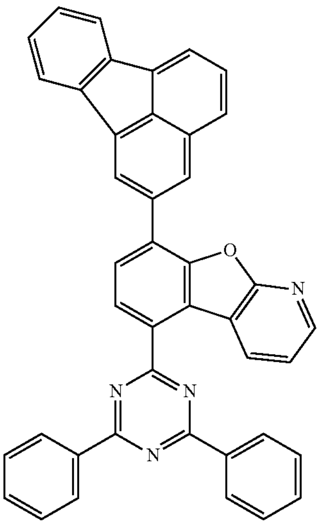
-continued
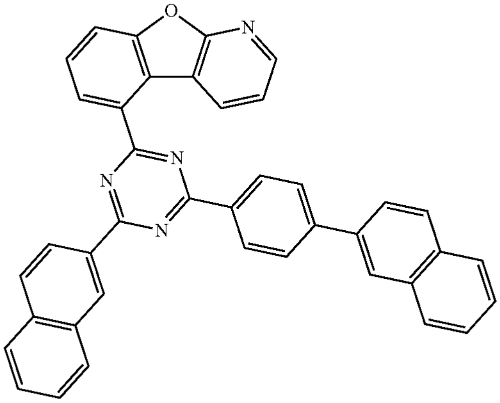
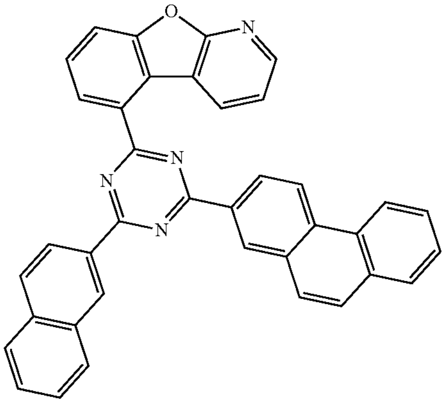
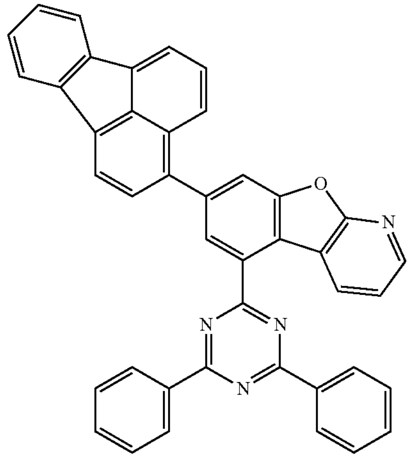
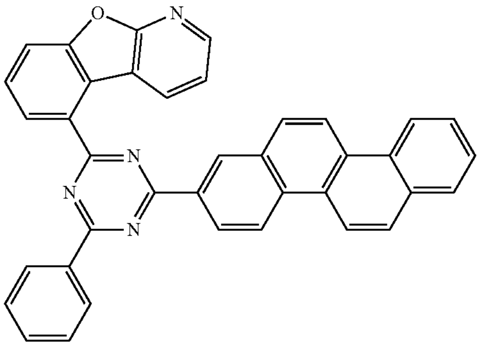

-continued
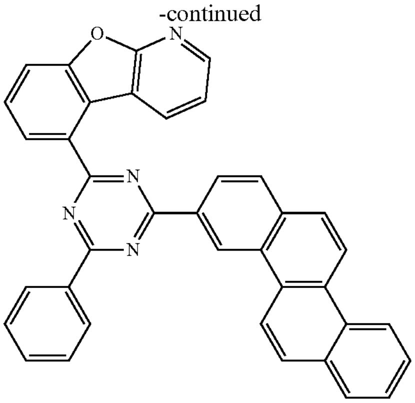
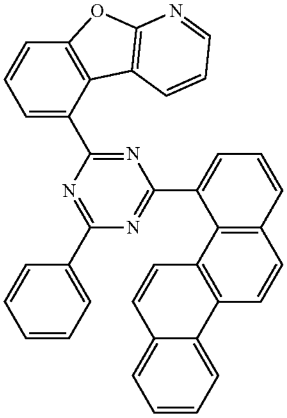
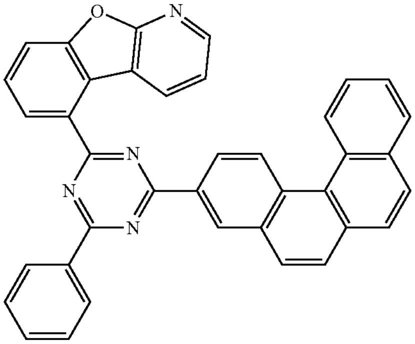
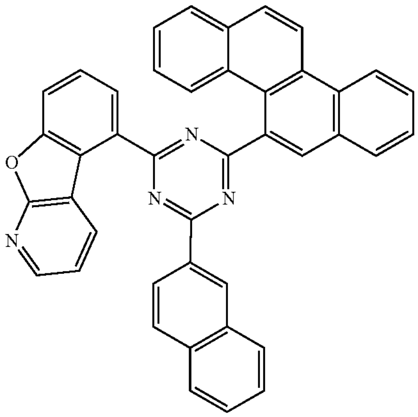
-continued
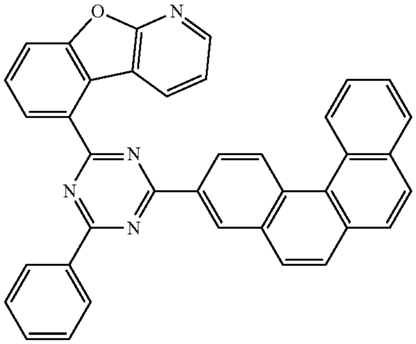
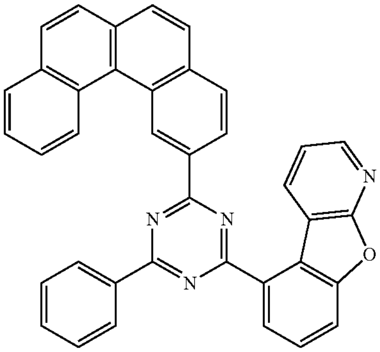
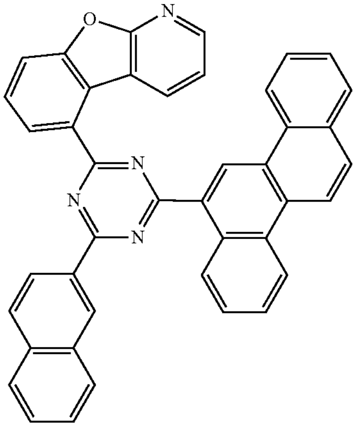

-continued
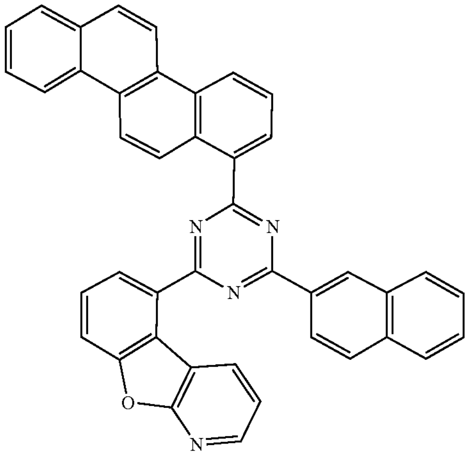
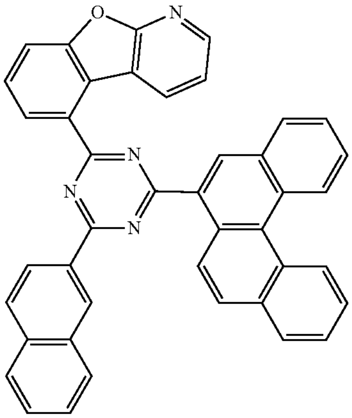
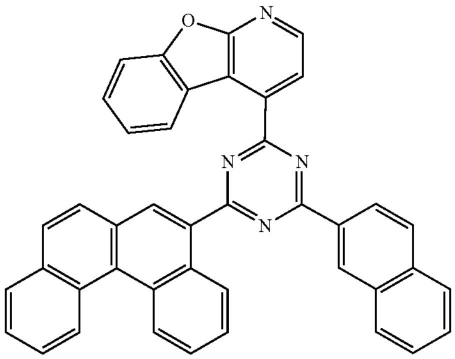
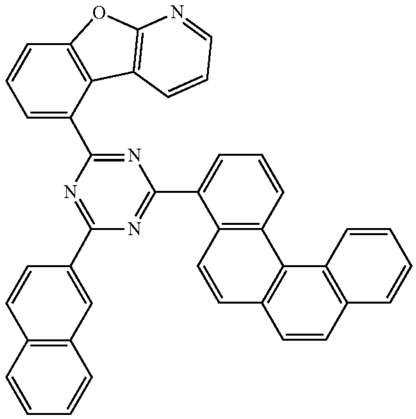
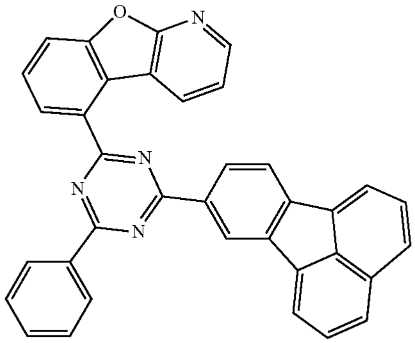
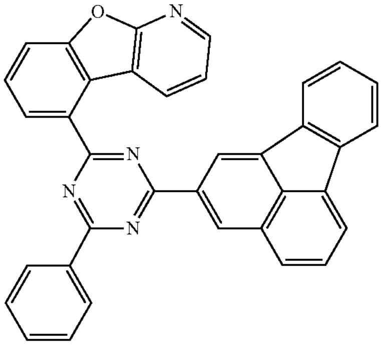
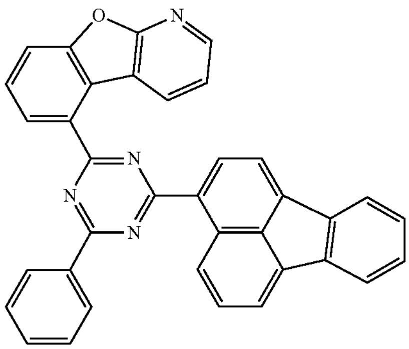
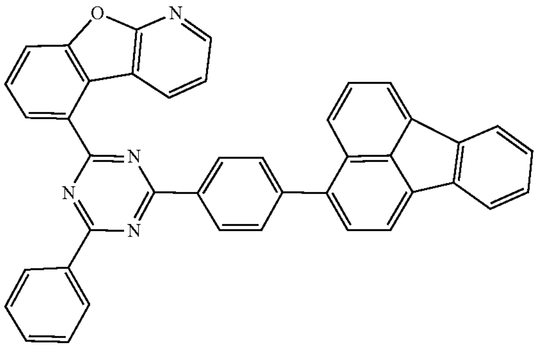

-continued
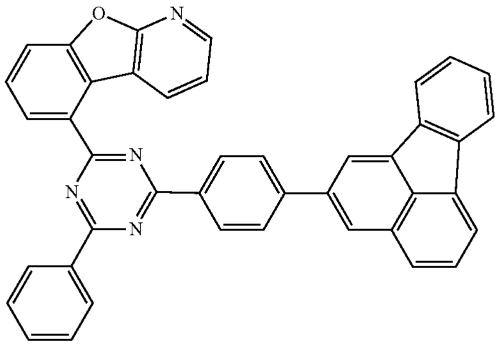
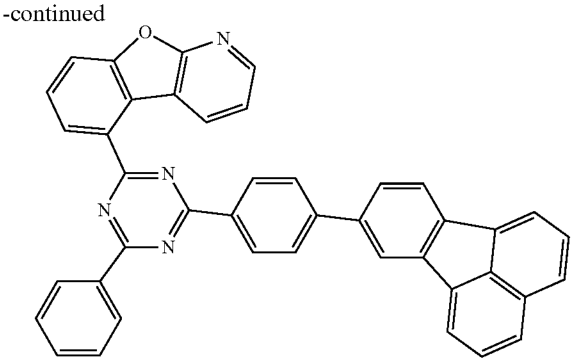
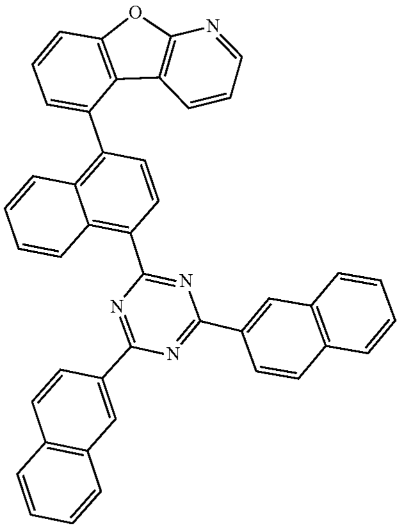
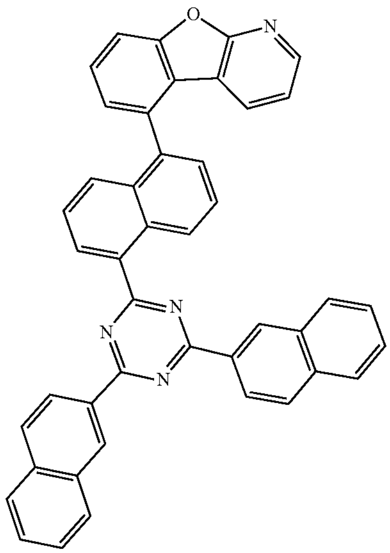
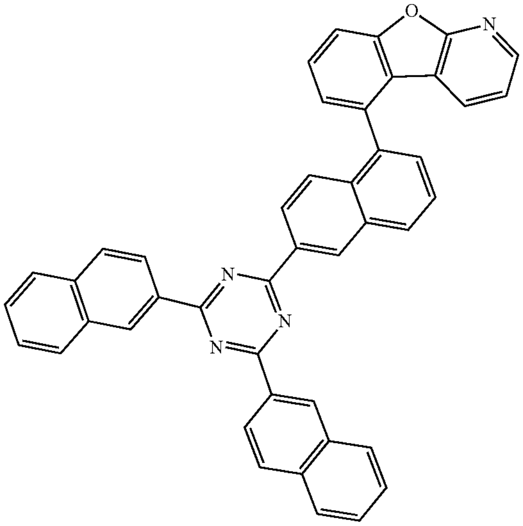
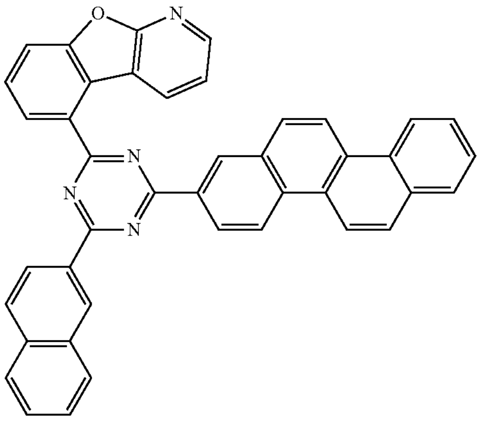

-continued
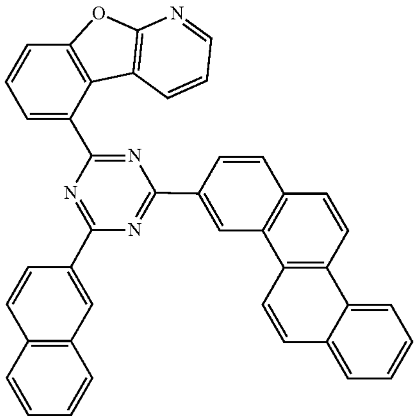
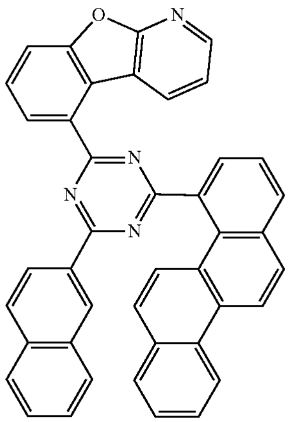
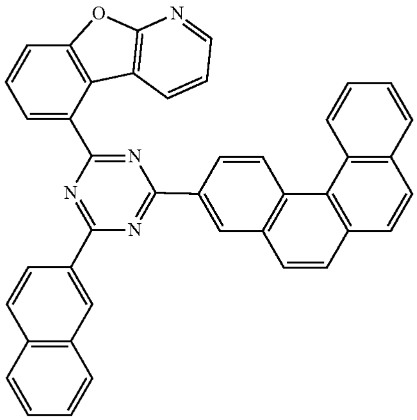
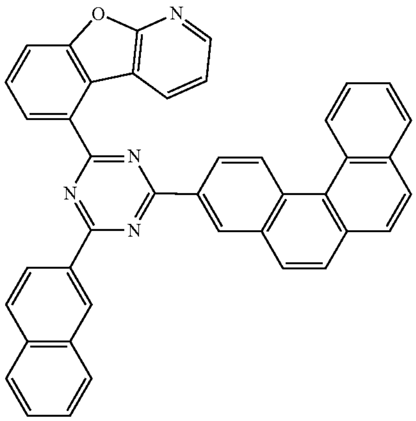
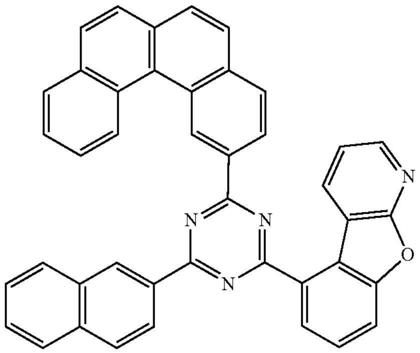
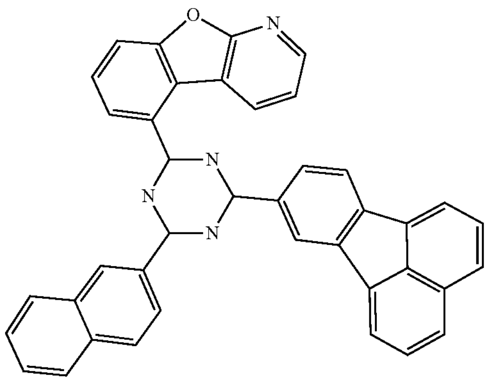
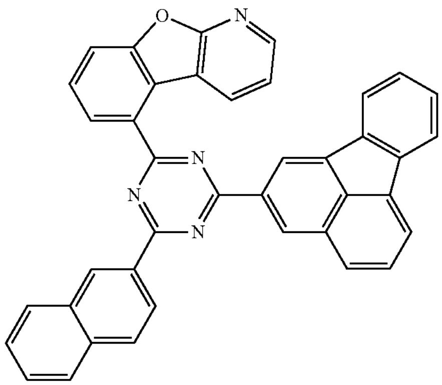
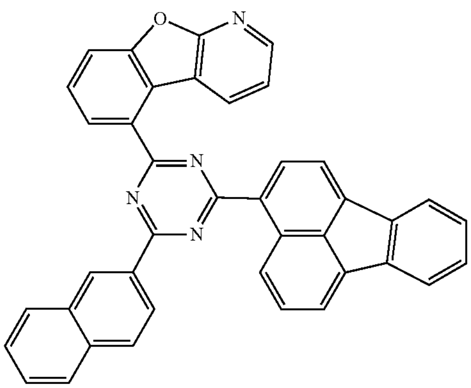

-continued
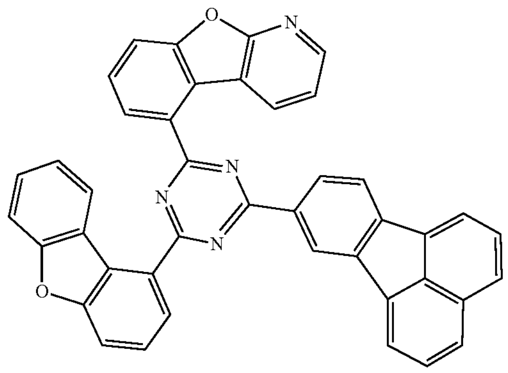
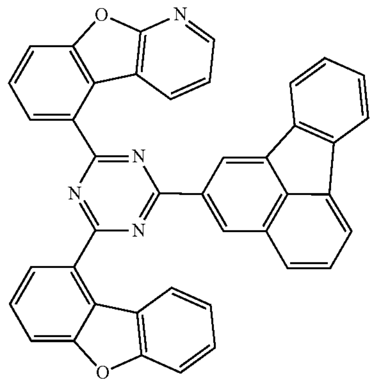
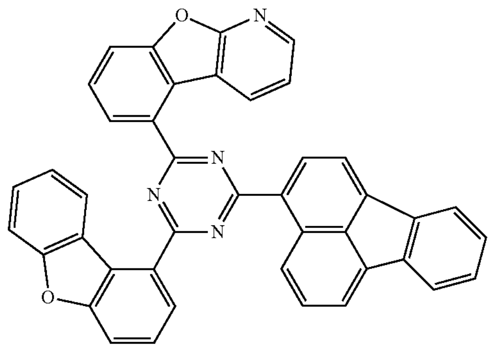
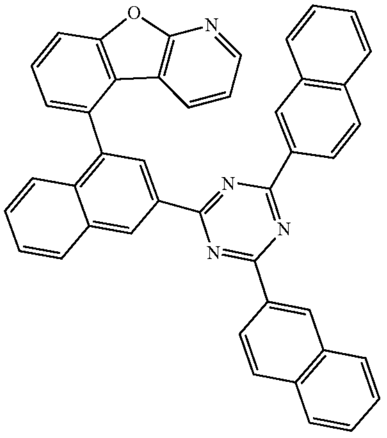
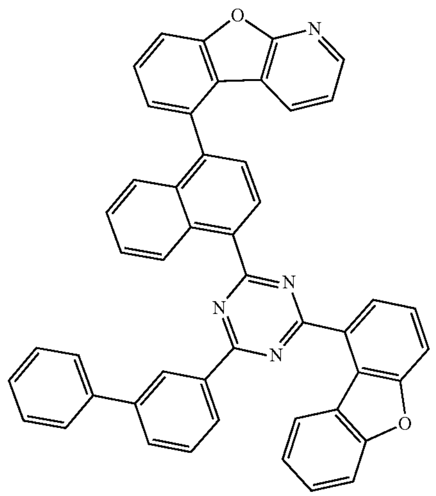
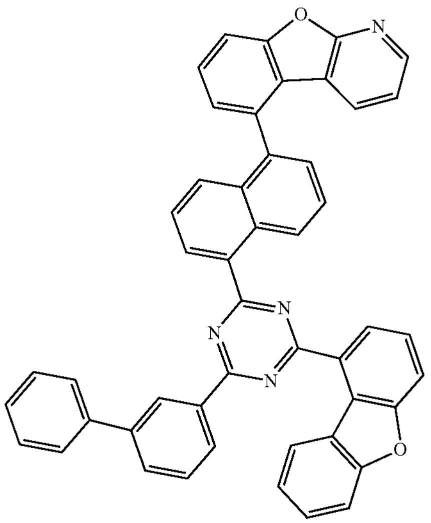

-continued
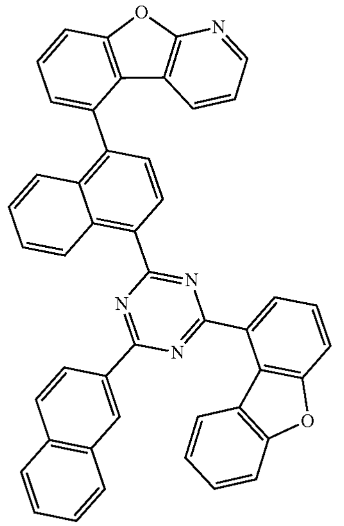
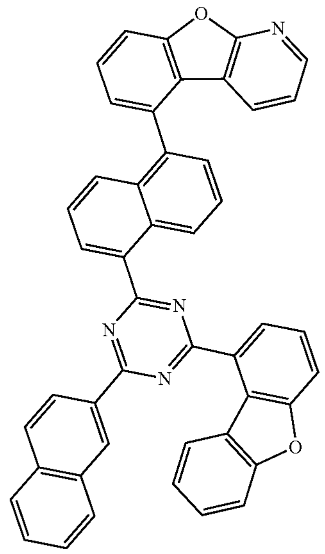
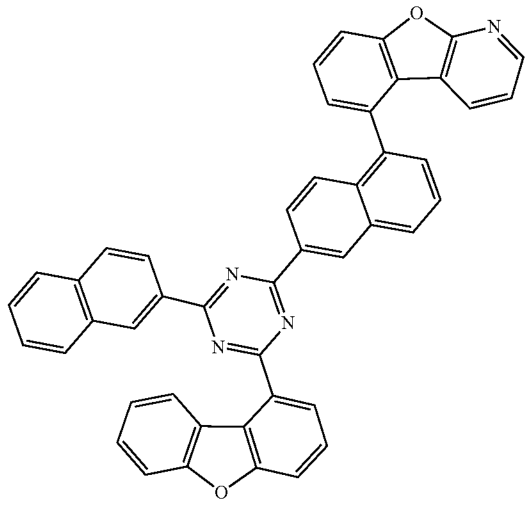
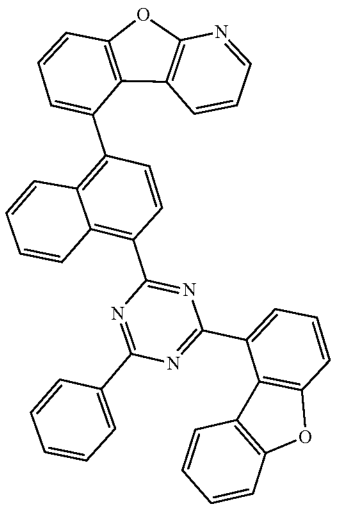
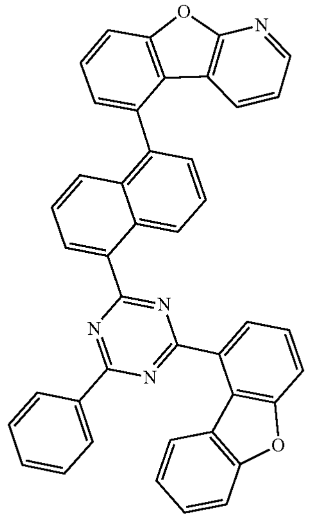
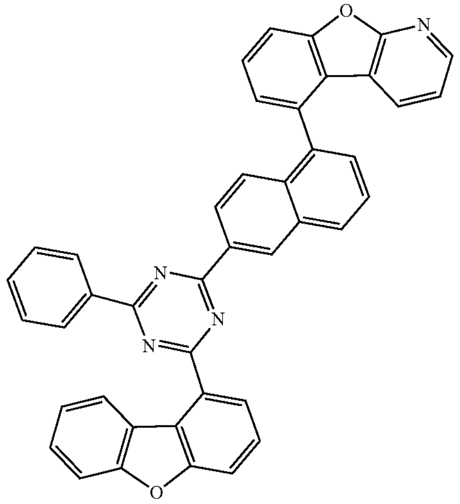

-continued
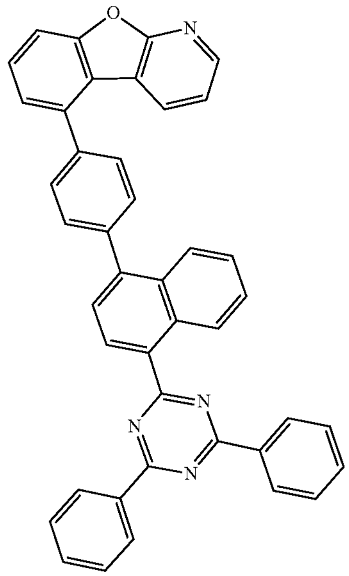
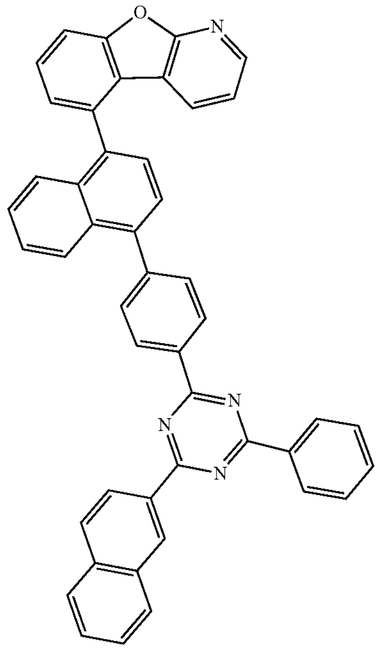
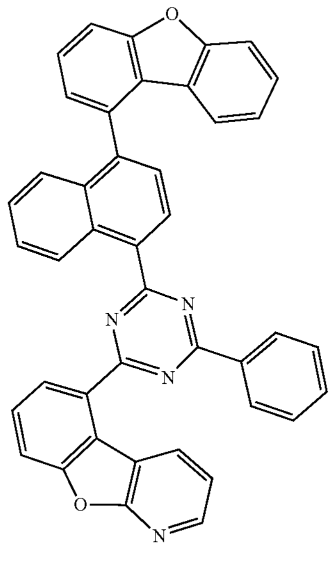
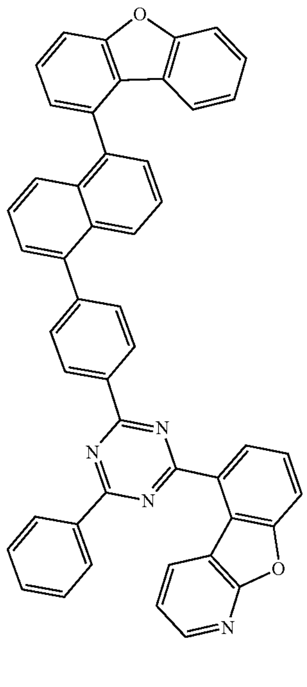

-continued
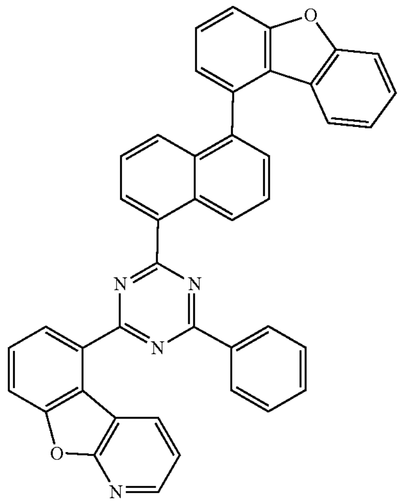
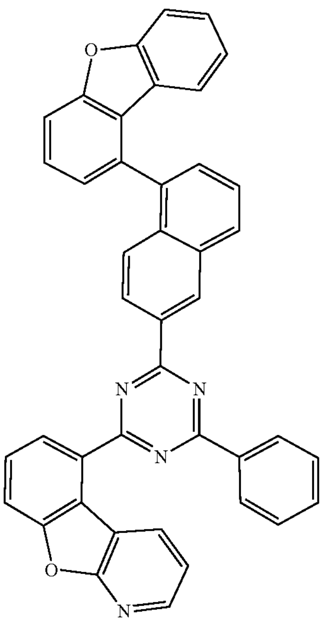
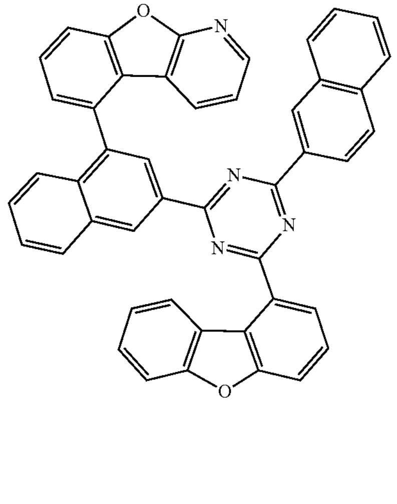
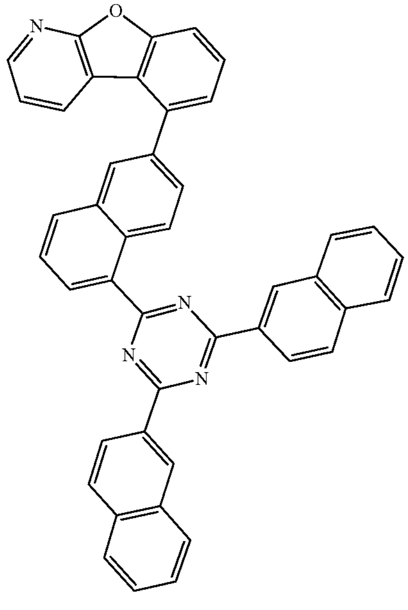

-continued
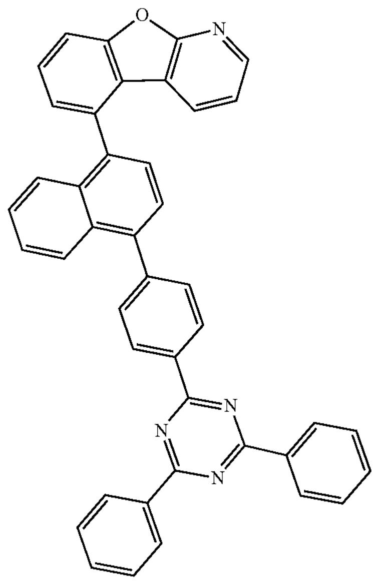
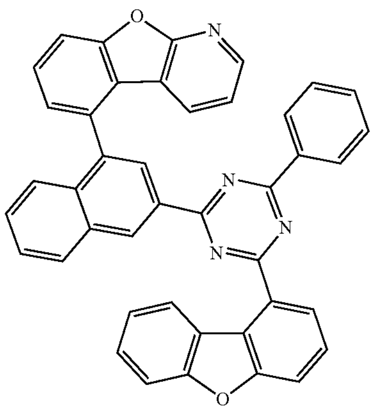
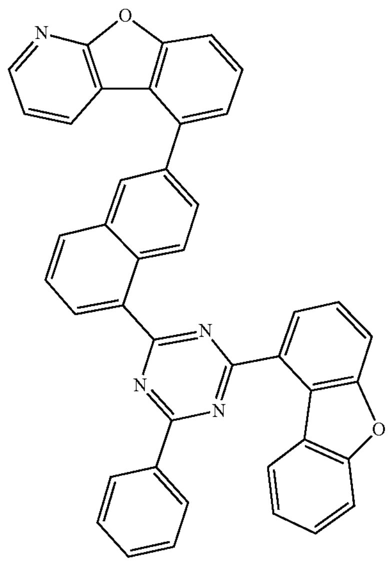
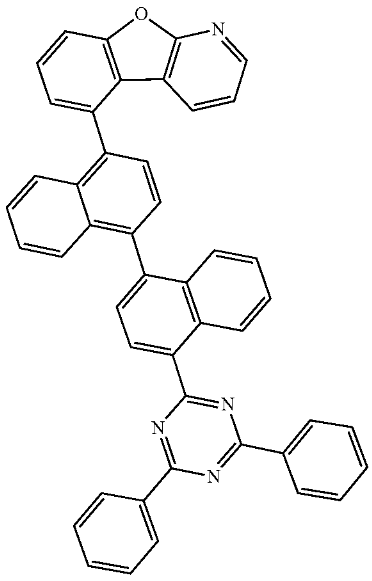

-continued
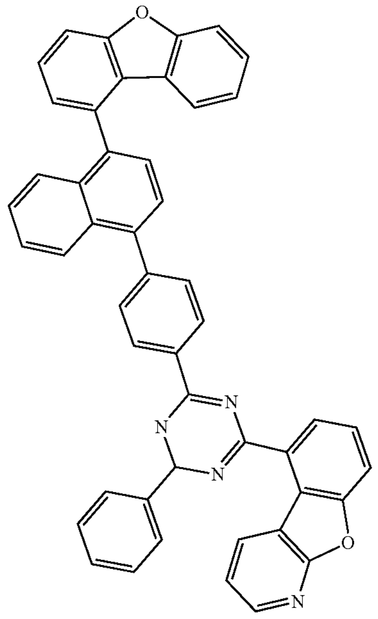
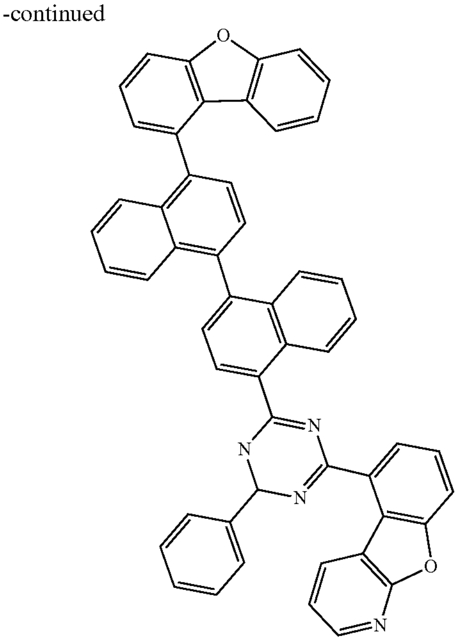
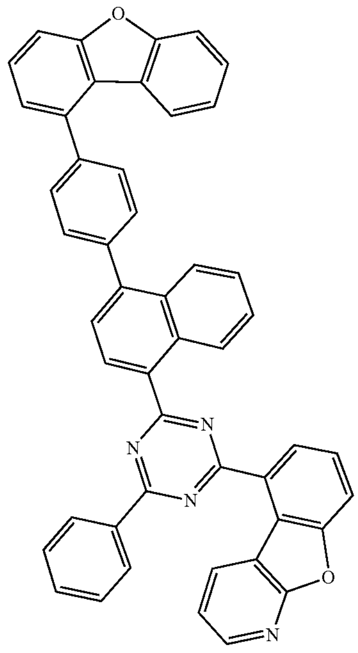
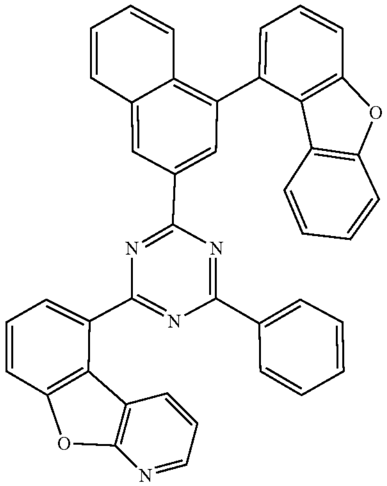

-continued
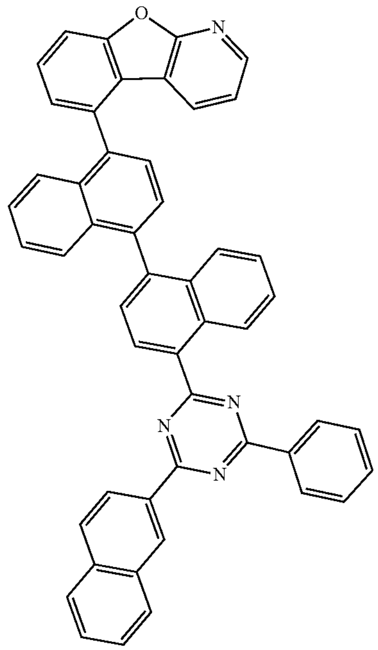
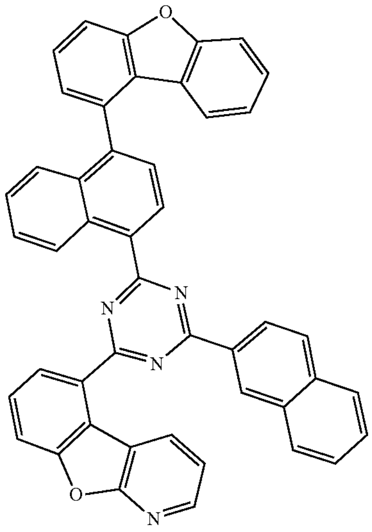
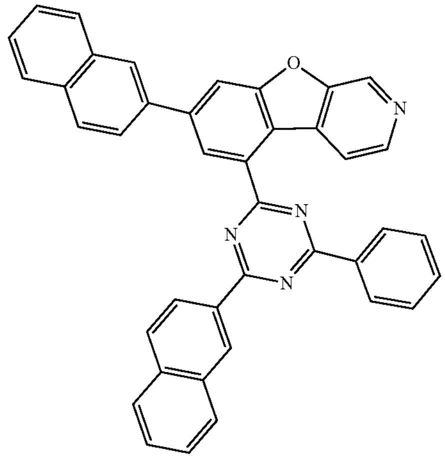
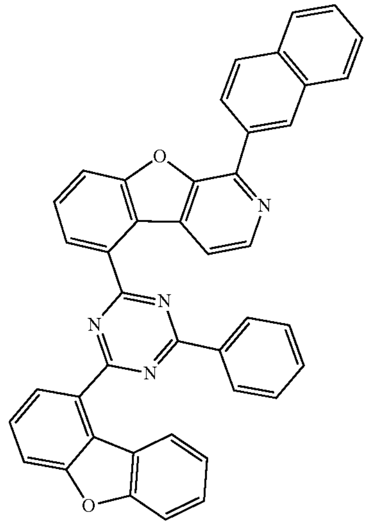

-continued
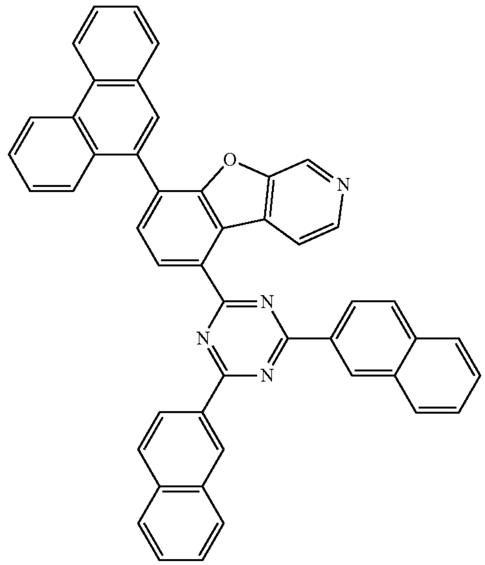
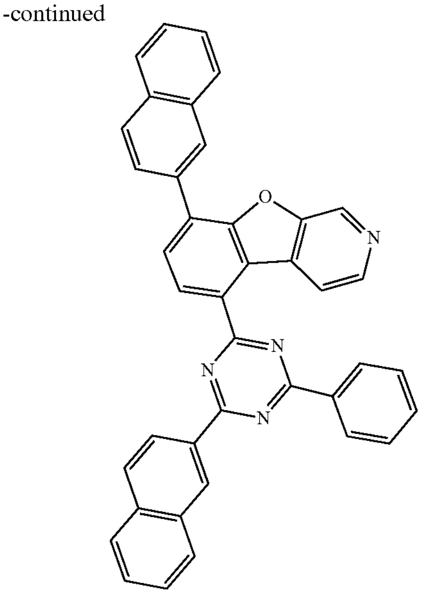
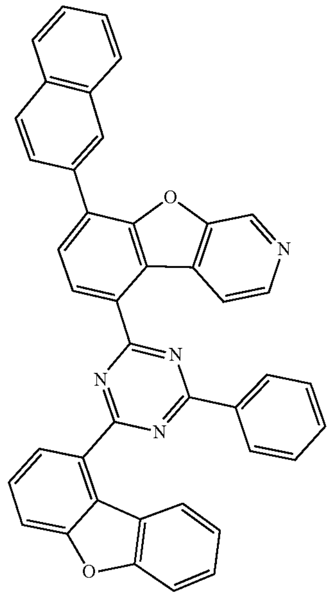
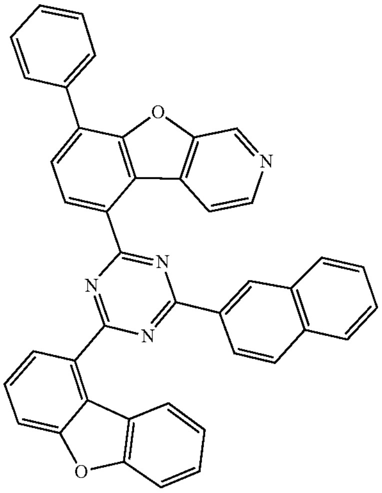
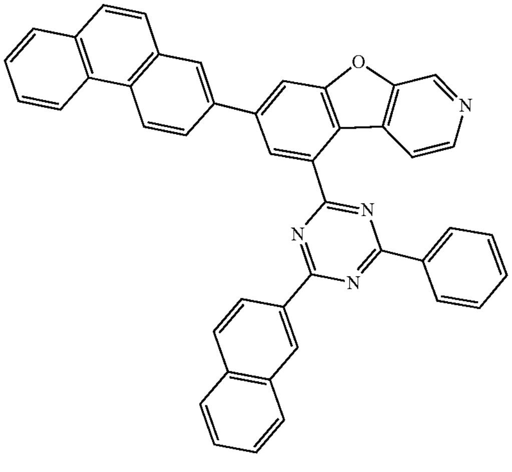
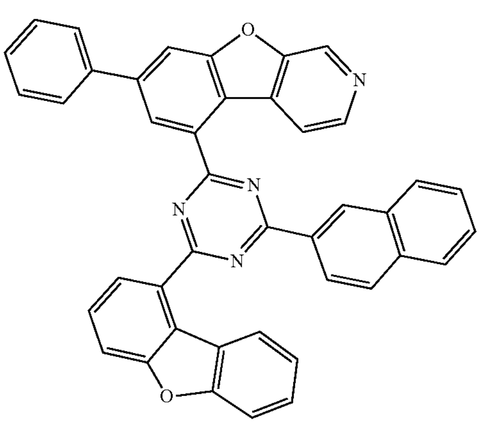

-continued
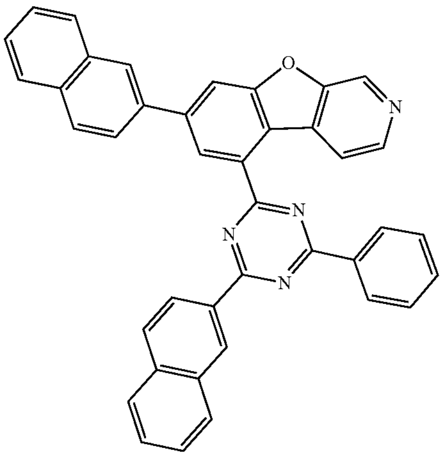
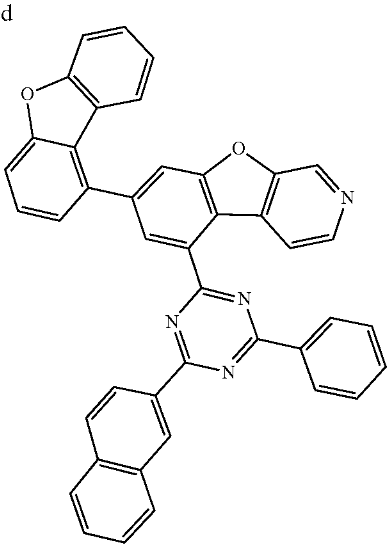
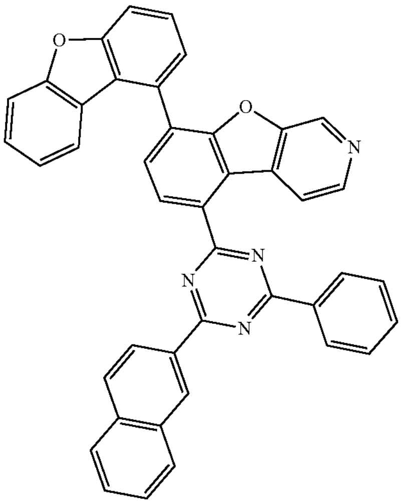
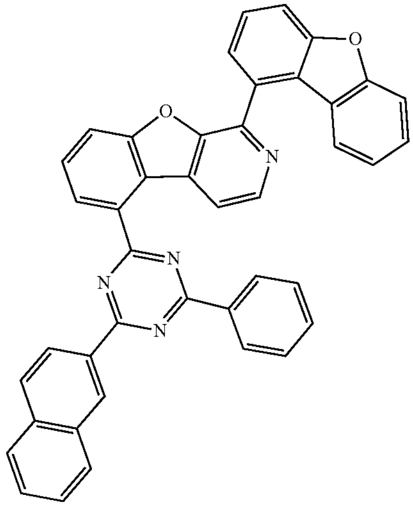
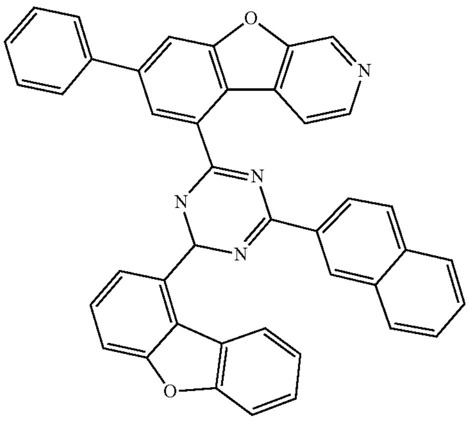
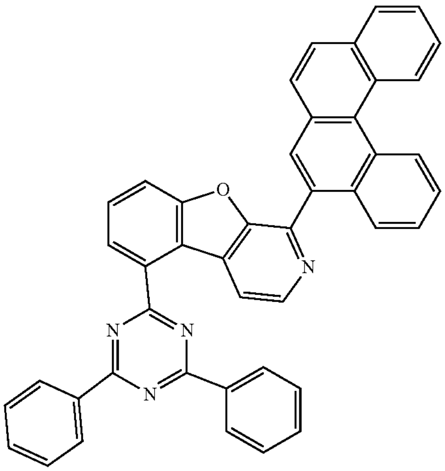

-continued
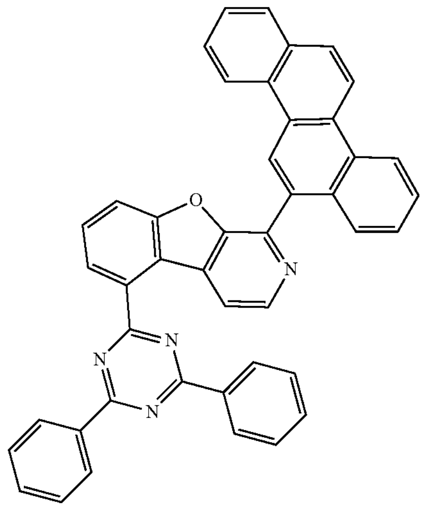
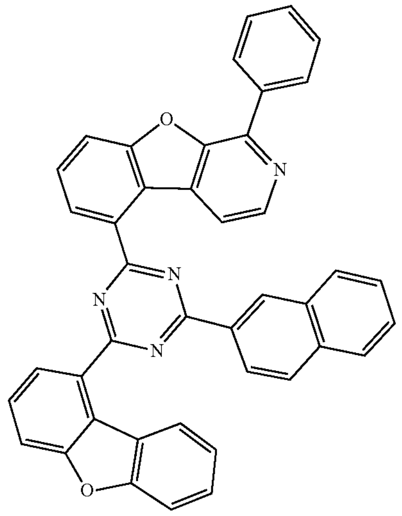
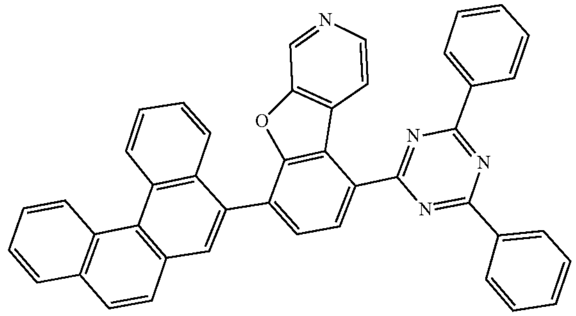
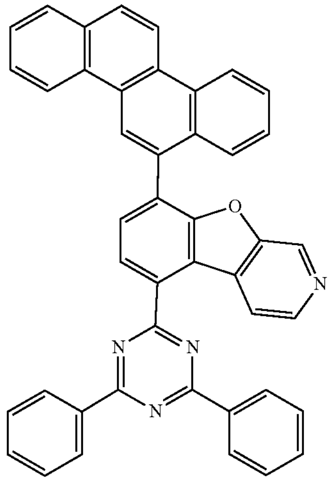
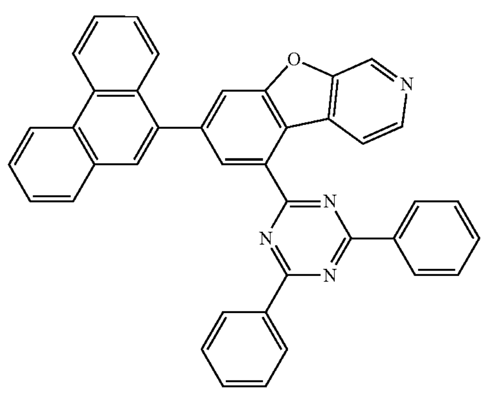
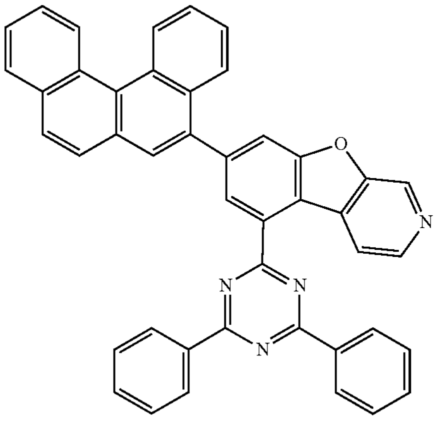

-continued
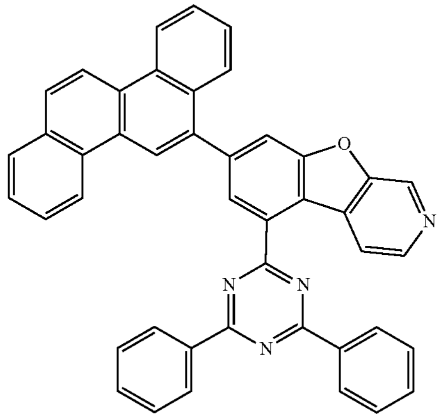
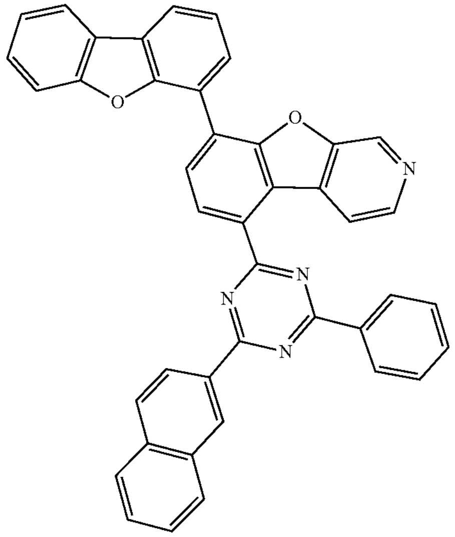
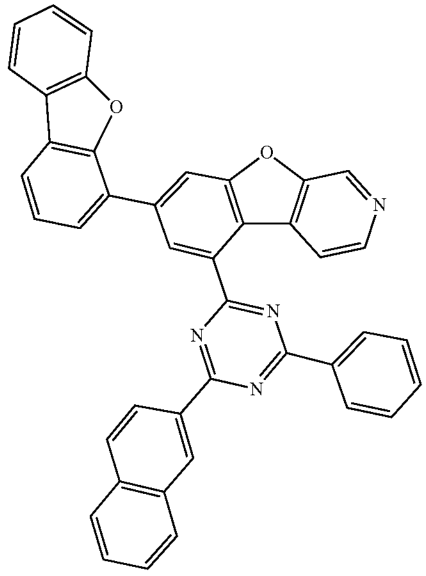
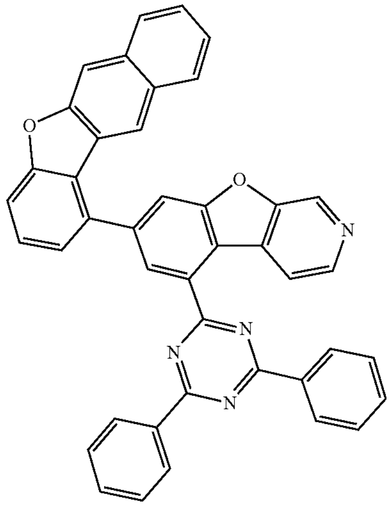
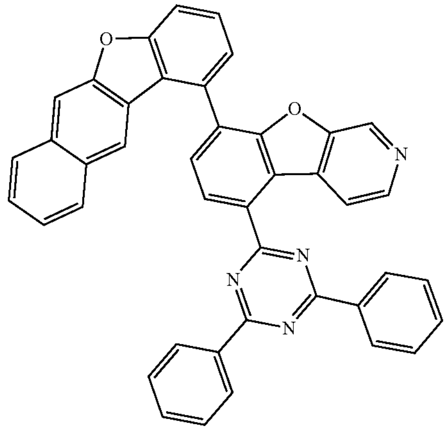
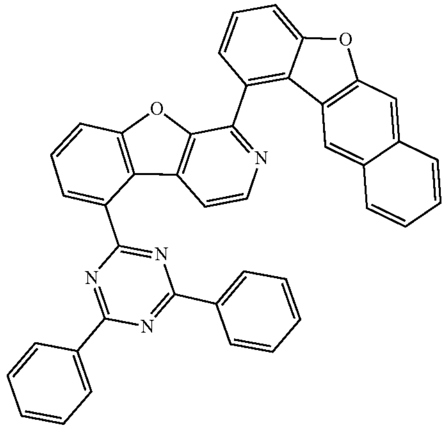

-continued
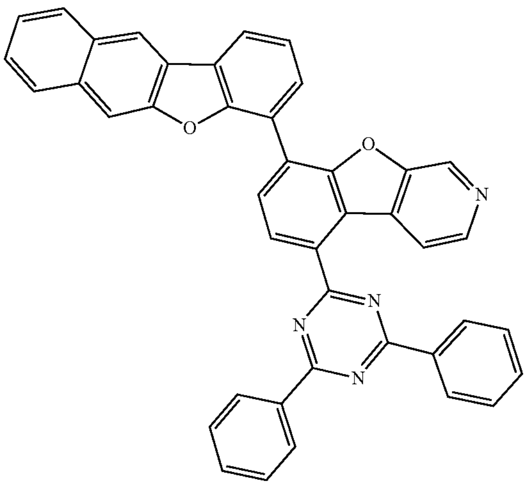
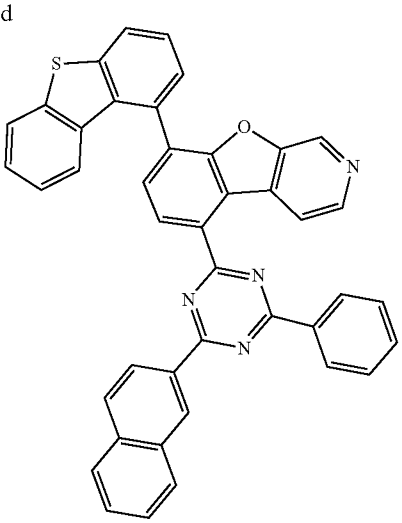
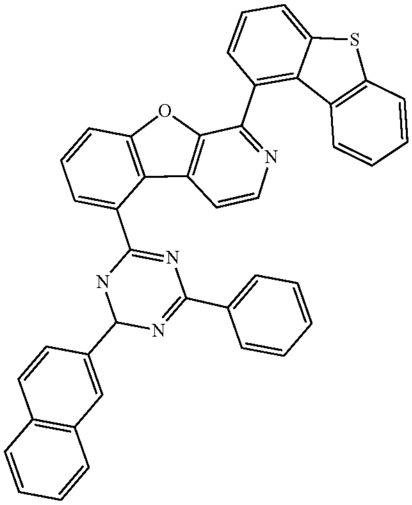
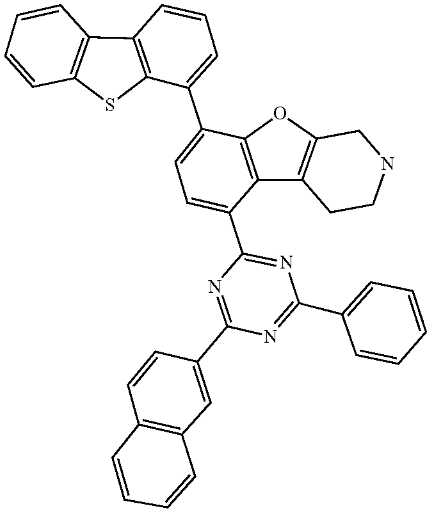
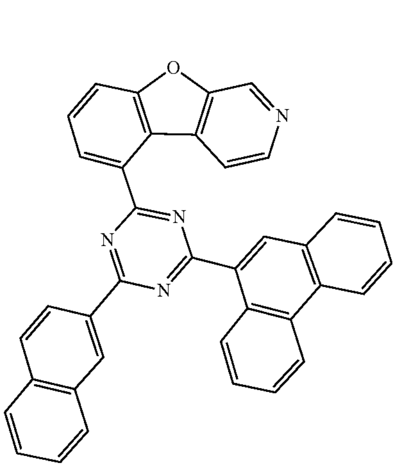
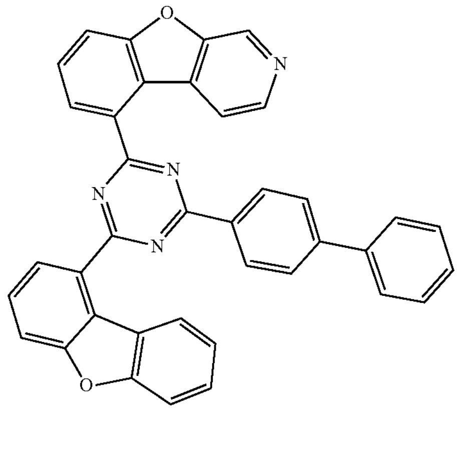

-continued
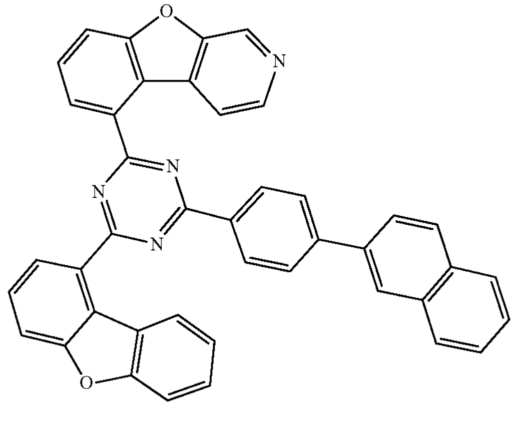
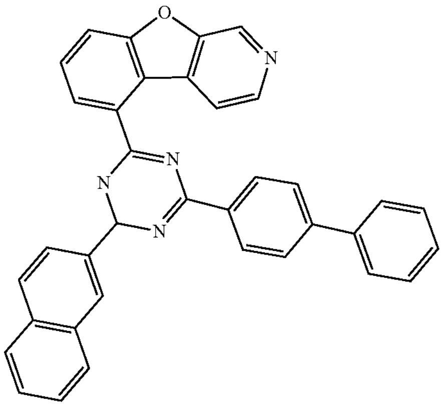
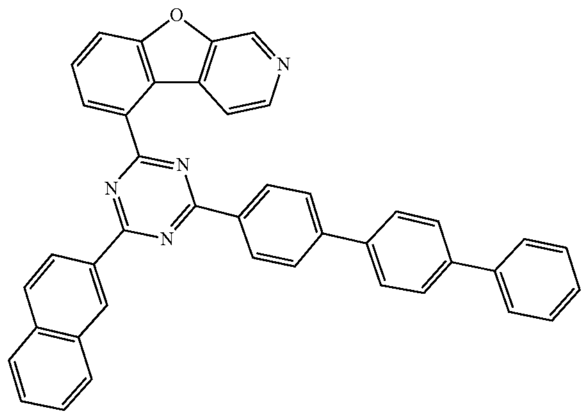
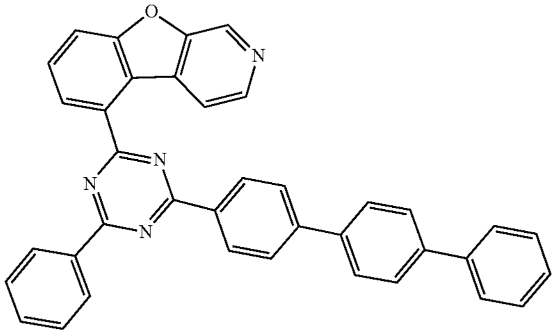
-continued
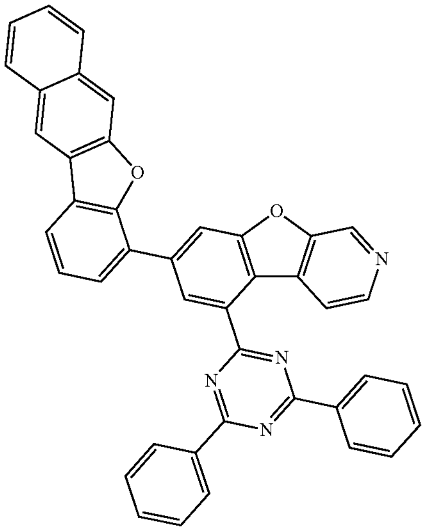
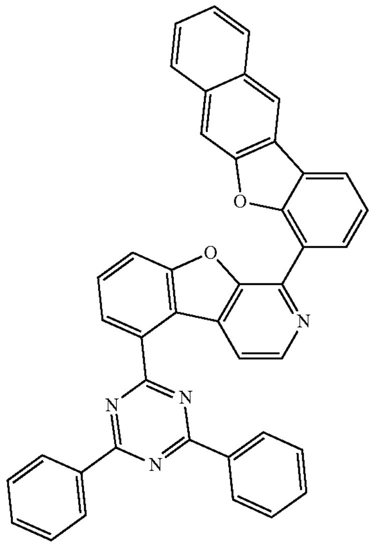

-continued
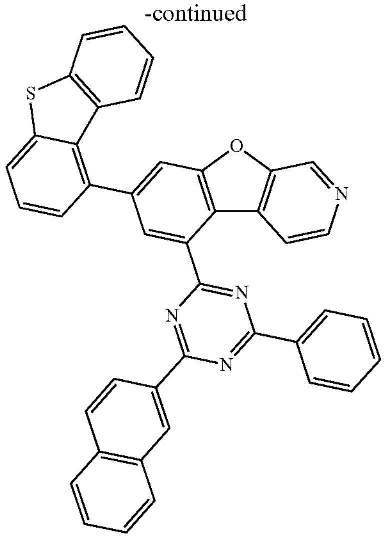
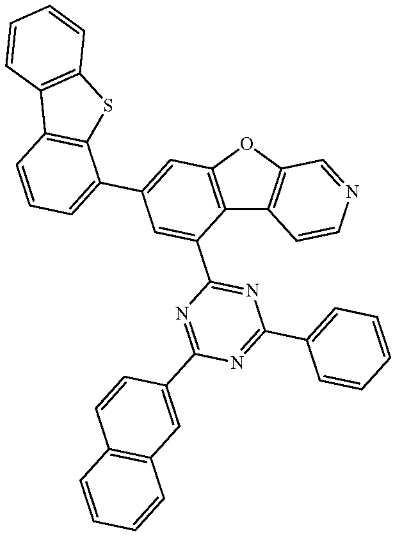
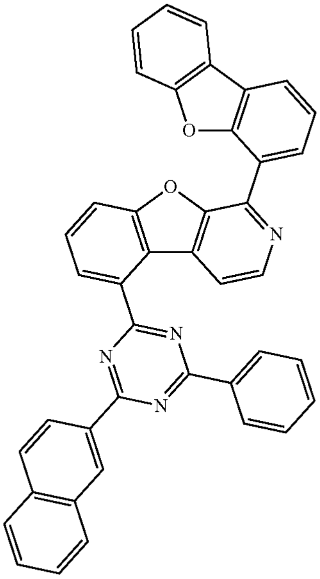
-continued
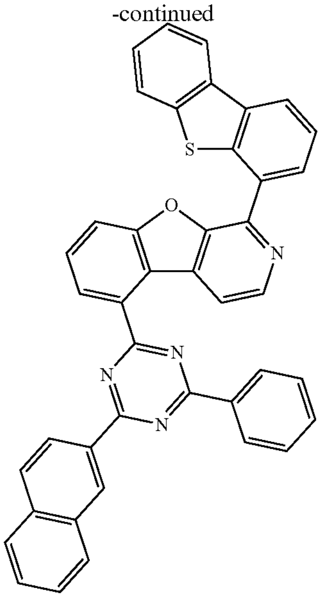
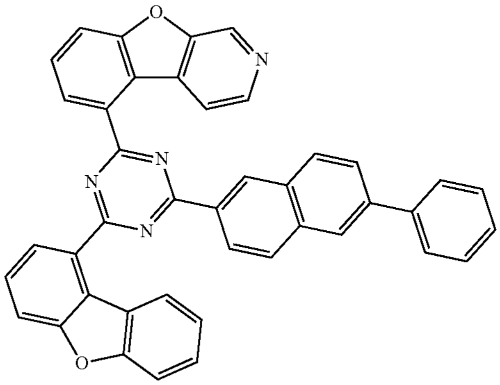
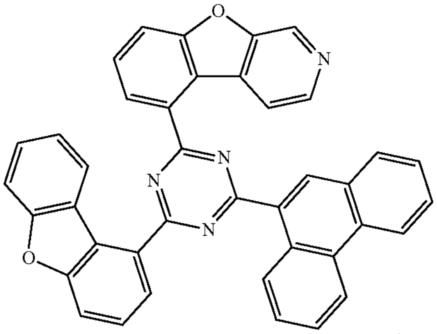
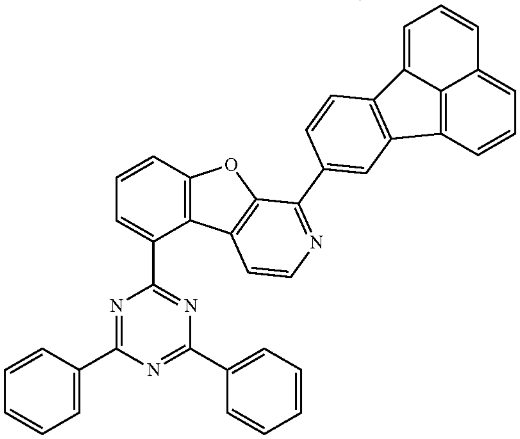

-continued
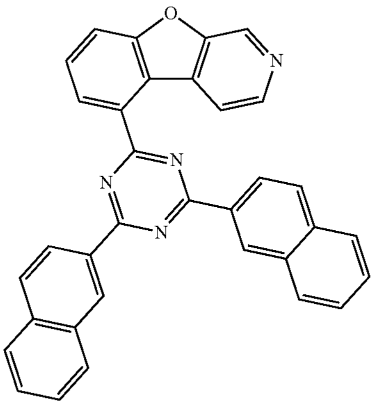
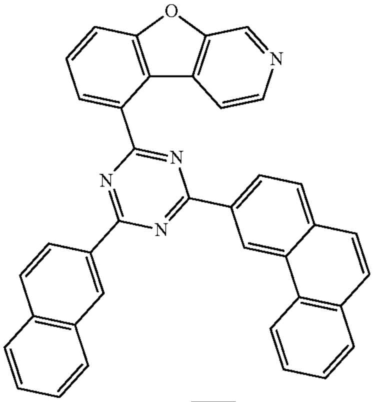
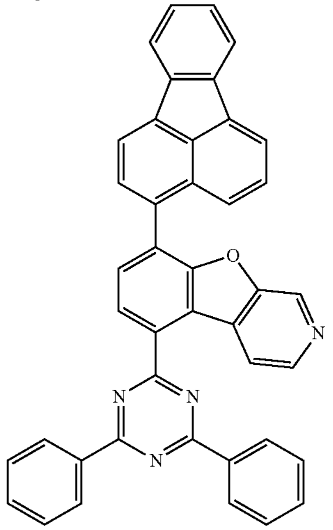
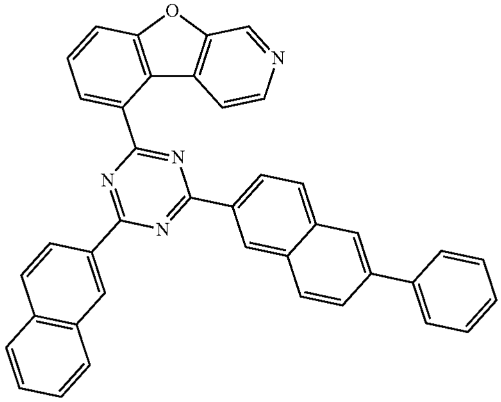
-continued
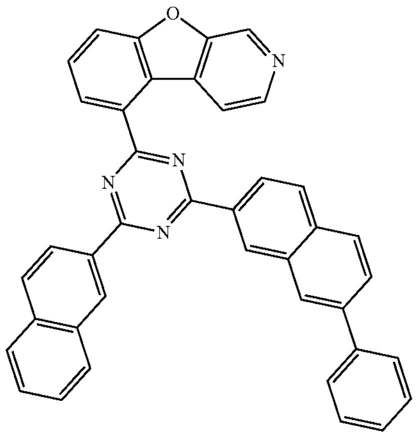
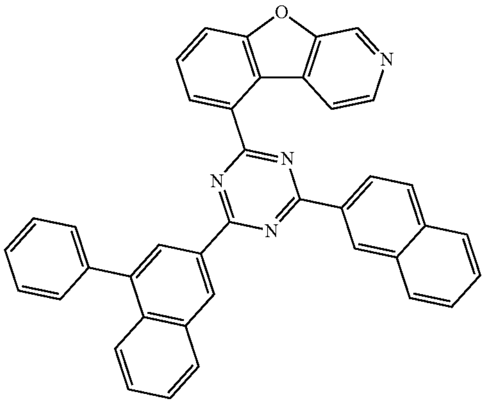
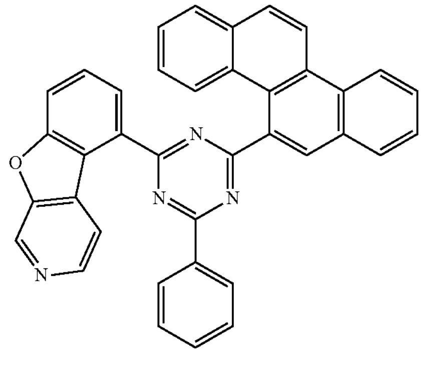
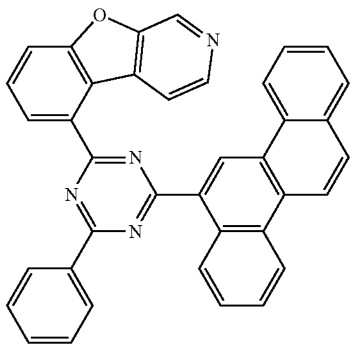

-continued
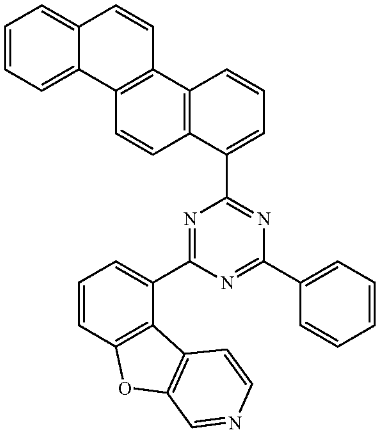
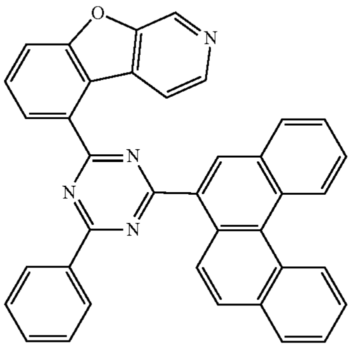
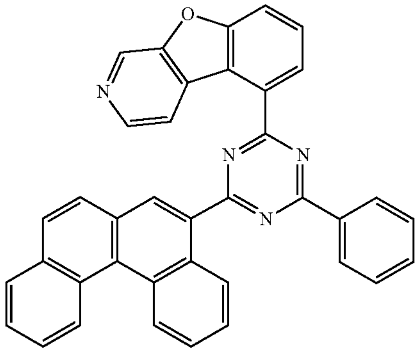
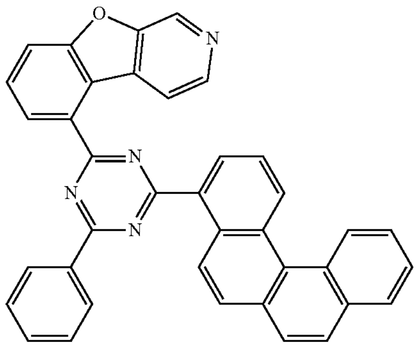
-continued
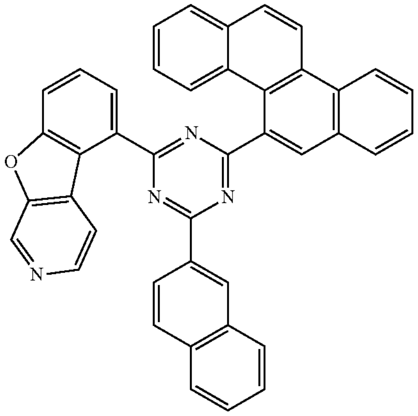
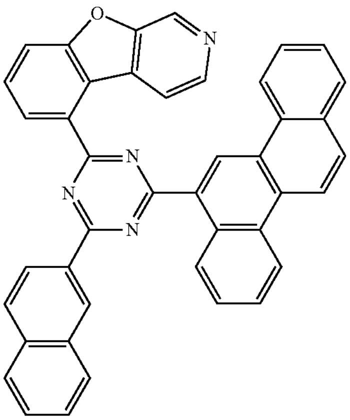
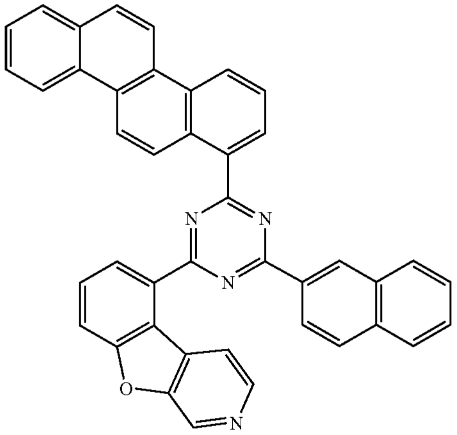
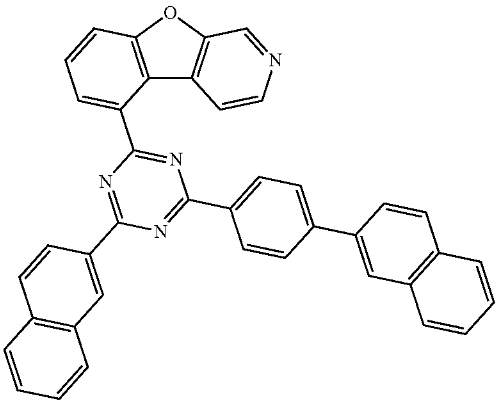

-continued
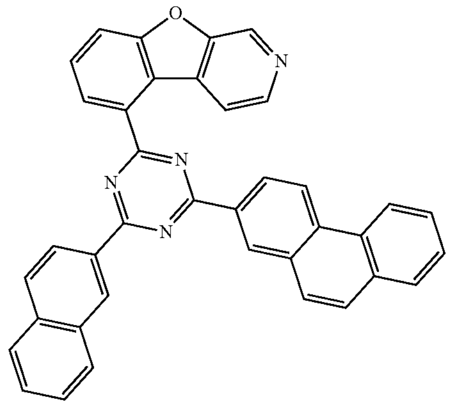
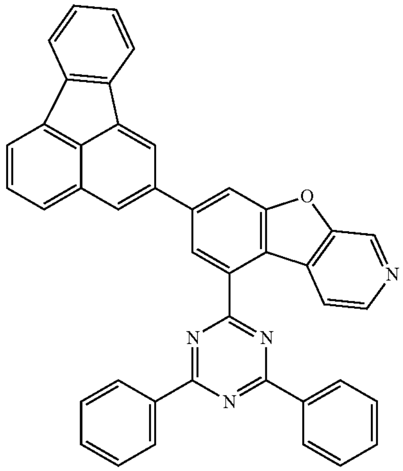
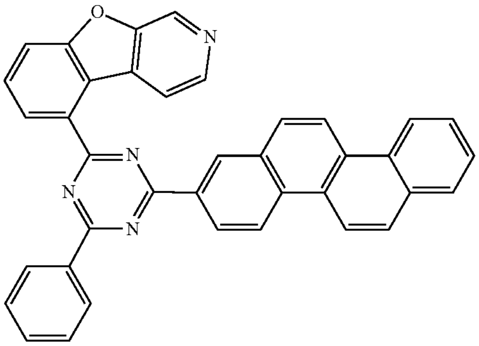
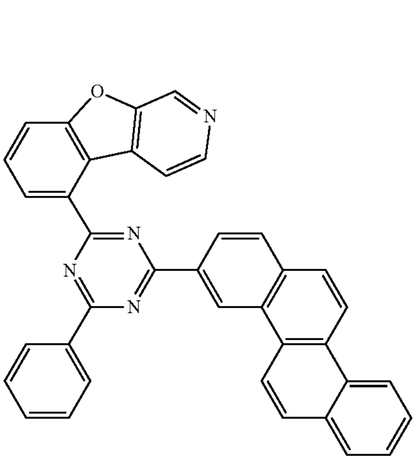
-continued
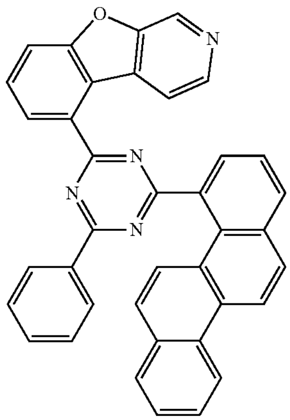
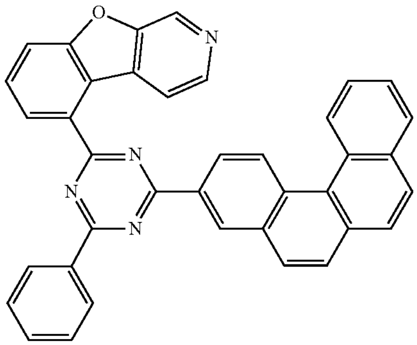
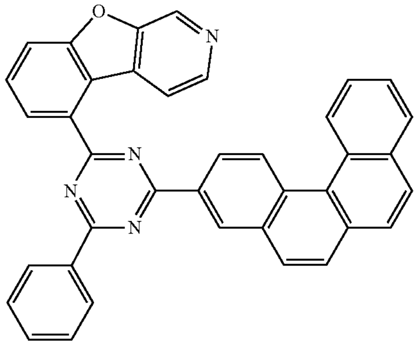
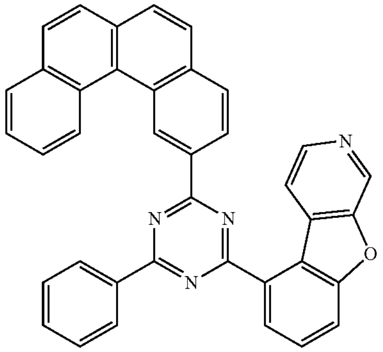

-continued
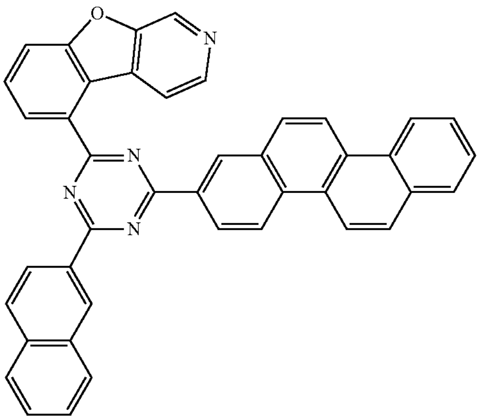
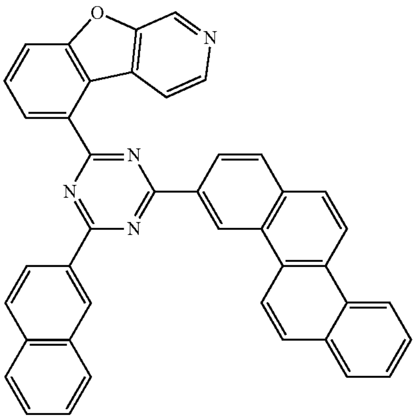
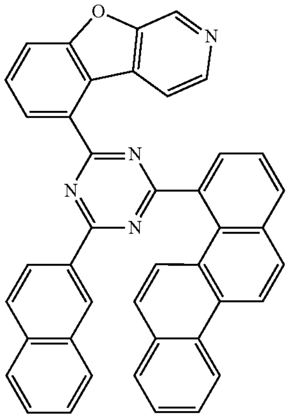
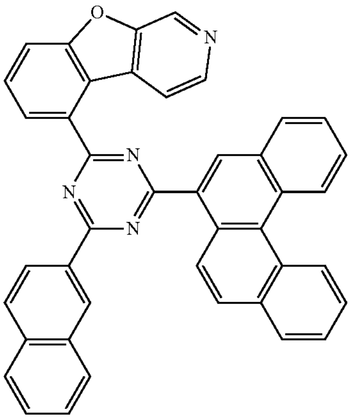
-continued
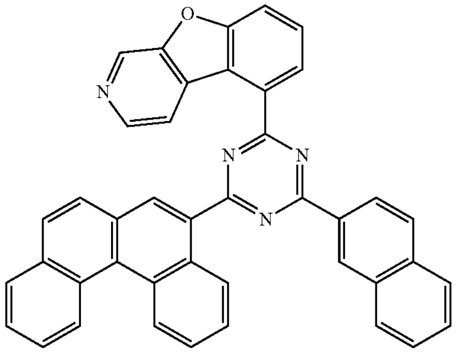
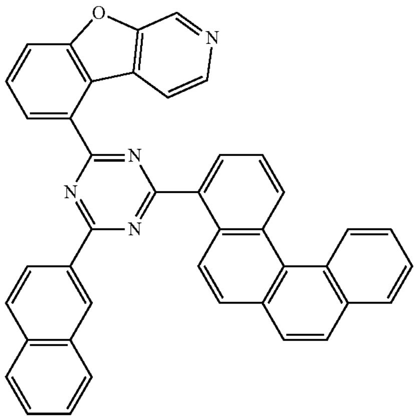
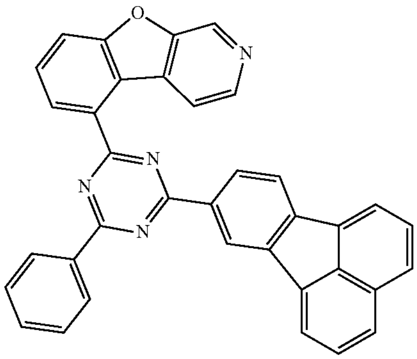
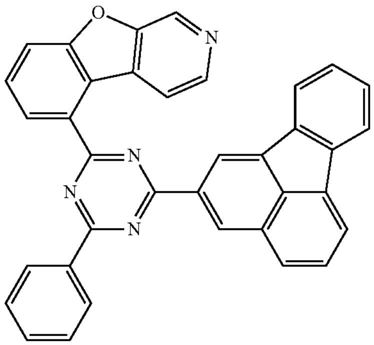

-continued
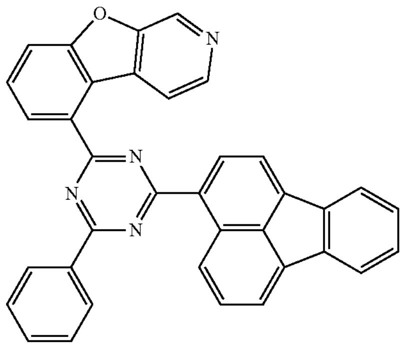
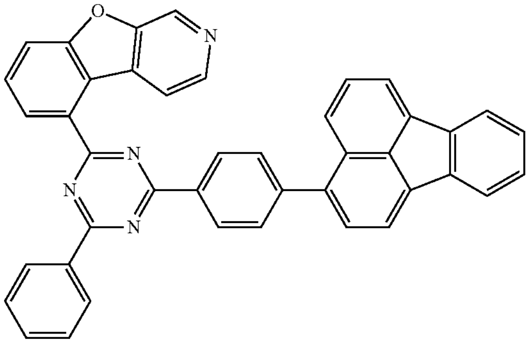
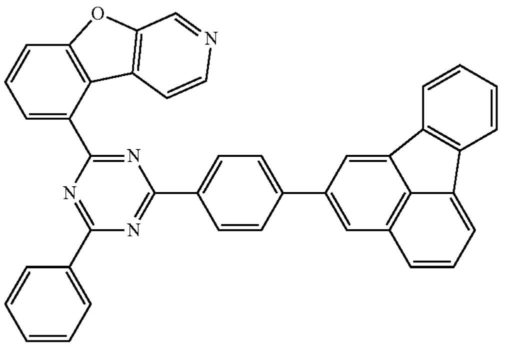
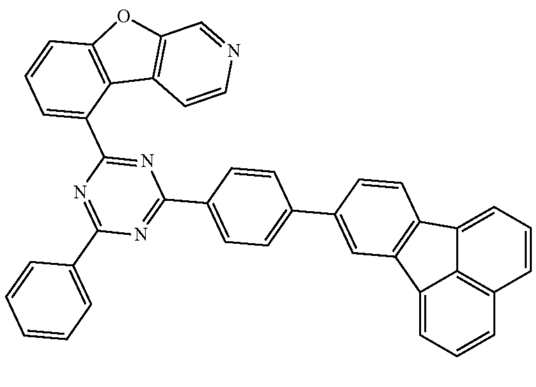
-continued
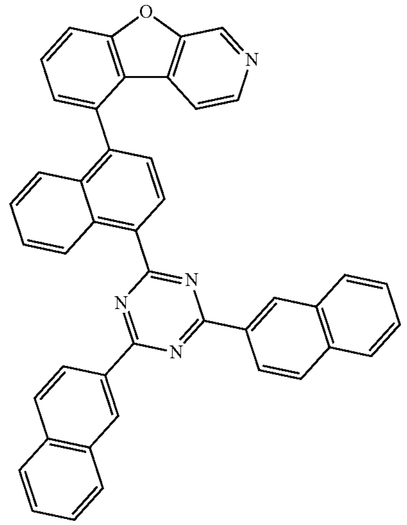
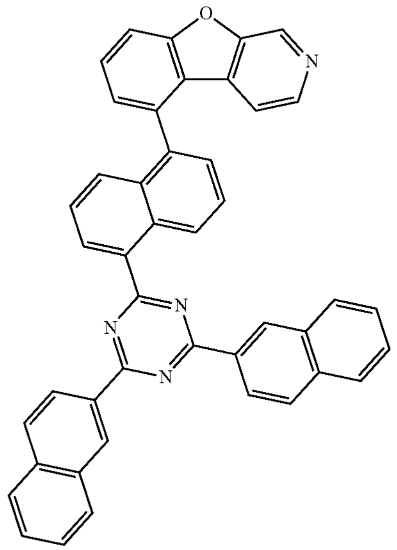
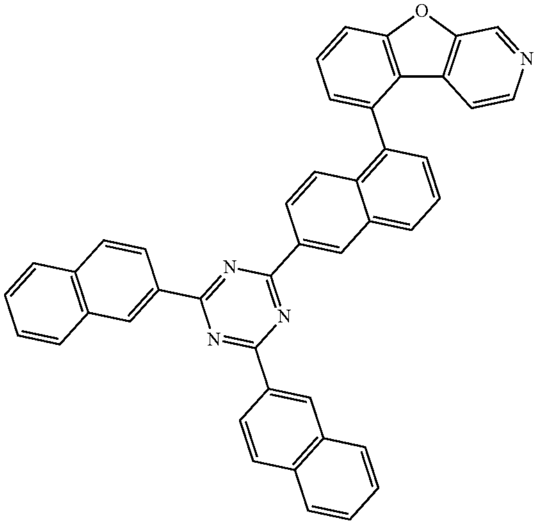

-continued
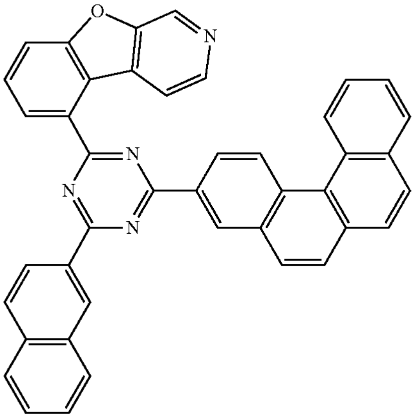
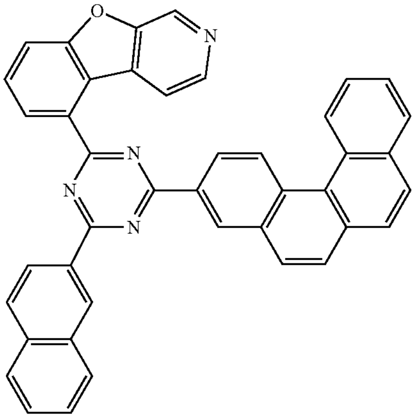
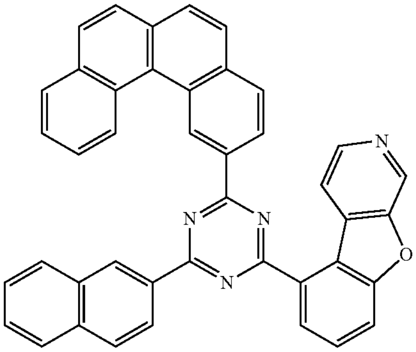
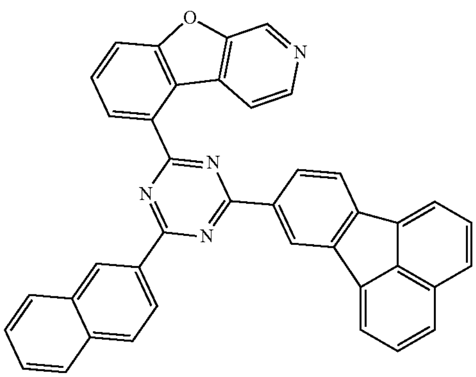
-continued
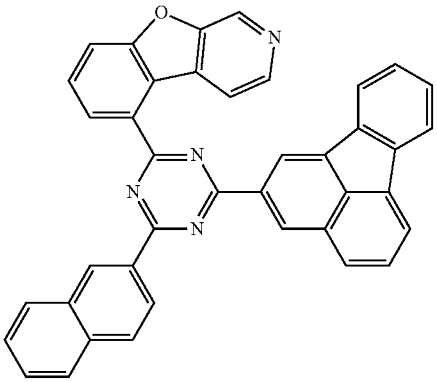
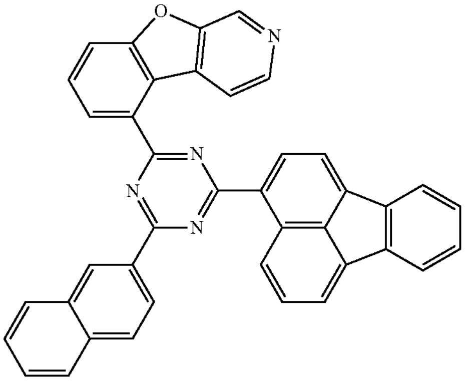
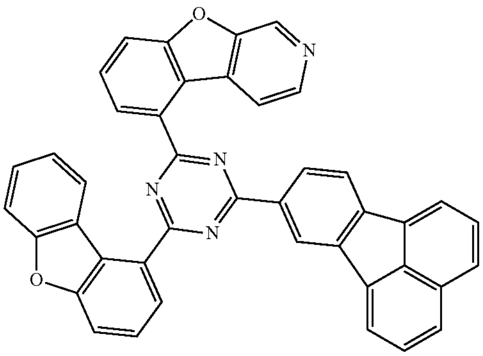
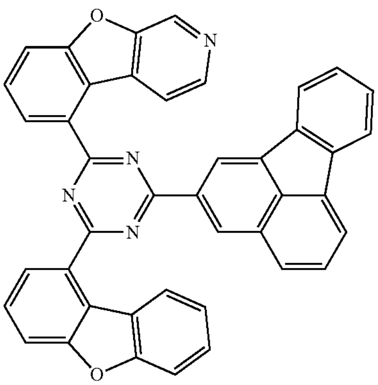

-continued
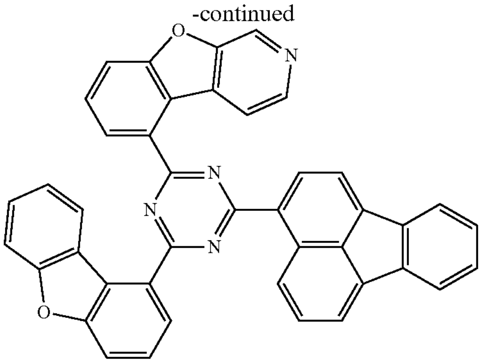
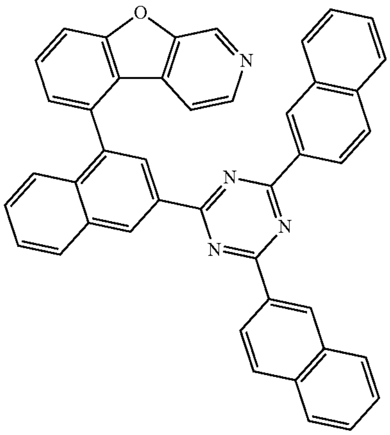
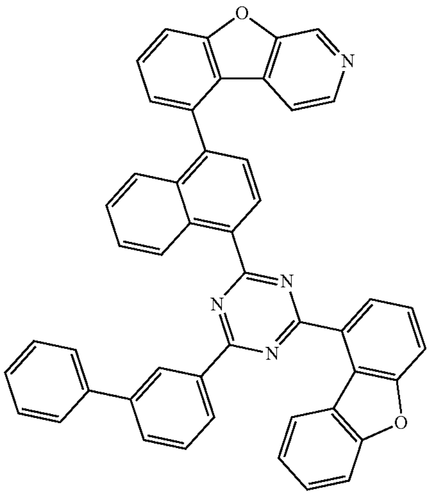
-continued
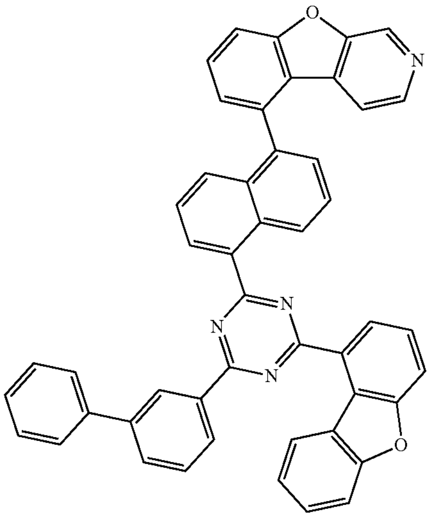
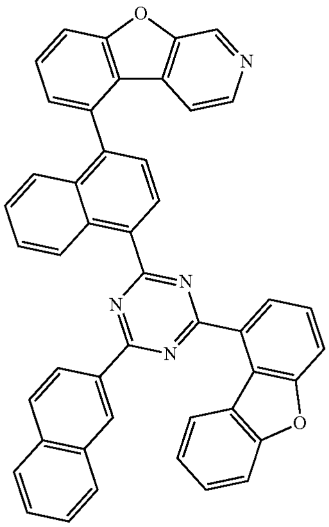
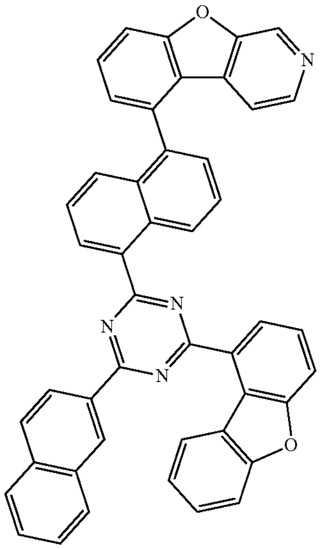

-continued
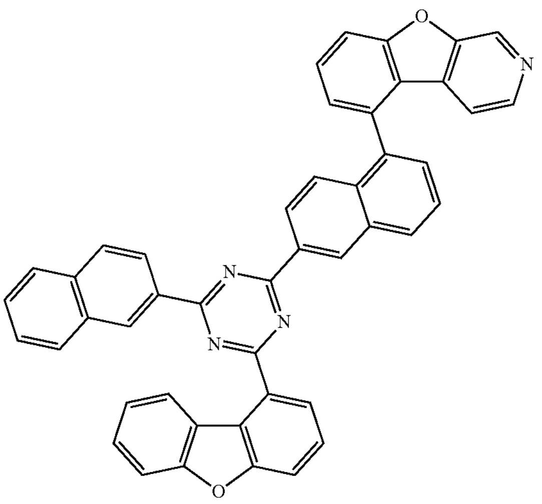
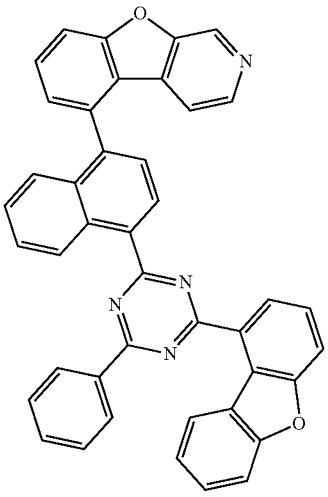
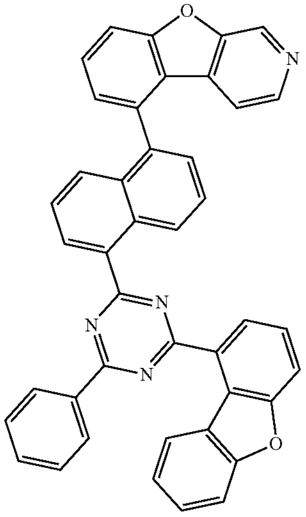
-continued
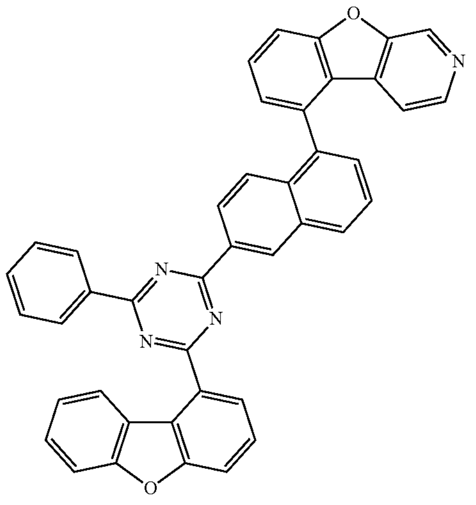
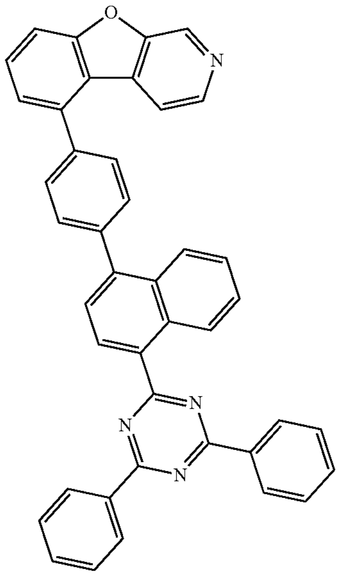
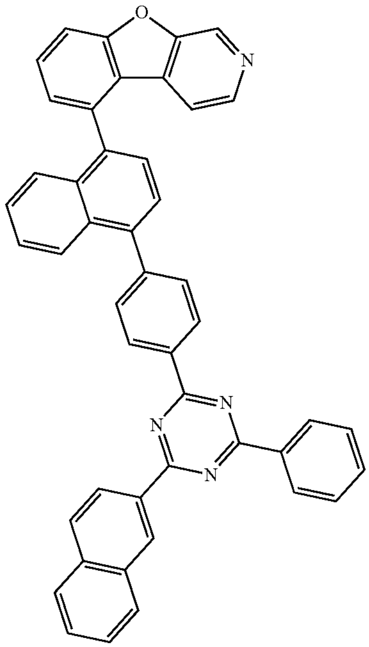

-continued
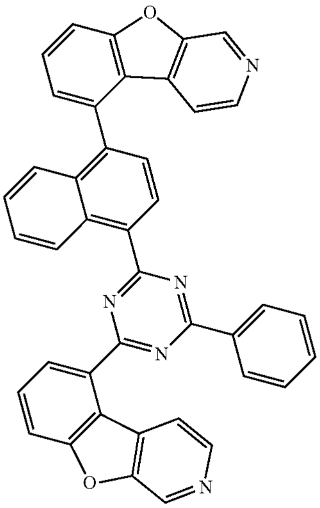
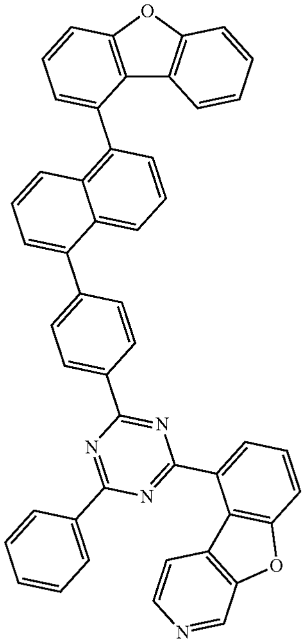
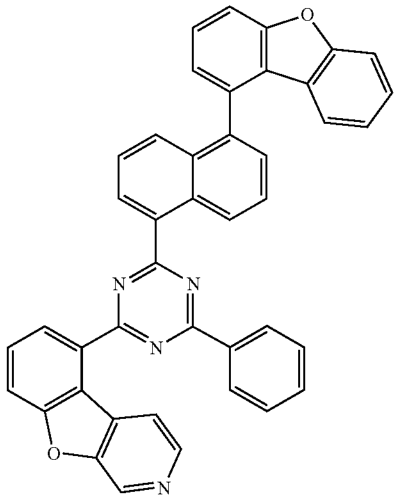
-continued
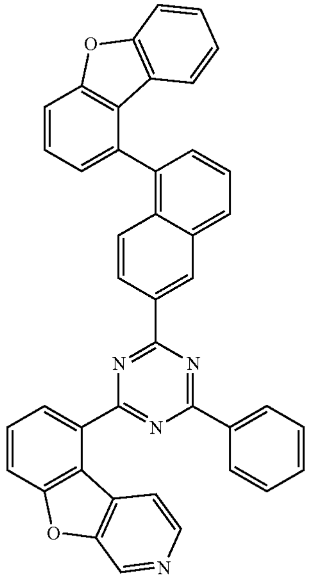
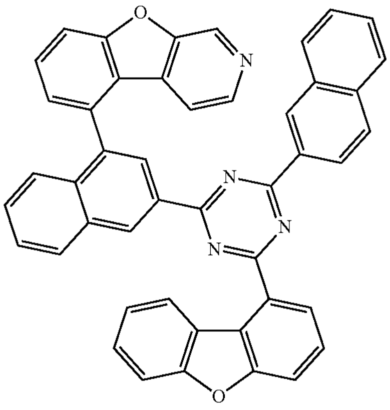
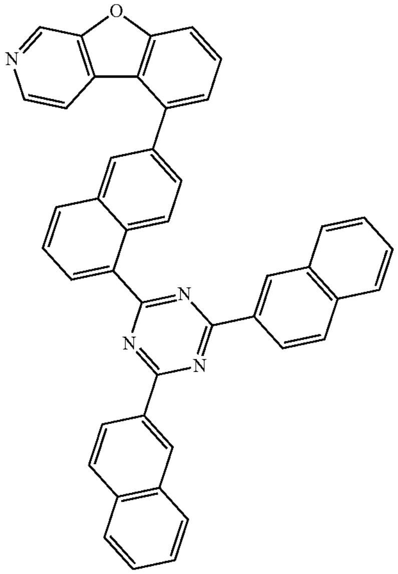

-continued
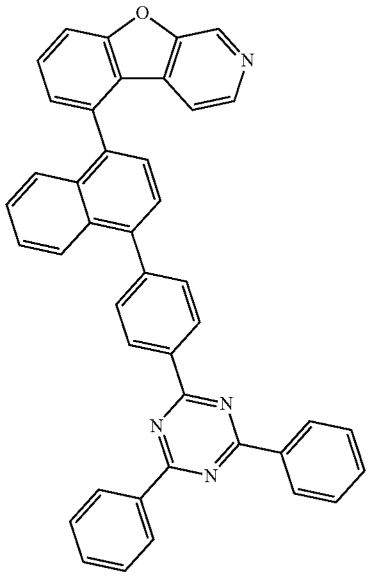
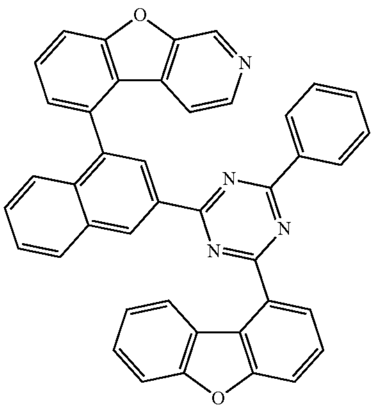
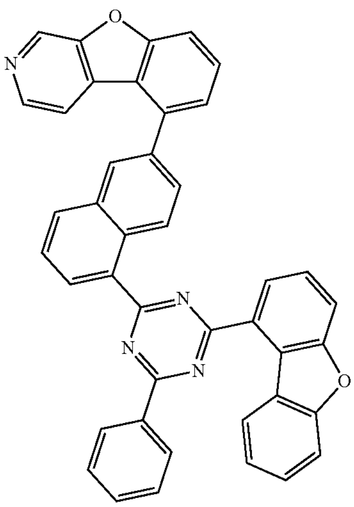
-continued
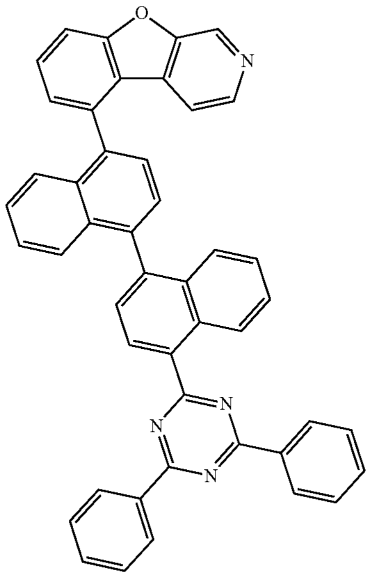
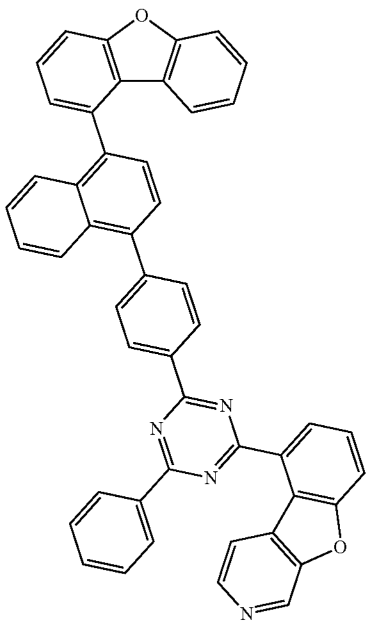

-continued
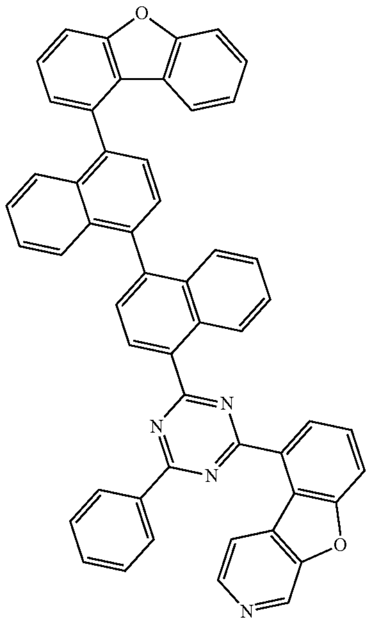
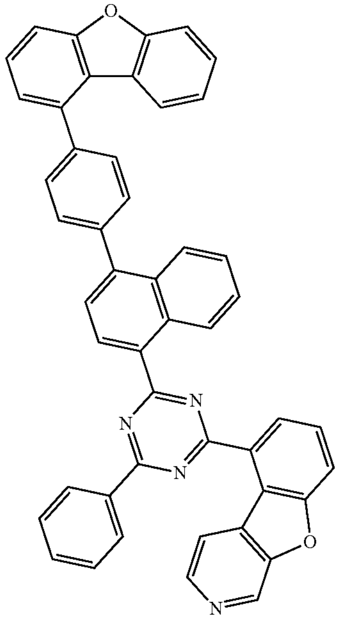
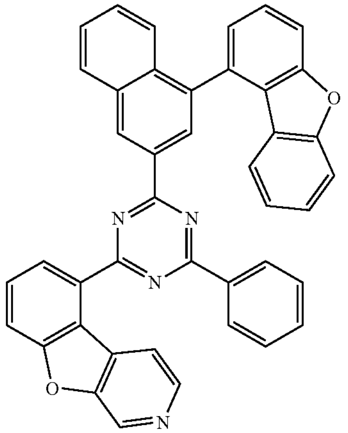
-continued
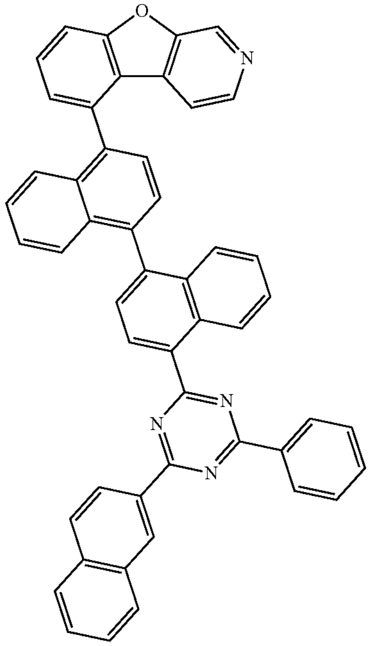
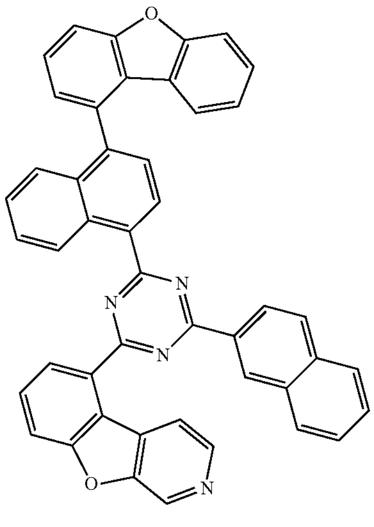
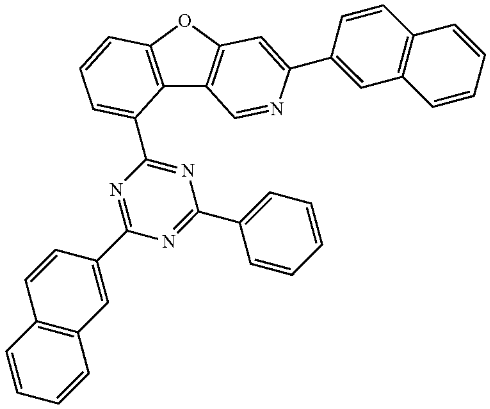

-continued
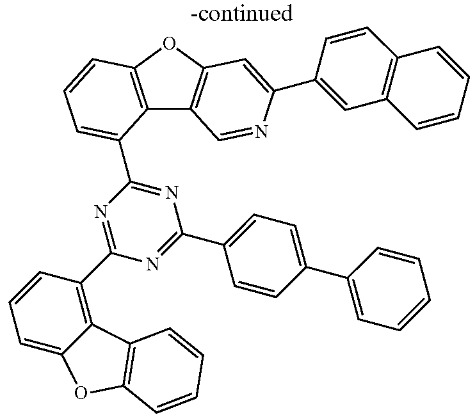
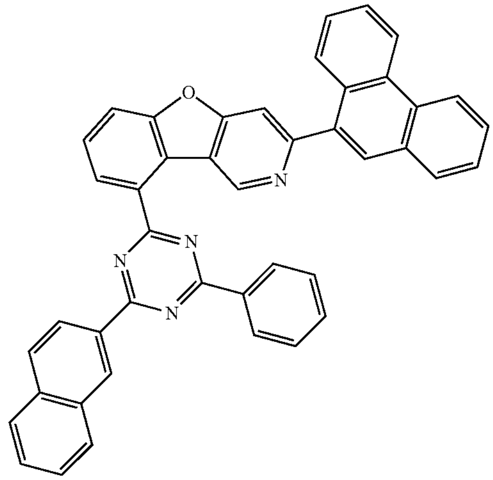
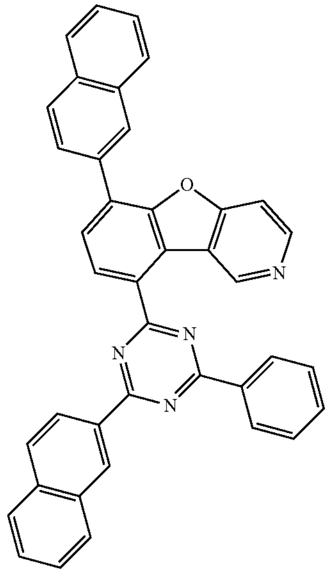
-continued
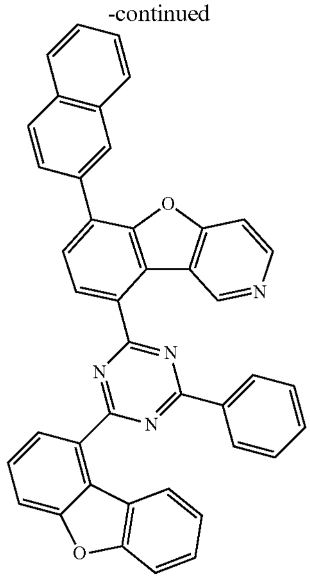
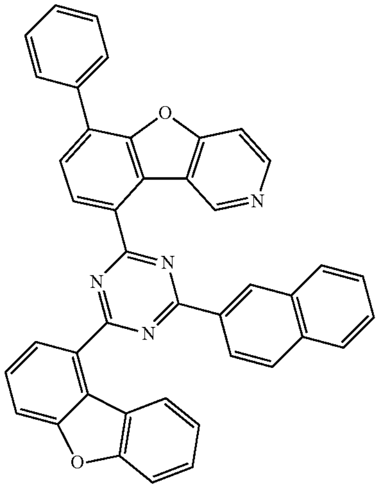
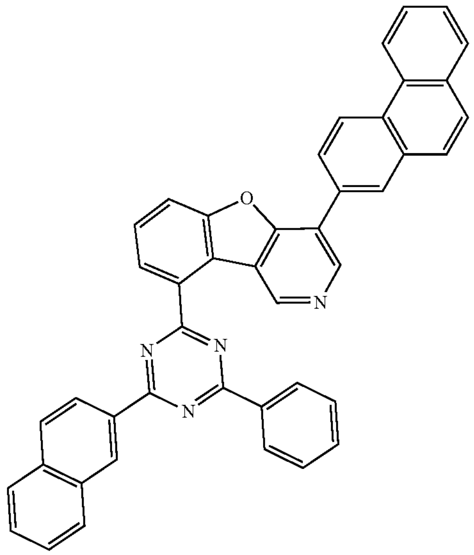

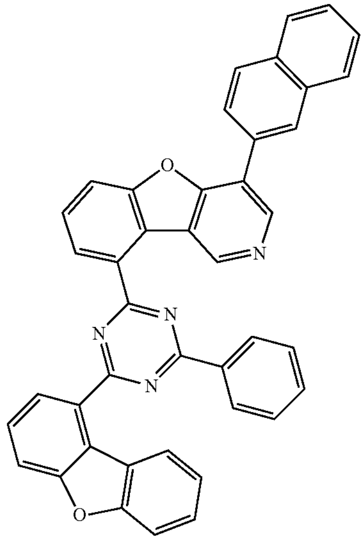
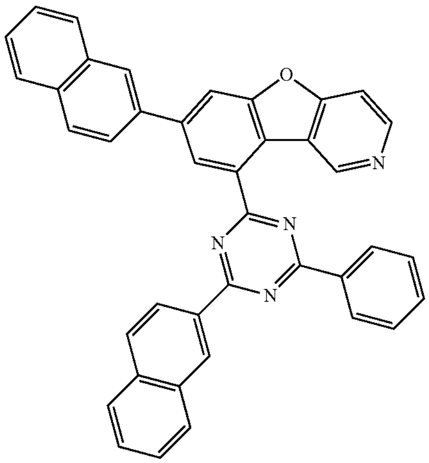
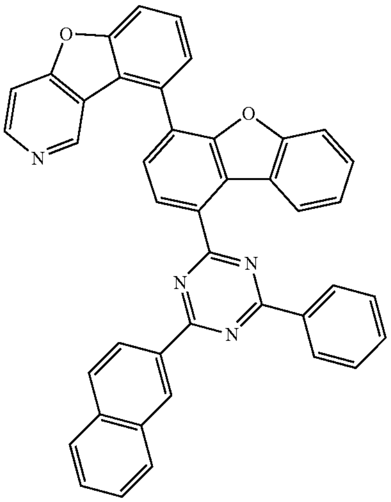
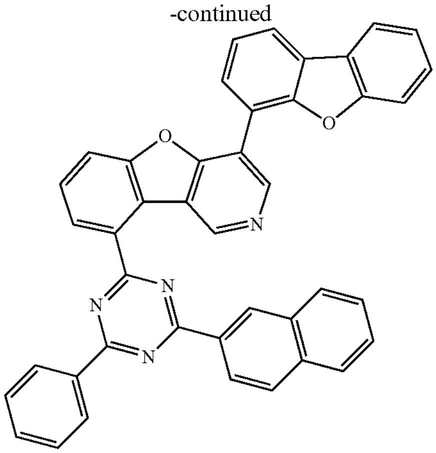
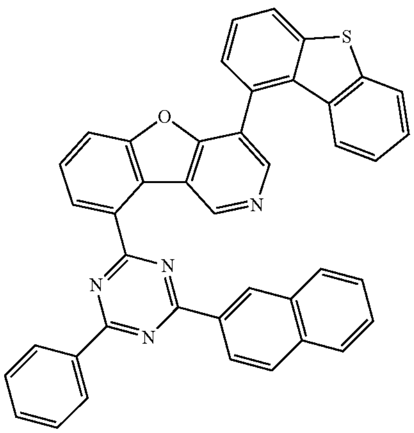
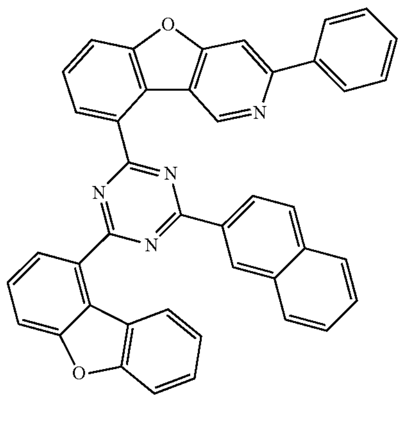

-continued
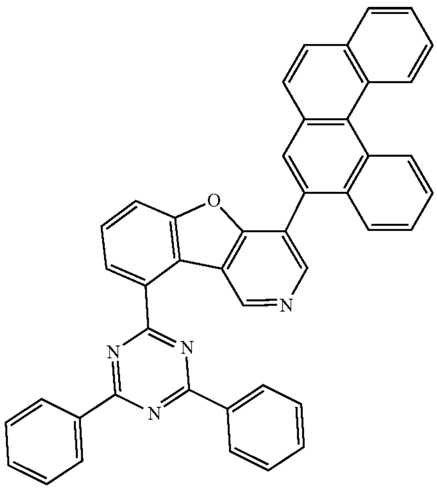
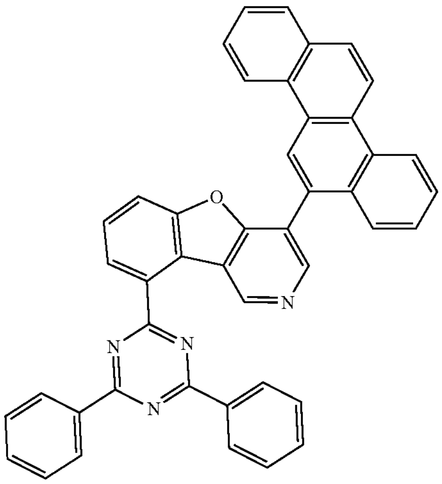
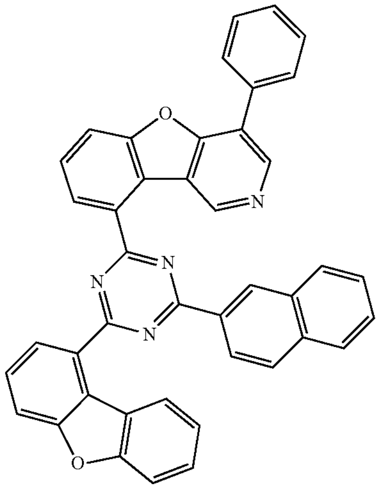
-continued
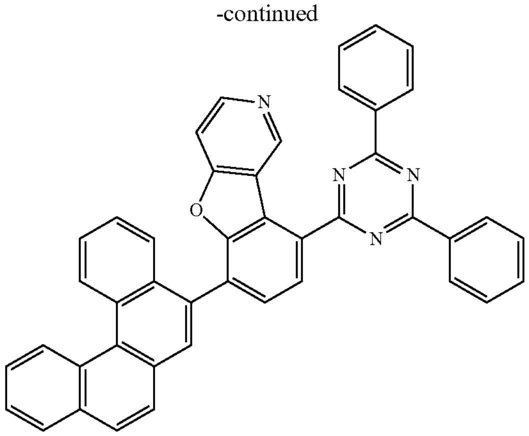
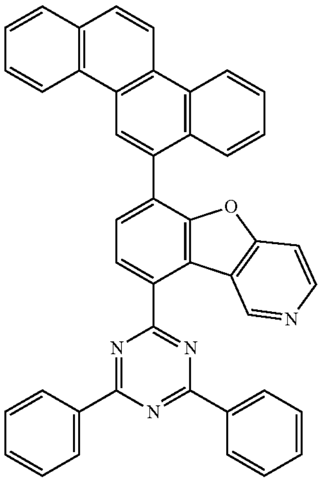
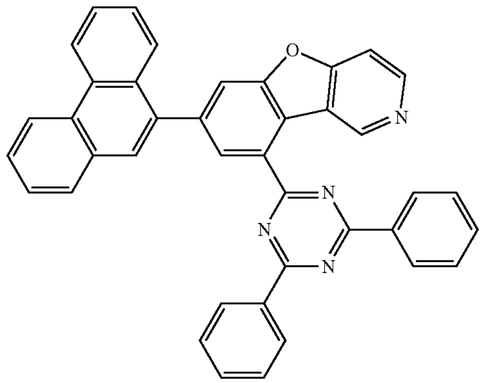

-continued
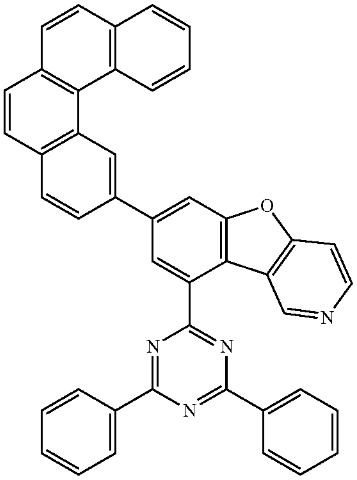
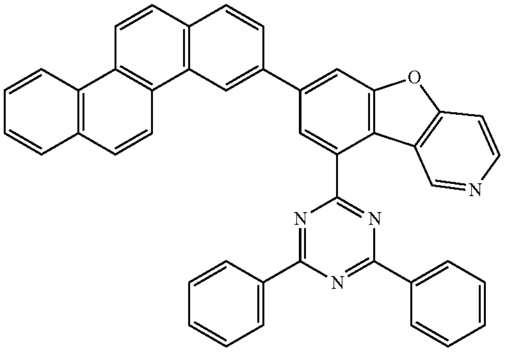
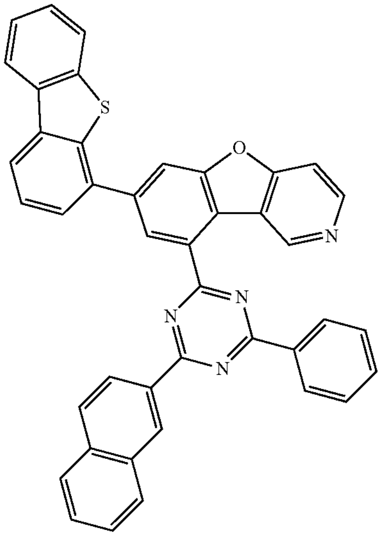
-continued
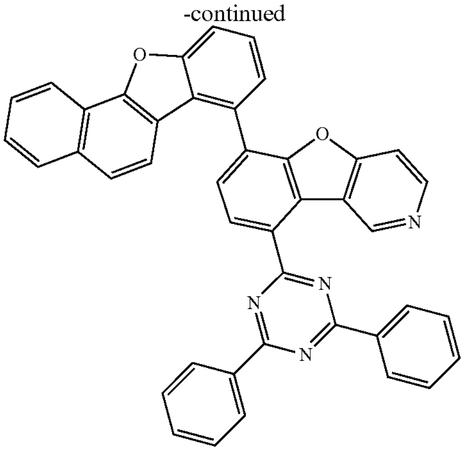
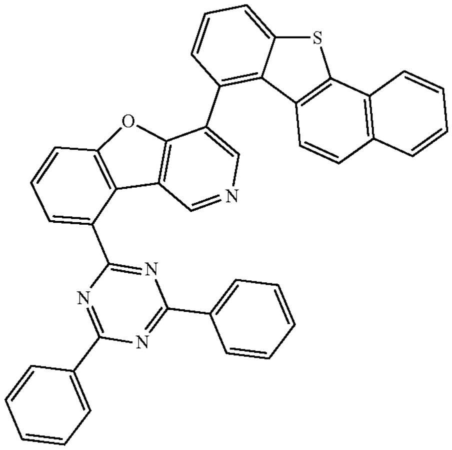
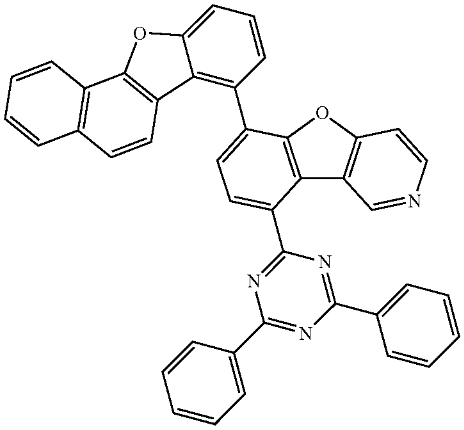

-continued
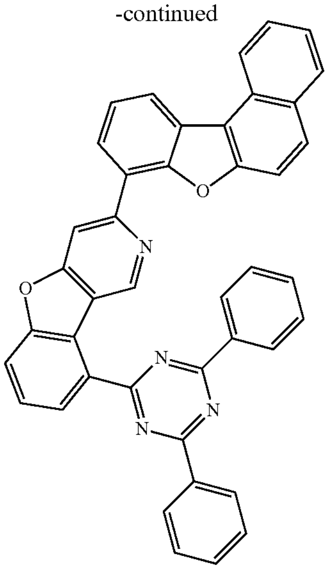
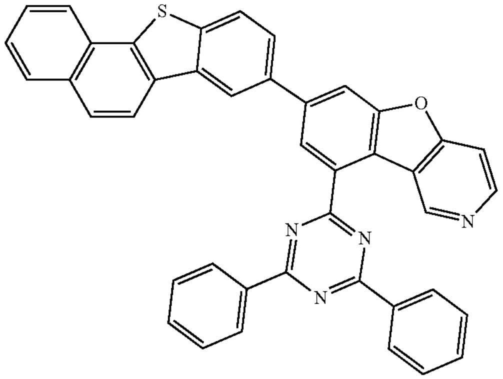
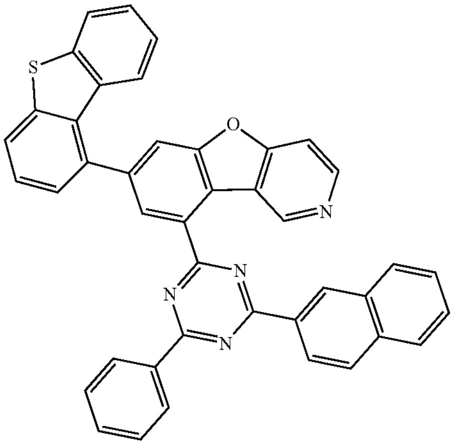
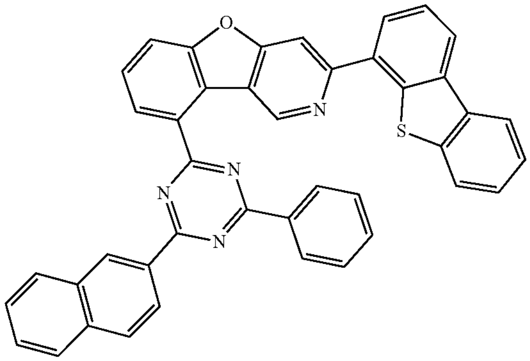
-continued
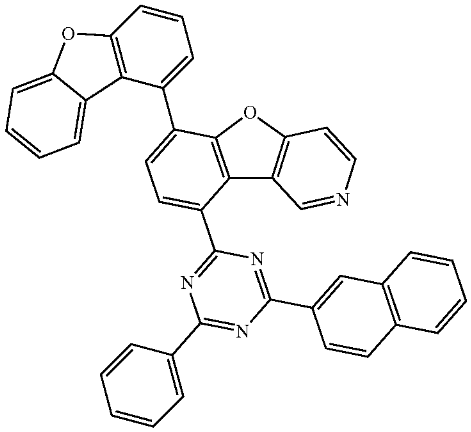
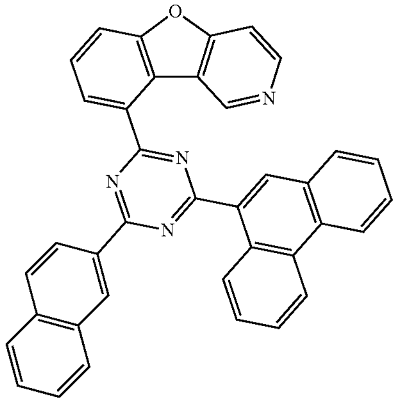
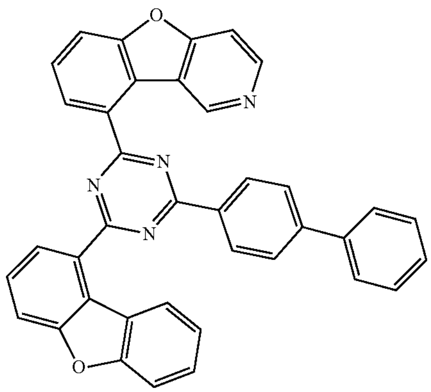
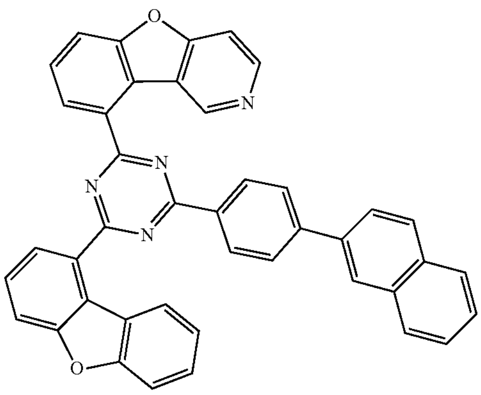

-continued
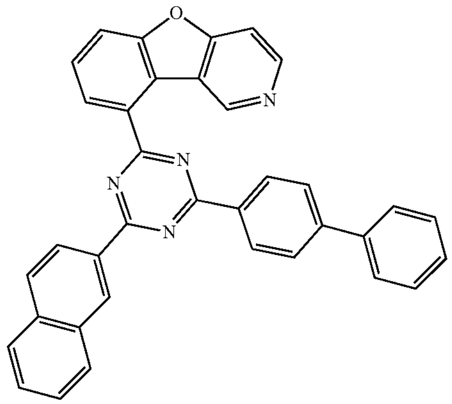
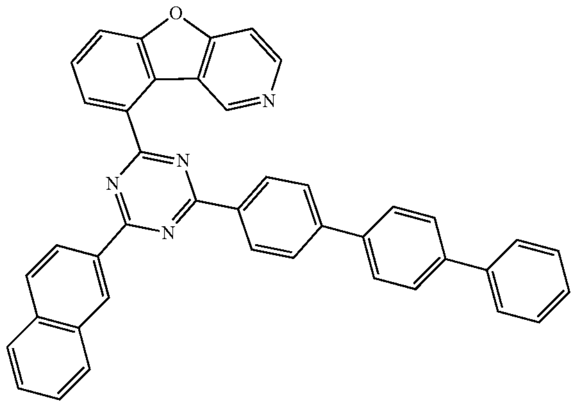
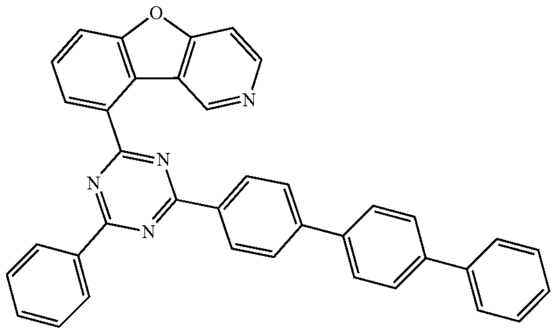
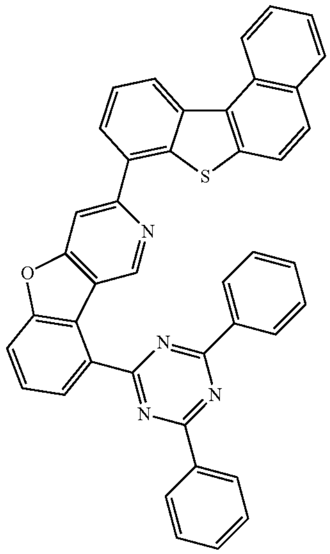
-continued
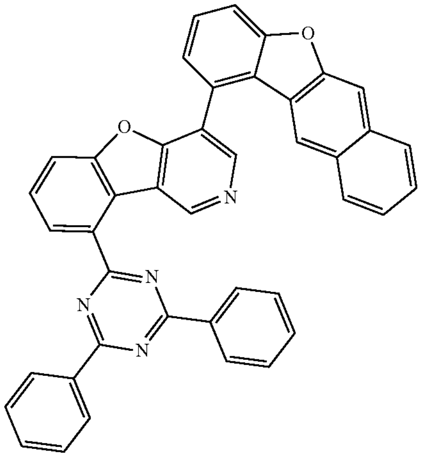
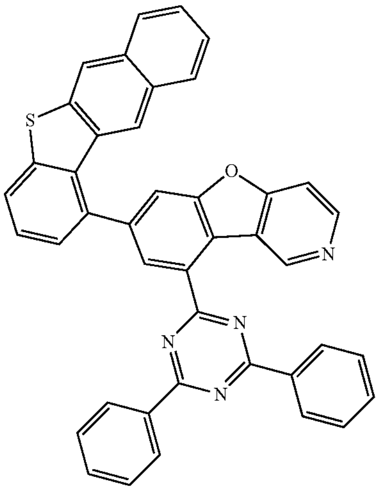
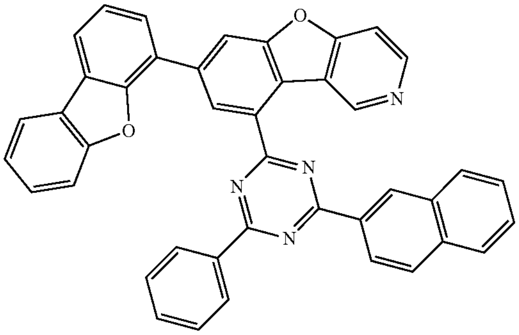

-continued
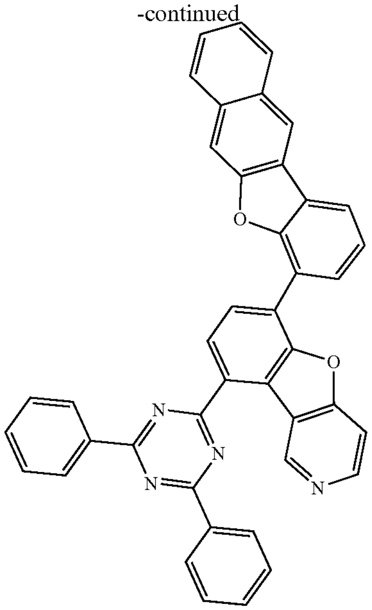
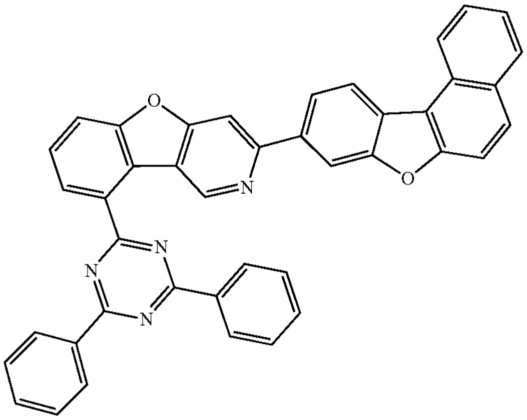
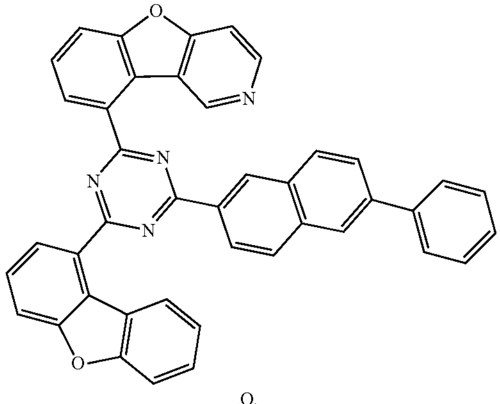
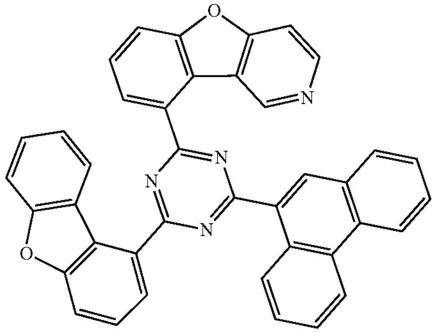
-continued
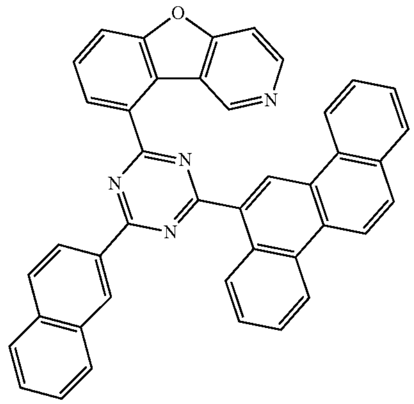
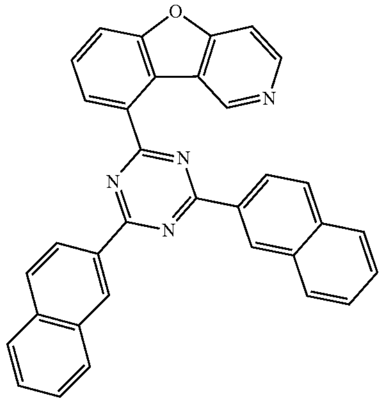
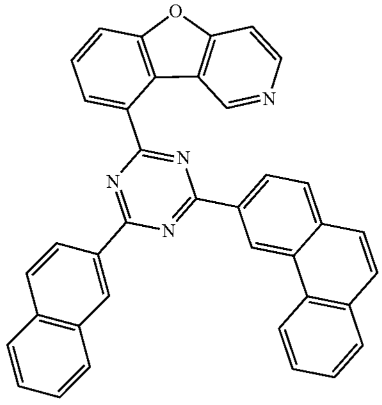
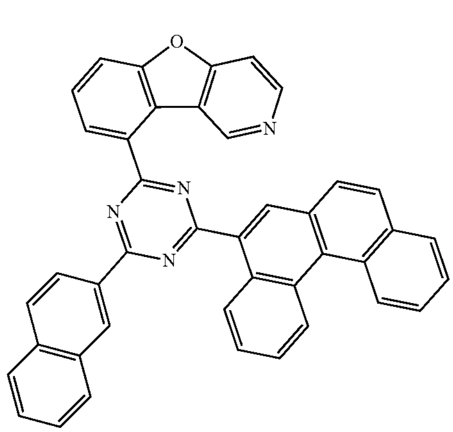

-continued
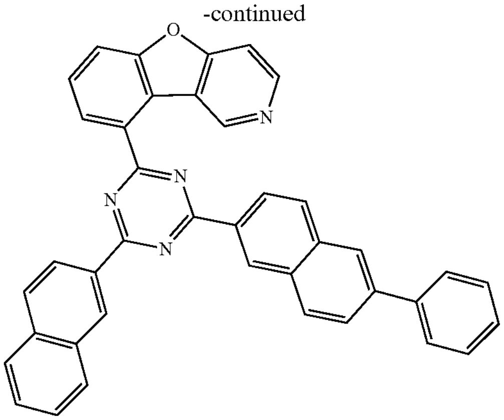
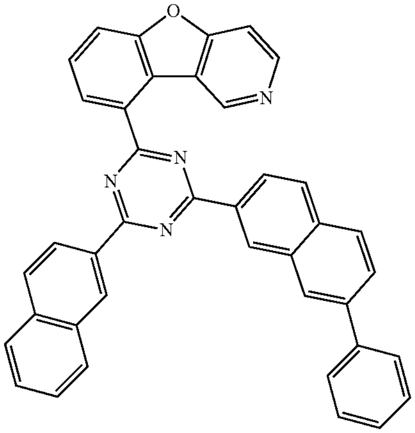
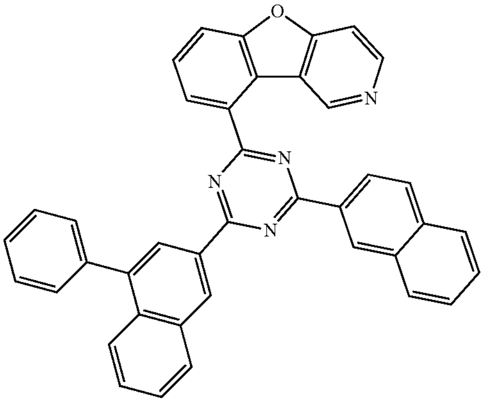
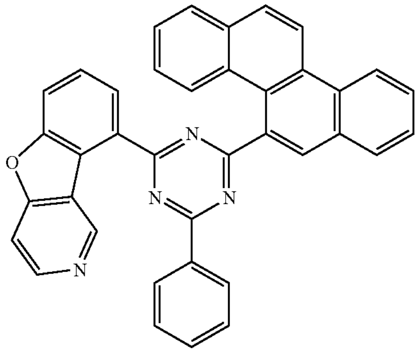
-continued
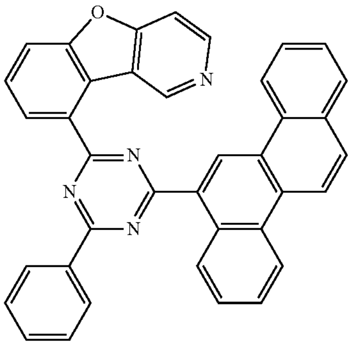
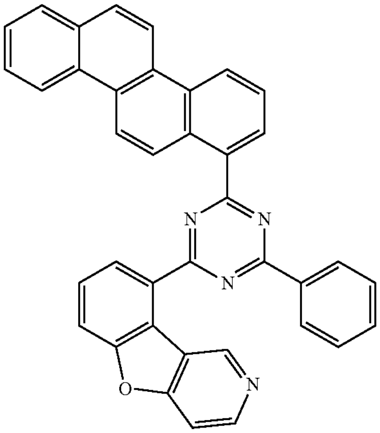
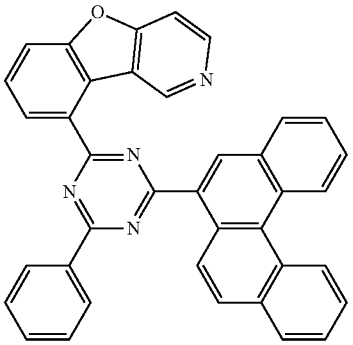
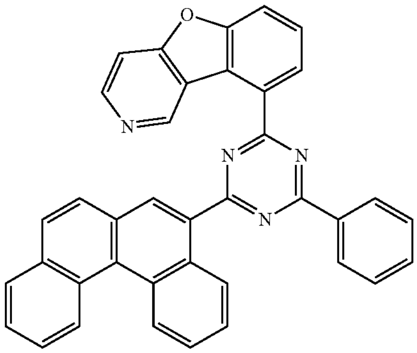

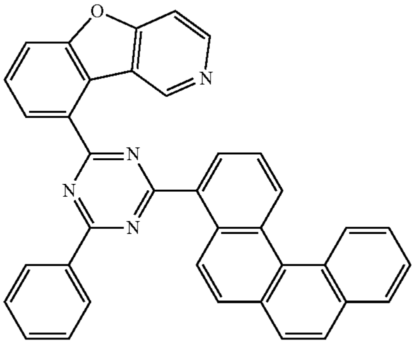
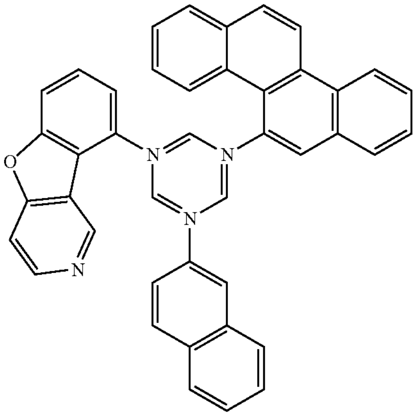
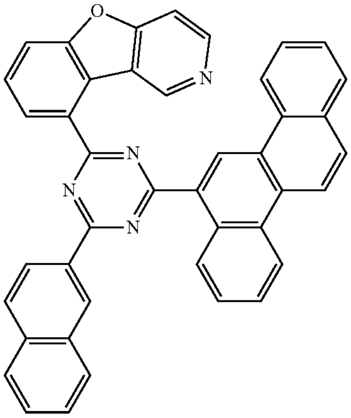
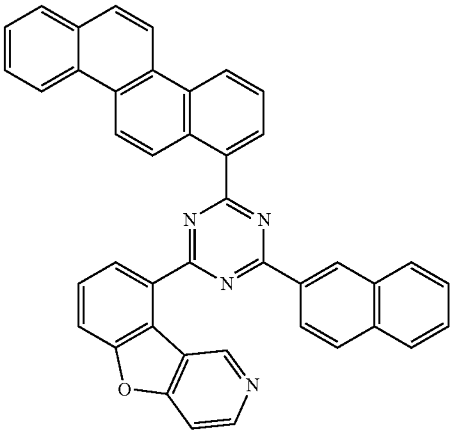
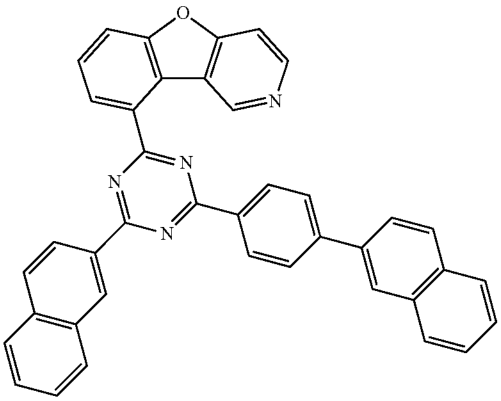
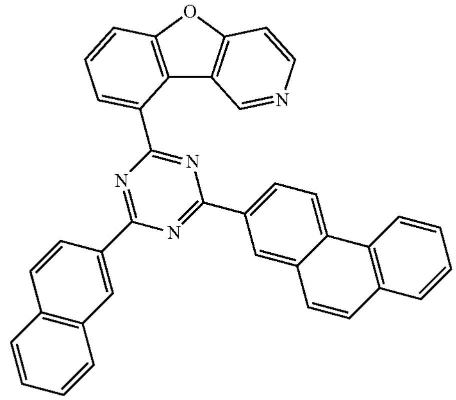
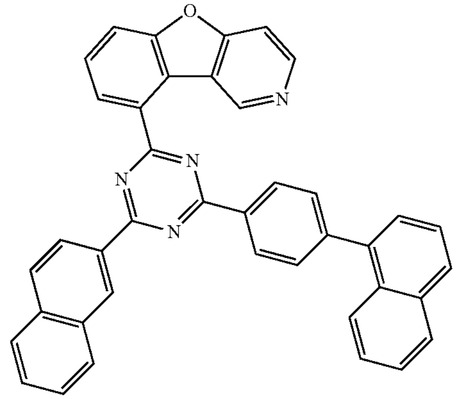
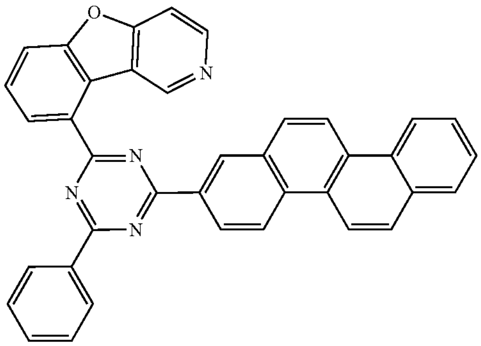

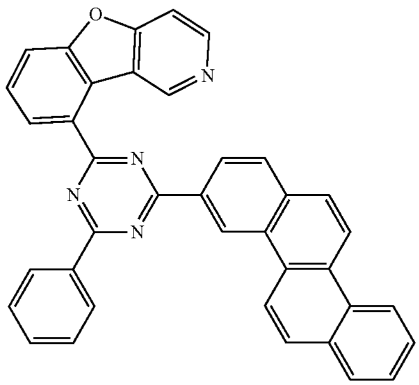
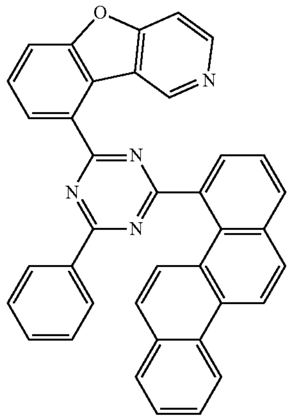
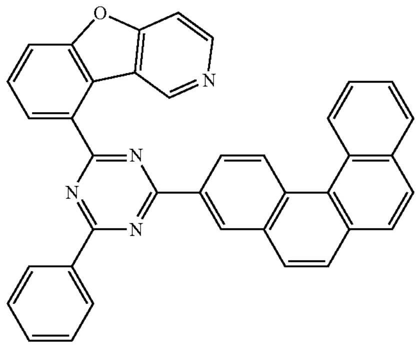
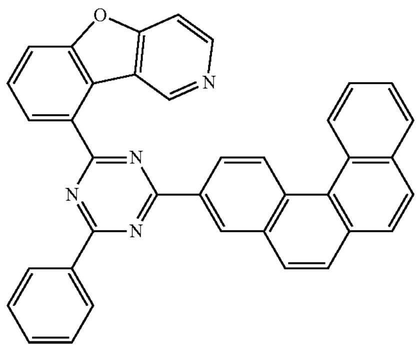
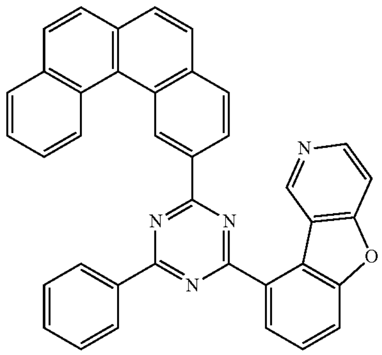
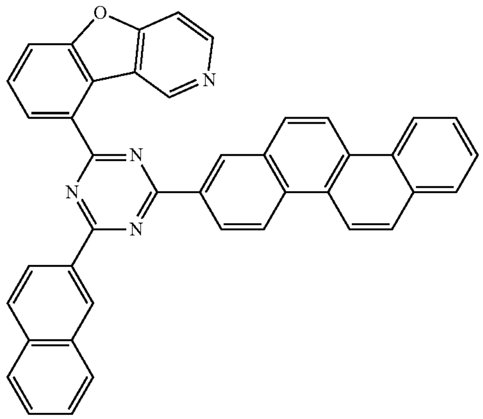
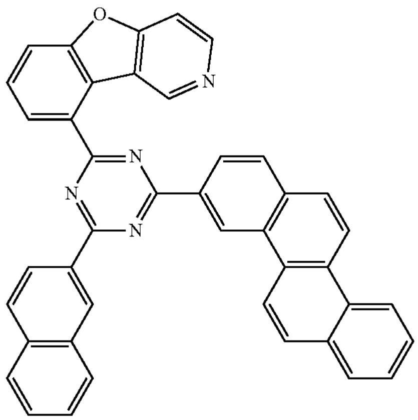
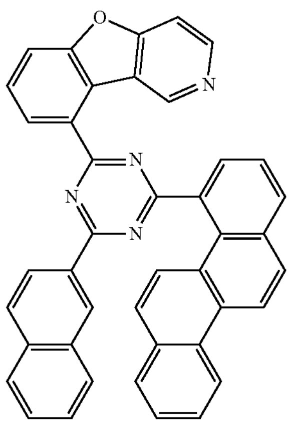

-continued
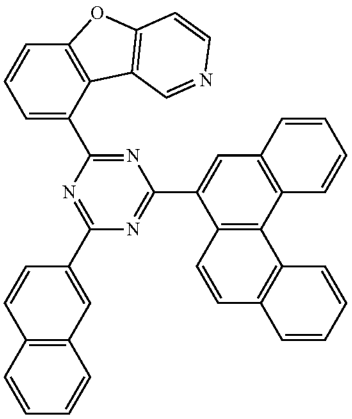
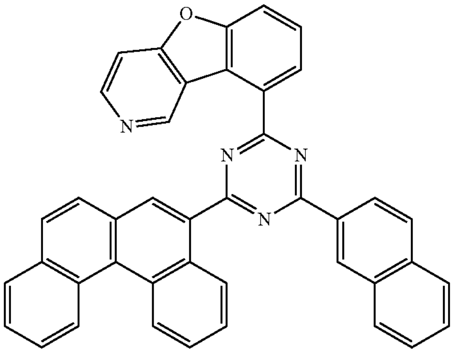
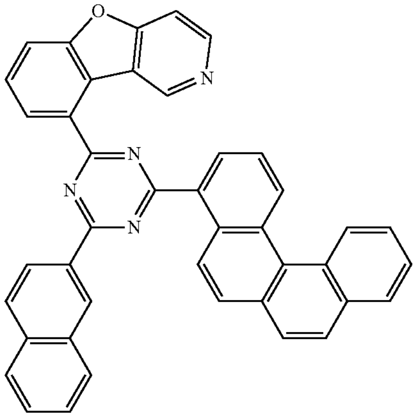
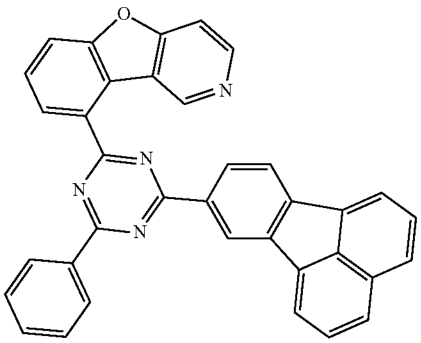
-continued
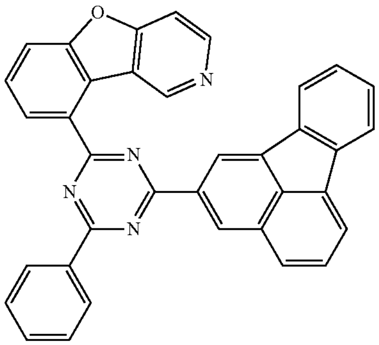
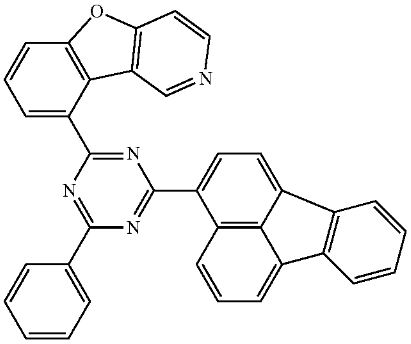
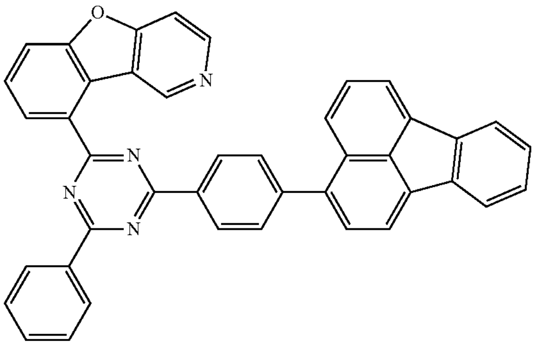
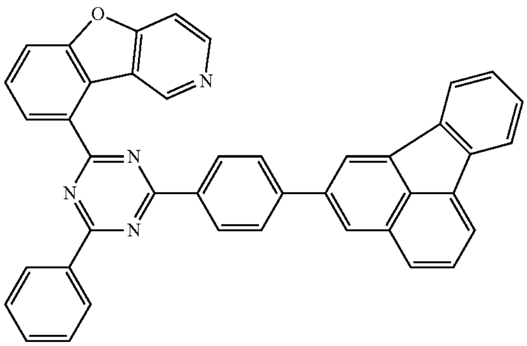

-continued
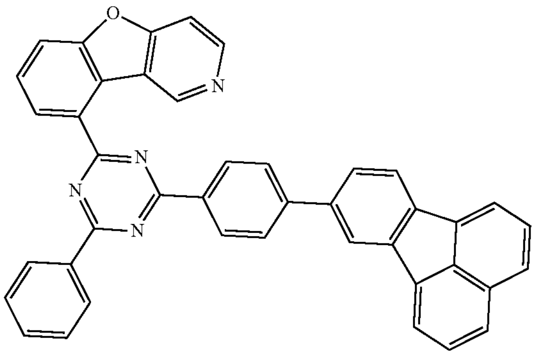
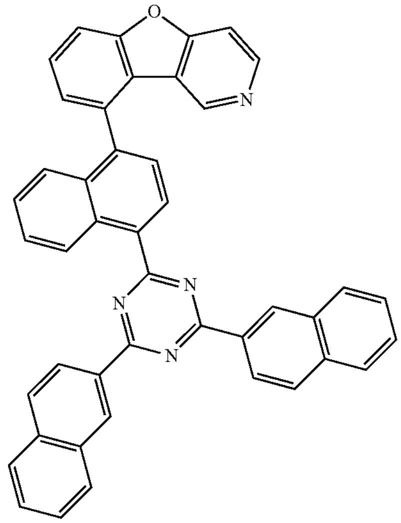
-continued
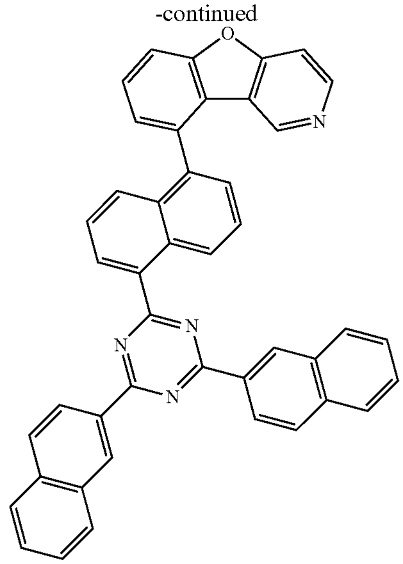
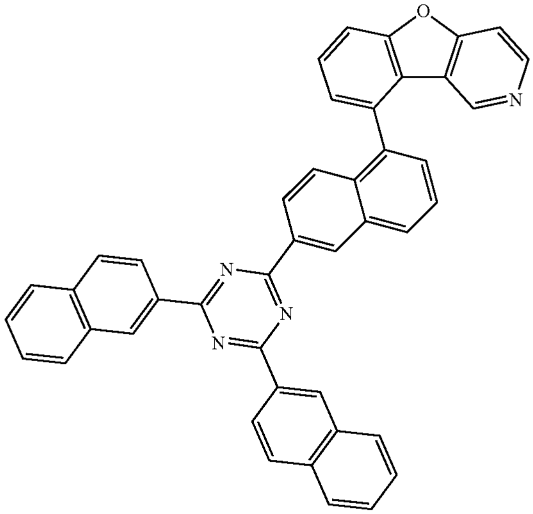
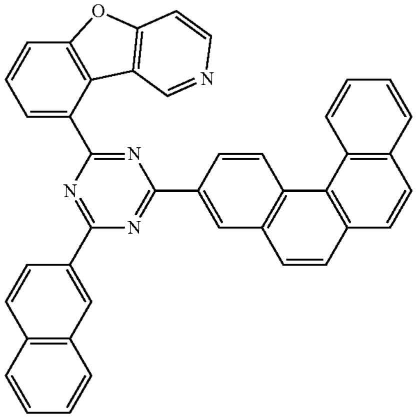
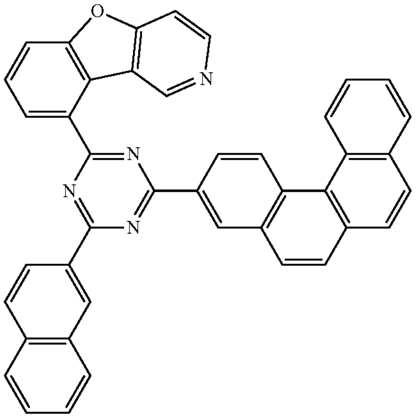

-continued
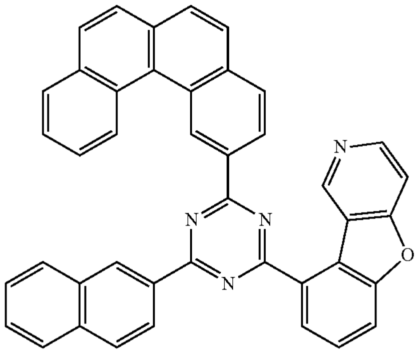
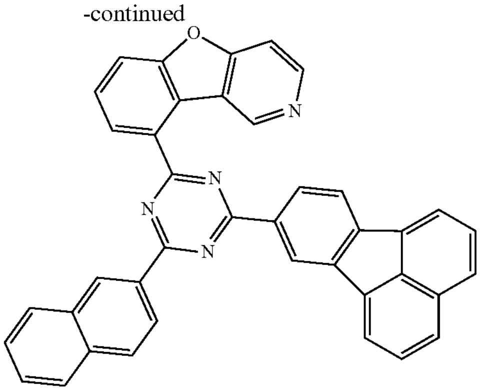
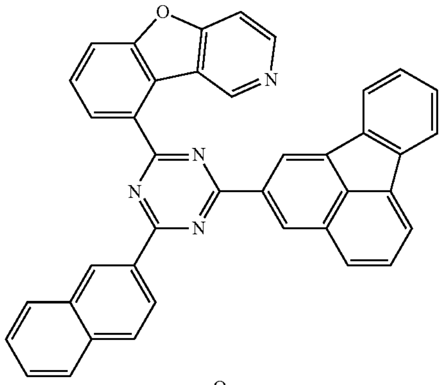
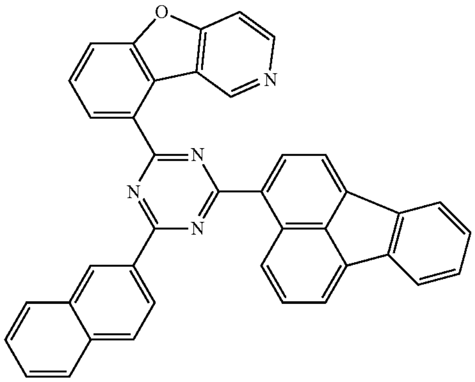
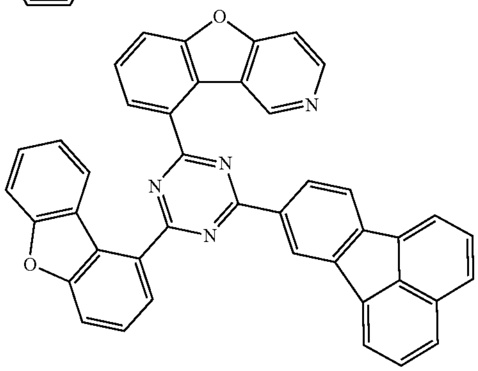
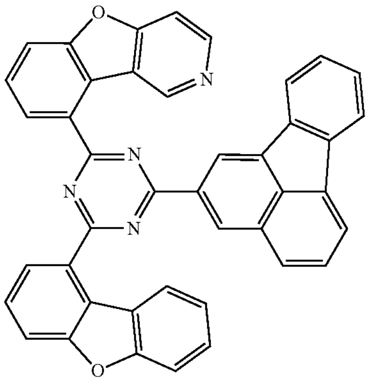
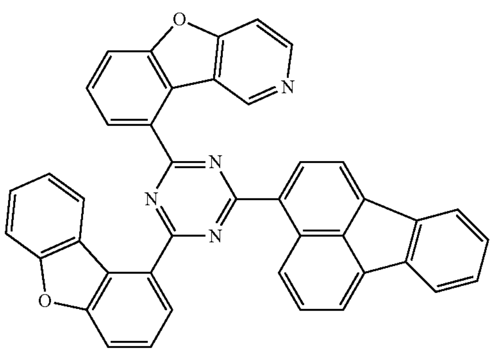
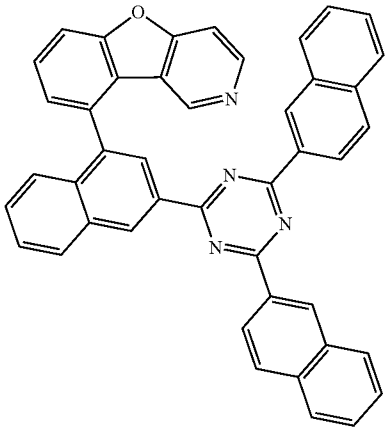

-continued
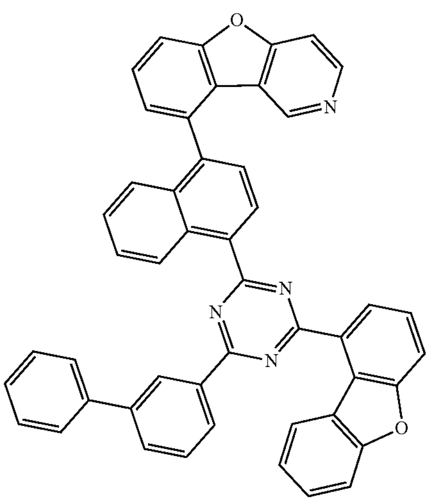
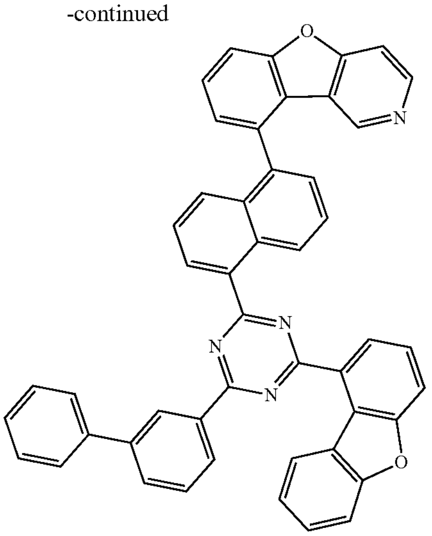
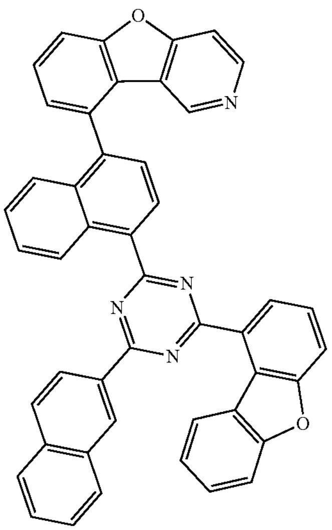
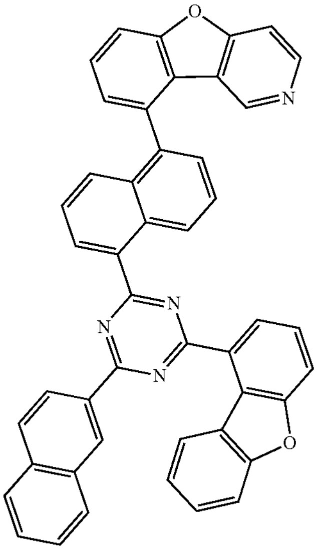
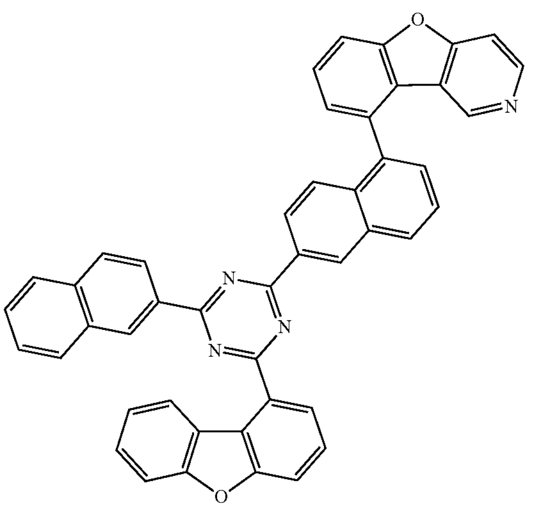
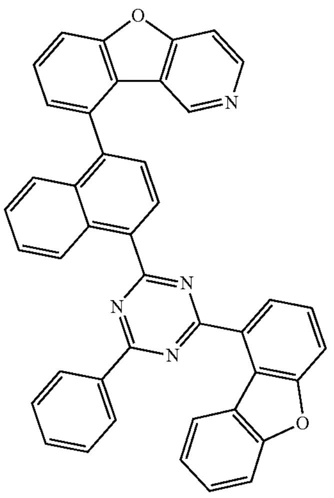

-continued
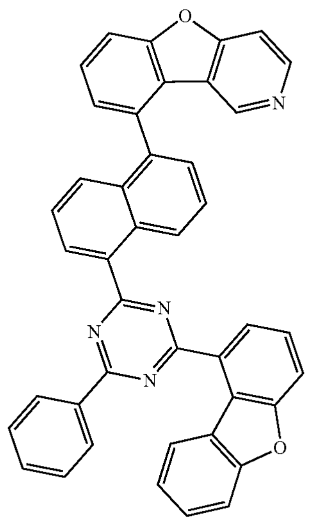
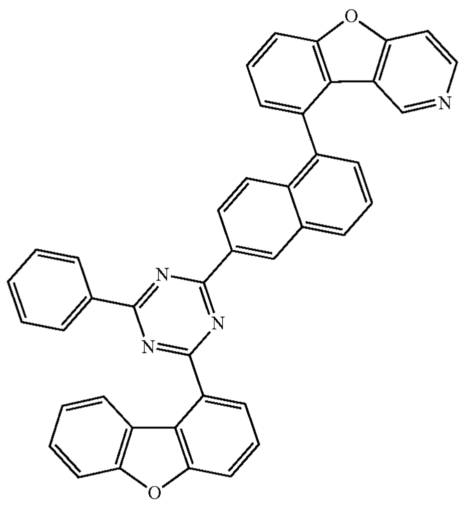
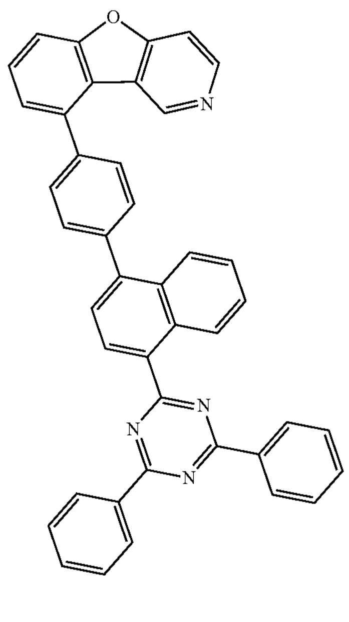
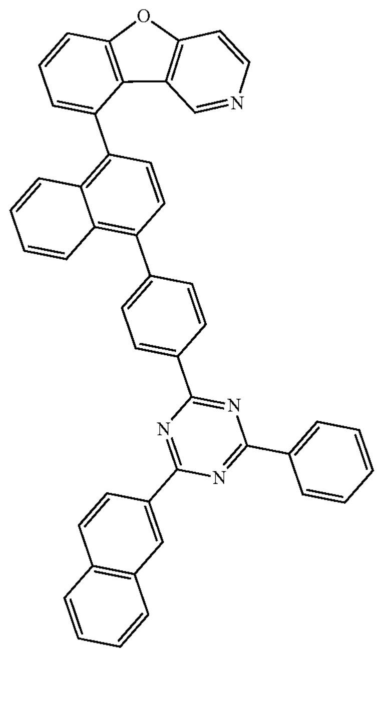

-continued
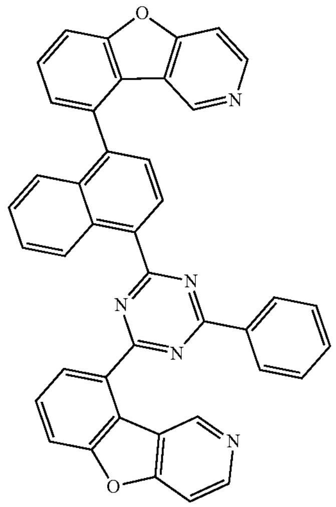
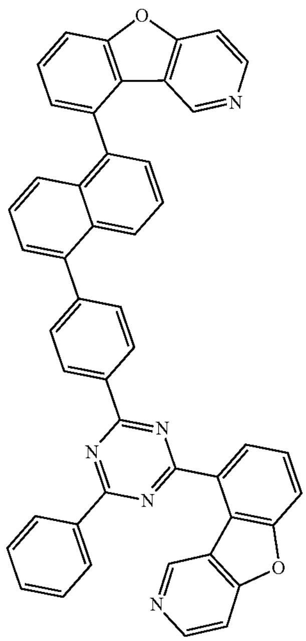
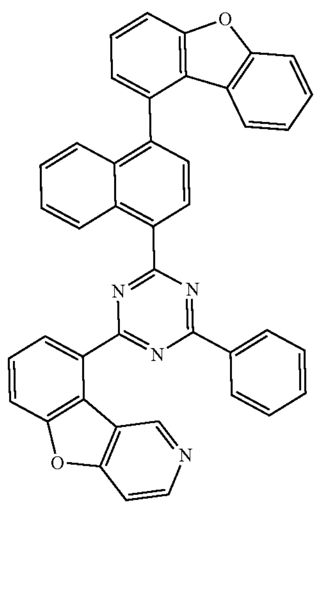
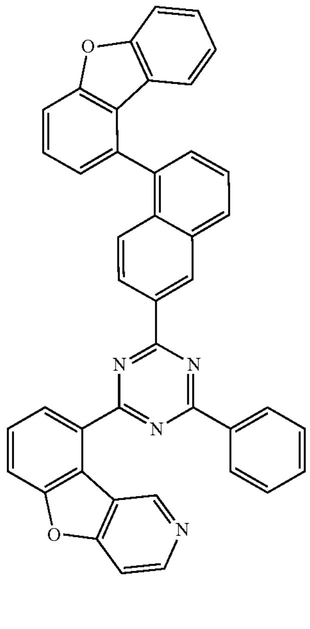

-continued
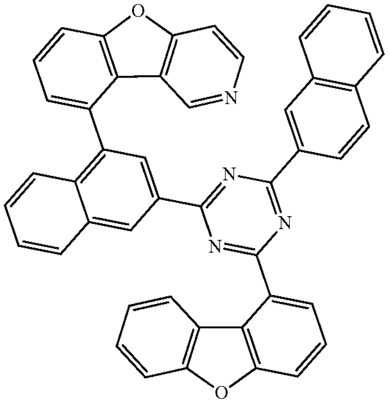
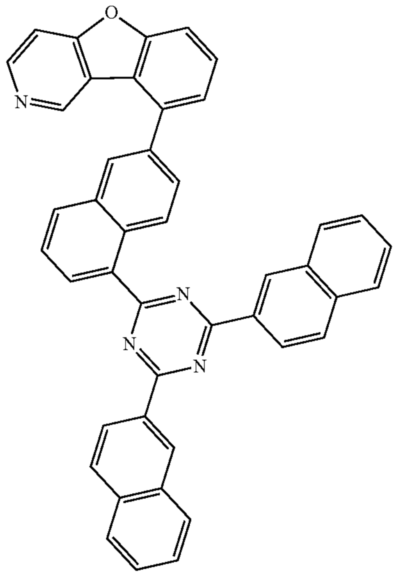
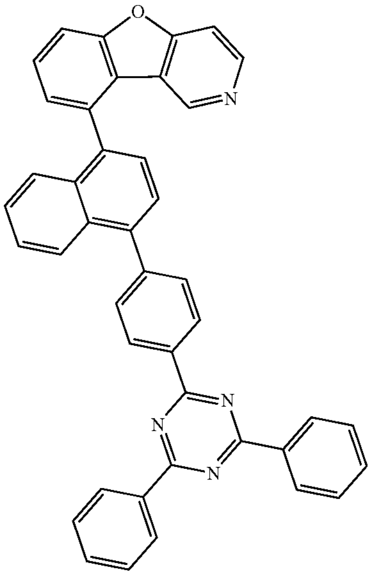
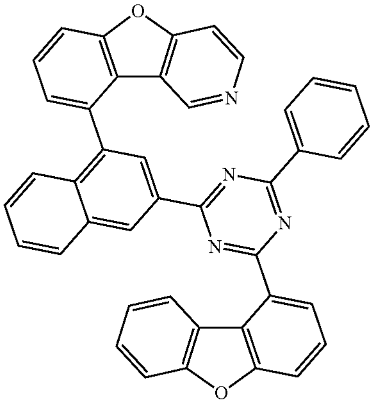
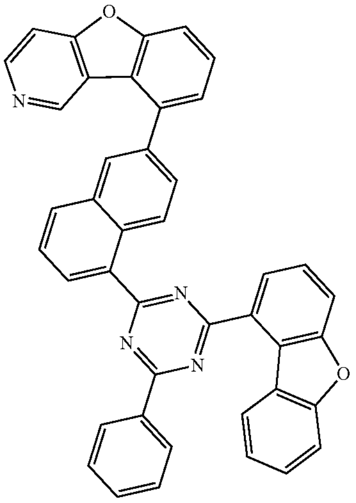
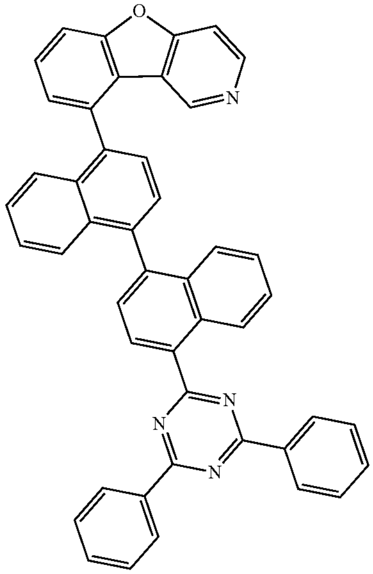

-continued
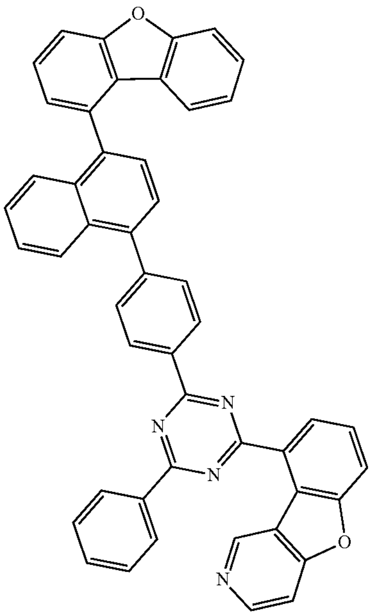
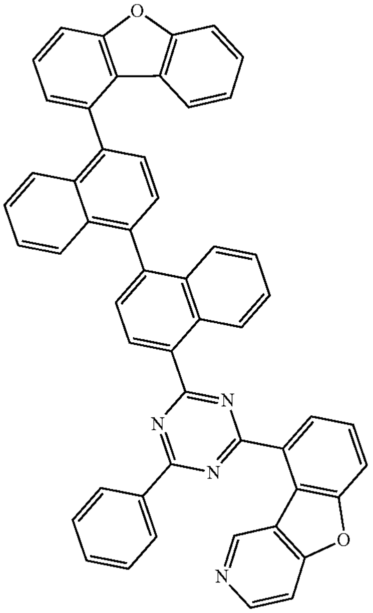
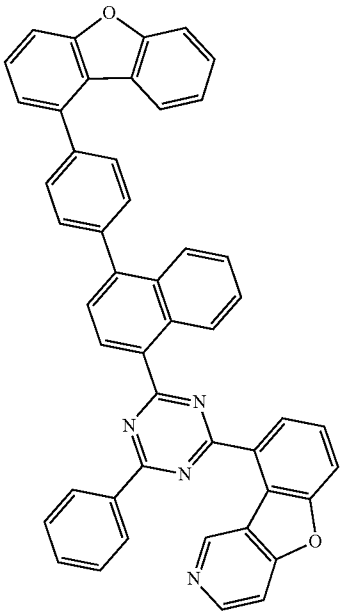
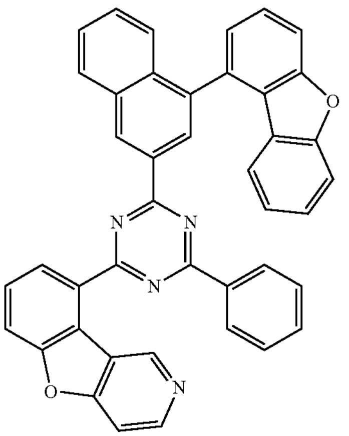
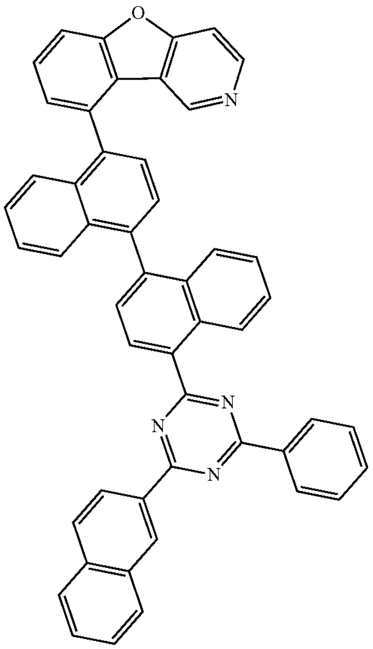

-continued
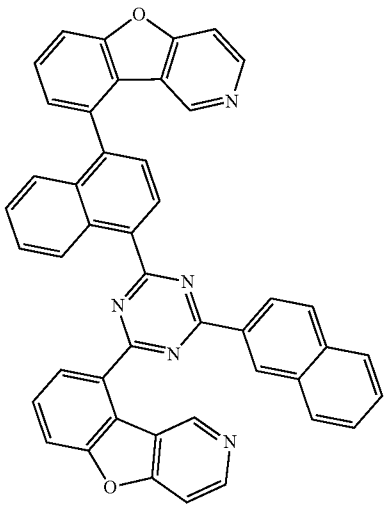
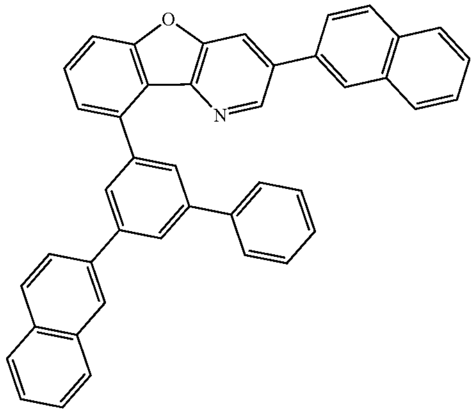
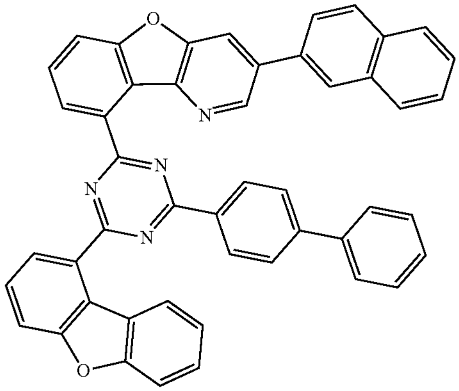
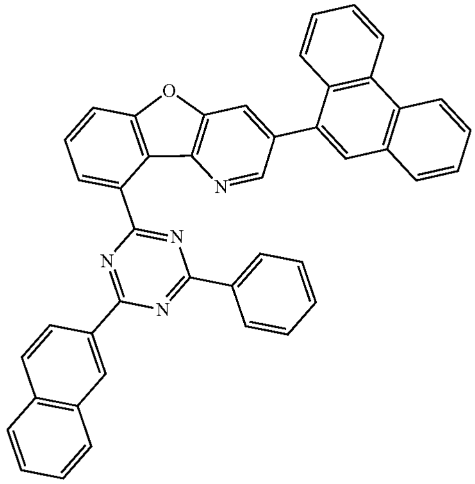
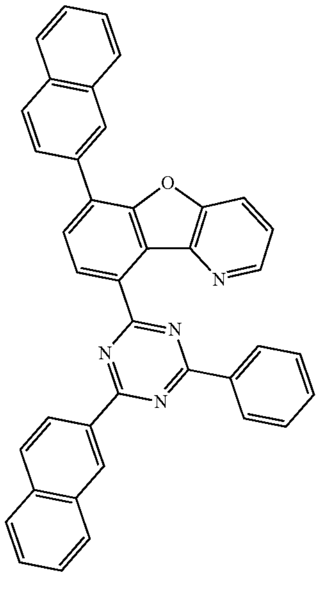
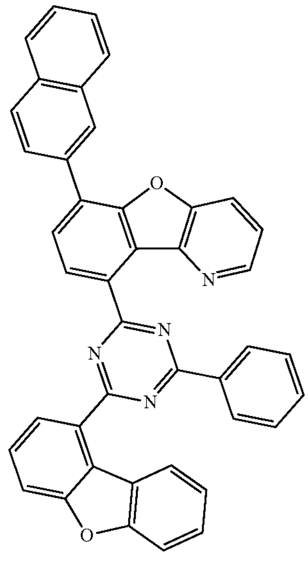
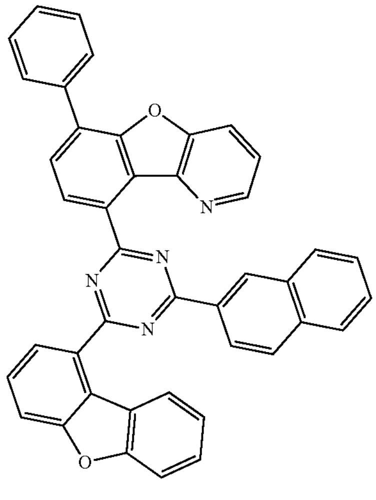

-continued
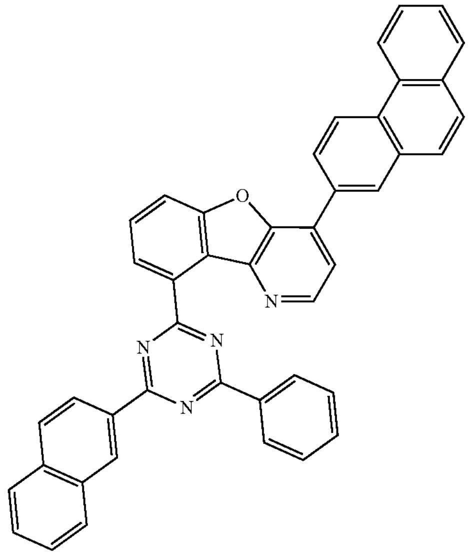
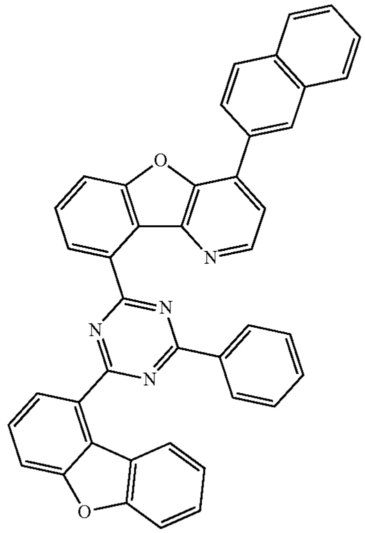
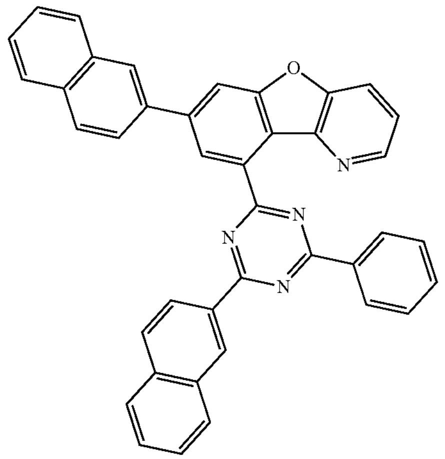
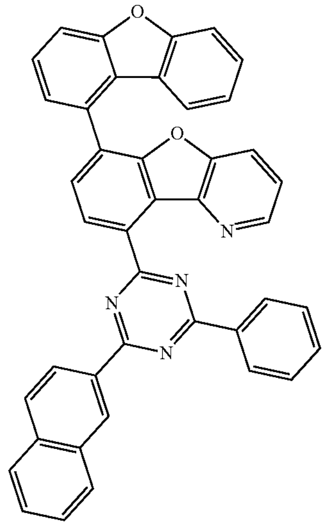
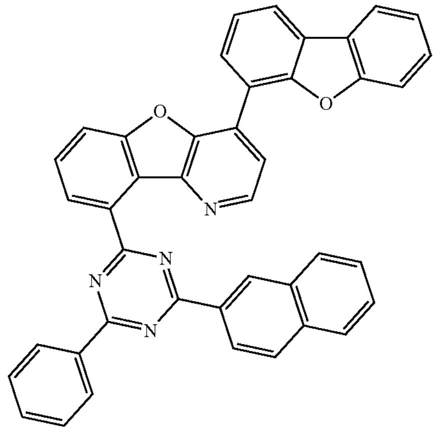
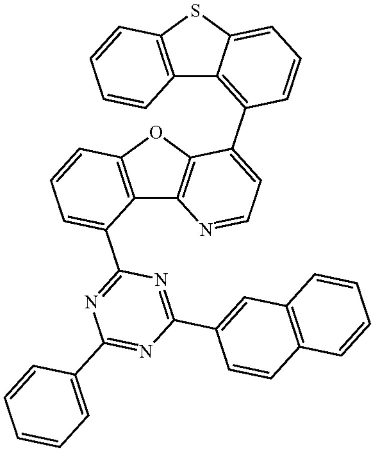

-continued
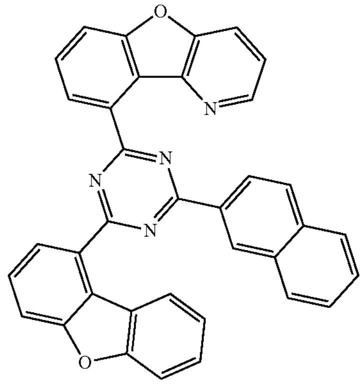
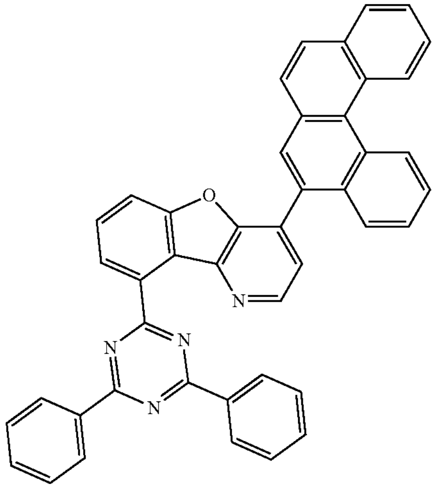
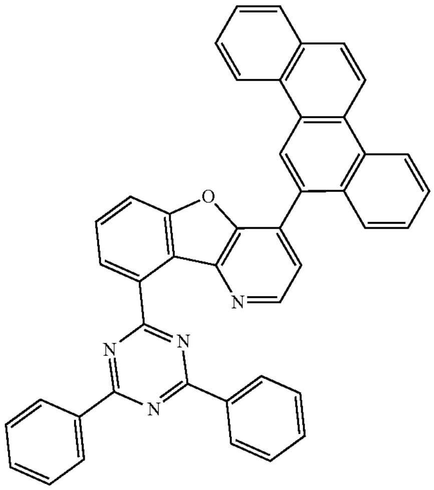
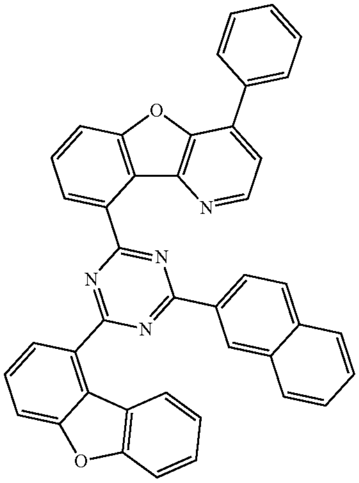
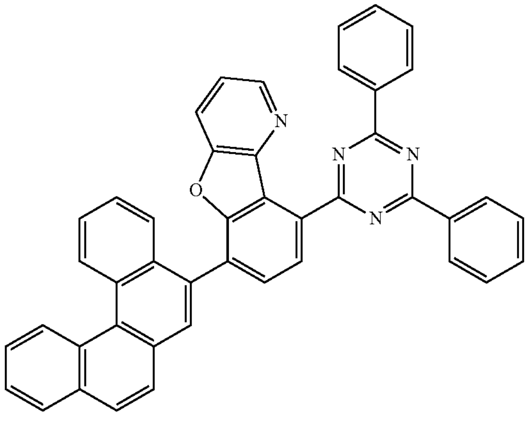
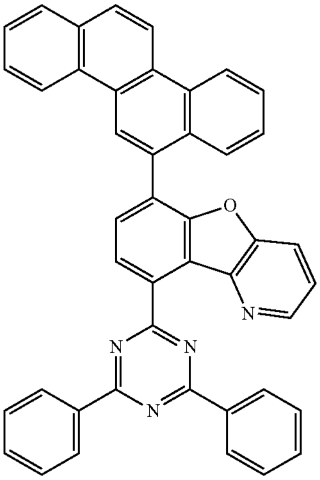

-continued
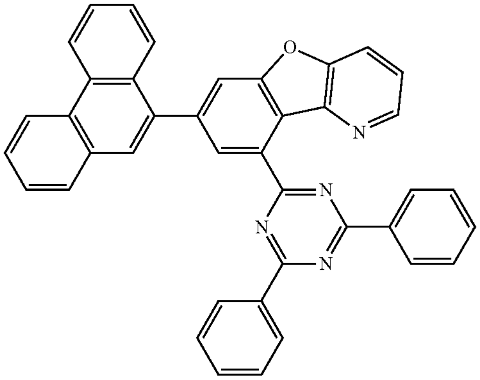
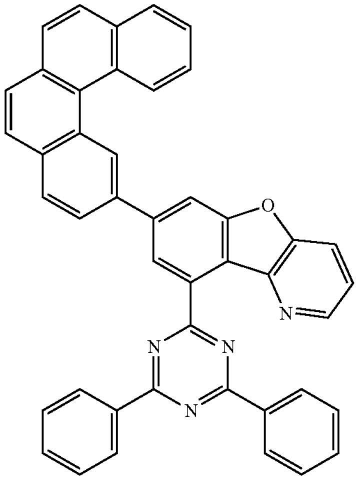
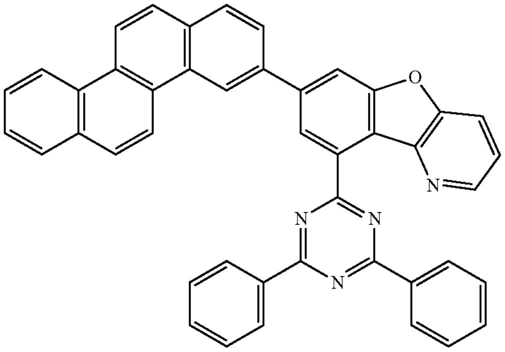
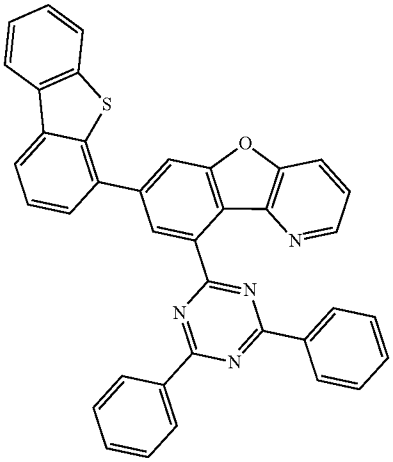
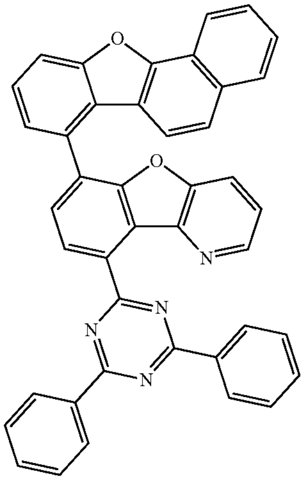
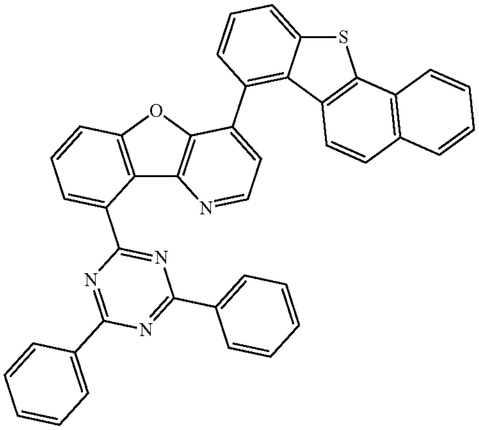

-continued
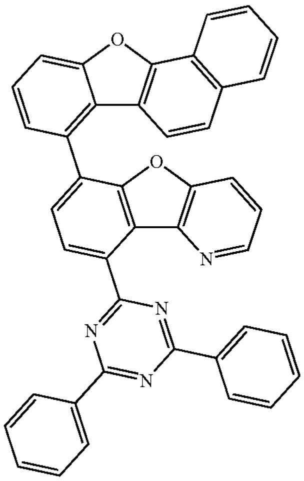
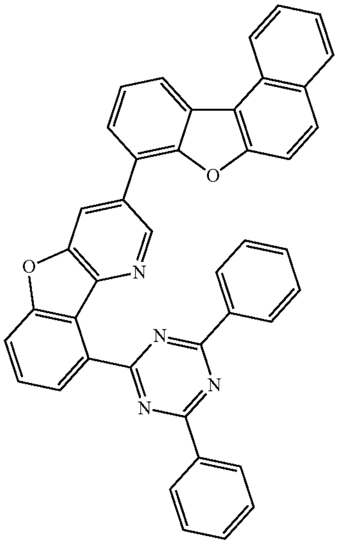
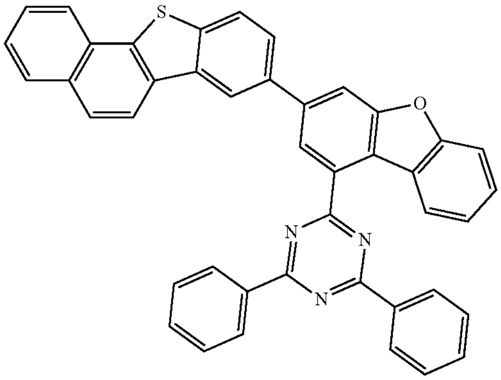
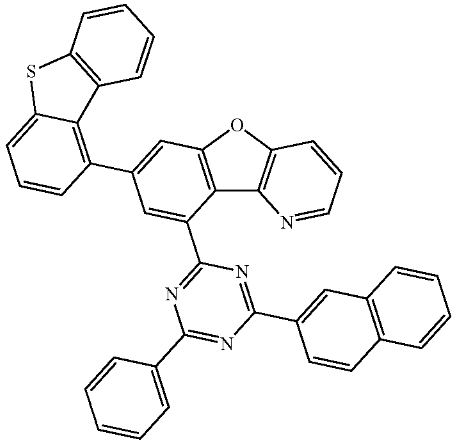
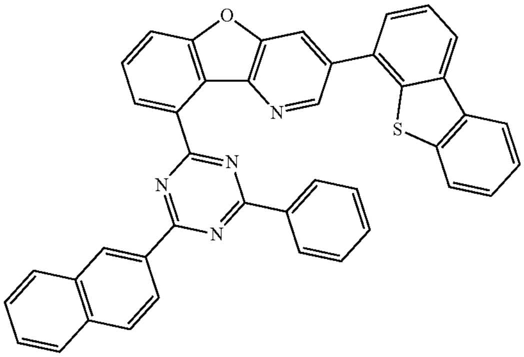
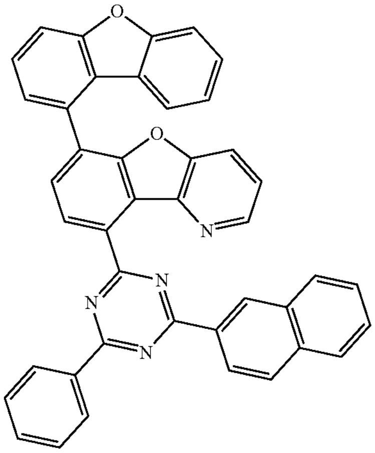

-continued
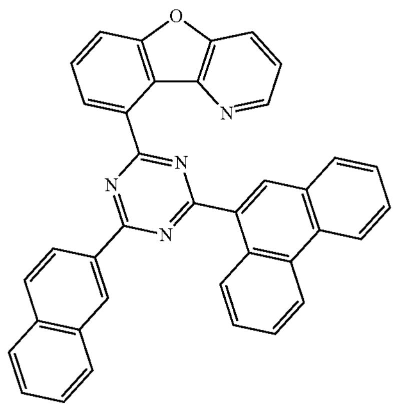
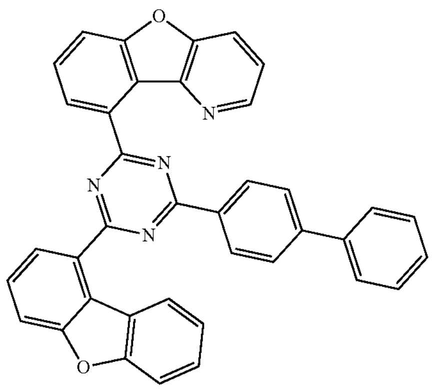
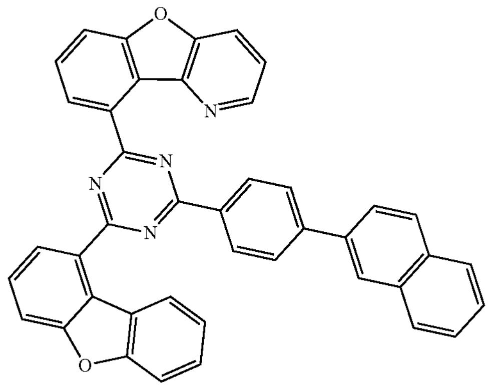
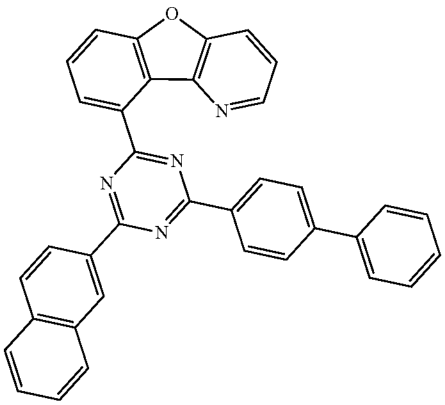
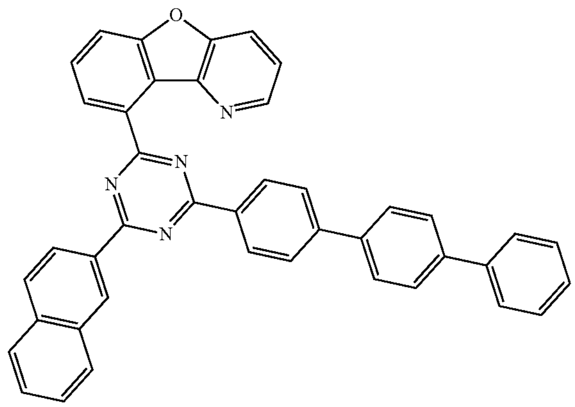
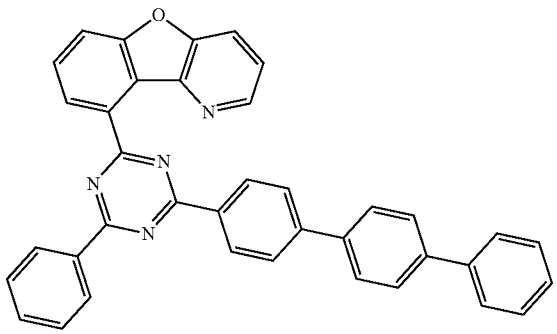

-continued
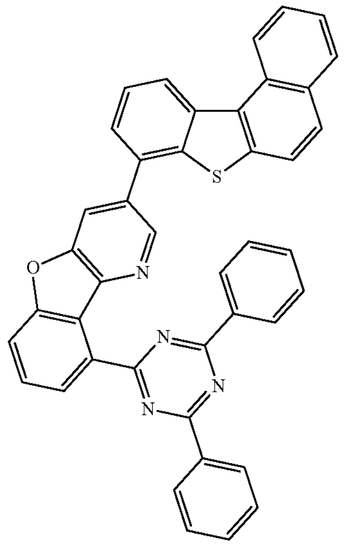
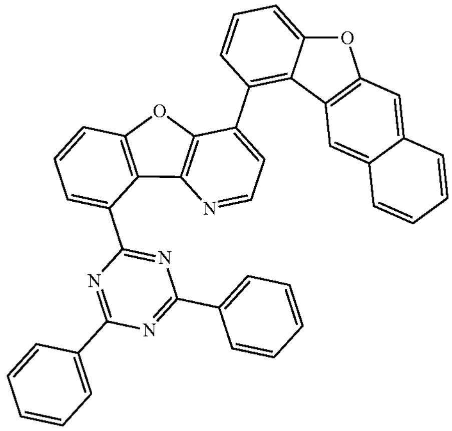
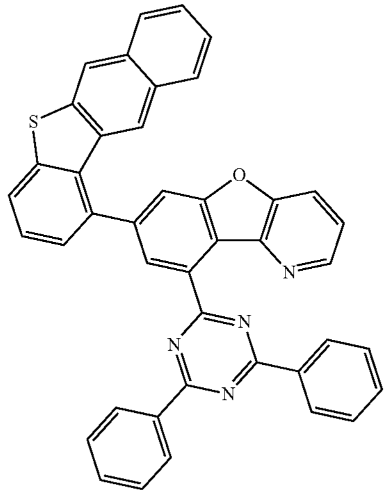
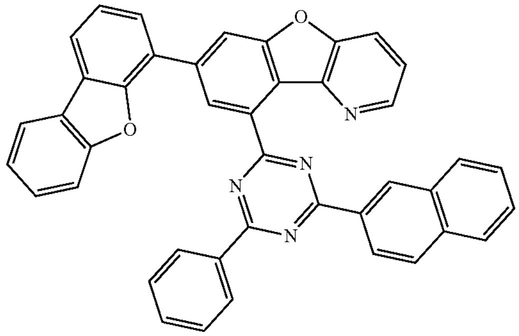
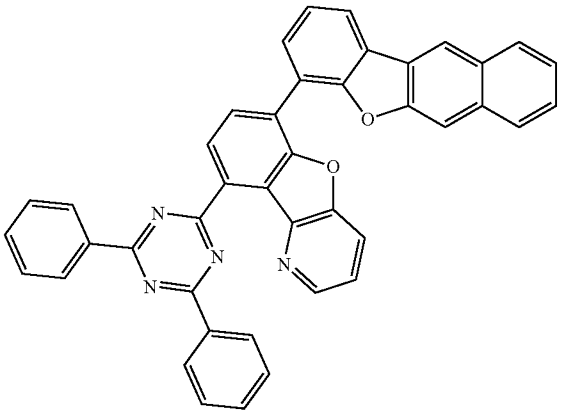
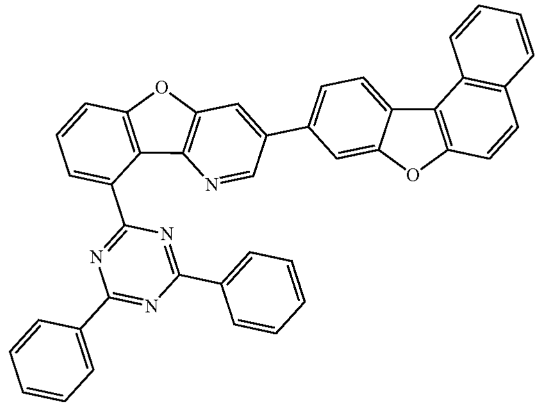

-continued
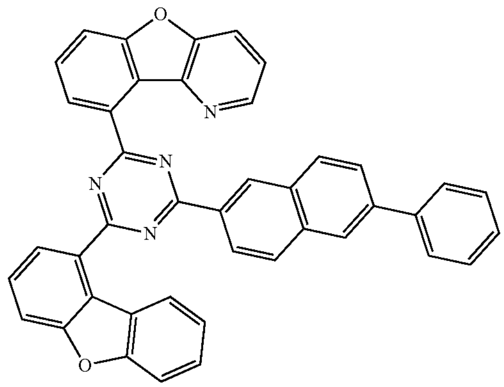
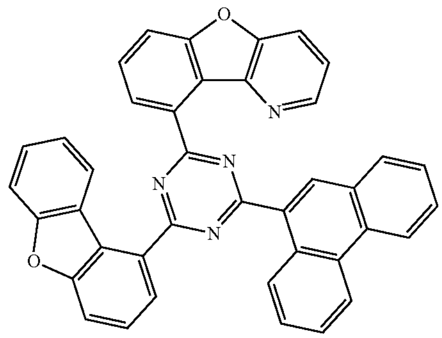
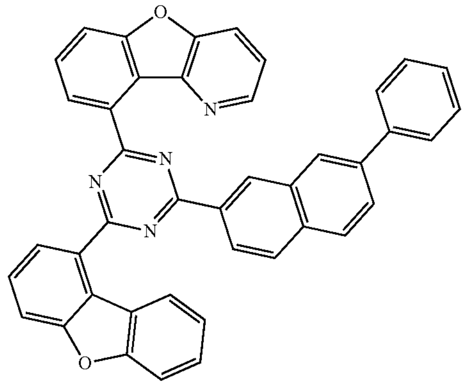
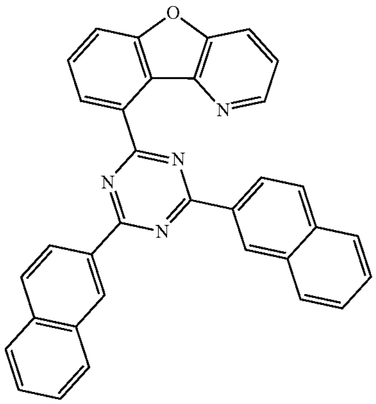
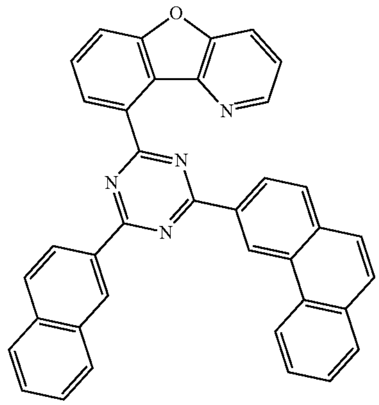
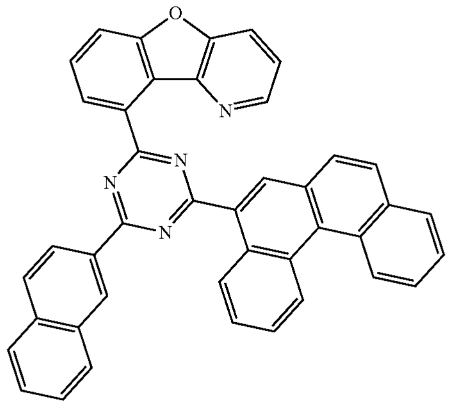

-continued
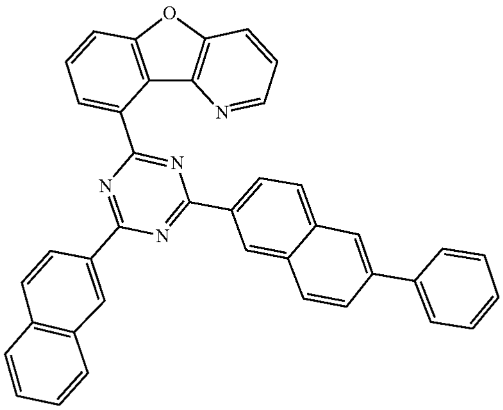
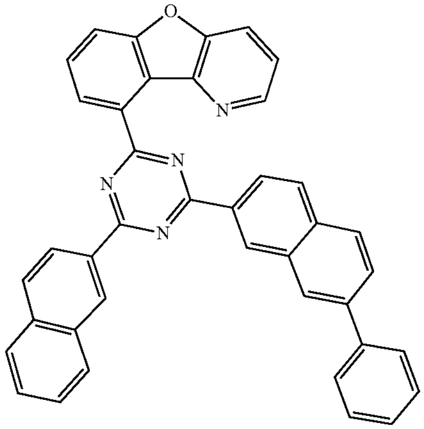
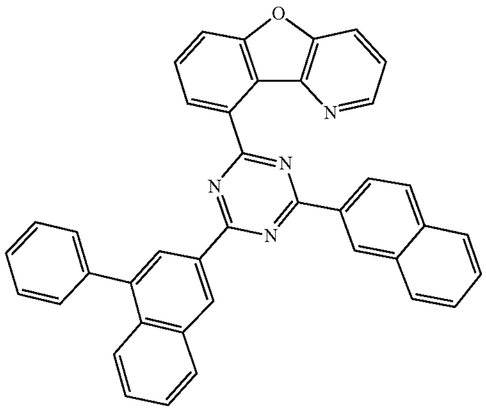
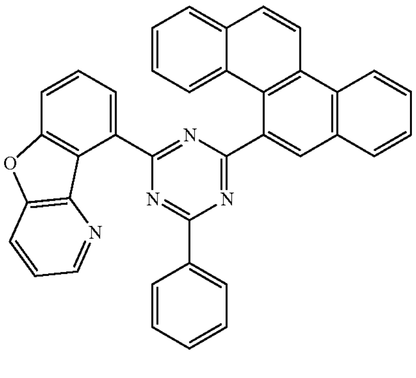
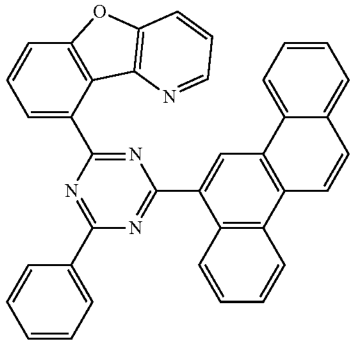
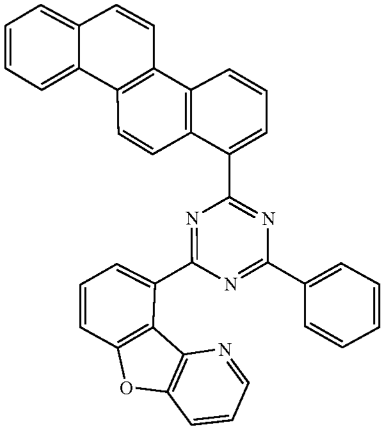
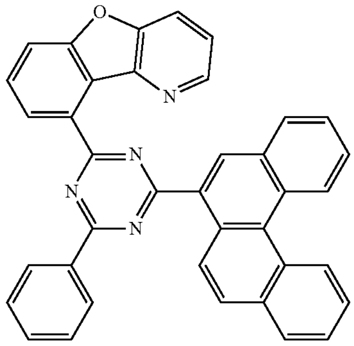
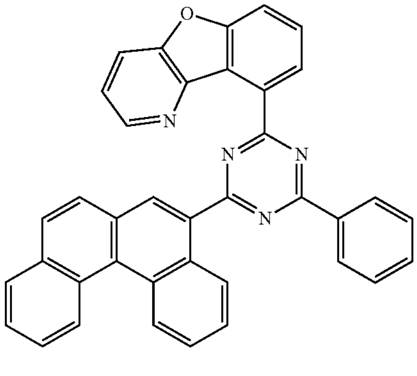

-continued
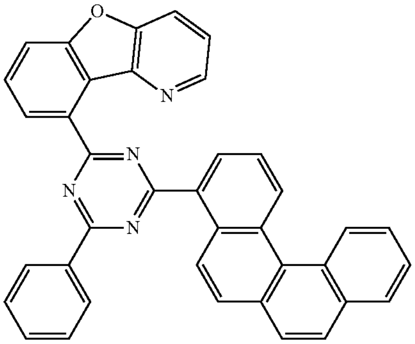
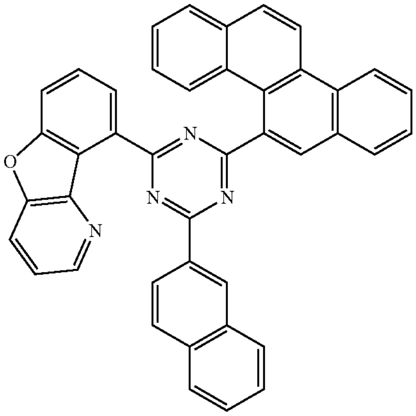
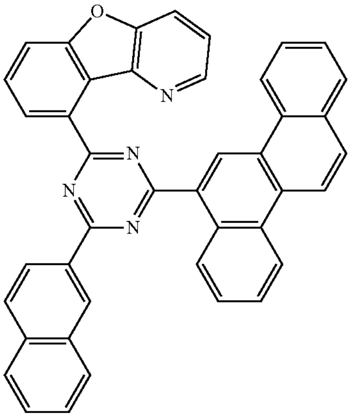
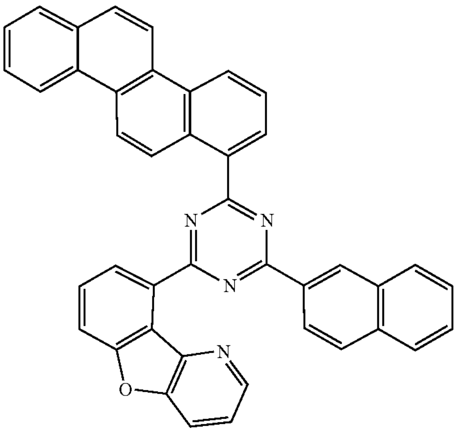
-continued
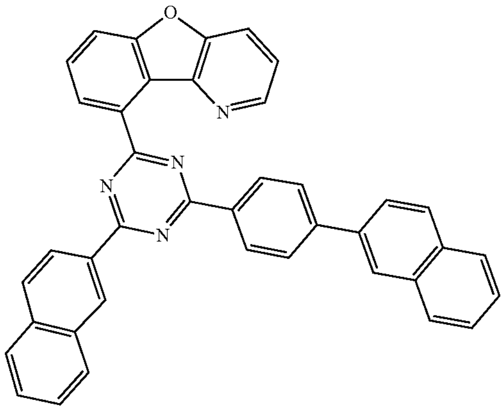
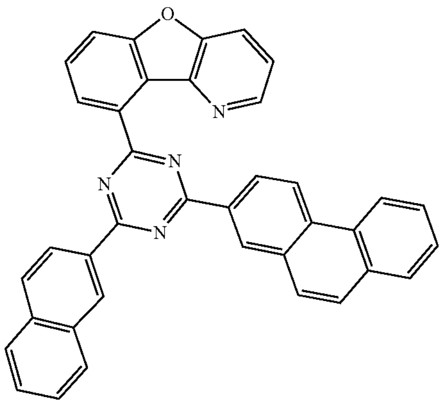
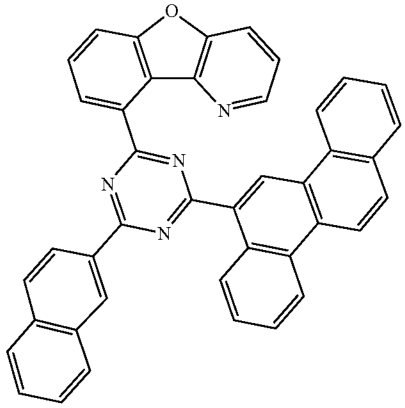
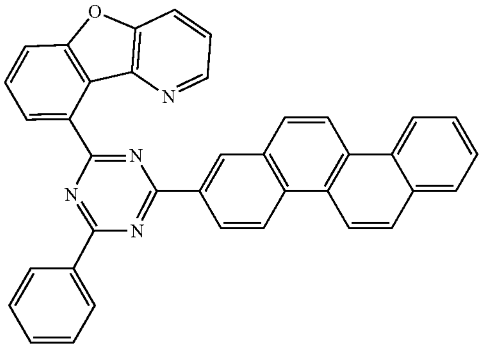

933
-continued
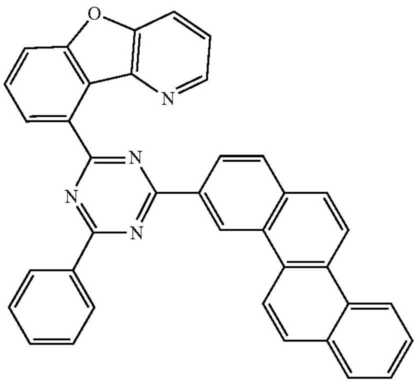
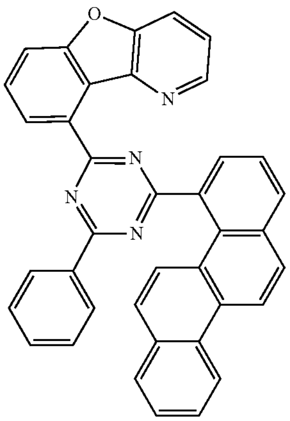
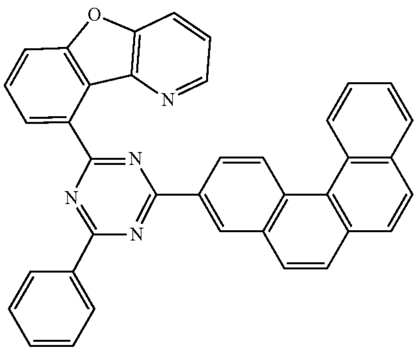
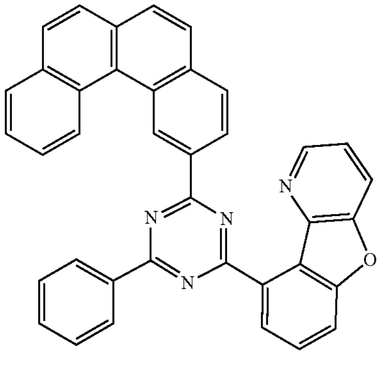
934
-continued
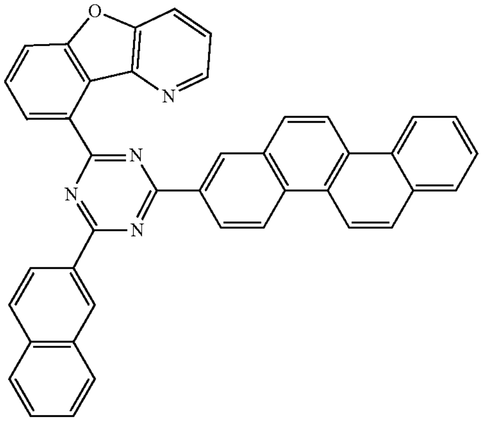
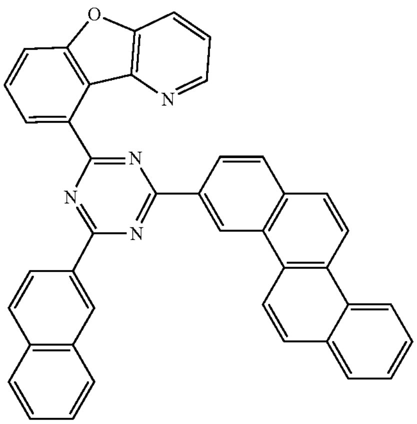
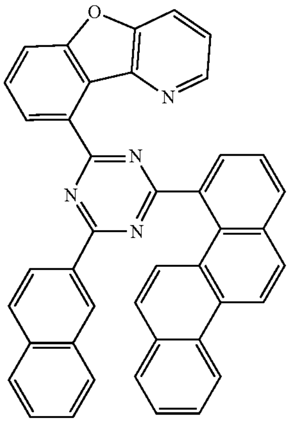
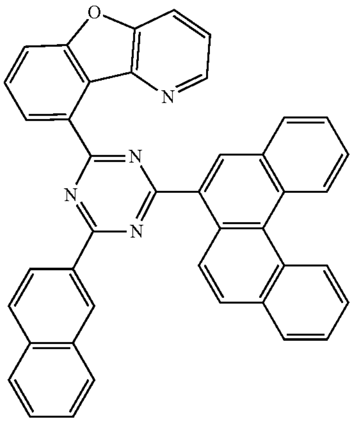

-continued
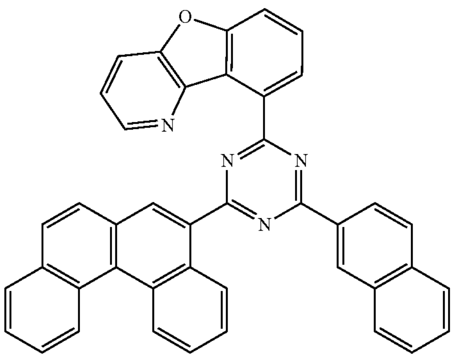
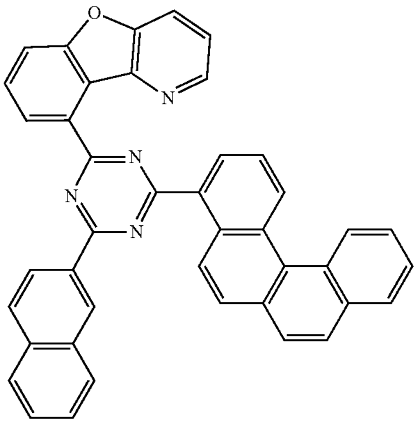
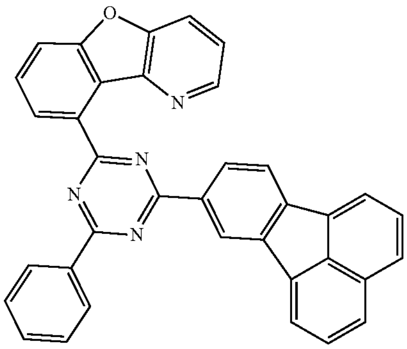
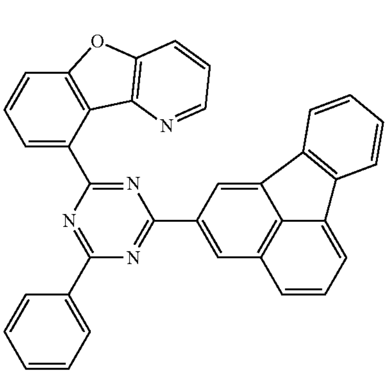
-continued
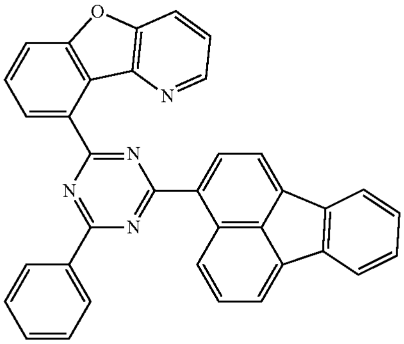
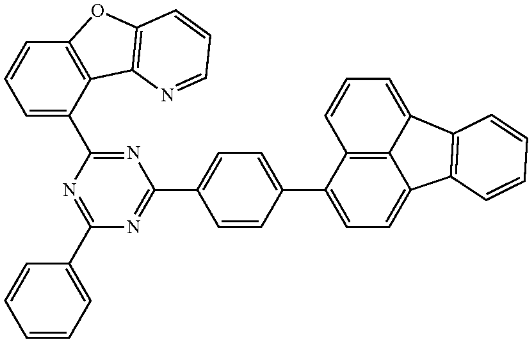
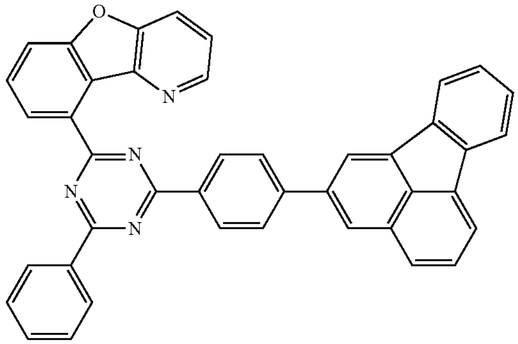
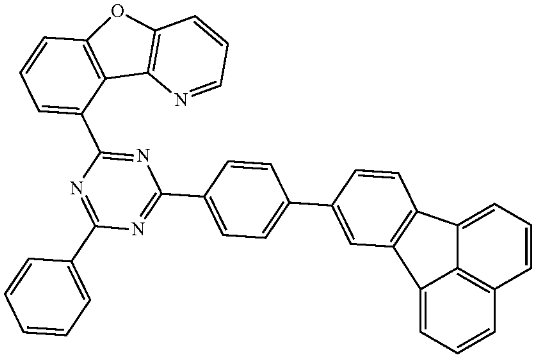

-continued
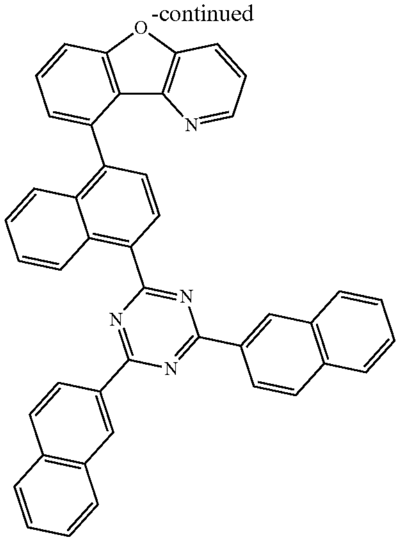
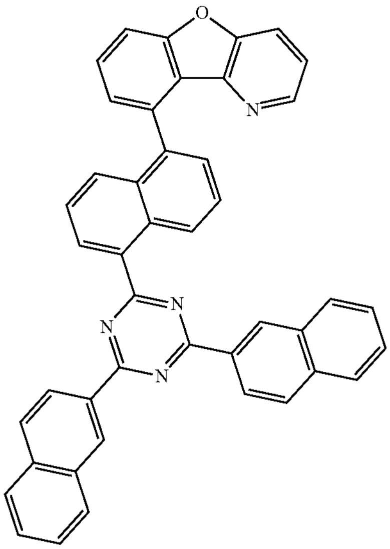
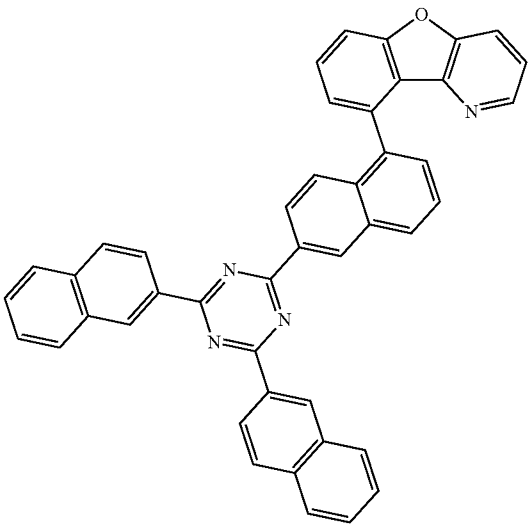
-continued
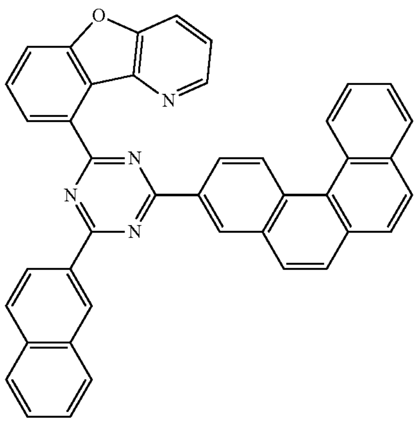
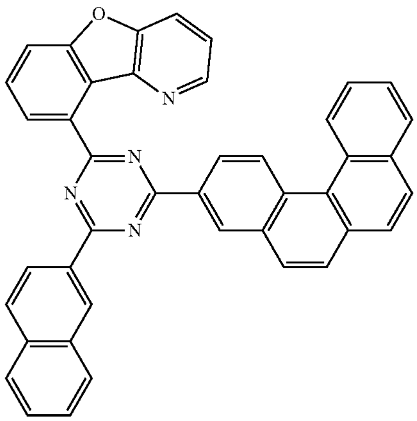
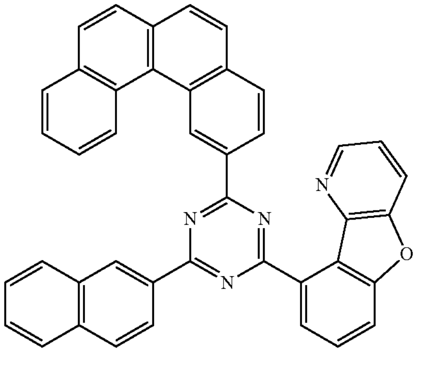
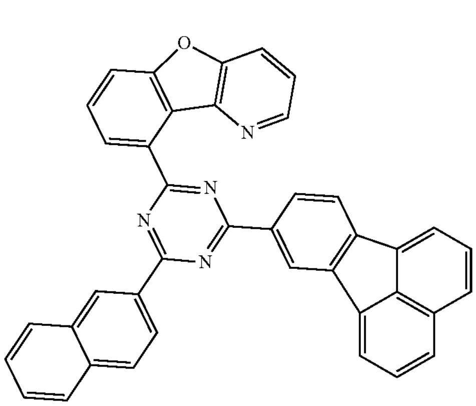

-continued
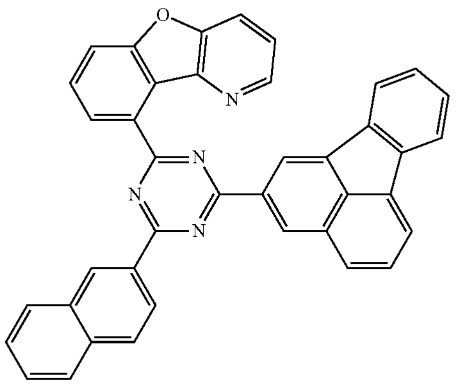
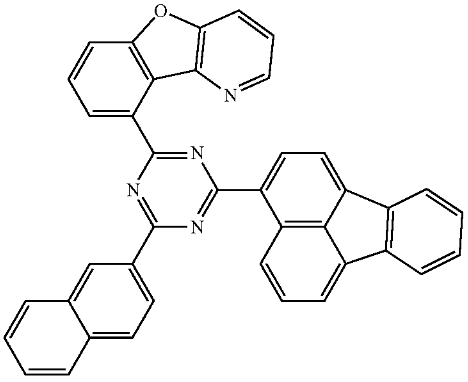
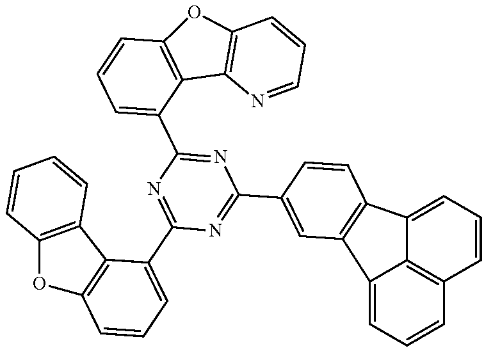
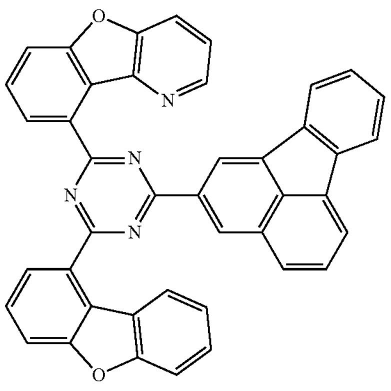
-continued
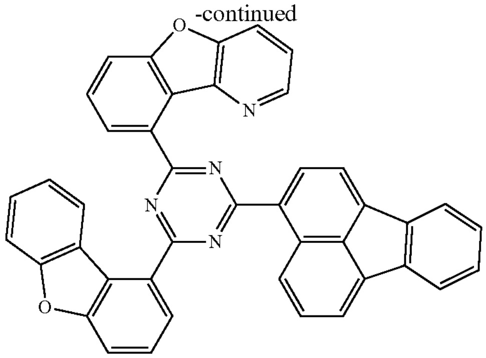
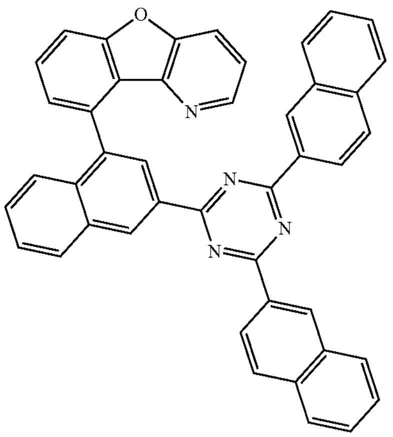
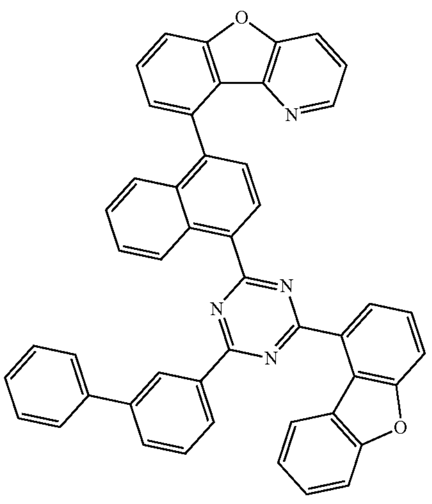

-continued
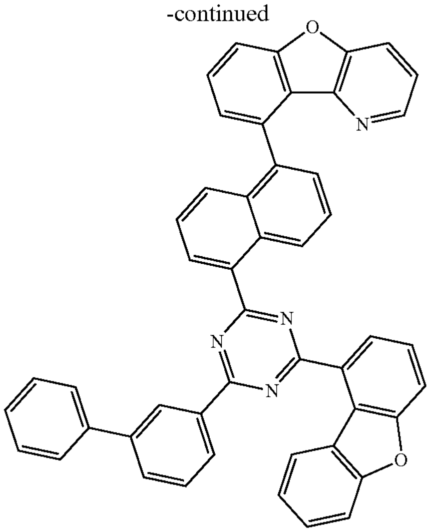
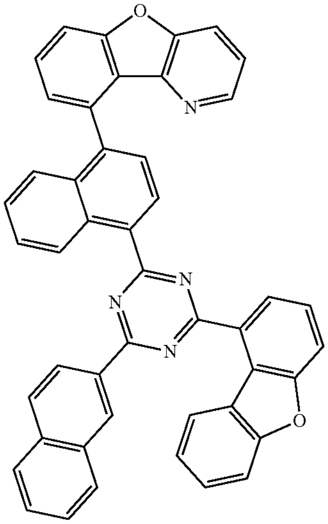
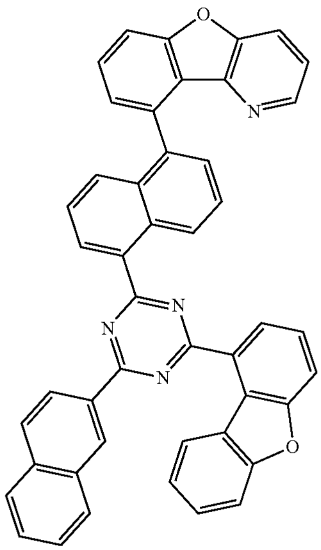
-continued
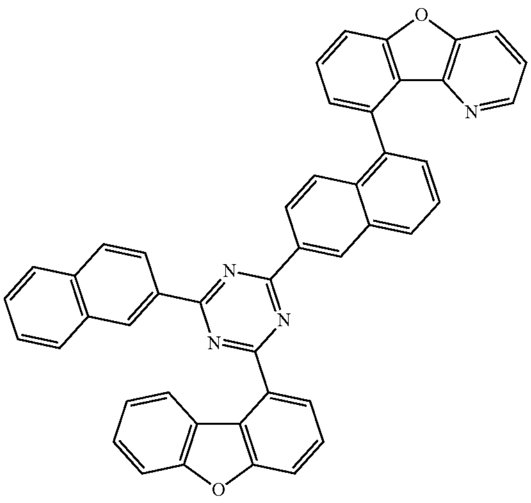
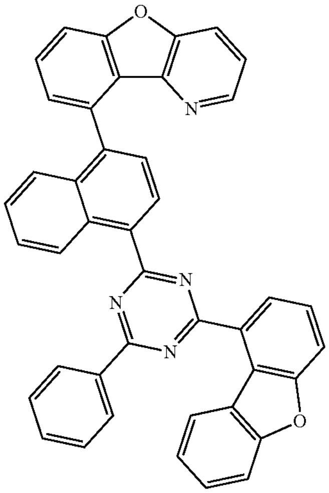
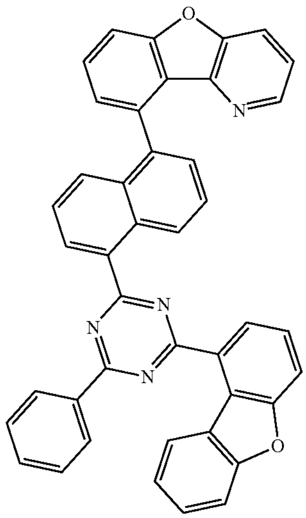

-continued
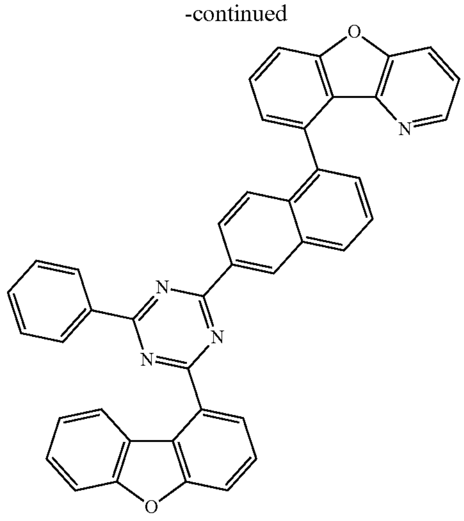
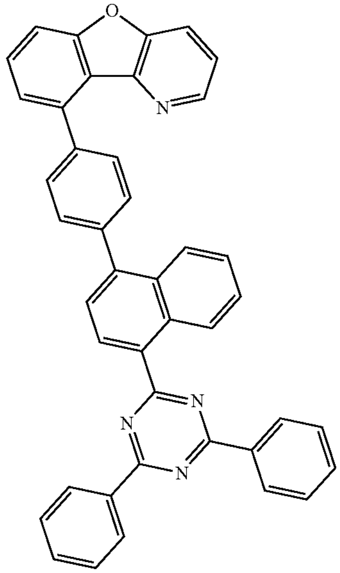
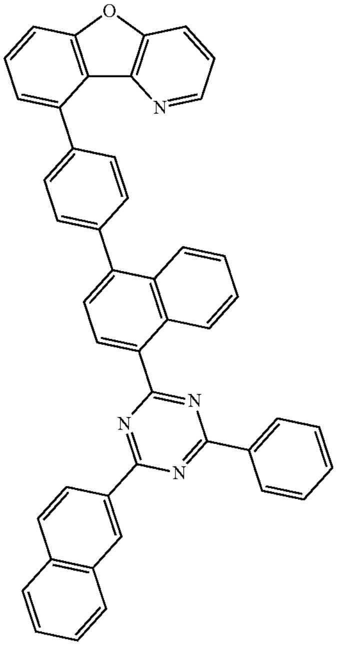
-continued
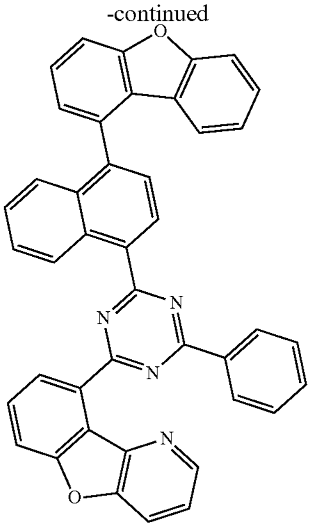
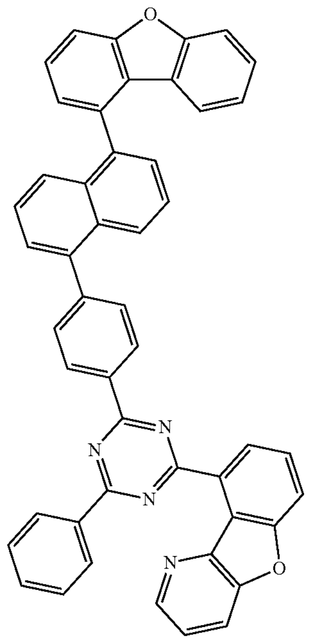
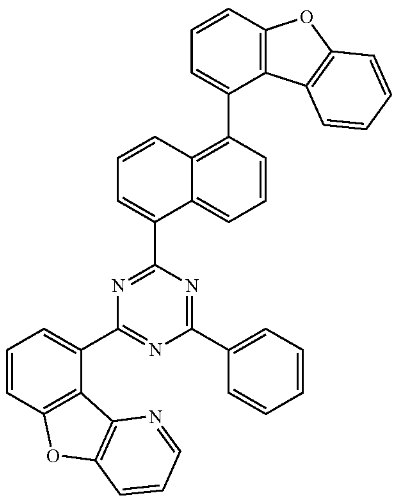

-continued
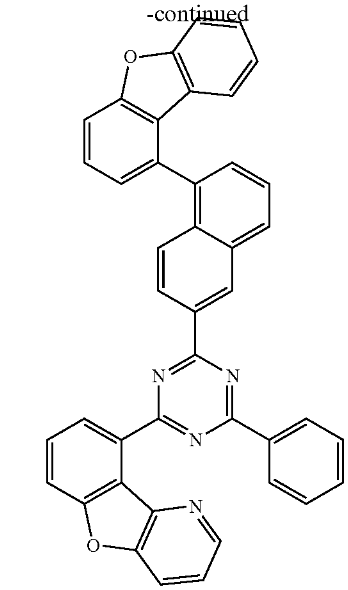
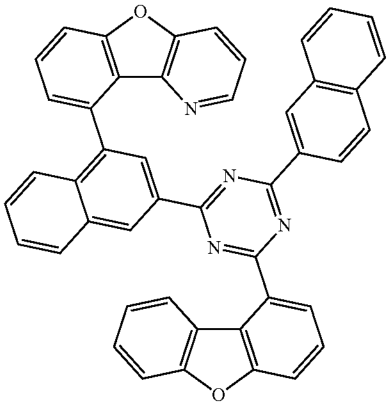
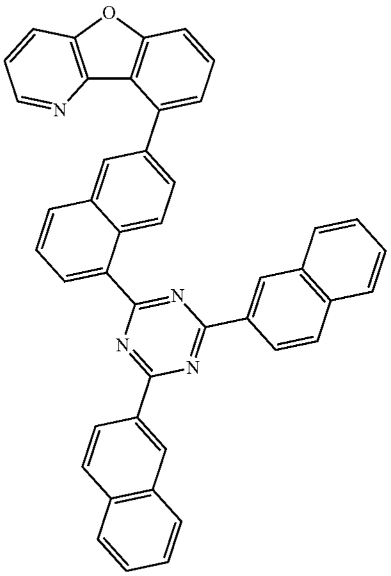
-continued
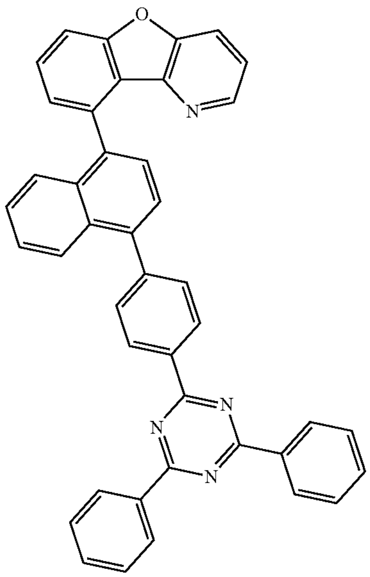
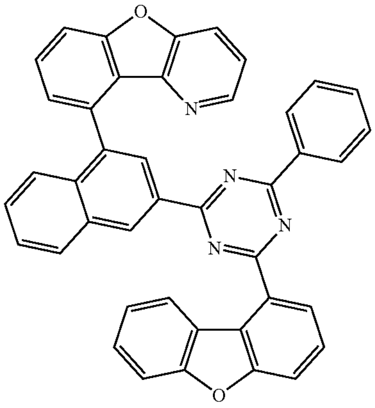
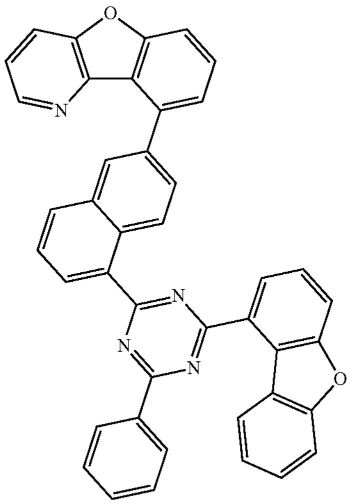

-continued
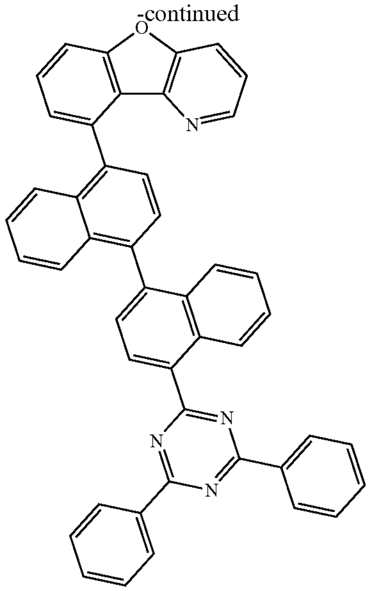
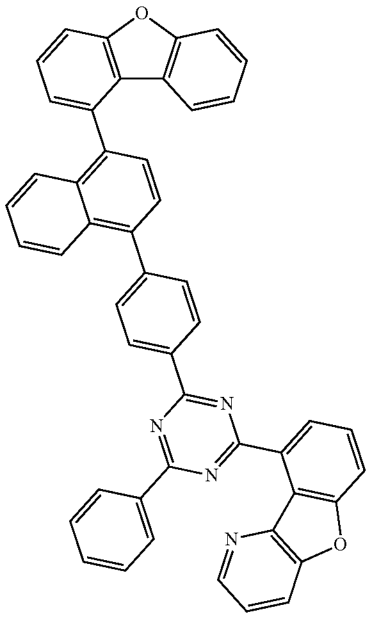
-continued
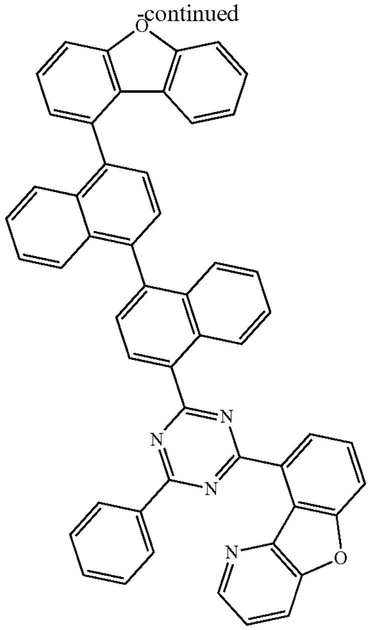
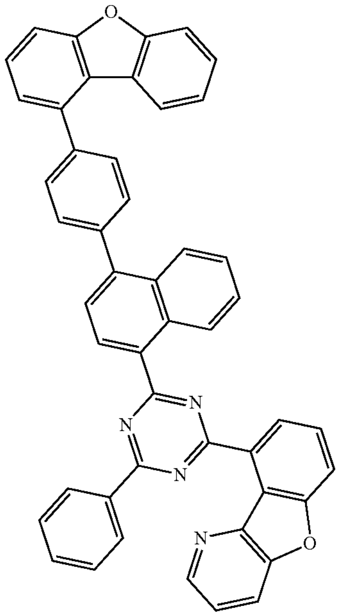
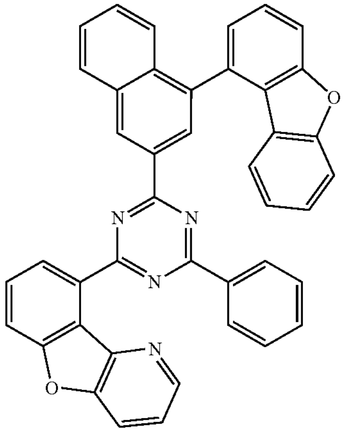

-continued

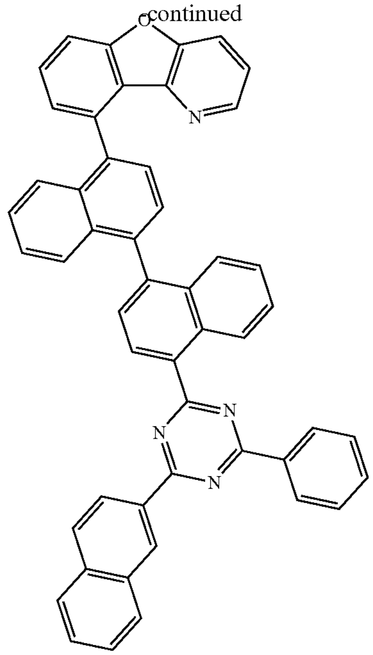

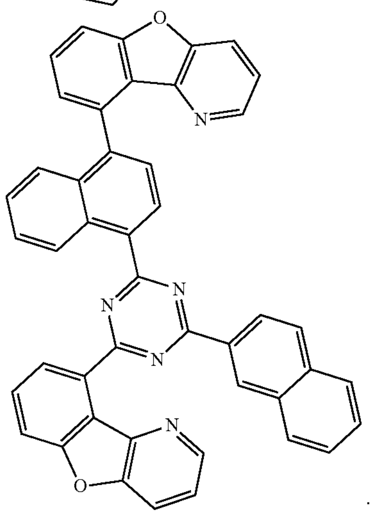

.

6. The organic light emitting device of claim 1, wherein $L'_1$ to $L'_4$ are each independently a single bond, phenylene that is unsubstituted or substituted with at least one deuterium, or naphthylene that is unsubstituted or substituted with at least one deuterium.

7. The organic light emitting device of claim 1, wherein $Ar'_1$ to $Ar'_3$ are each independently phenyl, biphenylyl, terphenylyl, naphthyl, dibenzofuranyl, dibenzothiophenyl, or 9,9-dimethylfluorenyl; and $Ar'_1$ to $Ar'_3$ are each independently unsubstituted or substituted with at least one deuterium.

8. The organic light emitting device of claim 1, wherein $L'_1$ is a single bond or phenylene that is unsubstituted or substituted with at least one deuterium; and $Ar'_1$ is a phenyl that is unsubstituted or substituted with at least one deuterium, a biphenylyl that is unsubstituted or substituted with at least one deuterium, a terphenylyl that is unsubstituted or substituted with at least one deuterium, or a naphthyl that is unsubstituted or substituted with at least one deuterium.

9. The organic light emitting device of claim 1, wherein the compound of Chemical Formula 2 is any compound one selected from the group consisting of:

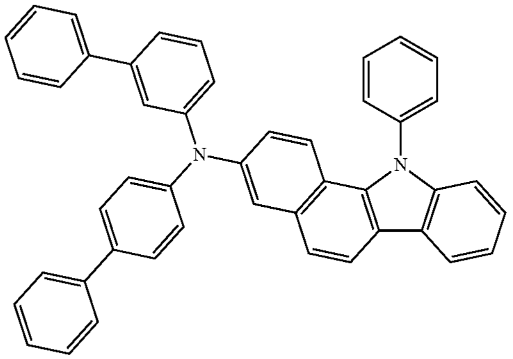

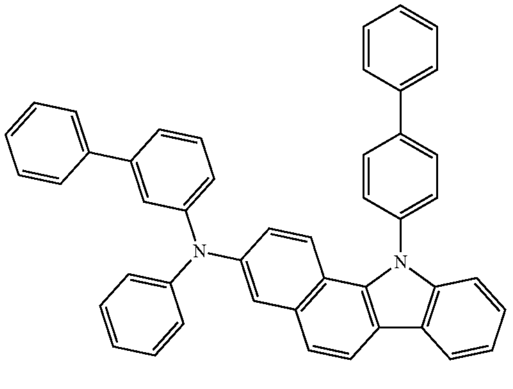

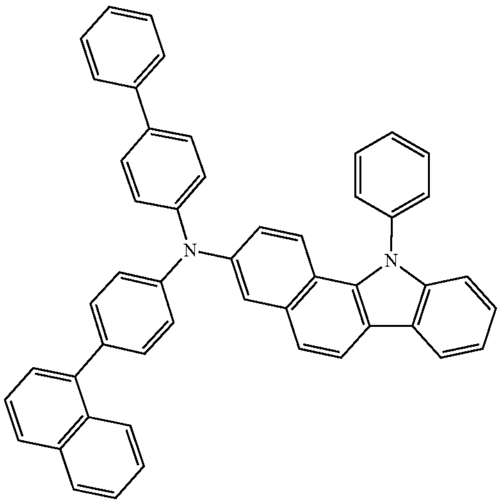

-continued
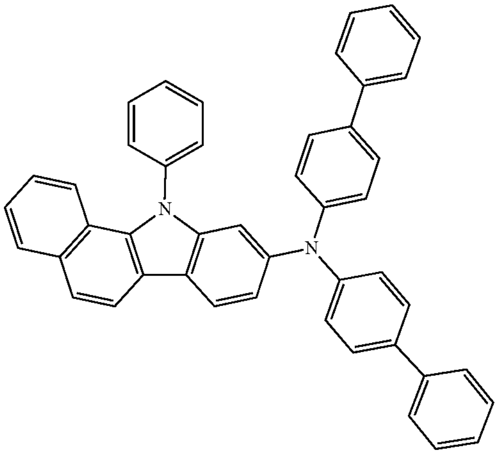
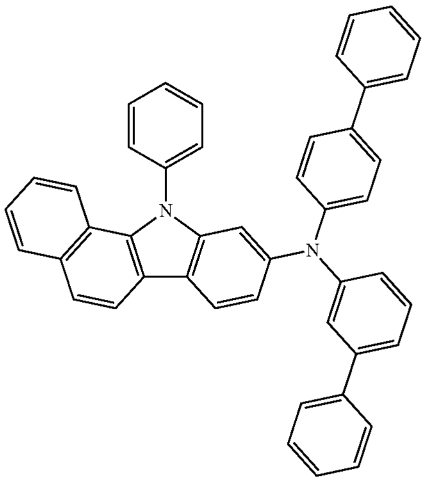
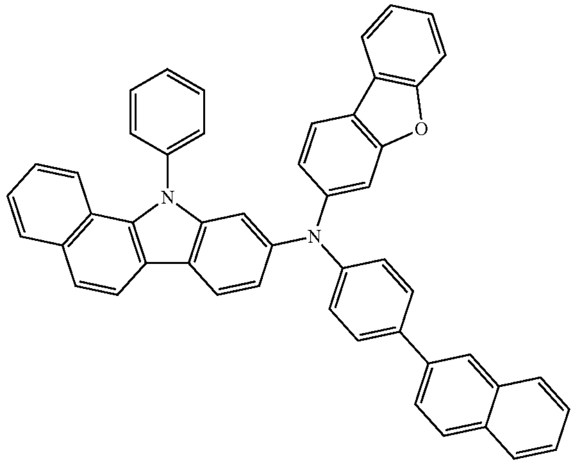
-continued
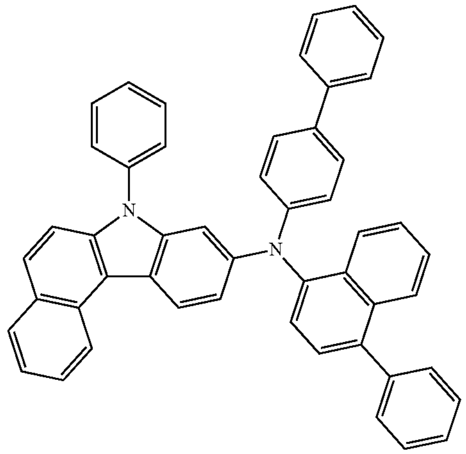
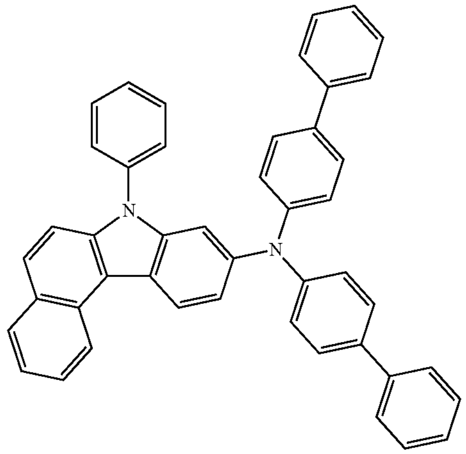
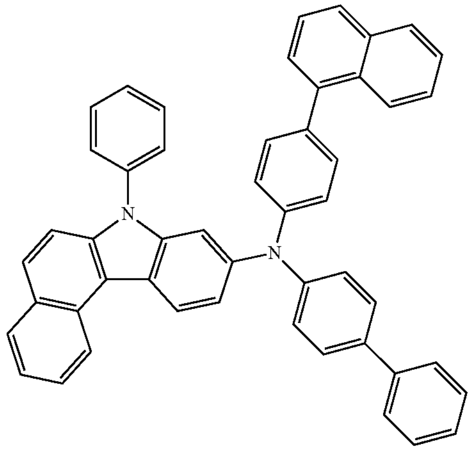

-continued
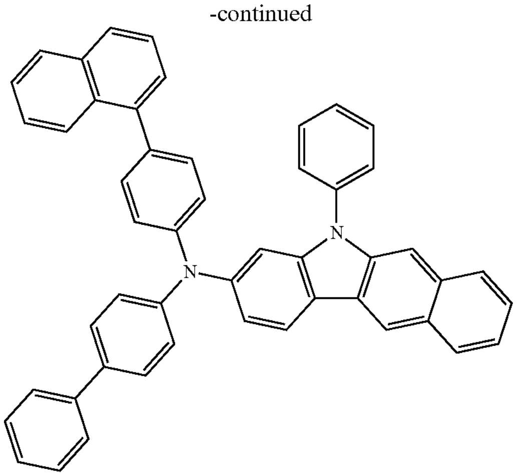
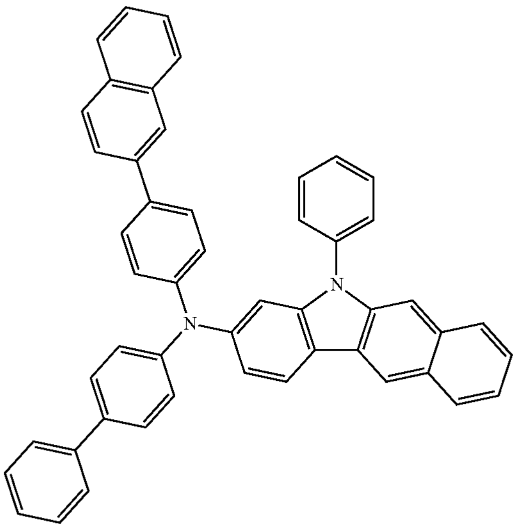
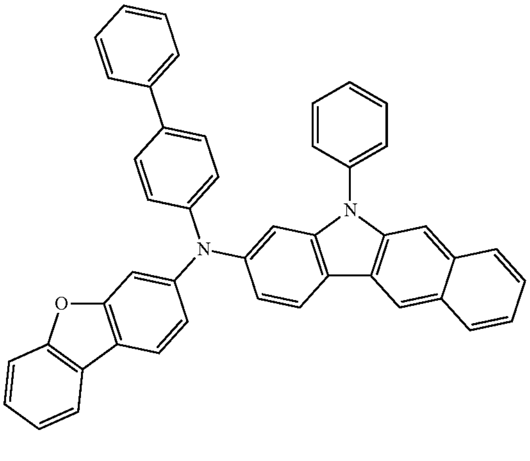
-continued
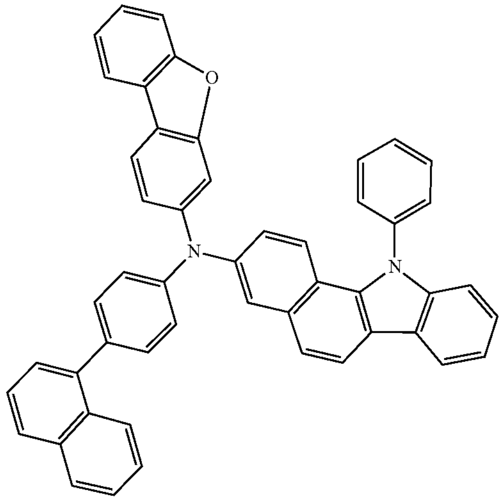
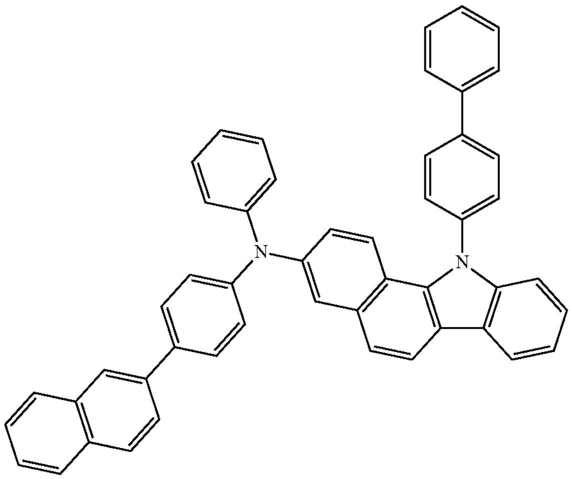
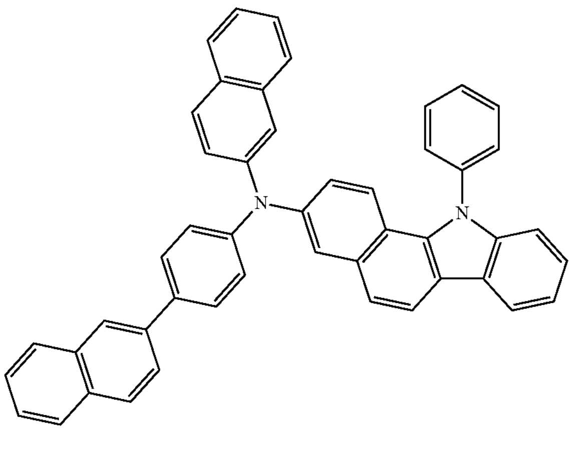

-continued
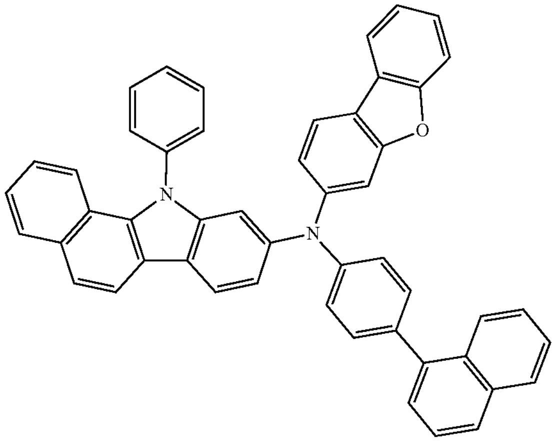
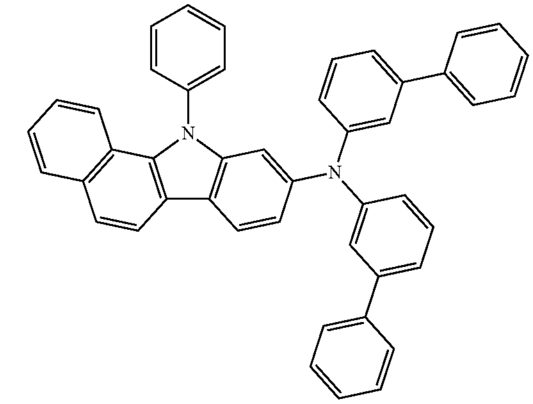
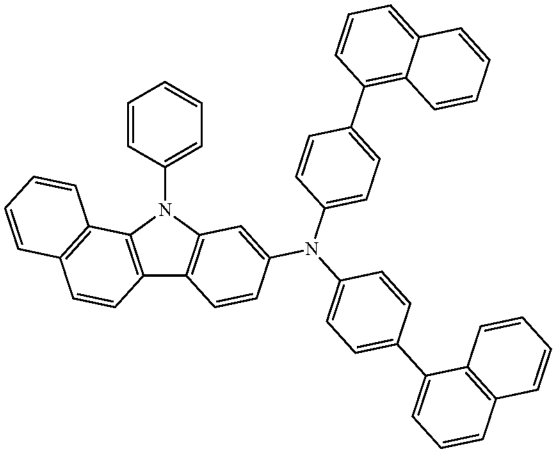
-continued
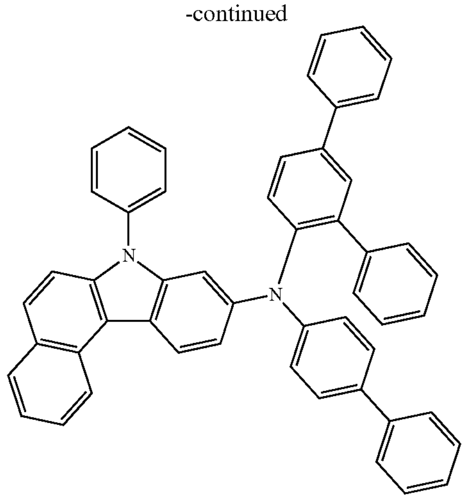
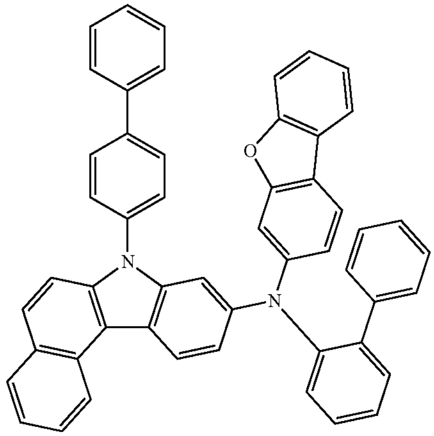
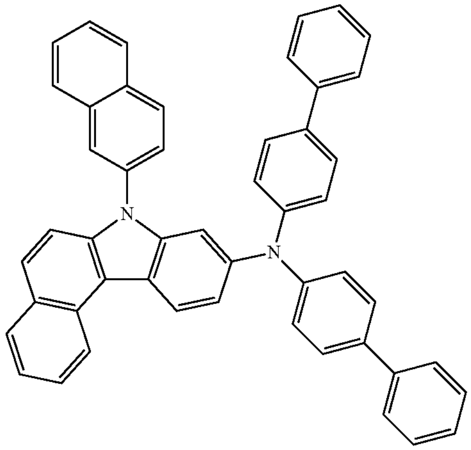

-continued
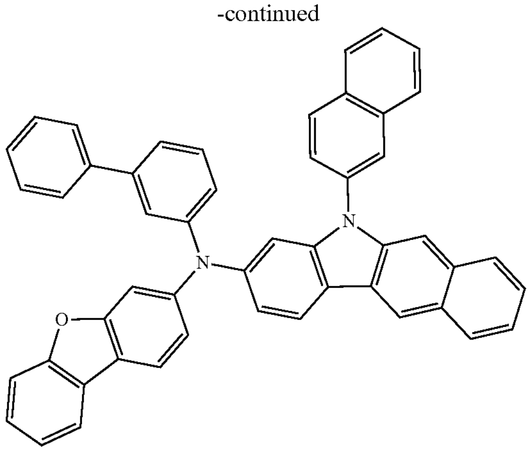
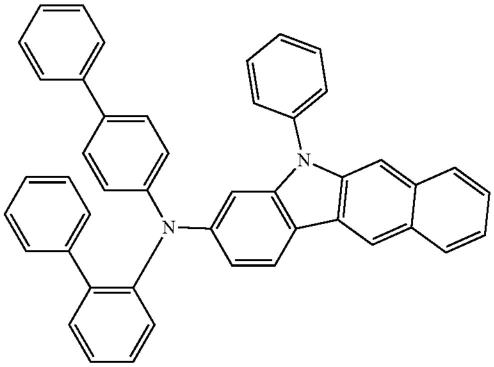
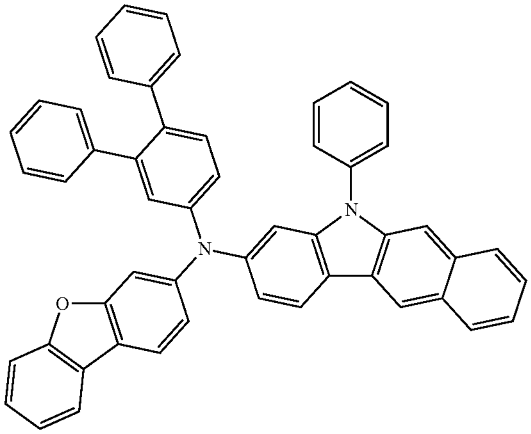
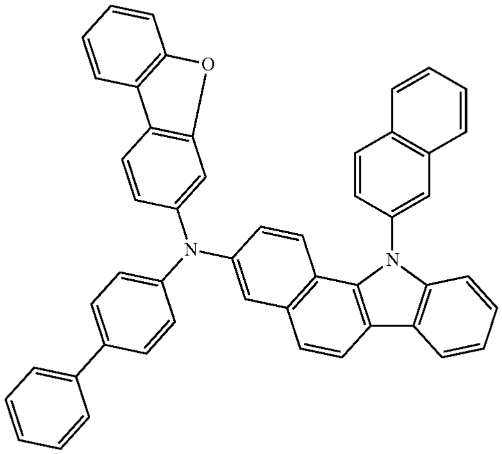
-continued
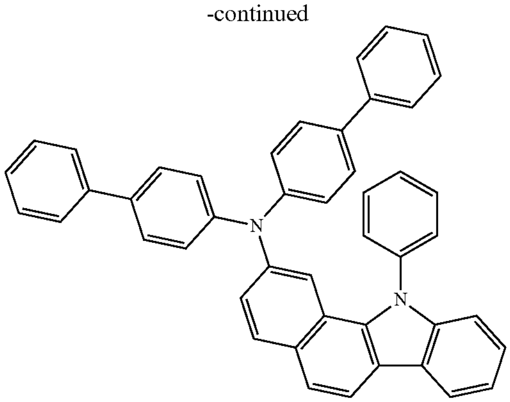
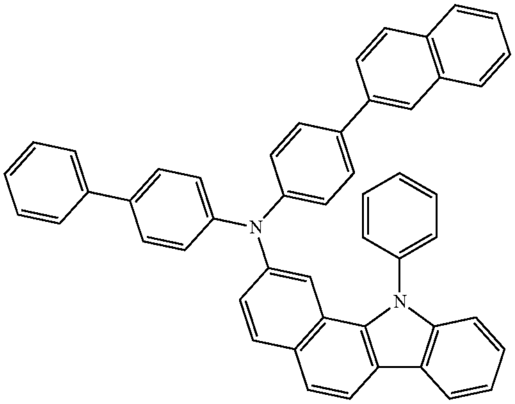
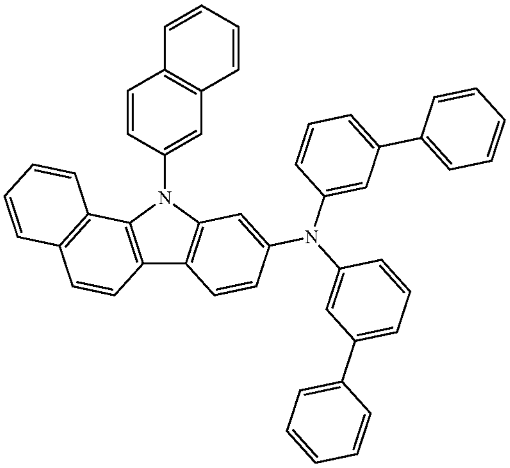
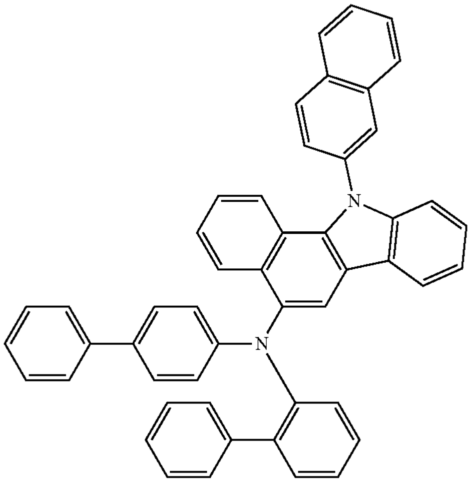

-continued
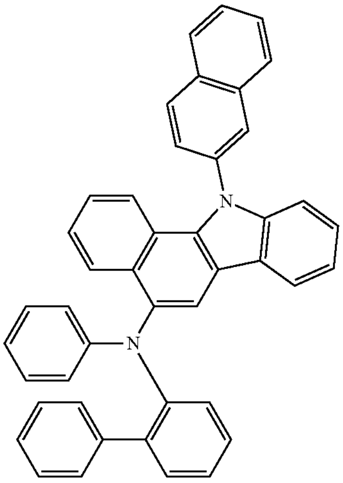
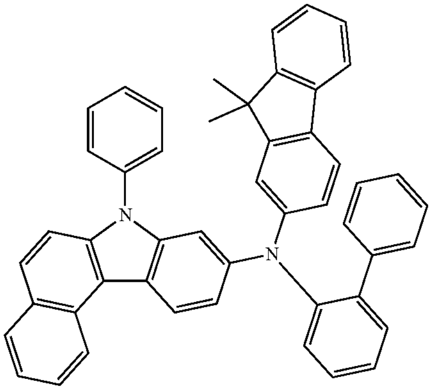
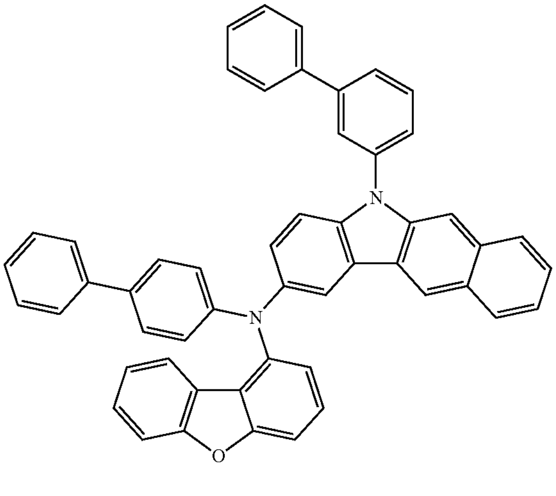
-continued
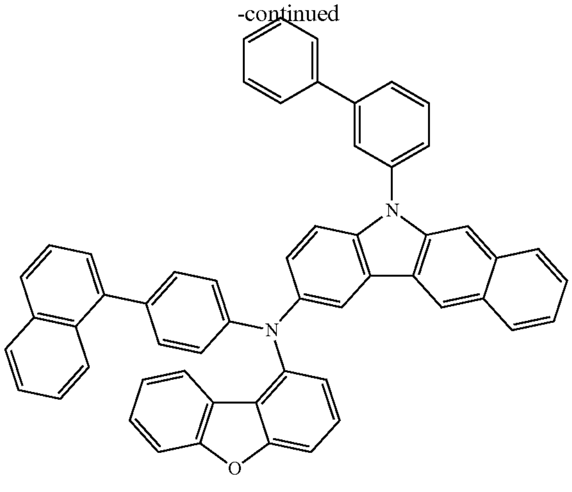
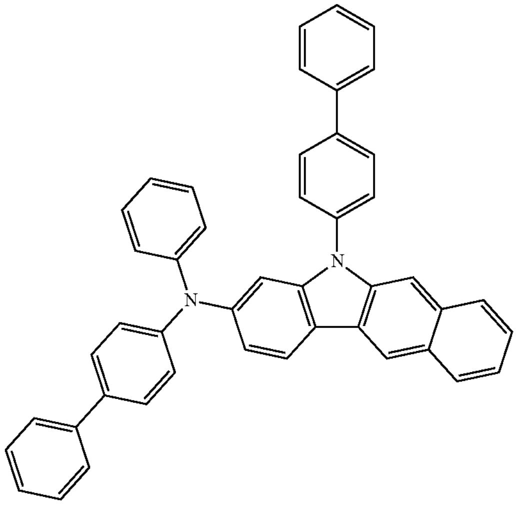
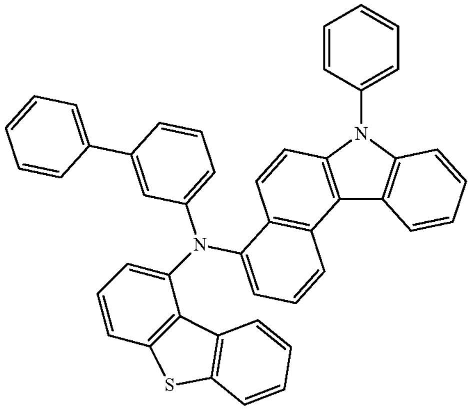

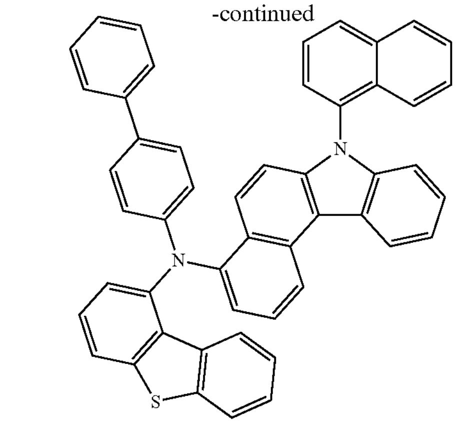
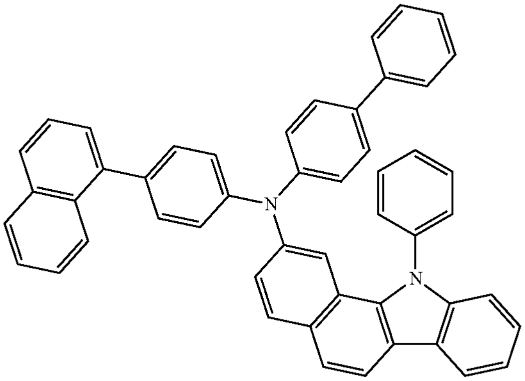
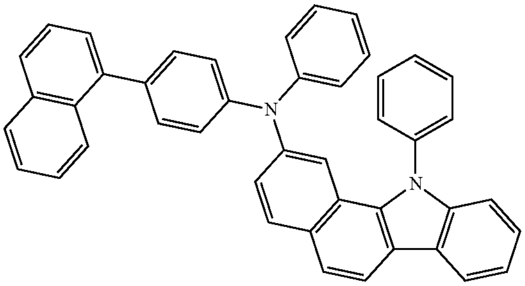
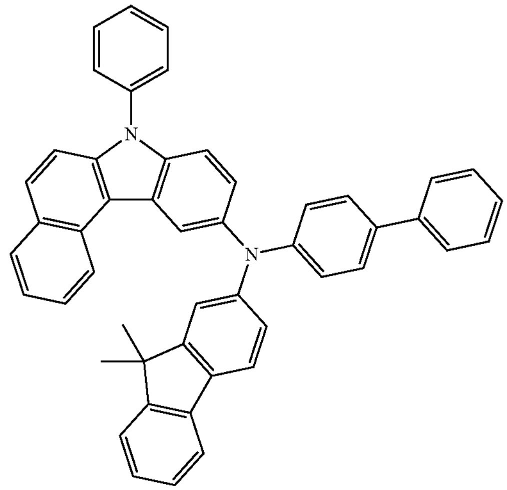
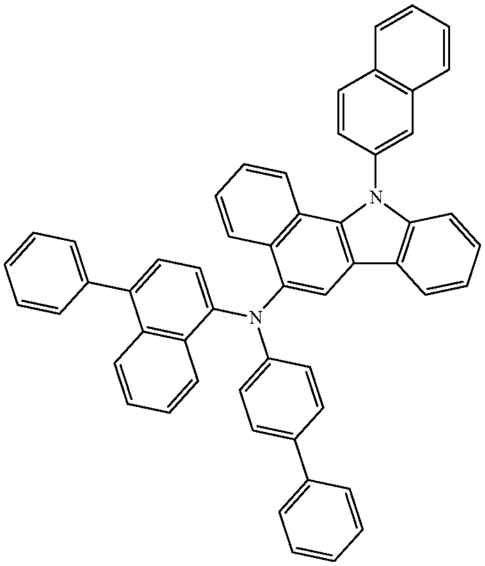
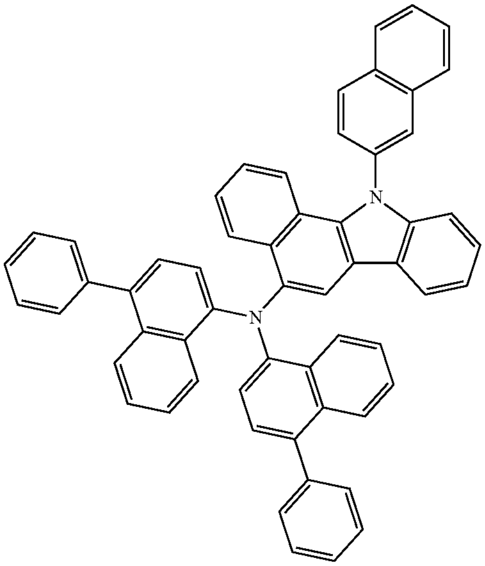
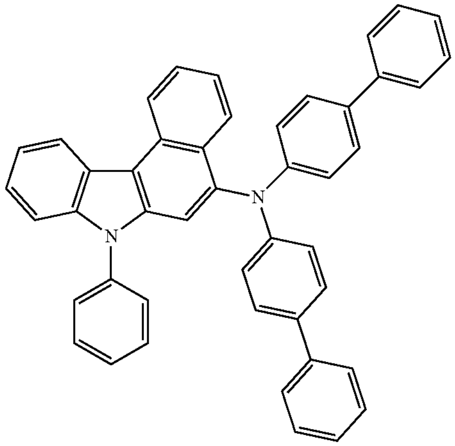

-continued
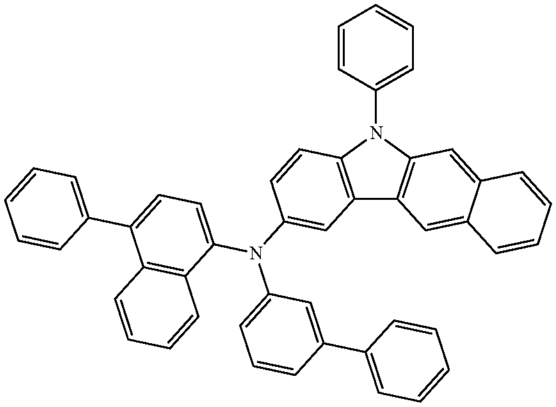
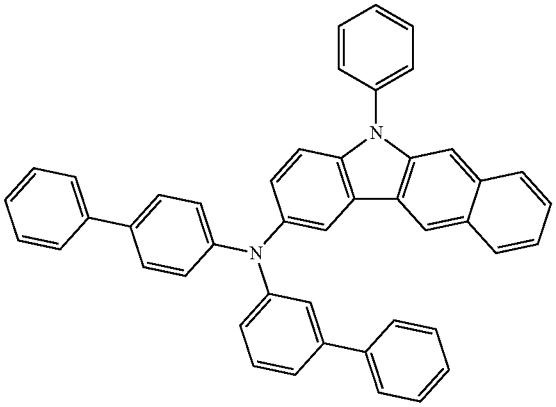
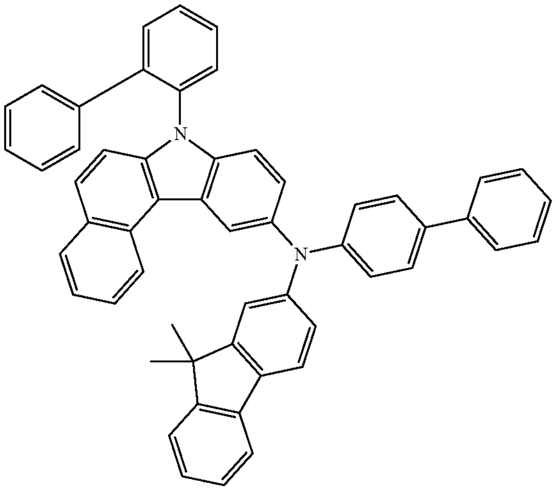
-continued
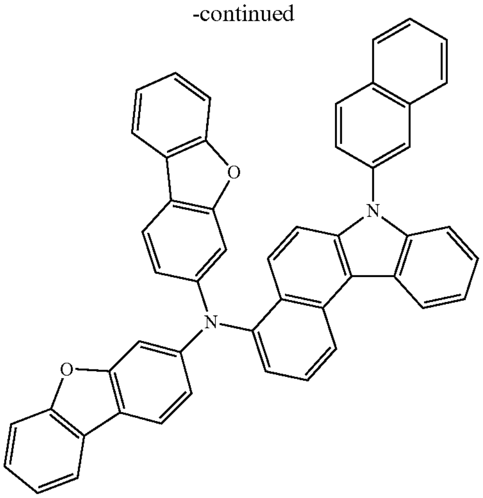
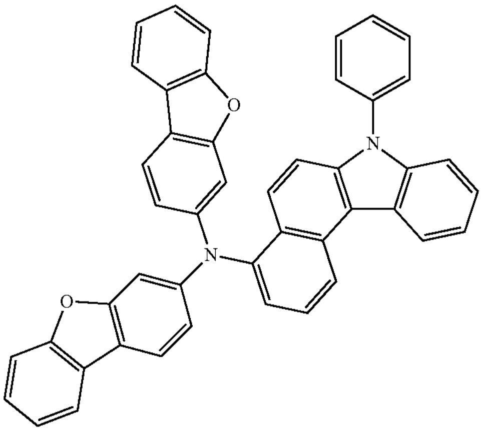
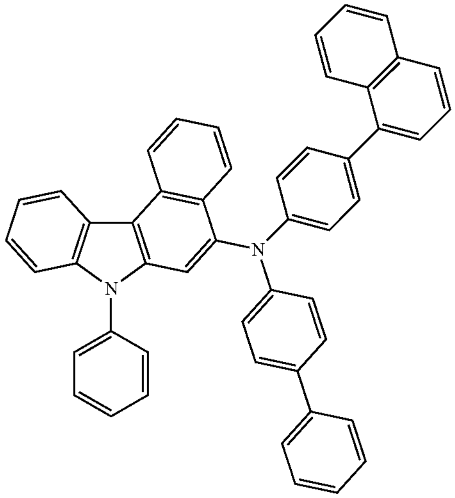

-continued
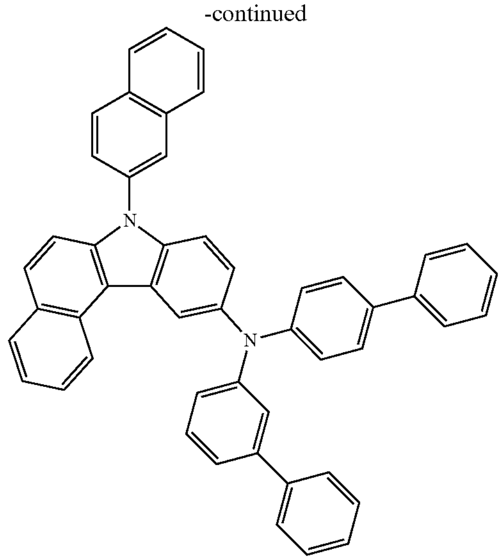
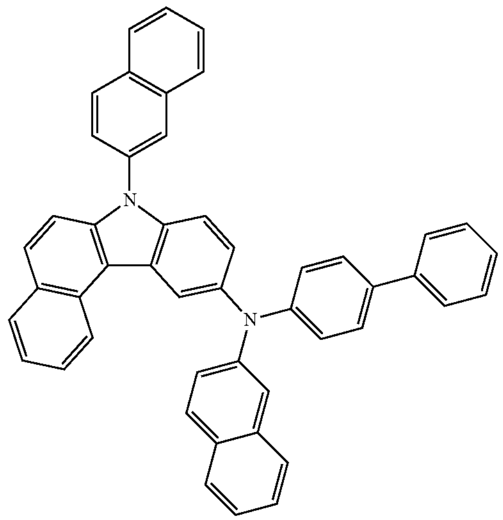
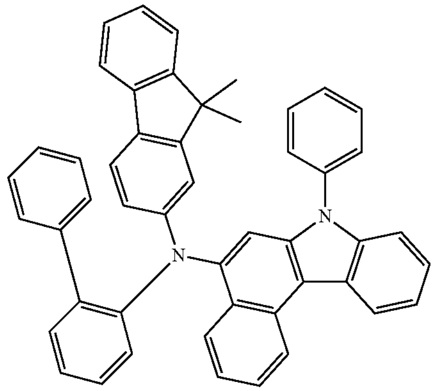
-continued
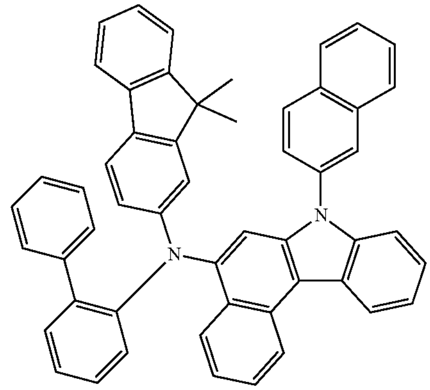
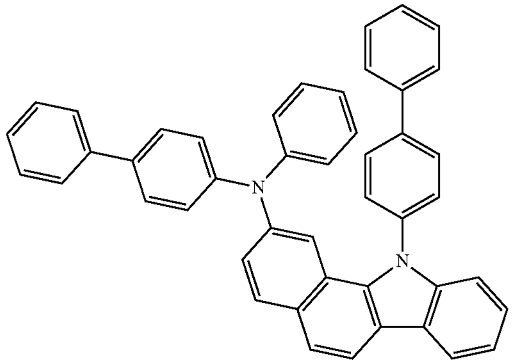
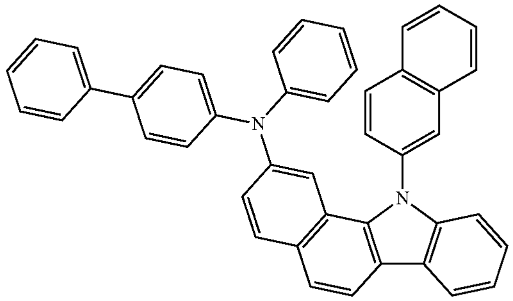
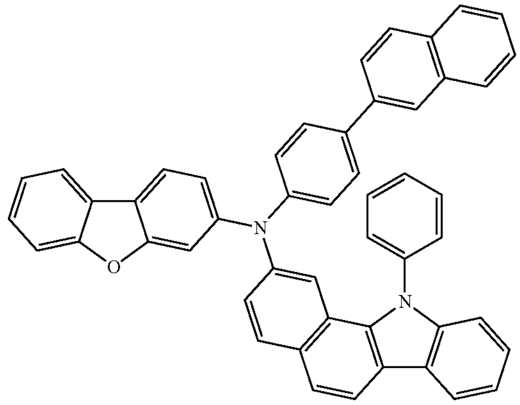

-continued
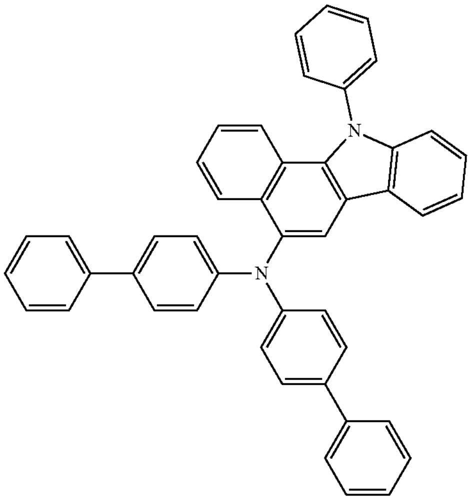
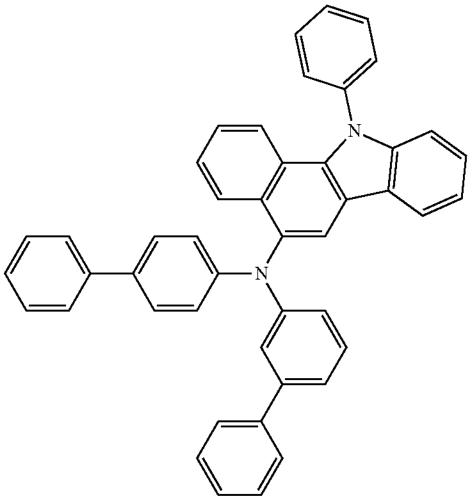
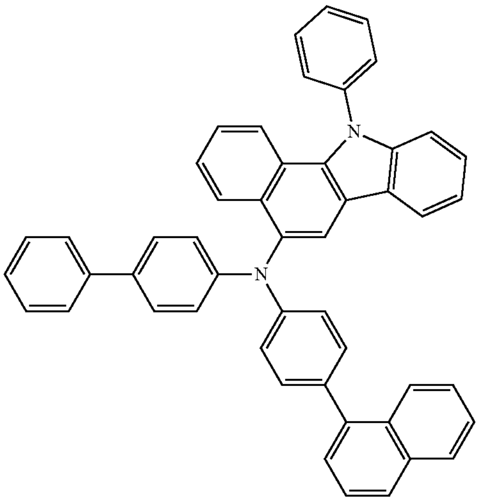
-continued
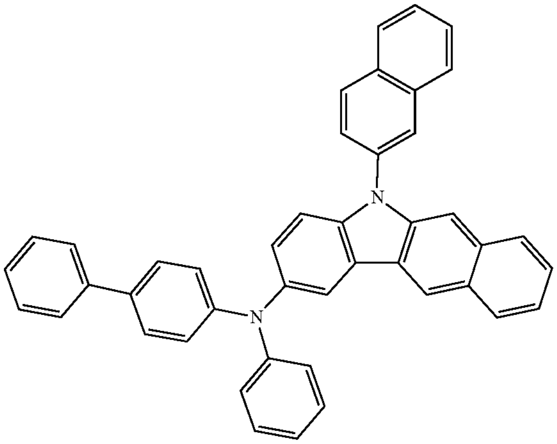
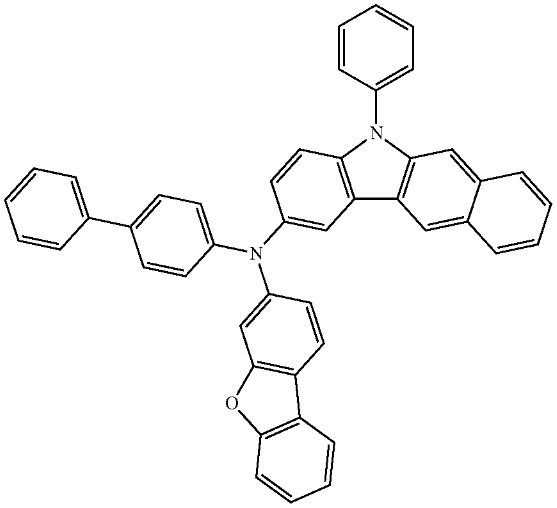
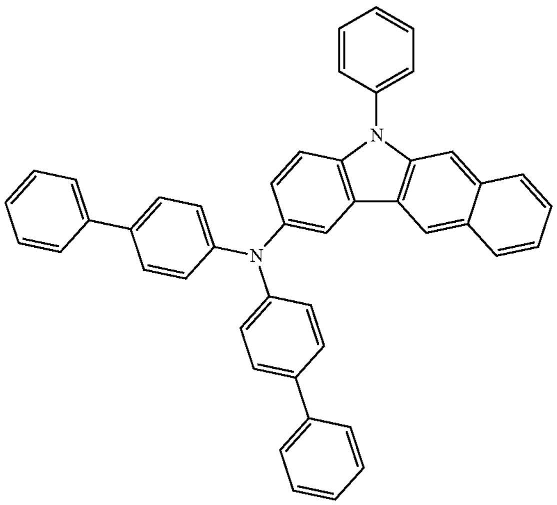

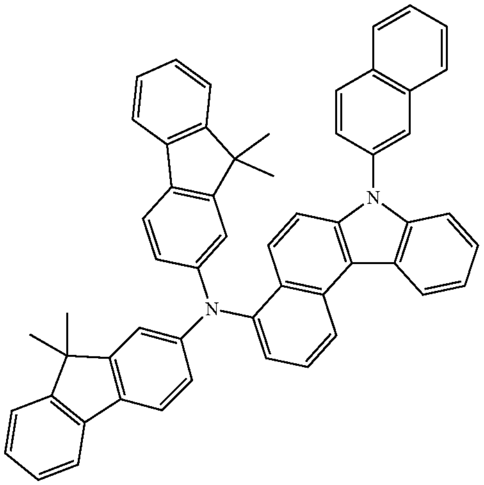
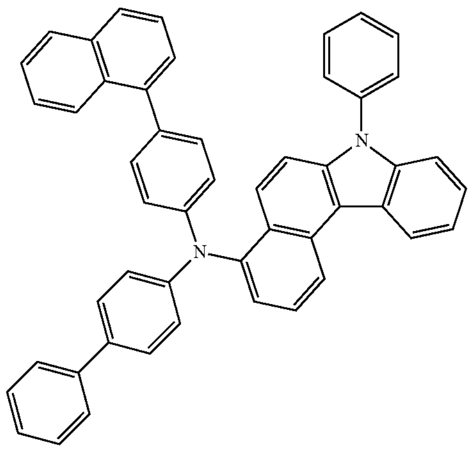
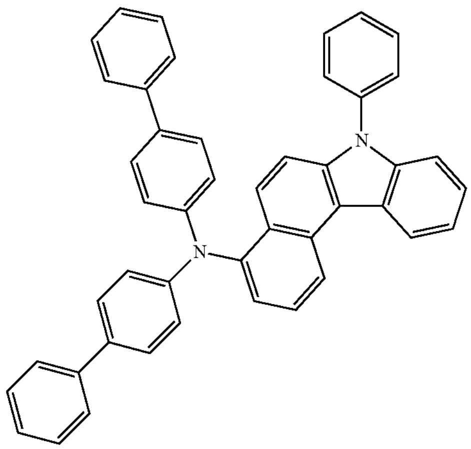
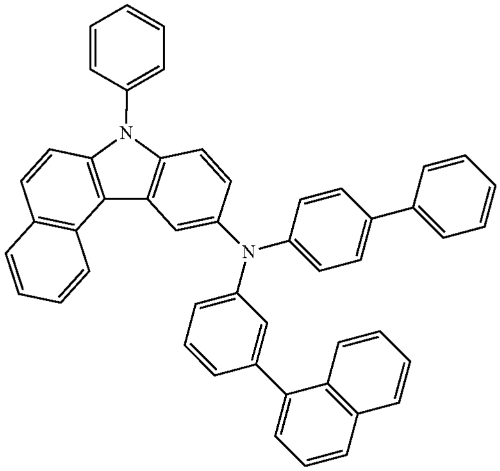
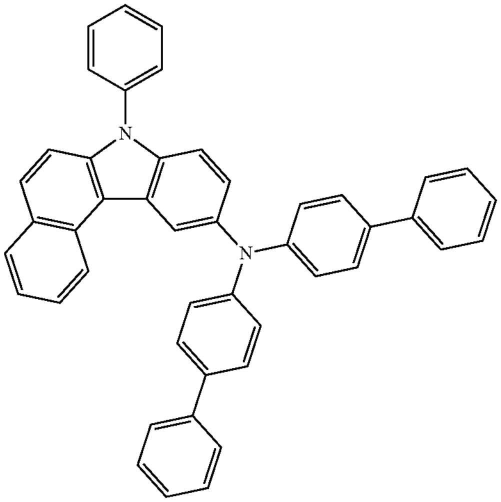
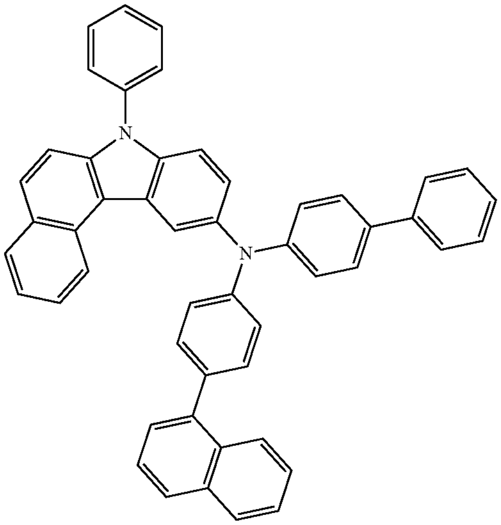

-continued
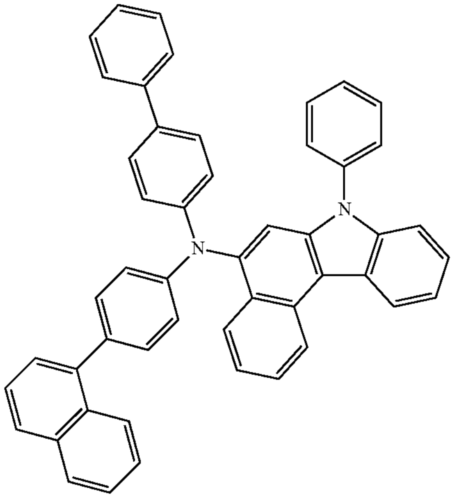
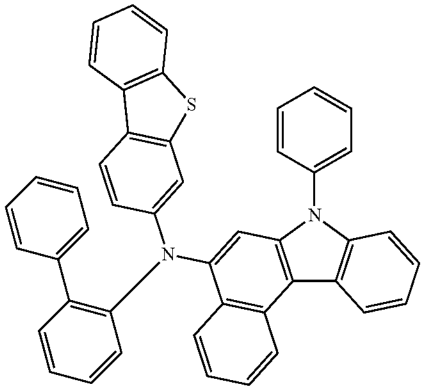
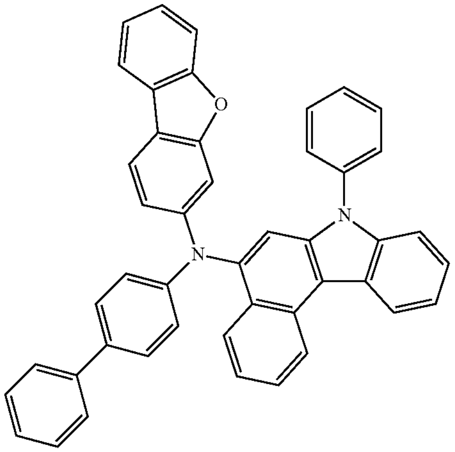
-continued
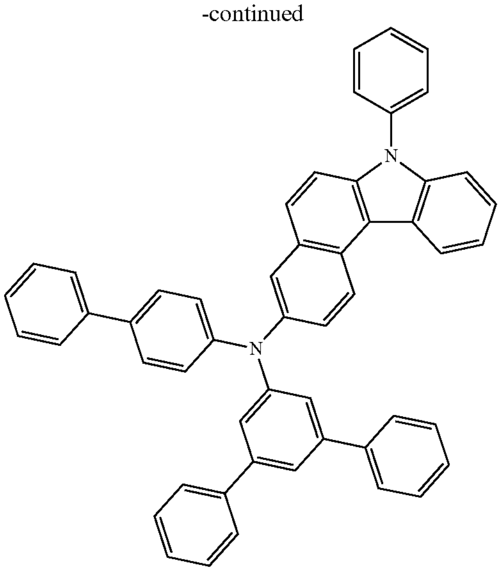
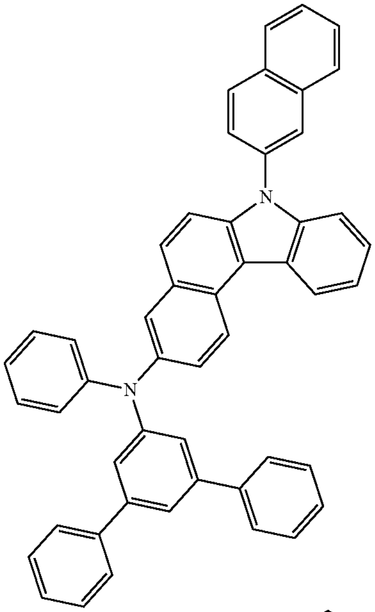
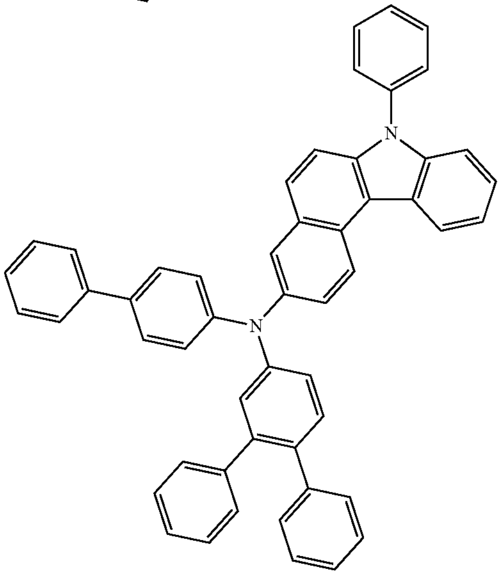

-continued
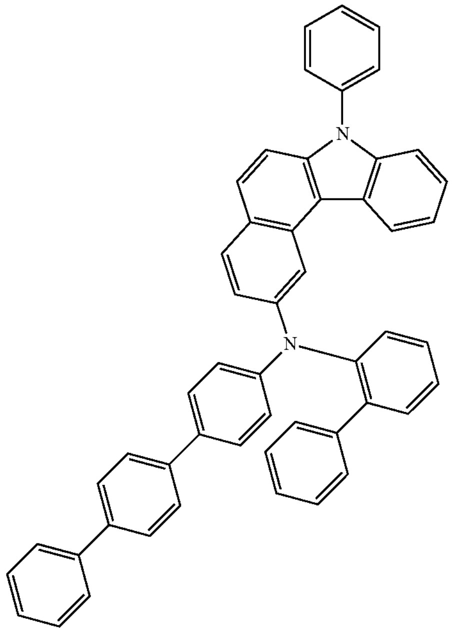
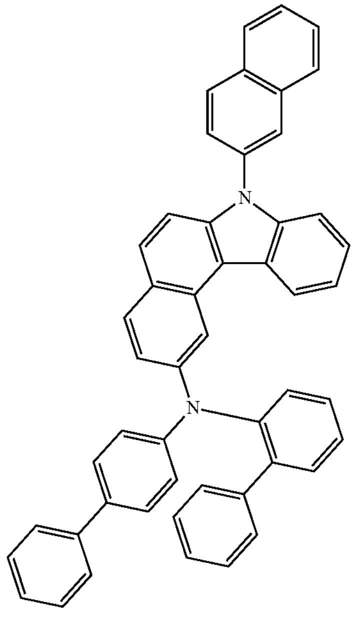
-continued
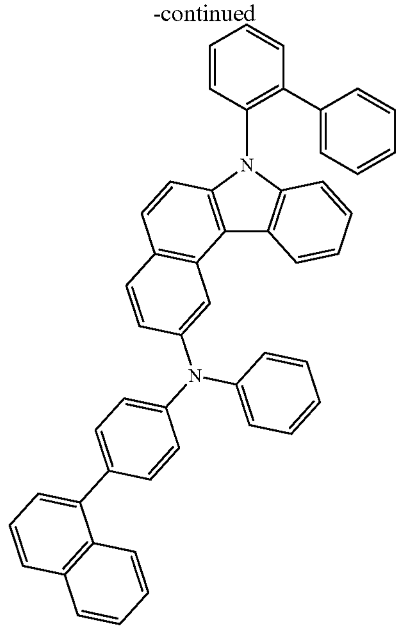
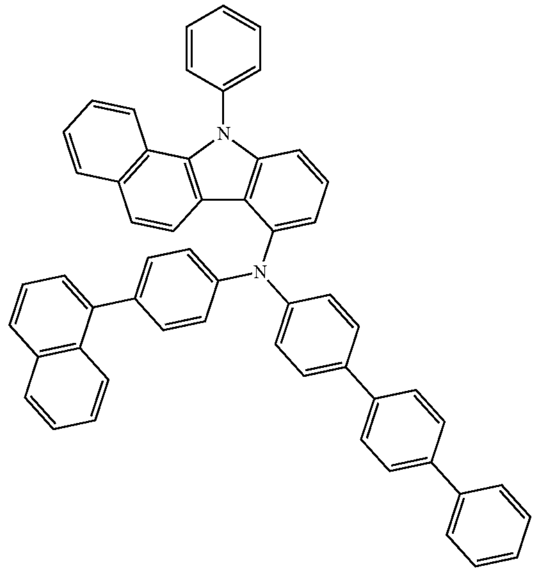
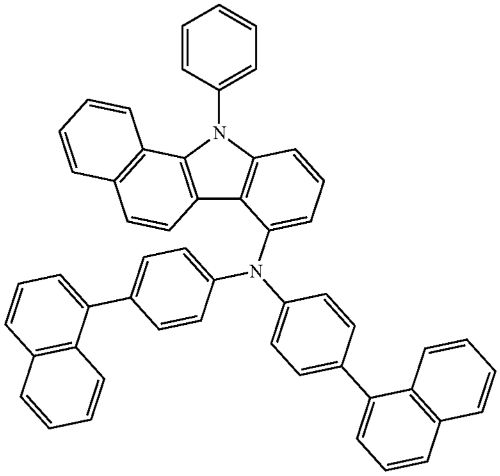

-continued
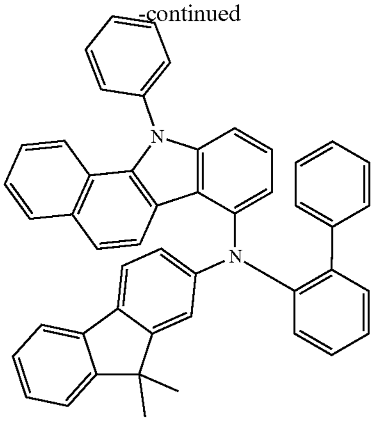
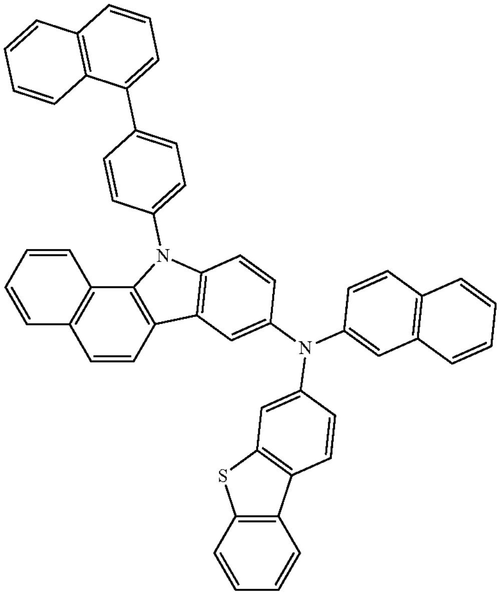
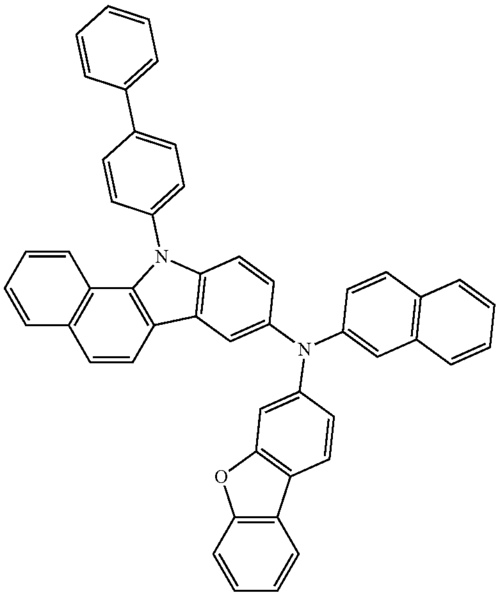
-continued
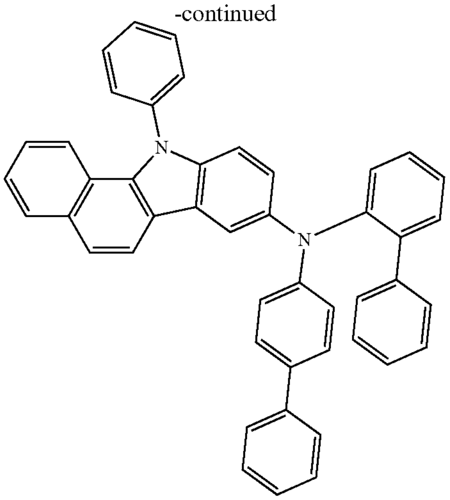
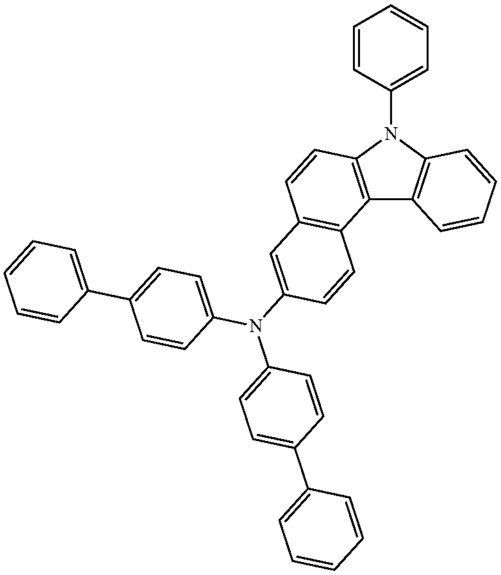
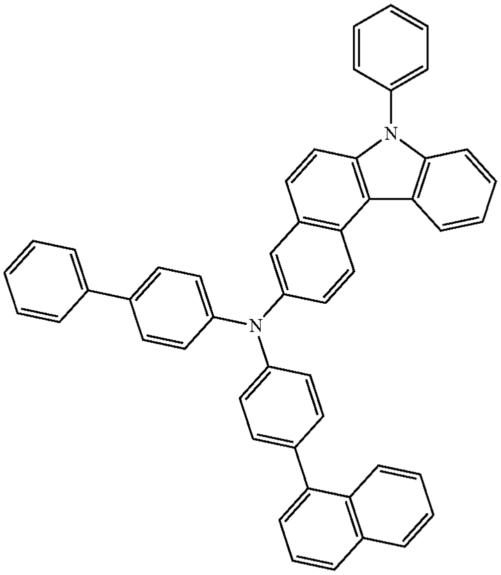

-continued
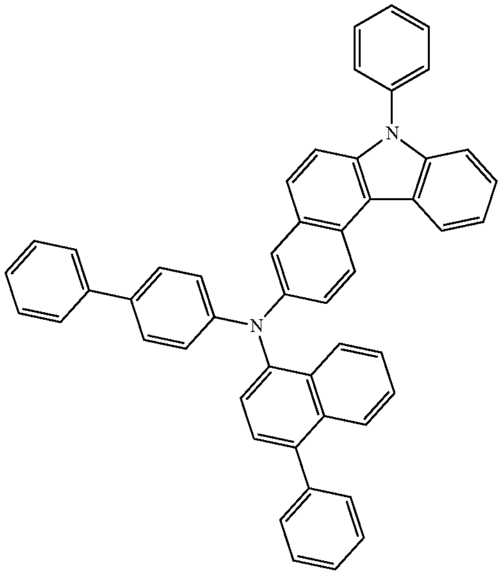
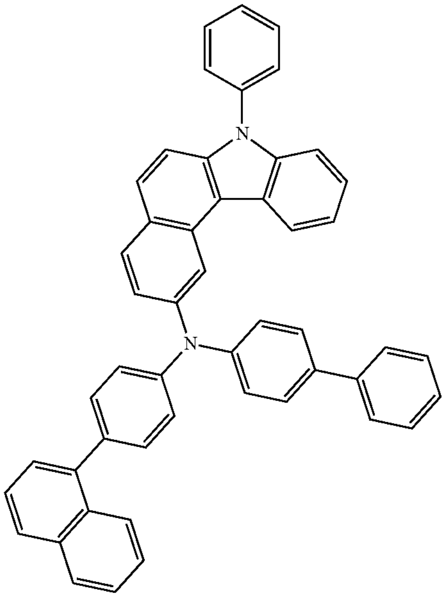
-continued
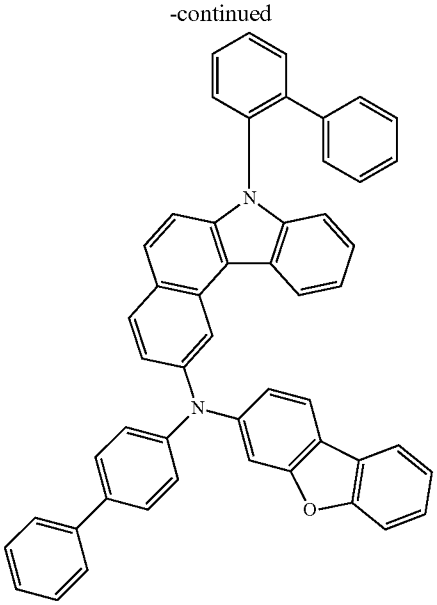
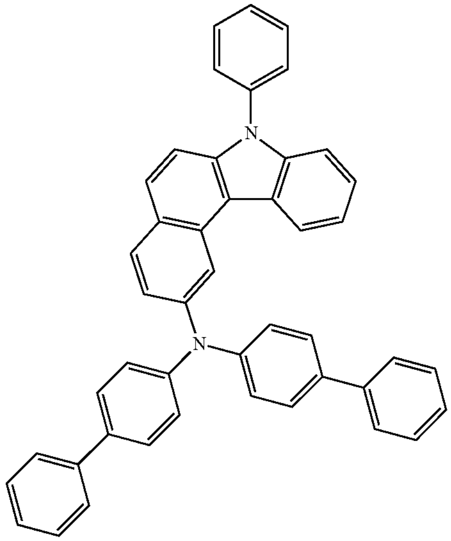
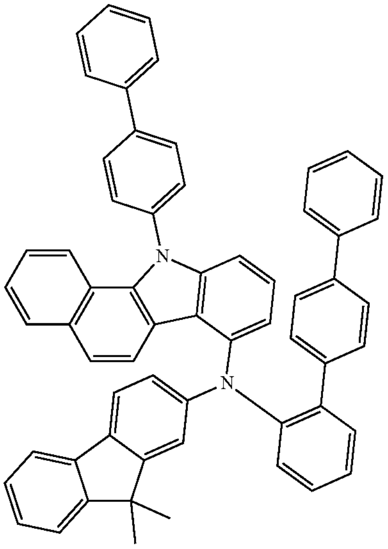

-continued
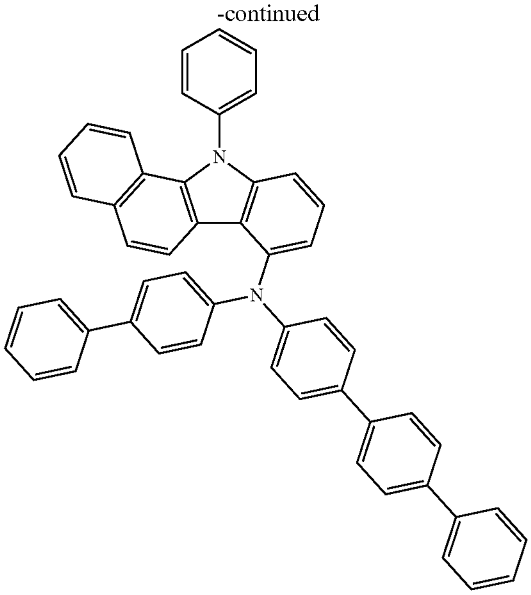
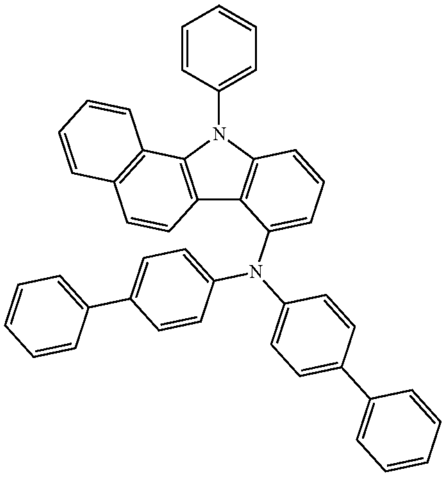
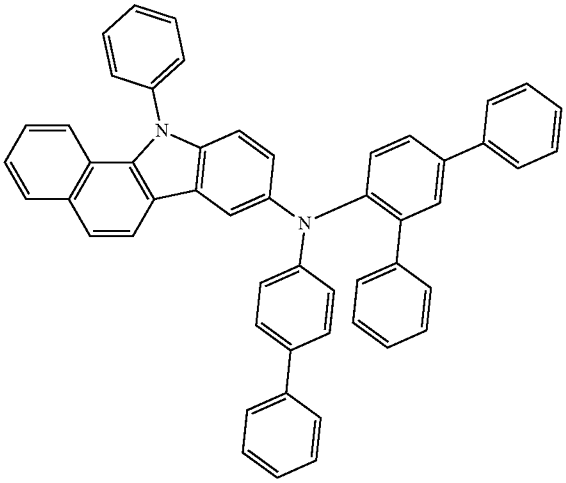
-continued
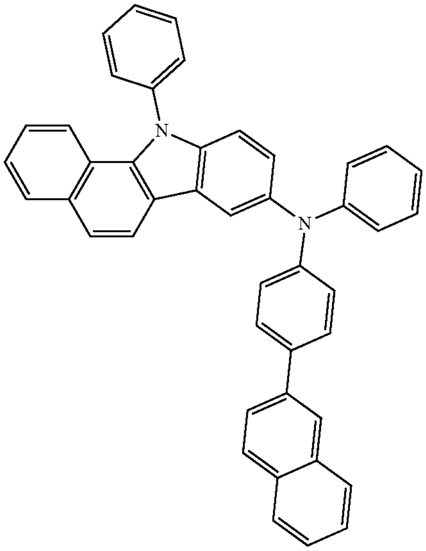
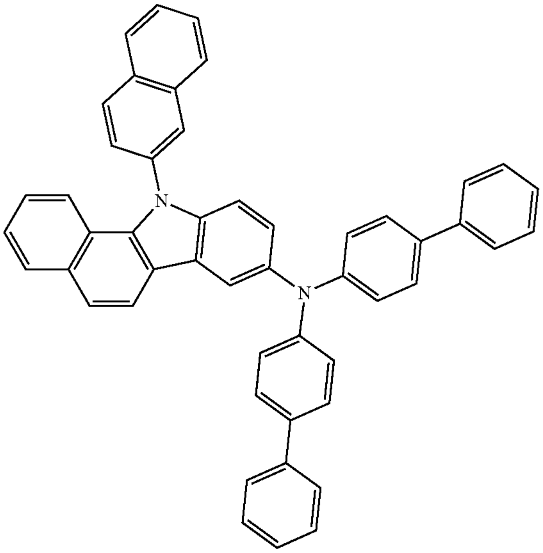

-continued
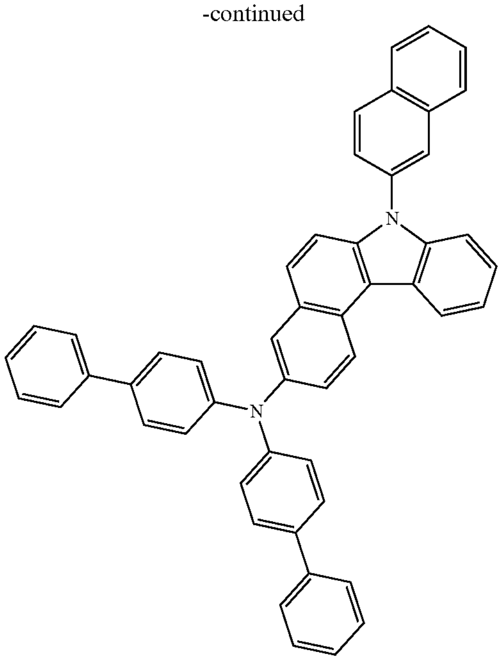
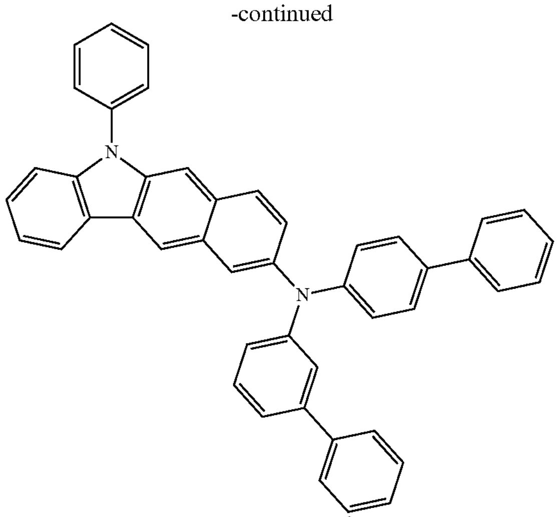
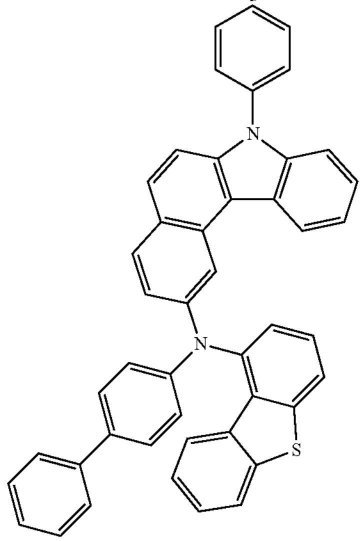
-continued
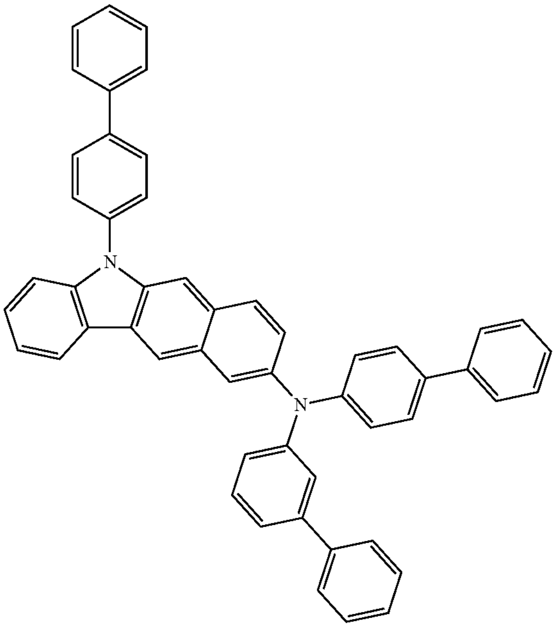
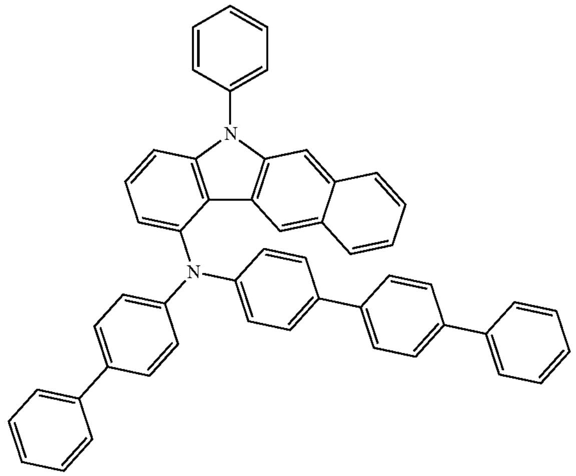

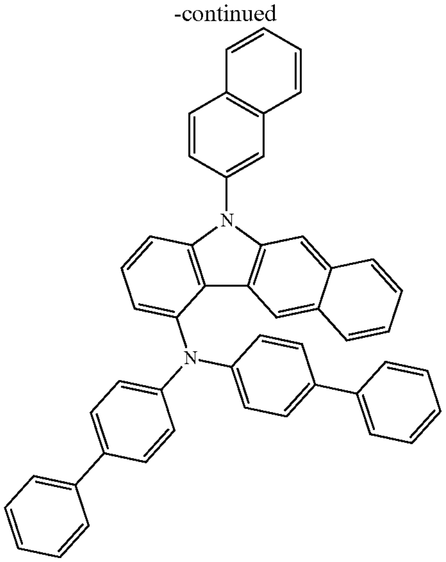
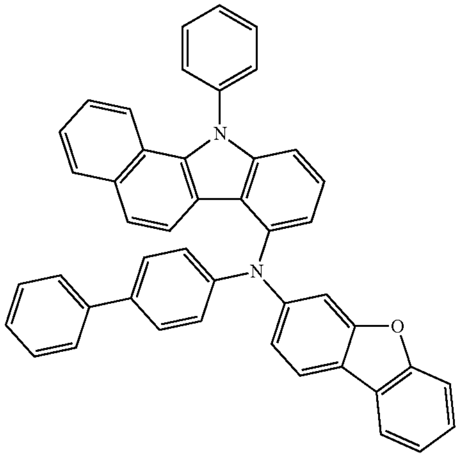
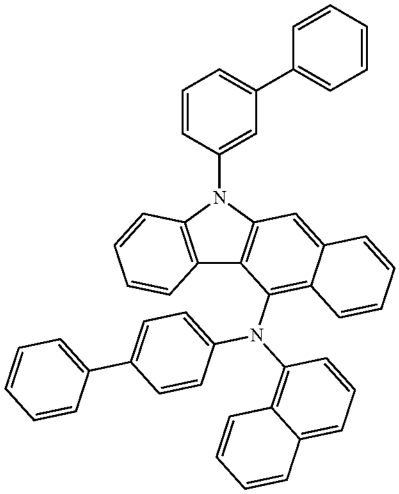
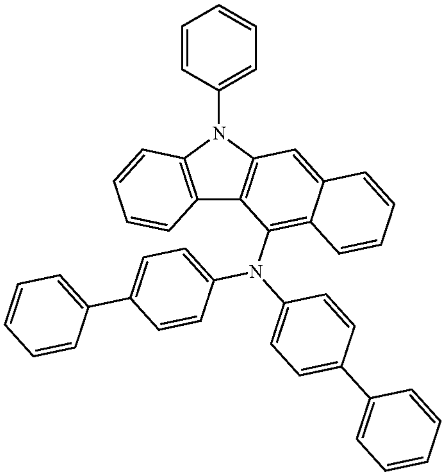
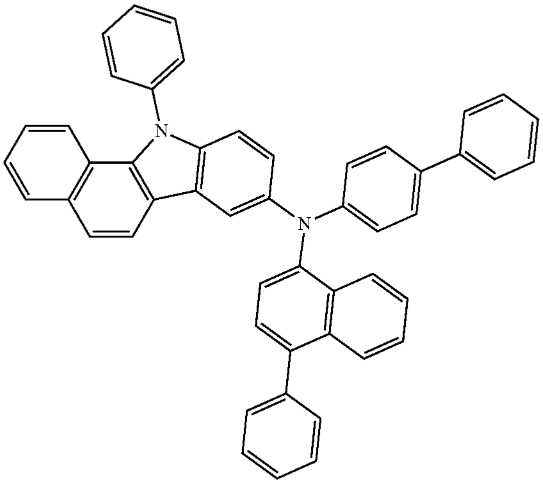
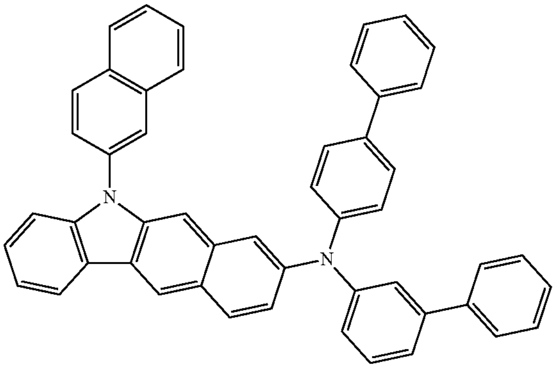
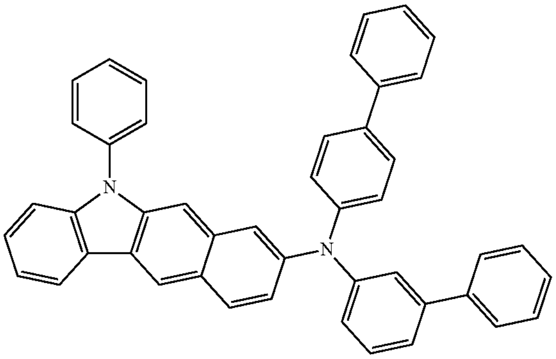

-continued
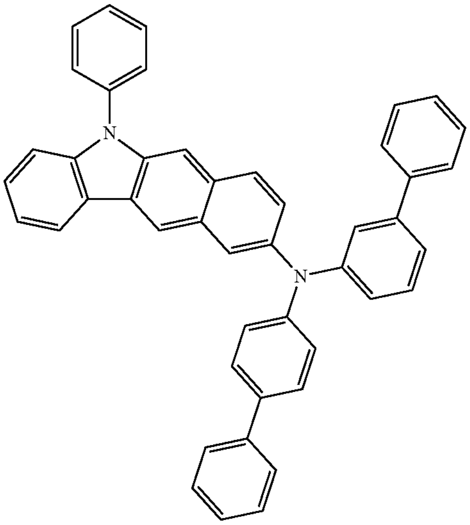
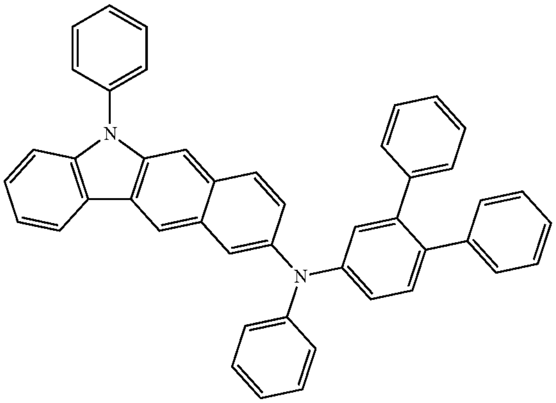
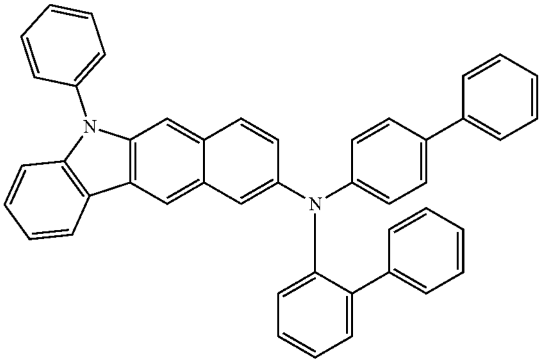
-continued
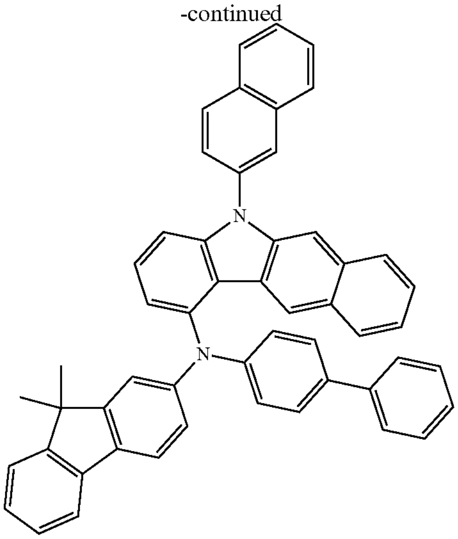
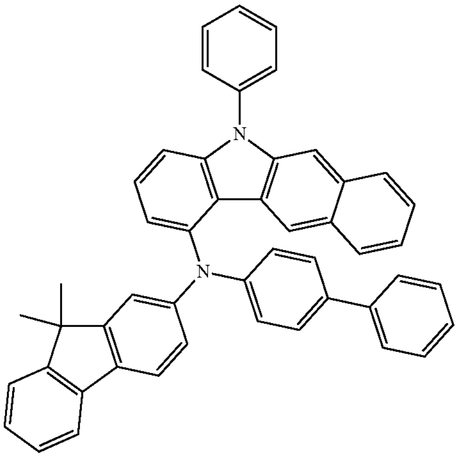
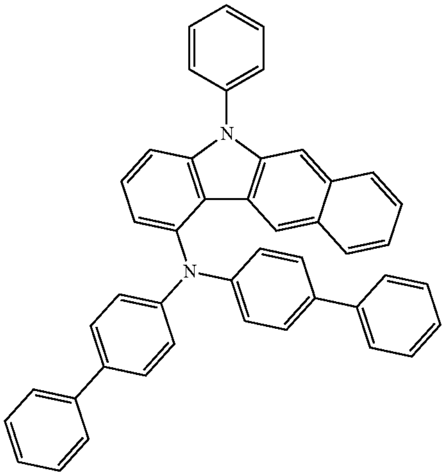

-continued
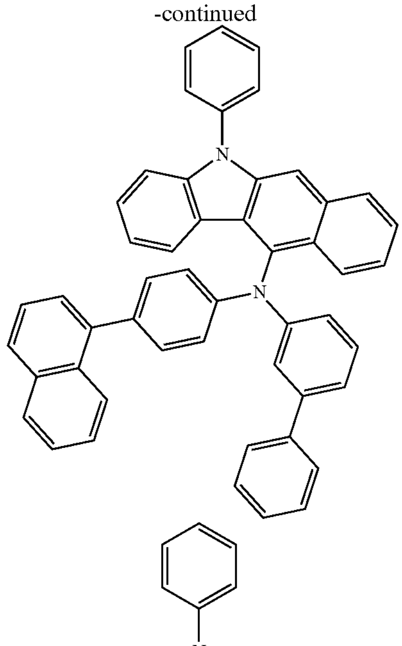
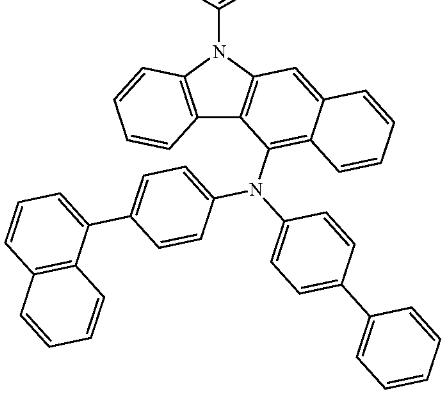
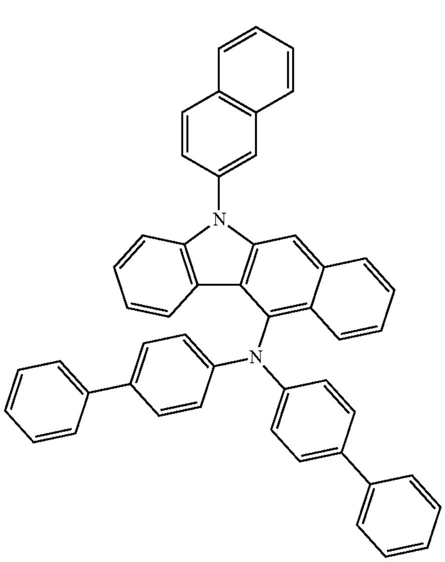
-continued
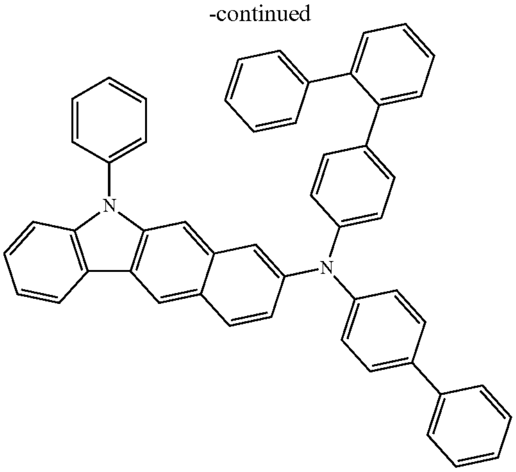
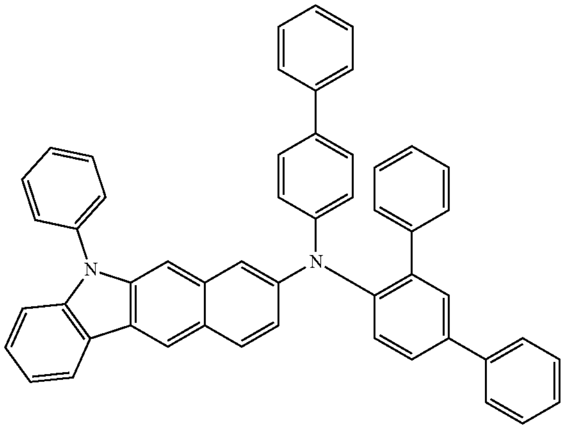
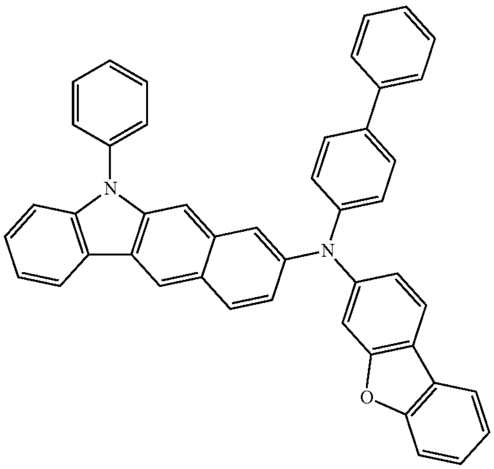

-continued
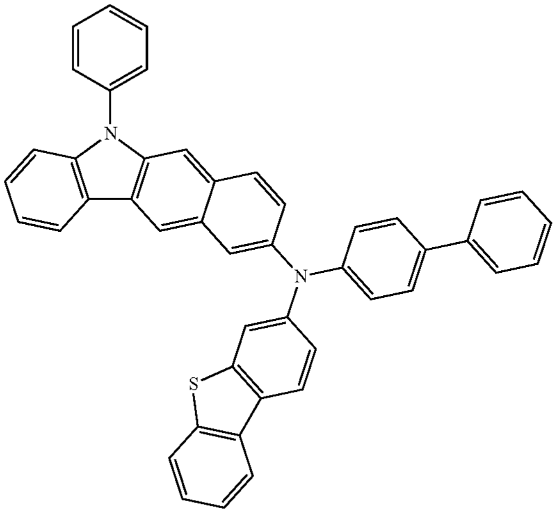
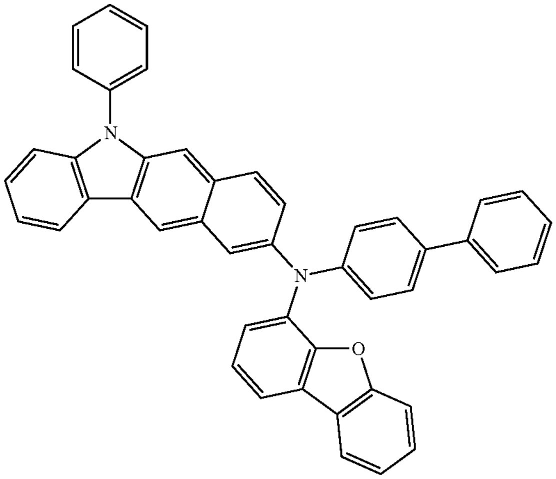
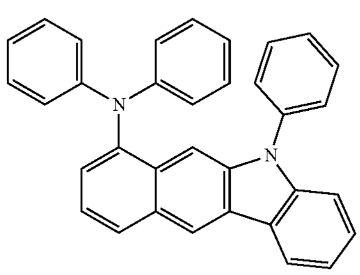
-continued
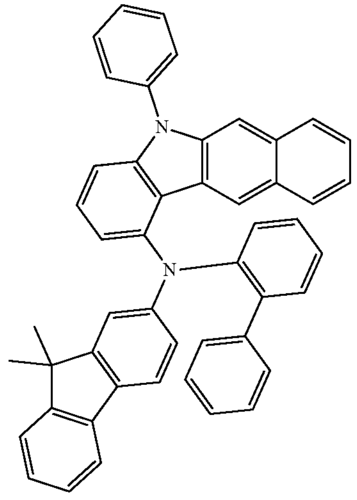
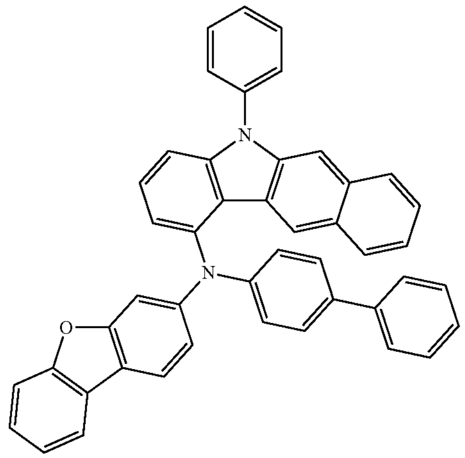
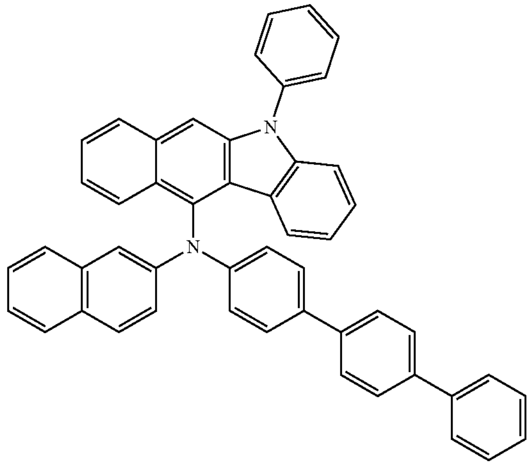

-continued
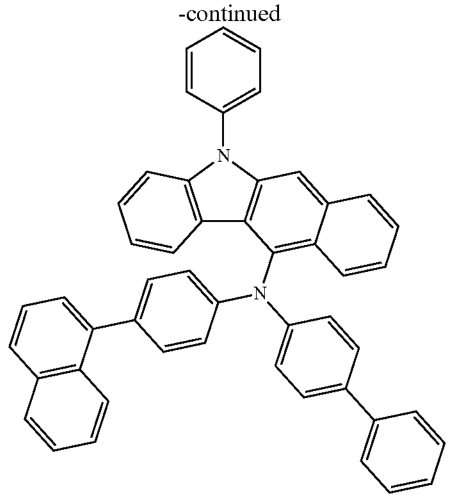
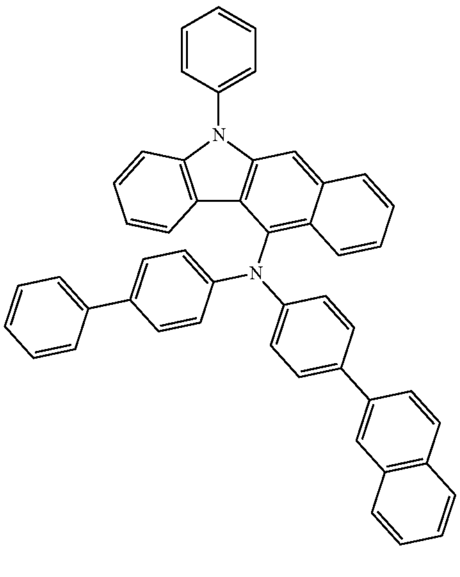
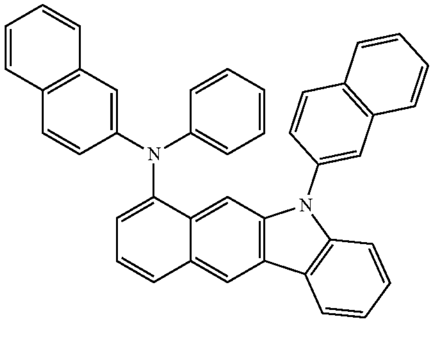
-continued
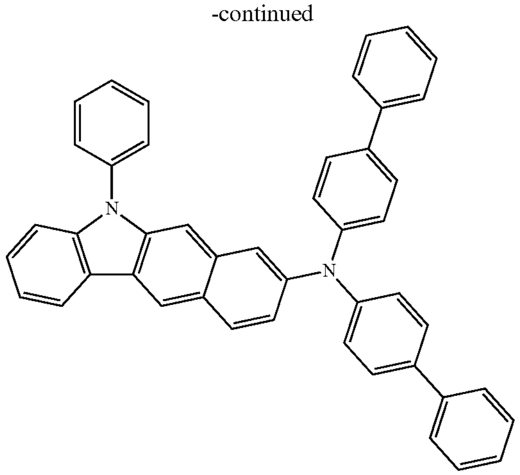
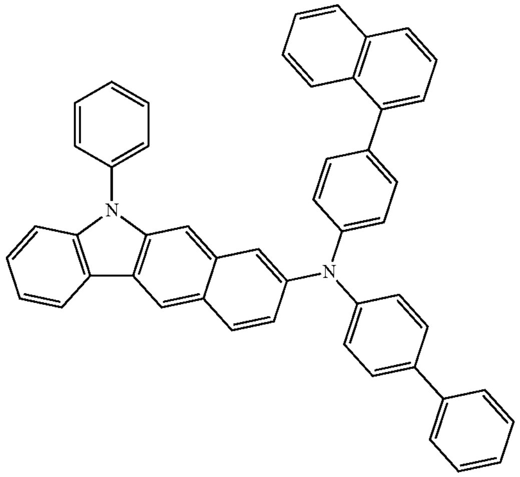
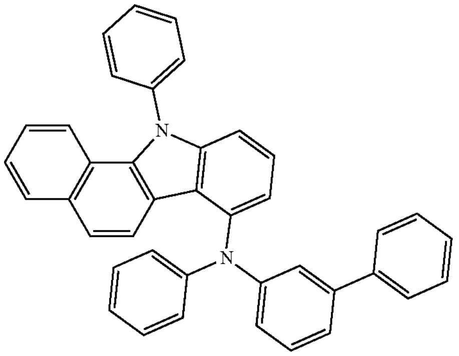
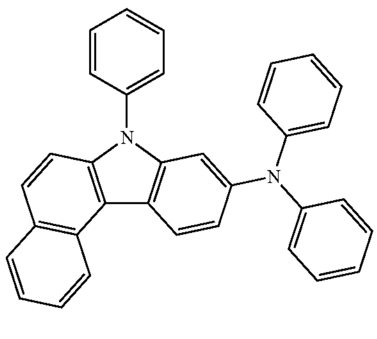

-continued
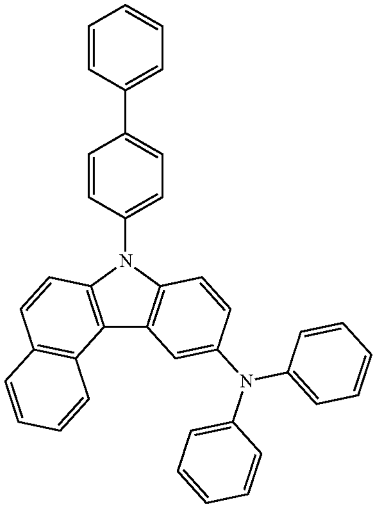
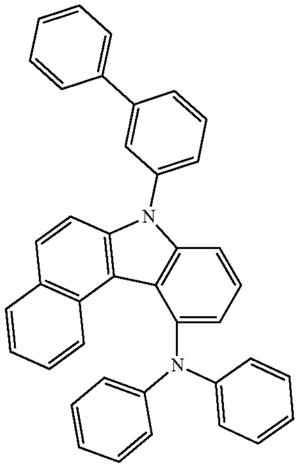
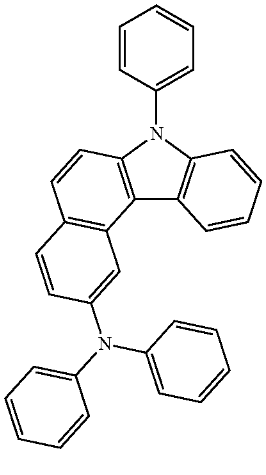
-continued
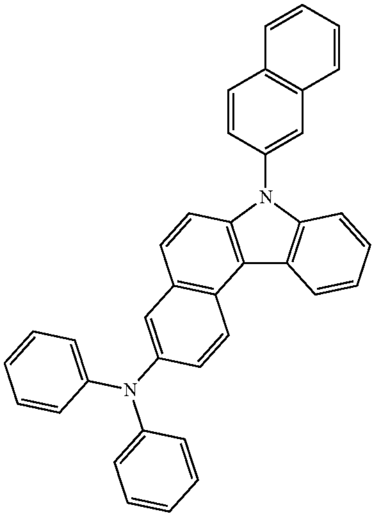
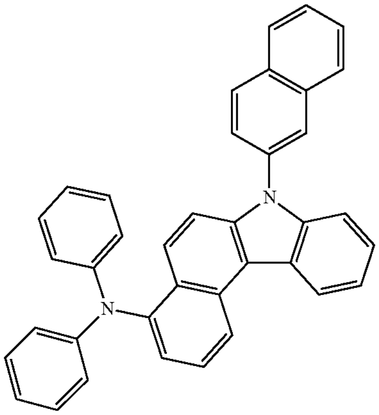
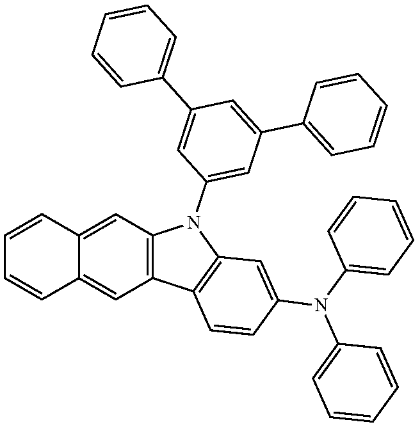

-continued
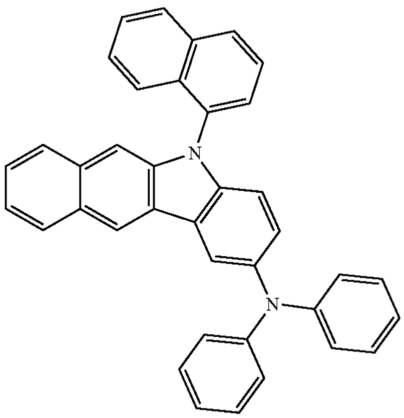
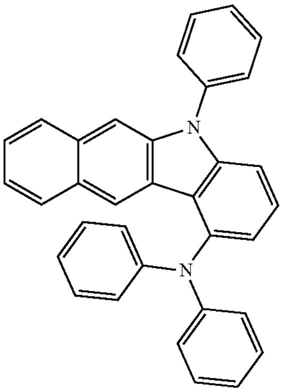
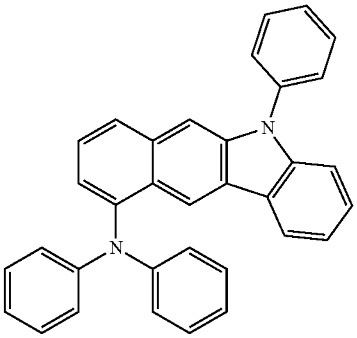
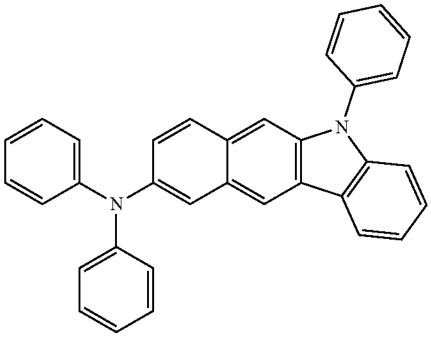
-continued
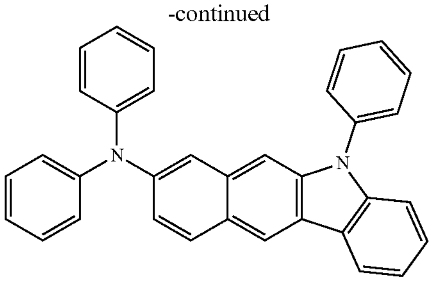
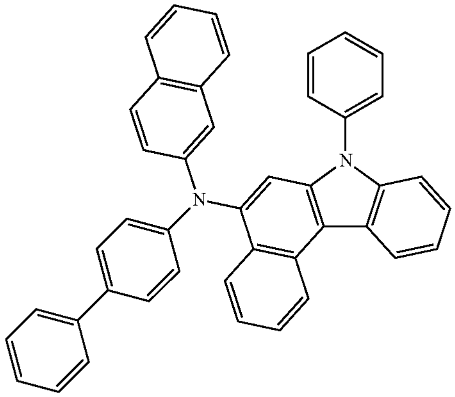
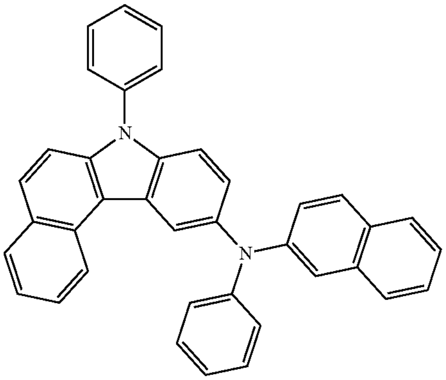
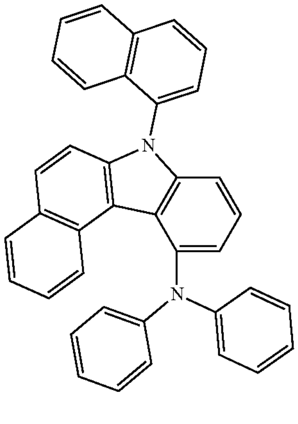

-continued
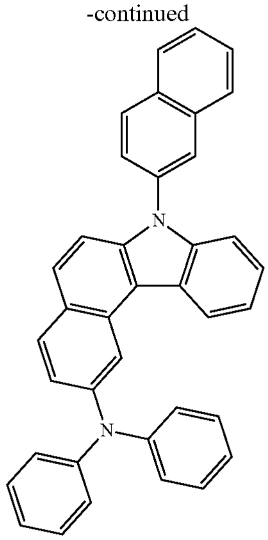
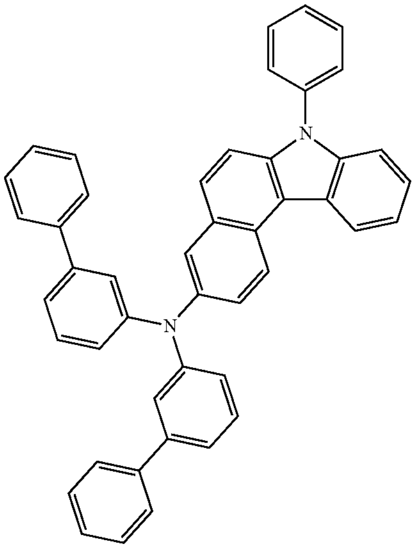
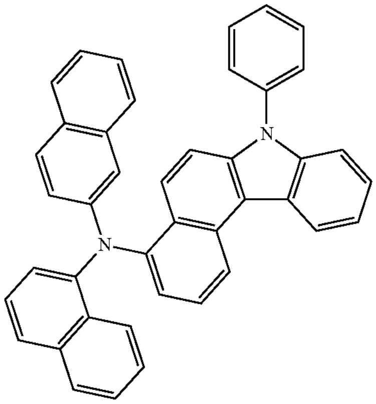
-continued
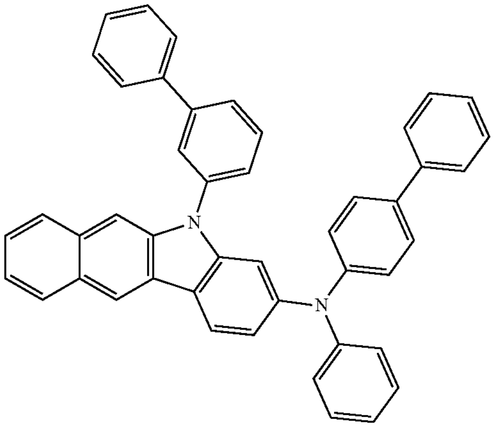
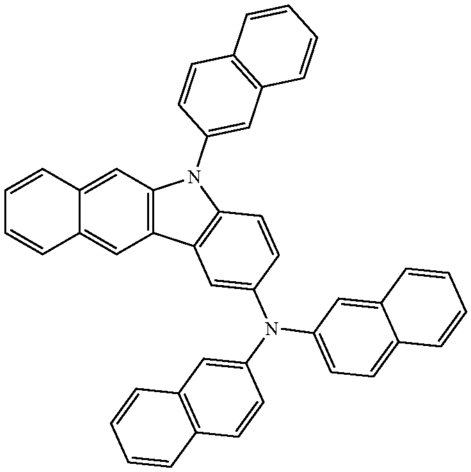
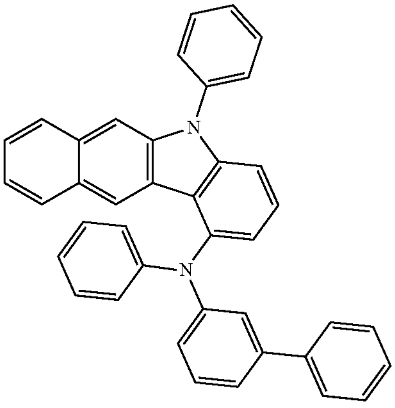

-continued
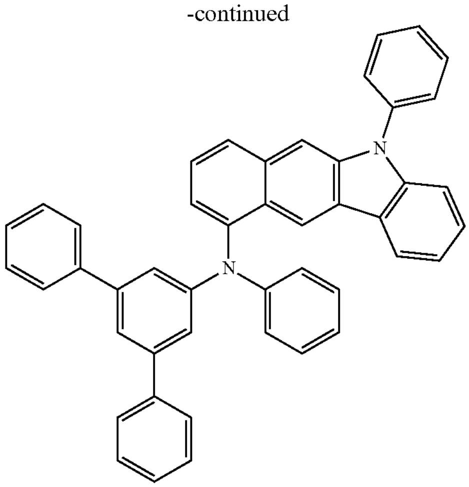
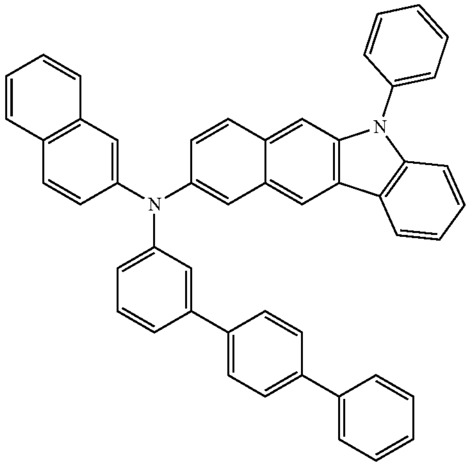
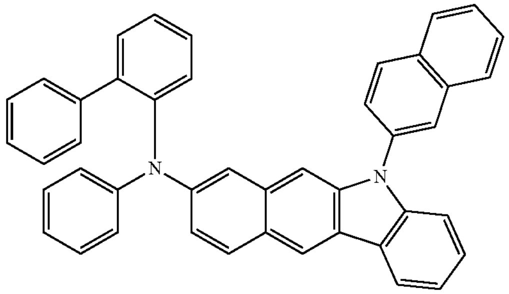
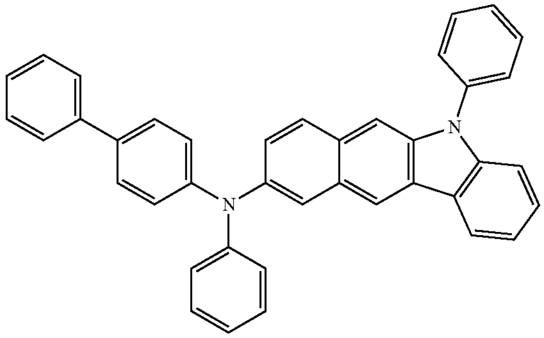
-continued
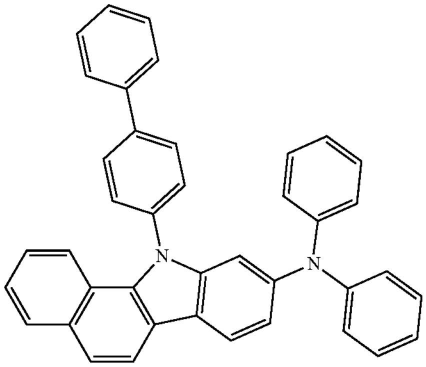
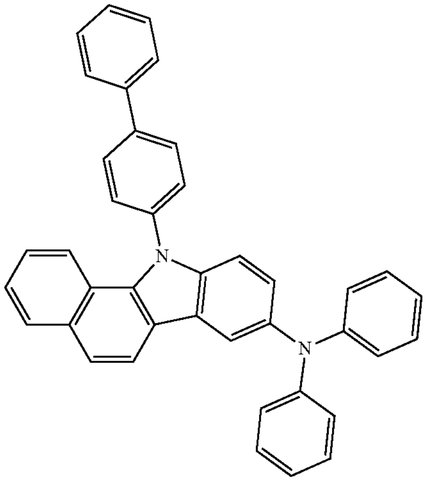
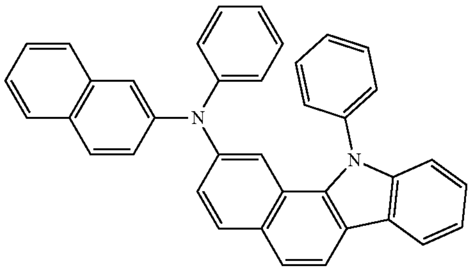
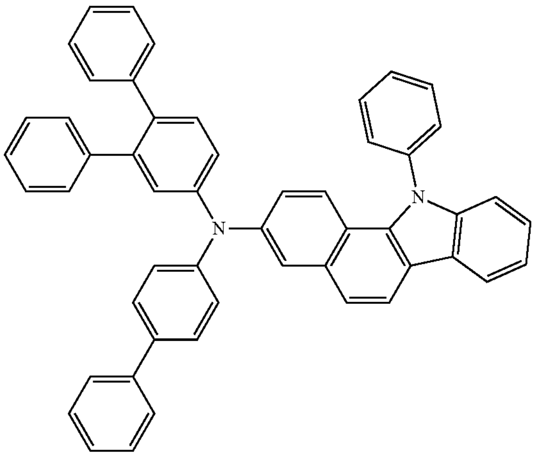

-continued
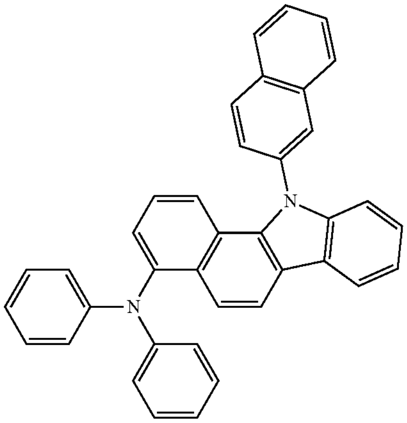
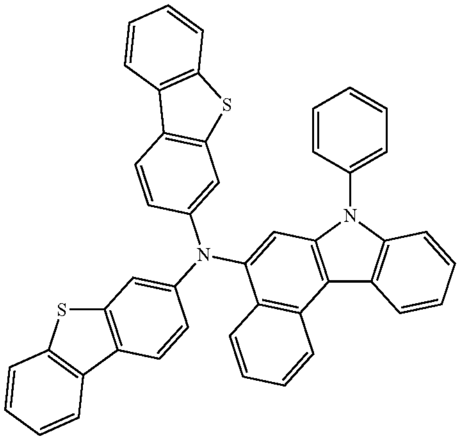
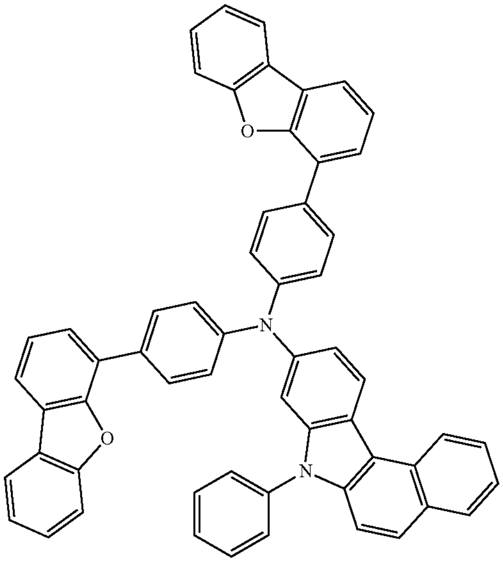
-continued
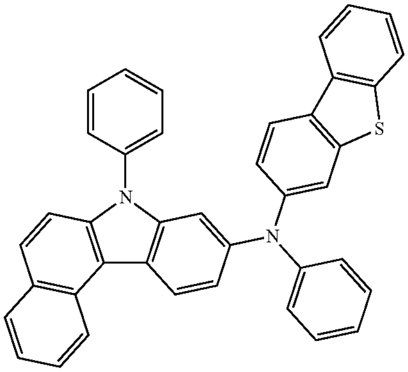
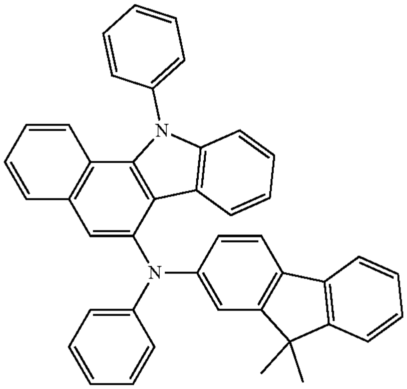
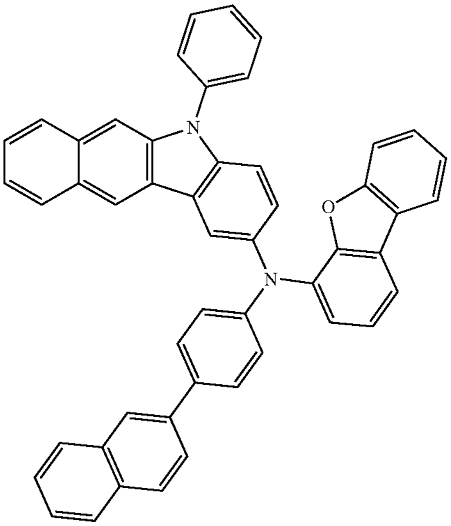

-continued
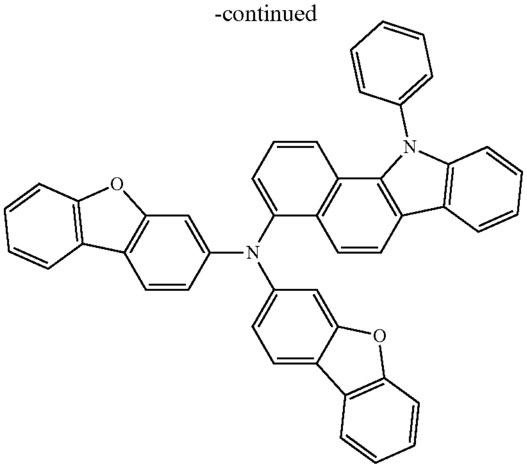
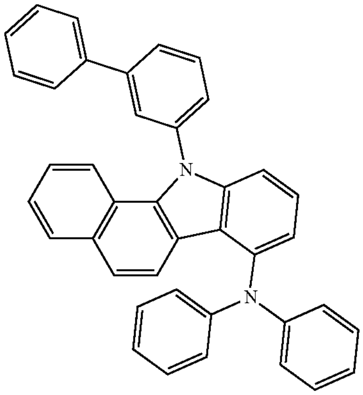
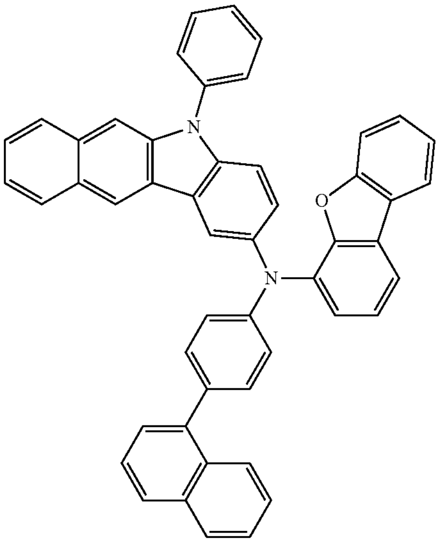
-continued
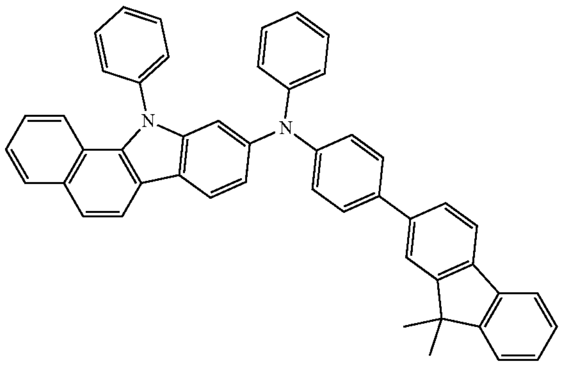
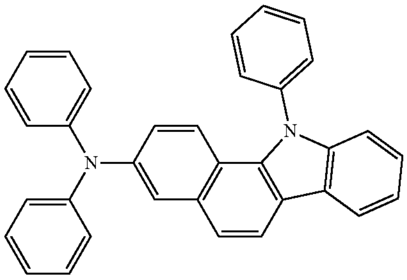
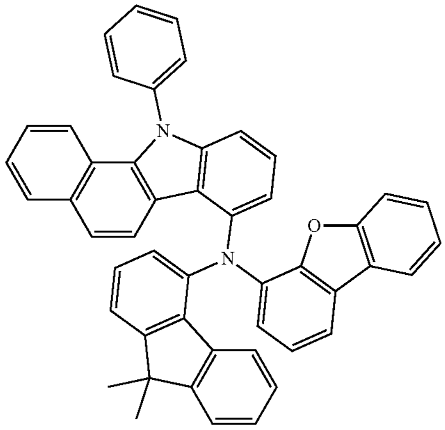
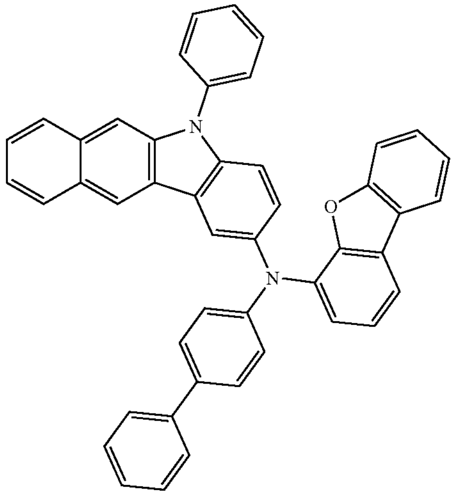

-continued
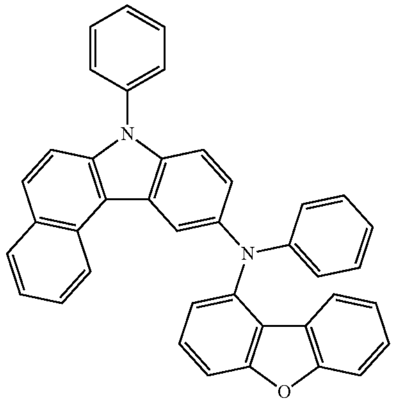
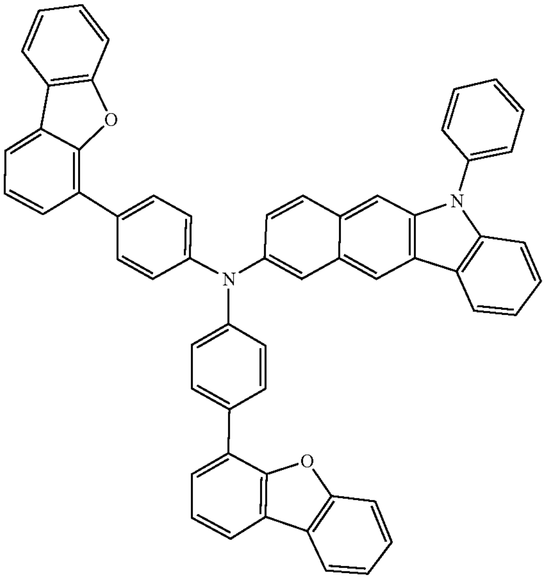
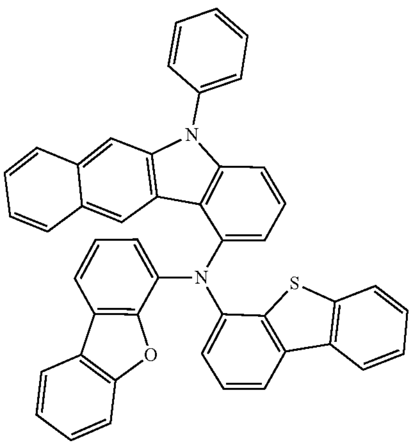
-continued
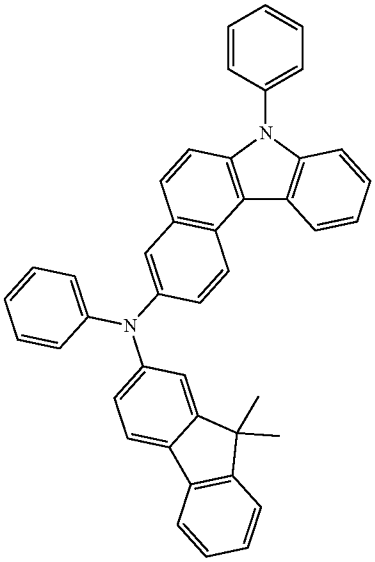
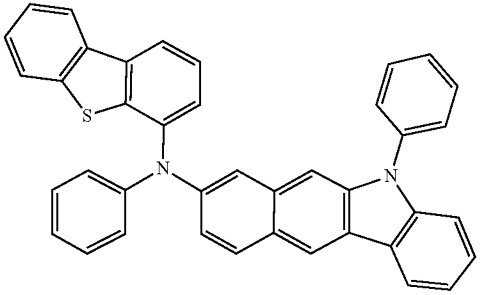
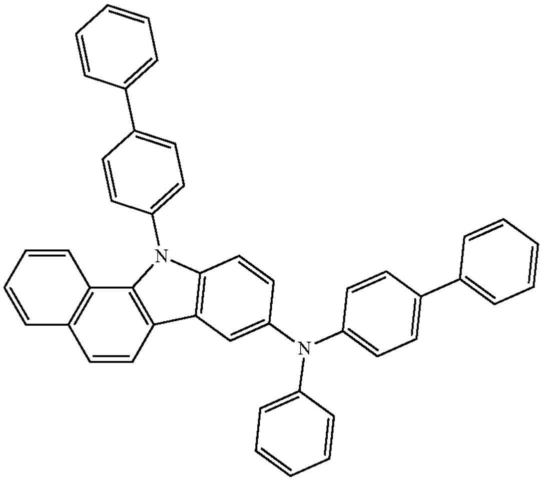
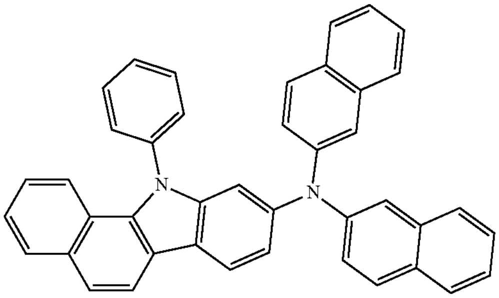

-continued
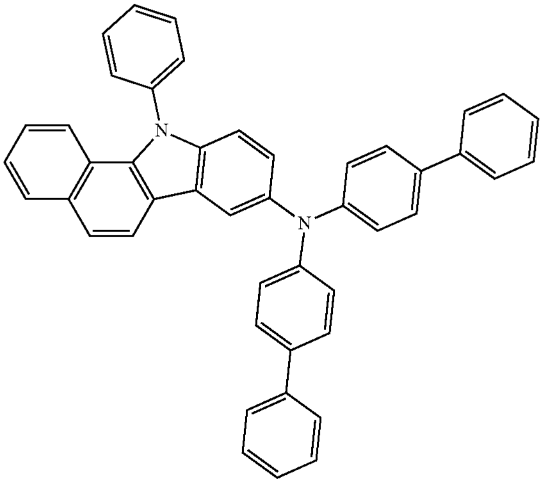
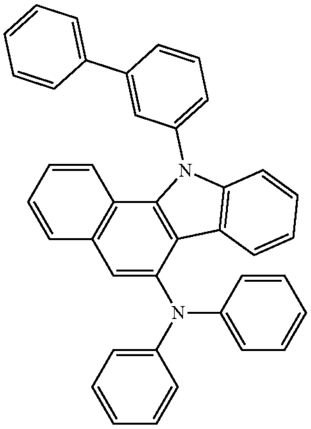
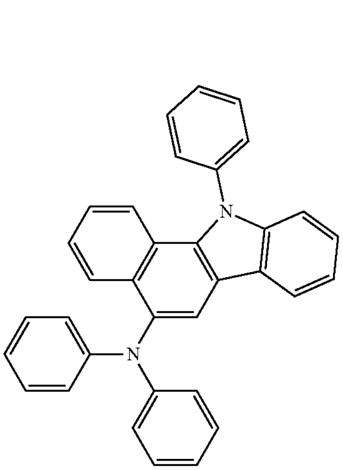
-continued
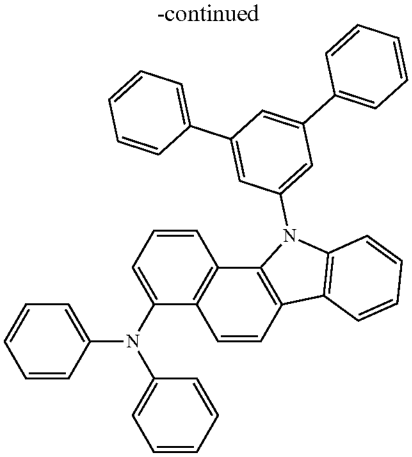
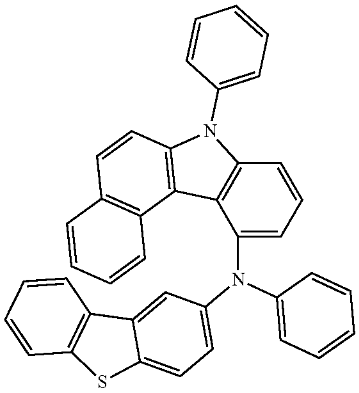
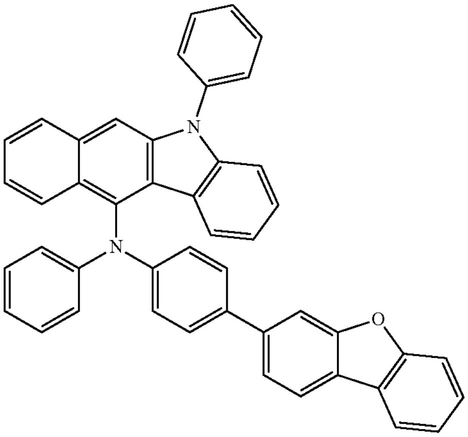
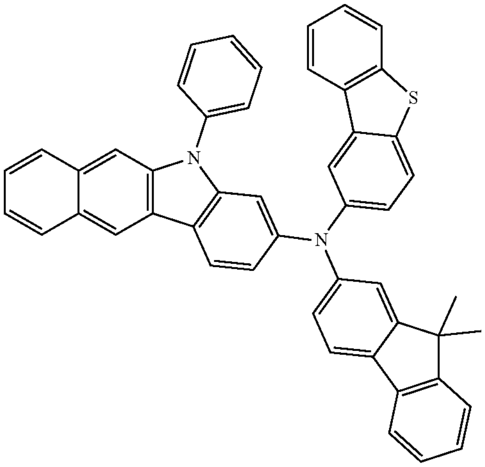

-continued
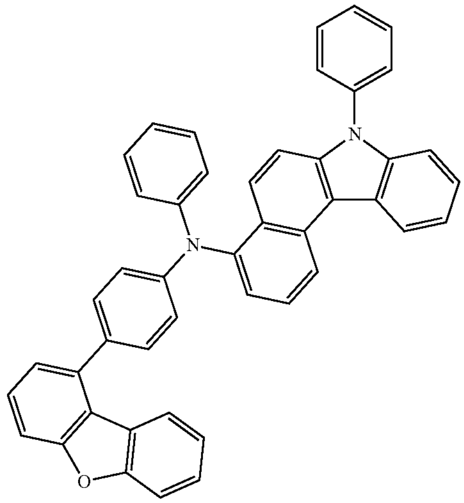
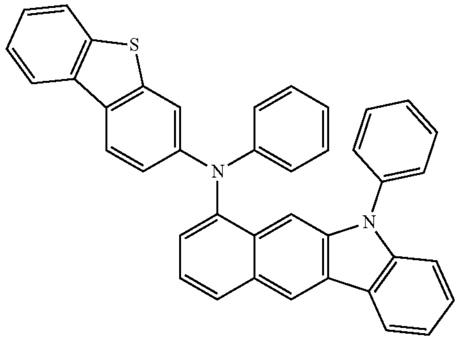
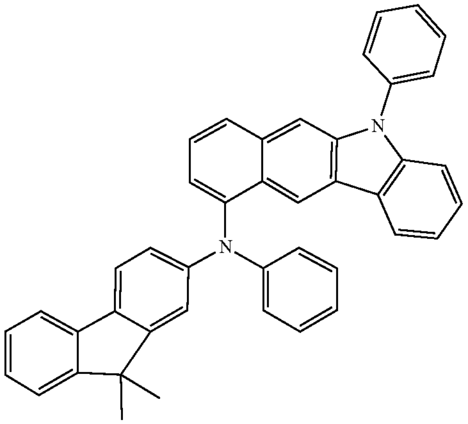
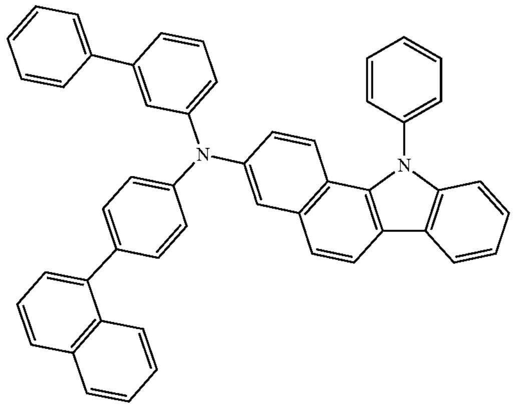
-continued
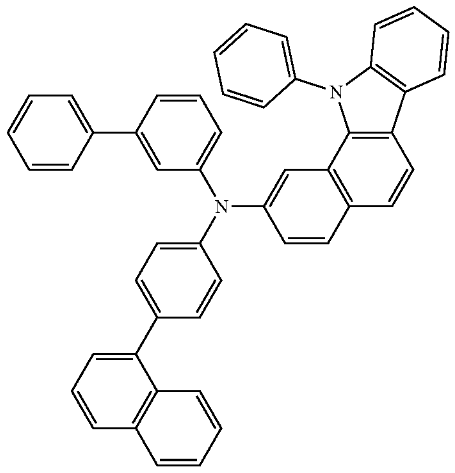
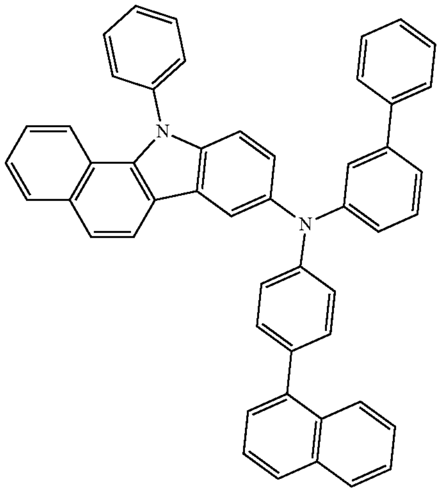
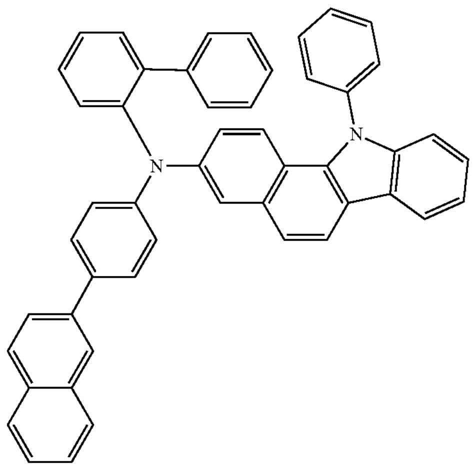
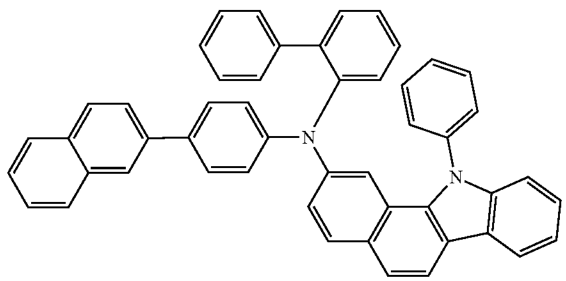

-continued
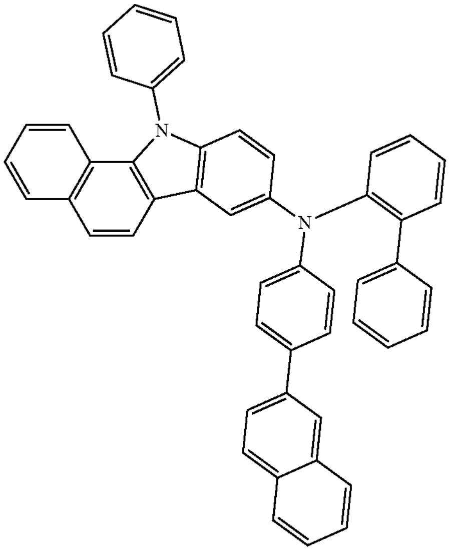
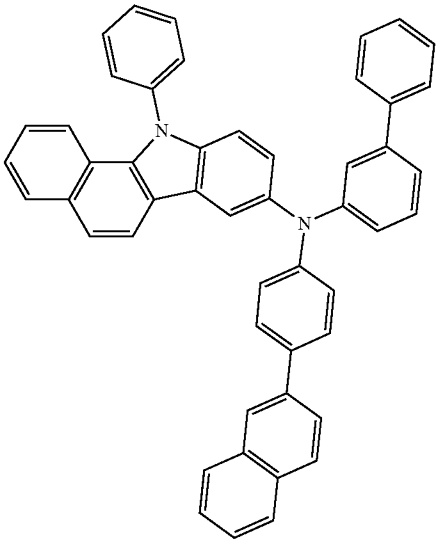
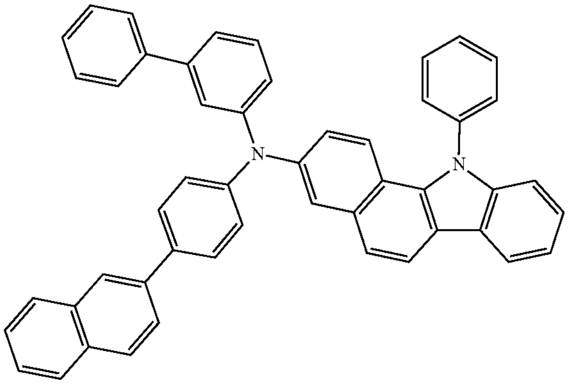
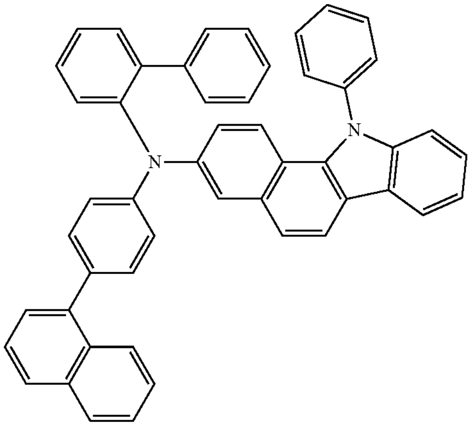
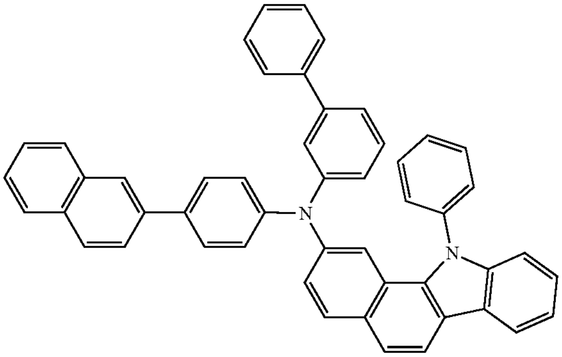
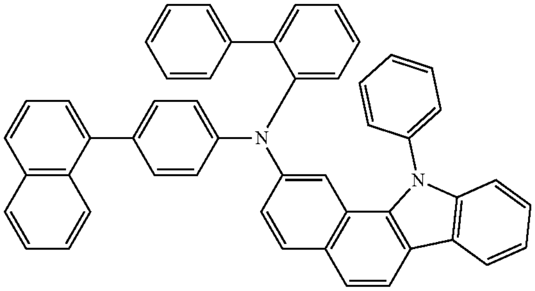
-continued -continued
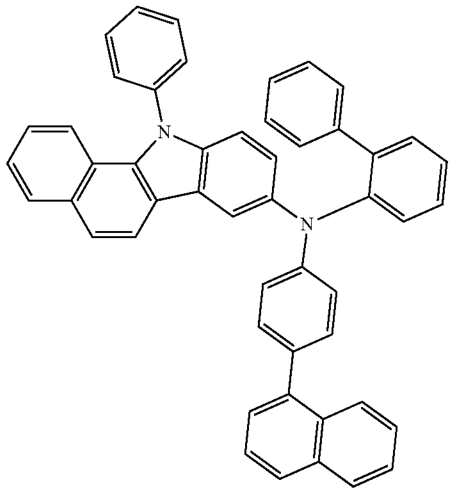
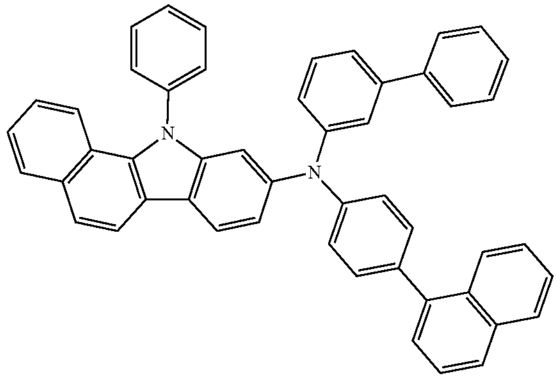
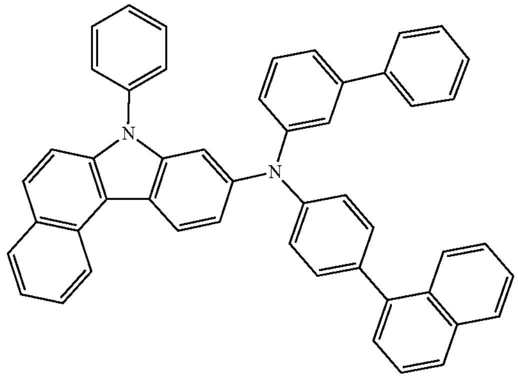
-continued
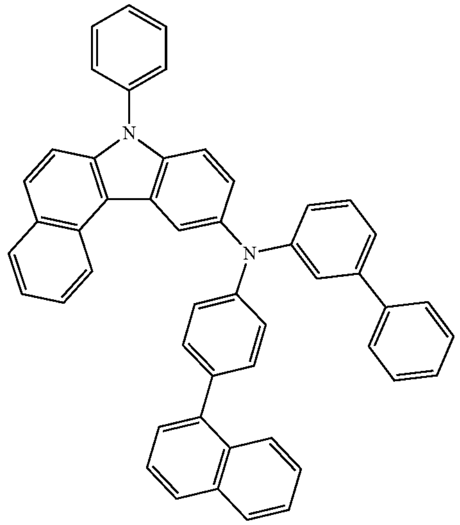
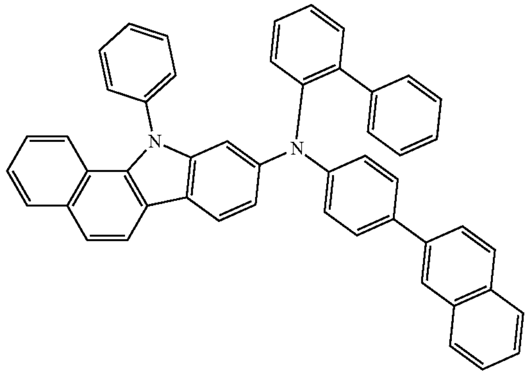
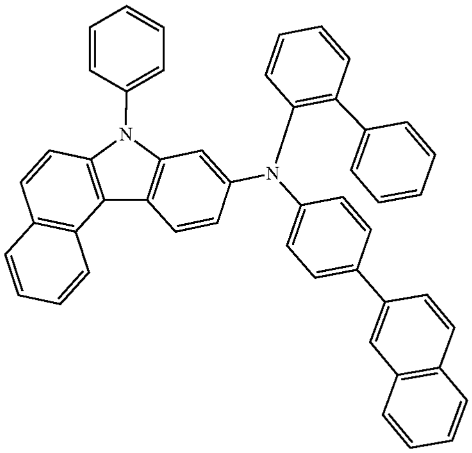

-continued
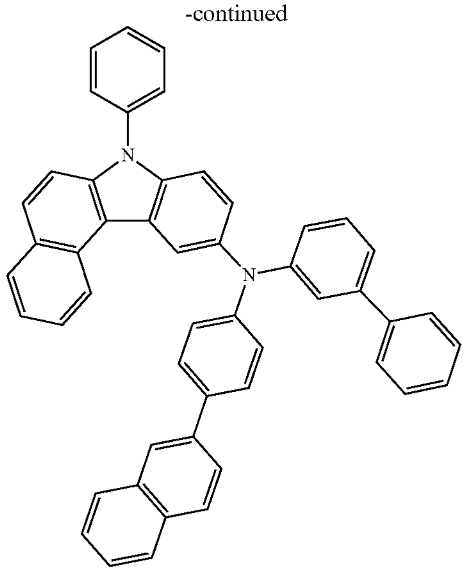
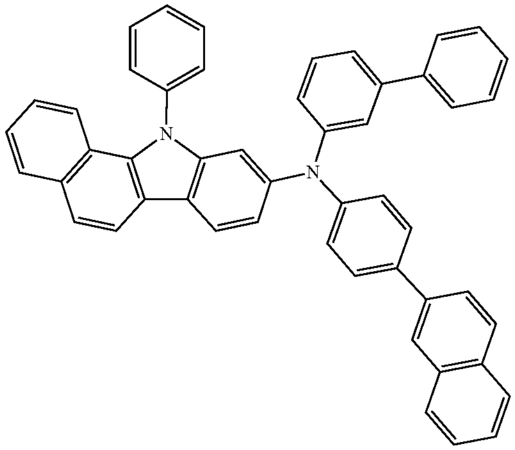
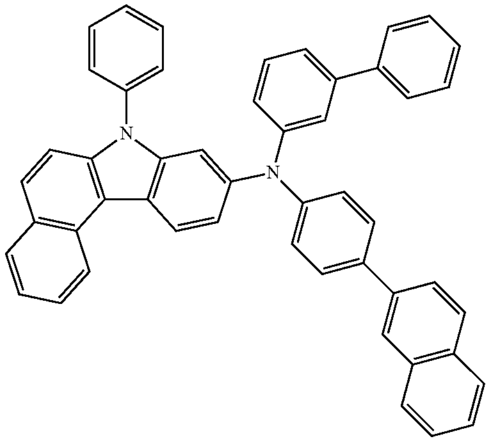
-continued
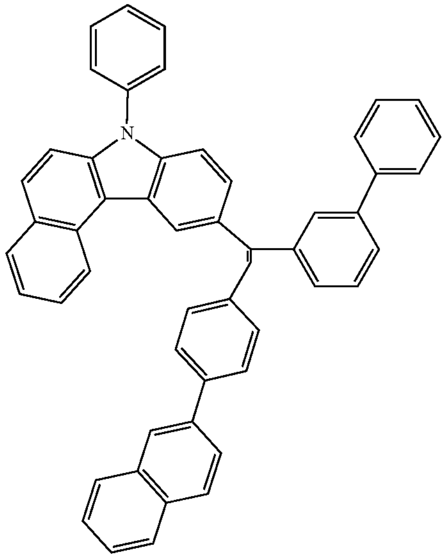
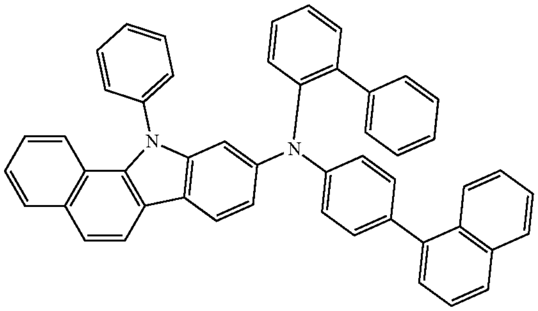
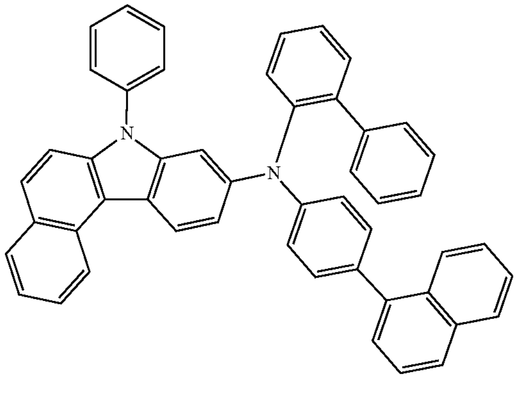

-continued
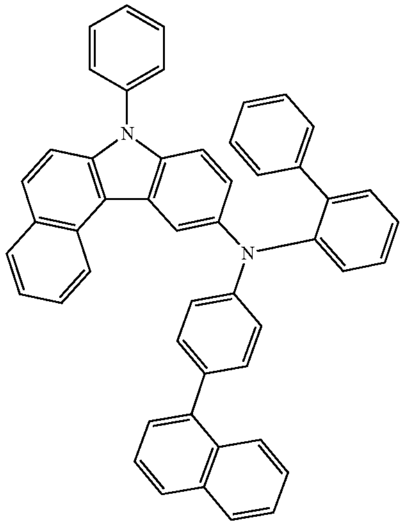
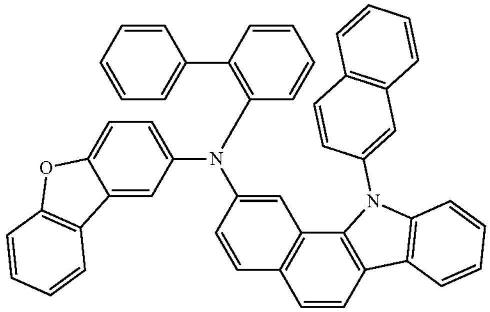
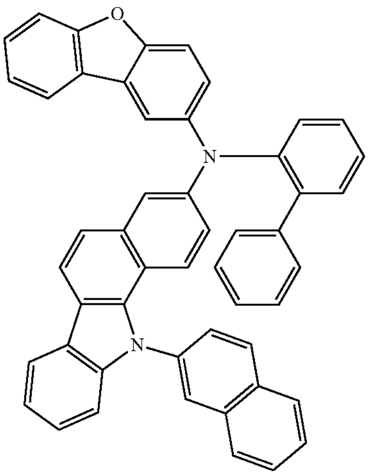
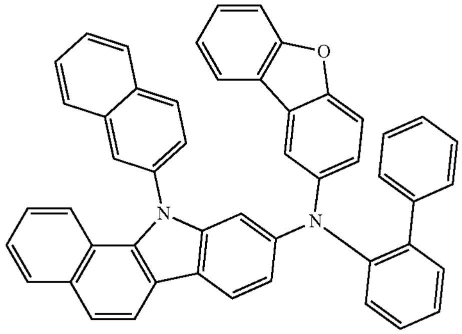
-continued
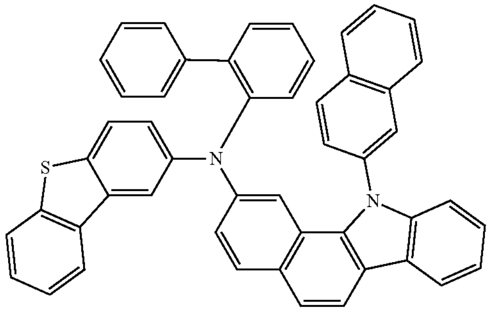
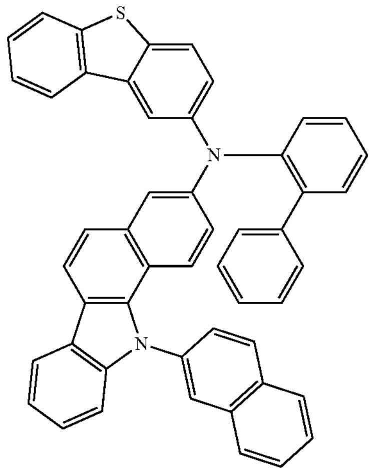
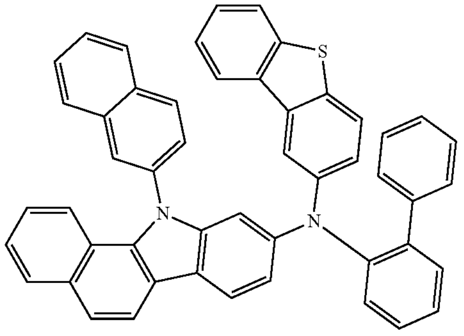
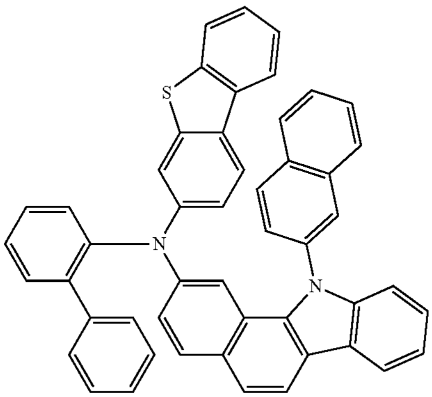

-continued
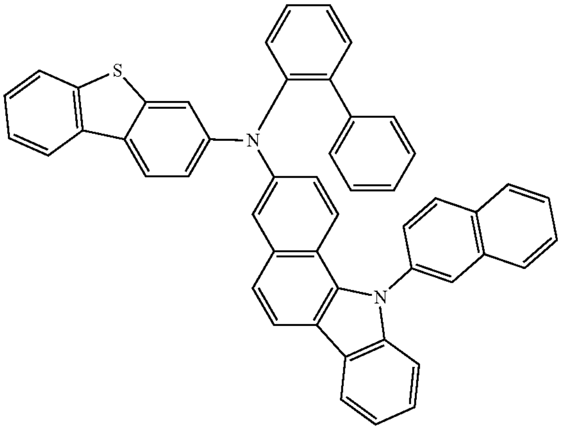
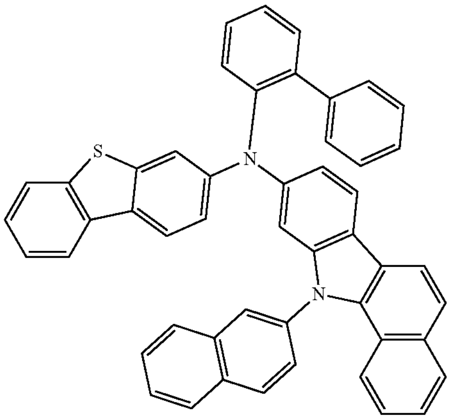
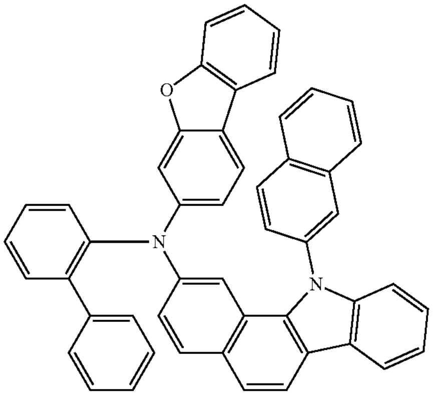
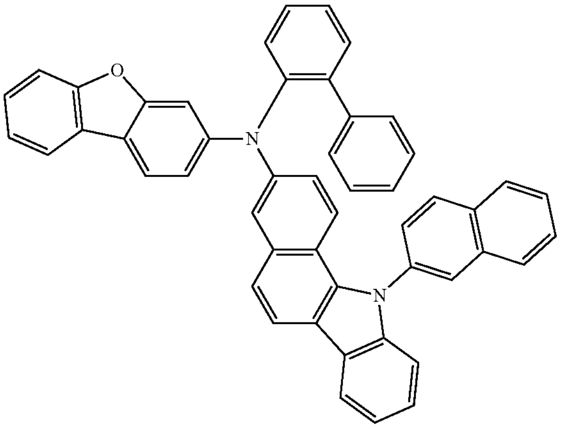
-continued
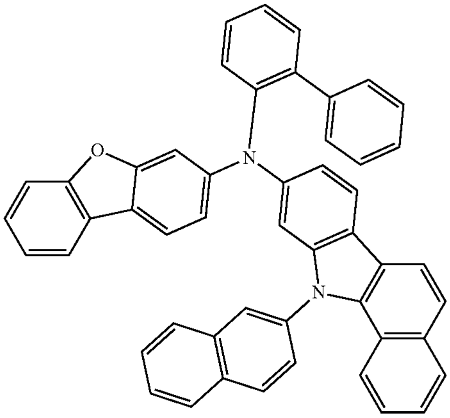
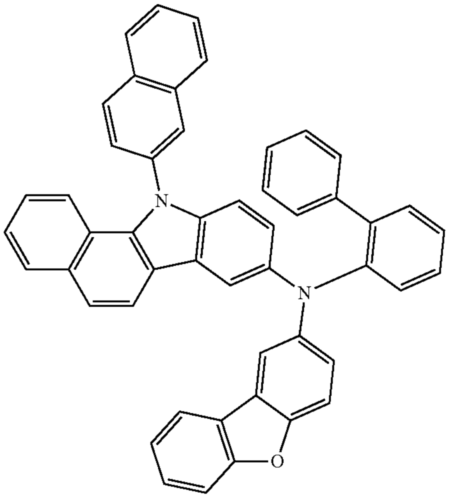
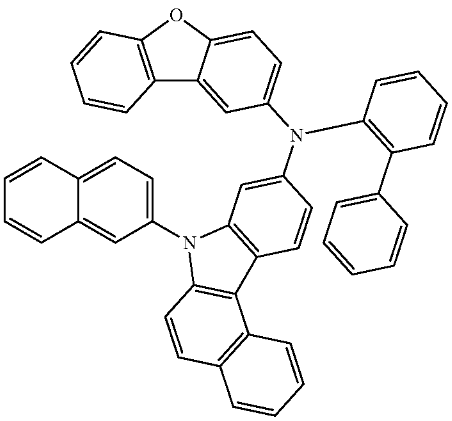

-continued
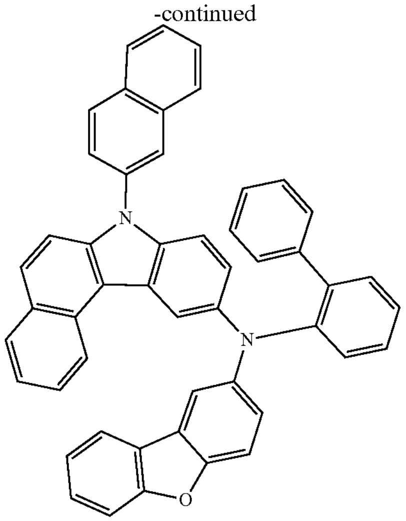
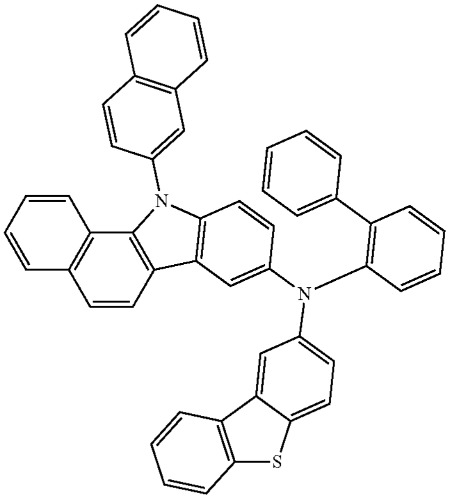
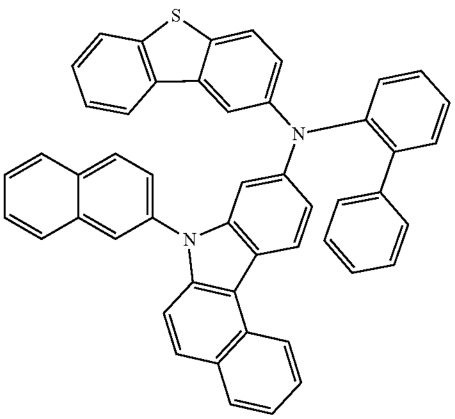
-continued
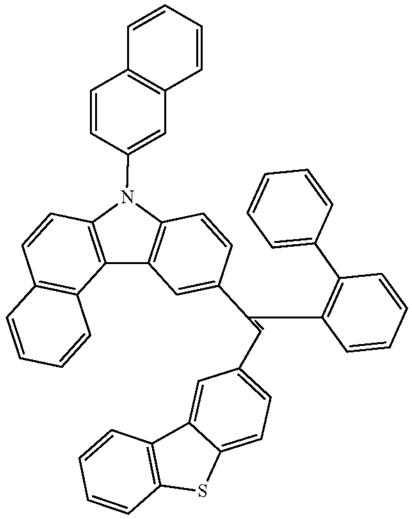
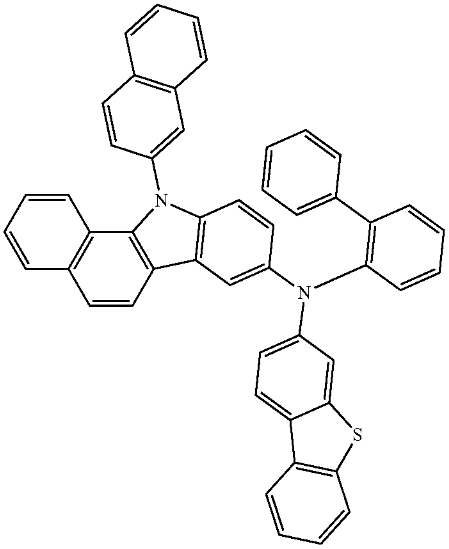
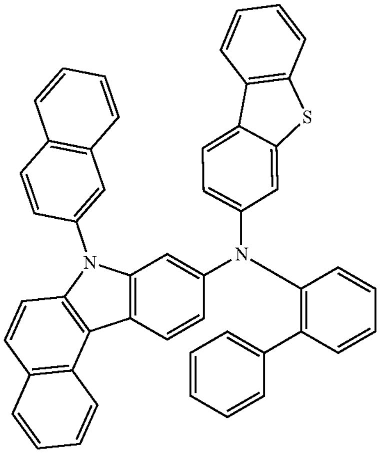

-continued
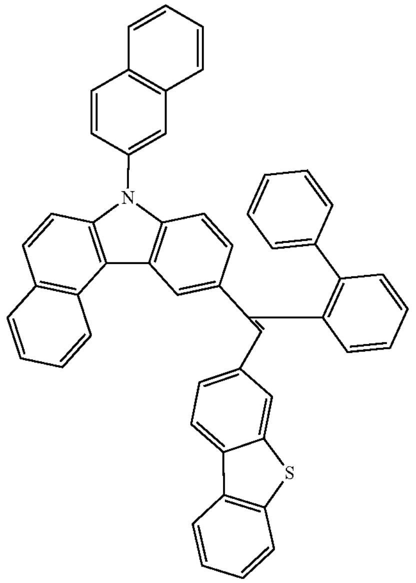
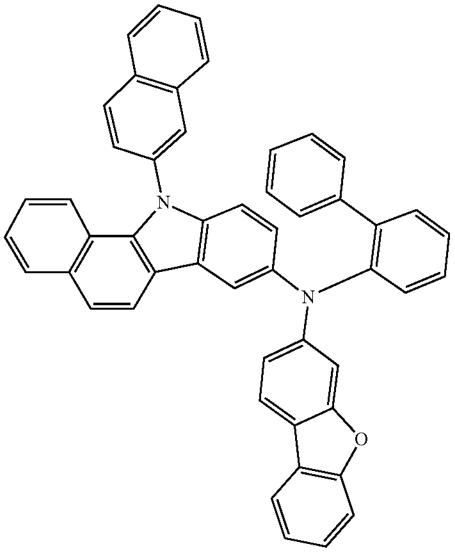
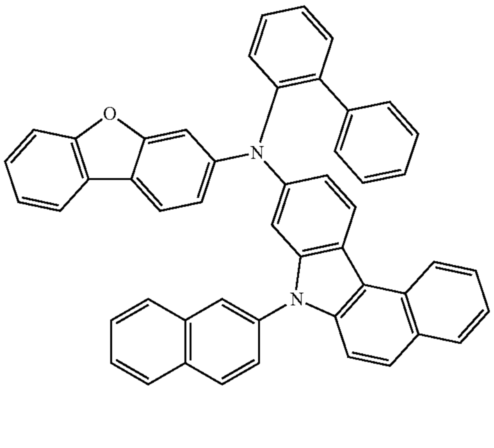
-continued
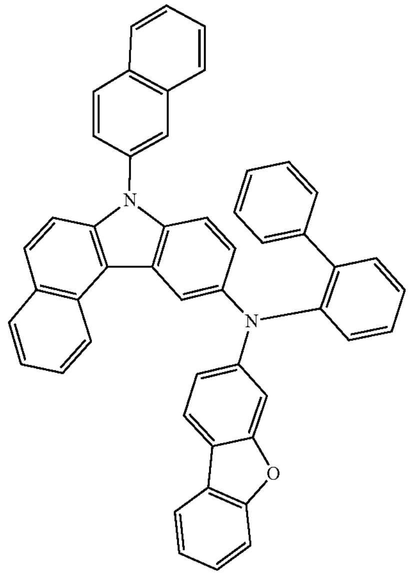
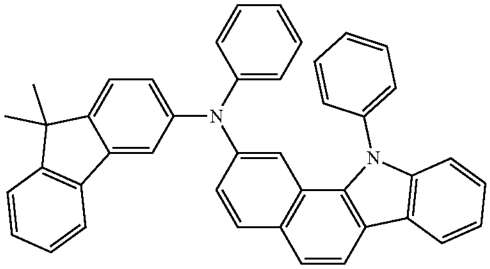
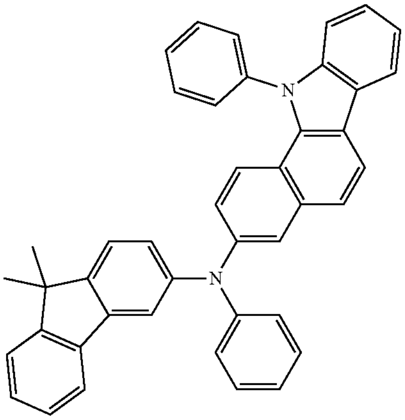
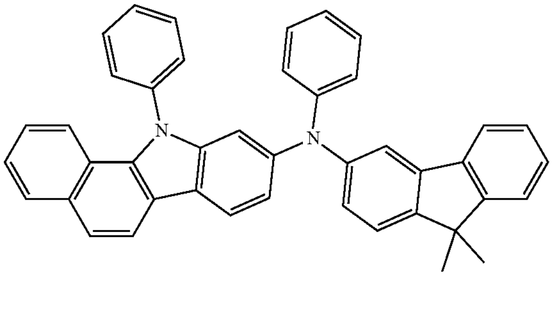

-continued
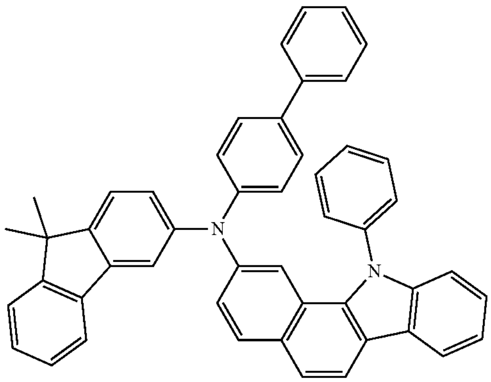
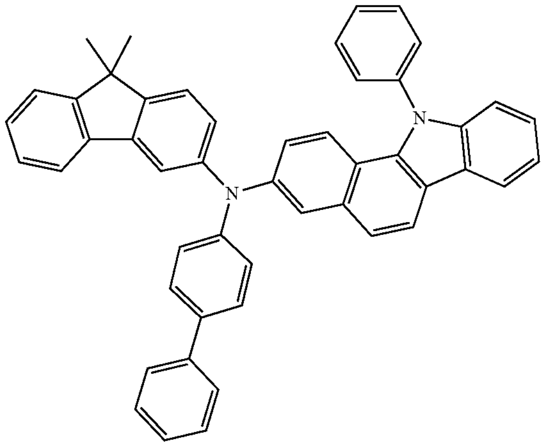
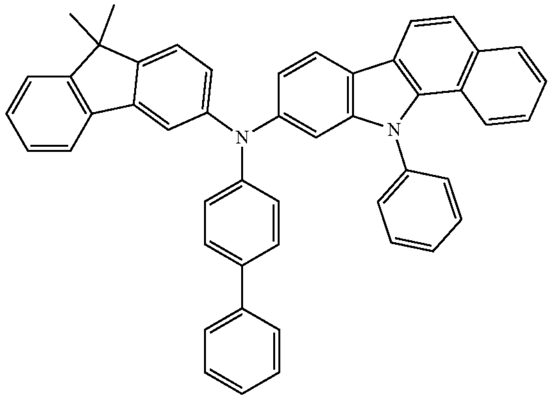
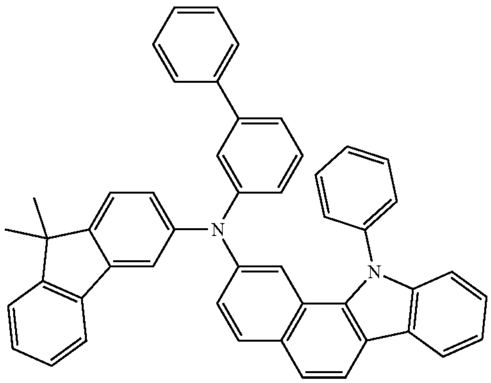
-continued
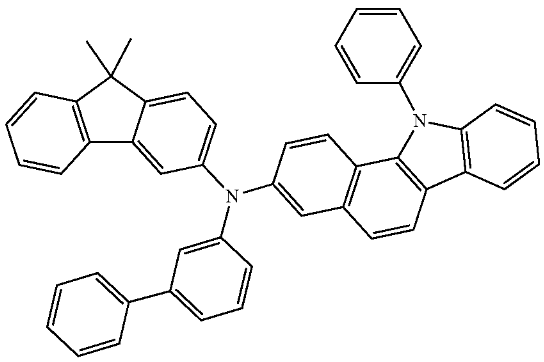
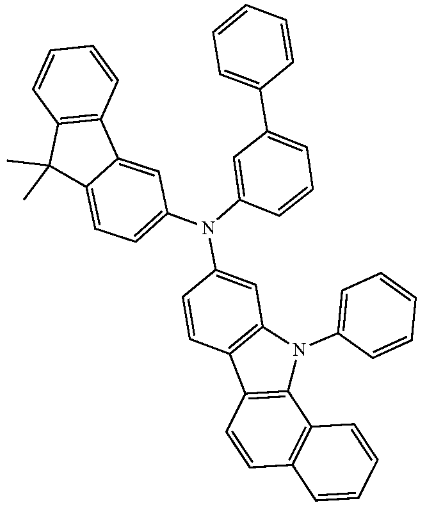
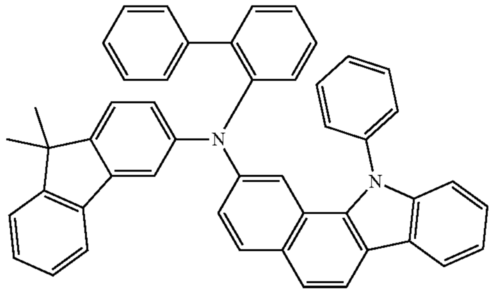
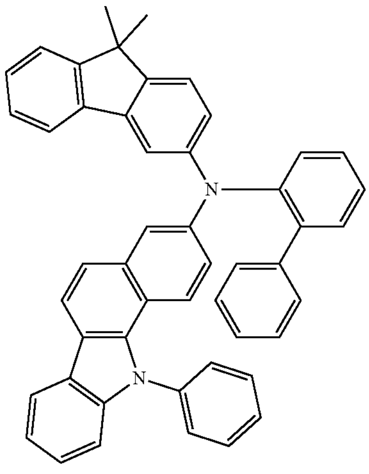

-continued
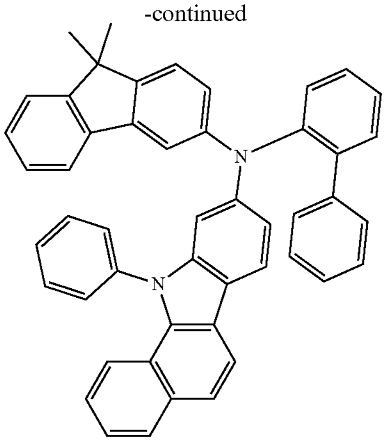
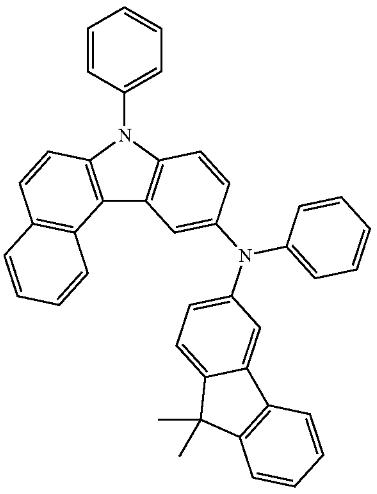
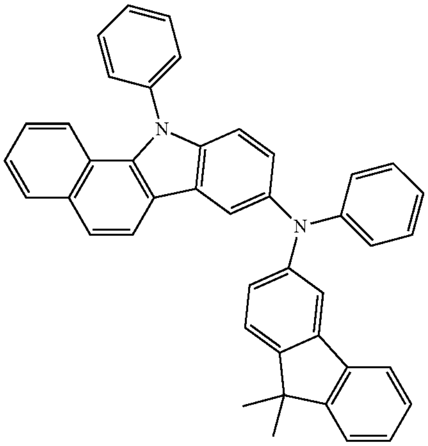
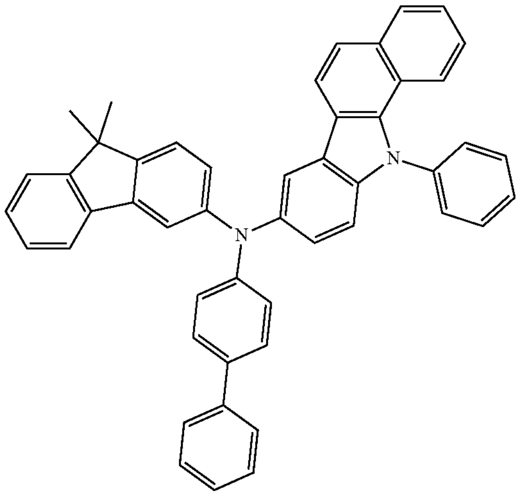
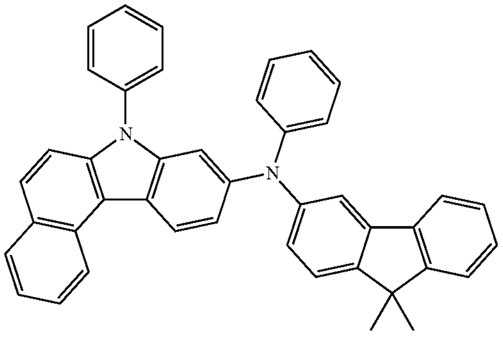
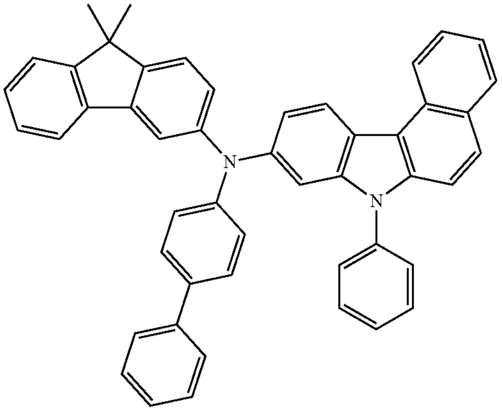
-continued -continued
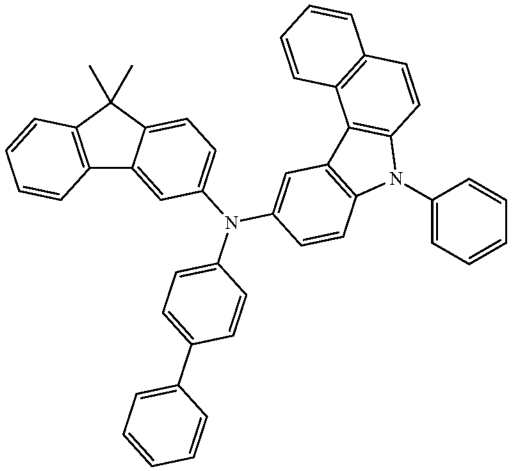
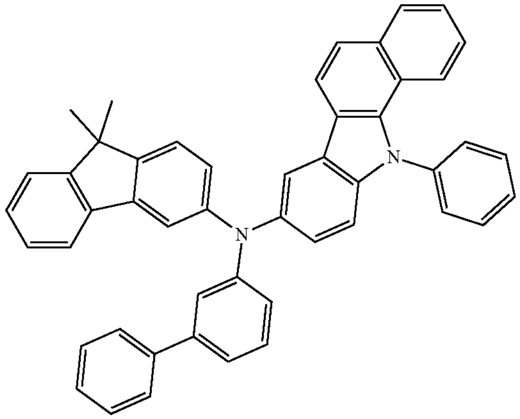
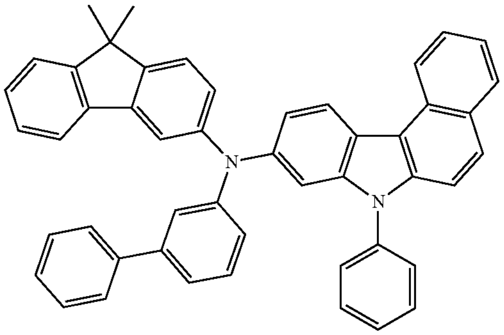
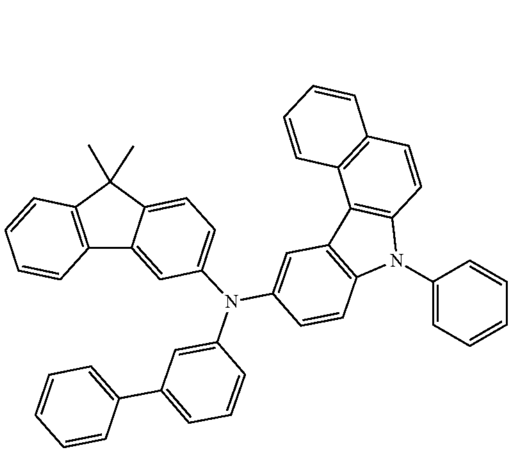
-continued
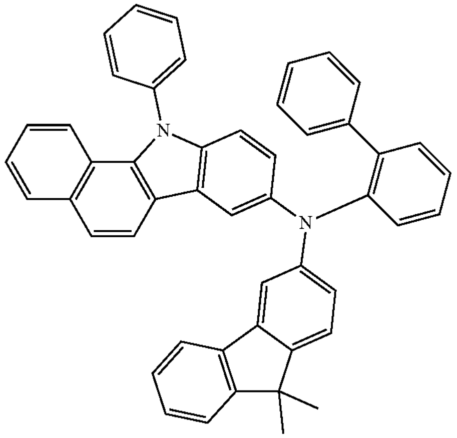
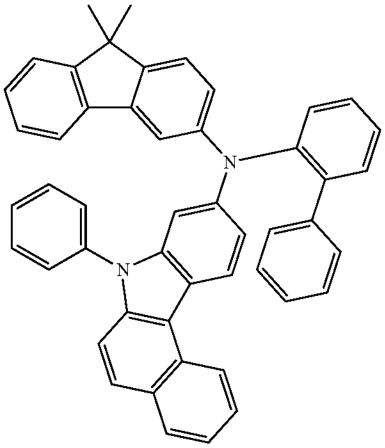
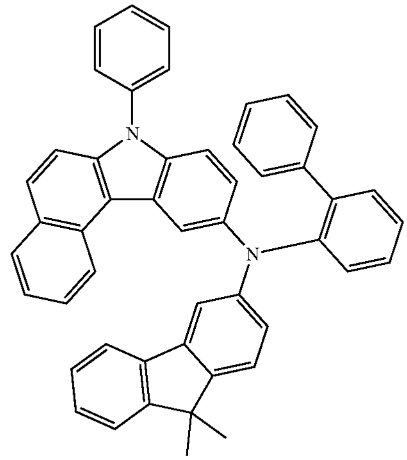
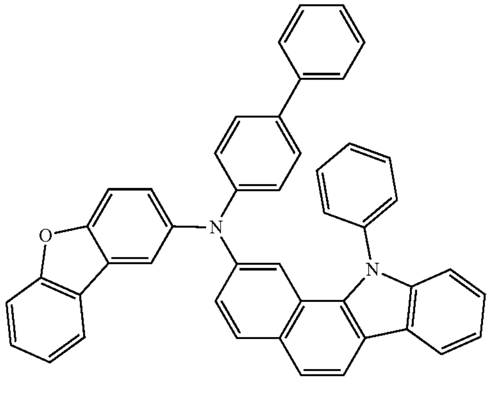

-continued
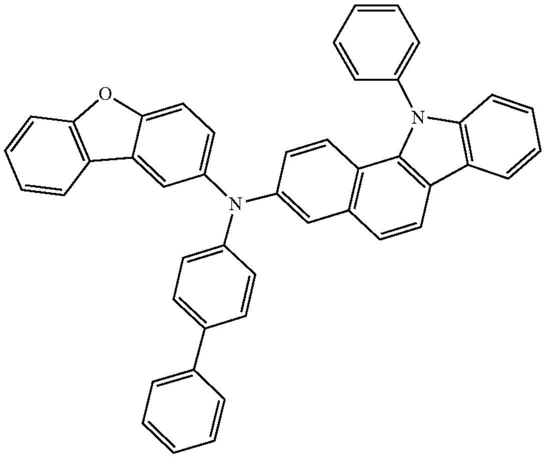
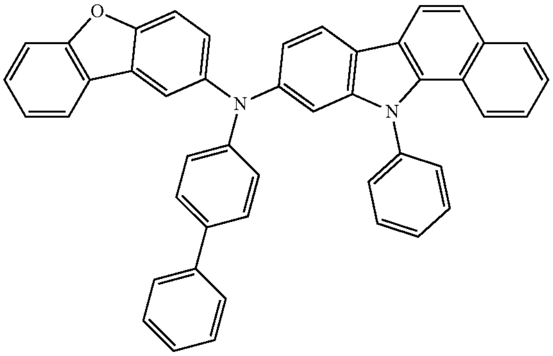
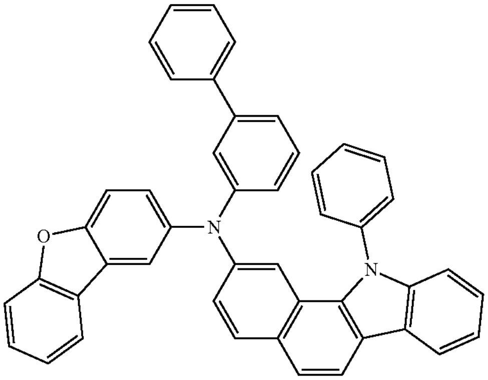
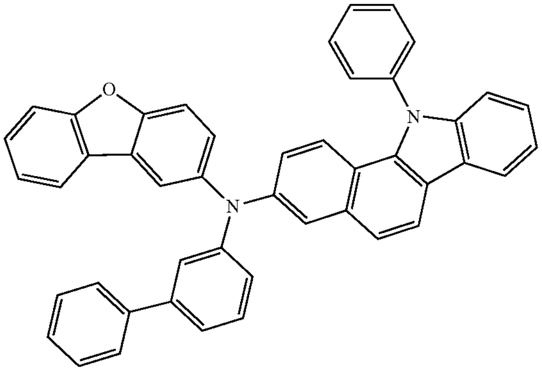
-continued
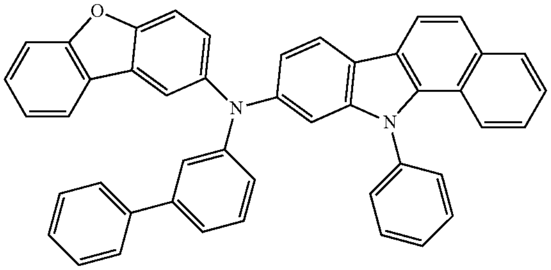
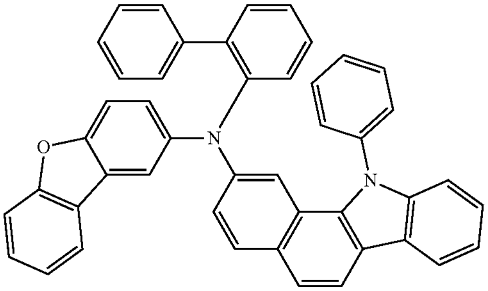
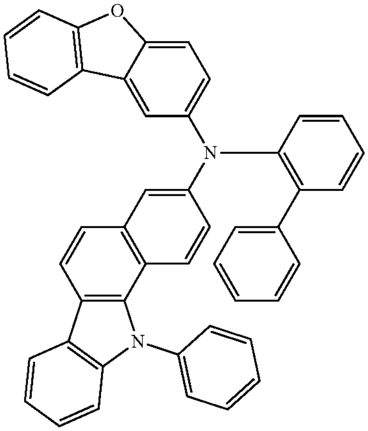
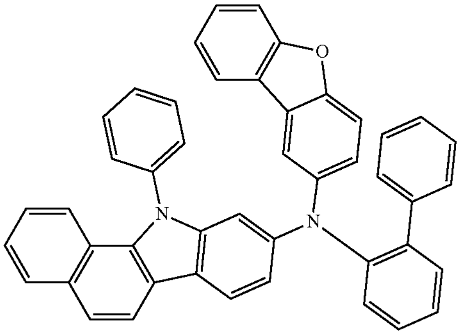
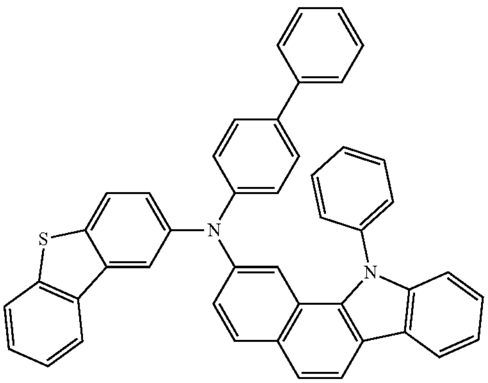

-continued
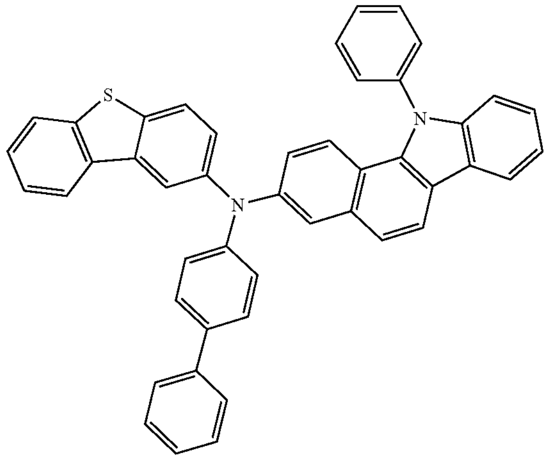
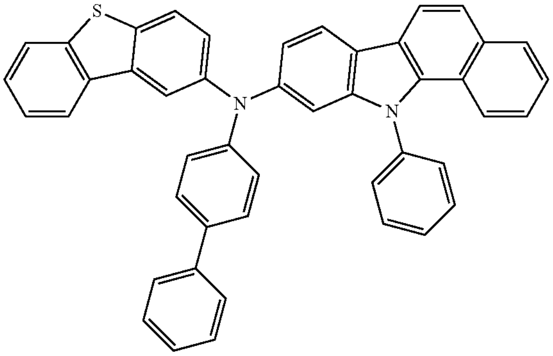
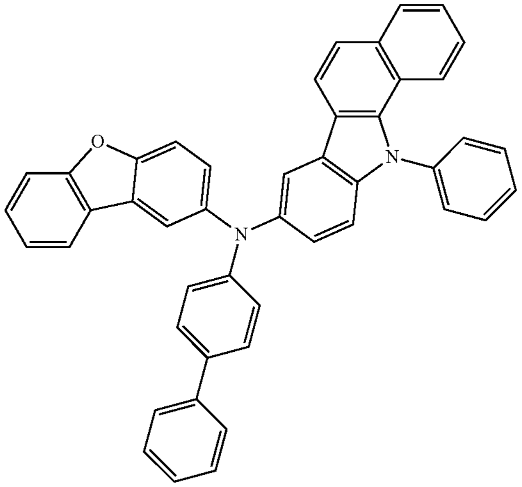
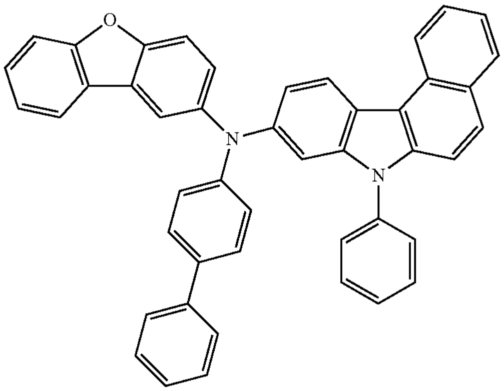
-continued
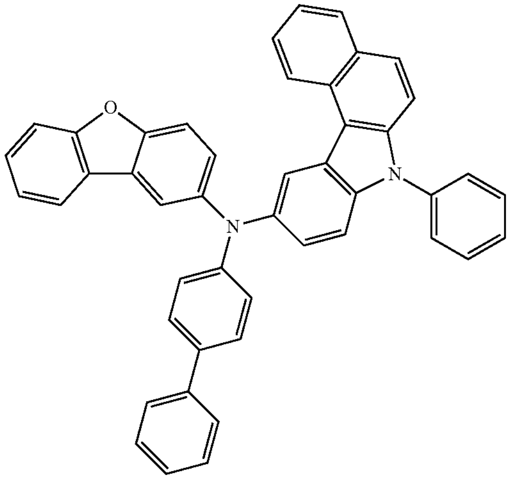
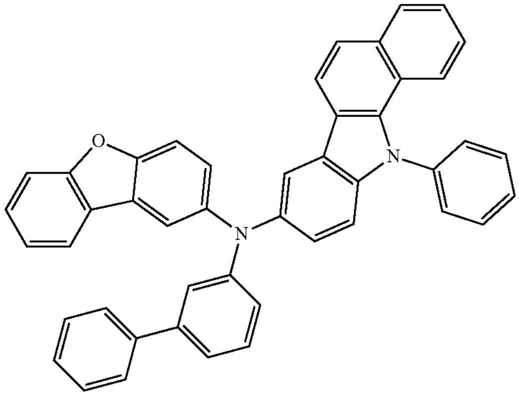
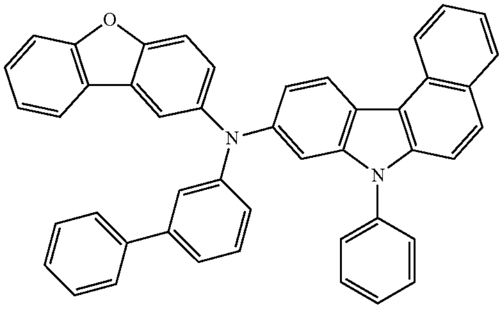
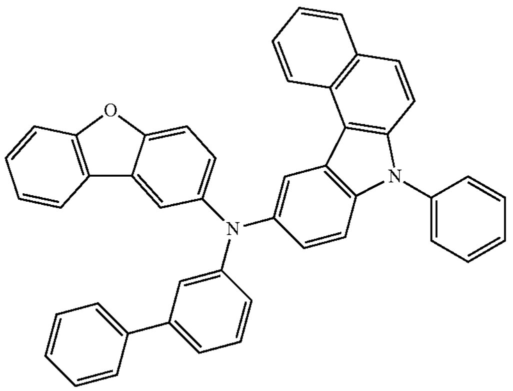

-continued
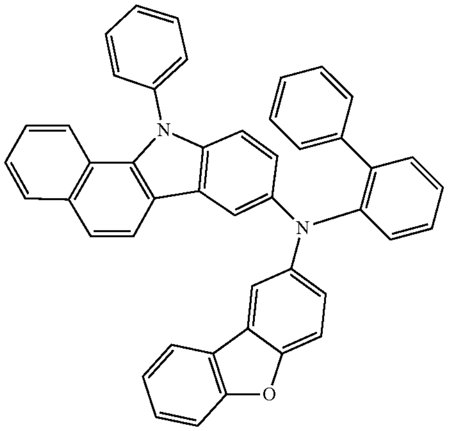
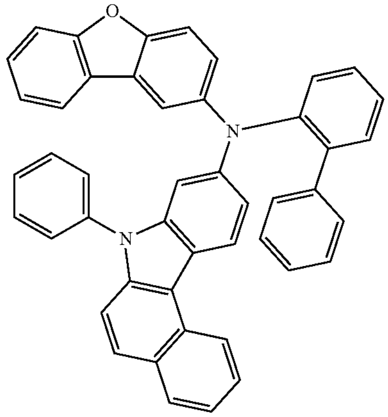
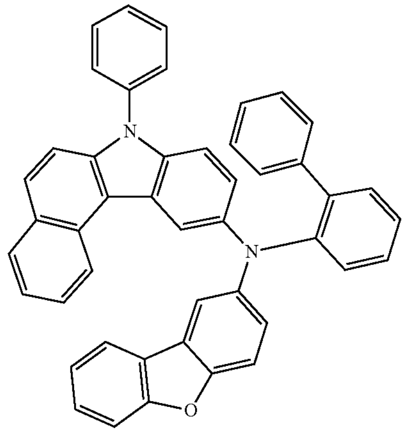
-continued
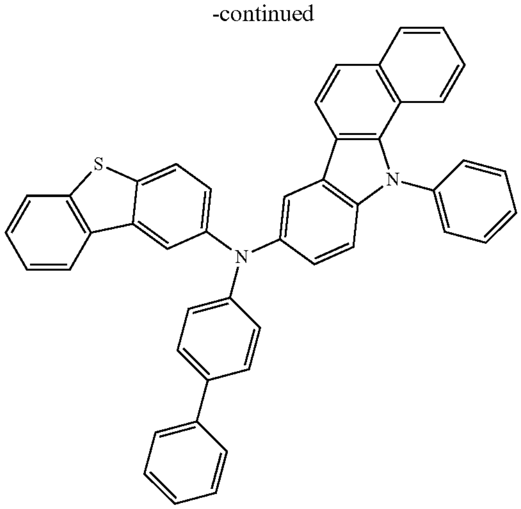
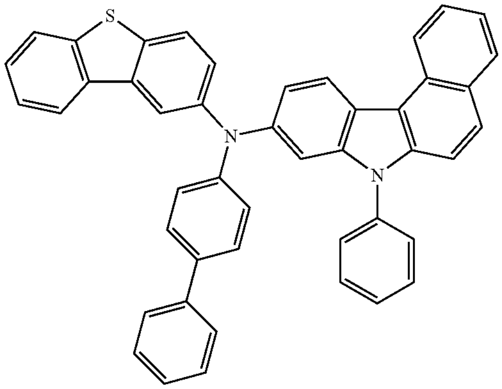
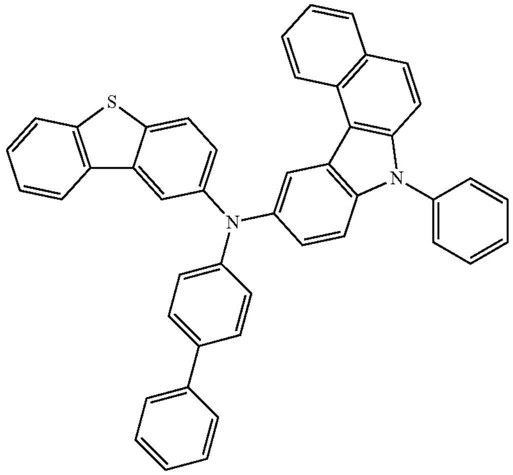
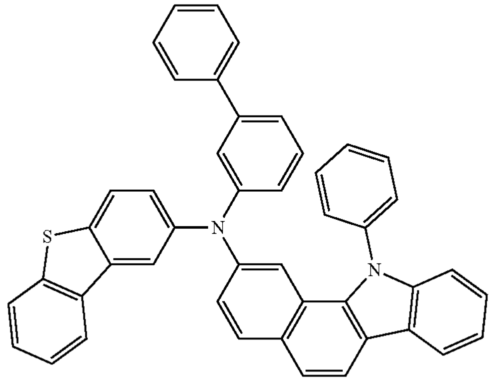

-continued
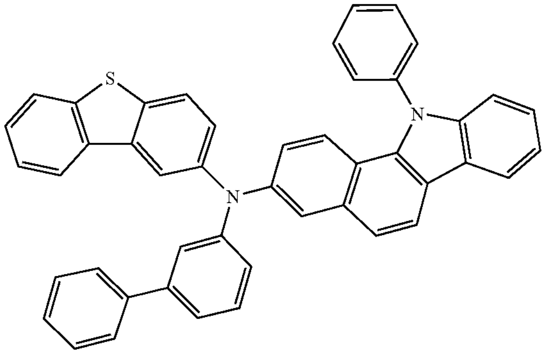
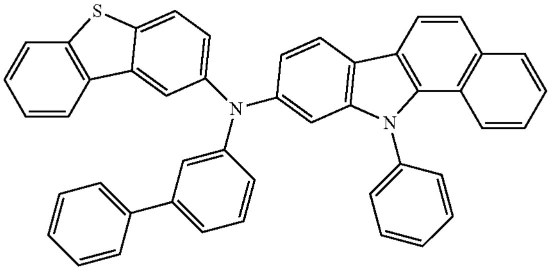
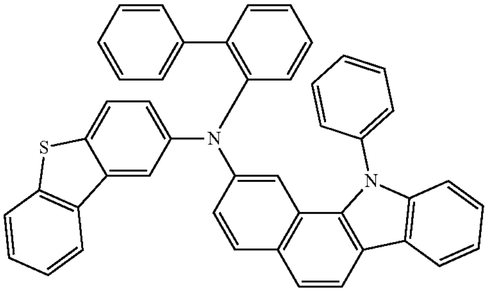
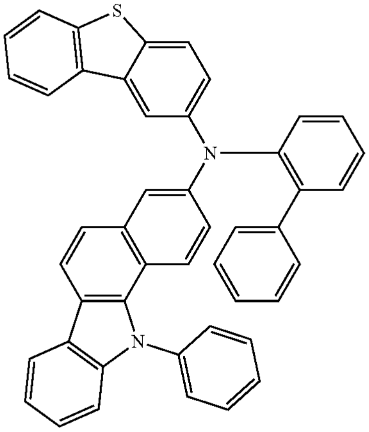
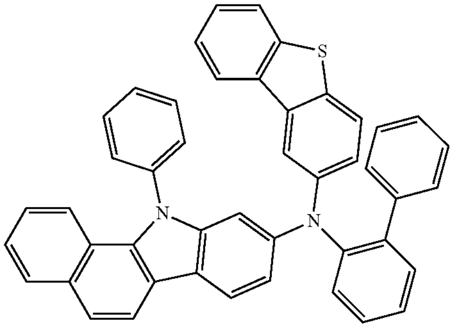
-continued
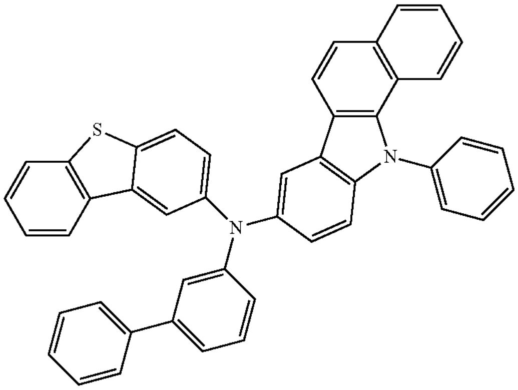
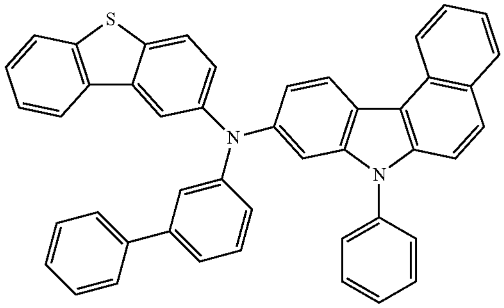
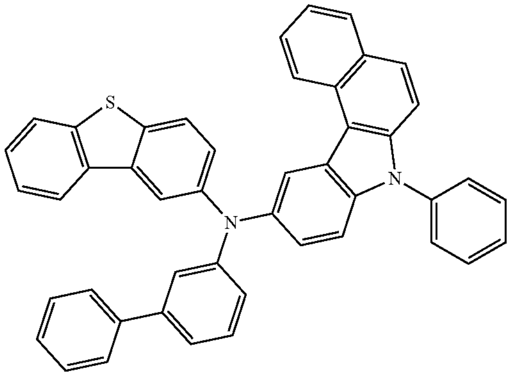
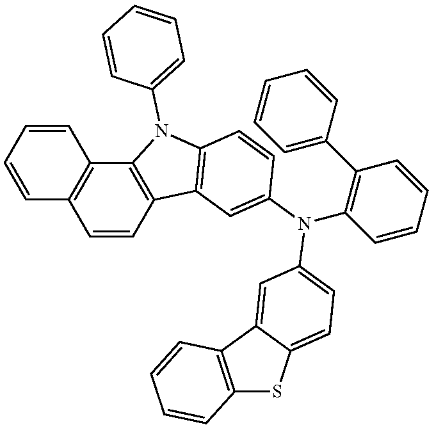

-continued
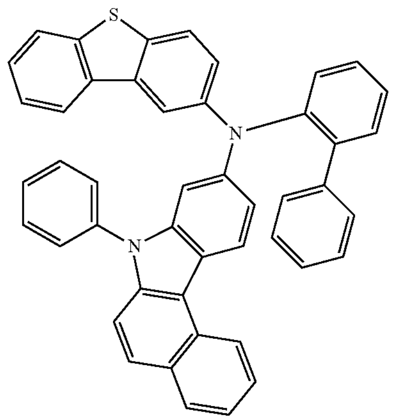
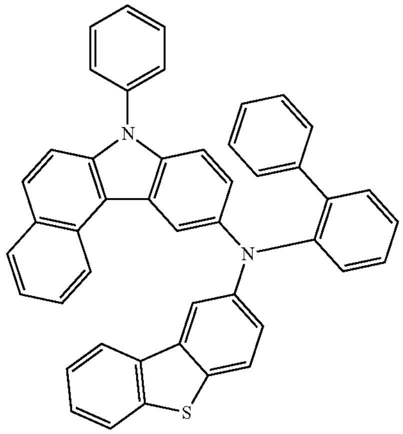
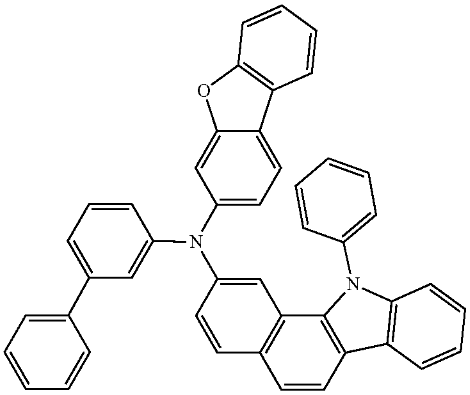
-continued
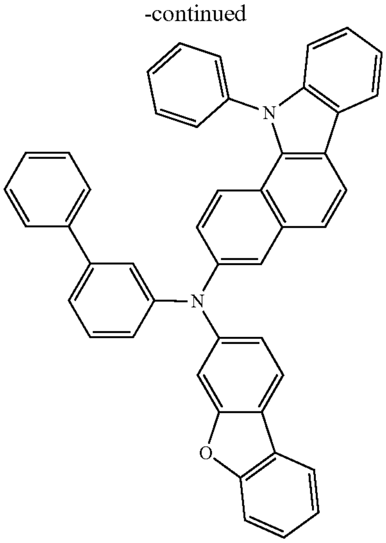
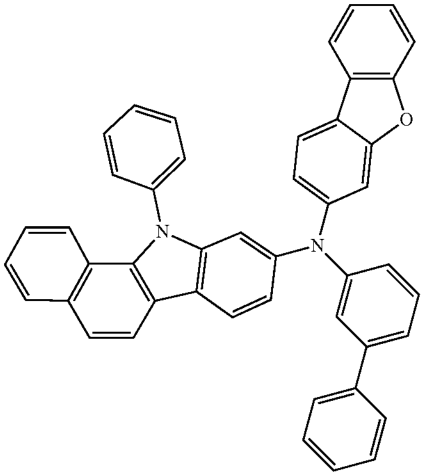
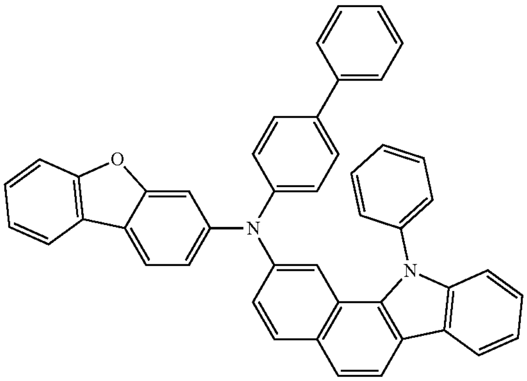

-continued
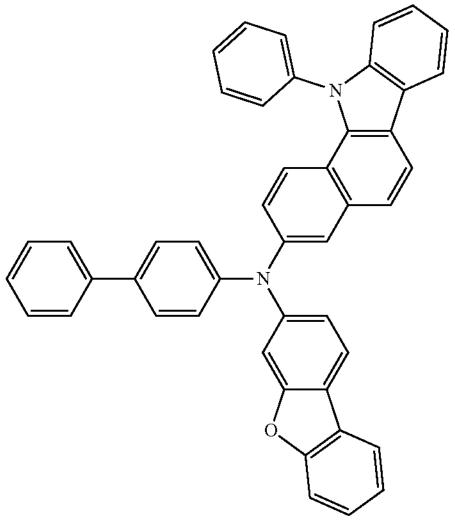
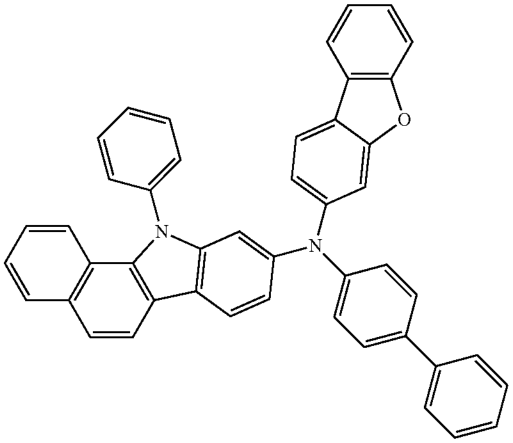
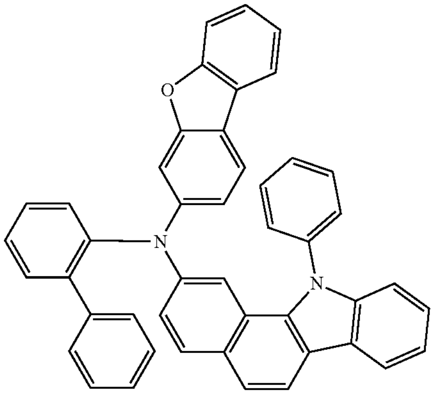
-continued
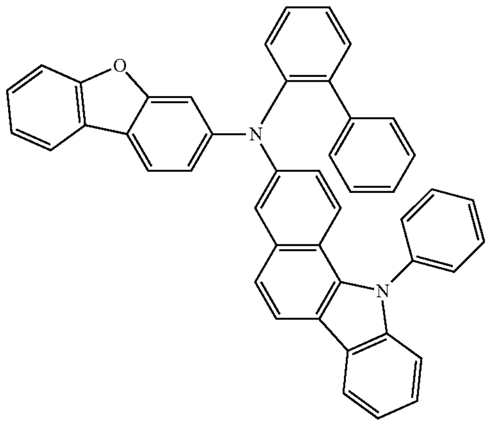
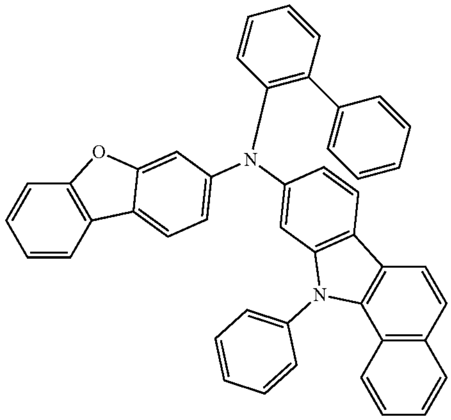
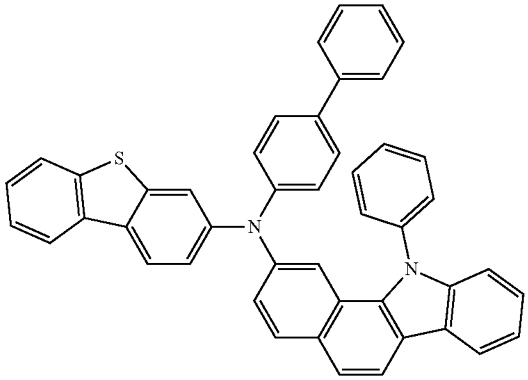

-continued
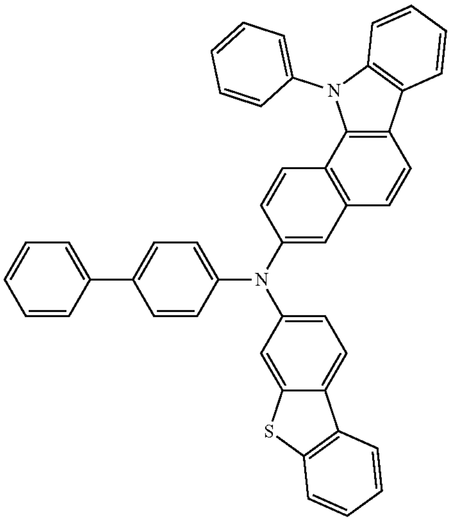
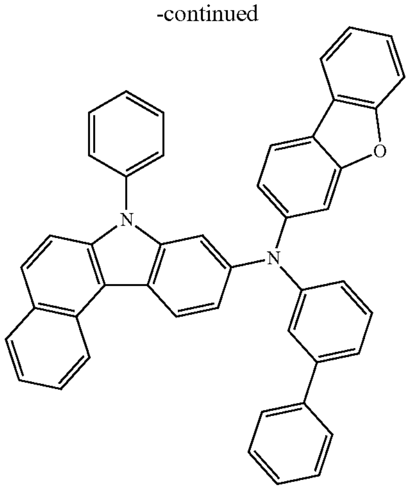
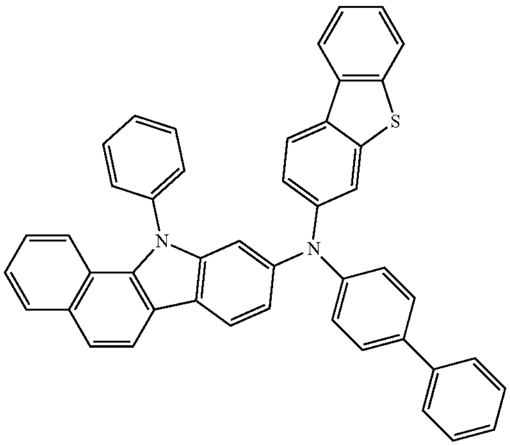
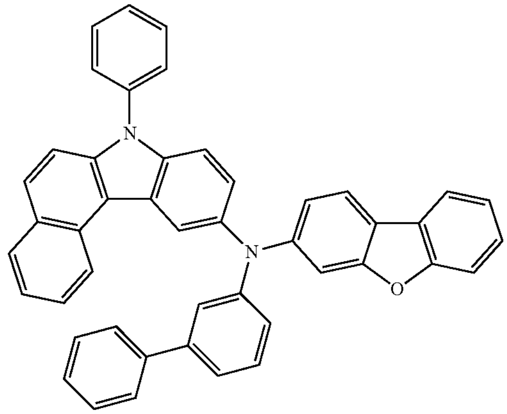
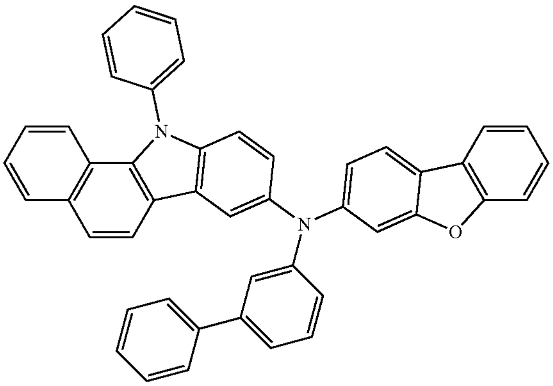
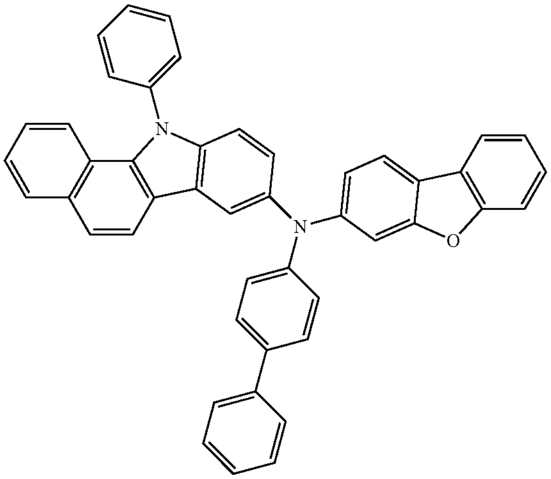
-continued -continued
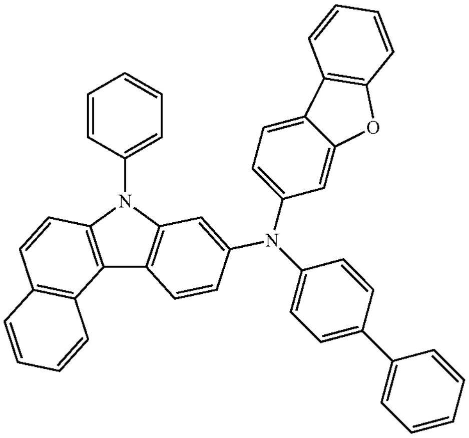
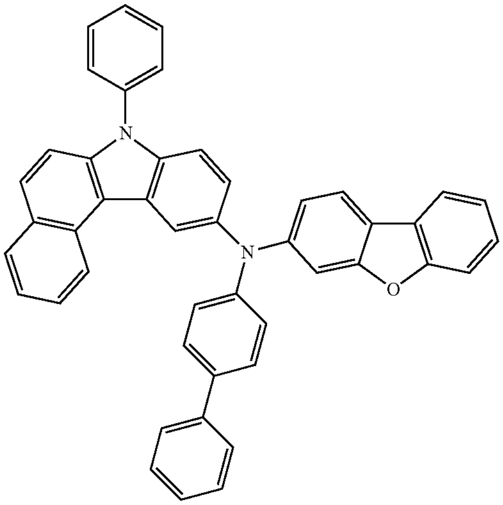
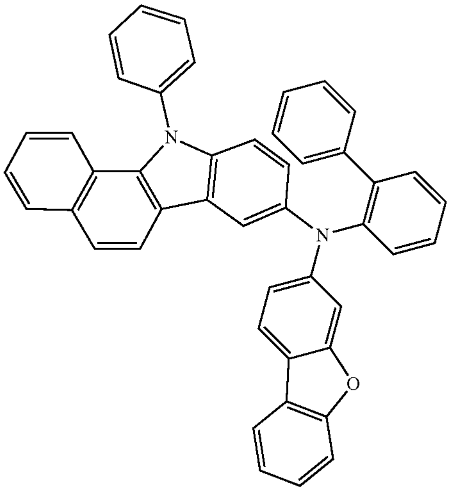
-continued
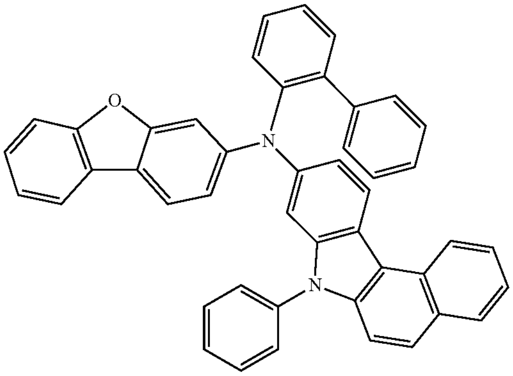
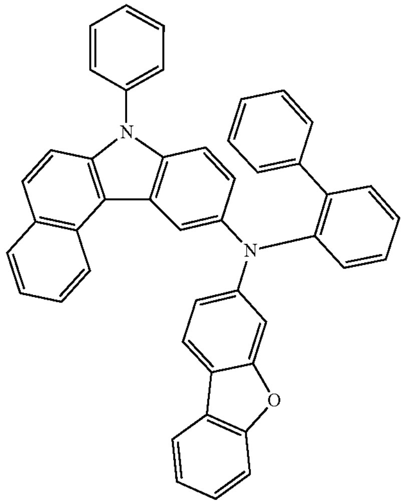
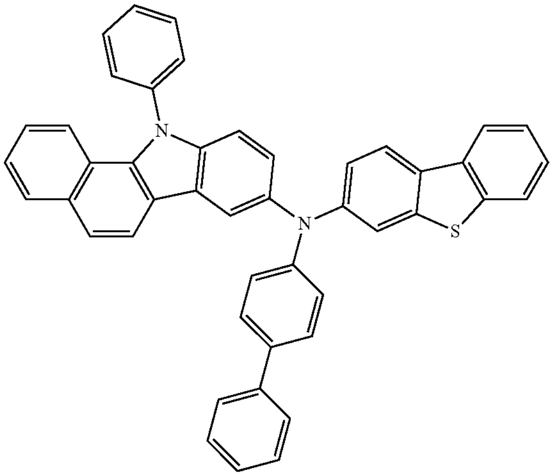

-continued
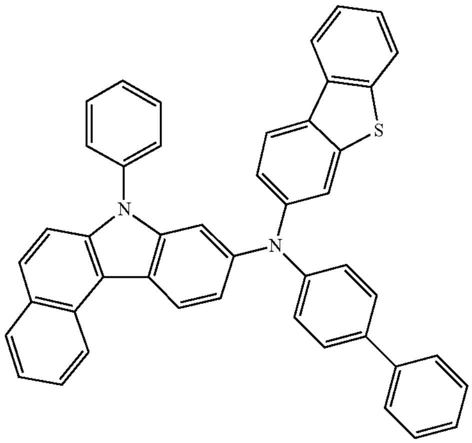
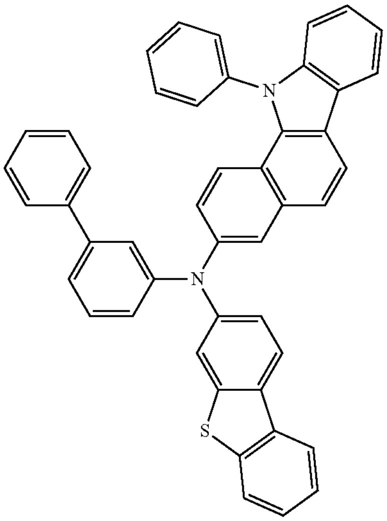
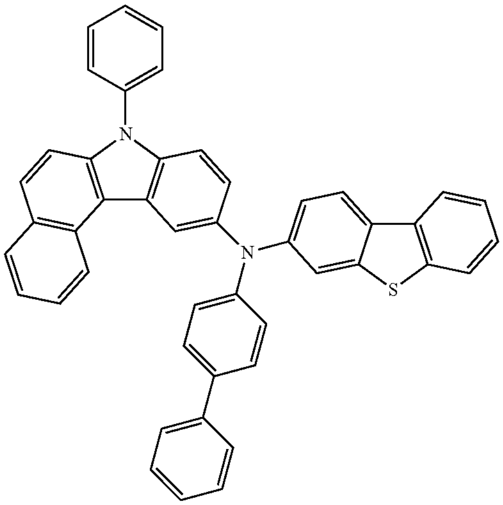
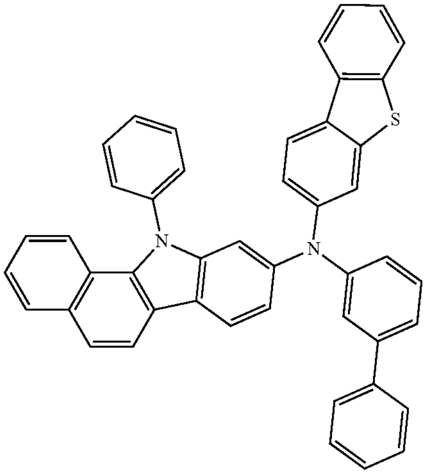
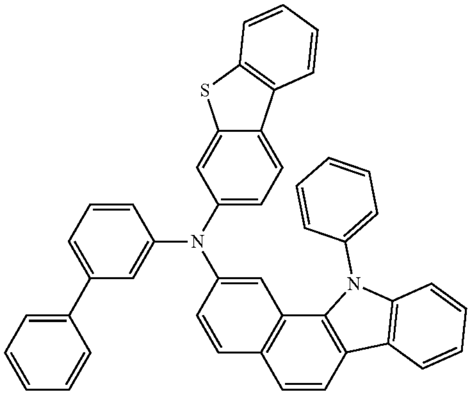
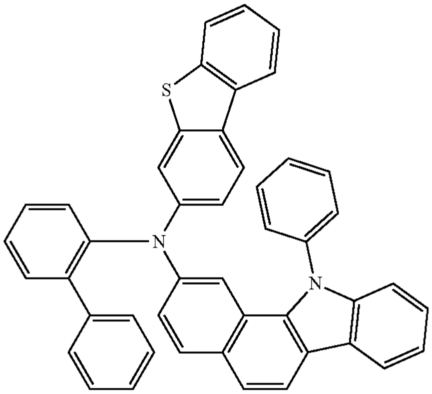

-continued
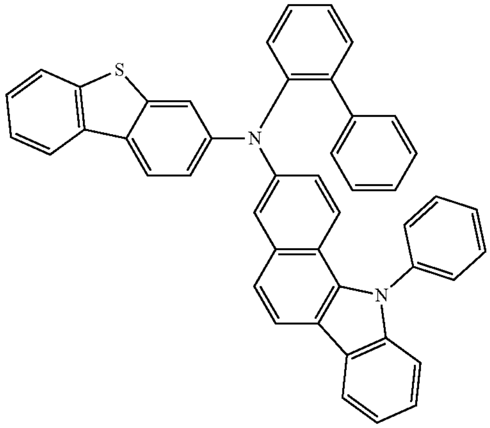
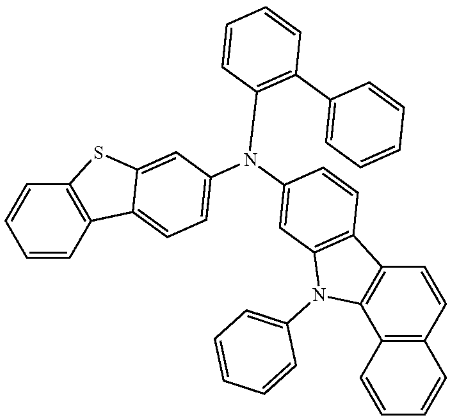
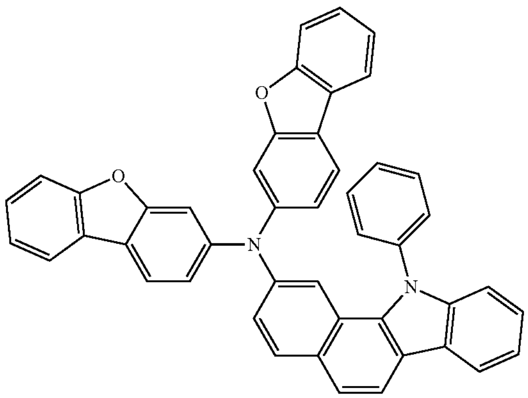
-continued
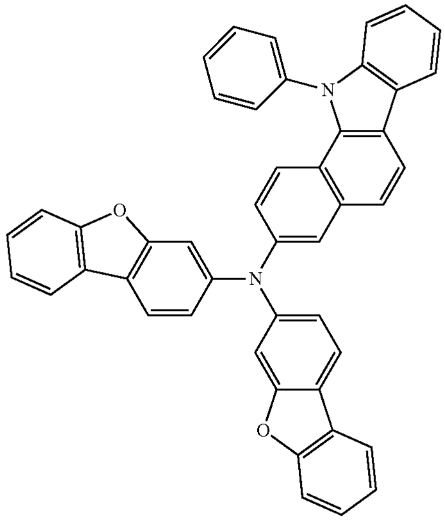
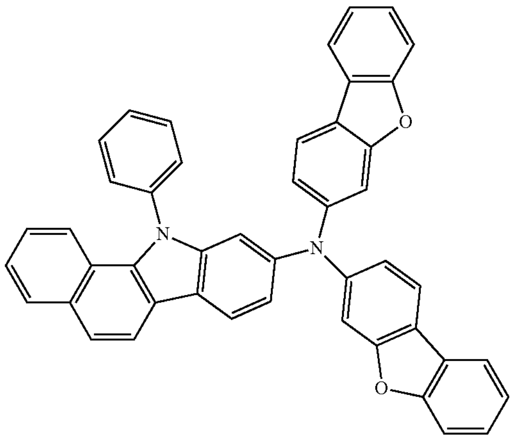
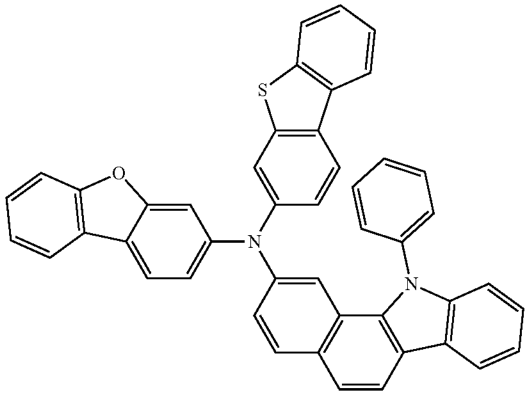

-continued
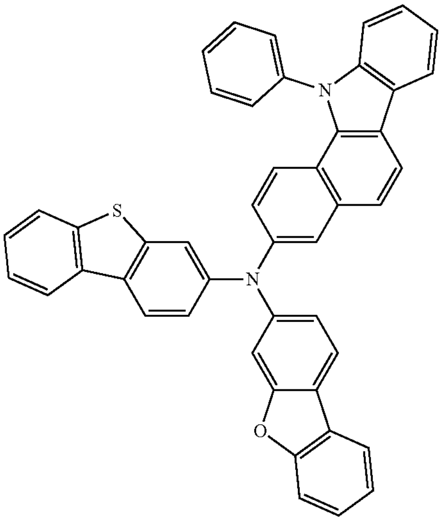
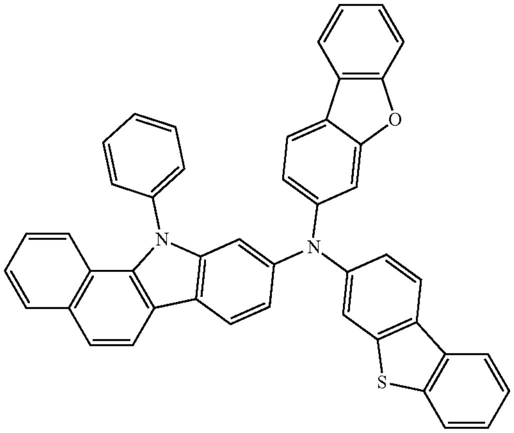
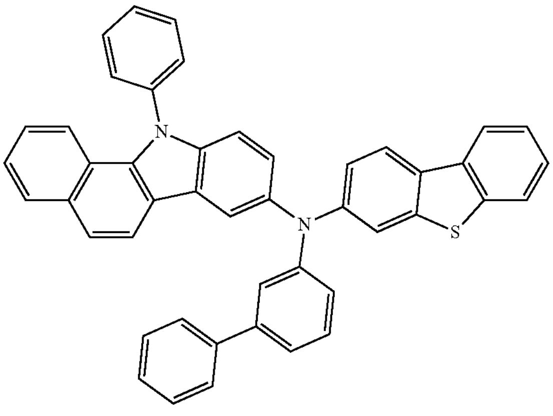
-continued
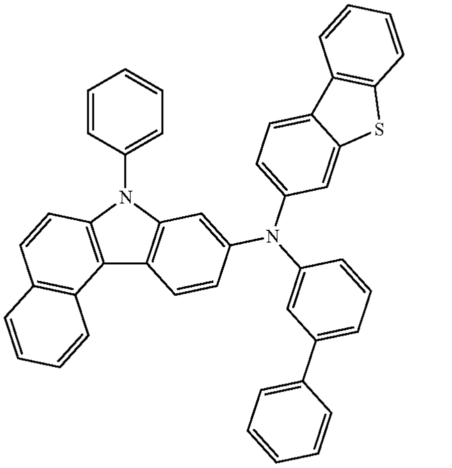
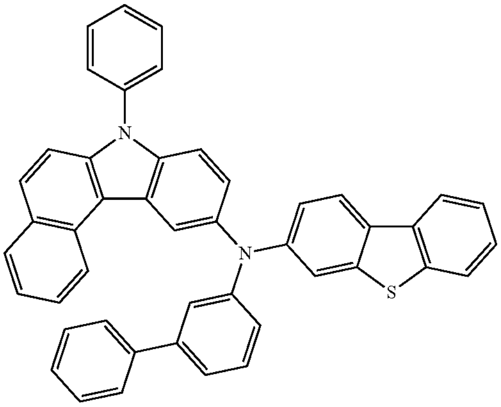
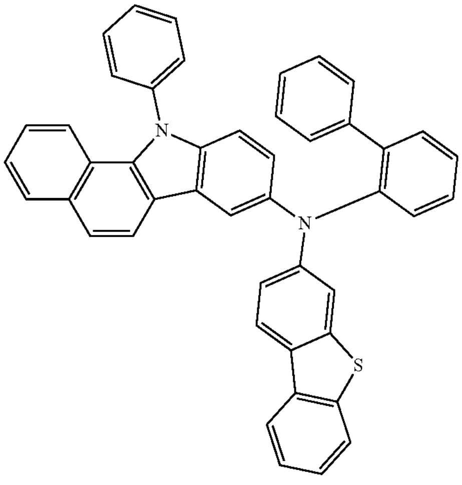

-continued
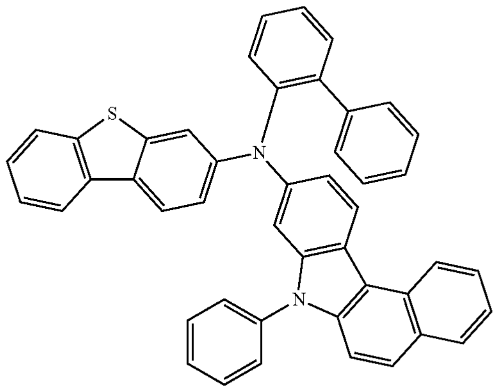
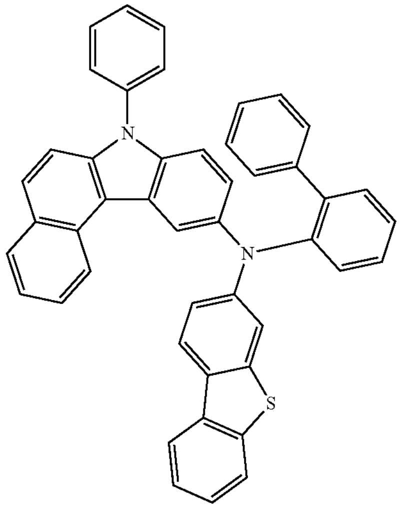
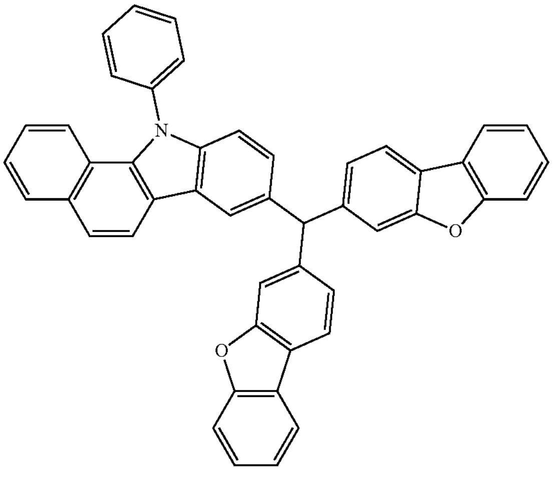
-continued
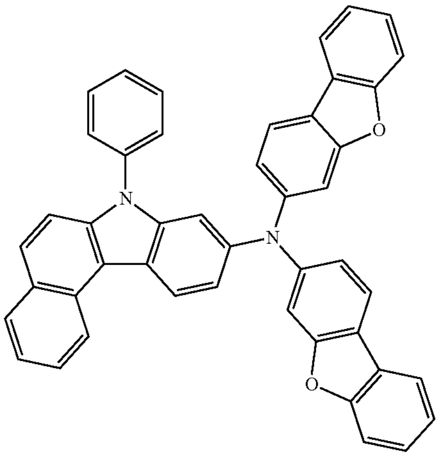
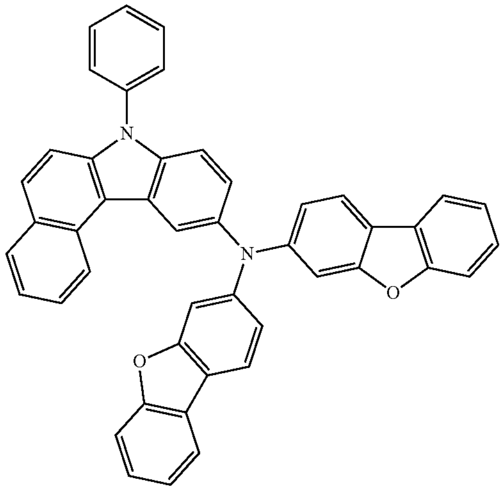
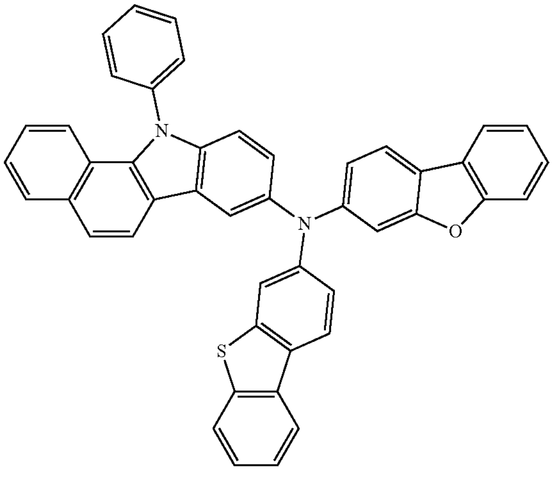

-continued
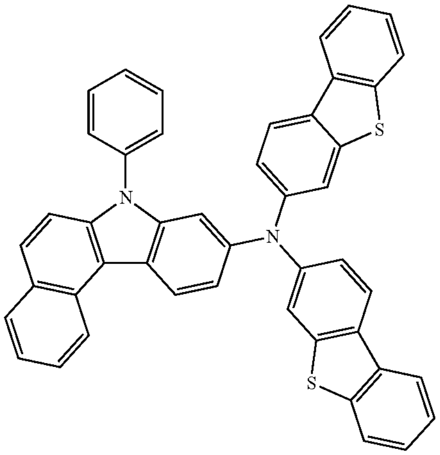
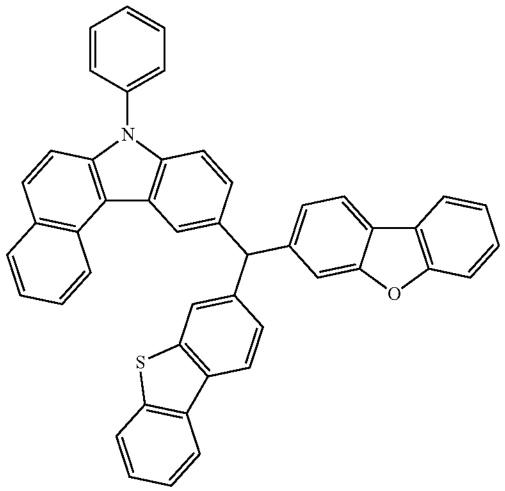
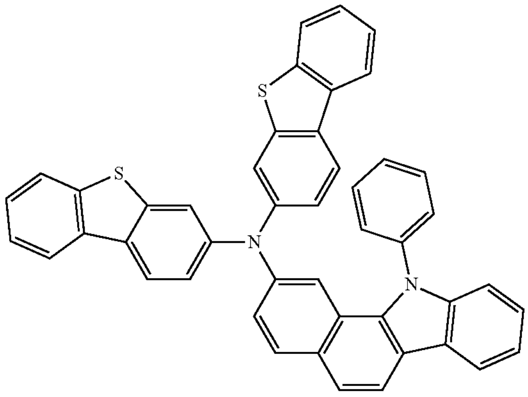
-continued
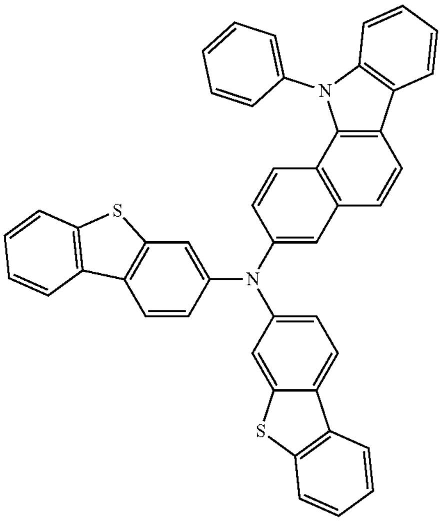
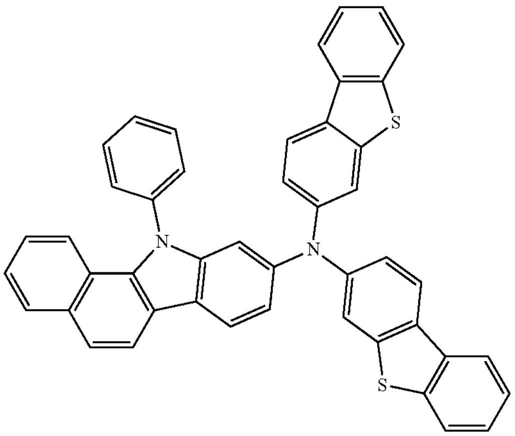
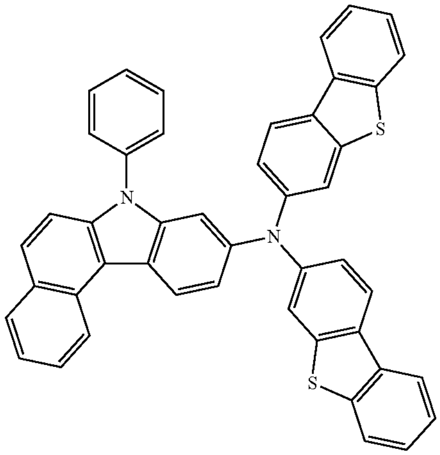

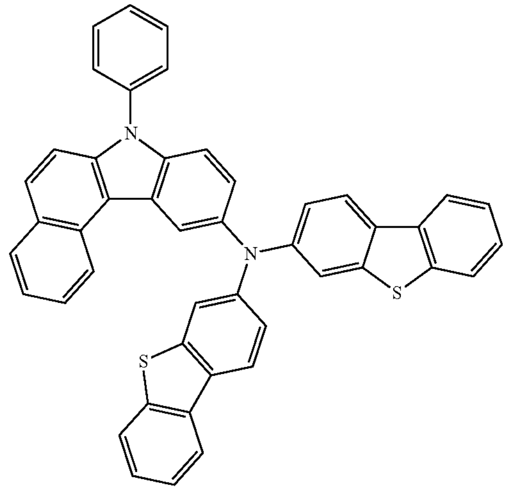
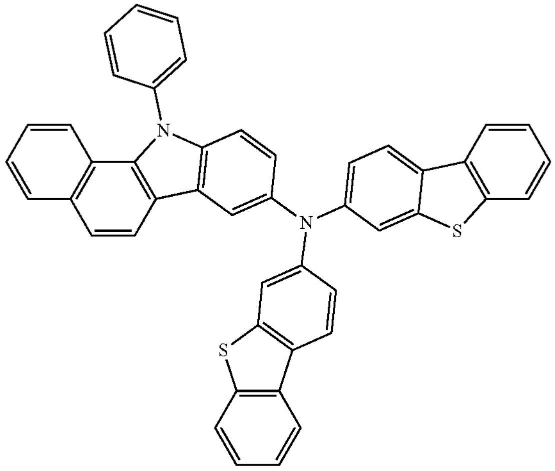
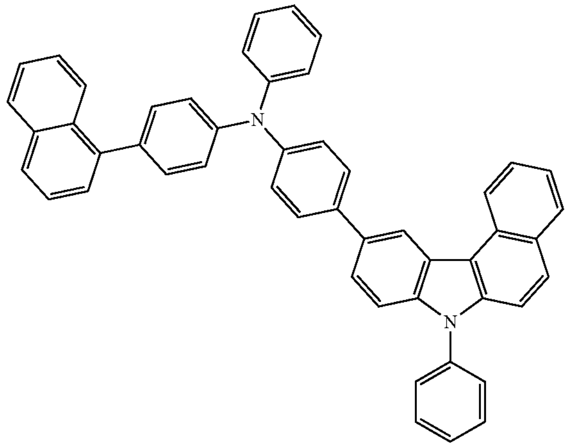
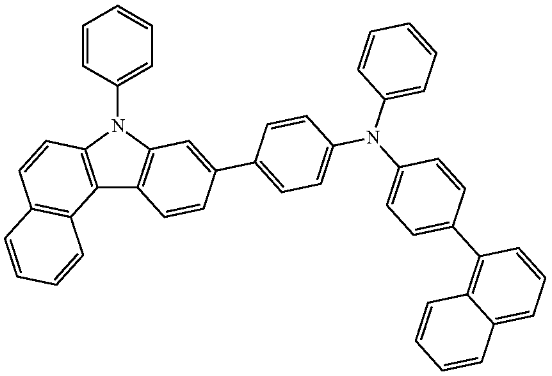
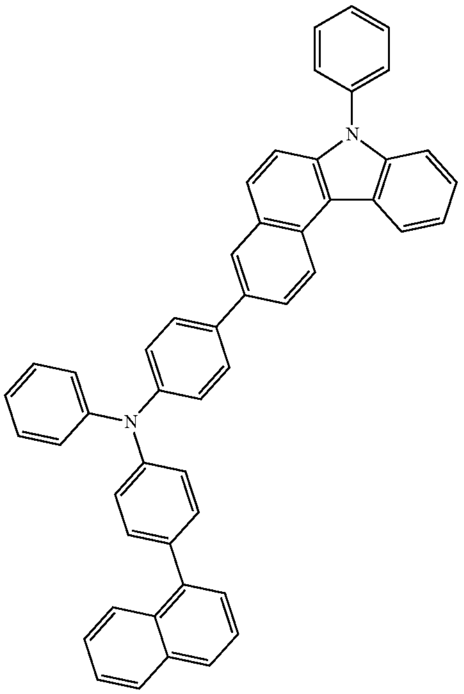
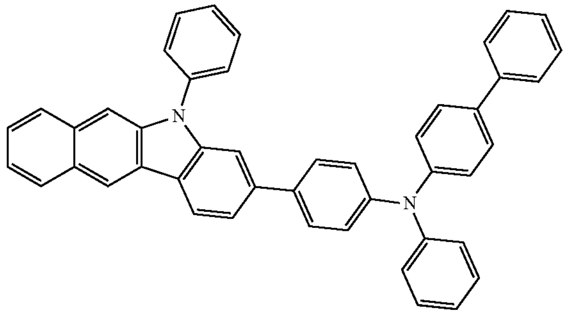

-continued
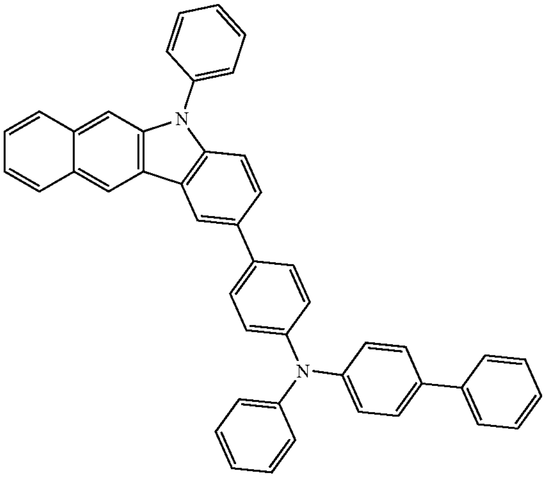
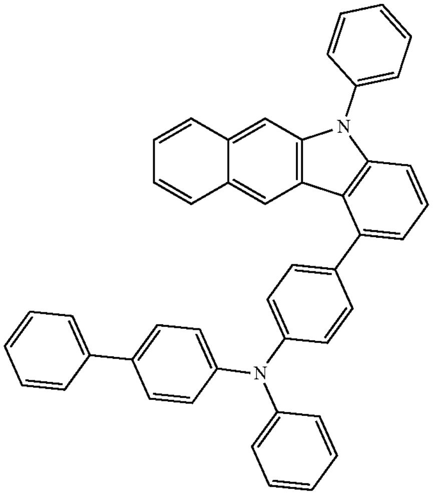
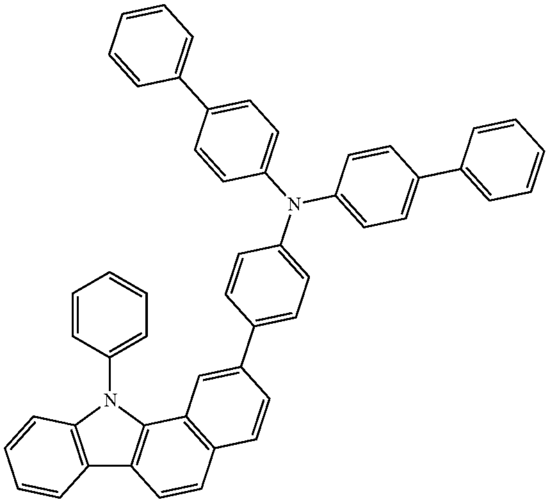
-continued
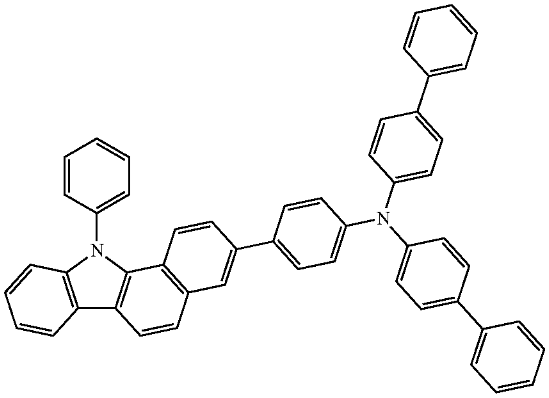
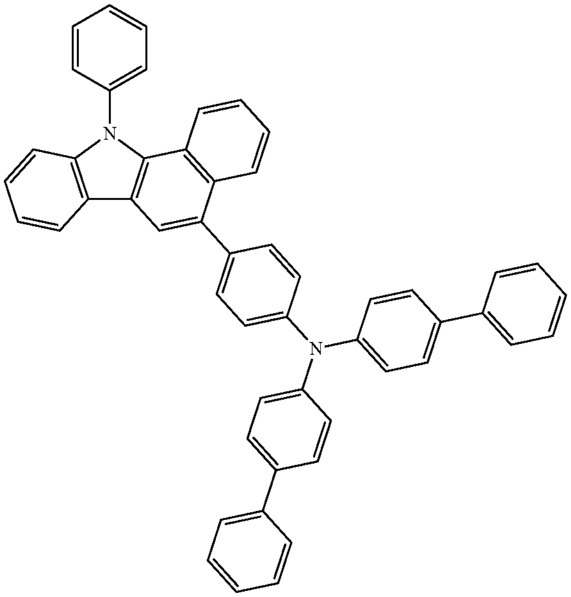
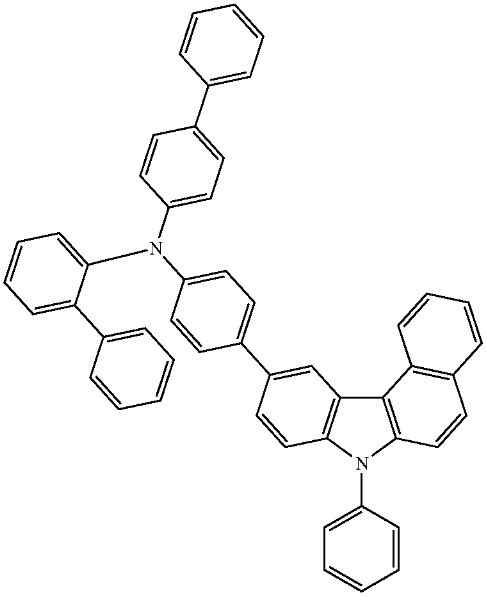

-continued
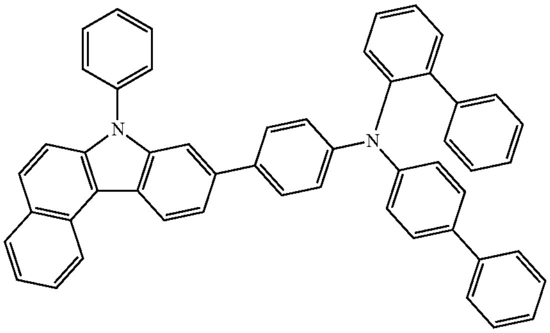
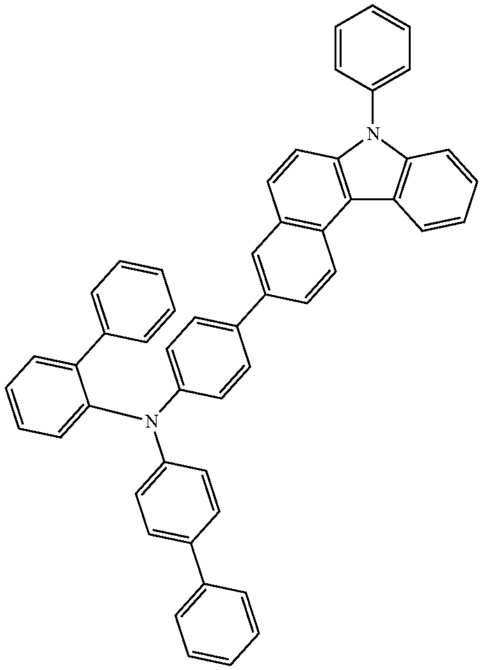
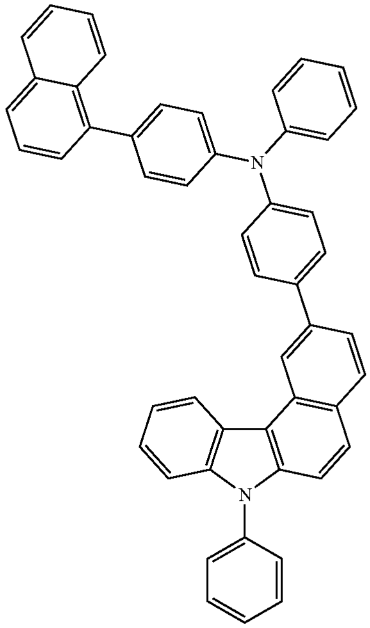
-continued
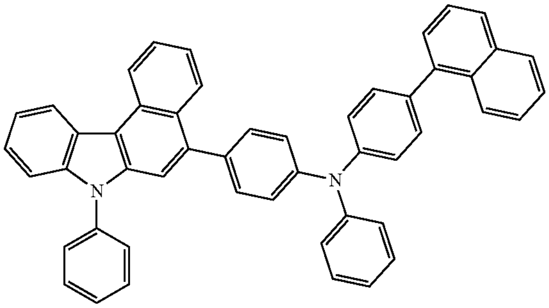
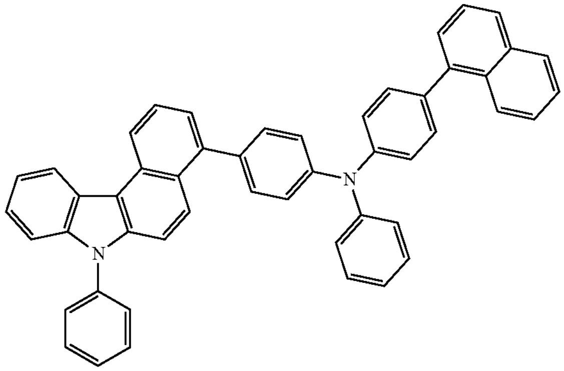
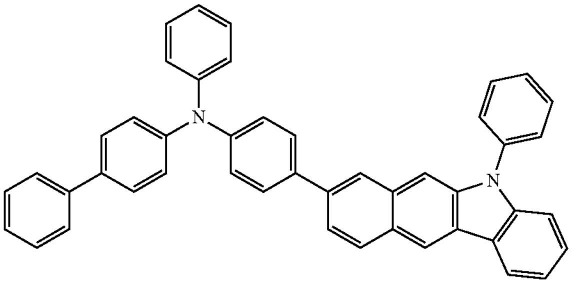
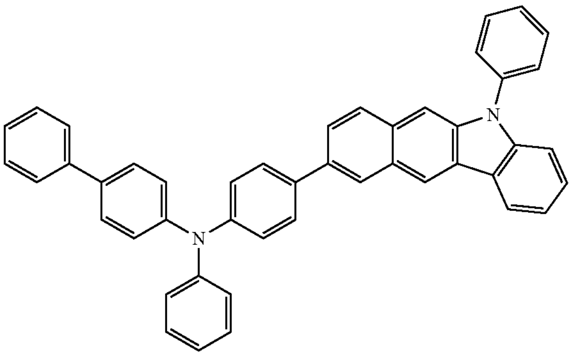

-continued
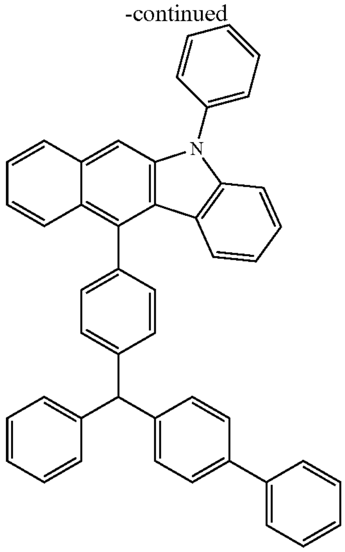
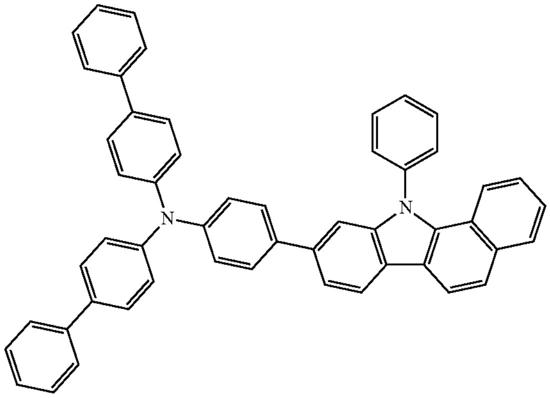
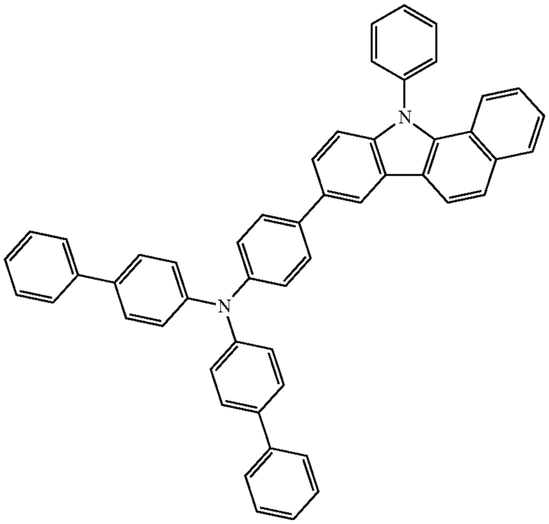
-continued
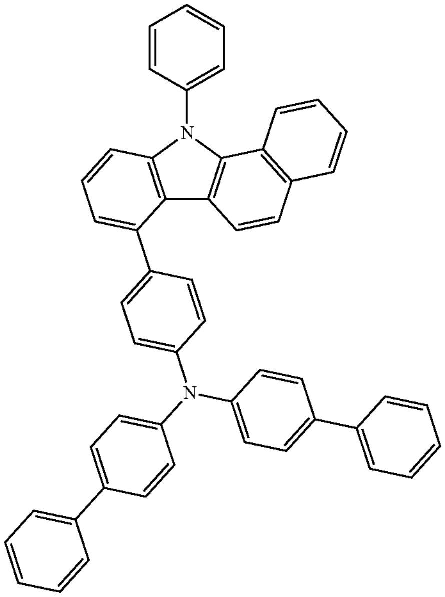
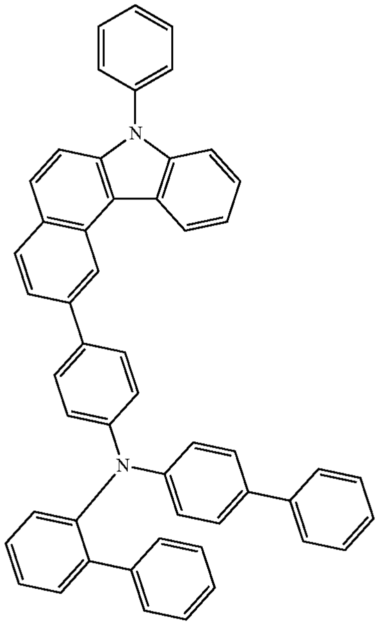
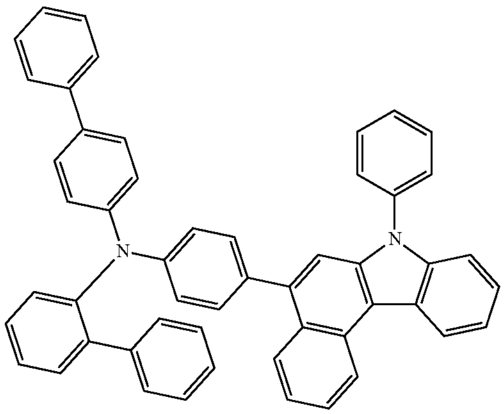

-continued
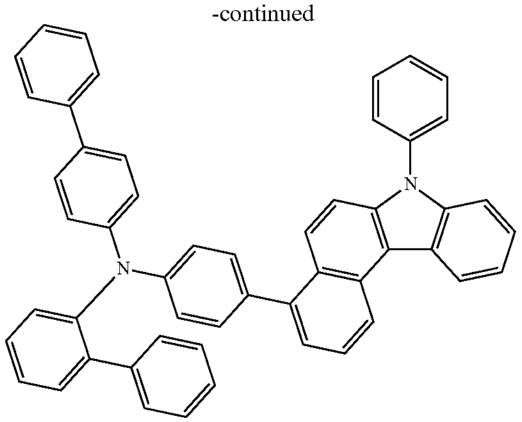
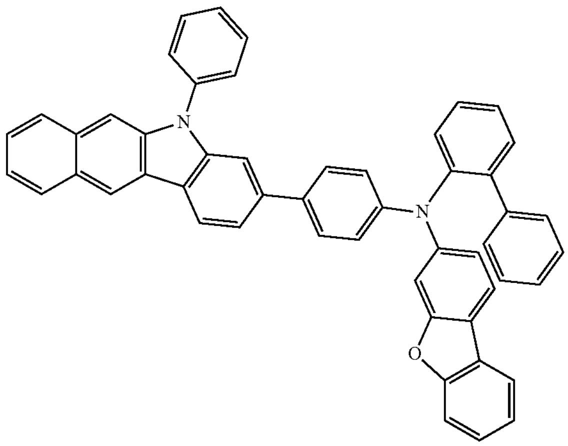
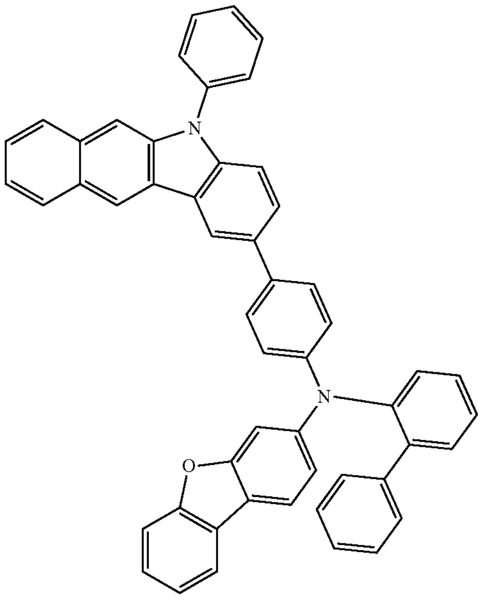
-continued
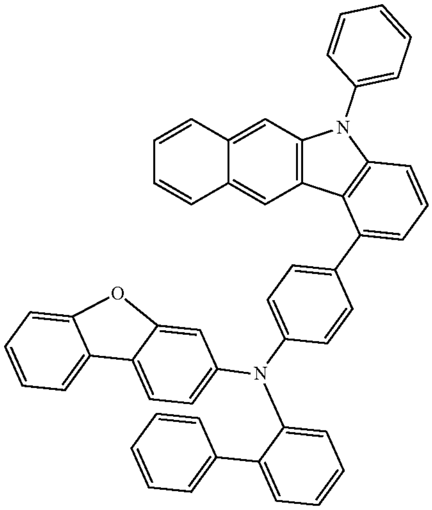
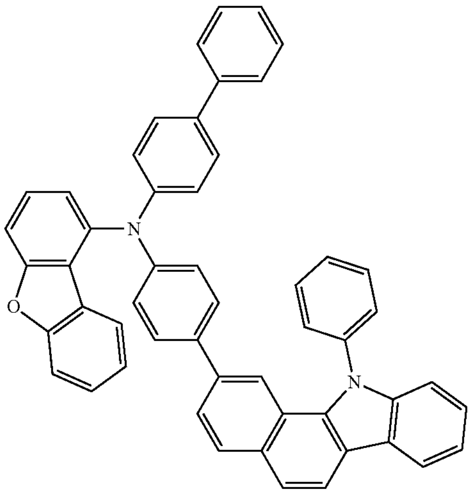
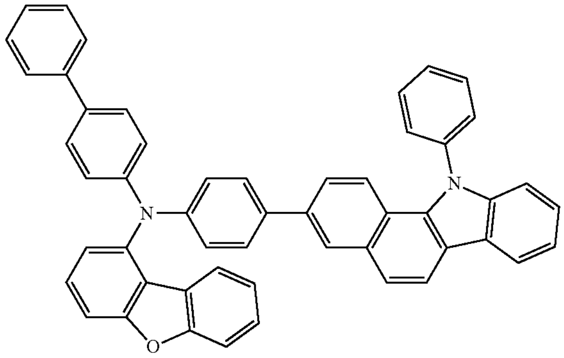

-continued
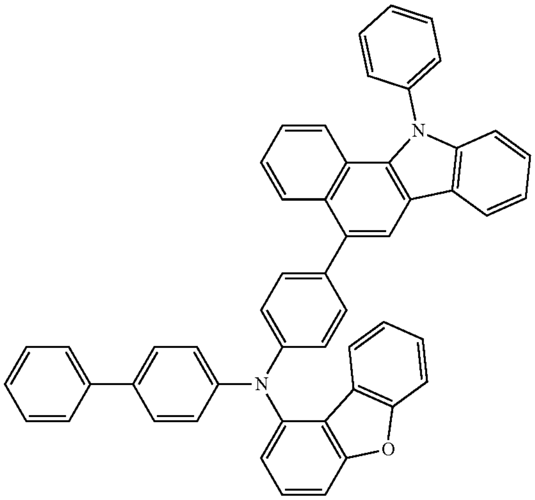
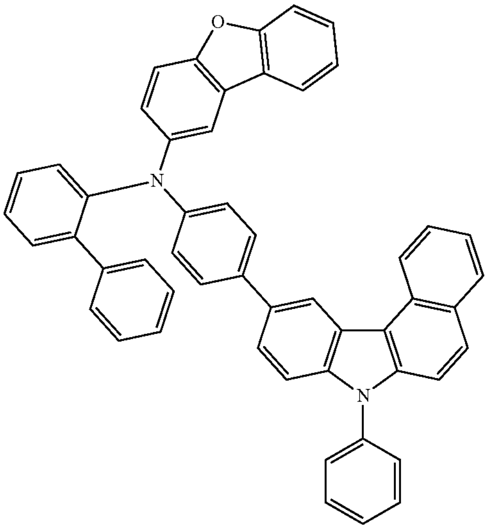
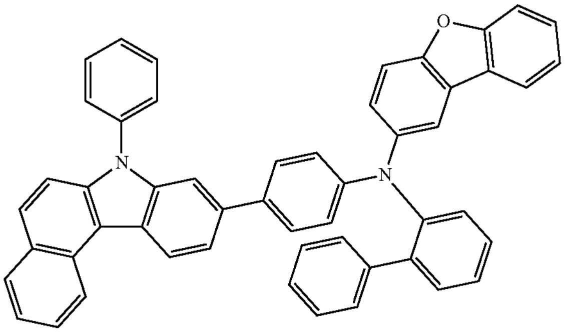
-continued
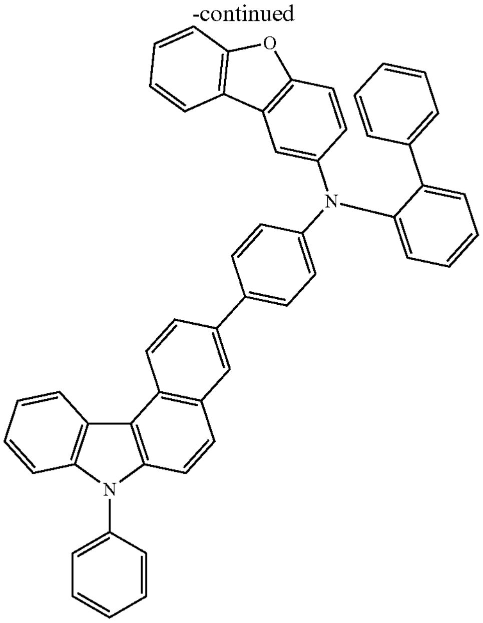
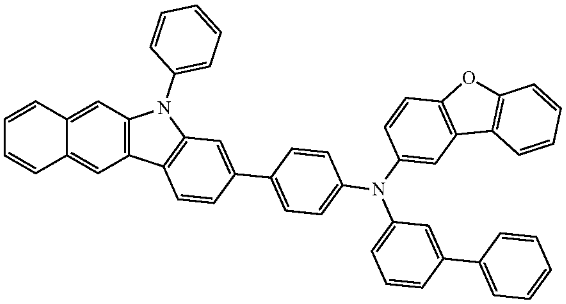
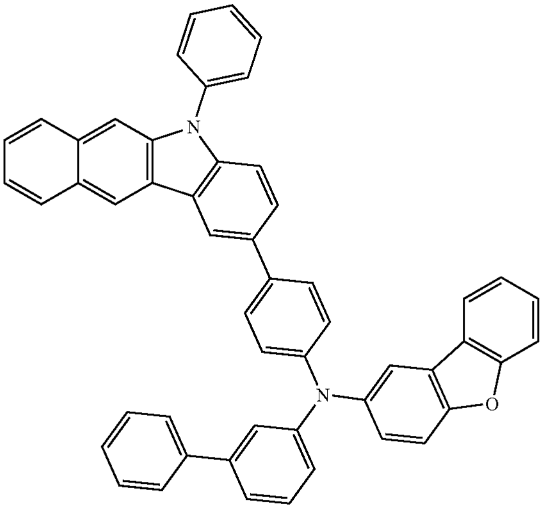

-continued
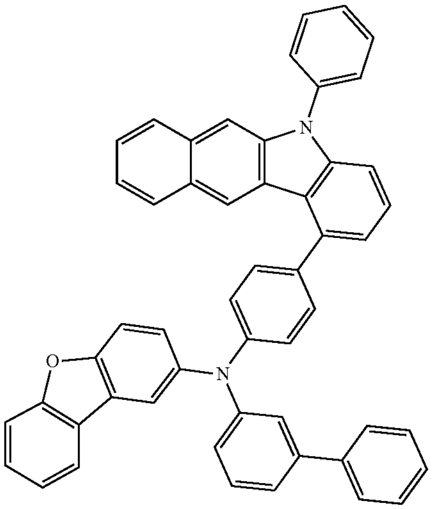
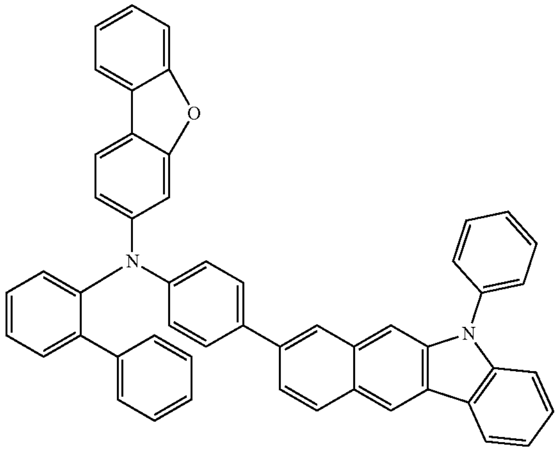
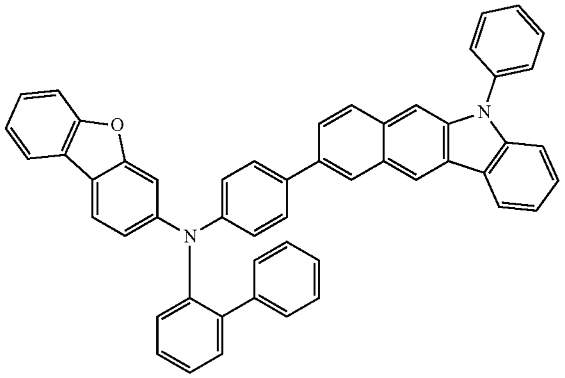
-continued
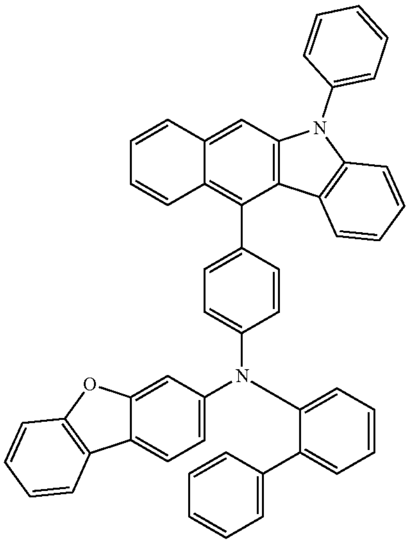
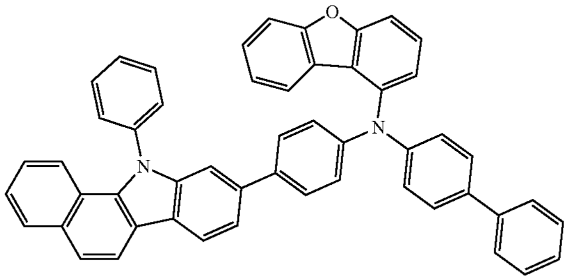
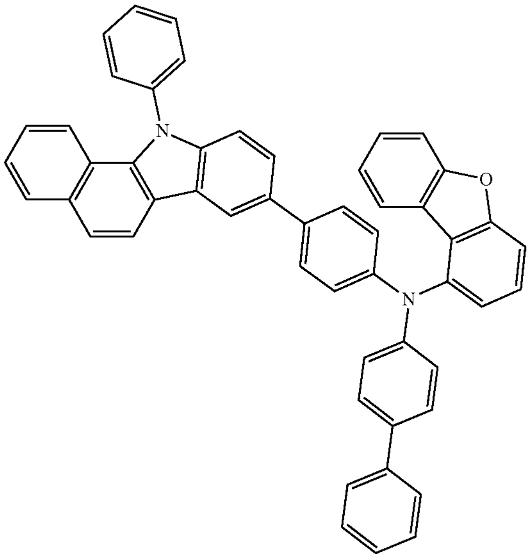

-continued
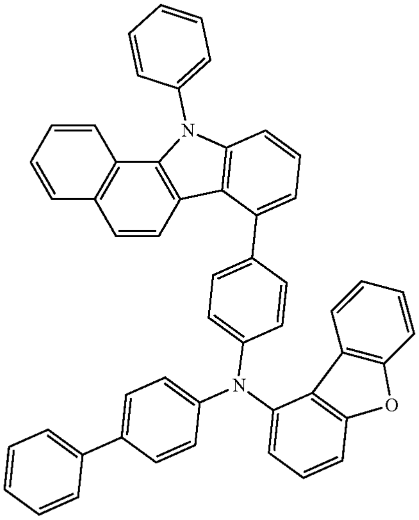
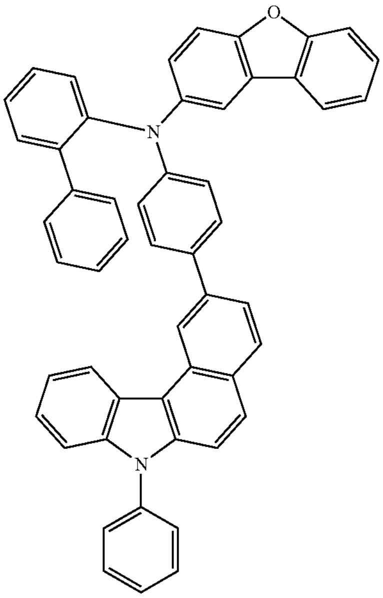
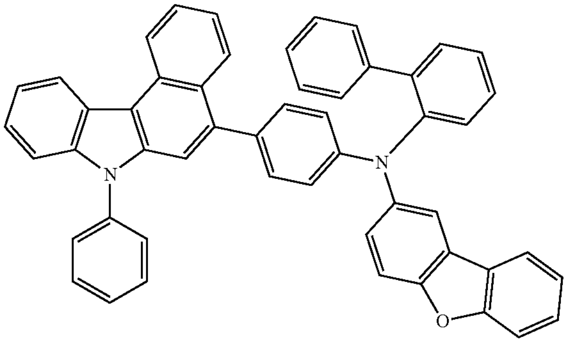
-continued
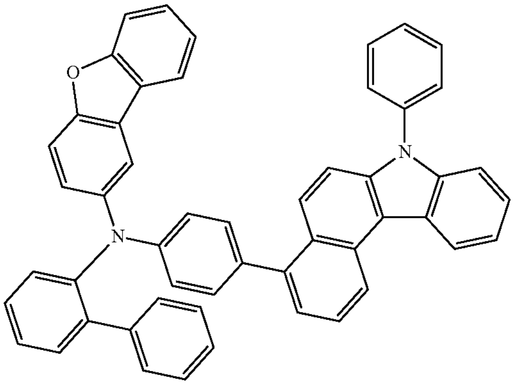
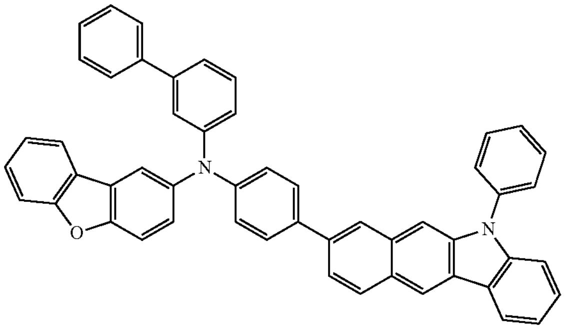
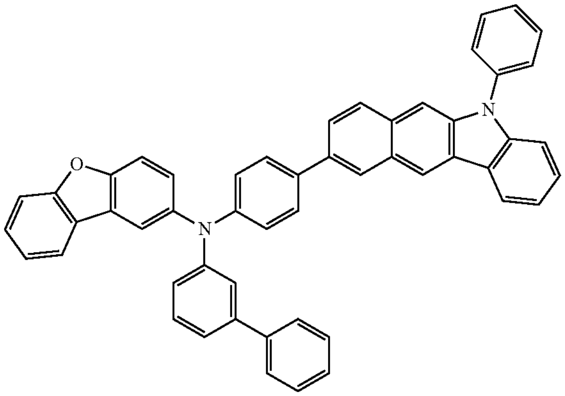
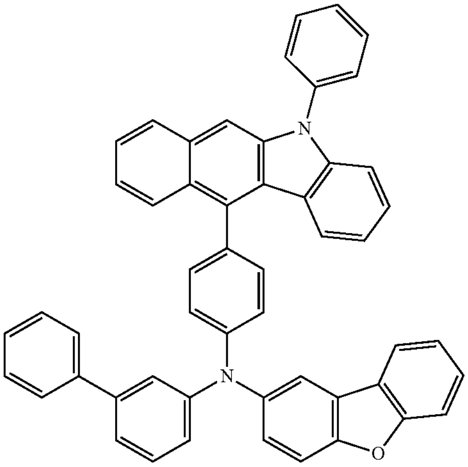

-continued
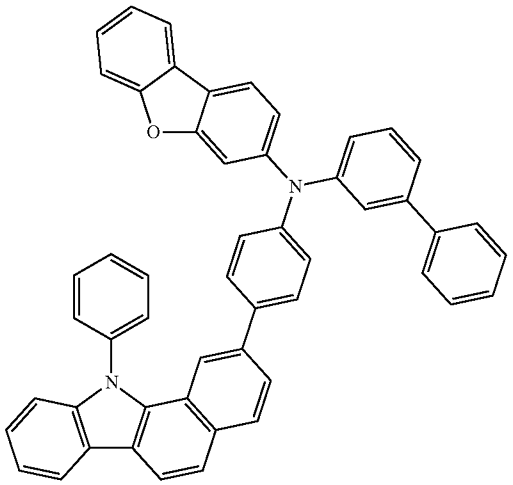
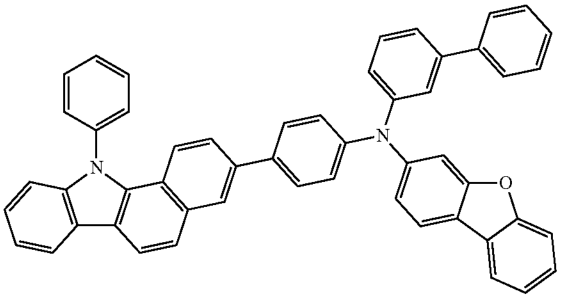
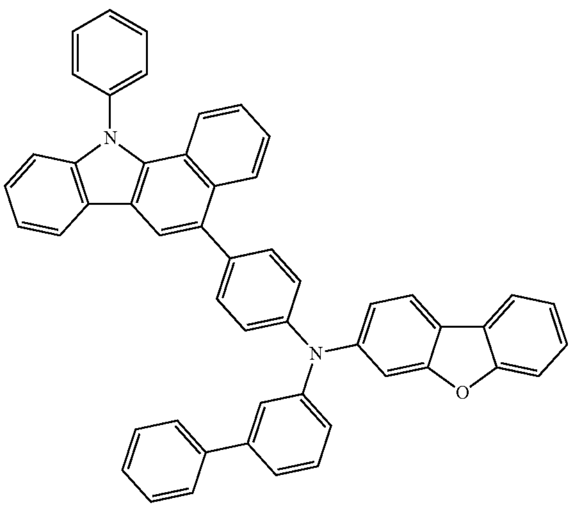
-continued
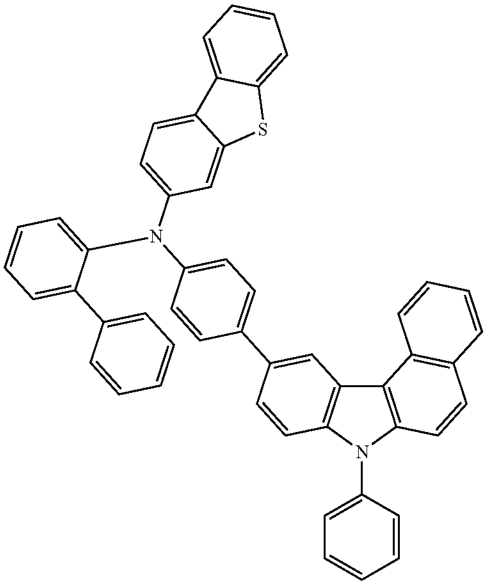
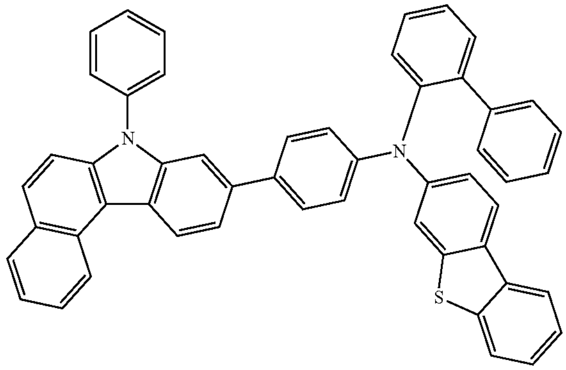
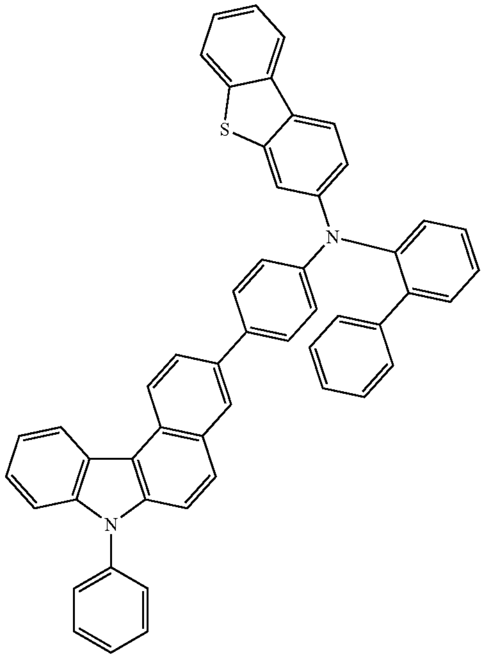

-continued
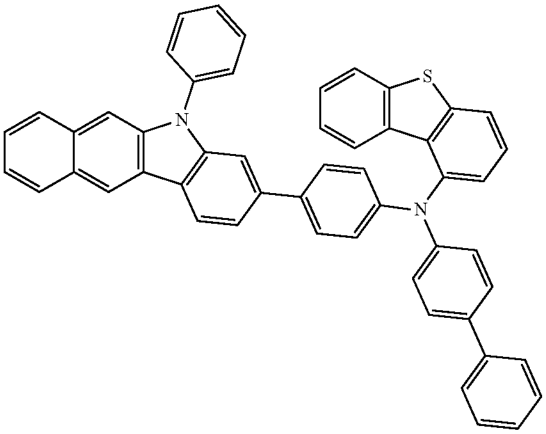
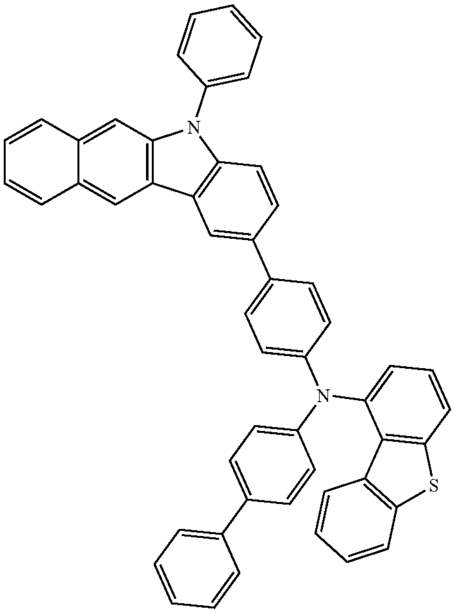
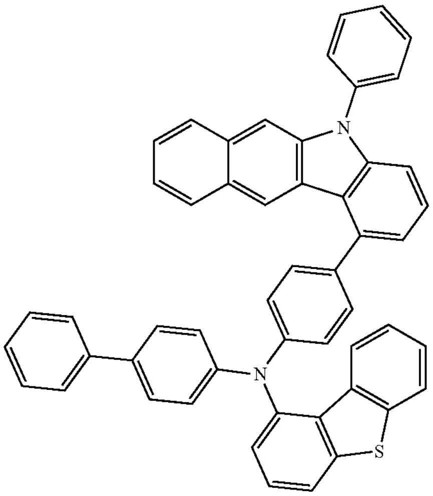
-continued
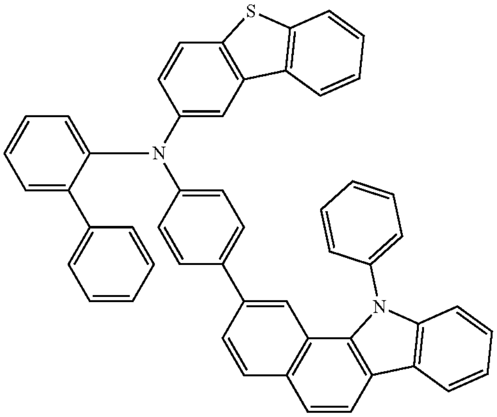
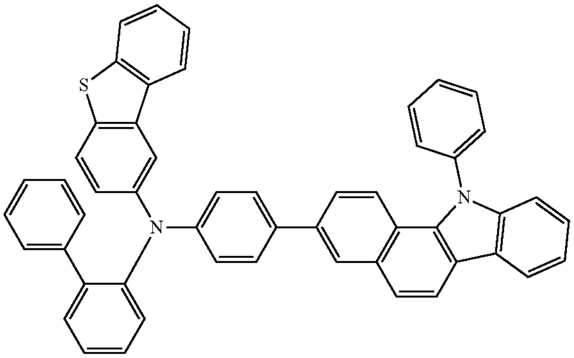
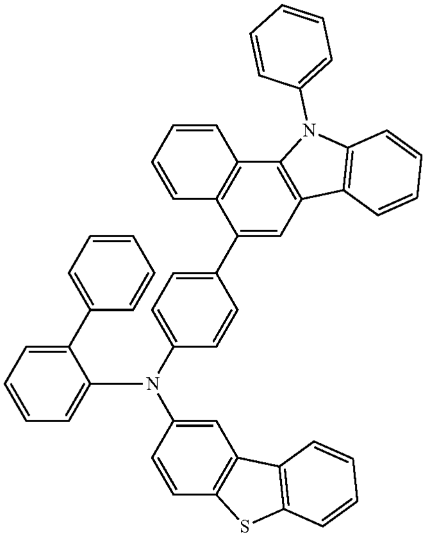
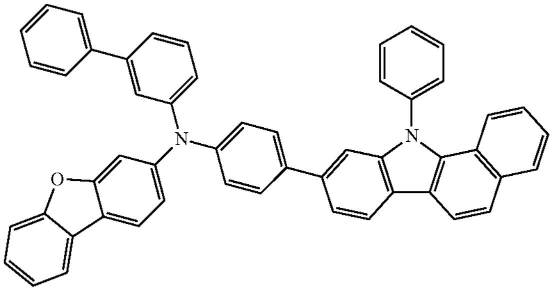

-continued
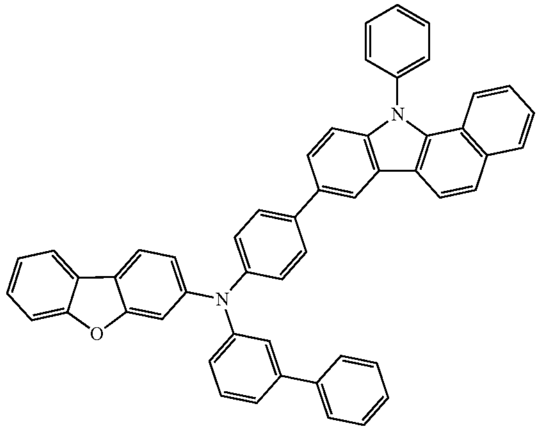
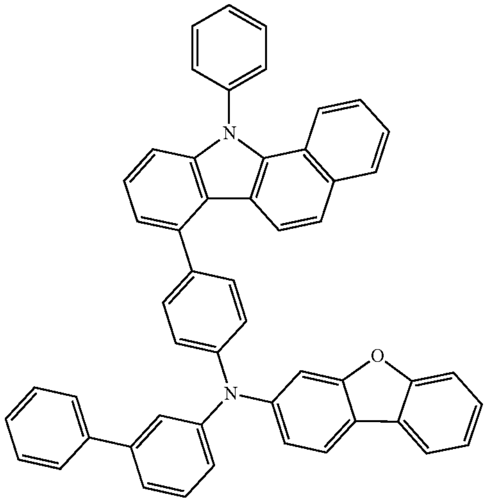
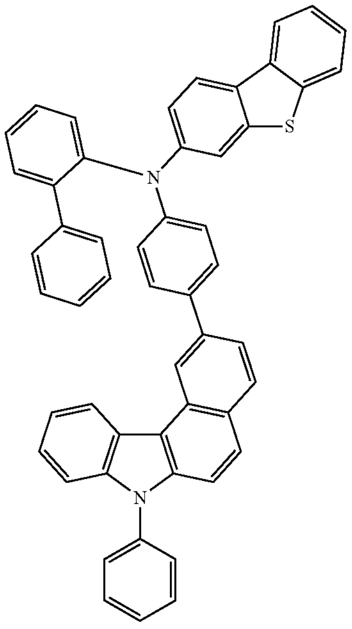
-continued
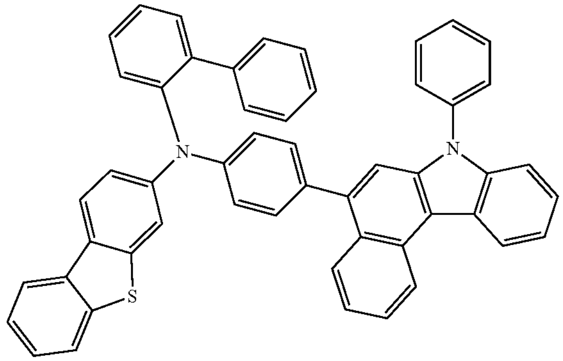
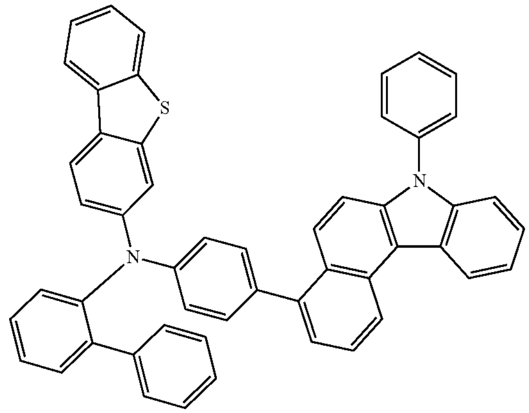
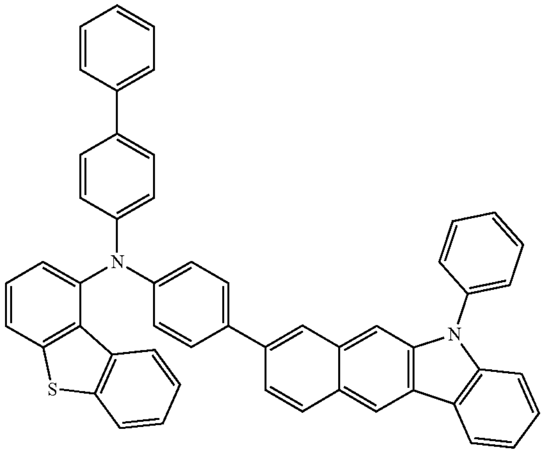

-continued
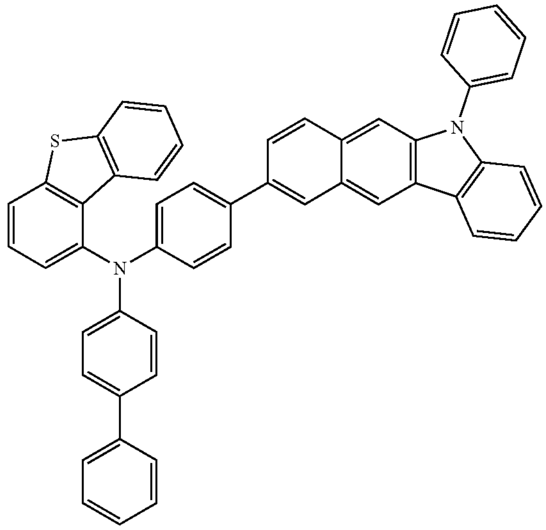
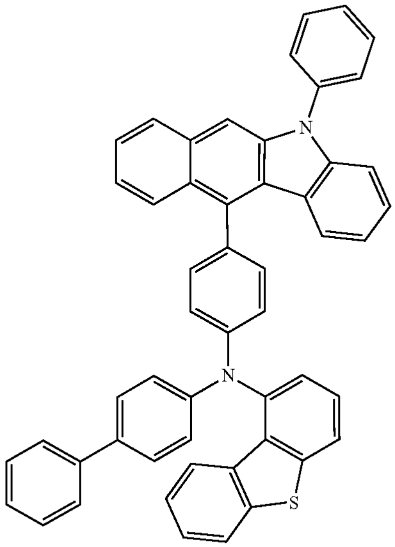
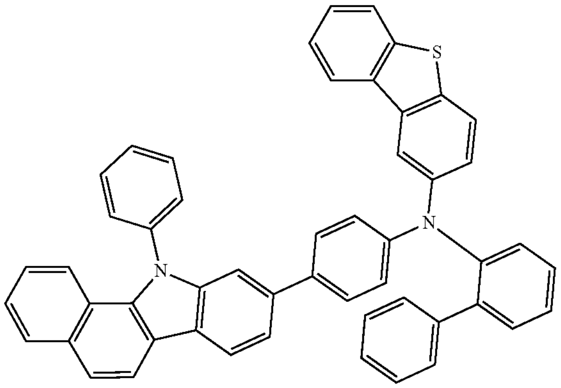
-continued
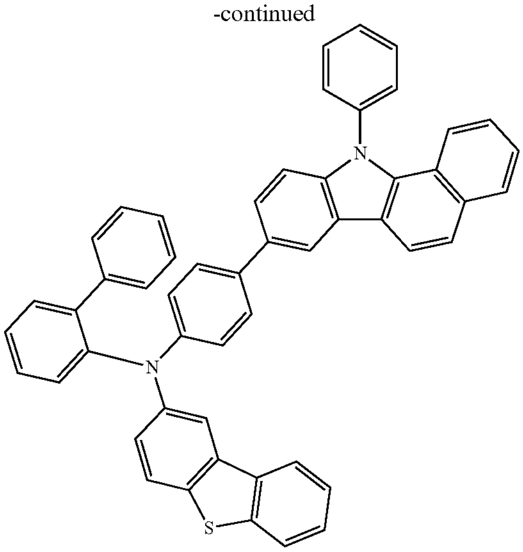
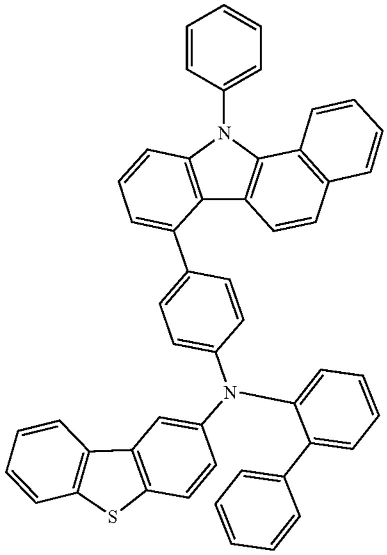
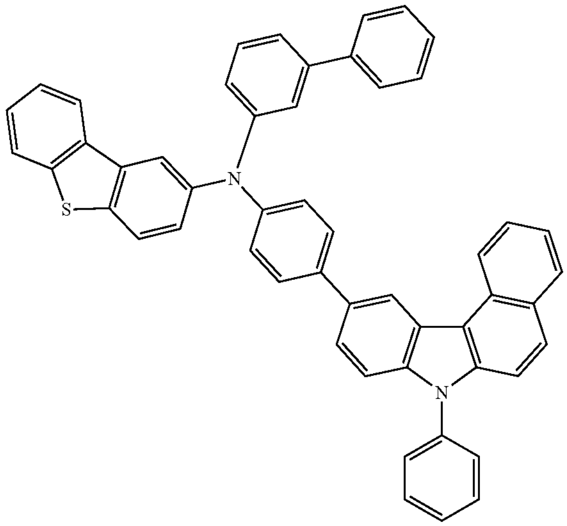

-continued
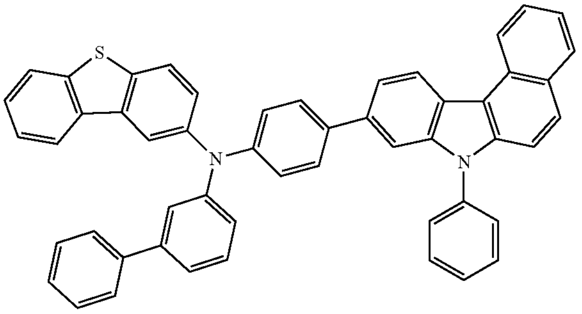
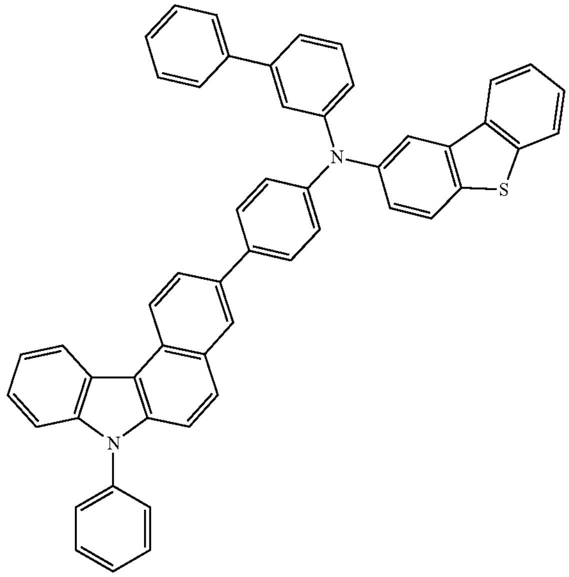
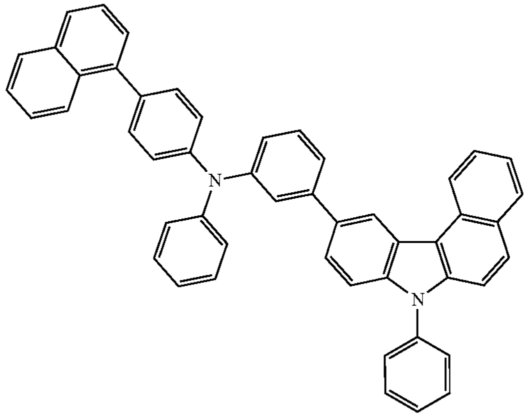
-continued
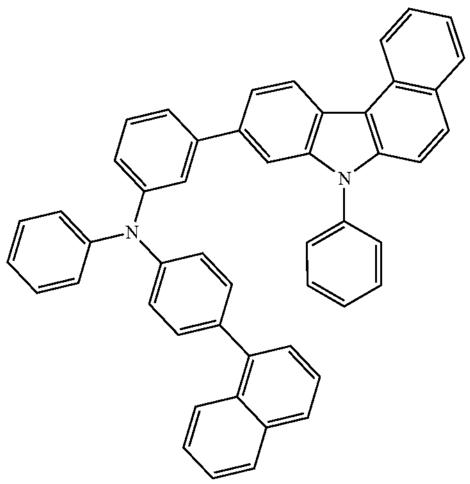
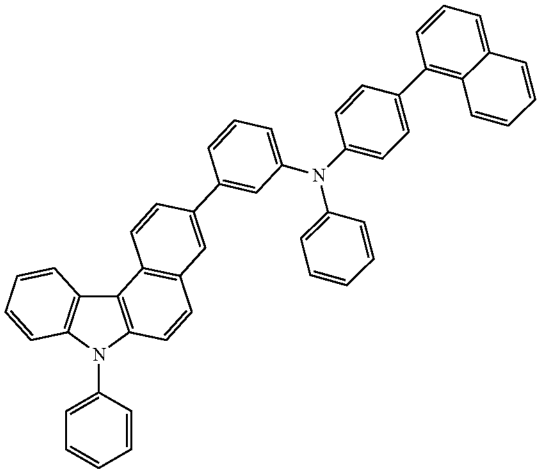
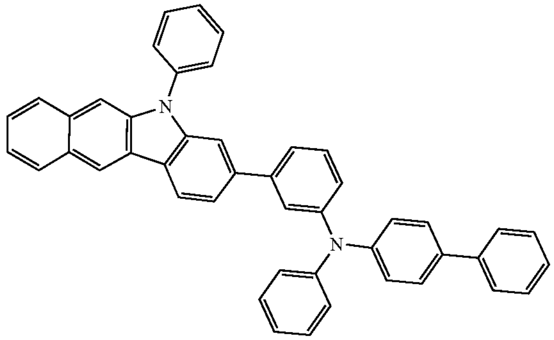

-continued
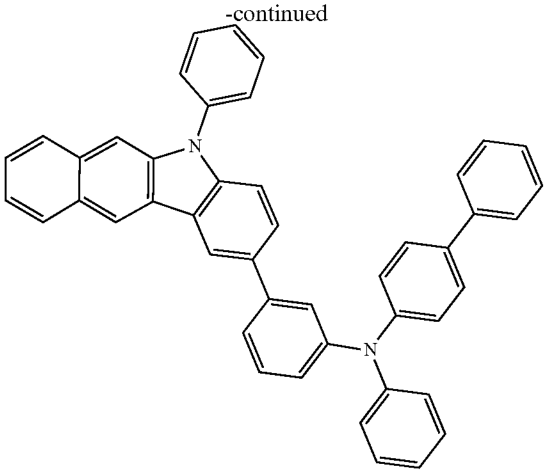
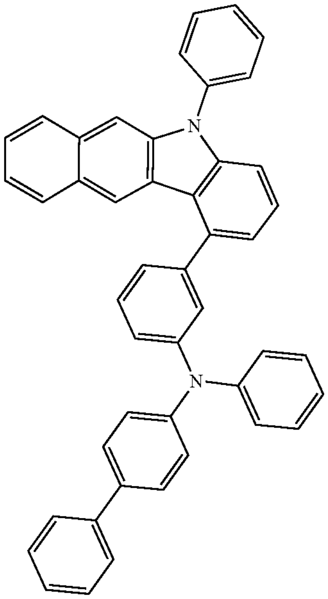
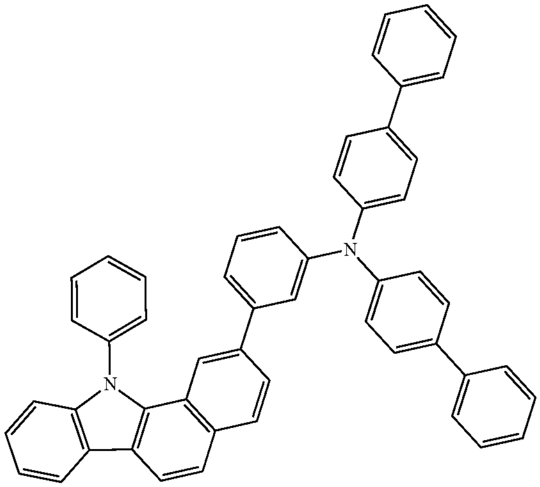
-continued
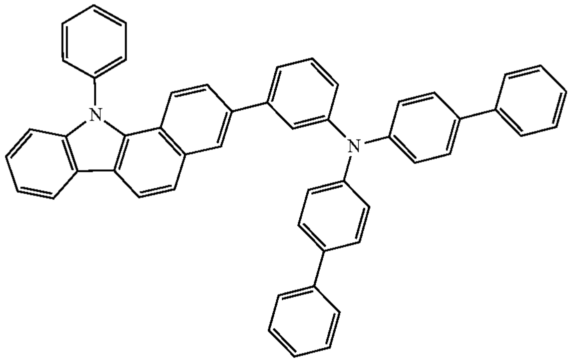
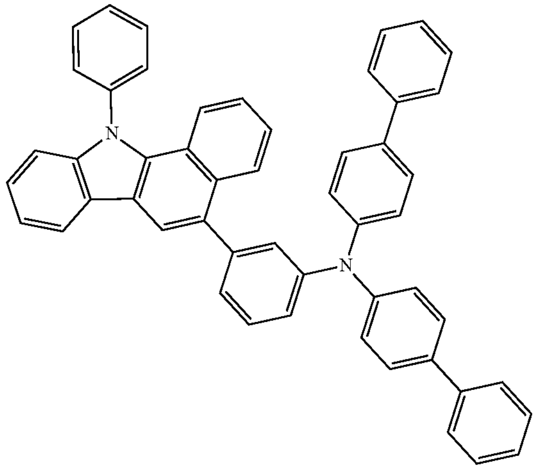
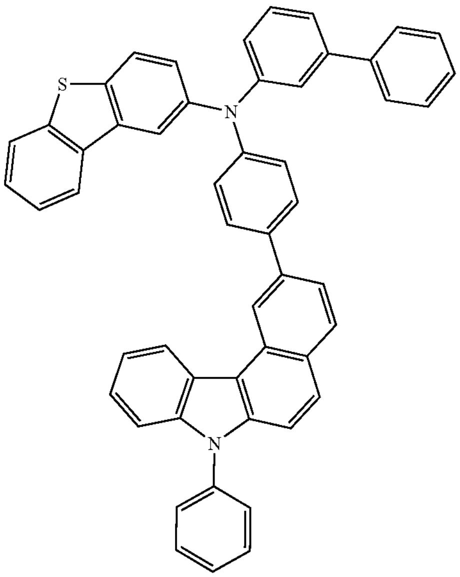
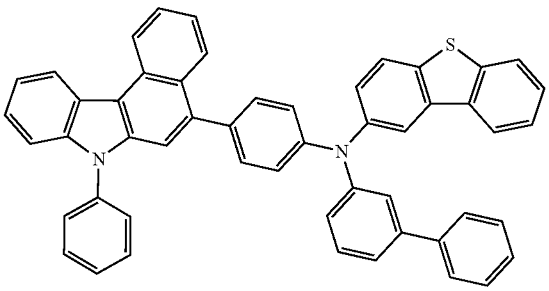

-continued
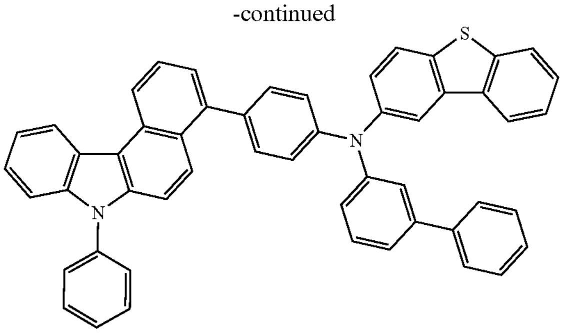
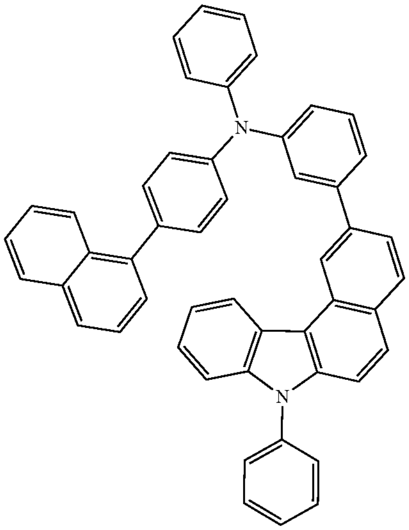
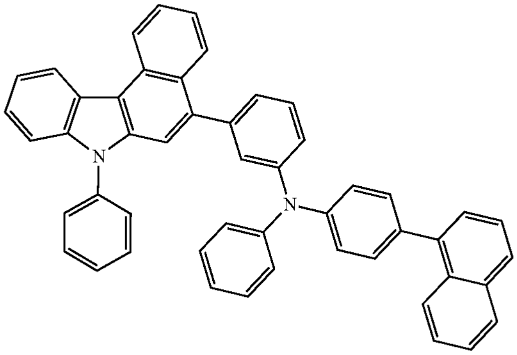
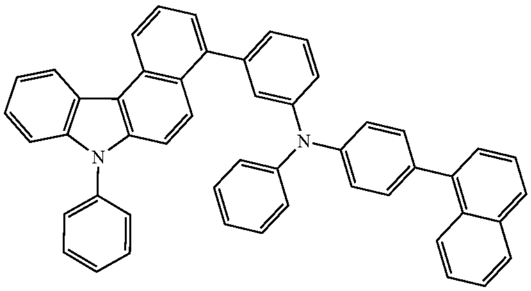
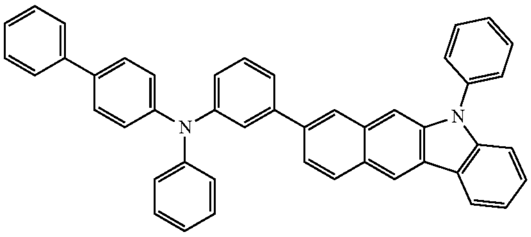
-continued
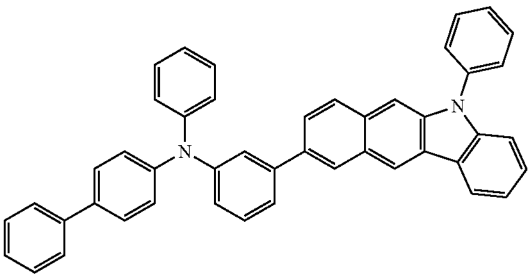
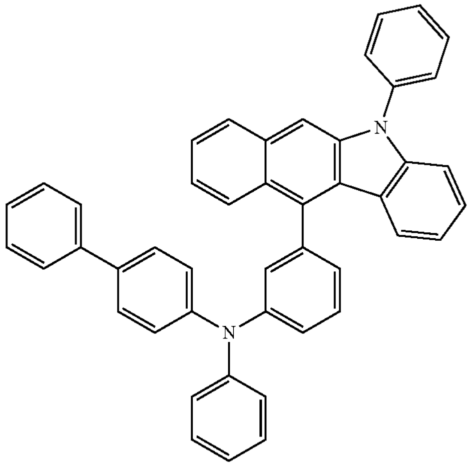
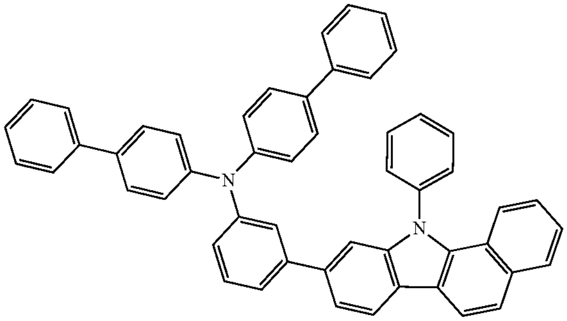
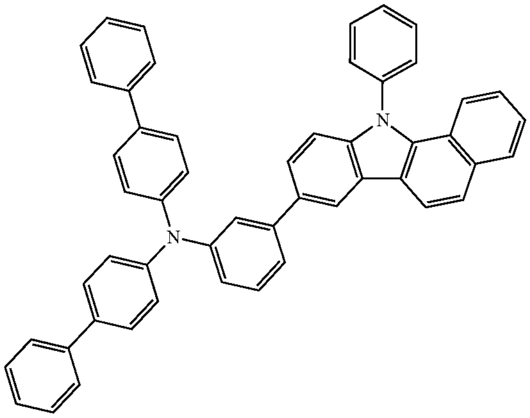

-continued
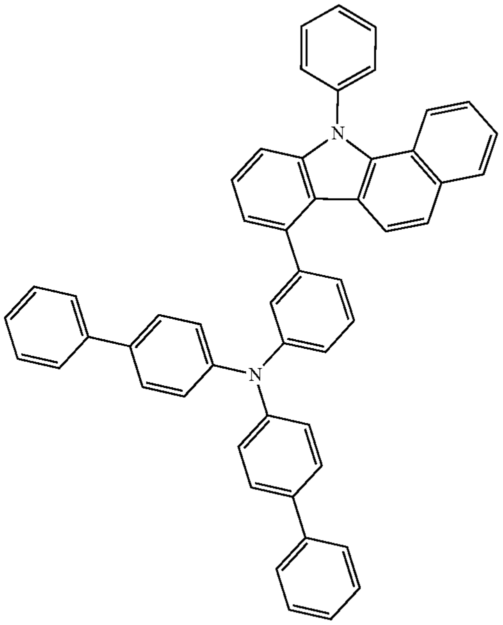
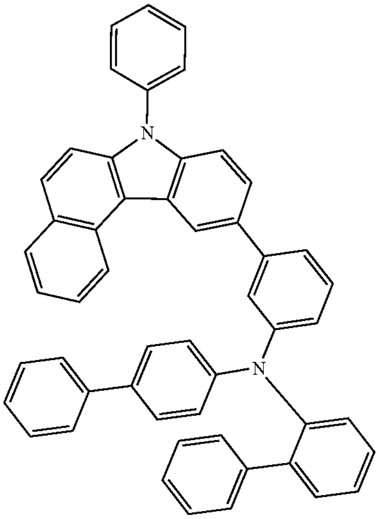
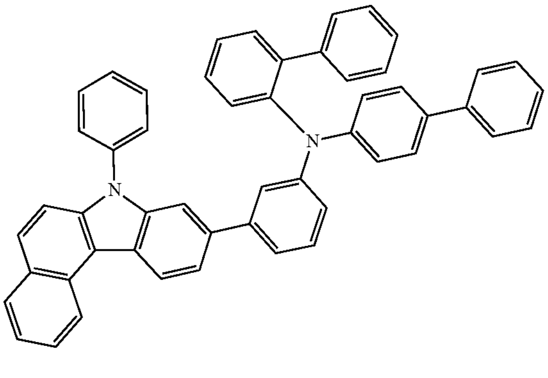
-continued
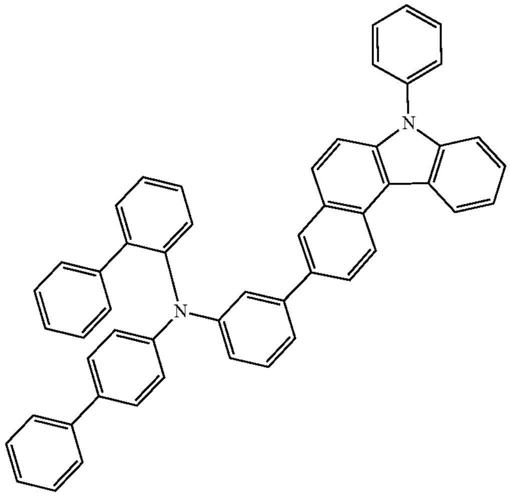
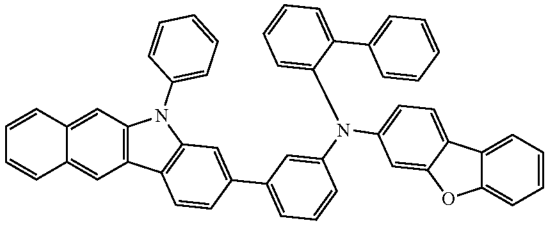
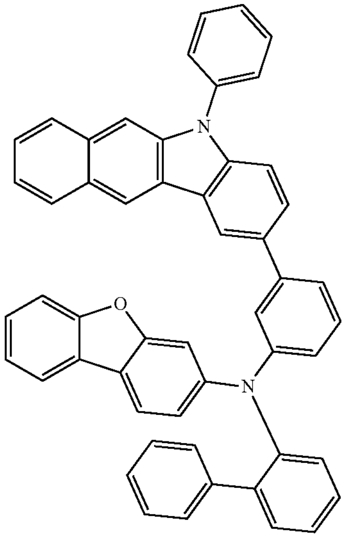

-continued
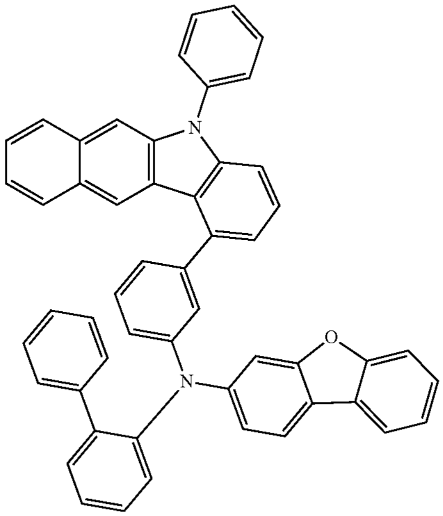
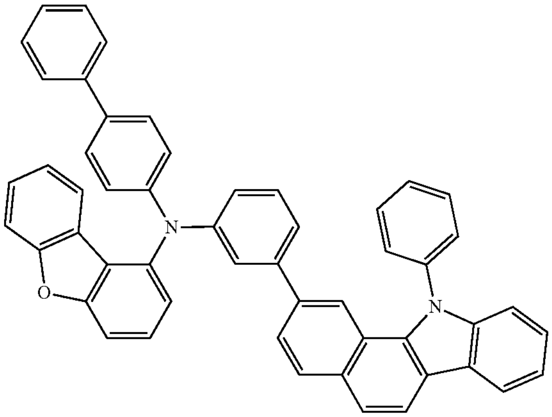
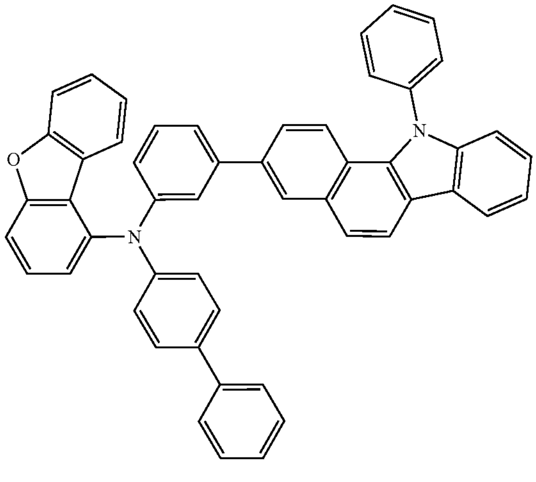
-continued
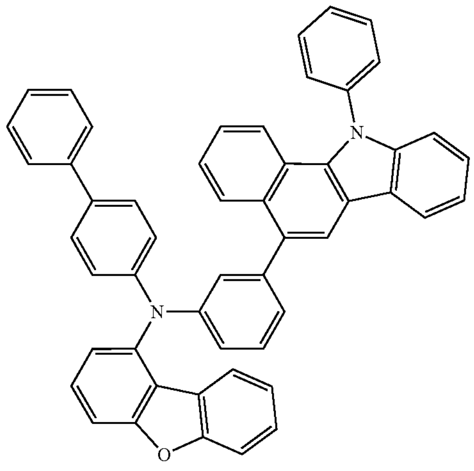
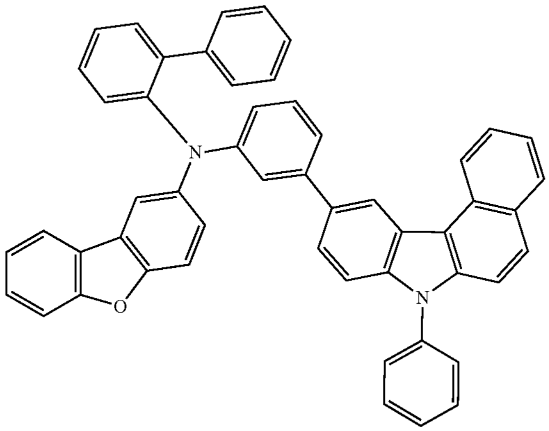
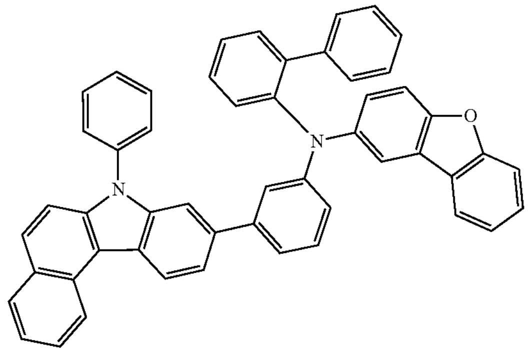
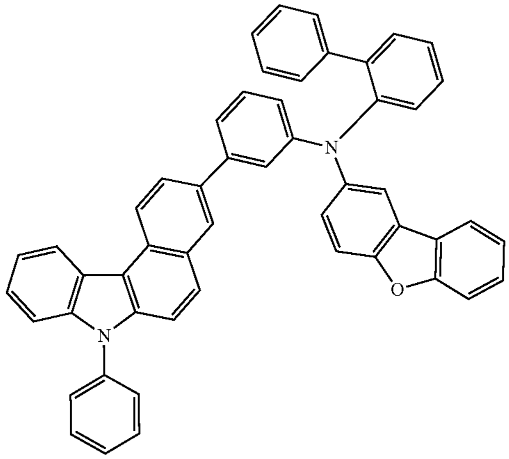

-continued
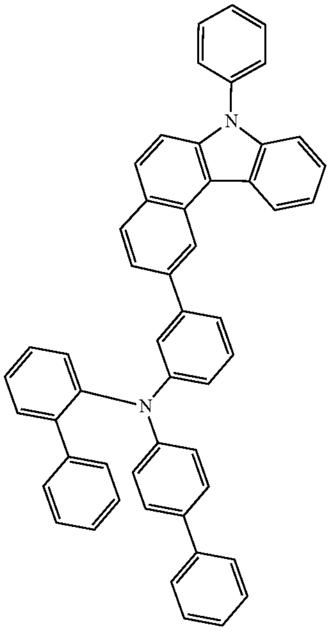
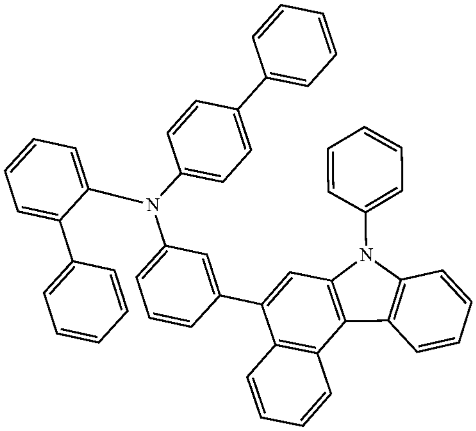
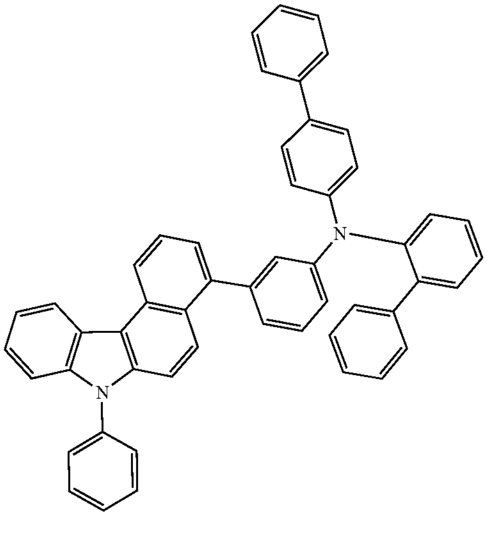
-continued
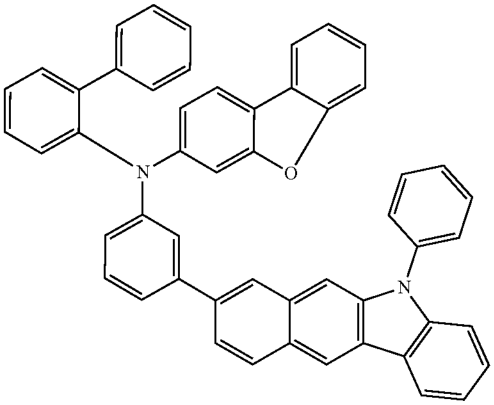
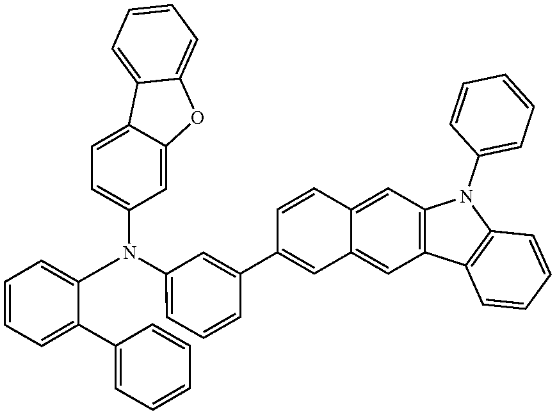
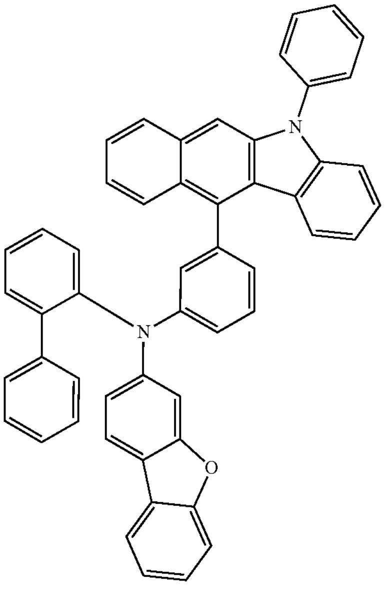

-continued
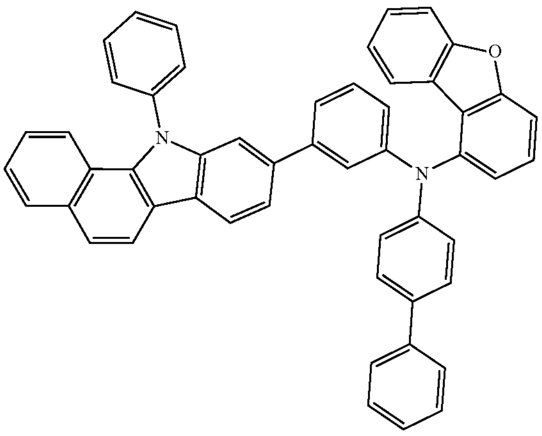
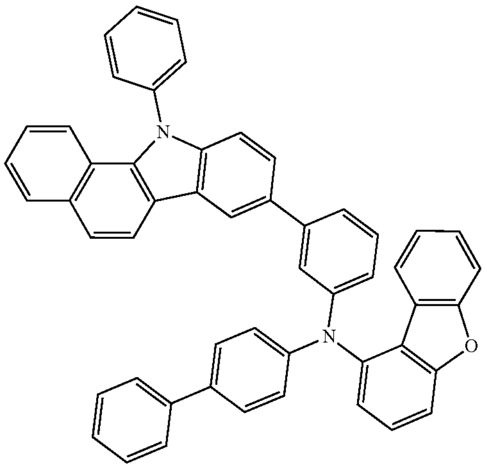
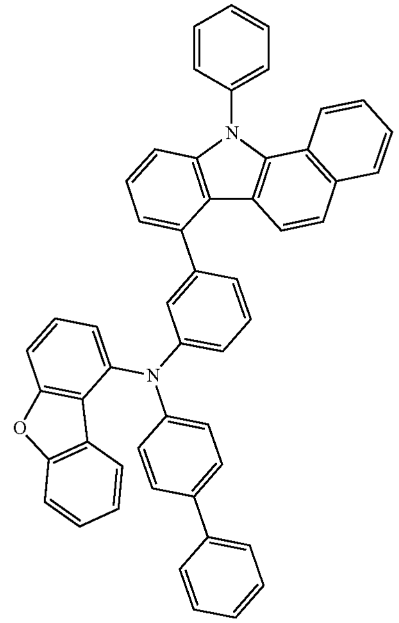
-continued
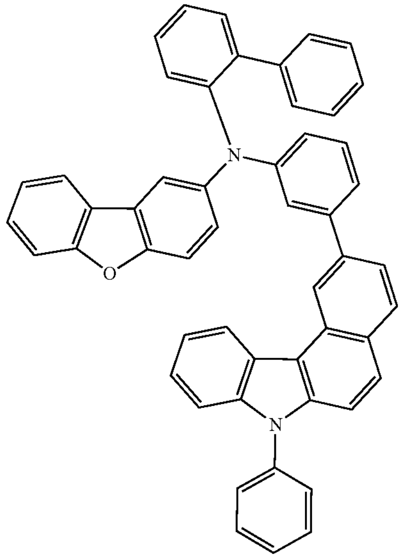
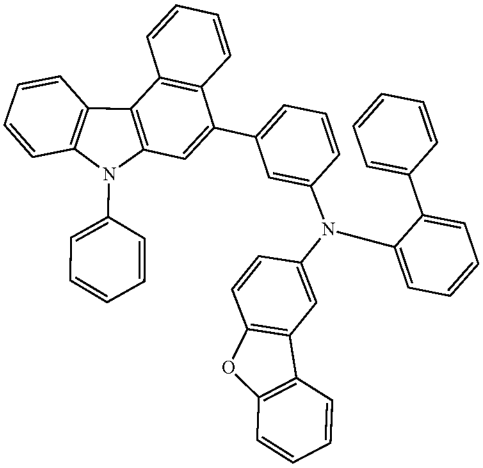
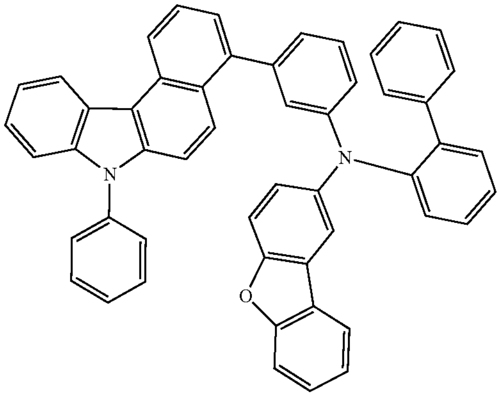
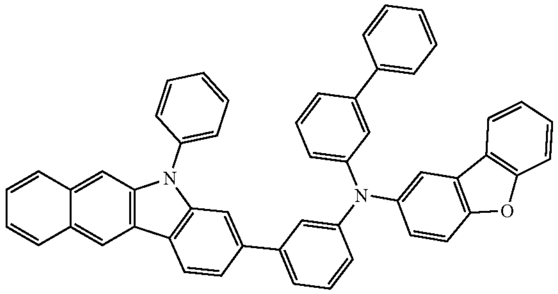

-continued
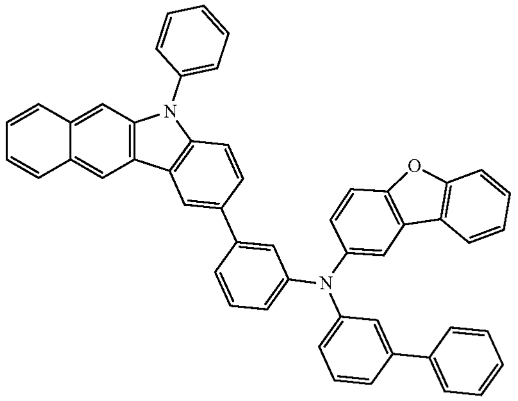
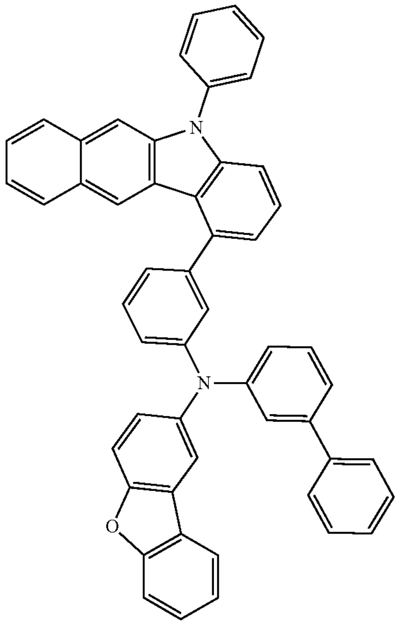
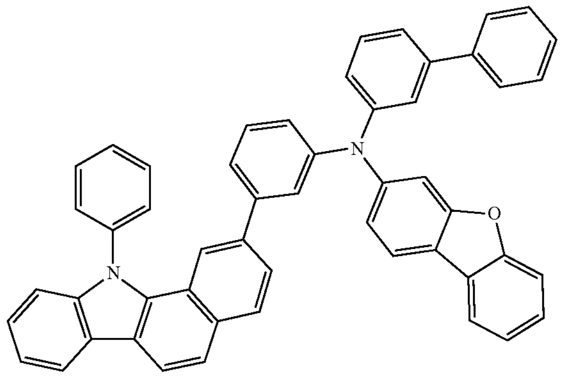
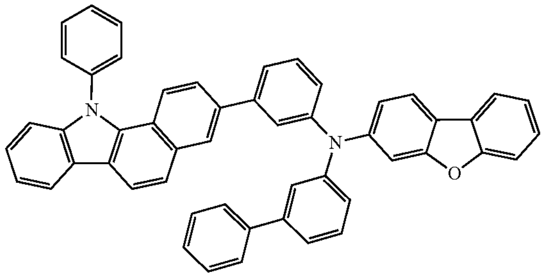
-continued
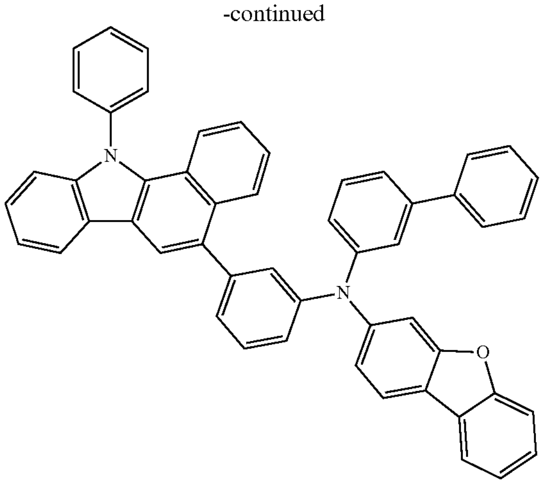
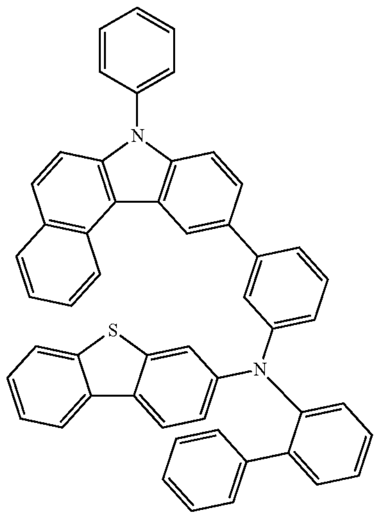
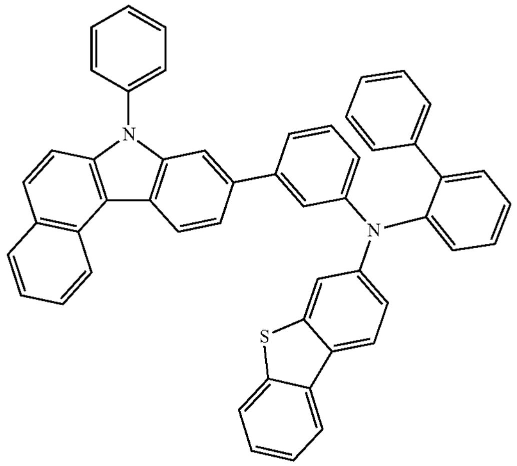

-continued
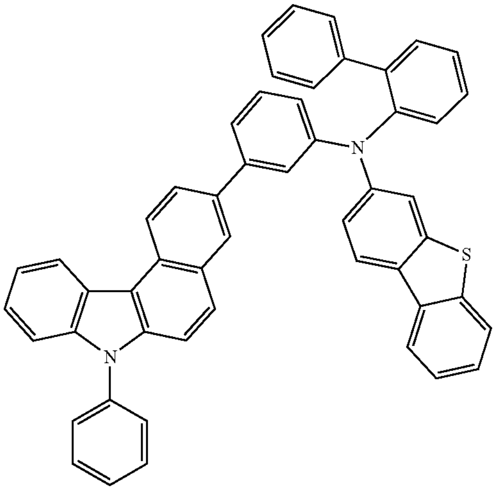
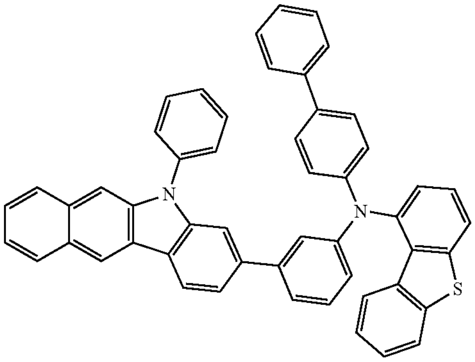
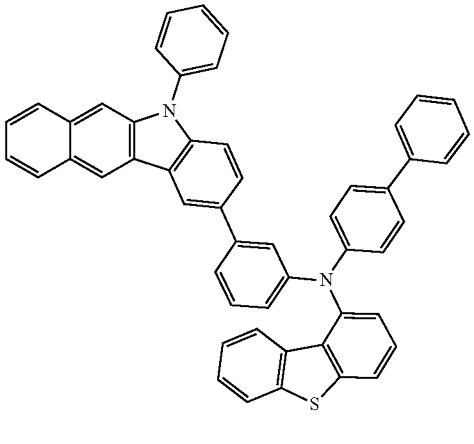
-continued
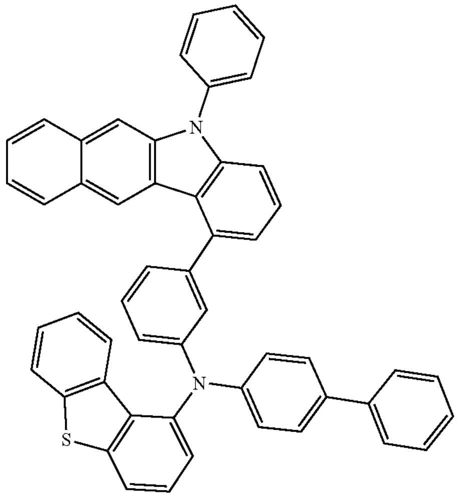
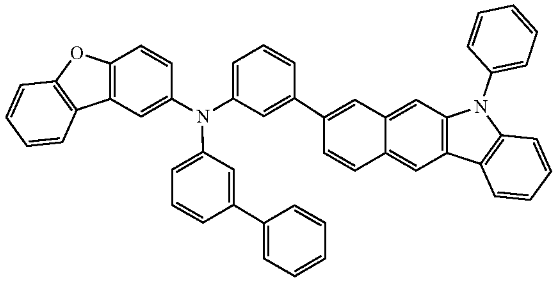
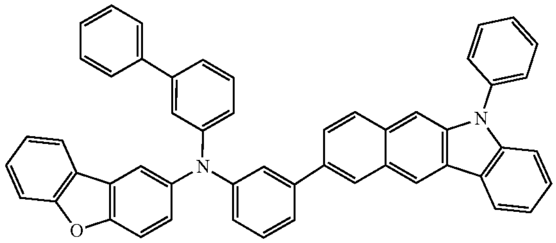
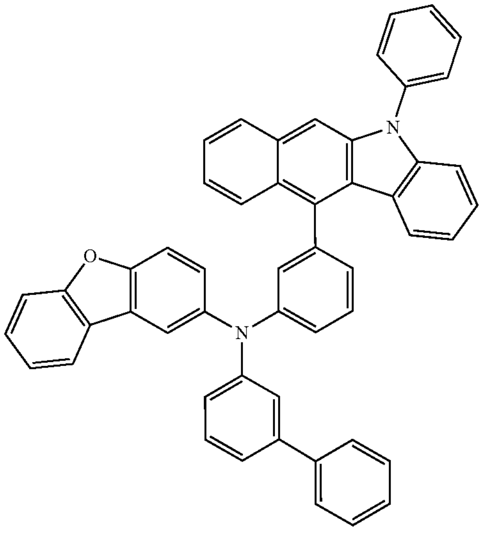

-continued
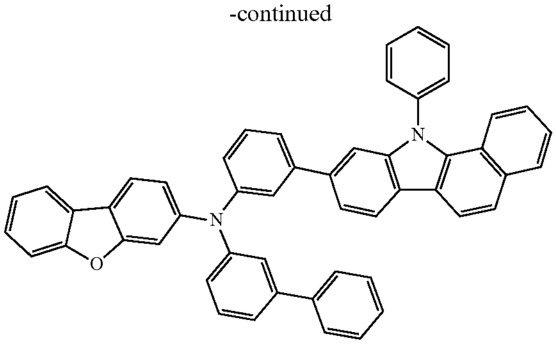
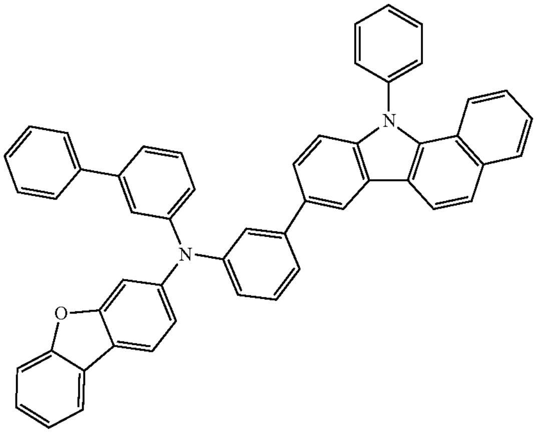
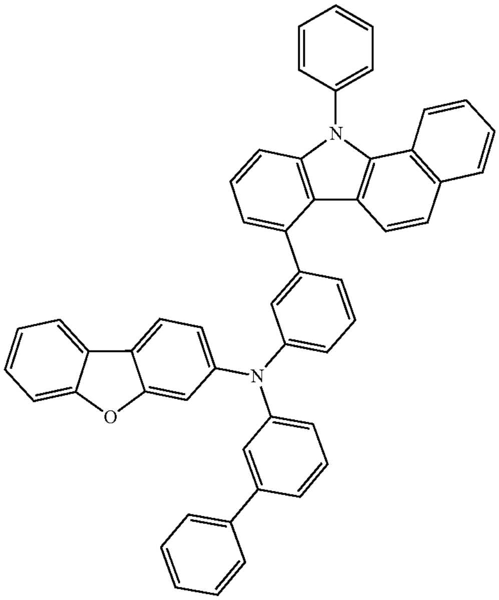
-continued
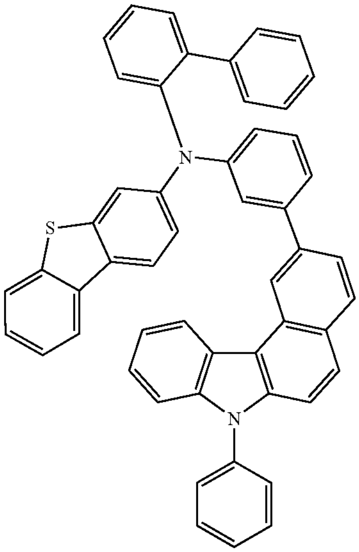
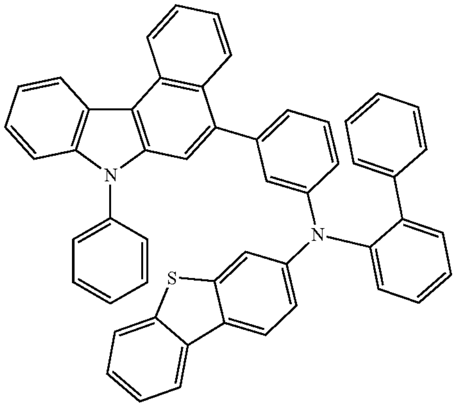
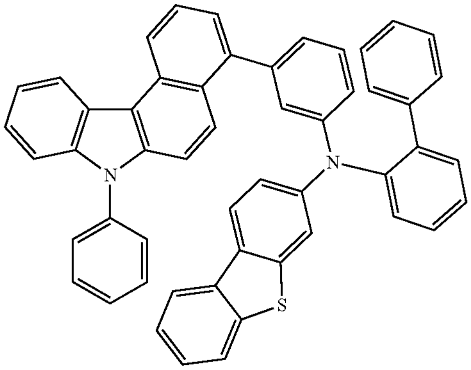

-continued
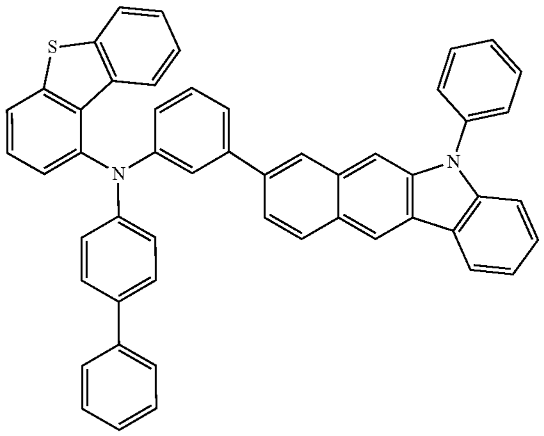
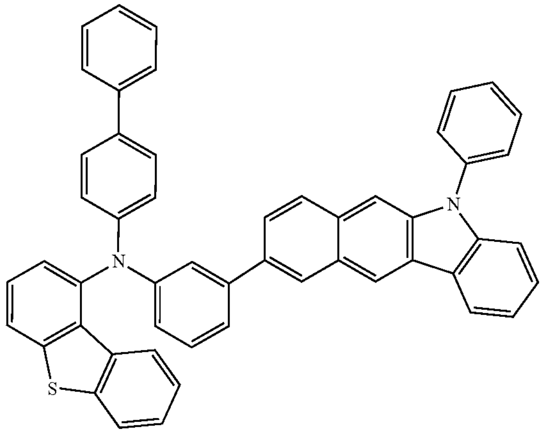
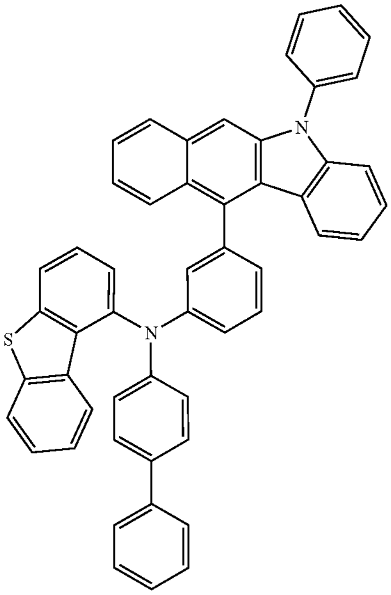
-continued
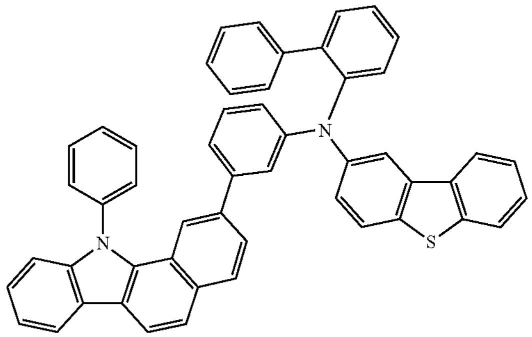
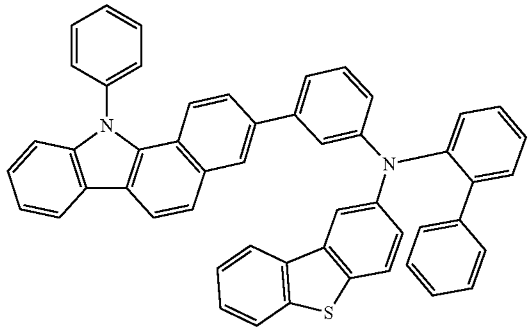
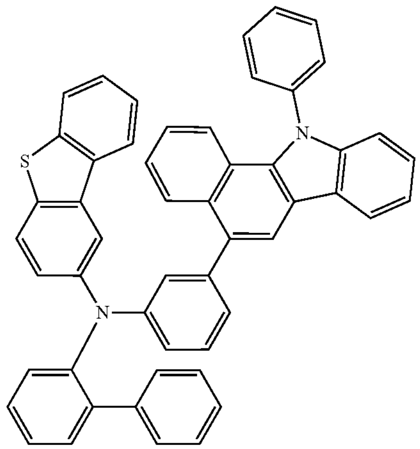
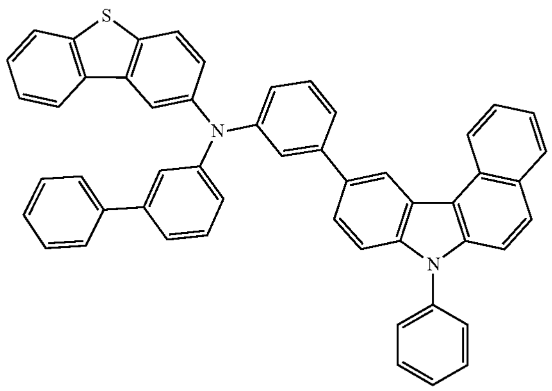

-continued
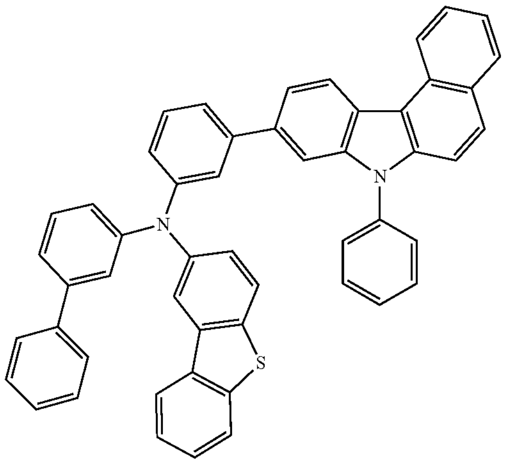
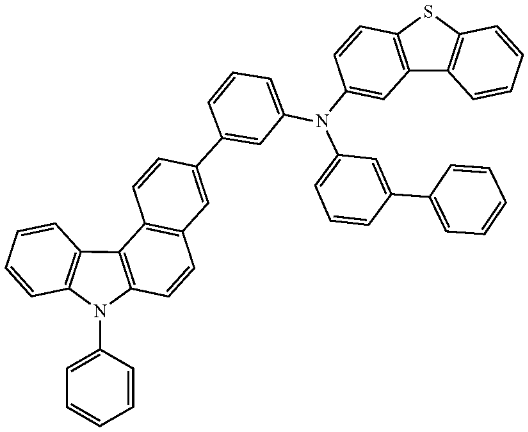
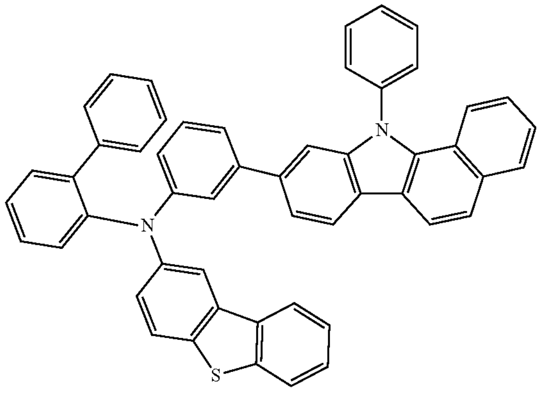
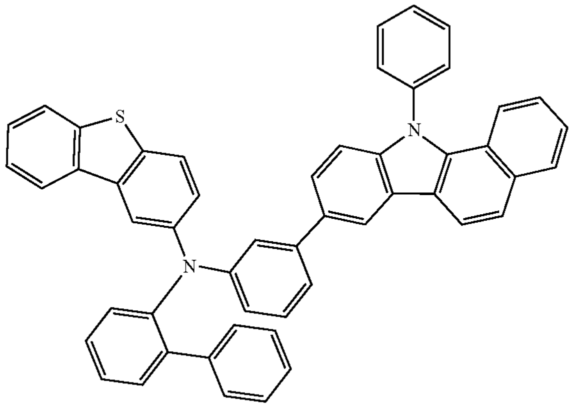
-continued
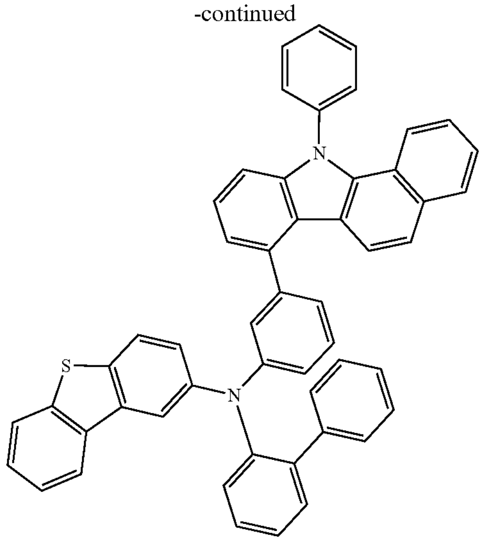
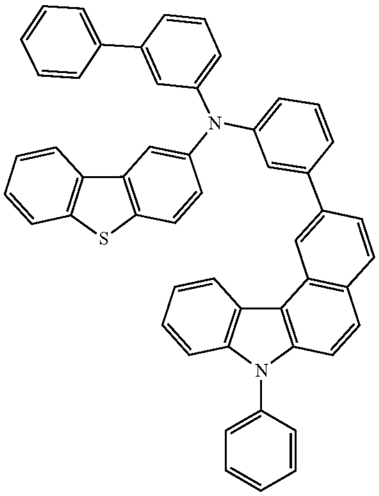
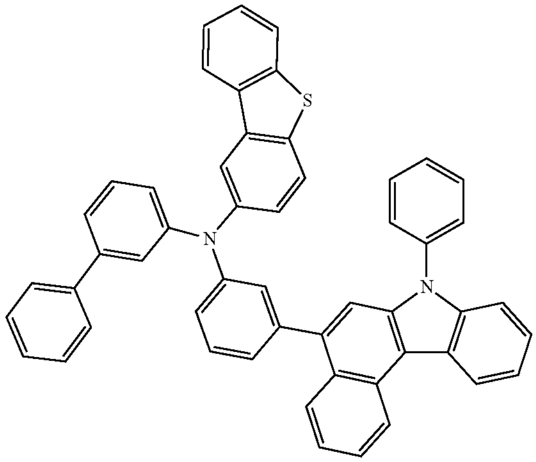

-continued
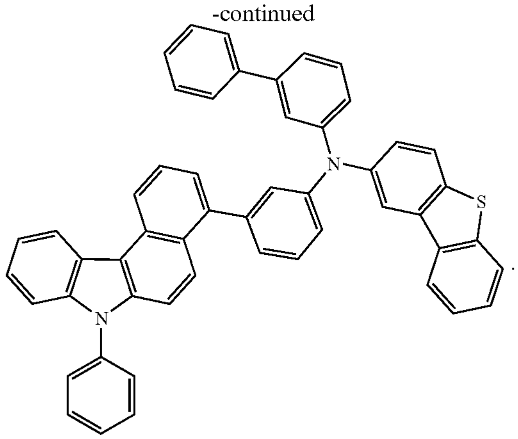
.
* * * * *